US011980093B2

(12) United States Patent
Lee et al.

(10) Patent No.: US 11,980,093 B2
(45) Date of Patent: May 7, 2024

(54) ORGANIC LIGHT EMITTING DIODE

(71) Applicant: LG CHEM, LTD., Seoul (KR)

(72) Inventors: Woochul Lee, Daejeon (KR); Ji Young Choi, Daejeon (KR); Joo Ho Kim, Daejeon (KR); Dong Hoon Lee, Daejeon (KR); Sang Duk Suh, Daejeon (KR); Hoon Jun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 855 days.

(21) Appl. No.: 16/961,221

(22) PCT Filed: May 17, 2019

(86) PCT No.: PCT/KR2019/005924
§ 371 (c)(1),
(2) Date: Jul. 9, 2020

(87) PCT Pub. No.: WO2019/221545
PCT Pub. Date: Nov. 21, 2019

(65) Prior Publication Data
US 2021/0066619 A1 Mar. 4, 2021

(30) Foreign Application Priority Data
May 17, 2018 (KR) ........................ 10-2018-0056458

(51) Int. Cl.
*H01L 51/50* (2006.01)
*H10K 85/30* (2023.01)
(Continued)

(52) U.S. Cl.
CPC ....... *H10K 85/6574* (2023.02); *H10K 85/322* (2023.02); *H10K 50/15* (2023.02);
(Continued)

(58) Field of Classification Search
None
See application file for complete search history.

(56) References Cited

U.S. PATENT DOCUMENTS

2011/0156016 A1 6/2011 Kawamura et al.
2017/0365788 A1 12/2017 Cha et al.
(Continued)

FOREIGN PATENT DOCUMENTS

CN 107108498 A 8/2017
JP 4807013 11/2011
(Continued)

*Primary Examiner* — Gregory D Clark
(74) *Attorney, Agent, or Firm* — Bryan Cave Leighton Paisner LLP

(57) ABSTRACT

An organic light emitting device including a compound of Chemical Formula 1 and a compound of Chemical Formula 2, wherein Chemical Formula 1 and (Continued)

-continued

Chemical Formula 2

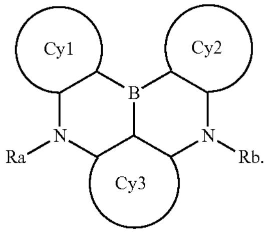

7 Claims, 2 Drawing Sheets

(51) Int. Cl.

| | |
|---|---|
| ***H10K 85/60*** | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.
CPC ........... *H10K 50/16* (2023.02); *H10K 50/171* (2023.02); *H10K 50/18* (2023.02)

(56) References Cited

U.S. PATENT DOCUMENTS

| | | | | |
|---|---|---|---|---|
| 2018/0301629 | A1 | 10/2018 | Hatakeyama et al. | |
| 2019/0207112 | A1* | 7/2019 | Hatakeyama .......... | C09K 11/02 |
| 2020/0190116 | A1 | 6/2020 | Hatakeyama et al. | |

FOREIGN PATENT DOCUMENTS

| | | | | | |
|---|---|---|---|---|---|
| JP | 5750821 | | | 7/2015 | |
| JP | 2017-193618 | | | 10/2017 | |
| KR | 2009-041999 | | * | 4/2009 | ............. C09K 11/06 |
| KR | 10-2009-0086015 | | | 8/2009 | |
| KR | 10-2011-0043625 | | | 4/2011 | |
| KR | 10-2014-0076170 | | | 6/2014 | |
| KR | 20170022940 | A | | 3/2017 | |
| KR | 10-2017-0058618 | | | 5/2017 | |
| KR | 10-2017-0130434 | | | 11/2017 | |
| KR | 10-2017-0130435 | | | 11/2017 | |
| KR | 10-2018-0027676 | | | 3/2018 | |
| WO | 2016152544 | A1 | | 9/2016 | |

* cited by examiner

ORGANIC LIGHT EMITTING DIODE

This application is a National Stage Application of International Application No. PCT/KR2019/005924 filed on May 17, 2019, which claims priority to and the benefits of Korean Patent Application No. 10-2018-0056458, filed with the Korean Intellectual Property Office on May 17, 2018, the entire contents of which are incorporated herein by reference.

TECHNICAL FIELD

The present specification relates to an organic light emitting device including a compound of Chemical Formula 1 and a compound of Chemical Formula 2.

BACKGROUND

An organic light emitting device has a structure disposing an organic thin film between two electrodes. When a voltage is applied to an organic light emitting device having such a structure, electrons and holes injected from the two electrodes combine in the organic thin film to form a pair, and light emits as these dissipate. The organic thin film may be formed in a single layer or a multilayer as necessary.

Materials used in an organic light emitting device are mostly pure organic materials or complex compounds in which an organic material and a metal form a complex, and may be divided into a hole injection material, a hole transfer material, a light emitting material, an electron transfer material, an electron injection material and the like depending on the application. Herein, as the hole injection material or the hole transfer material, organic materials having a p-type property, that is, organic materials readily oxidized and electrochemically stable when oxidized are mainly used. Meanwhile, as the electron injection material or the electron transfer material, organic materials having an n-type property, that is, organic materials readily reduced and electrochemically stable when reduced are mainly used. As the light emitting layer material, materials having both a p-type property and an n-type property, that is, materials stable in both oxidized and reduced states are preferred, and materials having, when excitons produced by holes and electrons recombining in a light emitting layer are formed, high light emission efficiency converting the excitons to light are preferred.

Development of organic thin film materials has been continuously required in order to enhance performance, lifetime and efficiency of an organic light emitting device.

Technical Problem

The present specification is directed to providing an organic light emitting device having properties of low driving voltage and long lifetime.

Technical Solution

One embodiment of the present specification provides an organic light emitting device including a first electrode; a second electrode provided opposite to the first electrode; and an organic material layer including a light emitting layer provided between the first electrode and the second electrode, wherein the light emitting layer includes a compound of the following Chemical Formula 1 and a compound of the following Chemical Formula 2.

Chemical Formula 1

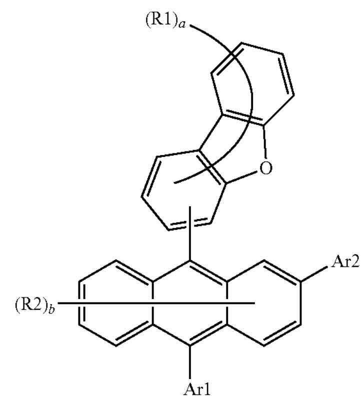

In Chemical Formula 1,

Ar1 and Ar2 are the same as or different from each other, and each independently a substituted or unsubstituted aryl group; or a substituted or unsubstituted heterocyclic group, R1 and R2 are the same as or different from each other, and each independently hydrogen; deuterium; a nitrile group; a halogen group; a silyl group; a boron group; a substituted or unsubstituted alkyl group; a substituted or unsubstituted aryloxy group; a substituted or unsubstituted aryl group; or a substituted or unsubstituted heterocyclic group, or bond to adjacent groups to form a substituted or unsubstituted ring, and a and b are each an integer of 0 to 7, and when a and b are each 2 or greater, substituents in the parentheses are the same as or different from each other, Chemical Formula 2

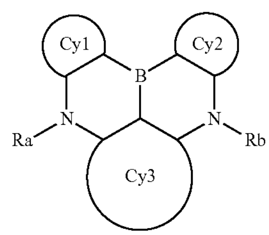

in Chemical Formula 2,

Cy1 to Cy3 are the same as or different from each other, and each independently a substituted or unsubstituted aromatic hydrocarbon ring; or a substituted or unsubstituted aromatic heteroring, Ra is a substituted or unsubstituted alkyl group; a substituted or unsubstituted aryl group; or a substituted or unsubstituted heterocyclic group, or bonds to Cy1 or Cy3 to form a substituted or unsubstituted ring, and Rb is a substituted or unsubstituted alkyl group; a substituted or unsubstituted aryl group; or a substituted or unsubstituted heterocyclic group, or bonds to Cy2 or Cy3 to form a substituted or unsubstituted ring.

Advantageous Effects

By an organic light emitting device of the present disclosure including both a compound of Chemical Formula 1 and a compound of Chemical Formula 2 in a light emitting layer, an organic light emitting device having low driving voltage, high efficiency and long lifetime can be obtained.

Specifically, the compound of Chemical Formula 1 of the present disclosure increases electron mobility by introducing a dibenzofuran group, an electron withdrawing group, to an anthracene structure that has been used in the art, and as a result, polarity of molecules increases facilitating electron injection.

In addition, by substituting a No. 2 position of the anthracene with an aryl group or a heterocyclic group, hole injection is facilitated by increasing a HOMO level of the molecule, which is effective in reducing device lifetime and driving voltage. According to one embodiment of the present disclosure, an organic light emitting device having high color purity and high efficiency can be manufactured by the device including a compound of Chemical Formula 2 together with a compound of Chemical Formula 1 in a light emitting layer.

REFERENCE NUMERAL

Figure 1:
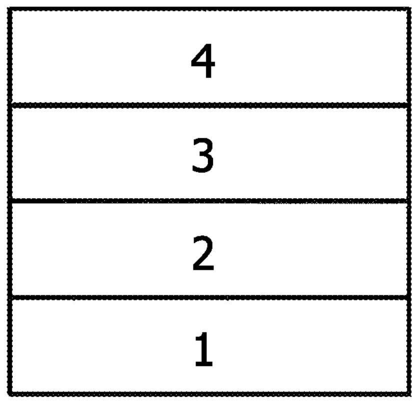
FIG. 1 illustrates an example of an organic light emitting device formed with a substrate (1), an anode (2), a light emitting layer (3) and a cathode (4).

1: Substrate
2: Anode
3: Light Emitting Layer
4: Cathode
5: Hole Injection Layer
6: Hole Transfer Layer
7: Light Emitting Layer
8: Electron Transfer Layer
9: Electron Injection Layer

DETAILED DESCRIPTION

Hereinafter, the present specification will be described in more detail.

An organic light emitting device of the present disclosure includes a first electrode; a second electrode provided opposite to the first electrode; and an organic material layer including a light emitting layer provided between the first electrode and the second electrode, wherein the light emitting layer includes a compound of the following Chemical Formula 1 and a compound of the following Chemical Formula 2.

By the organic light emitting device including a compound of the following Chemical Formula 1 and a compound of the following Chemical Formula 2 in a light emitting layer, the organic light emitting device including the light emitting layer has a low driving voltage and is effective in improving a lifetime of the device.

Chemical Formula 1

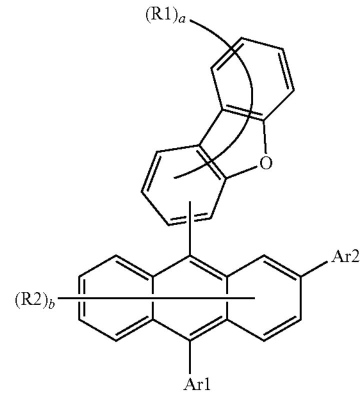

In Chemical Formula 1,

Ar1 and Ar2 are the same as or different from each other, and each independently a substituted or unsubstituted aryl group; or a substituted or unsubstituted heterocyclic group, R1 and R2 are the same as or different from each other, and each independently hydrogen; deuterium; a nitrile group; a halogen group; a silyl group; a boron group; a substituted or unsubstituted alkyl group; a substituted or unsubstituted aryloxy group; a substituted or unsubstituted aryl group; or a substituted or unsubstituted heterocyclic group, or bond to adjacent groups to form a substituted or unsubstituted ring, and a and b are each an integer of 0 to 7, and when a and b are each 2 or greater, substituents in the parentheses are the same as or different from each other, Chemical Formula 2

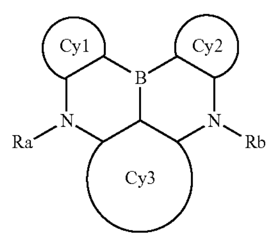

in Chemical Formula 2,

Cy1 to Cy3 are the same as or different from each other, and each independently a substituted or unsubstituted aromatic hydrocarbon ring; or a substituted or unsubstituted aromatic heteroring, Ra is a substituted or unsubstituted alkyl group; a substituted or unsubstituted aryl group; or a substituted or unsubstituted heterocyclic group, or bonds to Cy1 or Cy3 to form a substituted or unsubstituted ring, and Rb is a substituted or unsubstituted alkyl group; a substituted or unsubstituted aryl group; or a substituted or unsubstituted heterocyclic group, or bonds to Cy2 or Cy3 to form a substituted or unsubstituted ring.

In the present specification, a description of a certain part "including" certain constituents means capable of further including other constituents, and does not exclude other constituents unless particularly stated on the contrary.

In the present specification, a description of one member being placed "on" another member includes not only a case of the one member adjoining the another member but a case of still another member being present between the two members.

In the present specification, " " means a site bonding to a chemical formula or a compound.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which a hydrogen atom is substituted, that is, a position at which a substituent may substitute, and when two or more substituents substitute, the two or more substituents may be the same as or different from each other.

In the present specification, the term "substituted or unsubstituted" means being substituted with one, two or more substituents selected from the group consisting of deuterium; a halogen group; a nitrile group; a nitro group; a hydroxyl group; a carbonyl group; an ester group; an imide group; an amino group; a silyl group; a boron group; a substituted or unsubstituted alkoxy group; a substituted or unsubstituted aryloxy group; a substituted or unsubstituted alkyl group; a substituted or unsubstituted cycloalkyl group; a substituted or unsubstituted aryl group; and a substituted or unsubstituted heterocyclic group, being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

Examples of the substituents are described below, however, the substituents are not limited thereto.

In the present specification, examples of the halogen group may include fluorine (—F), chlorine (—Cl), bromine (—Br) or iodine (—I).

In the present specification, the number of carbon atoms of the carbonyl group is not particularly limited, but is preferably from 1 to 40. Specifically, compounds having structures as below may be included, however, the carbonyl group is not limited thereto.

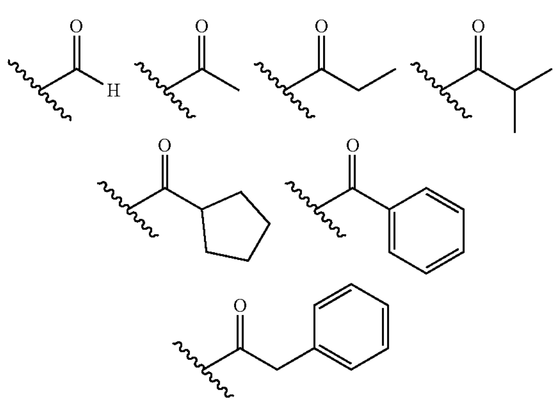

In the present specification, in the ester group, the oxygen of the ester group may be substituted with a linear, branched or cyclic alkyl group having 1 to 20 carbon atoms or an aryl group having 6 to 30 carbon atoms. Specifically, compounds having the following structural formulae may be included, however, the ester group is not limited thereto.

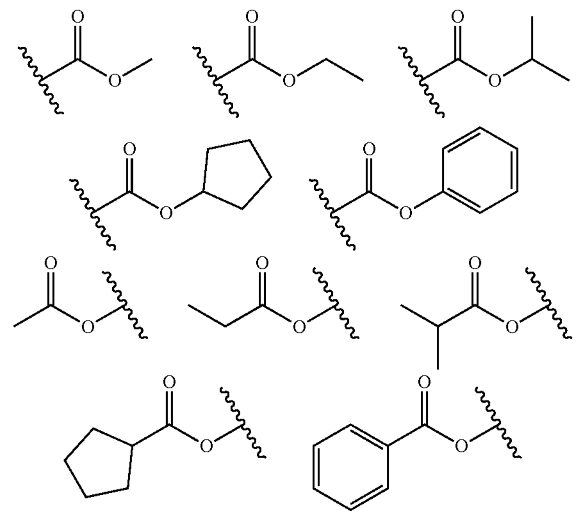

In the present specification, the number of carbon atoms of the imide group is not particularly limited, but is preferably from 1 to 25. Specifically, compounds having structures as below may be included, however, the imide group is not limited thereto.

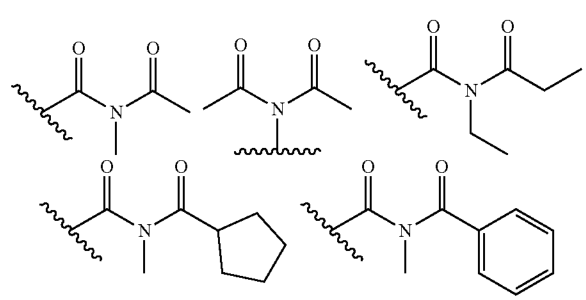

In the present specification, the silyl group may be of a chemical formula of $—SiY_aY_bY_c$, and $Y_a$, $Y_b$ and $Y_c$ may each be hydrogen; a substituted or unsubstituted alkyl group; or a substituted or unsubstituted aryl group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group may be of a chemical formula of $—BY_dY_e$, and $Y_d$ and $Y_c$ may each be hydrogen; a substituted or unsubstituted alkyl group; or a substituted or unsubstituted aryl group. Specific examples of the boron group may include a trimethylboron group, a triethylboron group, a t-butyldimethylboron group, a triphenylboron group, a phenylboron group and the like, but are not limited thereto.

In the present specification, the alkyl group may be linear or branched, and although not particularly limited thereto, the number of carbon atoms is preferably from 1 to 60. According to one embodiment, the number of carbon atoms of the alkyl group is from 1 to 30. According to another embodiment, the number of carbon atoms of the alkyl group is from 1 to 20. According to another embodiment, the number of carbon atoms of the alkyl group is from 1 to 10. Specific examples of the alkyl group may include a methyl group, an ethyl group, a propyl group, an n-propyl group, an isopropyl group, a butyl group, an n-butyl group, an isobutyl group, a tert-butyl group, a pentyl group, an n-pentyl group, a hexyl group, an n-hexyl group, a heptyl group, an n-heptyl group, an octyl group, an n-octyl group and the like, but are not limited thereto.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy and the like, but are not limited thereto.

The alkyl group, the alkoxy group and other substituents including the alkyl group part described in the present specification include both a linear or branched form.

In the present specification, the cycloalkyl group is not particularly limited, but preferably has 3 to 60 carbon atoms, and according to one embodiment, the number of carbon atoms of the cycloalkyl group is from 3 to 30. According to another embodiment, the number of carbon atoms of the cycloalkyl group is from 3 to 20. According to another embodiment, the number of carbon atoms of the cycloalkyl group is from 3 to 6. Specific examples thereof may include a cyclopropyl group, a cyclobutyl group, a cyclopentyl group, a cyclohexyl group, a cycloheptyl group, a cyclooctyl group and the like, but are not limited thereto.

In the present specification, the awl group is not particularly limited, but preferably has 6 to 60 carbon atoms, and may be a monocyclic aryl group or a polycyclic aryl group. According to one embodiment, the number of carbon atoms of the aryl group is from 6 to 30. According to one embodiment, the number of carbon atoms of the aryl group is from 6 to 20. When the aryl group is a monocyclic aryl group, examples thereof may include a phenyl group, a biphenyl group, a terphenyl group, a quaterphenyl group and the like, but are not limited thereto. Examples of the polycyclic aryl group may include a naphthyl group, an anthracenyl group, a phenanthrenyl group, a pyrenyl group, a perylenyl group, a triphenyl group, a chrysenyl group, a fluorenyl group, a triphenylenyl group and the like, but are not limited thereto.

In the present specification, the fluorenyl group may be substituted, and two substituents may bond to each other to form a spiro structure.

When the fluorenyl group is substituted, a spirofluorenyl group such as

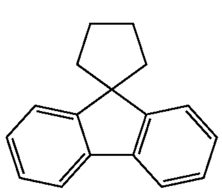

and

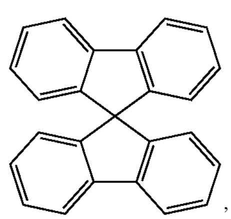

, a substituted fluorenyl group such as

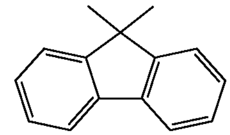

(9,9-dimethylfluorenyl group) and

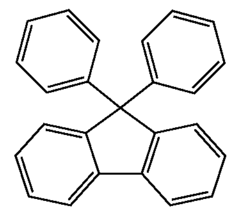 [SMILES: c1ccc(C2(c3ccccc3)c3ccccc3-c3ccccc32)cc1]

(9,9-diphenylfluorenyl group) may be included, however, the structure is not limited thereto.

In the present specification, descriptions on the acyl group provided above may be applied to the aryl group in the aryloxy group.

In the present specification, the heterocyclic group is a cyclic group including one or more of N, O, P, S, Si and Se as a heteroatom, and although not particularly limited thereto, the number of carbon atoms is preferably from 2 to 60. According to one embodiment, the number of carbon atoms of the heterocyclic group is from 2 to 30. Examples of the heterocyclic group may include a pyridine group, a pyrrole group, a pyrimidine group, a quinoline group, a pyridazinyl group, a furan group, a thiophene group, an imidazole group, a pyrazole group, a dibenzofuran group, a dibenzothiophene group, a carbazole group, a benzocarbazole group, a naphthobenzofuran group, a benzonaphthothiophene group, an indenocarbazole group and the like, but are not limited thereto.

In the present specification, descriptions on the heterocyclic group provided above may be applied to the heteroaryl group except for those that are aromatic.

In the present specification, the "ring" in the substituted or unsubstituted ring formed by bonding to adjacent groups means a hydrocarbon ring; or a heteroring.

The hydrocarbon ring may be aromatic, aliphatic or a fused ring of aromatic and aliphatic, and may be selected from among the examples of the cycloalkyl group or the aryl group except for those that are a divalent group.

In the present specification, descriptions on the awl group may be applied to the aromatic hydrocarbon ring except for those that are divalent.

Descriptions on the heterocyclic group may be applied to the heteroring except for those that are divalent.

According to one embodiment of the present disclosure, Ar1 and Ar2 are the same as or different from each other, and each independently a substituted or unsubstituted aryl group having 6 to 60 carbon atoms; or a substituted or unsubstituted heterocyclic group having 2 to 60 carbon atoms.

According to another embodiment, Ar1 and Ar2 are the same as or different from each other, and each independently a substituted or unsubstituted aryl group having 6 to 30 carbon atoms; or a substituted or unsubstituted heterocyclic group having 2 to 30 carbon atoms.

According to another embodiment Ar1 and Ar2 are the same as or different from each other, and each independently a substituted or unsubstituted aryl group having 6 to 15 carbon atoms; or a substituted or unsubstituted heterocyclic group having 2 to 15 carbon atoms.

According to another embodiment Ar1 and Ar2 are the same as or different from each other, and each independently a substituted or unsubstituted aryl group having 6 to 10 carbon atoms; or a substituted or unsubstituted heterocyclic group having 2 to 10 carbon atoms.

In another embodiment, Ar1 and Ar2 are the same as or different from each other, and each independently a substituted or unsubstituted phenyl group; a substituted or unsubstituted biphenyl group; a substituted or unsubstituted naphthyl group; a substituted or unsubstituted phenanthrenyl group; a substituted or unsubstituted triphenylenyl group; a substituted or unsubstituted pyrenyl group; a substituted or unsubstituted dibenzofuran group; a substituted or unsubstituted dibenzothiophene group; or a substituted or unsubstituted carbazole group.

In another embodiment, Ar1 and Ar2 are the same as or different from each other, and each independently a phenyl group unsubstituted or substituted with one or more substituents selected from the group consisting of an alkyl group, an aryl group, a halogen group, a nitrile group, a trifluoromethyl group, a silyl group and an alkoxy group; a biphenyl group unsubstituted or substituted with one or more substituents selected from the group consisting of an alkyl group, an aryl group, a halogen group, a nitrile group, a trifluoromethyl group, a silyl group and an alkoxy group; a naphthyl group unsubstituted or substituted with one or more substituents selected from the group consisting of an alkyl group, an aryl group, a halogen group, a nitrile group, a trifluoromethyl group, a silyl group and an alkoxy group; a phenanthrenyl group unsubstituted or substituted with one or more substituents selected from the group consisting of an alkyl group, an aryl group, a halogen group, a nitrile group, a trifluoromethyl group, a silyl group and an alkoxy group; a triphenylenyl group unsubstituted or substituted with one or more substituents selected from the group consisting of an alkyl group, an aryl group, a halogen group, a nitrile group, a trifluoromethyl group, a silyl group and an alkoxy group; a pyrenyl group unsubstituted or substituted with one or more substituents selected from the group consisting of an alkyl group, an aryl group, a halogen group, a nitrile group, a trifluoromethyl group, a silyl group and an alkoxy group; a dibenzofuran group unsubstituted or substituted with one or more substituents selected from the group consisting of an alkyl group, an aryl group, a halogen group, a nitrile group, a trifluoromethyl group, a silyl group and an alkoxy group; a dibenzothiophene group unsubstituted or substituted with one or more substituents selected from the group consisting of an alkyl group, an aryl group, a halogen group, a nitrile group, a trifluoromethyl group, a silyl group and an alkoxy group; or a carbazole group unsubstituted or substituted with one or more substituents selected from the group consisting of an alkyl group, an aryl group, a halogen group, a nitrile group, a trifluoromethyl group, a silyl group and an alkoxy group.

In another embodiment, Ar1 and Ar2 are the same as or different from each other, and each independently a phenyl group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a biphenyl group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a naphthyl group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a phenanthrenyl group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a triphenylenyl group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a pyrenyl group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a dibenzofuran group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; a dibenzothiophene group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group; or a carbazole group unsubstituted or substituted with one or more substituents selected from the group consisting of a methyl group, an ethyl group, an isopropyl group, a t-butyl group, a phenyl group, a naphthyl group, a fluorine group, a nitrile group, a trifluoromethyl group, a trimethylsilyl group and a methoxy group.

According to one embodiment of the present disclosure, R1 and R2 are the same as or different from each other, and each independently hydrogen; deuterium; a nitrile group; a halogen group; a silyl group; a boron group; a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms, or bond to adjacent groups to form a substituted or unsubstituted ring.

According to another embodiment, R2 is hydrogen.

In another embodiment, R1 is hydrogen; deuterium; a nitrile group; a halogen group; a silyl group; a substituted or unsubstituted aryloxy group; or a substituted or unsubstituted aryl group.

According to another embodiment, R1 is hydrogen; deuterium; a nitrile group; a halogen group; a silyl group; a substituted or unsubstituted aryloxy group having 6 to 30 carbon atoms; or a substituted or unsubstituted aryl group having 6 to 30 carbon atoms.

In another embodiment, R1 is hydrogen; deuterium; a nitrile group; a halogen group; a silyl group; an aryloxy group having 6 to 30 carbon atoms; or an aryl group having 6 to 30 carbon atoms.

According to another embodiment, R1 is hydrogen; deuterium; a nitrile group; a halogen group; a trimethylsilyl group; a phenyloxy group; a phenyl group; or a naphthyl group.

According to one embodiment of the present disclosure, a and b are each an integer of 0 to 2.

In another embodiment, a and b are each 0 or 1.

According to one embodiment of the present disclosure, Chemical Formula 1 may be of any one of the following Chemical Formulae 1-1 to 1-4.

[Chemical Formula 1-1]

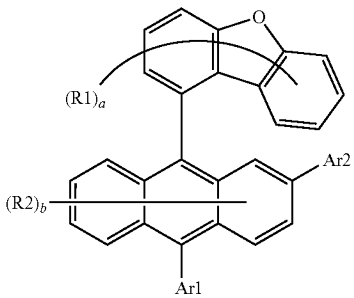

[Chemical Formula 1-2]

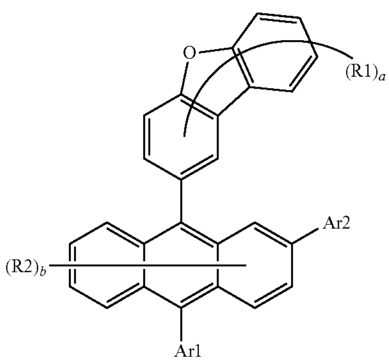

-continued

[Chemical Formula 1-3]

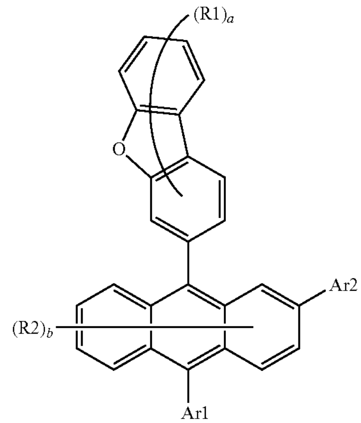

[Chemical Formula 1-4]

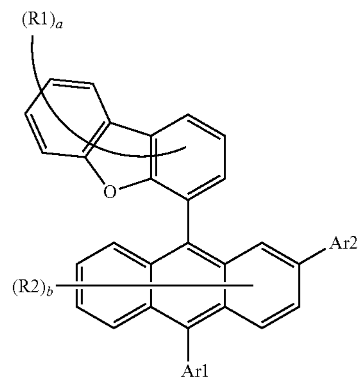

In Chemical Formulae 1-1 to 1-4,

R1, R2, Ar1, Ar2, a and b have the same definitions as in Chemical Formula 1. According to one embodiment of the present disclosure, Chemical Formula 1 may be any one of compounds presented in the following table.

| No. | | Ar1 | Ar2 |
|---|---|---|---|
| 1-1 | 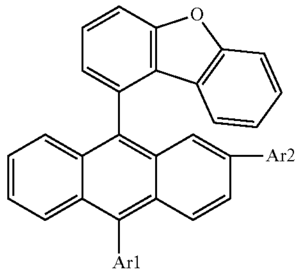 | 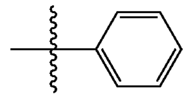 [SMILES: *c1ccccc1] | 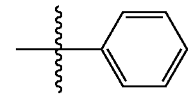 [SMILES: *c1ccccc1] |
| 1-2 | 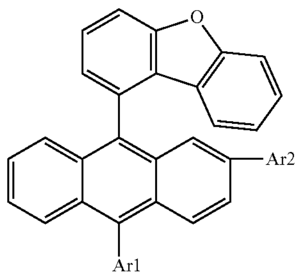 | 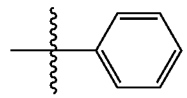 | 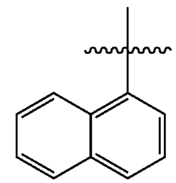 [SMILES: *c1cccc2ccccc12] |
| 1-3 | 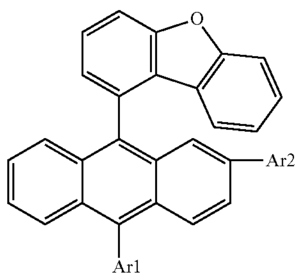 | 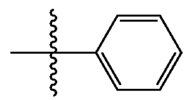 [SMILES: *c1ccccc1] | 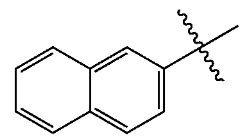 [SMILES: *c1ccc2ccccc2c1] |

-continued
| No. | | Ar1 | Ar2 |
|---|---|---|---|
| 1-4 | 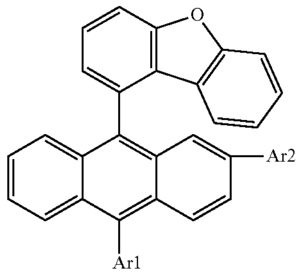  | 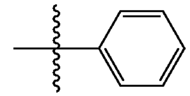 [SMILES: *c1ccccc1] | 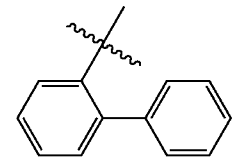 [SMILES: *c1ccccc1-c1ccccc1] |
| 1-5 | 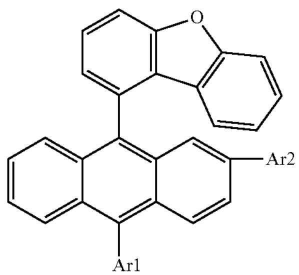  | 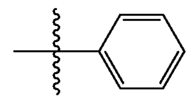 | 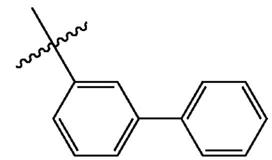 [SMILES: *c1cccc(-c2ccccc2)c1] |
| 1-6 | 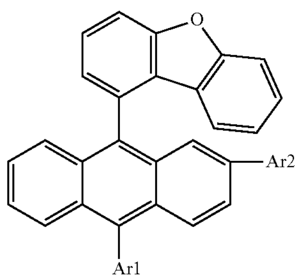  | 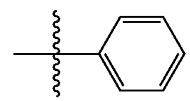 | 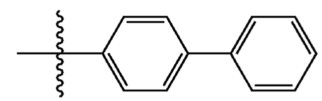 |

-continued
| No. | | Ar1 | Ar2 |
|---|---|---|---|
| 1-7 | 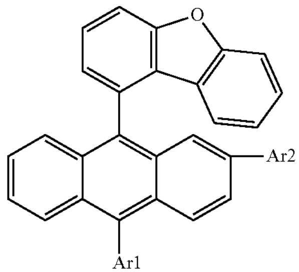 | 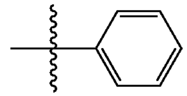 [SMILES: *c1ccccc1] | 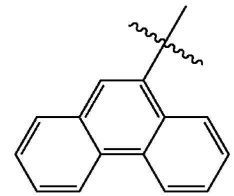 [SMILES: *c1cc2ccccc2c2ccccc12] |
| 1-8 | 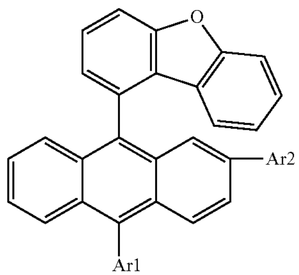 | 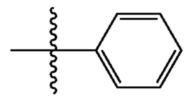 | 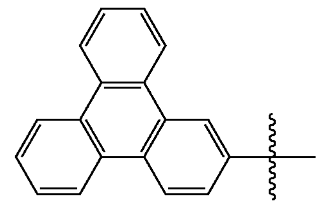 [SMILES: *c1ccc2c3ccccc3c3ccccc3c2c1] |
| 1-9 | 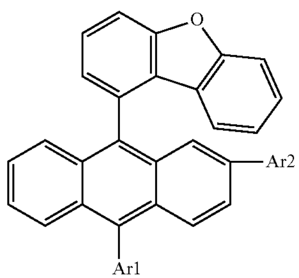 | 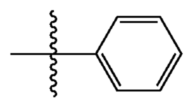 | 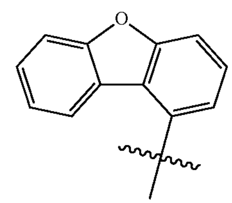 [SMILES: *c1cccc2oc3ccccc3c12] |

-continued
| No. | | Ar1 | Ar2 |
| --- | --- | --- | --- |
| 1-10 | 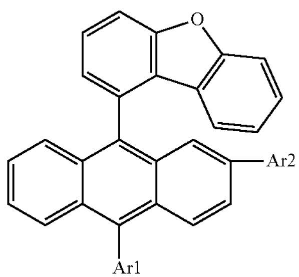 | 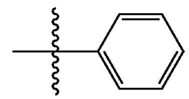 [SMILES: *c1ccccc1] | 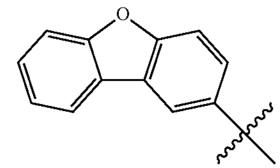 [SMILES: *c1ccc2oc3ccccc3c2c1] |
| 1-11 | 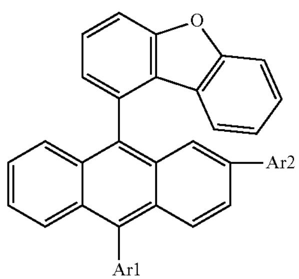 | 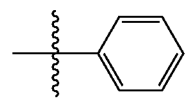 [SMILES: *c1ccccc1] | 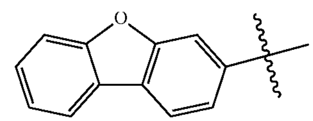 |
| 1-12 | 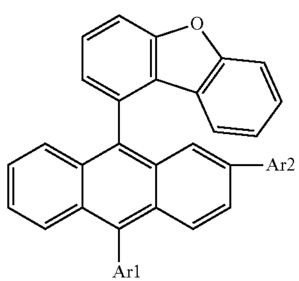 | 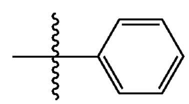 | 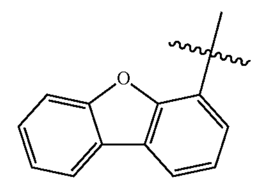 [SMILES: *c1cccc2c1oc1ccccc12] |

-continued
| No. | | Ar1 | Ar2 |
|---|---|---|---|
| 1-13 | 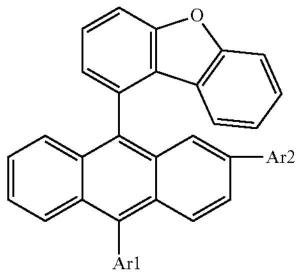 | 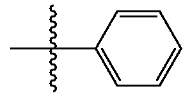 [SMILES: *c1ccccc1] | 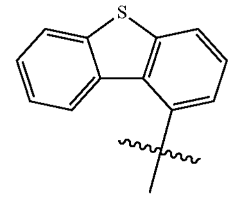 [SMILES: *c1cccc2sc3ccccc3c12] |
| 1-14 | 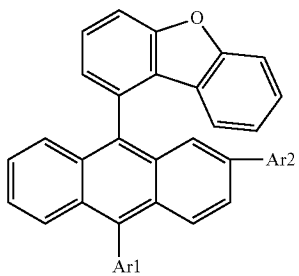 | 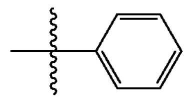 [SMILES: *c1ccccc1] | 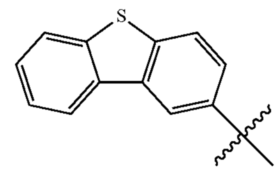 |
| 1-15 | 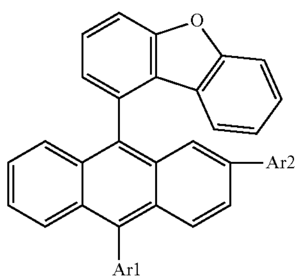 | 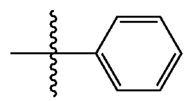 [SMILES: *c1ccccc1] | 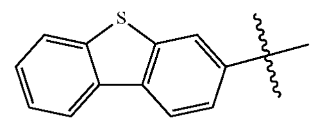 |

-continued
| No. | | Ar1 | Ar2 |
|---|---|---|---|
| 1-16 | 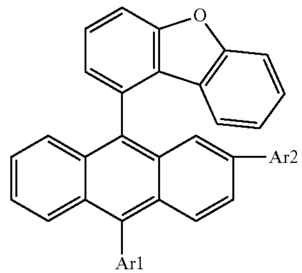 | 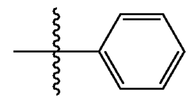 [SMILES: *c1ccccc1] | 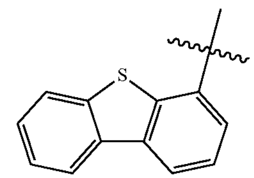 [SMILES: *c1cccc2c1sc1ccccc12] |
| 1-17 | 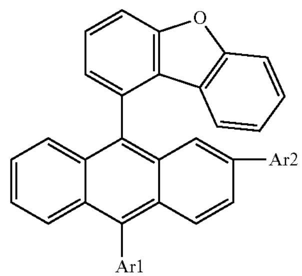 | 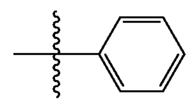 [SMILES: *c1ccccc1] | 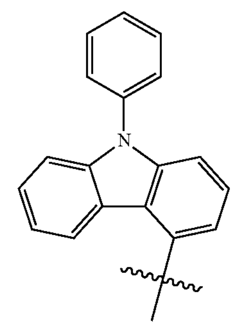 [SMILES: *c1cccc2c1c1ccccc1n2-c1ccccc1] |
| 1-18 | 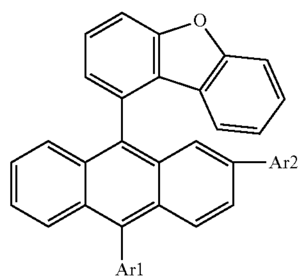 | 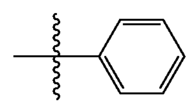 [SMILES: *c1ccccc1] | 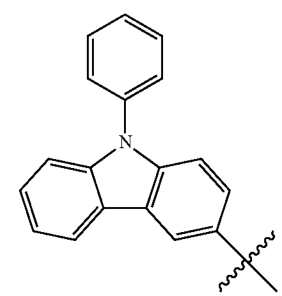 [SMILES: *c1ccc2c(c1)c1ccccc1n2-c1ccccc1] |

-continued
| No. | | Ar1 | Ar2 |
|---|---|---|---|
| 1-19 | 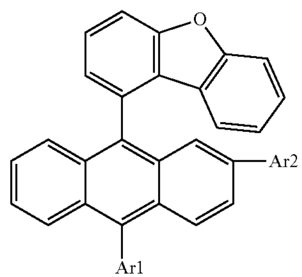  | 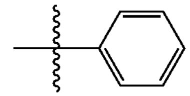 | 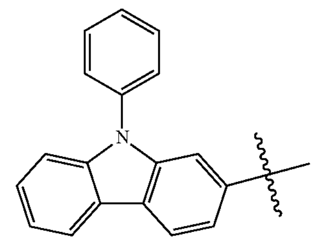 [SMILES: *c1ccc2c3ccccc3n(-c3ccccc3)c2c1]  |
| 1-20 | 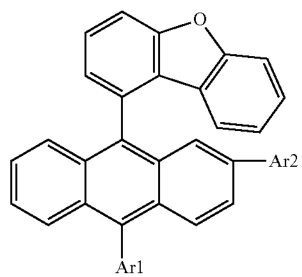  | 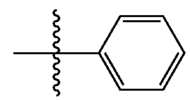 [SMILES: *c1ccccc1] | 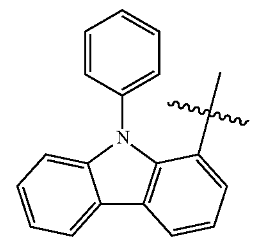 [SMILES: *c1cccc2c3ccccc3n(-c3ccccc3)c12]  |
| 1-21 | 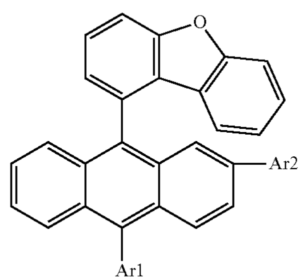  | 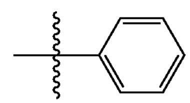 [SMILES: *c1ccccc1] | 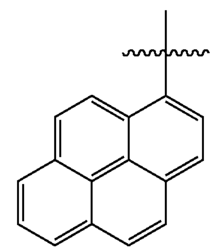 [SMILES: *c1ccc2ccc3cccc4ccc1c2c34] |

-continued
| No. | | Ar1 | Ar2 |
|---|---|---|---|
| 1-22 | 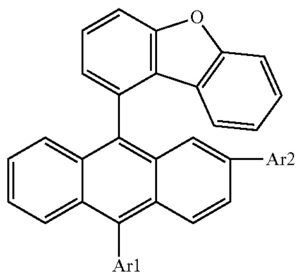 | 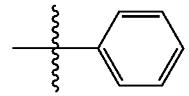 | 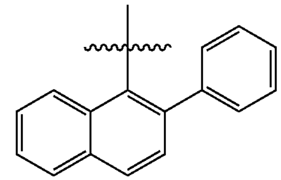 [SMILES: *c1c(-c2ccccc2)ccc2ccccc12] |
| 1-23 | 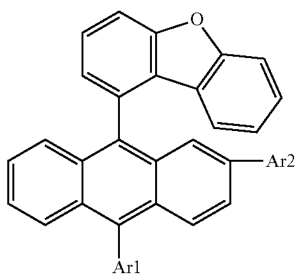 | 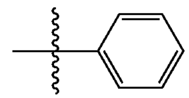 [SMILES: *c1ccccc1] | 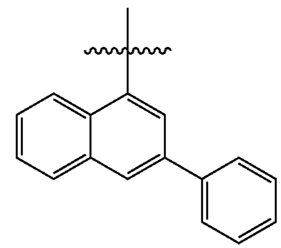 [SMILES: *c1cc(-c2ccccc2)cc2ccccc12] |
| 1-24 | 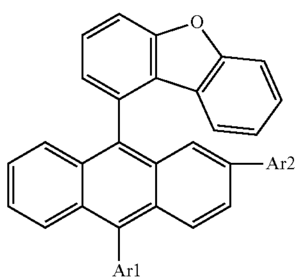 | 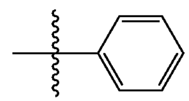 [SMILES: *c1ccccc1] | 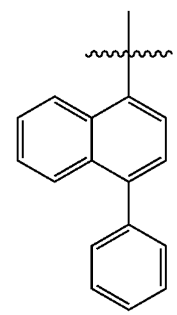 [SMILES: *c1ccc(-c2ccccc2)c2ccccc12] |

-continued
| No. | | Ar1 | Ar2 |
|---|---|---|---|
| 1-25 | 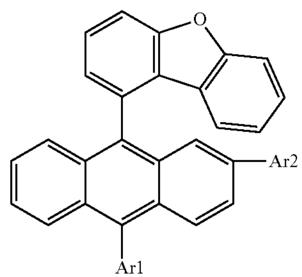 | 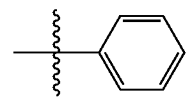 | 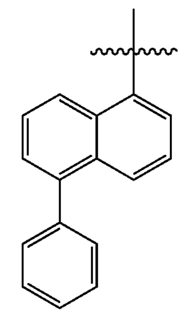 [SMILES: *c1cccc2c(-c3ccccc3)cccc12] |
| 1-26 | 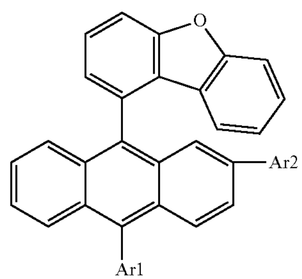 | 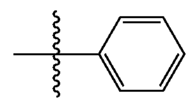 [SMILES: *c1ccccc1] | 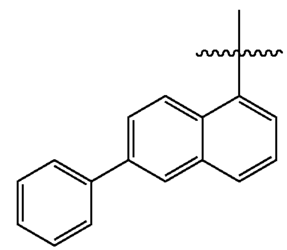 [SMILES: *c1cccc2cc(-c3ccccc3)ccc12] |
| 1-27 | 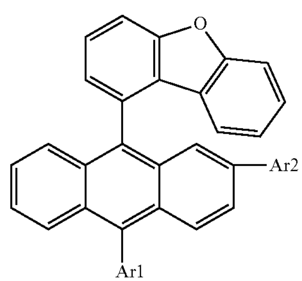 | 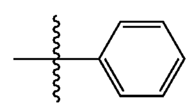 [SMILES: *c1ccccc1] | 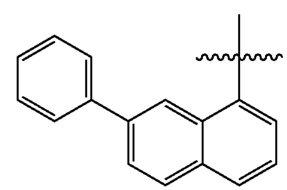 [SMILES: *c1cccc2ccc(-c3ccccc3)cc12] |

-continued
| No. | | Ar1 | Ar2 |
|---|---|---|---|
| 1-28 | 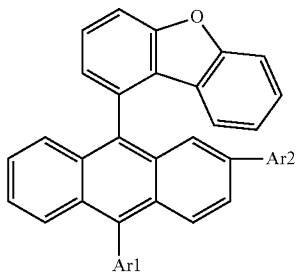 | 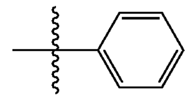 | 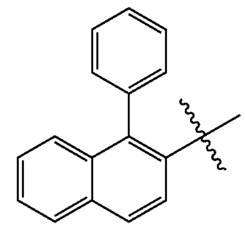 [SMILES: *c1ccc2ccccc2c1-c1ccccc1] |
| 1-29 | 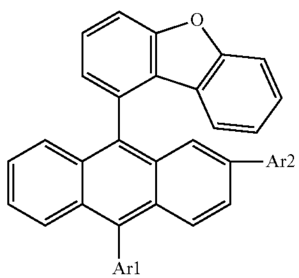 | 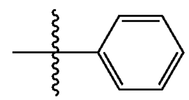 | 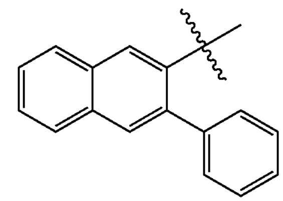 [SMILES: *c1cc2ccccc2cc1-c1ccccc1] |
| 1-30 | 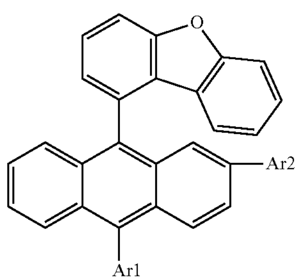 | 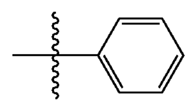 | 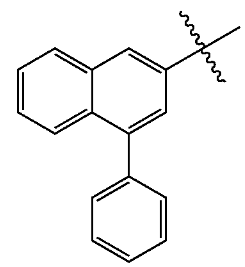 [SMILES: *c1cc(-c2ccccc2)c2ccccc2c1] |

-continued
| No. | | Ar1 | Ar2 |
|---|---|---|---|
| 1-31 | 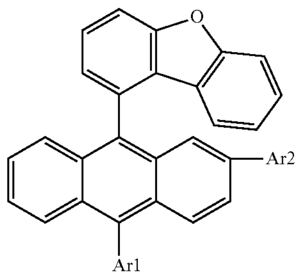 | 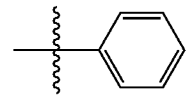 | 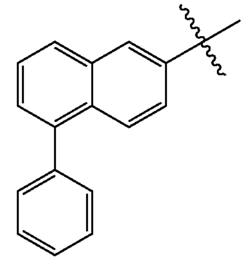 [SMILES: *c1ccc2c(-c3ccccc3)cccc2c1] |
| 1-32 | 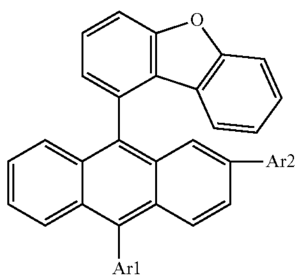 | 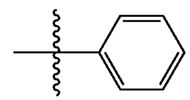 | 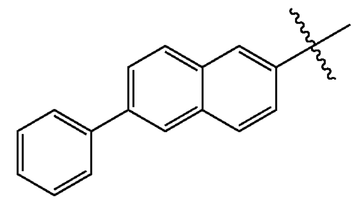 [SMILES: *c1ccc2cc(-c3ccccc3)ccc2c1] |
| 1-33 | 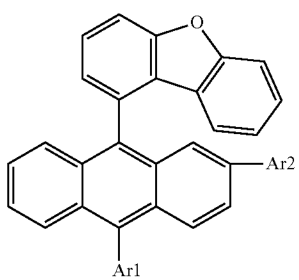 | 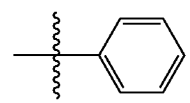 | 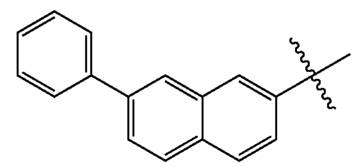 [SMILES: *c1ccc2ccc(-c3ccccc3)cc2c1] |

-continued
| No. | | Ar1 | Ar2 |
|---|---|---|---|
| 1-34 | 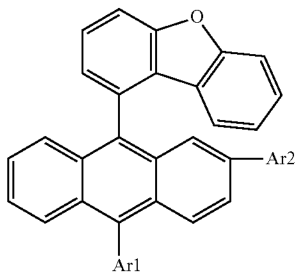 | 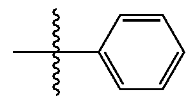 | 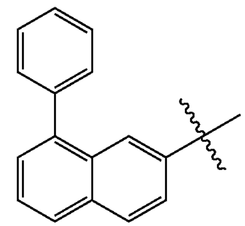 [SMILES: *c1ccc2cccc(-c3ccccc3)c2c1] |
| 1-35 | 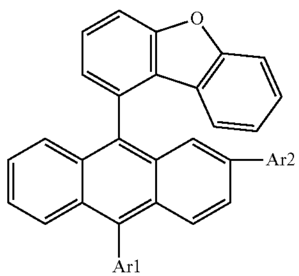 | 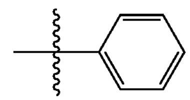 [SMILES: *c1ccccc1] | 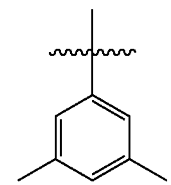 |
| 1-36 | 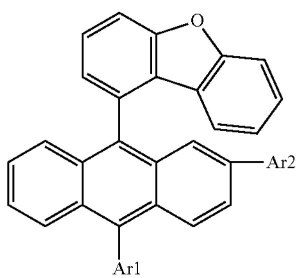 | 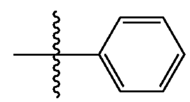 | 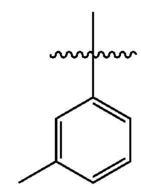 [SMILES: *c1cccc(C)c1] |

-continued
| No. | | Ar1 | Ar2 |
|---|---|---|---|
| 1-37 | 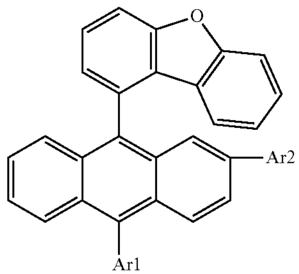 | 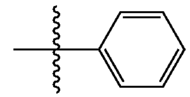 [SMILES: *c1ccccc1] | 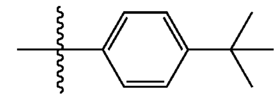 |
| 1-38 | 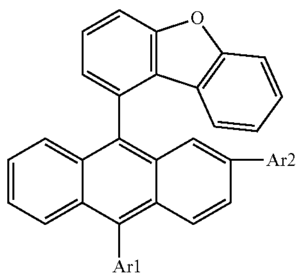 | 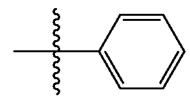 [SMILES: *c1ccccc1] | 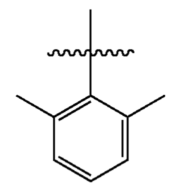 |
| 1-39 | 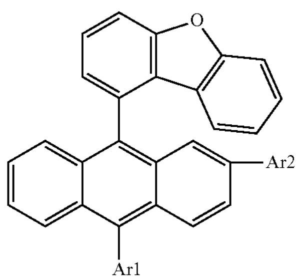 | 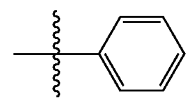 [SMILES: *c1ccccc1] | 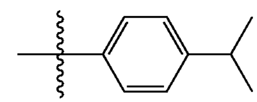 [SMILES: *c1ccc(C(C)C)cc1] |

-continued
| No. | | Ar1 | Ar2 |
|---|---|---|---|
| 1-40 | 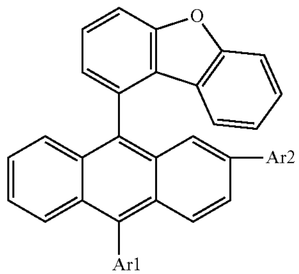 | 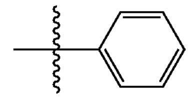 [SMILES: *c1ccccc1] | 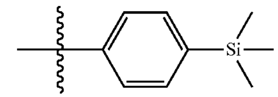 |
| 1-41 | 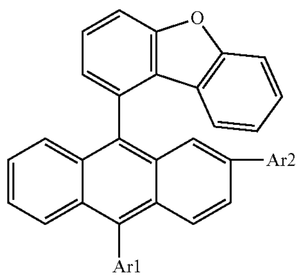 | 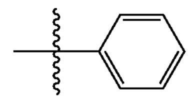 [SMILES: *c1ccccc1] | 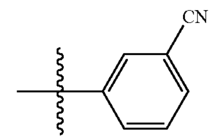 [SMILES: *c1cccc(C#N)c1] |
| 1-42 | 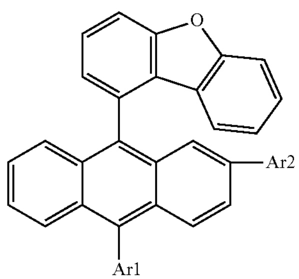 | 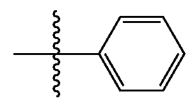 [SMILES: *c1ccccc1] | 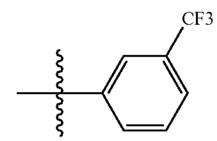 [SMILES: *c1cccc(C(F)(F)F)c1] |

-continued
| No. | | Ar1 | Ar2 |
|---|---|---|---|
| 1-43 | 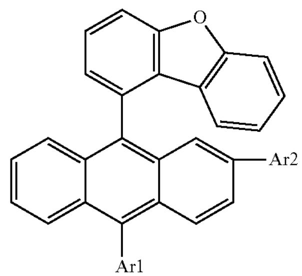 | 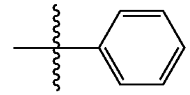 [SMILES: *c1ccccc1] | 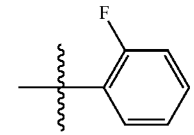 [SMILES: *c1ccccc1F] |
| 1-44 | 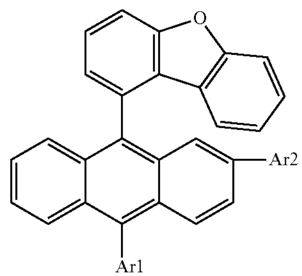 | 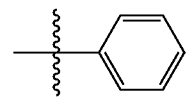 | 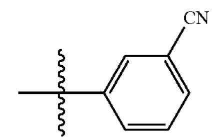 [SMILES: *c1cccc(C#N)c1] |
| 1-45 | 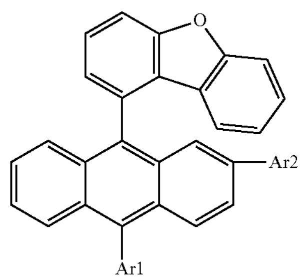 | 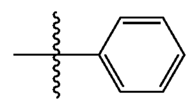 [SMILES: *c1ccccc1] | 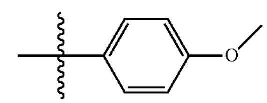 [SMILES: *c1ccc(OC)cc1] |

-continued
| No. | | Ar1 | Ar2 |
|---|---|---|---|
| 1-46 | 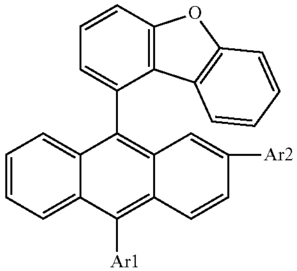 | 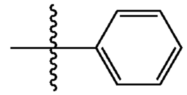 [SMILES: *c1ccccc1] | 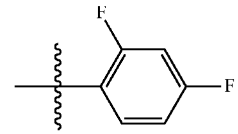 [SMILES: *c1ccc(F)cc1F] |
| 2-1 | 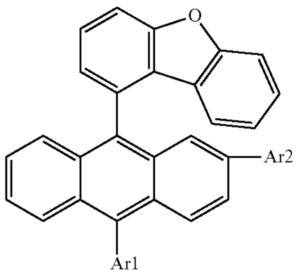 | 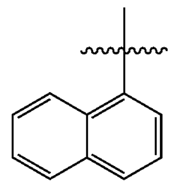 [SMILES: *c1cccc2ccccc12] | 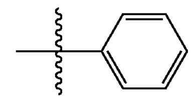 [SMILES: *c1ccccc1] |
| 2-2 | 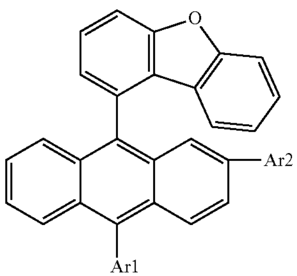 | 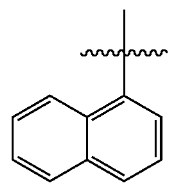 [SMILES: *c1cccc2ccccc12] | 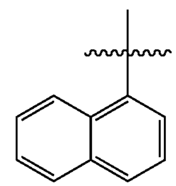 [SMILES: *c1cccc2ccccc12] |

-continued
| No. | | Ar1 | Ar2 |
|---|---|---|---|
| 2-3 | 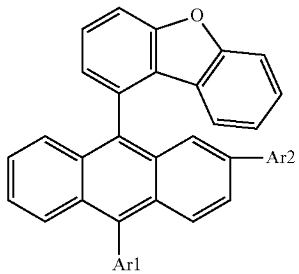 | 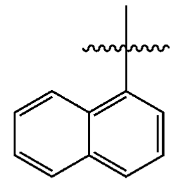 [SMILES: *c1cccc2ccccc12] | 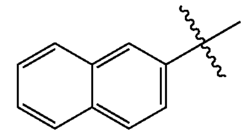 [SMILES: *c1ccc2ccccc2c1] |
| 2-4 | 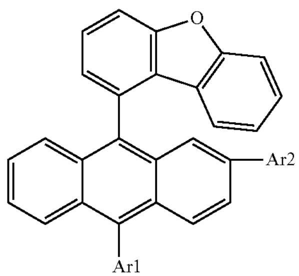 | 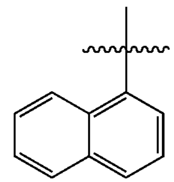 [SMILES: *c1cccc2ccccc12] | 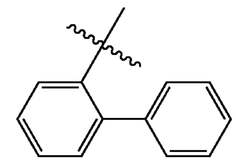 [SMILES: *c1ccccc1-c1ccccc1] |
| 2-5 | 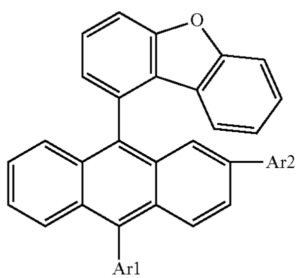 | 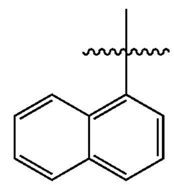 [SMILES: *c1cccc2ccccc12] | 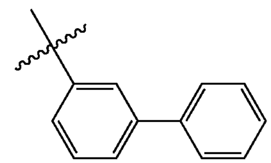 [SMILES: *c1cccc(-c2ccccc2)c1] |

-continued
| No. | | Ar1 | Ar2 |
|---|---|---|---|
| 2-6 | 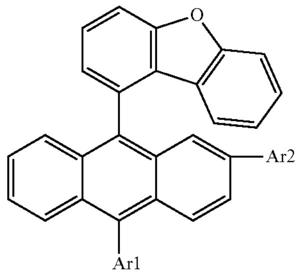 | 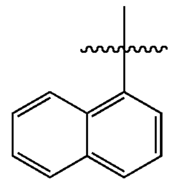 [SMILES: *c1cccc2ccccc12] | 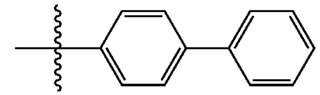 [SMILES: *c1ccc(-c2ccccc2)cc1] |
| 2-7 | 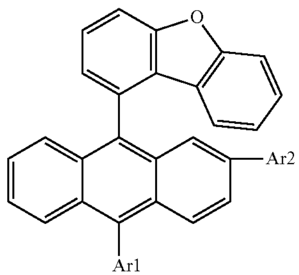 | 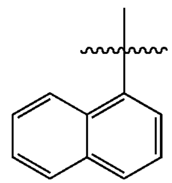 [SMILES: *c1cccc2ccccc12] | 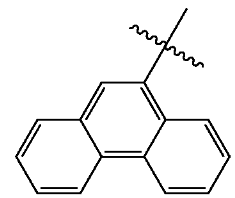 [SMILES: *c1cc2ccccc2c2ccccc12] |
| 2-8 | 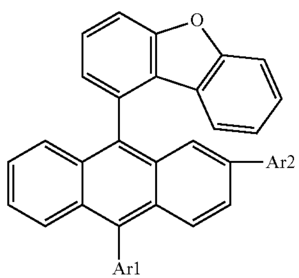 | 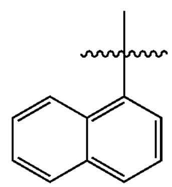 [SMILES: *c1cccc2ccccc12] | 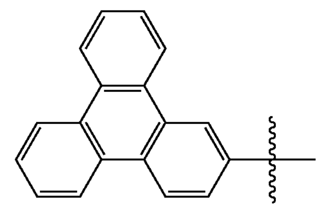 [SMILES: *c1ccc2c3ccccc3c3ccccc3c2c1] |

-continued
| No. | | Ar1 | Ar2 |
|---|---|---|---|
| 2-9 | 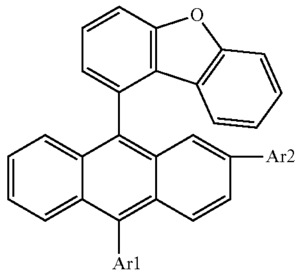 | 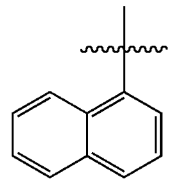 [SMILES: *c1cccc2ccccc12] | 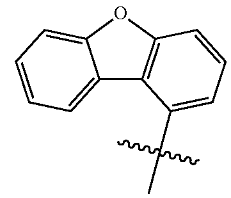 |
| 2-10 | 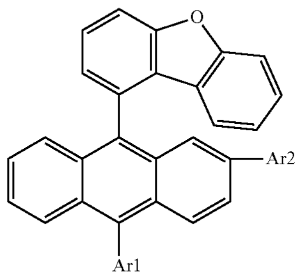 | 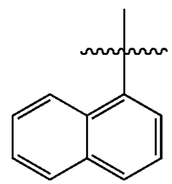 [SMILES: *c1cccc2ccccc12] | 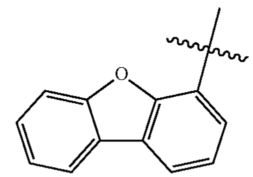 [SMILES: *c1cccc2c1oc1ccccc12] |
| 2-11 | 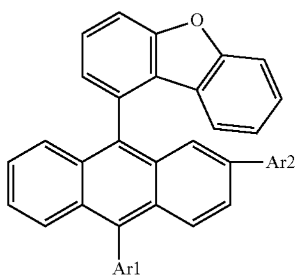 | 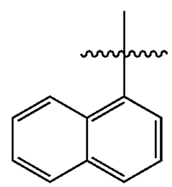 [SMILES: *c1cccc2ccccc12] | 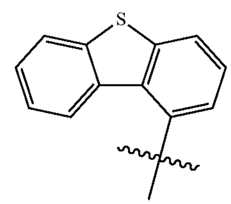 [SMILES: *c1cccc2sc3ccccc3c12] |

-continued
| No. | | Ar1 | Ar2 |
|---|---|---|---|
| 2-12 | 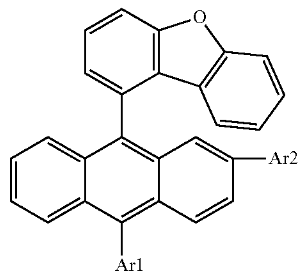 | 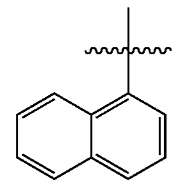 [SMILES: *c1cccc2ccccc12] | 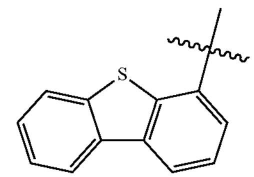 |
| 2-13 | 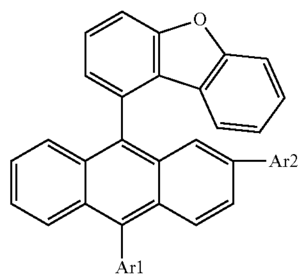 | 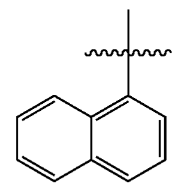 [SMILES: *c1cccc2ccccc12] | 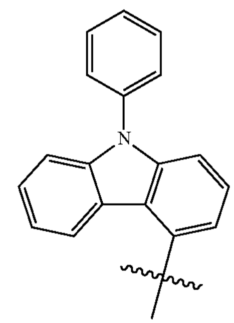 [SMILES: *c1cccc2c1c1ccccc1n2-c1ccccc1] |
| 2-14 | 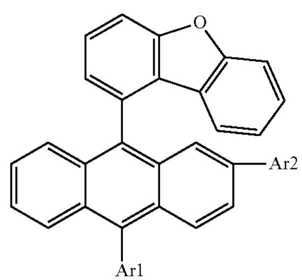 | 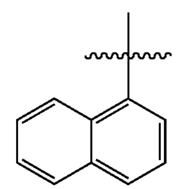 [SMILES: *c1cccc2ccccc12] | 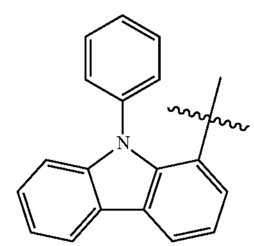 [SMILES: *c1cccc2c3ccccc3n(-c3ccccc3)c12] |

-continued
| No. | | Ar1 | Ar2 |
|---|---|---|---|
| 2-15 | 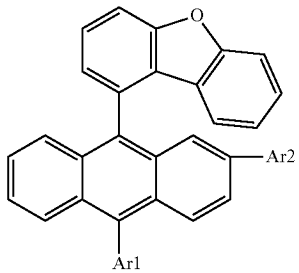  | 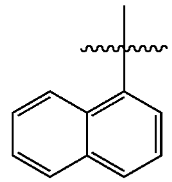 [SMILES: *c1cccc2ccccc12] | 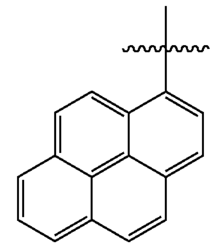 [SMILES: *c1ccc2ccc3cccc4ccc1c2c34] |
| 2-16 | 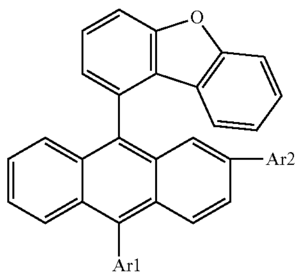  | 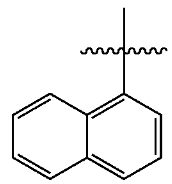 [SMILES: *c1cccc2ccccc12] | 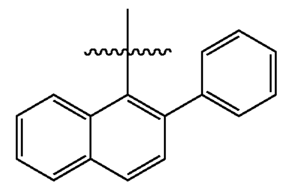 [SMILES: *c1c(-c2ccccc2)ccc2ccccc12] |
| 2-17 | 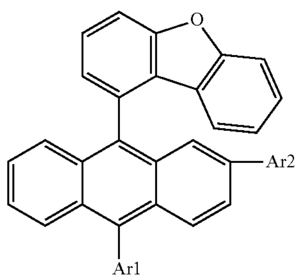  | 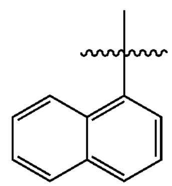 [SMILES: *c1cccc2ccccc12] | 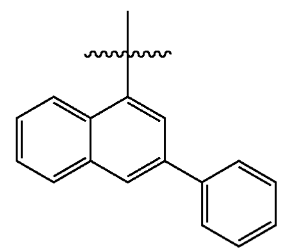 [SMILES: *c1cc(-c2ccccc2)cc2ccccc12] |

-continued
| No. | | Ar1 | Ar2 |
|---|---|---|---|
| 2-18 | 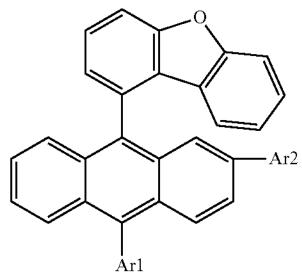 | 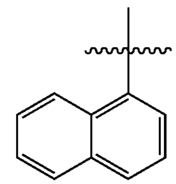 [SMILES: *c1cccc2ccccc12] | 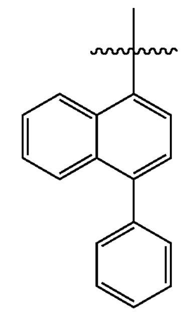 [SMILES: *c1ccc(-c2ccccc2)c2ccccc12] |
| 2-19 | 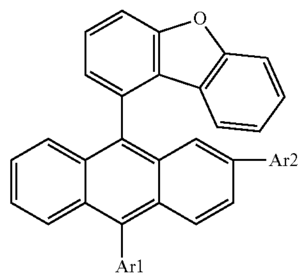 | 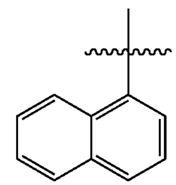 [SMILES: *c1cccc2ccccc12] | 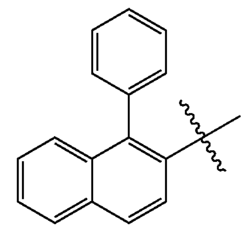 [SMILES: *c1ccc2ccccc2c1-c1ccccc1] |
| 2-20 | 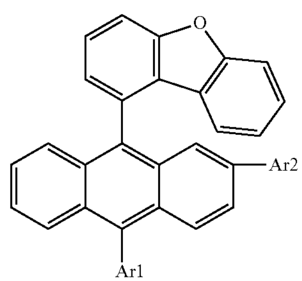 | 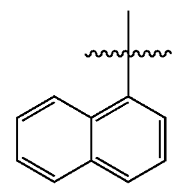 [SMILES: *c1cccc2ccccc12] | 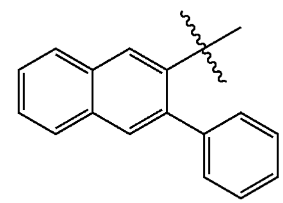 [SMILES: *c1cc2ccccc2cc1-c1ccccc1] |

-continued
| No. | | Ar1 | Ar2 |
|---|---|---|---|
| 2-21 | 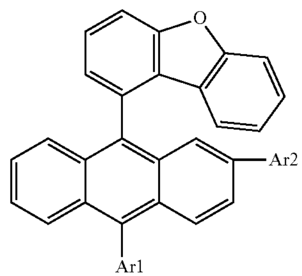 | 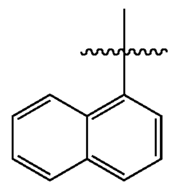 [SMILES: *c1cccc2ccccc12] | 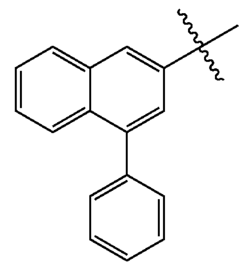 [SMILES: *c1cc(-c2ccccc2)c2ccccc2c1] |
| 2-22 | 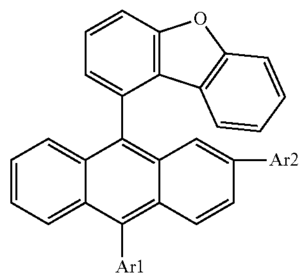 | 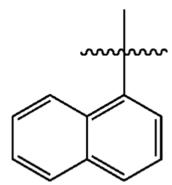 [SMILES: *c1cccc2ccccc12] | 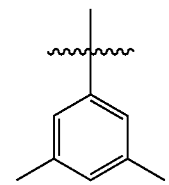 |
| 2-23 | 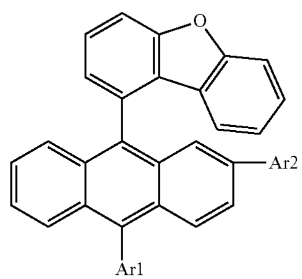 | 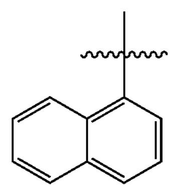 [SMILES: *c1cccc2ccccc12] | 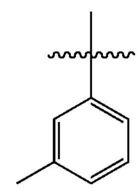 [SMILES: *c1cccc(C)c1] |

-continued
| No. | | Ar1 | Ar2 |
|---|---|---|---|
| 2-24 | 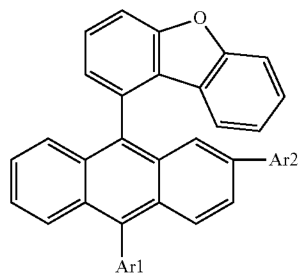 | 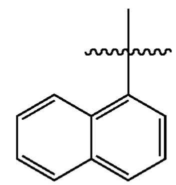 [SMILES: *c1cccc2ccccc12] | 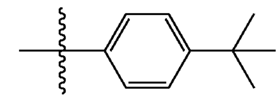 [SMILES: *c1ccc(C(C)(C)C)cc1] |
| 2-25 | 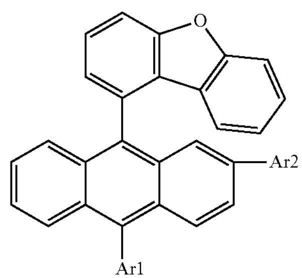 | 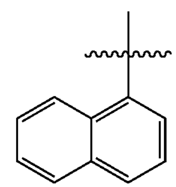 [SMILES: *c1cccc2ccccc12] | 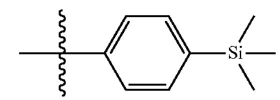 |
| 2-26 | 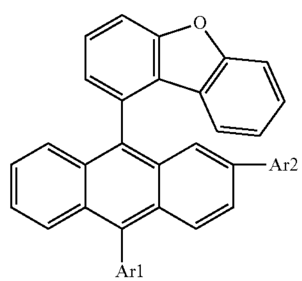 | 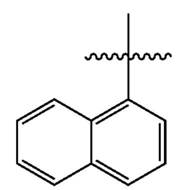 [SMILES: *c1cccc2ccccc12] | 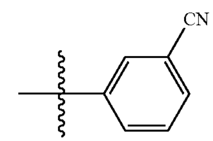 [SMILES: *c1cccc(C#N)c1] |

-continued
| No. | | Ar1 | Ar2 |
|---|---|---|---|
| 2-27 | 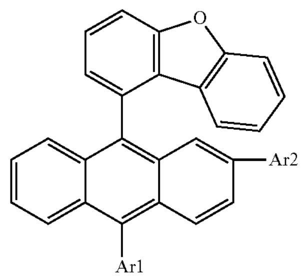  | 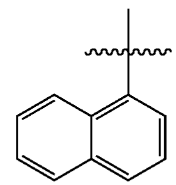 [SMILES: *c1cccc2ccccc12] | 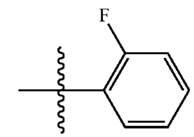  |
| 2-29 | 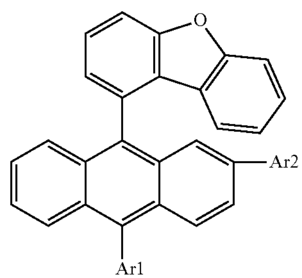  | 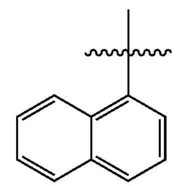 [SMILES: *c1cccc2ccccc12] | 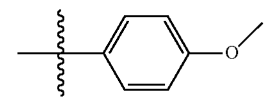  |
| 3-1 | 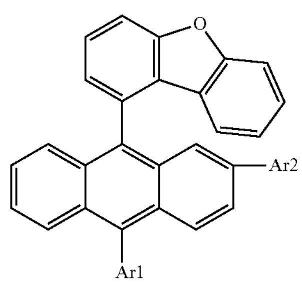  | 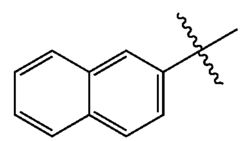 [SMILES: *c1ccc2ccccc2c1] | 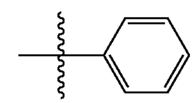 [SMILES: *c1ccccc1] |

-continued
| No. | | Ar1 | Ar2 |
|---|---|---|---|
| 3-2 | 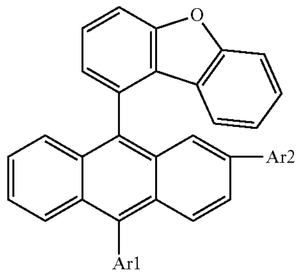 | 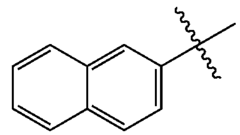 [SMILES: *c1ccc2ccccc2c1] | 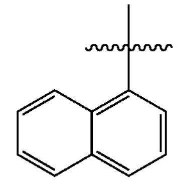 [SMILES: *c1cccc2ccccc12] |
| 3-3 | 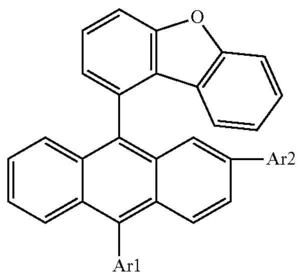 | 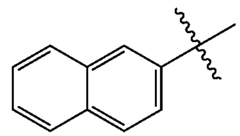 [SMILES: *c1ccc2ccccc2c1] | 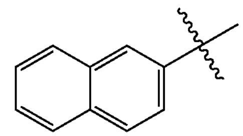 [SMILES: *c1ccc2ccccc2c1] |
| 3-4 | 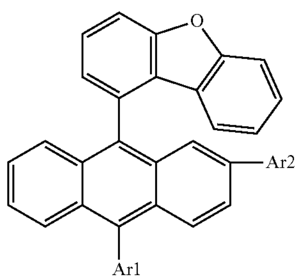 | 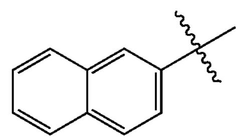 [SMILES: *c1ccc2ccccc2c1] | 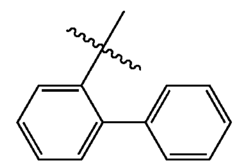 [SMILES: *c1ccccc1-c1ccccc1] |

-continued
| No. | | Ar1 | Ar2 |
|---|---|---|---|
| 3-5 | 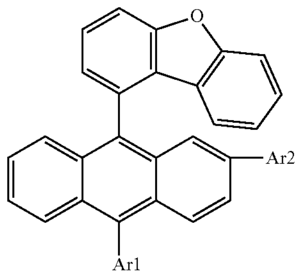 | 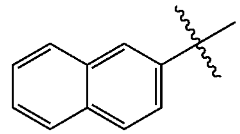 [SMILES: *c1ccc2ccccc2c1] | 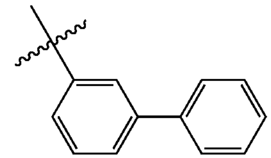 [SMILES: *c1cccc(-c2ccccc2)c1] |
| 3-6 | 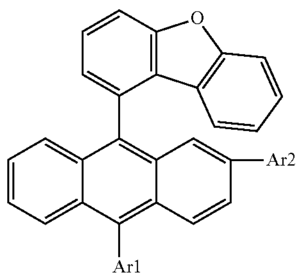 | 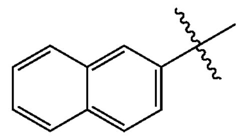 [SMILES: *c1ccc2ccccc2c1] | 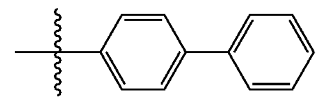 |
| 3-7 | 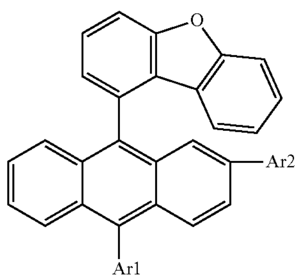 | 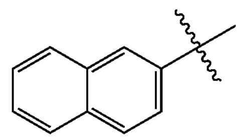 [SMILES: *c1ccc2ccccc2c1] | 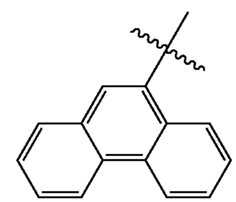 [SMILES: *c1cc2ccccc2c2ccccc12] |

-continued
| No. | | Ar1 | Ar2 |
|---|---|---|---|
| 3-8 | 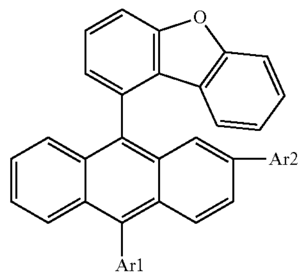 | 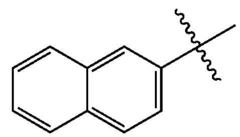 [SMILES: *c1ccc2ccccc2c1] | 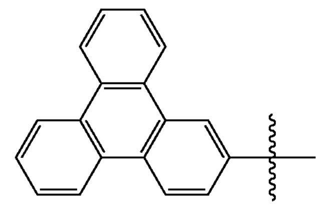 |
| 3-9 | 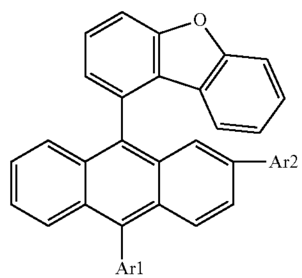 | 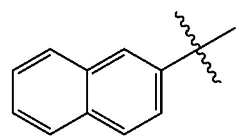 [SMILES: *c1ccc2ccccc2c1] | 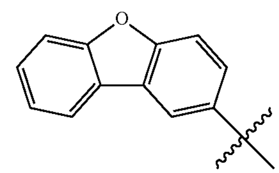 |
| 3-10 | 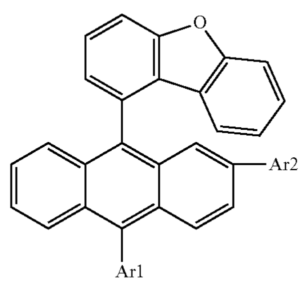 | 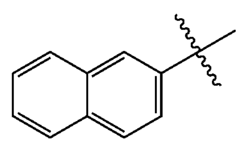 [SMILES: *c1ccc2ccccc2c1] | 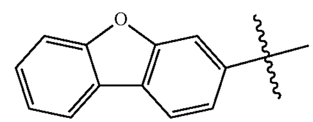 |

-continued
| No. | | Ar1 | Ar2 |
|---|---|---|---|
| 3-11 | 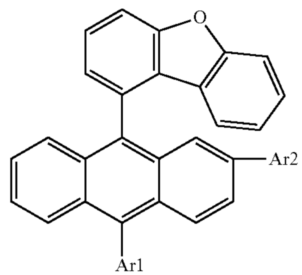 | 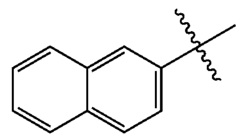 [SMILES: *c1ccc2ccccc2c1] | 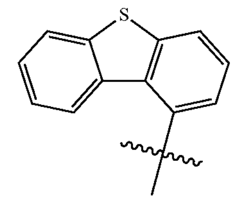 [SMILES: *c1cccc2sc3ccccc3c12] |
| 3-12 | 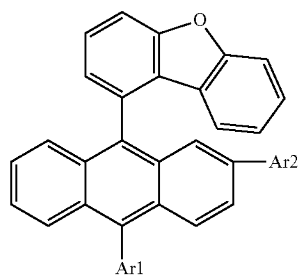 | 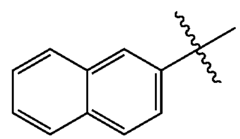 [SMILES: *c1ccc2ccccc2c1] | 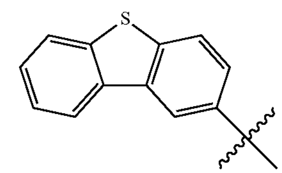 |
| 3-13 | 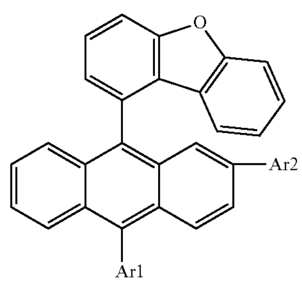 | 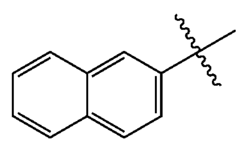 [SMILES: *c1ccc2ccccc2c1] | 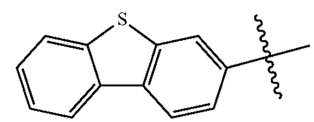 |

-continued
| No. | | Ar1 | Ar2 |
|---|---|---|---|
| 3-14 | 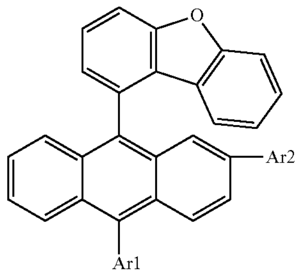 | 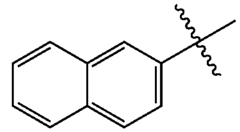 [SMILES: *c1ccc2ccccc2c1] | 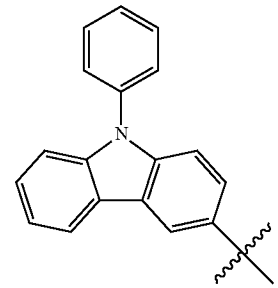 [SMILES: *c1ccc2c(c1)c1ccccc1n2-c1ccccc1] |
| 3-15 | 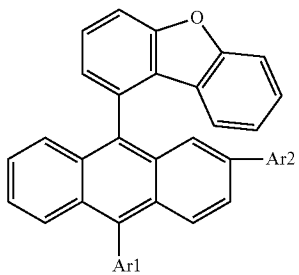 | 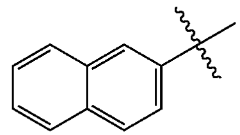 [SMILES: *c1ccc2ccccc2c1] | 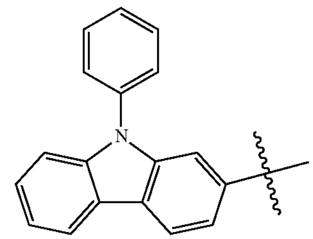 [SMILES: *c1ccc2c3ccccc3n(-c3ccccc3)c2c1] |
| 3-16 | 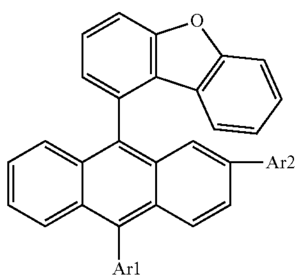 | 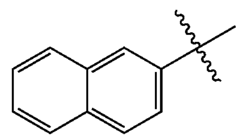 [SMILES: *c1ccc2ccccc2c1] | 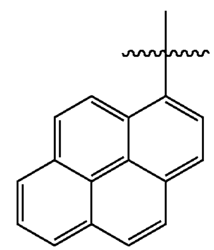 [SMILES: *c1ccc2ccc3cccc4ccc1c2c34] |

-continued
| No. | | Ar1 | Ar2 |
|---|---|---|---|
| 3-17 | 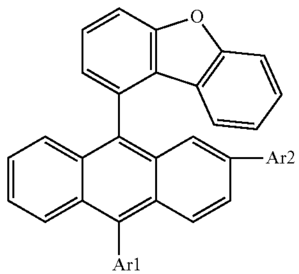 | 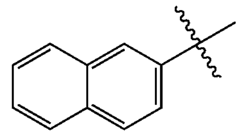 [SMILES: *c1ccc2ccccc2c1] | 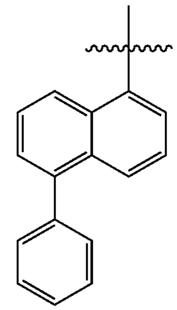 [SMILES: *c1cccc2c(-c3ccccc3)cccc12] |
| 3-18 | 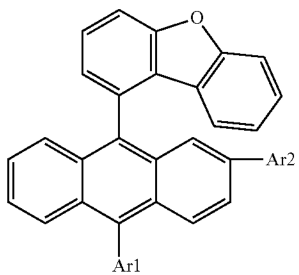 | 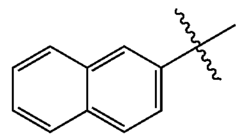 [SMILES: *c1ccc2ccccc2c1] | 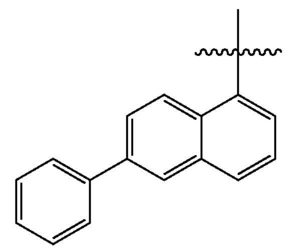 [SMILES: *c1cccc2cc(-c3ccccc3)ccc12] |
| 3-19 | 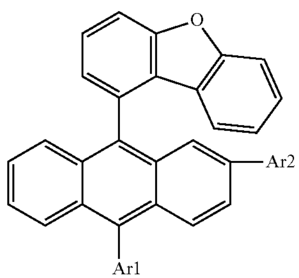 | 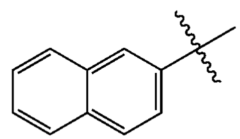 [SMILES: *c1ccc2ccccc2c1] | 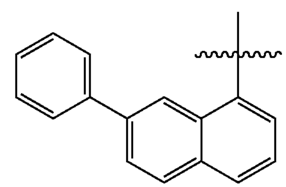 [SMILES: *c1cccc2ccc(-c3ccccc3)cc12] |

-continued
| No. | | Ar1 | Ar2 |
|---|---|---|---|
| 3-20 | 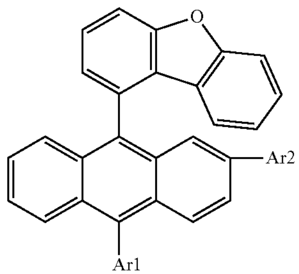 | 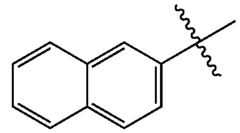 [SMILES: *c1ccc2ccccc2c1] | 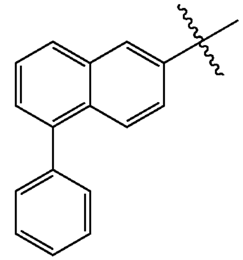 [SMILES: *c1ccc2c(-c3ccccc3)cccc2c1] |
| 3-21 | 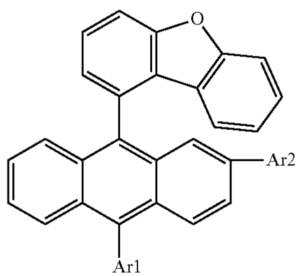 | 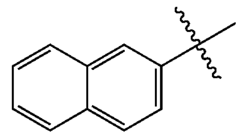 [SMILES: *c1ccc2ccccc2c1] | 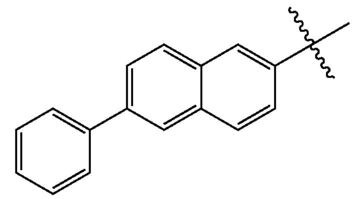 [SMILES: *c1ccc2cc(-c3ccccc3)ccc2c1] |
| 3-22 | 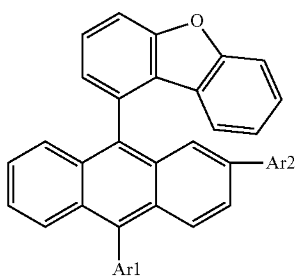 | 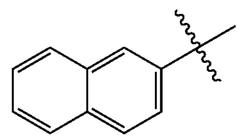 [SMILES: *c1ccc2ccccc2c1] | 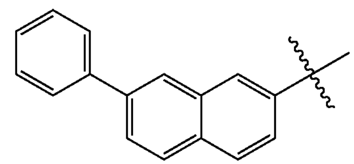 [SMILES: *c1ccc2ccc(-c3ccccc3)cc2c1] |

-continued
| No. | | Ar1 | Ar2 |
|---|---|---|---|
| 3-23 | 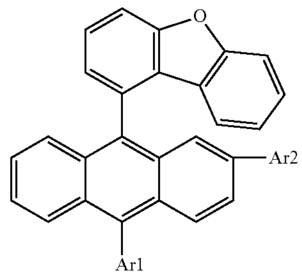 | 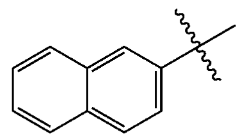 [SMILES: *c1ccc2ccccc2c1] | 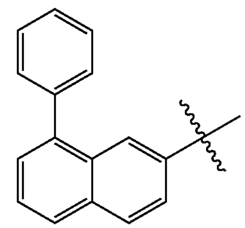 [SMILES: *c1ccc2cccc(-c3ccccc3)c2c1] |
| 3-24 | 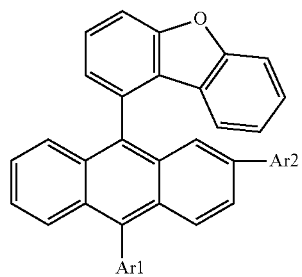 | 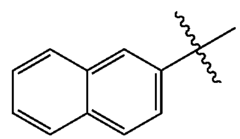 [SMILES: *c1ccc2ccccc2c1] | 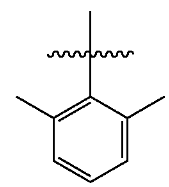 |
| 3-25 | 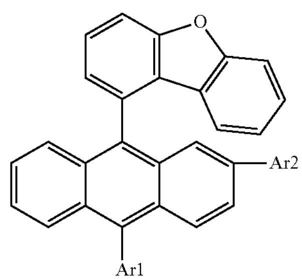 | 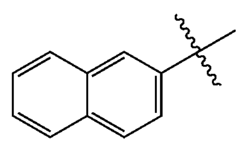 [SMILES: *c1ccc2ccccc2c1] | 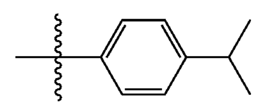 |

-continued
| No. | | Ar1 | Ar2 |
|---|---|---|---|
| 3-26 | 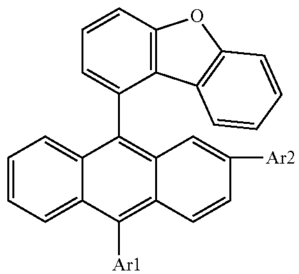 | 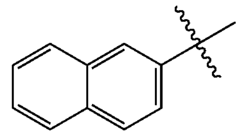 [SMILES: *c1ccc2ccccc2c1] | 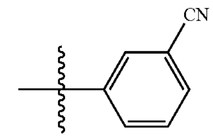 [SMILES: *c1cccc(C#N)c1] |
| 3-27 | 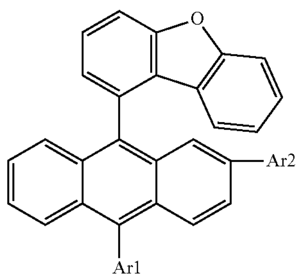 | 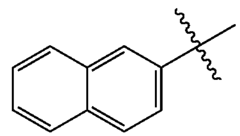 [SMILES: *c1ccc2ccccc2c1] | 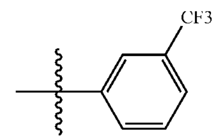 [SMILES: *c1cccc(C(F)(F)F)c1] |
| 3-28 | 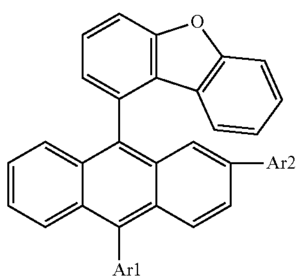 | 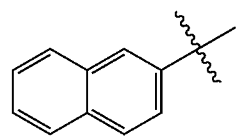 [SMILES: *c1ccc2ccccc2c1] | 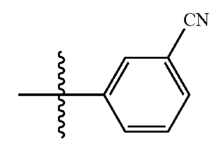 [SMILES: *c1cccc(C#N)c1] |

-continued
| No. | | Ar1 | Ar2 |
|---|---|---|---|
| 3-29 | 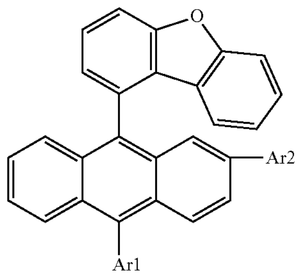 | 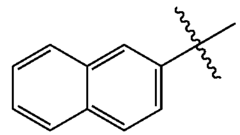 [SMILES: *c1ccc2ccccc2c1] | 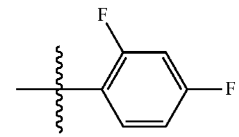 [SMILES: *c1ccc(F)cc1F] |
| 4-1 | 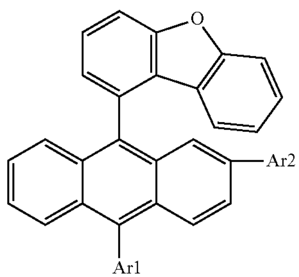 | 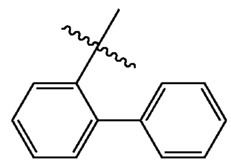 [SMILES: *c1ccccc1-c1ccccc1] | 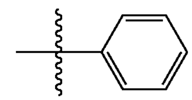 [SMILES: *c1ccccc1] |
| 4-2 | 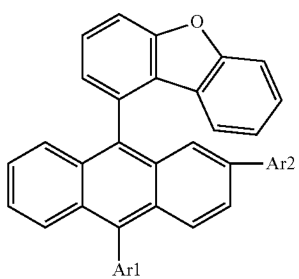 | 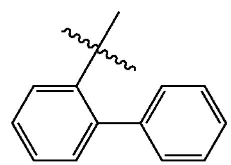 [SMILES: *c1ccccc1-c1ccccc1] | 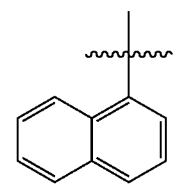 [SMILES: *c1cccc2ccccc12] |

-continued
| No. | | Ar1 | Ar2 |
|---|---|---|---|
| 4-3 | 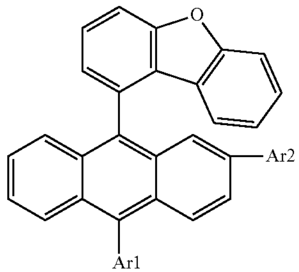 | 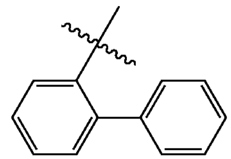 [SMILES: *c1ccccc1-c1ccccc1] | 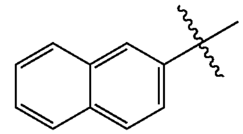 [SMILES: *c1ccc2ccccc2c1] |
| 4-4 | 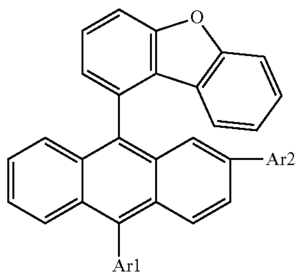 | 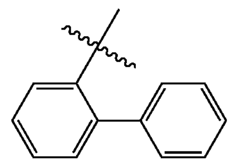 [SMILES: *c1ccccc1-c1ccccc1] | 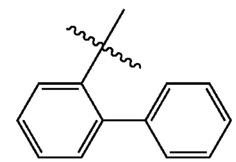 [SMILES: *c1ccccc1-c1ccccc1] |
| 4-5 | 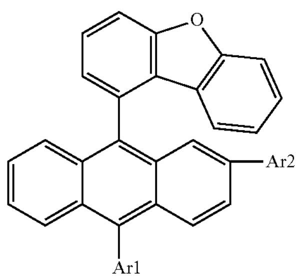 | 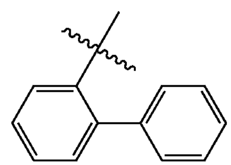 [SMILES: *c1ccccc1-c1ccccc1] | 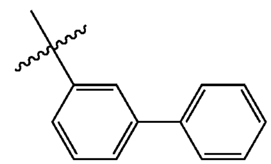 [SMILES: *c1cccc(-c2ccccc2)c1] |

-continued
| No. | | Ar1 | Ar2 |
|---|---|---|---|
| 4-6 | 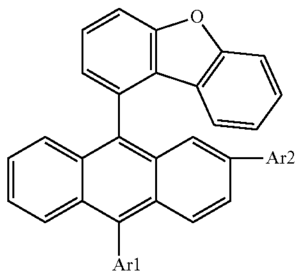 | 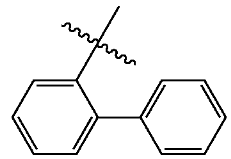 [SMILES: *c1ccccc1-c1ccccc1] | 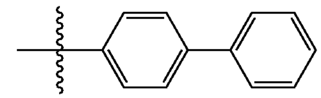 [SMILES: *c1ccc(-c2ccccc2)cc1] |
| 4-7 | 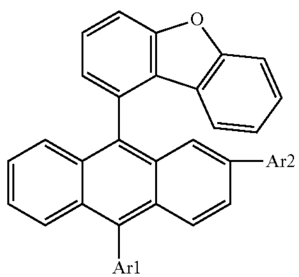 | 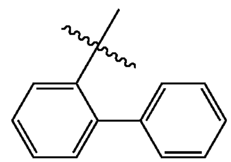 [SMILES: *c1ccccc1-c1ccccc1] | 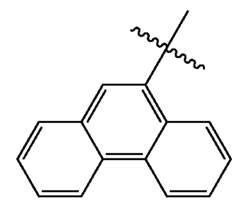 [SMILES: *c1cc2ccccc2c2ccccc12] |
| 4-8 | 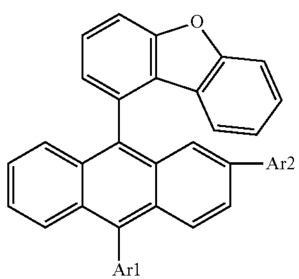 | 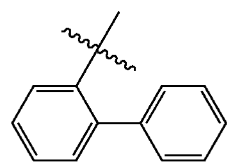 [SMILES: *c1ccccc1-c1ccccc1] | 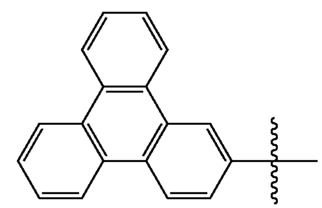 [SMILES: *c1ccc2c3ccccc3c3ccccc3c2c1] |

-continued
| No. | | Ar1 | Ar2 |
|---|---|---|---|
| 4-9 | 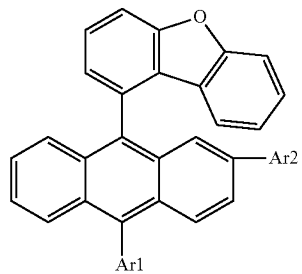 | 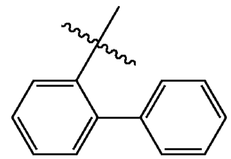 [SMILES: *c1ccccc1-c1ccccc1] | 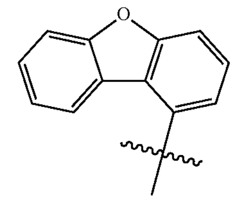 |
| 4-10 | 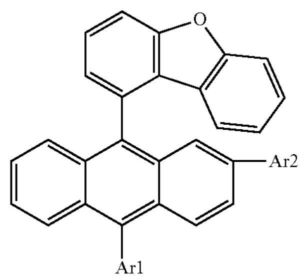 | 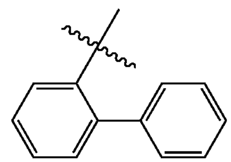 [SMILES: *c1ccccc1-c1ccccc1] | 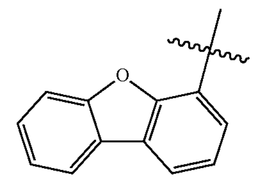 |
| 4-11 | 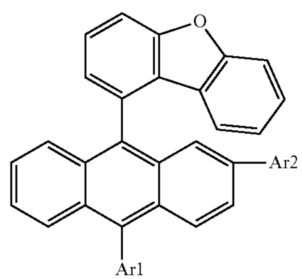 | 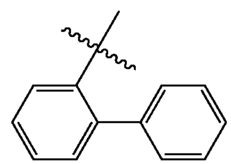 [SMILES: *c1ccccc1-c1ccccc1] | 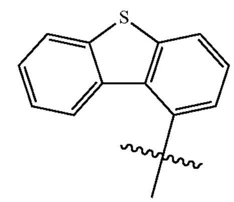 [SMILES: *c1cccc2sc3ccccc3c12] |

-continued
| No. | | Ar1 | Ar2 |
| --- | --- | --- | --- |
| 4-12 | 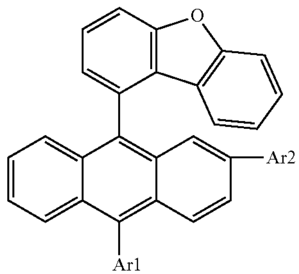 | 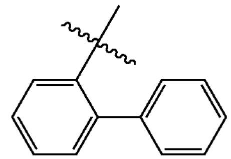 [SMILES: *c1ccccc1-c1ccccc1] | 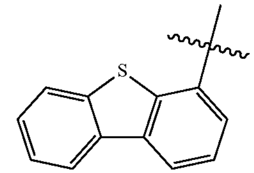 [SMILES: *c1cccc2c1sc1ccccc12] |
| 4-13 | 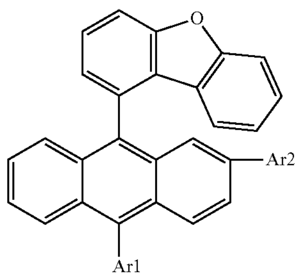 | 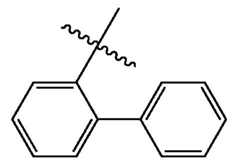 [SMILES: *c1ccccc1-c1ccccc1] | 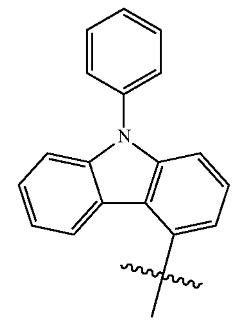 [SMILES: *c1cccc2c1c1ccccc1n2-c1ccccc1] |
| 4-14 | 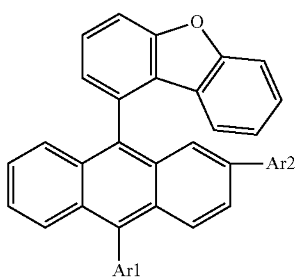 | 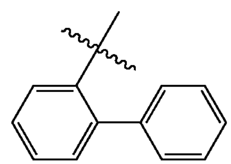 [SMILES: *c1ccccc1-c1ccccc1] | 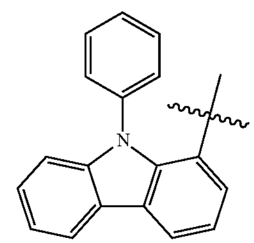 [SMILES: *c1cccc2c3ccccc3n(-c3ccccc3)c12] |

-continued
| No. | | Ar1 | Ar2 |
|---|---|---|---|
| 4-15 | 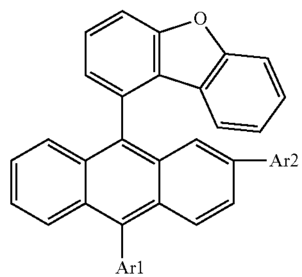 | 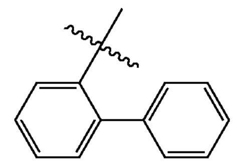 [SMILES: *c1ccccc1-c1ccccc1] | 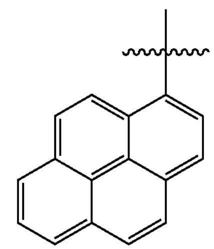 [SMILES: *c1ccc2ccc3cccc4ccc1c2c34] |
| 4-16 | 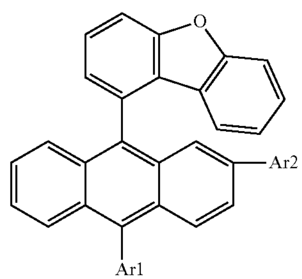 | 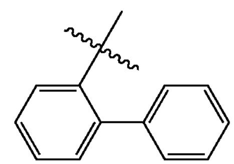 [SMILES: *c1ccccc1-c1ccccc1] | 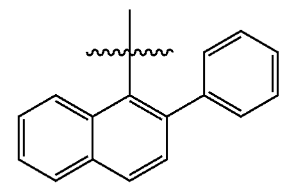 [SMILES: *c1c(-c2ccccc2)ccc2ccccc12] |
| 4-17 | 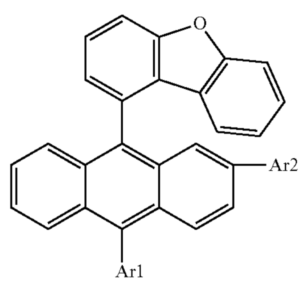 | 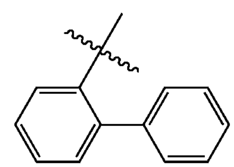 [SMILES: *c1ccccc1-c1ccccc1] | 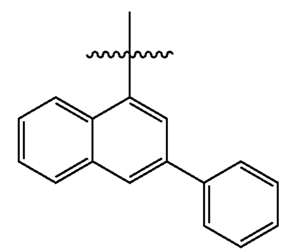 [SMILES: *c1cc(-c2ccccc2)cc2ccccc12] |

-continued
| No. | | Ar1 | Ar2 |
|---|---|---|---|
| 4-18 | 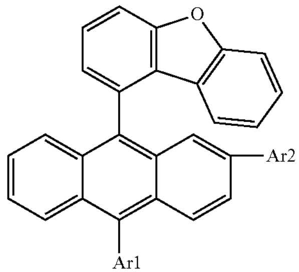 | 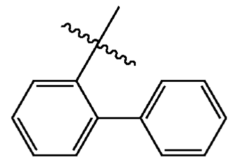 [SMILES: *c1ccccc1-c1ccccc1] | 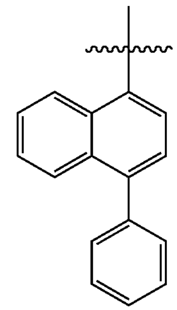 [SMILES: *c1ccc(-c2ccccc2)c2ccccc12] |
| 4-19 | 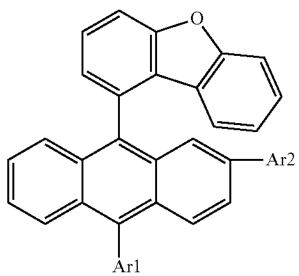 | 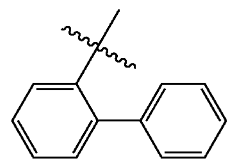 [SMILES: *c1ccccc1-c1ccccc1] | 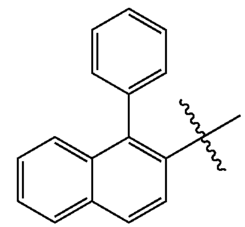 [SMILES: *c1ccc2ccccc2c1-c1ccccc1] |
| 4-20 | 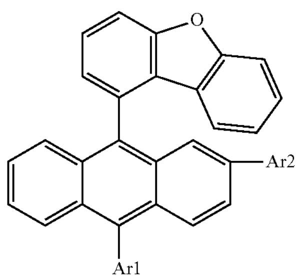 | 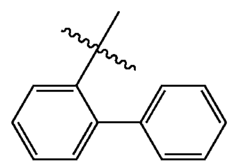 [SMILES: *c1ccccc1-c1ccccc1] | 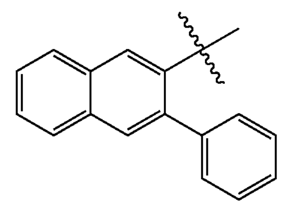 [SMILES: *c1cc2ccccc2cc1-c1ccccc1] |

-continued
| No. | | Ar1 | Ar2 |
|---|---|---|---|
| 4-21 | 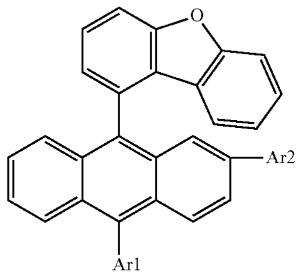 | 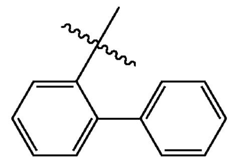 [SMILES: *c1ccccc1-c1ccccc1] | 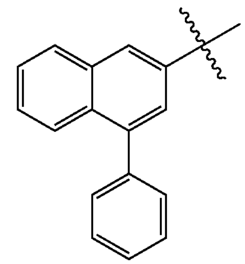 [SMILES: *c1cc(-c2ccccc2)c2ccccc2c1] |
| 4-22 | 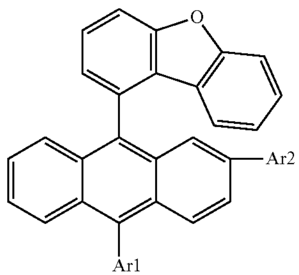 | 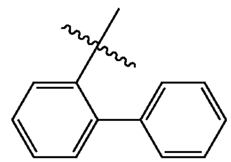 [SMILES: *c1ccccc1-c1ccccc1] | 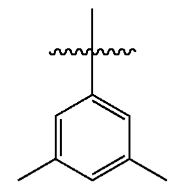 |
| 4-23 | 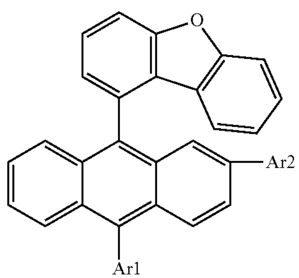 | 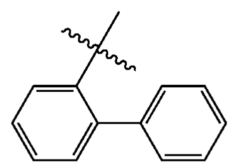 [SMILES: *c1ccccc1-c1ccccc1] | 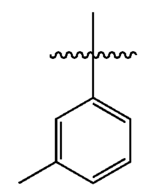 [SMILES: *c1cccc(C)c1] |

-continued
| No. | | Ar1 | Ar2 |
|---|---|---|---|
| 4-24 | 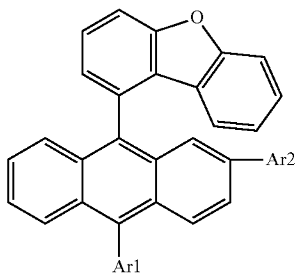 | 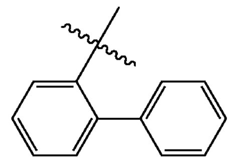 [SMILES: *c1ccccc1-c1ccccc1] | 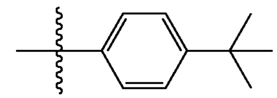 [SMILES: *c1ccc(C(C)(C)C)cc1] |
| 4-25 | 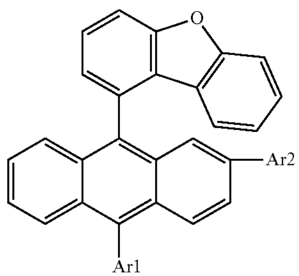 | 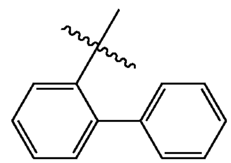 [SMILES: *c1ccccc1-c1ccccc1] | 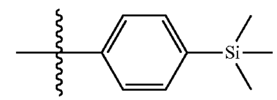 |
| 4-26 | 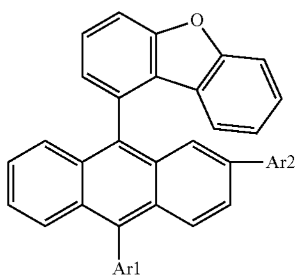 | 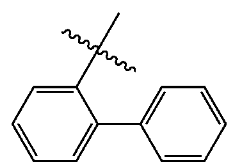 [SMILES: *c1ccccc1-c1ccccc1] | 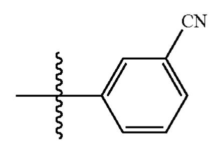 [SMILES: *c1cccc(C#N)c1] |

-continued
| No. | | Ar1 | Ar2 |
|---|---|---|---|
| 4-27 | 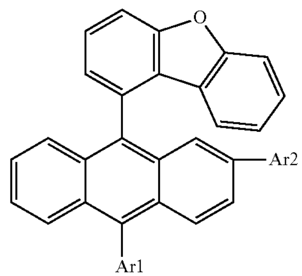 | 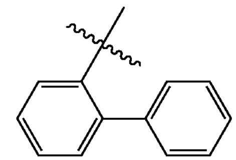 [SMILES: *c1ccccc1-c1ccccc1] | 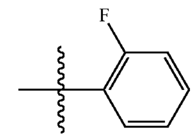 [SMILES: *c1ccccc1F] |
| 4-28 | 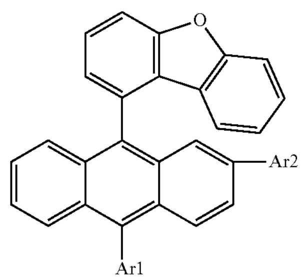 | 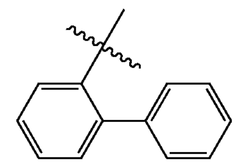 [SMILES: *c1ccccc1-c1ccccc1] | 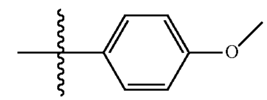 [SMILES: *c1ccc(OC)cc1] |
| 5-1 | 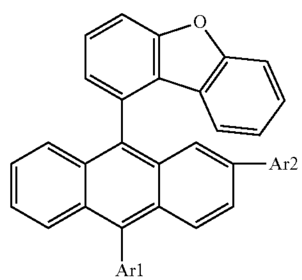 | 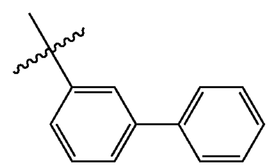 [SMILES: *c1cccc(-c2ccccc2)c1] | 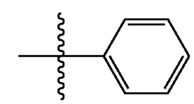 [SMILES: *c1ccccc1] |

-continued
| No. | | Ar1 | Ar2 |
|---|---|---|---|
| 5-2 | 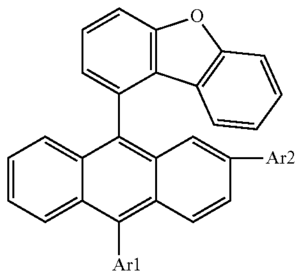 | 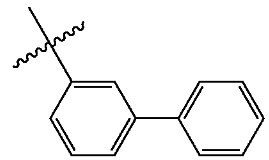 [SMILES: *c1cccc(-c2ccccc2)c1] | 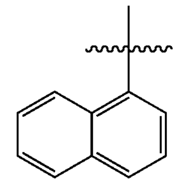 [SMILES: *c1cccc2ccccc12] |
| 5-3 | 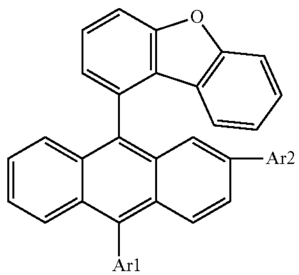 | 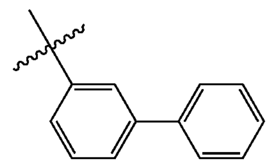 [SMILES: *c1cccc(-c2ccccc2)c1] | 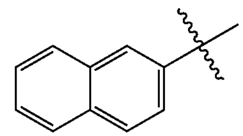 [SMILES: *c1ccc2ccccc2c1] |
| 5-4 | 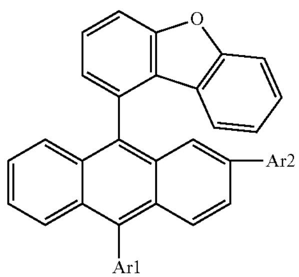 | 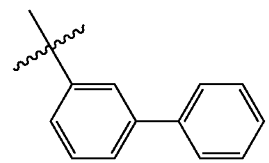 [SMILES: *c1cccc(-c2ccccc2)c1] | 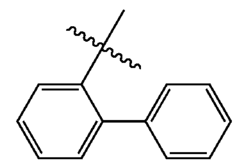 [SMILES: *c1ccccc1-c1ccccc1] |

-continued
| No. | | Ar1 | Ar2 |
|---|---|---|---|
| 5-5 | 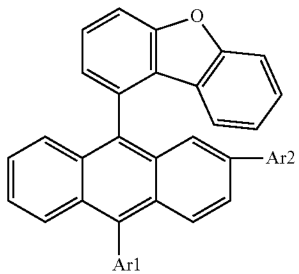 | 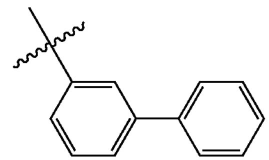 [SMILES: *c1cccc(-c2ccccc2)c1] | 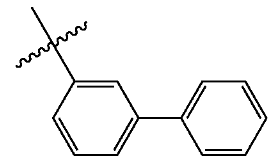 [SMILES: *c1cccc(-c2ccccc2)c1] |
| 5-6 | 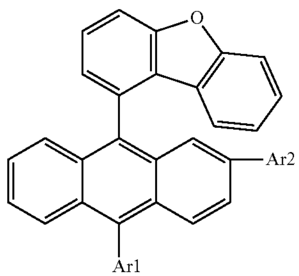 | 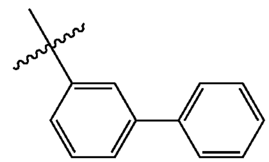 [SMILES: *c1cccc(-c2ccccc2)c1] | 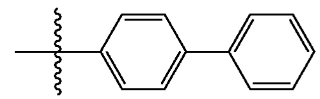 [SMILES: *c1ccc(-c2ccccc2)cc1] |
| 5-7 | 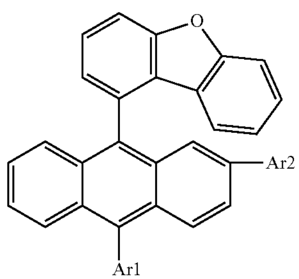 | 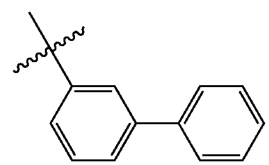 [SMILES: *c1cccc(-c2ccccc2)c1] | 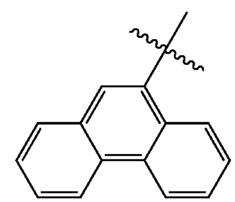 [SMILES: *c1cc2ccccc2c2ccccc12] |

-continued
| No. | | Ar1 | Ar2 |
|---|---|---|---|
| 5-8 | 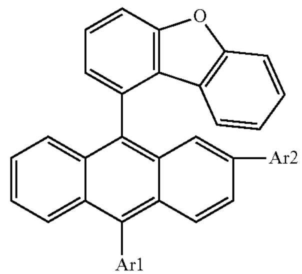 | 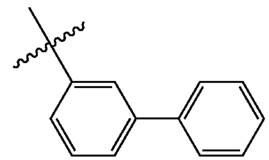 [SMILES: *c1cccc(-c2ccccc2)c1] | 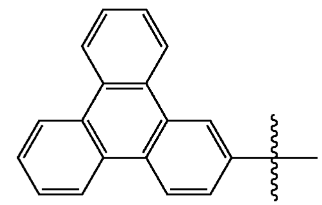 [SMILES: *c1ccc2c3ccccc3c3ccccc3c2c1] |
| 5-9 | 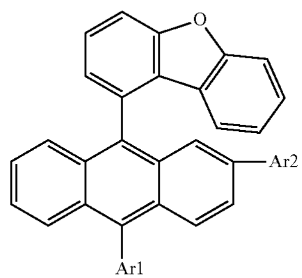 | 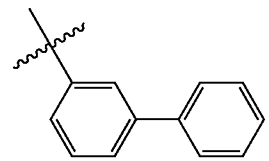 [SMILES: *c1cccc(-c2ccccc2)c1] | 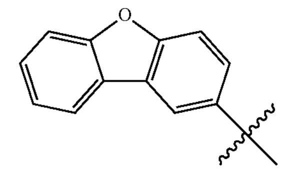 |
| 5-10 | 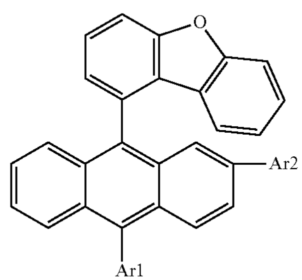 | 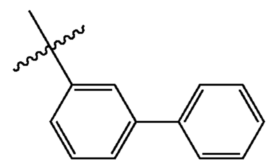 [SMILES: *c1cccc(-c2ccccc2)c1] | 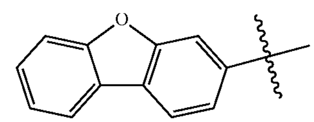 |

-continued
| No. | | Ar1 | Ar2 |
|---|---|---|---|
| 5-11 | 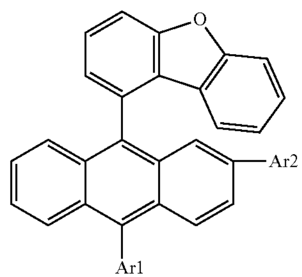 | 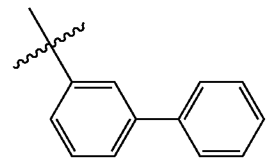 [SMILES: *c1cccc(-c2ccccc2)c1] | 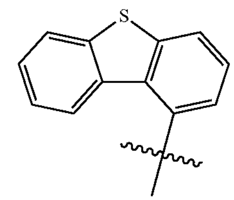 |
| 5-12 | 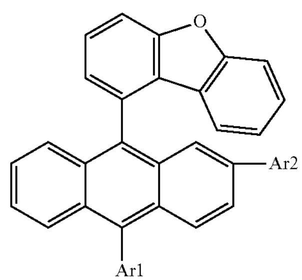 | 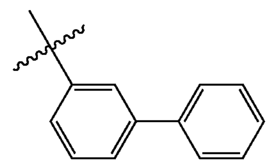 [SMILES: *c1cccc(-c2ccccc2)c1] | 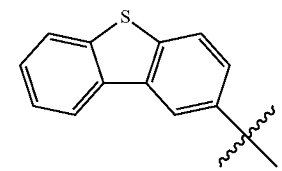 |
| 5-13 | 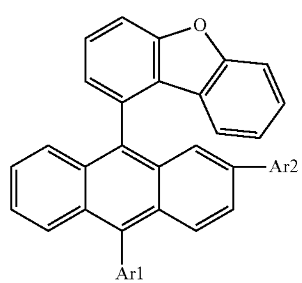 | 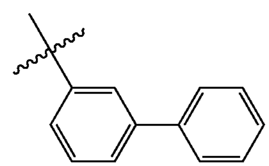 [SMILES: *c1cccc(-c2ccccc2)c1] | 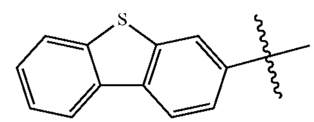 |

-continued
| No. | | Ar1 | Ar2 |
|---|---|---|---|
| 5-14 | 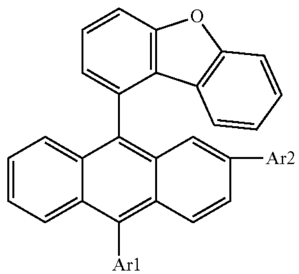 | 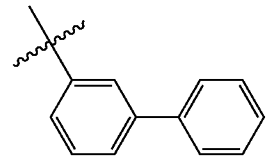 [SMILES: *c1cccc(-c2ccccc2)c1] | 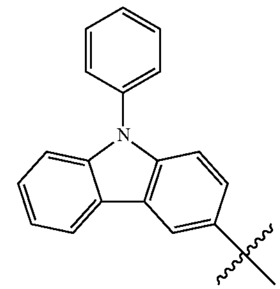 [SMILES: *c1ccc2c(c1)c1ccccc1n2-c1ccccc1] |
| 5-15 | 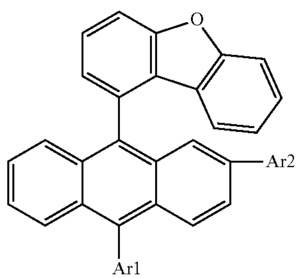 | 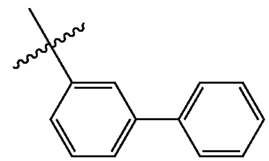 [SMILES: *c1cccc(-c2ccccc2)c1] | 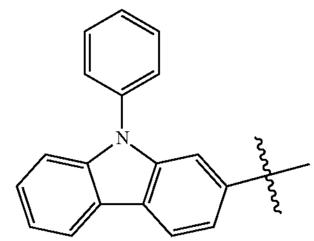 [SMILES: *c1ccc2c3ccccc3n(-c3ccccc3)c2c1] |
| 5-16 | 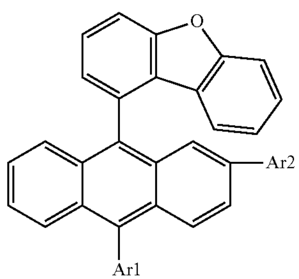 | 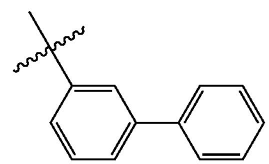 [SMILES: *c1cccc(-c2ccccc2)c1] | 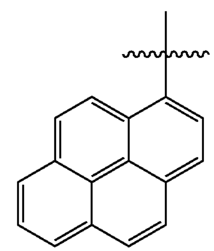 [SMILES: *c1ccc2ccc3cccc4ccc1c2c34] |

-continued
| No. | | Ar1 | Ar2 |
|---|---|---|---|
| 5-17 | 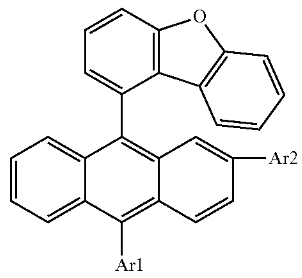 | 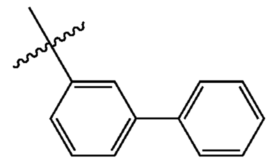 [SMILES: *c1cccc(-c2ccccc2)c1] | 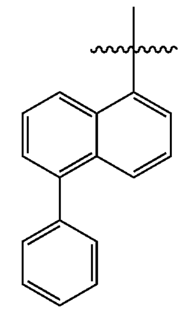 [SMILES: *c1cccc2c(-c3ccccc3)cccc12] |
| 5-18 | 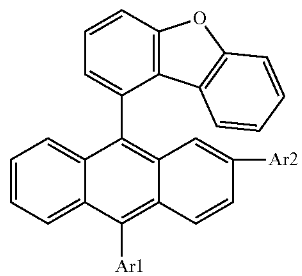 | 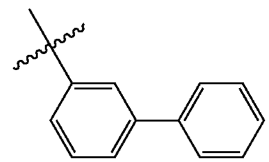 [SMILES: *c1cccc(-c2ccccc2)c1] | 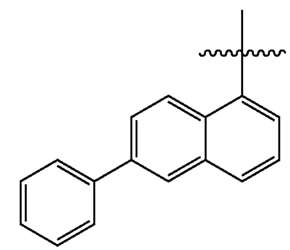 [SMILES: *c1cccc2cc(-c3ccccc3)ccc12] |
| 5-19 | 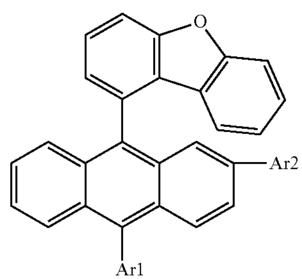 | 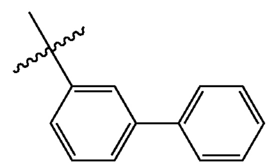 [SMILES: *c1cccc(-c2ccccc2)c1] | 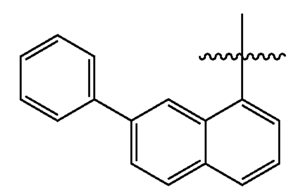 [SMILES: *c1cccc2ccc(-c3ccccc3)cc12] |

-continued
| No. | | Ar1 | Ar2 |
|---|---|---|---|
| 5-20 | 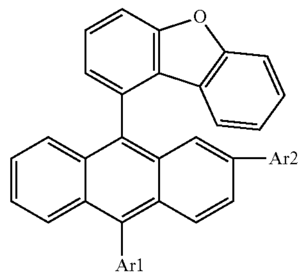 | 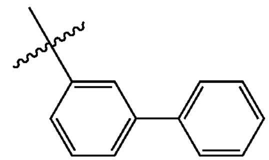 [SMILES: *c1cccc(-c2ccccc2)c1] | 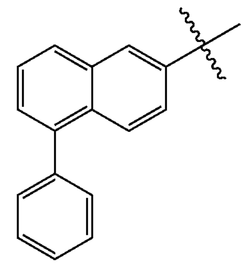 [SMILES: *c1ccc2c(-c3ccccc3)cccc2c1] |
| 5-21 | 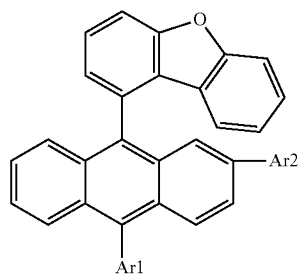 | 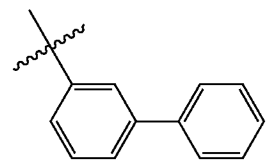 [SMILES: *c1cccc(-c2ccccc2)c1] | 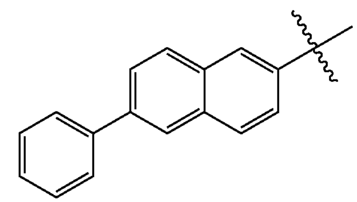 [SMILES: *c1ccc2cc(-c3ccccc3)ccc2c1] |
| 5-22 | 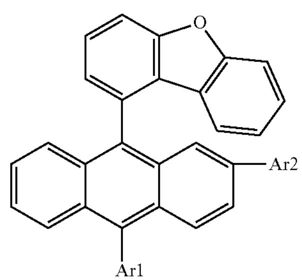 | 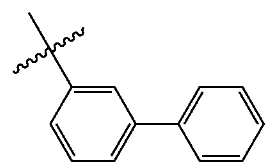 [SMILES: *c1cccc(-c2ccccc2)c1] | 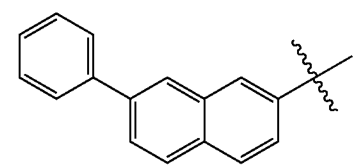 [SMILES: *c1ccc2ccc(-c3ccccc3)cc2c1] |

-continued
| No. | | Ar1 | Ar2 |
|---|---|---|---|
| 5-23 | 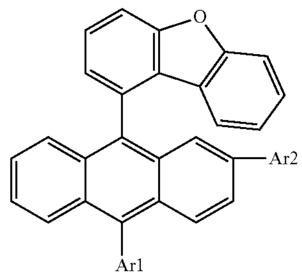 | 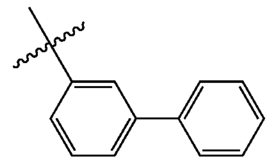 [SMILES: *c1cccc(-c2ccccc2)c1] | 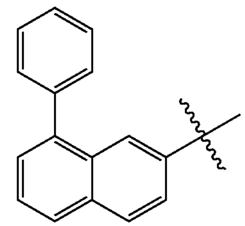 [SMILES: *c1ccc2cccc(-c3ccccc3)c2c1] |
| 5-24 | 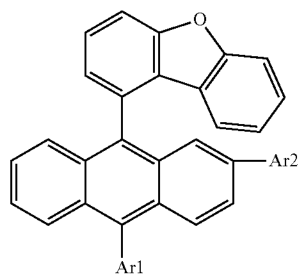 | 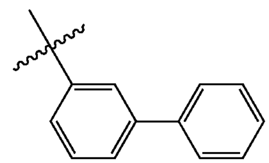 [SMILES: *c1cccc(-c2ccccc2)c1] | 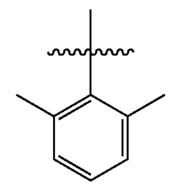 |
| 5-25 | 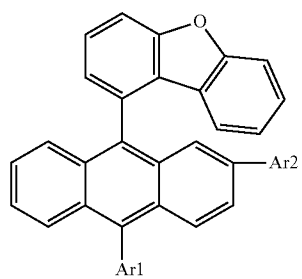 | 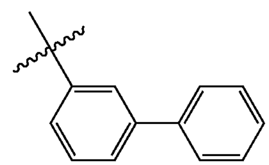 [SMILES: *c1cccc(-c2ccccc2)c1] | 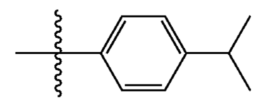 [SMILES: *c1ccc(C(C)C)cc1] |

-continued
| No. | | Ar1 | Ar2 |
|---|---|---|---|
| 5-26 | 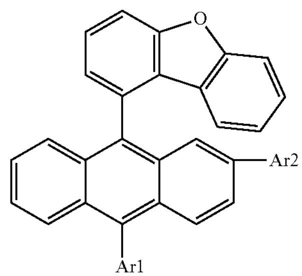 | 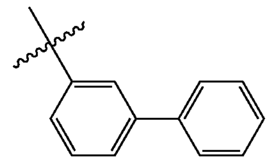 [SMILES: *c1cccc(-c2ccccc2)c1] | 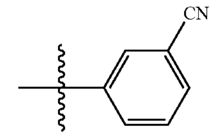 [SMILES: *c1cccc(C#N)c1] |
| 5-27 | 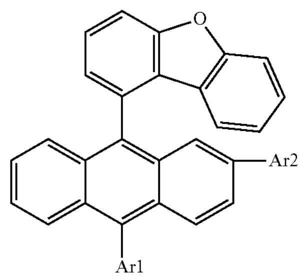 | 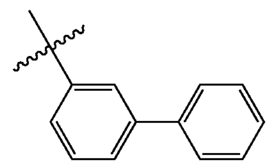 [SMILES: *c1cccc(-c2ccccc2)c1] | 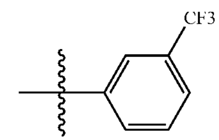 [SMILES: *c1cccc(C(F)(F)F)c1] |
| 5-28 | 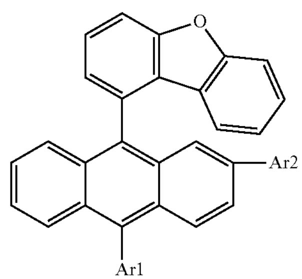 | 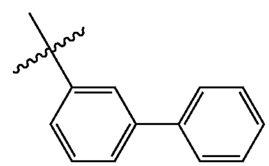 [SMILES: *c1cccc(-c2ccccc2)c1] | 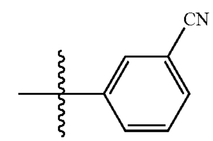 [SMILES: *c1cccc(C#N)c1] |

-continued
| No. | | Ar1 | Ar2 |
|---|---|---|---|
| 5-29 | 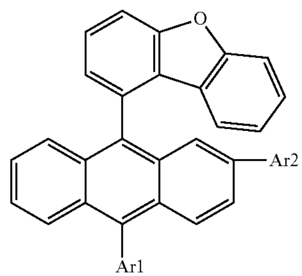 | 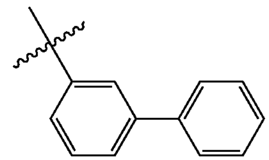 [SMILES: *c1cccc(-c2ccccc2)c1] | 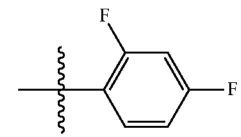 [SMILES: *c1ccc(F)cc1F] |
| 6-1 | 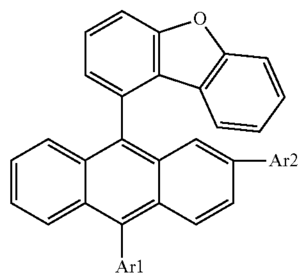 | 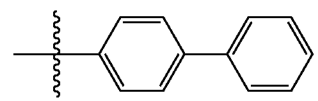 [SMILES: *c1ccc(-c2ccccc2)cc1] | 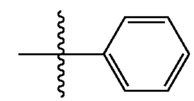 [SMILES: *c1ccccc1] |
| 6-2 | 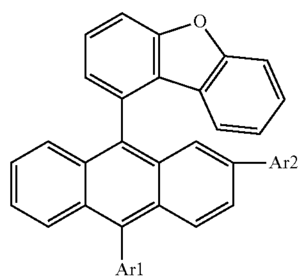 | 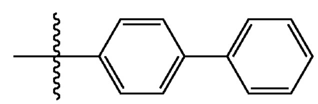 | 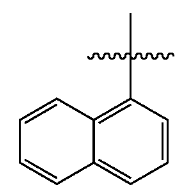 [SMILES: *c1cccc2ccccc12] |

-continued
| No. | | Ar1 | Ar2 |
| --- | --- | --- | --- |
| 6-3 | 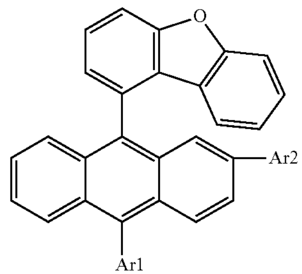 | 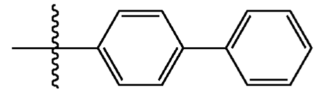 | 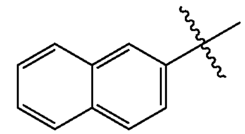 [SMILES: *c1ccc2ccccc2c1] |
| 6-4 | 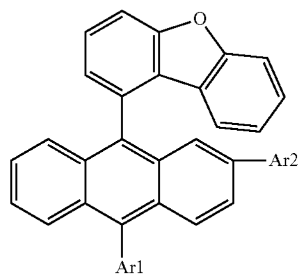 | 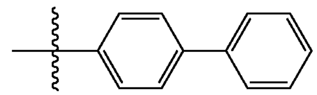 | 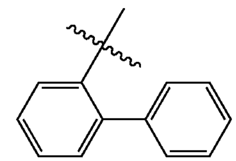 [SMILES: *c1ccccc1-c1ccccc1] |
| 6-5 | 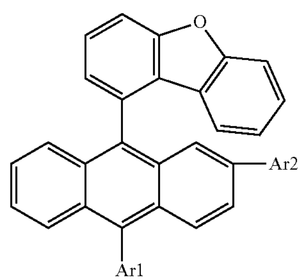 | 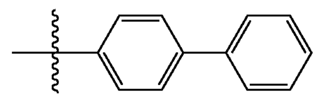 [SMILES: *c1ccc(-c2ccccc2)cc1] | 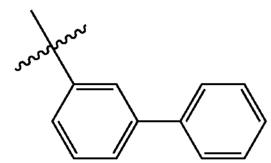 [SMILES: *c1cccc(-c2ccccc2)c1] |

-continued
| No. | | Ar1 | Ar2 |
| --- | --- | --- | --- |
| 6-6 | 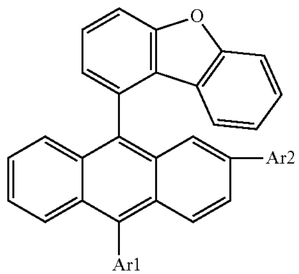 | 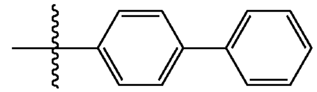 | 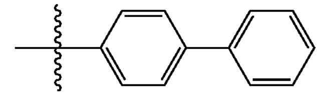 [SMILES: *c1ccc(-c2ccccc2)cc1] |
| 6-7 | 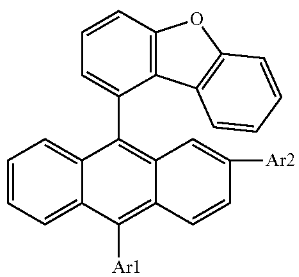 | 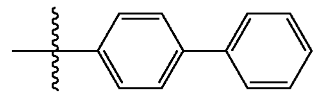 | 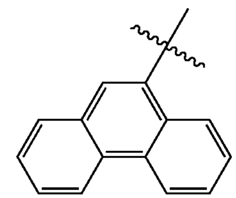 [SMILES: *c1cc2ccccc2c2ccccc12] |
| 6-8 | 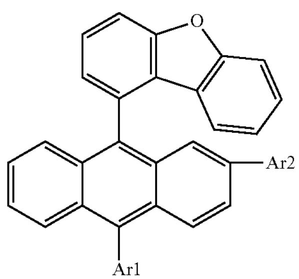 | 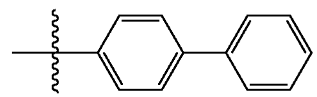 [SMILES: *c1ccc(-c2ccccc2)cc1] | 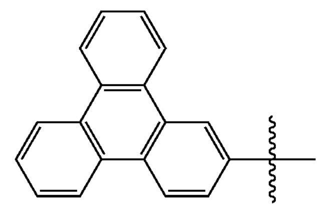 |

-continued
| No. | | Ar1 | Ar2 |
|---|---|---|---|
| 6-9 | 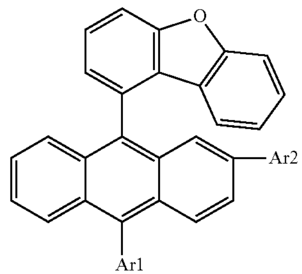 | 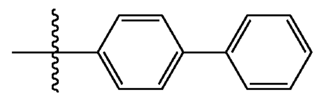 | 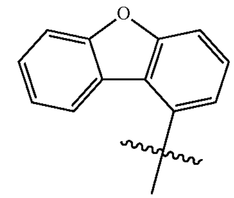 |
| 6-10 | 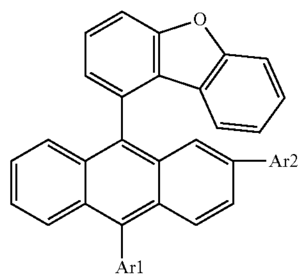 | 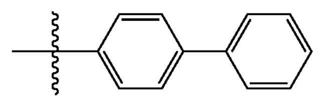 [SMILES: *c1ccc(-c2ccccc2)cc1] | 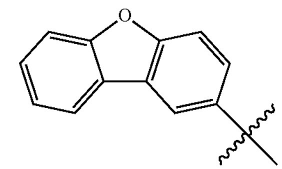 [SMILES: *c1ccc2oc3ccccc3c2c1] |
| 6-11 | 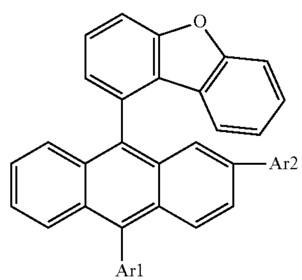 | 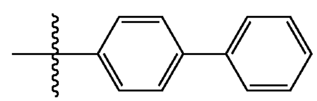 [SMILES: *c1ccc(-c2ccccc2)cc1] | 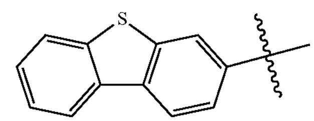 |

-continued
| No. | | Ar1 | Ar2 |
|---|---|---|---|
| 6-12 | 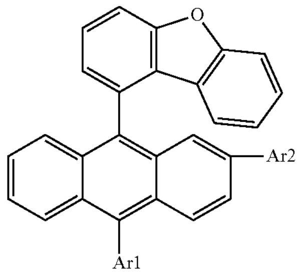 | 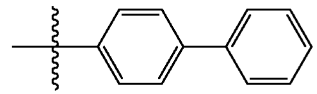 [SMILES: *c1ccc(-c2ccccc2)cc1] | 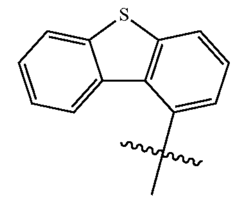 |
| 6-13 | 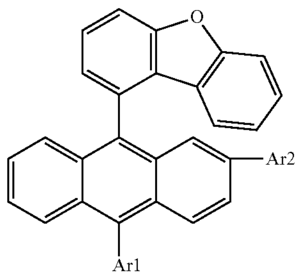 | 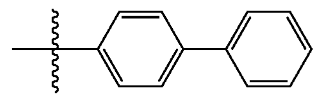 [SMILES: *c1ccc(-c2ccccc2)cc1] | 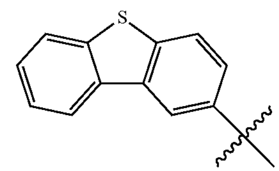 [SMILES: *c1ccc2sc3ccccc3c2c1] |
| 6-14 | 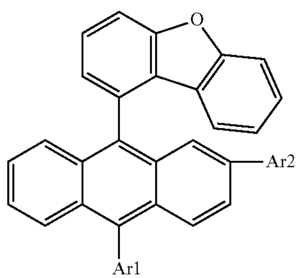 | 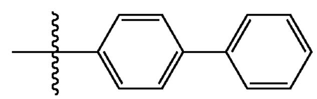 [SMILES: *c1ccc(-c2ccccc2)cc1] | 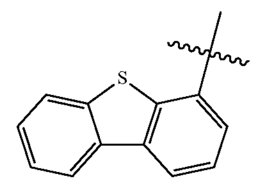 [SMILES: *c1cccc2c1sc1ccccc12] |

-continued
| No. | | Ar1 | Ar2 |
|---|---|---|---|
| 6-15 | 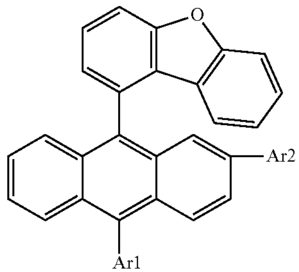 | 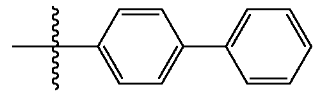 [SMILES: *c1ccc(-c2ccccc2)cc1] | 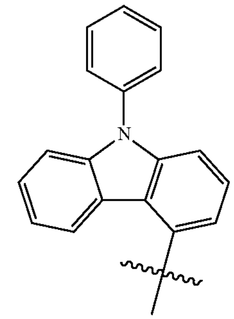 [SMILES: *c1cccc2c1c1ccccc1n2-c1ccccc1] |
| 6-16 | 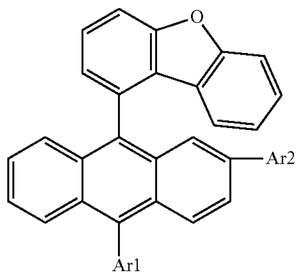 | 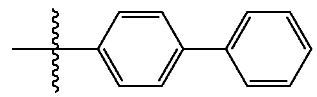 [SMILES: *c1ccc(-c2ccccc2)cc1] | 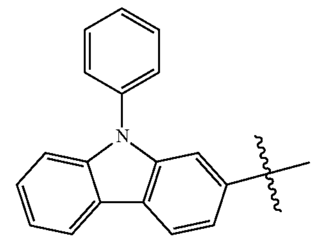 [SMILES: *c1ccc2c3ccccc3n(-c3ccccc3)c2c1] |
| 6-17 | 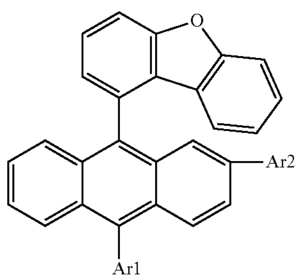 | 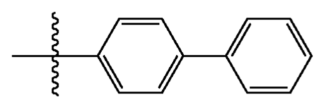 | 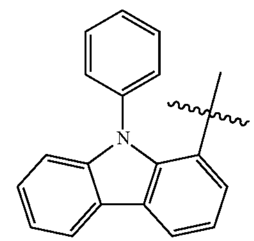 [SMILES: *c1cccc2c3ccccc3n(-c3ccccc3)c12] |

-continued
| No. | | Ar1 | Ar2 |
|---|---|---|---|
| 6-18 | 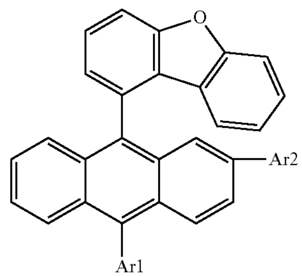 | 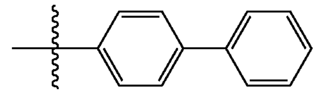 [SMILES: *c1ccc(-c2ccccc2)cc1] | 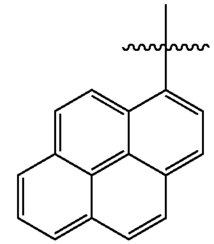 [SMILES: *c1ccc2ccc3cccc4ccc1c2c34] |
| 6-19 | 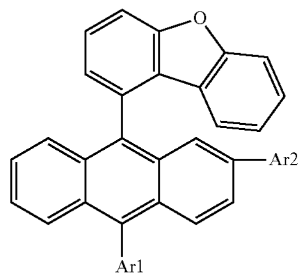 | 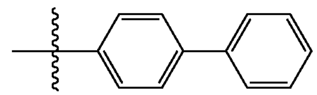 | 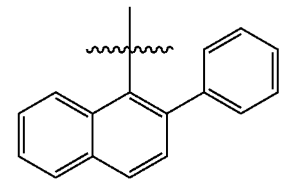 [SMILES: *c1c(-c2ccccc2)ccc2ccccc12] |
| 6-20 | 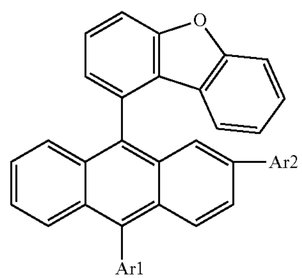 | 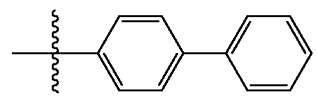 | 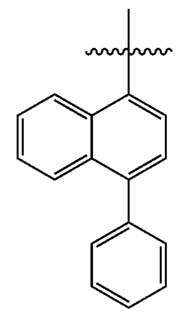 [SMILES: *c1ccc(-c2ccccc2)c2ccccc12] |

-continued
| No. | | Ar1 | Ar2 |
|---|---|---|---|
| 6-21 | 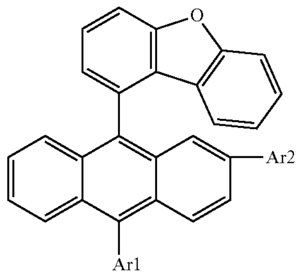 | 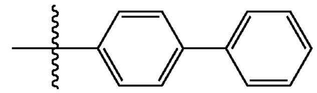 [SMILES: *c1ccc(-c2ccccc2)cc1] | 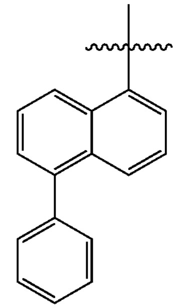 [SMILES: *c1cccc2c(-c3ccccc3)cccc12] |
| 6-22 | 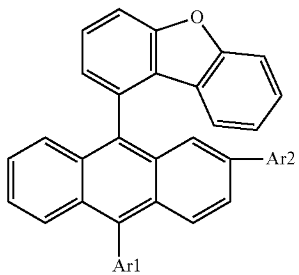 | 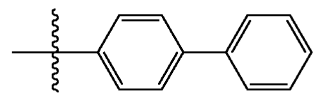 | 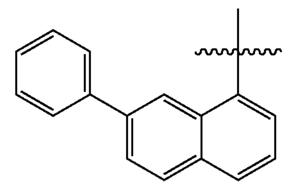 [SMILES: *c1cccc2ccc(-c3ccccc3)cc12] |
| 6-23 | 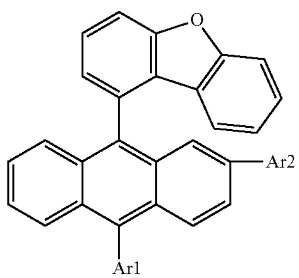 | 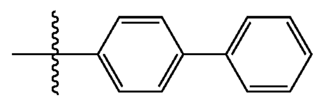 | 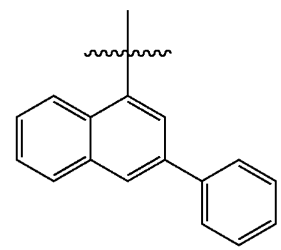 [SMILES: *c1cc(-c2ccccc2)cc2ccccc12] |

-continued
| No. | | Ar1 | Ar2 |
|---|---|---|---|
| 6-24 | 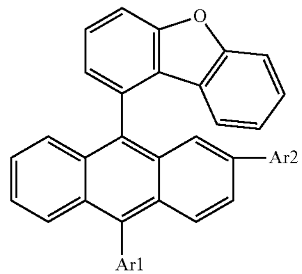 | 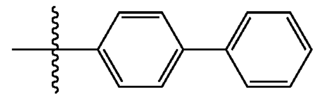 [SMILES: *c1ccc(-c2ccccc2)cc1] | 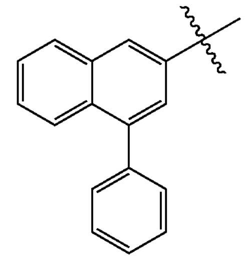 [SMILES: *c1cc(-c2ccccc2)c2ccccc2c1] |
| 6-25 | 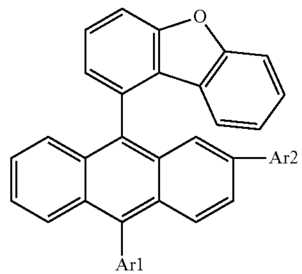 | 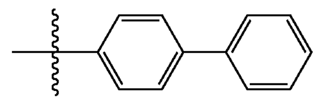 [SMILES: *c1ccc(-c2ccccc2)cc1] | 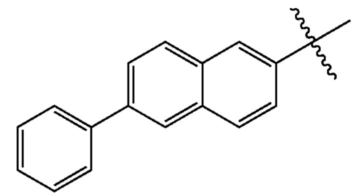 [SMILES: *c1ccc2cc(-c3ccccc3)ccc2c1] |
| 6-26 | 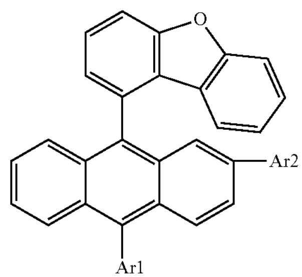 | 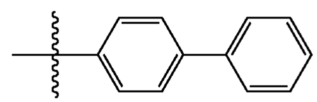 [SMILES: *c1ccc(-c2ccccc2)cc1] | 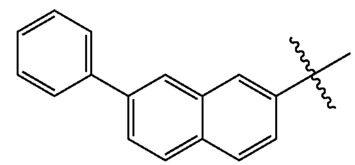 [SMILES: *c1ccc2ccc(-c3ccccc3)cc2c1] |

-continued
| No. | | Ar1 | Ar2 |
|---|---|---|---|
| 6-27 | 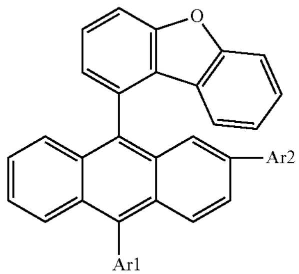 | 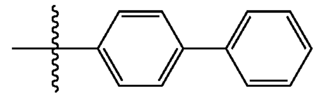 [SMILES: *c1ccc(-c2ccccc2)cc1] | 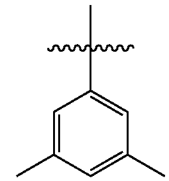 |
| 6-28 | 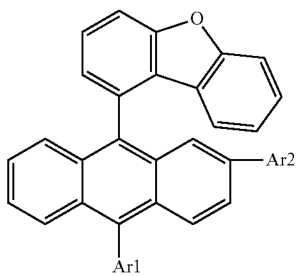 | 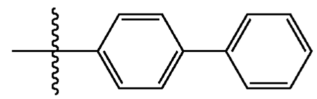 [SMILES: *c1ccc(-c2ccccc2)cc1] | 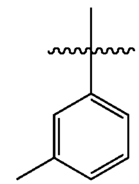 [SMILES: *c1cccc(C)c1] |
| 6-29 | 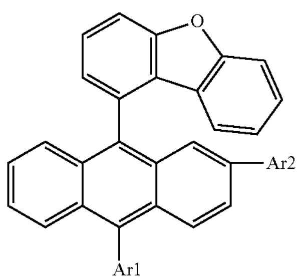 | 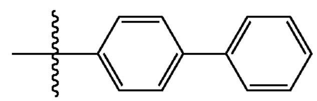 [SMILES: *c1ccc(-c2ccccc2)cc1] | 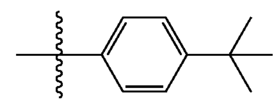 [SMILES: *c1ccc(C(C)(C)C)cc1] |

-continued
| No. | | Ar1 | Ar2 |
|---|---|---|---|
| 6-30 | 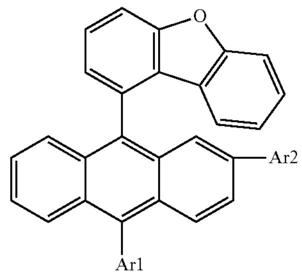 | 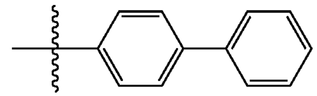 [SMILES: *c1ccc(-c2ccccc2)cc1] | 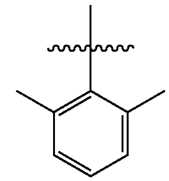 |
| 6-31 | 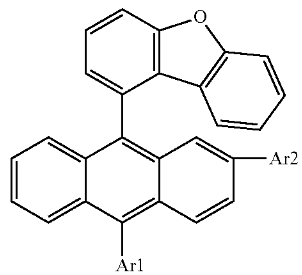 | 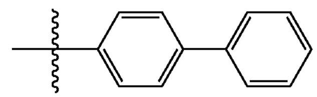 [SMILES: *c1ccc(-c2ccccc2)cc1] | 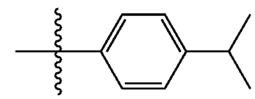 |
| 7-1 | 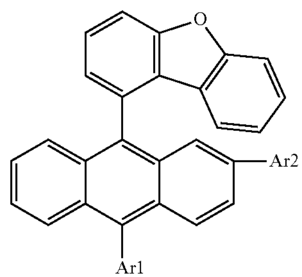 | 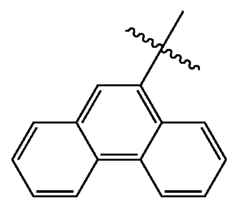 [SMILES: *c1cc2ccccc2c2ccccc12] | 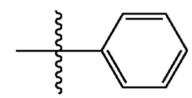 |

-continued
| No. | | Ar1 | Ar2 |
|---|---|---|---|
| 7-2 | 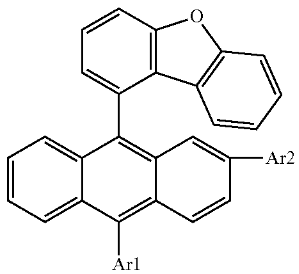 | 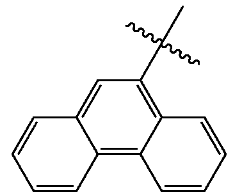 [SMILES: *c1cc2ccccc2c2ccccc12] | 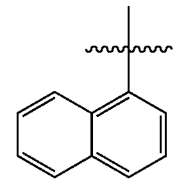 [SMILES: *c1cccc2ccccc12] |
| 7-3 | 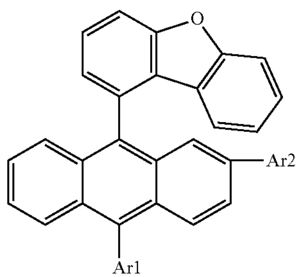 | 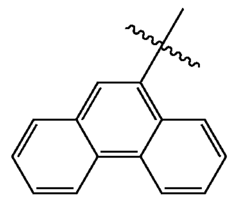 [SMILES: *c1cc2ccccc2c2ccccc12] | 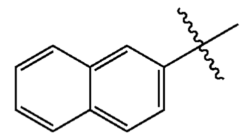 [SMILES: *c1ccc2ccccc2c1] |
| 7-4 | 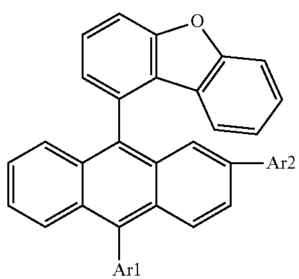 | 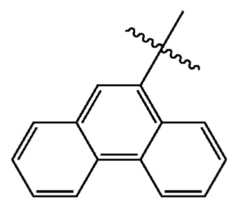 [SMILES: *c1cc2ccccc2c2ccccc12] | 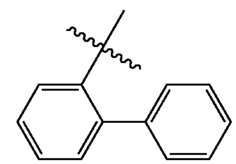 [SMILES: *c1ccccc1-c1ccccc1] |

-continued
| No. | | Ar1 | Ar2 |
|---|---|---|---|
| 7-5 | 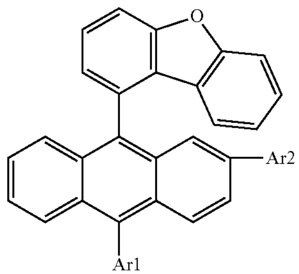 | 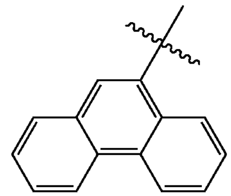 [SMILES: *c1cc2ccccc2c2ccccc12] | 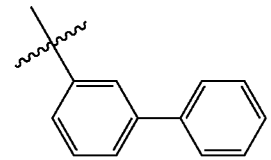 [SMILES: *c1cccc(-c2ccccc2)c1] |
| 7-6 | 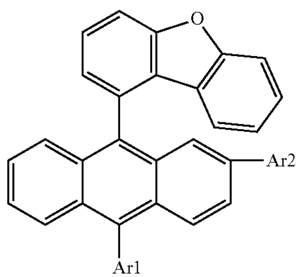 | 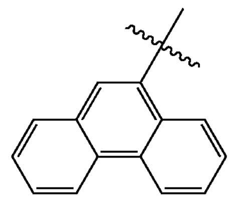 [SMILES: *c1cc2ccccc2c2ccccc12] | 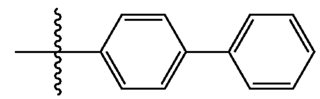 [SMILES: *c1ccc(-c2ccccc2)cc1] |
| 7-7 | 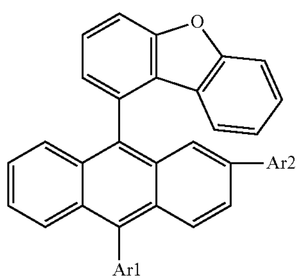 | 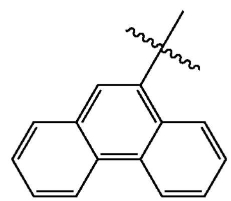 [SMILES: *c1cc2ccccc2c2ccccc12] | 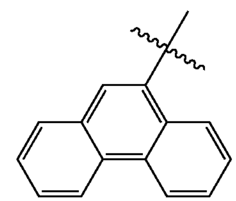 [SMILES: *c1cc2ccccc2c2ccccc12] |

-continued
| No. | | Ar1 | Ar2 |
|---|---|---|---|
| 7-8 | 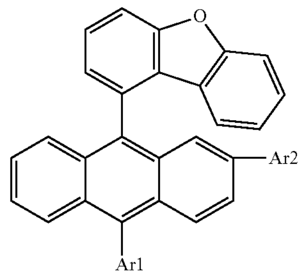 | 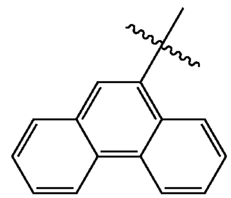 [SMILES: *c1cc2ccccc2c2ccccc12] | 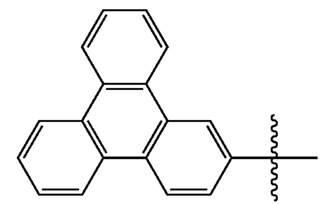 [SMILES: *c1ccc2c3ccccc3c3ccccc3c2c1] |
| 7-9 | 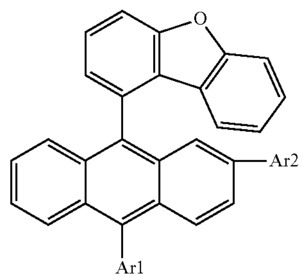 | 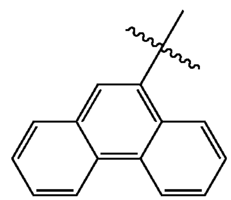 [SMILES: *c1cc2ccccc2c2ccccc12] | 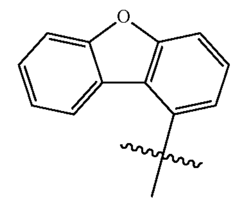 [SMILES: *c1cccc2oc3ccccc3c12] |
| 7-10 | 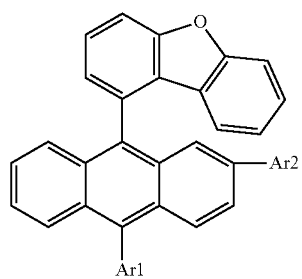 | 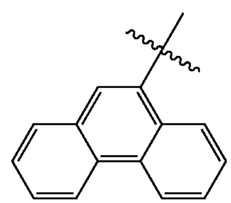 [SMILES: *c1cc2ccccc2c2ccccc12] | 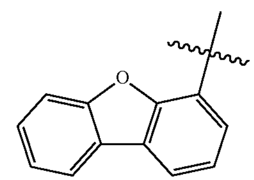 [SMILES: *c1cccc2c1oc1ccccc12] |

-continued
| No. | | Ar1 | Ar2 |
|---|---|---|---|
| 7-11 | 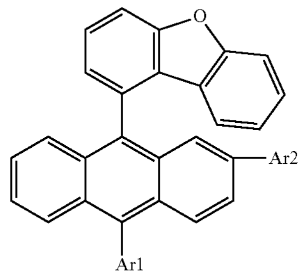 | 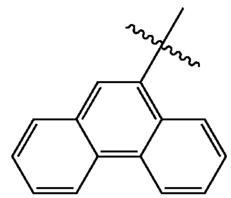 [SMILES: *c1cc2ccccc2c2ccccc12] | 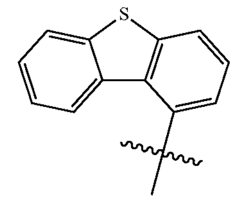 [SMILES: *c1cccc2sc3ccccc3c12] |
| 7-12 | 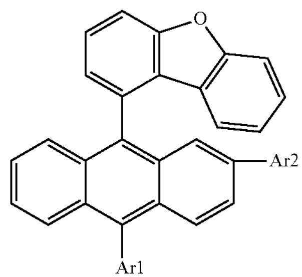 | 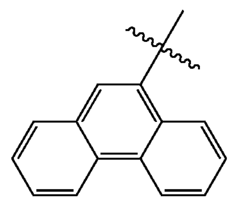 [SMILES: *c1cc2ccccc2c2ccccc12] | 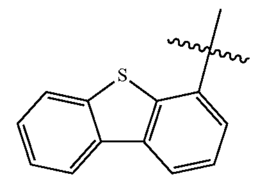 |
| 7-13 | 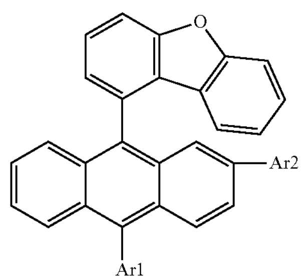 | 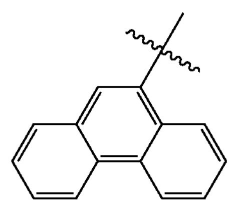 [SMILES: *c1cc2ccccc2c2ccccc12] | 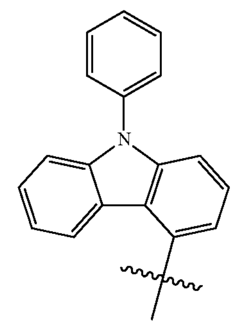 [SMILES: *c1cccc2c1c1ccccc1n2-c1ccccc1] |

-continued
| No. | | Ar1 | Ar2 |
|---|---|---|---|
| 7-14 | 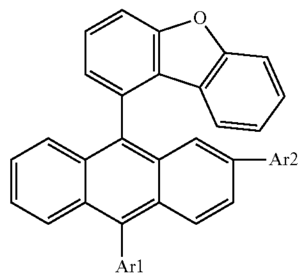 | 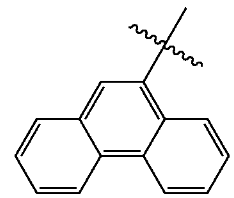 [SMILES: *c1cc2ccccc2c2ccccc12] | 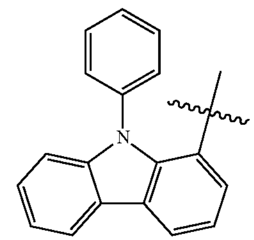 [SMILES: *c1cccc2c3ccccc3n(-c3ccccc3)c12] |
| 7-15 | 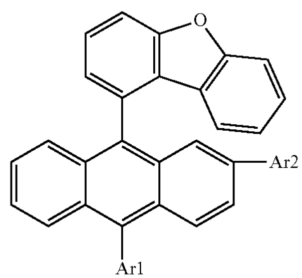 | 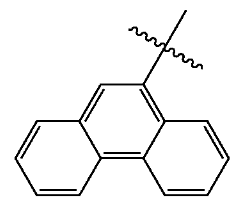 [SMILES: *c1cc2ccccc2c2ccccc12] | 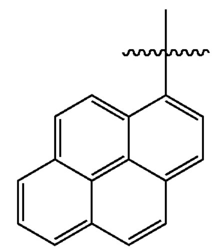 [SMILES: *c1ccc2ccc3cccc4ccc1c2c34] |
| 7-16 | 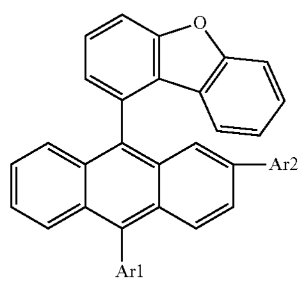 | 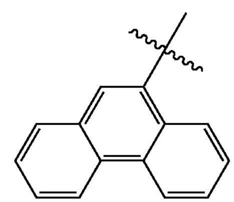 [SMILES: *c1cc2ccccc2c2ccccc12] | 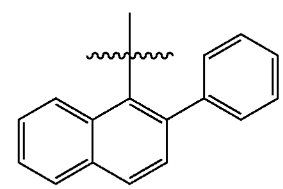 [SMILES: *c1c(-c2ccccc2)ccc2ccccc12] |

-continued
| No. | | Ar1 | Ar2 |
|---|---|---|---|
| 7-17 | 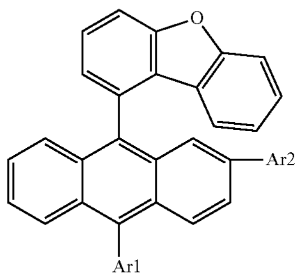 | 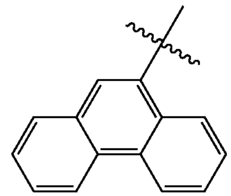 [SMILES: *c1cc2ccccc2c2ccccc12] | 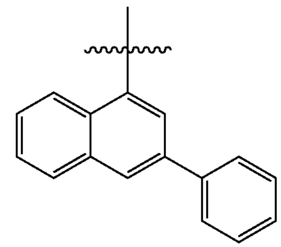 [SMILES: *c1cc(-c2ccccc2)cc2ccccc12] |
| 7-18 | 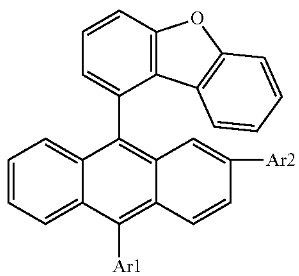 | 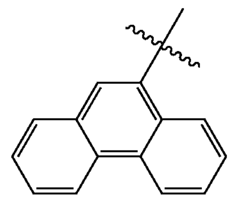 [SMILES: *c1cc2ccccc2c2ccccc12] | 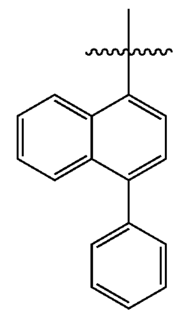 [SMILES: *c1ccc(-c2ccccc2)c2ccccc12] |
| 7-19 | 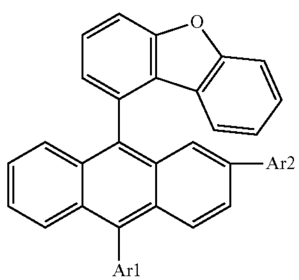 | 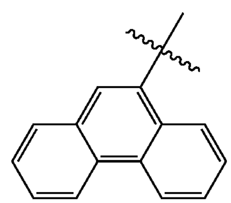 [SMILES: *c1cc2ccccc2c2ccccc12] | 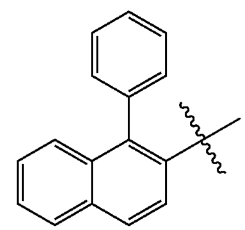 [SMILES: *c1ccc2ccccc2c1-c1ccccc1] |

-continued
| No. | | Ar1 | Ar2 |
|---|---|---|---|
| 7-20 | 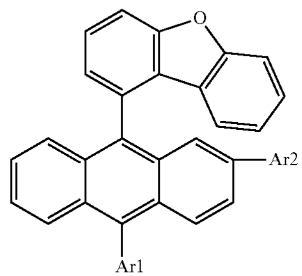 | 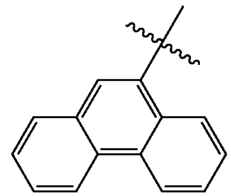 [SMILES: *c1cc2ccccc2c2ccccc12] | 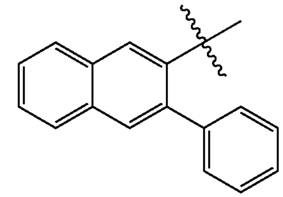 [SMILES: *c1cc2ccccc2cc1-c1ccccc1] |
| 7-21 | 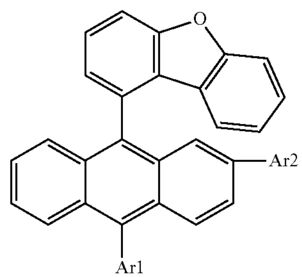 | 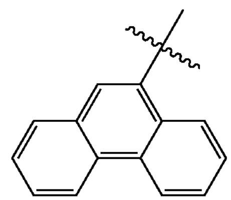 [SMILES: *c1cc2ccccc2c2ccccc12] | 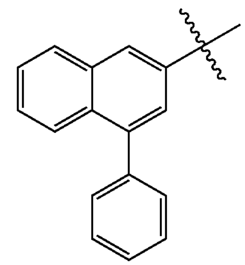 [SMILES: *c1cc(-c2ccccc2)c2ccccc2c1] |
| 7-22 | 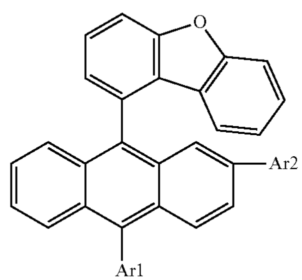 | 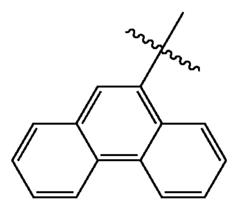 [SMILES: *c1cc2ccccc2c2ccccc12] | 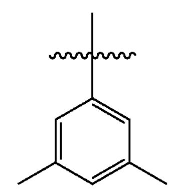 |

-continued
| No. | | Ar1 | Ar2 |
|---|---|---|---|
| 7-23 | 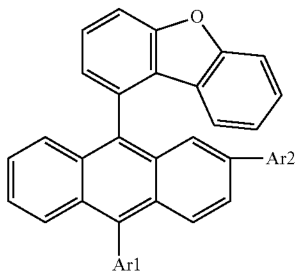 | 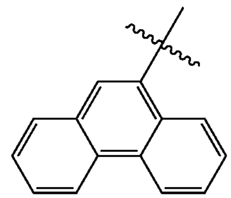 [SMILES: *c1cc2ccccc2c2ccccc12] | 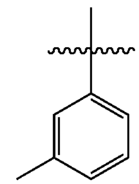 [SMILES: *c1cccc(C)c1] |
| 7-24 | 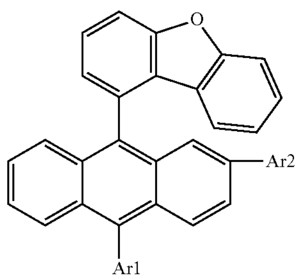 | 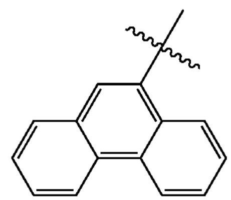 [SMILES: *c1cc2ccccc2c2ccccc12] | 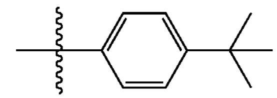 |
| 7-25 | 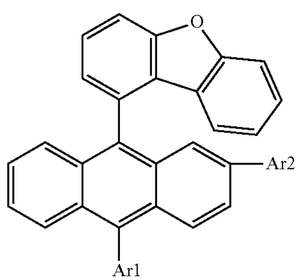 | 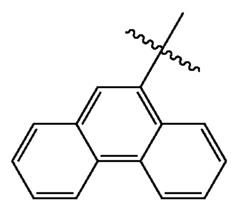 [SMILES: *c1cc2ccccc2c2ccccc12] | 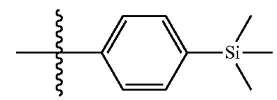 [SMILES: *c1ccc([Si](C)(C)C)cc1] |

-continued
| No. | | Ar1 | Ar2 |
|---|---|---|---|
| 7-26 | 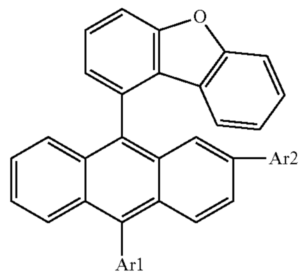 | 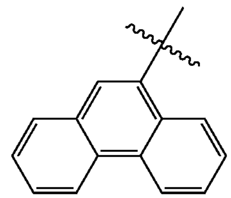 [SMILES: *c1cc2ccccc2c2ccccc12] | 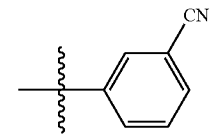 [SMILES: *c1cccc(C#N)c1] |
| 7-27 | 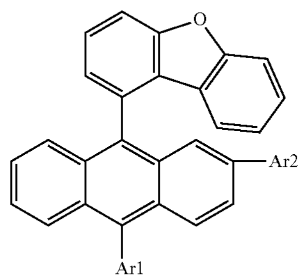 | 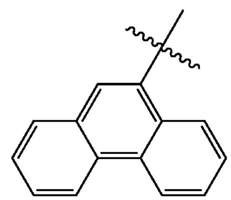 [SMILES: *c1cc2ccccc2c2ccccc12] | 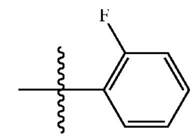 [SMILES: *c1ccccc1F] |
| 7-28 | 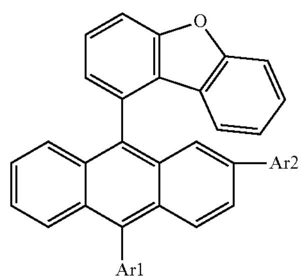 | 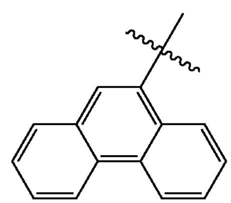 [SMILES: *c1cc2ccccc2c2ccccc12] | 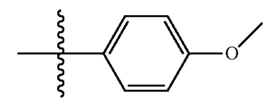 [SMILES: *c1ccc(OC)cc1] |

-continued
| No. | | Ar1 | Ar2 |
|---|---|---|---|
| 8-1 | 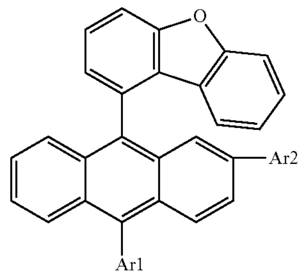 | 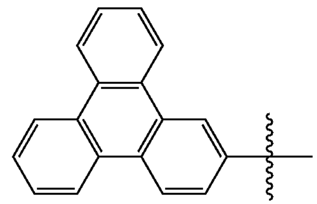 [SMILES: *c1ccc2c3ccccc3c3ccccc3c2c1] | 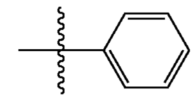 |
| 8-2 | 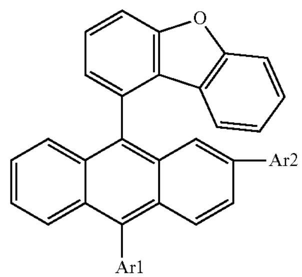 | 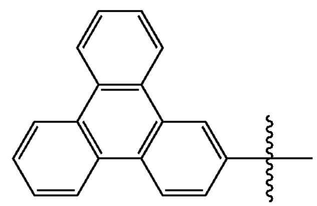 [SMILES: *c1ccc2c3ccccc3c3ccccc3c2c1] | 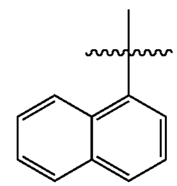 [SMILES: *c1cccc2ccccc12] |
| 8-3 | 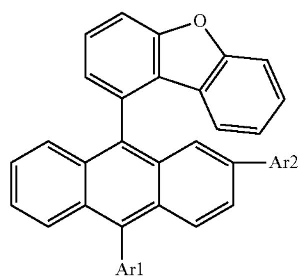 | 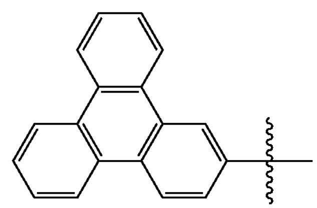 [SMILES: *c1ccc2c3ccccc3c3ccccc3c2c1] | 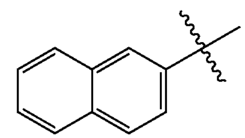 [SMILES: *c1ccc2ccccc2c1] |

-continued
| No. | | Ar1 | Ar2 |
|---|---|---|---|
| 8-4 | 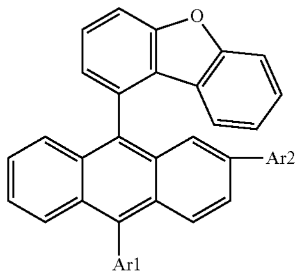 | 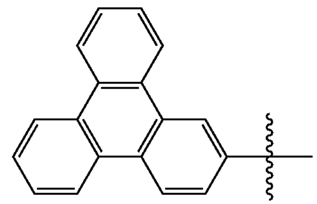 [SMILES: *c1ccc2c3ccccc3c3ccccc3c2c1] | 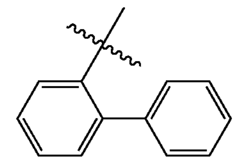 [SMILES: *c1ccccc1-c1ccccc1] |
| 8-5 | 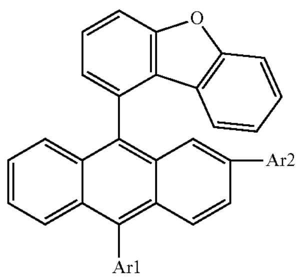 | 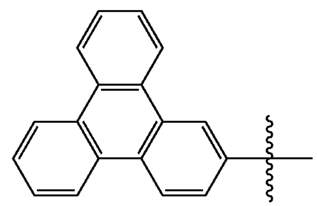 [SMILES: *c1ccc2c3ccccc3c3ccccc3c2c1] | 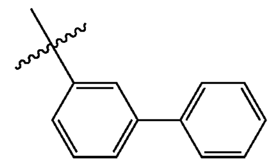 [SMILES: *c1cccc(-c2ccccc2)c1] |
| 8-6 | 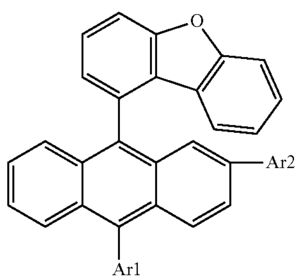 | 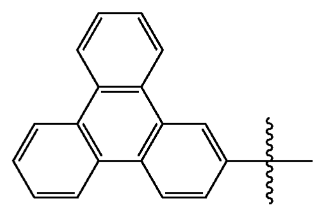 [SMILES: *c1ccc2c3ccccc3c3ccccc3c2c1] | 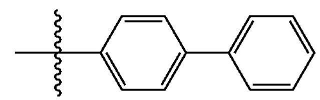 [SMILES: *c1ccc(-c2ccccc2)cc1] |

-continued
| No. | | Ar1 | Ar2 |
|---|---|---|---|
| 8-7 | 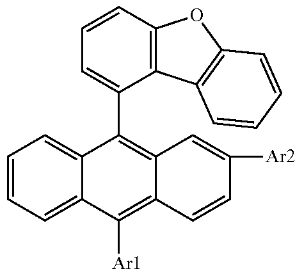 | 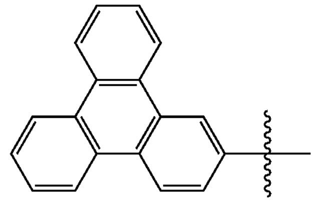 [SMILES: *c1ccc2c3ccccc3c3ccccc3c2c1] | 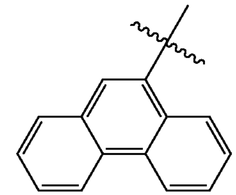 [SMILES: *c1cc2ccccc2c2ccccc12] |
| 8-8 | 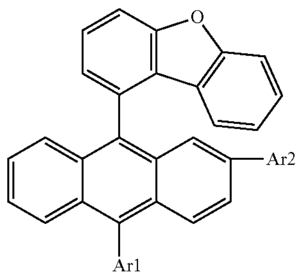 | 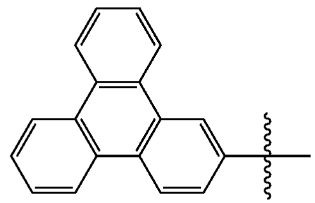 [SMILES: *c1ccc2c3ccccc3c3ccccc3c2c1] | 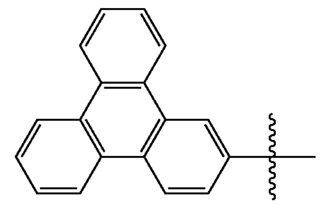 [SMILES: *c1ccc2c3ccccc3c3ccccc3c2c1] |
| 8-9 | 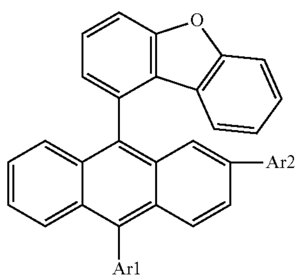 | 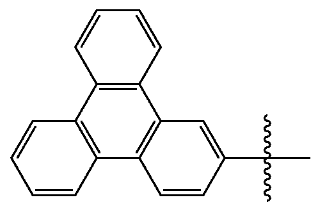 [SMILES: *c1ccc2c3ccccc3c3ccccc3c2c1] | 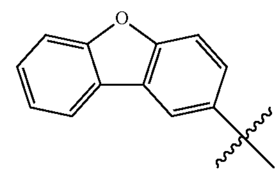 [SMILES: *c1ccc2oc3ccccc3c2c1] |

-continued
| No. | | Ar1 | Ar2 |
|---|---|---|---|
| 8-10 | 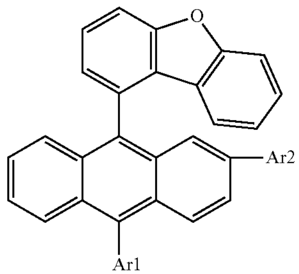 | 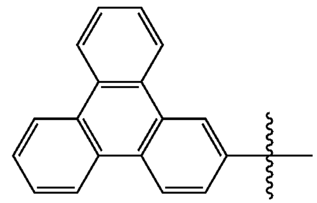 [SMILES: *c1ccc2c3ccccc3c3ccccc3c2c1] | 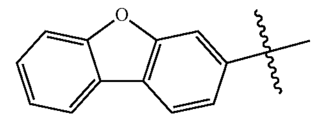 |
| 8-11 | 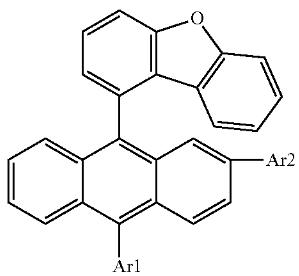 | 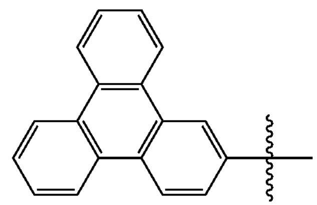 [SMILES: *c1ccc2c3ccccc3c3ccccc3c2c1] | 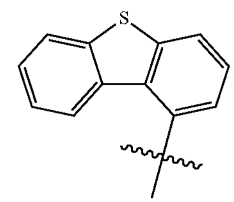 [SMILES: *c1cccc2sc3ccccc3c12] |
| 8-12 | 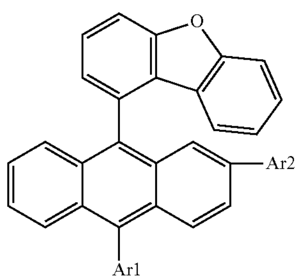 | 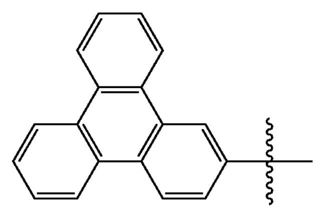 [SMILES: *c1ccc2c3ccccc3c3ccccc3c2c1] | 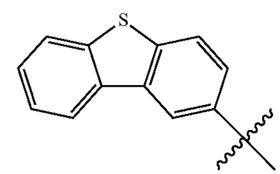 |

-continued
| No. | | Ar1 | Ar2 |
|---|---|---|---|
| 8-13 | 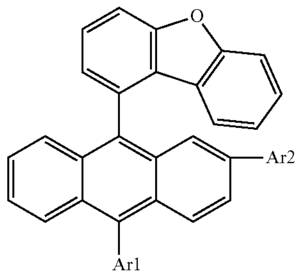 | 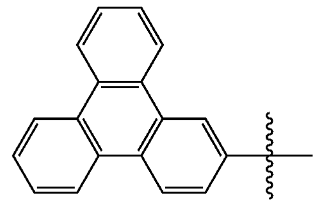 [SMILES: *c1ccc2c3ccccc3c3ccccc3c2c1] | 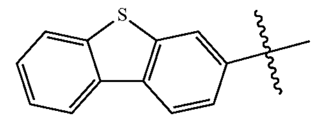 |
| 8-14 | 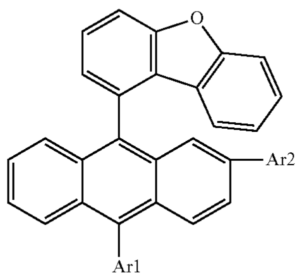 | 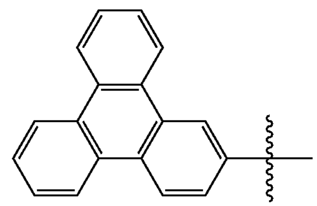 [SMILES: *c1ccc2c3ccccc3c3ccccc3c2c1] | 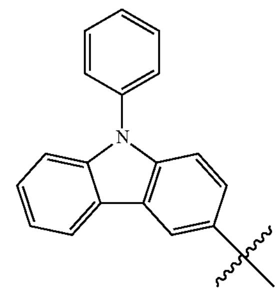 [SMILES: *c1ccc2c(c1)c1ccccc1n2-c1ccccc1] |
| 8-15 | 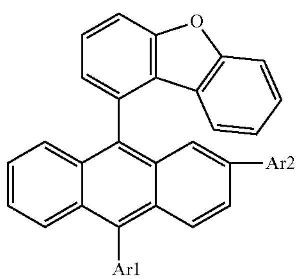 | 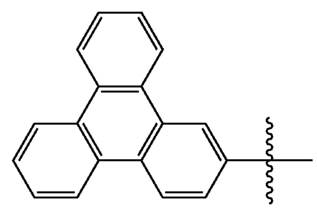 [SMILES: *c1ccc2c3ccccc3c3ccccc3c2c1] | 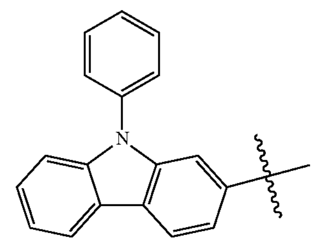 [SMILES: *c1ccc2c3ccccc3n(-c3ccccc3)c2c1] |

-continued
| No. | | Ar1 | Ar2 |
|---|---|---|---|
| 8-16 | 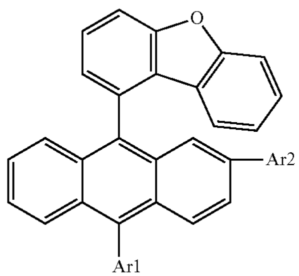 | 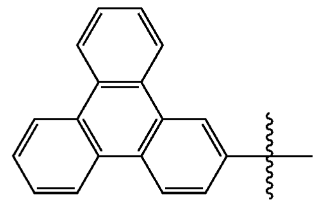 [SMILES: *c1ccc2c3ccccc3c3ccccc3c2c1] | 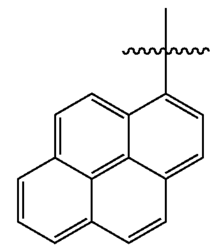 [SMILES: *c1ccc2ccc3cccc4ccc1c2c34] |
| 8-17 | 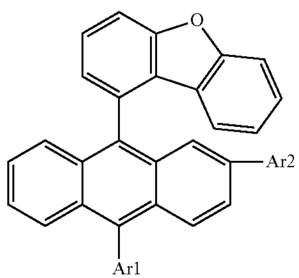 | 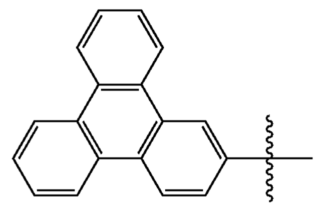 [SMILES: *c1ccc2c3ccccc3c3ccccc3c2c1] | 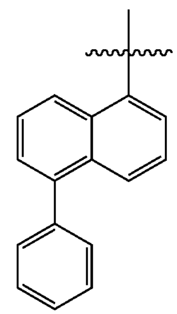 [SMILES: *c1cccc2c(-c3ccccc3)cccc12] |
| 8-18 | 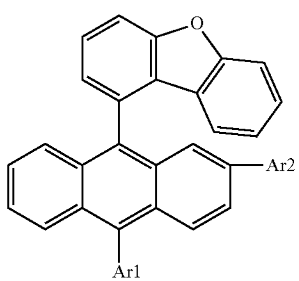 | 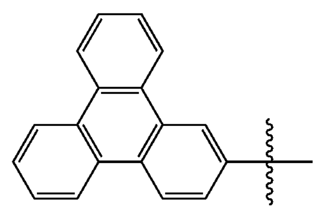 [SMILES: *c1ccc2c3ccccc3c3ccccc3c2c1] | 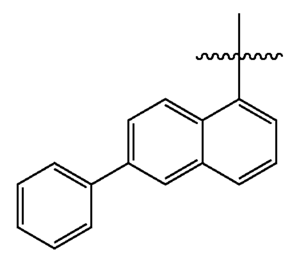 [SMILES: *c1cccc2cc(-c3ccccc3)ccc12] |

-continued
| No. | | Ar1 | Ar2 |
| --- | --- | --- | --- |
| 8-19 | 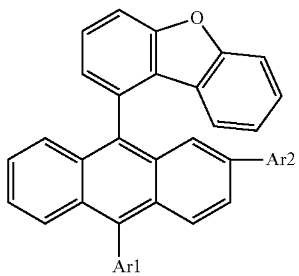 | 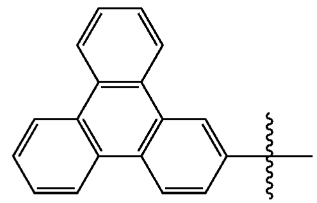 [SMILES: *c1ccc2c3ccccc3c3ccccc3c2c1] | 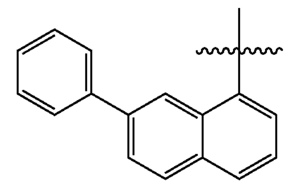 [SMILES: *c1cccc2ccc(-c3ccccc3)cc12] |
| 8-20 | 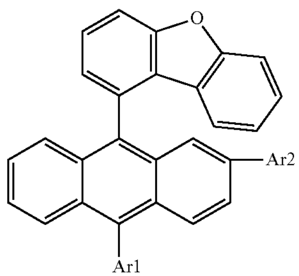 | 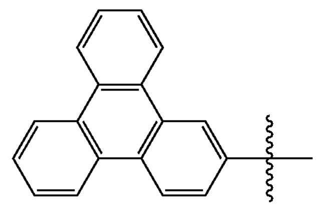 [SMILES: *c1ccc2c3ccccc3c3ccccc3c2c1] | 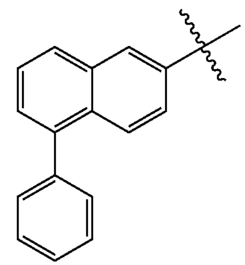 [SMILES: *c1ccc2c(-c3ccccc3)cccc2c1] |
| 8-21 | 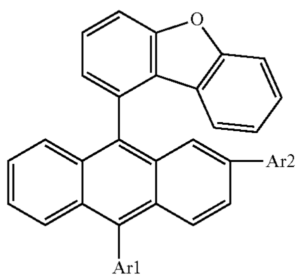 | 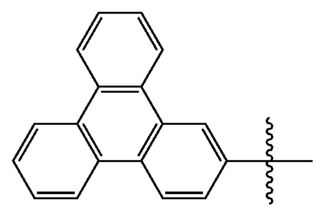 [SMILES: *c1ccc2c3ccccc3c3ccccc3c2c1] | 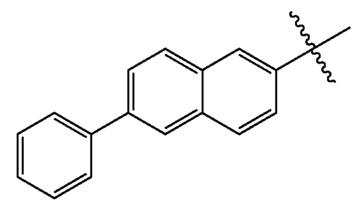 [SMILES: *c1ccc2cc(-c3ccccc3)ccc2c1] |

-continued
| No. | | Ar1 | Ar2 |
|---|---|---|---|
| 8-22 | 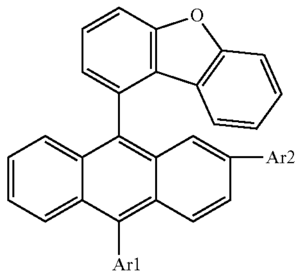 | 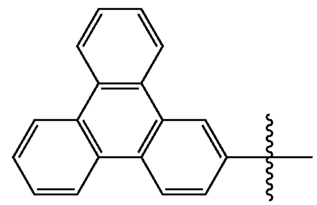 [SMILES: *c1ccc2c3ccccc3c3ccccc3c2c1] | 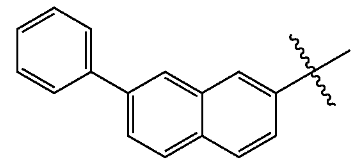 [SMILES: *c1ccc2ccc(-c3ccccc3)cc2c1] |
| 8-23 | 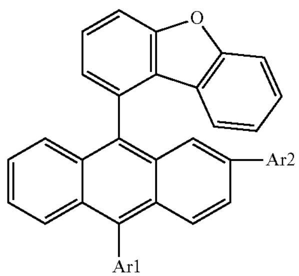 | 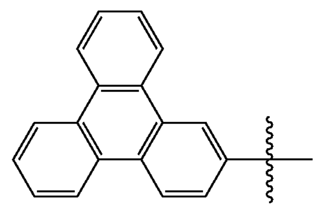 [SMILES: *c1ccc2c3ccccc3c3ccccc3c2c1] | 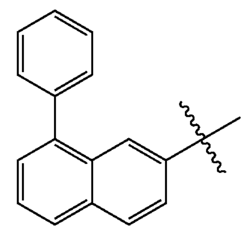 [SMILES: *c1ccc2cccc(-c3ccccc3)c2c1] |
| 8-24 | 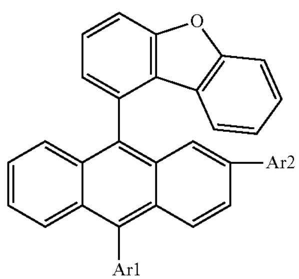 | 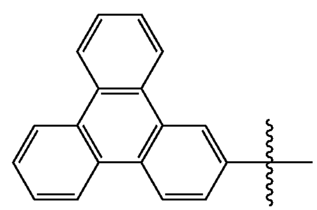 [SMILES: *c1ccc2c3ccccc3c3ccccc3c2c1] | 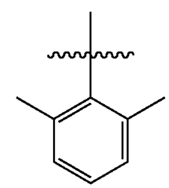 |

-continued
| No. | | Ar1 | Ar2 |
| --- | --- | --- | --- |
| 8-25 | 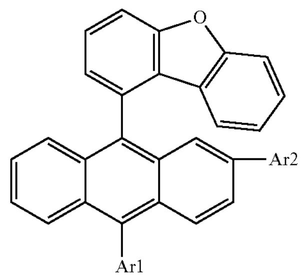 | 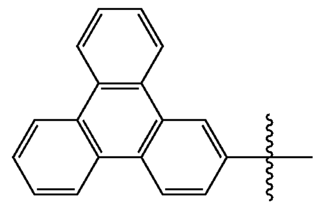 [SMILES: *c1ccc2c3ccccc3c3ccccc3c2c1] | 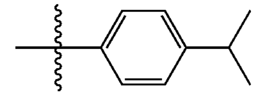 |
| 8-26 | 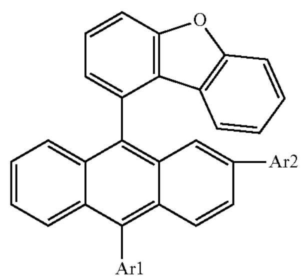 | 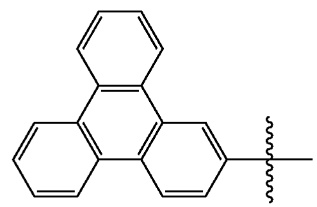 [SMILES: *c1ccc2c3ccccc3c3ccccc3c2c1] | 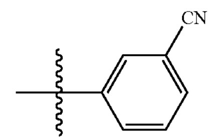 [SMILES: *c1cccc(C#N)c1] |
| 8-27 | 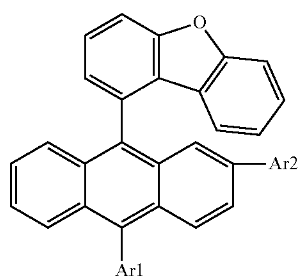 | 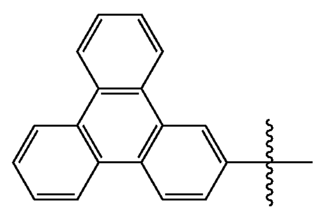 [SMILES: *c1ccc2c3ccccc3c3ccccc3c2c1] | 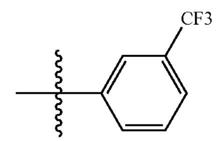 [SMILES: *c1cccc(C(F)(F)F)c1] |

-continued
| No. | | Ar1 | Ar2 |
|---|---|---|---|
| 8-28 | 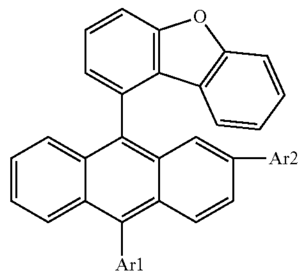 | 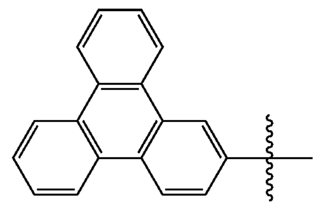 [SMILES: *c1ccc2c3ccccc3c3ccccc3c2c1] | 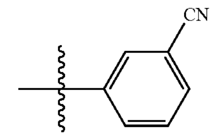 [SMILES: *c1cccc(C#N)c1] |
| 8-29 | 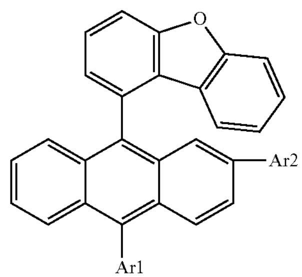 | 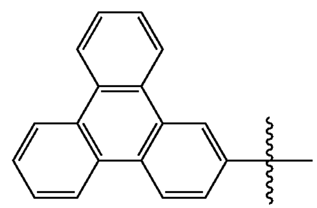 | 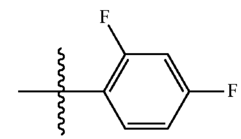 [SMILES: *c1ccc(F)cc1F] |
| 9-1 | 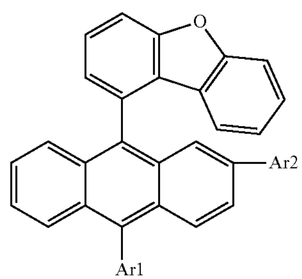 | 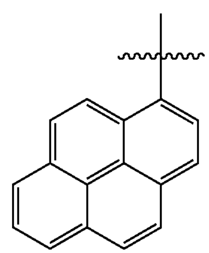 [SMILES: *c1ccc2ccc3cccc4ccc1c2c34] | 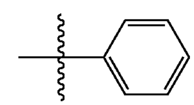 [SMILES: *c1ccccc1] |

-continued
| No. | | Ar1 | Ar2 |
|---|---|---|---|
| 9-2 | 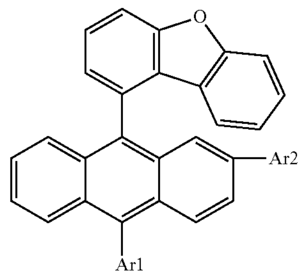 | 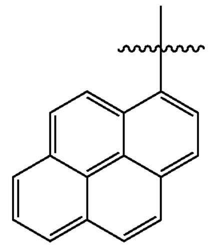 [SMILES: *c1ccc2ccc3cccc4ccc1c2c34] | 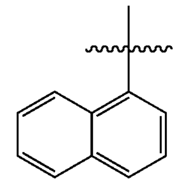 [SMILES: *c1cccc2ccccc12] |
| 9-3 | 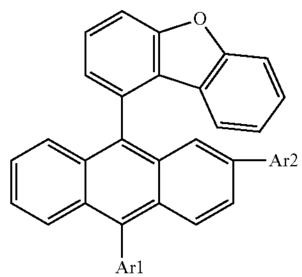 | 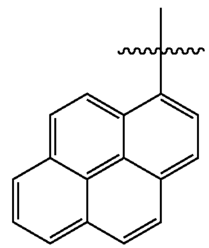 [SMILES: *c1ccc2ccc3cccc4ccc1c2c34] | 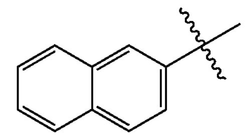 [SMILES: *c1ccc2ccccc2c1] |
| 9-4 | 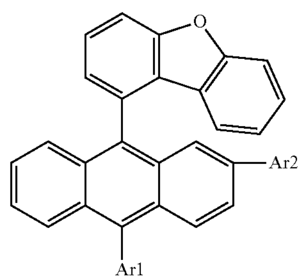 | 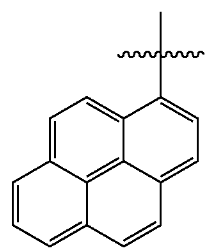 [SMILES: *c1ccc2ccc3cccc4ccc1c2c34] | 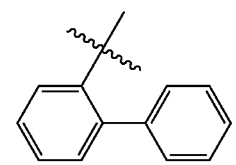 [SMILES: *c1ccccc1-c1ccccc1] |

-continued
| No. | | Ar1 | Ar2 |
|---|---|---|---|
| 9-5 | 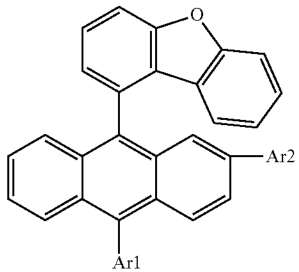 | 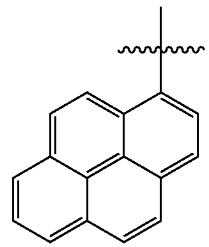 [SMILES: *c1ccc2ccc3cccc4ccc1c2c34] | 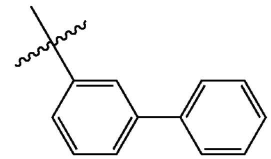 [SMILES: *c1cccc(-c2ccccc2)c1] |
| 9-6 | 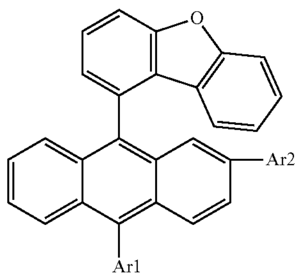 | 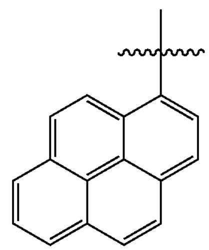 [SMILES: *c1ccc2ccc3cccc4ccc1c2c34] | 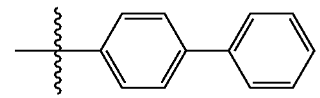 [SMILES: *c1ccc(-c2ccccc2)cc1] |
| 9-7 | 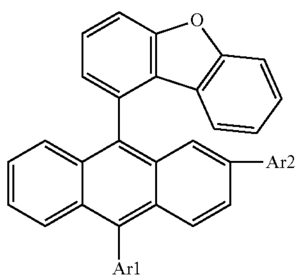 | 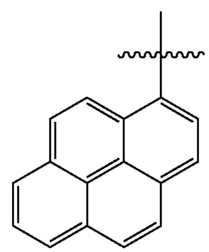 [SMILES: *c1ccc2ccc3cccc4ccc1c2c34] | 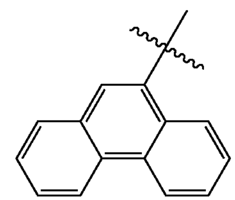 [SMILES: *c1cc2ccccc2c2ccccc12] |

-continued
| No. | | Ar1 | Ar2 |
| --- | --- | --- | --- |
| 9-8 | 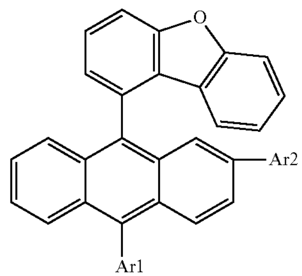 | 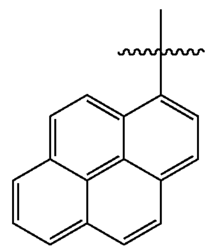 [SMILES: *c1ccc2ccc3cccc4ccc1c2c34] | 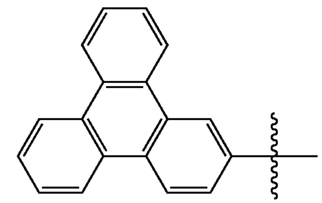 [SMILES: *c1ccc2c3ccccc3c3ccccc3c2c1] |
| 9-9 | 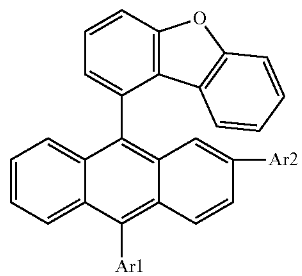 | 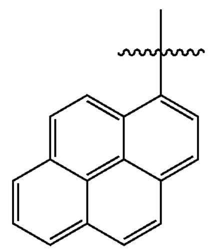 [SMILES: *c1ccc2ccc3cccc4ccc1c2c34] | 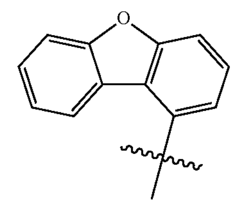 [SMILES: *c1cccc2oc3ccccc3c12] |
| 9-10 | 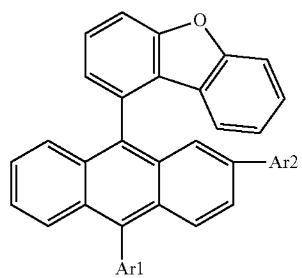 | 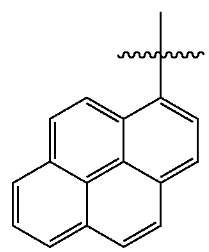 [SMILES: *c1ccc2ccc3cccc4ccc1c2c34] | 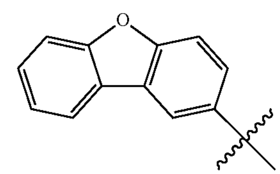 |

-continued
| No. | | Ar1 | Ar2 |
|---|---|---|---|
| 9-11 | 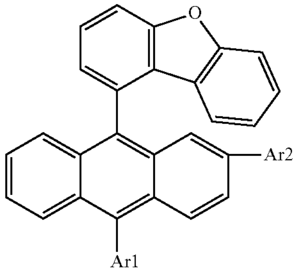 | 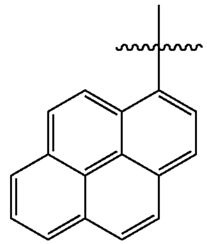 [SMILES: *c1ccc2ccc3cccc4ccc1c2c34] | 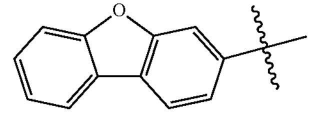 |
| 9-12 | 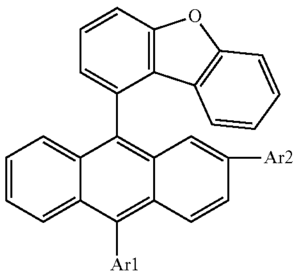 | 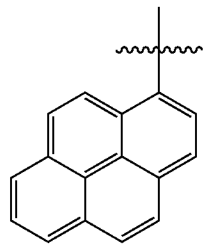 [SMILES: *c1ccc2ccc3cccc4ccc1c2c34] | 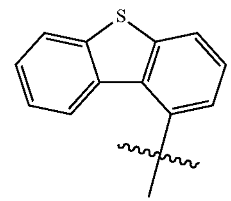 [SMILES: *c1cccc2sc3ccccc3c12] |
| 9-13 | 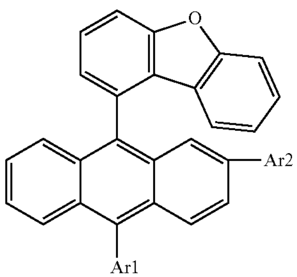 | 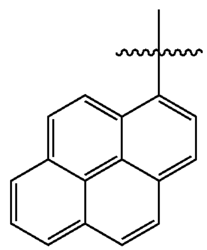 [SMILES: *c1ccc2ccc3cccc4ccc1c2c34] | 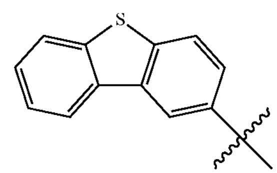 [SMILES: *c1ccc2sc3ccccc3c2c1] |

-continued
| No. | | Ar1 | Ar2 |
|---|---|---|---|
| 9-14 | 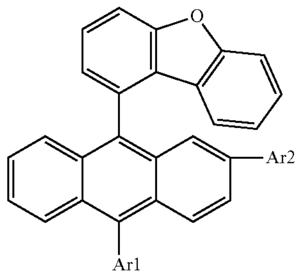 | 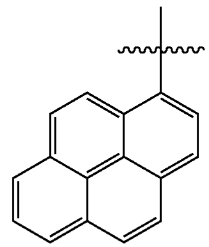 [SMILES: *c1ccc2ccc3cccc4ccc1c2c34] | 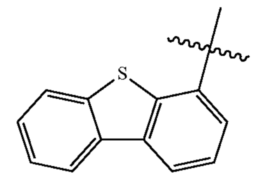 |
| 9-15 | 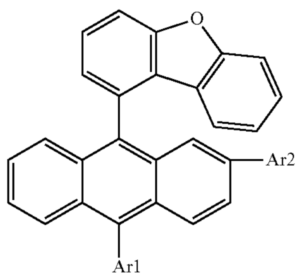 | 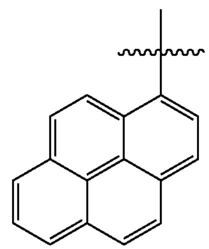 [SMILES: *c1ccc2ccc3cccc4ccc1c2c34] | 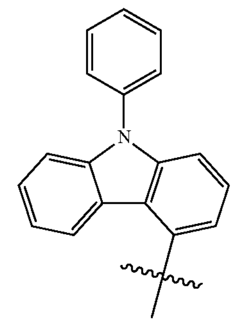 [SMILES: *c1cccc2c1c1ccccc1n2-c1ccccc1] |
| 9-16 | 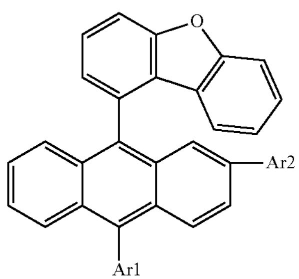 | 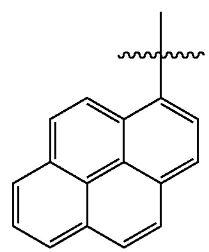 [SMILES: *c1ccc2ccc3cccc4ccc1c2c34] | 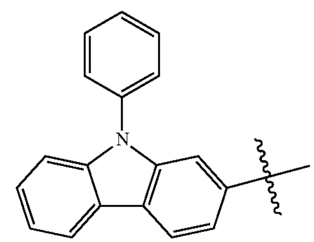 [SMILES: *c1ccc2c3ccccc3n(-c3ccccc3)c2c1] |

-continued
| No. | | Ar1 | Ar2 |
|---|---|---|---|
| 9-17 | 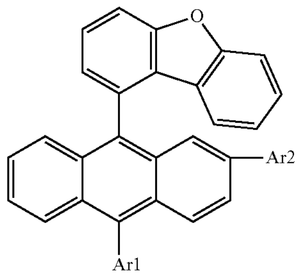 | 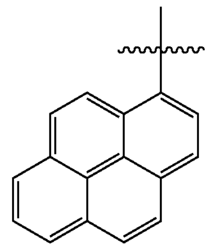 [SMILES: *c1ccc2ccc3cccc4ccc1c2c34] | 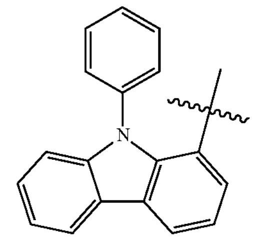 [SMILES: *c1cccc2c3ccccc3n(-c3ccccc3)c12] |
| 9-18 | 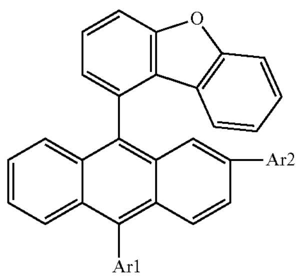 | 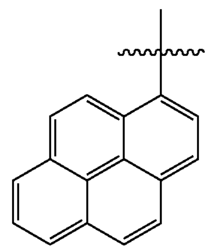 [SMILES: *c1ccc2ccc3cccc4ccc1c2c34] | 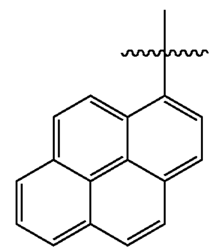 [SMILES: *c1ccc2ccc3cccc4ccc1c2c34] |
| 9-19 | 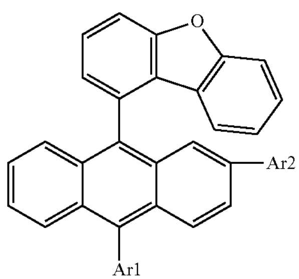 | 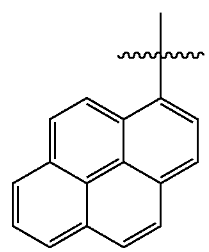 [SMILES: *c1ccc2ccc3cccc4ccc1c2c34] | 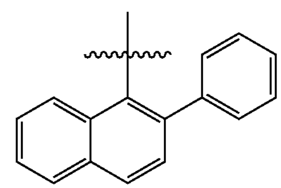 [SMILES: *c1c(-c2ccccc2)ccc2ccccc12] |

-continued
| No. | | Ar1 | Ar2 |
|---|---|---|---|
| 9-20 | 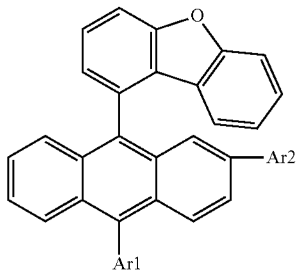 | 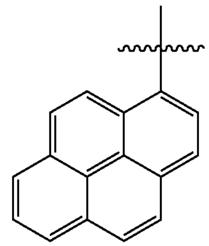 [SMILES: *c1ccc2ccc3cccc4ccc1c2c34] | 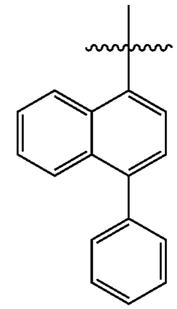 [SMILES: *c1ccc(-c2ccccc2)c2ccccc12] |
| 9-21 | 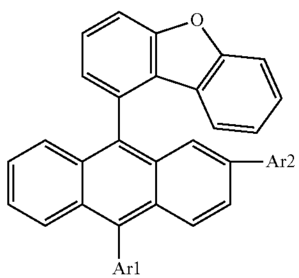 | 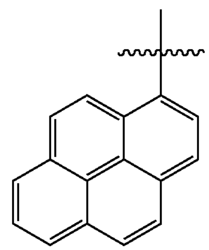 [SMILES: *c1ccc2ccc3cccc4ccc1c2c34] | 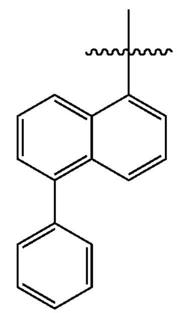 [SMILES: *c1cccc2c(-c3ccccc3)cccc12] |
| 9-22 | 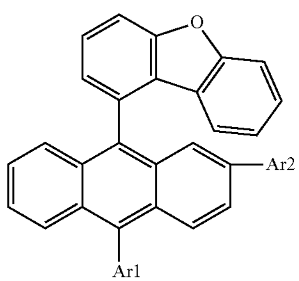 | 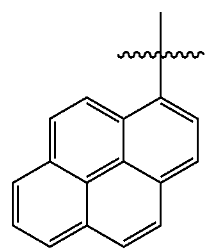 [SMILES: *c1ccc2ccc3cccc4ccc1c2c34] | 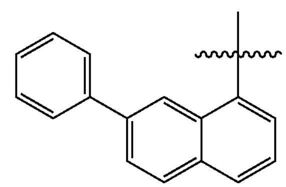 [SMILES: *c1cccc2ccc(-c3ccccc3)cc12] |

-continued
| No. | | Ar1 | Ar2 |
|---|---|---|---|
| 9-23 | 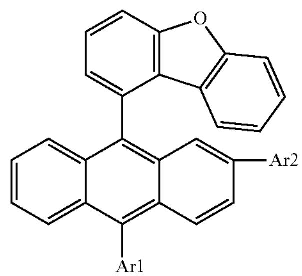 | 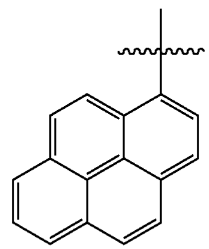 [SMILES: *c1ccc2ccc3cccc4ccc1c2c34] | 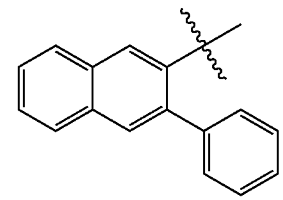 [SMILES: *c1cc2ccccc2cc1-c1ccccc1] |
| 9-24 | 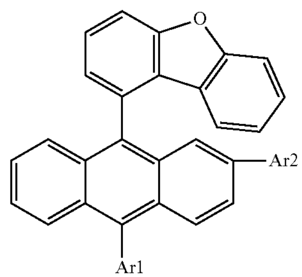 | 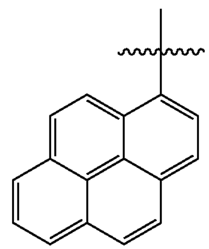 [SMILES: *c1ccc2ccc3cccc4ccc1c2c34] | 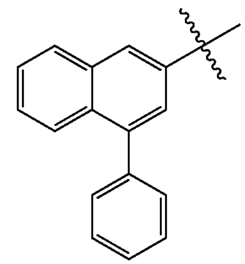 [SMILES: *c1cc(-c2ccccc2)c2ccccc2c1] |
| 9-25 | 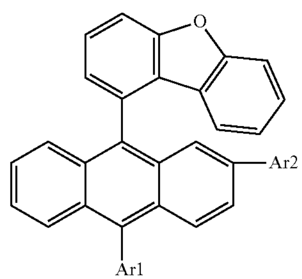 | 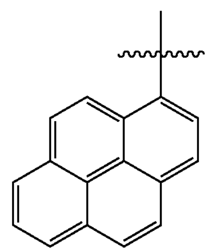 [SMILES: *c1ccc2ccc3cccc4ccc1c2c34] | 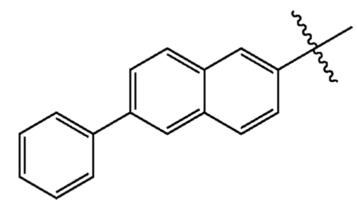 [SMILES: *c1ccc2cc(-c3ccccc3)ccc2c1] |

-continued
| No. | | Ar1 | Ar2 |
|---|---|---|---|
| 9-26 | 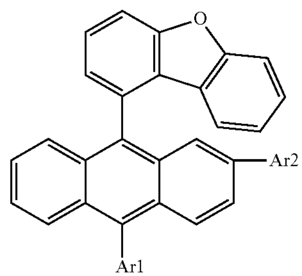 | 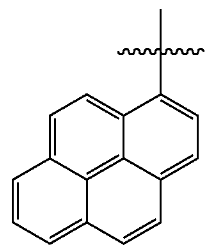 [SMILES: *c1ccc2ccc3cccc4ccc1c2c34] | 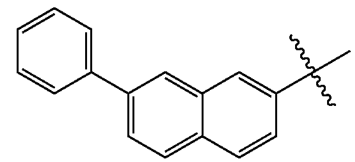 [SMILES: *c1ccc2ccc(-c3ccccc3)cc2c1] |
| 9-27 | 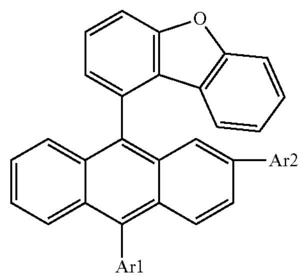 | 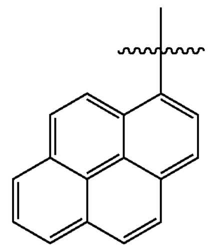 [SMILES: *c1ccc2ccc3cccc4ccc1c2c34] | 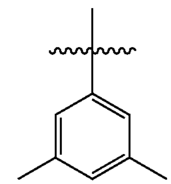 |
| 9-28 | 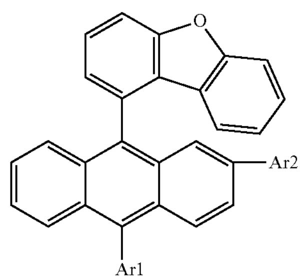 | 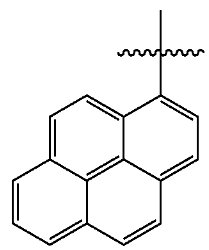 [SMILES: *c1ccc2ccc3cccc4ccc1c2c34] | 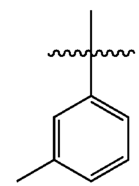 [SMILES: *c1cccc(C)c1] |

-continued
| No. | | Ar1 | Ar2 |
|---|---|---|---|
| 9-29 | 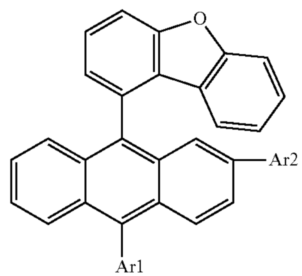 | 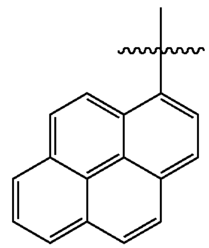 [SMILES: *c1ccc2ccc3cccc4ccc1c2c34] | 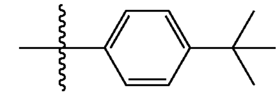 [SMILES: *c1ccc(C(C)(C)C)cc1] |
| 9-30 | 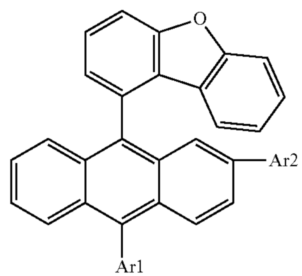 | 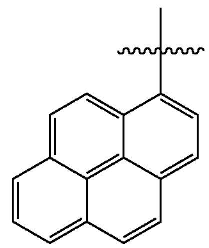 [SMILES: *c1ccc2ccc3cccc4ccc1c2c34] | 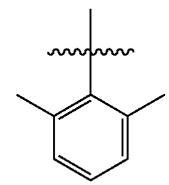 |
| 9-31 | 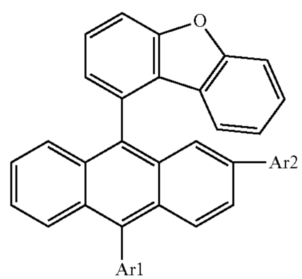 | 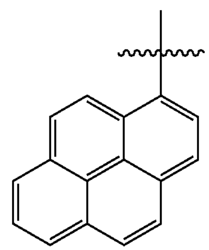 [SMILES: *c1ccc2ccc3cccc4ccc1c2c34] | 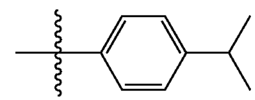 [SMILES: *c1ccc(C(C)C)cc1] |

-continued
| No. | | Ar1 | Ar2 |
|---|---|---|---|
| 10-1 | 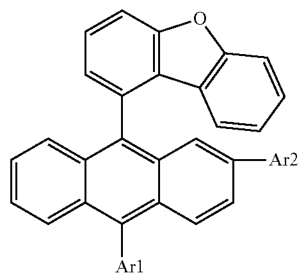 | 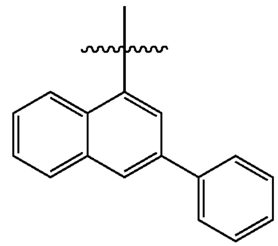 [SMILES: *c1cc(-c2ccccc2)cc2ccccc12] | 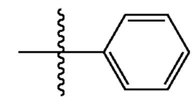 |
| 10-2 | 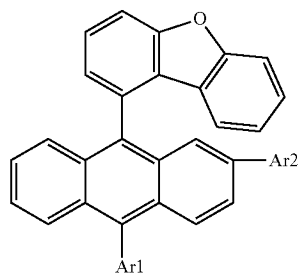 | 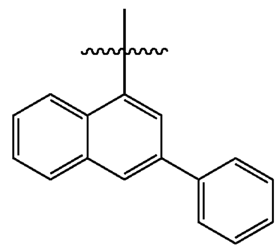 [SMILES: *c1cc(-c2ccccc2)cc2ccccc12] | 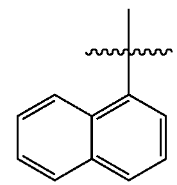 [SMILES: *c1cccc2ccccc12] |
| 10-3 | 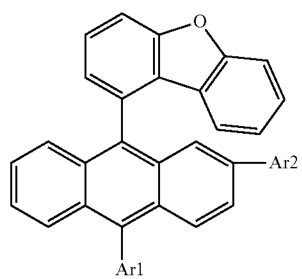 | 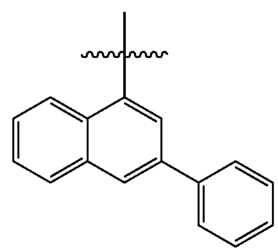 [SMILES: *c1cc(-c2ccccc2)cc2ccccc12] | 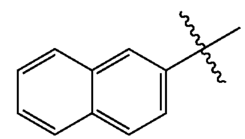 [SMILES: *c1ccc2ccccc2c1] |

-continued
| No. | | Ar1 | Ar2 |
| --- | --- | --- | --- |
| 10-4 | 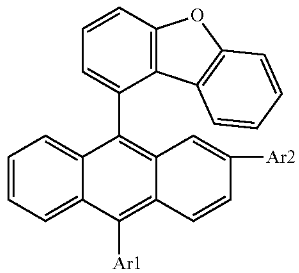 | 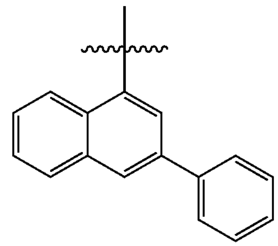 [SMILES: *c1cc(-c2ccccc2)cc2ccccc12] | 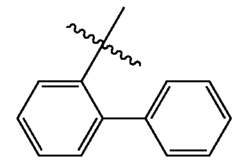 [SMILES: *c1ccccc1-c1ccccc1] |
| 10-5 | 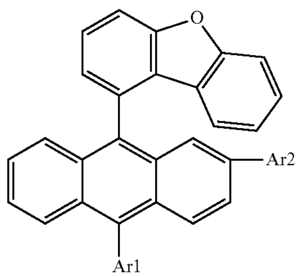 | 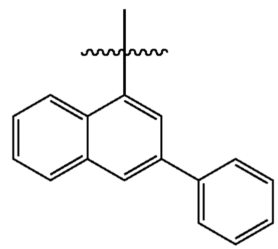 [SMILES: *c1cc(-c2ccccc2)cc2ccccc12] | 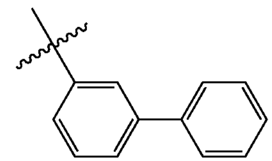 [SMILES: *c1cccc(-c2ccccc2)c1] |
| 10-6 | 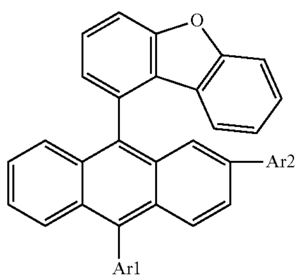 | 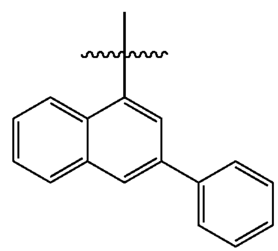 [SMILES: *c1cc(-c2ccccc2)cc2ccccc12] | 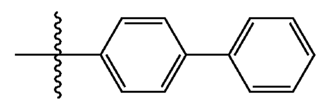 [SMILES: *c1ccc(-c2ccccc2)cc1] |

-continued
| No. | | Ar1 | Ar2 |
|---|---|---|---|
| 10-7 | 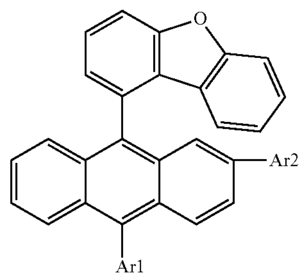 | 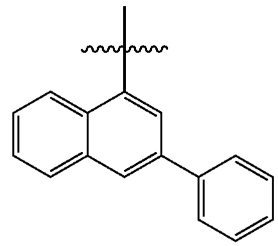 [SMILES: *c1cc(-c2ccccc2)cc2ccccc12] | 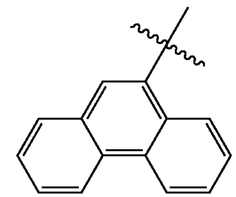 [SMILES: *c1cc2ccccc2c2ccccc12] |
| 10-8 | 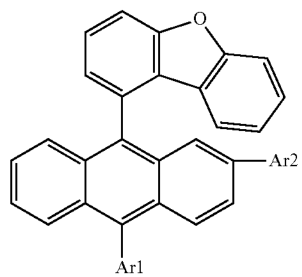 | 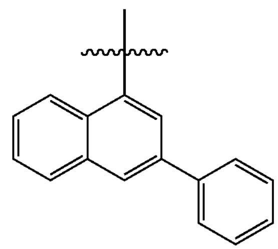 [SMILES: *c1cc(-c2ccccc2)cc2ccccc12] | 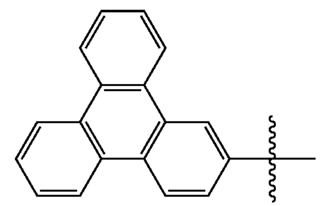 |
| 10-9 | 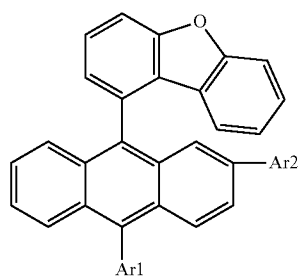 | 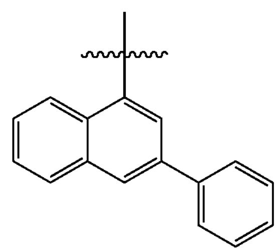 [SMILES: *c1cc(-c2ccccc2)cc2ccccc12] | 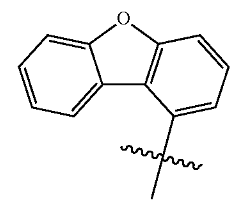 [SMILES: *c1cccc2oc3ccccc3c12] |

-continued
| No. | | Ar1 | Ar2 |
|---|---|---|---|
| 10-10 | 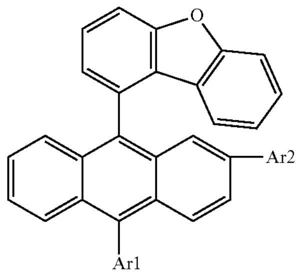  | 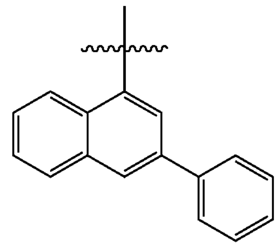 [SMILES: *c1cc(-c2ccccc2)cc2ccccc12] | 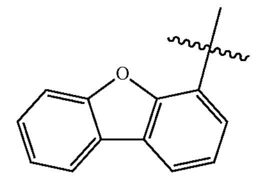 |
| 10-11 | 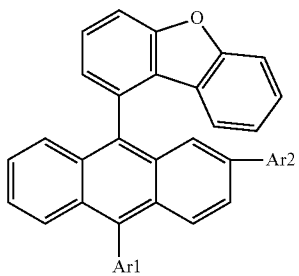  | 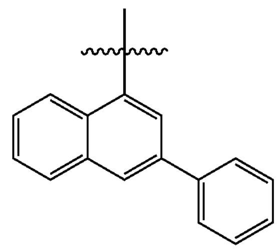 [SMILES: *c1cc(-c2ccccc2)cc2ccccc12] | 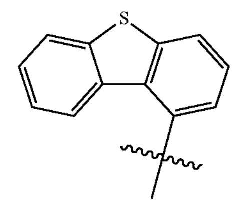 [SMILES: *c1cccc2sc3ccccc3c12] |
| 10-12 | 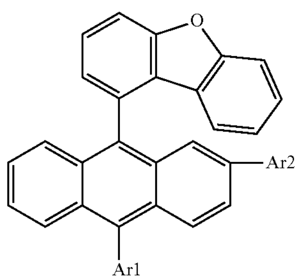  | 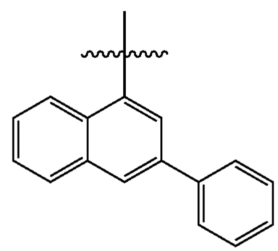 [SMILES: *c1cc(-c2ccccc2)cc2ccccc12] | 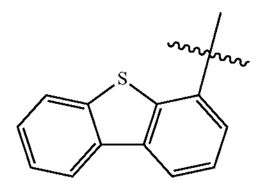 |

-continued
| No. | | Ar1 | Ar2 |
|---|---|---|---|
| 10-13 | 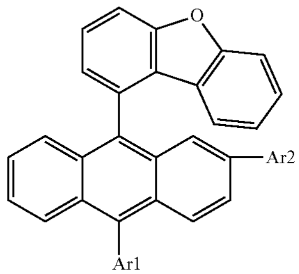 | 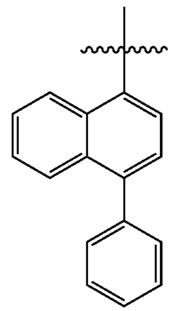 [SMILES: *c1ccc(-c2ccccc2)c2ccccc12] | 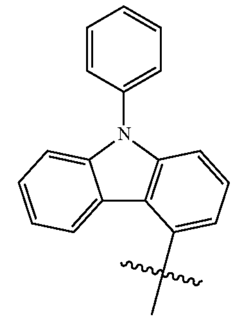 [SMILES: *c1cccc2c1c1ccccc1n2-c1ccccc1] |
| 10-14 | 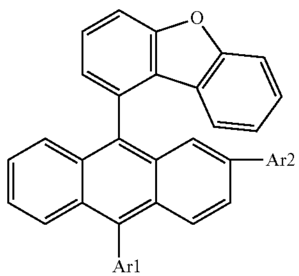 | 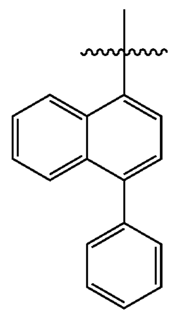 [SMILES: *c1ccc(-c2ccccc2)c2ccccc12] | 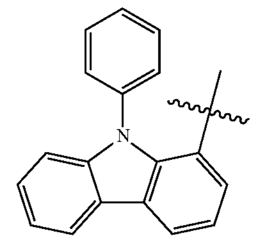 [SMILES: *c1cccc2c3ccccc3n(-c3ccccc3)c12] |
| 10-15 | 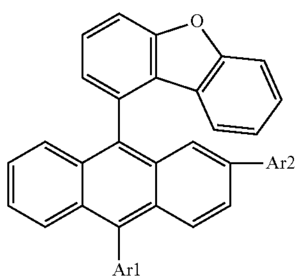 | 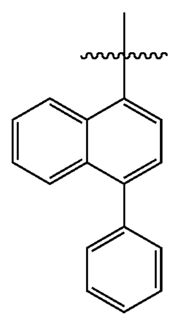 [SMILES: *c1ccc(-c2ccccc2)c2ccccc12] | 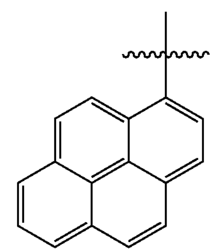 [SMILES: *c1ccc2ccc3cccc4ccc1c2c34] |

-continued
| No. | | Ar1 | Ar2 |
|---|---|---|---|
| 10-16 | 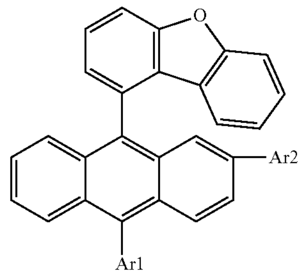 | 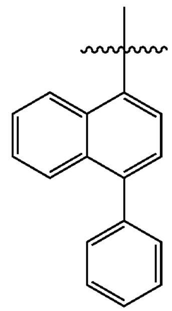 [SMILES: *c1ccc(-c2ccccc2)c2ccccc12] | 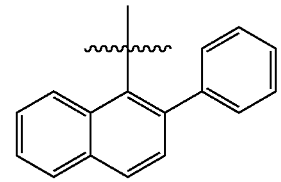 [SMILES: *c1c(-c2ccccc2)ccc2ccccc12] |
| 10-17 | 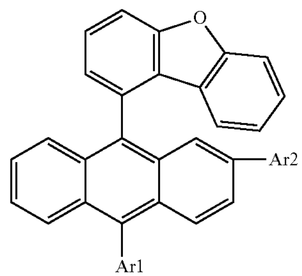 | 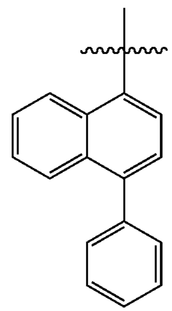 [SMILES: *c1ccc(-c2ccccc2)c2ccccc12] | 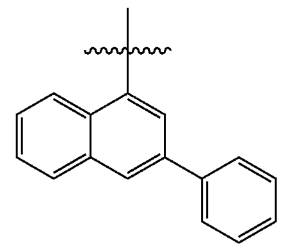 [SMILES: *c1cc(-c2ccccc2)cc2ccccc12] |
| 10-18 | 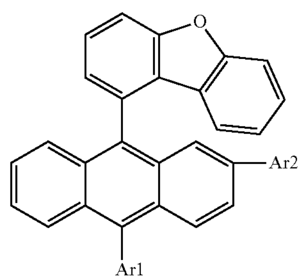 | 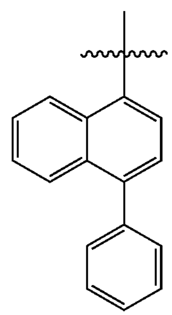 [SMILES: *c1ccc(-c2ccccc2)c2ccccc12] | 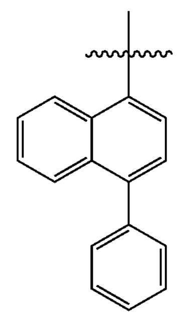 [SMILES: *c1ccc(-c2ccccc2)c2ccccc12] |

-continued
| No. | | Ar1 | Ar2 |
|---|---|---|---|
| 10-19 | 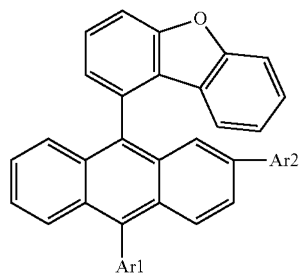 | 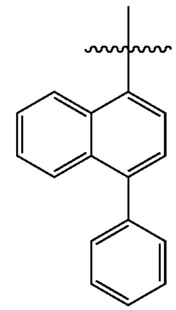 [SMILES: *c1ccc(-c2ccccc2)c2ccccc12] | 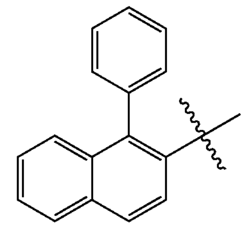 [SMILES: *c1ccc2ccccc2c1-c1ccccc1] |
| 10-20 | 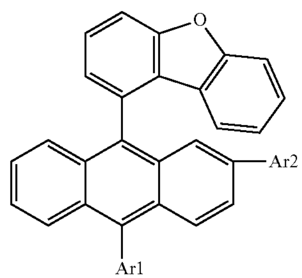 | 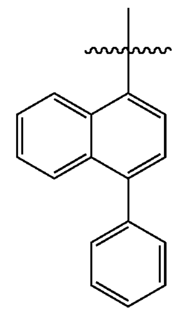 [SMILES: *c1ccc(-c2ccccc2)c2ccccc12] | 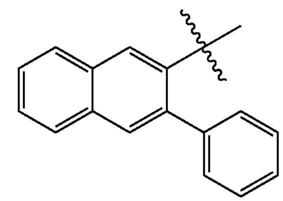 [SMILES: *c1cc2ccccc2cc1-c1ccccc1] |
| 10-21 | 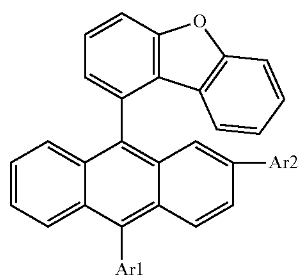 | 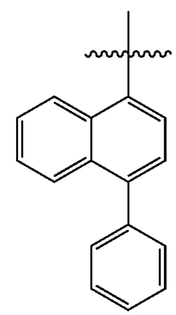 [SMILES: *c1ccc(-c2ccccc2)c2ccccc12] | 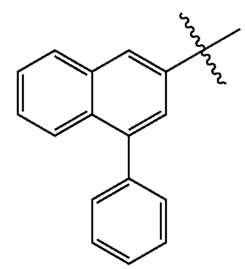 [SMILES: *c1cc(-c2ccccc2)c2ccccc2c1] |

-continued
| No. | | Ar1 | Ar2 |
|---|---|---|---|
| 10-22 | 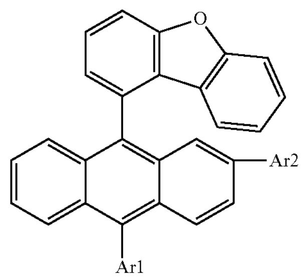 | 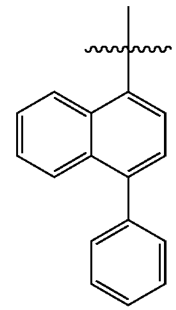 [SMILES: *c1ccc(-c2ccccc2)c2ccccc12] | 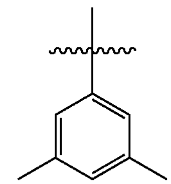 |
| 10-23 | 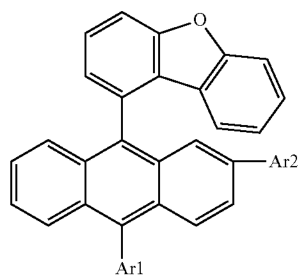 | 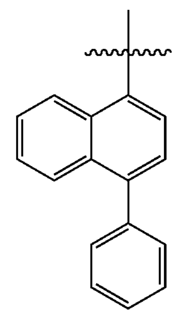 [SMILES: *c1ccc(-c2ccccc2)c2ccccc12] | 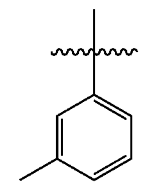 [SMILES: *c1cccc(C)c1] |
| 10-24 | 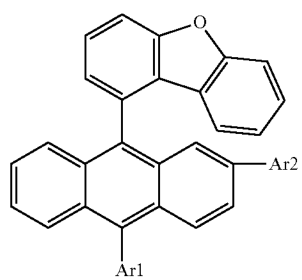 | 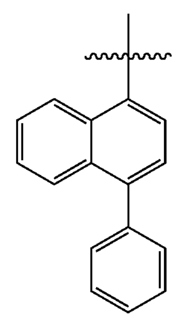 [SMILES: *c1ccc(-c2ccccc2)c2ccccc12] | 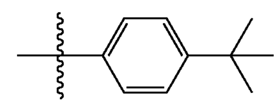 [SMILES: *c1ccc(C(C)(C)C)cc1] |

-continued
| No. | | Ar1 | Ar2 |
|---|---|---|---|
| 10-25 | 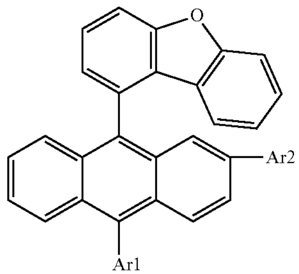 | 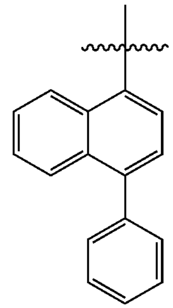 [SMILES: *c1ccc(-c2ccccc2)c2ccccc12] | 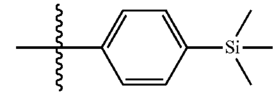 |
| 10-26 | 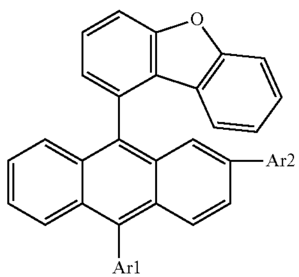 | 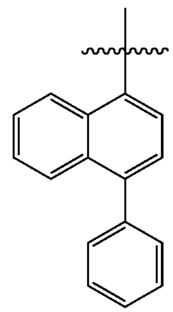 [SMILES: *c1ccc(-c2ccccc2)c2ccccc12] | 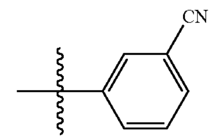 [SMILES: *c1cccc(C#N)c1] |
| 10-27 | 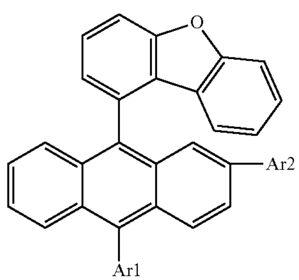 | 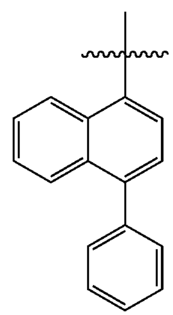 [SMILES: *c1ccc(-c2ccccc2)c2ccccc12] | 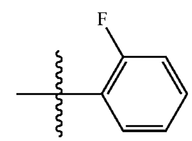 [SMILES: *c1ccccc1F] |

-continued
| No. | | Ar1 | Ar2 |
|---|---|---|---|
| 10-28 | 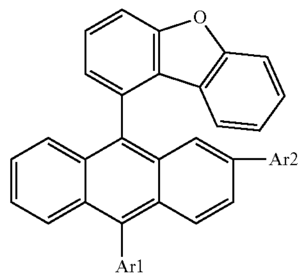 | 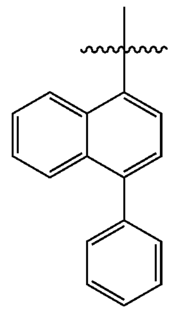 [SMILES: *c1ccc(-c2ccccc2)c2ccccc12] | 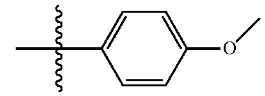 |
| 11-1 | 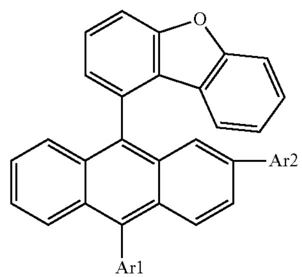 | 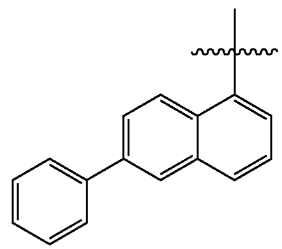 [SMILES: *c1cccc2cc(-c3ccccc3)ccc12] | 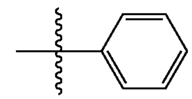 [SMILES: *c1ccccc1] |
| 11-2 | 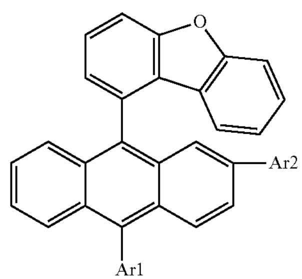 | 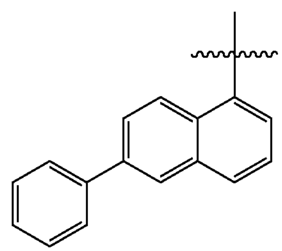 [SMILES: *c1cccc2cc(-c3ccccc3)ccc12] | 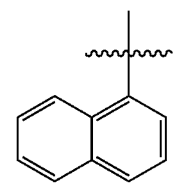 [SMILES: *c1cccc2ccccc12] |

-continued
| No. | | Ar1 | Ar2 |
|---|---|---|---|
| 11-3 | 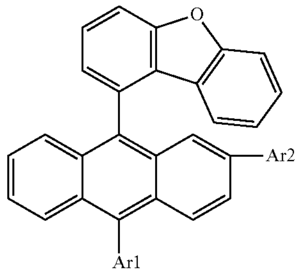 | 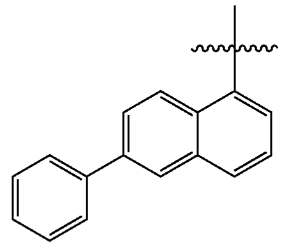 [SMILES: *c1cccc2cc(-c3ccccc3)ccc12] | 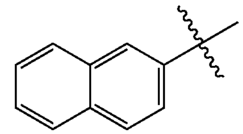 [SMILES: *c1ccc2ccccc2c1] |
| 11-4 | 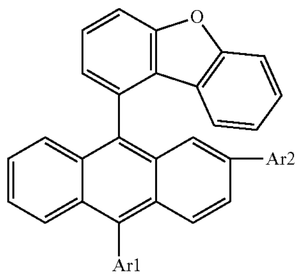 | 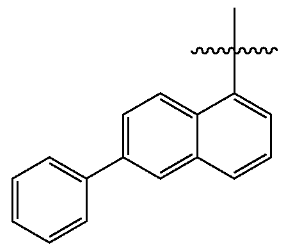 [SMILES: *c1cccc2cc(-c3ccccc3)ccc12] | 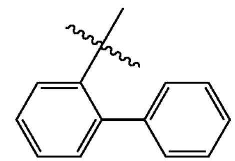 [SMILES: *c1ccccc1-c1ccccc1] |
| 11-5 | 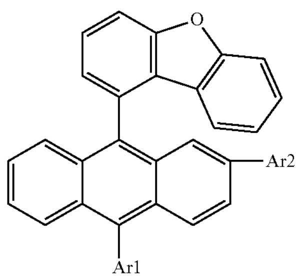 | 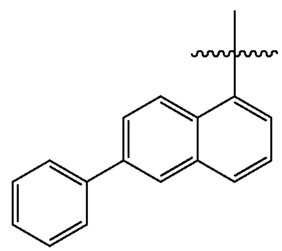 [SMILES: *c1cccc2cc(-c3ccccc3)ccc12] | 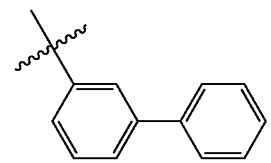 [SMILES: *c1cccc(-c2ccccc2)c1] |

-continued
| No. | | Ar1 | Ar2 |
|---|---|---|---|
| 11-6 | 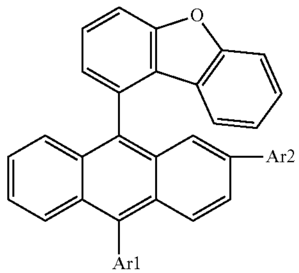 | 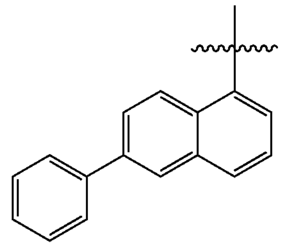 [SMILES: *c1cccc2cc(-c3ccccc3)ccc12] | 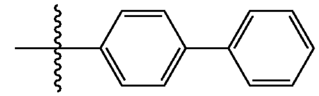 |
| 11-7 | 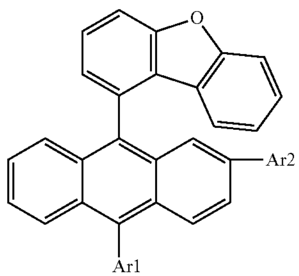 | 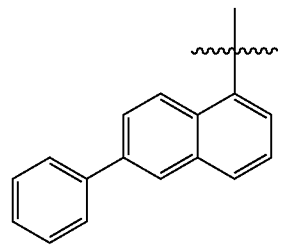 [SMILES: *c1cccc2cc(-c3ccccc3)ccc12] | 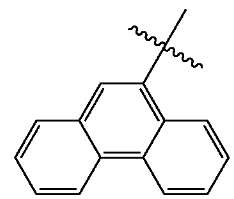 [SMILES: *c1cc2ccccc2c2ccccc12] |
| 11-8 | 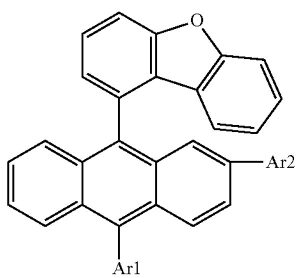 | 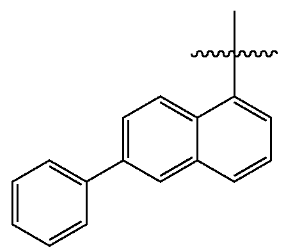 [SMILES: *c1cccc2cc(-c3ccccc3)ccc12] | 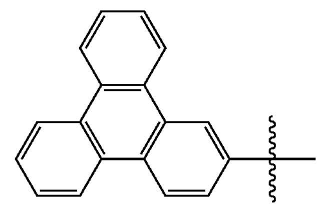 [SMILES: *c1ccc2c3ccccc3c3ccccc3c2c1] |

-continued
| No. | | Ar1 | Ar2 |
|---|---|---|---|
| 11-9 | 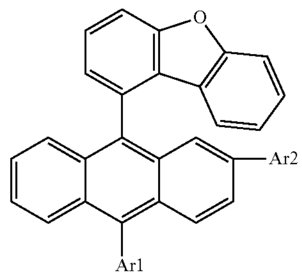 | 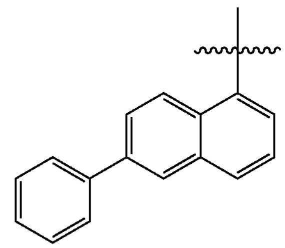 [SMILES: *c1cccc2cc(-c3ccccc3)ccc12] | 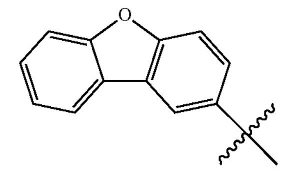 [SMILES: *c1ccc2oc3ccccc3c2c1] |
| 11-10 | 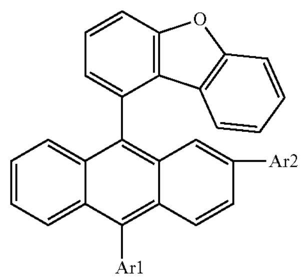 | 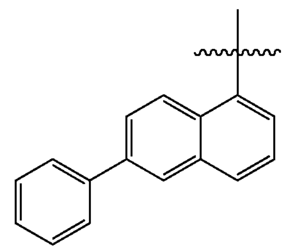 [SMILES: *c1cccc2cc(-c3ccccc3)ccc12] | 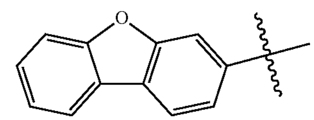 |
| 11-11 | 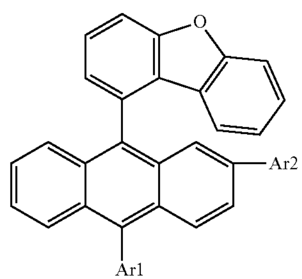 | 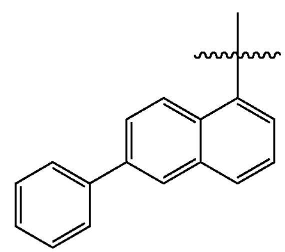 [SMILES: *c1cccc2cc(-c3ccccc3)ccc12] | 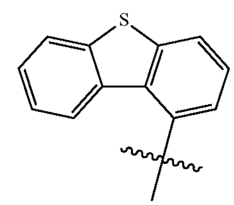 |

-continued
| No. | | Ar1 | Ar2 |
|---|---|---|---|
| 11-12 | 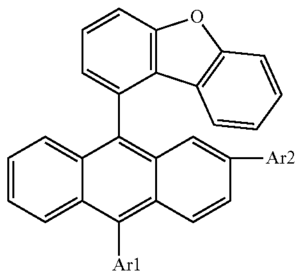 | 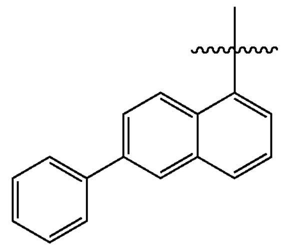 [SMILES: *c1cccc2cc(-c3ccccc3)ccc12] | 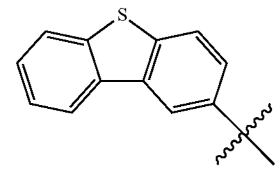 |
| 11-13 | 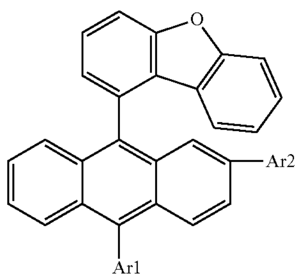 | 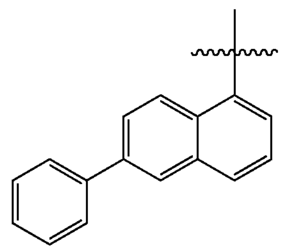 [SMILES: *c1cccc2cc(-c3ccccc3)ccc12] | 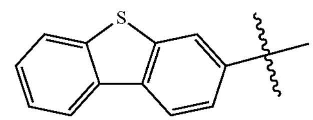 |
| 11-14 | 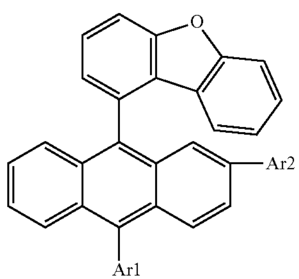 | 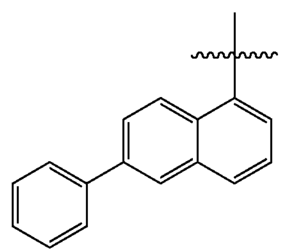 [SMILES: *c1cccc2cc(-c3ccccc3)ccc12] | 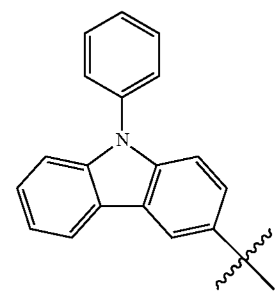 [SMILES: *c1ccc2c(c1)c1ccccc1n2-c1ccccc1] |

-continued
| No. | | Ar1 | Ar2 |
|---|---|---|---|
| 11-15 | 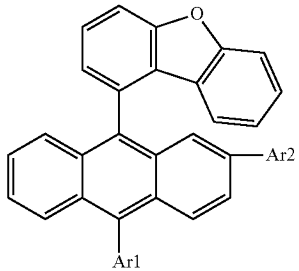 | 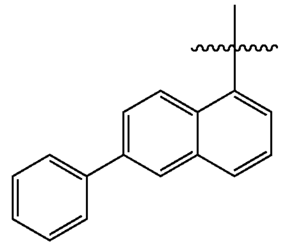 [SMILES: *c1cccc2cc(-c3ccccc3)ccc12] | 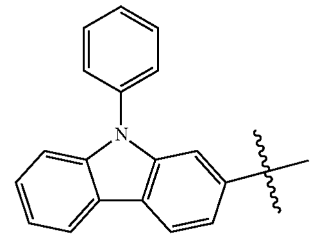 [SMILES: *c1ccc2c3ccccc3n(-c3ccccc3)c2c1] |
| 11-16 | 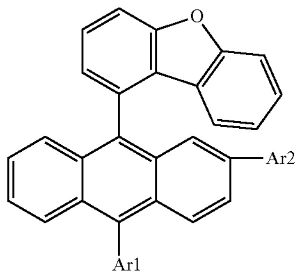 | 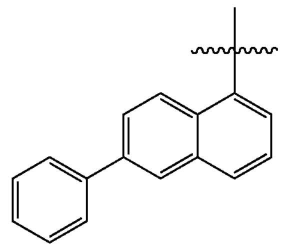 [SMILES: *c1cccc2cc(-c3ccccc3)ccc12] | 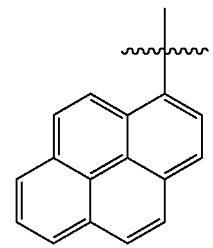 [SMILES: *c1ccc2ccc3cccc4ccc1c2c34] |
| 11-17 | 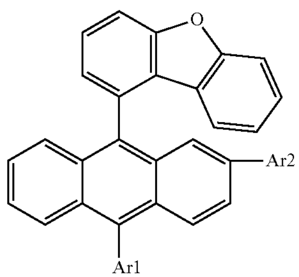 | 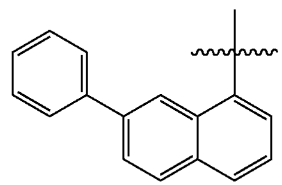 [SMILES: *c1cccc2ccc(-c3ccccc3)cc12] | 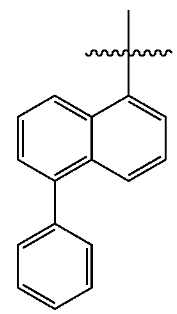 [SMILES: *c1cccc2c(-c3ccccc3)cccc12] |

-continued
| No. | | Ar1 | Ar2 |
| --- | --- | --- | --- |
| 11-18 | 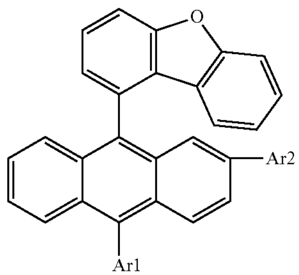  | 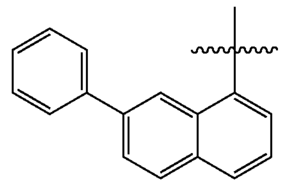 [SMILES: *c1cccc2ccc(-c3ccccc3)cc12] | 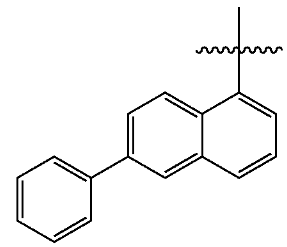 [SMILES: *c1cccc2cc(-c3ccccc3)ccc12] |
| 11-19 | 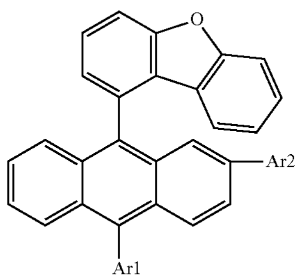  | 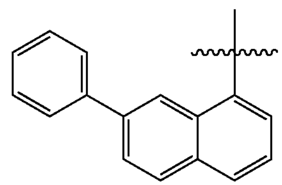 [SMILES: *c1cccc2ccc(-c3ccccc3)cc12] | 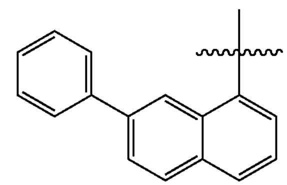 [SMILES: *c1cccc2ccc(-c3ccccc3)cc12] |
| 11-20 | 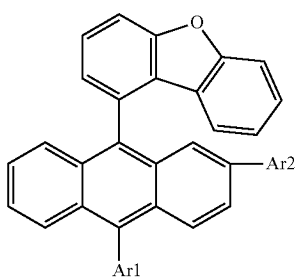  | 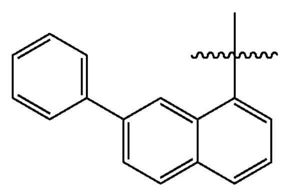 [SMILES: *c1cccc2ccc(-c3ccccc3)cc12] | 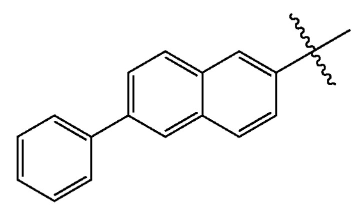 [SMILES: *c1ccc2cc(-c3ccccc3)ccc2c1] |

-continued
| No. | | Ar1 | Ar2 |
|---|---|---|---|
| 11-21 | 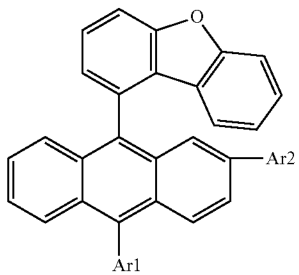 | 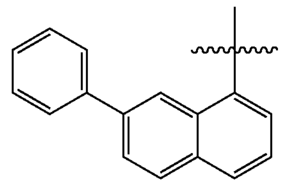 [SMILES: *c1cccc2ccc(-c3ccccc3)cc12] | 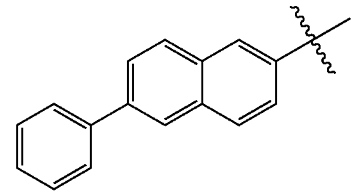 [SMILES: *c1ccc2cc(-c3ccccc3)ccc2c1] |
| 11-22 | 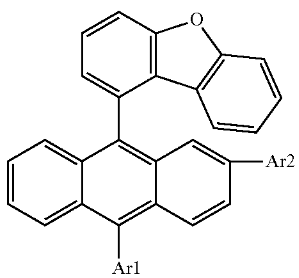 | 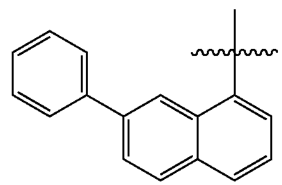 [SMILES: *c1cccc2ccc(-c3ccccc3)cc12] | 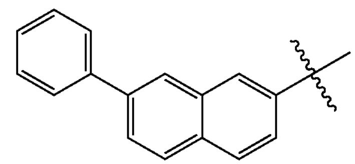 [SMILES: *c1ccc2ccc(-c3ccccc3)cc2c1] |
| 11-23 | 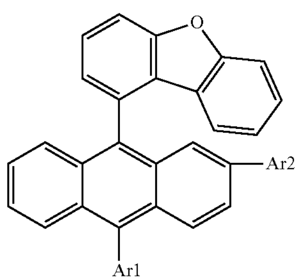 | 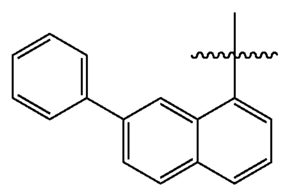 [SMILES: *c1cccc2ccc(-c3ccccc3)cc12] | 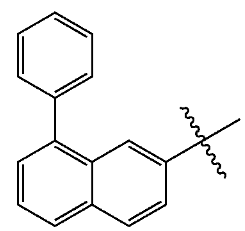 [SMILES: *c1ccc2cccc(-c3ccccc3)c2c1] |

-continued
| No. | | Ar1 | Ar2 |
|---|---|---|---|
| 11-24 | 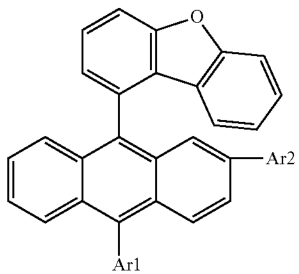 | 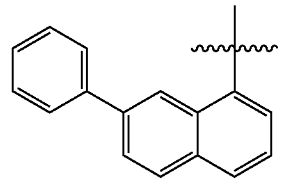 [SMILES: *c1cccc2ccc(-c3ccccc3)cc12] | 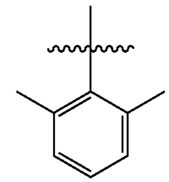 |
| 11-25 | 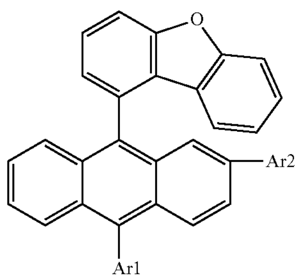 | 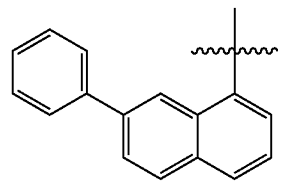 [SMILES: *c1cccc2ccc(-c3ccccc3)cc12] | 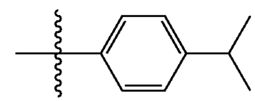 [SMILES: *c1ccc(C(C)C)cc1] |
| 11-26 | 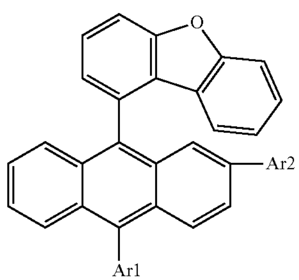 | 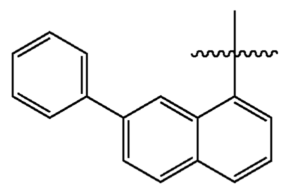 [SMILES: *c1cccc2ccc(-c3ccccc3)cc12] | 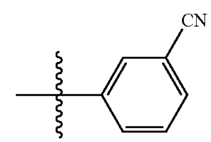 [SMILES: *c1cccc(C#N)c1] |

-continued
| No. | | Ar1 | Ar2 |
|---|---|---|---|
| 11-27 | 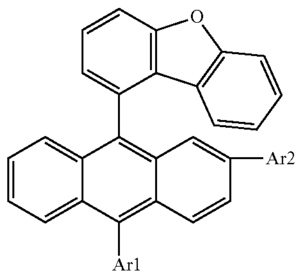 | 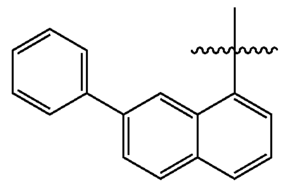 [SMILES: *c1cccc2ccc(-c3ccccc3)cc12] | 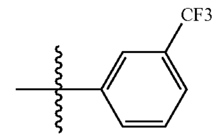 [SMILES: *c1cccc(C(F)(F)F)c1] |
| 11-28 | 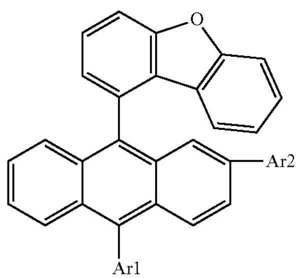 | 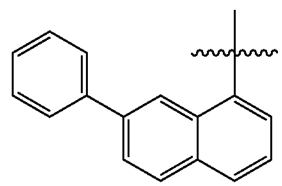 [SMILES: *c1cccc2ccc(-c3ccccc3)cc12] | 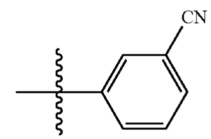 |
| 11-29 | 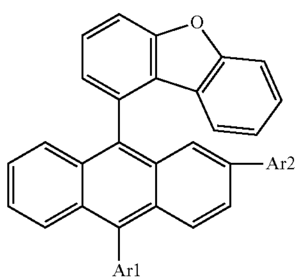 | 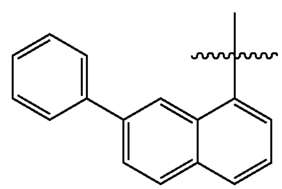 [SMILES: *c1cccc2ccc(-c3ccccc3)cc12] | 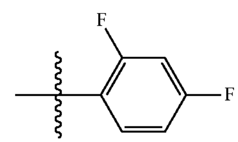 [SMILES: *c1ccc(F)cc1F] |

-continued
| No. | | Ar1 | Ar2 |
|---|---|---|---|
| 12-1 | 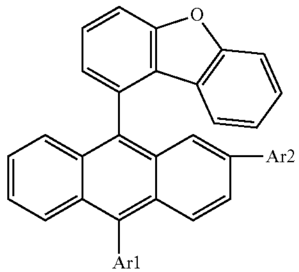 | 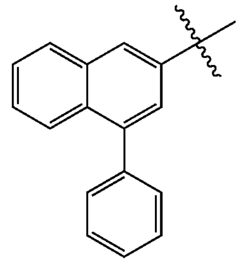 [SMILES: *c1cc(-c2ccccc2)c2ccccc2c1] | 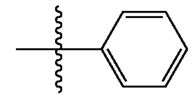 |
| 12-2 | 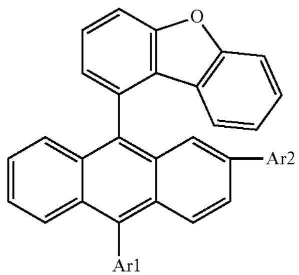 | 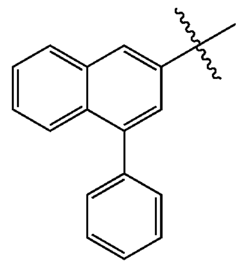 [SMILES: *c1cc(-c2ccccc2)c2ccccc2c1] | 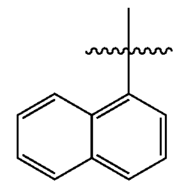 [SMILES: *c1cccc2ccccc12] |
| 12-3 | 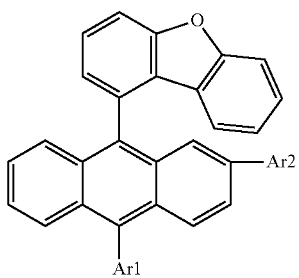 | 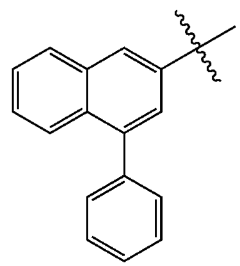 [SMILES: *c1cc(-c2ccccc2)c2ccccc2c1] | 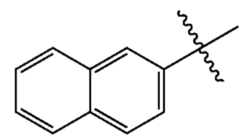 [SMILES: *c1ccc2ccccc2c1] |

-continued
| No. | | Ar1 | Ar2 |
|---|---|---|---|
| 12-4 | 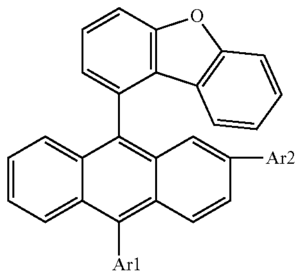  | 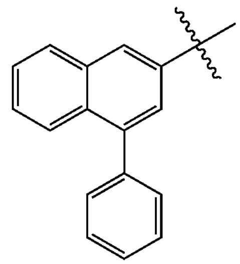 [SMILES: *c1cc(-c2ccccc2)c2ccccc2c1] | 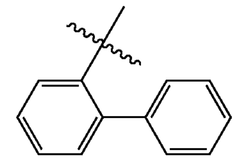 [SMILES: *c1ccccc1-c1ccccc1] |
| 12-5 | 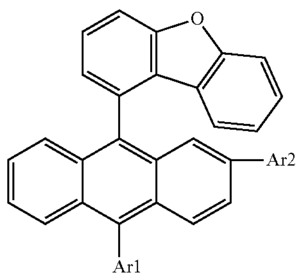  | 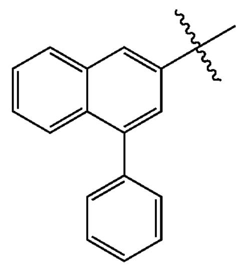 [SMILES: *c1cc(-c2ccccc2)c2ccccc2c1] | 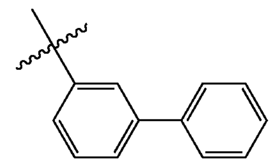 [SMILES: *c1cccc(-c2ccccc2)c1] |
| 12-6 | 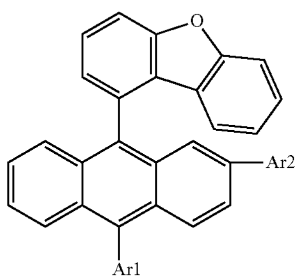  | 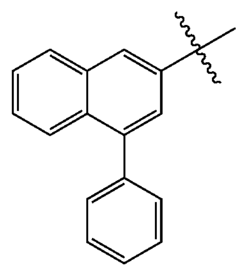 [SMILES: *c1cc(-c2ccccc2)c2ccccc2c1] | 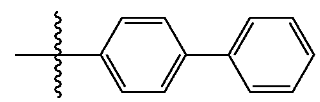 |

-continued
| No. | | Ar1 | Ar2 |
|---|---|---|---|
| 12-7 | 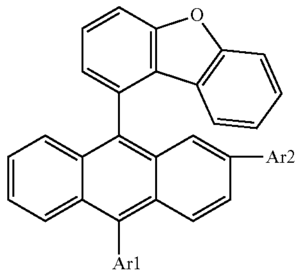 | 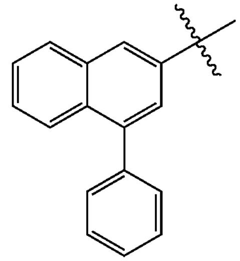 [SMILES: *c1cc(-c2ccccc2)c2ccccc2c1] | 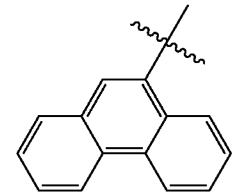 [SMILES: *c1cc2ccccc2c2ccccc12] |
| 12-8 | 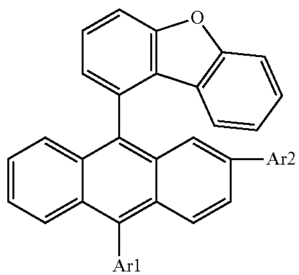 | 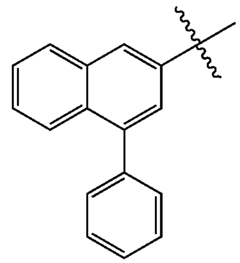 [SMILES: *c1cc(-c2ccccc2)c2ccccc2c1] | 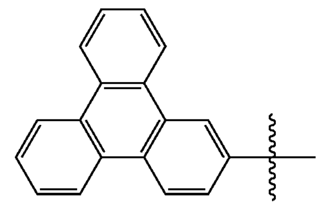 [SMILES: *c1ccc2c3ccccc3c3ccccc3c2c1] |
| 12-9 | 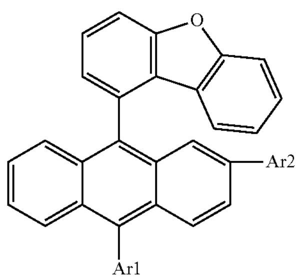 | 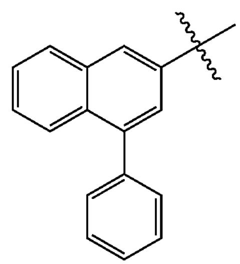 [SMILES: *c1cc(-c2ccccc2)c2ccccc2c1] | 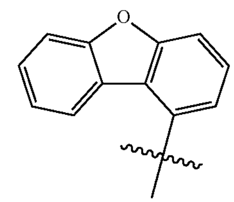 |

-continued
| No. | | Ar1 | Ar2 |
|---|---|---|---|
| 12-10 | 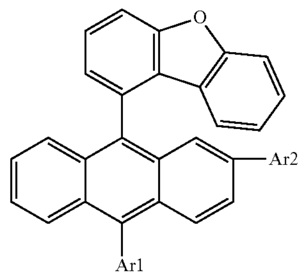 | 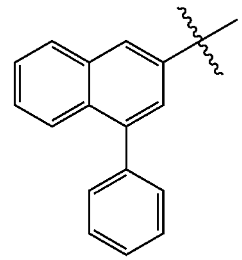 [SMILES: *c1cc(-c2ccccc2)c2ccccc2c1] | 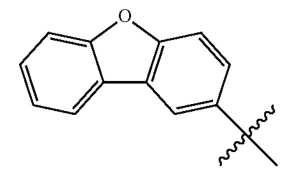 |
| 12-11 | 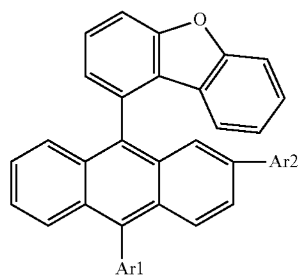 | 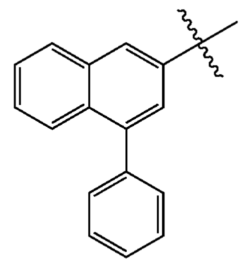 [SMILES: *c1cc(-c2ccccc2)c2ccccc2c1] | 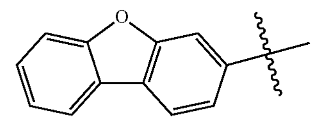 |
| 12-12 | 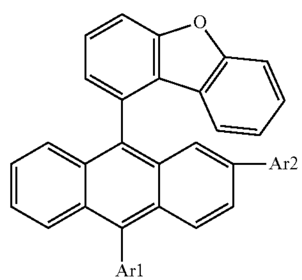 | 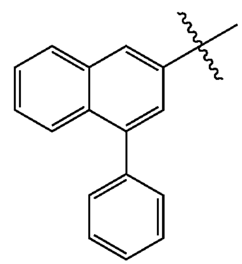 [SMILES: *c1cc(-c2ccccc2)c2ccccc2c1] | 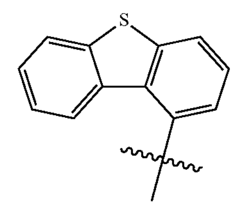 |

-continued
| No. | | Ar1 | Ar2 |
|---|---|---|---|
| 12-13 | 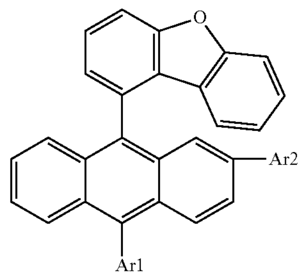 | 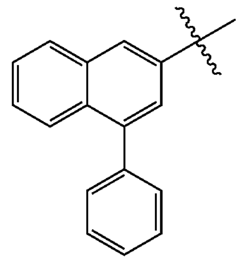 [SMILES: *c1cc(-c2ccccc2)c2ccccc2c1] | 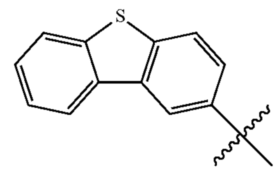 |
| 12-14 | 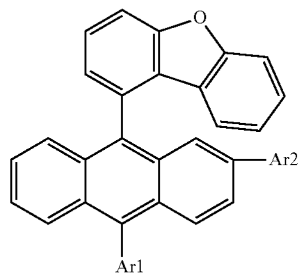 | 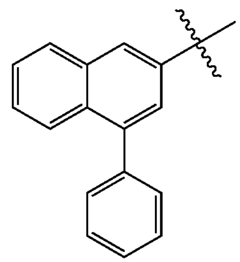 [SMILES: *c1cc(-c2ccccc2)c2ccccc2c1] | 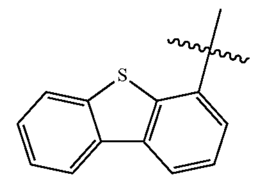 [SMILES: *c1cccc2c1sc1ccccc12] |
| 12-15 | 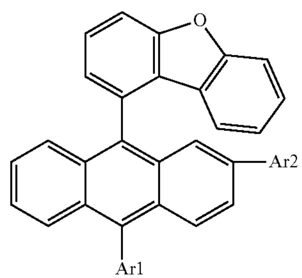 | 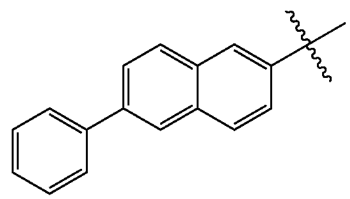 [SMILES: *c1ccc2cc(-c3ccccc3)ccc2c1] | 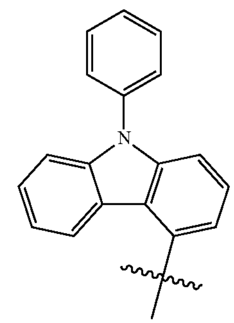 [SMILES: *c1cccc2c1c1ccccc1n2-c1ccccc1] |

-continued
| No. | | Ar1 | Ar2 |
|---|---|---|---|
| 12-16 | 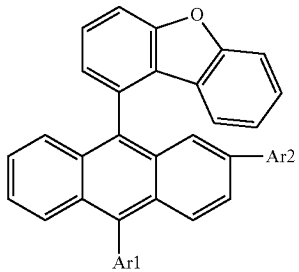 | 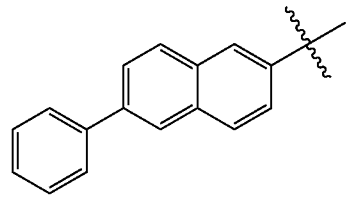 [SMILES: *c1ccc2cc(-c3ccccc3)ccc2c1] | 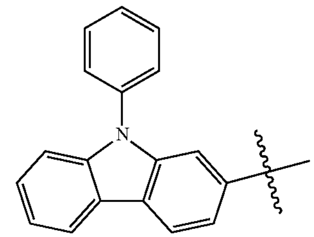 [SMILES: *c1ccc2c3ccccc3n(-c3ccccc3)c2c1] |
| 12-17 | 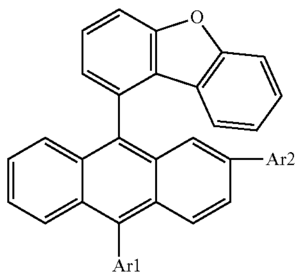 | 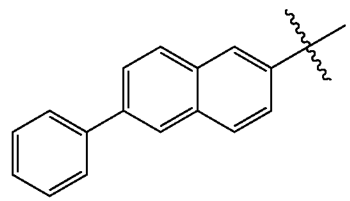 [SMILES: *c1ccc2cc(-c3ccccc3)ccc2c1] | 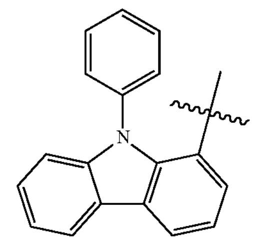 [SMILES: *c1cccc2c3ccccc3n(-c3ccccc3)c12] |
| 12-18 | 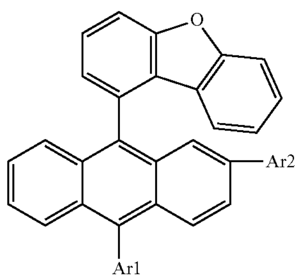 | 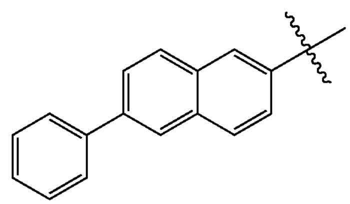 [SMILES: *c1ccc2cc(-c3ccccc3)ccc2c1] | 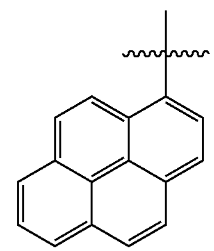 [SMILES: *c1ccc2ccc3cccc4ccc1c2c34] |

-continued
| No. | | Ar1 | Ar2 |
|---|---|---|---|
| 12-19 | 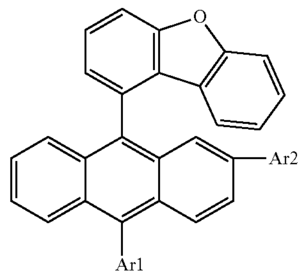 | 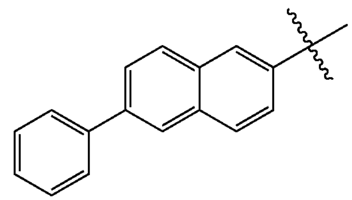 [SMILES: *c1ccc2cc(-c3ccccc3)ccc2c1] | 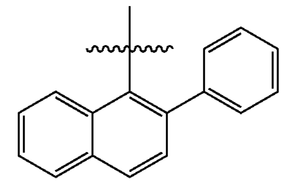 [SMILES: *c1c(-c2ccccc2)ccc2ccccc12] |
| 12-20 | 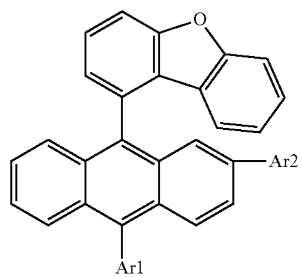 | 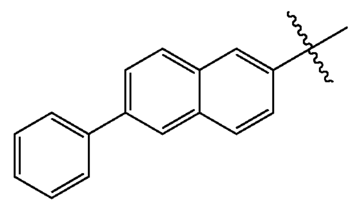 [SMILES: *c1ccc2cc(-c3ccccc3)ccc2c1] | 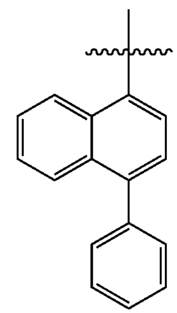 [SMILES: *c1ccc(-c2ccccc2)c2ccccc12] |
| 12-21 | 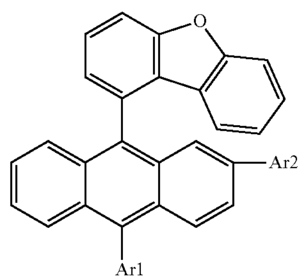 | 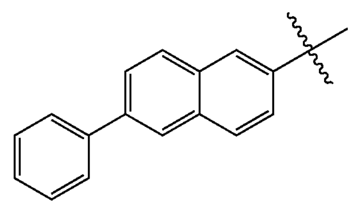 [SMILES: *c1ccc2cc(-c3ccccc3)ccc2c1] | 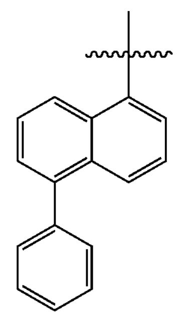 [SMILES: *c1cccc2c(-c3ccccc3)cccc12] |

-continued
| No. | | Ar1 | Ar2 |
|---|---|---|---|
| 12-22 | 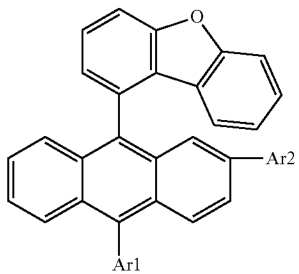 | 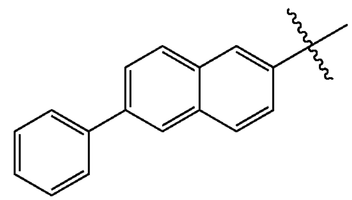 [SMILES: *c1ccc2cc(-c3ccccc3)ccc2c1] | 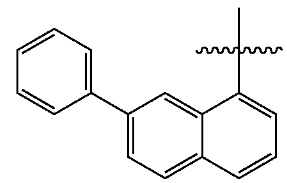 [SMILES: *c1cccc2ccc(-c3ccccc3)cc12] |
| 12-23 | 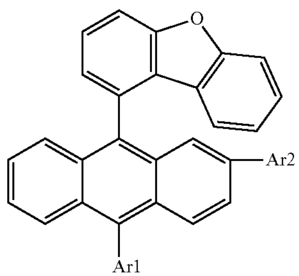 | 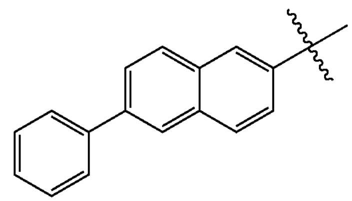 [SMILES: *c1ccc2cc(-c3ccccc3)ccc2c1] | 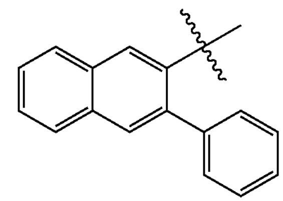 [SMILES: *c1cc2ccccc2cc1-c1ccccc1] |
| 12-24 | 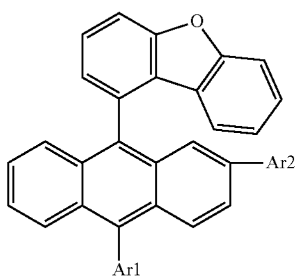 | 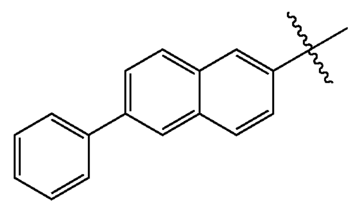 [SMILES: *c1ccc2cc(-c3ccccc3)ccc2c1] | 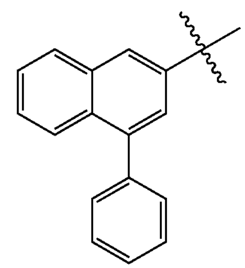 [SMILES: *c1cc(-c2ccccc2)c2ccccc2c1] |

-continued
| No. | | Ar1 | Ar2 |
|---|---|---|---|
| 12-25 | 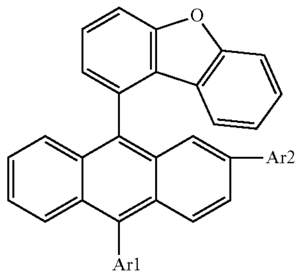 | 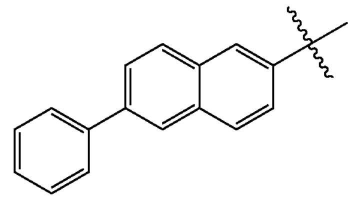 [SMILES: *c1ccc2cc(-c3ccccc3)ccc2c1] | 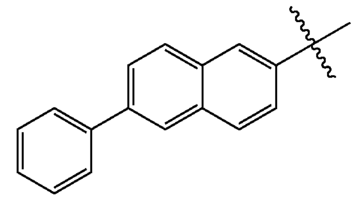 [SMILES: *c1ccc2cc(-c3ccccc3)ccc2c1] |
| 12-26 | 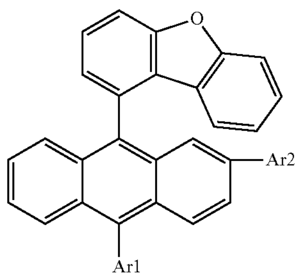 | 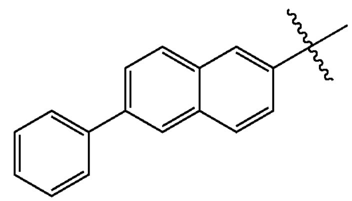 [SMILES: *c1ccc2cc(-c3ccccc3)ccc2c1] | 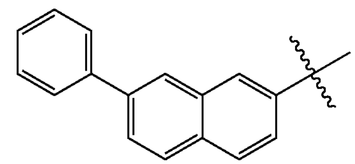 [SMILES: *c1ccc2ccc(-c3ccccc3)cc2c1] |
| 12-27 | 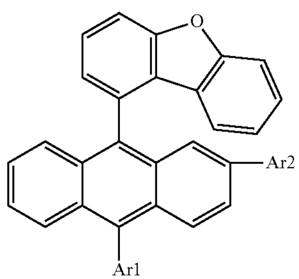 | 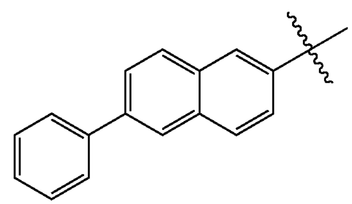 [SMILES: *c1ccc2cc(-c3ccccc3)ccc2c1] | 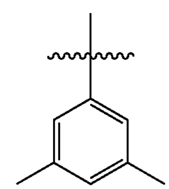 |

-continued
| No. | | Ar1 | Ar2 |
|---|---|---|---|
| 12-28 | 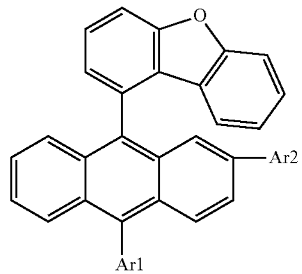 | 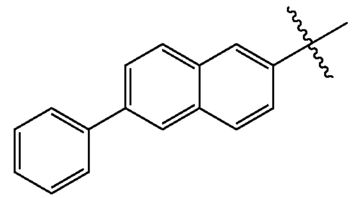 [SMILES: *c1ccc2cc(-c3ccccc3)ccc2c1] | 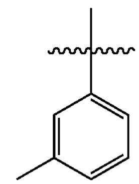 [SMILES: *c1cccc(C)c1] |
| 12-29 | 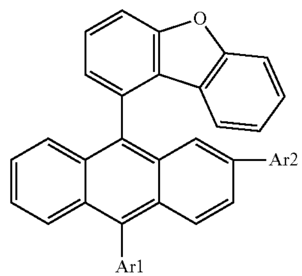 | 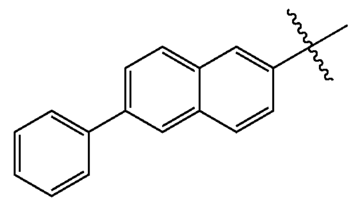 [SMILES: *c1ccc2cc(-c3ccccc3)ccc2c1] | 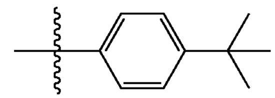 [SMILES: *c1ccc(C(C)(C)C)cc1] |
| 12-30 | 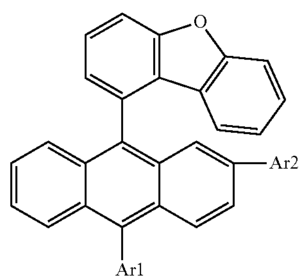 | 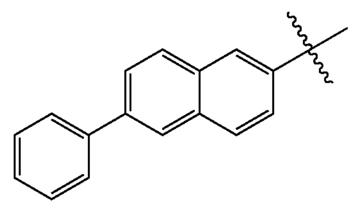 [SMILES: *c1ccc2cc(-c3ccccc3)ccc2c1] | 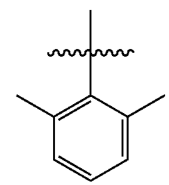 |

-continued
| No. | | Ar1 | Ar2 |
|---|---|---|---|
| 12-31 | 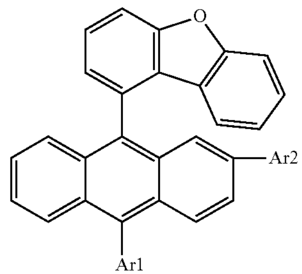 | 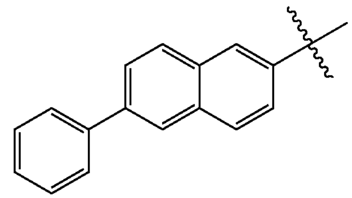 [SMILES: *c1ccc2cc(-c3ccccc3)ccc2c1] | 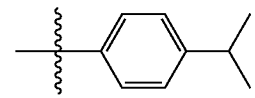 [SMILES: *c1ccc(C(C)C)cc1] |
| 13-1 | 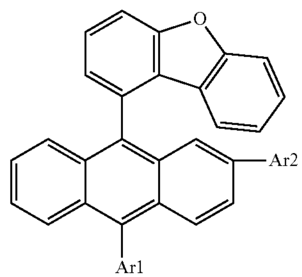 | 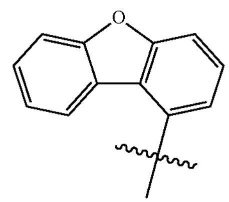 [SMILES: *c1cccc2oc3ccccc3c12] | 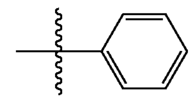 [SMILES: *c1ccccc1] |
| 13-2 | 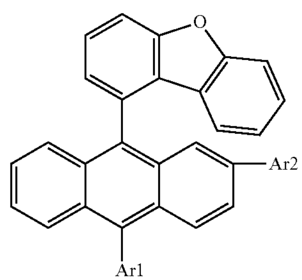 | 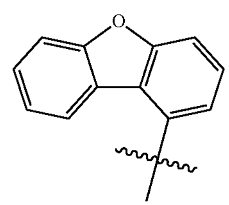 [SMILES: *c1cccc2oc3ccccc3c12] | 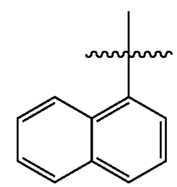 [SMILES: *c1cccc2ccccc12] |

-continued
| No. | | Ar1 | Ar2 |
|---|---|---|---|
| 13-3 | 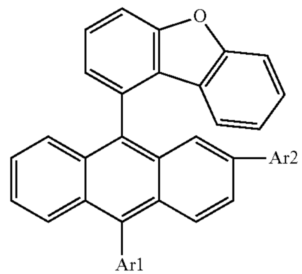 | 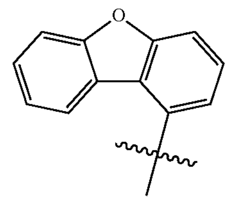 [SMILES: *c1cccc2oc3ccccc3c12] | 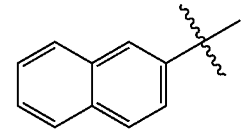 [SMILES: *c1ccc2ccccc2c1] |
| 13-4 | 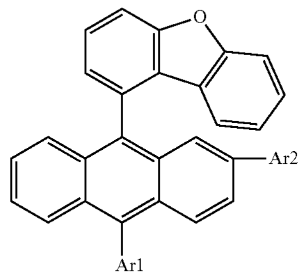 | 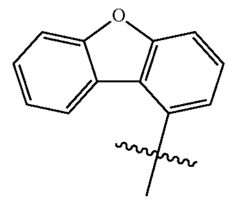 [SMILES: *c1cccc2oc3ccccc3c12] | 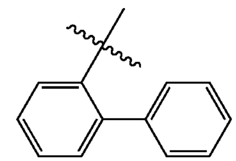 [SMILES: *c1ccccc1-c1ccccc1] |
| 13-5 | 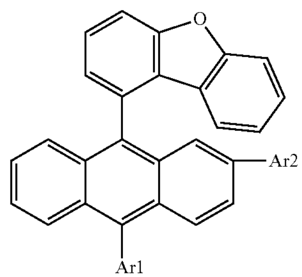 | 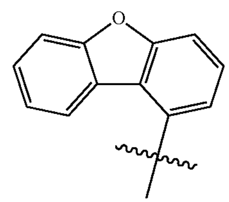 [SMILES: *c1cccc2oc3ccccc3c12] | 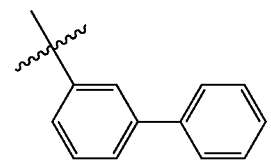 [SMILES: *c1cccc(-c2ccccc2)c1] |

-continued
| No. | | Ar1 | Ar2 |
|---|---|---|---|
| 13-6 | 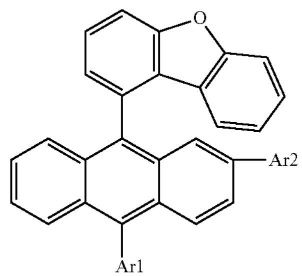 | 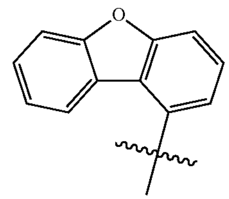 | 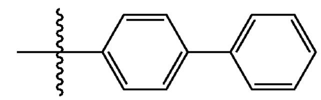 [SMILES: *c1ccc(-c2ccccc2)cc1] |
| 13-7 | 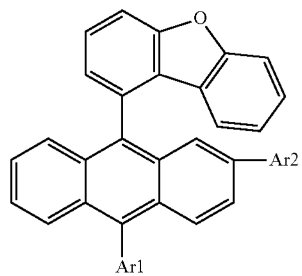 | 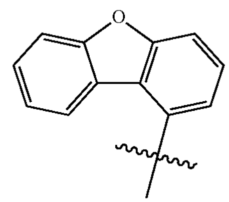 | 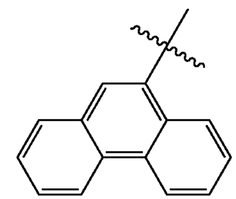 [SMILES: *c1cc2ccccc2c2ccccc12] |
| 13-8 | 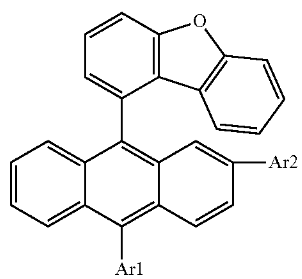 | 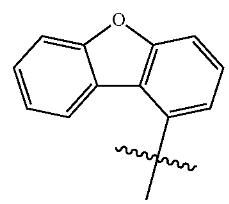 | 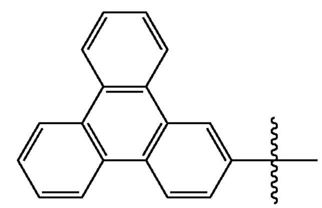 [SMILES: *c1ccc2c3ccccc3c3ccccc3c2c1] |

-continued
| No. | | Ar1 | Ar2 |
|---|---|---|---|
| 13-9 | 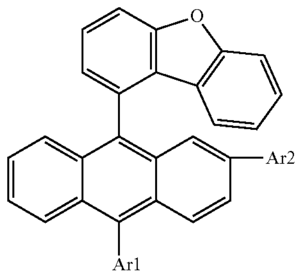 | 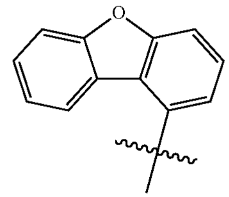 | 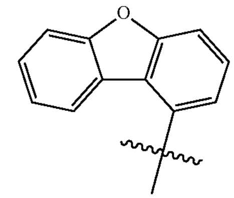 |
| 13-10 | 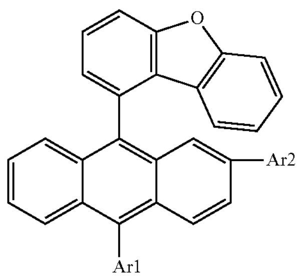 | 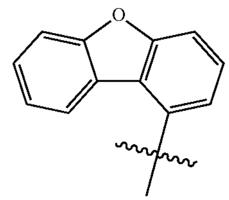 | 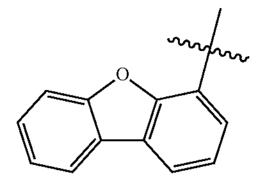 [SMILES: *c1cccc2c1oc1ccccc12] |
| 13-11 | 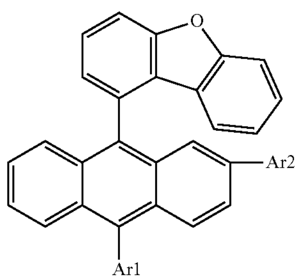 | 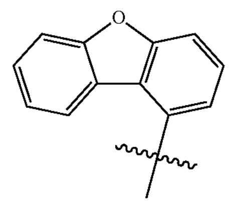 | 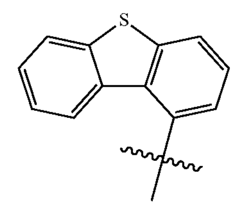 [SMILES: *c1cccc2sc3ccccc3c12] |

-continued
| No. | | Ar1 | Ar2 |
|---|---|---|---|
| 13-12 | 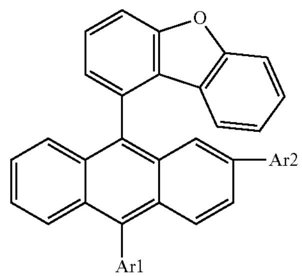 | 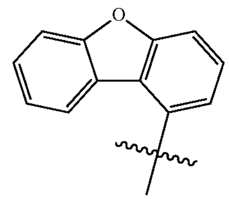 | 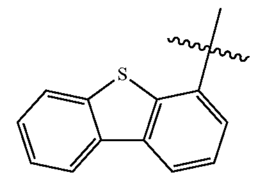 [SMILES: *c1cccc2c1sc1ccccc12] |
| 13-13 | 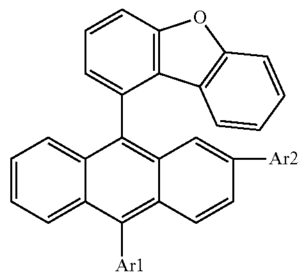 | 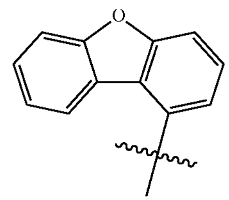 [SMILES: *c1cccc2oc3ccccc3c12] | 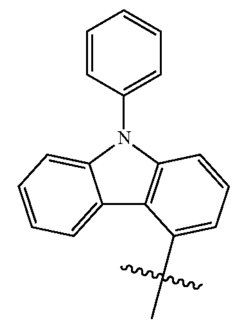 [SMILES: *c1cccc2c1c1ccccc1n2-c1ccccc1] |
| 13-14 | 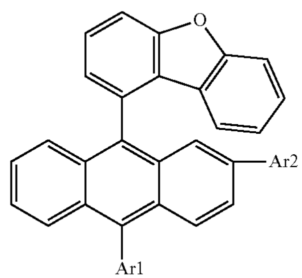 | 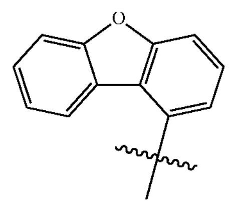 [SMILES: *c1cccc2oc3ccccc3c12] | 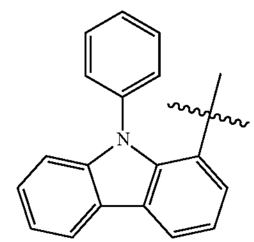 [SMILES: *c1cccc2c3ccccc3n(-c3ccccc3)c12] |

-continued
| No. | | Ar1 | Ar2 |
|---|---|---|---|
| 13-15 | 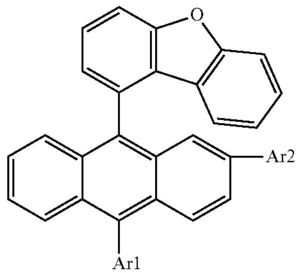 | 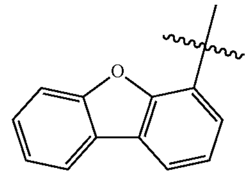 | 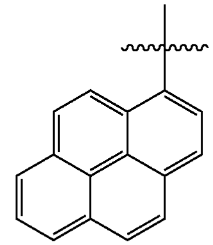 [SMILES: *c1ccc2ccc3cccc4ccc1c2c34] |
| 13-16 | 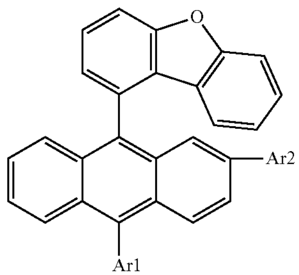 | 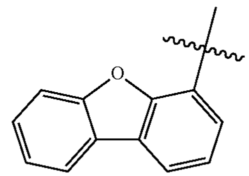 | 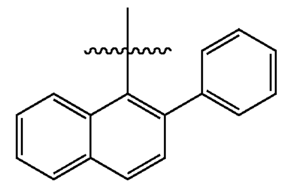 [SMILES: *c1c(-c2ccccc2)ccc2ccccc12] |
| 13-17 | 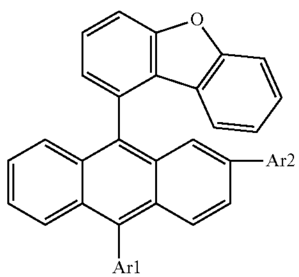 | 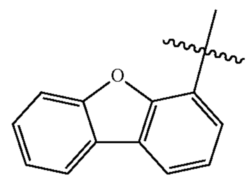 [SMILES: *c1cccc2c1oc1ccccc12] | 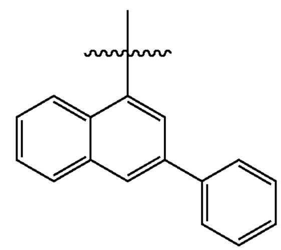 [SMILES: *c1cc(-c2ccccc2)cc2ccccc12] |

-continued
| No. | | Ar1 | Ar2 |
|---|---|---|---|
| 13-18 | 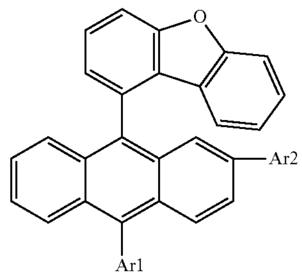 | 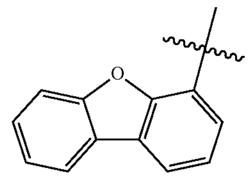 | 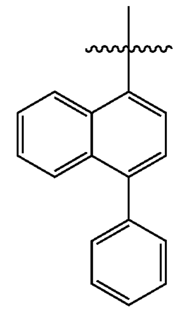 [SMILES: *c1ccc(-c2ccccc2)c2ccccc12] |
| 13-19 | 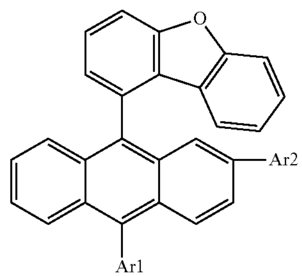 | 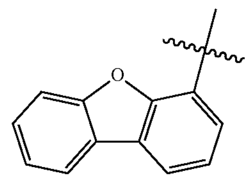 [SMILES: *c1cccc2c1oc1ccccc12] | 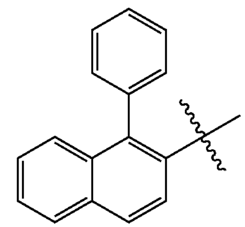 [SMILES: *c1ccc2ccccc2c1-c1ccccc1] |
| 13-20 | 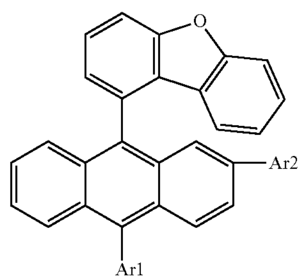 | 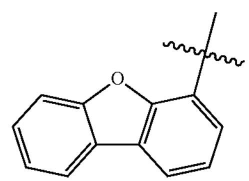 [SMILES: *c1cccc2c1oc1ccccc12] | 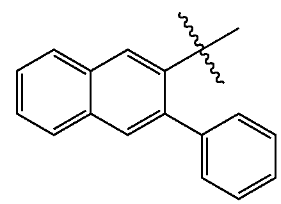 [SMILES: *c1cc2ccccc2cc1-c1ccccc1] |

-continued
| No. | | Ar1 | Ar2 |
|---|---|---|---|
| 13-21 | 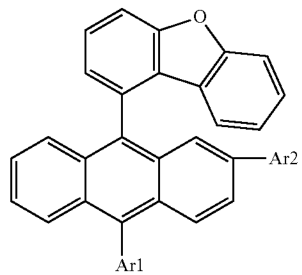 | 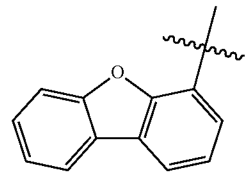 | 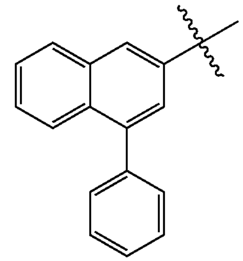 [SMILES: *c1cc(-c2ccccc2)c2ccccc2c1] |
| 13-22 | 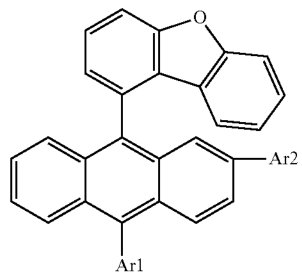 | 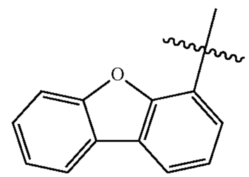 [SMILES: *c1cccc2c1oc1ccccc12] | 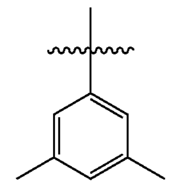 |
| 13-23 | 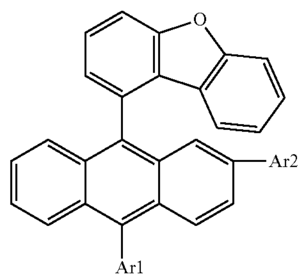 | 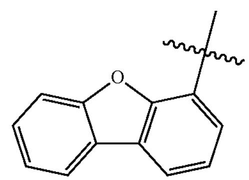 [SMILES: *c1cccc2c1oc1ccccc12] | 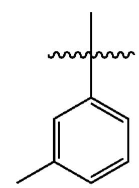 [SMILES: *c1cccc(C)c1] |

-continued
| No. | | Ar1 | Ar2 |
|---|---|---|---|
| 13-24 | 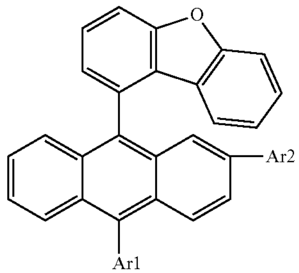 | 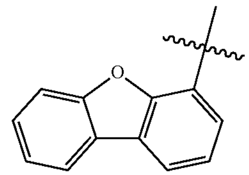 | 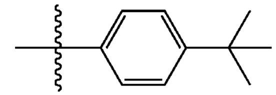 |
| 13-25 | 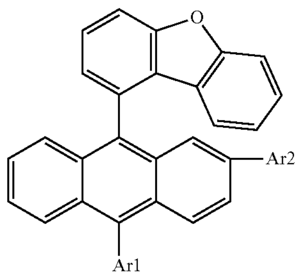 | 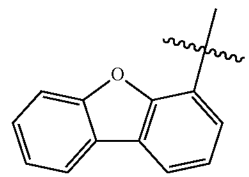 [SMILES: *c1cccc2c1oc1ccccc12] | 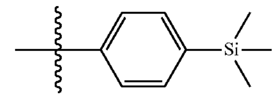 |
| 13-26 | 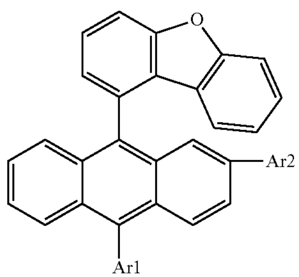 | 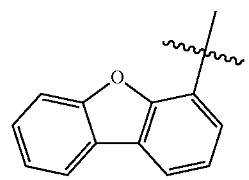 [SMILES: *c1cccc2c1oc1ccccc12] | 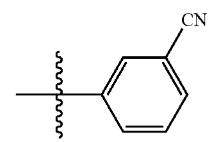 [SMILES: *c1cccc(C#N)c1] |

-continued
| No. | | Ar1 | Ar2 |
|---|---|---|---|
| 13-27 | 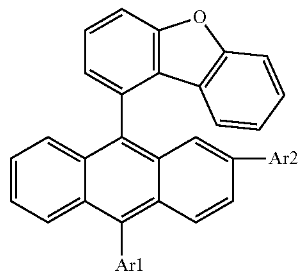 | 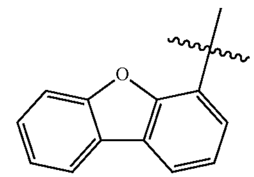 [SMILES: *c1cccc2c1oc1ccccc12] | 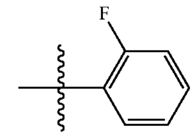 [SMILES: *c1ccccc1F] |
| 13-28 | 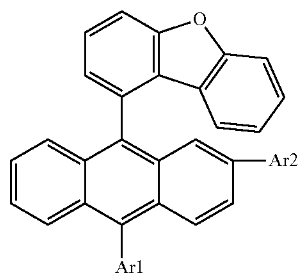 | 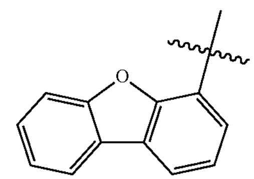 [SMILES: *c1cccc2c1oc1ccccc12] | 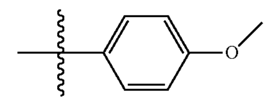 [SMILES: *c1ccc(OC)cc1] |
| 14-1 | 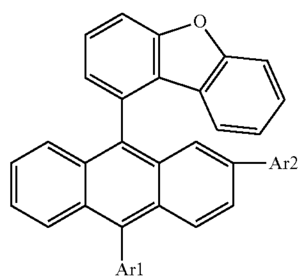 | 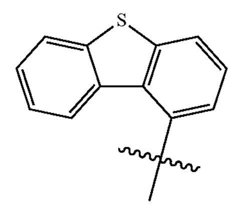 [SMILES: *c1cccc2sc3ccccc3c12] | 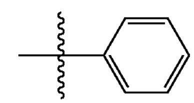 [SMILES: *c1ccccc1] |

-continued
| No. | | Ar1 | Ar2 |
|---|---|---|---|
| 14-2 | 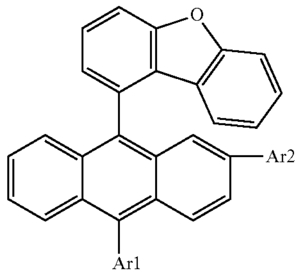 | 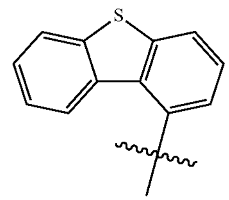 | 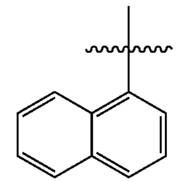 [SMILES: *c1cccc2ccccc12] |
| 14-3 | 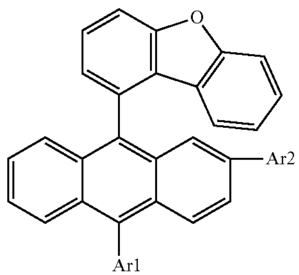 | 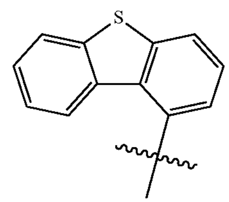 | 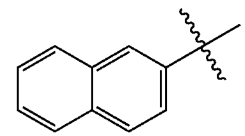 [SMILES: *c1ccc2ccccc2c1] |
| 14-4 | 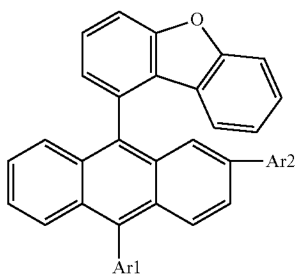 | 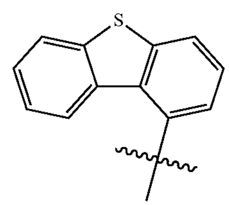 [SMILES: *c1cccc2sc3ccccc3c12] | 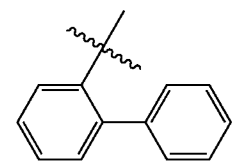 [SMILES: *c1ccccc1-c1ccccc1] |

-continued
| No. | | Ar1 | Ar2 |
|---|---|---|---|
| 14-5 | 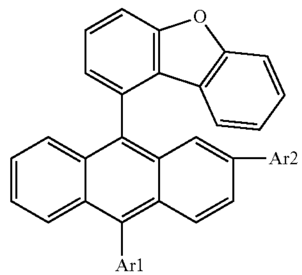 | 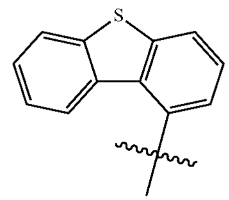 | 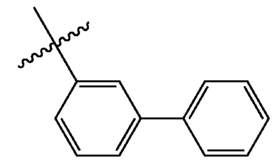 [SMILES: *c1cccc(-c2ccccc2)c1] |
| 14-6 | 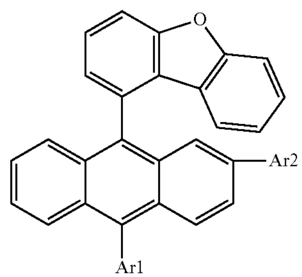 | 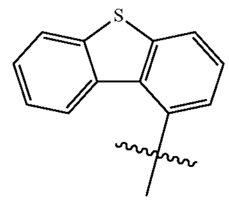 | 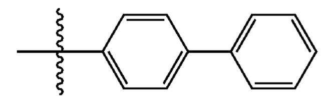 [SMILES: *c1ccc(-c2ccccc2)cc1] |
| 14-7 | 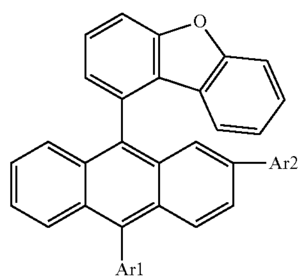 | 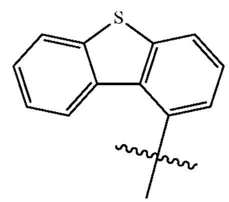 [SMILES: *c1cccc2sc3ccccc3c12] | 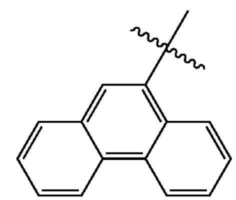 [SMILES: *c1cc2ccccc2c2ccccc12] |

-continued
| No. | | Ar1 | Ar2 |
|---|---|---|---|
| 14-8 | 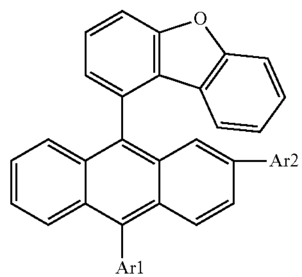 | 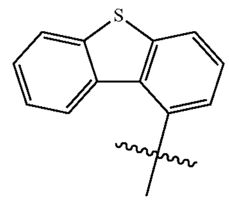 | 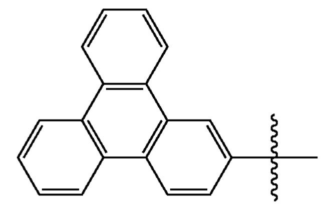 [SMILES: *c1ccc2c3ccccc3c3ccccc3c2c1] |
| 14-9 | 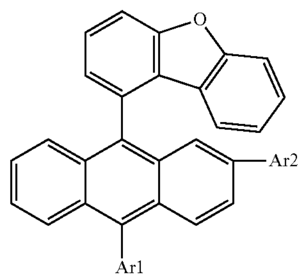 | 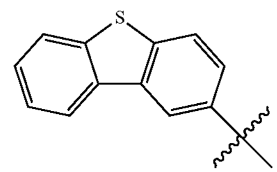 | 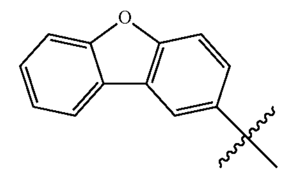 |
| 14-10 | 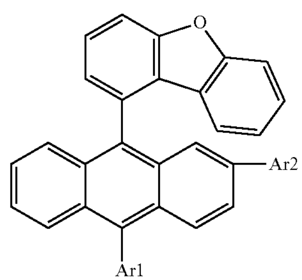 | 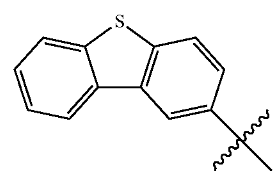 | 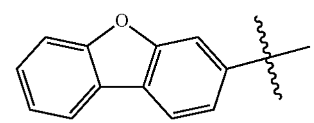 |

-continued
| No. | | Ar1 | Ar2 |
|---|---|---|---|
| 14-11 | 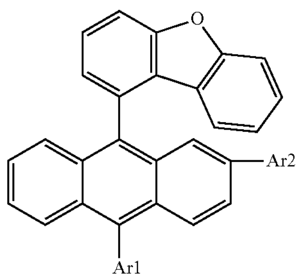 | 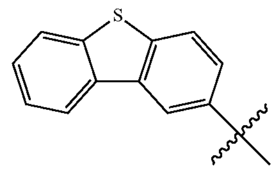 | 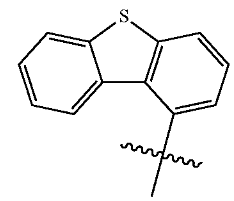 |
| 14-12 | 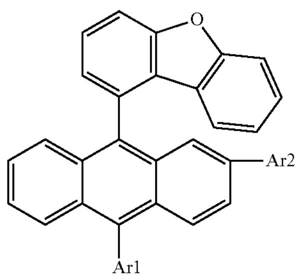 | 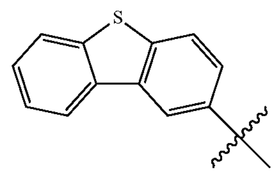 | 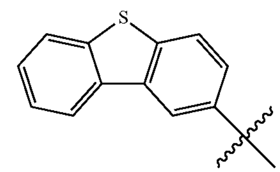 |
| 14-13 | 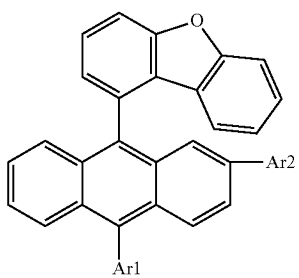 | 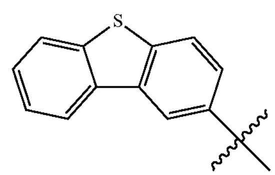 [SMILES: *c1ccc2sc3ccccc3c2c1] | 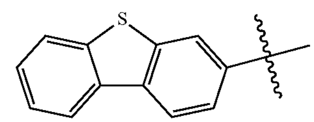 |

-continued
| No. | | Ar1 | Ar2 |
|---|---|---|---|
| 14-14 | 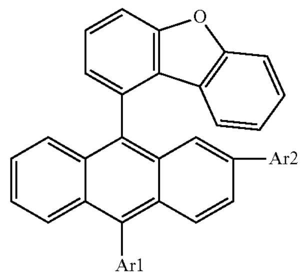 | 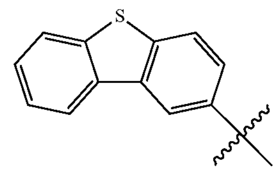 | 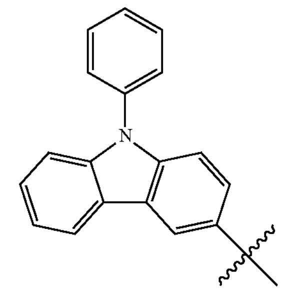 [SMILES: *c1ccc2c(c1)c1ccccc1n2-c1ccccc1] |
| 14-15 | 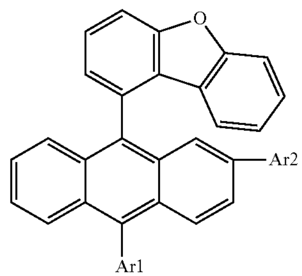 | 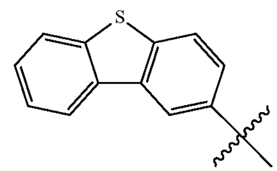 | 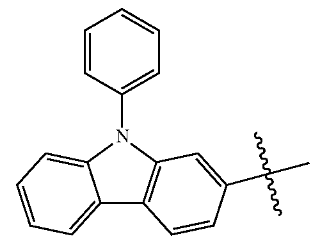 [SMILES: *c1ccc2c3ccccc3n(-c3ccccc3)c2c1] |
| 14-16 | 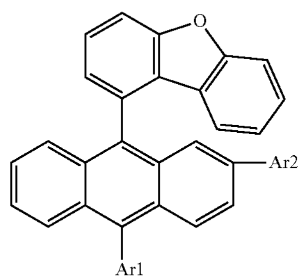 | 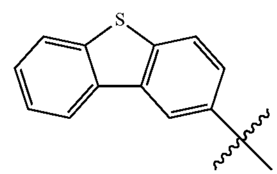 | 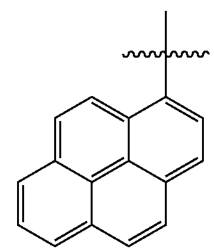 [SMILES: *c1ccc2ccc3cccc4ccc1c2c34] |

-continued
| No. | | Ar1 | Ar2 |
|---|---|---|---|
| 14-17 | 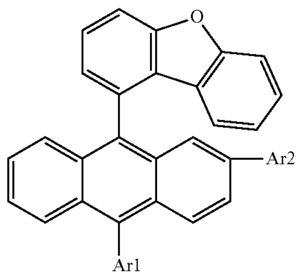 | 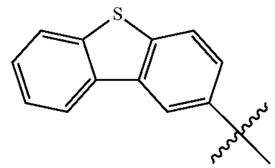 | 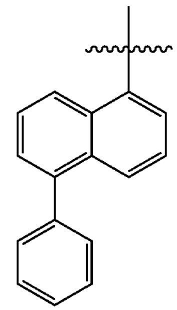 [SMILES: *c1cccc2c(-c3ccccc3)cccc12] |
| 14-18 | 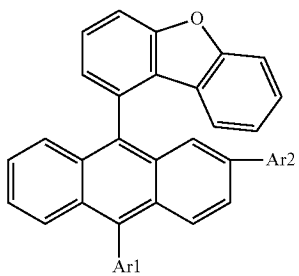 | 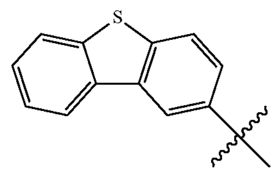 | 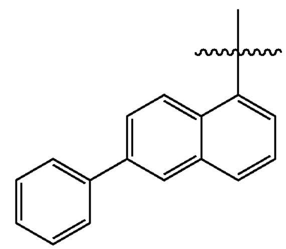 [SMILES: *c1cccc2cc(-c3ccccc3)ccc12] |
| 14-19 | 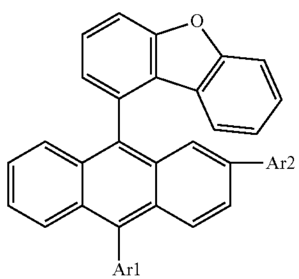 | 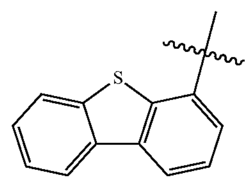 | 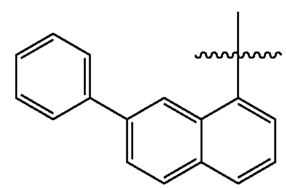 [SMILES: *c1cccc2ccc(-c3ccccc3)cc12] |

-continued
| No. | | Ar1 | Ar2 |
|---|---|---|---|
| 14-20 | 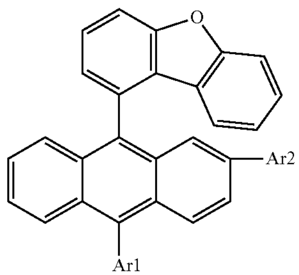 | 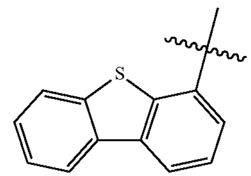 | 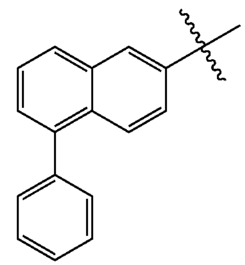 [SMILES: *c1ccc2c(-c3ccccc3)cccc2c1] |
| 14-21 | 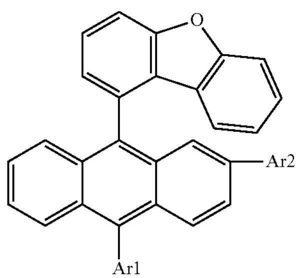 | 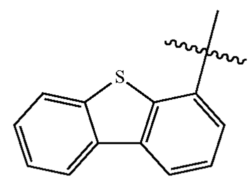 | 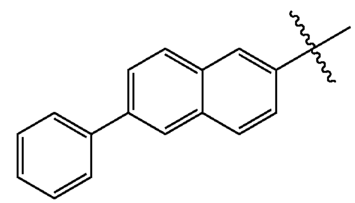 [SMILES: *c1ccc2cc(-c3ccccc3)ccc2c1] |
| 14-22 | 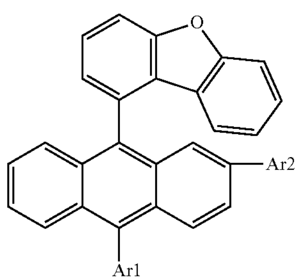 | 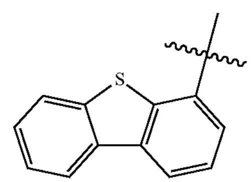 | 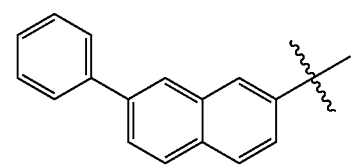 [SMILES: *c1ccc2ccc(-c3ccccc3)cc2c1] |

-continued
| No. | | Ar1 | Ar2 |
|---|---|---|---|
| 14-23 | 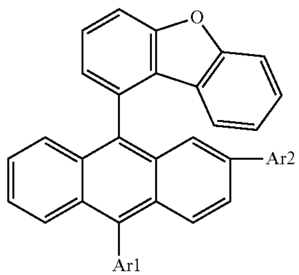 | 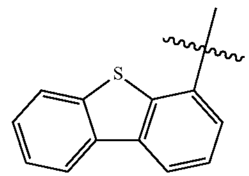 | 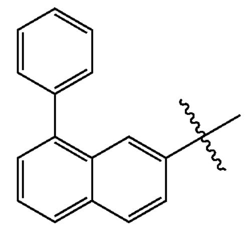 [SMILES: *c1ccc2cccc(-c3ccccc3)c2c1] |
| 14-24 | 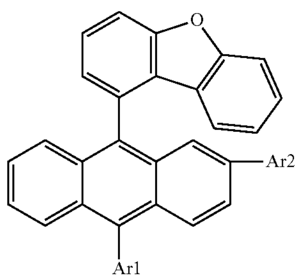 | 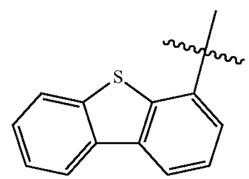 | 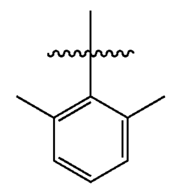 |
| 14-25 | 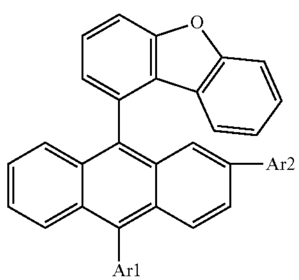 | 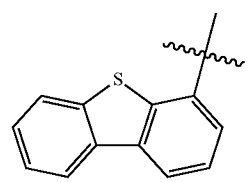 | 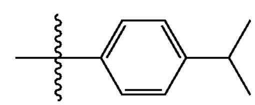 |

-continued
| No. | | Ar1 | Ar2 |
|---|---|---|---|
| 14-26 | 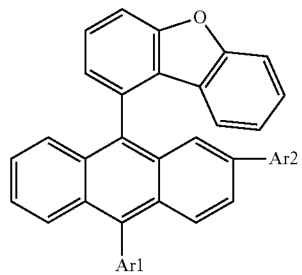 | 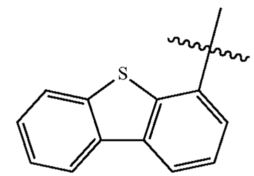 | 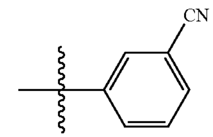 [SMILES: *c1cccc(C#N)c1] |
| 14-27 | 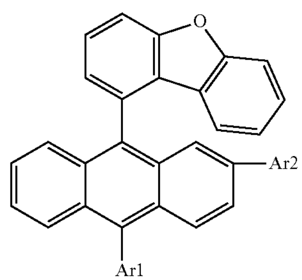 | 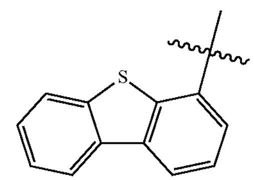 | 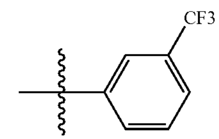 [SMILES: *c1cccc(C(F)(F)F)c1] |
| 14-28 | 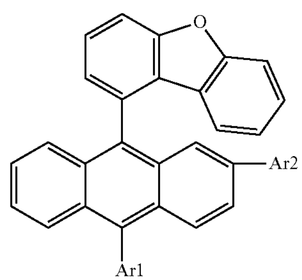 | 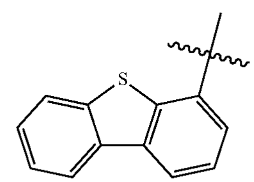 [SMILES: *c1cccc2c1sc1ccccc12] | 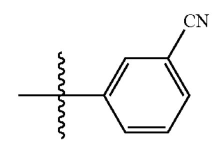 [SMILES: *c1cccc(C#N)c1] |

-continued
| No. | | Ar1 | Ar2 |
|---|---|---|---|
| 14-29 | 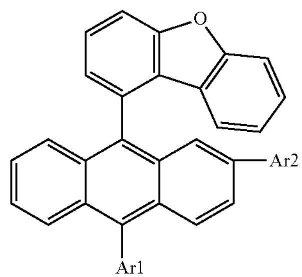 | 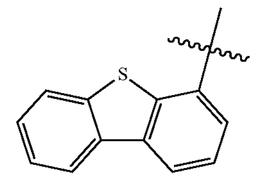 [SMILES: *c1cccc2c1sc1ccccc12] | 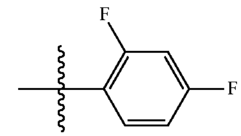 [SMILES: *c1ccc(F)cc1F] |
| 15-1 | 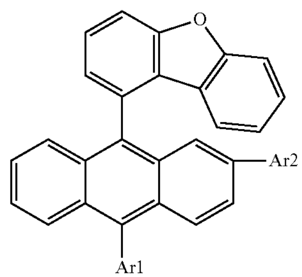 | 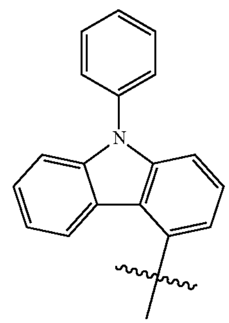 [SMILES: *c1cccc2c1c1ccccc1n2-c1ccccc1] | 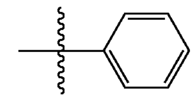 [SMILES: *c1ccccc1] |
| 15-2 | 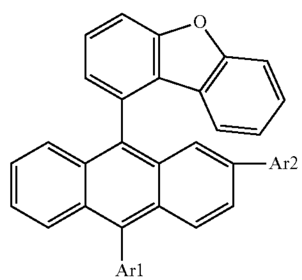 | 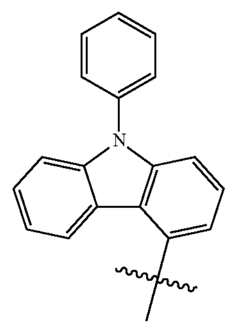 [SMILES: *c1cccc2c1c1ccccc1n2-c1ccccc1] | 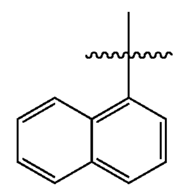 [SMILES: *c1cccc2ccccc12] |

-continued
| No. | | Ar1 | Ar2 |
|---|---|---|---|
| 15-3 | 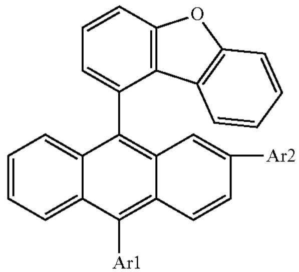 | 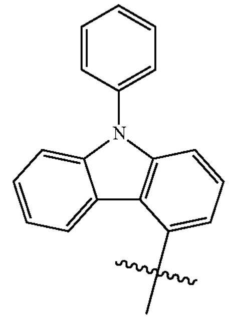 [SMILES: *c1cccc2c1c1ccccc1n2-c1ccccc1] | 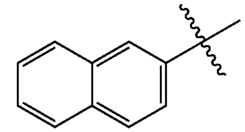 [SMILES: *c1ccc2ccccc2c1] |
| 15-4 | 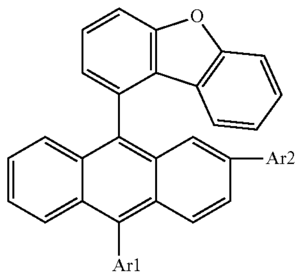 | 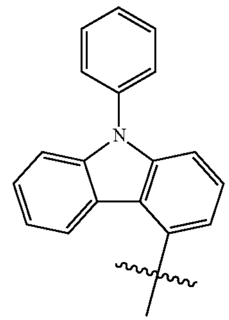 [SMILES: *c1cccc2c1c1ccccc1n2-c1ccccc1] | 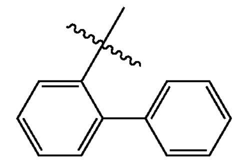 [SMILES: *c1ccccc1-c1ccccc1] |
| 15-5 | 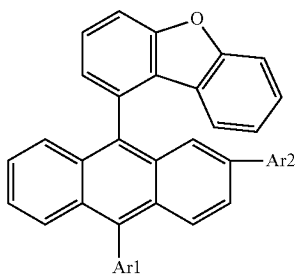 | 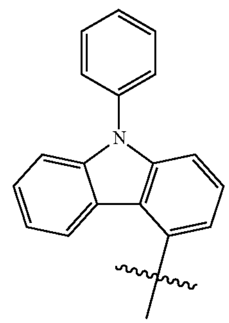 [SMILES: *c1cccc2c1c1ccccc1n2-c1ccccc1] | 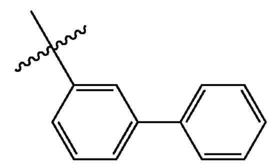 [SMILES: *c1cccc(-c2ccccc2)c1] |

-continued
| No. | | Ar1 | Ar2 |
|---|---|---|---|
| 15-6 | 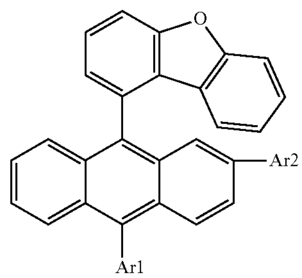 | 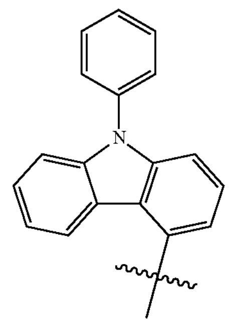 [SMILES: *c1cccc2c1c1ccccc1n2-c1ccccc1] | 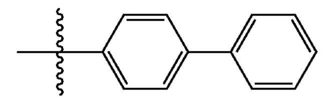 [SMILES: *c1ccc(-c2ccccc2)cc1] |
| 15-7 | 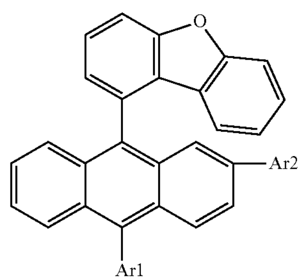 | 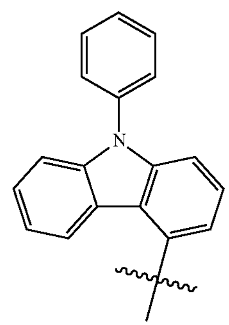 [SMILES: *c1cccc2c1c1ccccc1n2-c1ccccc1] | 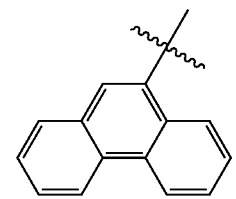 [SMILES: *c1cc2ccccc2c2ccccc12] |
| 15-8 | 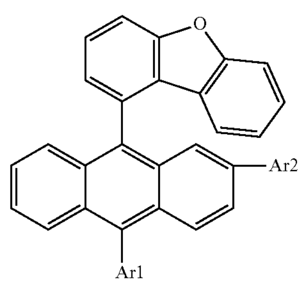 | 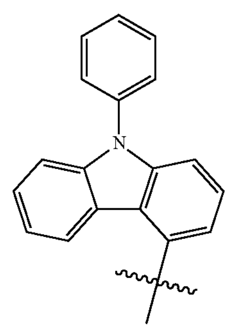 [SMILES: *c1cccc2c1c1ccccc1n2-c1ccccc1] | 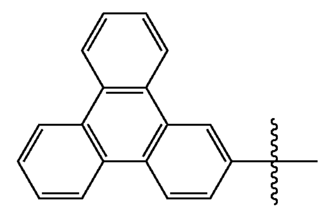 [SMILES: *c1ccc2c3ccccc3c3ccccc3c2c1] |

-continued
| No. | | Ar1 | Ar2 |
|---|---|---|---|
| 15-9 | 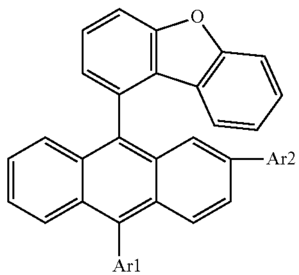 | 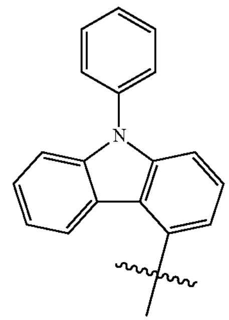 [SMILES: *c1cccc2c1c1ccccc1n2-c1ccccc1] | 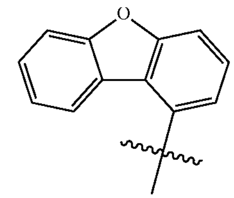 [SMILES: *c1cccc2oc3ccccc3c12] |
| 15-10 | 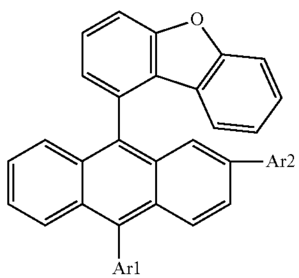 | 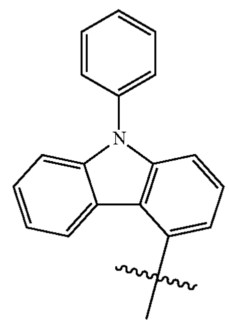 [SMILES: *c1cccc2c1c1ccccc1n2-c1ccccc1] | 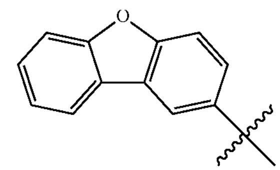 |
| 15-11 | 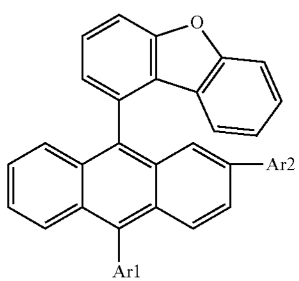 | 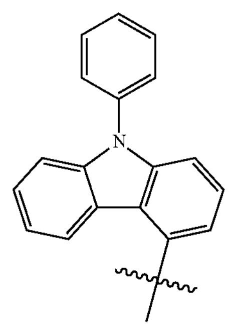 [SMILES: *c1cccc2c1c1ccccc1n2-c1ccccc1] | 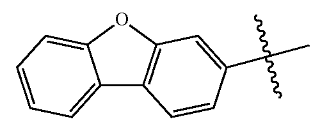 [SMILES: *c1ccc2c(c1)oc1ccccc12] |

-continued
| No. | | Ar1 | Ar2 |
| --- | --- | --- | --- |
| 15-12 | 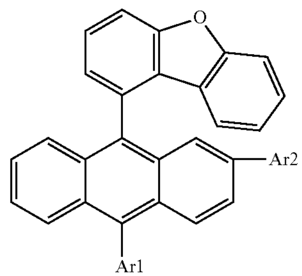 | 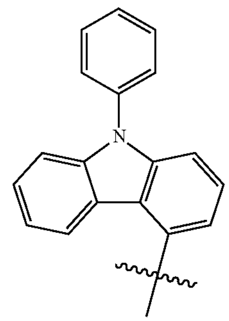 [SMILES: *c1cccc2c1c1ccccc1n2-c1ccccc1] | 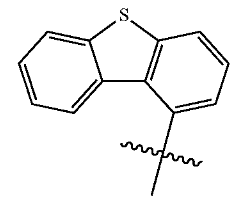 |
| 15-13 | 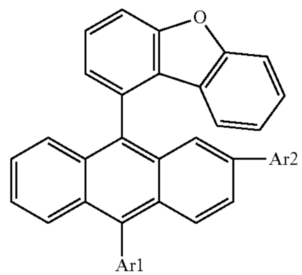 | 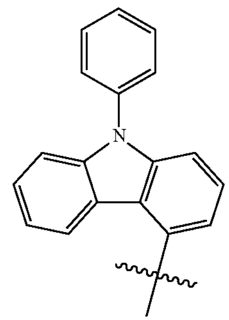 [SMILES: *c1cccc2c1c1ccccc1n2-c1ccccc1] | 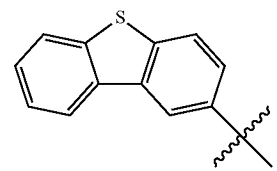 |
| 15-14 | 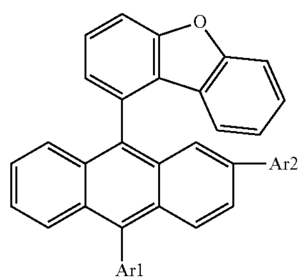 | 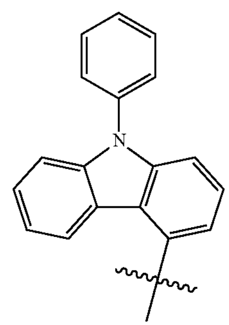 [SMILES: *c1cccc2c1c1ccccc1n2-c1ccccc1] | 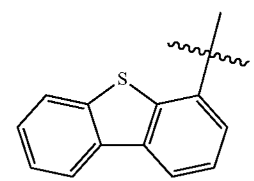 [SMILES: *c1cccc2c1sc1ccccc12] |

-continued
| No. | | Ar1 | Ar2 |
|---|---|---|---|
| 15-15 | 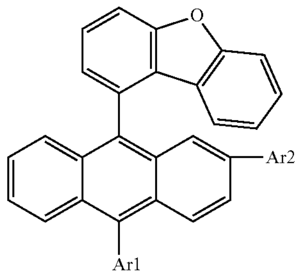 | 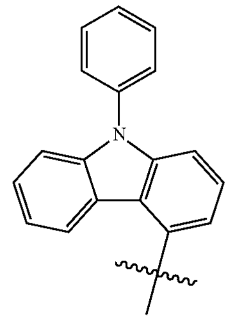 [SMILES: *c1cccc2c1c1ccccc1n2-c1ccccc1] | 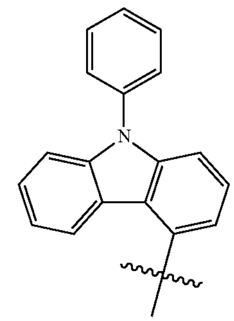 [SMILES: *c1cccc2c1c1ccccc1n2-c1ccccc1] |
| 15-16 | 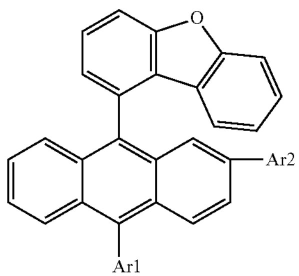 | 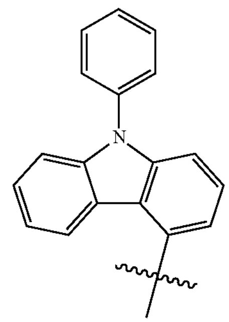 [SMILES: *c1cccc2c1c1ccccc1n2-c1ccccc1] | 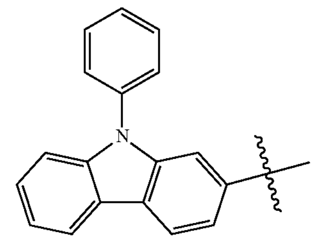 [SMILES: *c1ccc2c3ccccc3n(-c3ccccc3)c2c1] |
| 15-17 | 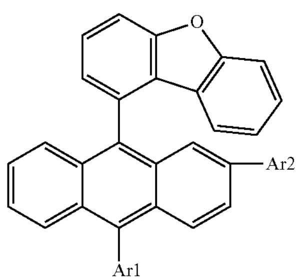 | 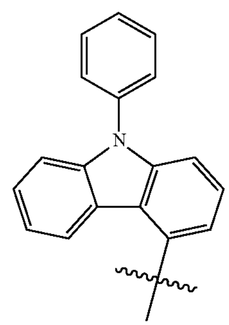 [SMILES: *c1cccc2c1c1ccccc1n2-c1ccccc1] | 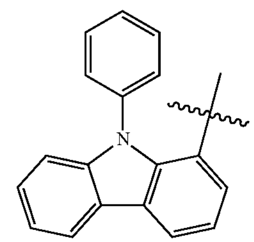 [SMILES: *c1cccc2c3ccccc3n(-c3ccccc3)c12] |

-continued
| No. | | Ar1 | Ar2 |
|---|---|---|---|
| 15-18 | 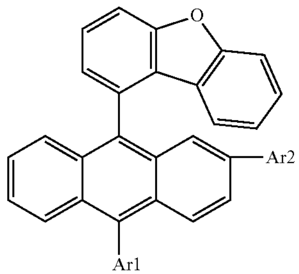 | 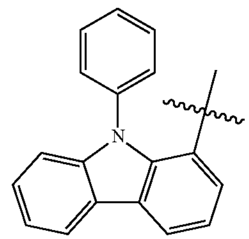 [SMILES: *c1cccc2c3ccccc3n(-c3ccccc3)c12] | 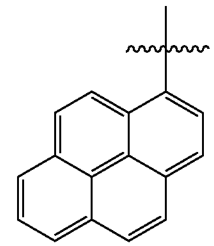 [SMILES: *c1ccc2ccc3cccc4ccc1c2c34] |
| 15-19 | 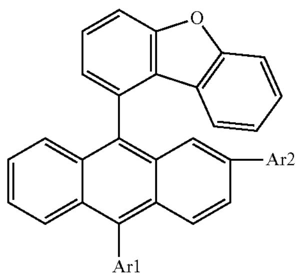 | 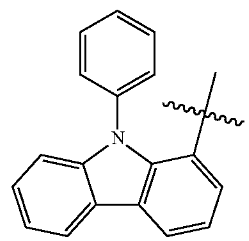 [SMILES: *c1cccc2c3ccccc3n(-c3ccccc3)c12] | 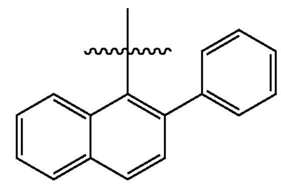 [SMILES: *c1c(-c2ccccc2)ccc2ccccc12] |
| 15-20 | 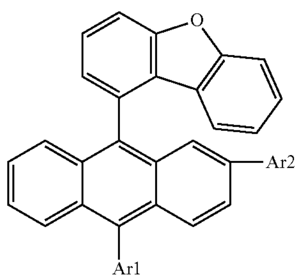 | 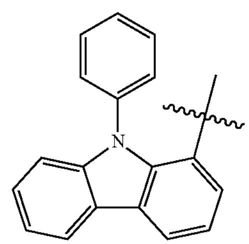 [SMILES: *c1cccc2c3ccccc3n(-c3ccccc3)c12] | 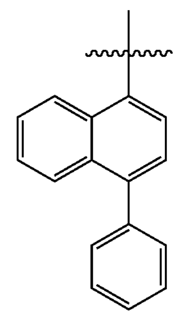 [SMILES: *c1ccc(-c2ccccc2)c2ccccc12] |

-continued
| No. | | Ar1 | Ar2 |
| --- | --- | --- | --- |
| 15-21 | 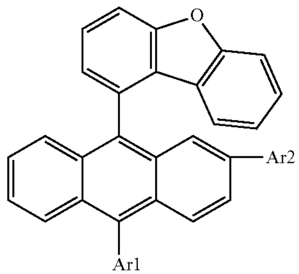 | 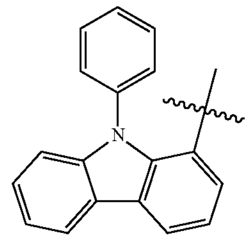 [SMILES: *c1cccc2c3ccccc3n(-c3ccccc3)c12] | 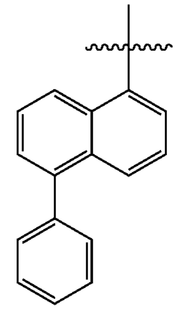 [SMILES: *c1cccc2c(-c3ccccc3)cccc12] |
| 15-22 | 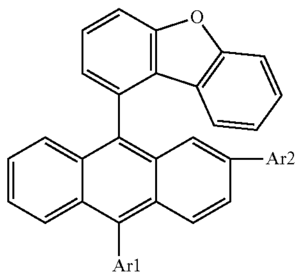 | 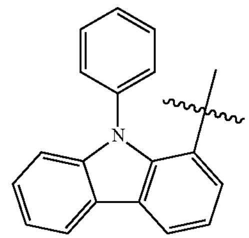 [SMILES: *c1cccc2c3ccccc3n(-c3ccccc3)c12] | 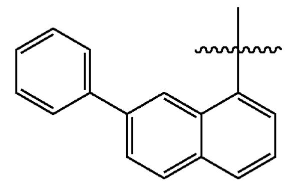 [SMILES: *c1cccc2ccc(-c3ccccc3)cc12] |
| 15-23 | 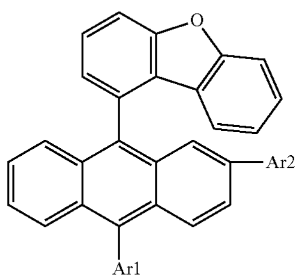 | 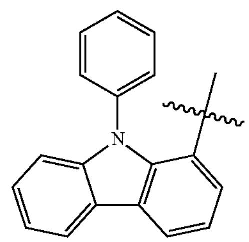 [SMILES: *c1cccc2c3ccccc3n(-c3ccccc3)c12] | 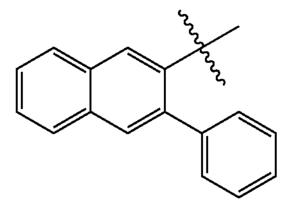 [SMILES: *c1cc2ccccc2cc1-c1ccccc1] |

-continued
| No. | | Ar1 | Ar2 |
|---|---|---|---|
| 15-24 | 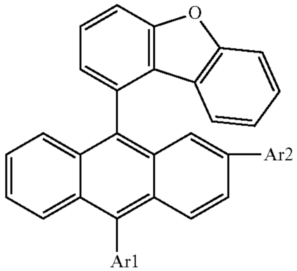 | 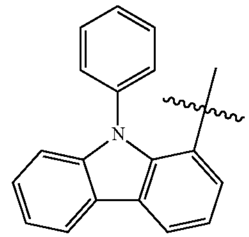 [SMILES: *c1cccc2c3ccccc3n(-c3ccccc3)c12] | 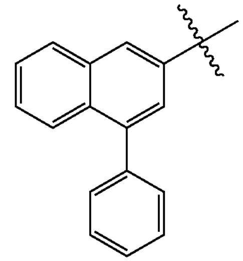 [SMILES: *c1cc(-c2ccccc2)c2ccccc2c1] |
| 15-25 | 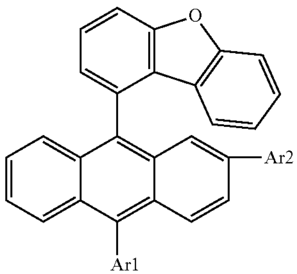 | 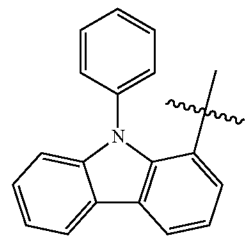 [SMILES: *c1cccc2c3ccccc3n(-c3ccccc3)c12] | 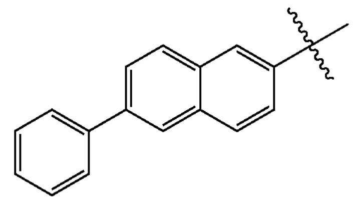 [SMILES: *c1ccc2cc(-c3ccccc3)ccc2c1] |
| 15-26 | 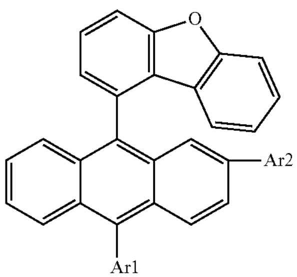 | 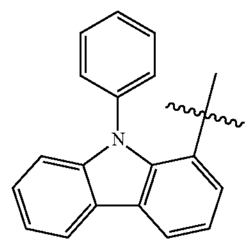 [SMILES: *c1cccc2c3ccccc3n(-c3ccccc3)c12] | 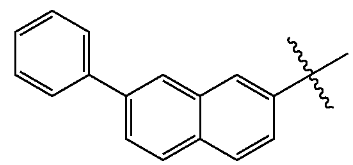 [SMILES: *c1ccc2ccc(-c3ccccc3)cc2c1] |

-continued
| No. | | Ar1 | Ar2 |
| --- | --- | --- | --- |
| 15-27 | 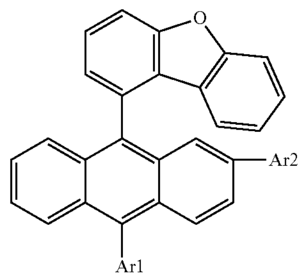 | 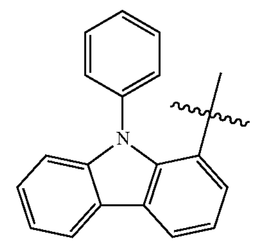 [SMILES: *c1cccc2c3ccccc3n(-c3ccccc3)c12] | 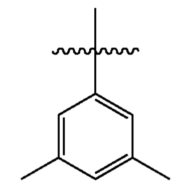 |
| 15-28 | 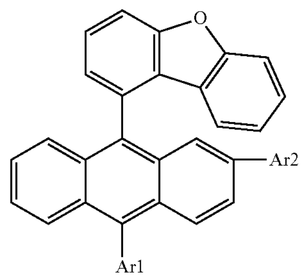 | 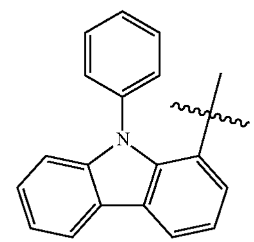 [SMILES: *c1cccc2c3ccccc3n(-c3ccccc3)c12] | 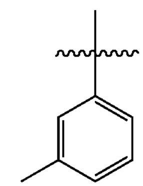 [SMILES: *c1cccc(C)c1] |
| 15-29 | 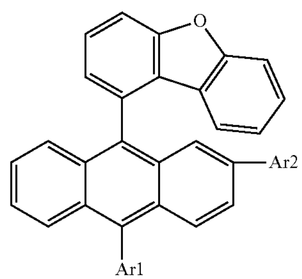 | 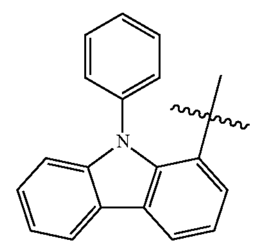 [SMILES: *c1cccc2c3ccccc3n(-c3ccccc3)c12] | 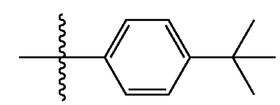 |

-continued
| No. | | Ar1 | Ar2 |
|---|---|---|---|
| 15-30 | 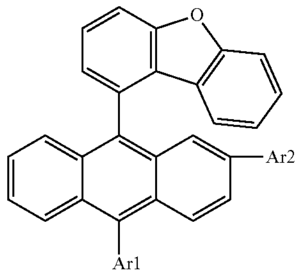 | 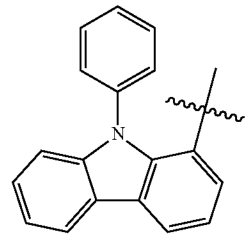 [SMILES: *c1cccc2c3ccccc3n(-c3ccccc3)c12] | 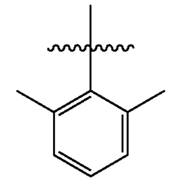 |
| 15-31 | 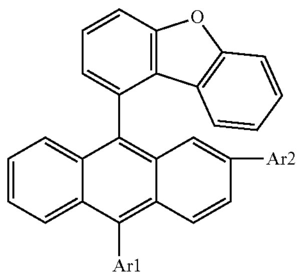 | 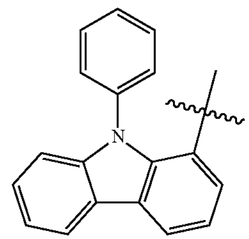 [SMILES: *c1cccc2c3ccccc3n(-c3ccccc3)c12] | 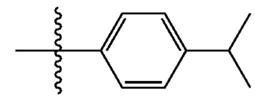 |
| 16-1 | 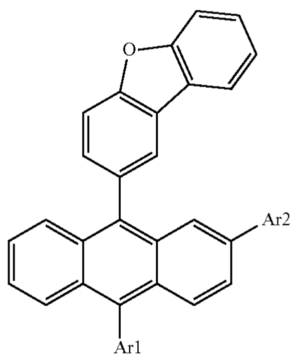 | 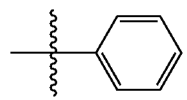 [SMILES: *c1ccccc1] | 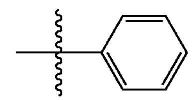 [SMILES: *c1ccccc1] |

-continued
| No. | | Ar1 | Ar2 |
|---|---|---|---|
| 16-2 | 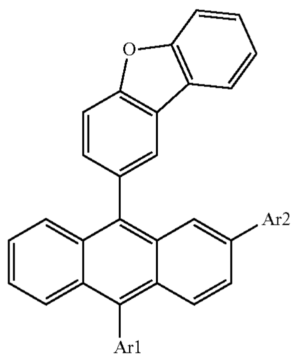 | 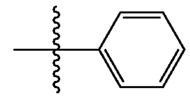 [SMILES: *c1ccccc1] | 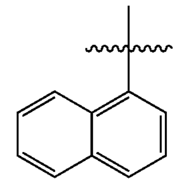 [SMILES: *c1cccc2ccccc12] |
| 16-3 | 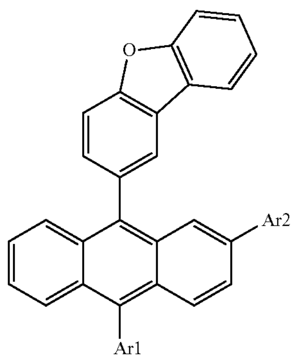 | 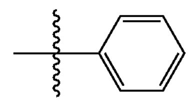 | 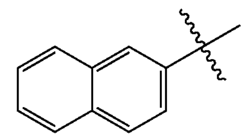 [SMILES: *c1ccc2ccccc2c1] |

-continued
| No. | | Ar1 | Ar2 |
| --- | --- | --- | --- |
| 16-4 | 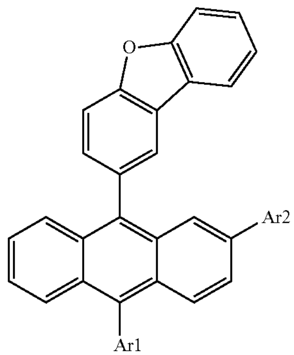 | 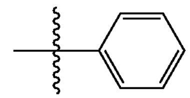 [SMILES: *c1ccccc1] | 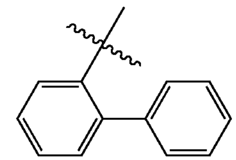 [SMILES: *c1ccccc1-c1ccccc1] |
| 16-5 | 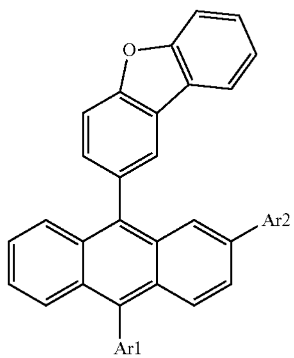 | 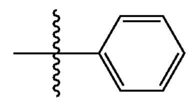 | 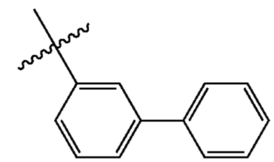 [SMILES: *c1cccc(-c2ccccc2)c1] |
| 16-6 | 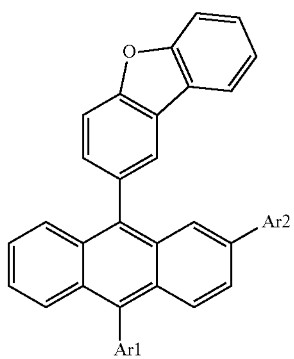 | 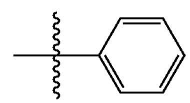 | 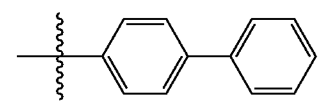 |

-continued
| No. | | Ar1 | Ar2 |
|---|---|---|---|
| 16-7 | 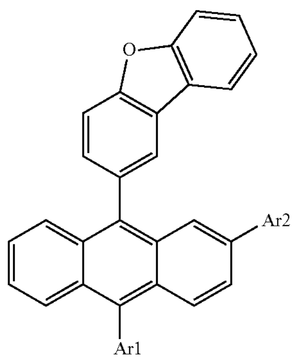 | 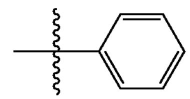 [SMILES: *c1ccccc1] | 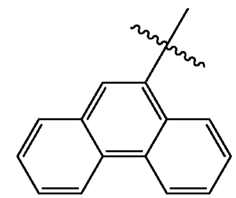 [SMILES: *c1cc2ccccc2c2ccccc12] |
| 16-8 | 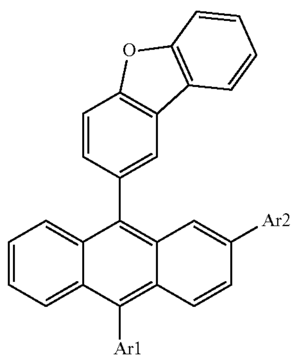 | 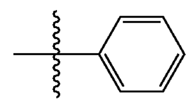 | 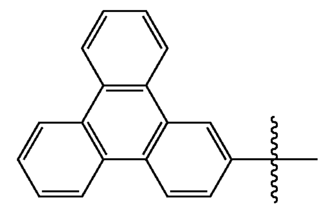 [SMILES: *c1ccc2c3ccccc3c3ccccc3c2c1] |

-continued
| No. | | Ar1 | Ar2 |
|---|---|---|---|
| 16-9 | 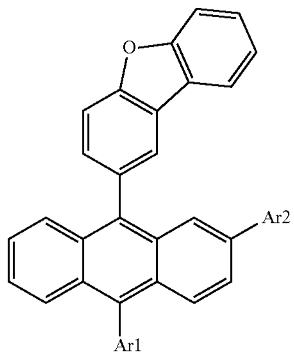  | 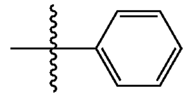 [SMILES: *c1ccccc1] | 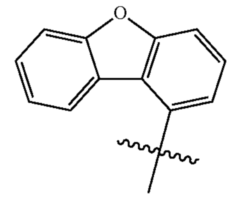 |
| 16-10 | 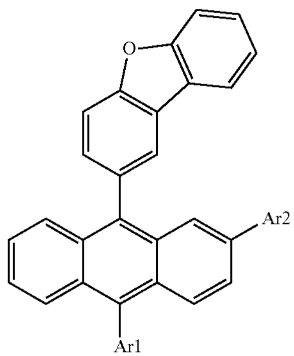  | 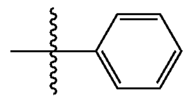 [SMILES: *c1ccccc1] | 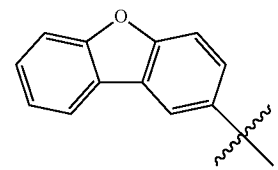 |
| 16-11 | 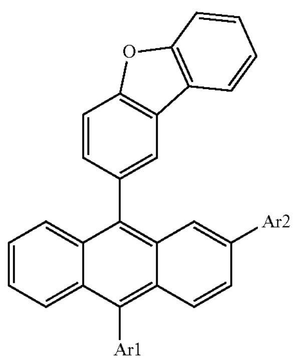  | 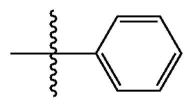 | 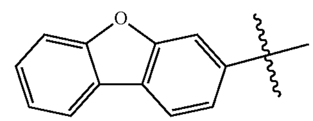 |

-continued
| No. | | Ar1 | Ar2 |
|---|---|---|---|
| 16-12 | 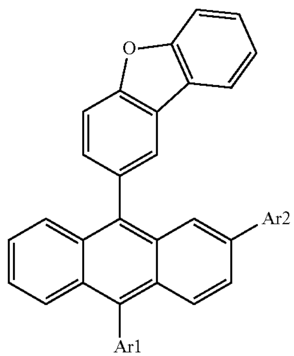 | 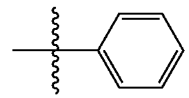 [SMILES: *c1ccccc1] | 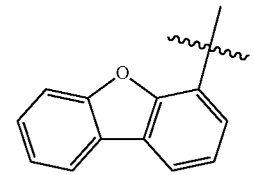 [SMILES: *c1cccc2c1oc1ccccc12] |
| 16-13 | 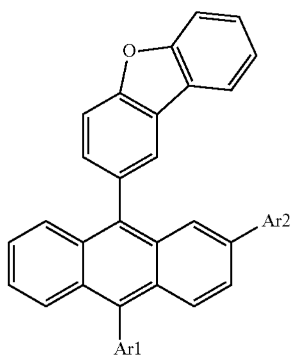 | 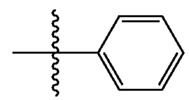 [SMILES: *c1ccccc1] | 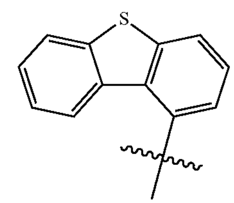 [SMILES: *c1cccc2sc3ccccc3c12] |

-continued
| No. | | Ar1 | Ar2 |
|---|---|---|---|
| 16-14 | 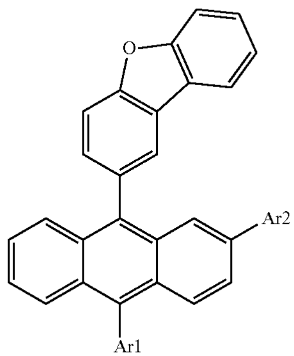 | 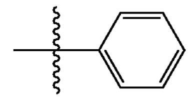 | 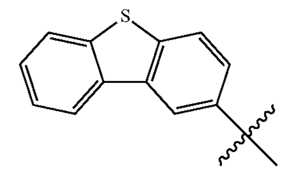 |
| 16-15 | 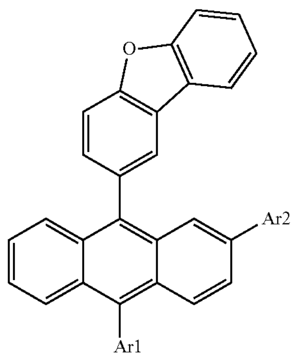 | 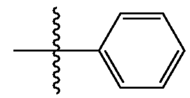 | 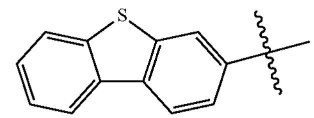 |

-continued
| No. | | Ar1 | Ar2 |
|---|---|---|---|
| 16-16 | 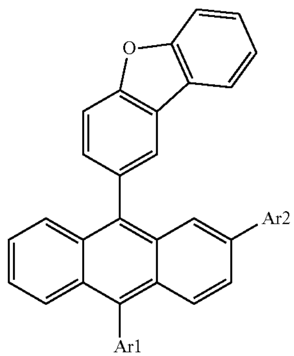 | 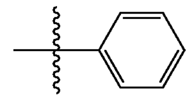 | 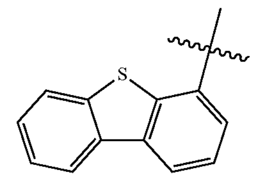 [SMILES: *c1cccc2c1sc1ccccc12] |
| 16-17 | 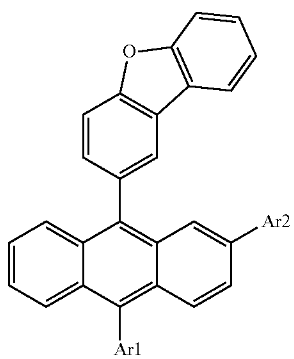 | 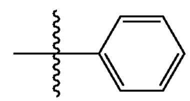 | 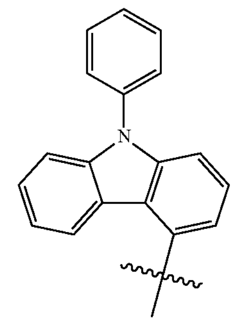 [SMILES: *c1cccc2c1c1ccccc1n2-c1ccccc1] |

-continued
| No. | | Ar1 | Ar2 |
|---|---|---|---|
| 16-18 | 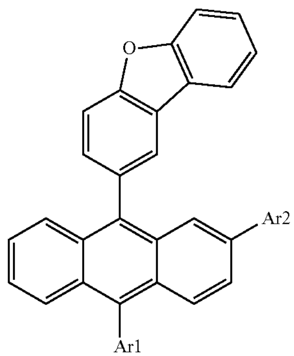 | 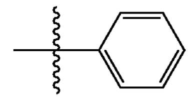 | 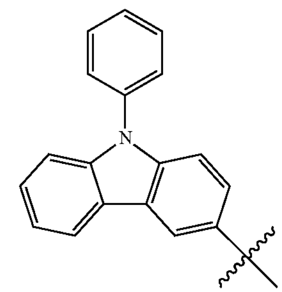 [SMILES: *c1ccc2c(c1)c1ccccc1n2-c1ccccc1] |
| 16-19 | 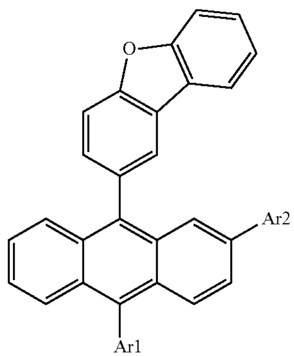 | 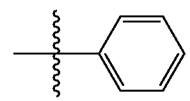 | 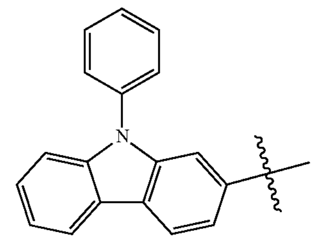 [SMILES: *c1ccc2c3ccccc3n(-c3ccccc3)c2c1] |

-continued
| No. | | Ar1 | Ar2 |
|---|---|---|---|
| 16-20 | 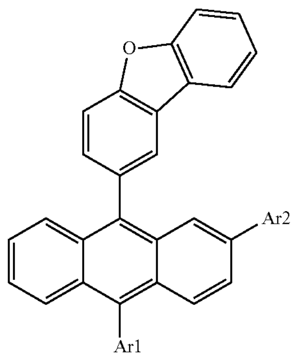 | 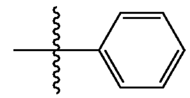 | 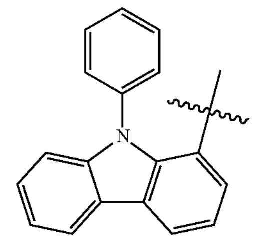 [SMILES: *c1cccc2c3ccccc3n(-c3ccccc3)c12] |
| 16-21 | 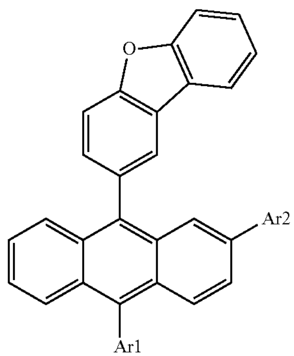 | 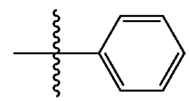 | 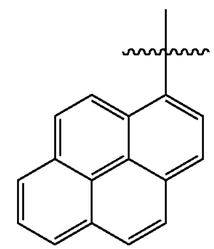 [SMILES: *c1ccc2ccc3cccc4ccc1c2c34] |

-continued
| No. | | Ar1 | Ar2 |
|---|---|---|---|
| 16-22 | 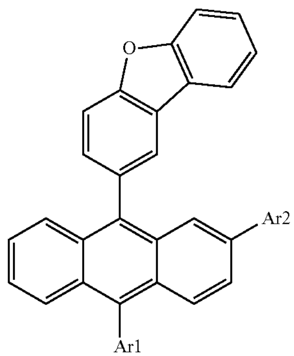 | 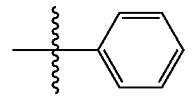 | 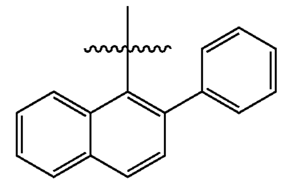 [SMILES: *c1c(-c2ccccc2)ccc2ccccc12] |
| 16-23 | 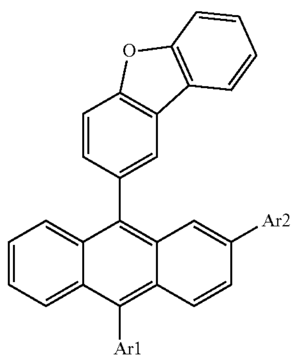 | 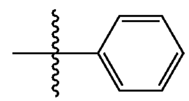 | 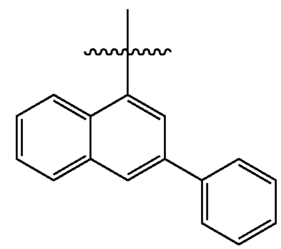 [SMILES: *c1cc(-c2ccccc2)cc2ccccc12] |

-continued
| No. | | Ar1 | Ar2 |
|---|---|---|---|
| 16-24 | 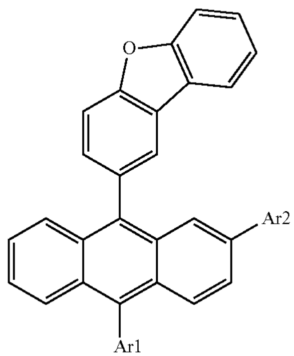 | 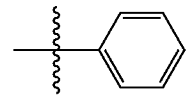 | 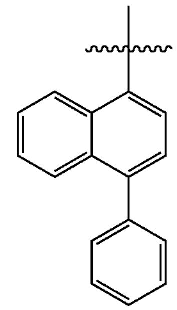 [SMILES: *c1ccc(-c2ccccc2)c2ccccc12] |
| 16-25 | 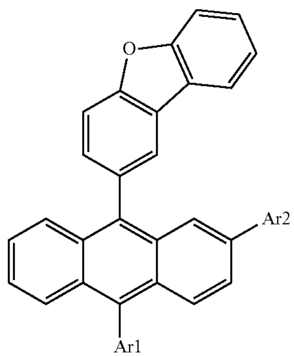 | 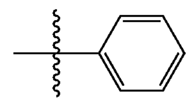 | 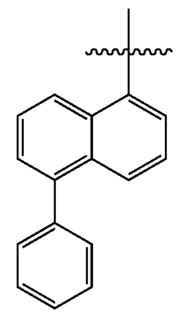 [SMILES: *c1cccc2c(-c3ccccc3)cccc12] |

-continued
| No. | | Ar1 | Ar2 |
|---|---|---|---|
| 16-26 | 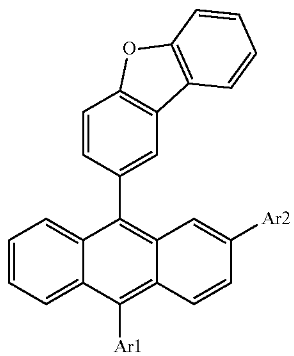 | 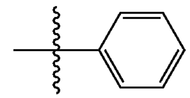 | 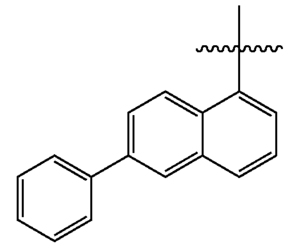 [SMILES: *c1cccc2cc(-c3ccccc3)ccc12] |
| 16-27 | 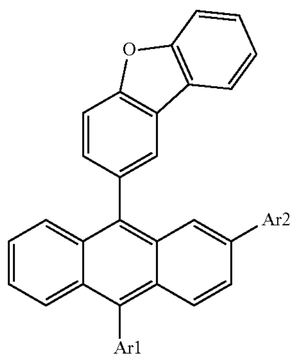 | 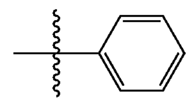 | 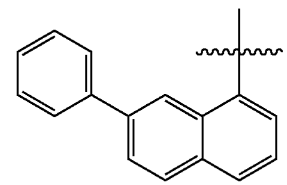 [SMILES: *c1cccc2ccc(-c3ccccc3)cc12] |

-continued
| No. | | Ar1 | Ar2 |
|---|---|---|---|
| 16-28 | 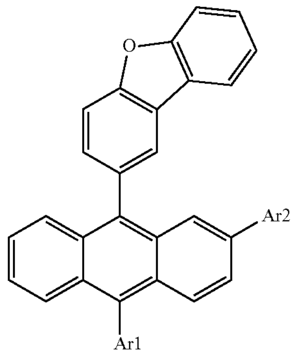 | 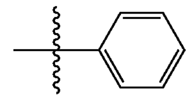 | 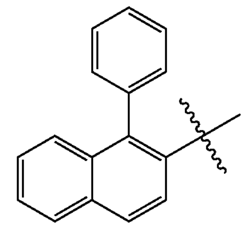 [SMILES: *c1ccc2ccccc2c1-c1ccccc1] |
| 16-29 | 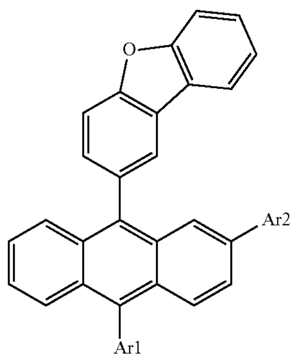 | 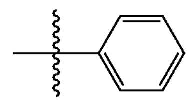 | 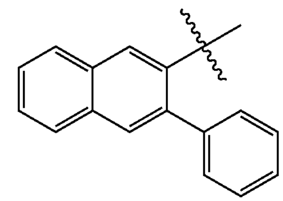 [SMILES: *c1cc2ccccc2cc1-c1ccccc1] |

-continued
| No. | | Ar1 | Ar2 |
|---|---|---|---|
| 16-30 | 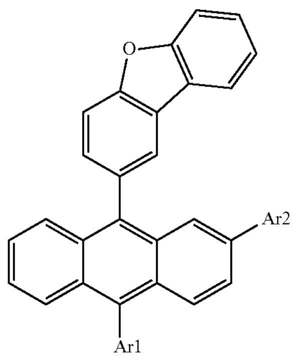 | 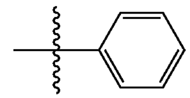 | 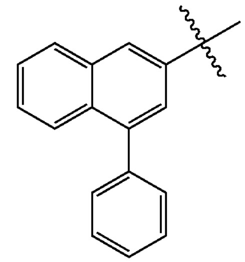 [SMILES: *c1cc(-c2ccccc2)c2ccccc2c1] |
| 16-31 | 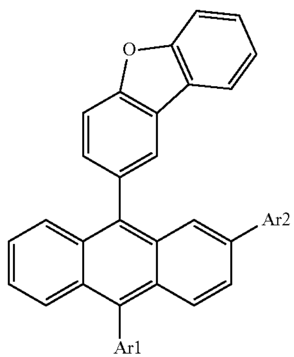 | 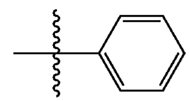 | 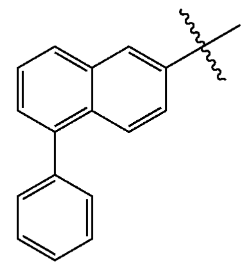 [SMILES: *c1ccc2c(-c3ccccc3)cccc2c1] |

-continued
| No. | | Ar1 | Ar2 |
|---|---|---|---|
| 16-32 | 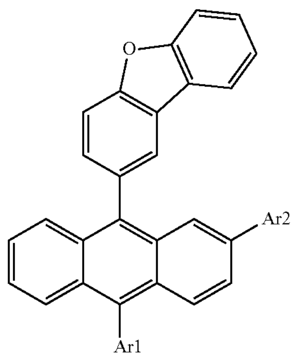 | 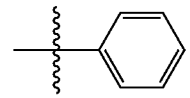 | 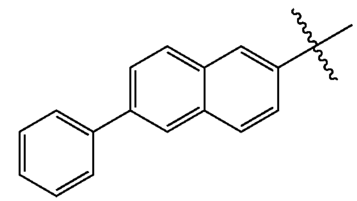 [SMILES: *c1ccc2cc(-c3ccccc3)ccc2c1] |
| 16-33 | 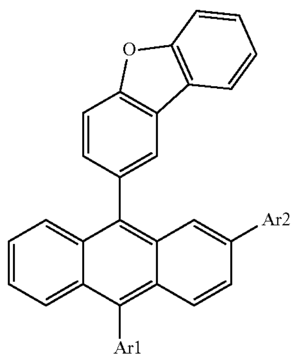 | 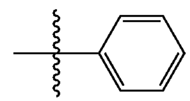 | 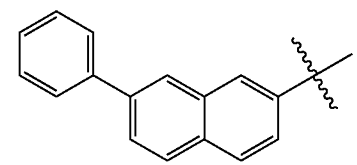 [SMILES: *c1ccc2ccc(-c3ccccc3)cc2c1] |

-continued
| No. | | Ar1 | Ar2 |
|---|---|---|---|
| 16-34 | 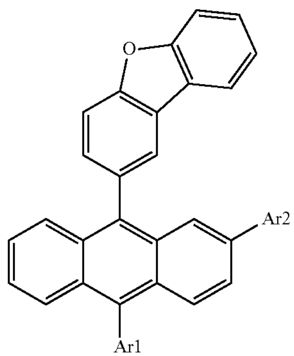 | 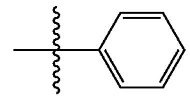 | 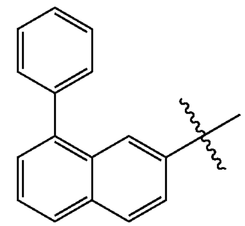 [SMILES: *c1ccc2cccc(-c3ccccc3)c2c1] |
| 16-35 | 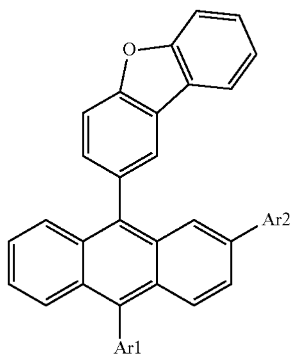 | 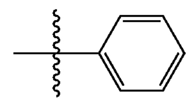 | 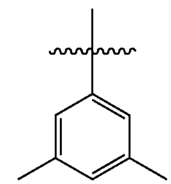 |

-continued
| No. | | Ar1 | Ar2 |
|---|---|---|---|
| 16-36 | 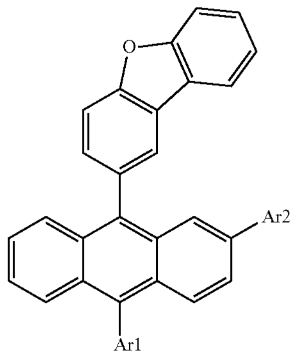 | 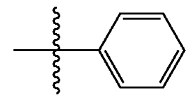 | 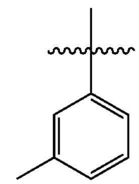 [SMILES: *c1cccc(C)c1] |
| 16-37 | 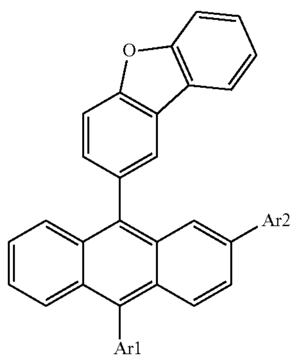 | 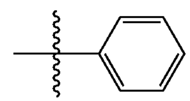 [SMILES: *c1ccccc1] | 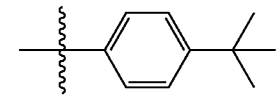 [SMILES: *c1ccc(C(C)(C)C)cc1] |

-continued
| No. | | Ar1 | Ar2 |
|---|---|---|---|
| 16-38 | 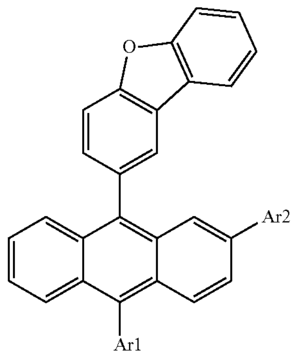 | 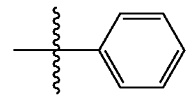 | 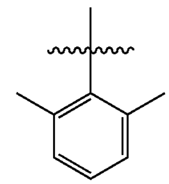 |
| 16-39 | 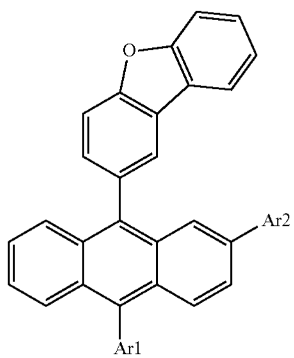 | 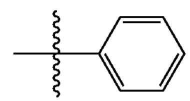 [SMILES: *c1ccccc1] | 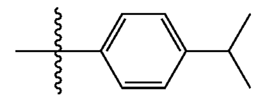 [SMILES: *c1ccc(C(C)C)cc1] |

-continued
| No. | | Ar1 | Ar2 |
|---|---|---|---|
| 16-40 | 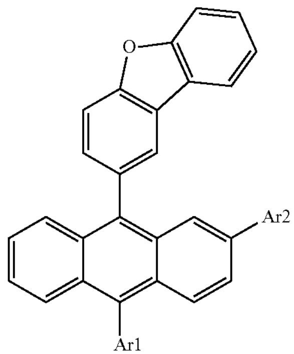 | 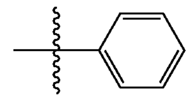 | 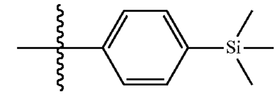 |
| 16-41 | 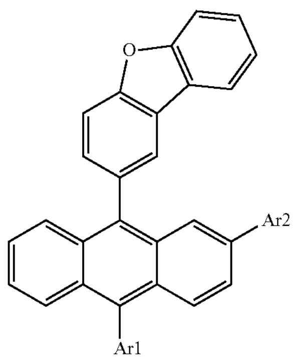 | 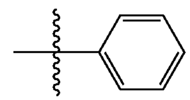 | 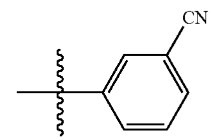 [SMILES: *c1cccc(C#N)c1] |

-continued
| No. | | Ar1 | Ar2 |
|---|---|---|---|
| 16-42 | 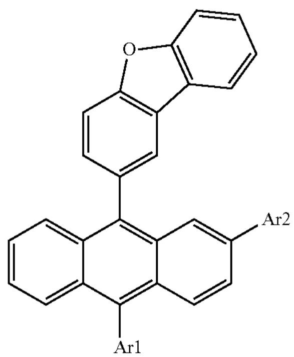 | 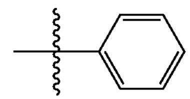 [SMILES: *c1ccccc1] | 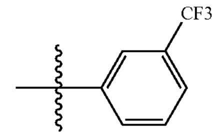 [SMILES: *c1cccc(C(F)(F)F)c1] |
| 16-43 | 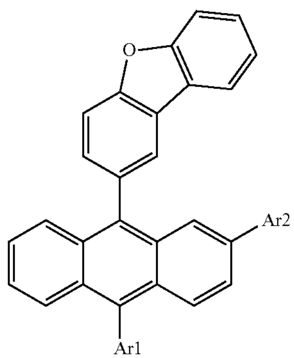 | 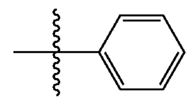 | 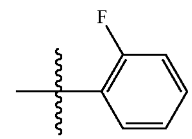 [SMILES: *c1ccccc1F] |

-continued
| No. | | Ar1 | Ar2 |
|---|---|---|---|
| 16-44 | 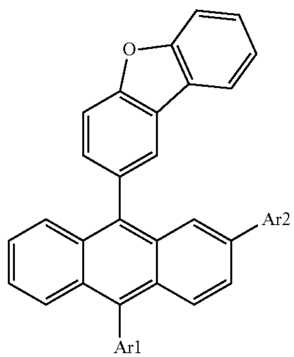 | 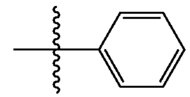 [SMILES: *c1ccccc1] | 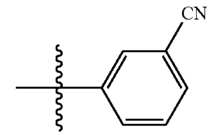 [SMILES: *c1cccc(C#N)c1] |
| 16-45 | 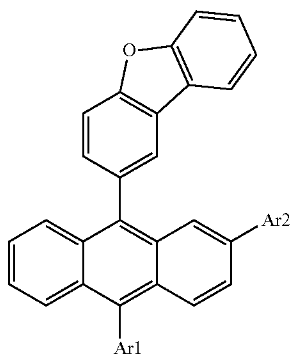 | 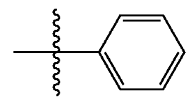 | 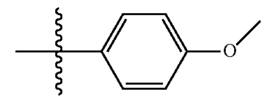 [SMILES: *c1ccc(OC)cc1] |

-continued
| No. | | Ar1 | Ar2 |
|---|---|---|---|
| 16-46 | 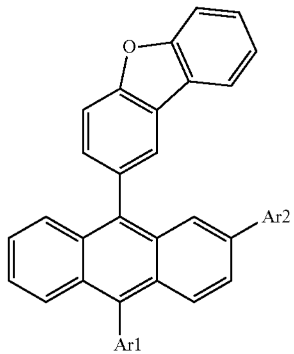 | 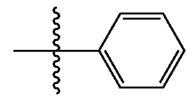 [SMILES: *c1ccccc1] | 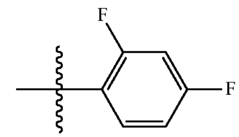 [SMILES: *c1ccc(F)cc1F] |
| 17-1 | 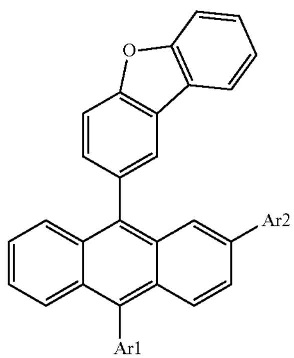 | 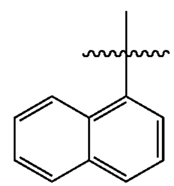 [SMILES: *c1cccc2ccccc12] | 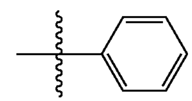 [SMILES: *c1ccccc1] |

-continued
| No. | | Ar1 | Ar2 |
|---|---|---|---|
| 17-2 | 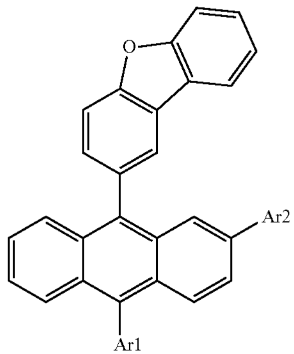 | 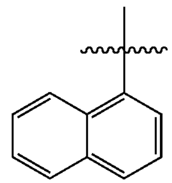 [SMILES: *c1cccc2ccccc12] | 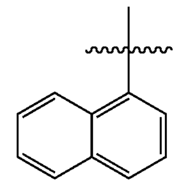 [SMILES: *c1cccc2ccccc12] |
| 17-3 | 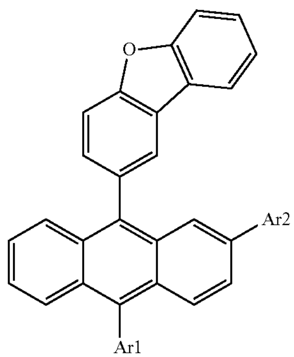 | 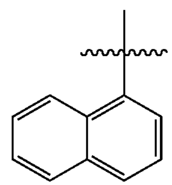 [SMILES: *c1cccc2ccccc12] | 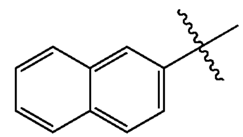 [SMILES: *c1ccc2ccccc2c1] |

-continued
| No. | | Ar1 | Ar2 |
|---|---|---|---|
| 17-4 | 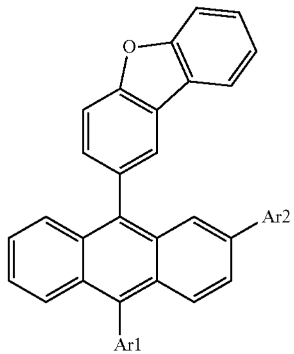 | 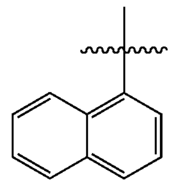 [SMILES: *c1cccc2ccccc12] | 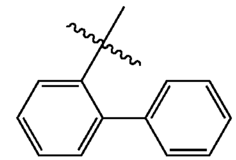 [SMILES: *c1ccccc1-c1ccccc1] |
| 17-5 | 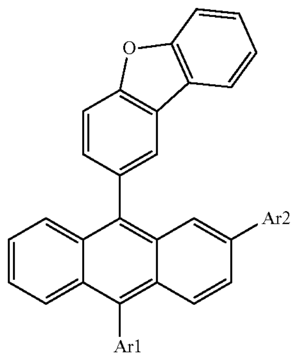 | 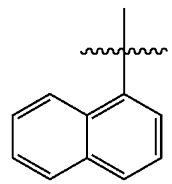 [SMILES: *c1cccc2ccccc12] | 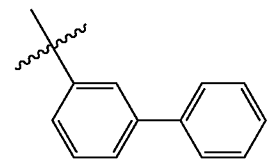 [SMILES: *c1cccc(-c2ccccc2)c1] |

-continued
| No. | | Ar1 | Ar2 |
|---|---|---|---|
| 17-6 | 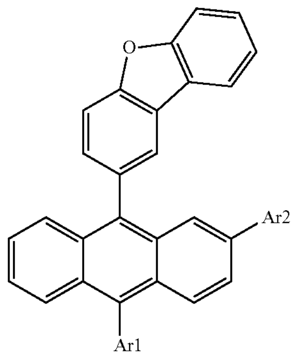 | 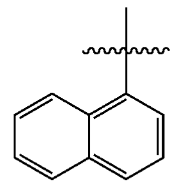 [SMILES: *c1cccc2ccccc12] | 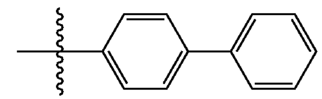 [SMILES: *c1ccc(-c2ccccc2)cc1] |
| 17-7 | 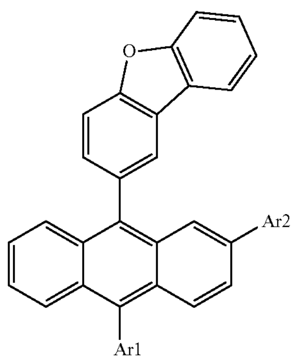 | 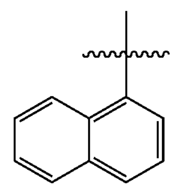 [SMILES: *c1cccc2ccccc12] | 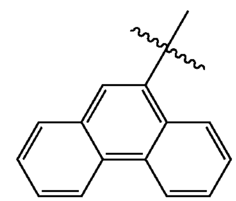 [SMILES: *c1cc2ccccc2c2ccccc12] |

-continued
| No. | | Ar1 | Ar2 |
|---|---|---|---|
| 17-8 | 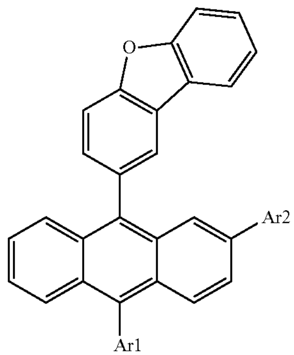 | 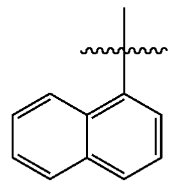 [SMILES: *c1cccc2ccccc12] | 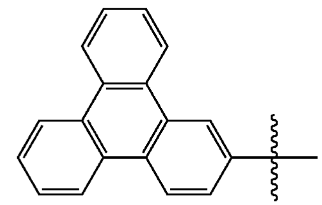 [SMILES: *c1ccc2c3ccccc3c3ccccc3c2c1] |
| 17-9 | 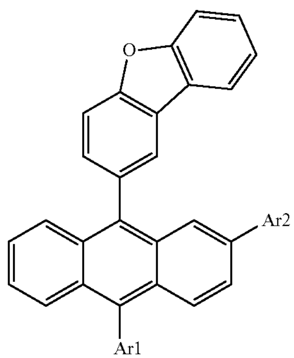 | 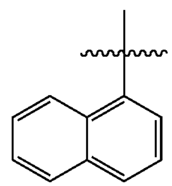 [SMILES: *c1cccc2ccccc12] | 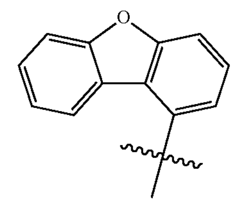 [SMILES: *c1cccc2oc3ccccc3c12] |

-continued
| No. | | Ar1 | Ar2 |
|---|---|---|---|
| 17-10 | 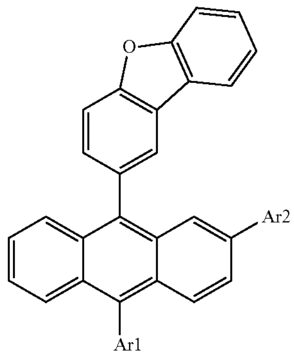 | 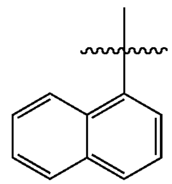 [SMILES: *c1cccc2ccccc12] | 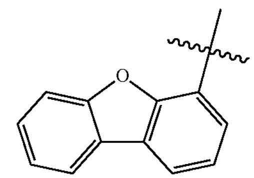 [SMILES: *c1cccc2c1oc1ccccc12] |
| 17-11 | 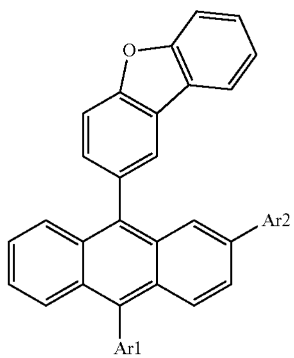 | 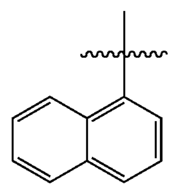 [SMILES: *c1cccc2ccccc12] | 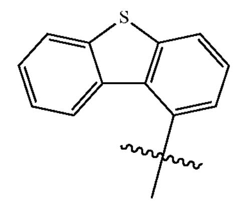 [SMILES: *c1cccc2sc3ccccc3c12] |

-continued
| No. | | Ar1 | Ar2 |
|---|---|---|---|
| 17-12 | 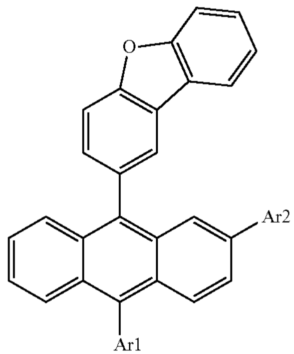 | 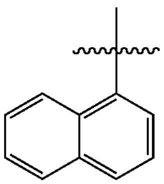 [SMILES: *c1cccc2ccccc12] | 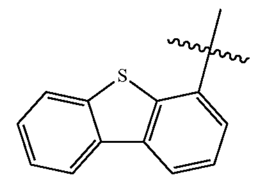 |
| 17-13 | 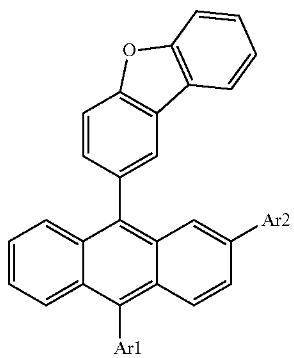 | 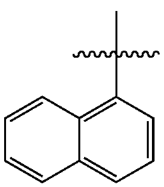 [SMILES: *c1cccc2ccccc12] | 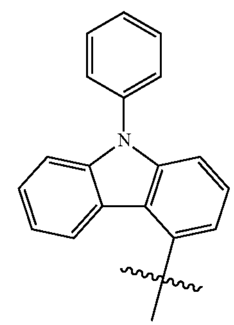 [SMILES: *c1cccc2c1c1ccccc1n2-c1ccccc1] |

-continued
| No. | | Ar1 | Ar2 |
|---|---|---|---|
| 17-14 | 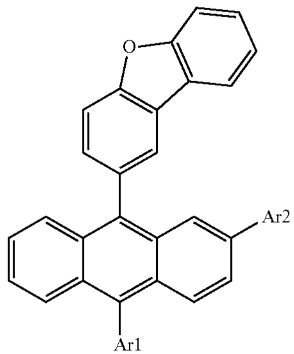 | 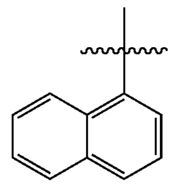 [SMILES: *c1cccc2ccccc12] | 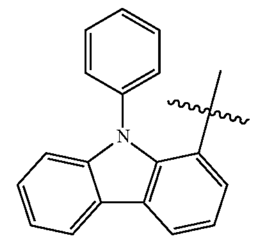 [SMILES: *c1cccc2c3ccccc3n(-c3ccccc3)c12] |
| 17-15 | 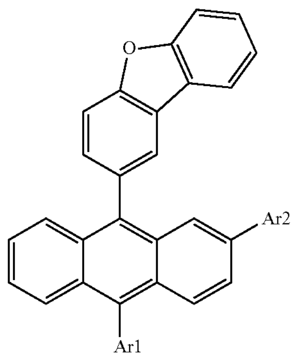 | 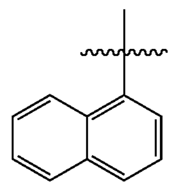 [SMILES: *c1cccc2ccccc12] | 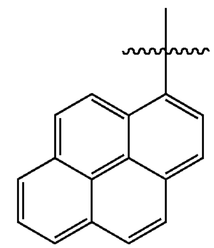 [SMILES: *c1ccc2ccc3cccc4ccc1c2c34] |

-continued
| No. | | Ar1 | Ar2 |
|---|---|---|---|
| 17-16 | 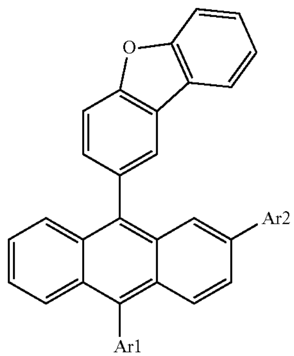 | 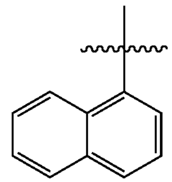 [SMILES: *c1cccc2ccccc12] | 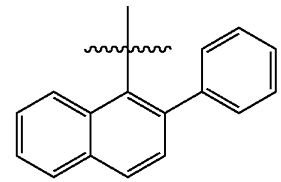 [SMILES: *c1c(-c2ccccc2)ccc2ccccc12] |
| 17-17 | 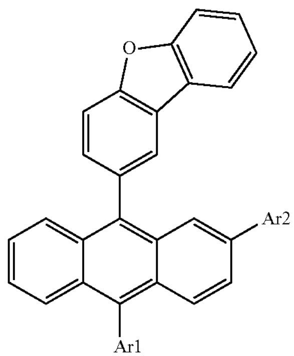 | 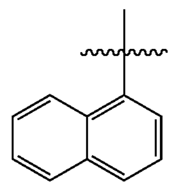 [SMILES: *c1cccc2ccccc12] | 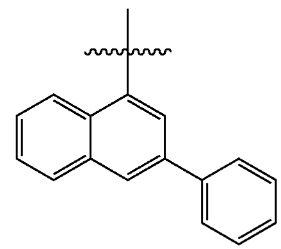 [SMILES: *c1cc(-c2ccccc2)cc2ccccc12] |

-continued
| No. | | Ar1 | Ar2 |
|---|---|---|---|
| 17-18 | 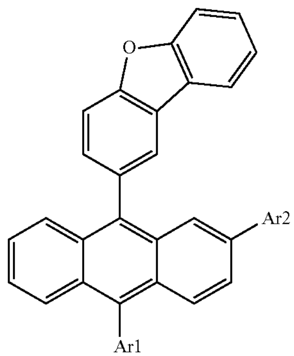 | 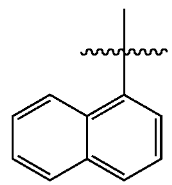 [SMILES: *c1cccc2ccccc12] | 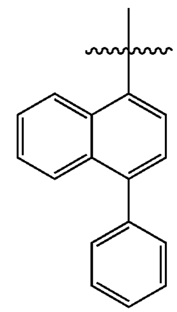 [SMILES: *c1ccc(-c2ccccc2)c2ccccc12] |
| 17-19 | 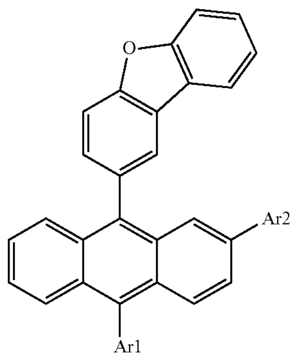 | 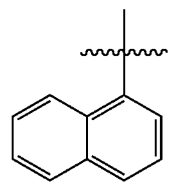 [SMILES: *c1cccc2ccccc12] | 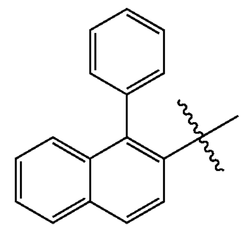 [SMILES: *c1ccc2ccccc2c1-c1ccccc1] |

-continued
| No. | | Ar1 | Ar2 |
|---|---|---|---|
| 17-20 | 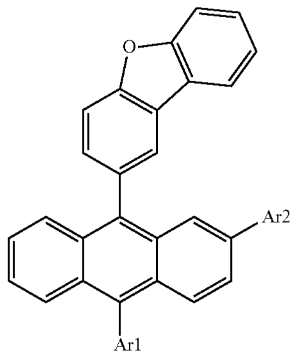 | 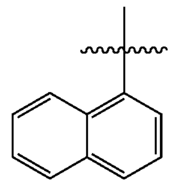 [SMILES: *c1cccc2ccccc12] | 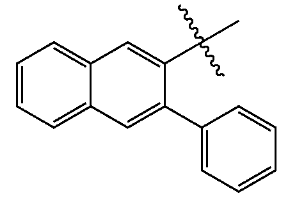 [SMILES: *c1cc2ccccc2cc1-c1ccccc1] |
| 17-21 | 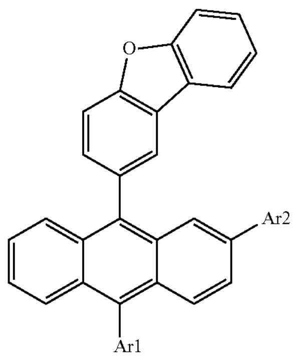 | 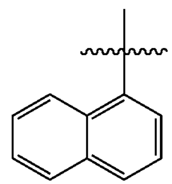 [SMILES: *c1cccc2ccccc12] | 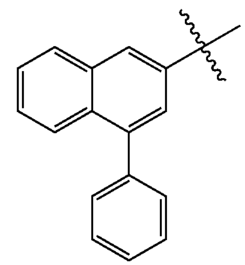 [SMILES: *c1cc(-c2ccccc2)c2ccccc2c1] |

-continued
| No. | | Ar1 | Ar2 |
|---|---|---|---|
| 17-22 | 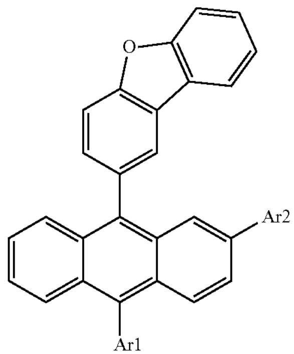 | 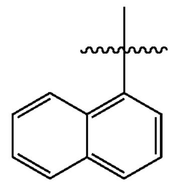 [SMILES: *c1cccc2ccccc12] | 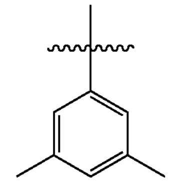 |
| 17-23 | 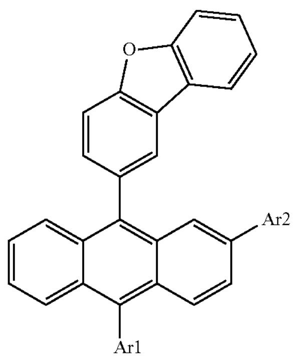 | 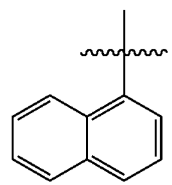 [SMILES: *c1cccc2ccccc12] | 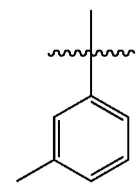 [SMILES: *c1cccc(C)c1] |

-continued
| No. | | Ar1 | Ar2 |
|---|---|---|---|
| 17-24 | 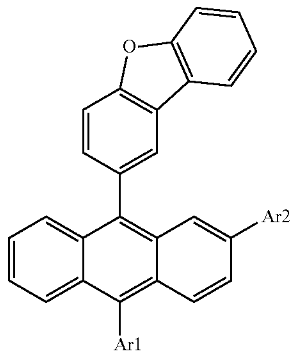  | 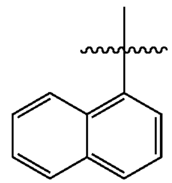 [SMILES: *c1cccc2ccccc12] | 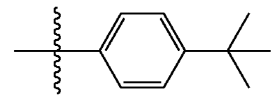 [SMILES: *c1ccc(C(C)(C)C)cc1] |
| 17-25 | 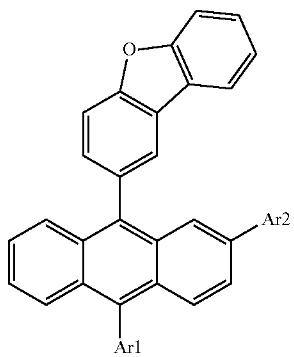  | 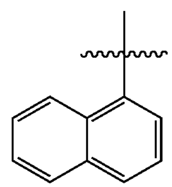 [SMILES: *c1cccc2ccccc12] | 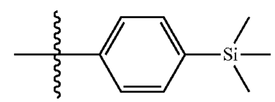  |
| 17-26 | 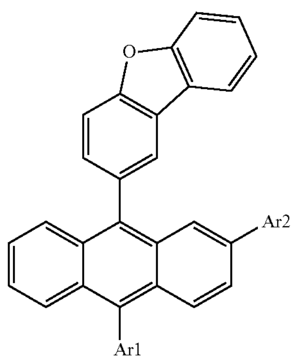  | 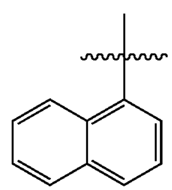 [SMILES: *c1cccc2ccccc12] | 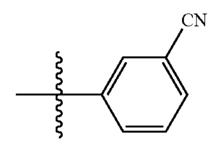 [SMILES: *c1cccc(C#N)c1]  |

-continued
| No. | | Ar1 | Ar2 |
|---|---|---|---|
| 17-27 | 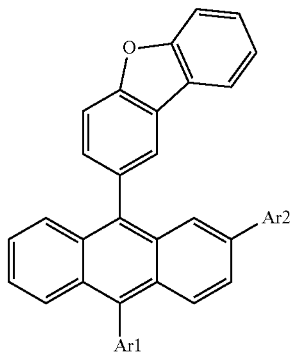 | 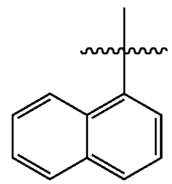 [SMILES: *c1cccc2ccccc12] | 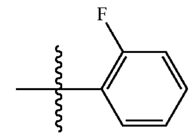 [SMILES: *c1ccccc1F] |
| 17-28 | 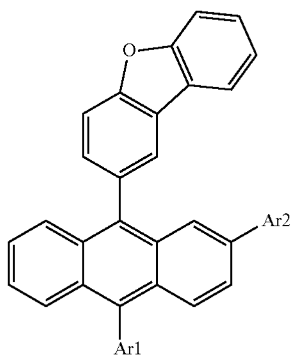 | 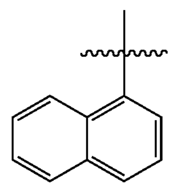 [SMILES: *c1cccc2ccccc12] | 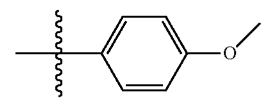 [SMILES: *c1ccc(OC)cc1] |

-continued
| No. | | Ar1 | Ar2 |
|---|---|---|---|
| 18-1 | 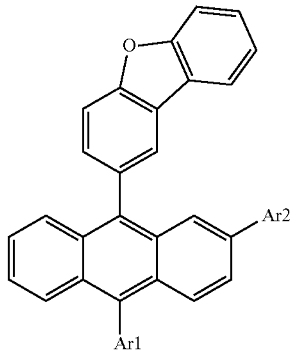 | 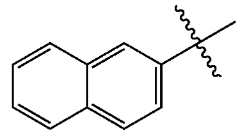 [SMILES: *c1ccc2ccccc2c1] | 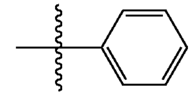 |
| 18-2 | 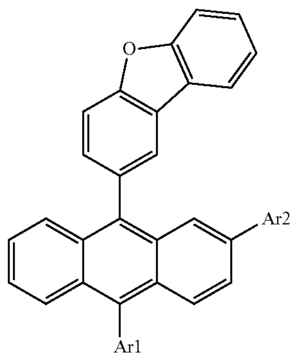 | 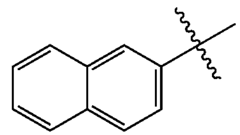 [SMILES: *c1ccc2ccccc2c1] | 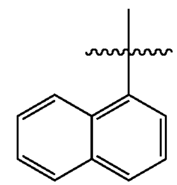 [SMILES: *c1cccc2ccccc12] |
| 18-3 | 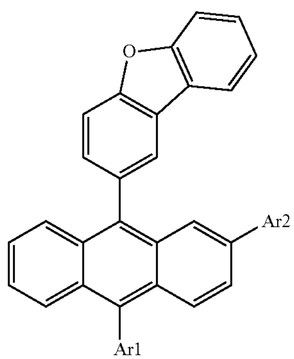 | 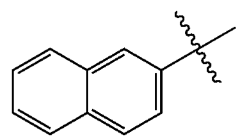 [SMILES: *c1ccc2ccccc2c1] | 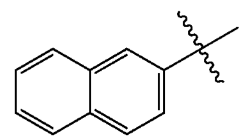 [SMILES: *c1ccc2ccccc2c1] |

-continued
| No. | | Ar1 | Ar2 |
|---|---|---|---|
| 18-4 | 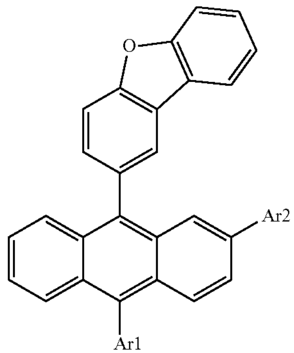 | 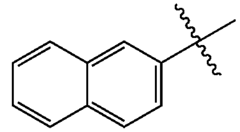 [SMILES: *c1ccc2ccccc2c1] | 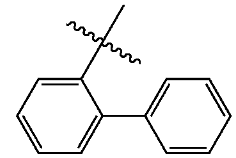 [SMILES: *c1ccccc1-c1ccccc1] |
| 18-5 | 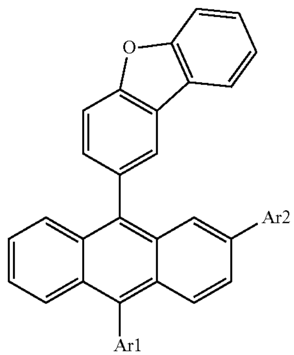 | 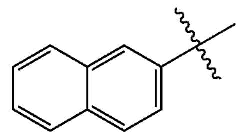 [SMILES: *c1ccc2ccccc2c1] | 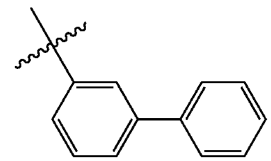 [SMILES: *c1cccc(-c2ccccc2)c1] |

-continued
| No. | | Ar1 | Ar2 |
|---|---|---|---|
| 18-6 | 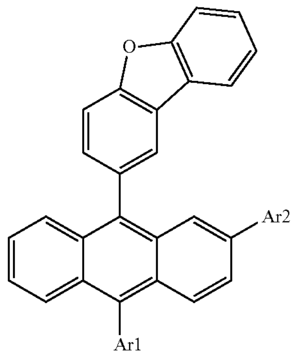 | 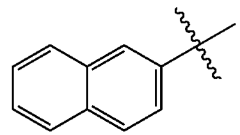 [SMILES: *c1ccc2ccccc2c1] | 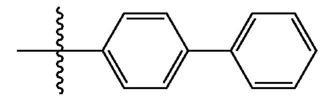 [SMILES: *c1ccc(-c2ccccc2)cc1] |
| 18-7 | 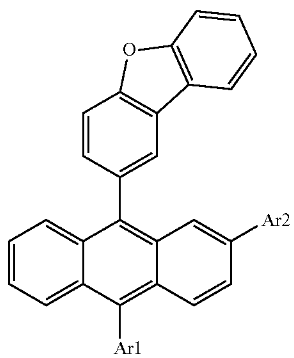 | 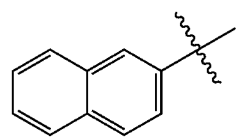 [SMILES: *c1ccc2ccccc2c1] | 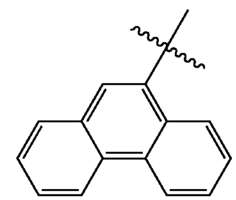 [SMILES: *c1cc2ccccc2c2ccccc12] |

-continued
| No. | | Ar1 | Ar2 |
|---|---|---|---|
| 18-8 | 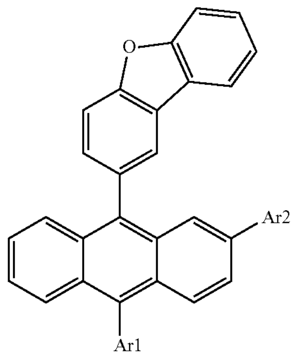  | 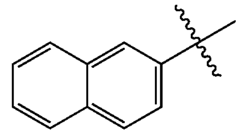 [SMILES: *c1ccc2ccccc2c1] | 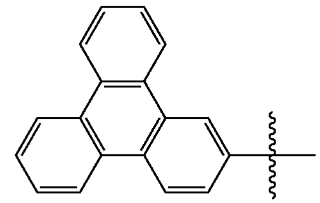 [SMILES: *c1ccc2c3ccccc3c3ccccc3c2c1] |
| 18-9 | 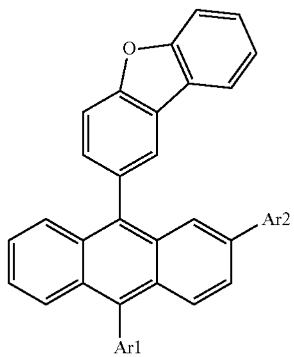  | 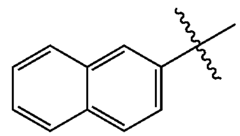 [SMILES: *c1ccc2ccccc2c1] | 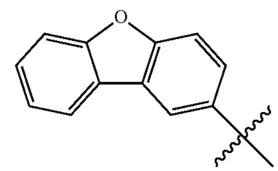  |

-continued
| No. | | Ar1 | Ar2 |
|---|---|---|---|
| 18-10 | 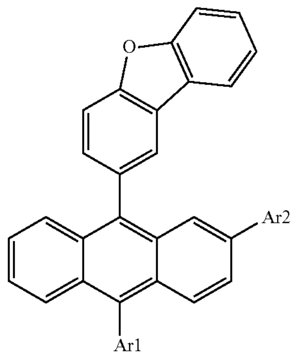 | 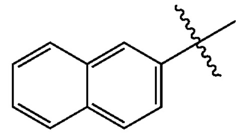 [SMILES: *c1ccc2ccccc2c1] | 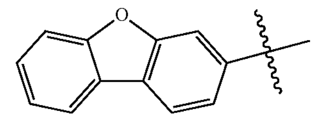 [SMILES: *c1ccc2c(c1)oc1ccccc12] |
| 18-11 | 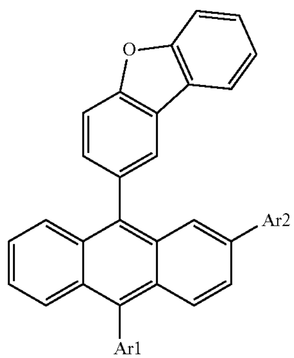 | 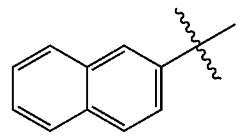 [SMILES: *c1ccc2ccccc2c1] | 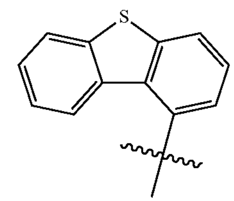 [SMILES: *c1cccc2sc3ccccc3c12] |

-continued
| No. | | Ar1 | Ar2 |
|---|---|---|---|
| 18-12 | 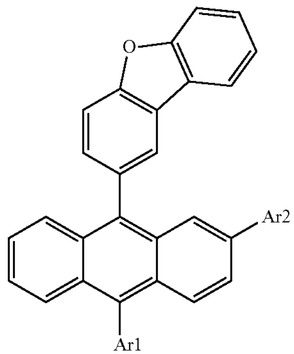 | 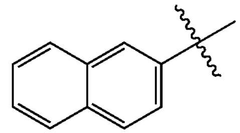 [SMILES: *c1ccc2ccccc2c1] | 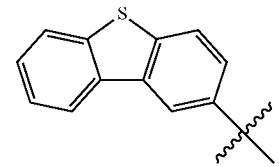 |
| 18-13 | 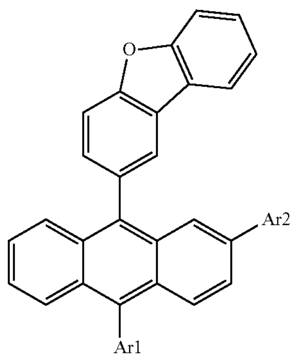 | 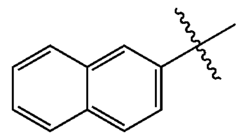 [SMILES: *c1ccc2ccccc2c1] | 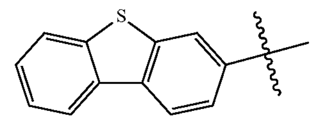 |

-continued
| No. | | Ar1 | Ar2 |
|---|---|---|---|
| 18-14 | 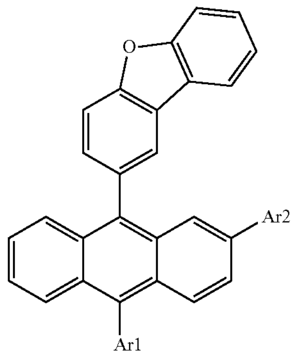 | 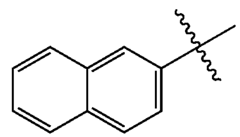 [SMILES: *c1ccc2ccccc2c1] | 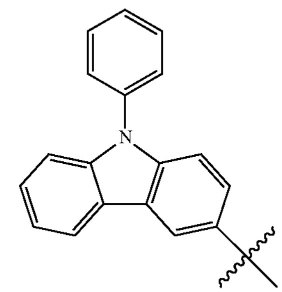 [SMILES: *c1ccc2c(c1)c1ccccc1n2-c1ccccc1] |
| 18-15 | 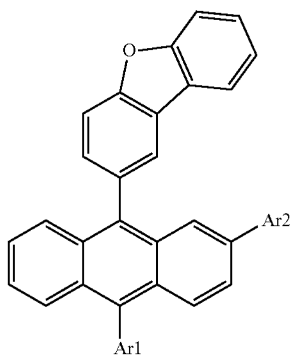 | 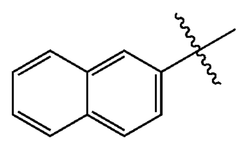 [SMILES: *c1ccc2ccccc2c1] | 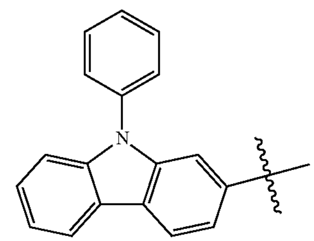 [SMILES: *c1ccc2c3ccccc3n(-c3ccccc3)c2c1] |

-continued
| No. | | Ar1 | Ar2 |
|---|---|---|---|
| 18-16 | 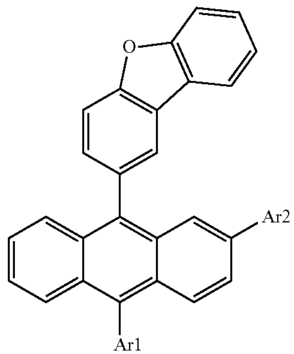 | 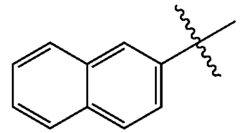 [SMILES: *c1ccc2ccccc2c1] | 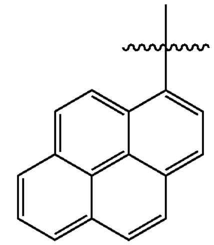 [SMILES: *c1ccc2ccc3cccc4ccc1c2c34] |
| 18-17 | 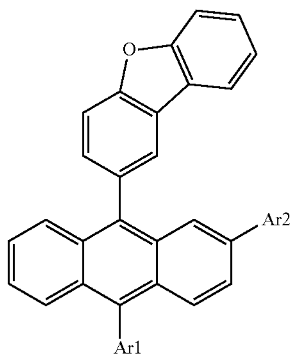 | 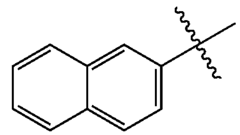 [SMILES: *c1ccc2ccccc2c1] | 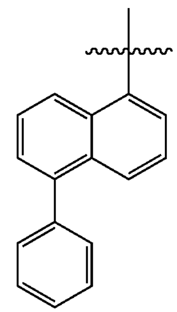 [SMILES: *c1cccc2c(-c3ccccc3)cccc12] |

-continued
| No. | | Ar1 | Ar2 |
|---|---|---|---|
| 18-18 | 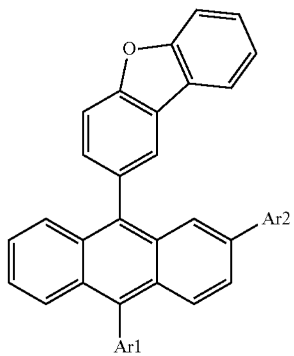 | 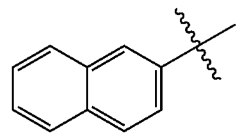 [SMILES: *c1ccc2ccccc2c1] | 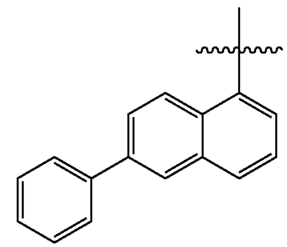 [SMILES: *c1cccc2cc(-c3ccccc3)ccc12] |
| 18-19 | 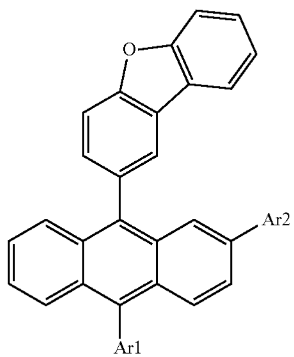 | 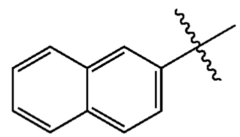 [SMILES: *c1ccc2ccccc2c1] | 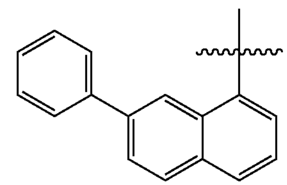 [SMILES: *c1cccc2ccc(-c3ccccc3)cc12] |

-continued
| No. | | Ar1 | Ar2 |
|---|---|---|---|
| 18-20 | 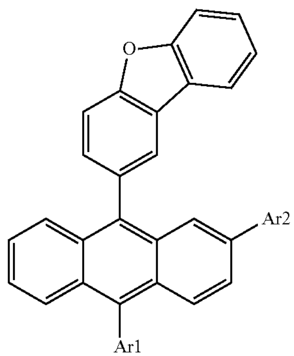 | 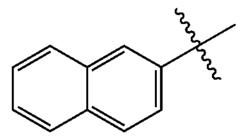 [SMILES: *c1ccc2ccccc2c1] | 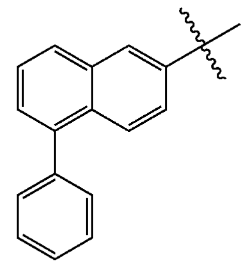 [SMILES: *c1ccc2c(-c3ccccc3)cccc2c1] |
| 18-21 | 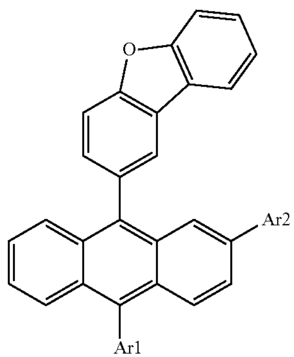 | 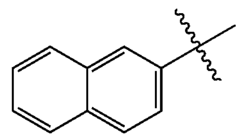 [SMILES: *c1ccc2ccccc2c1] | 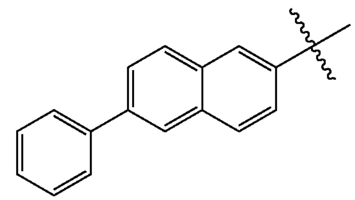 [SMILES: *c1ccc2cc(-c3ccccc3)ccc2c1] |

-continued
| No. | | Ar1 | Ar2 |
|---|---|---|---|
| 18-22 | 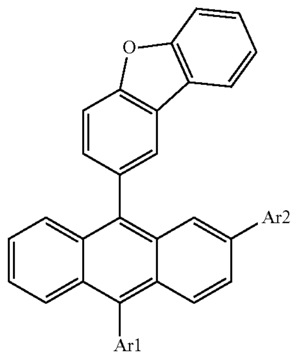 | 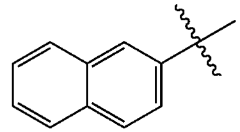 [SMILES: *c1ccc2ccccc2c1] | 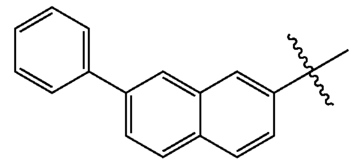 [SMILES: *c1ccc2ccc(-c3ccccc3)cc2c1] |
| 18-23 | 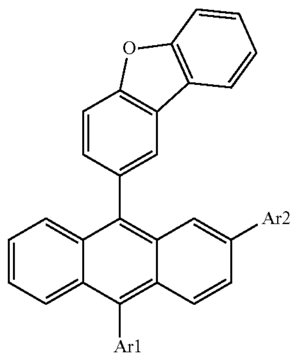 | 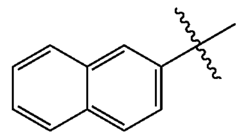 [SMILES: *c1ccc2ccccc2c1] | 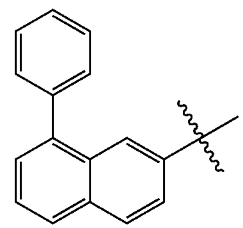 [SMILES: *c1ccc2cccc(-c3ccccc3)c2c1] |

-continued
| No. | | Ar1 | Ar2 |
|---|---|---|---|
| 18-24 | 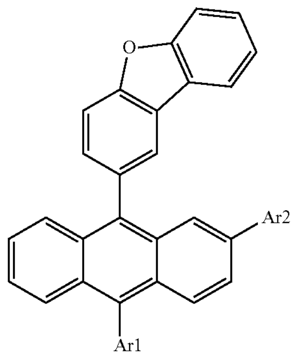 | 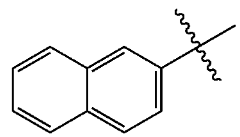 [SMILES: *c1ccc2ccccc2c1] | 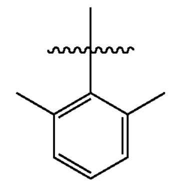 |
| 18-25 | 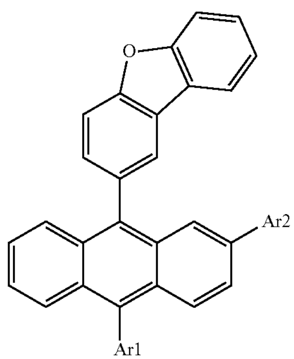 | 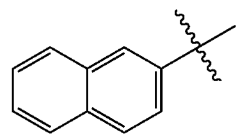 [SMILES: *c1ccc2ccccc2c1] | 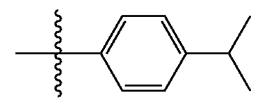 [SMILES: *c1ccc(C(C)C)cc1] |

-continued
| No. | | Ar1 | Ar2 |
|---|---|---|---|
| 18-26 | 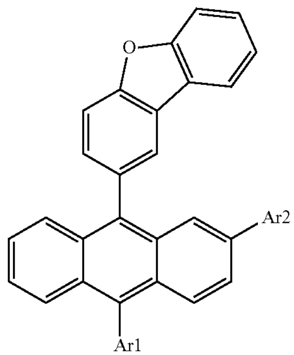  | 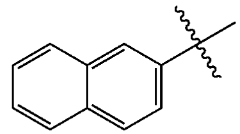 [SMILES: *c1ccc2ccccc2c1] | 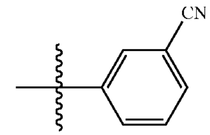  |
| 18-27 | 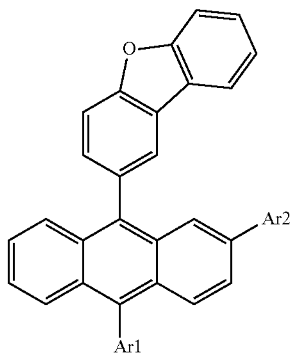  | 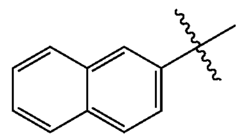 [SMILES: *c1ccc2ccccc2c1] | 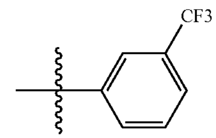 [SMILES: *c1cccc(C(F)(F)F)c1]  |

-continued
| No. | | Ar1 | Ar2 |
|---|---|---|---|
| 18-28 | 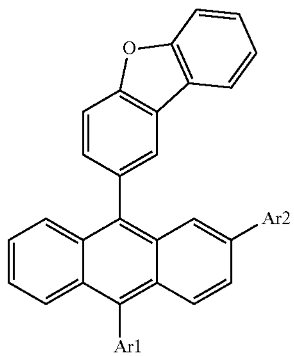 | 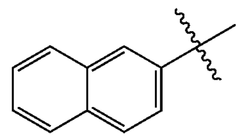 [SMILES: *c1ccc2ccccc2c1] | 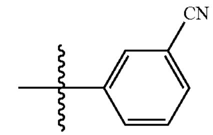 [SMILES: *c1cccc(C#N)c1] |
| 18-29 | 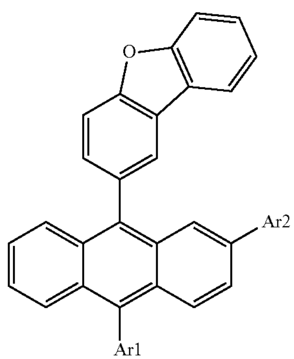 | 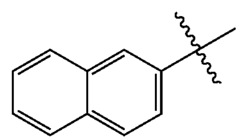 [SMILES: *c1ccc2ccccc2c1] | 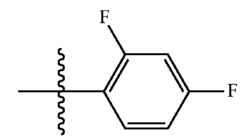 [SMILES: *c1ccc(F)cc1F] |

-continued
| No. | | Ar1 | Ar2 |
|---|---|---|---|
| 19-1 | 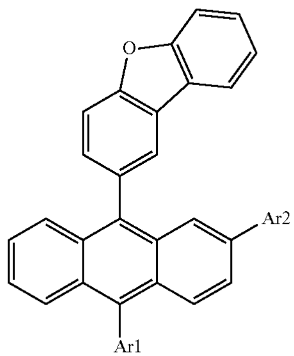 | 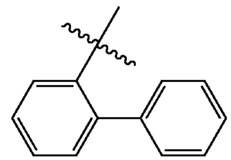 [SMILES: *c1ccccc1-c1ccccc1] | 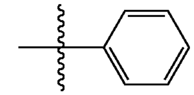 |
| 19-2 | 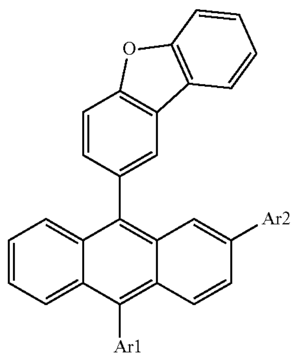 | 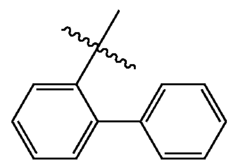 [SMILES: *c1ccccc1-c1ccccc1] | 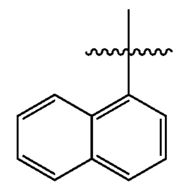 [SMILES: *c1cccc2ccccc12] |

-continued
| No. | | Ar1 | Ar2 |
|---|---|---|---|
| 19-3 | 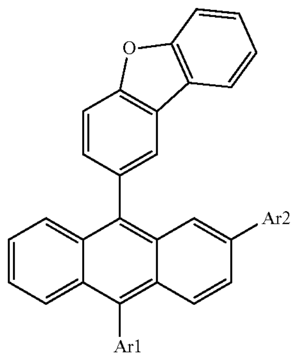 | 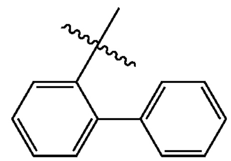 [SMILES: *c1ccccc1-c1ccccc1] | 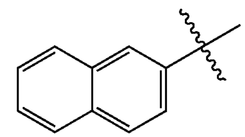 [SMILES: *c1ccc2ccccc2c1] |
| 19-4 | 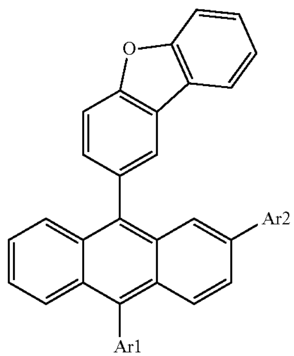 | 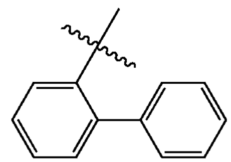 [SMILES: *c1ccccc1-c1ccccc1] | 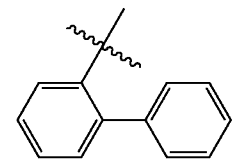 [SMILES: *c1ccccc1-c1ccccc1] |

-continued
| No. | | Ar1 | Ar2 |
|---|---|---|---|
| 19-5 | 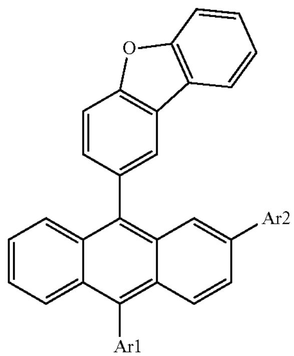 | 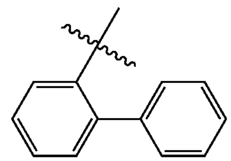 [SMILES: *c1ccccc1-c1ccccc1] | 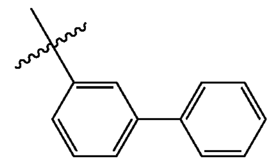 [SMILES: *c1cccc(-c2ccccc2)c1] |
| 19-6 | 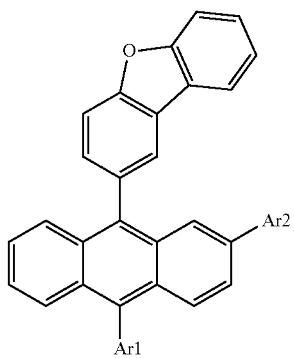 | 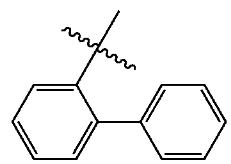 [SMILES: *c1ccccc1-c1ccccc1] | 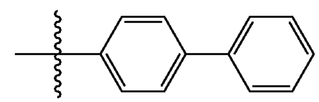 [SMILES: *c1ccc(-c2ccccc2)cc1] |

-continued
| No. | | Ar1 | Ar2 |
|---|---|---|---|
| 19-7 | 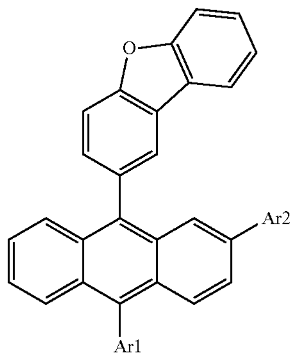 | 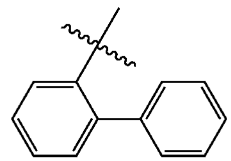 [SMILES: *c1ccccc1-c1ccccc1] | 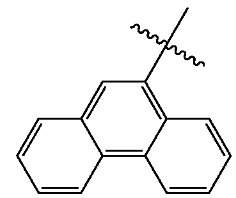 [SMILES: *c1cc2ccccc2c2ccccc12] |
| 19-8 | 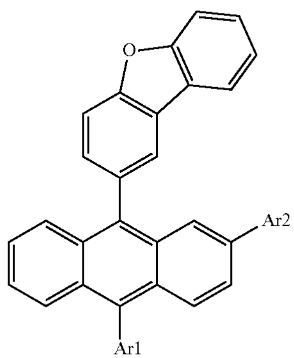 | 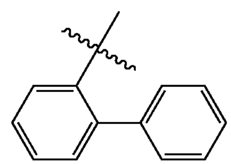 [SMILES: *c1ccccc1-c1ccccc1] | 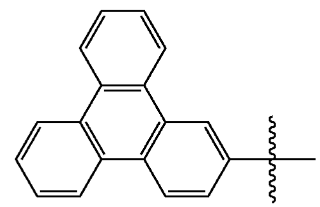 [SMILES: *c1ccc2c3ccccc3c3ccccc3c2c1] |

-continued
| No. | | Ar1 | Ar2 |
| --- | --- | --- | --- |
| 19-9 | 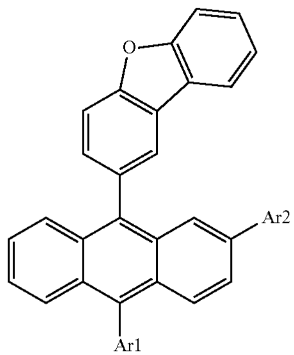 | 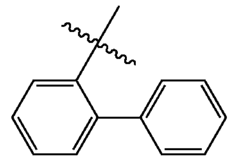 [SMILES: *c1ccccc1-c1ccccc1] | 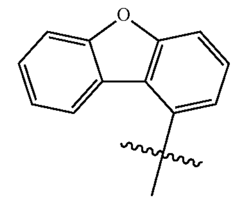 |
| 19-10 | 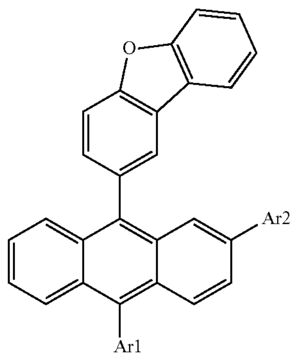 | 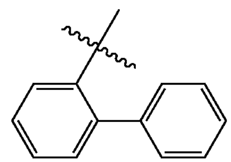 [SMILES: *c1ccccc1-c1ccccc1] | 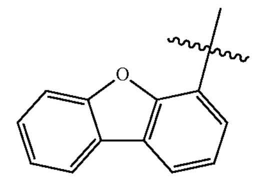 [SMILES: *c1cccc2c1oc1ccccc12] |

-continued
| No. | | Ar1 | Ar2 |
|---|---|---|---|
| 19-11 | 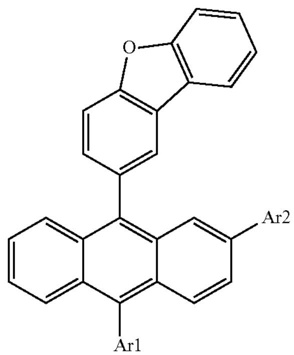 | 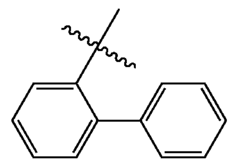 [SMILES: *c1ccccc1-c1ccccc1] | 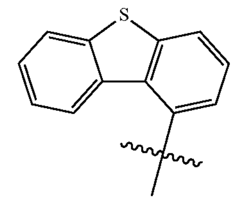 |
| 19-12 | 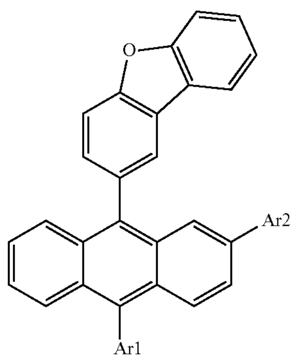 | 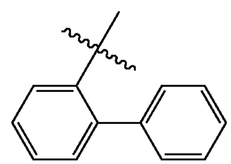 [SMILES: *c1ccccc1-c1ccccc1] | 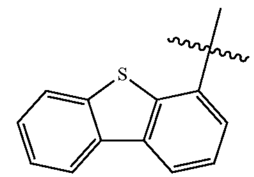 [SMILES: *c1cccc2c1sc1ccccc12] |

-continued
| No. | | Ar1 | Ar2 |
|---|---|---|---|
| 19-13 | 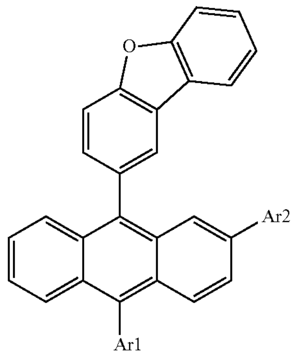 | 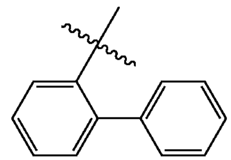 [SMILES: *c1ccccc1-c1ccccc1] | 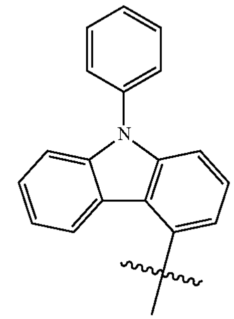 [SMILES: *c1cccc2c1c1ccccc1n2-c1ccccc1] |
| 19-14 | 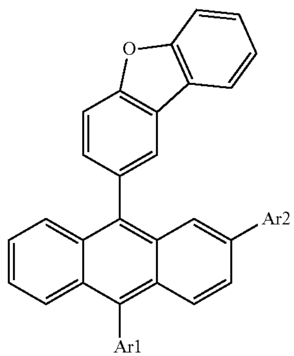 | 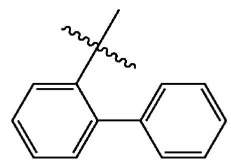 [SMILES: *c1ccccc1-c1ccccc1] | 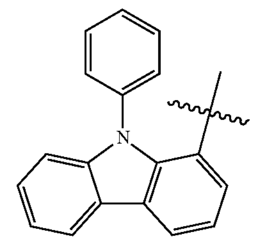 [SMILES: *c1cccc2c3ccccc3n(-c3ccccc3)c12] |

-continued
| No. | | Ar1 | Ar2 |
|---|---|---|---|
| 19-15 | 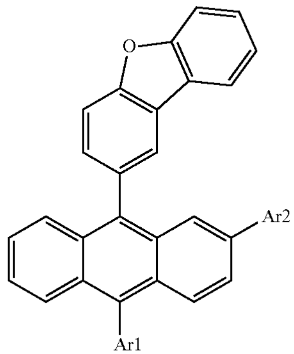 | 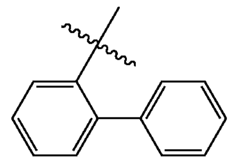 [SMILES: *c1ccccc1-c1ccccc1] | 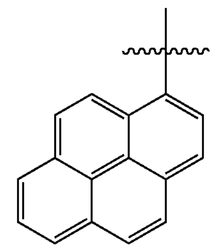 [SMILES: *c1ccc2ccc3cccc4ccc1c2c34] |
| 19-16 | 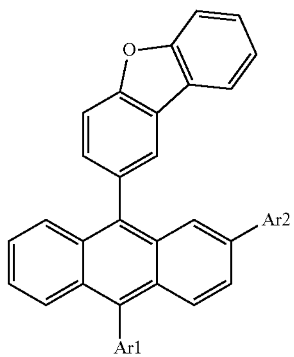 | 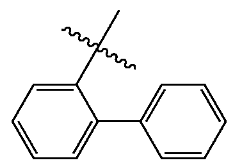 [SMILES: *c1ccccc1-c1ccccc1] | 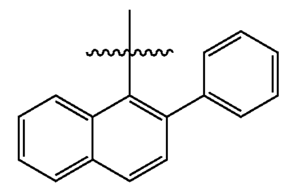 [SMILES: *c1c(-c2ccccc2)ccc2ccccc12] |

-continued
| No. | | Ar1 | Ar2 |
|---|---|---|---|
| 19-17 | 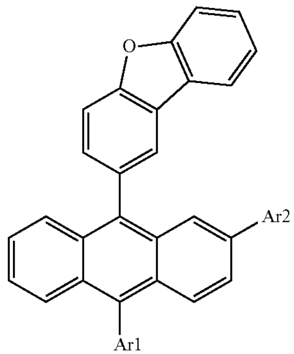 | 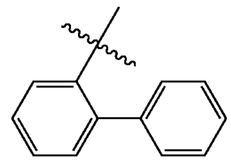 [SMILES: *c1ccccc1-c1ccccc1] | 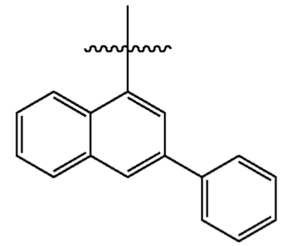 [SMILES: *c1cc(-c2ccccc2)cc2ccccc12] |
| 19-18 | 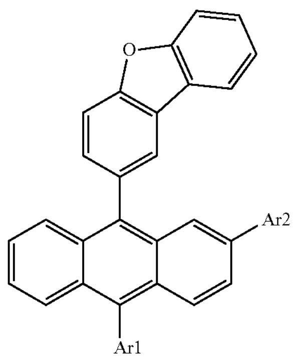 | 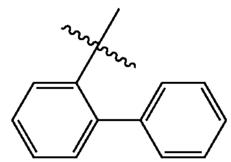 [SMILES: *c1ccccc1-c1ccccc1] | 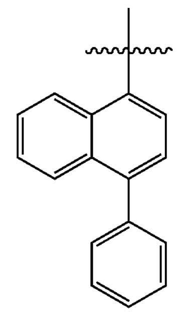 [SMILES: *c1ccc(-c2ccccc2)c2ccccc12] |
| 19-19 | 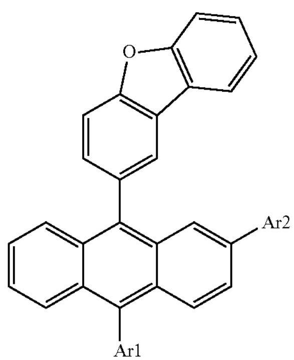 | 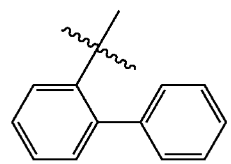 [SMILES: *c1ccccc1-c1ccccc1] | 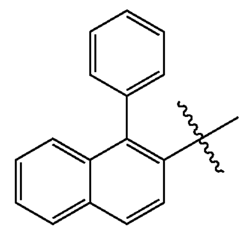 [SMILES: *c1ccc2ccccc2c1-c1ccccc1] |

-continued
| No. | | Ar1 | Ar2 |
|---|---|---|---|
| 19-20 | 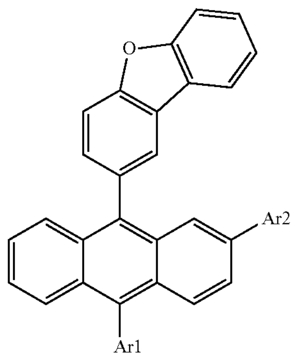 | 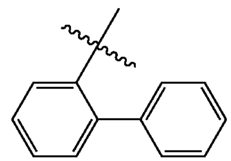 [SMILES: *c1ccccc1-c1ccccc1] | 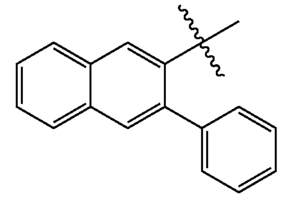 [SMILES: *c1cc2ccccc2cc1-c1ccccc1] |
| 19-21 | 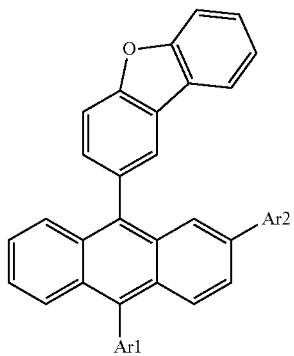 | 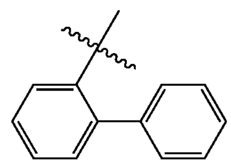 [SMILES: *c1ccccc1-c1ccccc1] | 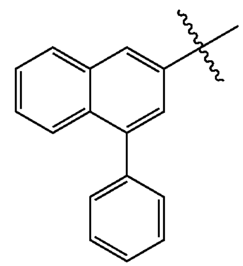 [SMILES: *c1cc(-c2ccccc2)c2ccccc2c1] |

-continued
| No. | | Ar1 | Ar2 |
|---|---|---|---|
| 19-22 | 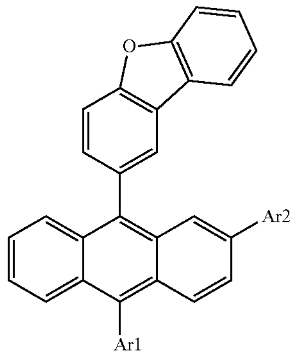  | 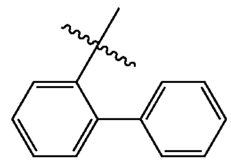 [SMILES: *c1ccccc1-c1ccccc1] | 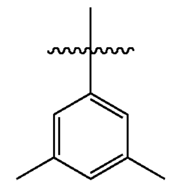 |
| 19-23 | 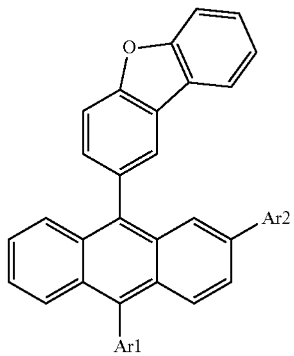  | 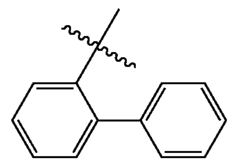 [SMILES: *c1ccccc1-c1ccccc1] | 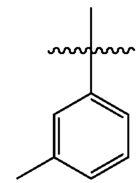 [SMILES: *c1cccc(C)c1] |
| 19-24 | 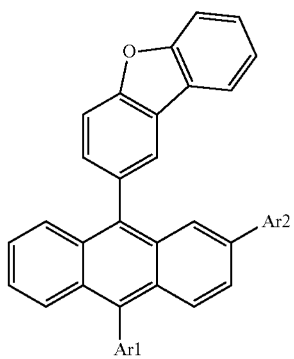  | 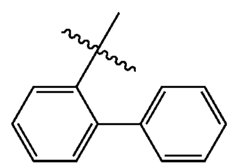 [SMILES: *c1ccccc1-c1ccccc1] | 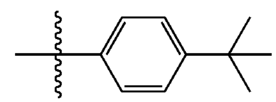 |

-continued
| No. | | Ar1 | Ar2 |
|---|---|---|---|
| 19-25 | 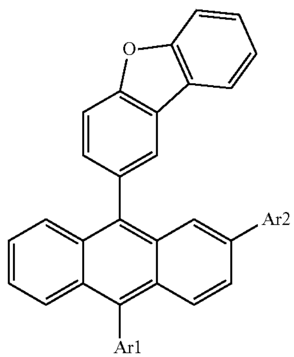 | 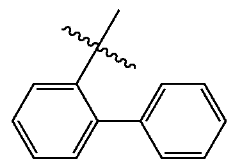 [SMILES: *c1ccccc1-c1ccccc1] | 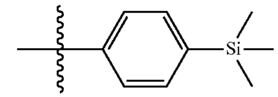 |
| 19-26 | 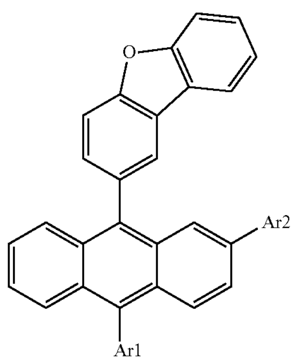 | 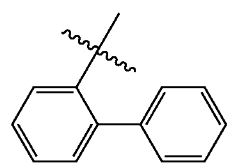 [SMILES: *c1ccccc1-c1ccccc1] | 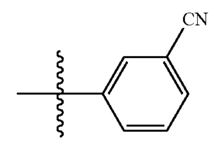 [SMILES: *c1cccc(C#N)c1] |

-continued
| No. | | Ar1 | Ar2 |
|---|---|---|---|
| 19-27 | 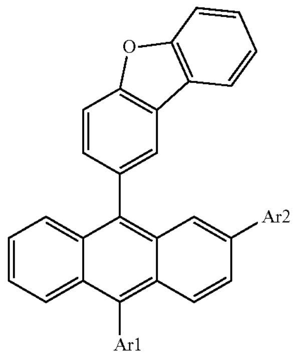 | 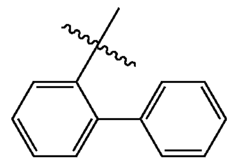 [SMILES: *c1ccccc1-c1ccccc1] | 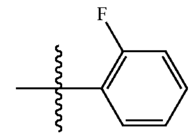 [SMILES: *c1ccccc1F] |
| 19-28 | 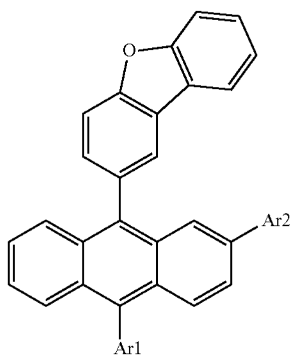 | 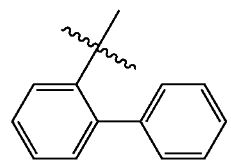 [SMILES: *c1ccccc1-c1ccccc1] | 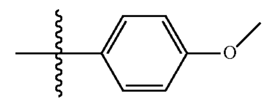 [SMILES: *c1ccc(OC)cc1] |

-continued
| No. | | Ar1 | Ar2 |
|---|---|---|---|
| 20-1 | 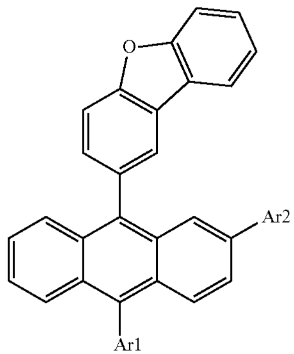 | 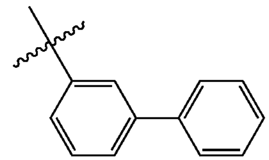 [SMILES: *c1cccc(-c2ccccc2)c1] | 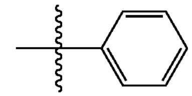 |
| 20-2 | 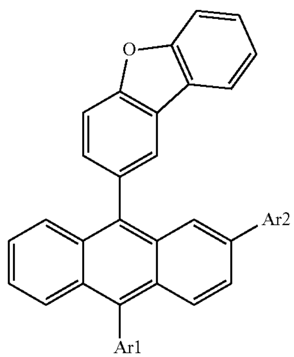 | 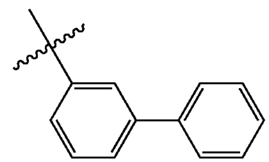 [SMILES: *c1cccc(-c2ccccc2)c1] | 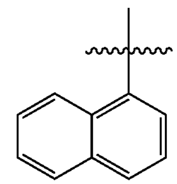 [SMILES: *c1cccc2ccccc12] |

-continued
| No. | | Ar1 | Ar2 |
| --- | --- | --- | --- |
| 20-3 | 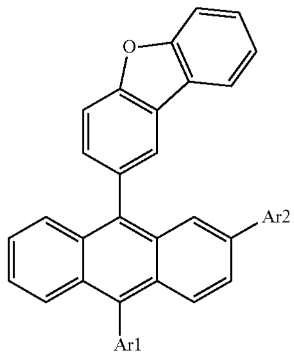 | 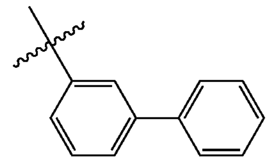 [SMILES: *c1cccc(-c2ccccc2)c1] | 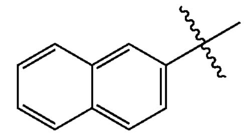 [SMILES: *c1ccc2ccccc2c1] |
| 20-4 | 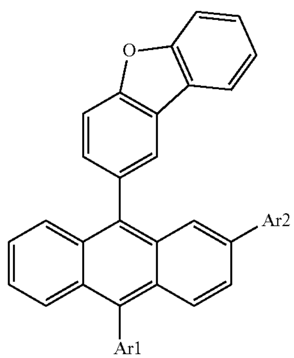 | 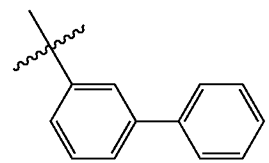 [SMILES: *c1cccc(-c2ccccc2)c1] | 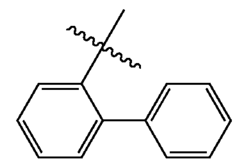 [SMILES: *c1ccccc1-c1ccccc1] |

-continued
| No. | | Ar1 | Ar2 |
|---|---|---|---|
| 20-5 | 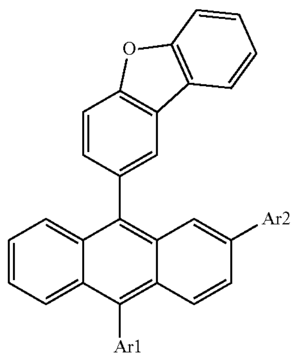 | 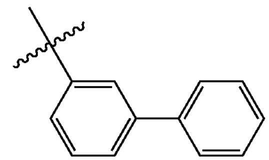 [SMILES: *c1cccc(-c2ccccc2)c1] | 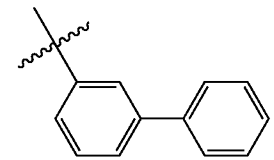 [SMILES: *c1cccc(-c2ccccc2)c1] |
| 20-6 | 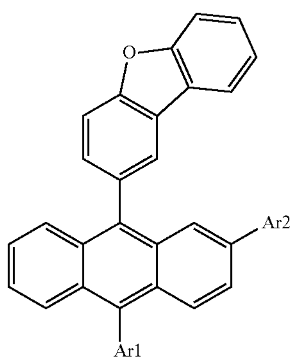 | 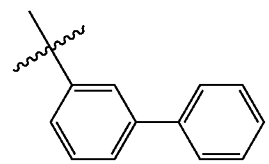 [SMILES: *c1cccc(-c2ccccc2)c1] | 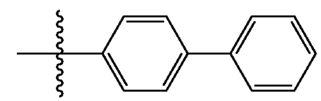 |

-continued
| No. | | Ar1 | Ar2 |
|---|---|---|---|
| 20-7 | 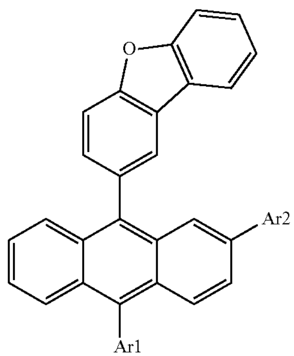 | 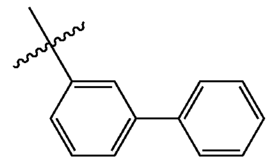 [SMILES: *c1cccc(-c2ccccc2)c1] | 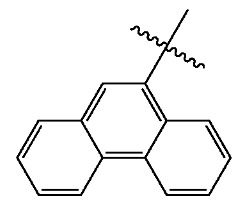 [SMILES: *c1cc2ccccc2c2ccccc12] |
| 20-8 | 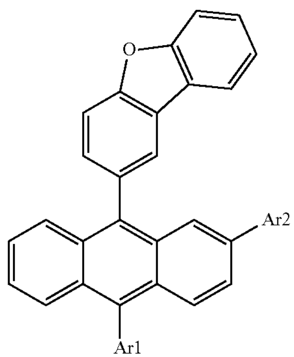 | 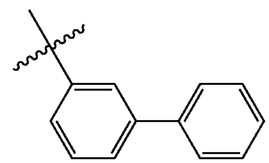 [SMILES: *c1cccc(-c2ccccc2)c1] | 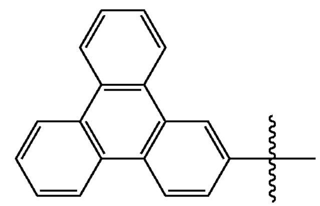 [SMILES: *c1ccc2c3ccccc3c3ccccc3c2c1] |

-continued
| No. | | Ar1 | Ar2 |
|---|---|---|---|
| 20-9 | 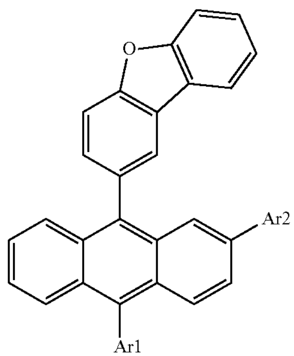 | 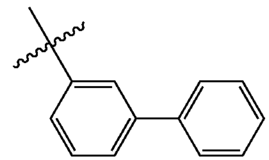 [SMILES: *c1cccc(-c2ccccc2)c1] | 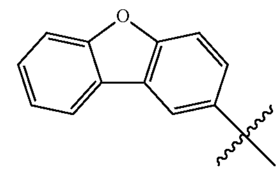 [SMILES: *c1ccc2oc3ccccc3c2c1] |
| 20-10 | 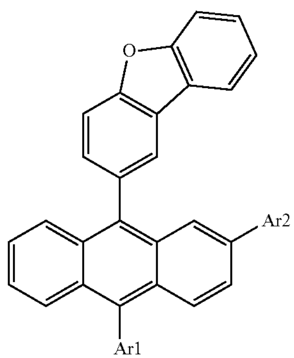 | 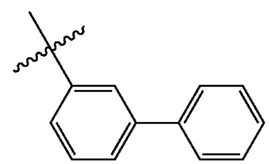 [SMILES: *c1cccc(-c2ccccc2)c1] | 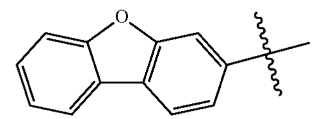 |

-continued
| No. | | Ar1 | Ar2 |
|---|---|---|---|
| 20-11 | 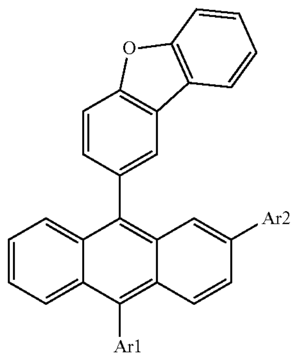 | 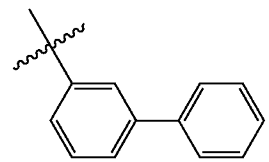 [SMILES: *c1cccc(-c2ccccc2)c1] | 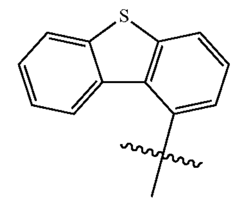 |
| 20-12 | 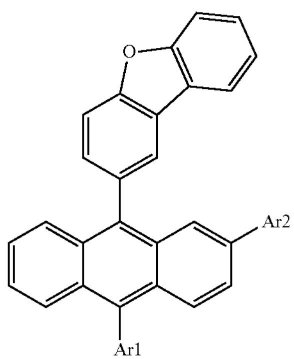 | 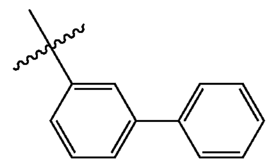 [SMILES: *c1cccc(-c2ccccc2)c1] | 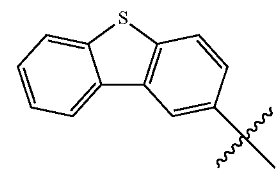 |

-continued
| No. | | Ar1 | Ar2 |
|---|---|---|---|
| 20-13 | 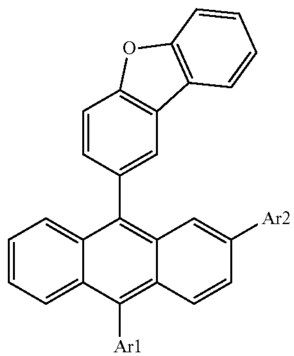 | 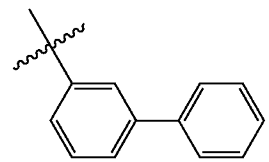 [SMILES: *c1cccc(-c2ccccc2)c1] | 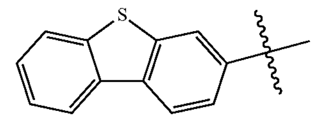 |
| 20-14 | 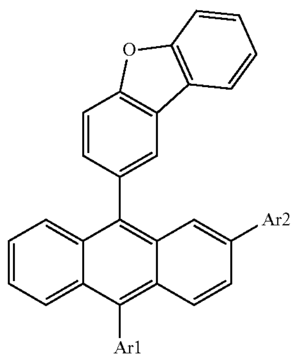 | 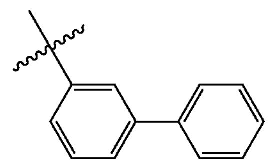 [SMILES: *c1cccc(-c2ccccc2)c1] | 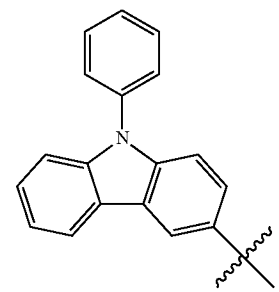 [SMILES: *c1ccc2c(c1)c1ccccc1n2-c1ccccc1] |

-continued
| No. | | Ar1 | Ar2 |
|---|---|---|---|
| 20-15 | 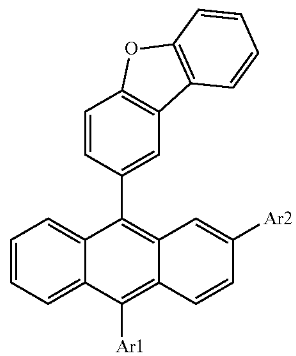 | 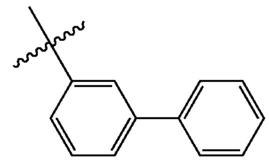 [SMILES: *c1cccc(-c2ccccc2)c1] | 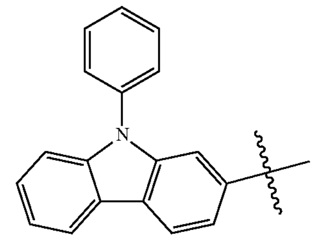 [SMILES: *c1ccc2c3ccccc3n(-c3ccccc3)c2c1] |
| 20-16 | 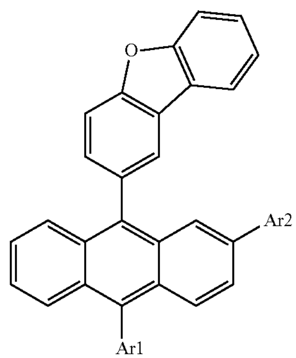 | 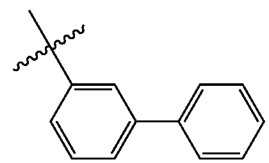 [SMILES: *c1cccc(-c2ccccc2)c1] | 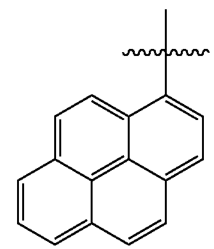 [SMILES: *c1ccc2ccc3cccc4ccc1c2c34] |

-continued
| No. | | Ar1 | Ar2 |
|---|---|---|---|
| 20-17 | 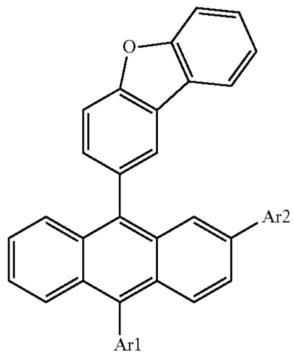 | 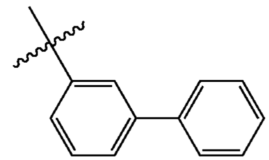 [SMILES: *c1cccc(-c2ccccc2)c1] | 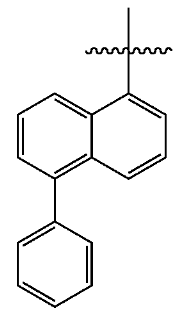 [SMILES: *c1cccc2c(-c3ccccc3)cccc12] |
| 20-18 | 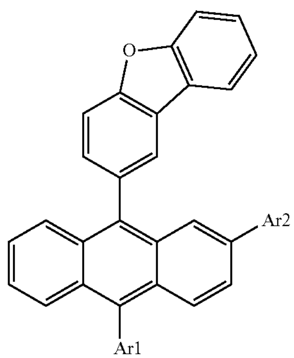 | 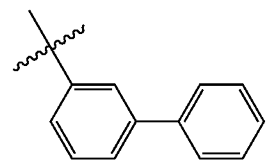 [SMILES: *c1cccc(-c2ccccc2)c1] | 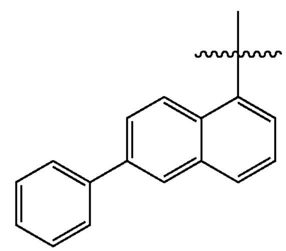 [SMILES: *c1cccc2cc(-c3ccccc3)ccc12] |

-continued
| No. | | Ar1 | Ar2 |
|---|---|---|---|
| 20-19 | 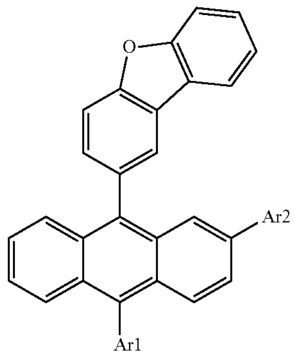 | 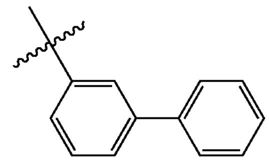 [SMILES: *c1cccc(-c2ccccc2)c1] | 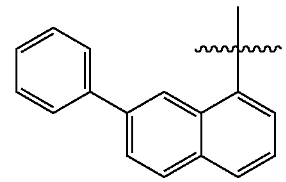 [SMILES: *c1cccc2ccc(-c3ccccc3)cc12] |
| 20-20 | 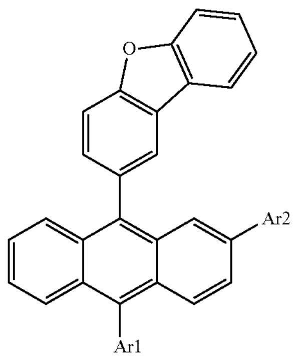 | 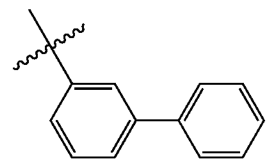 [SMILES: *c1cccc(-c2ccccc2)c1] | 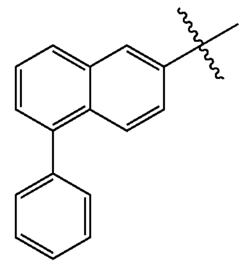 [SMILES: *c1ccc2c(-c3ccccc3)cccc2c1] |

-continued
| No. | | Ar1 | Ar2 |
| --- | --- | --- | --- |
| 20-21 | 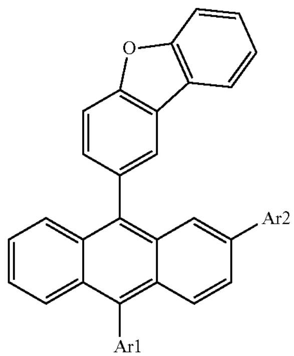 | 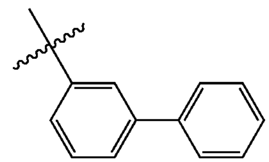 [SMILES: *c1cccc(-c2ccccc2)c1] | 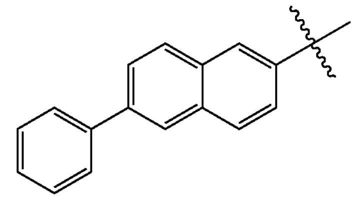 [SMILES: *c1ccc2cc(-c3ccccc3)ccc2c1] |
| 20-22 | 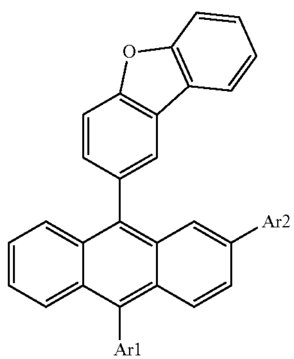 | 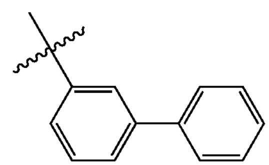 [SMILES: *c1cccc(-c2ccccc2)c1] | 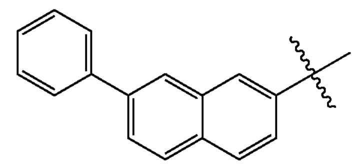 [SMILES: *c1ccc2ccc(-c3ccccc3)cc2c1] |

-continued
| No. | | Ar1 | Ar2 |
| --- | --- | --- | --- |
| 20-23 | 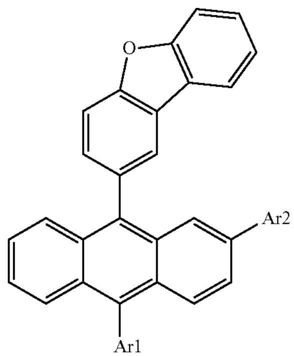 | 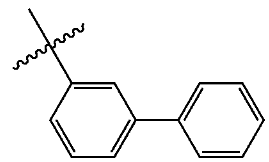 [SMILES: *c1cccc(-c2ccccc2)c1] | 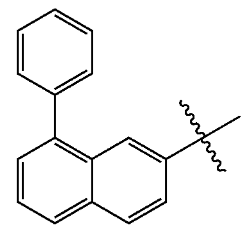 [SMILES: *c1ccc2cccc(-c3ccccc3)c2c1] |
| 20-24 | 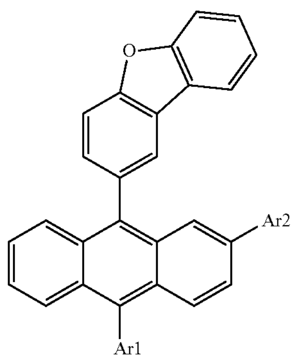 | 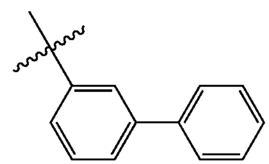 [SMILES: *c1cccc(-c2ccccc2)c1] | 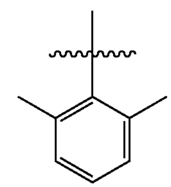 |

-continued
| No. | | Ar1 | Ar2 |
|---|---|---|---|
| 20-25 | 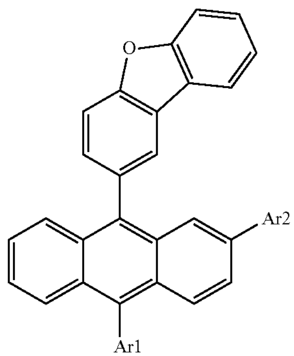 | 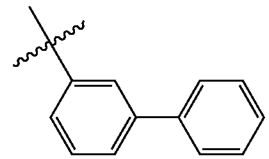 [SMILES: *c1cccc(-c2ccccc2)c1] | 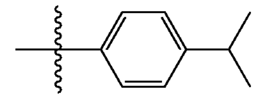 [SMILES: *c1ccc(C(C)C)cc1] |
| 20-26 | 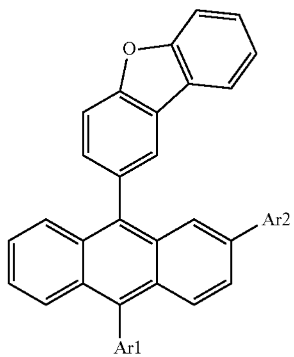 | 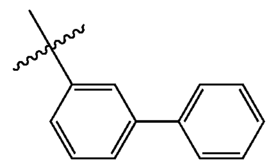 [SMILES: *c1cccc(-c2ccccc2)c1] | 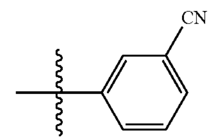 [SMILES: *c1cccc(C#N)c1] |

-continued
| No. | | Ar1 | Ar2 |
|---|---|---|---|
| 20-27 | 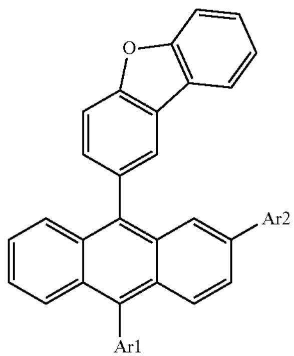 | 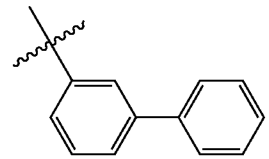 [SMILES: *c1cccc(-c2ccccc2)c1] | 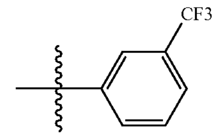 [SMILES: *c1cccc(C(F)(F)F)c1] |
| 20-28 | 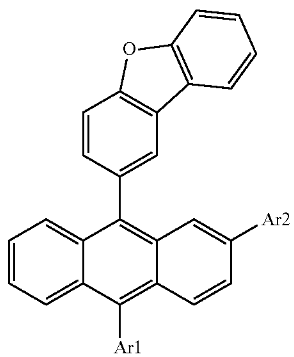 | 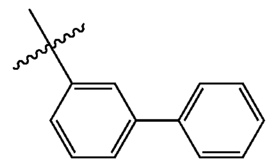 [SMILES: *c1cccc(-c2ccccc2)c1] | 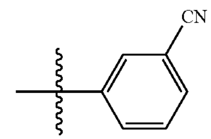 [SMILES: *c1cccc(C#N)c1] |

-continued
| No. | | Ar1 | Ar2 |
|---|---|---|---|
| 20-29 | 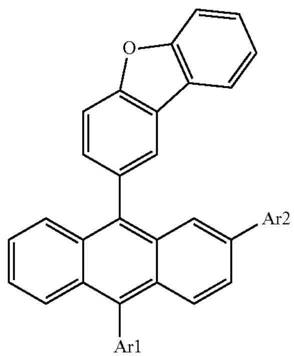 | 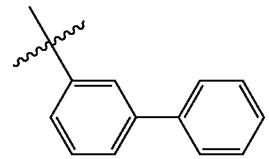 [SMILES: *c1cccc(-c2ccccc2)c1] | 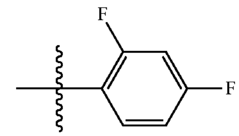 [SMILES: *c1ccc(F)cc1F] |
| 21-1 | 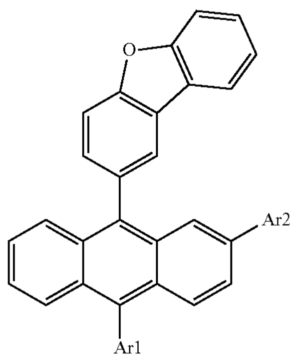 | 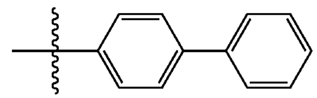 | 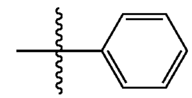 [SMILES: *c1ccccc1] |

-continued
| No. | | Ar1 | Ar2 |
|---|---|---|---|
| 21-2 | 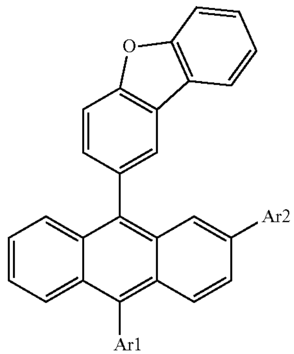 | 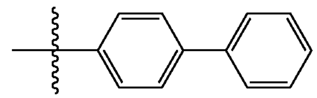 | 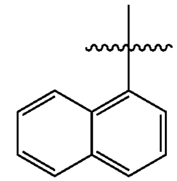 [SMILES: *c1cccc2ccccc12] |
| 21-3 | 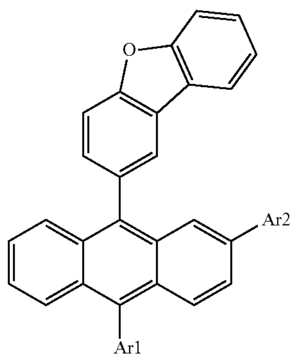 | 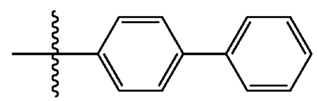 | 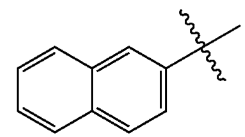 [SMILES: *c1ccc2ccccc2c1] |

-continued
| No. | | Ar1 | Ar2 |
|---|---|---|---|
| 21-4 | 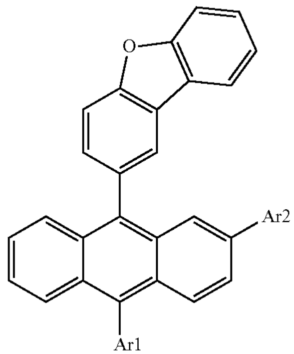 | 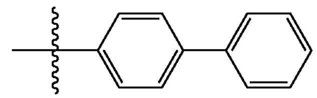 | 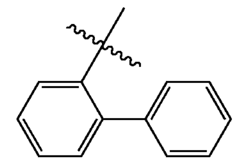 [SMILES: *c1ccccc1-c1ccccc1] |
| 21-5 | 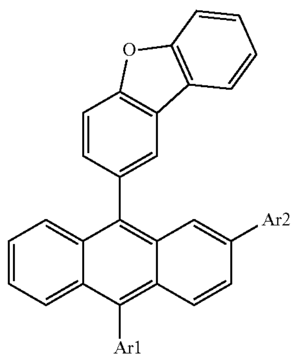 | 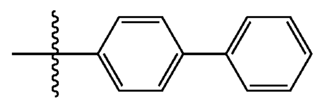 | 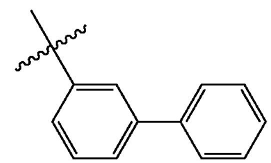 [SMILES: *c1cccc(-c2ccccc2)c1] |

-continued
| No. | | Ar1 | Ar2 |
|---|---|---|---|
| 21-6 | 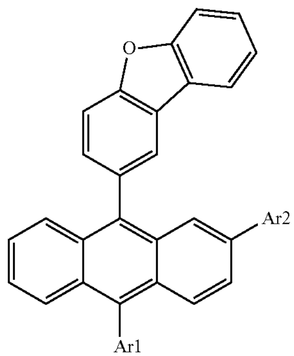 | 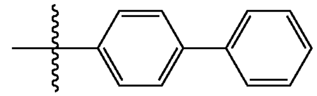 | 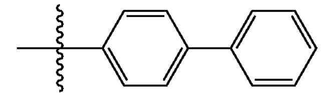 |
| 21-7 | 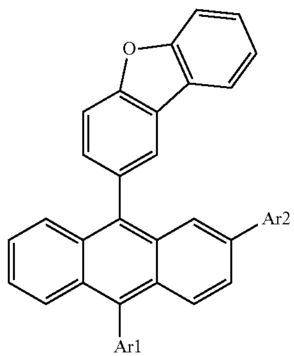 | 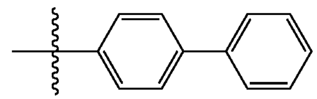 | 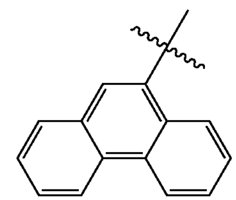 [SMILES: *c1cc2ccccc2c2ccccc12] |

-continued
| No. | | Ar1 | Ar2 |
|---|---|---|---|
| 21-8 | 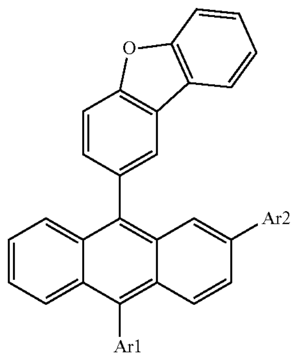 | 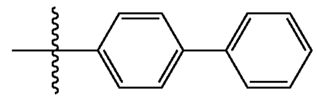 | 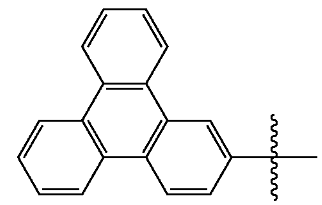 [SMILES: *c1ccc2c3ccccc3c3ccccc3c2c1] |
| 21-9 | 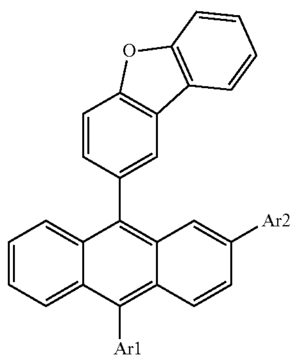 | 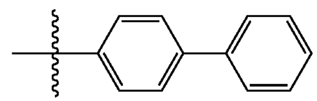 | 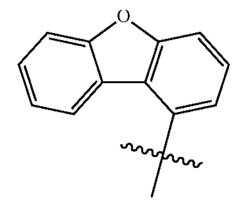 [SMILES: *c1cccc2oc3ccccc3c12] |

-continued
| No. | | Ar1 | Ar2 |
|---|---|---|---|
| 21-10 | 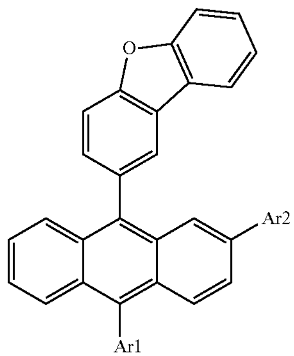 | 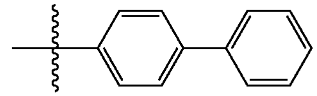 | 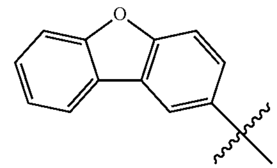 [SMILES: *c1ccc2oc3ccccc3c2c1] |
| 21-11 | 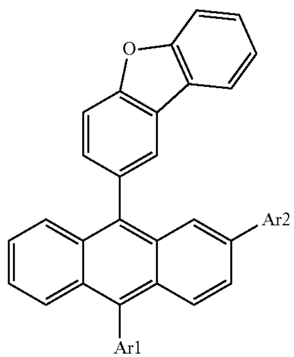 | 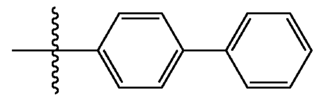 | 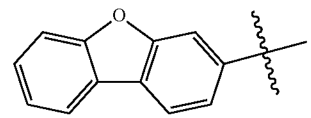 |

-continued
| No. | | Ar1 | Ar2 |
|---|---|---|---|
| 21-12 | 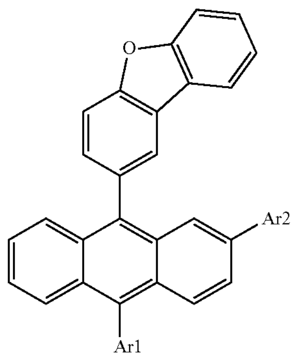 | 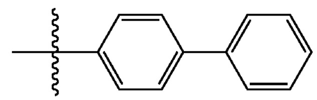 | 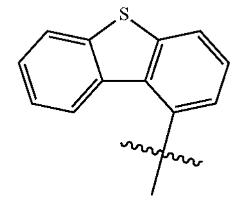 [SMILES: *c1cccc2sc3ccccc3c12] |
| 21-13 | 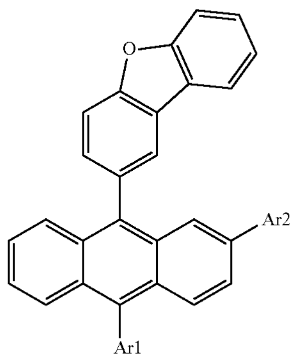 | 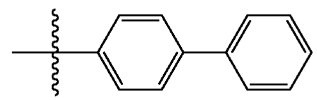 | 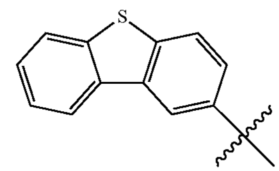 [SMILES: *c1ccc2sc3ccccc3c2c1] |

-continued
| No. | | Ar1 | Ar2 |
|---|---|---|---|
| 21-14 | 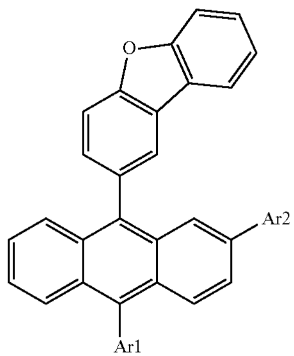 | 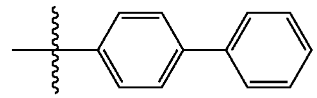 | 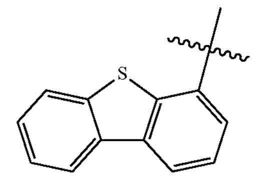 [SMILES: *c1cccc2c1sc1ccccc12] |
| 21-15 | 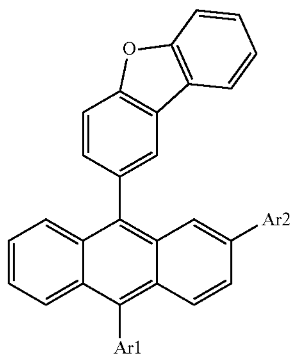 | 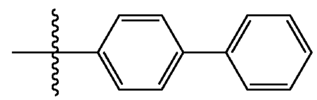 | 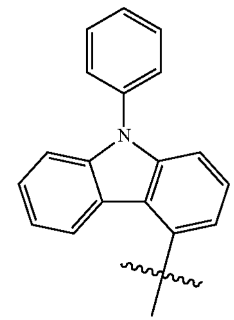 [SMILES: *c1cccc2c1c1ccccc1n2-c1ccccc1] |

-continued
| No. | | Ar1 | Ar2 |
|---|---|---|---|
| 21-16 | 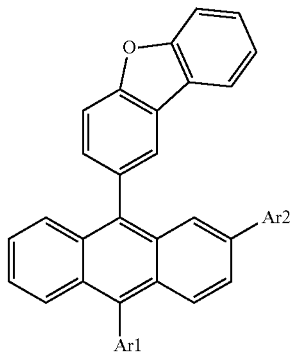 | 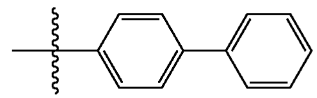 [SMILES: *c1ccc(-c2ccccc2)cc1] | 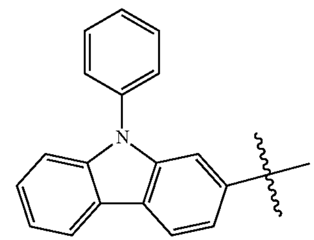 [SMILES: *c1ccc2c3ccccc3n(-c3ccccc3)c2c1] |
| 21-17 | 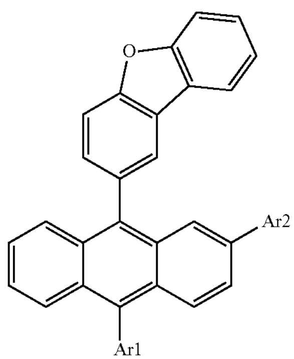 | 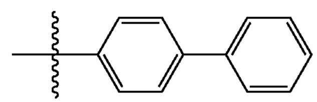 [SMILES: *c1ccc(-c2ccccc2)cc1] | 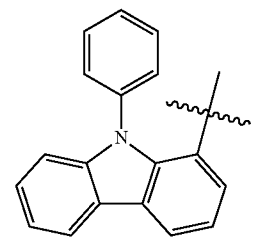 [SMILES: *c1cccc2c3ccccc3n(-c3ccccc3)c12] |

-continued
| No. | | Ar1 | Ar2 |
|---|---|---|---|
| 21-18 | 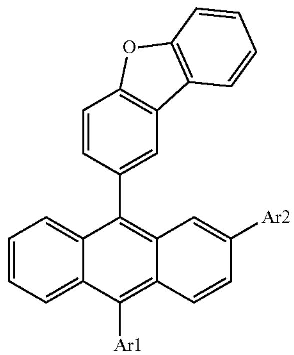 | 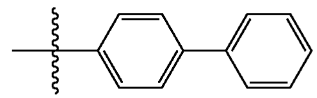 [SMILES: *c1ccc(-c2ccccc2)cc1] | 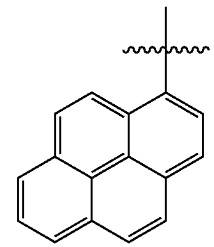 [SMILES: *c1ccc2ccc3cccc4ccc1c2c34] |
| 21-19 | 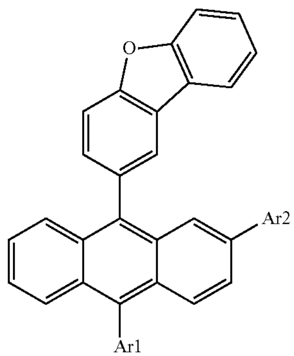 | 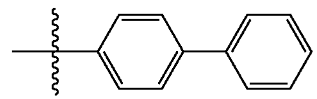 [SMILES: *c1ccc(-c2ccccc2)cc1] | 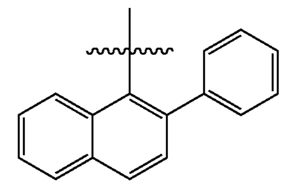 [SMILES: *c1c(-c2ccccc2)ccc2ccccc12] |

-continued
| No. | | Ar1 | Ar2 |
|---|---|---|---|
| 21-20 | 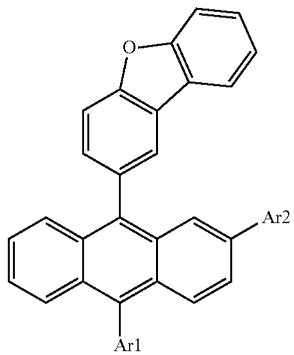 | 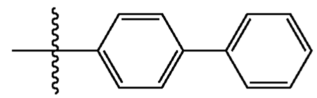 [SMILES: *c1ccc(-c2ccccc2)cc1] | 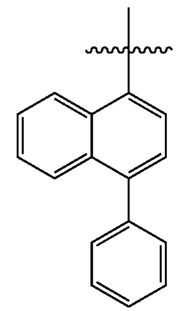 [SMILES: *c1ccc(-c2ccccc2)c2ccccc12] |
| 21-21 | 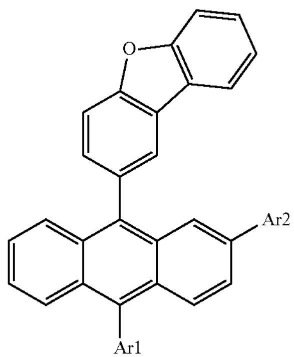 | 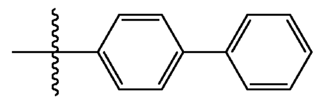 [SMILES: *c1ccc(-c2ccccc2)cc1] | 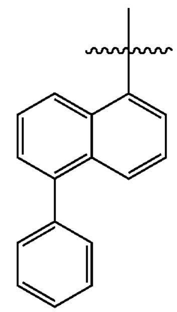 [SMILES: *c1cccc2c(-c3ccccc3)cccc12] |

-continued
| No. | | Ar1 | Ar2 |
| --- | --- | --- | --- |
| 21-22 | 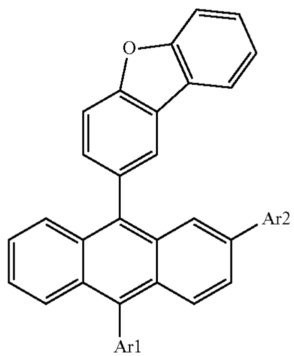 | 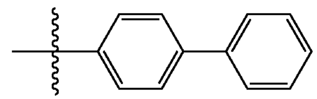 [SMILES: *c1ccc(-c2ccccc2)cc1] | 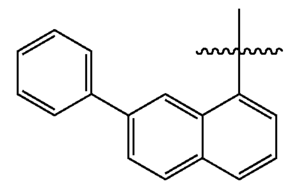 [SMILES: *c1cccc2ccc(-c3ccccc3)cc12] |
| 21-23 | 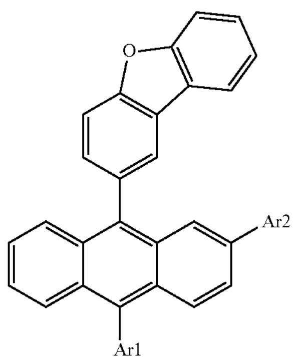 | 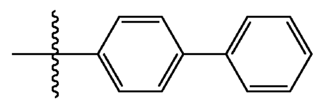 [SMILES: *c1ccc(-c2ccccc2)cc1] | 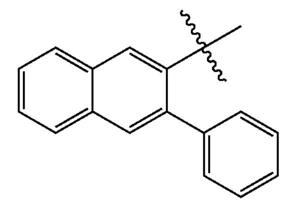 [SMILES: *c1cc2ccccc2cc1-c1ccccc1] |

-continued
| No. | | Ar1 | Ar2 |
|---|---|---|---|
| 21-24 | 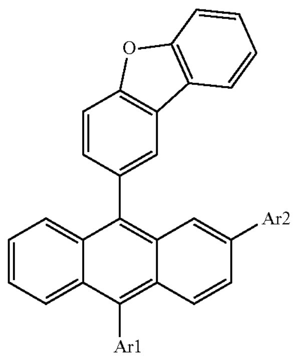 | 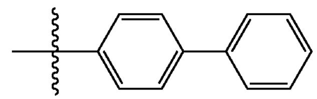 [SMILES: *c1ccc(-c2ccccc2)cc1] | 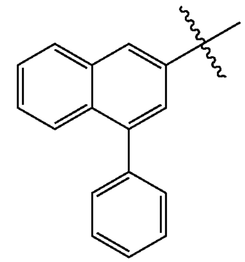 [SMILES: *c1cc(-c2ccccc2)c2ccccc2c1] |
| 21-25 | 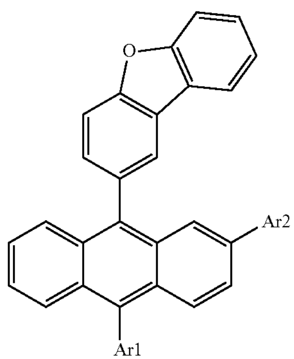 | 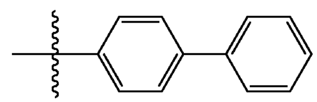 [SMILES: *c1ccc(-c2ccccc2)cc1] | 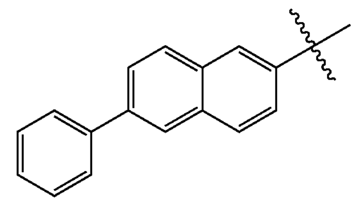 [SMILES: *c1ccc2cc(-c3ccccc3)ccc2c1] |

-continued
| No. | | Ar1 | Ar2 |
|---|---|---|---|
| 21-26 | 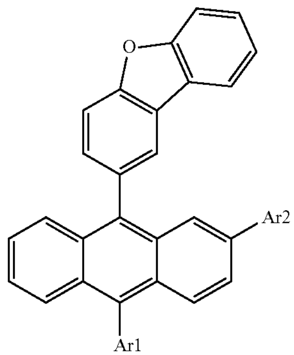 | 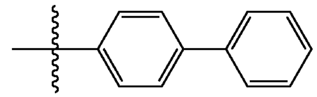 [SMILES: *c1ccc(-c2ccccc2)cc1] | 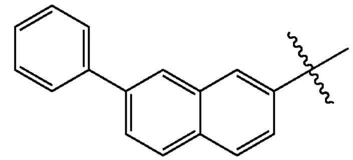 [SMILES: *c1ccc2ccc(-c3ccccc3)cc2c1] |
| 21-27 | 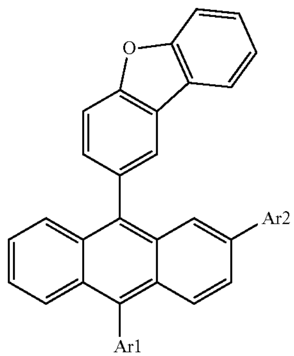 | 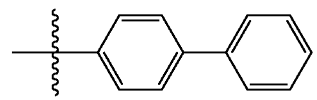 | 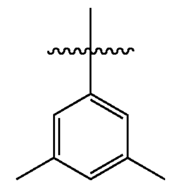 |

-continued
| No. | | Ar1 | Ar2 |
|---|---|---|---|
| 21-28 | 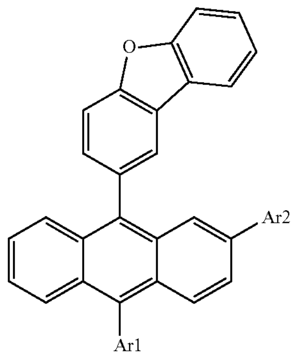 | 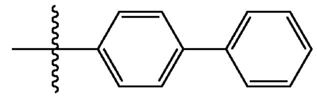 [SMILES: *c1ccc(-c2ccccc2)cc1] | 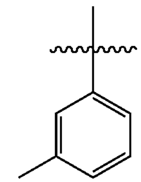 [SMILES: *c1cccc(C)c1] |
| 21-29 | 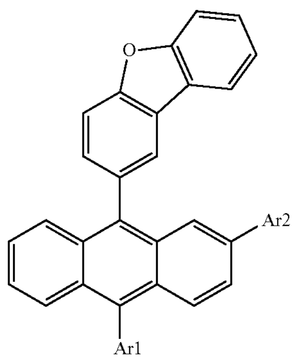 | 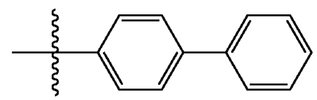 | 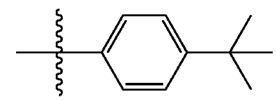 |

-continued
| No. | | Ar1 | Ar2 |
|---|---|---|---|
| 21-30 | 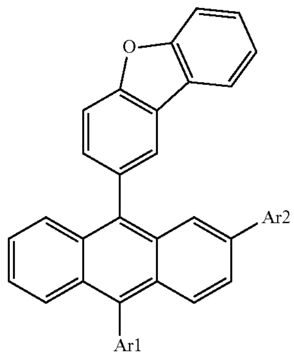 | 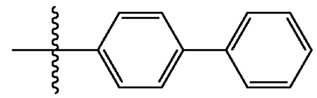 [SMILES: *c1ccc(-c2ccccc2)cc1] | 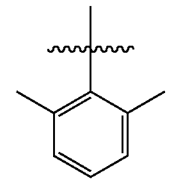 |
| 21-31 | 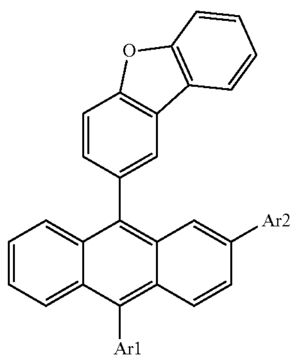 | 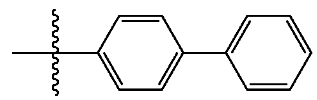 [SMILES: *c1ccc(-c2ccccc2)cc1] | 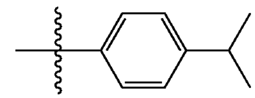 [SMILES: *c1ccc(C(C)C)cc1] |

-continued
| No. | | Ar1 | Ar2 |
|---|---|---|---|
| 22-1 | 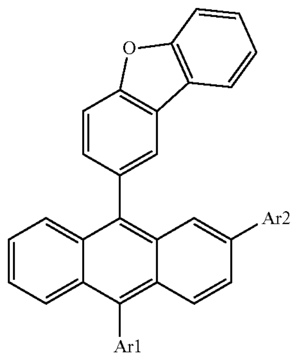 | 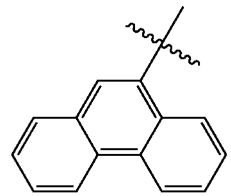 [SMILES: *c1cc2ccccc2c2ccccc12] | 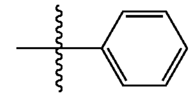 |
| 22-2 | 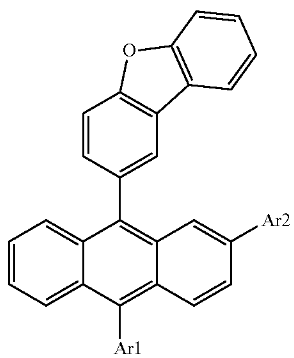 | 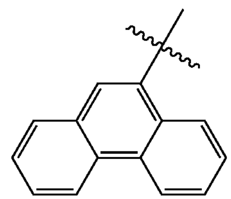 [SMILES: *c1cc2ccccc2c2ccccc12] | 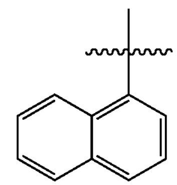 [SMILES: *c1cccc2ccccc12] |

-continued
| No. | | Ar1 | Ar2 |
|---|---|---|---|
| 22-3 | 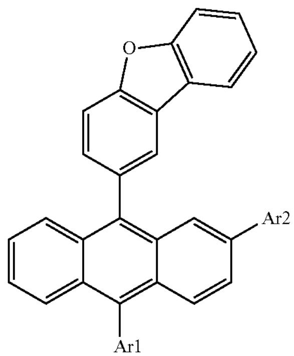 | 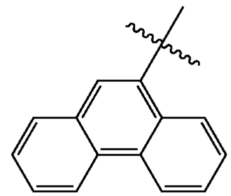 [SMILES: *c1cc2ccccc2c2ccccc12] | 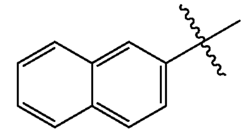 [SMILES: *c1ccc2ccccc2c1] |
| 22-4 | 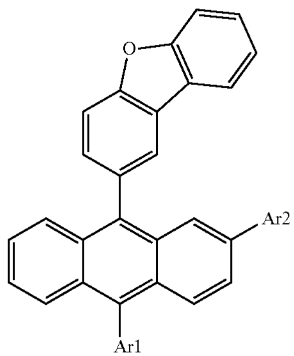 | 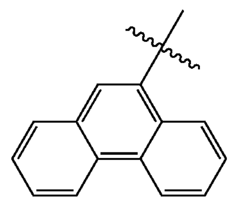 [SMILES: *c1cc2ccccc2c2ccccc12] | 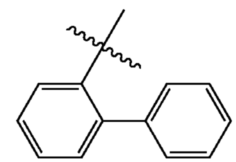 [SMILES: *c1ccccc1-c1ccccc1] |
| 22-5 | 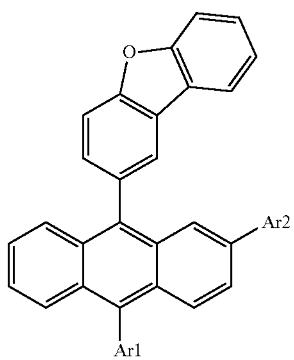 | 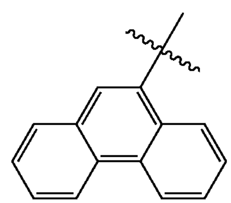 [SMILES: *c1cc2ccccc2c2ccccc12] | 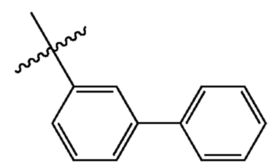 [SMILES: *c1cccc(-c2ccccc2)c1] |

-continued
| No. | | Ar1 | Ar2 |
| --- | --- | --- | --- |
| 22-6 | 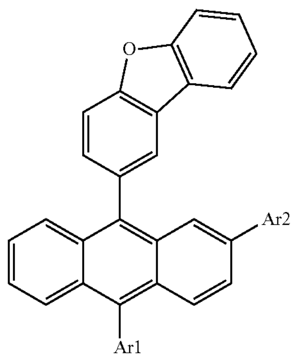 | 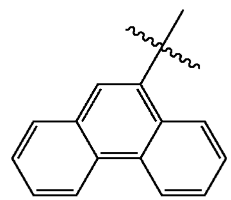 [SMILES: *c1cc2ccccc2c2ccccc12] | 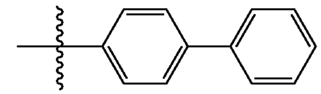 |
| 22-7 | 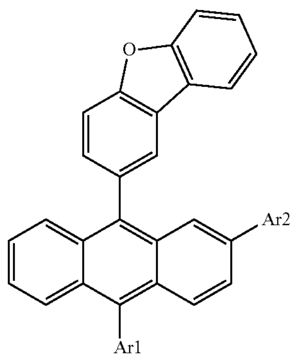 | 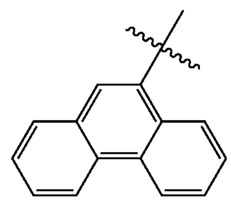 [SMILES: *c1cc2ccccc2c2ccccc12] | 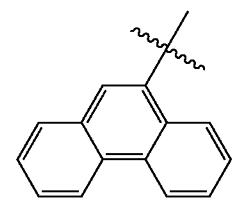 [SMILES: *c1cc2ccccc2c2ccccc12] |

-continued
| No. | | Ar1 | Ar2 |
|---|---|---|---|
| 22-8 | 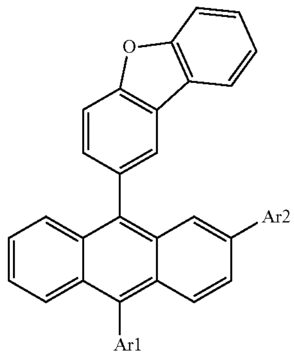 | 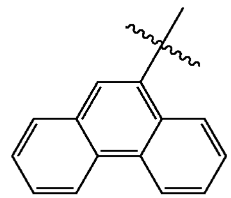 [SMILES: *c1cc2ccccc2c2ccccc12] | 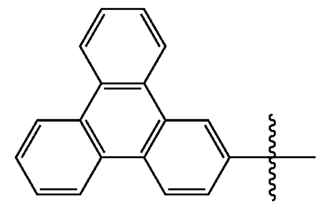 [SMILES: *c1ccc2c3ccccc3c3ccccc3c2c1] |
| 22-9 | 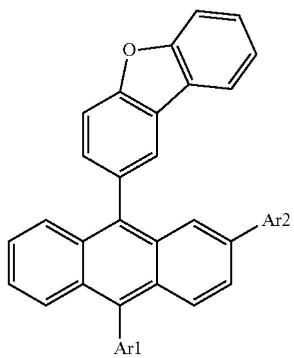 | 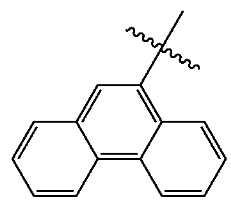 [SMILES: *c1cc2ccccc2c2ccccc12] | 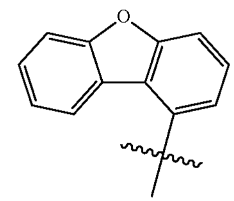 |
| 22-10 | 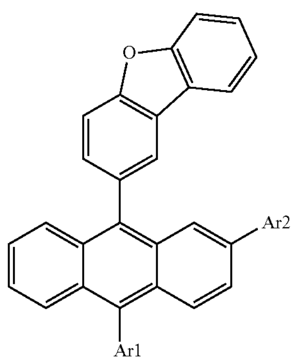 | 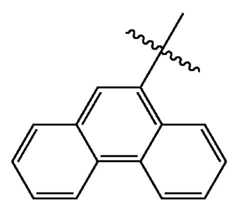 [SMILES: *c1cc2ccccc2c2ccccc12] | 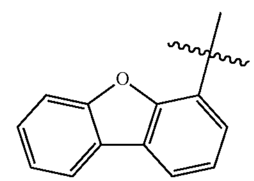 [SMILES: *c1cccc2c1oc1ccccc12] |

-continued
| No. | | Ar1 | Ar2 |
|---|---|---|---|
| 22-11 | 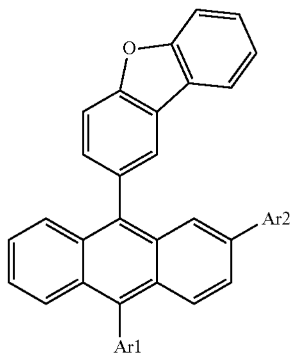 | 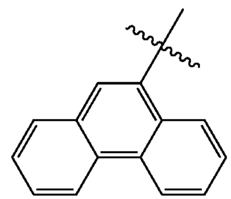 [SMILES: *c1cc2ccccc2c2ccccc12] | 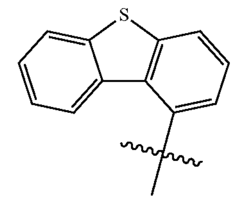 |
| 22-12 | 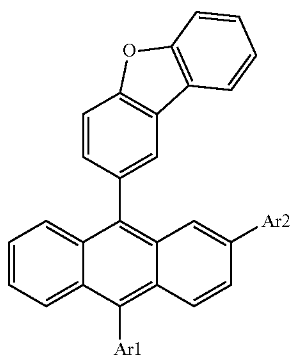 | 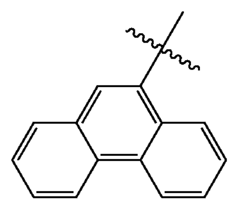 [SMILES: *c1cc2ccccc2c2ccccc12] | 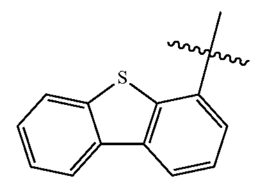 |

-continued
| No. | | Ar1 | Ar2 |
|---|---|---|---|
| 22-13 | 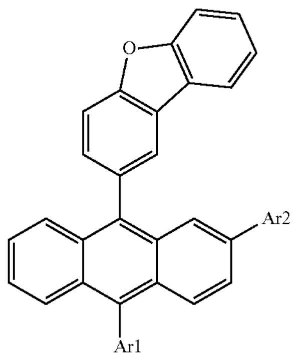 | 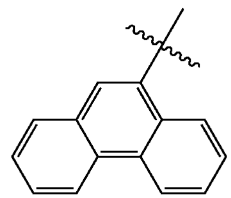 [SMILES: *c1cc2ccccc2c2ccccc12] | 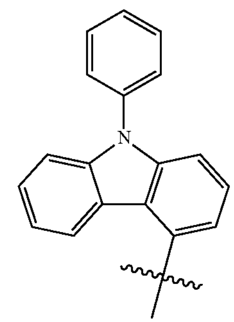 [SMILES: *c1cccc2c1c1ccccc1n2-c1ccccc1] |
| 22-14 | 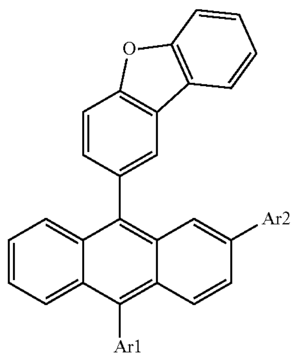 | 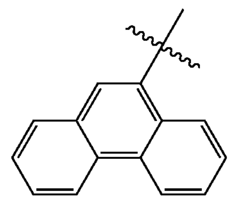 [SMILES: *c1cc2ccccc2c2ccccc12] | 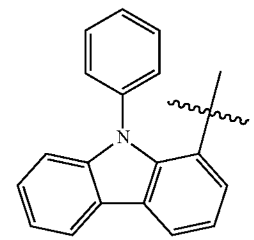 [SMILES: *c1cccc2c3ccccc3n(-c3ccccc3)c12] |

-continued
| No. | | Ar1 | Ar2 |
|---|---|---|---|
| 22-15 | 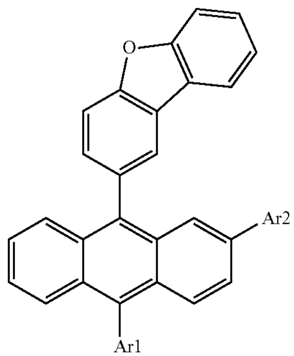 Ar2, Ar1 | 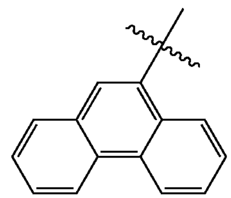 [SMILES: *c1cc2ccccc2c2ccccc12] | 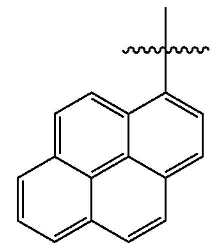 [SMILES: *c1ccc2ccc3cccc4ccc1c2c34] |
| 22-16 | 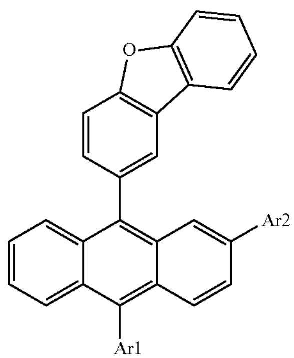 Ar2, Ar1 | 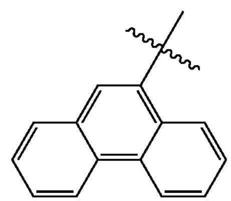 [SMILES: *c1cc2ccccc2c2ccccc12] | 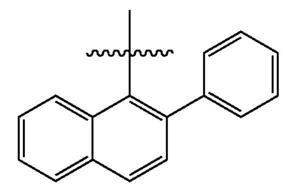 [SMILES: *c1c(-c2ccccc2)ccc2ccccc12] |

-continued
| No. | | Ar1 | Ar2 |
|---|---|---|---|
| 22-17 | 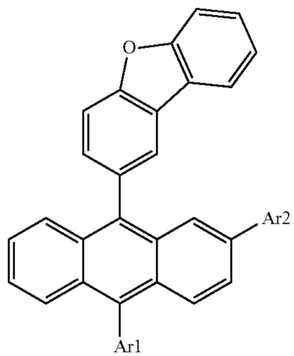 | 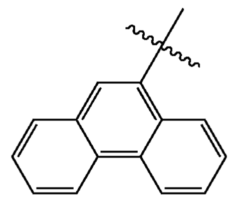 [SMILES: *c1cc2ccccc2c2ccccc12] | 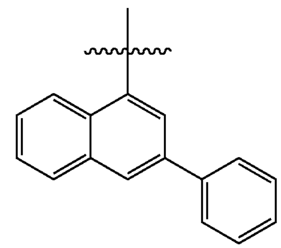 [SMILES: *c1cc(-c2ccccc2)cc2ccccc12] |
| 22-18 | 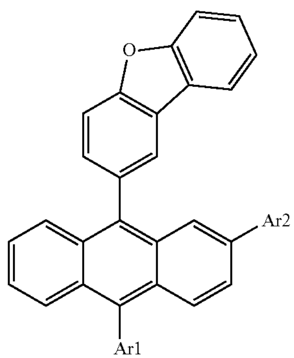 | 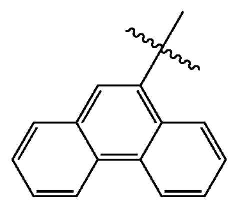 [SMILES: *c1cc2ccccc2c2ccccc12] | 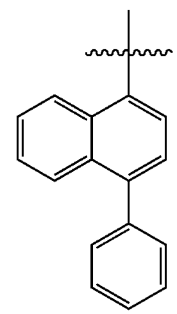 [SMILES: *c1ccc(-c2ccccc2)c2ccccc12] |

-continued
| No. | | Ar1 | Ar2 |
|---|---|---|---|
| 22-19 | 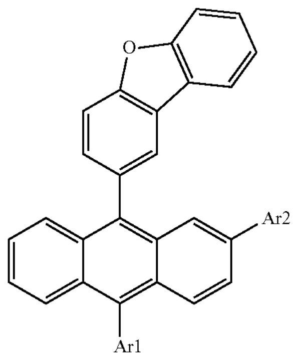 | 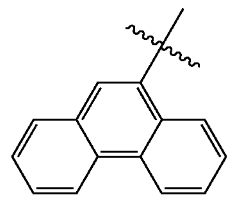 [SMILES: *c1cc2ccccc2c2ccccc12] | 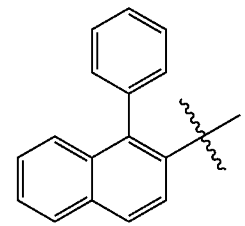 [SMILES: *c1ccc2ccccc2c1-c1ccccc1] |
| 22-20 | 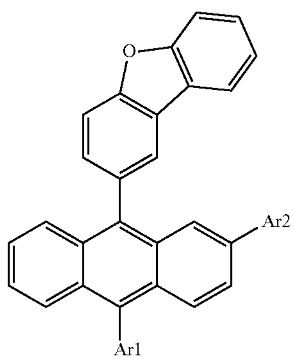 | 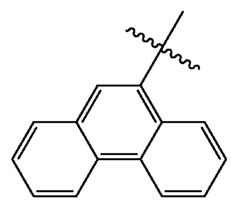 [SMILES: *c1cc2ccccc2c2ccccc12] | 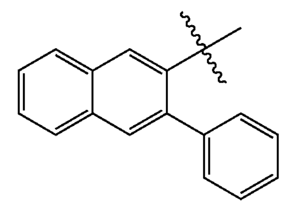 [SMILES: *c1cc2ccccc2cc1-c1ccccc1] |

-continued
| No. | | Ar1 | Ar2 |
|---|---|---|---|
| 22-21 | 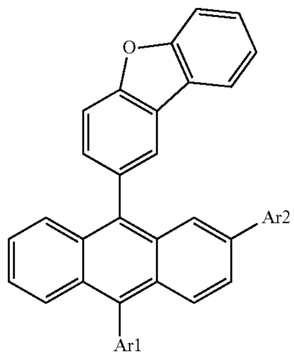 | 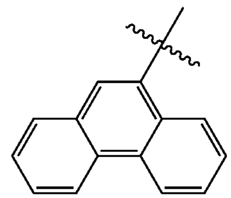 [SMILES: *c1cc2ccccc2c2ccccc12] | 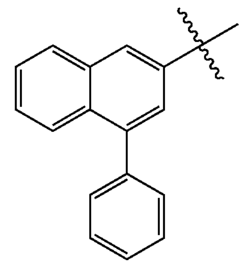 [SMILES: *c1cc(-c2ccccc2)c2ccccc2c1] |
| 22-22 | 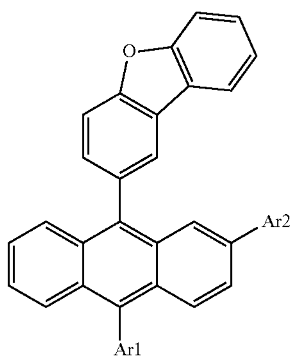 | 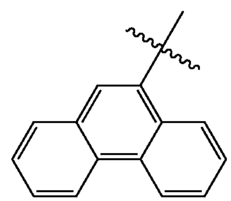 [SMILES: *c1cc2ccccc2c2ccccc12] | 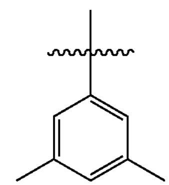 |

-continued
| No. | | Ar1 | Ar2 |
| --- | --- | --- | --- |
| 22-23 | 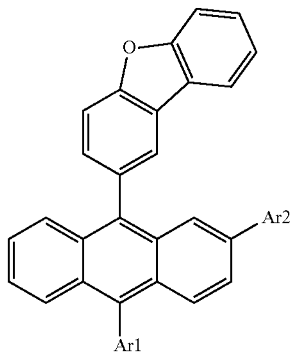 | 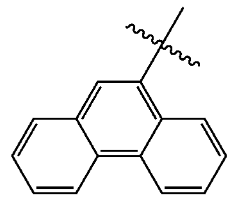 [SMILES: *c1cc2ccccc2c2ccccc12] | 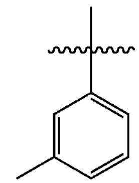 [SMILES: *c1cccc(C)c1] |
| 22-24 | 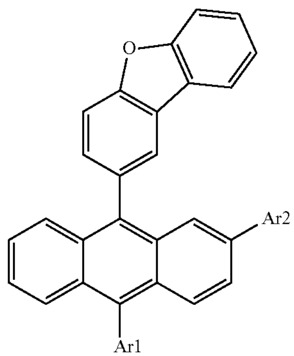 | 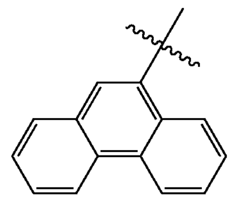 [SMILES: *c1cc2ccccc2c2ccccc12] | 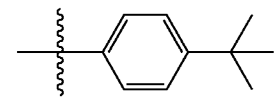 |

-continued
| No. | | Ar1 | Ar2 |
|---|---|---|---|
| 22-25 | 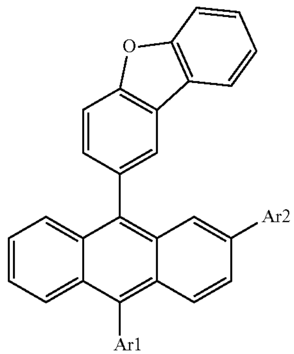 | 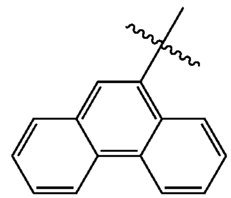 [SMILES: *c1cc2ccccc2c2ccccc12] | 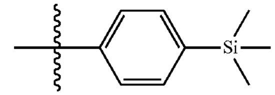 |
| 22-26 | 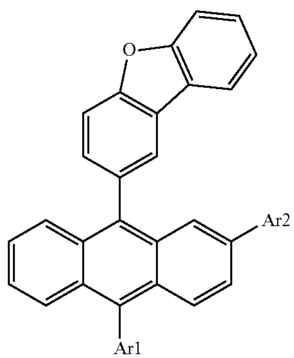 | 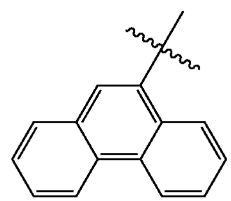 [SMILES: *c1cc2ccccc2c2ccccc12] | 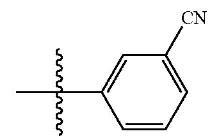 [SMILES: *c1cccc(C#N)c1] |

-continued
| No. | | Ar1 | Ar2 |
|---|---|---|---|
| 22-27 | 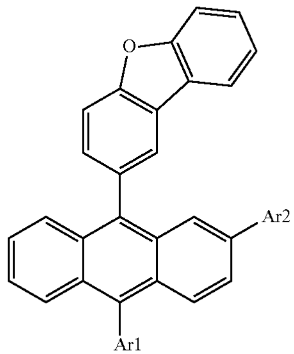 | 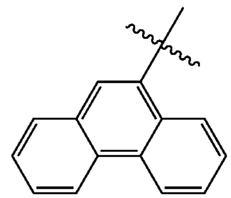 [SMILES: *c1cc2ccccc2c2ccccc12] | 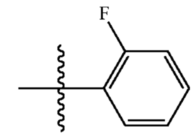 [SMILES: *c1ccccc1F] |
| 22-28 | 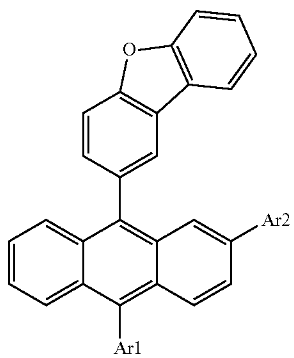 | 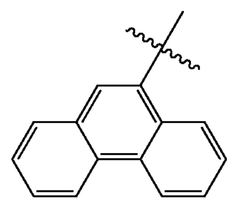 [SMILES: *c1cc2ccccc2c2ccccc12] | 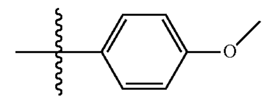 [SMILES: *c1ccc(OC)cc1] |

-continued
| No. | | Ar1 | Ar2 |
|---|---|---|---|
| 23-1 | 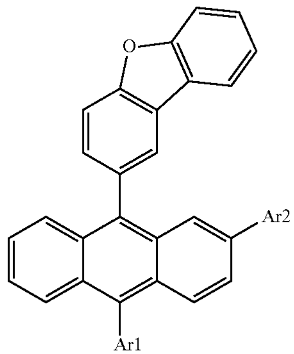 | 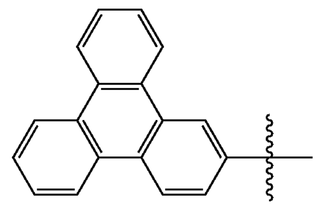 [SMILES: *c1ccc2c3ccccc3c3ccccc3c2c1] | 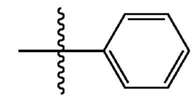 [SMILES: *c1ccccc1] |
| 23-2 | 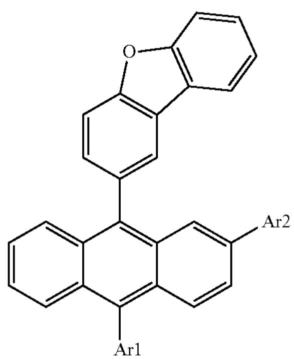 | 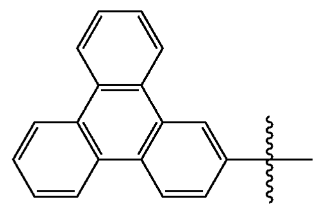 | 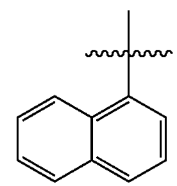 [SMILES: *c1cccc2ccccc12] |

-continued
| No. | | Ar1 | Ar2 |
|---|---|---|---|
| 23-3 | 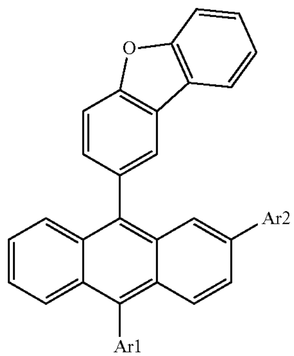 | 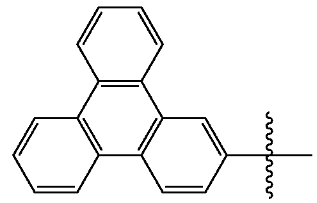 | 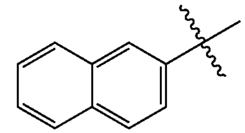 [SMILES: *c1ccc2ccccc2c1] |
| 23-4 | 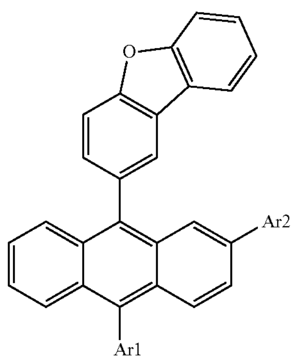 | 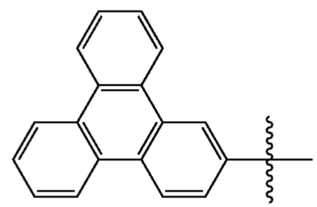 | 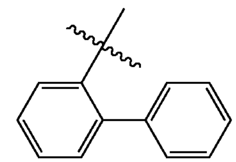 [SMILES: *c1ccccc1-c1ccccc1] |

-continued
| No. | | Ar1 | Ar2 |
|---|---|---|---|
| 23-5 | 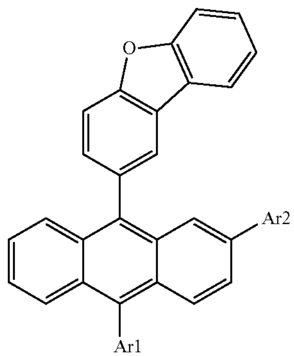 | 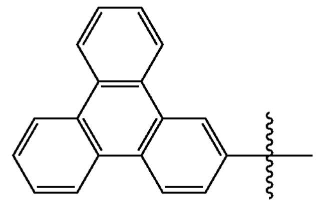 | 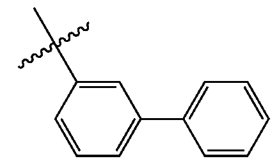 [SMILES: *c1cccc(-c2ccccc2)c1] |
| 23-6 | 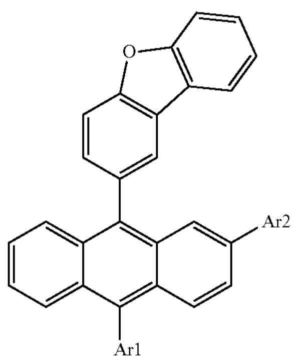 | 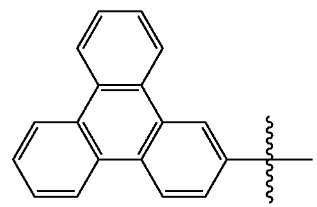 | 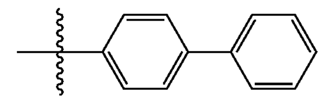 [SMILES: *c1ccc(-c2ccccc2)cc1] |

-continued
| No. | | Ar1 | Ar2 |
|---|---|---|---|
| 23-7 | 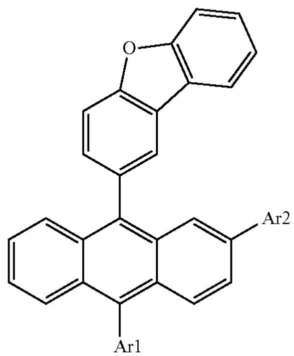 | 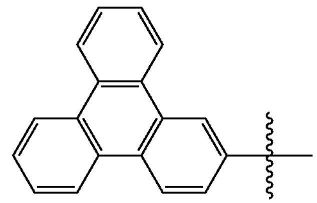 | 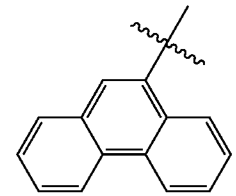 [SMILES: *c1cc2ccccc2c2ccccc12] |
| 23-8 | 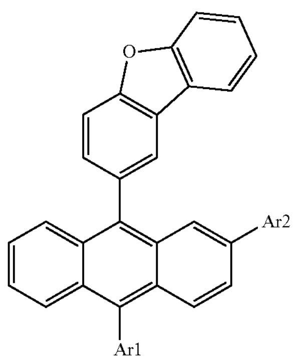 | 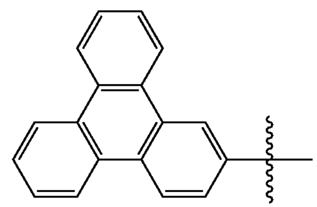 | 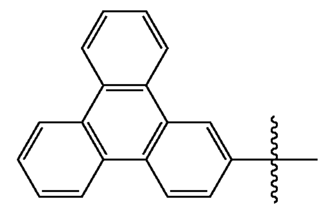 |

-continued
| No. | | Ar1 | Ar2 |
|---|---|---|---|
| 23-9 | 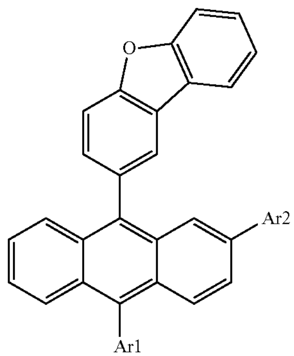 | 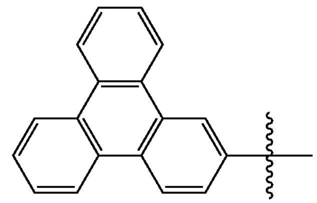 | 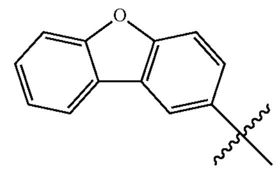 |
| 23-10 | 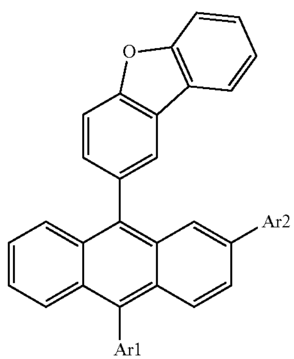 | 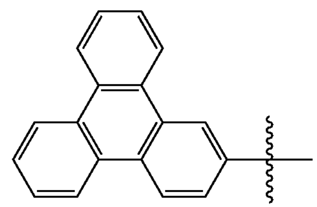 | 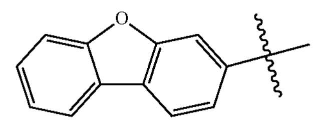 |

-continued
| No. | | Ar1 | Ar2 |
|---|---|---|---|
| 23-11 | 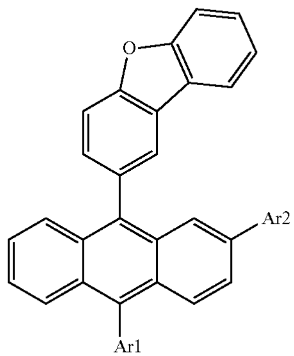 | 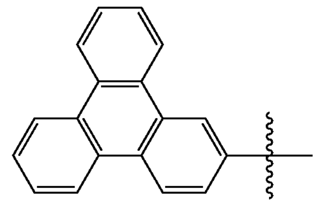 | 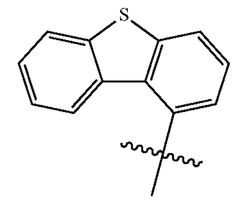 |
| 23-12 | 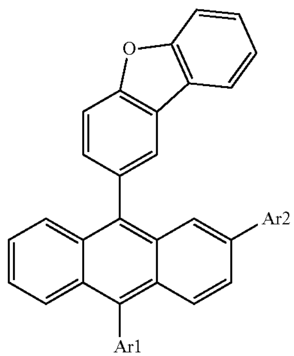 | 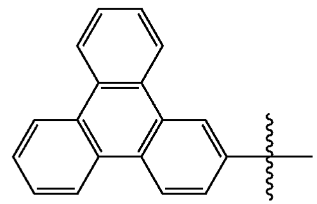 [SMILES: *c1ccc2c3ccccc3c3ccccc3c2c1] | 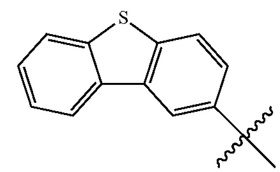 [SMILES: *c1ccc2sc3ccccc3c2c1] |

-continued
| No. | | Ar1 | Ar2 |
|---|---|---|---|
| 23-13 | 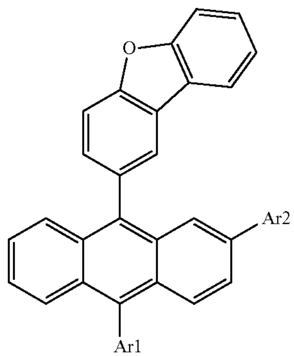 | 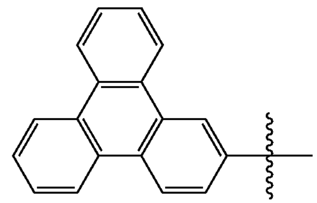 [SMILES: *c1ccc2c3ccccc3c3ccccc3c2c1] | 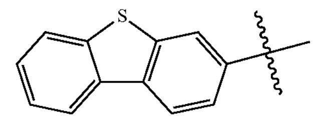 |
| 23-14 | 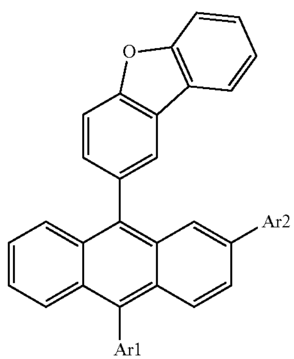 | 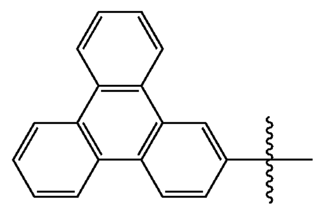 [SMILES: *c1ccc2c3ccccc3c3ccccc3c2c1] | 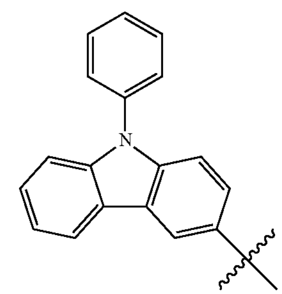 [SMILES: *c1ccc2c(c1)c1ccccc1n2-c1ccccc1] |

-continued
| No. | | Ar1 | Ar2 |
|---|---|---|---|
| 23-15 | 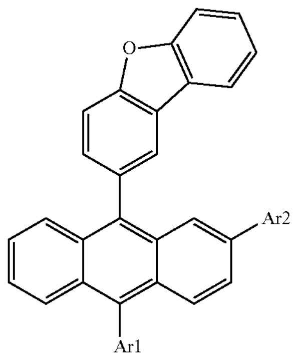 | 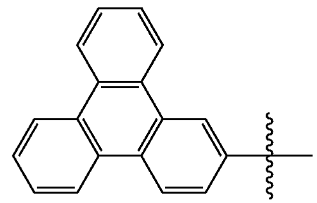 [SMILES: *c1ccc2c3ccccc3c3ccccc3c2c1] | 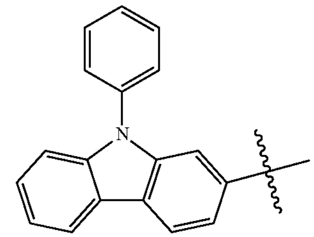 [SMILES: *c1ccc2c3ccccc3n(-c3ccccc3)c2c1] |
| 23-16 | 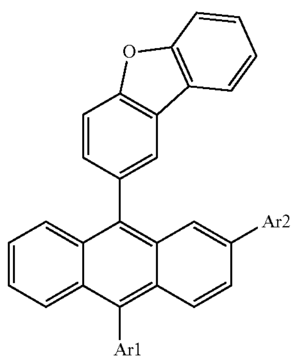 | 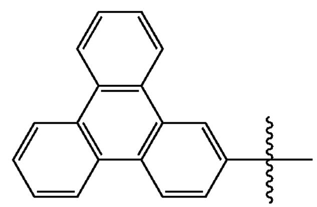 [SMILES: *c1ccc2c3ccccc3c3ccccc3c2c1] | 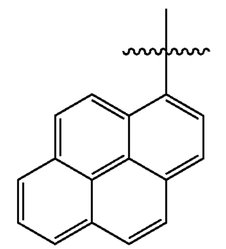 [SMILES: *c1ccc2ccc3cccc4ccc1c2c34] |

-continued
| No. | | Ar1 | Ar2 |
|---|---|---|---|
| 23-17 | 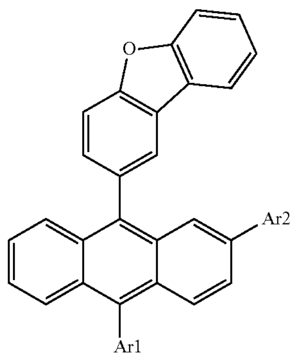 | 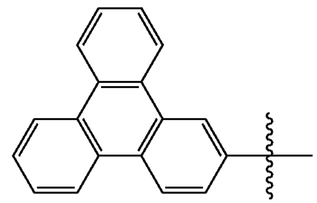 [SMILES: *c1ccc2c3ccccc3c3ccccc3c2c1] | 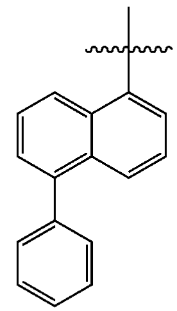 [SMILES: *c1cccc2c(-c3ccccc3)cccc12] |
| 23-18 | 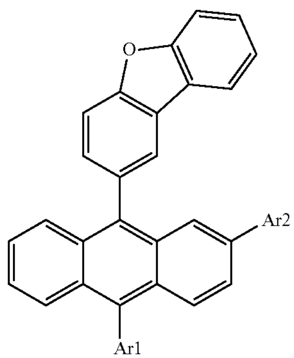 | 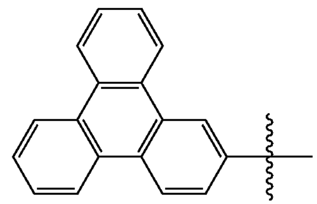 [SMILES: *c1ccc2c3ccccc3c3ccccc3c2c1] | 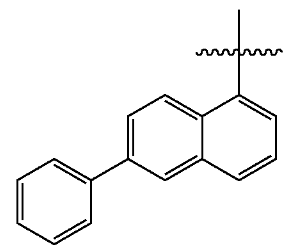 [SMILES: *c1cccc2cc(-c3ccccc3)ccc12] |

-continued
| No. | | Ar1 | Ar2 |
|---|---|---|---|
| 23-19 | 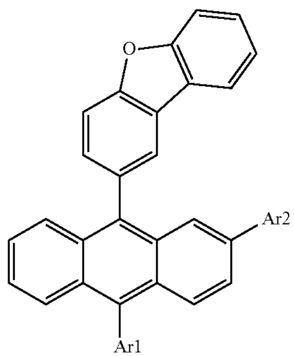 | 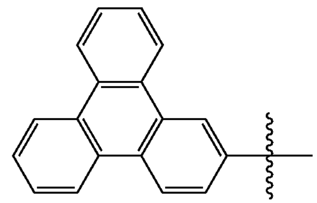 [SMILES: *c1ccc2c3ccccc3c3ccccc3c2c1] | 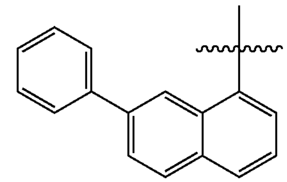 [SMILES: *c1cccc2ccc(-c3ccccc3)cc12] |
| 23-20 | 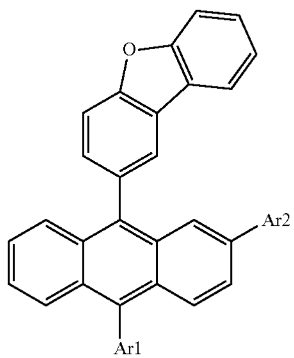 | 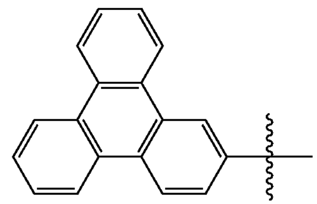 [SMILES: *c1ccc2c3ccccc3c3ccccc3c2c1] | 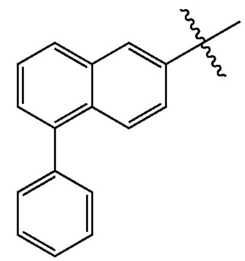 [SMILES: *c1ccc2c(-c3ccccc3)cccc2c1] |

-continued
| No. | | Ar1 | Ar2 |
|---|---|---|---|
| 23-21 | 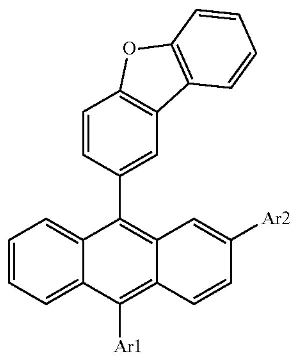 | 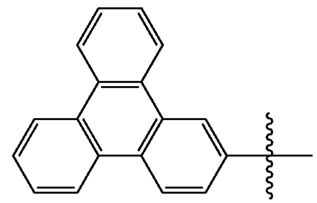 [SMILES: *c1ccc2c3ccccc3c3ccccc3c2c1] | 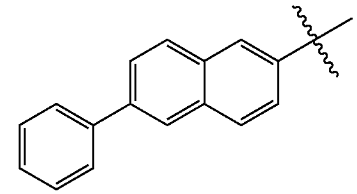 [SMILES: *c1ccc2cc(-c3ccccc3)ccc2c1] |
| 23-22 | 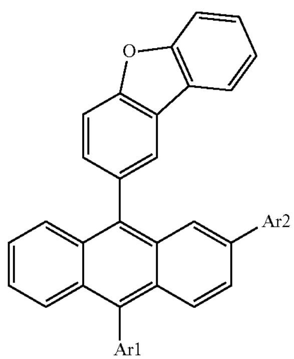 | 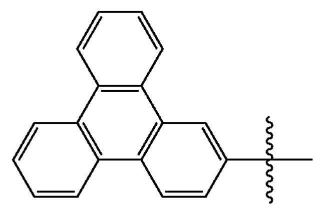 [SMILES: *c1ccc2c3ccccc3c3ccccc3c2c1] | 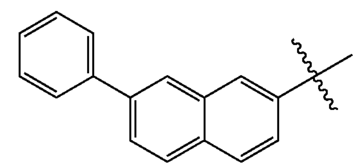 [SMILES: *c1ccc2ccc(-c3ccccc3)cc2c1] |

-continued
| No. | | Ar1 | Ar2 |
|---|---|---|---|
| 23-23 | 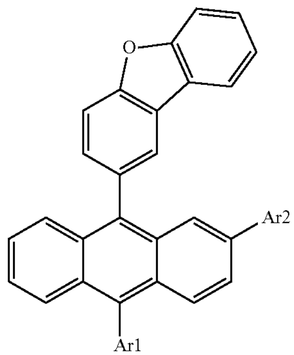 | 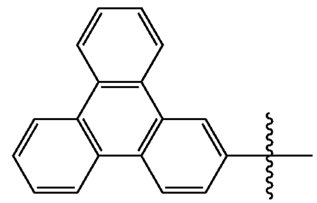 [SMILES: *c1ccc2c3ccccc3c3ccccc3c2c1] | 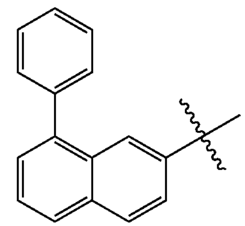 [SMILES: *c1ccc2cccc(-c3ccccc3)c2c1] |
| 23-24 | 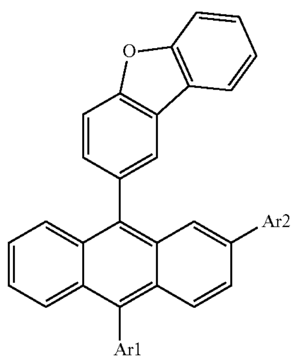 | 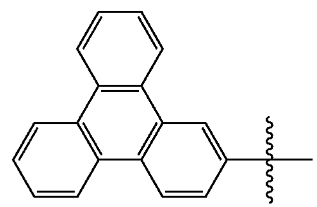 [SMILES: *c1ccc2c3ccccc3c3ccccc3c2c1] | 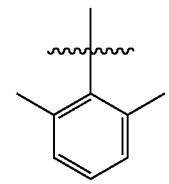 |

-continued
| No. | | Ar1 | Ar2 |
|---|---|---|---|
| 23-25 | 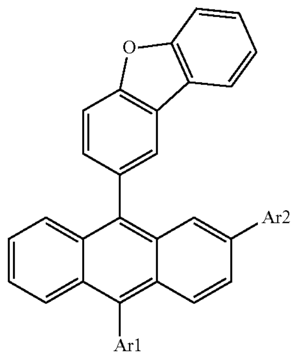 | 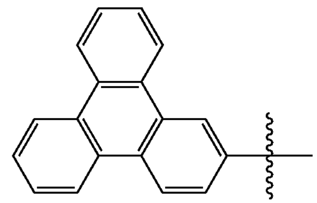 [SMILES: *c1ccc2c3ccccc3c3ccccc3c2c1] | 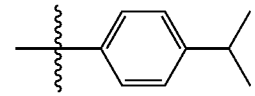 [SMILES: *c1ccc(C(C)C)cc1] |
| 23-26 | 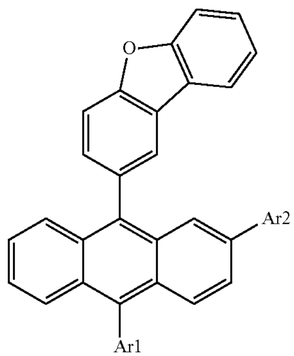 | 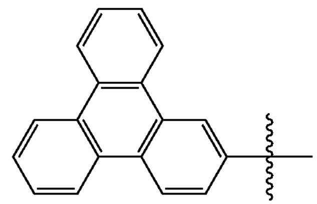 [SMILES: *c1ccc2c3ccccc3c3ccccc3c2c1] | 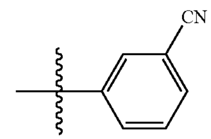 [SMILES: *c1cccc(C#N)c1] |

-continued
| No. | | Ar1 | Ar2 |
|---|---|---|---|
| 23-27 | 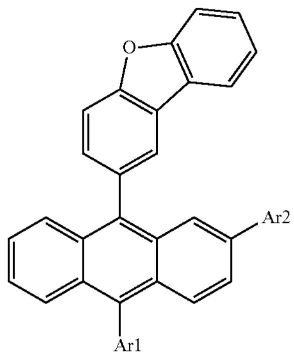 | 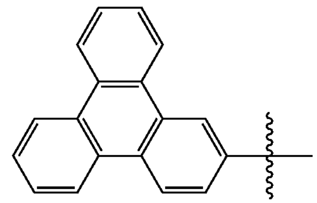 [SMILES: *c1ccc2c3ccccc3c3ccccc3c2c1] | 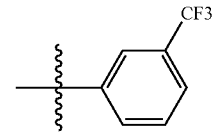 [SMILES: *c1cccc(C(F)(F)F)c1] |
| 23-28 | 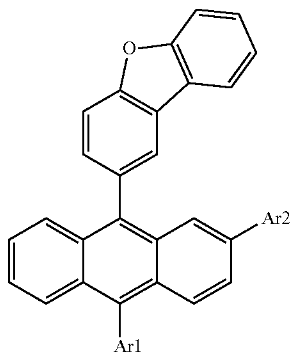 | 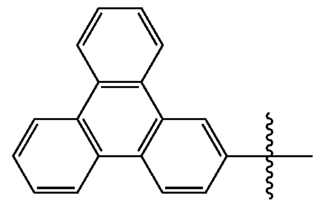 [SMILES: *c1ccc2c3ccccc3c3ccccc3c2c1] | 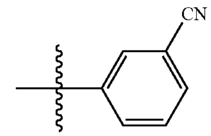 [SMILES: *c1cccc(C#N)c1] |

-continued
| No. | | Ar1 | Ar2 |
|---|---|---|---|
| 23-29 | 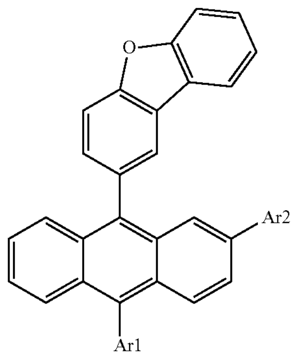 | 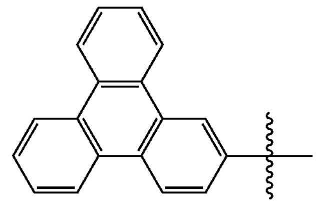 [SMILES: *c1ccc2c3ccccc3c3ccccc3c2c1] | 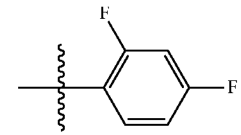 [SMILES: *c1ccc(F)cc1F] |
| 24-1 | 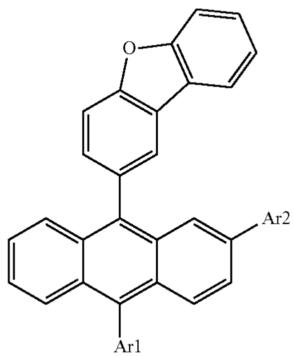 | 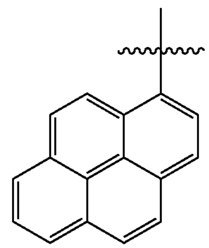 [SMILES: *c1ccc2ccc3cccc4ccc1c2c34] | 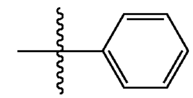 [SMILES: *c1ccccc1] |

-continued
| No. | | Ar1 | Ar2 |
|---|---|---|---|
| 24-2 | 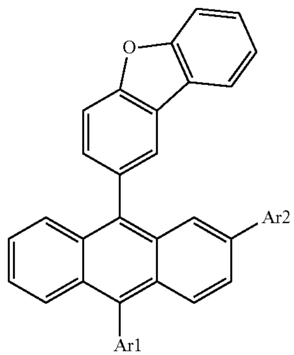 | 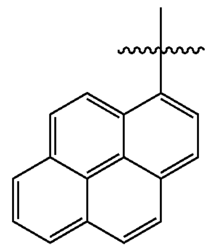 [SMILES: *c1ccc2ccc3cccc4ccc1c2c34] | 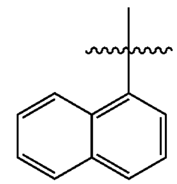 [SMILES: *c1cccc2ccccc12] |
| 24-3 | 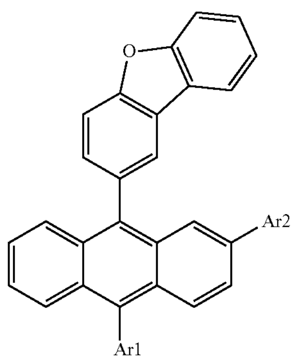 | 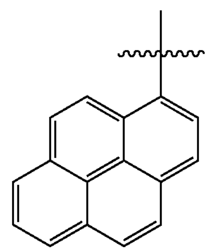 [SMILES: *c1ccc2ccc3cccc4ccc1c2c34] | 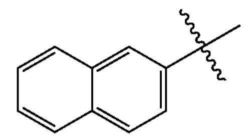 [SMILES: *c1ccc2ccccc2c1] |

-continued
| No. | | Ar1 | Ar2 |
|---|---|---|---|
| 24-4 | 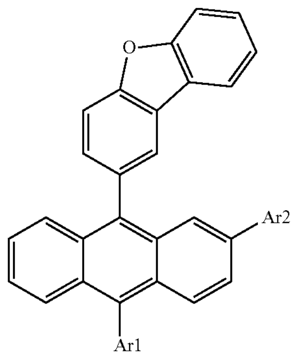 | 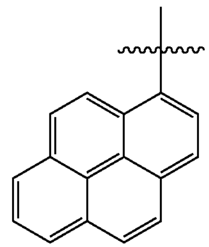 [SMILES: *c1ccc2ccc3cccc4ccc1c2c34] | 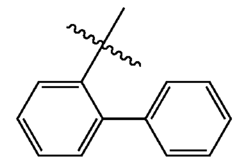 [SMILES: *c1ccccc1-c1ccccc1] |
| 24-5 | 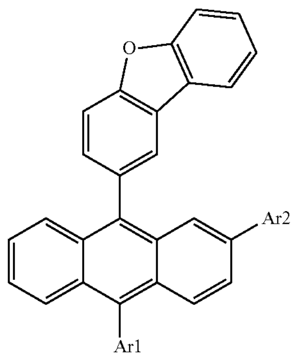 | 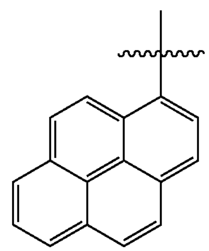 [SMILES: *c1ccc2ccc3cccc4ccc1c2c34] | 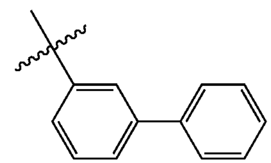 [SMILES: *c1cccc(-c2ccccc2)c1] |

-continued
| No. | | Ar1 | Ar2 |
|---|---|---|---|
| 24-6 | 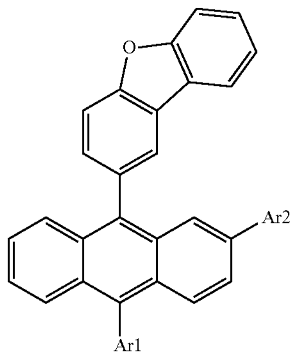 | 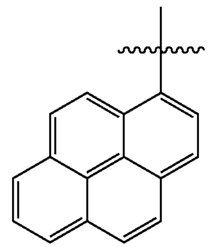 [SMILES: *c1ccc2ccc3cccc4ccc1c2c34] | 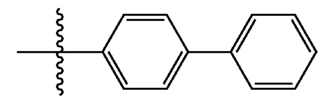 |
| 24-7 | 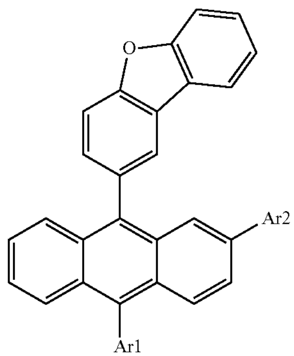 | 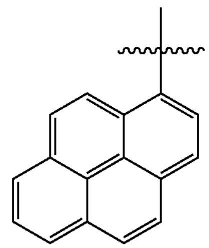 [SMILES: *c1ccc2ccc3cccc4ccc1c2c34] | 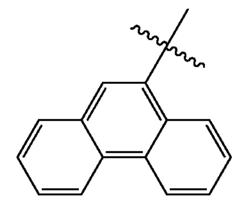 [SMILES: *c1cc2ccccc2c2ccccc12] |

-continued
| No. | | Ar1 | Ar2 |
| --- | --- | --- | --- |
| 24-8 | 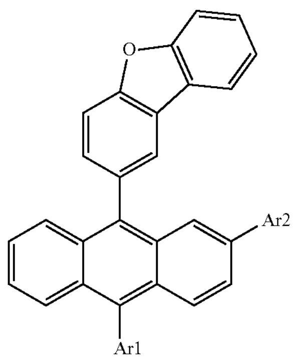 | 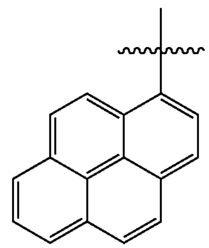 [SMILES: *c1ccc2ccc3cccc4ccc1c2c34] | 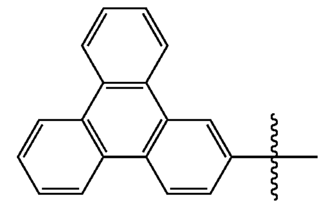 [SMILES: *c1ccc2c3ccccc3c3ccccc3c2c1] |
| 24-9 | 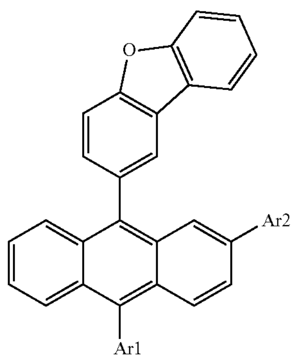 | 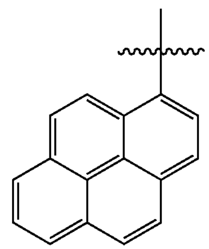 [SMILES: *c1ccc2ccc3cccc4ccc1c2c34] | 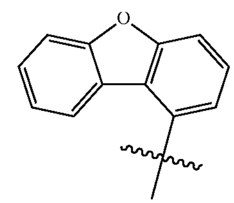 [SMILES: *c1cccc2oc3ccccc3c12] |

-continued
| No. | | Ar1 | Ar2 |
|---|---|---|---|
| 24-10 | 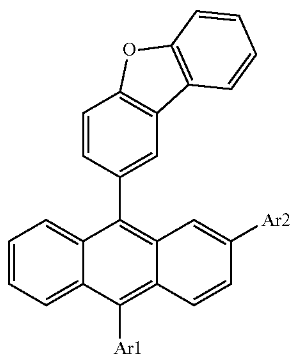 | 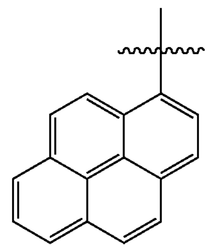 [SMILES: *c1ccc2ccc3cccc4ccc1c2c34] | 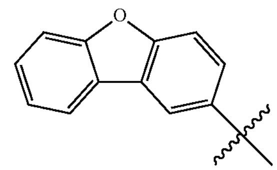 |
| 24-11 | 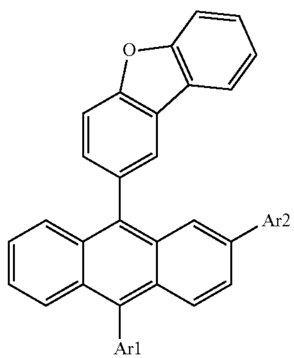 | 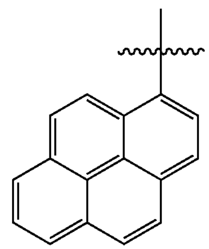 [SMILES: *c1ccc2ccc3cccc4ccc1c2c34] | 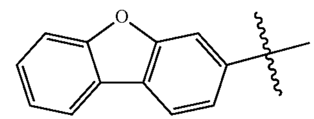 |

-continued
| No. | | Ar1 | Ar2 |
| --- | --- | --- | --- |
| 24-12 | 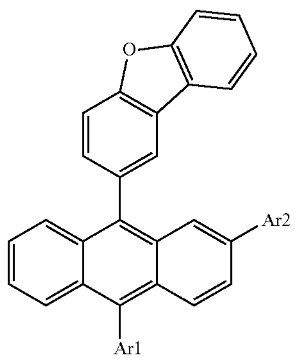 | 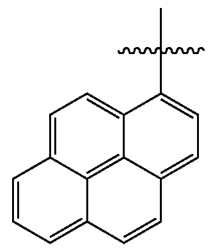 [SMILES: *c1ccc2ccc3cccc4ccc1c2c34] | 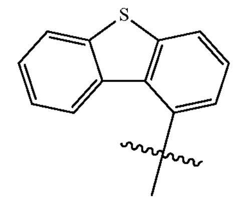 |
| 24-13 | 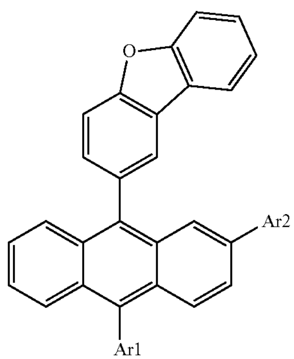 | 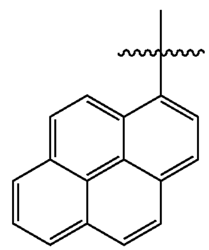 [SMILES: *c1ccc2ccc3cccc4ccc1c2c34] | 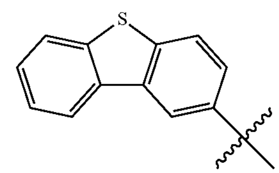 |

-continued
| No. | | Ar1 | Ar2 |
|---|---|---|---|
| 24-14 | 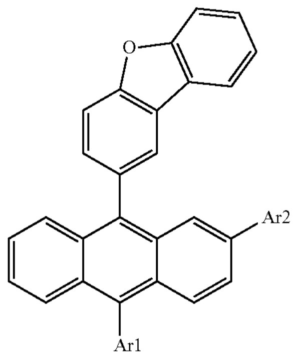 | 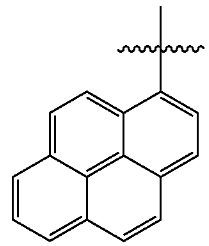 [SMILES: *c1ccc2ccc3cccc4ccc1c2c34] | 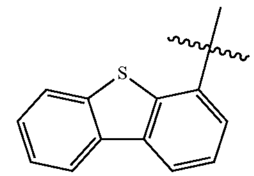 |
| 24-15 | 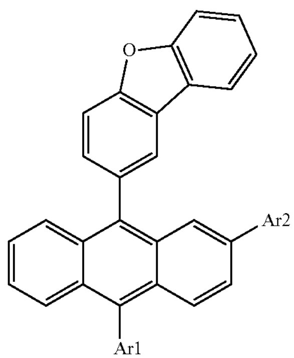 | 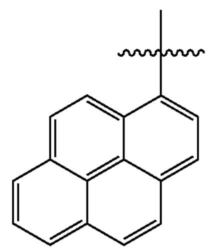 [SMILES: *c1ccc2ccc3cccc4ccc1c2c34] | 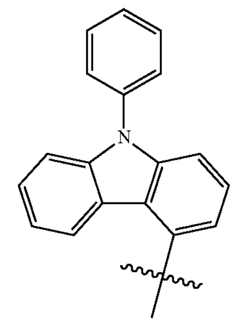 [SMILES: *c1cccc2c1c1ccccc1n2-c1ccccc1] |

-continued
| No. | | Ar1 | Ar2 |
|---|---|---|---|
| 24-16 | 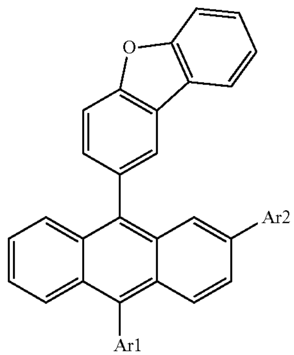 | 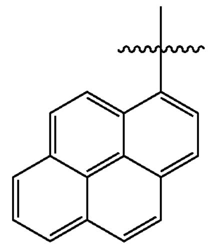 [SMILES: *c1ccc2ccc3cccc4ccc1c2c34] | 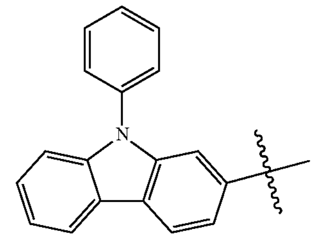 [SMILES: *c1ccc2c3ccccc3n(-c3ccccc3)c2c1] |
| 24-17 | 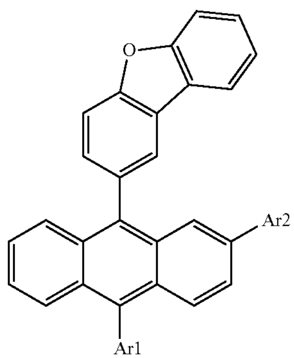 | 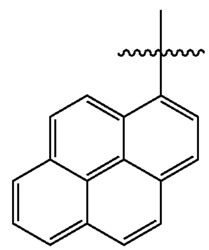 [SMILES: *c1ccc2ccc3cccc4ccc1c2c34] | 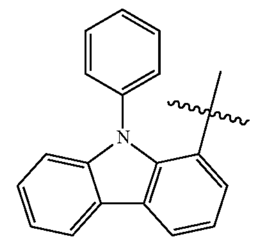 [SMILES: *c1cccc2c3ccccc3n(-c3ccccc3)c12] |

-continued
| No. | | Ar1 | Ar2 |
|---|---|---|---|
| 24-18 | 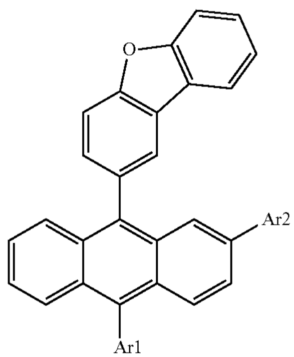  | 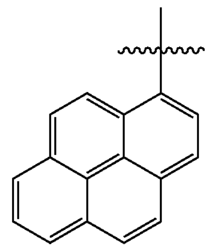 [SMILES: *c1ccc2ccc3cccc4ccc1c2c34] | 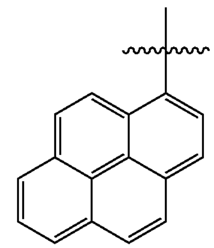 [SMILES: *c1ccc2ccc3cccc4ccc1c2c34] |
| 24-19 | 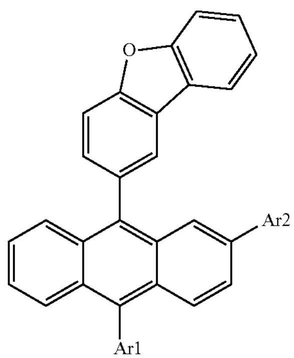  | 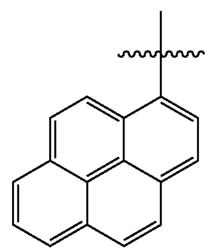 [SMILES: *c1ccc2ccc3cccc4ccc1c2c34] | 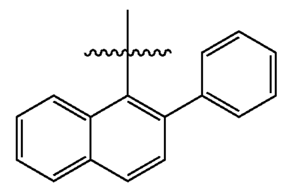 [SMILES: *c1c(-c2ccccc2)ccc2ccccc12] |

-continued
| No. | | Ar1 | Ar2 |
|---|---|---|---|
| 24-20 | 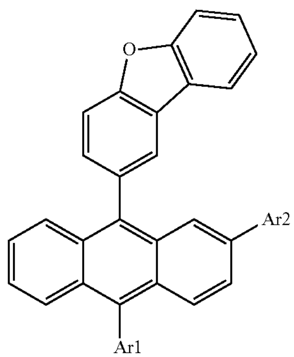 | 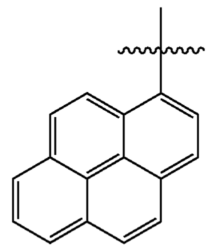 [SMILES: *c1ccc2ccc3cccc4ccc1c2c34] | 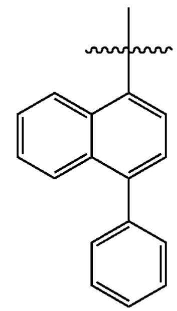 [SMILES: *c1ccc(-c2ccccc2)c2ccccc12] |
| 24-21 | 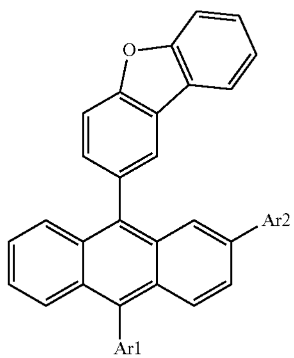 | 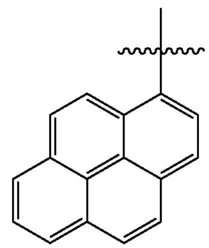 [SMILES: *c1ccc2ccc3cccc4ccc1c2c34] | 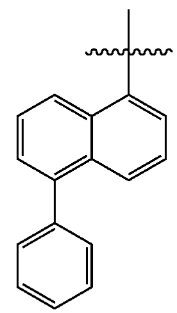 [SMILES: *c1cccc2c(-c3ccccc3)cccc12] |

-continued
| No. | | Ar1 | Ar2 |
|---|---|---|---|
| 24-22 | 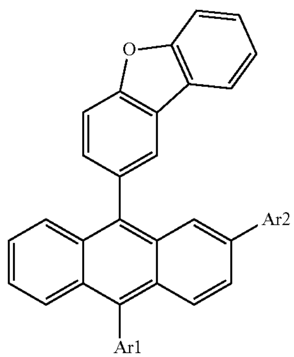 | 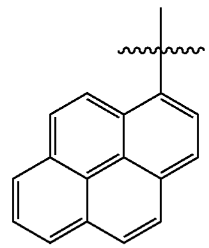 [SMILES: *c1ccc2ccc3cccc4ccc1c2c34] | 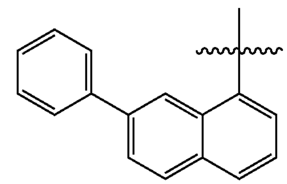 [SMILES: *c1cccc2ccc(-c3ccccc3)cc12] |
| 24-23 | 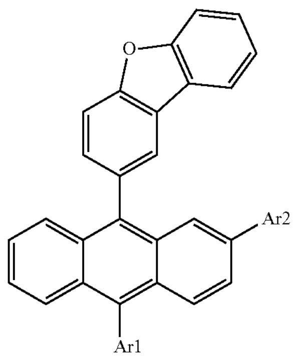 | 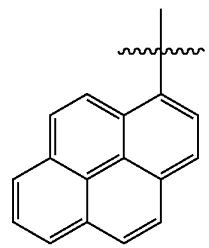 [SMILES: *c1ccc2ccc3cccc4ccc1c2c34] | 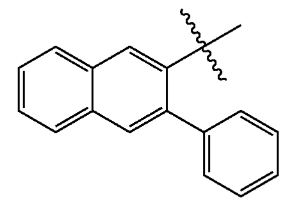 [SMILES: *c1cc2ccccc2cc1-c1ccccc1] |

-continued
| No. | | Ar1 | Ar2 |
|---|---|---|---|
| 24-24 | 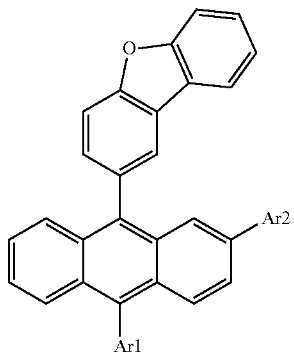 | 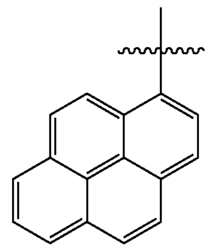 [SMILES: *c1ccc2ccc3cccc4ccc1c2c34] | 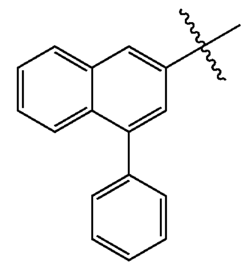 [SMILES: *c1cc(-c2ccccc2)c2ccccc2c1] |
| 24-25 | 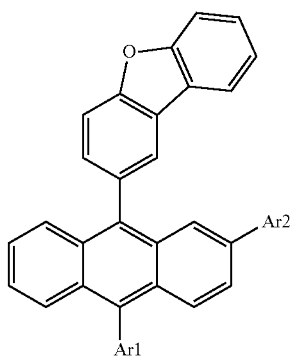 | 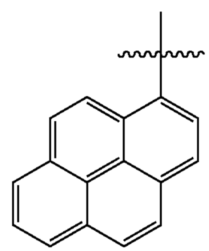 [SMILES: *c1ccc2ccc3cccc4ccc1c2c34] | 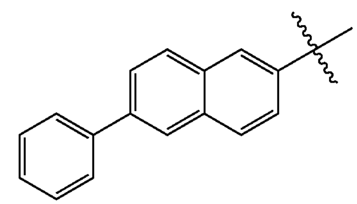 [SMILES: *c1ccc2cc(-c3ccccc3)ccc2c1] |

-continued
| No. | | Ar1 | Ar2 |
|---|---|---|---|
| 24-26 | 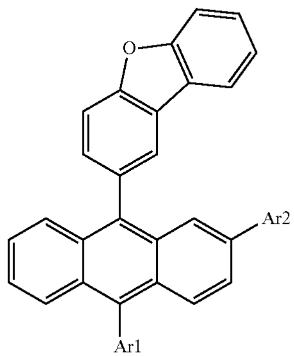 | 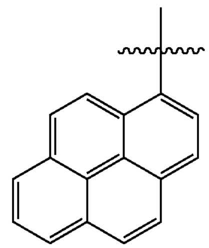 [SMILES: *c1ccc2ccc3cccc4ccc1c2c34] | 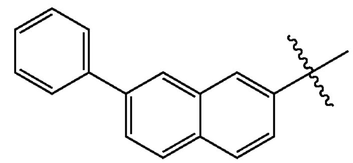 [SMILES: *c1ccc2ccc(-c3ccccc3)cc2c1] |
| 24-27 | 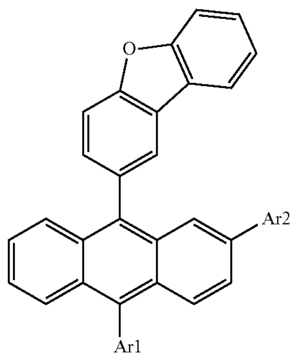 | 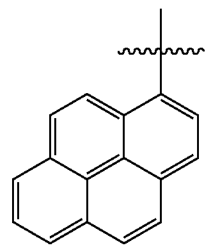 [SMILES: *c1ccc2ccc3cccc4ccc1c2c34] | 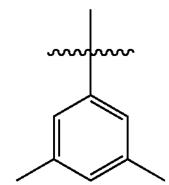 |

-continued
| No. | | Ar1 | Ar2 |
|---|---|---|---|
| 24-28 | 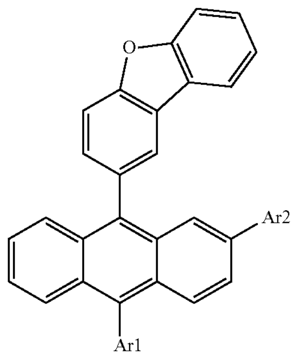 | 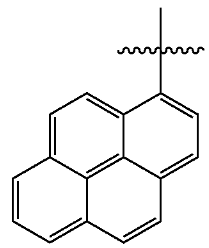 [SMILES: *c1ccc2ccc3cccc4ccc1c2c34] | 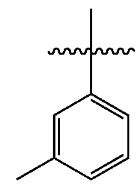 [SMILES: *c1cccc(C)c1] |
| 24-29 | 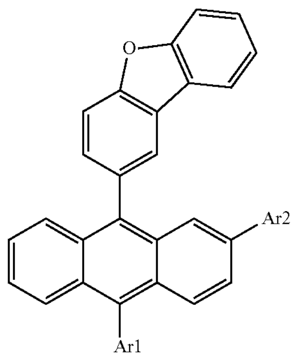 | 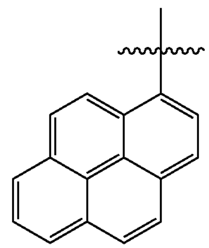 [SMILES: *c1ccc2ccc3cccc4ccc1c2c34] | 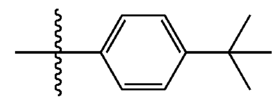 |

-continued
| No. | | Ar1 | Ar2 |
|---|---|---|---|
| 24-30 | 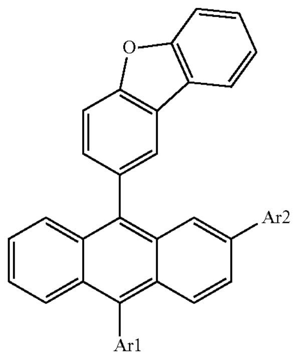 | 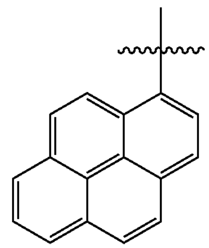 [SMILES: *c1ccc2ccc3cccc4ccc1c2c34] | 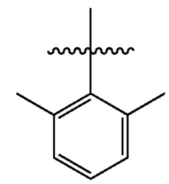 |
| 24-31 | 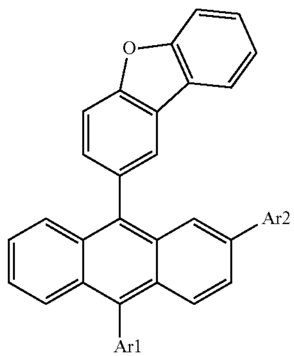 | 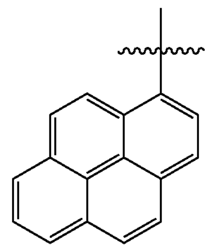 [SMILES: *c1ccc2ccc3cccc4ccc1c2c34] | 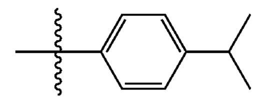 [SMILES: *c1ccc(C(C)C)cc1] |

-continued
| No. | | Ar1 | Ar2 |
|---|---|---|---|
| 25-1 | 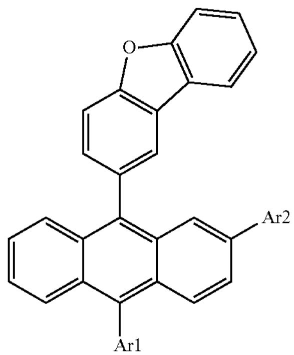 | 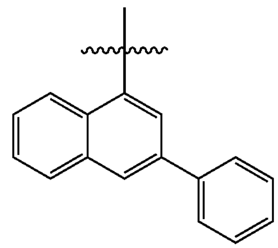 [SMILES: *c1cc(-c2ccccc2)cc2ccccc12] | 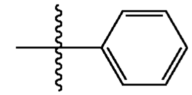 [SMILES: *c1ccccc1] |
| 25-2 | 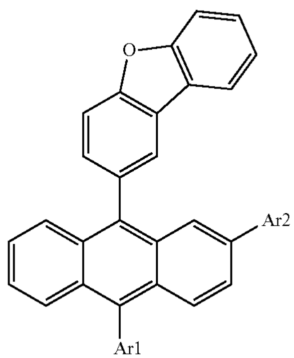 | 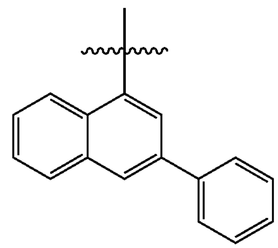 [SMILES: *c1cc(-c2ccccc2)cc2ccccc12] | 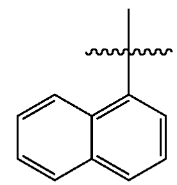 [SMILES: *c1cccc2ccccc12] |

-continued
| No. | | Ar1 | Ar2 |
|---|---|---|---|
| 25-3 | 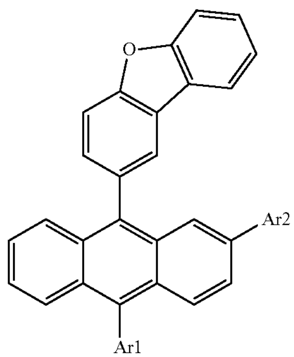 | 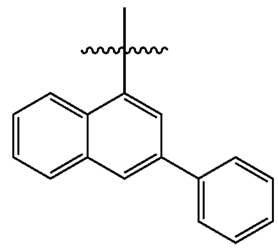 [SMILES: *c1cc(-c2ccccc2)cc2ccccc12] | 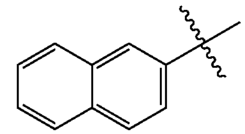 [SMILES: *c1ccc2ccccc2c1] |
| 25-4 | 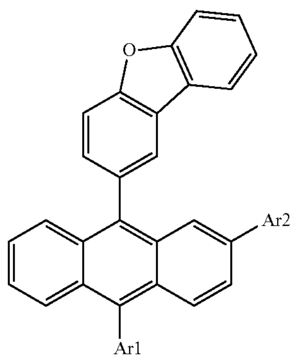 | 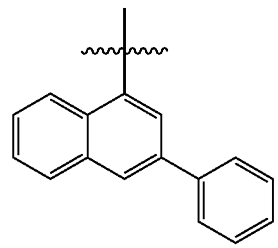 [SMILES: *c1cc(-c2ccccc2)cc2ccccc12] | 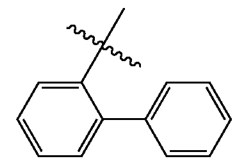 [SMILES: *c1ccccc1-c1ccccc1] |

-continued
| No. | | Ar1 | Ar2 |
|---|---|---|---|
| 25-5 | 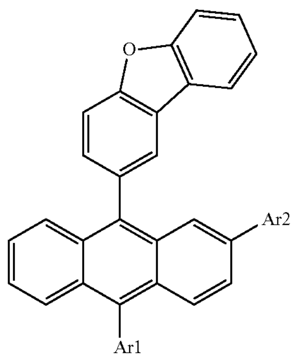 | 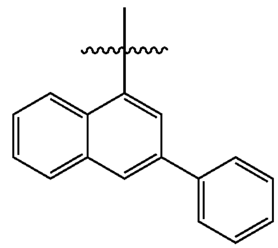 [SMILES: *c1cc(-c2ccccc2)cc2ccccc12] | 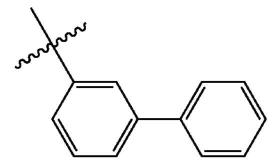 [SMILES: *c1cccc(-c2ccccc2)c1] |
| 25-6 | 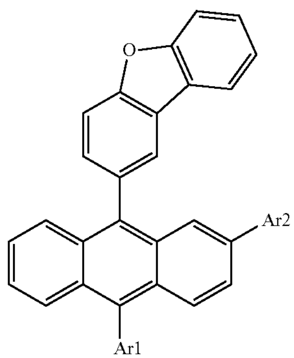 | 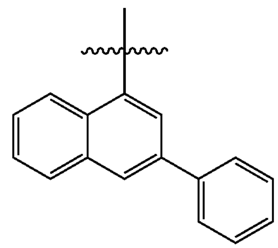 [SMILES: *c1cc(-c2ccccc2)cc2ccccc12] | 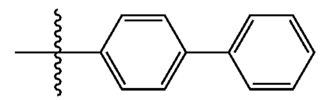 |

-continued
| No. | | Ar1 | Ar2 |
|---|---|---|---|
| 25-7 | 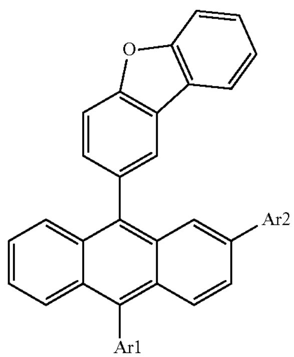  | 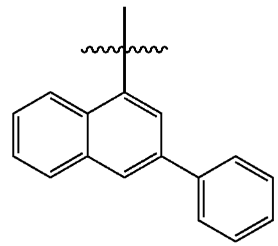 [SMILES: *c1cc(-c2ccccc2)cc2ccccc12] | 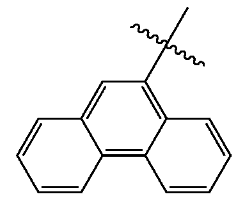 [SMILES: *c1cc2ccccc2c2ccccc12] |
| 25-8 | 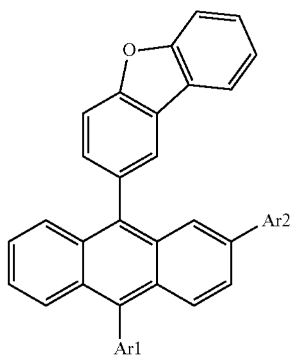  | 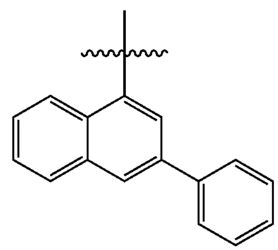 [SMILES: *c1cc(-c2ccccc2)cc2ccccc12] | 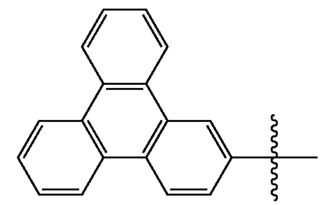 [SMILES: *c1ccc2c3ccccc3c3ccccc3c2c1] |

-continued
| No. | | Ar1 | Ar2 |
|---|---|---|---|
| 25-9 | 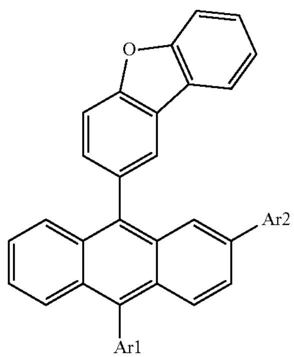 | 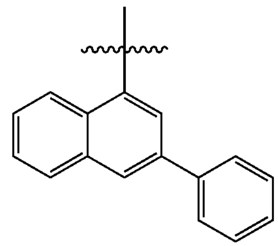 [SMILES: *c1cc(-c2ccccc2)cc2ccccc12] | 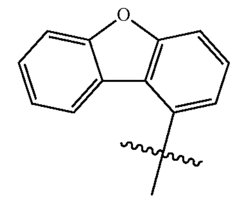 [SMILES: *c1cccc2oc3ccccc3c12] |
| 25-10 | 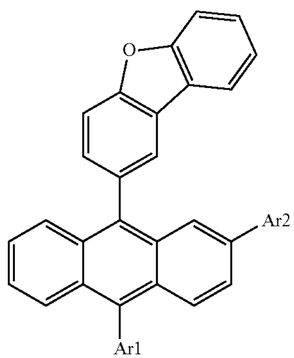 | 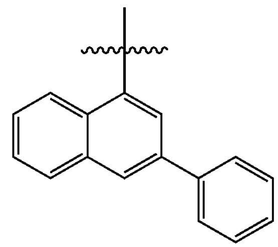 [SMILES: *c1cc(-c2ccccc2)cc2ccccc12] | 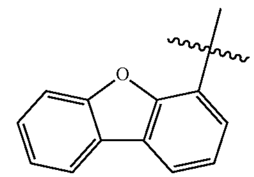 |

-continued
| No. | | Ar1 | Ar2 |
|---|---|---|---|
| 25-11 | 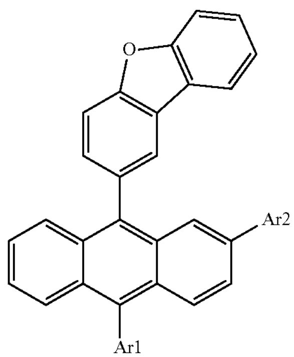 | 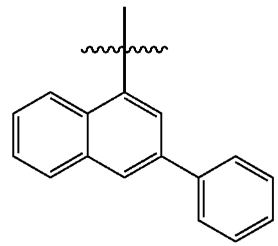 [SMILES: *c1cc(-c2ccccc2)cc2ccccc12] | 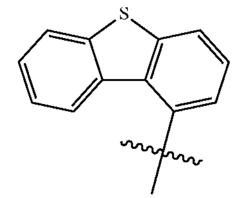 [SMILES: *c1cccc2sc3ccccc3c12] |
| 25-12 | 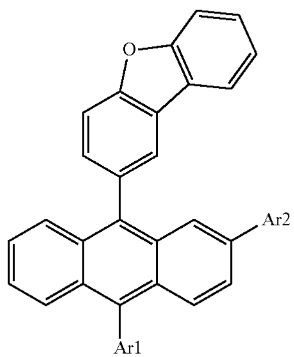 | 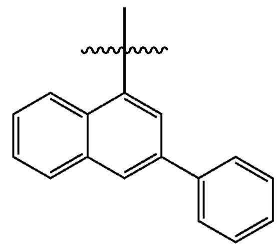 [SMILES: *c1cc(-c2ccccc2)cc2ccccc12] | 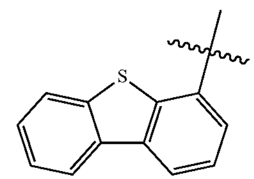 |

-continued
| No. | | Ar1 | Ar2 |
|---|---|---|---|
| 25-13 | 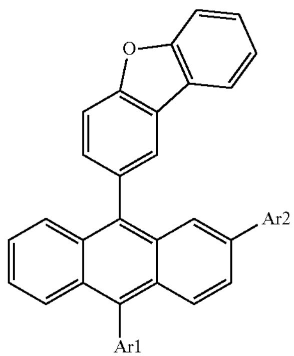 | 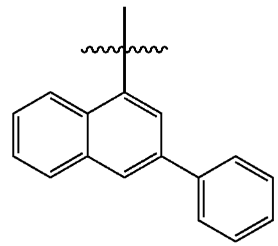 [SMILES: *c1cc(-c2ccccc2)cc2ccccc12] | 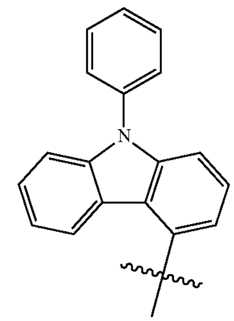 [SMILES: *c1cccc2c1c1ccccc1n2-c1ccccc1] |
| 25-14 | 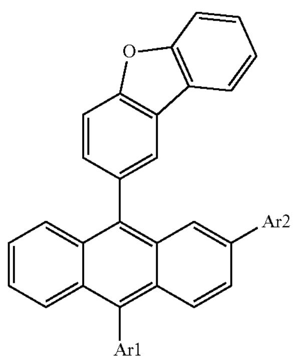 | 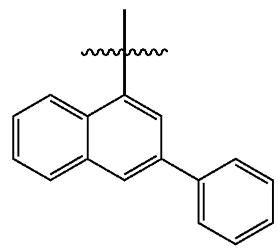 [SMILES: *c1cc(-c2ccccc2)cc2ccccc12] | 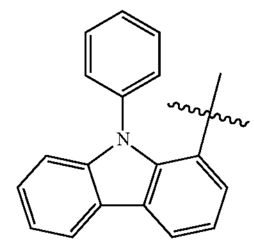 [SMILES: *c1cccc2c3ccccc3n(-c3ccccc3)c12] |

-continued
| No. | | Ar1 | Ar2 |
| --- | --- | --- | --- |
| 25-15 | 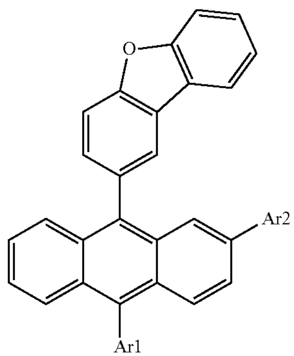 | 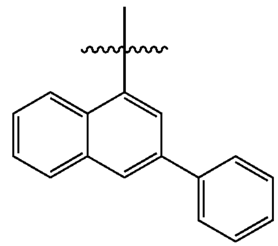 [SMILES: *c1cc(-c2ccccc2)cc2ccccc12] | 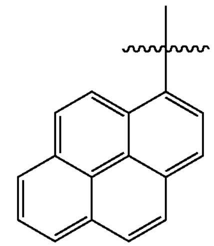 [SMILES: *c1ccc2ccc3cccc4ccc1c2c34] |
| 25-16 | 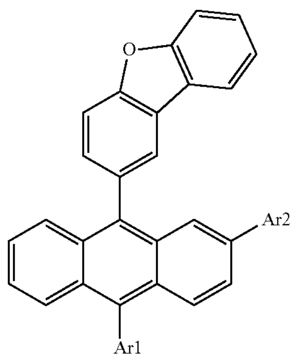 | 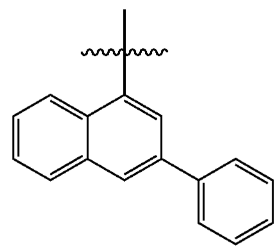 [SMILES: *c1cc(-c2ccccc2)cc2ccccc12] | 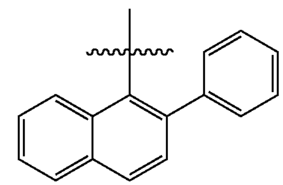 [SMILES: *c1c(-c2ccccc2)ccc2ccccc12] |
| 25-17 | 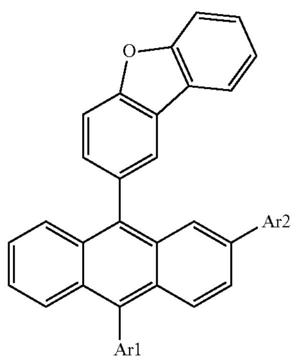 | 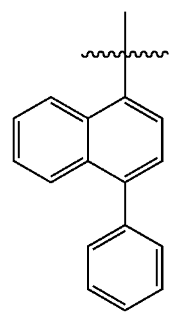 [SMILES: *c1ccc(-c2ccccc2)c2ccccc12] | 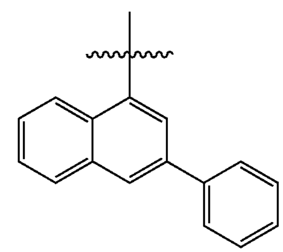 [SMILES: *c1cc(-c2ccccc2)cc2ccccc12] |

-continued
| No. | | Ar1 | Ar2 |
|---|---|---|---|
| 25-18 | 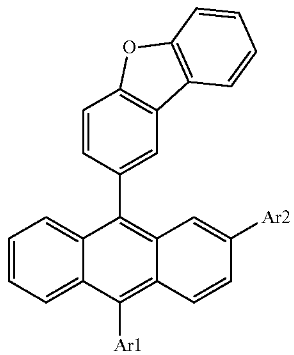 | 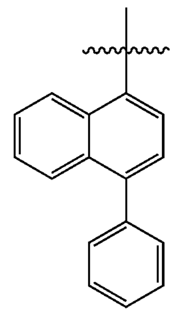 [SMILES: *c1ccc(-c2ccccc2)c2ccccc12] | 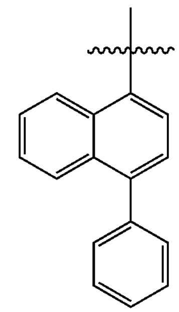 [SMILES: *c1ccc(-c2ccccc2)c2ccccc12] |
| 25-19 | 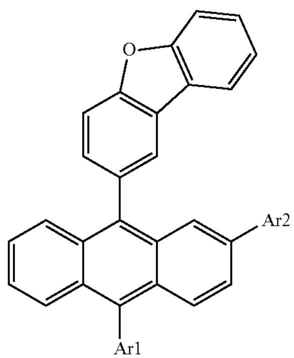 | 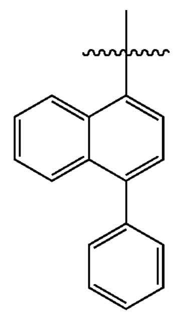 [SMILES: *c1ccc(-c2ccccc2)c2ccccc12] | 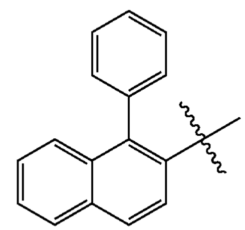 [SMILES: *c1ccc2ccccc2c1-c1ccccc1] |

-continued
| No. | | Ar1 | Ar2 |
|---|---|---|---|
| 25-20 | 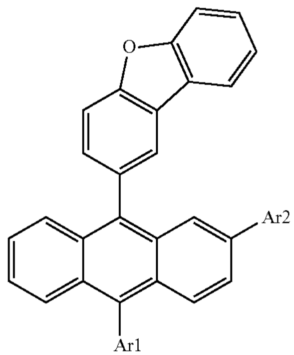 | 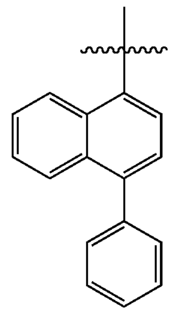 [SMILES: *c1ccc(-c2ccccc2)c2ccccc12] | 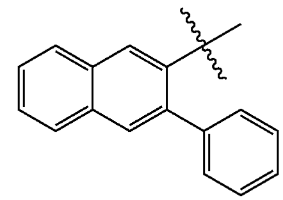 [SMILES: *c1cc2ccccc2cc1-c1ccccc1] |
| 25-21 | 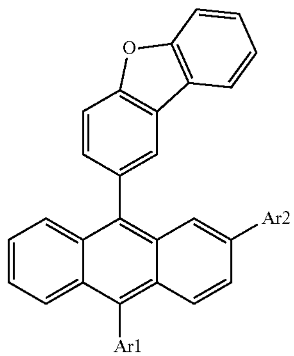 | 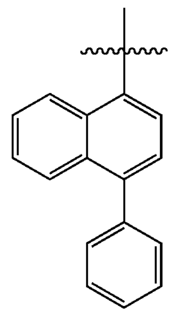 [SMILES: *c1ccc(-c2ccccc2)c2ccccc12] | 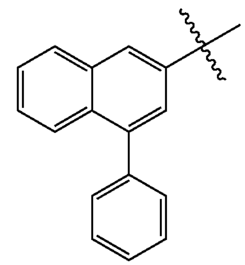 [SMILES: *c1cc(-c2ccccc2)c2ccccc2c1] |
| 25-22 | 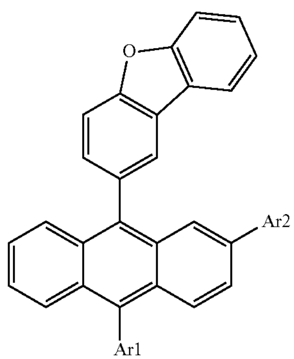 | 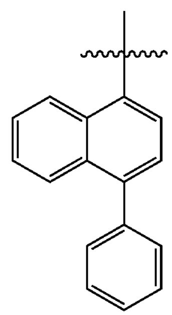 [SMILES: *c1ccc(-c2ccccc2)c2ccccc12] | 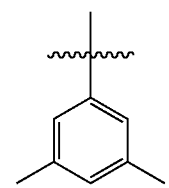 |

-continued
| No. | | Ar1 | Ar2 |
|---|---|---|---|
| 25-23 | 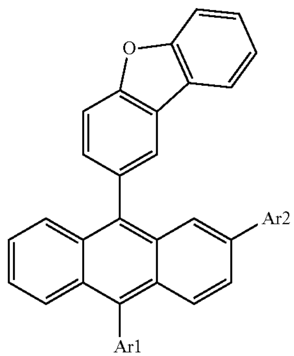 | 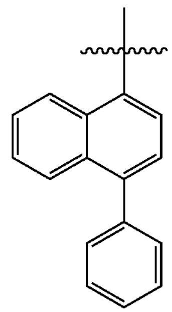 [SMILES: *c1ccc(-c2ccccc2)c2ccccc12] | 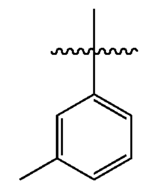 [SMILES: *c1cccc(C)c1] |
| 25-24 | 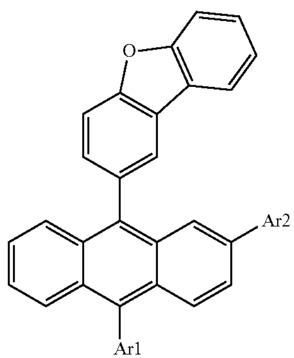 | 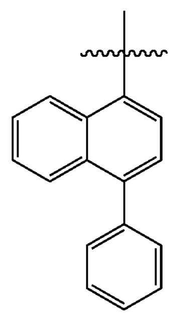 [SMILES: *c1ccc(-c2ccccc2)c2ccccc12] | 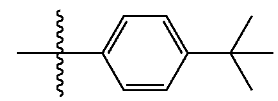 [SMILES: *c1ccc(C(C)(C)C)cc1] |

-continued
| No. | | Ar1 | Ar2 |
|---|---|---|---|
| 25-25 | 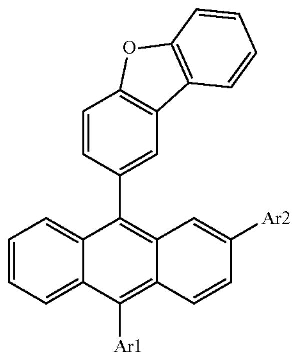 | 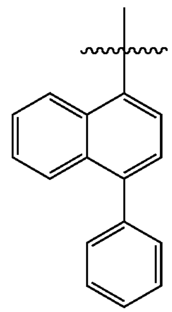 [SMILES: *c1ccc(-c2ccccc2)c2ccccc12] | 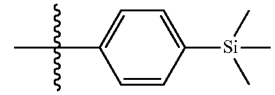 |
| 25-26 | 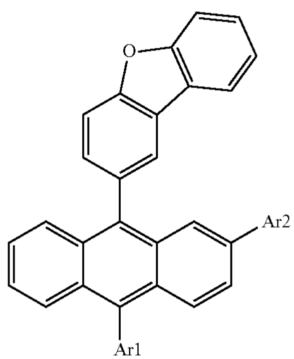 | 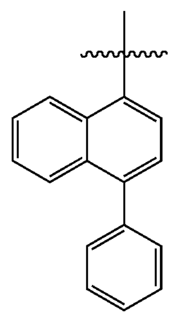 [SMILES: *c1ccc(-c2ccccc2)c2ccccc12] | 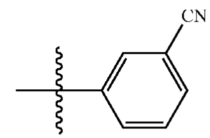 |

-continued
| No. | | Ar1 | Ar2 |
|---|---|---|---|
| 25-27 | 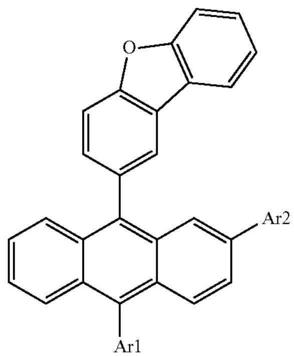 | 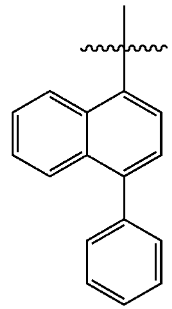 [SMILES: *c1ccc(-c2ccccc2)c2ccccc12] | 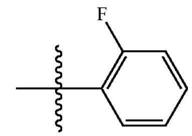 [SMILES: *c1ccccc1F] |
| 25-28 | 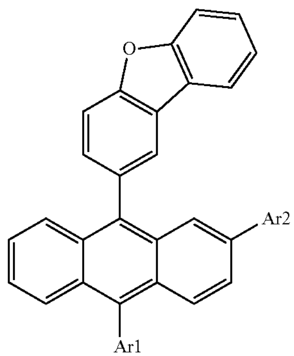 | 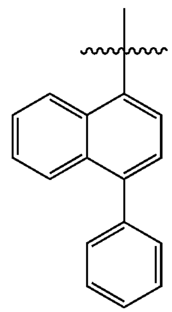 [SMILES: *c1ccc(-c2ccccc2)c2ccccc12] | 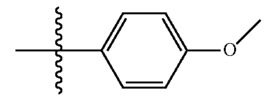 [SMILES: *c1ccc(OC)cc1] |

-continued
| No. | | Ar1 | Ar2 |
|---|---|---|---|
| 26-1 | 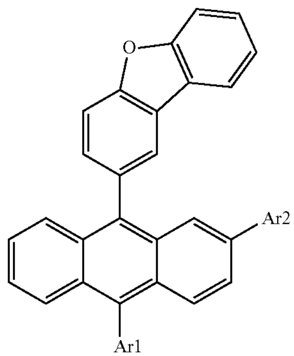 | 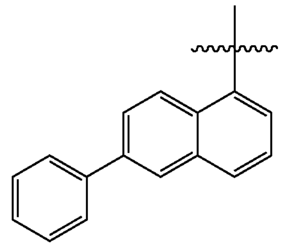 [SMILES: *c1cccc2cc(-c3ccccc3)ccc12] | 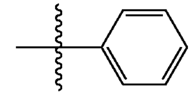 [SMILES: *c1ccccc1] |
| 26-2 | 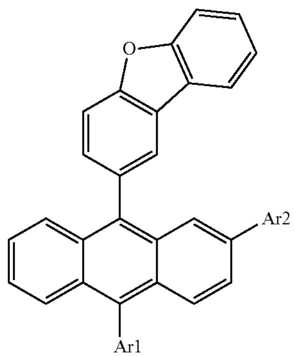 | 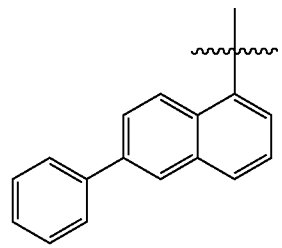 [SMILES: *c1cccc2cc(-c3ccccc3)ccc12] | 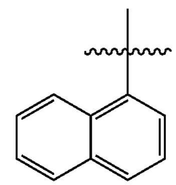 [SMILES: *c1cccc2ccccc12] |

-continued
| No. | | Ar1 | Ar2 |
|---|---|---|---|
| 26-3 | 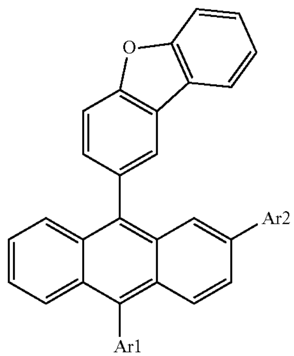 | 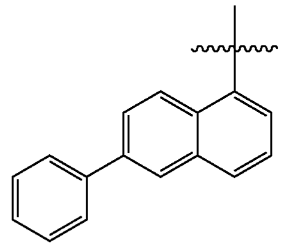 [SMILES: *c1cccc2cc(-c3ccccc3)ccc12] | 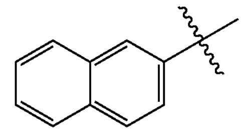 [SMILES: *c1ccc2ccccc2c1] |
| 26-4 | 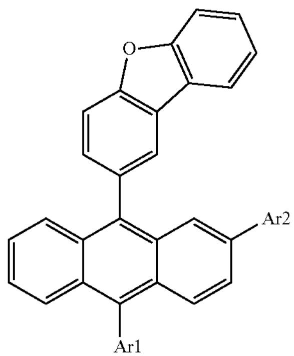 | 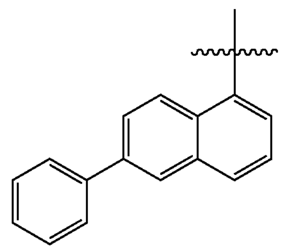 [SMILES: *c1cccc2cc(-c3ccccc3)ccc12] | 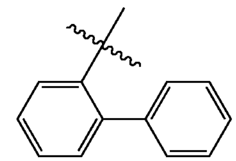 [SMILES: *c1ccccc1-c1ccccc1] |

-continued
| No. | | Ar1 | Ar2 |
|---|---|---|---|
| 26-5 | 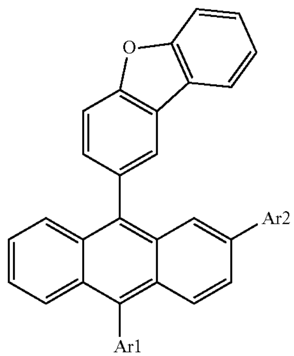 | 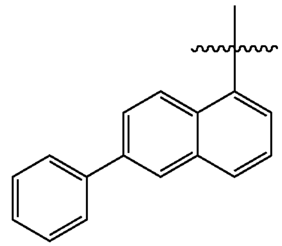 [SMILES: *c1cccc2cc(-c3ccccc3)ccc12] | 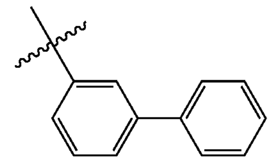 [SMILES: *c1cccc(-c2ccccc2)c1] |
| 26-6 | 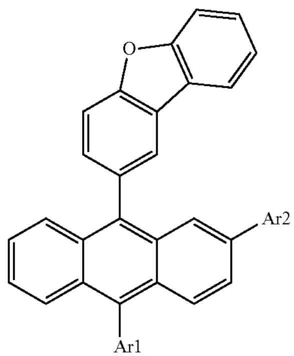 | 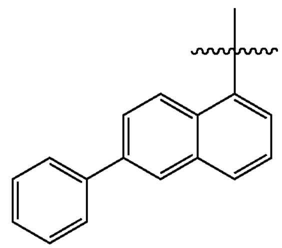 [SMILES: *c1cccc2cc(-c3ccccc3)ccc12] | 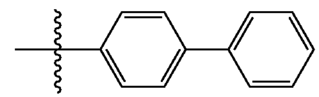 [SMILES: *c1ccc(-c2ccccc2)cc1] |

-continued
| No. | | Ar1 | Ar2 |
|---|---|---|---|
| 26-7 | 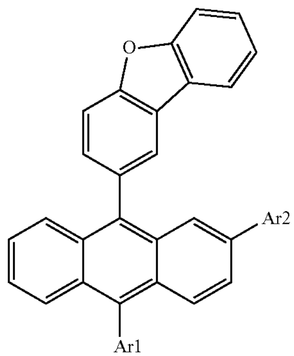 | 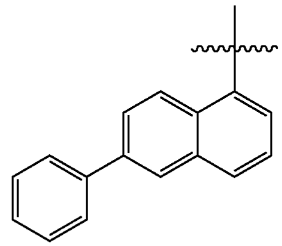 [SMILES: *c1cccc2cc(-c3ccccc3)ccc12] | 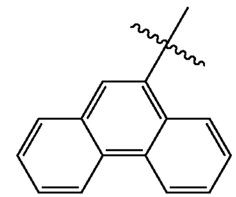 [SMILES: *c1cc2ccccc2c2ccccc12] |
| 26-8 | 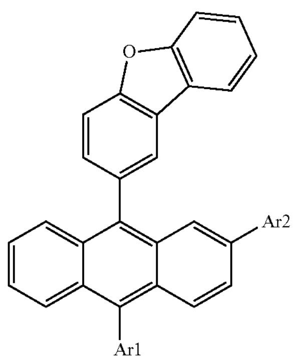 | 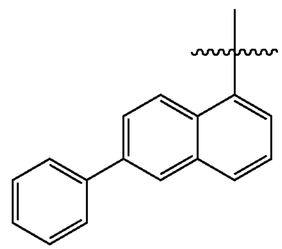 [SMILES: *c1cccc2cc(-c3ccccc3)ccc12] | 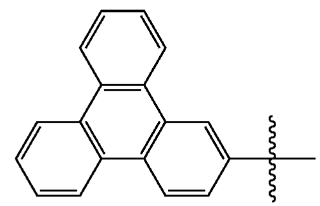 [SMILES: *c1ccc2c3ccccc3c3ccccc3c2c1] |

-continued
| No. | | Ar1 | Ar2 |
|---|---|---|---|
| 26-9 | 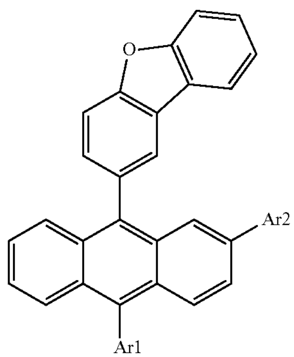 | 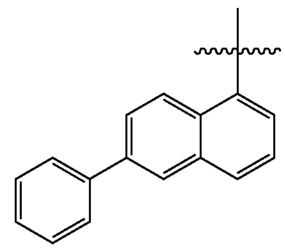 [SMILES: *c1cccc2cc(-c3ccccc3)ccc12] | 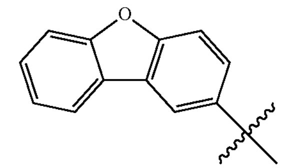 |
| 26-10 | 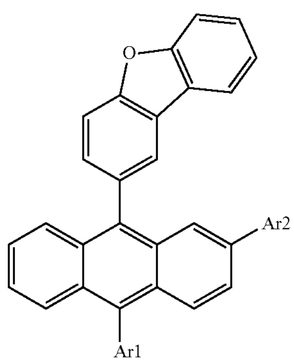 | 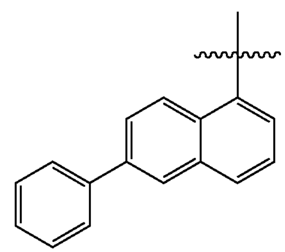 [SMILES: *c1cccc2cc(-c3ccccc3)ccc12] | 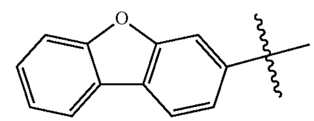 |

-continued
| No. | | Ar1 | Ar2 |
|---|---|---|---|
| 26-11 | 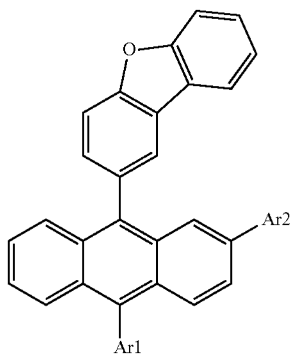 | 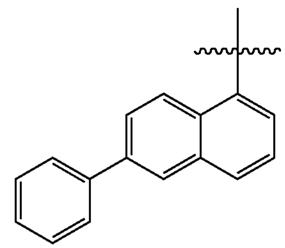 [SMILES: *c1cccc2cc(-c3ccccc3)ccc12] | 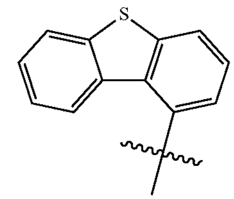 [SMILES: *c1cccc2sc3ccccc3c12] |
| 26-12 | 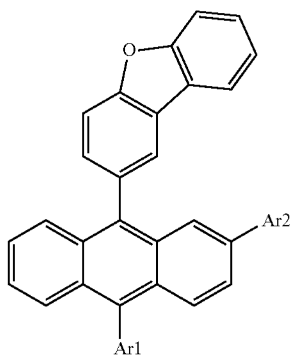 | 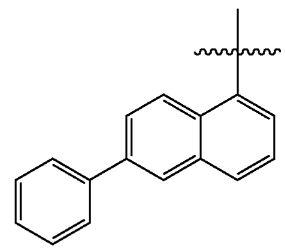 [SMILES: *c1cccc2cc(-c3ccccc3)ccc12] | 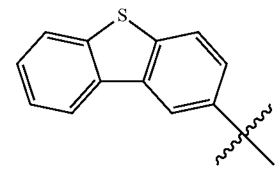 [SMILES: *c1ccc2sc3ccccc3c2c1] |

-continued
| No. | | Ar1 | Ar2 |
|---|---|---|---|
| 26-13 | 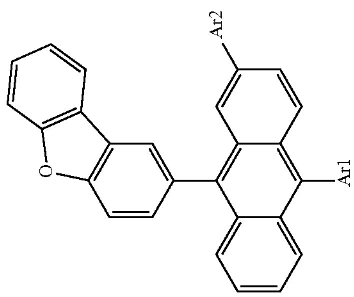 | 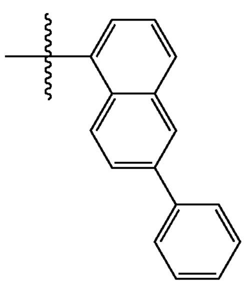 | 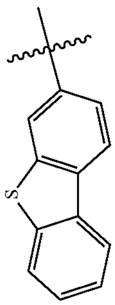 |
| 26-14 | 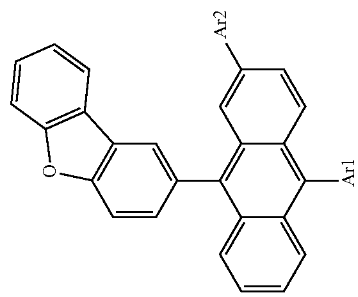 | 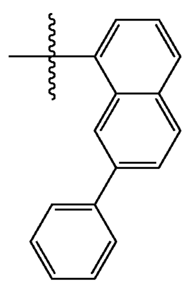 | 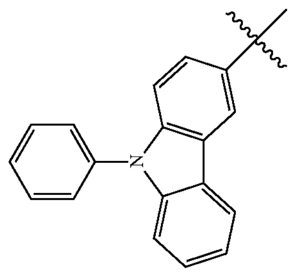 |

-continued
| No. | | Ar1 | Ar2 |
|---|---|---|---|
| 26-15 | 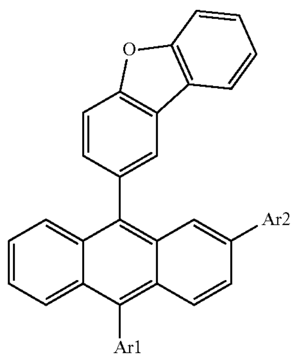 | 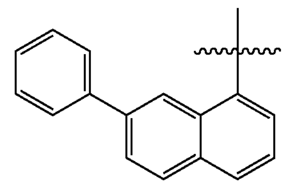 [SMILES: *c1cccc2ccc(-c3ccccc3)cc12] | 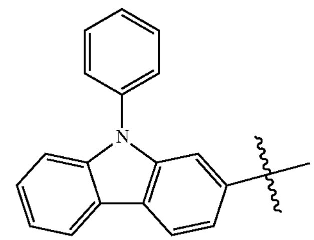 [SMILES: *c1ccc2c3ccccc3n(-c3ccccc3)c2c1] |
| 26-16 | 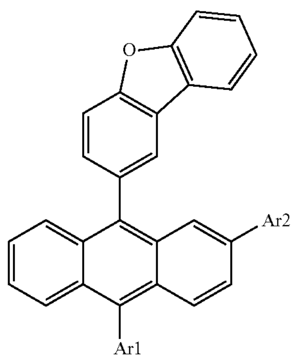 | 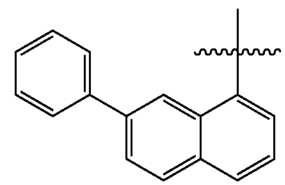 [SMILES: *c1cccc2ccc(-c3ccccc3)cc12] | 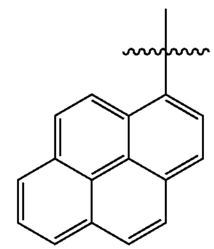 [SMILES: *c1ccc2ccc3cccc4ccc1c2c34] |

-continued
| No. | | Ar1 | Ar2 |
|---|---|---|---|
| 26-17 | 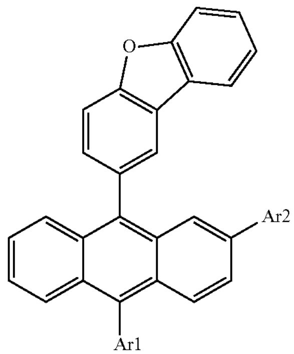 | 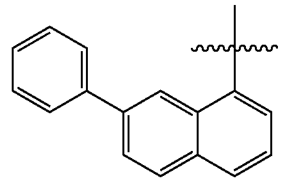 [SMILES: *c1cccc2ccc(-c3ccccc3)cc12] | 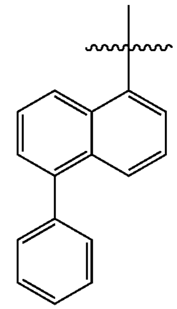 [SMILES: *c1cccc2c(-c3ccccc3)cccc12] |
| 26-18 | 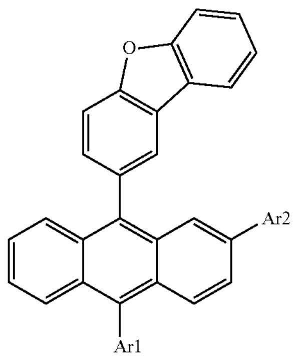 | 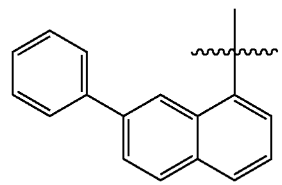 [SMILES: *c1cccc2ccc(-c3ccccc3)cc12] | 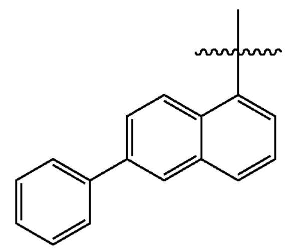 [SMILES: *c1cccc2cc(-c3ccccc3)ccc12] |

-continued
| No. | | Ar1 | Ar2 |
|---|---|---|---|
| 26-19 | 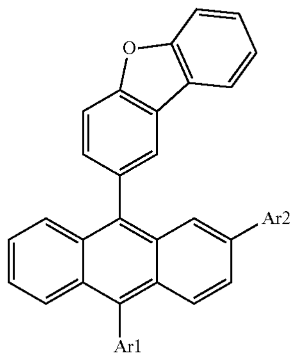 | 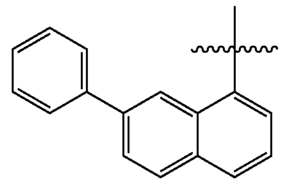 [SMILES: *c1cccc2ccc(-c3ccccc3)cc12] | 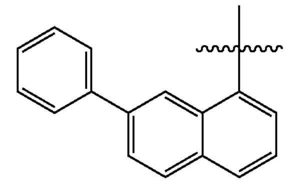 [SMILES: *c1cccc2ccc(-c3ccccc3)cc12] |
| 26-20 | 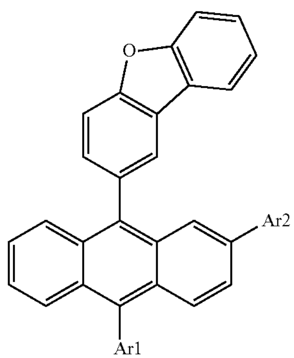 | 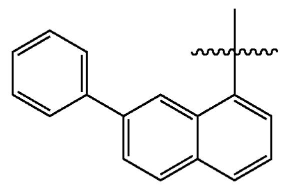 [SMILES: *c1cccc2ccc(-c3ccccc3)cc12] | 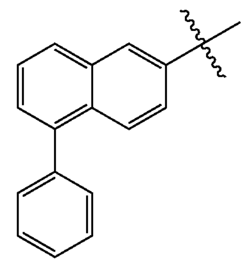 [SMILES: *c1ccc2c(-c3ccccc3)cccc2c1] |

-continued
| No. | | Ar1 | Ar2 |
|---|---|---|---|
| 26-21 | 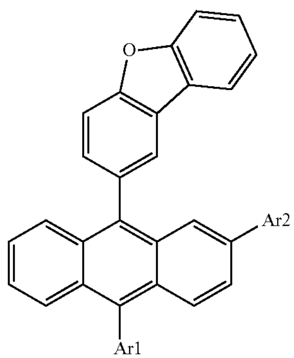 | 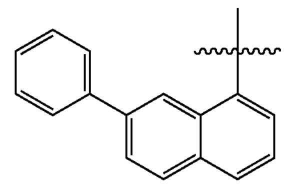 [SMILES: *c1cccc2ccc(-c3ccccc3)cc12] | 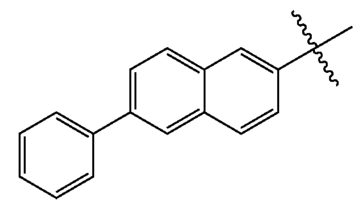 [SMILES: *c1ccc2cc(-c3ccccc3)ccc2c1] |
| 26-22 | 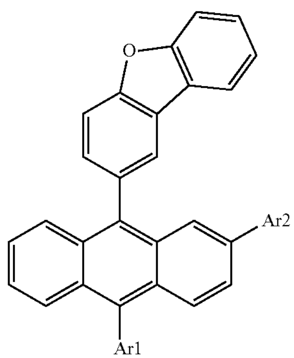 | 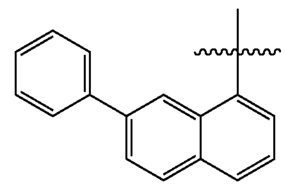 [SMILES: *c1cccc2ccc(-c3ccccc3)cc12] | 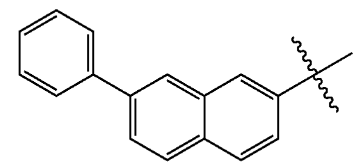 [SMILES: *c1ccc2ccc(-c3ccccc3)cc2c1] |

-continued
| No. | | Ar1 | Ar2 |
|---|---|---|---|
| 26-23 | 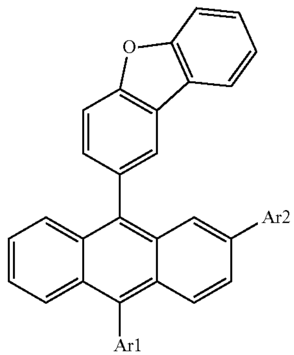 | 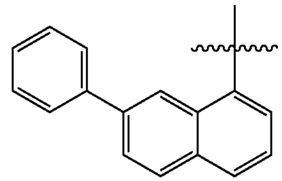 [SMILES: *c1cccc2ccc(-c3ccccc3)cc12] | 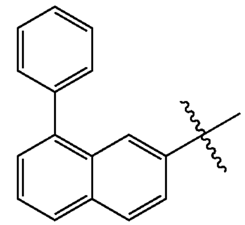 [SMILES: *c1ccc2cccc(-c3ccccc3)c2c1] |
| 26-24 | 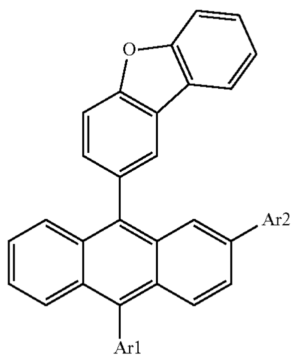 | 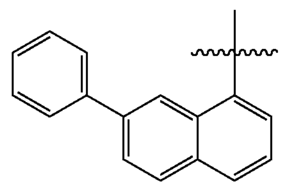 [SMILES: *c1cccc2ccc(-c3ccccc3)cc12] | 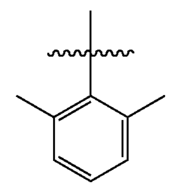 |

-continued
| No. | | Ar1 | Ar2 |
|---|---|---|---|
| 26-25 | 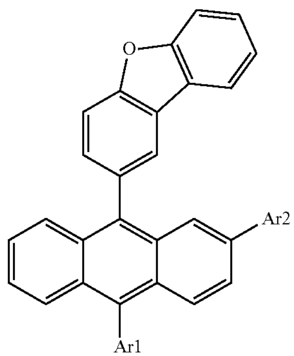 | 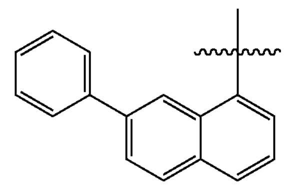 [SMILES: *c1cccc2ccc(-c3ccccc3)cc12] | 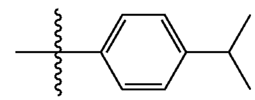 [SMILES: *c1ccc(C(C)C)cc1] |
| 26-26 | 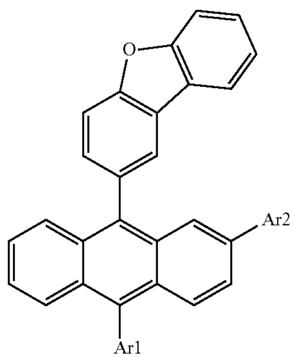 | 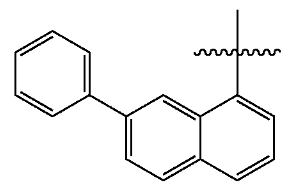 [SMILES: *c1cccc2ccc(-c3ccccc3)cc12] | 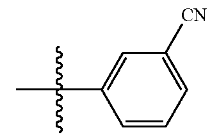 [SMILES: *c1cccc(C#N)c1] |

-continued
| No. | | Ar1 | Ar2 |
|---|---|---|---|
| 26-27 | 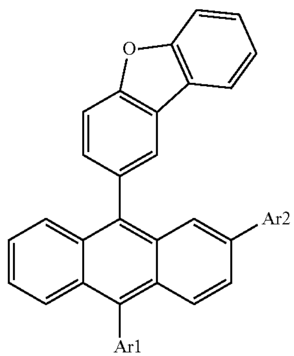  | 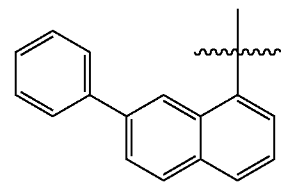 [SMILES: *c1cccc2ccc(-c3ccccc3)cc12] | 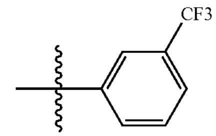 [SMILES: *c1cccc(C(F)(F)F)c1]  |
| 26-28 | 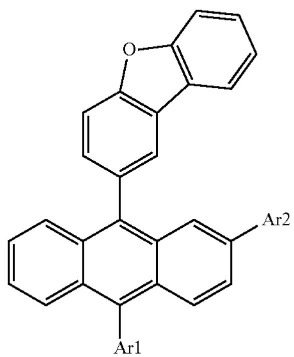  | 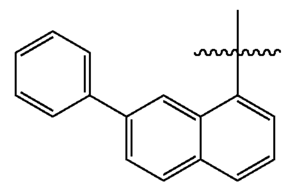 [SMILES: *c1cccc2ccc(-c3ccccc3)cc12] | 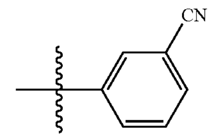 [SMILES: *c1cccc(C#N)c1]  |

-continued
| No. | | Ar1 | Ar2 |
|---|---|---|---|
| 26-29 | 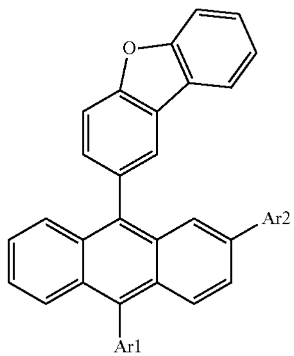 | 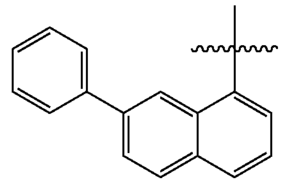 [SMILES: *c1cccc2ccc(-c3ccccc3)cc12] | 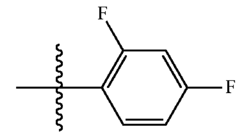 [SMILES: *c1ccc(F)cc1F] |
| 27-1 | 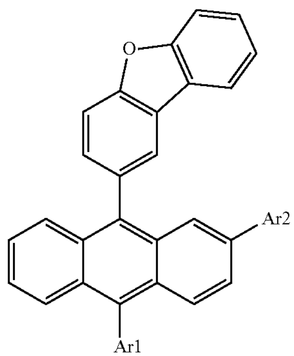 | 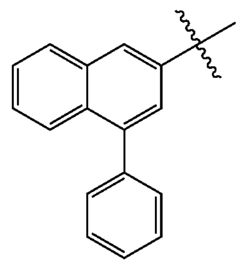 [SMILES: *c1cc(-c2ccccc2)c2ccccc2c1] | 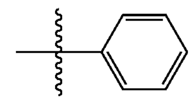 |

-continued
| No. | | Ar1 | Ar2 |
|---|---|---|---|
| 27-2 | 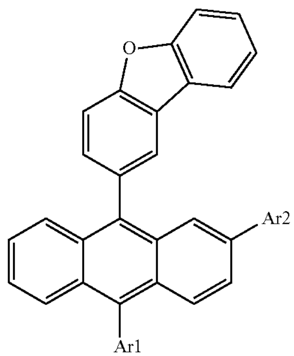 | 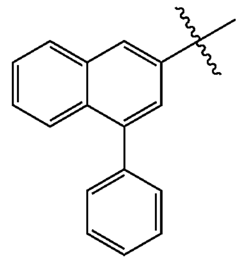 [SMILES: *c1cc(-c2ccccc2)c2ccccc2c1] | 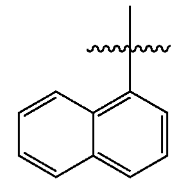 [SMILES: *c1cccc2ccccc12] |
| 27-3 | 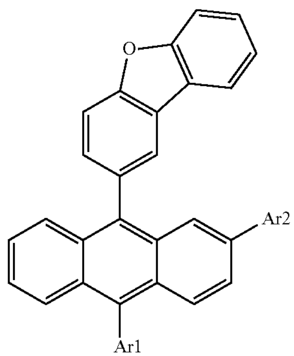 | 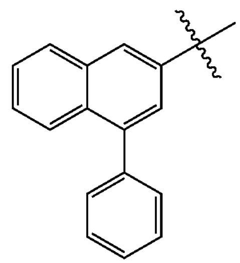 [SMILES: *c1cc(-c2ccccc2)c2ccccc2c1] | 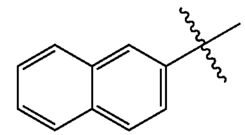 [SMILES: *c1ccc2ccccc2c1] |

-continued
| No. | | Ar1 | Ar2 |
|---|---|---|---|
| 27-4 | 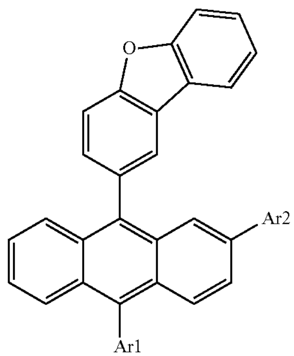 | 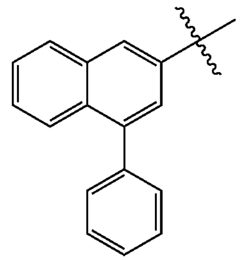 [SMILES: *c1cc(-c2ccccc2)c2ccccc2c1] | 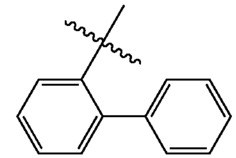 [SMILES: *c1ccccc1-c1ccccc1] |
| 27-5 | 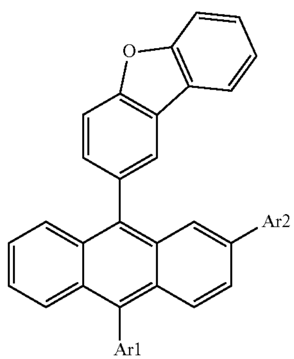 | 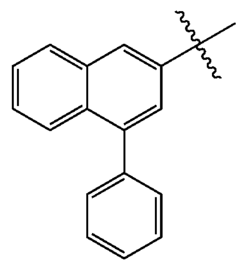 [SMILES: *c1cc(-c2ccccc2)c2ccccc2c1] | 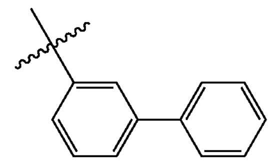 [SMILES: *c1cccc(-c2ccccc2)c1] |

-continued
| No. | | Ar1 | Ar2 |
|---|---|---|---|
| 27-6 | 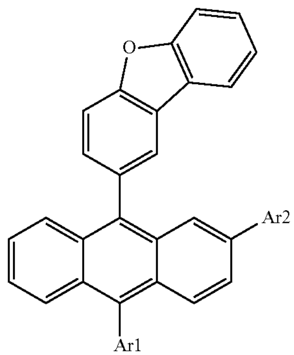 | 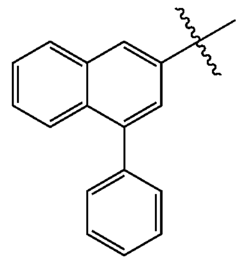 [SMILES: *c1cc(-c2ccccc2)c2ccccc2c1] | 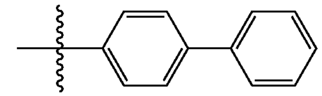 |
| 27-7 | 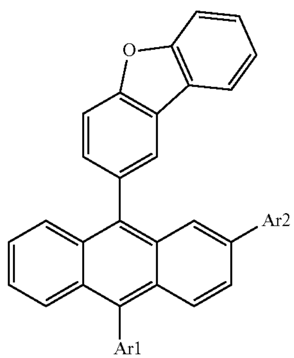 | 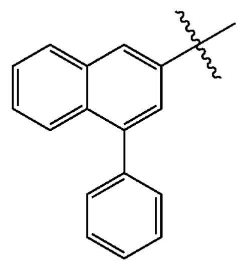 [SMILES: *c1cc(-c2ccccc2)c2ccccc2c1] | 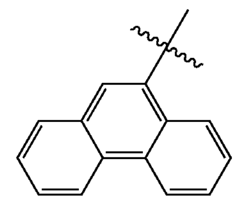 [SMILES: *c1cc2ccccc2c2ccccc12] |

-continued
| No. | | Ar1 | Ar2 |
|---|---|---|---|
| 27-8 | 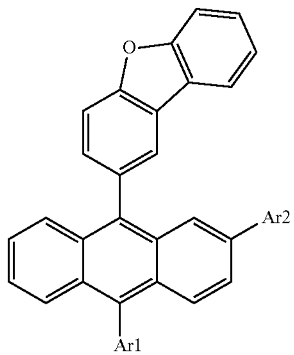 | 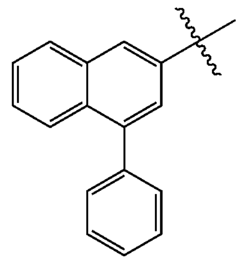 [SMILES: *c1cc(-c2ccccc2)c2ccccc2c1] | 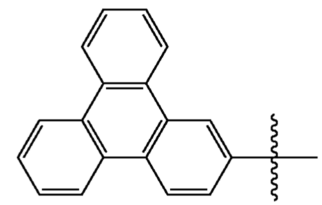 |
| 27-9 | 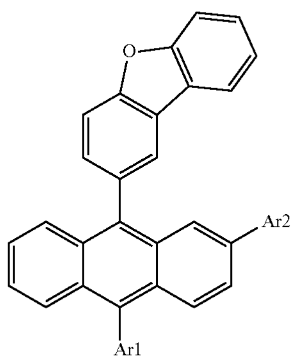 | 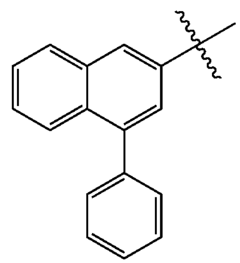 [SMILES: *c1cc(-c2ccccc2)c2ccccc2c1] | 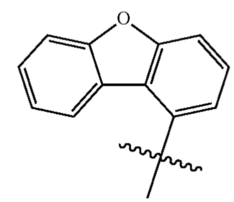 [SMILES: *c1cccc2oc3ccccc3c12] |

-continued
| No. | | Ar1 | Ar2 |
|---|---|---|---|
| 27-10 | 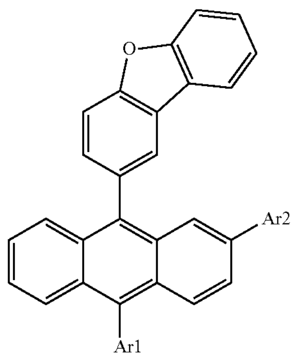 | 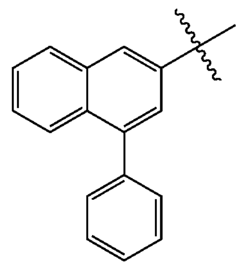 [SMILES: *c1cc(-c2ccccc2)c2ccccc2c1] | 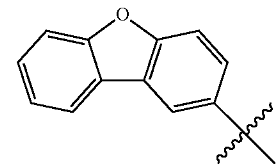 |
| 27-11 | 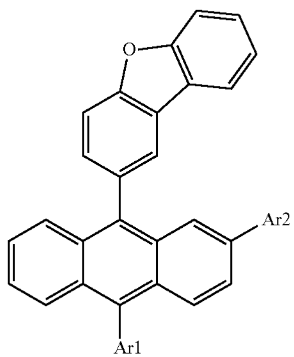 | 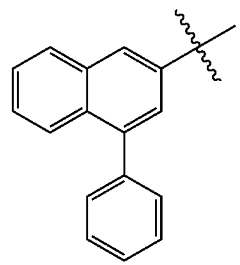 [SMILES: *c1cc(-c2ccccc2)c2ccccc2c1] | 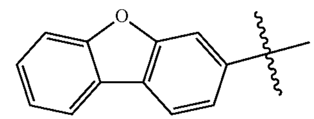 |

-continued
| No. | | Ar1 | Ar2 |
|---|---|---|---|
| 27-12 | 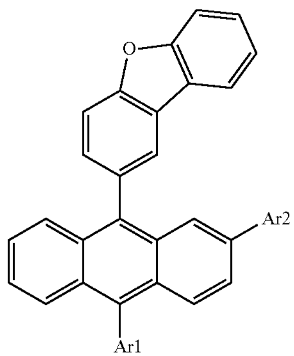 | 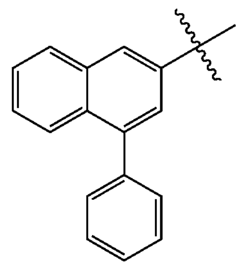 [SMILES: *c1cc(-c2ccccc2)c2ccccc2c1] | 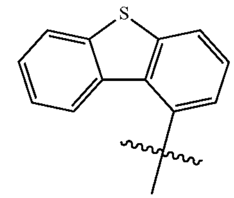 |
| 27-13 | 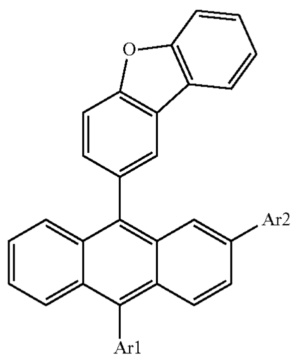 | 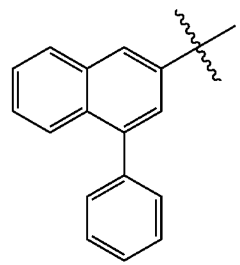 [SMILES: *c1cc(-c2ccccc2)c2ccccc2c1] | 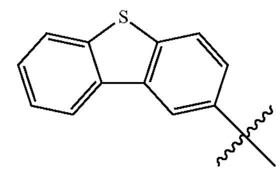 |

-continued
| No. | | Ar1 | Ar2 |
|---|---|---|---|
| 27-14 | 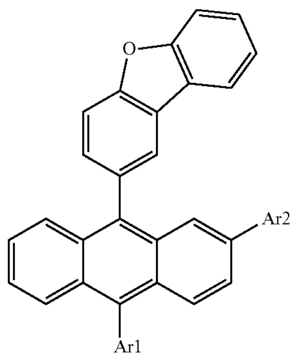 | 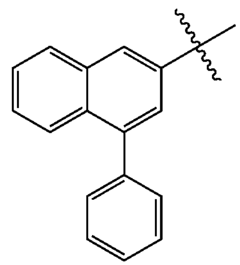 [SMILES: *c1cc(-c2ccccc2)c2ccccc2c1] | 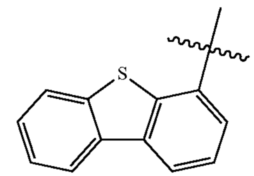 |
| 27-15 | 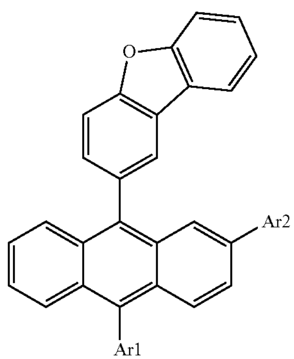 | 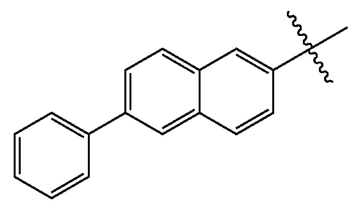 [SMILES: *c1ccc2cc(-c3ccccc3)ccc2c1] | 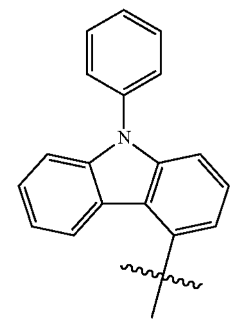 [SMILES: *c1cccc2c1c1ccccc1n2-c1ccccc1] |

-continued
| No. | | Ar1 | Ar2 |
|---|---|---|---|
| 27-16 | 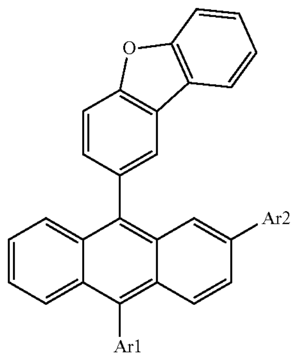 | 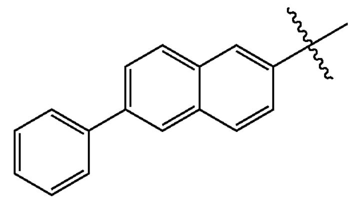 [SMILES: *c1ccc2cc(-c3ccccc3)ccc2c1] | 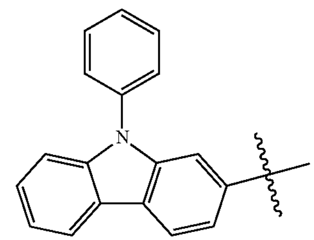 [SMILES: *c1ccc2c3ccccc3n(-c3ccccc3)c2c1] |
| 27-17 | 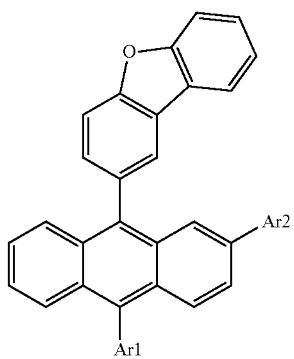 | 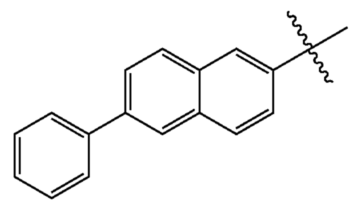 [SMILES: *c1ccc2cc(-c3ccccc3)ccc2c1] | 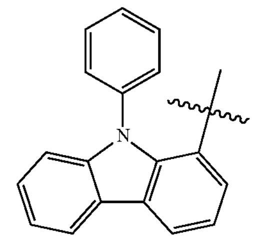 [SMILES: *c1cccc2c3ccccc3n(-c3ccccc3)c12] |

-continued
| No. | | Ar1 | Ar2 |
|---|---|---|---|
| 27-18 | 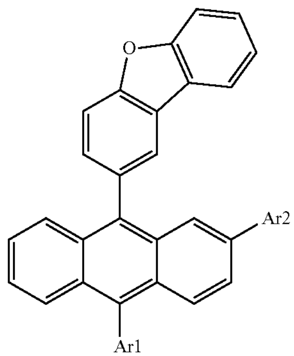 | 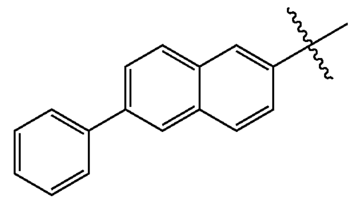 [SMILES: *c1ccc2cc(-c3ccccc3)ccc2c1] | 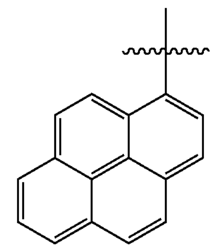 [SMILES: *c1ccc2ccc3cccc4ccc1c2c34] |
| 27-19 | 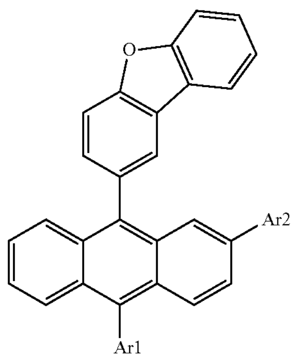 | 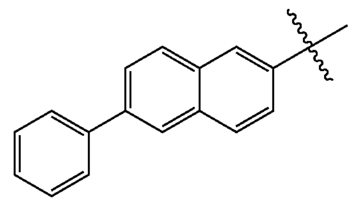 [SMILES: *c1ccc2cc(-c3ccccc3)ccc2c1] | 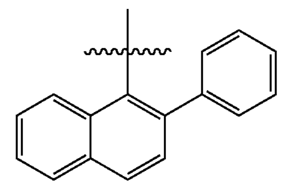 [SMILES: *c1c(-c2ccccc2)ccc2ccccc12] |

-continued
| No. | | Ar1 | Ar2 |
|---|---|---|---|
| 27-20 | 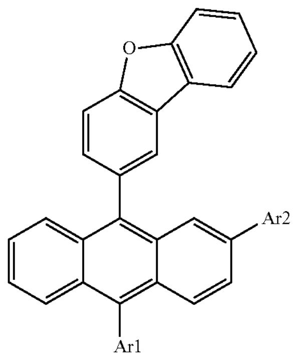 | 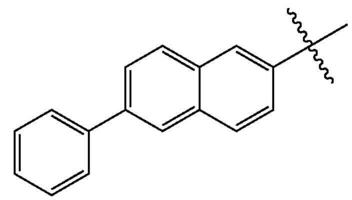 [SMILES: *c1ccc2cc(-c3ccccc3)ccc2c1] | 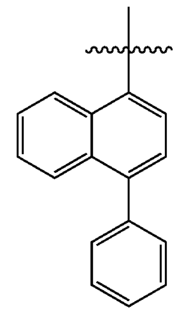 [SMILES: *c1ccc(-c2ccccc2)c2ccccc12] |
| 27-21 | 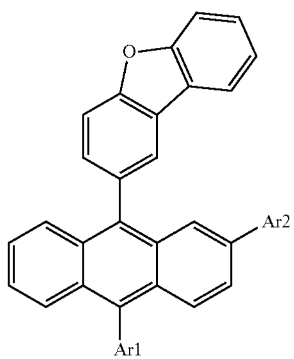 | 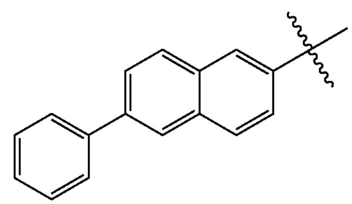 [SMILES: *c1ccc2cc(-c3ccccc3)ccc2c1] | 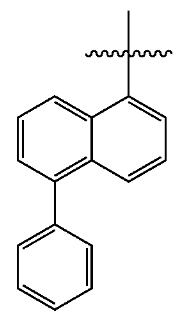 [SMILES: *c1cccc2c(-c3ccccc3)cccc12] |

-continued
| No. | | Ar1 | Ar2 |
|---|---|---|---|
| 27-22 | 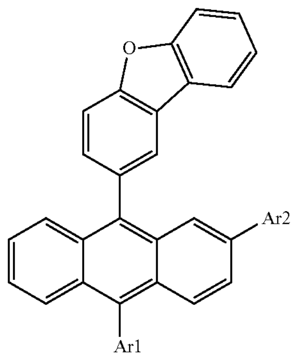  | 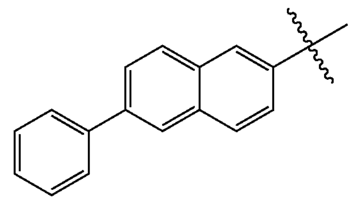 [SMILES: *c1ccc2cc(-c3ccccc3)ccc2c1] | 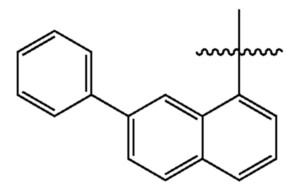 [SMILES: *c1cccc2ccc(-c3ccccc3)cc12] |
| 27-23 | 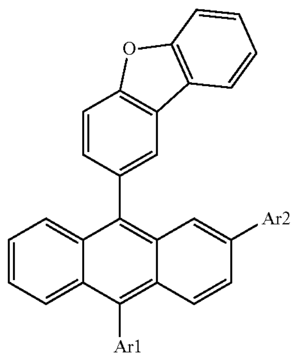  | 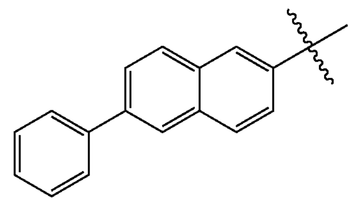 [SMILES: *c1ccc2cc(-c3ccccc3)ccc2c1] | 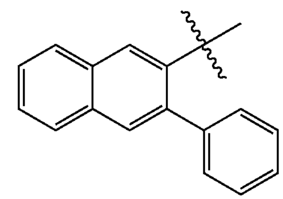 [SMILES: *c1cc2ccccc2cc1-c1ccccc1] |

-continued
| No. | | Ar1 | Ar2 |
|---|---|---|---|
| 27-24 | 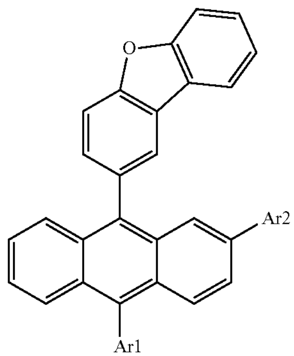 | 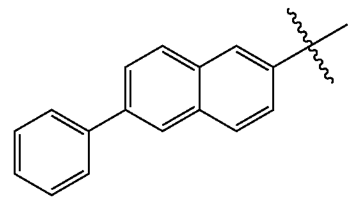 [SMILES: *c1ccc2cc(-c3ccccc3)ccc2c1] | 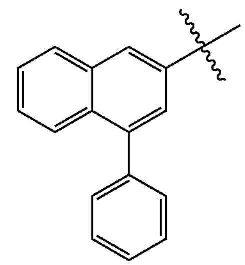 [SMILES: *c1cc(-c2ccccc2)c2ccccc2c1] |
| 27-25 | 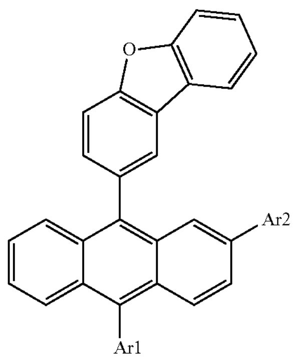 | 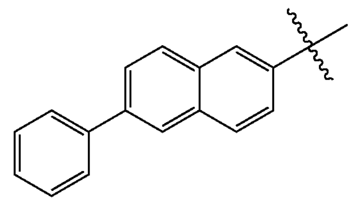 [SMILES: *c1ccc2cc(-c3ccccc3)ccc2c1] | 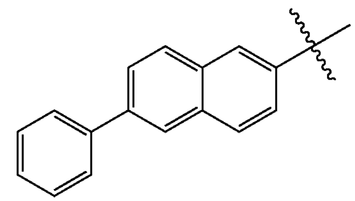 [SMILES: *c1ccc2cc(-c3ccccc3)ccc2c1] |

-continued
| No. | | Ar1 | Ar2 |
|---|---|---|---|
| 27-26 | 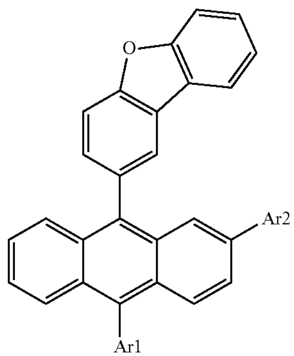 | 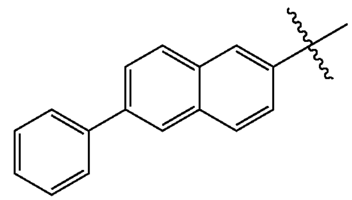 [SMILES: *c1ccc2cc(-c3ccccc3)ccc2c1] | 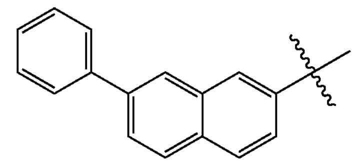 [SMILES: *c1ccc2ccc(-c3ccccc3)cc2c1] |
| 27-27 | 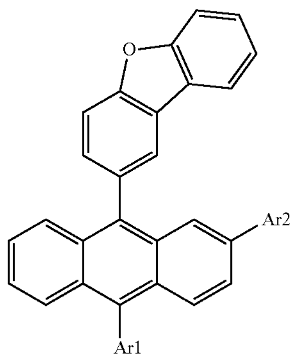 | 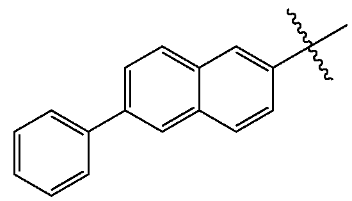 [SMILES: *c1ccc2cc(-c3ccccc3)ccc2c1] | 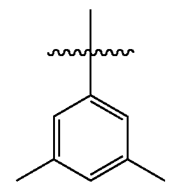 |

-continued
| No. | | Ar1 | Ar2 |
|---|---|---|---|
| 27-28 | 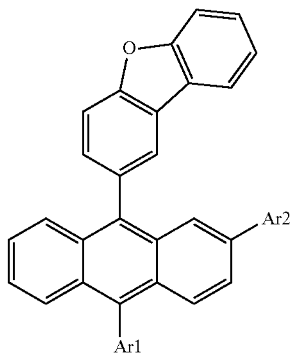 | 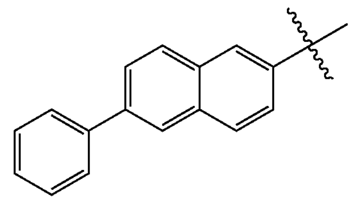 [SMILES: *c1ccc2cc(-c3ccccc3)ccc2c1] | 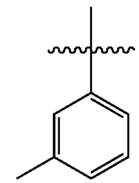 [SMILES: *c1cccc(C)c1] |
| 27-29 | 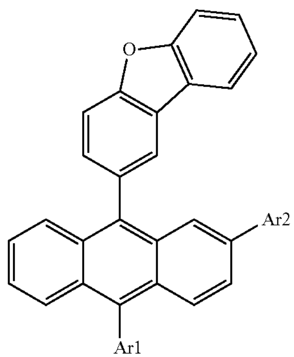 | 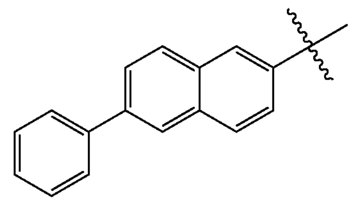 [SMILES: *c1ccc2cc(-c3ccccc3)ccc2c1] | 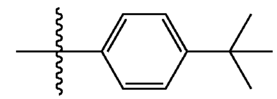 [SMILES: *c1ccc(C(C)(C)C)cc1] |

-continued
| No. | | Ar1 | Ar2 |
|---|---|---|---|
| 27-30 | 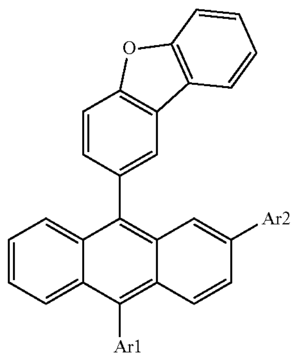 | 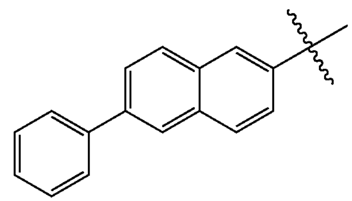 [SMILES: *c1ccc2cc(-c3ccccc3)ccc2c1] | 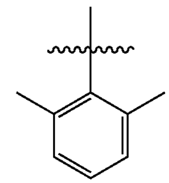 |
| 27-31 | 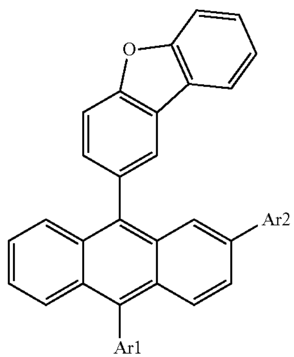 | 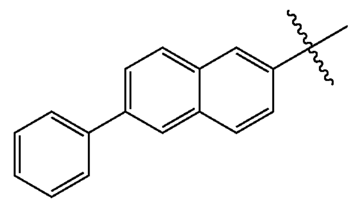 [SMILES: *c1ccc2cc(-c3ccccc3)ccc2c1] | 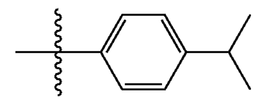 [SMILES: *c1ccc(C(C)C)cc1] |

-continued
| No. | | Ar1 | Ar2 |
|---|---|---|---|
| 28-1 | 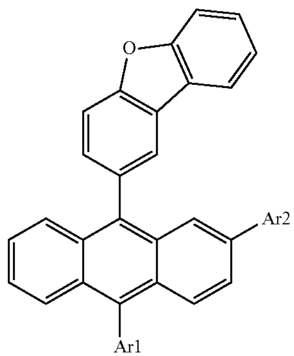 | 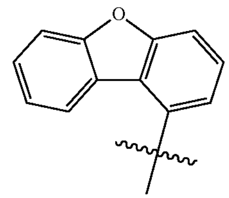 [SMILES: *c1cccc2oc3ccccc3c12] | 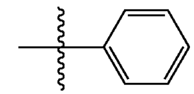 |
| 28-2 | 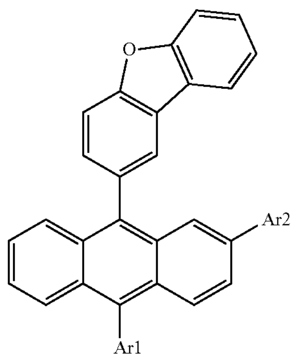 | 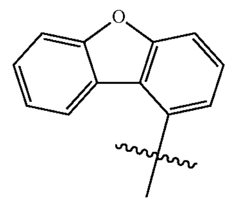 [SMILES: *c1cccc2oc3ccccc3c12] | 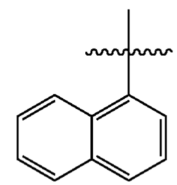 [SMILES: *c1cccc2ccccc12] |

-continued
| No. | | Ar1 | Ar2 |
| --- | --- | --- | --- |
| 28-3 | 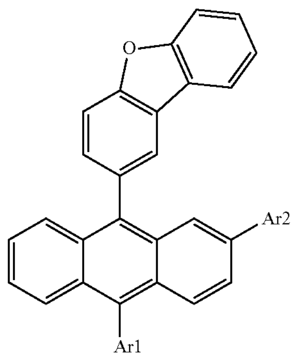  | 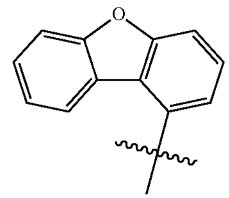 [SMILES: *c1cccc2oc3ccccc3c12] | 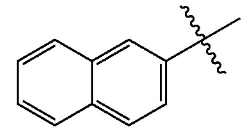 [SMILES: *c1ccc2ccccc2c1] |
| 28-4 | 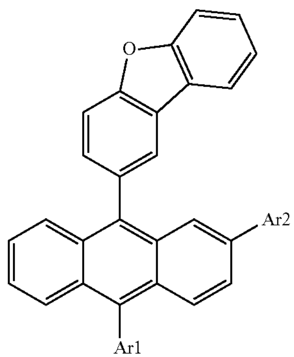  | 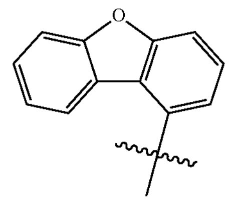 | 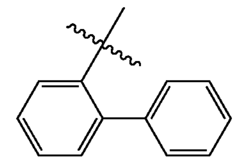 [SMILES: *c1ccccc1-c1ccccc1] |

-continued
| No. | | Ar1 | Ar2 |
|---|---|---|---|
| 28-5 | 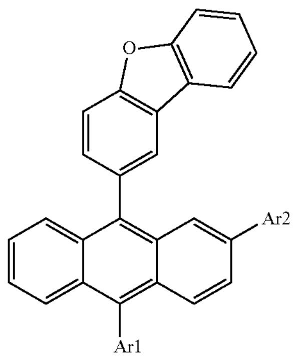 | 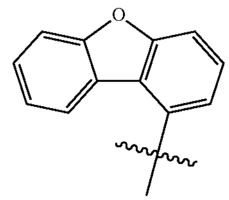 | 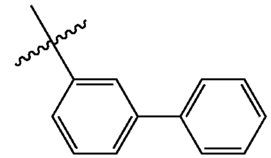 [SMILES: *c1cccc(-c2ccccc2)c1] |
| 28-6 | 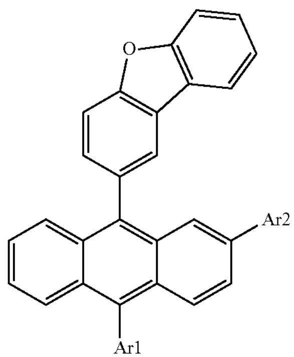 | 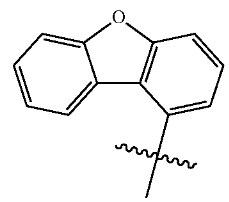 | 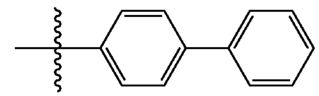 |

-continued
| No. | | Ar1 | Ar2 |
|---|---|---|---|
| 28-7 | 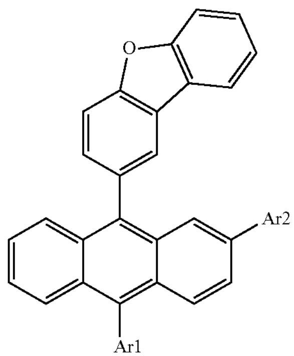 | 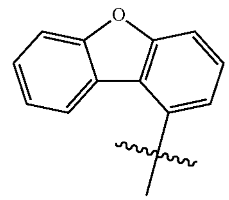 | 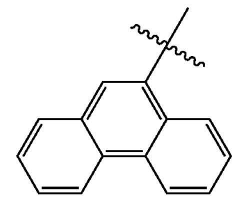 [SMILES: *c1cc2ccccc2c2ccccc12] |
| 28-8 | 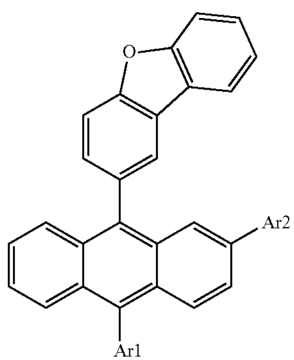 | 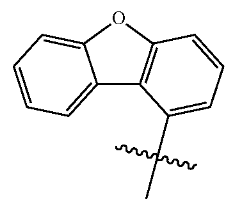 | 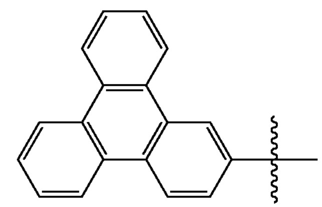 |

-continued
| No. | | Ar1 | Ar2 |
|---|---|---|---|
| 28-9 | 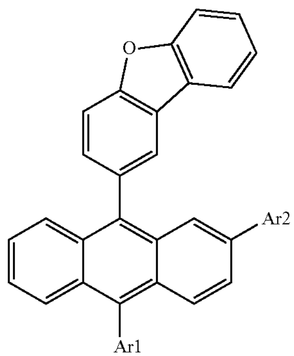 | 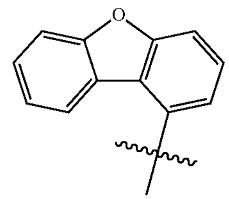 | 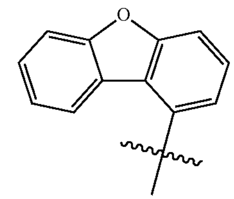 [SMILES: *c1cccc2oc3ccccc3c12] |
| 28-10 | 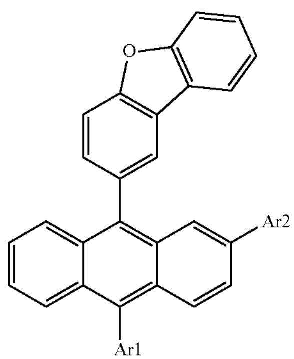 | 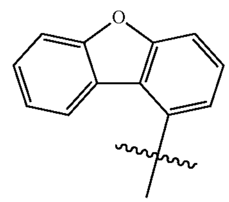 [SMILES: *c1cccc2oc3ccccc3c12] | 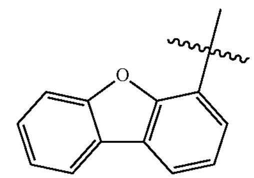 [SMILES: *c1cccc2c1oc1ccccc12] |

-continued
| No. | | Ar1 | Ar2 |
|---|---|---|---|
| 28-11 | 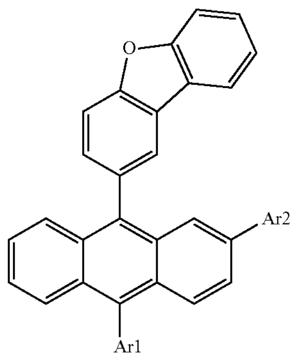 | 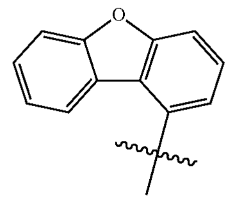 | 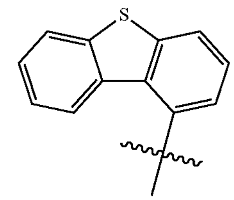 [SMILES: *c1cccc2sc3ccccc3c12] |
| 28-12 | 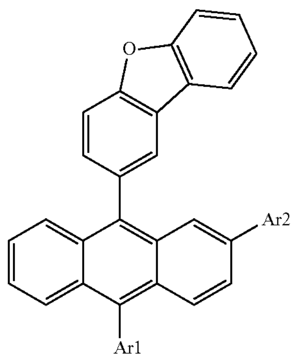 | 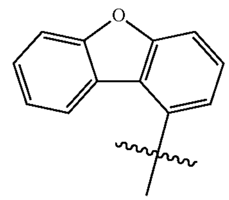 [SMILES: *c1cccc2oc3ccccc3c12] | 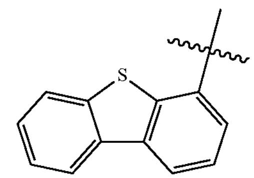 [SMILES: *c1cccc2c1sc1ccccc12] |

-continued
| No. | | Ar1 | Ar2 |
|---|---|---|---|
| 28-13 | 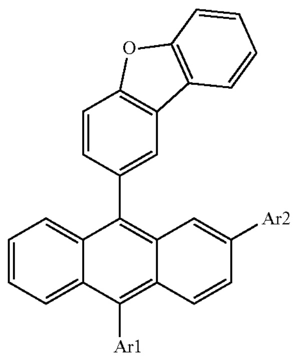 | 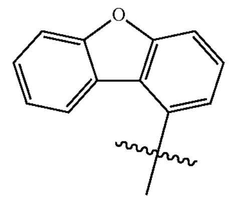 | 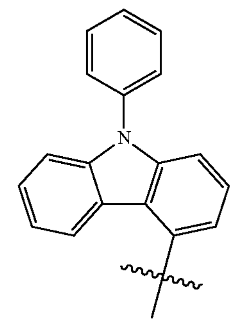 [SMILES: *c1cccc2c1c1ccccc1n2-c1ccccc1] |
| 28-14 | 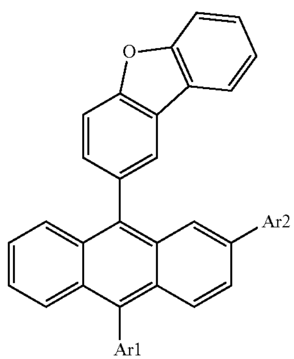 | 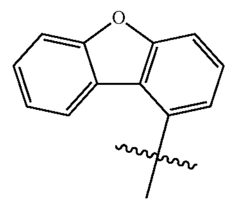 | 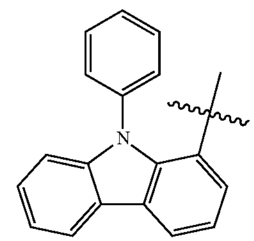 [SMILES: *c1cccc2c3ccccc3n(-c3ccccc3)c12] |

-continued
| No. | | Ar1 | Ar2 |
|---|---|---|---|
| 28-15 | 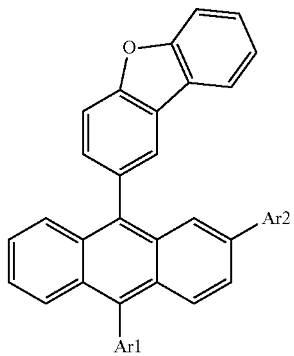 | 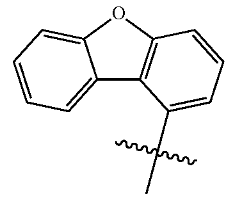 | 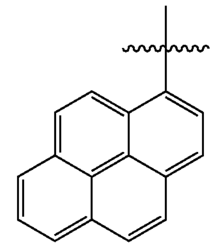 [SMILES: *c1ccc2ccc3cccc4ccc1c2c34] |
| 28-16 | 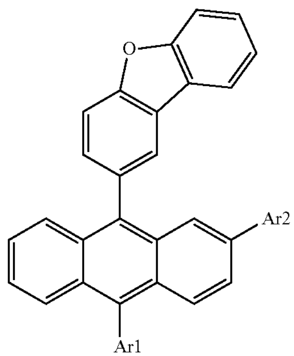 | 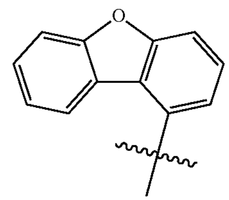 | 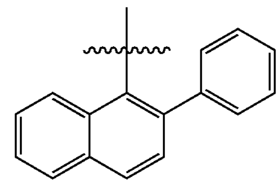 [SMILES: *c1c(-c2ccccc2)ccc2ccccc12] |

-continued
| No. | | Ar1 | Ar2 |
|---|---|---|---|
| 28-17 | 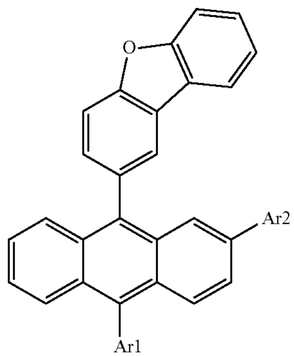 | 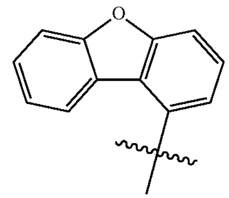 | 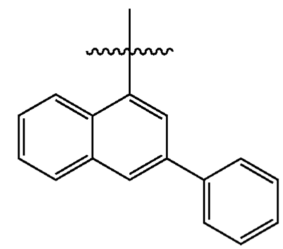 [SMILES: *c1cc(-c2ccccc2)cc2ccccc12] |
| 28-18 | 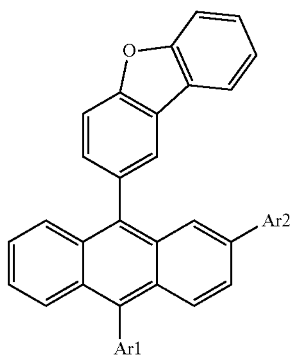 | 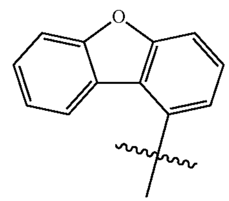 | 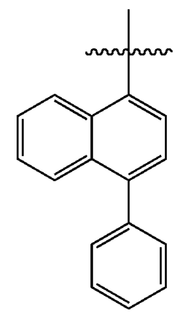 [SMILES: *c1ccc(-c2ccccc2)c2ccccc12] |

-continued
| No. | | Ar1 | Ar2 |
|---|---|---|---|
| 28-19 | 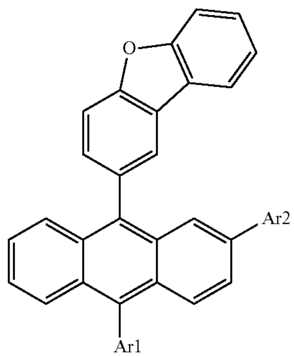 | 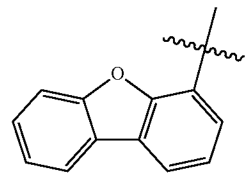 | 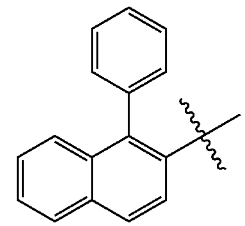 [SMILES: *c1ccc2ccccc2c1-c1ccccc1] |
| 28-20 | 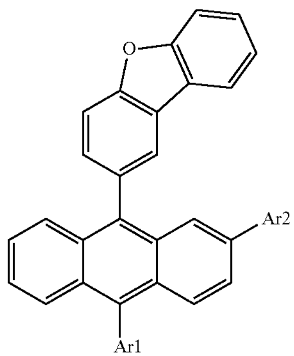 | 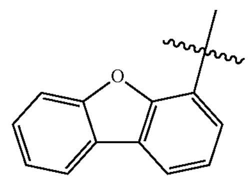 | 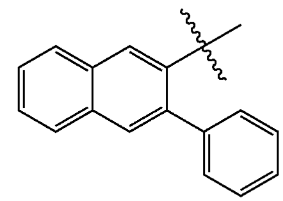 [SMILES: *c1cc2ccccc2cc1-c1ccccc1] |

-continued
| No. | | Ar1 | Ar2 |
| --- | --- | --- | --- |
| 28-21 | 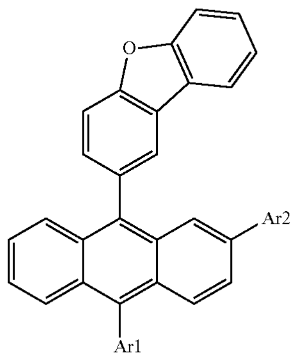 | 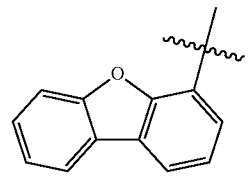 | 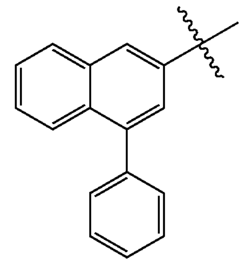 [SMILES: *c1cc(-c2ccccc2)c2ccccc2c1] |
| 28-22 | 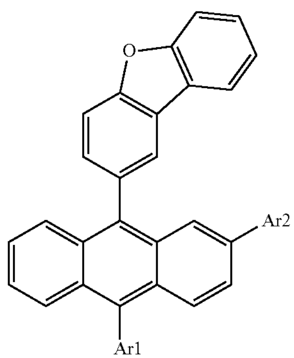 | 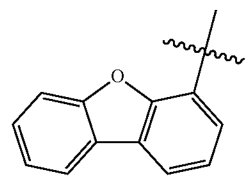 | 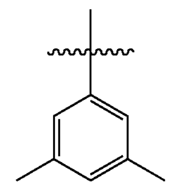 |

-continued
| No. | | Ar1 | Ar2 |
|---|---|---|---|
| 28-23 | 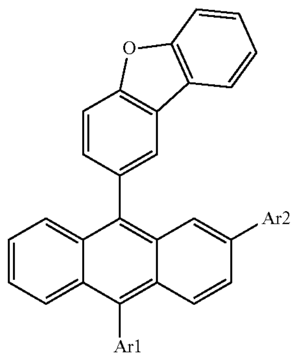 | 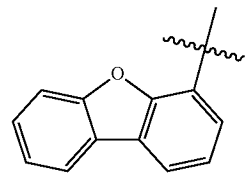 | 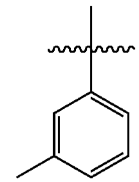 [SMILES: *c1cccc(C)c1] |
| 28-24 | 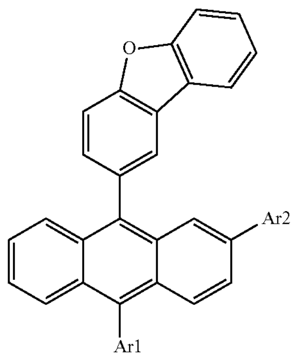 | 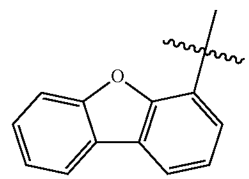 | 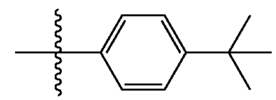 [SMILES: *c1ccc(C(C)(C)C)cc1] |

-continued
| No. | | Ar1 | Ar2 |
|---|---|---|---|
| 28-25 | 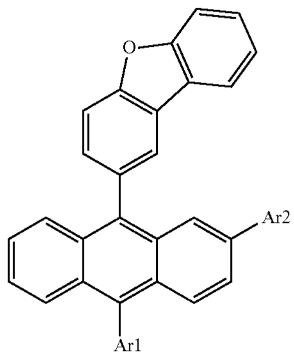 | 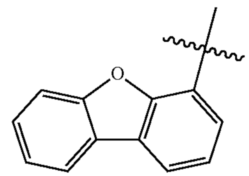 | 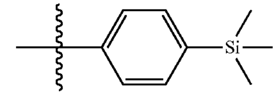 [SMILES: *c1ccc([Si](C)(C)C)cc1] |
| 28-26 | 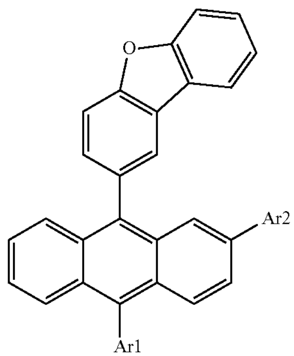 | 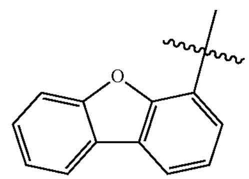 | 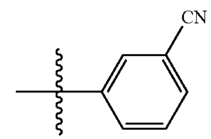 [SMILES: *c1cccc(C#N)c1] |

-continued
| No. | | Ar1 | Ar2 |
|---|---|---|---|
| 28-27 | 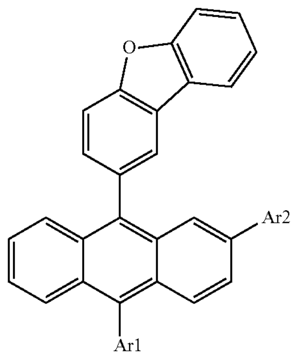 | 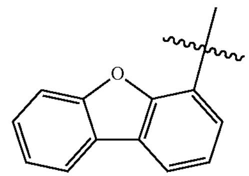 | 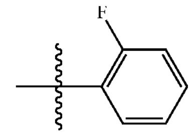 [SMILES: *c1ccccc1F] |
| 28-28 | 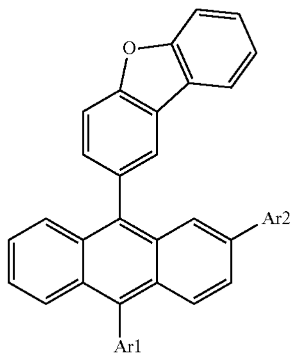 | 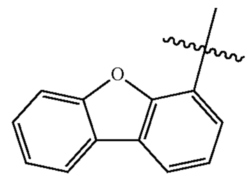 | 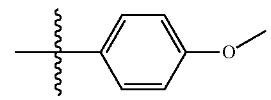 [SMILES: *c1ccc(OC)cc1] |

-continued
| No. | | Ar1 | Ar2 |
|---|---|---|---|
| 29-1 | 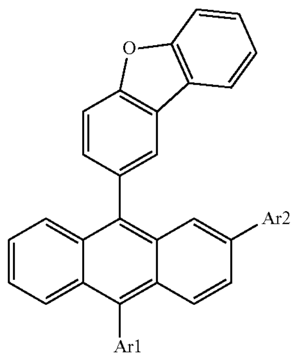 | 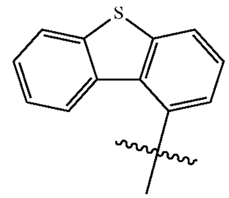 | 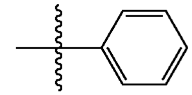 [SMILES: *c1ccccc1] |
| 29-2 | 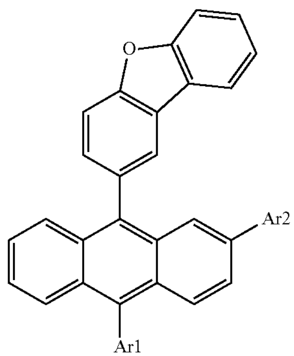 | 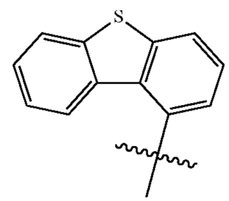 [SMILES: *c1cccc2sc3ccccc3c12] | 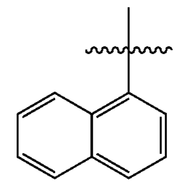 [SMILES: *c1cccc2ccccc12] |

-continued
| No. | | Ar1 | Ar2 |
|---|---|---|---|
| 29-3 | 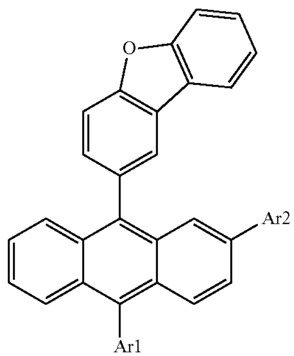 | 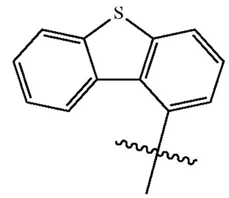 | 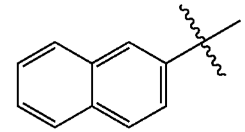 [SMILES: *c1ccc2ccccc2c1] |
| 29-4 | 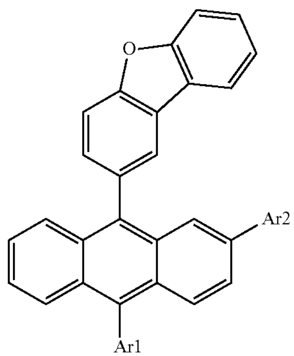 | 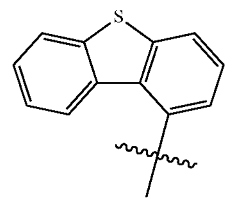 [SMILES: *c1cccc2sc3ccccc3c12] | 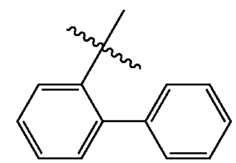 [SMILES: *c1ccccc1-c1ccccc1] |

-continued
| No. | | Ar1 | Ar2 |
|---|---|---|---|
| 29-5 | 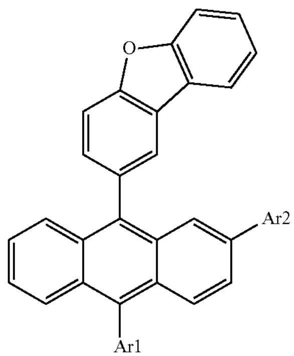 | 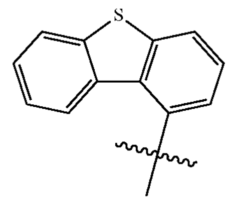 | 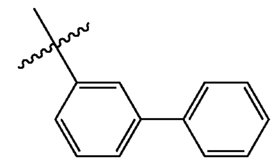 [SMILES: *c1cccc(-c2ccccc2)c1] |
| 29-6 | 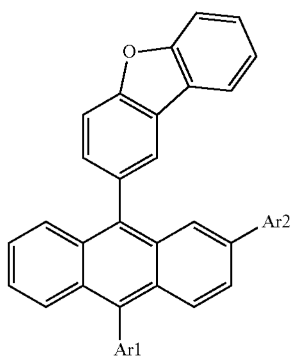 | 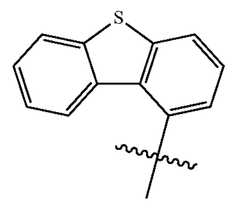 [SMILES: *c1cccc2sc3ccccc3c12] | 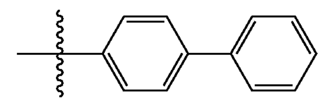 |

-continued
| No. | | Ar1 | Ar2 |
|---|---|---|---|
| 29-7 | 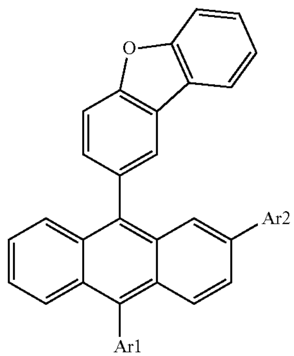 | 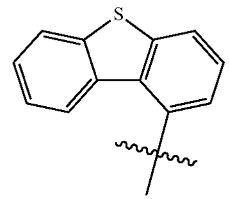 [SMILES: *c1cccc2sc3ccccc3c12] | 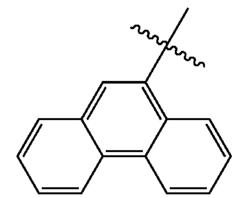 [SMILES: *c1cc2ccccc2c2ccccc12] |
| 29-8 | 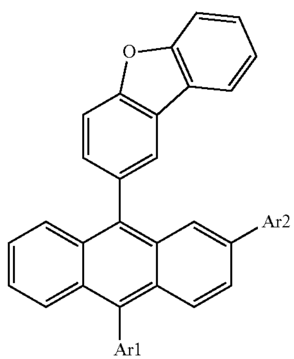 | 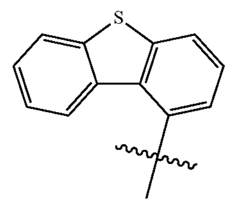 [SMILES: *c1cccc2sc3ccccc3c12] | 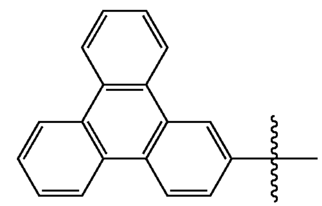 [SMILES: *c1ccc2c3ccccc3c3ccccc3c2c1] |

-continued
| No. | | Ar1 | Ar2 |
|---|---|---|---|
| 29-9 | 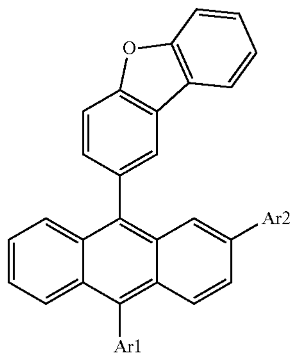 | 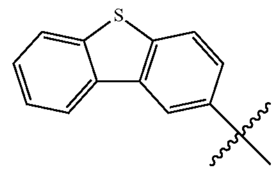 | 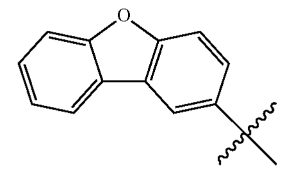 [SMILES: *c1ccc2oc3ccccc3c2c1] |
| 29-10 | 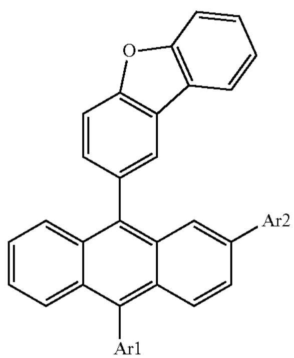 | 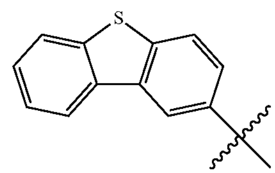 [SMILES: *c1ccc2sc3ccccc3c2c1] | 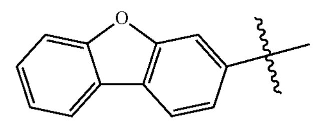 |

-continued
| No. | | Ar1 | Ar2 |
|---|---|---|---|
| 29-11 | 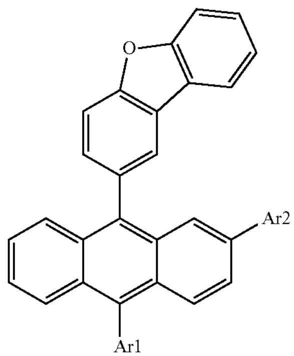 | 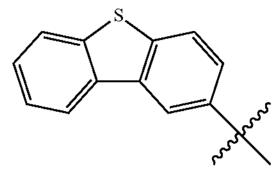 [SMILES: *c1ccc2sc3ccccc3c2c1] | 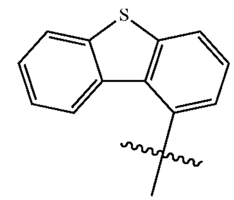 [SMILES: *c1cccc2sc3ccccc3c12] |
| 29-12 | 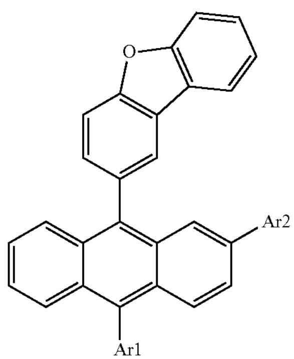 | 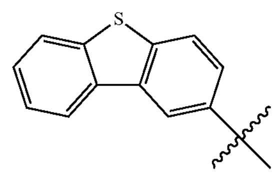 | 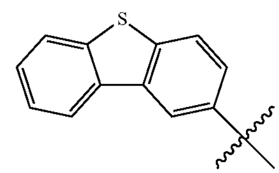 |

-continued
| No. | | Ar1 | Ar2 |
|---|---|---|---|
| 29-13 | 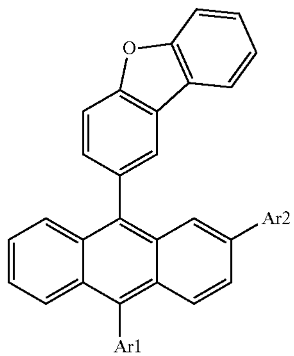 | 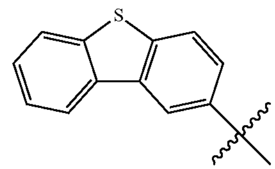 [SMILES: *c1ccc2sc3ccccc3c2c1] | 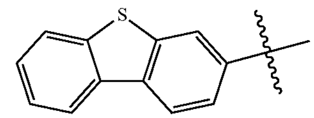 |
| 29-14 | 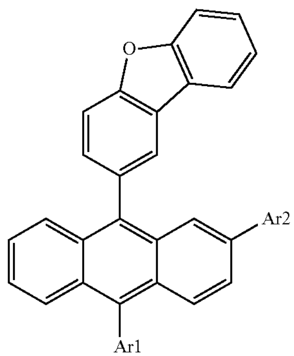 | 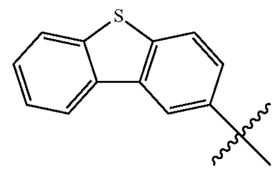 | 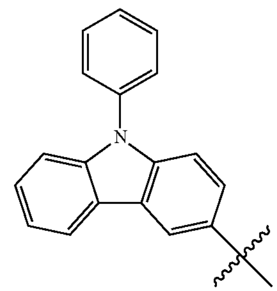 [SMILES: *c1ccc2c(c1)c1ccccc1n2-c1ccccc1] |

-continued
| No. | | Ar1 | Ar2 |
|---|---|---|---|
| 29-15 | 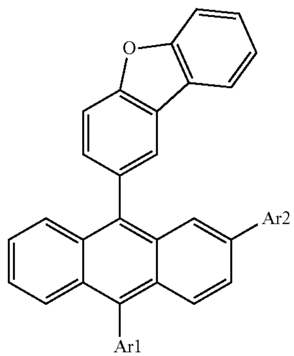 | 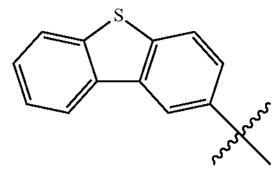 [SMILES: *c1ccc2sc3ccccc3c2c1] | 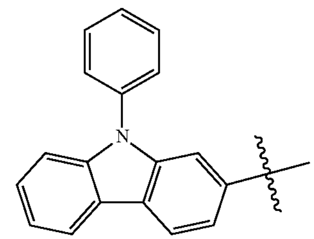 [SMILES: *c1ccc2c3ccccc3n(-c3ccccc3)c2c1] |
| 29-16 | 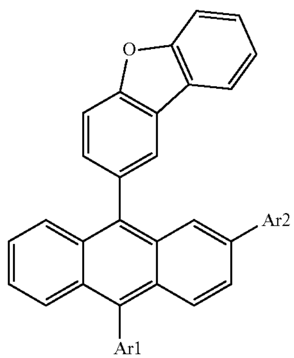 | 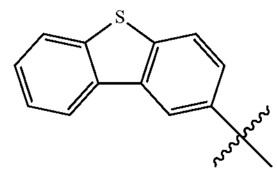 | 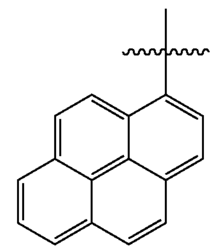 [SMILES: *c1ccc2ccc3cccc4ccc1c2c34] |

-continued
| No. | | Ar1 | Ar2 |
|---|---|---|---|
| 29-17 | 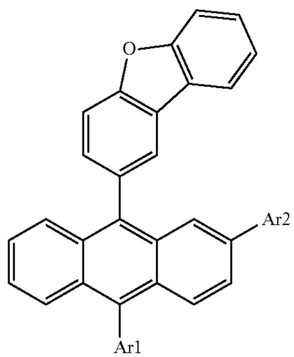 | 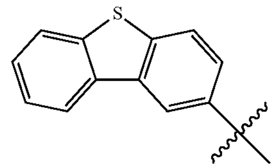 | 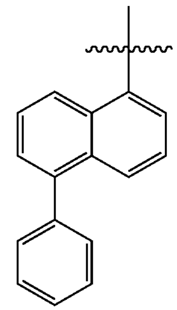 [SMILES: *c1cccc2c(-c3ccccc3)cccc12] |
| 29-18 | 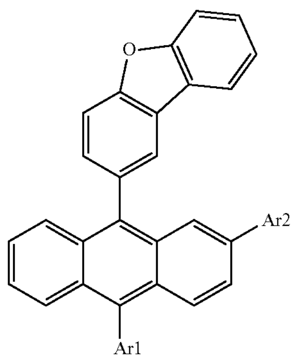 | 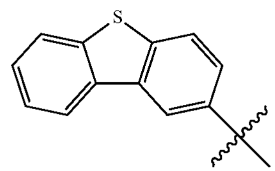 | 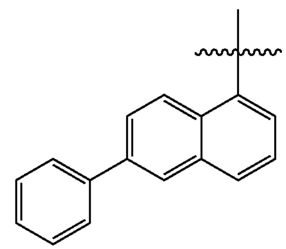 [SMILES: *c1cccc2cc(-c3ccccc3)ccc12] |

-continued
| No. | | Ar1 | Ar2 |
|---|---|---|---|
| 29-19 | 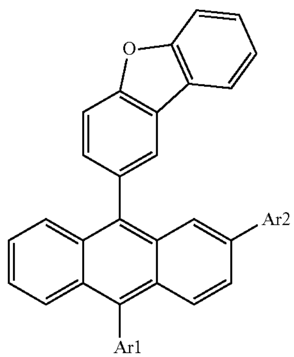 | 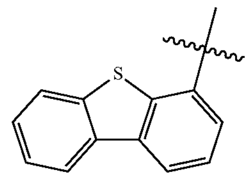 [SMILES: *c1cccc2c1sc1ccccc12] | 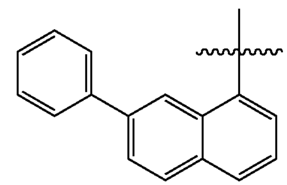 [SMILES: *c1cccc2ccc(-c3ccccc3)cc12] |
| 29-20 | 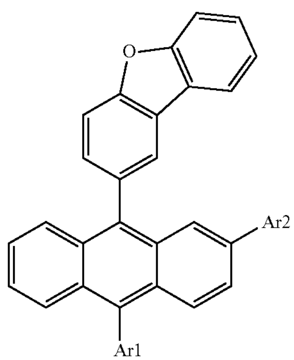 | 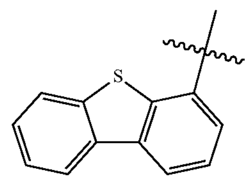 | 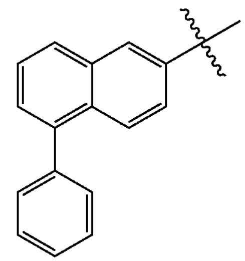 [SMILES: *c1ccc2c(-c3ccccc3)cccc2c1] |

-continued
| No. | | Ar1 | Ar2 |
|---|---|---|---|
| 29-21 | 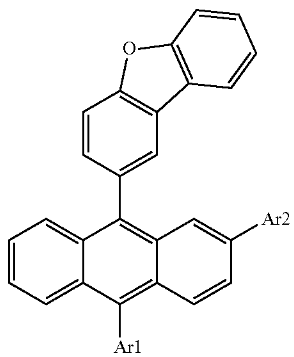 | 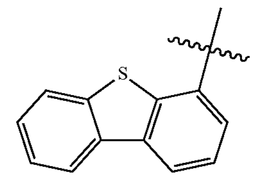 | 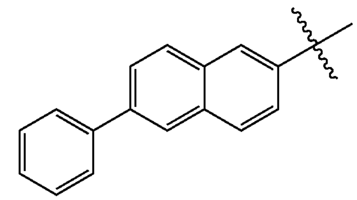 [SMILES: *c1ccc2cc(-c3ccccc3)ccc2c1] |
| 29-22 | 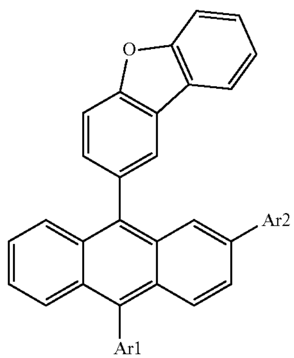 | 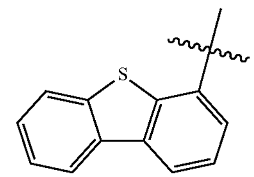 | 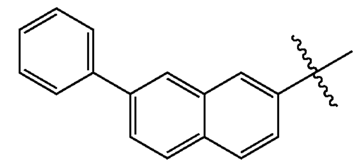 [SMILES: *c1ccc2ccc(-c3ccccc3)cc2c1] |

-continued
| No. | | Ar1 | Ar2 |
| --- | --- | --- | --- |
| 29-23 | 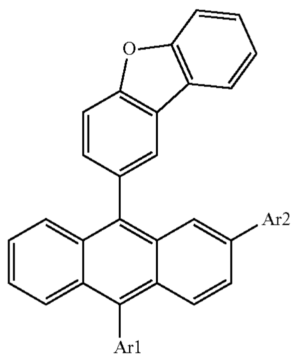 | 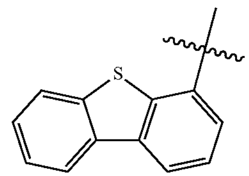 | 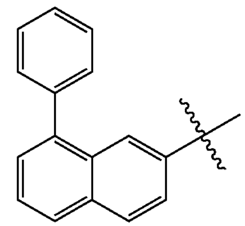 [SMILES: *c1ccc2cccc(-c3ccccc3)c2c1] |
| 29-24 | 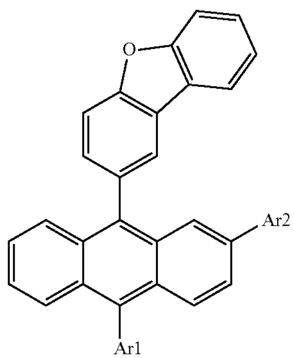 | 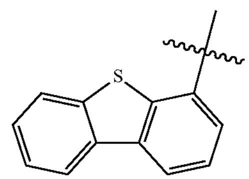 | 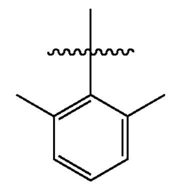 |

-continued
| No. | | Ar1 | Ar2 |
|---|---|---|---|
| 29-25 | 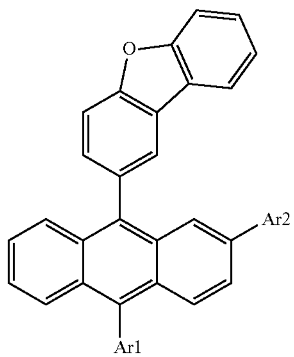 | 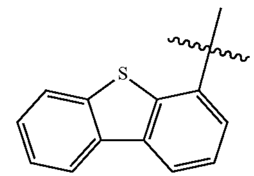 | 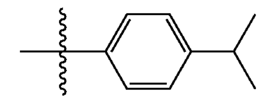 [SMILES: *c1ccc(C(C)C)cc1] |
| 29-26 | 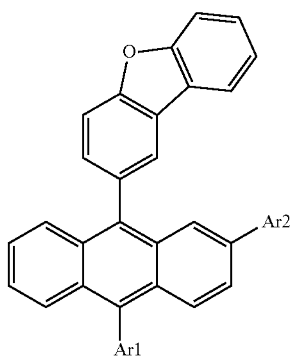 | 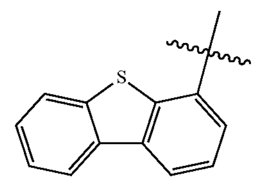 [SMILES: *c1cccc2c1sc1ccccc12] | 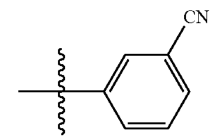 [SMILES: *c1cccc(C#N)c1] |

-continued
| No. | | Ar1 | Ar2 |
|---|---|---|---|
| 29-27 | 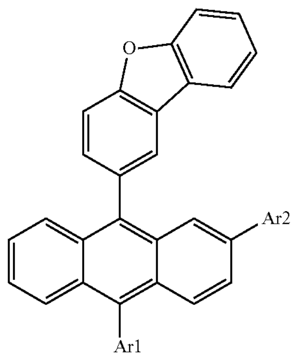 | 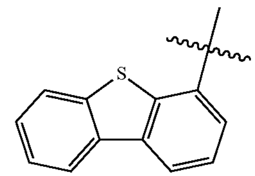 [SMILES: *c1cccc2c1sc1ccccc12] | 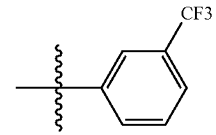 [SMILES: *c1cccc(C(F)(F)F)c1] |
| 29-28 | 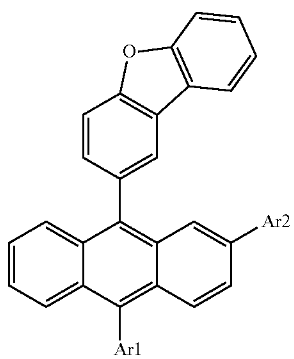 | 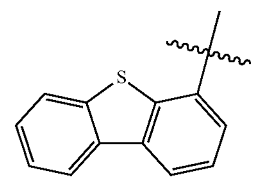 [SMILES: *c1cccc2c1sc1ccccc12] | 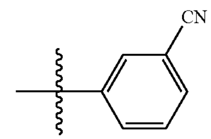 [SMILES: *c1cccc(C#N)c1] |

-continued
| No. | | Ar1 | Ar2 |
|---|---|---|---|
| 29-29 | 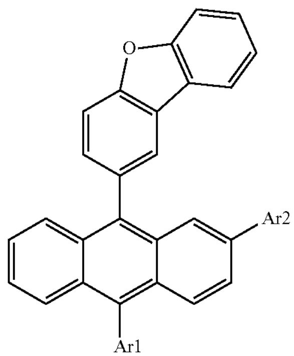 | 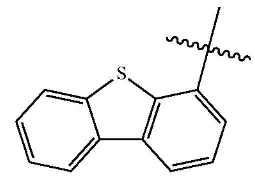 [SMILES: *c1cccc2c1sc1ccccc12] | 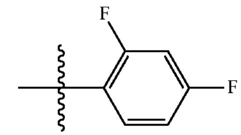 [SMILES: *c1ccc(F)cc1F] |
| 30-1 | 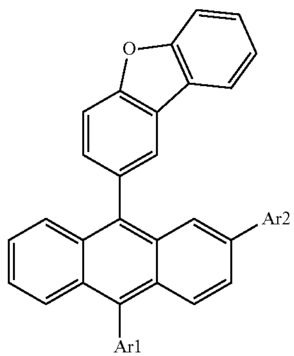 | 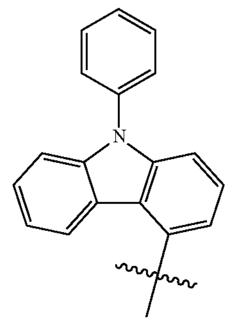 [SMILES: *c1cccc2c1c1ccccc1n2-c1ccccc1] | 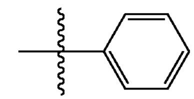 [SMILES: *c1ccccc1] |

-continued
| No. | | Ar1 | Ar2 |
|---|---|---|---|
| 30-2 | 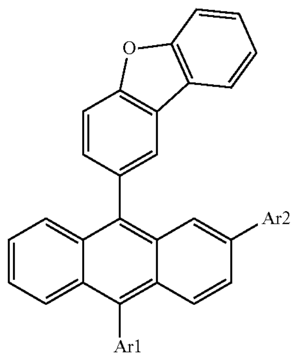 | 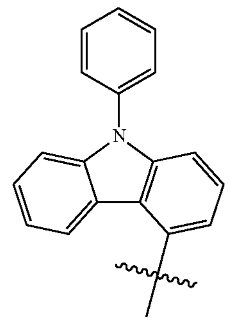 [SMILES: *c1cccc2c1c1ccccc1n2-c1ccccc1] | 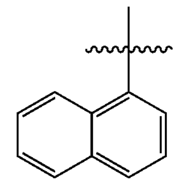 [SMILES: *c1cccc2ccccc12] |
| 30-3 | 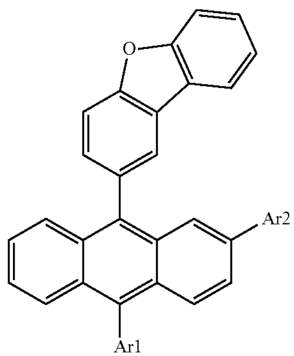 | 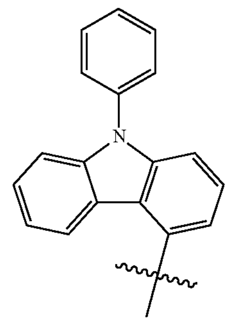 [SMILES: *c1cccc2c1c1ccccc1n2-c1ccccc1] | 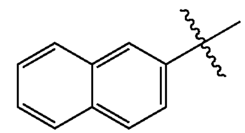 [SMILES: *c1ccc2ccccc2c1] |

-continued
| No. | | Ar1 | Ar2 |
| --- | --- | --- | --- |
| 30-4 | 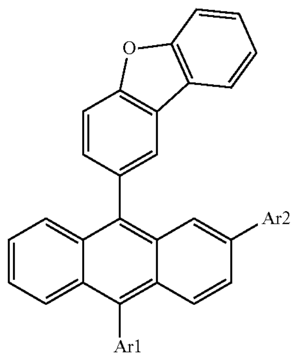 | 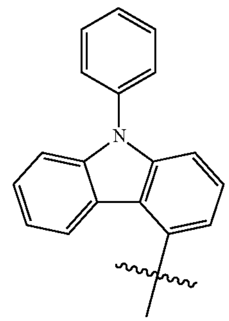 [SMILES: *c1cccc2c1c1ccccc1n2-c1ccccc1] | 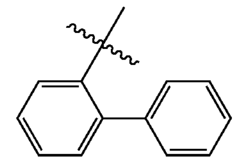 [SMILES: *c1ccccc1-c1ccccc1] |
| 30-5 | 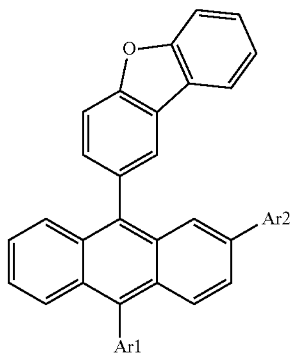 | 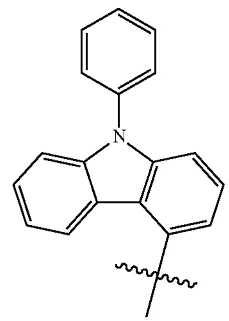 [SMILES: *c1cccc2c1c1ccccc1n2-c1ccccc1] | 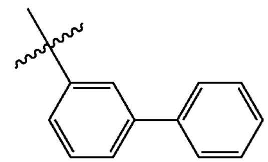 [SMILES: *c1cccc(-c2ccccc2)c1] |

-continued
| No. | | Ar1 | Ar2 |
|---|---|---|---|
| 30-6 | 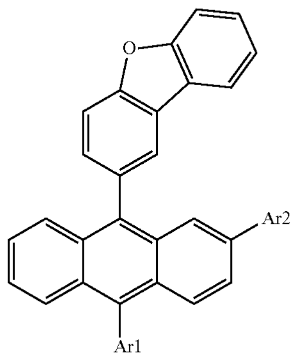 | 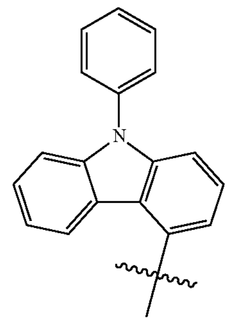 [SMILES: *c1cccc2c1c1ccccc1n2-c1ccccc1] | 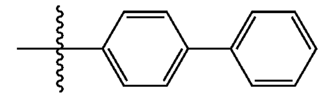 [SMILES: *c1ccc(-c2ccccc2)cc1] |
| 30-7 | 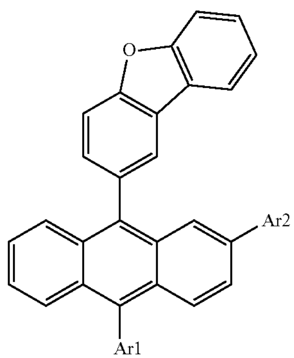 | 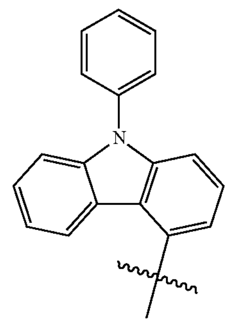 [SMILES: *c1cccc2c1c1ccccc1n2-c1ccccc1] | 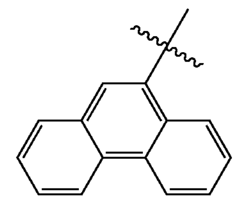 [SMILES: *c1cc2ccccc2c2ccccc12] |

-continued
| No. | | Ar1 | Ar2 |
|---|---|---|---|
| 30-8 | 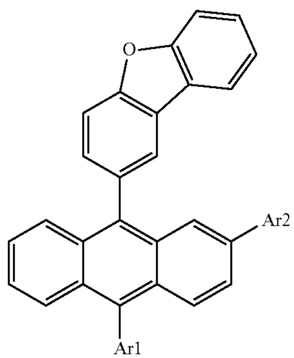 | 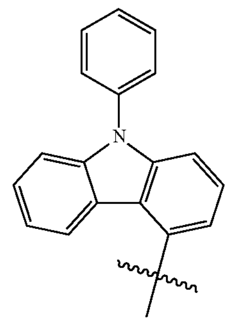 [SMILES: *c1cccc2c1c1ccccc1n2-c1ccccc1] | 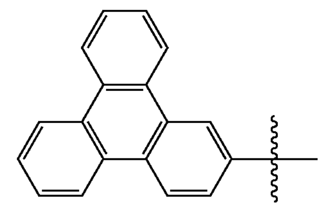 [SMILES: *c1ccc2c3ccccc3c3ccccc3c2c1] |
| 30-9 | 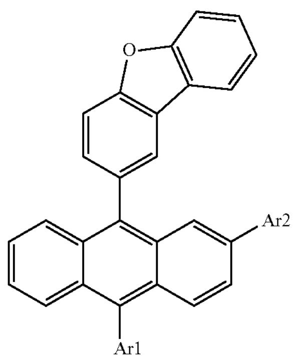 | 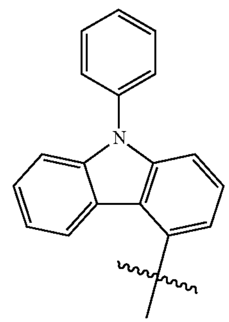 [SMILES: *c1cccc2c1c1ccccc1n2-c1ccccc1] | 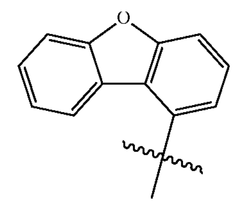 [SMILES: *c1cccc2oc3ccccc3c12] |

-continued
| No. | | Ar1 | Ar2 |
|---|---|---|---|
| 30-10 | 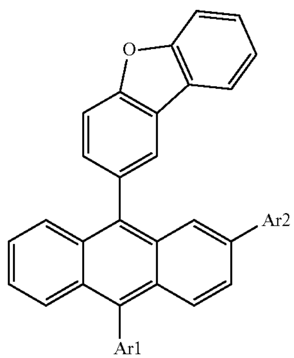 | 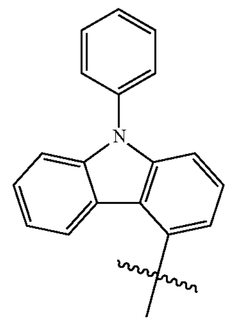 [SMILES: *c1cccc2c1c1ccccc1n2-c1ccccc1] | 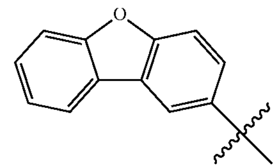 |
| 30-11 | 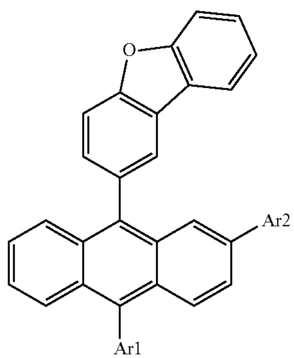 | 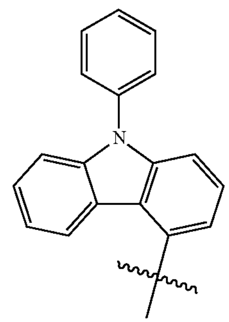 [SMILES: *c1cccc2c1c1ccccc1n2-c1ccccc1] | 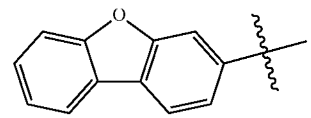 |

-continued
| No. | | Ar1 | Ar2 |
|---|---|---|---|
| 30-12 | 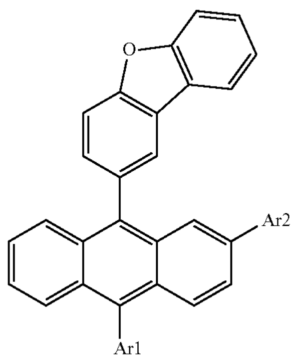 | 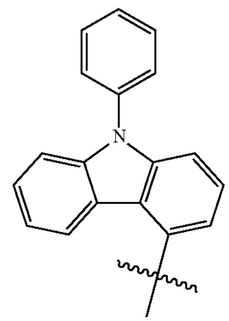 [SMILES: *c1cccc2c1c1ccccc1n2-c1ccccc1] | 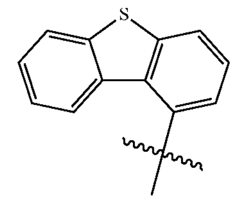 [SMILES: *c1cccc2sc3ccccc3c12] |
| 30-13 | 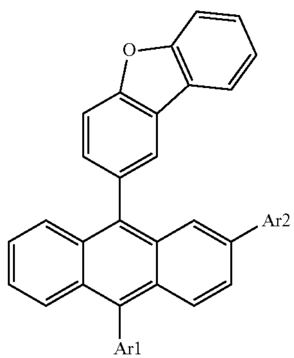 | 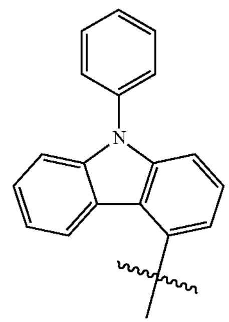 [SMILES: *c1cccc2c1c1ccccc1n2-c1ccccc1] | 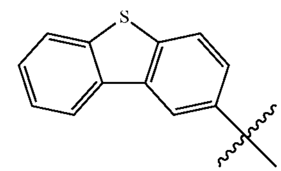 |

-continued
| No. | | Ar1 | Ar2 |
|---|---|---|---|
| 30-14 | 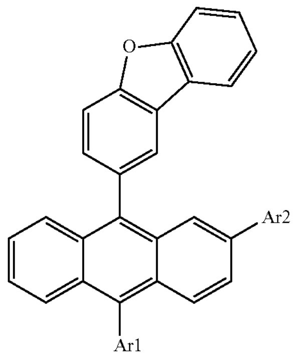 | 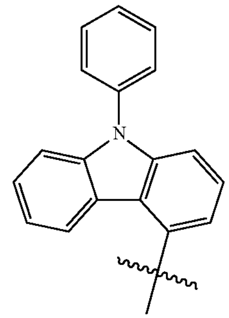 [SMILES: *c1cccc2c1c1ccccc1n2-c1ccccc1] | 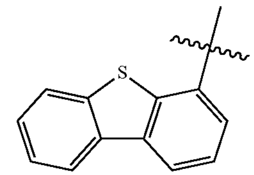 [SMILES: *c1cccc2c1sc1ccccc12] |
| 30-15 | 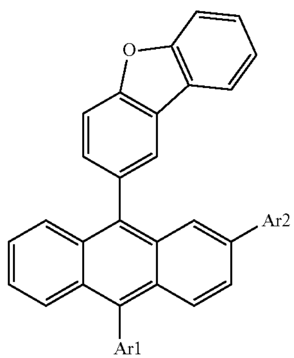 | 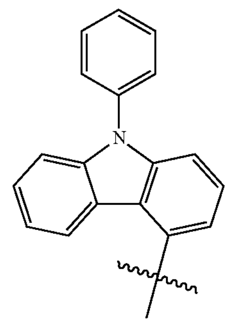 [SMILES: *c1cccc2c1c1ccccc1n2-c1ccccc1] | 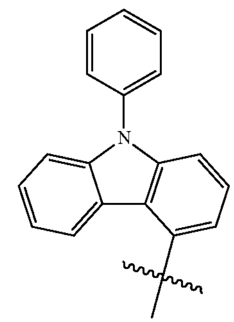 [SMILES: *c1cccc2c1c1ccccc1n2-c1ccccc1] |

-continued
| No. | | Ar1 | Ar2 |
|---|---|---|---|
| 30-16 | 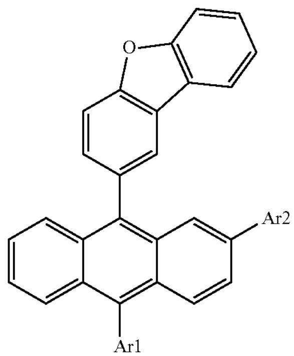 | 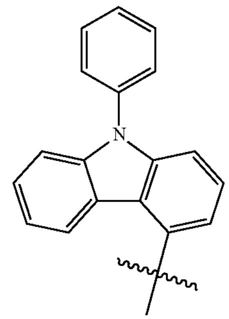 [SMILES: *c1cccc2c1c1ccccc1n2-c1ccccc1] | 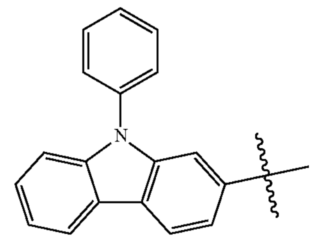 [SMILES: *c1ccc2c3ccccc3n(-c3ccccc3)c2c1] |
| 30-17 | 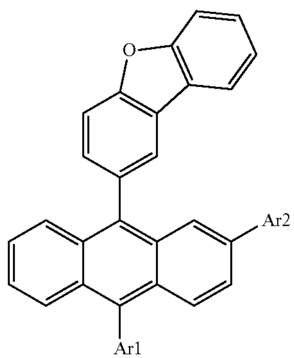 | 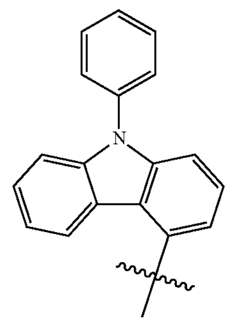 [SMILES: *c1cccc2c1c1ccccc1n2-c1ccccc1] | 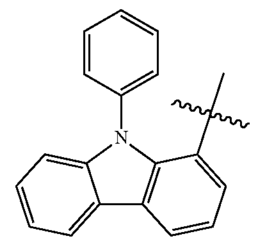 [SMILES: *c1cccc2c3ccccc3n(-c3ccccc3)c12] |

-continued
| No. | | Ar1 | Ar2 |
|---|---|---|---|
| 30-18 | 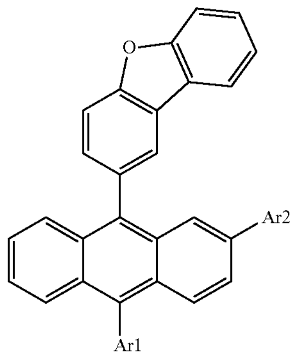 | 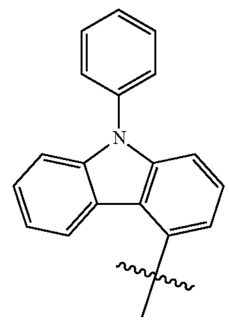 [SMILES: *c1cccc2c1c1ccccc1n2-c1ccccc1] | 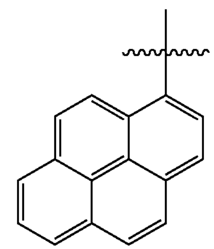 [SMILES: *c1ccc2ccc3cccc4ccc1c2c34] |
| 30-19 | 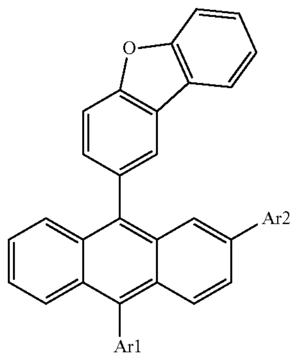 | 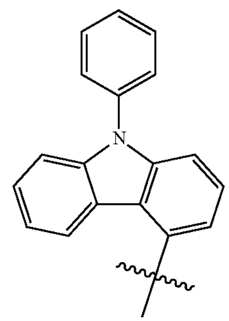 [SMILES: *c1cccc2c1c1ccccc1n2-c1ccccc1] | 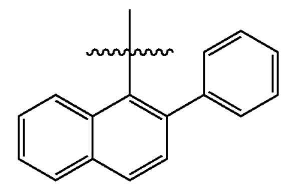 [SMILES: *c1c(-c2ccccc2)ccc2ccccc12] |

-continued
| No. | | Ar1 | Ar2 |
|---|---|---|---|
| 30-20 | 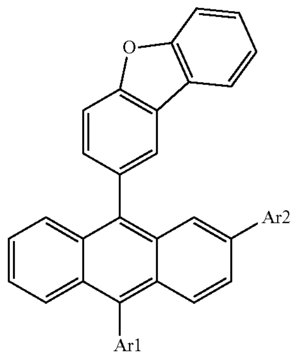 | 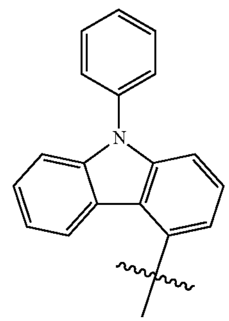 [SMILES: *c1cccc2c1c1ccccc1n2-c1ccccc1] | 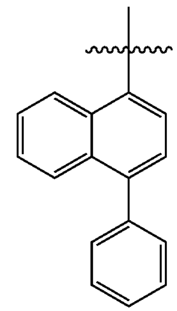 [SMILES: *c1ccc(-c2ccccc2)c2ccccc12] |
| 30-21 | 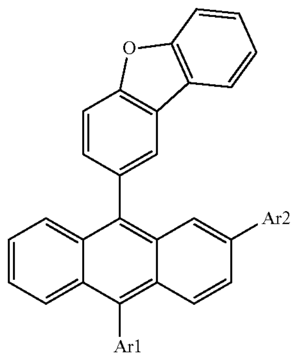 | 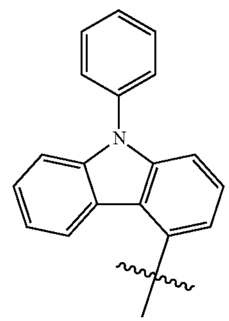 [SMILES: *c1cccc2c1c1ccccc1n2-c1ccccc1] | 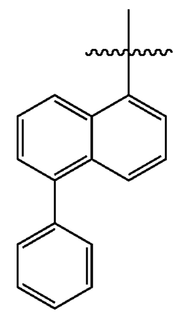 [SMILES: *c1cccc2c(-c3ccccc3)cccc12] |

-continued
| No. | | Ar1 | Ar2 |
|---|---|---|---|
| 30-22 | 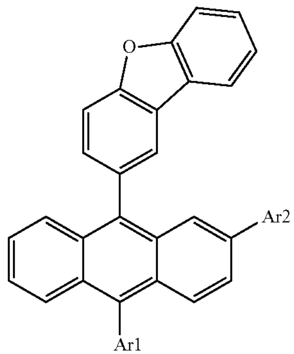 | 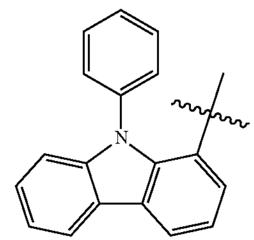 [SMILES: *c1cccc2c3ccccc3n(-c3ccccc3)c12] | 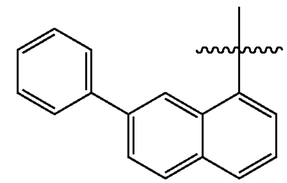 [SMILES: *c1cccc2ccc(-c3ccccc3)cc12] |
| 30-23 | 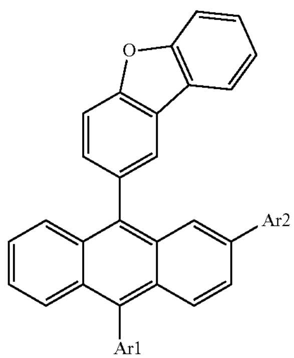 | 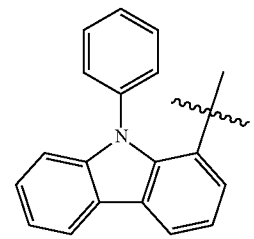 [SMILES: *c1cccc2c3ccccc3n(-c3ccccc3)c12] | 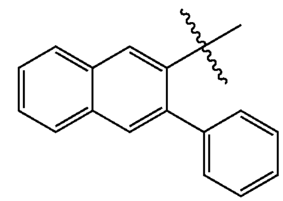 [SMILES: *c1cc2ccccc2cc1-c1ccccc1] |

-continued
| No. | | Ar1 | Ar2 |
|---|---|---|---|
| 30-24 | 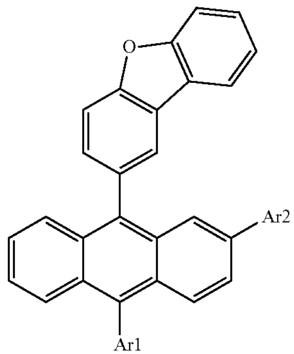 | 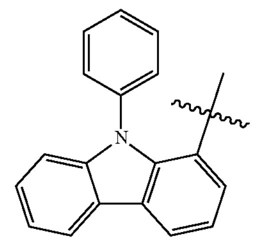 [SMILES: *c1cccc2c3ccccc3n(-c3ccccc3)c12] | 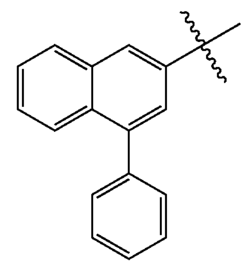 [SMILES: *c1cc(-c2ccccc2)c2ccccc2c1] |
| 30-25 | 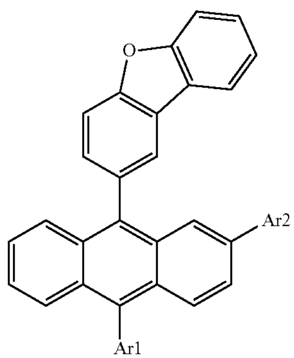 | 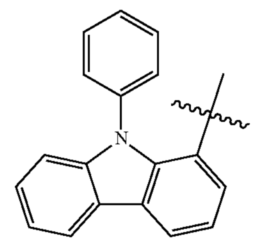 [SMILES: *c1cccc2c3ccccc3n(-c3ccccc3)c12] | 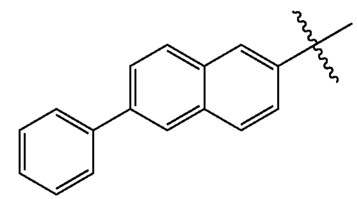 [SMILES: *c1ccc2cc(-c3ccccc3)ccc2c1] |

-continued
| No. | | Ar1 | Ar2 |
|---|---|---|---|
| 30-26 | 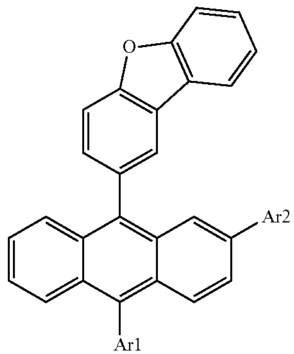 | 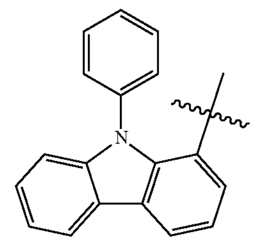 [SMILES: *c1cccc2c3ccccc3n(-c3ccccc3)c12] | 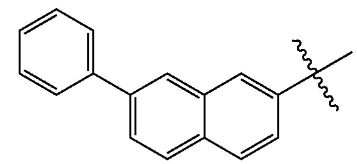 [SMILES: *c1ccc2ccc(-c3ccccc3)cc2c1] |
| 30-27 | 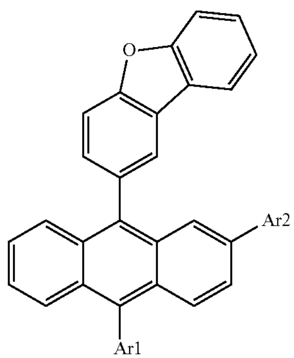 | 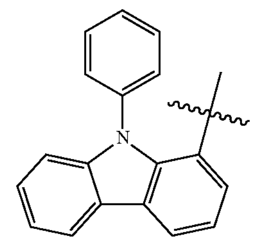 [SMILES: *c1cccc2c3ccccc3n(-c3ccccc3)c12] | 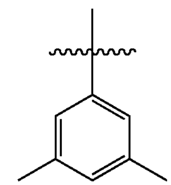 |

-continued
| No. | | Ar1 | Ar2 |
|---|---|---|---|
| 30-28 | 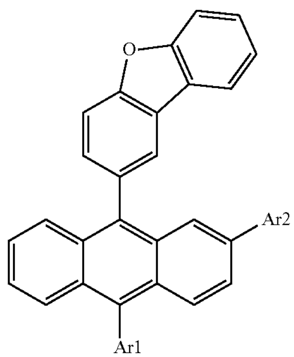 | 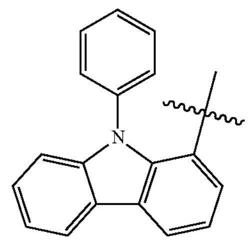 [SMILES: *c1cccc2c3ccccc3n(-c3ccccc3)c12] | 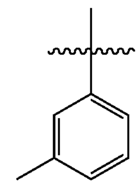 [SMILES: *c1cccc(C)c1] |
| 30-29 | 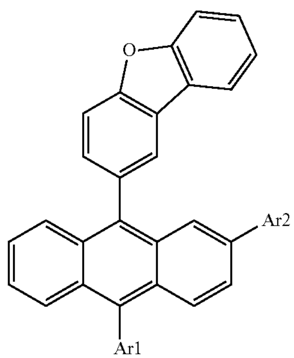 | 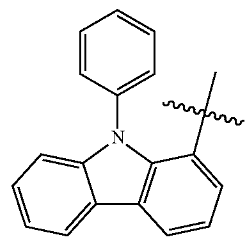 [SMILES: *c1cccc2c3ccccc3n(-c3ccccc3)c12] | 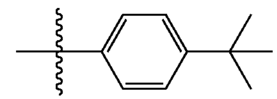 |

-continued
| No. | | Ar1 | Ar2 |
|---|---|---|---|
| 30-30 | 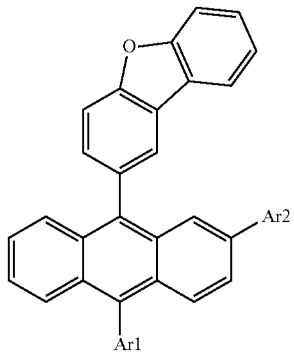 | 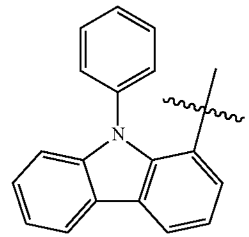 [SMILES: *c1cccc2c3ccccc3n(-c3ccccc3)c12] | 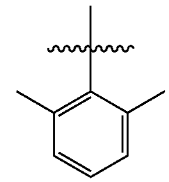 |
| 30-31 | 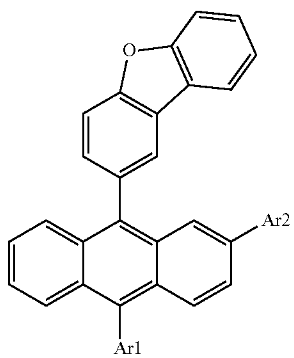 | 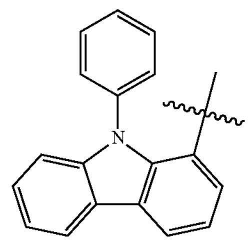 [SMILES: *c1cccc2c3ccccc3n(-c3ccccc3)c12] | 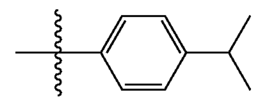 [SMILES: *c1ccc(C(C)C)cc1] |

-continued
| No. | | Ar1 | Ar2 |
|---|---|---|---|
| 31-1 | 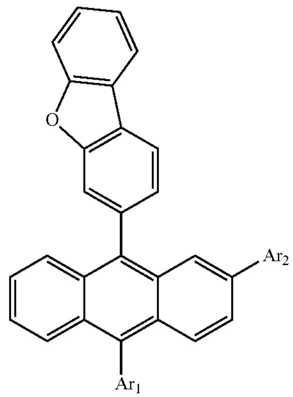 | 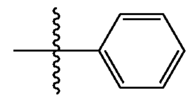 [SMILES: *c1ccccc1] | 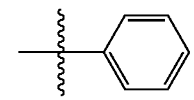 |
| 31-2 | 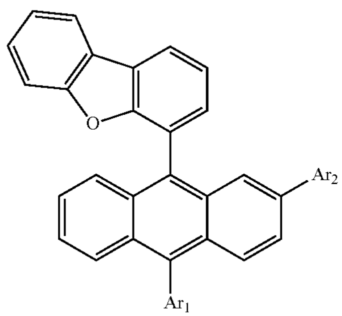 | 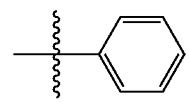 | 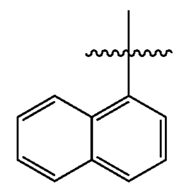 [SMILES: *c1cccc2ccccc12] |

-continued
| No. | | Ar1 | Ar2 |
|---|---|---|---|
| 31-3 | 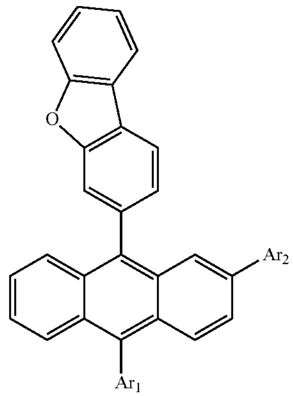 | 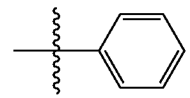 [SMILES: *c1ccccc1] | 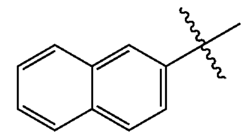 [SMILES: *c1ccc2ccccc2c1] |
| 31-4 | 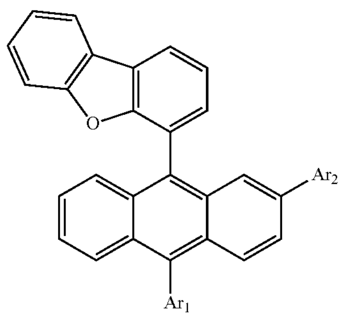 | 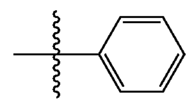 | 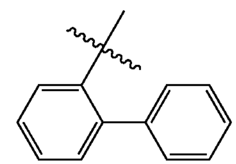 [SMILES: *c1ccccc1-c1ccccc1] |

-continued
| No. | | Ar1 | Ar2 |
|---|---|---|---|
| 31-5 | 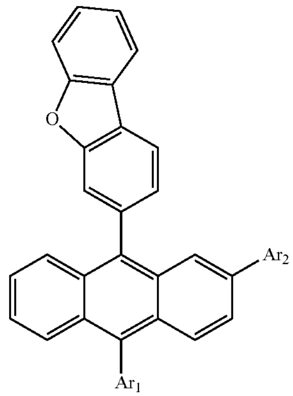 | 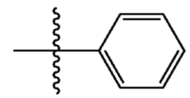 [SMILES: *c1ccccc1] | 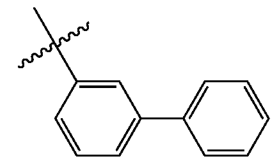 [SMILES: *c1cccc(-c2ccccc2)c1] |
| 31-6 | 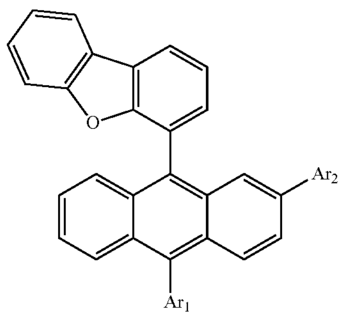 | 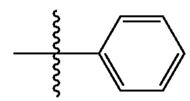 | 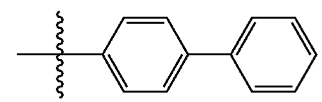 [SMILES: *c1ccc(-c2ccccc2)cc1] |

-continued
| No. | | Ar1 | Ar2 |
|---|---|---|---|
| 31-7 | 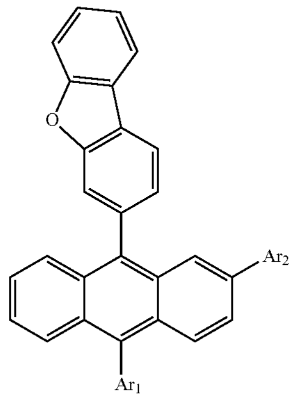 | 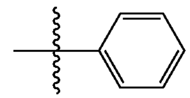 | 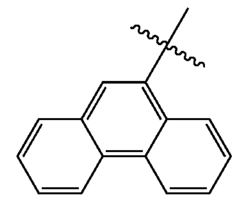 [SMILES: *c1cc2ccccc2c2ccccc12] |
| 31-8 | 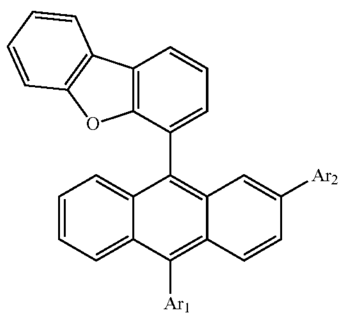 | 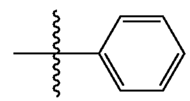 | 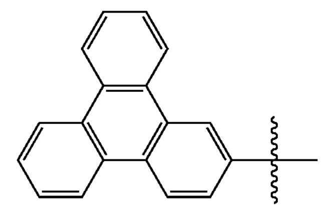 |

-continued
| No. | | Ar1 | Ar2 |
|---|---|---|---|
| 31-9 | 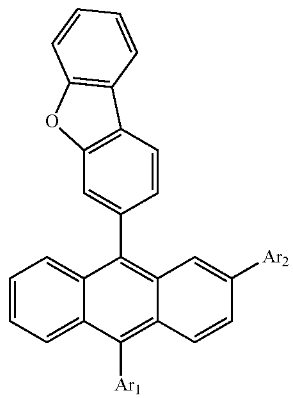 | 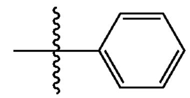 | 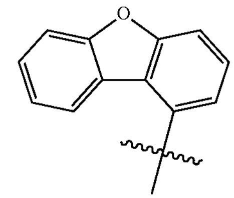 |
| 31-10 | 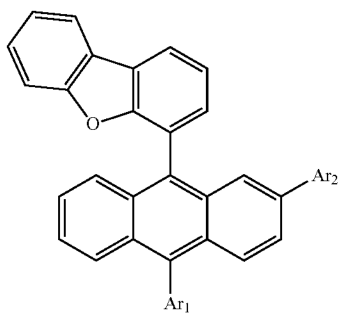 | 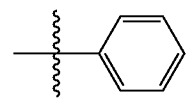 | 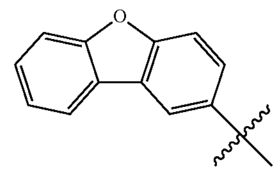 |

-continued
| No. | | Ar1 | Ar2 |
|---|---|---|---|
| 31-11 | 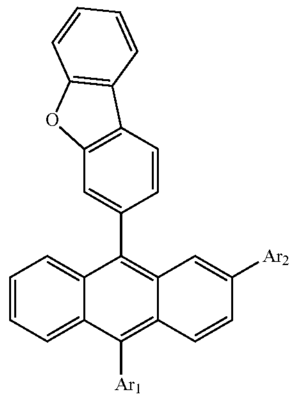 | 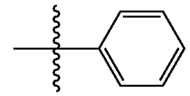 | 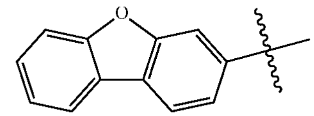 |
| 31-12 | 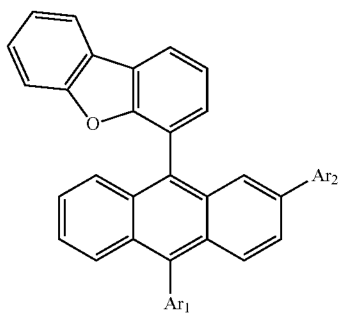 | 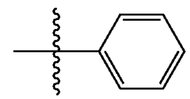 | 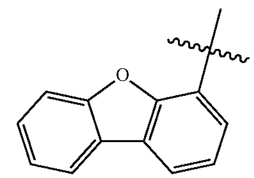 [SMILES: *c1cccc2c1oc1ccccc12] |

-continued
| No. | | Ar1 | Ar2 |
|---|---|---|---|
| 31-13 | 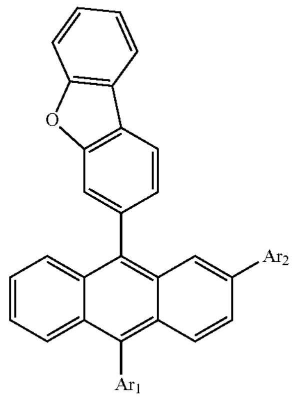 | 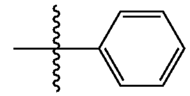 | 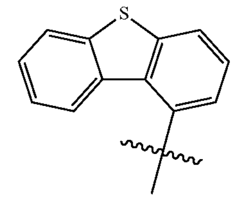 [SMILES: *c1cccc2sc3ccccc3c12] |
| 31-14 | 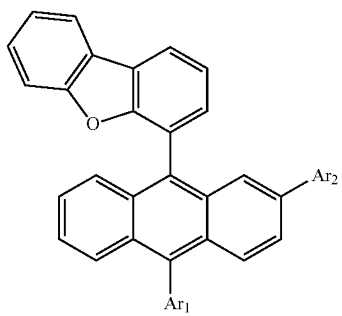 | 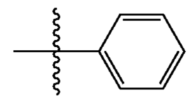 | 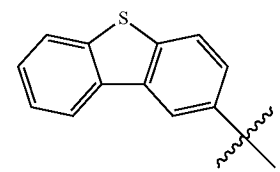 [SMILES: *c1ccc2sc3ccccc3c2c1] |

-continued
| No. | | Ar1 | Ar2 |
| --- | --- | --- | --- |
| 31-15 | 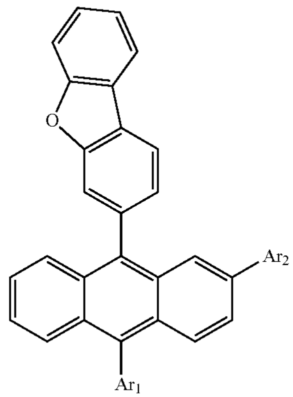 | 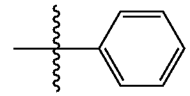 | 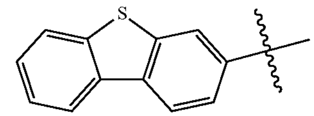 |
| 31-16 | 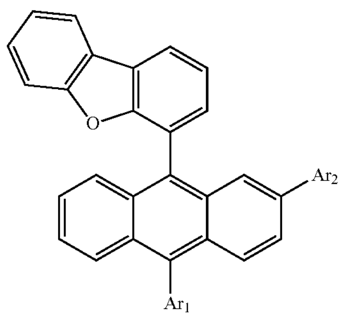 | 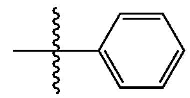 [SMILES: *c1ccccc1] | 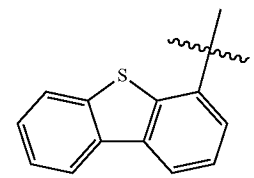 [SMILES: *c1cccc2c1sc1ccccc12] |

-continued
| No. | | Ar1 | Ar2 |
|---|---|---|---|
| 31-17 | 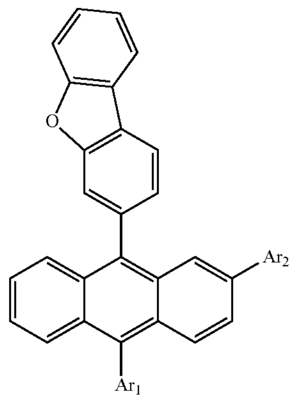 | 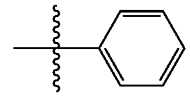 | 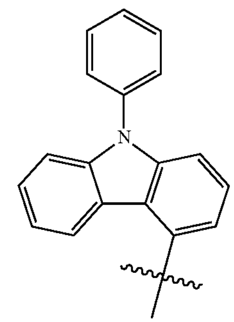 [SMILES: *c1cccc2c1c1ccccc1n2-c1ccccc1] |
| 31-18 | 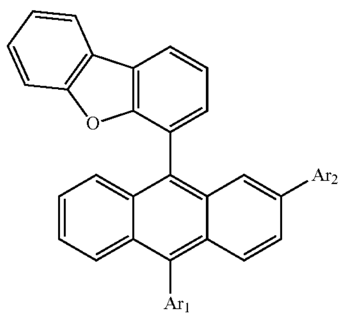 | 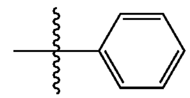 [SMILES: *c1ccccc1] | 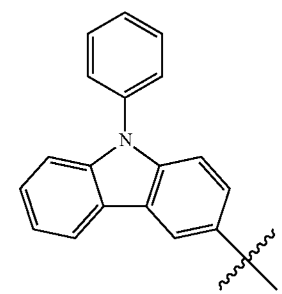 [SMILES: *c1ccc2c(c1)c1ccccc1n2-c1ccccc1] |

-continued
| No. | | Ar1 | Ar2 |
|---|---|---|---|
| 31-19 | 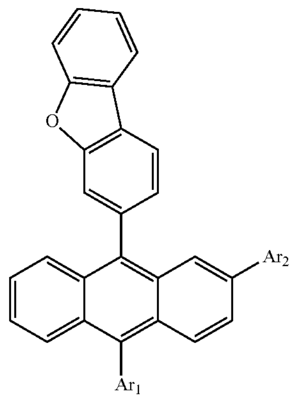 | 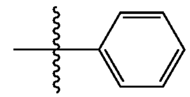 | 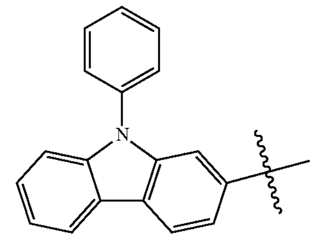 [SMILES: *c1ccc2c3ccccc3n(-c3ccccc3)c2c1] |
| 31-20 | 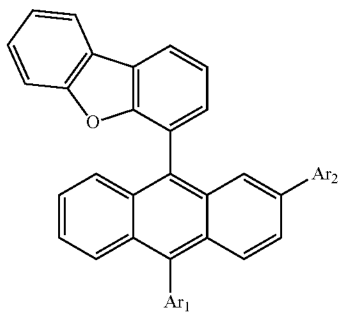 | 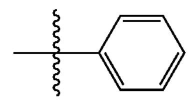 [SMILES: *c1ccccc1] | 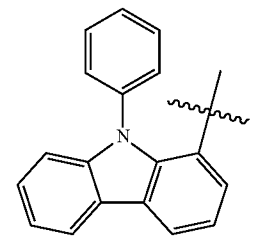 [SMILES: *c1cccc2c3ccccc3n(-c3ccccc3)c12] |

-continued
| No. | | Ar1 | Ar2 |
|---|---|---|---|
| 31-21 | 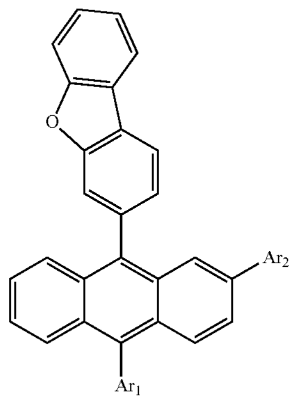 | 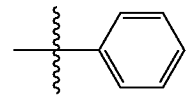 | 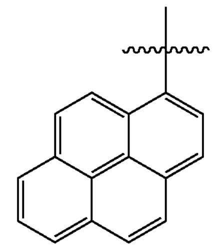 [SMILES: *c1ccc2ccc3cccc4ccc1c2c34] |
| 31-22 | 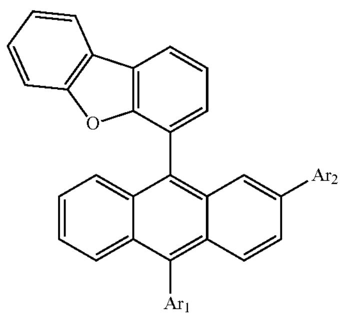 | 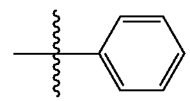 | 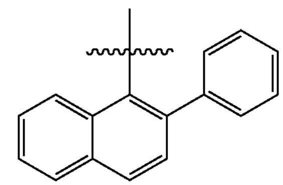 [SMILES: *c1c(-c2ccccc2)ccc2ccccc12] |

-continued
| No. | | Ar1 | Ar2 |
|---|---|---|---|
| 31-23 | 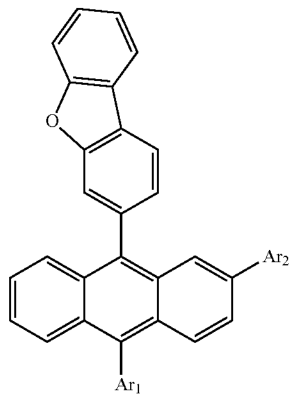 | 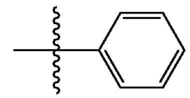 | 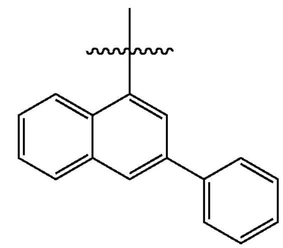 [SMILES: *c1cc(-c2ccccc2)cc2ccccc12] |
| 31-24 | 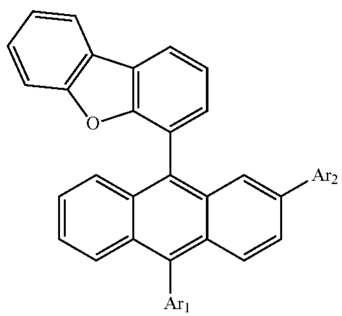 | 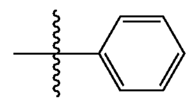 | 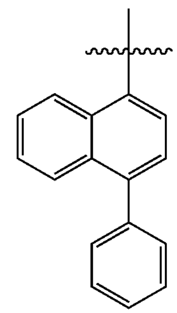 [SMILES: *c1ccc(-c2ccccc2)c2ccccc12] |

-continued
| No. | | Ar1 | Ar2 |
|---|---|---|---|
| 31-25 | 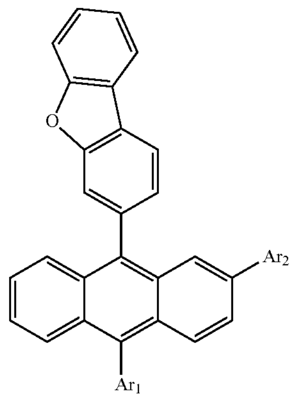 | 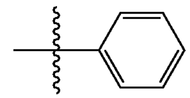 | 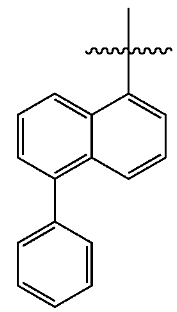 [SMILES: *c1cccc2c(-c3ccccc3)cccc12] |
| 31-26 | 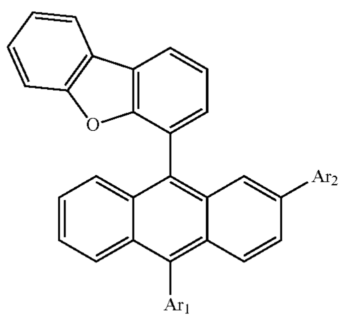 | 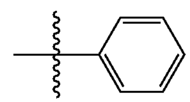 [SMILES: *c1ccccc1] | 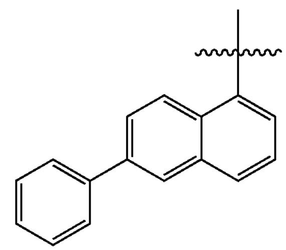 [SMILES: *c1cccc2cc(-c3ccccc3)ccc12] |

-continued
| No. | | Ar1 | Ar2 |
|---|---|---|---|
| 31-27 | 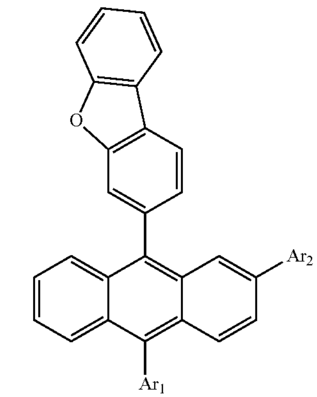 | 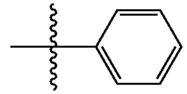 [SMILES: *c1ccccc1] | 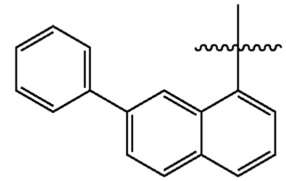 [SMILES: *c1cccc2ccc(-c3ccccc3)cc12] |
| 31-28 | 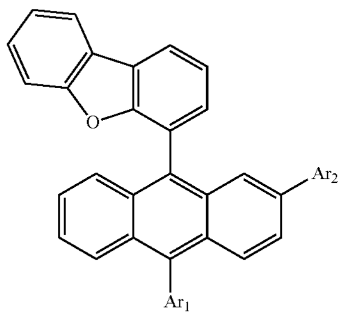 | 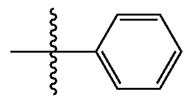 [SMILES: *c1ccccc1] | 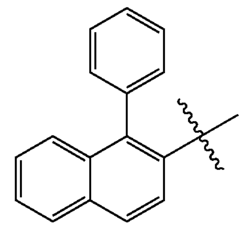 [SMILES: *c1ccc2ccccc2c1-c1ccccc1] |

-continued
| No. | | Ar1 | Ar2 |
|---|---|---|---|
| 31-29 | 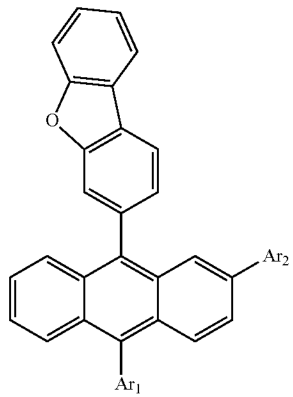 | 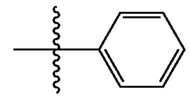 [SMILES: *c1ccccc1] | 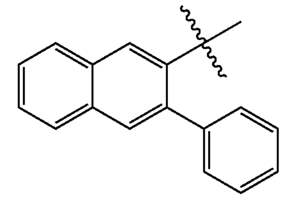 [SMILES: *c1cc2ccccc2cc1-c1ccccc1] |
| 31-30 | 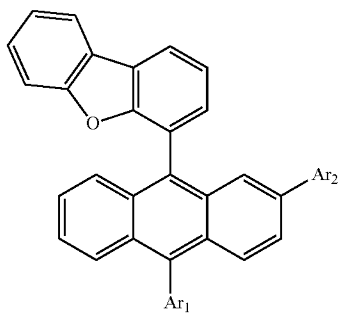 | 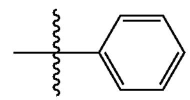 [SMILES: *c1ccccc1] | 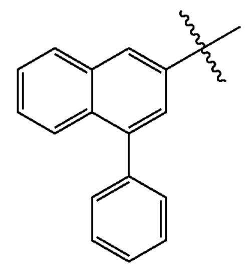 [SMILES: *c1cc(-c2ccccc2)c2ccccc2c1] |

-continued
| No. | | Ar1 | Ar2 |
|---|---|---|---|
| 31-31 | 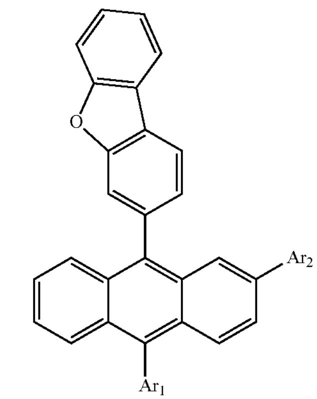 | 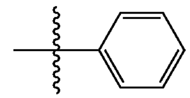 | 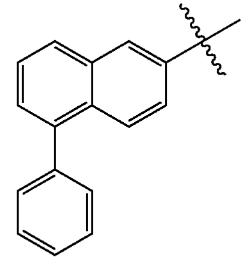 [SMILES: *c1ccc2c(-c3ccccc3)cccc2c1] |
| 31-32 | 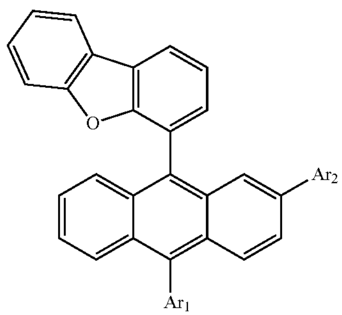 | 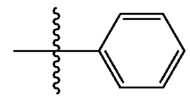 [SMILES: *c1ccccc1] | 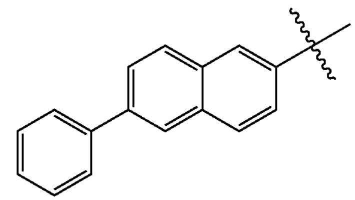 [SMILES: *c1ccc2cc(-c3ccccc3)ccc2c1] |

-continued
| No. | | Ar1 | Ar2 |
|---|---|---|---|
| 31-33 | 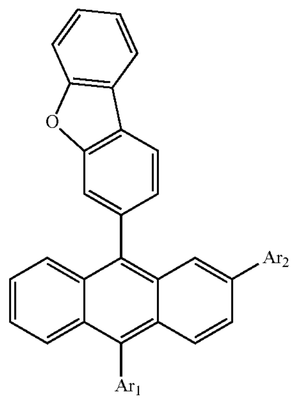 | 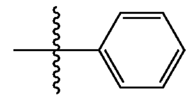 | 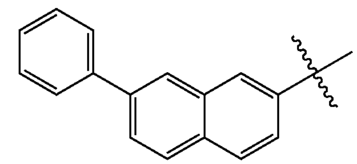 [SMILES: *c1ccc2ccc(-c3ccccc3)cc2c1] |
| 31-34 | 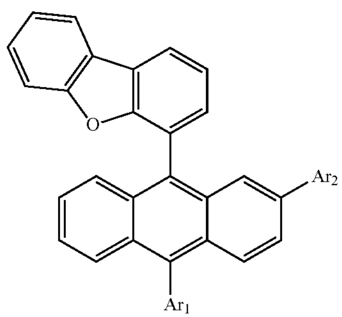 | 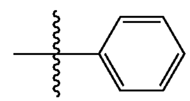 [SMILES: *c1ccccc1] | 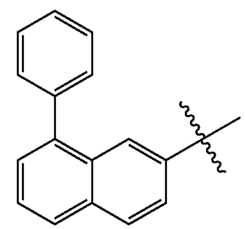 [SMILES: *c1ccc2cccc(-c3ccccc3)c2c1] |

-continued
| No. | | Ar1 | Ar2 |
|---|---|---|---|
| 31-35 | 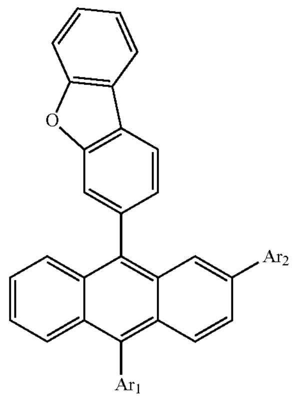 | 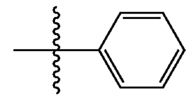 | 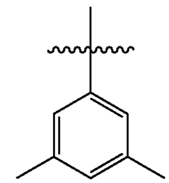 |
| 31-36 | 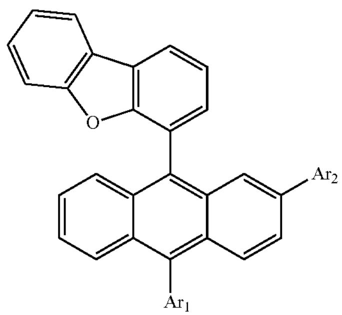 | 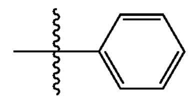 | 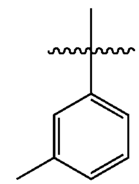 [SMILES: *c1cccc(C)c1] |

-continued
| No. | | Ar1 | Ar2 |
|---|---|---|---|
| 31-37 | 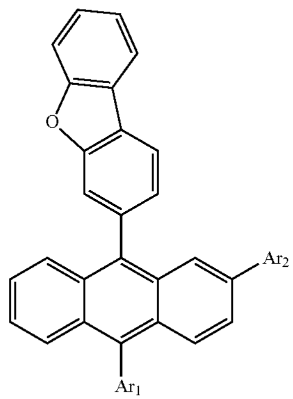 | 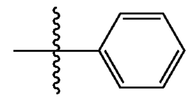 [SMILES: *c1ccccc1] | 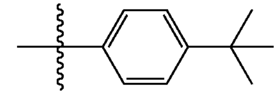 [SMILES: *c1ccc(C(C)(C)C)cc1] |
| 31-38 | 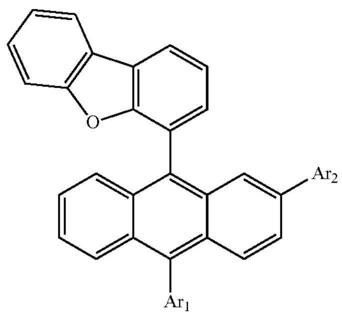 | 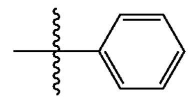 | 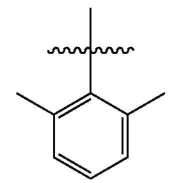 |

-continued
| No. | | Ar1 | Ar2 |
|---|---|---|---|
| 31-39 | 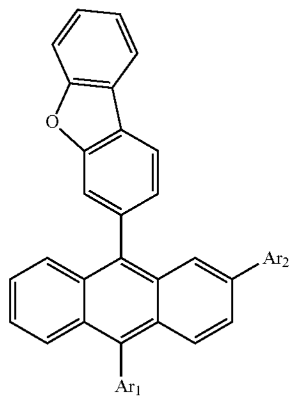 | 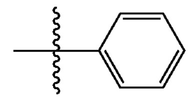 [SMILES: *c1ccccc1] | 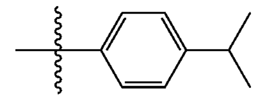 [SMILES: *c1ccc(C(C)C)cc1] |
| 31-40 | 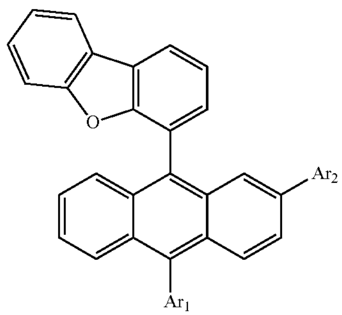 | 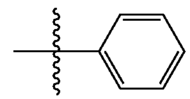 | 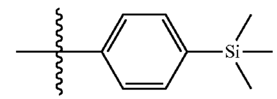 |

-continued
| No. | | Ar1 | Ar2 |
|---|---|---|---|
| 31-41 | 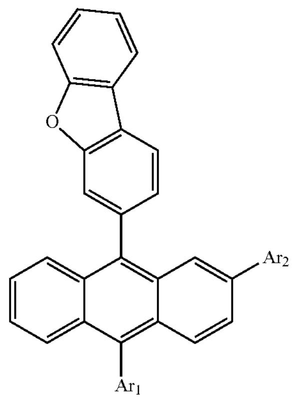 | 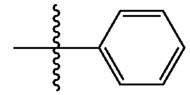 [SMILES: *c1ccccc1] | 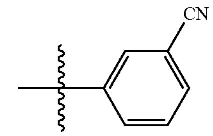 [SMILES: *c1cccc(C#N)c1] |
| 31-42 | 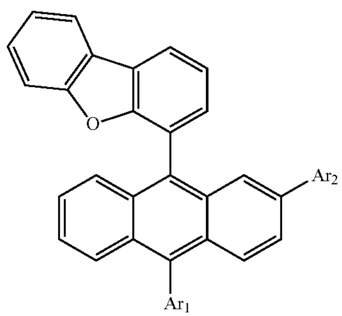 | 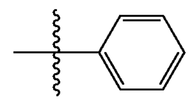 | 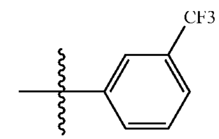 [SMILES: *c1cccc(C(F)(F)F)c1] |

-continued
| No. | | Ar1 | Ar2 |
|---|---|---|---|
| 31-43 | 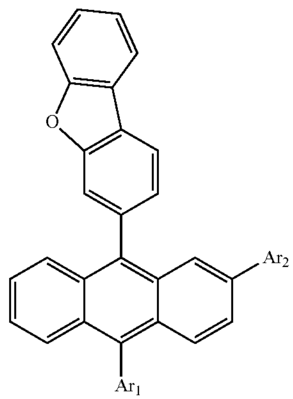 | 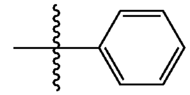 [SMILES: *c1ccccc1] | 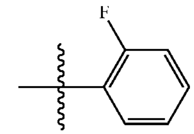 [SMILES: *c1ccccc1F] |
| 31-44 | 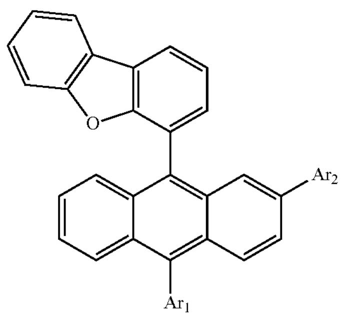 | 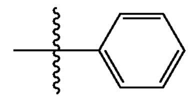 | 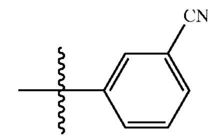 |

-continued
| No. | | Ar1 | Ar2 |
|---|---|---|---|
| 31-45 | 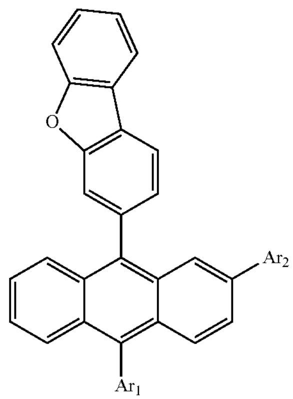 | 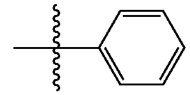 [SMILES: *c1ccccc1] | 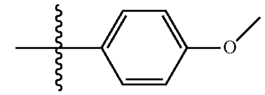 |
| 31-46 | 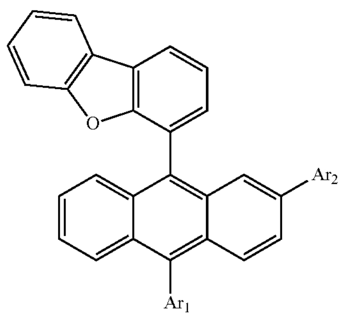 | 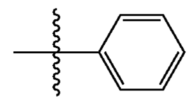 | 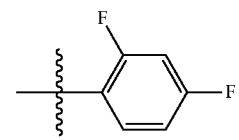 [SMILES: *c1ccc(F)cc1F] |

-continued
| No. | | Ar1 | Ar2 |
|---|---|---|---|
| 32-1 | 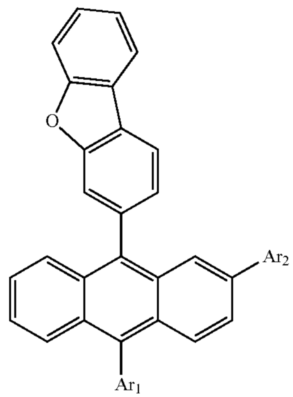 | 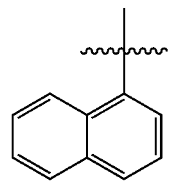 [SMILES: *c1cccc2ccccc12] | 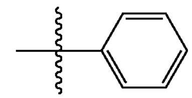 [SMILES: *c1ccccc1] |
| 32-2 | 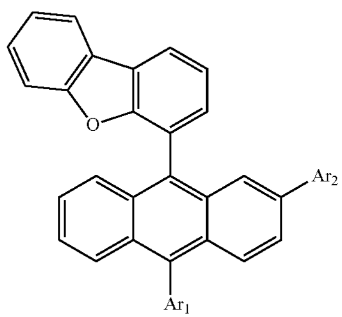 | 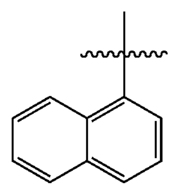 [SMILES: *c1cccc2ccccc12] | 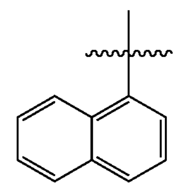 [SMILES: *c1cccc2ccccc12] |

-continued
| No. | | Ar1 | Ar2 |
|---|---|---|---|
| 32-3 | 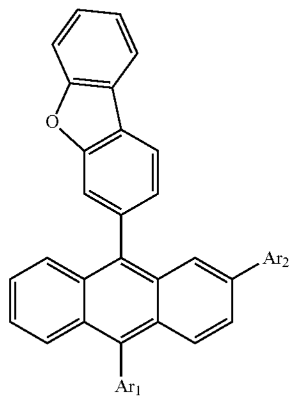 | 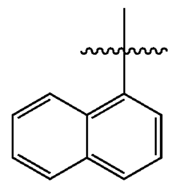 [SMILES: *c1cccc2ccccc12] | 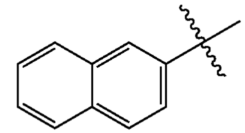 [SMILES: *c1ccc2ccccc2c1] |
| 32-4 | 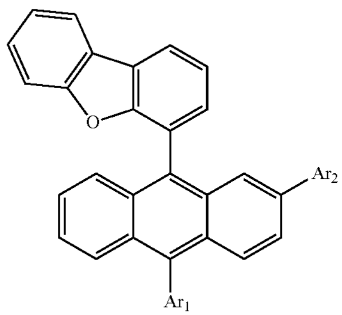 | 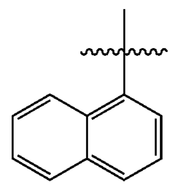 [SMILES: *c1cccc2ccccc12] | 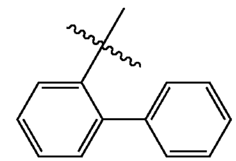 [SMILES: *c1ccccc1-c1ccccc1] |

-continued
| No. | | Ar1 | Ar2 |
|---|---|---|---|
| 32-5 | 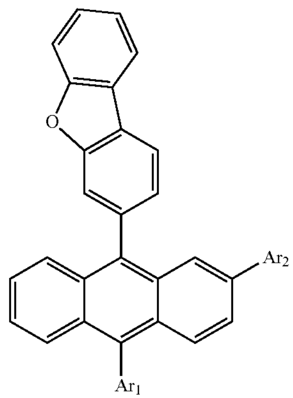 | 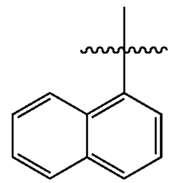 [SMILES: *c1cccc2ccccc12] | 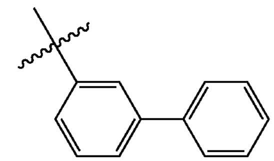 [SMILES: *c1cccc(-c2ccccc2)c1] |
| 32-6 | 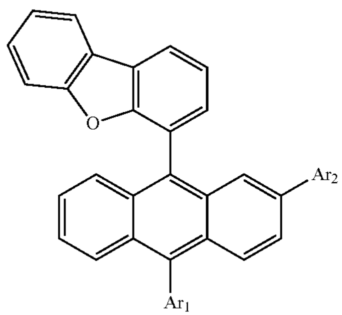 | 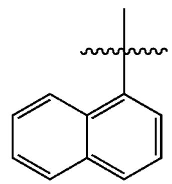 [SMILES: *c1cccc2ccccc12] | 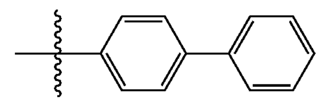 [SMILES: *c1ccc(-c2ccccc2)cc1] |

-continued
| No. | | Ar1 | Ar2 |
|---|---|---|---|
| 32-7 | 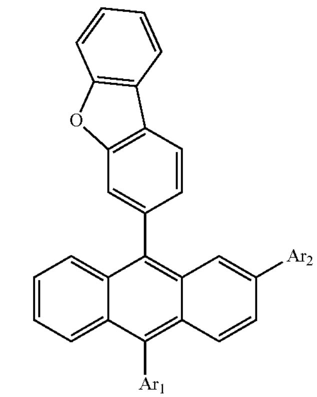 | 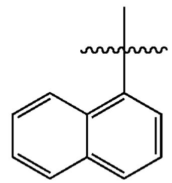 [SMILES: *c1cccc2ccccc12] | 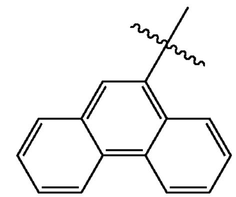 [SMILES: *c1cc2ccccc2c2ccccc12] |
| 32-8 | 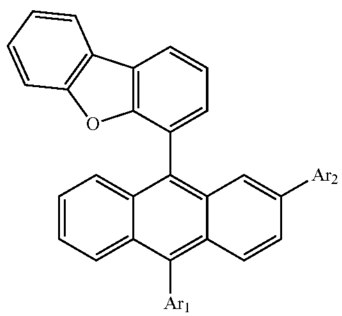 | 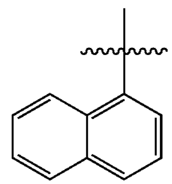 [SMILES: *c1cccc2ccccc12] | 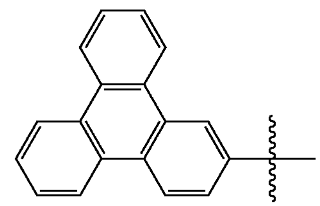 [SMILES: *c1ccc2c3ccccc3c3ccccc3c2c1] |

-continued
| No. | | Ar1 | Ar2 |
| --- | --- | --- | --- |
| 32-9 | 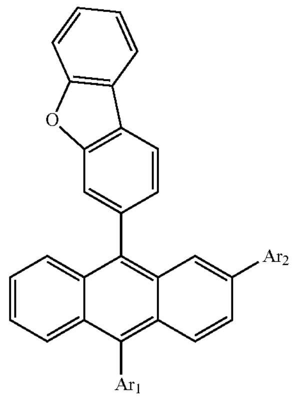  | 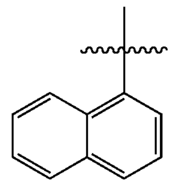 [SMILES: *c1cccc2ccccc12] | 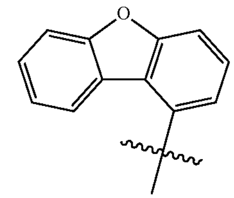  |
| 32-10 | 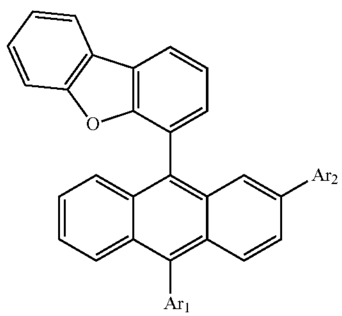  | 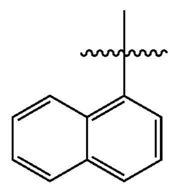 [SMILES: *c1cccc2ccccc12] | 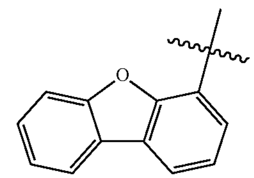 [SMILES: *c1cccc2c1oc1ccccc12]  |

-continued
| No. | | Ar1 | Ar2 |
|---|---|---|---|
| 32-11 | 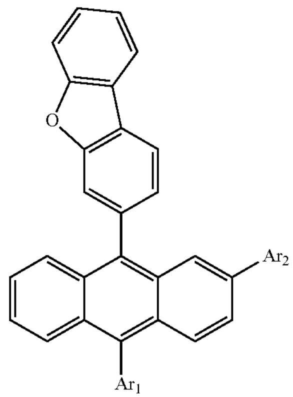 | 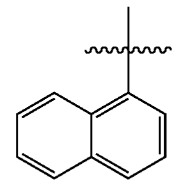 [SMILES: *c1cccc2ccccc12] | 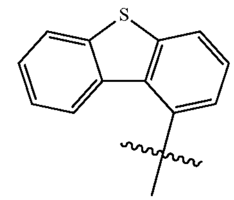 |
| 32-12 | 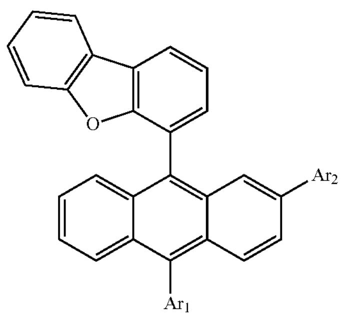 | 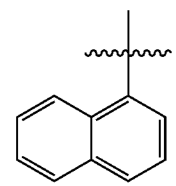 [SMILES: *c1cccc2ccccc12] | 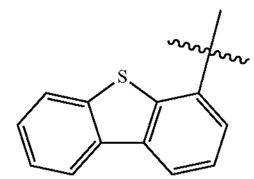 |

-continued
| No. | | Ar1 | Ar2 |
|---|---|---|---|
| 32-13 | 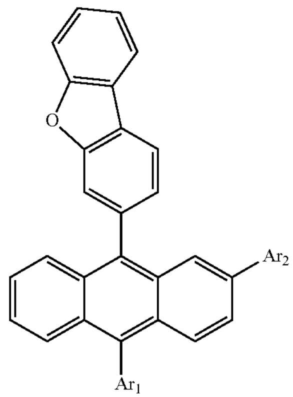 | 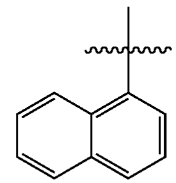 [SMILES: *c1cccc2ccccc12] | 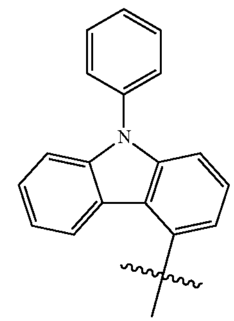 [SMILES: *c1cccc2c1c1ccccc1n2-c1ccccc1] |
| 32-14 | 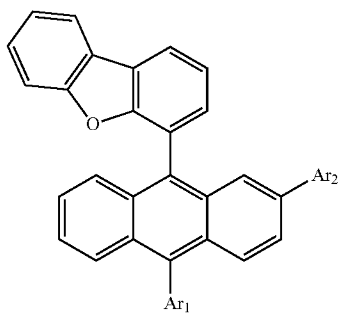 | 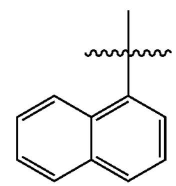 [SMILES: *c1cccc2ccccc12] | 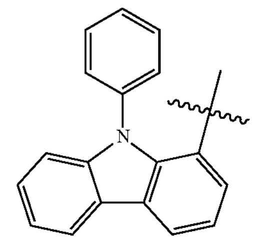 [SMILES: *c1cccc2c3ccccc3n(-c3ccccc3)c12] |

-continued
| No. | | Ar1 | Ar2 |
|---|---|---|---|
| 32-15 | 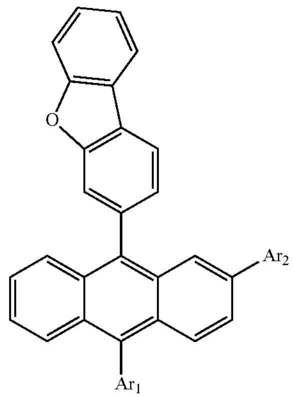 | 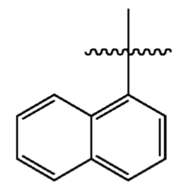 [SMILES: *c1cccc2ccccc12] | 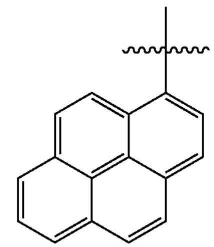 [SMILES: *c1ccc2ccc3cccc4ccc1c2c34] |
| 32-16 | 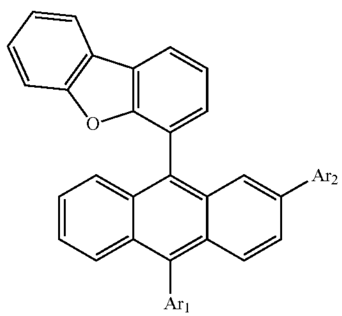 | 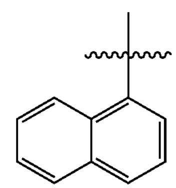 [SMILES: *c1cccc2ccccc12] | 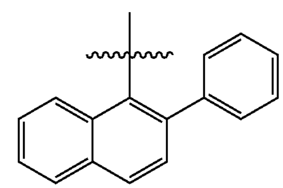 [SMILES: *c1c(-c2ccccc2)ccc2ccccc12] |

-continued
| No. | | Ar1 | Ar2 |
|---|---|---|---|
| 32-17 | 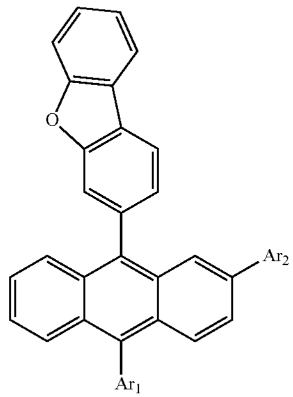 | 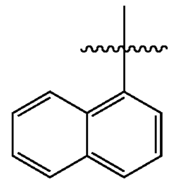 [SMILES: *c1cccc2ccccc12] | 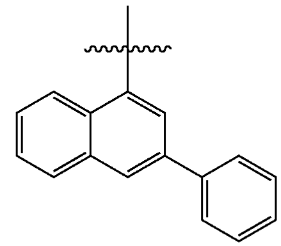 [SMILES: *c1cc(-c2ccccc2)cc2ccccc12] |
| 32-18 | 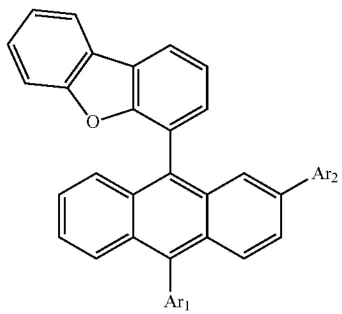 | 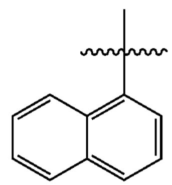 [SMILES: *c1cccc2ccccc12] | 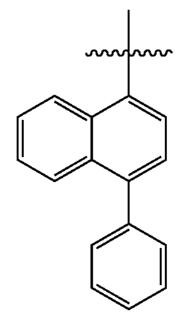 [SMILES: *c1ccc(-c2ccccc2)c2ccccc12] |

-continued
| No. | | Ar1 | Ar2 |
|---|---|---|---|
| 32-19 | 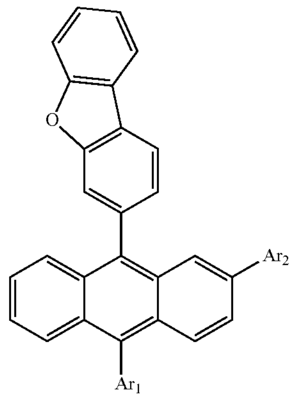 | 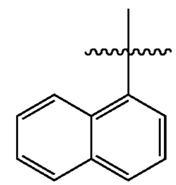 [SMILES: *c1cccc2ccccc12] | 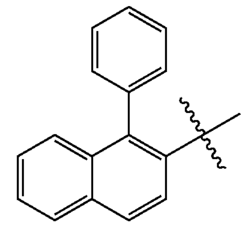 [SMILES: *c1ccc2ccccc2c1-c1ccccc1] |
| 32-20 | 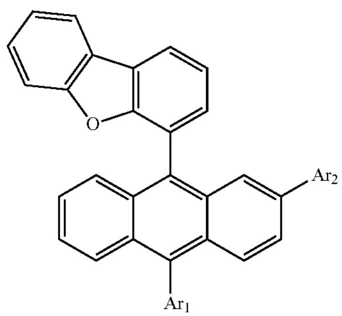 | 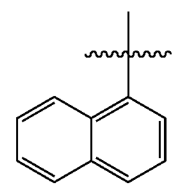 [SMILES: *c1cccc2ccccc12] | 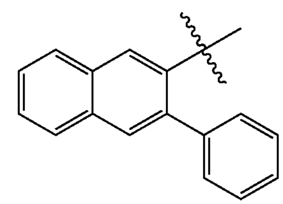 [SMILES: *c1cc2ccccc2cc1-c1ccccc1] |

-continued
| No. | | Ar1 | Ar2 |
|---|---|---|---|
| 32-21 | 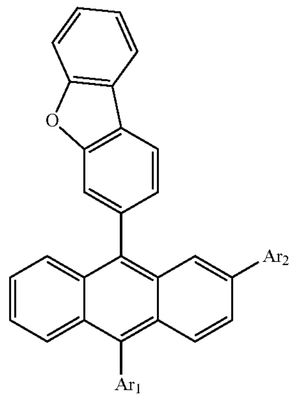 | 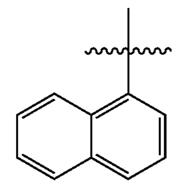 [SMILES: *c1cccc2ccccc12] | 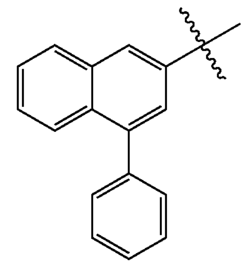 [SMILES: *c1cc(-c2ccccc2)c2ccccc2c1] |
| 32-22 | 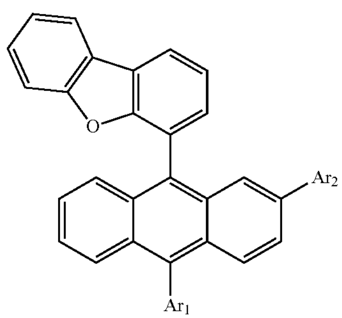 | 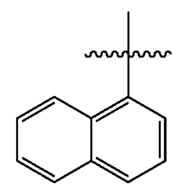 [SMILES: *c1cccc2ccccc12] | 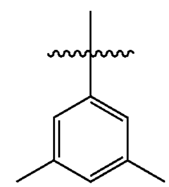 |

-continued
| No. | | Ar1 | Ar2 |
|---|---|---|---|
| 32-23 | 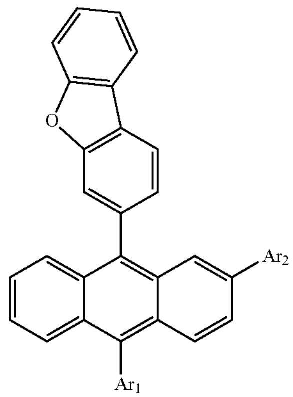 | 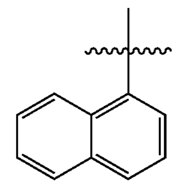 [SMILES: *c1cccc2ccccc12] | 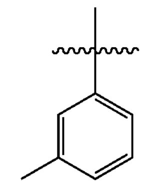 [SMILES: *c1cccc(C)c1] |
| 32-24 | 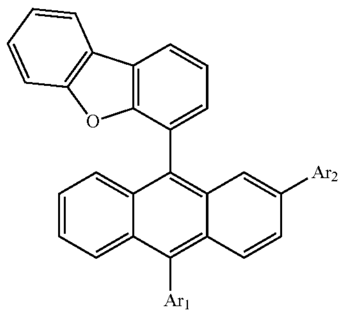 | 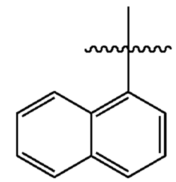 [SMILES: *c1cccc2ccccc12] | 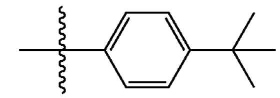 [SMILES: *c1ccc(C(C)(C)C)cc1] |

-continued
| No. | | Ar1 | Ar2 |
|---|---|---|---|
| 32-25 | 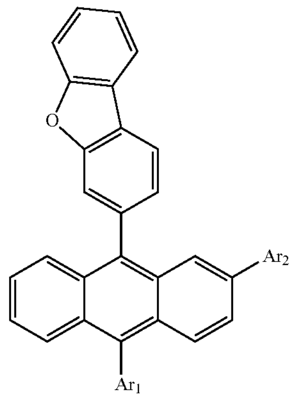 | 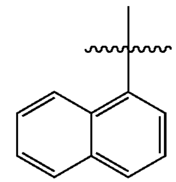 [SMILES: *c1cccc2ccccc12] | 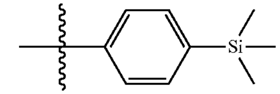 [SMILES: *c1ccc([Si](C)(C)C)cc1] |
| 32-26 | 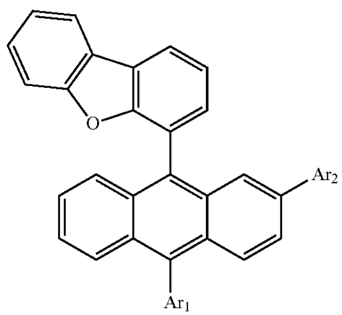 | 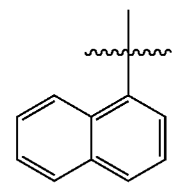 [SMILES: *c1cccc2ccccc12] | 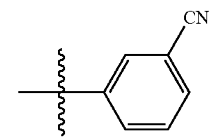 [SMILES: *c1cccc(C#N)c1] |

-continued
| No. | | Ar1 | Ar2 |
|---|---|---|---|
| 32-27 | 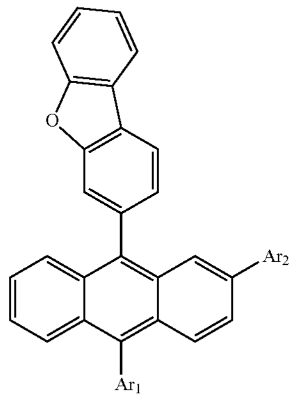 | 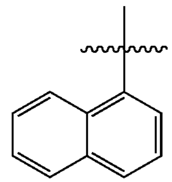 [SMILES: *c1cccc2ccccc12] | 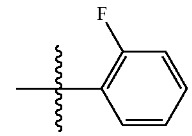 [SMILES: *c1ccccc1F] |
| 32-28 | 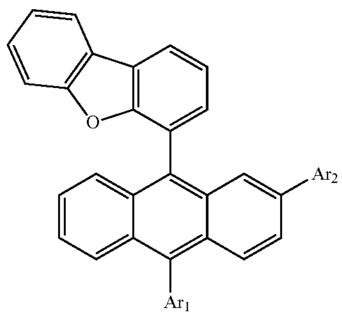 | 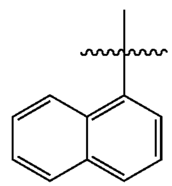 [SMILES: *c1cccc2ccccc12] | 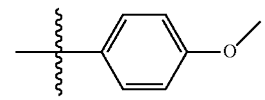 [SMILES: *c1ccc(OC)cc1] |

-continued
| No. | | Ar1 | Ar2 |
|---|---|---|---|
| 33-1 | 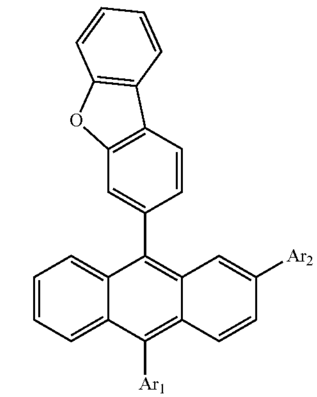 | 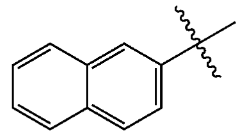 [SMILES: *c1ccc2ccccc2c1] | 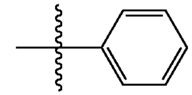 |
| 33-2 | 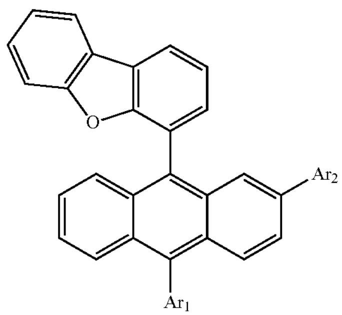 | 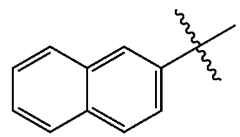 [SMILES: *c1ccc2ccccc2c1] | 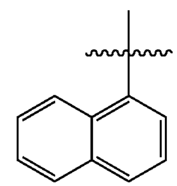 [SMILES: *c1cccc2ccccc12] |

-continued
| No. | | Ar1 | Ar2 |
|---|---|---|---|
| 33-3 | 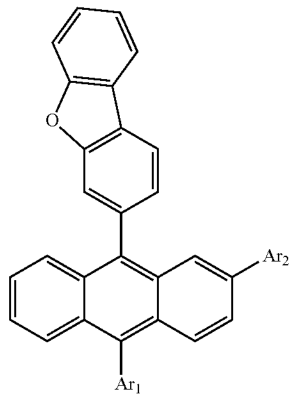 | 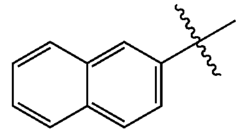 [SMILES: *c1ccc2ccccc2c1] | 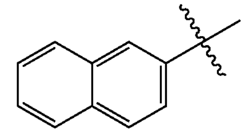 [SMILES: *c1ccc2ccccc2c1] |
| 33-4 | 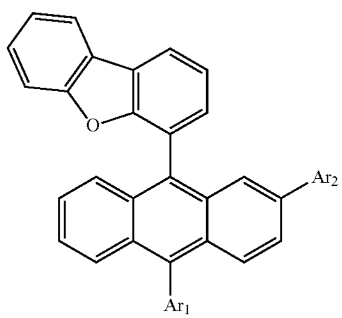 | 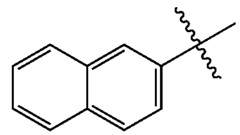 [SMILES: *c1ccc2ccccc2c1] | 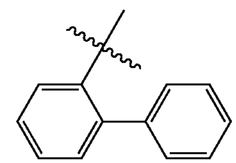 [SMILES: *c1ccccc1-c1ccccc1] |

-continued
| No. | | Ar1 | Ar2 |
|---|---|---|---|
| 33-5 | 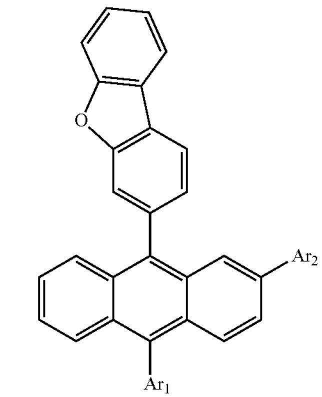 | 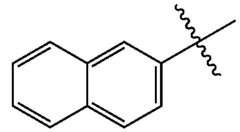 [SMILES: *c1ccc2ccccc2c1] | 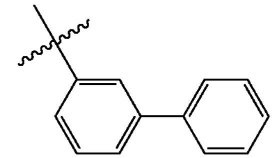 [SMILES: *c1cccc(-c2ccccc2)c1] |
| 33-6 | 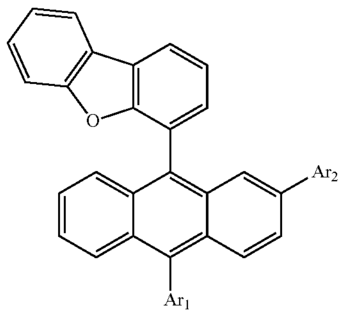 | 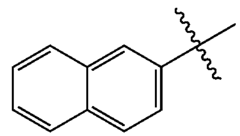 [SMILES: *c1ccc2ccccc2c1] | 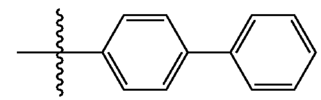 [SMILES: *c1ccc(-c2ccccc2)cc1] |

-continued
| No. | | Ar1 | Ar2 |
|---|---|---|---|
| 33-7 | 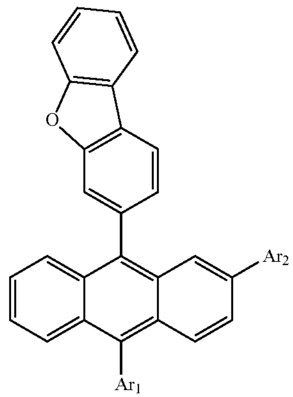 | 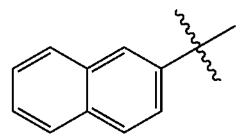 [SMILES: *c1ccc2ccccc2c1] | 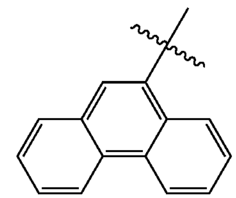 [SMILES: *c1cc2ccccc2c2ccccc12] |
| 33-8 | 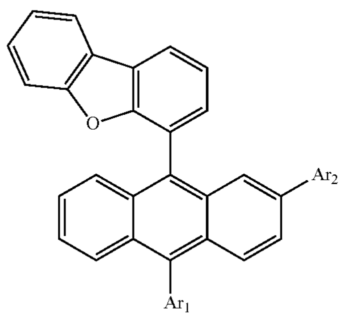 | 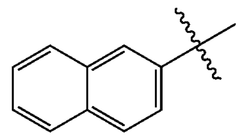 [SMILES: *c1ccc2ccccc2c1] | 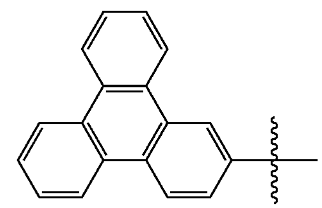 [SMILES: *c1ccc2c3ccccc3c3ccccc3c2c1] |

-continued
| No. | | Ar1 | Ar2 |
|---|---|---|---|
| 33-9 | 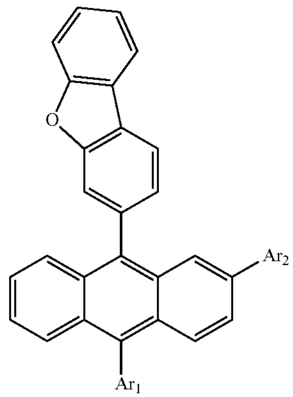 | 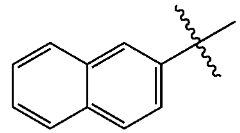 [SMILES: *c1ccc2ccccc2c1] | 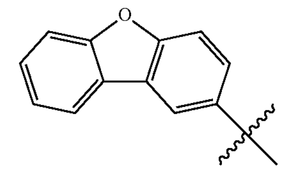 |
| 33-10 | 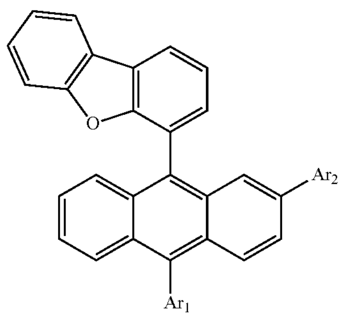 | 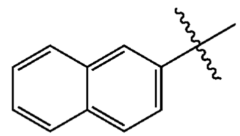 [SMILES: *c1ccc2ccccc2c1] | 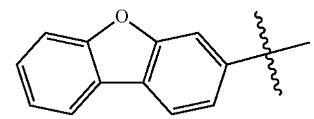 |

-continued
| No. | | Ar1 | Ar2 |
|---|---|---|---|
| 33-11 | 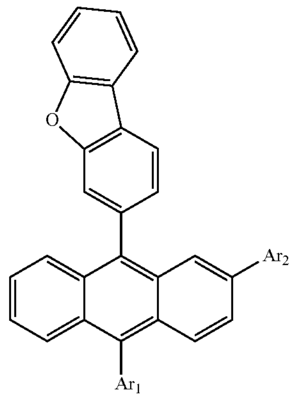 | 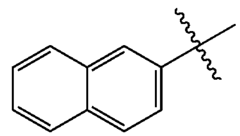 [SMILES: *c1ccc2ccccc2c1] | 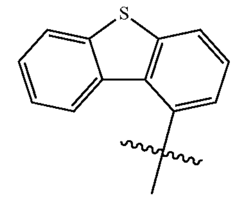 |
| 33-12 | 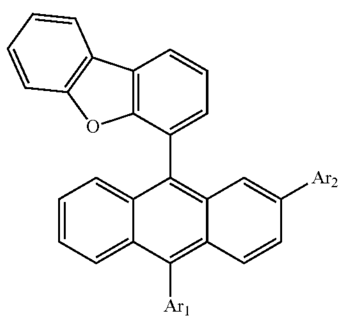 | 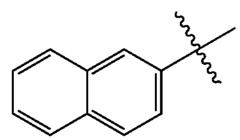 [SMILES: *c1ccc2ccccc2c1] | 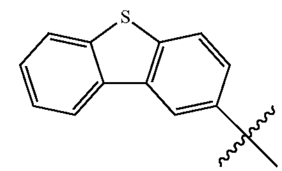 [SMILES: *c1ccc2sc3ccccc3c2c1] |

-continued
| No. | | Ar1 | Ar2 |
| --- | --- | --- | --- |
| 33-13 | 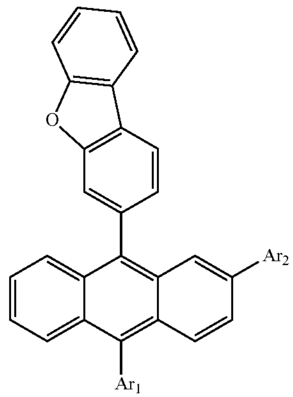 | 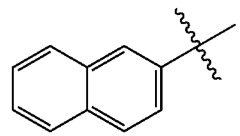 [SMILES: *c1ccc2ccccc2c1] | 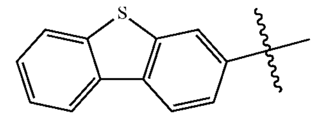 [SMILES: *c1ccc2c(c1)sc1ccccc12] |
| 33-14 | 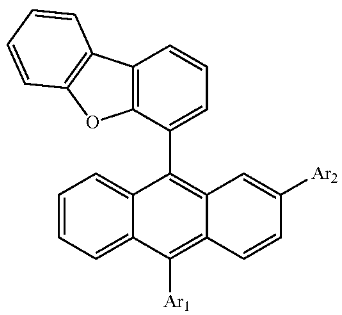 | 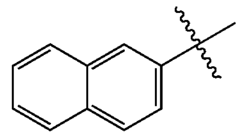 [SMILES: *c1ccc2ccccc2c1] | 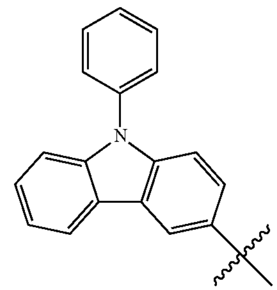 [SMILES: *c1ccc2c(c1)c1ccccc1n2-c1ccccc1] |

-continued
| No. | | Ar1 | Ar2 |
|---|---|---|---|
| 33-15 | 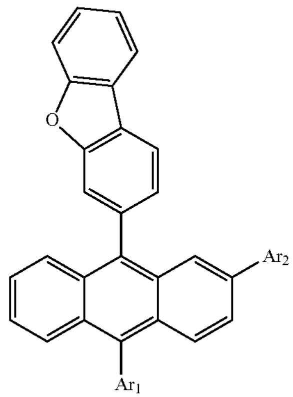 | 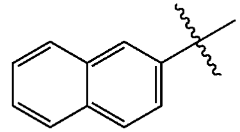 [SMILES: *c1ccc2ccccc2c1] | 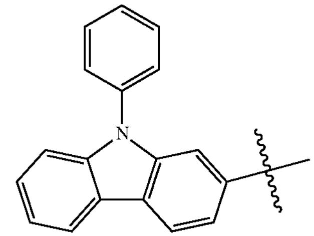 [SMILES: *c1ccc2c3ccccc3n(-c3ccccc3)c2c1] |
| 33-16 | 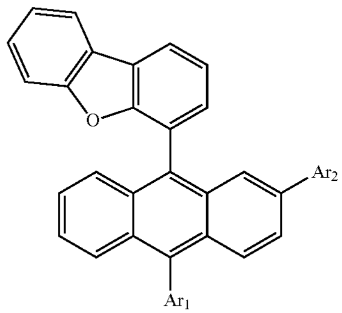 | 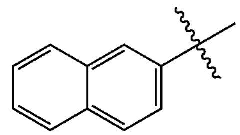 [SMILES: *c1ccc2ccccc2c1] | 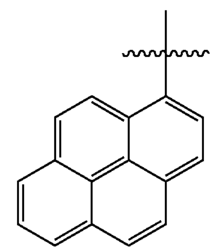 [SMILES: *c1ccc2ccc3cccc4ccc1c2c34] |

-continued
| No. | | Ar1 | Ar2 |
|---|---|---|---|
| 33-17 | 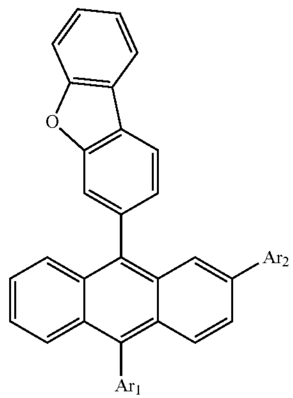 | 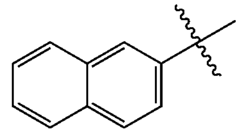 [SMILES: *c1ccc2ccccc2c1] | 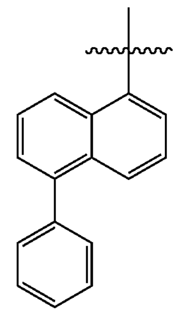 [SMILES: *c1cccc2c(-c3ccccc3)cccc12] |
| 33-18 | 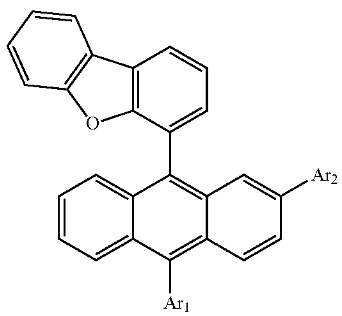 | 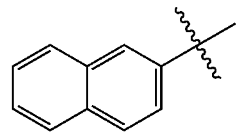 [SMILES: *c1ccc2ccccc2c1] | 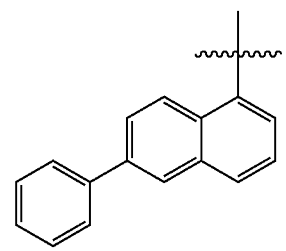 [SMILES: *c1cccc2cc(-c3ccccc3)ccc12] |

-continued
| No. | | Ar1 | Ar2 |
| --- | --- | --- | --- |
| 33-19 | 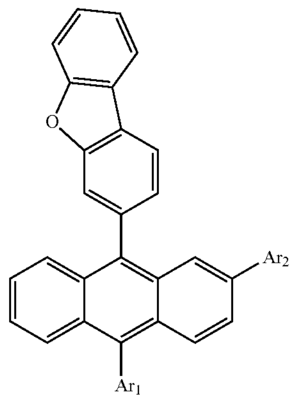 | 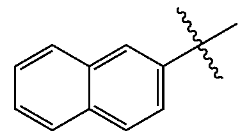 [SMILES: *c1ccc2ccccc2c1] | 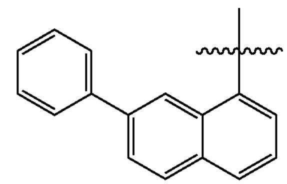 [SMILES: *c1cccc2ccc(-c3ccccc3)cc12] |
| 33-20 | 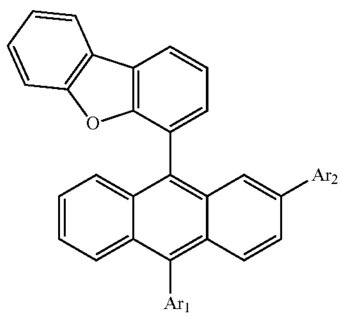 | 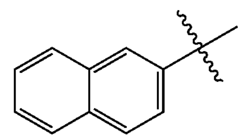 [SMILES: *c1ccc2ccccc2c1] | 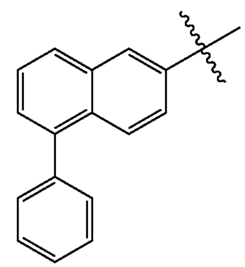 [SMILES: *c1ccc2c(-c3ccccc3)cccc2c1] |

-continued
| No. | | Ar1 | Ar2 |
|---|---|---|---|
| 33-21 | 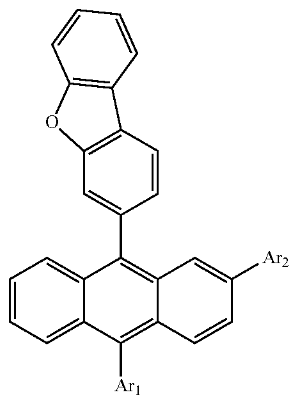 | 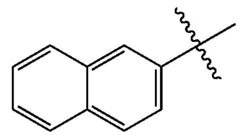 [SMILES: *c1ccc2ccccc2c1] | 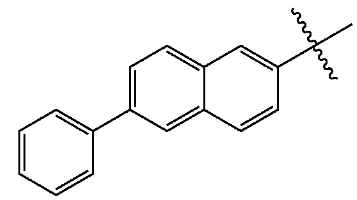 [SMILES: *c1ccc2cc(-c3ccccc3)ccc2c1] |
| 33-22 | 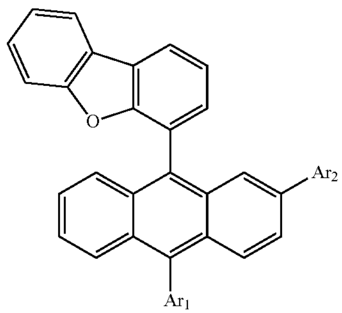 | 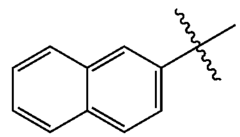 [SMILES: *c1ccc2ccccc2c1] | 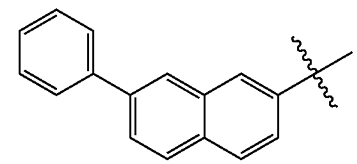 [SMILES: *c1ccc2ccc(-c3ccccc3)cc2c1] |

-continued
| No. | | Ar1 | Ar2 |
|---|---|---|---|
| 33-23 | 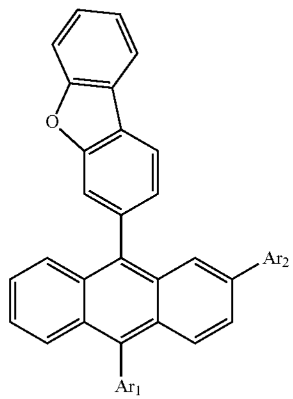 | 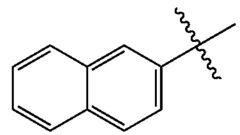 [SMILES: *c1ccc2ccccc2c1] | 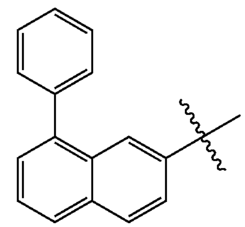 [SMILES: *c1ccc2cccc(-c3ccccc3)c2c1] |
| 33-24 | 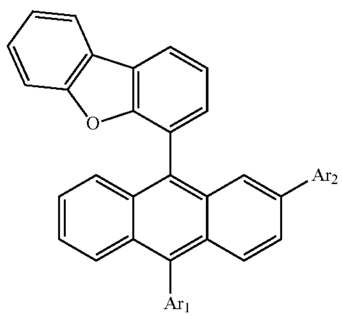 | 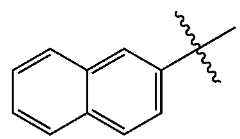 [SMILES: *c1ccc2ccccc2c1] | 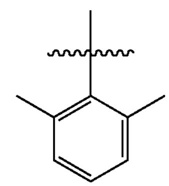 |

-continued
| No. | | Ar1 | Ar2 |
|---|---|---|---|
| 33-25 | 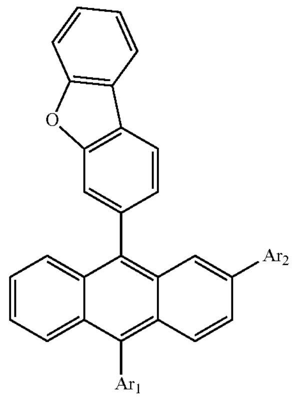 | 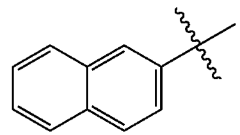 [SMILES: *c1ccc2ccccc2c1] | 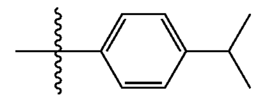 [SMILES: *c1ccc(C(C)C)cc1] |
| 33-26 | 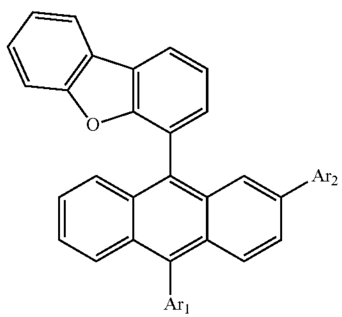 | 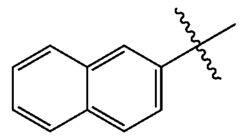 [SMILES: *c1ccc2ccccc2c1] | 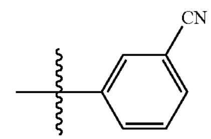 [SMILES: *c1cccc(C#N)c1] |

-continued
| No. | | Ar1 | Ar2 |
|---|---|---|---|
| 33-27 | 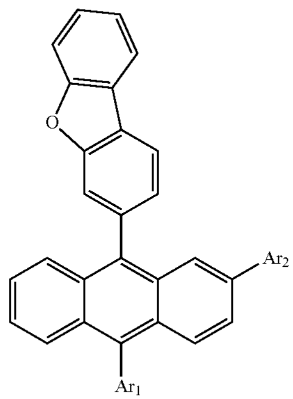 | 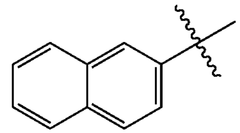 [SMILES: *c1ccc2ccccc2c1] | 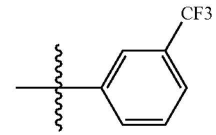 [SMILES: *c1cccc(C(F)(F)F)c1] |
| 33-28 | 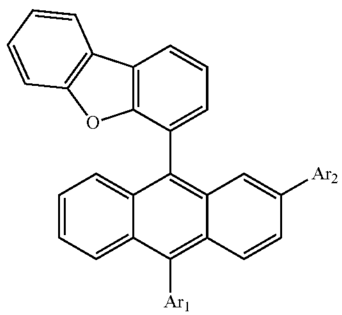 | 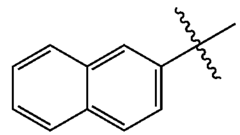 [SMILES: *c1ccc2ccccc2c1] | 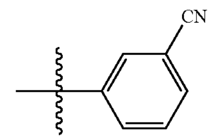 [SMILES: *c1cccc(C#N)c1] |

-continued
| No. | | Ar1 | Ar2 |
| --- | --- | --- | --- |
| 33-29 | 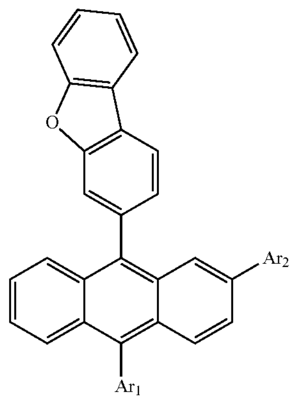 | 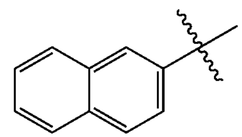 [SMILES: *c1ccc2ccccc2c1] | 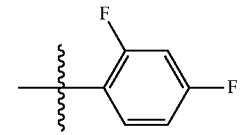 [SMILES: *c1ccc(F)cc1F] |
| 34-1 | 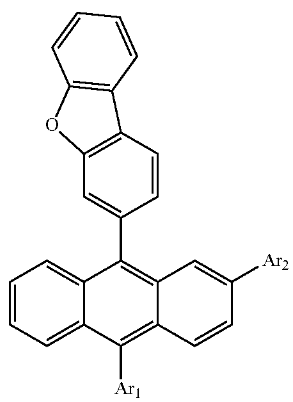 | 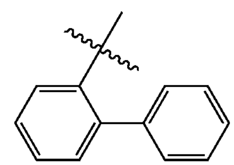 [SMILES: *c1ccccc1-c1ccccc1] | 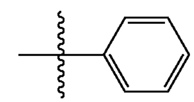 [SMILES: *c1ccccc1] |

-continued
| No. | | Ar1 | Ar2 |
|---|---|---|---|
| 34-2 | 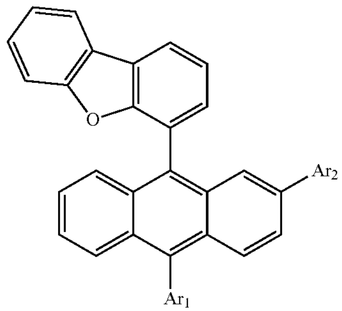 | 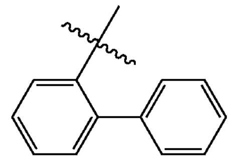 [SMILES: *c1ccccc1-c1ccccc1] | 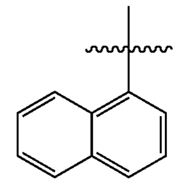 [SMILES: *c1cccc2ccccc12] |
| 34-3 | 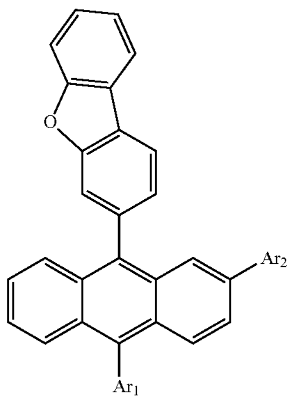 | 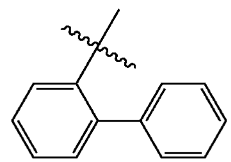 [SMILES: *c1ccccc1-c1ccccc1] | 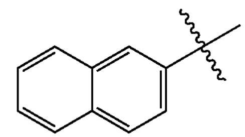 [SMILES: *c1ccc2ccccc2c1] |
| 34-4 | 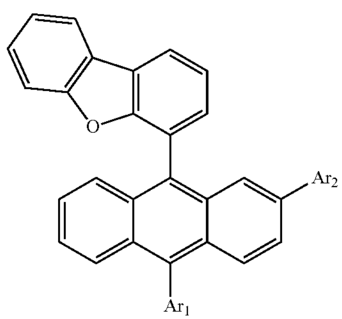 | 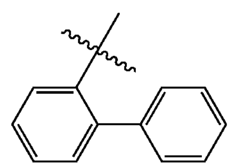 [SMILES: *c1ccccc1-c1ccccc1] | 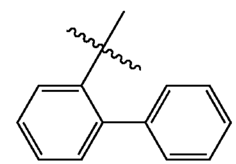 [SMILES: *c1ccccc1-c1ccccc1] |

-continued
| No. | | Ar1 | Ar2 |
| --- | --- | --- | --- |
| 34-5 | 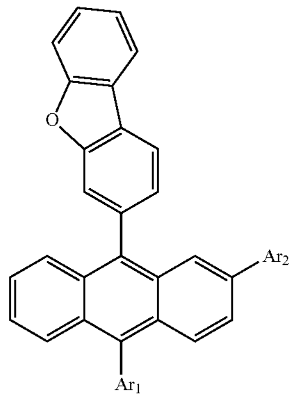 | 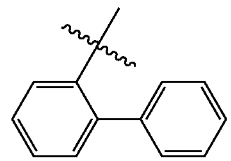 [SMILES: *c1ccccc1-c1ccccc1] | 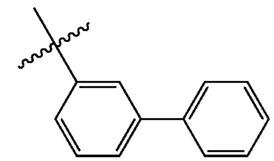 [SMILES: *c1cccc(-c2ccccc2)c1] |
| 34-6 | 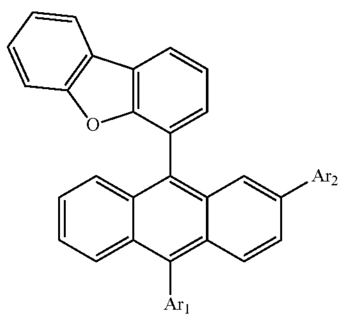 | 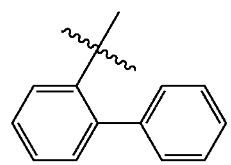 [SMILES: *c1ccccc1-c1ccccc1] | 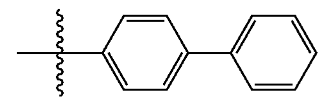 [SMILES: *c1ccc(-c2ccccc2)cc1] |

-continued
| No. | | Ar1 | Ar2 |
|---|---|---|---|
| 34-7 | 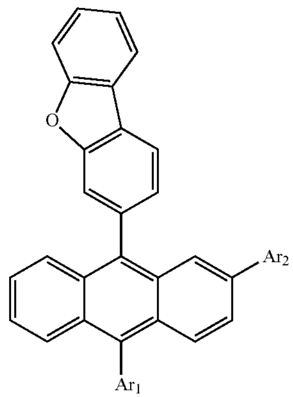 | 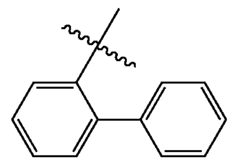 [SMILES: *c1ccccc1-c1ccccc1] | 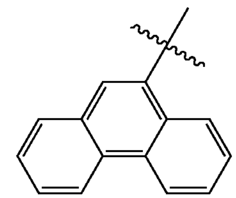 [SMILES: *c1cc2ccccc2c2ccccc12] |
| 34-8 | 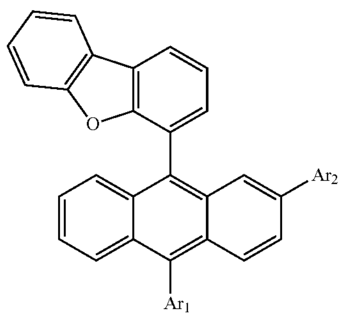 | 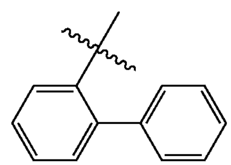 [SMILES: *c1ccccc1-c1ccccc1] | 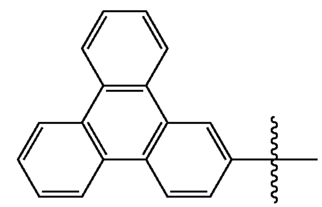 [SMILES: *c1ccc2c3ccccc3c3ccccc3c2c1] |

-continued
| No. | | Ar1 | Ar2 |
|---|---|---|---|
| 34-9 | 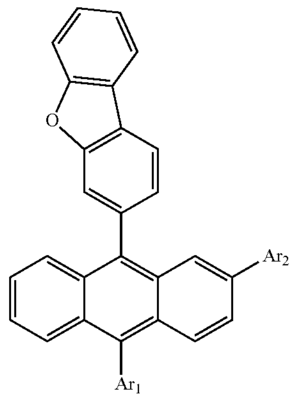 | 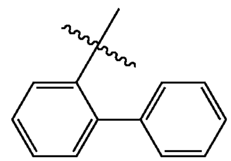 [SMILES: *c1ccccc1-c1ccccc1] | 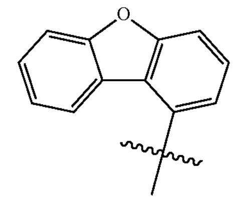 [SMILES: *c1cccc2oc3ccccc3c12] |
| 34-10 | 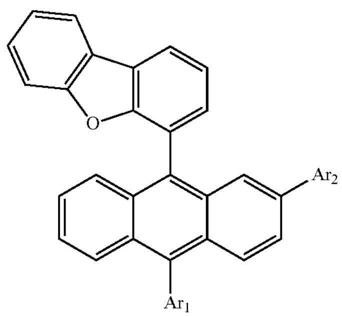 | 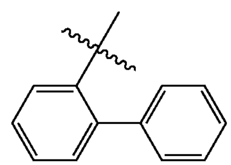 [SMILES: *c1ccccc1-c1ccccc1] | 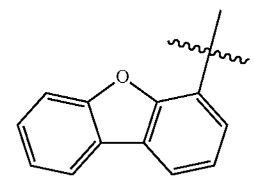 [SMILES: *c1cccc2c1oc1ccccc12] |

-continued
| No. | | Ar1 | Ar2 |
|---|---|---|---|
| 34-11 | 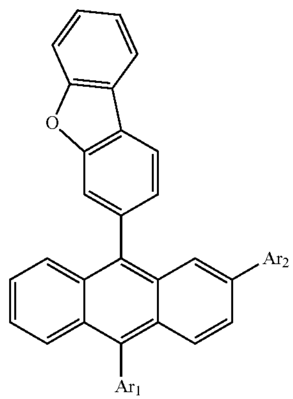 | 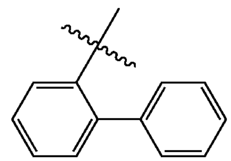 [SMILES: *c1ccccc1-c1ccccc1] | 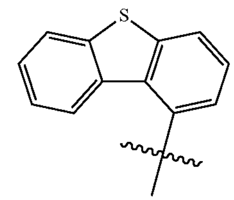 [SMILES: *c1cccc2sc3ccccc3c12] |
| 34-12 | 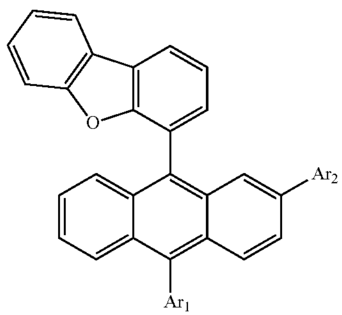 | 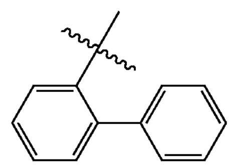 [SMILES: *c1ccccc1-c1ccccc1] | 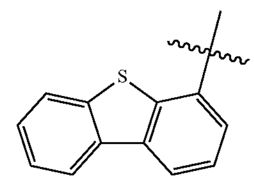 [SMILES: *c1cccc2c1sc1ccccc12] |

-continued
| No. | | Ar1 | Ar2 |
|---|---|---|---|
| 34-13 | 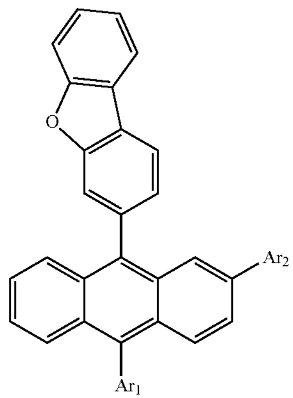 | 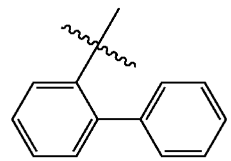 [SMILES: *c1ccccc1-c1ccccc1] | 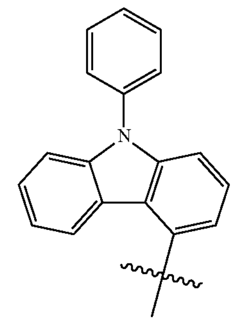 [SMILES: *c1cccc2c1c1ccccc1n2-c1ccccc1] |
| 34-14 | 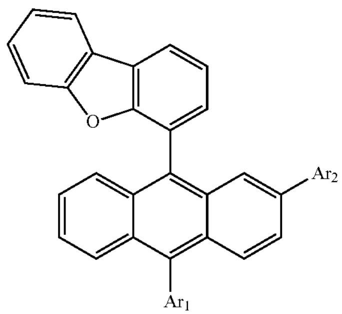 | 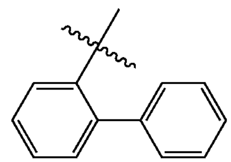 [SMILES: *c1ccccc1-c1ccccc1] | 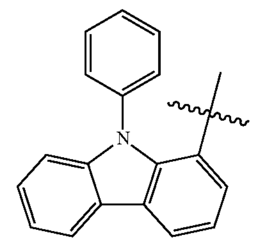 [SMILES: *c1cccc2c3ccccc3n(-c3ccccc3)c12] |

-continued
| No. | | Ar1 | Ar2 |
|---|---|---|---|
| 34-15 | 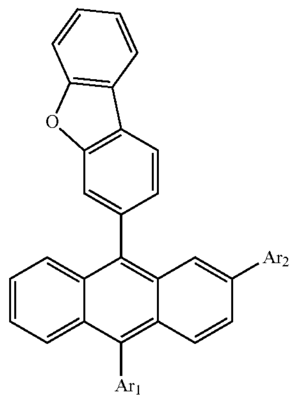 | 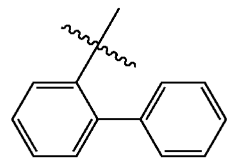 [SMILES: *c1ccccc1-c1ccccc1] | 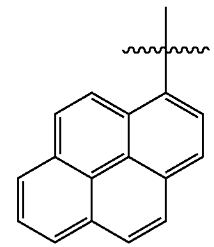 [SMILES: *c1ccc2ccc3cccc4ccc1c2c34] |
| 34-16 | 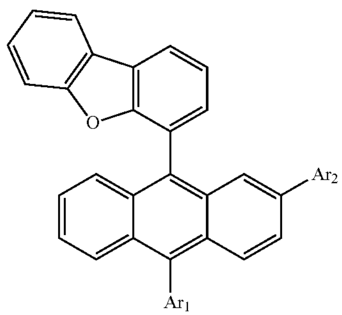 | 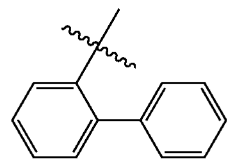 [SMILES: *c1ccccc1-c1ccccc1] | 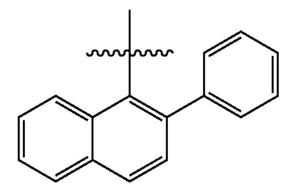 [SMILES: *c1c(-c2ccccc2)ccc2ccccc12] |

-continued
| No. | | Ar1 | Ar2 |
|---|---|---|---|
| 34-17 | 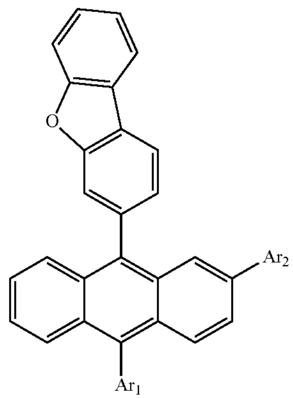 | 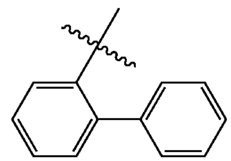 [SMILES: *c1ccccc1-c1ccccc1] | 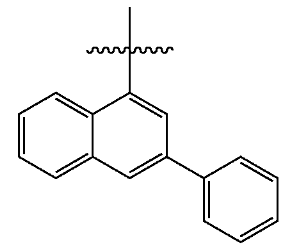 [SMILES: *c1cc(-c2ccccc2)cc2ccccc12] |
| 34-18 | 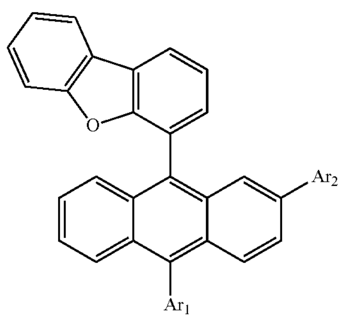 | 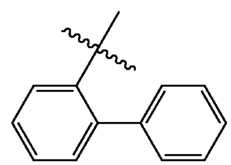 [SMILES: *c1ccccc1-c1ccccc1] | 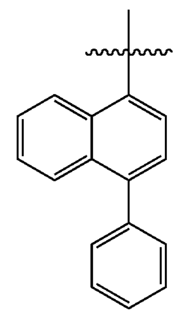 [SMILES: *c1ccc(-c2ccccc2)c2ccccc12] |

-continued
| No. | | Ar1 | Ar2 |
|---|---|---|---|
| 34-19 | 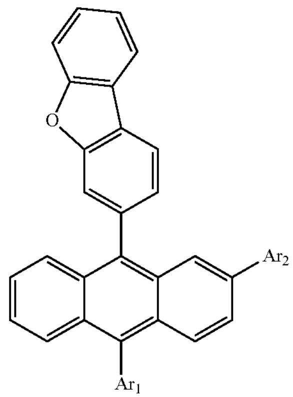 | 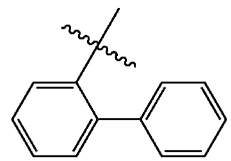 [SMILES: *c1ccccc1-c1ccccc1] | 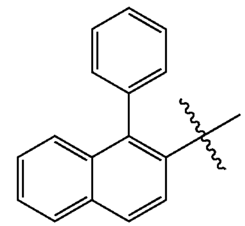 [SMILES: *c1ccc2ccccc2c1-c1ccccc1] |
| 34-20 | 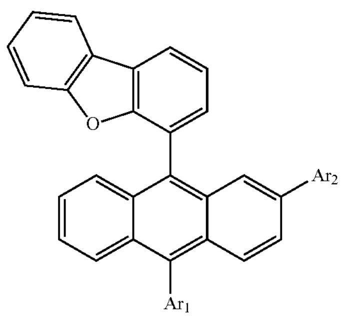 | 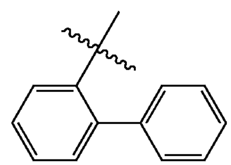 [SMILES: *c1ccccc1-c1ccccc1] | 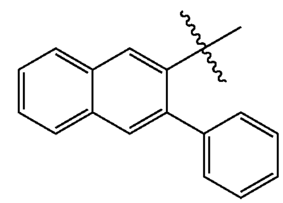 [SMILES: *c1cc2ccccc2cc1-c1ccccc1] |

-continued
| No. | | Ar1 | Ar2 |
|---|---|---|---|
| 34-21 | 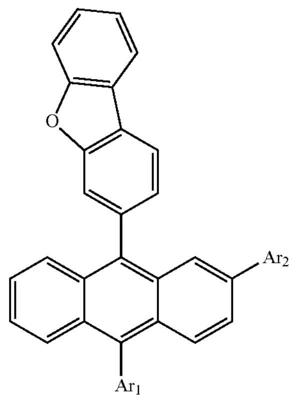 | 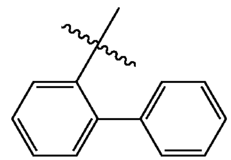 [SMILES: *c1ccccc1-c1ccccc1] | 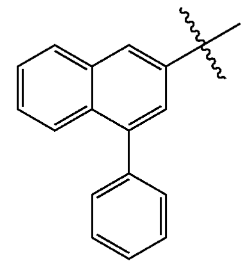 [SMILES: *c1cc(-c2ccccc2)c2ccccc2c1] |
| 34-22 | 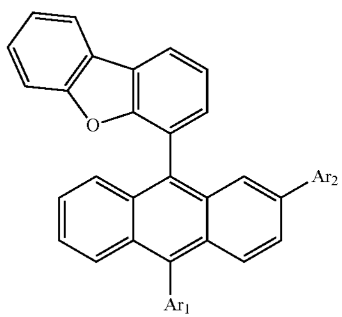 | 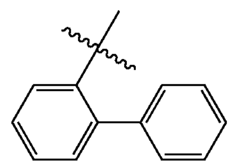 [SMILES: *c1ccccc1-c1ccccc1] | 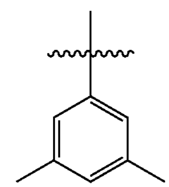 |

-continued
| No. | | Ar1 | Ar2 |
|---|---|---|---|
| 34-23 | 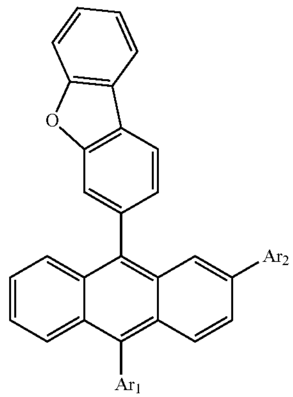 | 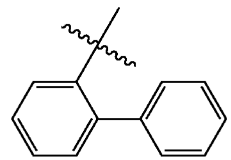 [SMILES: *c1ccccc1-c1ccccc1] | 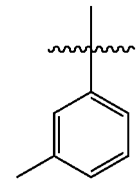 [SMILES: *c1cccc(C)c1] |
| 34-24 | 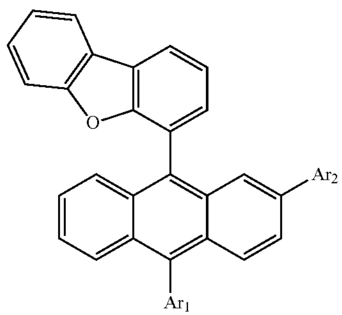 | 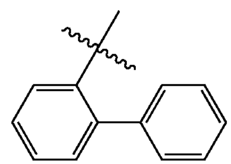 [SMILES: *c1ccccc1-c1ccccc1] | 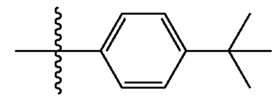 [SMILES: *c1ccc(C(C)(C)C)cc1] |

-continued
| No. | | Ar1 | Ar2 |
|---|---|---|---|
| 34-25 | 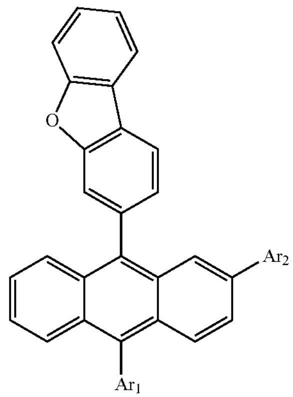 | 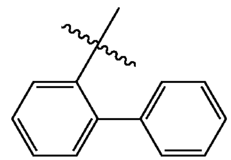 [SMILES: *c1ccccc1-c1ccccc1] | 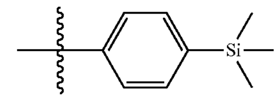 [SMILES: *c1ccc([Si](C)(C)C)cc1] |
| 34-26 | 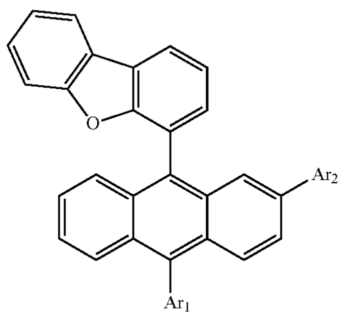 | 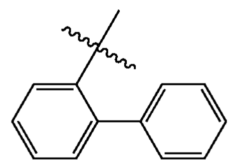 [SMILES: *c1ccccc1-c1ccccc1] | 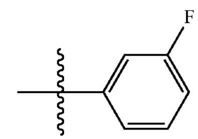 [SMILES: *c1cccc(F)c1] |

-continued
| No. | | Ar1 | Ar2 |
|---|---|---|---|
| 34-27 | 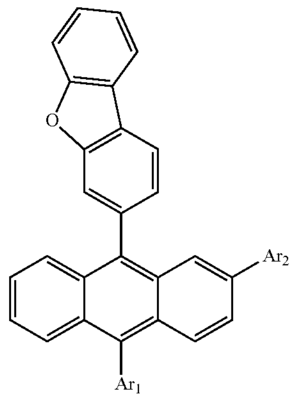 | 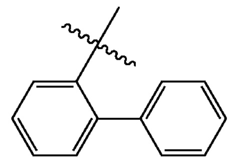 [SMILES: *c1ccccc1-c1ccccc1] | 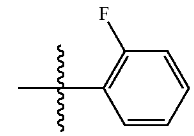 [SMILES: *c1ccccc1F] |
| 34-28 | 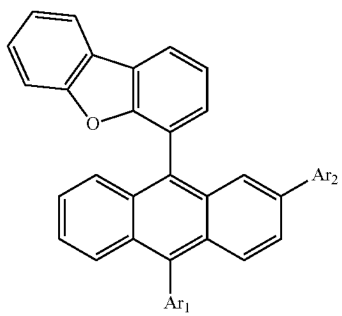 | 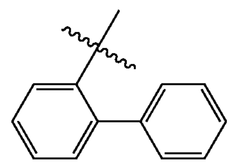 [SMILES: *c1ccccc1-c1ccccc1] | 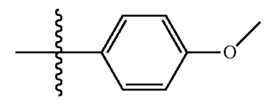 [SMILES: *c1ccc(OC)cc1] |

-continued
| No. | | Ar1 | Ar2 |
|---|---|---|---|
| 35-1 | 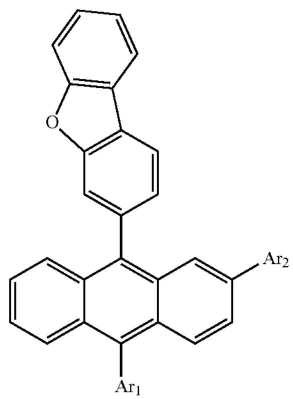 | 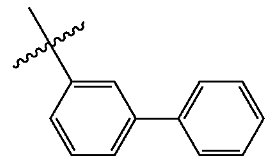 [SMILES: *c1cccc(-c2ccccc2)c1] | 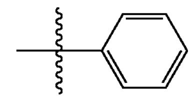 |
| 35-2 | 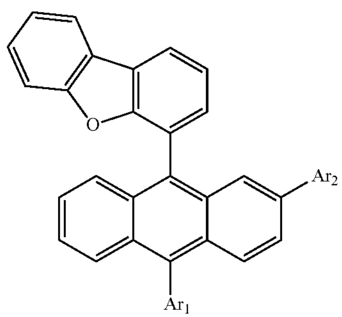 | 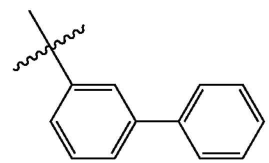 [SMILES: *c1cccc(-c2ccccc2)c1] | 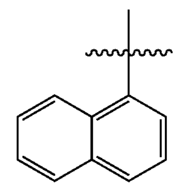 [SMILES: *c1cccc2ccccc12] |

-continued
| No. | | Ar1 | Ar2 |
|---|---|---|---|
| 35-3 | 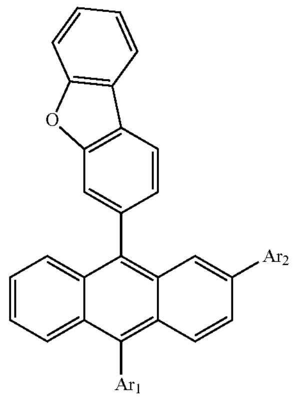 | 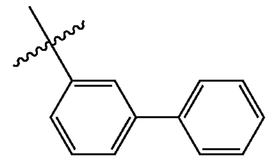 [SMILES: *c1cccc(-c2ccccc2)c1] | 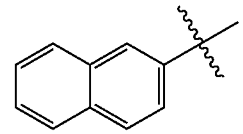 [SMILES: *c1ccc2ccccc2c1] |
| 35-4 | 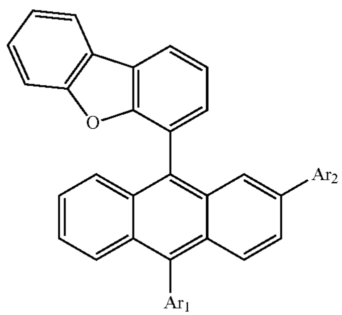 | 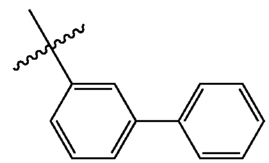 [SMILES: *c1cccc(-c2ccccc2)c1] | 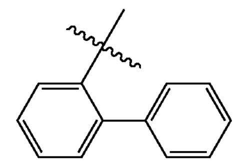 [SMILES: *c1ccccc1-c1ccccc1] |

-continued
| No. | | Ar1 | Ar2 |
|---|---|---|---|
| 35-5 | 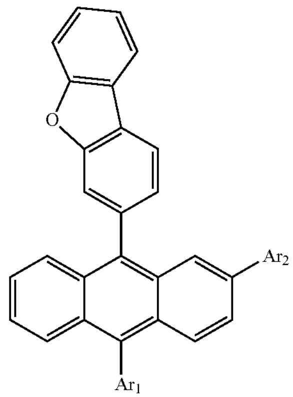 | 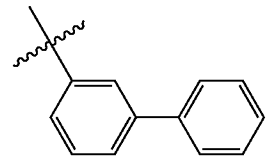 [SMILES: *c1cccc(-c2ccccc2)c1] | 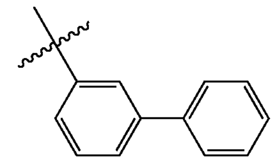 [SMILES: *c1cccc(-c2ccccc2)c1] |
| 35-6 | 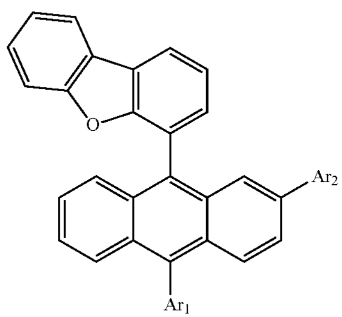 | 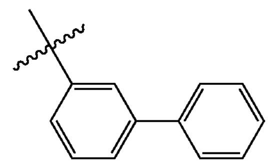 [SMILES: *c1cccc(-c2ccccc2)c1] | 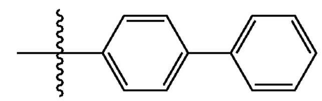 [SMILES: *c1ccc(-c2ccccc2)cc1] |

-continued
| No. | | Ar1 | Ar2 |
|---|---|---|---|
| 35-7 | 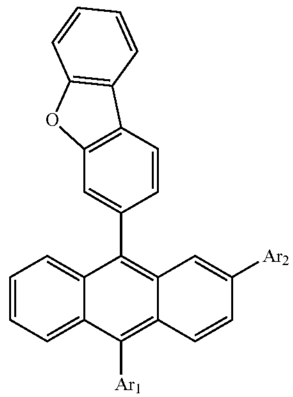 | 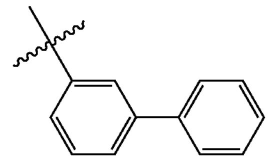 [SMILES: *c1cccc(-c2ccccc2)c1] | 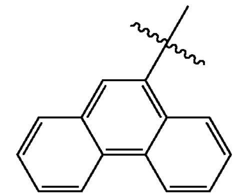 [SMILES: *c1cc2ccccc2c2ccccc12] |
| 35-8 | 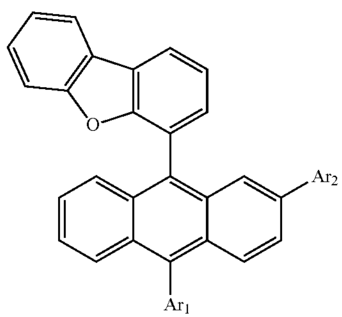 | 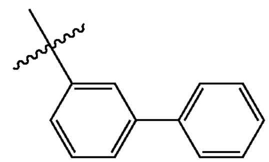 [SMILES: *c1cccc(-c2ccccc2)c1] | 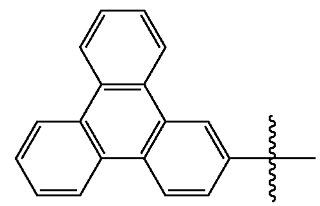 [SMILES: *c1ccc2c3ccccc3c3ccccc3c2c1] |

-continued
| No. | | Ar1 | Ar2 |
| --- | --- | --- | --- |
| 35-9 | 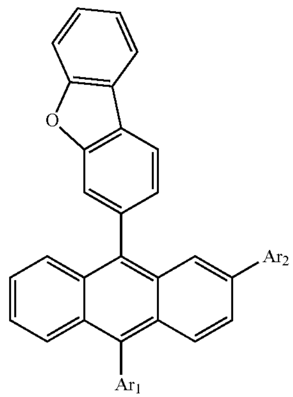  | 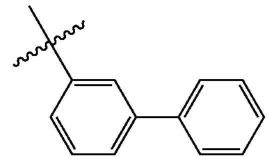 [SMILES: *c1cccc(-c2ccccc2)c1] | 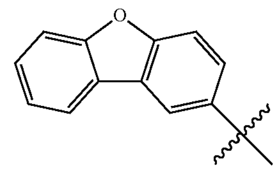 [SMILES: *c1ccc2oc3ccccc3c2c1]  |
| 35-10 | 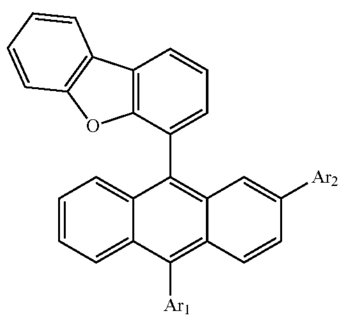  | 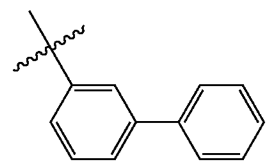 [SMILES: *c1cccc(-c2ccccc2)c1] | 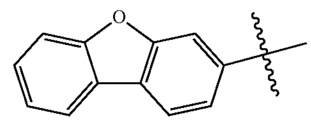  |

-continued
| No. | | Ar1 | Ar2 |
|---|---|---|---|
| 35-11 | 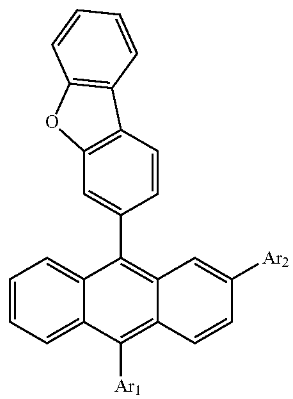 | 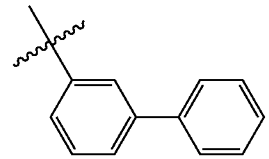 [SMILES: *c1cccc(-c2ccccc2)c1] | 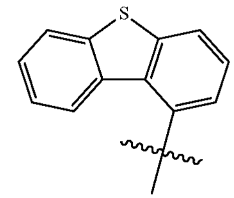 [SMILES: *c1cccc2sc3ccccc3c12] |
| 35-12 | 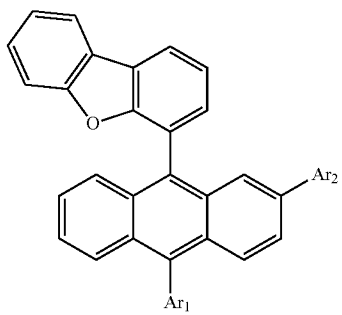 | 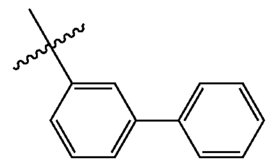 [SMILES: *c1cccc(-c2ccccc2)c1] | 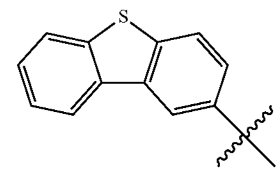 |

-continued
| No. | | Ar1 | Ar2 |
|---|---|---|---|
| 35-13 | 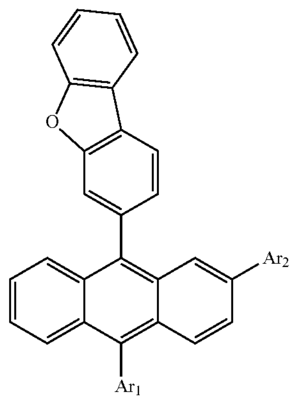 | 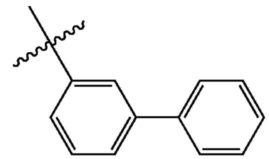 [SMILES: *c1cccc(-c2ccccc2)c1] | 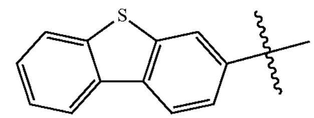 |
| 35-14 | 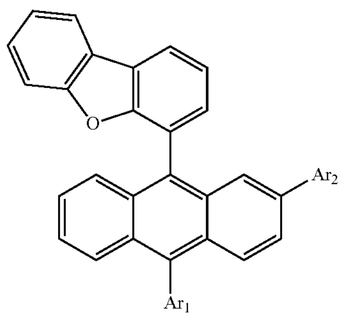 | 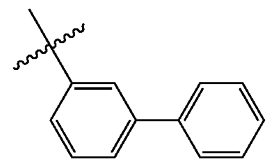 [SMILES: *c1cccc(-c2ccccc2)c1] | 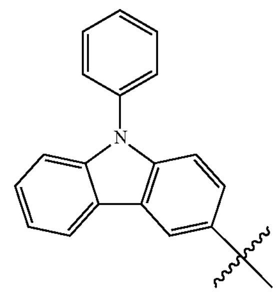 [SMILES: *c1ccc2c(c1)c1ccccc1n2-c1ccccc1] |

-continued
| No. | | Ar1 | Ar2 |
|---|---|---|---|
| 35-15 | 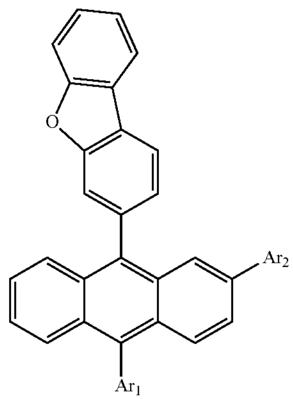 | 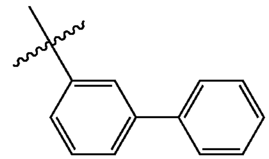 [SMILES: *c1cccc(-c2ccccc2)c1] | 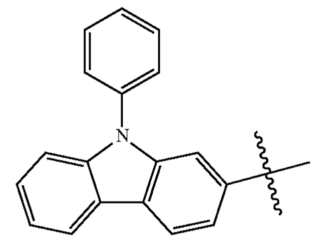 [SMILES: *c1ccc2c3ccccc3n(-c3ccccc3)c2c1] |
| 35-16 | 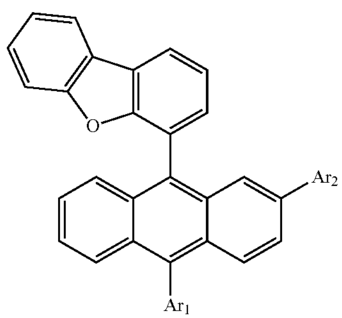 | 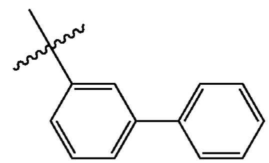 [SMILES: *c1cccc(-c2ccccc2)c1] | 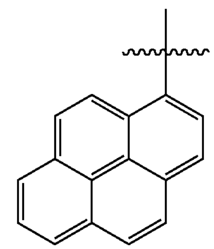 [SMILES: *c1ccc2ccc3cccc4ccc1c2c34] |

-continued
| No. | | Ar1 | Ar2 |
|---|---|---|---|
| 35-17 | 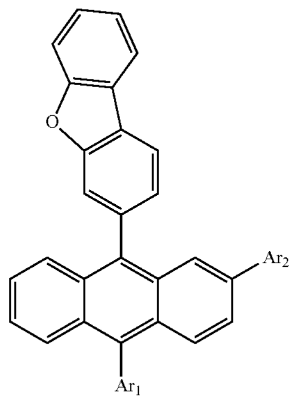 | 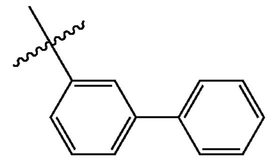 [SMILES: *c1cccc(-c2ccccc2)c1] | 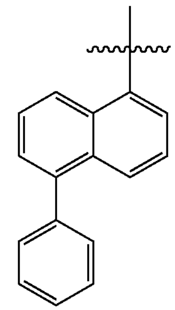 [SMILES: *c1cccc2c(-c3ccccc3)cccc12] |
| 35-18 | 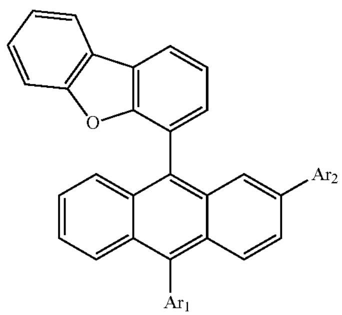 | 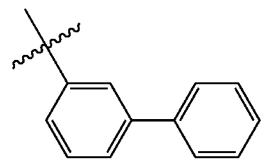 [SMILES: *c1cccc(-c2ccccc2)c1] | 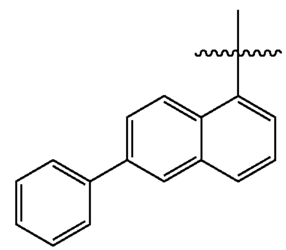 [SMILES: *c1cccc2cc(-c3ccccc3)ccc12] |

-continued
| No. | | Ar1 | Ar2 |
| --- | --- | --- | --- |
| 35-19 | 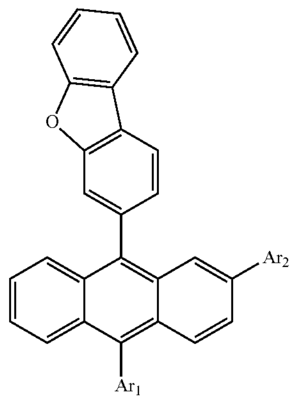 | 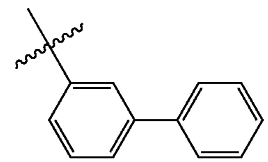 [SMILES: *c1cccc(-c2ccccc2)c1] | 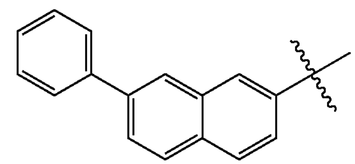 [SMILES: *c1ccc2ccc(-c3ccccc3)cc2c1] |
| 35-20 | 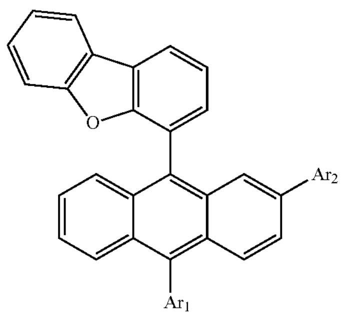 | 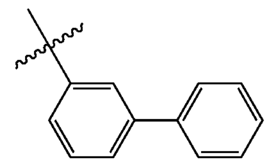 [SMILES: *c1cccc(-c2ccccc2)c1] | 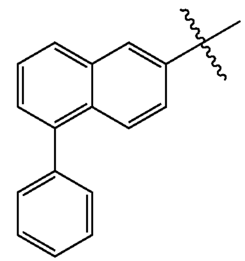 [SMILES: *c1ccc2c(-c3ccccc3)cccc2c1] |

-continued
| No. | | Ar1 | Ar2 |
| --- | --- | --- | --- |
| 35-21 | 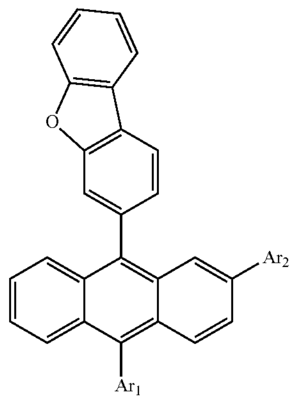 | 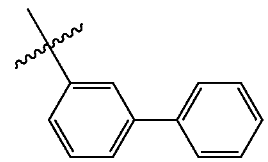 [SMILES: *c1cccc(-c2ccccc2)c1] | 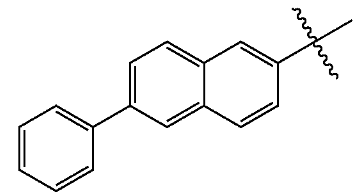 [SMILES: *c1ccc2cc(-c3ccccc3)ccc2c1] |
| 35-22 | 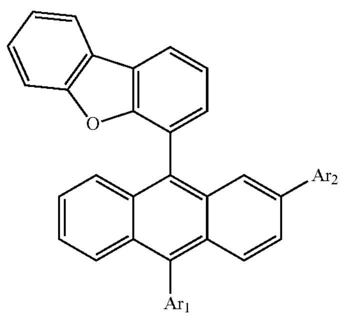 | 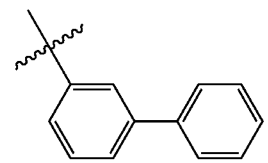 [SMILES: *c1cccc(-c2ccccc2)c1] | 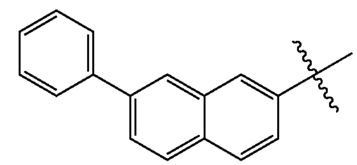 [SMILES: *c1ccc2ccc(-c3ccccc3)cc2c1] |

-continued
| No. | | Ar1 | Ar2 |
|---|---|---|---|
| 35-23 | 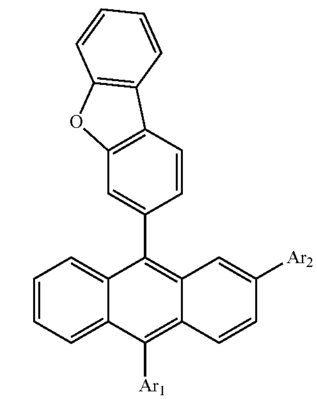 | 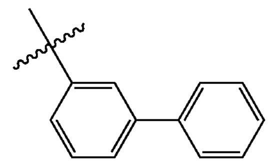 [SMILES: *c1cccc(-c2ccccc2)c1] | 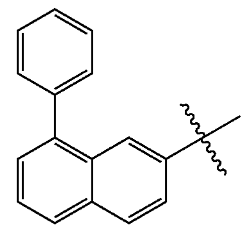 [SMILES: *c1ccc2cccc(-c3ccccc3)c2c1] |
| 35-24 | 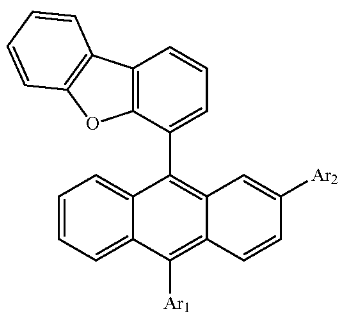 | 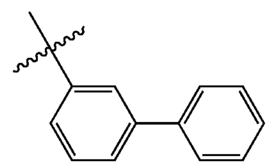 [SMILES: *c1cccc(-c2ccccc2)c1] | 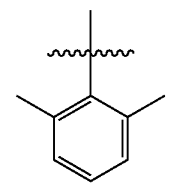 |

-continued
| No. | | Ar1 | Ar2 |
|---|---|---|---|
| 35-25 | 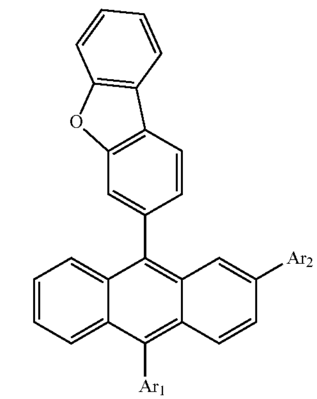 | 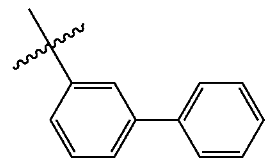 [SMILES: *c1cccc(-c2ccccc2)c1] | 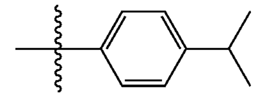 |
| 35-26 | 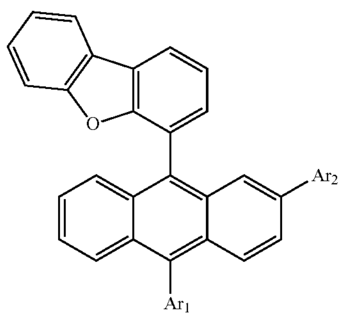 | 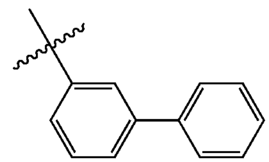 [SMILES: *c1cccc(-c2ccccc2)c1] | 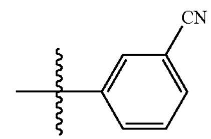 [SMILES: *c1cccc(C#N)c1] |

-continued
| No. | | Ar1 | Ar2 |
|---|---|---|---|
| 35-27 | 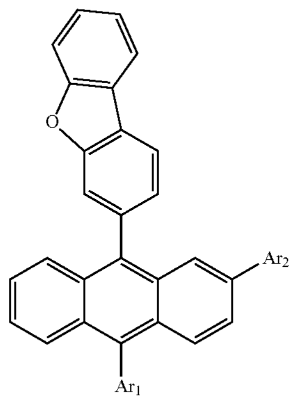 | 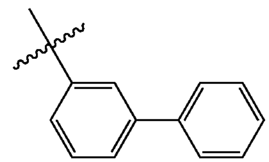 [SMILES: *c1cccc(-c2ccccc2)c1] | 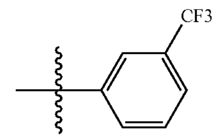 [SMILES: *c1cccc(C(F)(F)F)c1] |
| 35-28 | 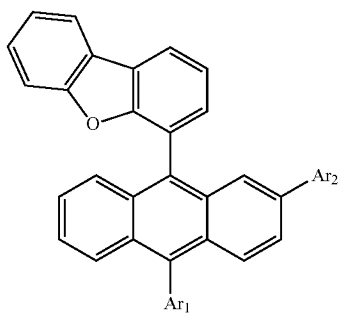 | 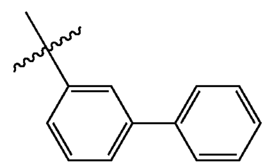 [SMILES: *c1cccc(-c2ccccc2)c1] | 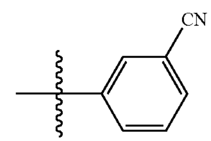 [SMILES: *c1cccc(C#N)c1] |

-continued
| No. | | Ar1 | Ar2 |
|---|---|---|---|
| 35-29 | 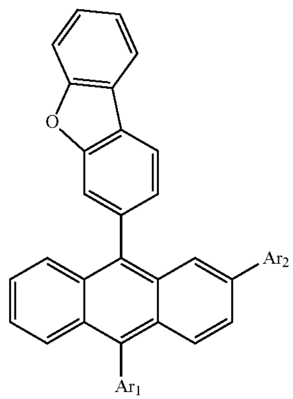 | 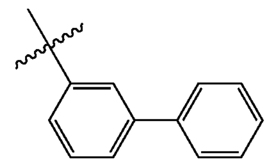 [SMILES: *c1cccc(-c2ccccc2)c1] | 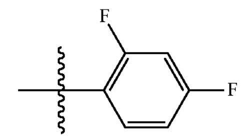 [SMILES: *c1ccc(F)cc1F] |
| 36-1 | 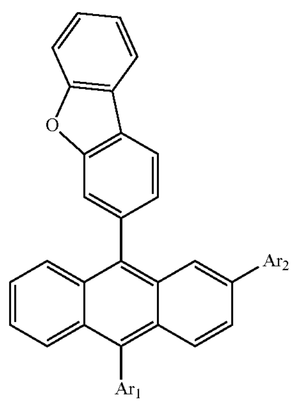 | 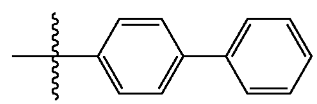 | 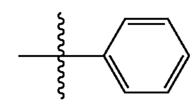 |

-continued
| No. | | Ar1 | Ar2 |
| --- | --- | --- | --- |
| 36-2 | 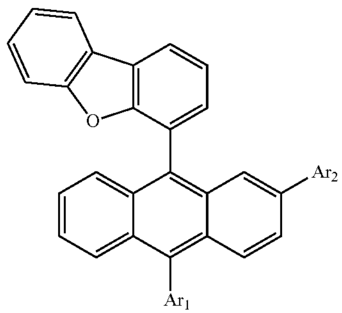 | 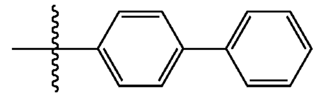 | 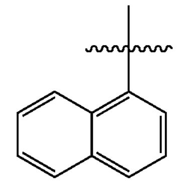 [SMILES: *c1cccc2ccccc12] |
| 36-3 | 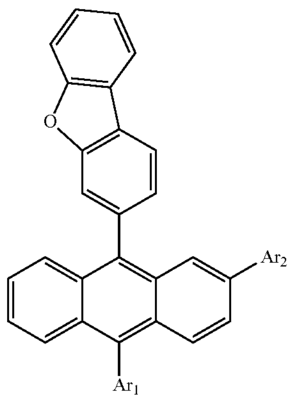 | 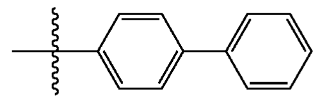 | 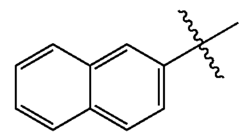 [SMILES: *c1ccc2ccccc2c1] |
| 36-4 | 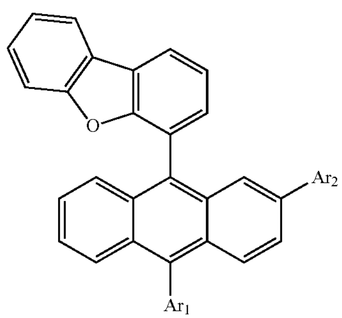 | 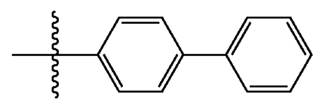 | 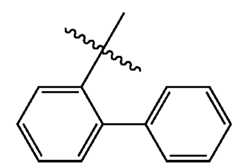 [SMILES: *c1ccccc1-c1ccccc1] |

-continued
| No. | | Ar1 | Ar2 |
|---|---|---|---|
| 36-5 | 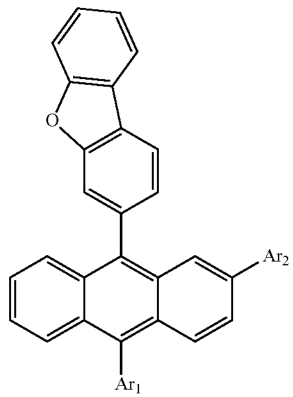 | 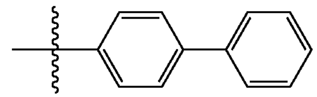 [SMILES: *c1ccc(-c2ccccc2)cc1] | 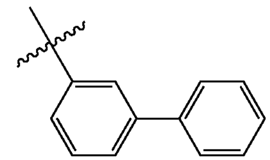 [SMILES: *c1cccc(-c2ccccc2)c1] |
| 36-6 | 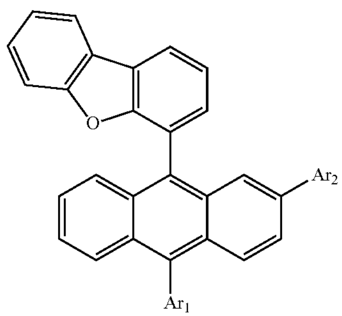 | 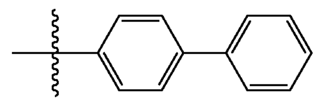 [SMILES: *c1ccc(-c2ccccc2)cc1] | 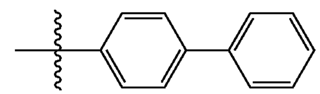 [SMILES: *c1ccc(-c2ccccc2)cc1] |

-continued
| No. | | Ar1 | Ar2 |
|---|---|---|---|
| 36-7 | 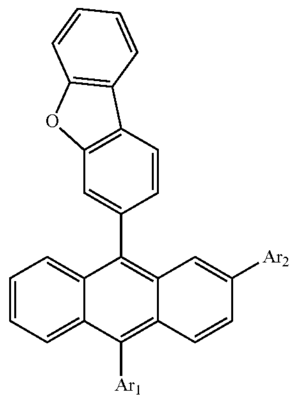 | 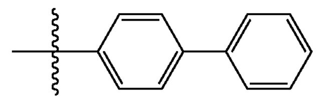 [SMILES: *c1ccc(-c2ccccc2)cc1] | 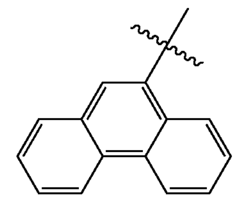 [SMILES: *c1cc2ccccc2c2ccccc12] |
| 36-8 | 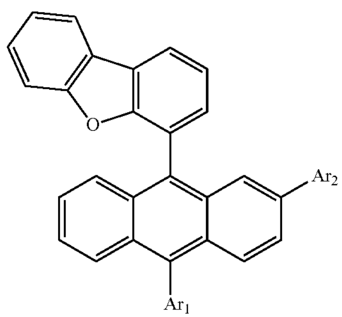 | 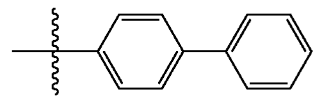 | 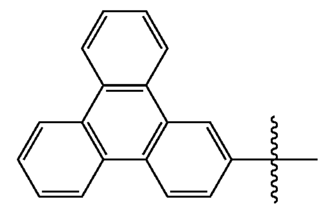 [SMILES: *c1ccc2c3ccccc3c3ccccc3c2c1] |

-continued
| No. | | Ar1 | Ar2 |
|---|---|---|---|
| 36-9 | 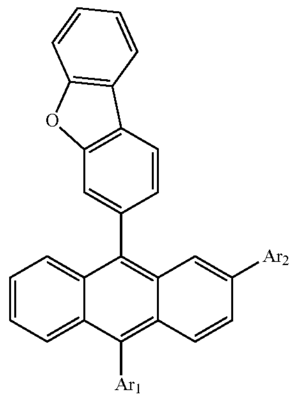 | 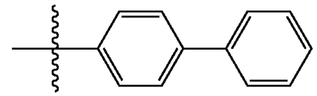 [SMILES: *c1ccc(-c2ccccc2)cc1] | 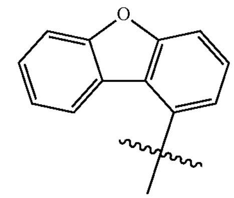 [SMILES: *c1cccc2oc3ccccc3c12] |
| 36-10 | 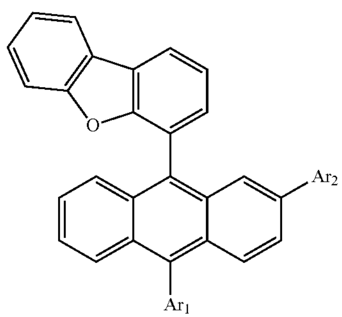 | 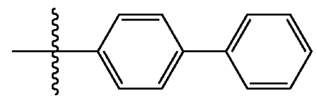 | 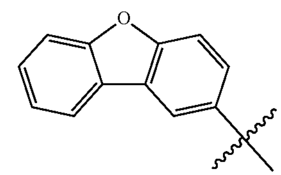 [SMILES: *c1ccc2oc3ccccc3c2c1] |

-continued
| No. | | Ar1 | Ar2 |
|---|---|---|---|
| 36-11 | 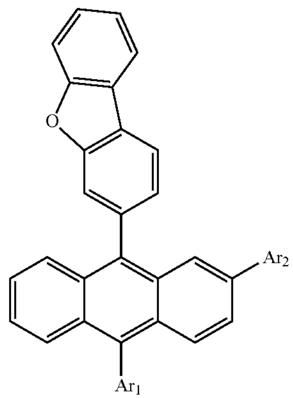 | 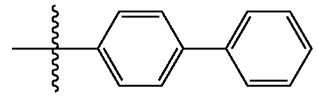 [SMILES: *c1ccc(-c2ccccc2)cc1] | 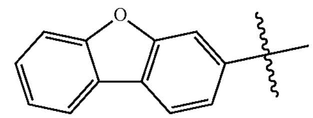 [SMILES: *c1ccc2c(c1)oc1ccccc12] |
| 36-12 | 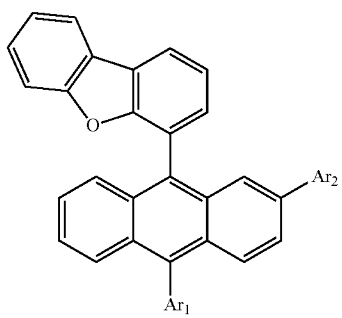 | 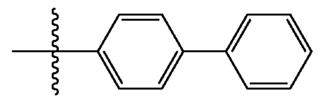 | 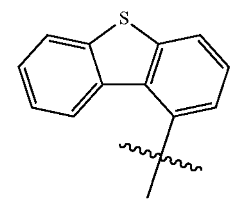 [SMILES: *c1cccc2sc3ccccc3c12] |

-continued
| No. | | Ar1 | Ar2 |
| --- | --- | --- | --- |
| 36-13 | 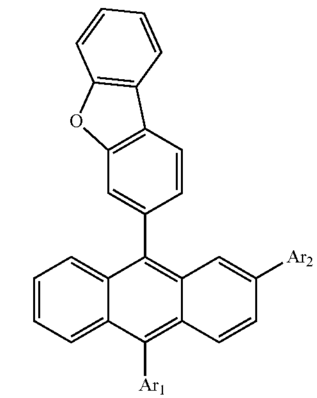 | 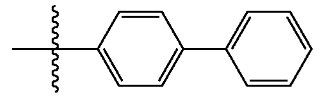 [SMILES: *c1ccc(-c2ccccc2)cc1] | 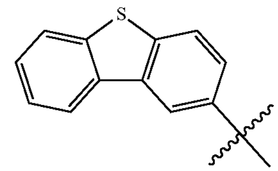 [SMILES: *c1ccc2sc3ccccc3c2c1] |
| 36-14 | 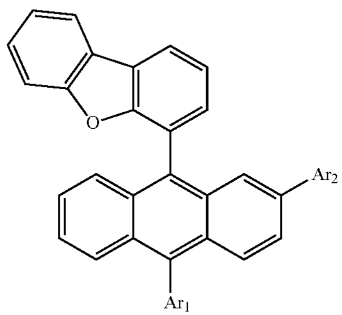 | 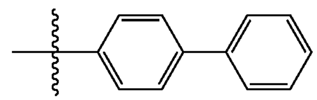 [SMILES: *c1ccc(-c2ccccc2)cc1] | 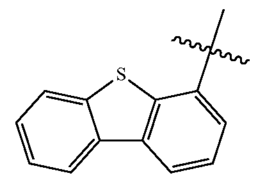 [SMILES: *c1cccc2c1sc1ccccc12] |

-continued
| No. | | Ar1 | Ar2 |
|---|---|---|---|
| 36-15 | 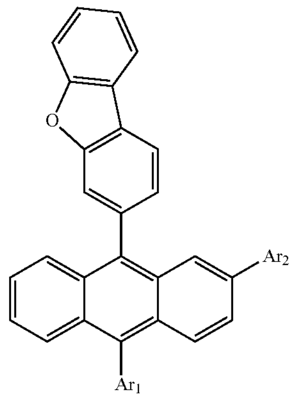 | 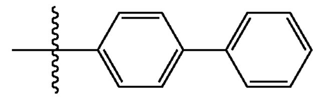 [SMILES: *c1ccc(-c2ccccc2)cc1] | 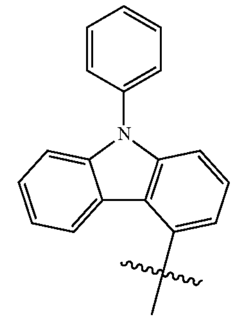 [SMILES: *c1cccc2c1c1ccccc1n2-c1ccccc1] |
| 36-16 | 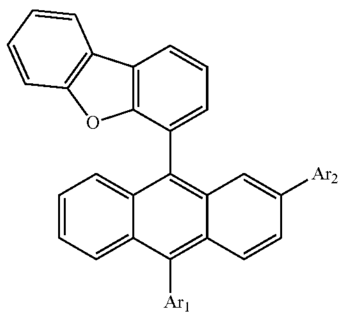 | 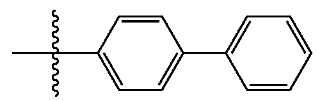 [SMILES: *c1ccc(-c2ccccc2)cc1] | 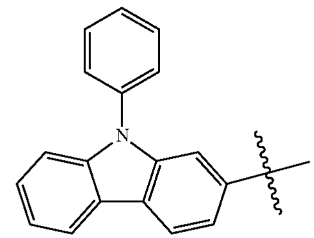 [SMILES: *c1ccc2c3ccccc3n(-c3ccccc3)c2c1] |

-continued
| No. | | Ar1 | Ar2 |
|---|---|---|---|
| 36-17 | 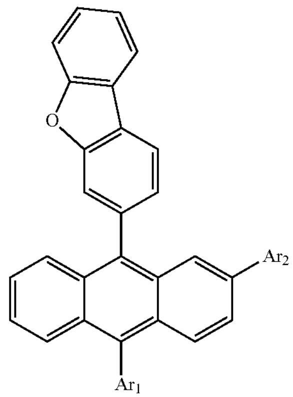  | 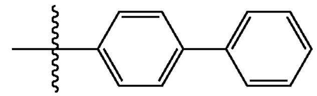 [SMILES: *c1ccc(-c2ccccc2)cc1] | 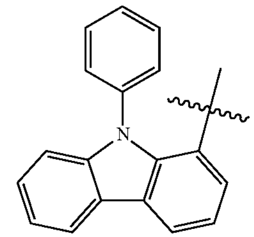 [SMILES: *c1cccc2c3ccccc3n(-c3ccccc3)c12]  |
| 36-18 | 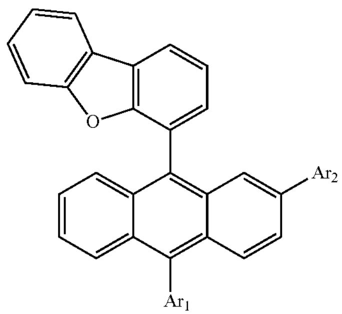  | 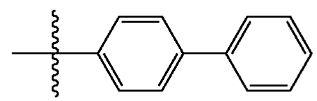 [SMILES: *c1ccc(-c2ccccc2)cc1] | 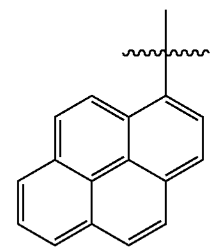 [SMILES: *c1ccc2ccc3cccc4ccc1c2c34] |

-continued
| No. | | Ar1 | Ar2 |
|---|---|---|---|
| 36-19 | 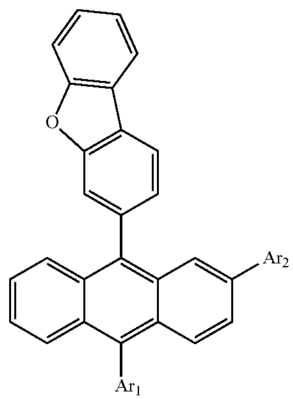 | 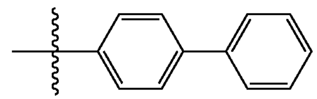 [SMILES: *c1ccc(-c2ccccc2)cc1] | 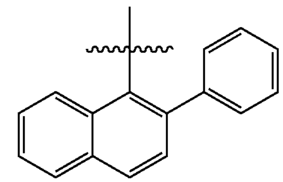 [SMILES: *c1c(-c2ccccc2)ccc2ccccc12] |
| 36-20 | 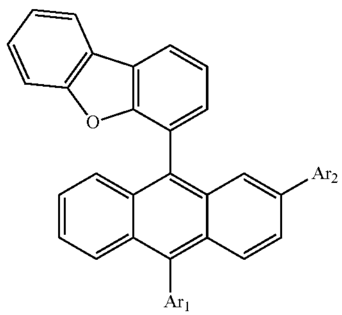 | 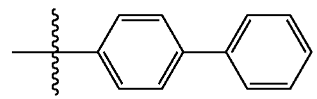 [SMILES: *c1ccc(-c2ccccc2)cc1] | 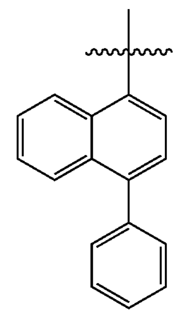 [SMILES: *c1ccc(-c2ccccc2)c2ccccc12] |

-continued
| No. | | Ar1 | Ar2 |
|---|---|---|---|
| 36-21 | 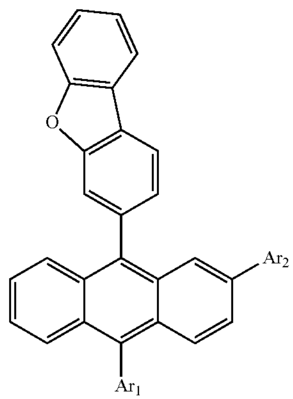 | 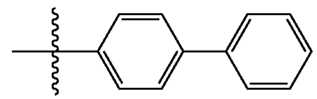 [SMILES: *c1ccc(-c2ccccc2)cc1] | 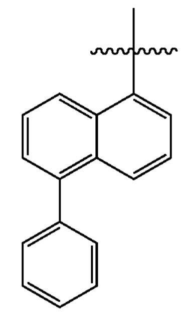 [SMILES: *c1cccc2c(-c3ccccc3)cccc12] |
| 36-22 | 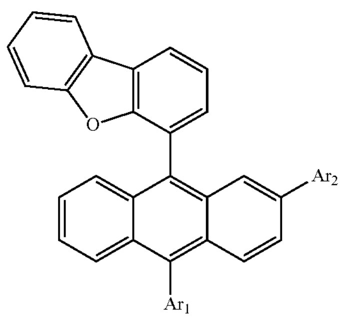 | 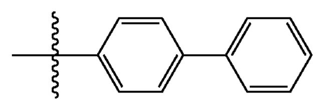 [SMILES: *c1ccc(-c2ccccc2)cc1] | 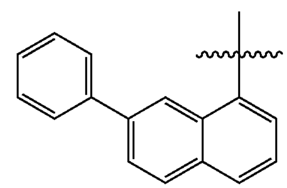 [SMILES: *c1cccc2ccc(-c3ccccc3)cc12] |

-continued
| No. | | Ar1 | Ar2 |
|---|---|---|---|
| 36-23 | 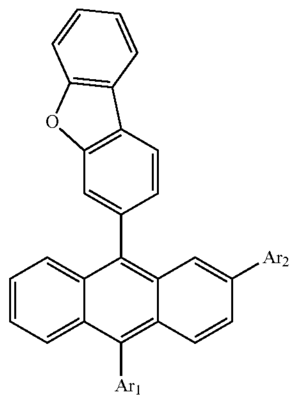 | 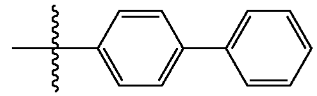 [SMILES: *c1ccc(-c2ccccc2)cc1] | 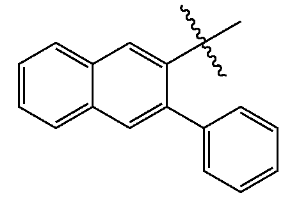 [SMILES: *c1cc2ccccc2cc1-c1ccccc1] |
| 36-24 | 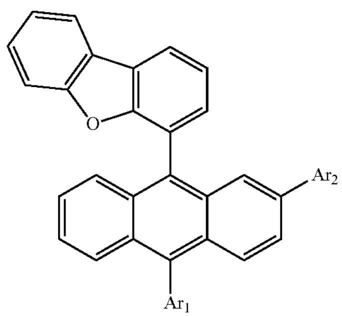 | 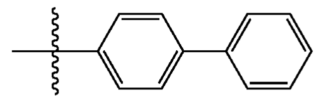 | 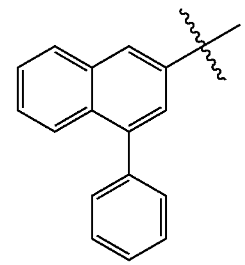 [SMILES: *c1cc(-c2ccccc2)c2ccccc2c1] |

-continued
| No. | | Ar1 | Ar2 |
|---|---|---|---|
| 36-25 | 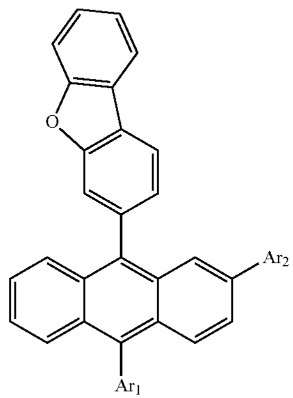 | 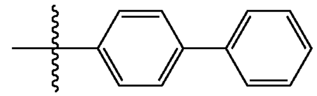 [SMILES: *c1ccc(-c2ccccc2)cc1] | 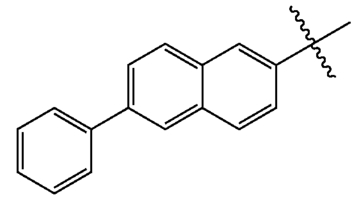 [SMILES: *c1ccc2cc(-c3ccccc3)ccc2c1] |
| 36-26 | 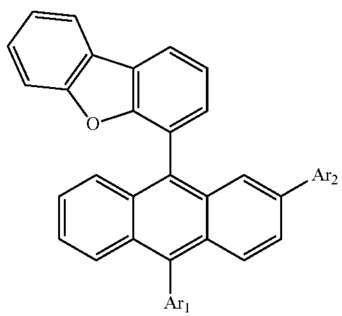 | 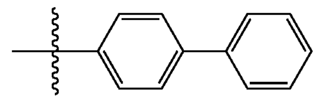 | 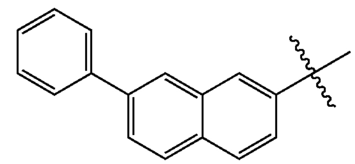 [SMILES: *c1ccc2ccc(-c3ccccc3)cc2c1] |

-continued
| No. | | Ar1 | Ar2 |
|---|---|---|---|
| 36-27 | 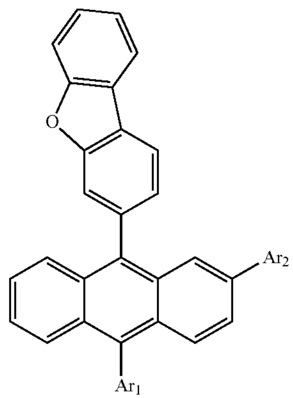 | 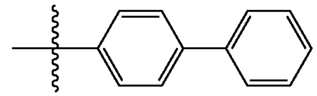 [SMILES: *c1ccc(-c2ccccc2)cc1] | 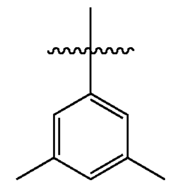 |
| 36-28 | 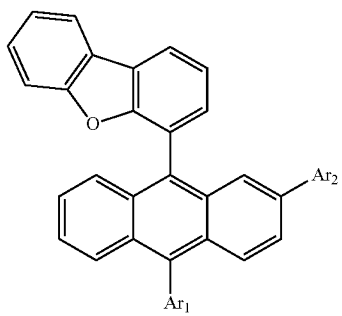 | 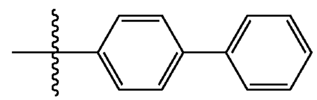 [SMILES: *c1ccc(-c2ccccc2)cc1] | 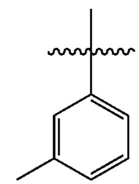 [SMILES: *c1cccc(C)c1] |

-continued
| No. | | Ar1 | Ar2 |
| --- | --- | --- | --- |
| 36-29 | 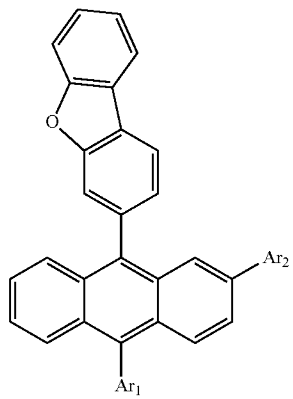 | 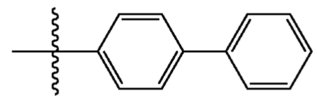 [SMILES: *c1ccc(-c2ccccc2)cc1] | 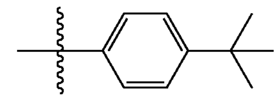 |
| 36-30 | 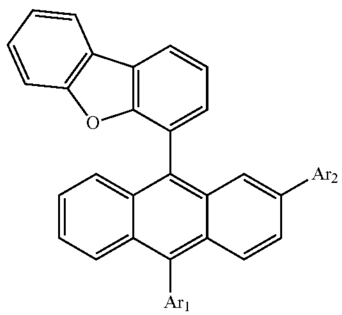 | 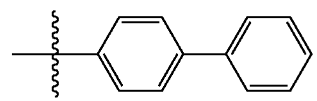 [SMILES: *c1ccc(-c2ccccc2)cc1] | 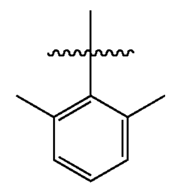 |

-continued
| No. | | Ar1 | Ar2 |
|---|---|---|---|
| 36-31 | 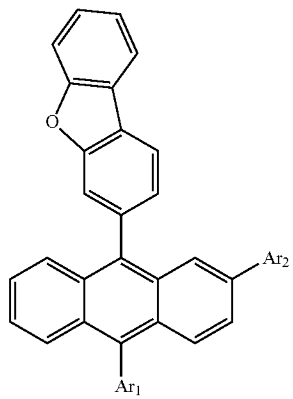 | 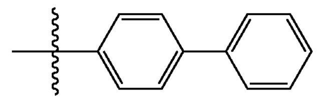 [SMILES: *c1ccc(-c2ccccc2)cc1] | 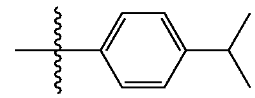 [SMILES: *c1ccc(C(C)C)cc1] |
| 37-1 | 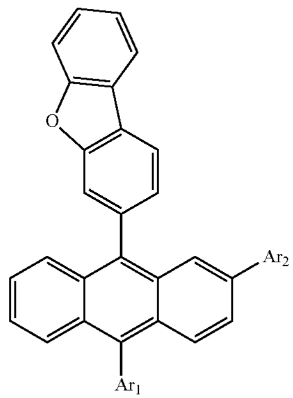 | 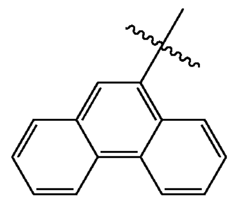 [SMILES: *c1cc2ccccc2c2ccccc12] | 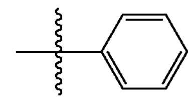 [SMILES: *c1ccccc1] |

-continued
| No. | | Ar1 | Ar2 |
|---|---|---|---|
| 37-2 | 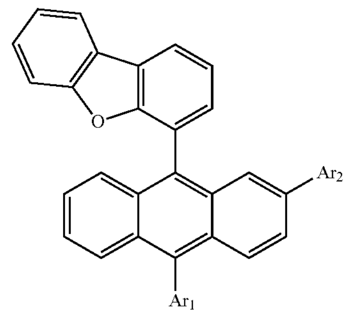 | 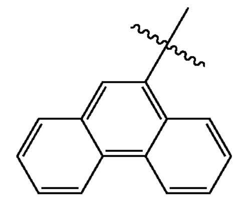 [SMILES: *c1cc2ccccc2c2ccccc12] | 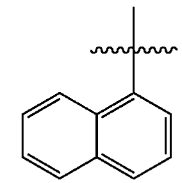 [SMILES: *c1cccc2ccccc12] |
| 37-3 | 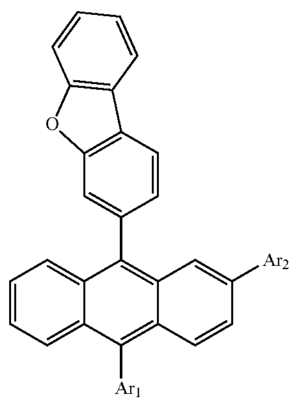 | 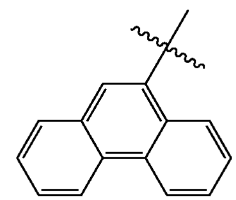 [SMILES: *c1cc2ccccc2c2ccccc12] | 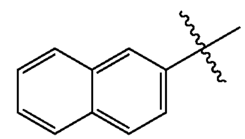 [SMILES: *c1ccc2ccccc2c1] |
| 37-4 | 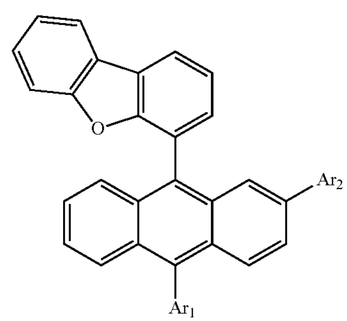 | 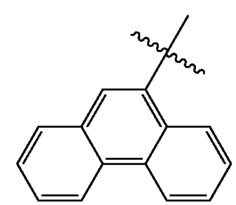 [SMILES: *c1cc2ccccc2c2ccccc12] | 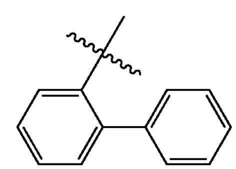 [SMILES: *c1ccccc1-c1ccccc1] |

-continued
| No. | | Ar1 | Ar2 |
|---|---|---|---|
| 37-5 | 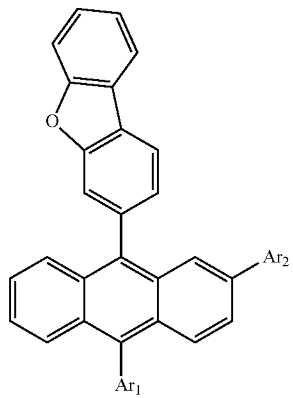 | 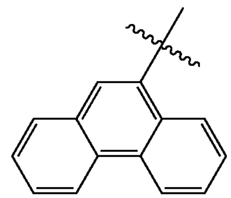 [SMILES: *c1cc2ccccc2c2ccccc12] | 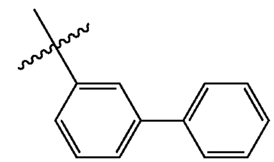 [SMILES: *c1cccc(-c2ccccc2)c1] |
| 37-6 | 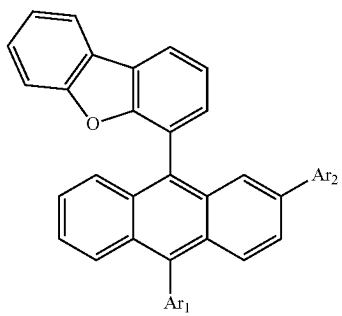 | 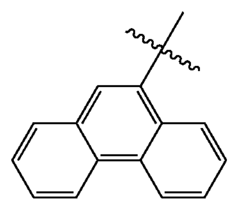 [SMILES: *c1cc2ccccc2c2ccccc12] | 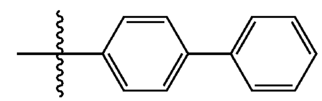 |

-continued
| No. | | Ar1 | Ar2 |
|---|---|---|---|
| 37-7 | 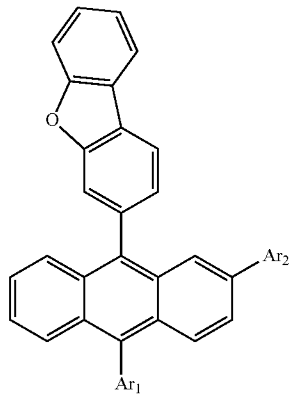 | 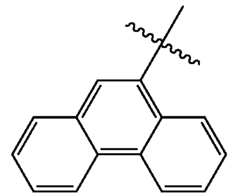 [SMILES: *c1cc2ccccc2c2ccccc12] | 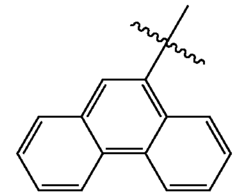 [SMILES: *c1cc2ccccc2c2ccccc12] |
| 37-8 | 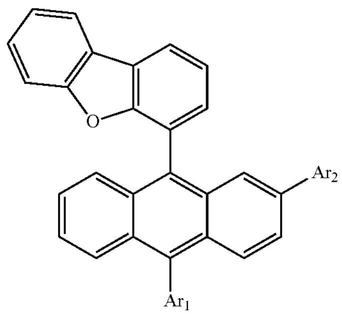 | 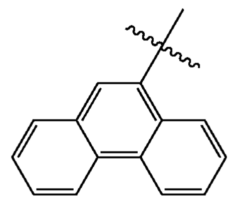 [SMILES: *c1cc2ccccc2c2ccccc12] | 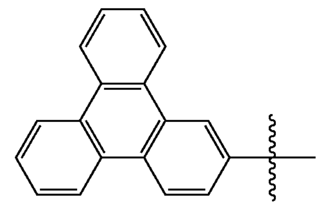 [SMILES: *c1ccc2c3ccccc3c3ccccc3c2c1] |

-continued
| No. | | Ar1 | Ar2 |
|---|---|---|---|
| 37-9 | 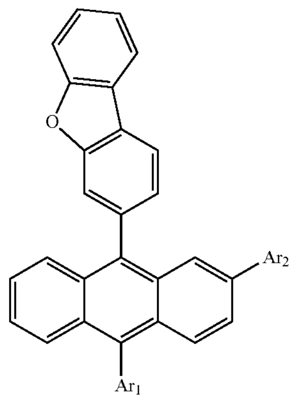 | 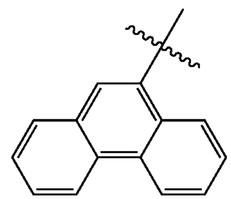 [SMILES: *c1cc2ccccc2c2ccccc12] | 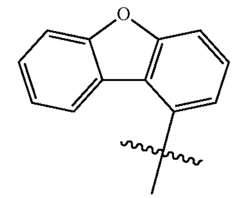 [SMILES: *c1cccc2oc3ccccc3c12] |
| 37-10 | 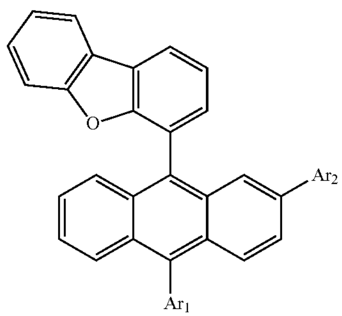 | 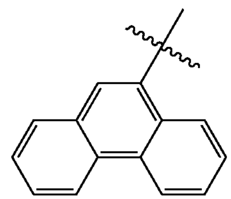 [SMILES: *c1cc2ccccc2c2ccccc12] | 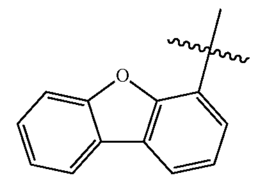 [SMILES: *c1cccc2c1oc1ccccc12] |

-continued
| No. | | Ar1 | Ar2 |
| --- | --- | --- | --- |
| 37-11 | 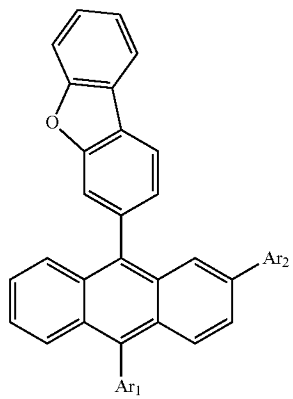 | 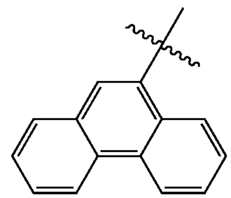 [SMILES: *c1cc2ccccc2c2ccccc12] | 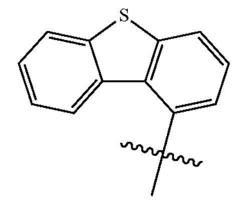 [SMILES: *c1cccc2sc3ccccc3c12] |
| 37-12 | 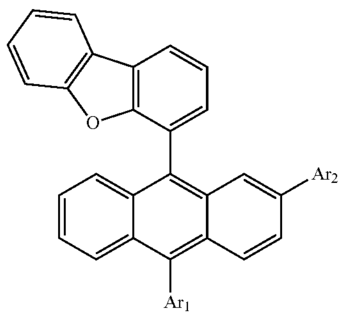 | 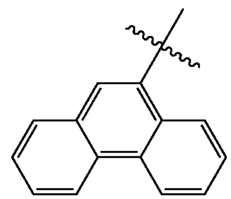 [SMILES: *c1cc2ccccc2c2ccccc12] | 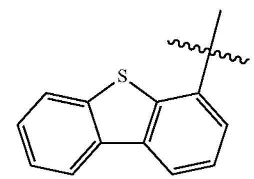 [SMILES: *c1cccc2c1sc1ccccc12] |

-continued
| No. | | Ar1 | Ar2 |
|---|---|---|---|
| 37-13 | 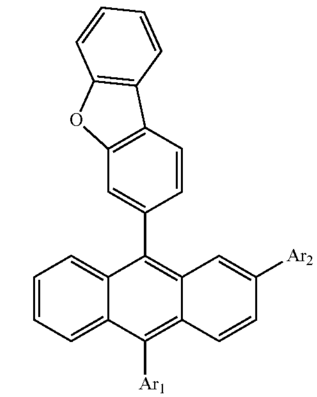 | 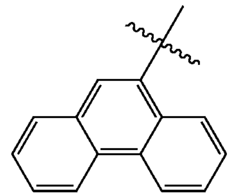 [SMILES: *c1cc2ccccc2c2ccccc12] | 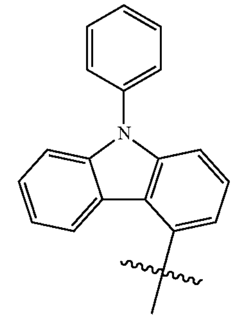 [SMILES: *c1cccc2c1c1ccccc1n2-c1ccccc1] |
| 37-14 | 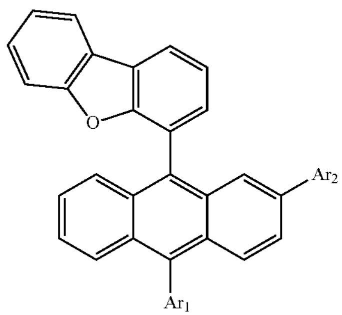 | 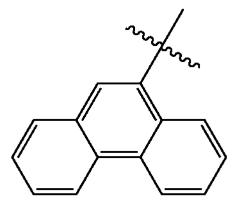 [SMILES: *c1cc2ccccc2c2ccccc12] | 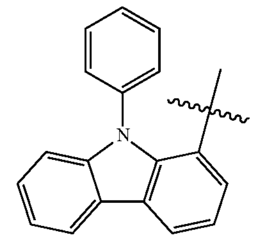 [SMILES: *c1cccc2c3ccccc3n(-c3ccccc3)c12] |

-continued
| No. | | Ar1 | Ar2 |
|---|---|---|---|
| 37-15 | 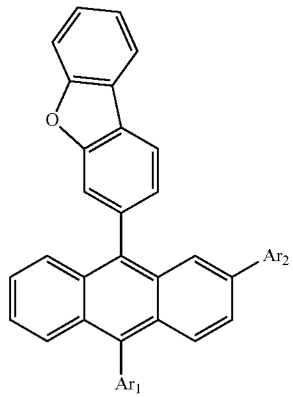 | 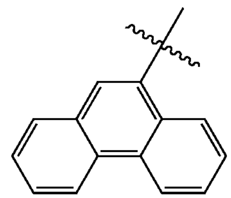 [SMILES: *c1cc2ccccc2c2ccccc12] | 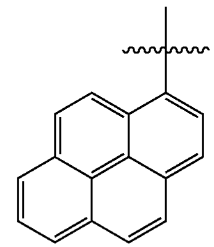 [SMILES: *c1ccc2ccc3cccc4ccc1c2c34] |
| 37-16 | 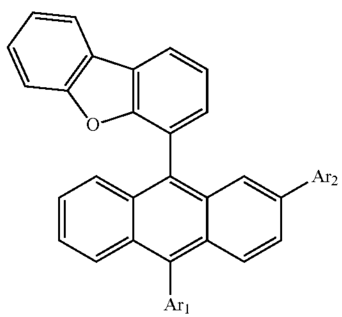 | 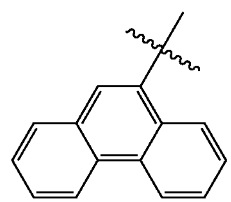 [SMILES: *c1cc2ccccc2c2ccccc12] | 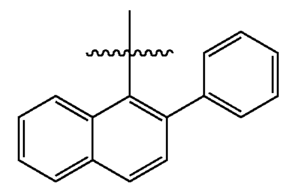 [SMILES: *c1c(-c2ccccc2)ccc2ccccc12] |

-continued
| No. | | Ar1 | Ar2 |
|---|---|---|---|
| 37-17 | 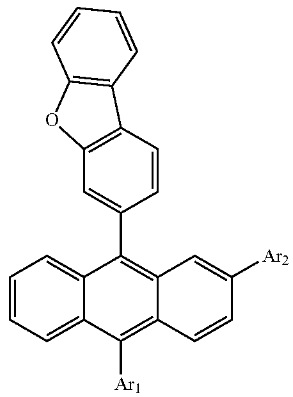 | 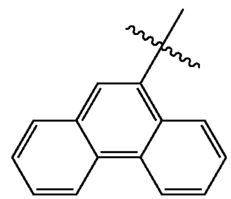 [SMILES: *c1cc2ccccc2c2ccccc12] | 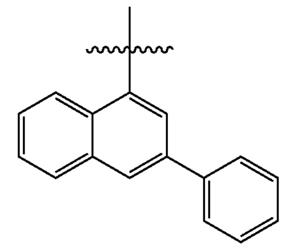 [SMILES: *c1cc(-c2ccccc2)cc2ccccc12] |
| 37-18 | 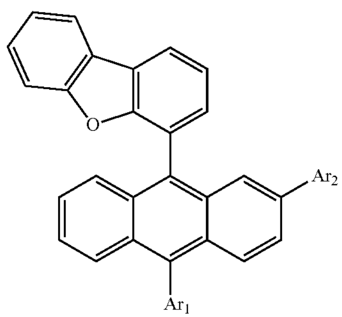 | 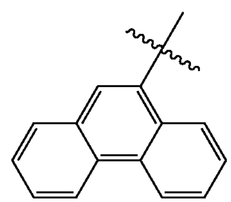 [SMILES: *c1cc2ccccc2c2ccccc12] | 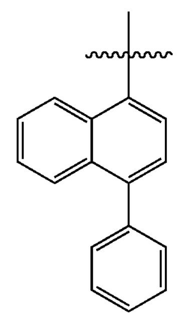 [SMILES: *c1ccc(-c2ccccc2)c2ccccc12] |

-continued
| No. | | Ar1 | Ar2 |
| --- | --- | --- | --- |
| 37-19 | 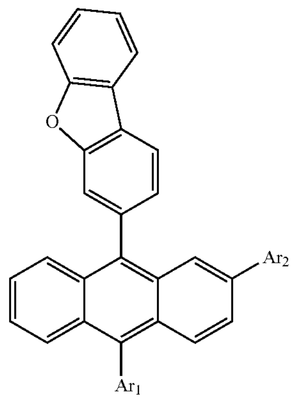 | 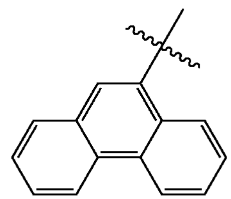 [SMILES: *c1cc2ccccc2c2ccccc12] | 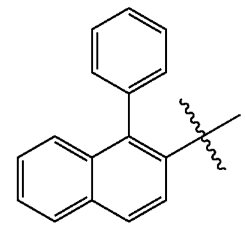 [SMILES: *c1ccc2ccccc2c1-c1ccccc1] |
| 37-20 | 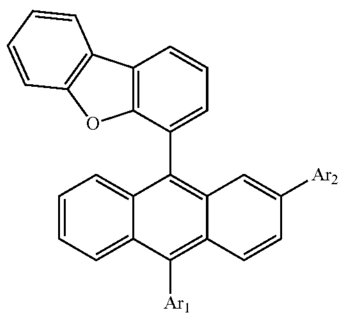 | 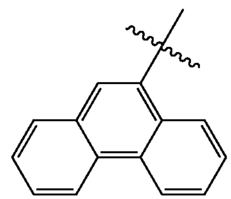 [SMILES: *c1cc2ccccc2c2ccccc12] | 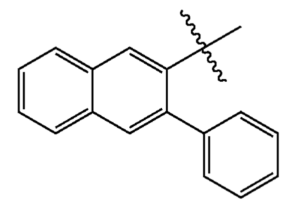 [SMILES: *c1cc2ccccc2cc1-c1ccccc1] |

-continued
| No. | | Ar1 | Ar2 |
|---|---|---|---|
| 37-21 | 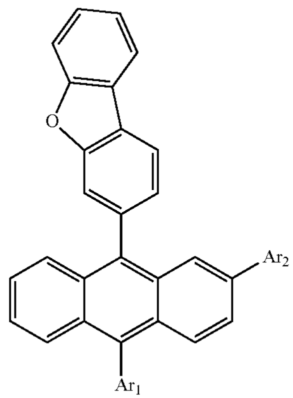 | 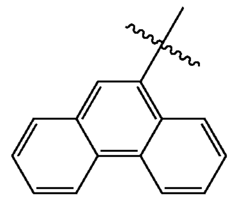 [SMILES: *c1cc2ccccc2c2ccccc12] | 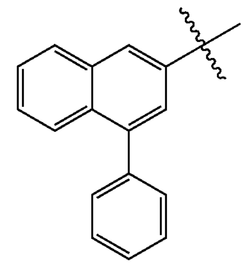 [SMILES: *c1cc(-c2ccccc2)c2ccccc2c1] |
| 37-22 | 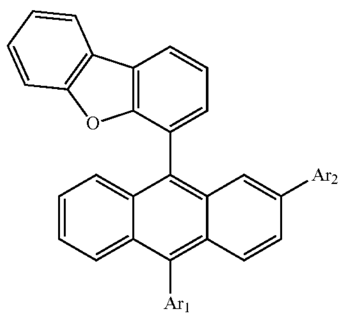 | 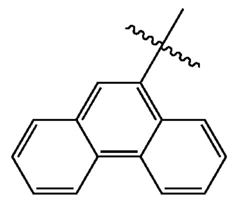 [SMILES: *c1cc2ccccc2c2ccccc12] | 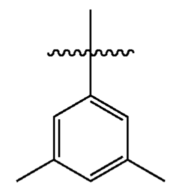 |

-continued
| No. | | Ar1 | Ar2 |
|---|---|---|---|
| 37-23 | 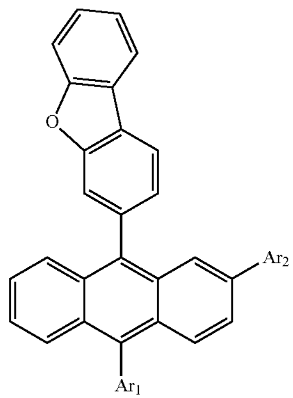 | 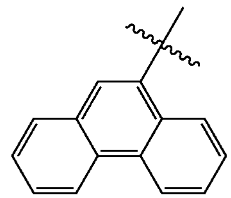 [SMILES: *c1cc2ccccc2c2ccccc12] | 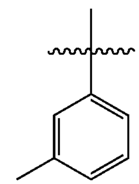 [SMILES: *c1cccc(C)c1] |
| 37-24 | 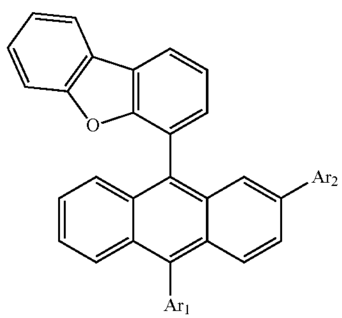 | 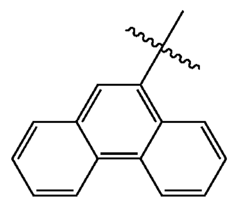 [SMILES: *c1cc2ccccc2c2ccccc12] | 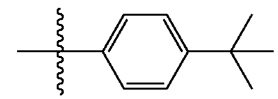 |

-continued
| No. | | Ar1 | Ar2 |
|---|---|---|---|
| 37-25 | 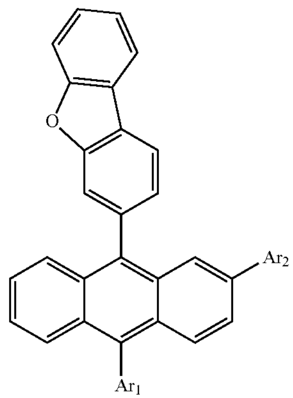 | 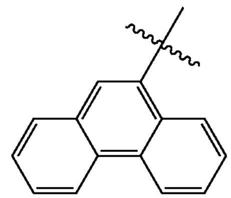 [SMILES: *c1cc2ccccc2c2ccccc12] | 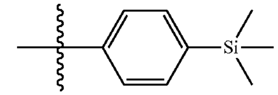 |
| 37-26 | 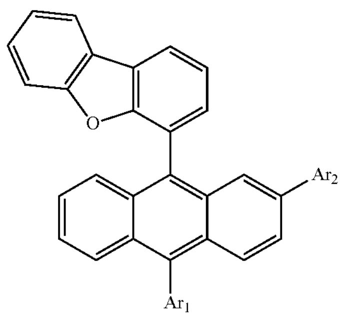 | 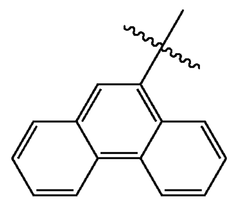 [SMILES: *c1cc2ccccc2c2ccccc12] | 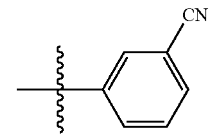 [SMILES: *c1cccc(C#N)c1] |

-continued
| No. | | Ar1 | Ar2 |
|---|---|---|---|
| 37-27 | 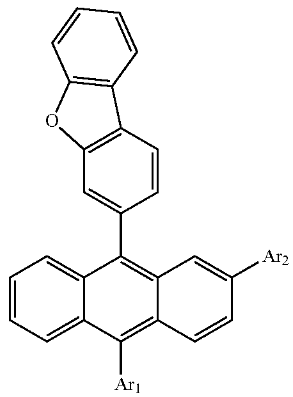 | 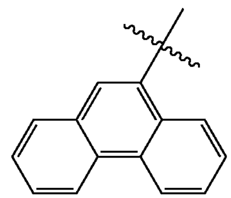 [SMILES: *c1cc2ccccc2c2ccccc12] | 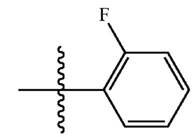 [SMILES: *c1ccccc1F] |
| 37-28 | 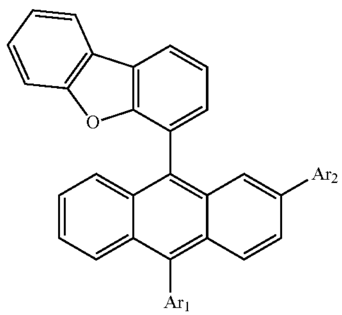 | 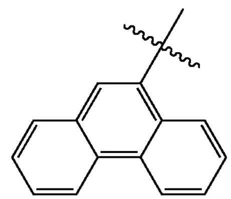 [SMILES: *c1cc2ccccc2c2ccccc12] | 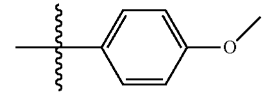 [SMILES: *c1ccc(OC)cc1] |

-continued
| No. | | Ar1 | Ar2 |
|---|---|---|---|
| 38-1 | 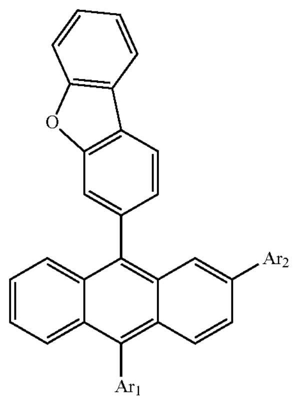 | 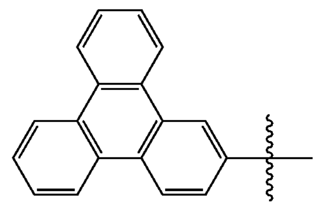 [SMILES: *c1ccc2c3ccccc3c3ccccc3c2c1] | 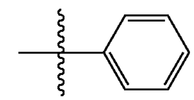 [SMILES: *c1ccccc1] |
| 38-2 | 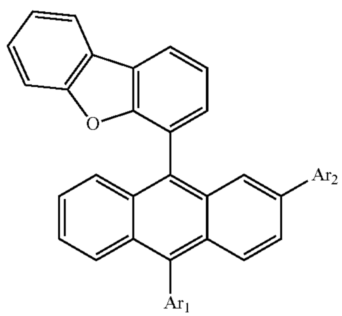 | 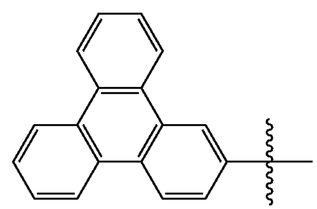 [SMILES: *c1ccc2c3ccccc3c3ccccc3c2c1] | 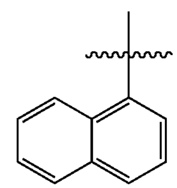 [SMILES: *c1cccc2ccccc12] |

-continued
| No. | | Ar1 | Ar2 |
|---|---|---|---|
| 38-3 | 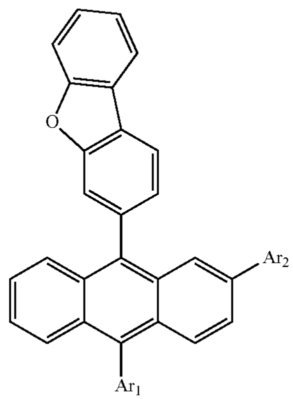 | 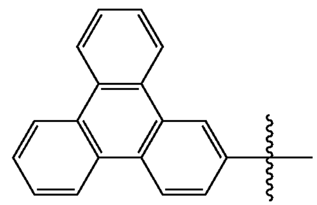 [SMILES: *c1ccc2c3ccccc3c3ccccc3c2c1] | 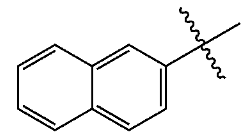 [SMILES: *c1ccc2ccccc2c1] |
| 38-4 | 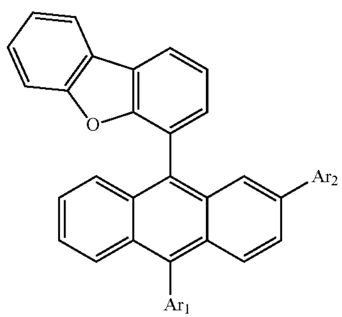 | 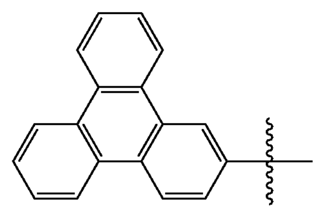 [SMILES: *c1ccc2c3ccccc3c3ccccc3c2c1] | 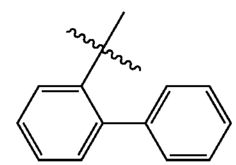 [SMILES: *c1ccccc1-c1ccccc1] |

-continued
| No. | | Ar1 | Ar2 |
|---|---|---|---|
| 38-5 | 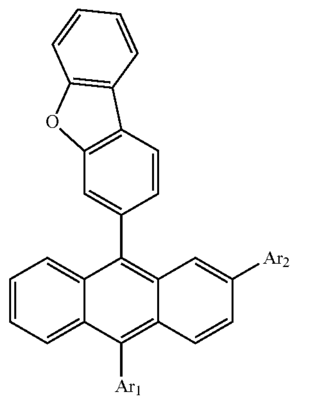 | 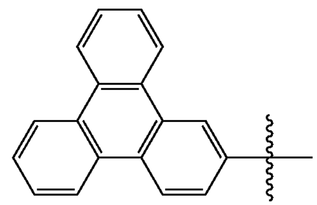 [SMILES: *c1ccc2c3ccccc3c3ccccc3c2c1] | 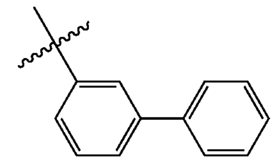 [SMILES: *c1cccc(-c2ccccc2)c1] |
| 38-6 | 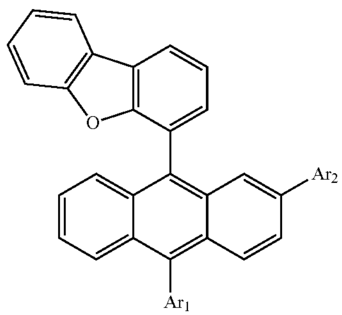 | 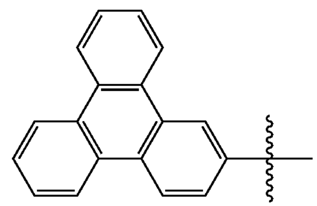 [SMILES: *c1ccc2c3ccccc3c3ccccc3c2c1] | 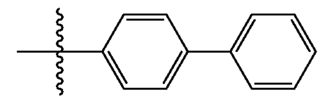 [SMILES: *c1ccc(-c2ccccc2)cc1] |

-continued
| No. | | Ar1 | Ar2 |
|---|---|---|---|
| 38-7 | 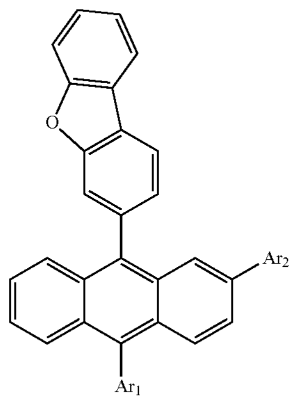 | 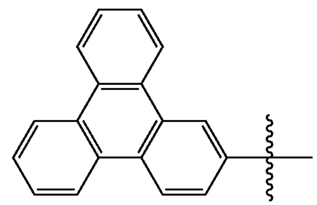 [SMILES: *c1ccc2c3ccccc3c3ccccc3c2c1] | 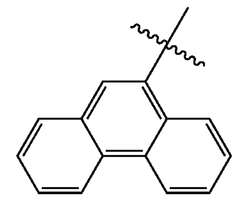 [SMILES: *c1cc2ccccc2c2ccccc12] |
| 38-8 | 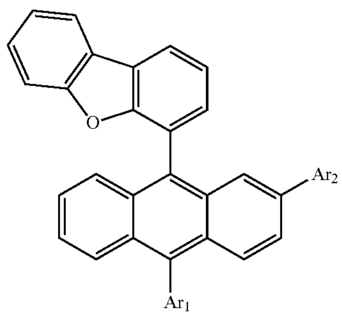 | 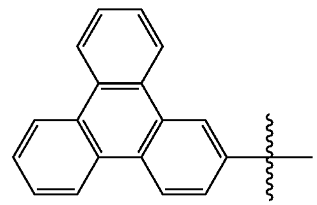 [SMILES: *c1ccc2c3ccccc3c3ccccc3c2c1] | 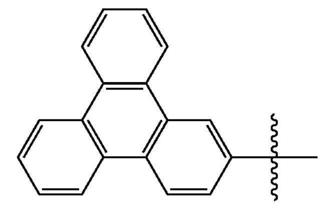 [SMILES: *c1ccc2c3ccccc3c3ccccc3c2c1] |

-continued
| No. | | Ar1 | Ar2 |
|---|---|---|---|
| 38-9 | 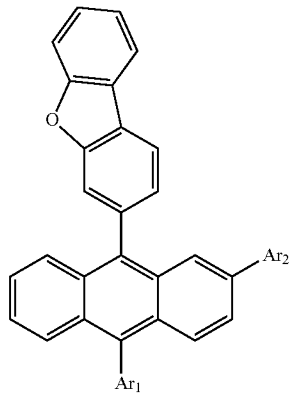 | 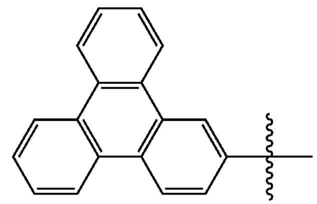 [SMILES: *c1ccc2c3ccccc3c3ccccc3c2c1] | 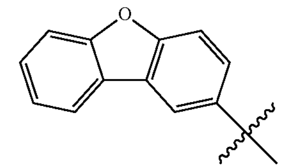 |
| 38-10 | 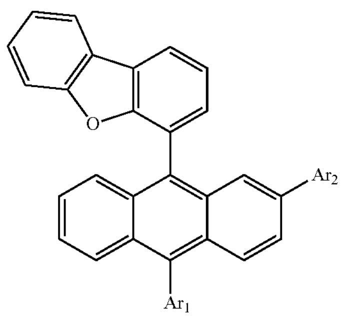 | 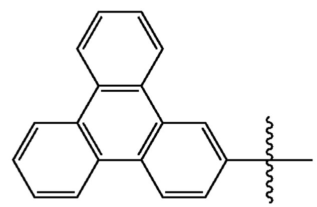 [SMILES: *c1ccc2c3ccccc3c3ccccc3c2c1] | 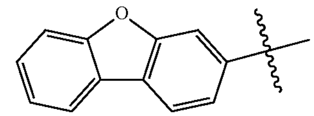 |

-continued
| No. | | Ar1 | Ar2 |
|---|---|---|---|
| 38-11 | 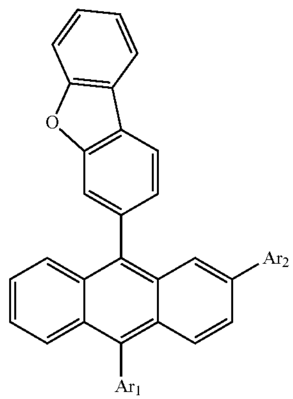 | 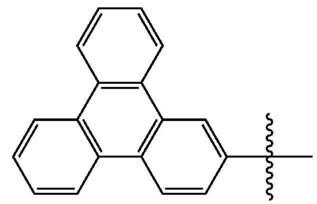 [SMILES: *c1ccc2c3ccccc3c3ccccc3c2c1] | 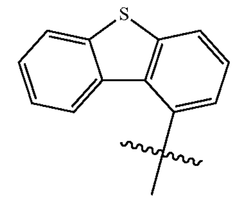 [SMILES: *c1cccc2sc3ccccc3c12] |
| 38-12 | 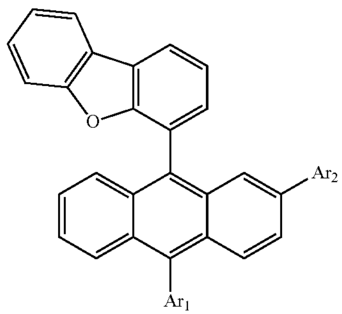 | 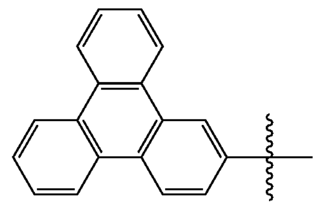 [SMILES: *c1ccc2c3ccccc3c3ccccc3c2c1] | 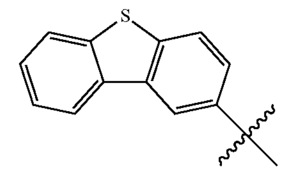 [SMILES: *c1ccc2sc3ccccc3c2c1] |

-continued
| No. | | Ar1 | Ar2 |
|---|---|---|---|
| 38-13 | 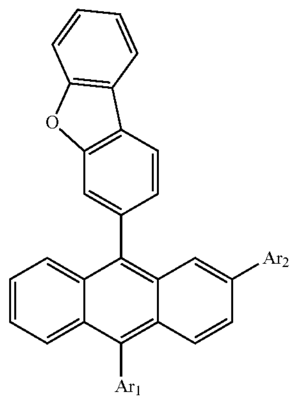 | 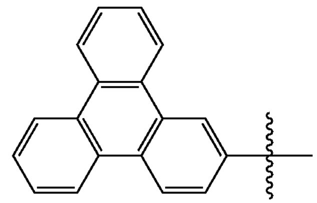 [SMILES: *c1ccc2c3ccccc3c3ccccc3c2c1] | 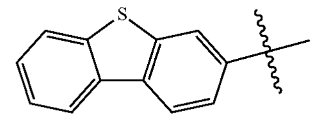 [SMILES: *c1ccc2c(c1)sc1ccccc12] |
| 38-14 | 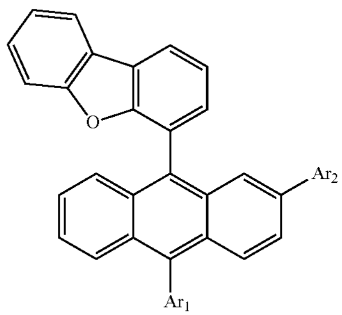 | 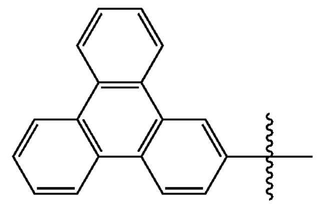 | 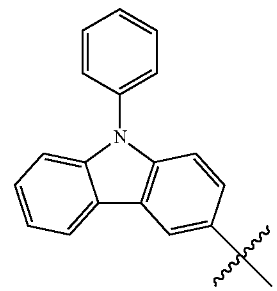 [SMILES: *c1ccc2c(c1)c1ccccc1n2-c1ccccc1] |

-continued
| No. | | Ar1 | Ar2 |
| --- | --- | --- | --- |
| 38-15 | 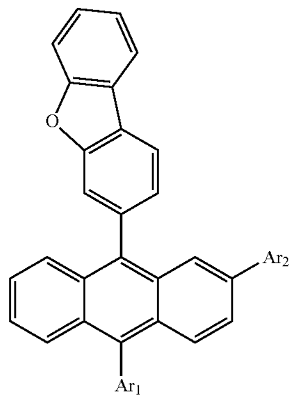 | 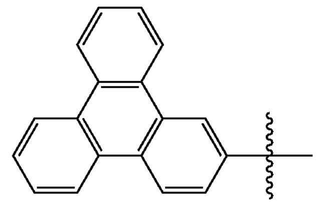 [SMILES: *c1ccc2c3ccccc3c3ccccc3c2c1] | 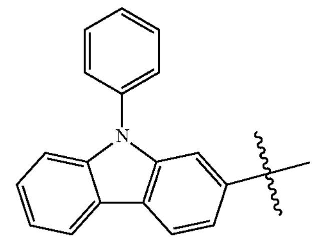 [SMILES: *c1ccc2c3ccccc3n(-c3ccccc3)c2c1] |
| 38-16 | 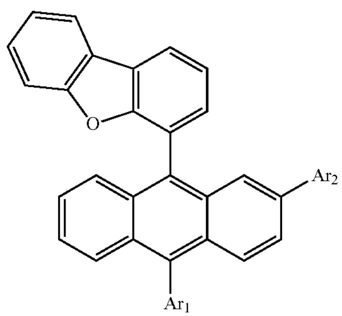 | 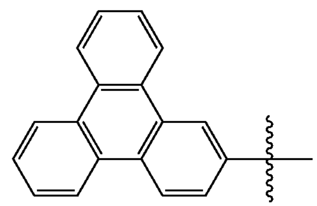 [SMILES: *c1ccc2c3ccccc3c3ccccc3c2c1] | 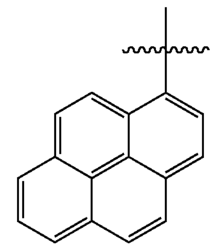 [SMILES: *c1ccc2ccc3cccc4ccc1c2c34] |

-continued
| No. | | Ar1 | Ar2 |
|---|---|---|---|
| 38-17 | 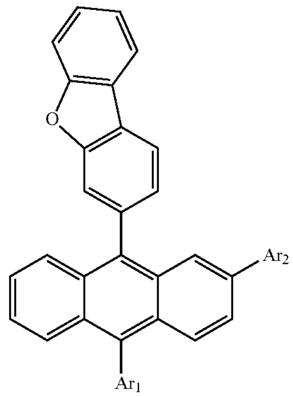 | 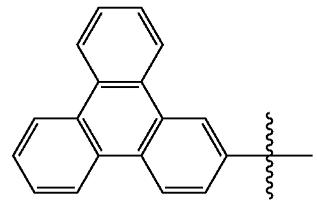 [SMILES: *c1ccc2c3ccccc3c3ccccc3c2c1] | 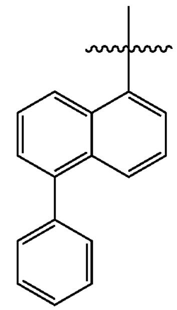 [SMILES: *c1cccc2c(-c3ccccc3)cccc12] |
| 38-18 | 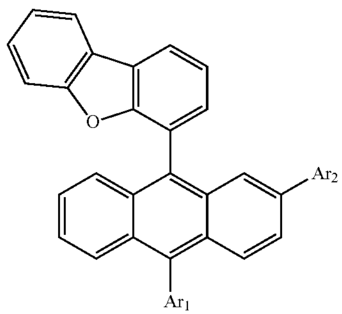 | 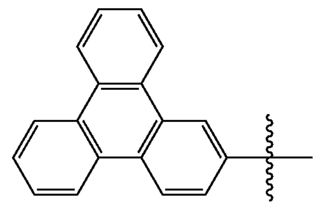 [SMILES: *c1ccc2c3ccccc3c3ccccc3c2c1] | 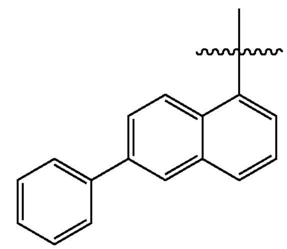 [SMILES: *c1cccc2cc(-c3ccccc3)ccc12] |

-continued
| No. | | Ar1 | Ar2 |
|---|---|---|---|
| 38-19 | 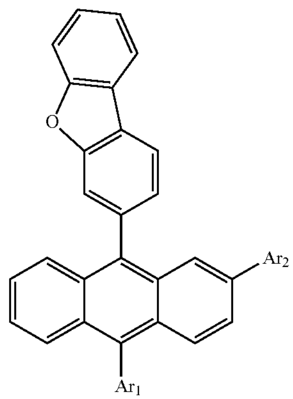 | 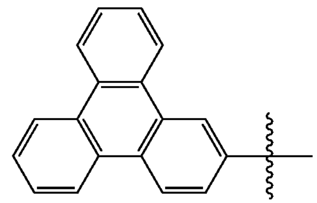 [SMILES: *c1ccc2c3ccccc3c3ccccc3c2c1] | 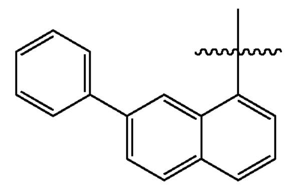 [SMILES: *c1cccc2ccc(-c3ccccc3)cc12] |
| 38-20 | 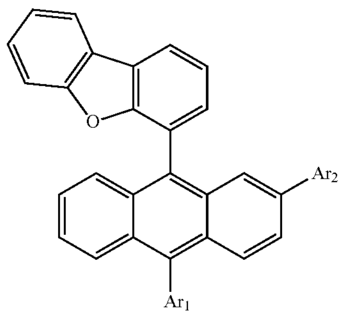 | 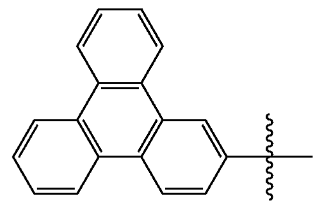 [SMILES: *c1ccc2c3ccccc3c3ccccc3c2c1] | 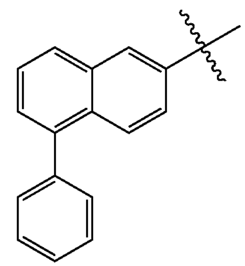 [SMILES: *c1ccc2c(-c3ccccc3)cccc2c1] |

-continued
| No. | | Ar1 | Ar2 |
|---|---|---|---|
| 38-21 | 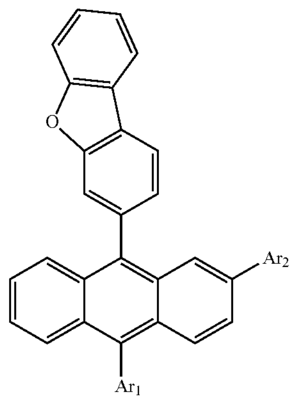 | 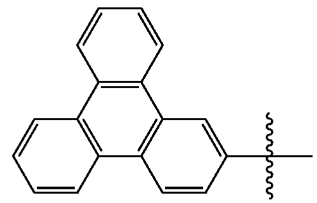 [SMILES: *c1ccc2c3ccccc3c3ccccc3c2c1] | 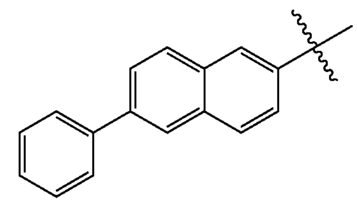 [SMILES: *c1ccc2cc(-c3ccccc3)ccc2c1] |
| 38-22 | 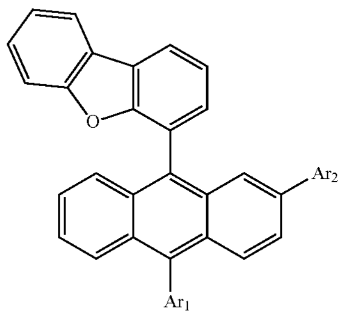 | 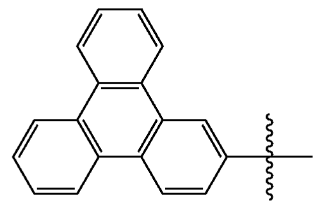 [SMILES: *c1ccc2c3ccccc3c3ccccc3c2c1] | 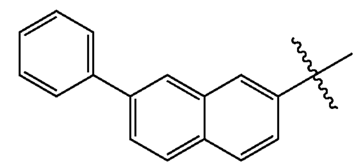 [SMILES: *c1ccc2ccc(-c3ccccc3)cc2c1] |

-continued
| No. | | Ar1 | Ar2 |
|---|---|---|---|
| 38-23 | 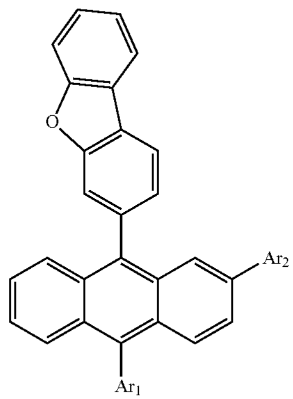 | 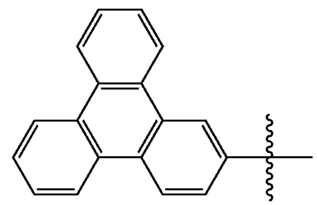 [SMILES: *c1ccc2c3ccccc3c3ccccc3c2c1] | 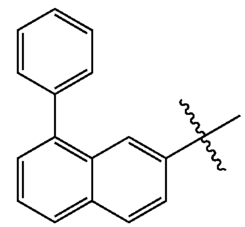 [SMILES: *c1ccc2cccc(-c3ccccc3)c2c1] |
| 38-24 | 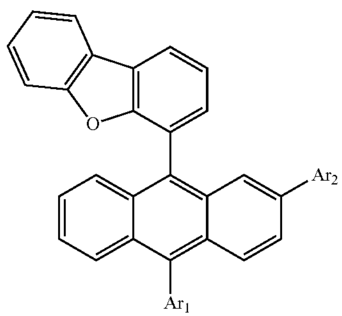 | 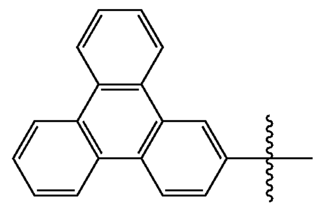 [SMILES: *c1ccc2c3ccccc3c3ccccc3c2c1] | 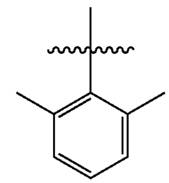 |

-continued
| No. | | Ar1 | Ar2 |
|---|---|---|---|
| 38-25 | 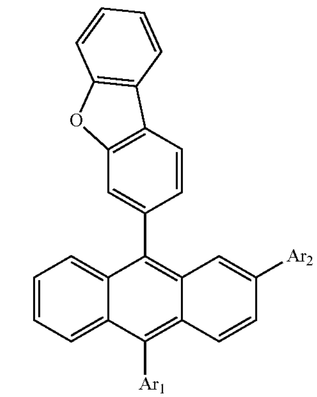 | 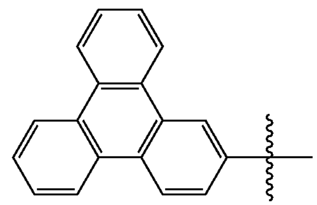 [SMILES: *c1ccc2c3ccccc3c3ccccc3c2c1] | 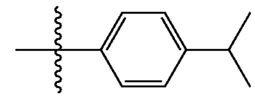 [SMILES: *c1ccc(C(C)C)cc1] |
| 38-26 | 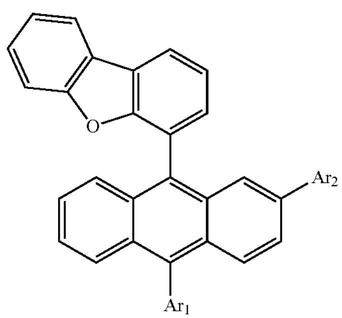 | 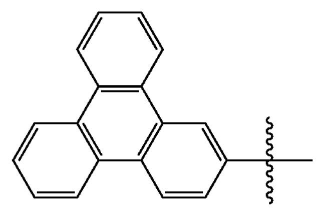 [SMILES: *c1ccc2c3ccccc3c3ccccc3c2c1] | 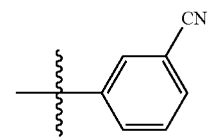 [SMILES: *c1cccc(C#N)c1] |

-continued
| No. | | Ar1 | Ar2 |
|---|---|---|---|
| 38-27 | 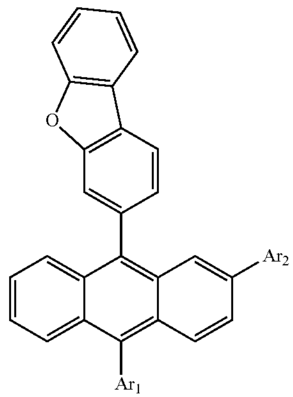 | 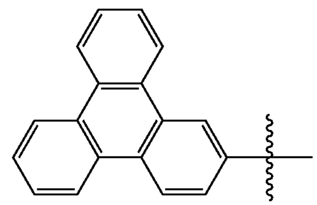 [SMILES: *c1ccc2c3ccccc3c3ccccc3c2c1] | 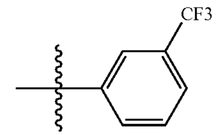 [SMILES: *c1cccc(C(F)(F)F)c1] |
| 38-28 | 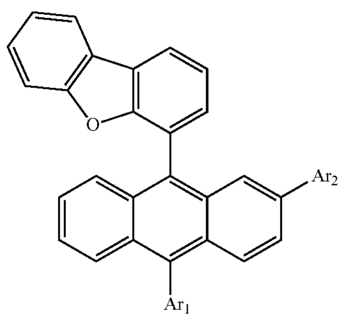 | 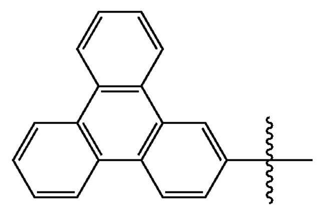 [SMILES: *c1ccc2c3ccccc3c3ccccc3c2c1] | 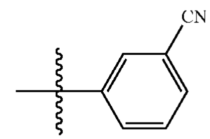 [SMILES: *c1cccc(C#N)c1] |

-continued
| No. | | Ar1 | Ar2 |
|---|---|---|---|
| 38-29 | 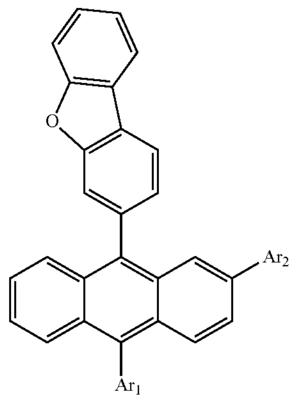 | 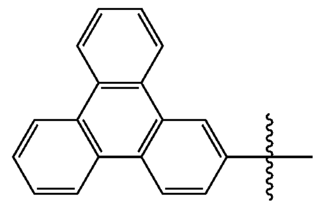 [SMILES: *c1ccc2c3ccccc3c3ccccc3c2c1] | 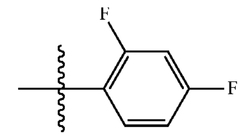 [SMILES: *c1ccc(F)cc1F] |
| 39-1 | 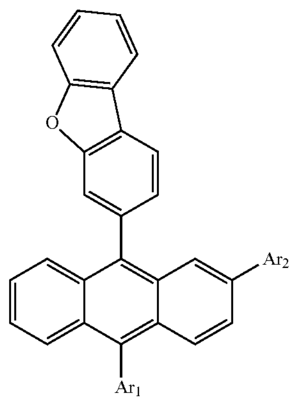 | 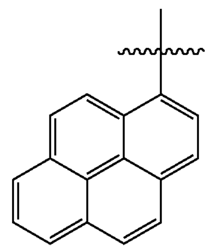 [SMILES: *c1ccc2ccc3cccc4ccc1c2c34] | 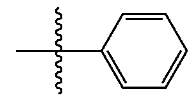 [SMILES: *c1ccccc1] |

-continued
| No. | | Ar1 | Ar2 |
|---|---|---|---|
| 39-2 | 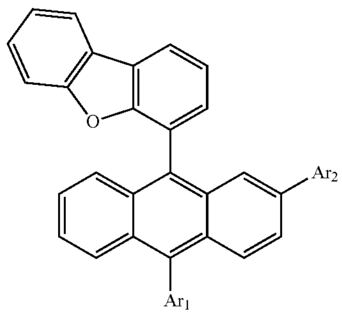 | 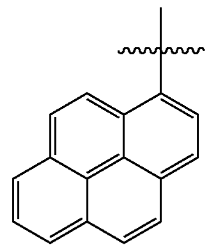 [SMILES: *c1ccc2ccc3cccc4ccc1c2c34] | 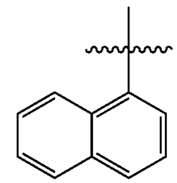 [SMILES: *c1cccc2ccccc12] |
| 39-3 | 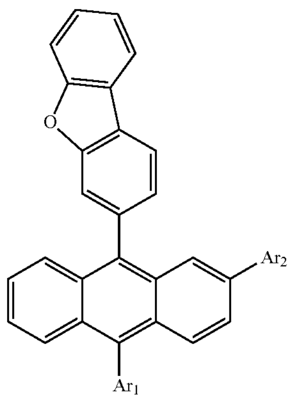 | 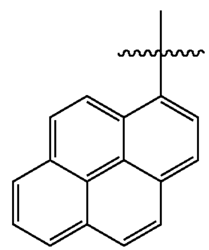 [SMILES: *c1ccc2ccc3cccc4ccc1c2c34] | 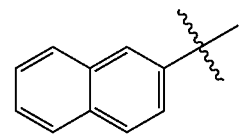 [SMILES: *c1ccc2ccccc2c1] |
| 39-4 | 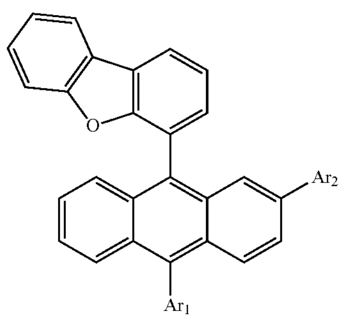 | 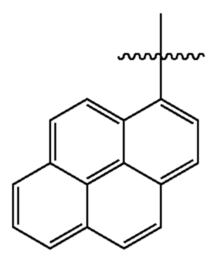 [SMILES: *c1ccc2ccc3cccc4ccc1c2c34] | 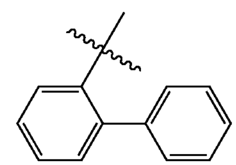 [SMILES: *c1ccccc1-c1ccccc1] |

-continued
| No. | | Ar1 | Ar2 |
|---|---|---|---|
| 39-5 | 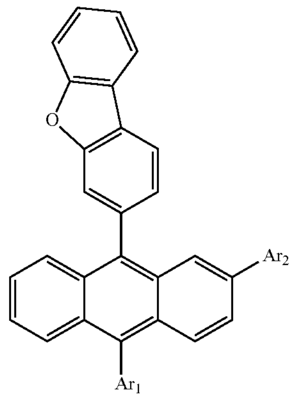  | 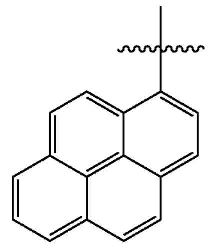 [SMILES: *c1ccc2ccc3cccc4ccc1c2c34] | 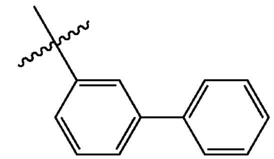 [SMILES: *c1cccc(-c2ccccc2)c1] |
| 39-6 | 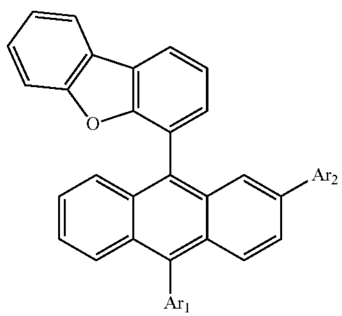  | 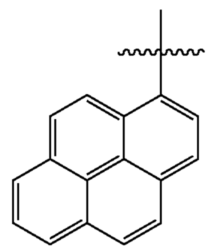 [SMILES: *c1ccc2ccc3cccc4ccc1c2c34] | 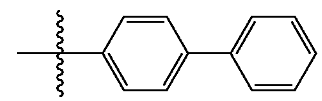 |

-continued
| No. | | Ar1 | Ar2 |
|---|---|---|---|
| 39-7 | 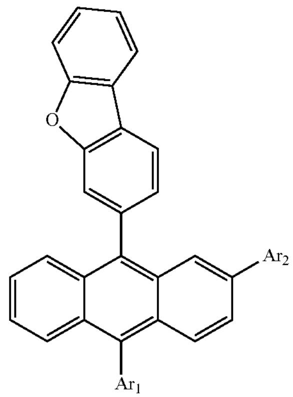 | 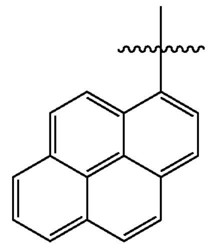 [SMILES: *c1ccc2ccc3cccc4ccc1c2c34] | 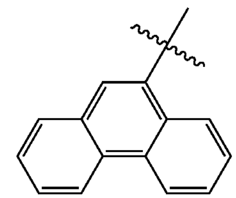 [SMILES: *c1cc2ccccc2c2ccccc12] |
| 39-8 | 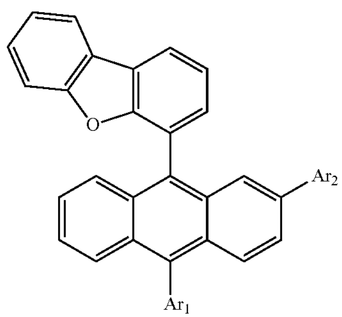 | 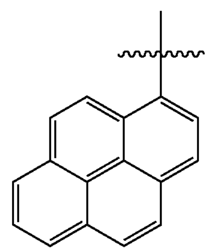 [SMILES: *c1ccc2ccc3cccc4ccc1c2c34] | 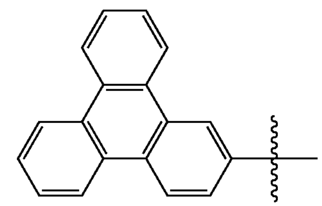 [SMILES: *c1ccc2c3ccccc3c3ccccc3c2c1] |

-continued
| No. | | Ar1 | Ar2 |
|---|---|---|---|
| 39-9 | 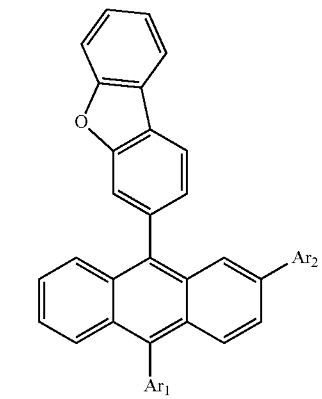 | 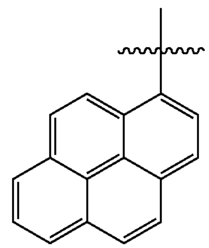 [SMILES: *c1ccc2ccc3cccc4ccc1c2c34] | 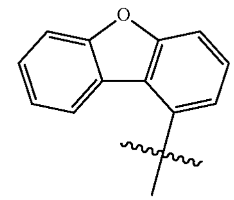 [SMILES: *c1cccc2oc3ccccc3c12] |
| 39-10 | 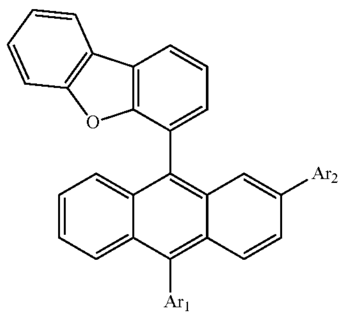 | 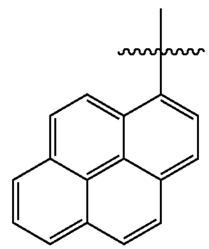 [SMILES: *c1ccc2ccc3cccc4ccc1c2c34] | 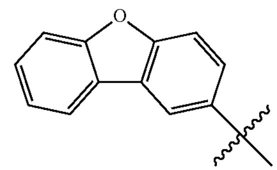 |

-continued
| No. | | Ar1 | Ar2 |
|---|---|---|---|
| 39-11 | 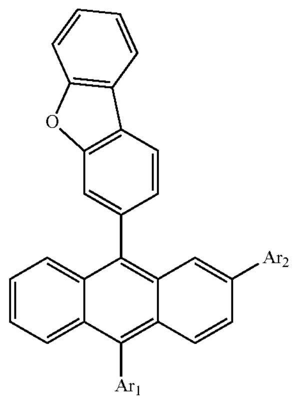 | 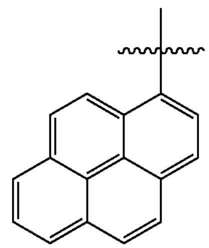 [SMILES: *c1ccc2ccc3cccc4ccc1c2c34] | 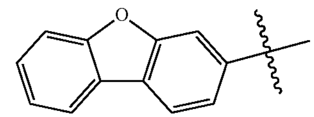 [SMILES: *c1ccc2c(c1)oc1ccccc12] |
| 39-12 | 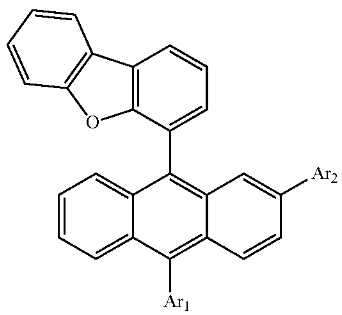 | 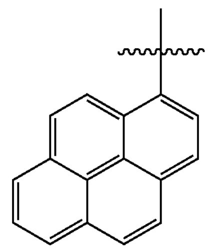 [SMILES: *c1ccc2ccc3cccc4ccc1c2c34] | 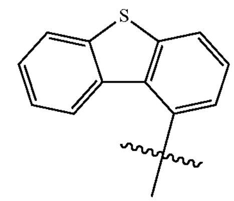 [SMILES: *c1cccc2sc3ccccc3c12] |

-continued
| No. | | Ar1 | Ar2 |
|---|---|---|---|
| 39-13 | 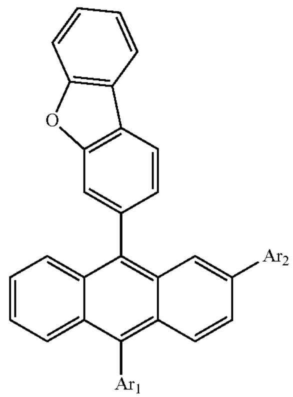 | 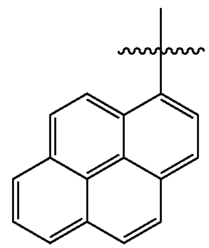 [SMILES: *c1ccc2ccc3cccc4ccc1c2c34] | 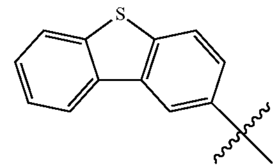 |
| 39-14 | 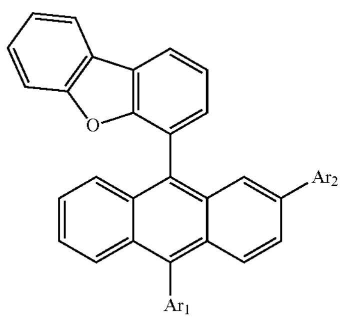 | 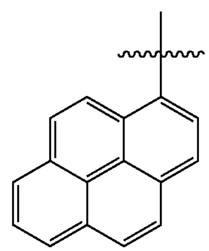 [SMILES: *c1ccc2ccc3cccc4ccc1c2c34] | 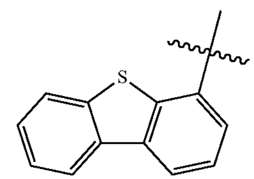 |

-continued
| No. | | Ar1 | Ar2 |
| --- | --- | --- | --- |
| 39-15 | 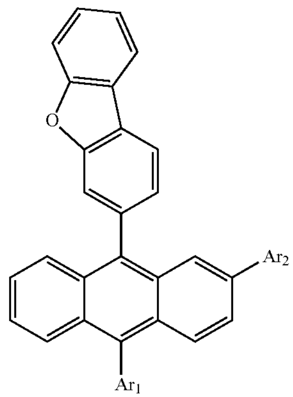 | 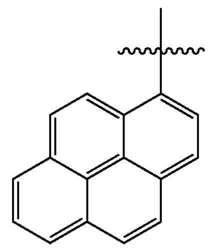 [SMILES: *c1ccc2ccc3cccc4ccc1c2c34] | 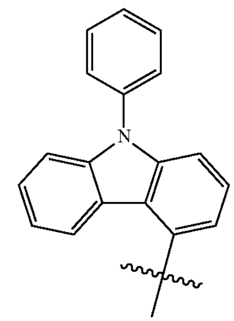 [SMILES: *c1cccc2c1c1ccccc1n2-c1ccccc1] |
| 39-16 | 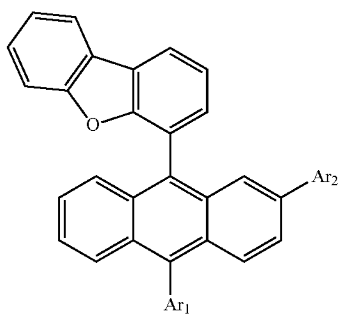 | 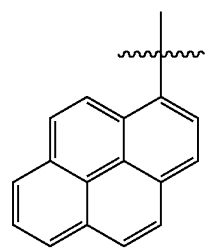 [SMILES: *c1ccc2ccc3cccc4ccc1c2c34] | 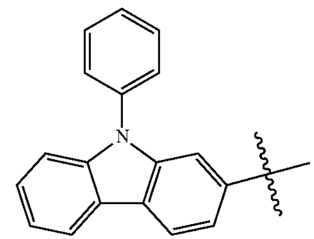 [SMILES: *c1ccc2c3ccccc3n(-c3ccccc3)c2c1] |

-continued
| No. | | Ar1 | Ar2 |
|---|---|---|---|
| 39-17 | 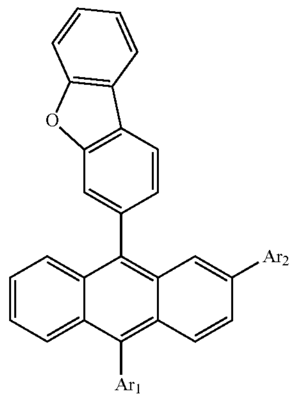 | 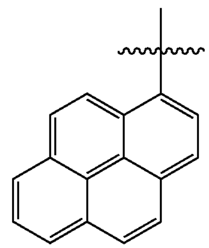 [SMILES: *c1ccc2ccc3cccc4ccc1c2c34] | 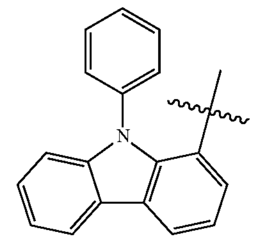 [SMILES: *c1cccc2c3ccccc3n(-c3ccccc3)c12] |
| 39-18 | 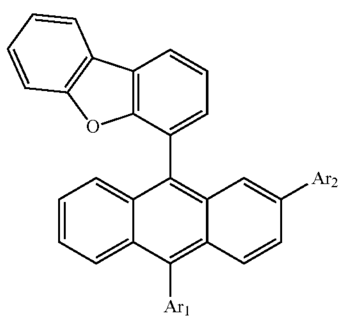 | 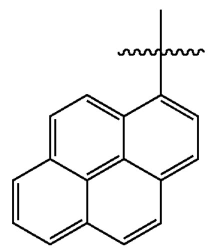 [SMILES: *c1ccc2ccc3cccc4ccc1c2c34] | 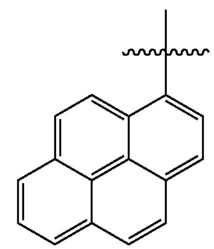 [SMILES: *c1ccc2ccc3cccc4ccc1c2c34] |

-continued
| No. | | Ar1 | Ar2 |
|---|---|---|---|
| 39-19 | 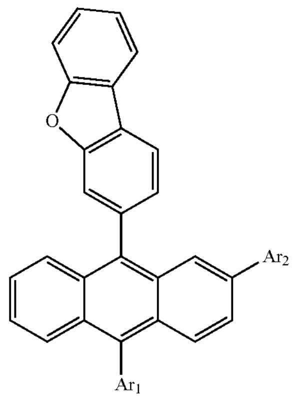 | 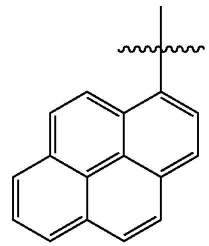 [SMILES: *c1ccc2ccc3cccc4ccc1c2c34] | 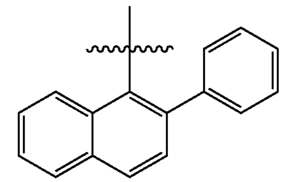 [SMILES: *c1c(-c2ccccc2)ccc2ccccc12] |
| 39-20 | 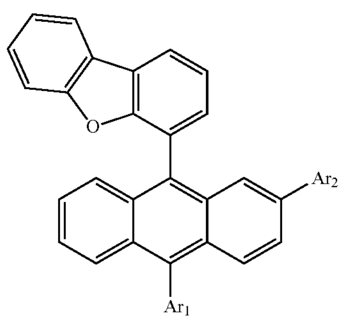 | 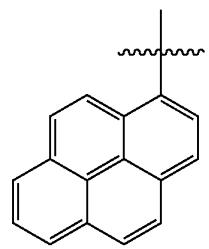 [SMILES: *c1ccc2ccc3cccc4ccc1c2c34] | 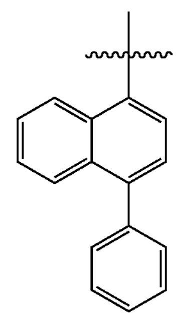 [SMILES: *c1ccc(-c2ccccc2)c2ccccc12] |

-continued
| No. | | Ar1 | Ar2 |
|---|---|---|---|
| 39-21 | 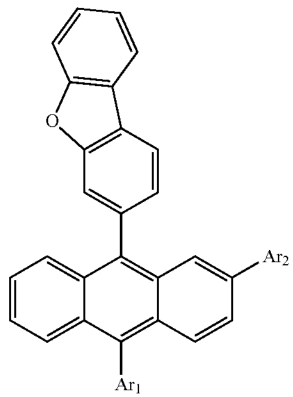 | 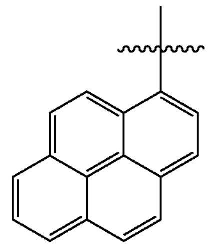 [SMILES: *c1ccc2ccc3cccc4ccc1c2c34] | 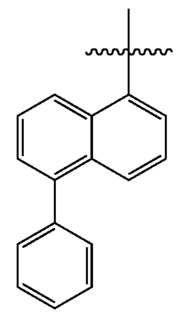 [SMILES: *c1cccc2c(-c3ccccc3)cccc12] |
| 39-22 | 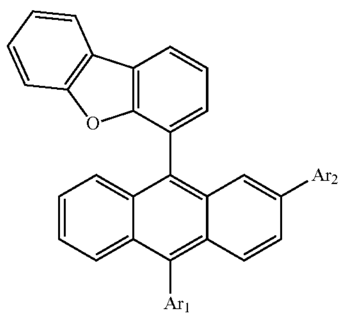 | 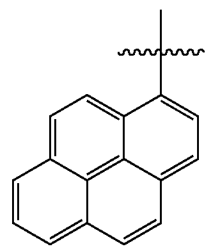 [SMILES: *c1ccc2ccc3cccc4ccc1c2c34] | 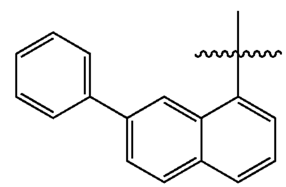 [SMILES: *c1cccc2ccc(-c3ccccc3)cc12] |

-continued
| No. | | Ar1 | Ar2 |
|---|---|---|---|
| 39-23 | 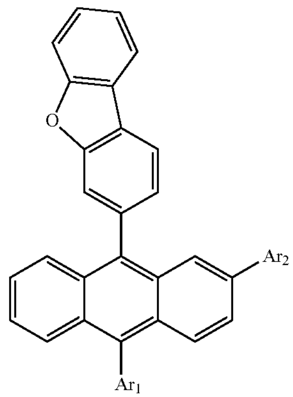 | 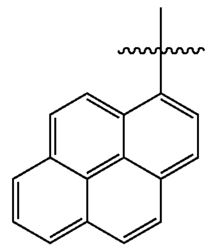 [SMILES: *c1ccc2ccc3cccc4ccc1c2c34] | 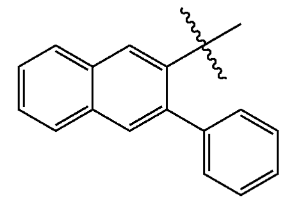 [SMILES: *c1cc2ccccc2cc1-c1ccccc1] |
| 39-24 | 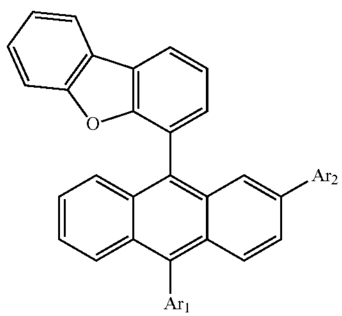 | 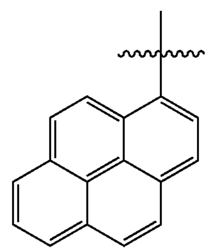 [SMILES: *c1ccc2ccc3cccc4ccc1c2c34] | 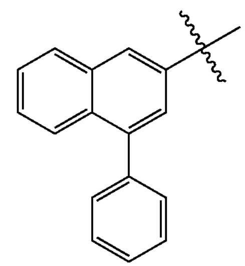 [SMILES: *c1cc(-c2ccccc2)c2ccccc2c1] |

-continued
| No. | | Ar1 | Ar2 |
|---|---|---|---|
| 39-25 | 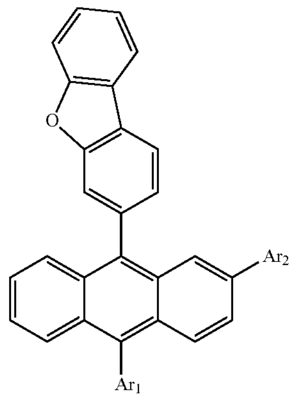 | 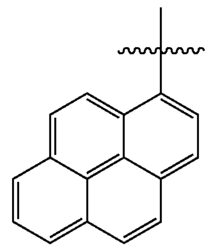 [SMILES: *c1ccc2ccc3cccc4ccc1c2c34] | 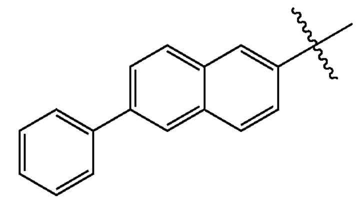 [SMILES: *c1ccc2cc(-c3ccccc3)ccc2c1] |
| 39-26 | 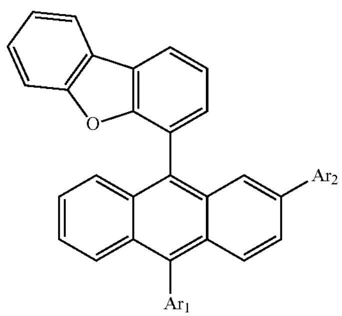 | 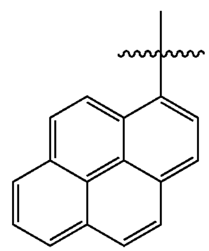 [SMILES: *c1ccc2ccc3cccc4ccc1c2c34] | 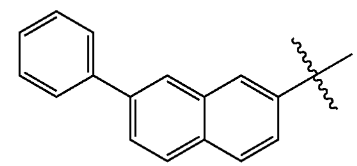 [SMILES: *c1ccc2ccc(-c3ccccc3)cc2c1] |

-continued
| No. | | Ar1 | Ar2 |
|---|---|---|---|
| 39-27 | 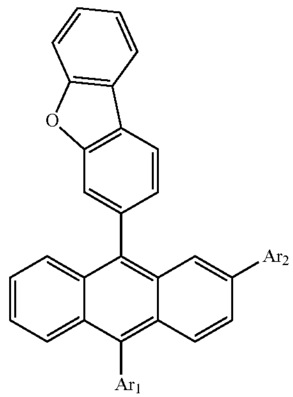 | 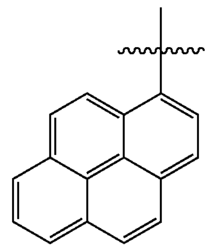 [SMILES: *c1ccc2ccc3cccc4ccc1c2c34] | 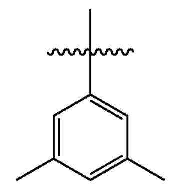 |
| 39-28 | 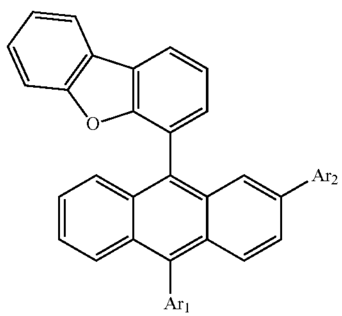 | 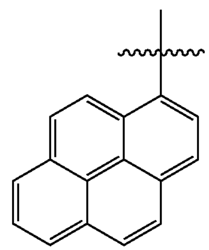 [SMILES: *c1ccc2ccc3cccc4ccc1c2c34] | 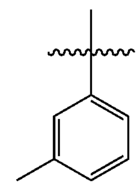 [SMILES: *c1cccc(C)c1] |

-continued
| No. | | Ar1 | Ar2 |
|---|---|---|---|
| 39-29 | 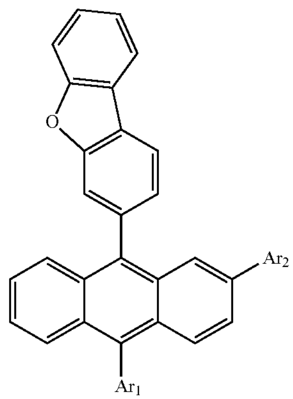 | 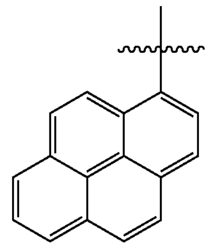 [SMILES: *c1ccc2ccc3cccc4ccc1c2c34] | 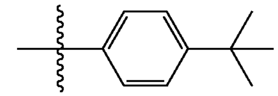 [SMILES: *c1ccc(C(C)(C)C)cc1] |
| 39-30 | 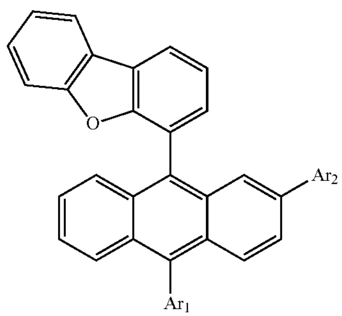 | 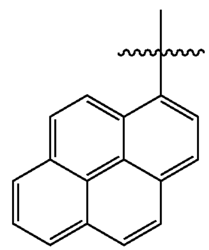 [SMILES: *c1ccc2ccc3cccc4ccc1c2c34] | 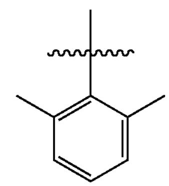 |

-continued
| No. | | Ar1 | Ar2 |
|---|---|---|---|
| 39-31 | 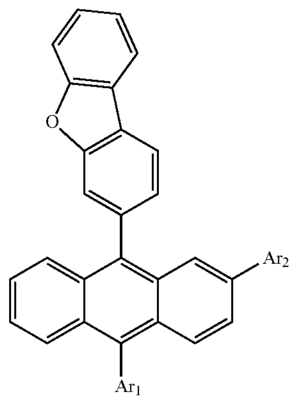 | 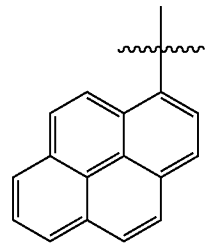 [SMILES: *c1ccc2ccc3cccc4ccc1c2c34] | 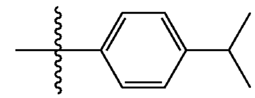 [SMILES: *c1ccc(C(C)C)cc1] |
| 40-1 | 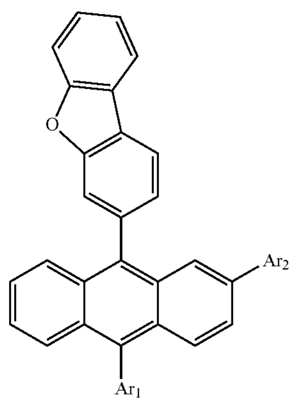 | 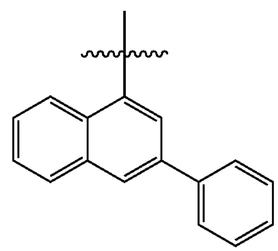 [SMILES: *c1cc(-c2ccccc2)cc2ccccc12] | 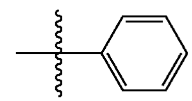 [SMILES: *c1ccccc1] |

-continued
| No. | | Ar1 | Ar2 |
| --- | --- | --- | --- |
| 40-2 | 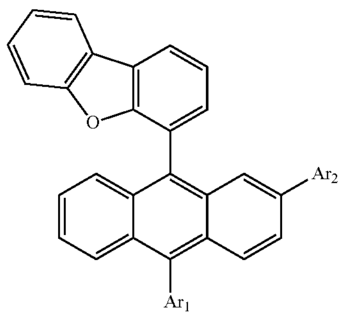 | 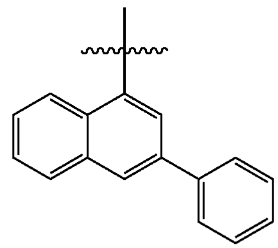 [SMILES: *c1cc(-c2ccccc2)cc2ccccc12] | 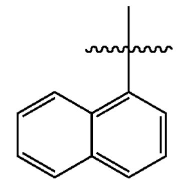 [SMILES: *c1cccc2ccccc12] |
| 40-3 | 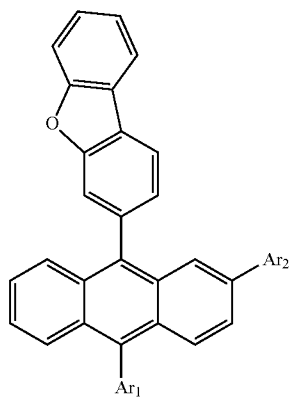 | 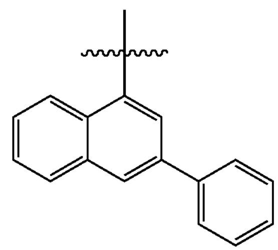 [SMILES: *c1cc(-c2ccccc2)cc2ccccc12] | 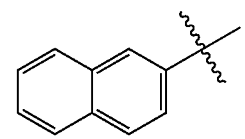 [SMILES: *c1ccc2ccccc2c1] |
| 40-4 | 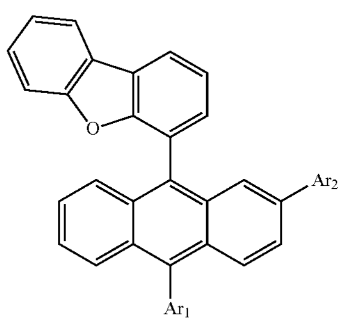 | 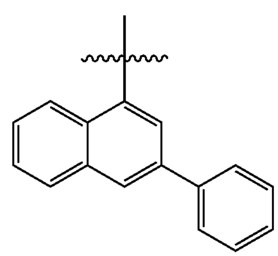 [SMILES: *c1cc(-c2ccccc2)cc2ccccc12] | 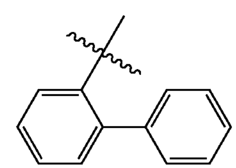 [SMILES: *c1ccccc1-c1ccccc1] |

-continued
| No. | | Ar1 | Ar2 |
|---|---|---|---|
| 40-5 | 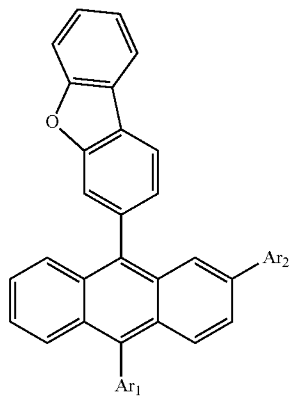 | 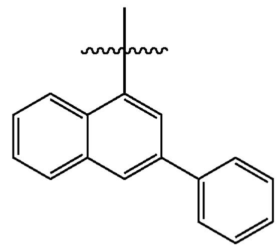 [SMILES: *c1cc(-c2ccccc2)cc2ccccc12] | 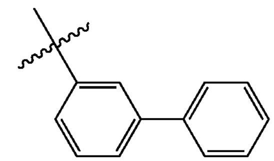 [SMILES: *c1cccc(-c2ccccc2)c1] |
| 40-6 | 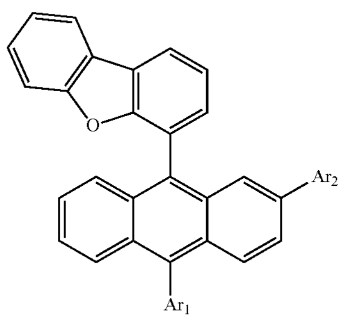 | 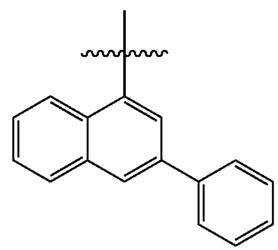 [SMILES: *c1cc(-c2ccccc2)cc2ccccc12] | 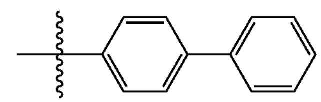 |

-continued
| No. | | Ar1 | Ar2 |
|---|---|---|---|
| 40-7 | 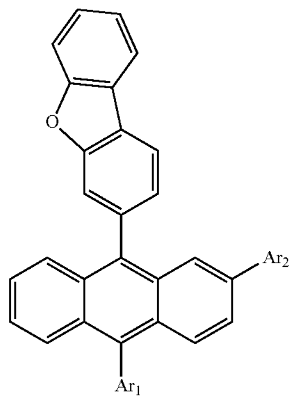 | 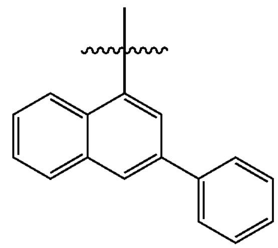 [SMILES: *c1cc(-c2ccccc2)cc2ccccc12] | 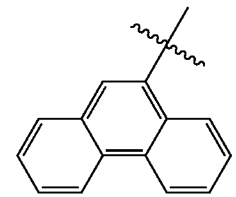 [SMILES: *c1cc2ccccc2c2ccccc12] |
| 40-8 | 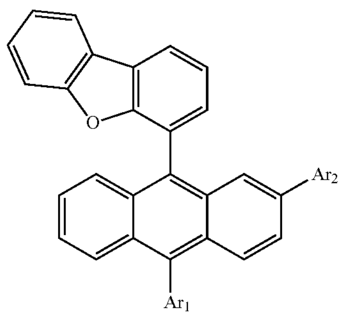 | 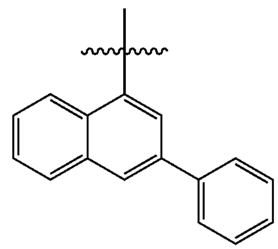 [SMILES: *c1cc(-c2ccccc2)cc2ccccc12] | 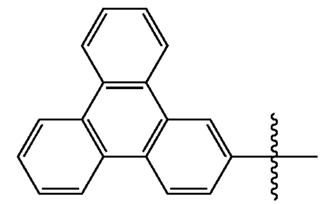 |

-continued
| No. | | Ar1 | Ar2 |
|---|---|---|---|
| 40-9 | 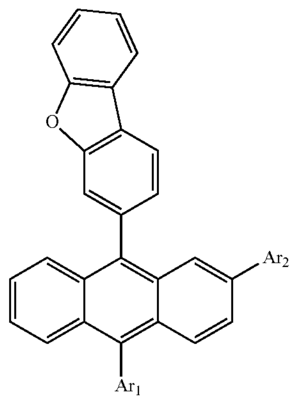 | 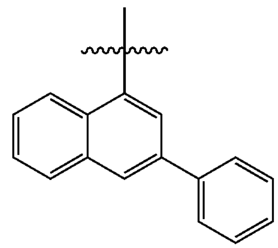 [SMILES: *c1cc(-c2ccccc2)cc2ccccc12] | 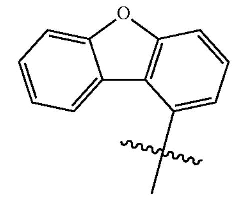 |
| 40-10 | 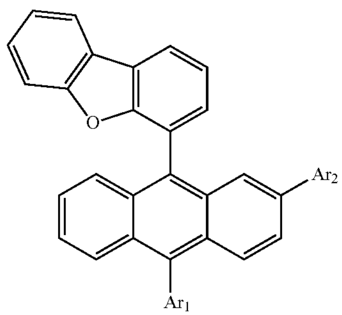 | 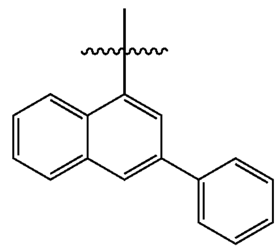 [SMILES: *c1cc(-c2ccccc2)cc2ccccc12] | 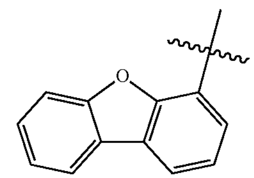 [SMILES: *c1cccc2c1oc1ccccc12] |

-continued
| No. | | Ar1 | Ar2 |
|---|---|---|---|
| 40-11 | 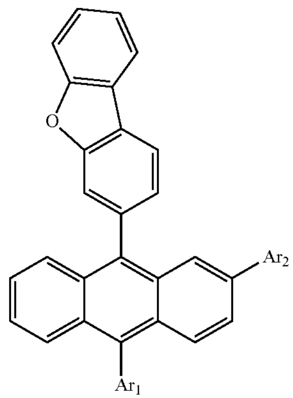 | 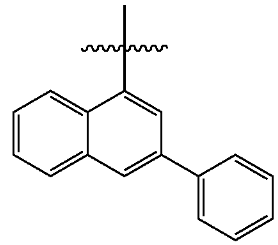 [SMILES: *c1cc(-c2ccccc2)cc2ccccc12] | 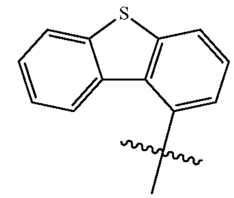 |
| 40-12 | 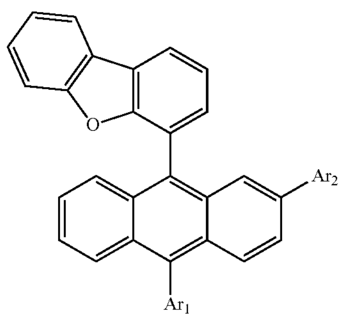 | 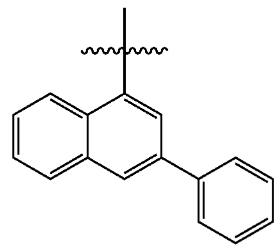 [SMILES: *c1cc(-c2ccccc2)cc2ccccc12] | 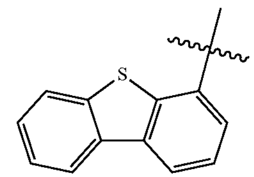 [SMILES: *c1cccc2c1sc1ccccc12] |

-continued
| No. | | Ar1 | Ar2 |
|---|---|---|---|
| 40-13 | 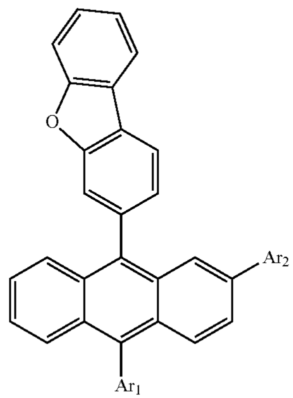 | 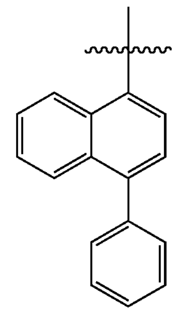 [SMILES: *c1ccc(-c2ccccc2)c2ccccc12] | 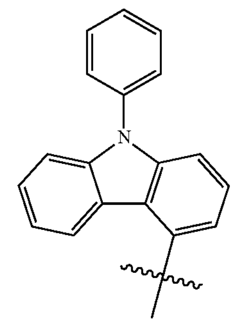 [SMILES: *c1cccc2c1c1ccccc1n2-c1ccccc1] |
| 40-14 | 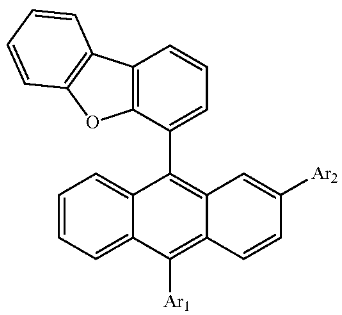 | 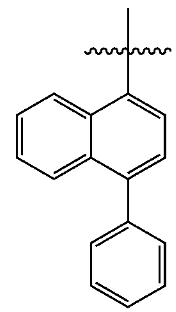 [SMILES: *c1ccc(-c2ccccc2)c2ccccc12] | 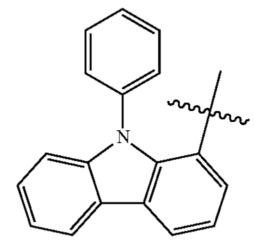 [SMILES: *c1cccc2c3ccccc3n(-c3ccccc3)c12] |

-continued
| No. | | Ar1 | Ar2 |
| --- | --- | --- | --- |
| 40-15 | 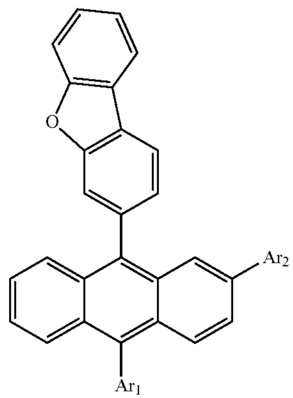 | 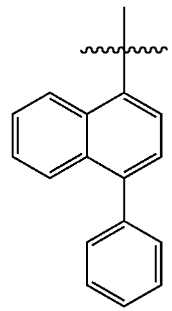 [SMILES: *c1ccc(-c2ccccc2)c2ccccc12] | 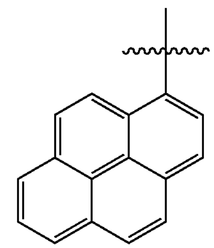 [SMILES: *c1ccc2ccc3cccc4ccc1c2c34] |
| 40-16 | 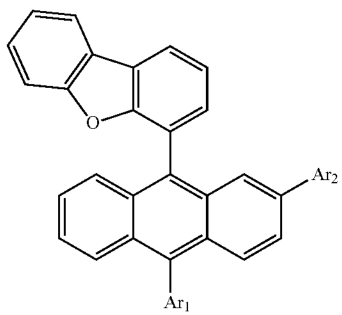 | 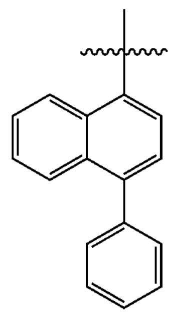 [SMILES: *c1ccc(-c2ccccc2)c2ccccc12] | 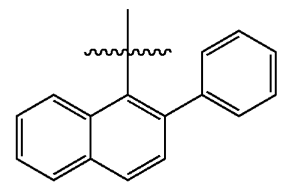 [SMILES: *c1c(-c2ccccc2)ccc2ccccc12] |

-continued
| No. | | Ar1 | Ar2 |
|---|---|---|---|
| 40-17 | 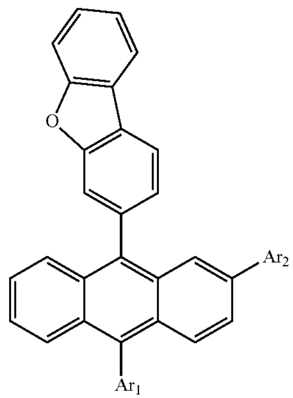 | 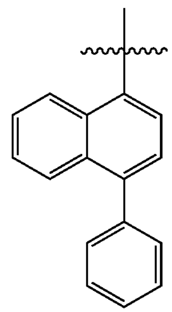 [SMILES: *c1ccc(-c2ccccc2)c2ccccc12] | 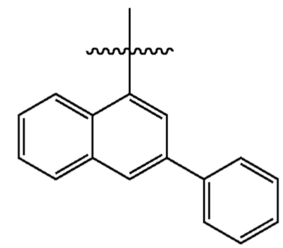 [SMILES: *c1cc(-c2ccccc2)cc2ccccc12] |
| 40-18 | 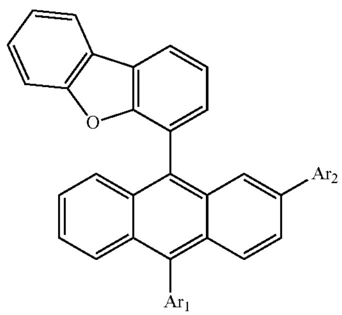 | 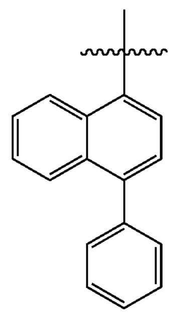 [SMILES: *c1ccc(-c2ccccc2)c2ccccc12] | 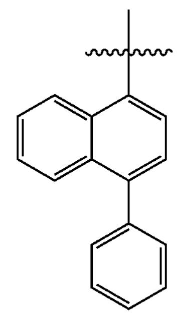 [SMILES: *c1ccc(-c2ccccc2)c2ccccc12] |

-continued
| No. | | Ar1 | Ar2 |
|---|---|---|---|
| 40-19 | 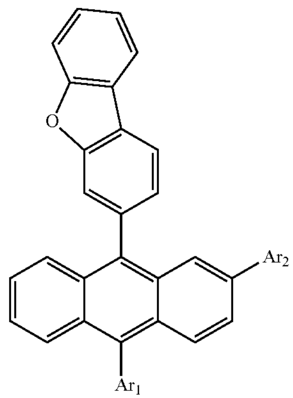 | 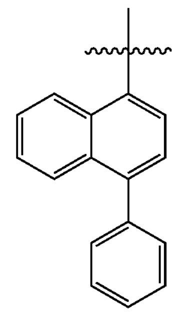 [SMILES: *c1ccc(-c2ccccc2)c2ccccc12] | 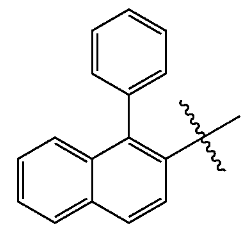 [SMILES: *c1ccc2ccccc2c1-c1ccccc1] |
| 40-20 | 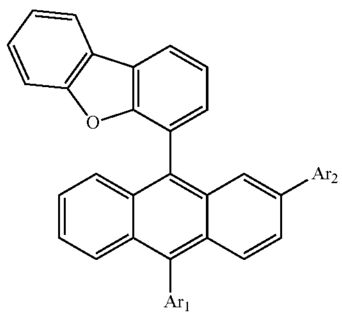 | 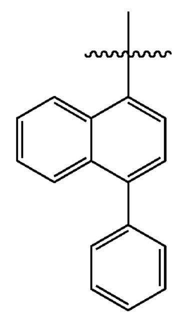 [SMILES: *c1ccc(-c2ccccc2)c2ccccc12] | 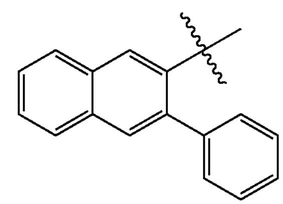 [SMILES: *c1cc2ccccc2cc1-c1ccccc1] |

-continued
| No. | | Ar1 | Ar2 |
|---|---|---|---|
| 40-21 | 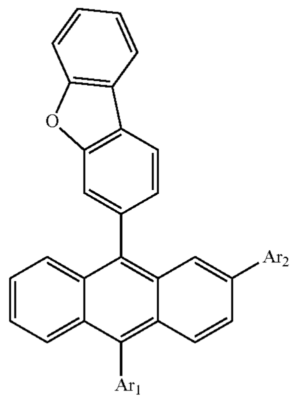  | 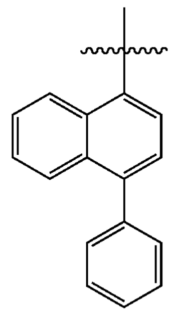 [SMILES: *c1ccc(-c2ccccc2)c2ccccc12] | 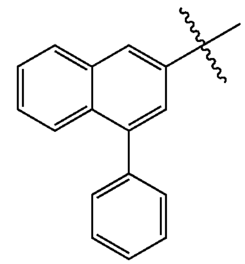 [SMILES: *c1cc(-c2ccccc2)c2ccccc2c1] |
| 40-22 | 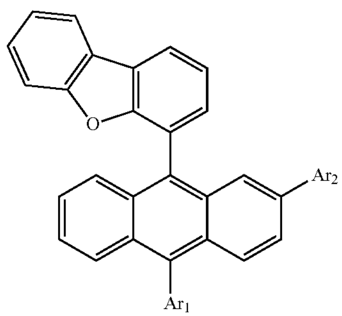  | 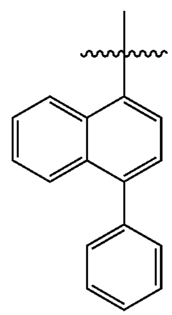 [SMILES: *c1ccc(-c2ccccc2)c2ccccc12] | 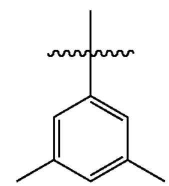 |

-continued
| No. | | Ar1 | Ar2 |
|---|---|---|---|
| 40-23 | 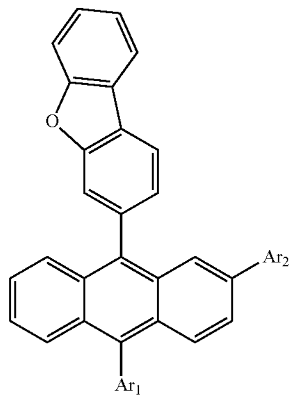 | 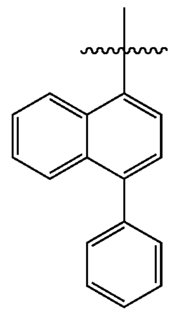 [SMILES: *c1ccc(-c2ccccc2)c2ccccc12] | 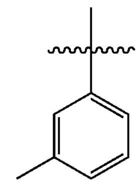 [SMILES: *c1cccc(C)c1] |
| 40-24 | 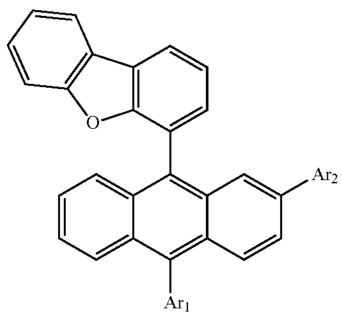 | 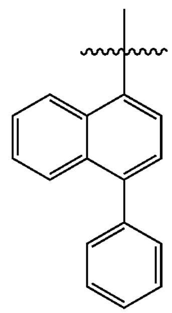 [SMILES: *c1ccc(-c2ccccc2)c2ccccc12] | 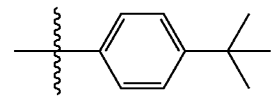 |

-continued
| No. | | Ar1 | Ar2 |
|---|---|---|---|
| 40-25 | 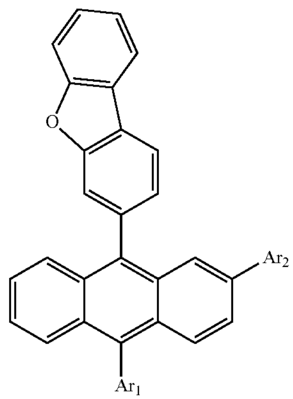 | 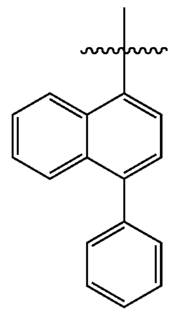 [SMILES: *c1ccc(-c2ccccc2)c2ccccc12] | 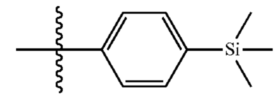 |
| 40-26 | 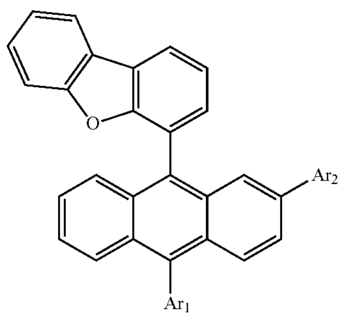 | 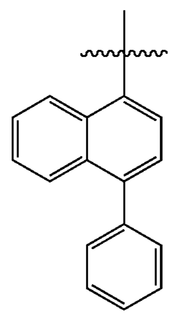 [SMILES: *c1ccc(-c2ccccc2)c2ccccc12] | 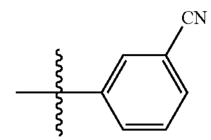 [SMILES: *c1cccc(C#N)c1] |

-continued
| No. | | Ar1 | Ar2 |
| --- | --- | --- | --- |
| 40-27 | 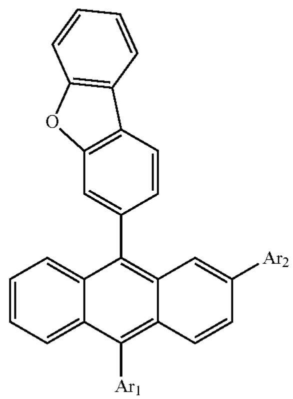 | 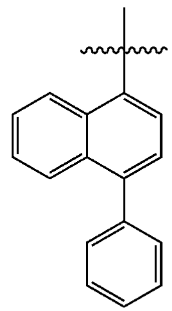 [SMILES: *c1ccc(-c2ccccc2)c2ccccc12] | 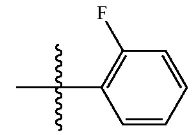 [SMILES: *c1ccccc1F] |
| 40-28 | 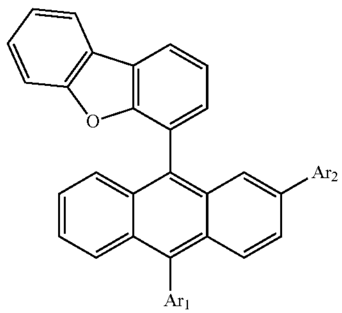 | 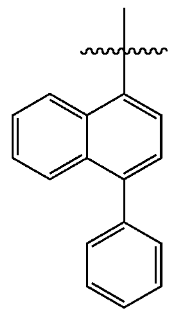 [SMILES: *c1ccc(-c2ccccc2)c2ccccc12] | 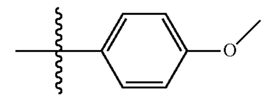 |

-continued
| No. | | Ar1 | Ar2 |
|---|---|---|---|
| 41-1 | 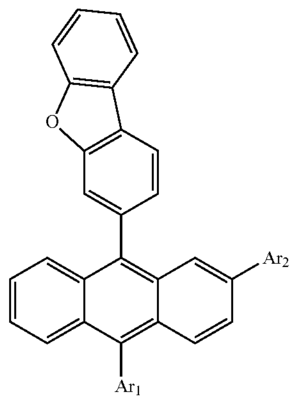 | 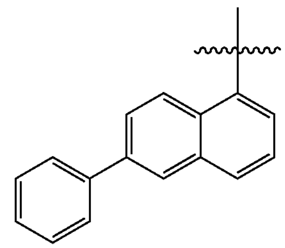 [SMILES: *c1cccc2cc(-c3ccccc3)ccc12] | 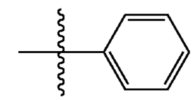 [SMILES: *c1ccccc1] |
| 41-2 | 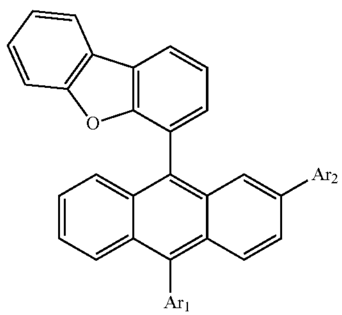 | 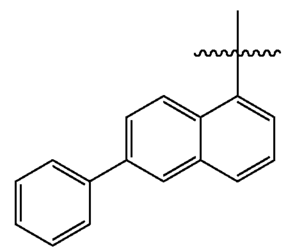 [SMILES: *c1cccc2cc(-c3ccccc3)ccc12] | 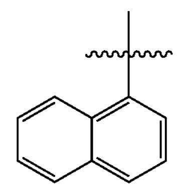 [SMILES: *c1cccc2ccccc12] |

-continued
| No. | | Ar1 | Ar2 |
|---|---|---|---|
| 41-3 | 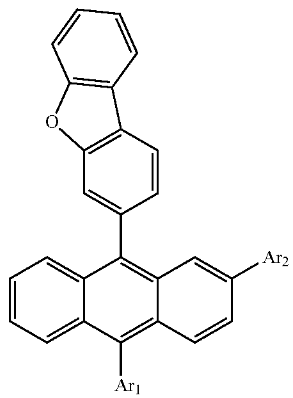 | 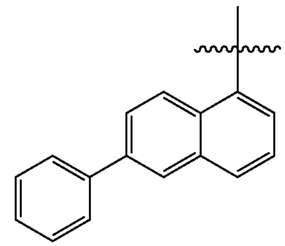 [SMILES: *c1cccc2cc(-c3ccccc3)ccc12] | 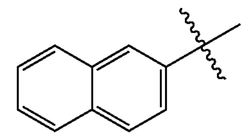 [SMILES: *c1ccc2ccccc2c1] |
| 41-4 | 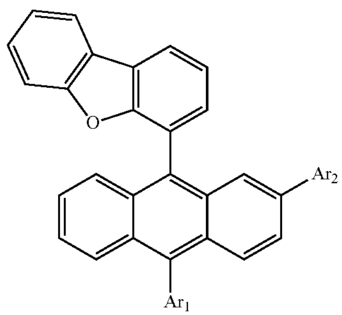 | 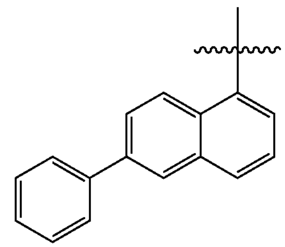 [SMILES: *c1cccc2cc(-c3ccccc3)ccc12] | 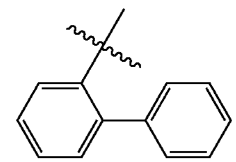 [SMILES: *c1ccccc1-c1ccccc1] |

-continued
| No. | | Ar1 | Ar2 |
|---|---|---|---|
| 41-5 | 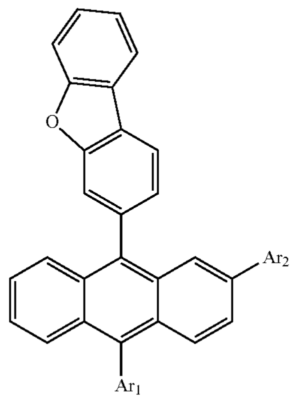 | 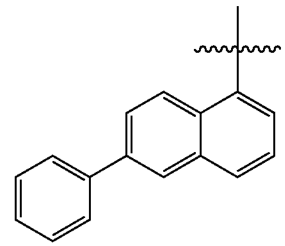 [SMILES: *c1cccc2cc(-c3ccccc3)ccc12] | 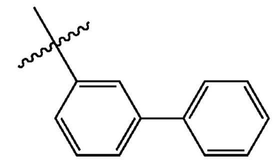 [SMILES: *c1cccc(-c2ccccc2)c1] |
| 41-6 | 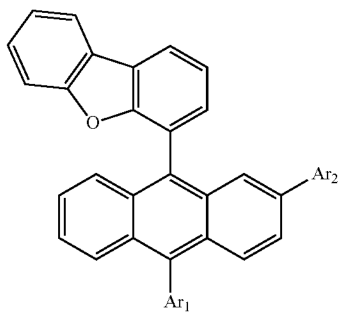 | 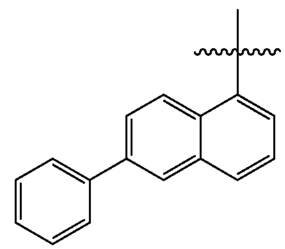 [SMILES: *c1cccc2cc(-c3ccccc3)ccc12] | 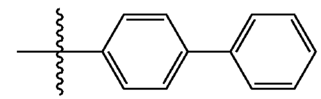 [SMILES: *c1ccc(-c2ccccc2)cc1] |

-continued
| No. | | Ar1 | Ar2 |
|---|---|---|---|
| 41-7 | 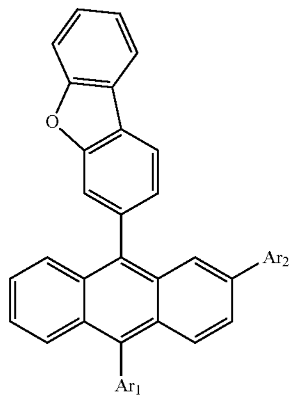 | 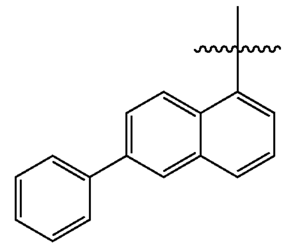 [SMILES: *c1cccc2cc(-c3ccccc3)ccc12] | 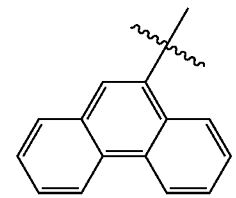 [SMILES: *c1cc2ccccc2c2ccccc12] |
| 41-8 | 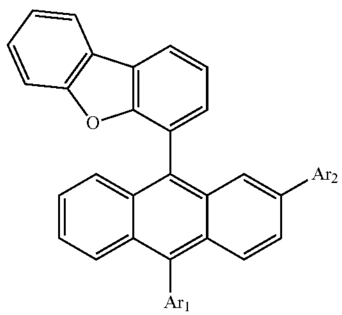 | 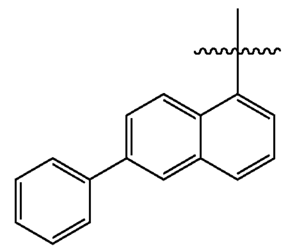 [SMILES: *c1cccc2cc(-c3ccccc3)ccc12] | 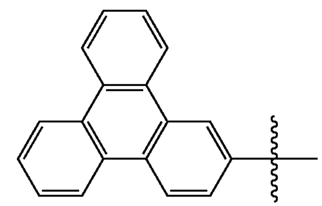 |

-continued
| No. | | Ar1 | Ar2 |
| --- | --- | --- | --- |
| 41-9 | 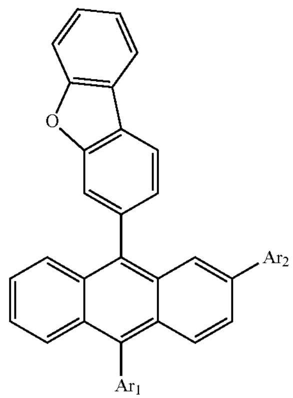 | 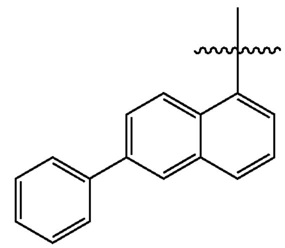 [SMILES: *c1cccc2cc(-c3ccccc3)ccc12] | 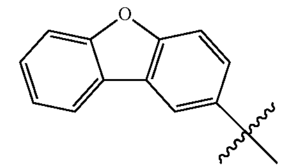 [SMILES: *c1ccc2oc3ccccc3c2c1] |
| 41-10 | 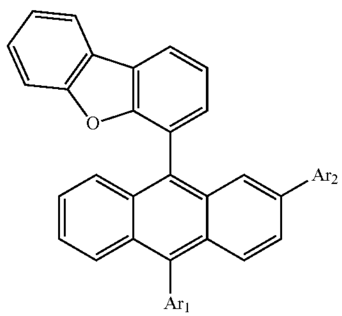 | 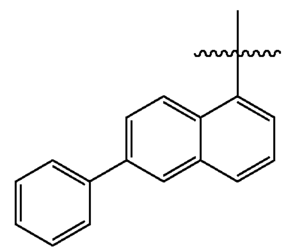 [SMILES: *c1cccc2cc(-c3ccccc3)ccc12] | 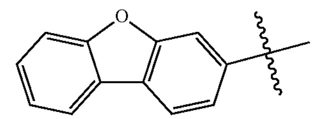 |

-continued
| No. | | Ar1 | Ar2 |
|---|---|---|---|
| 41-11 | 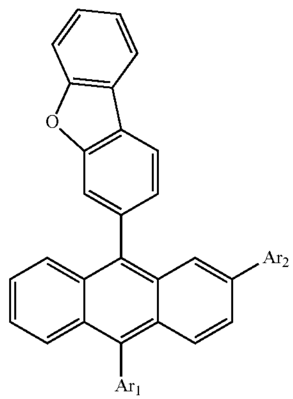 | 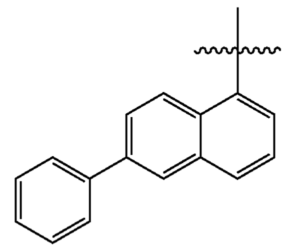 [SMILES: *c1cccc2cc(-c3ccccc3)ccc12] | 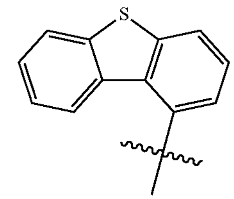 [SMILES: *c1cccc2sc3ccccc3c12] |
| 41-12 | 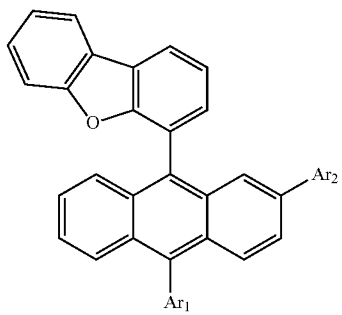 | 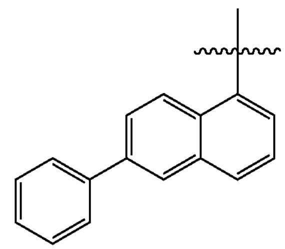 [SMILES: *c1cccc2cc(-c3ccccc3)ccc12] | 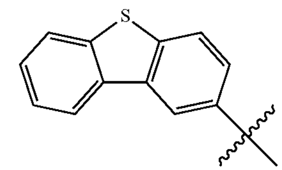 |

-continued
| No. | | Ar1 | Ar2 |
|---|---|---|---|
| 41-13 | 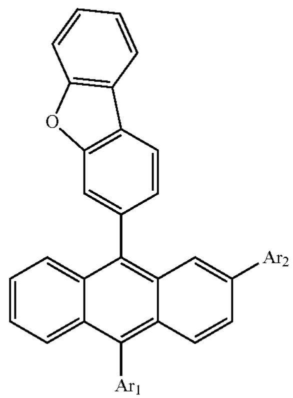 | 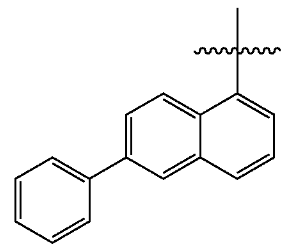 [SMILES: *c1cccc2cc(-c3ccccc3)ccc12] | 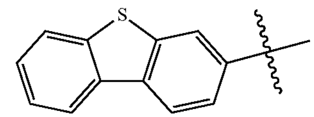 |
| 41-14 | 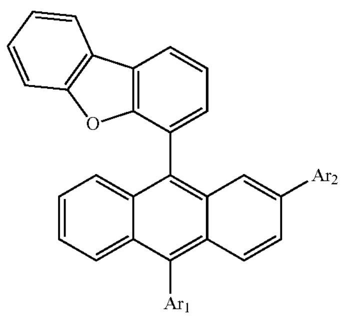 | 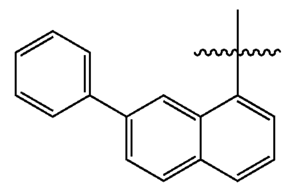 [SMILES: *c1cccc2ccc(-c3ccccc3)cc12] | 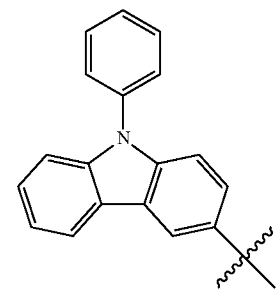 [SMILES: *c1ccc2c(c1)c1ccccc1n2-c1ccccc1] |

-continued
| No. | | Ar1 | Ar2 |
|---|---|---|---|
| 41-15 | 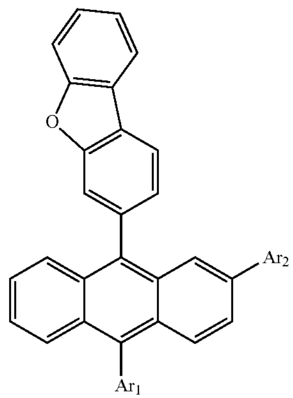 | 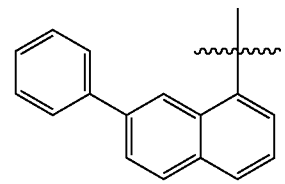 [SMILES: *c1cccc2ccc(-c3ccccc3)cc12] | 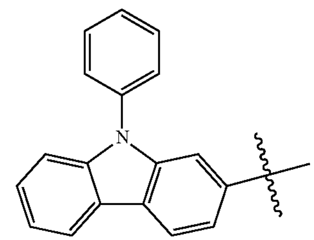 [SMILES: *c1ccc2c3ccccc3n(-c3ccccc3)c2c1] |
| 41-16 | 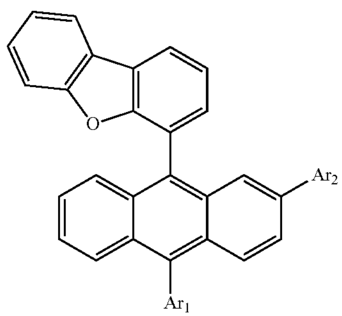 | 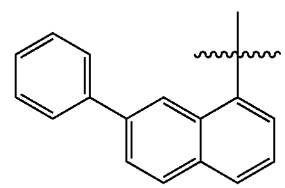 [SMILES: *c1cccc2ccc(-c3ccccc3)cc12] | 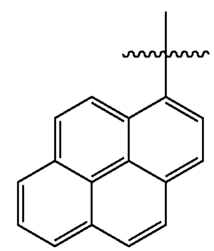 [SMILES: *c1ccc2ccc3cccc4ccc1c2c34] |

-continued
| No. | | Ar1 | Ar2 |
|---|---|---|---|
| 41-17 | 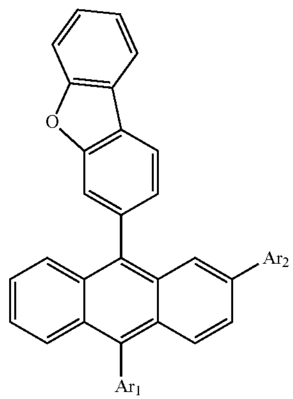 | 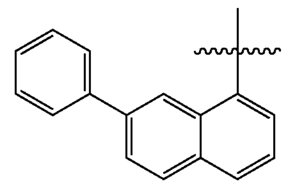 [SMILES: *c1cccc2ccc(-c3ccccc3)cc12] | 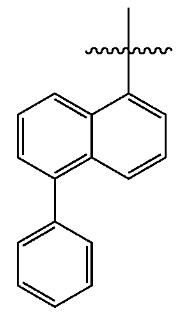 [SMILES: *c1cccc2c(-c3ccccc3)cccc12] |
| 41-18 | 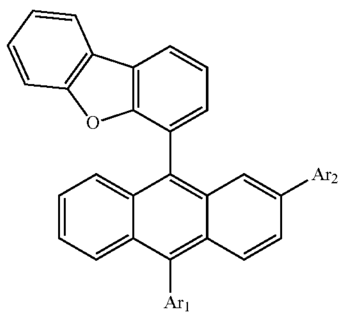 | 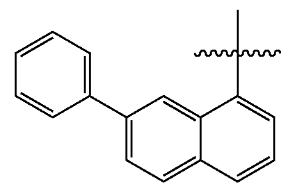 [SMILES: *c1cccc2ccc(-c3ccccc3)cc12] | 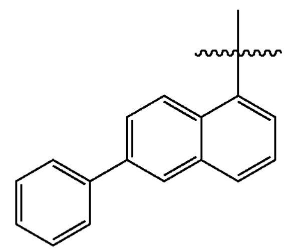 [SMILES: *c1cccc2cc(-c3ccccc3)ccc12] |

-continued
| No. | | Ar1 | Ar2 |
|---|---|---|---|
| 41-19 | 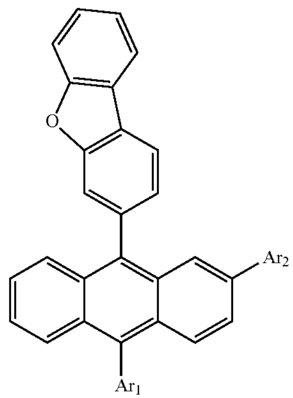 | 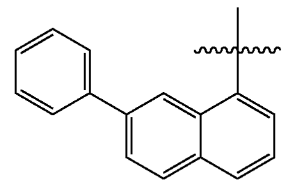 [SMILES: *c1cccc2ccc(-c3ccccc3)cc12] | 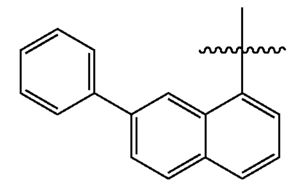 [SMILES: *c1cccc2ccc(-c3ccccc3)cc12] |
| 41-20 | 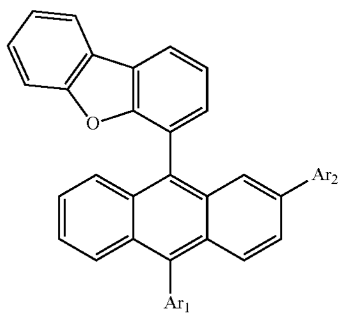 | 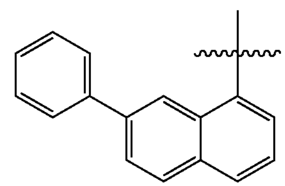 [SMILES: *c1cccc2ccc(-c3ccccc3)cc12] | 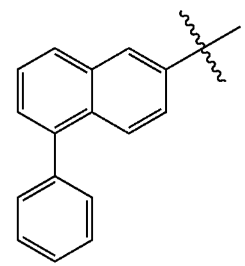 [SMILES: *c1ccc2c(-c3ccccc3)cccc2c1] |

-continued
| No. | | Ar1 | Ar2 |
|---|---|---|---|
| 41-21 | 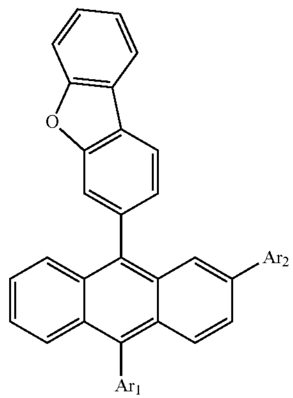 | 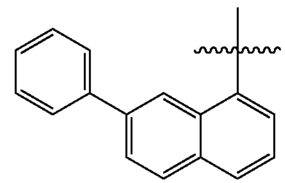 [SMILES: *c1cccc2ccc(-c3ccccc3)cc12] | 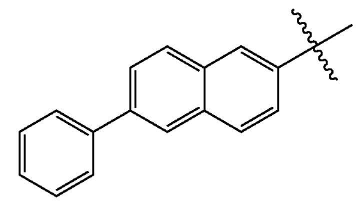 [SMILES: *c1ccc2cc(-c3ccccc3)ccc2c1] |
| 41-22 | 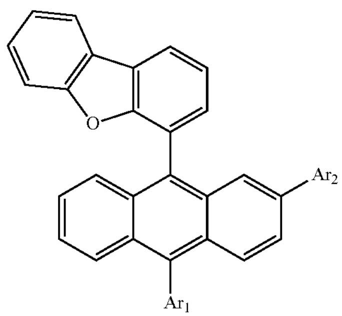 | 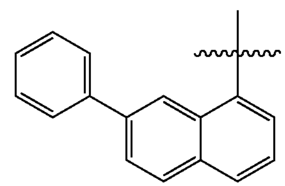 [SMILES: *c1cccc2ccc(-c3ccccc3)cc12] | 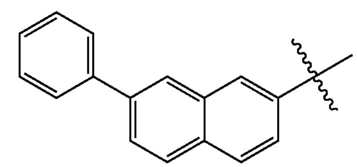 [SMILES: *c1ccc2ccc(-c3ccccc3)cc2c1] |

-continued
| No. | | Ar1 | Ar2 |
|---|---|---|---|
| 41-23 | 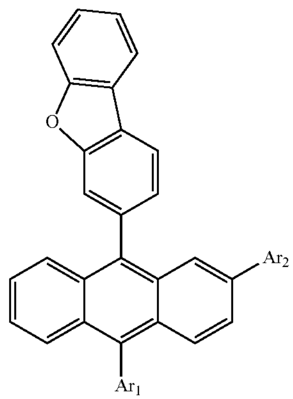 | 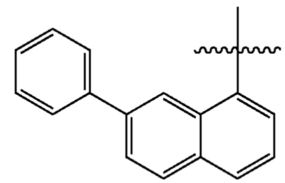 [SMILES: *c1cccc2ccc(-c3ccccc3)cc12] | 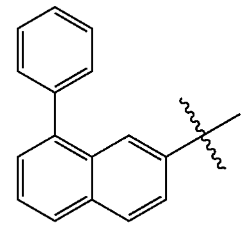 [SMILES: *c1ccc2cccc(-c3ccccc3)c2c1] |
| 41-24 | 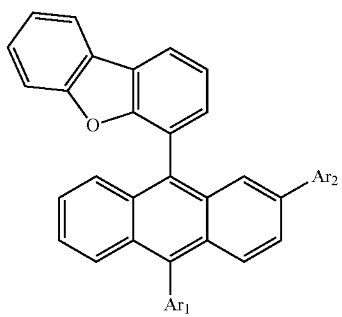 | 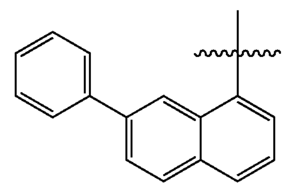 [SMILES: *c1cccc2ccc(-c3ccccc3)cc12] | 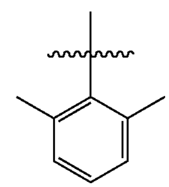 |

-continued
| No. | | Ar1 | Ar2 |
|---|---|---|---|
| 41-25 | 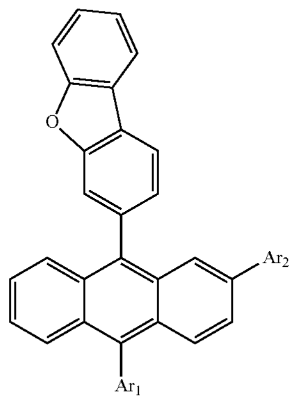 | 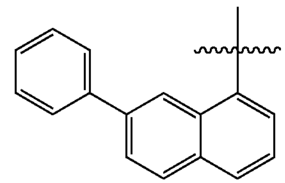 [SMILES: *c1cccc2ccc(-c3ccccc3)cc12] | 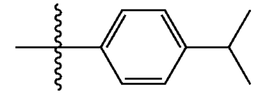 |
| 41-26 | 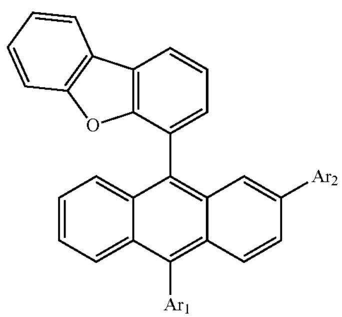 | 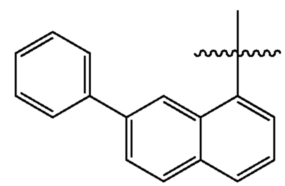 [SMILES: *c1cccc2ccc(-c3ccccc3)cc12] | 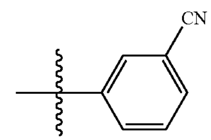 [SMILES: *c1cccc(C#N)c1] |

-continued
| No. | | Ar1 | Ar2 |
|---|---|---|---|
| 41-27 | 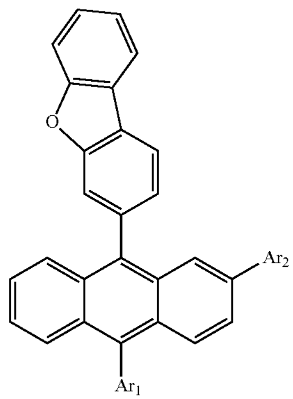 | 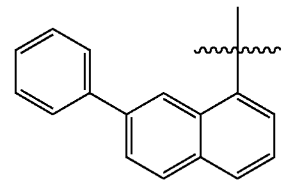 [SMILES: *c1cccc2ccc(-c3ccccc3)cc12] | 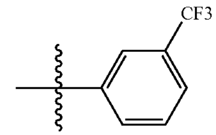 [SMILES: *c1cccc(C(F)(F)F)c1] |
| 41-28 | 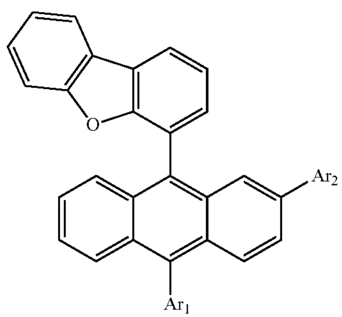 | 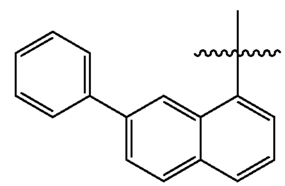 [SMILES: *c1cccc2ccc(-c3ccccc3)cc12] | 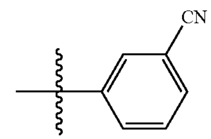 [SMILES: *c1cccc(C#N)c1] |

-continued
| No. | | Ar1 | Ar2 |
|---|---|---|---|
| 41-29 | 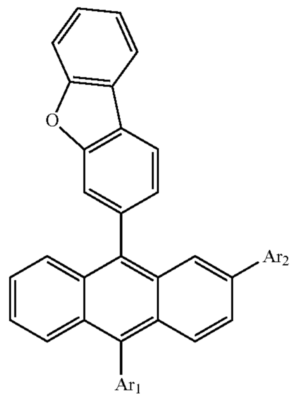 | 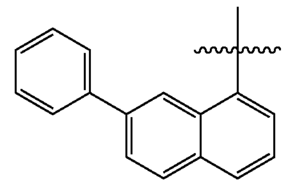 [SMILES: *c1cccc2ccc(-c3ccccc3)cc12] | 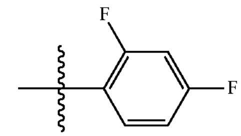 [SMILES: *c1ccc(F)cc1F] |
| 42-1 | 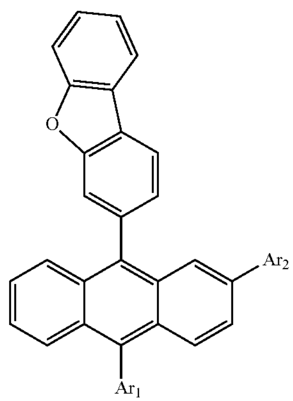 | 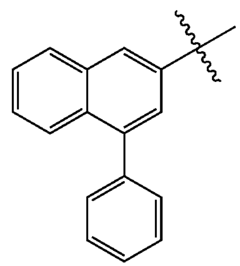 [SMILES: *c1cc(-c2ccccc2)c2ccccc2c1] | 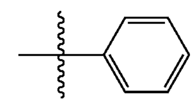 [SMILES: *c1ccccc1] |

-continued
| No. | | Ar1 | Ar2 |
|---|---|---|---|
| 42-2 | 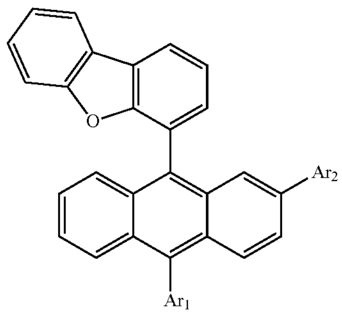 | 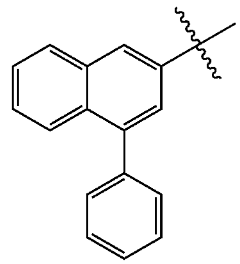 [SMILES: *c1cc(-c2ccccc2)c2ccccc2c1] | 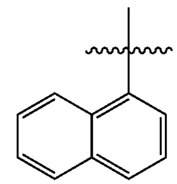 [SMILES: *c1cccc2ccccc12] |
| 42-3 | 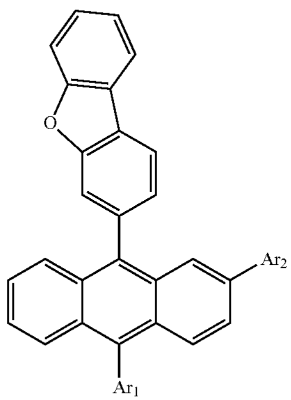 | 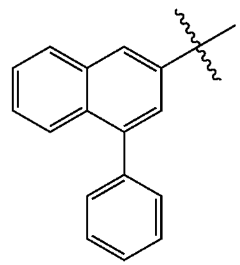 [SMILES: *c1cc(-c2ccccc2)c2ccccc2c1] | 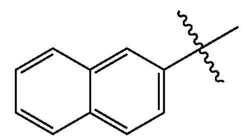 [SMILES: *c1ccc2ccccc2c1] |
| 42-4 | 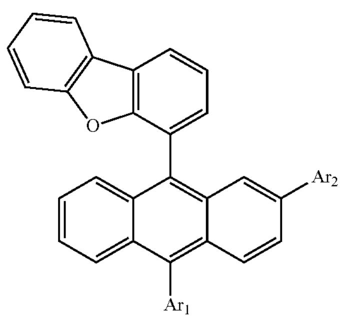 | 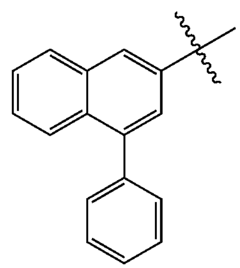 [SMILES: *c1cc(-c2ccccc2)c2ccccc2c1] | 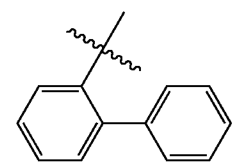 [SMILES: *c1ccccc1-c1ccccc1] |

-continued
| No. | | Ar1 | Ar2 |
|---|---|---|---|
| 42-5 | 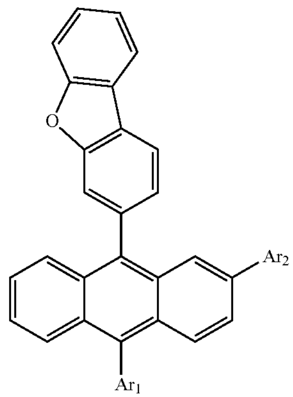 | 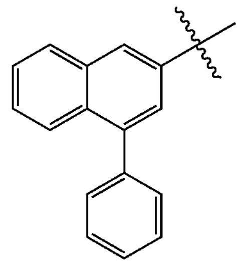 [SMILES: *c1cc(-c2ccccc2)c2ccccc2c1] | 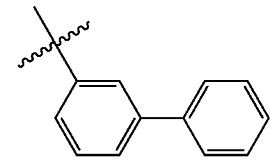 [SMILES: *c1cccc(-c2ccccc2)c1] |
| 42-6 | 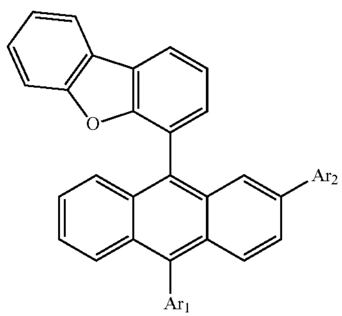 | 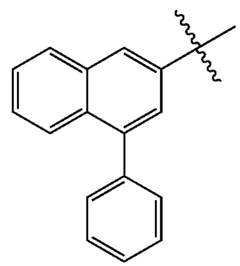 [SMILES: *c1cc(-c2ccccc2)c2ccccc2c1] | 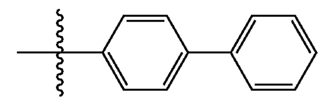 [SMILES: *c1ccc(-c2ccccc2)cc1] |

-continued
| No. | | Ar1 | Ar2 |
|---|---|---|---|
| 42-7 | 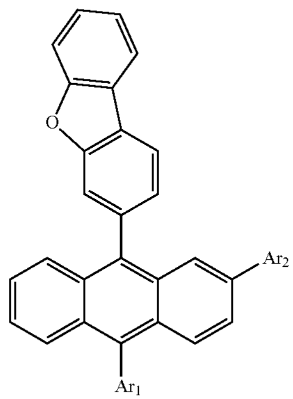 | 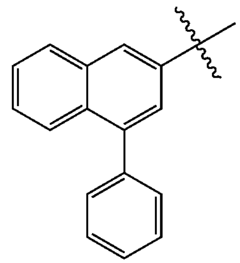 [SMILES: *c1cc(-c2ccccc2)c2ccccc2c1] | 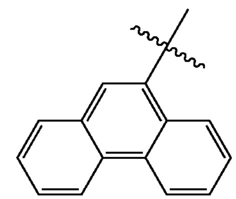 [SMILES: *c1cc2ccccc2c2ccccc12] |
| 42-8 | 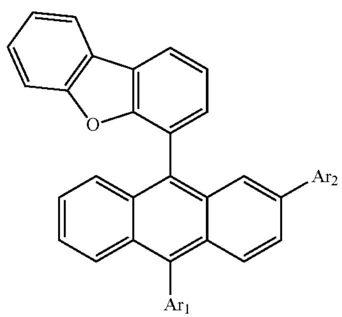 | 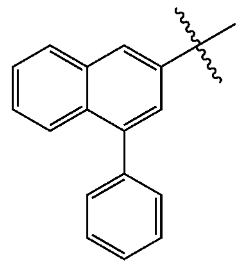 [SMILES: *c1cc(-c2ccccc2)c2ccccc2c1] | 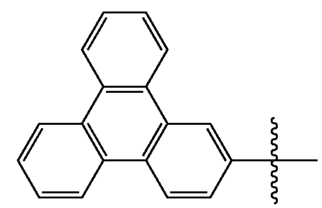 [SMILES: *c1ccc2c3ccccc3c3ccccc3c2c1] |

-continued
| No. | | Ar1 | Ar2 |
|---|---|---|---|
| 42-9 | 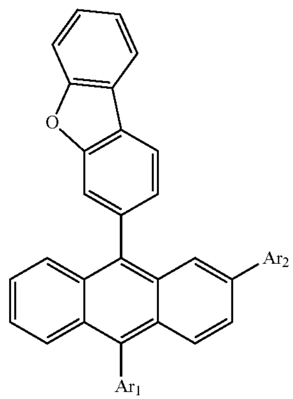 | 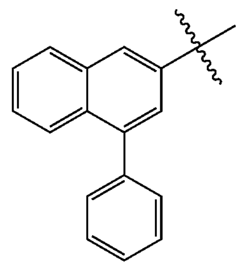 [SMILES: *c1cc(-c2ccccc2)c2ccccc2c1] | 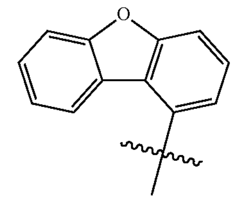 [SMILES: *c1cccc2oc3ccccc3c12] |
| 42-10 | 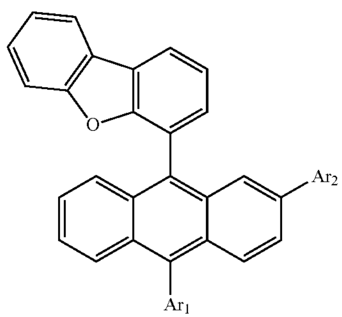 | 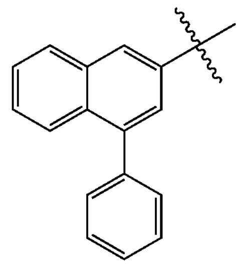 [SMILES: *c1cc(-c2ccccc2)c2ccccc2c1] | 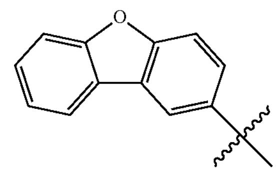 [SMILES: *c1ccc2oc3ccccc3c2c1] |

-continued
| No. | | Ar1 | Ar2 |
|---|---|---|---|
| 42-11 | 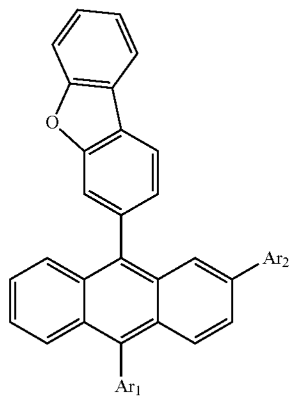 | 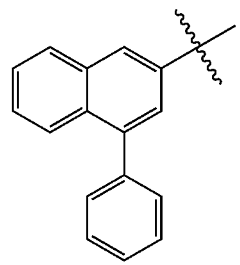 [SMILES: *c1cc(-c2ccccc2)c2ccccc2c1] | 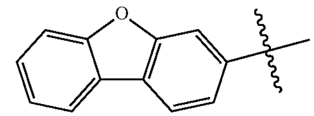 |
| 42-12 | 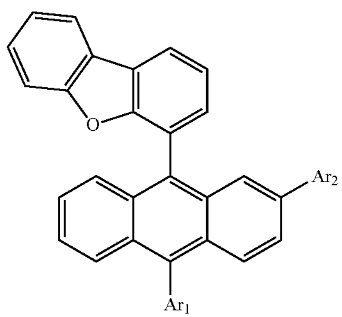 | 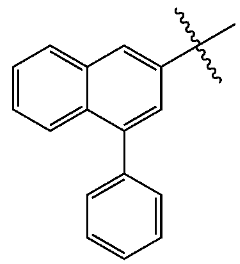 [SMILES: *c1cc(-c2ccccc2)c2ccccc2c1] | 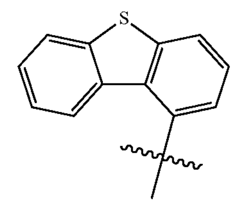 [SMILES: *c1cccc2sc3ccccc3c12] |

-continued
| No. | | Ar1 | Ar2 |
|---|---|---|---|
| 42-13 | 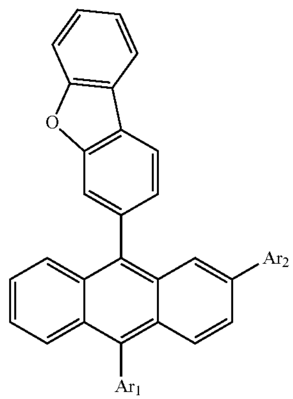 | 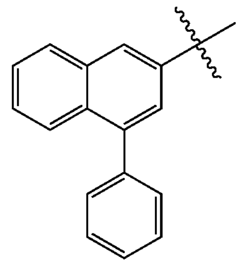 [SMILES: *c1cc(-c2ccccc2)c2ccccc2c1] | 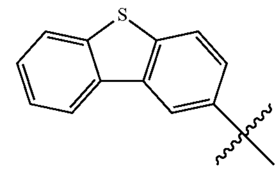 |
| 42-14 | 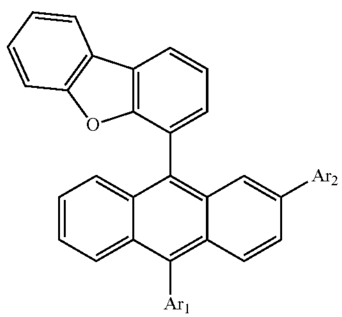 | 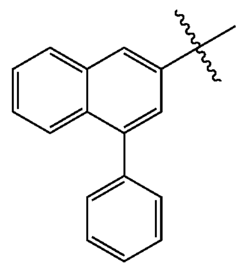 [SMILES: *c1cc(-c2ccccc2)c2ccccc2c1] | 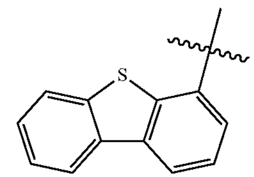 [SMILES: *c1cccc2c1sc1ccccc12] |

-continued
| No. | | Ar1 | Ar2 |
|---|---|---|---|
| 42-15 | 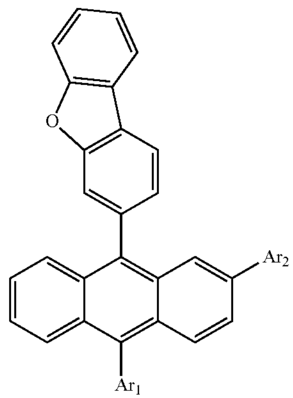 | 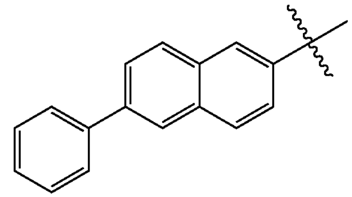 [SMILES: *c1ccc2cc(-c3ccccc3)ccc2c1] | 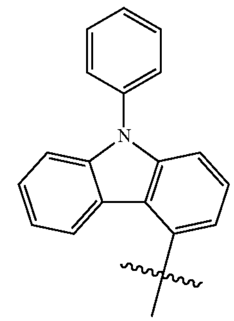 [SMILES: *c1cccc2c1c1ccccc1n2-c1ccccc1] |
| 42-16 | 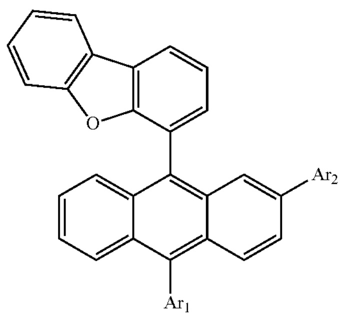 | 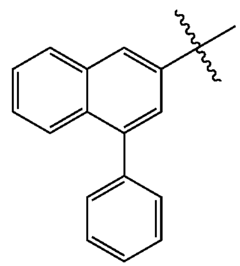 [SMILES: *c1cc(-c2ccccc2)c2ccccc2c1] | 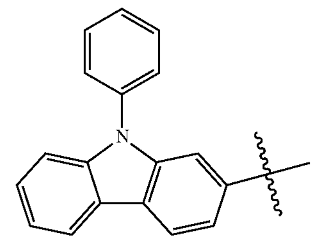 [SMILES: *c1ccc2c3ccccc3n(-c3ccccc3)c2c1] |

-continued
| No. | | Ar1 | Ar2 |
|---|---|---|---|
| 42-17 | 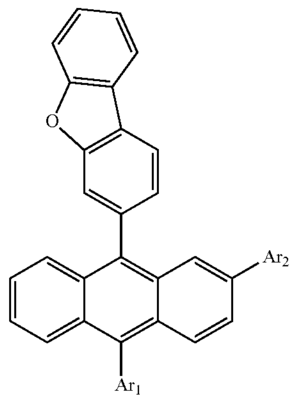 | 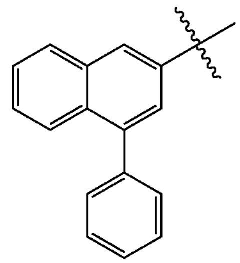 [SMILES: *c1cc(-c2ccccc2)c2ccccc2c1] | 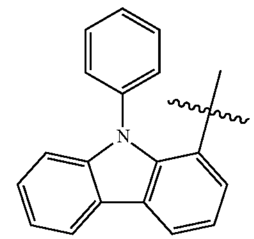 [SMILES: *c1cccc2c3ccccc3n(-c3ccccc3)c12] |
| 42-18 | 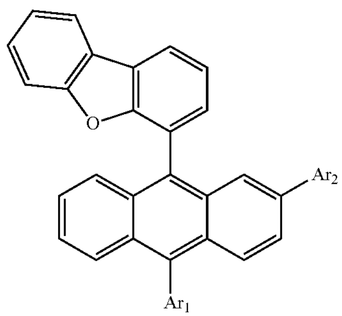 | 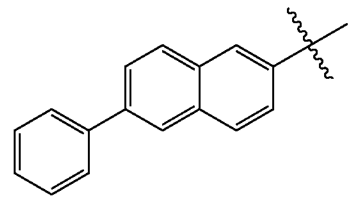 [SMILES: *c1ccc2cc(-c3ccccc3)ccc2c1] | 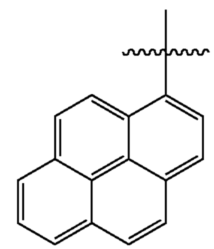 [SMILES: *c1ccc2ccc3cccc4ccc1c2c34] |

-continued
| No. | | Ar1 | Ar2 |
|---|---|---|---|
| 42-19 | 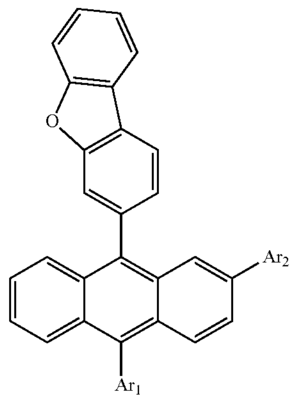 | 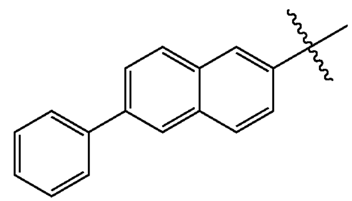 [SMILES: *c1ccc2cc(-c3ccccc3)ccc2c1] | 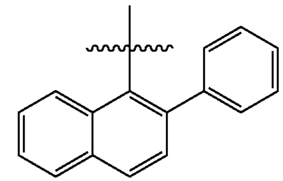 [SMILES: *c1c(-c2ccccc2)ccc2ccccc12] |
| 42-20 | 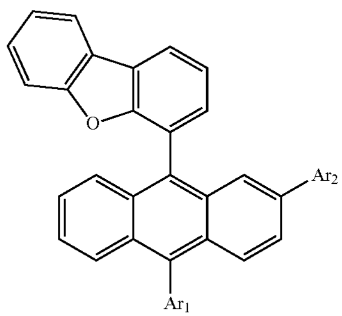 | 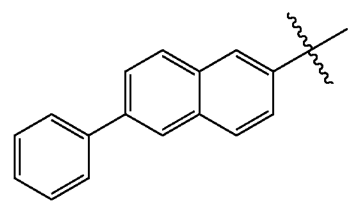 [SMILES: *c1ccc2cc(-c3ccccc3)ccc2c1] | 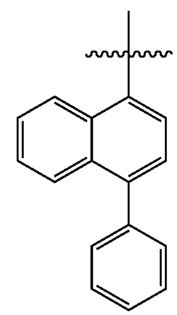 [SMILES: *c1ccc(-c2ccccc2)c2ccccc12] |

-continued
| No. | | Ar1 | Ar2 |
|---|---|---|---|
| 42-21 | 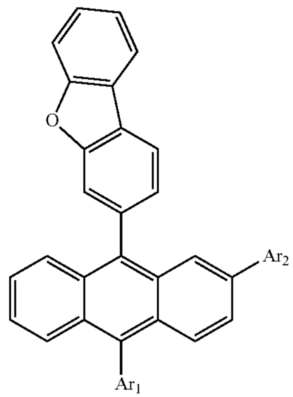 | 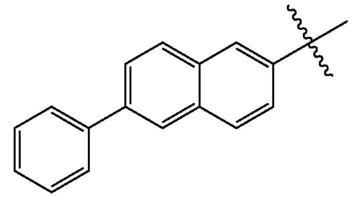 [SMILES: *c1ccc2cc(-c3ccccc3)ccc2c1] | 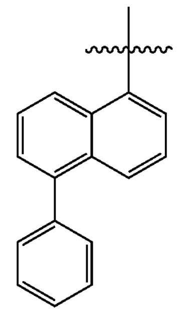 [SMILES: *c1cccc2c(-c3ccccc3)cccc12] |
| 42-22 | 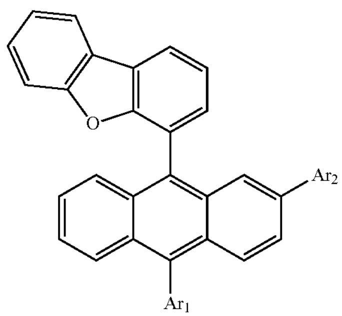 | 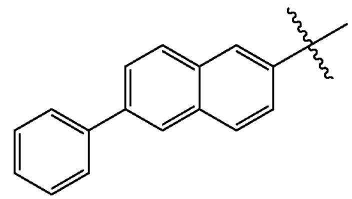 [SMILES: *c1ccc2cc(-c3ccccc3)ccc2c1] | 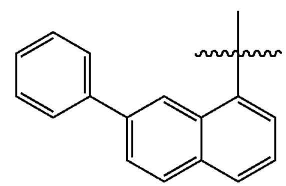 [SMILES: *c1cccc2ccc(-c3ccccc3)cc12] |

-continued
| No. | | Ar1 | Ar2 |
|---|---|---|---|
| 42-23 | 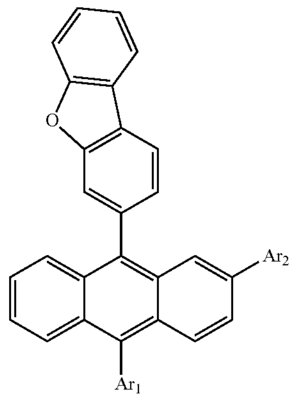 | 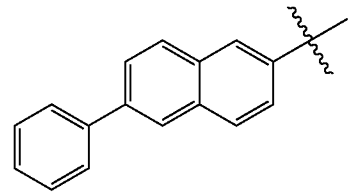 [SMILES: *c1ccc2cc(-c3ccccc3)ccc2c1] | 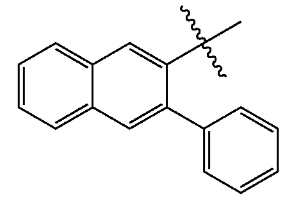 [SMILES: *c1cc2ccccc2cc1-c1ccccc1] |
| 42-24 | 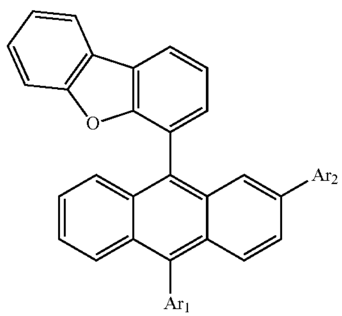 | 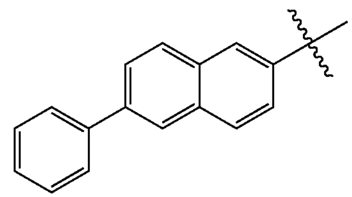 [SMILES: *c1ccc2cc(-c3ccccc3)ccc2c1] | 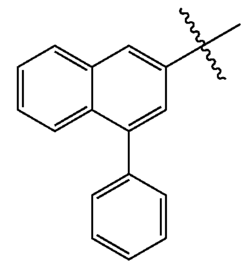 [SMILES: *c1cc(-c2ccccc2)c2ccccc2c1] |

-continued
| No. | | Ar1 | Ar2 |
|---|---|---|---|
| 42-25 | 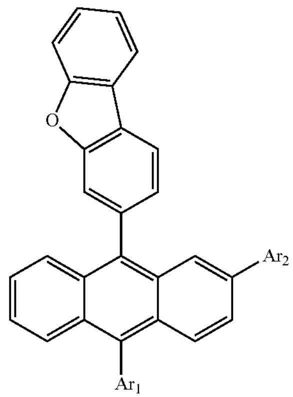 | 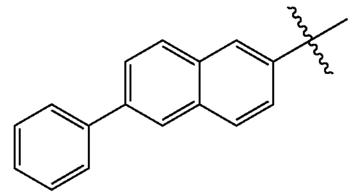 [SMILES: *c1ccc2cc(-c3ccccc3)ccc2c1] | 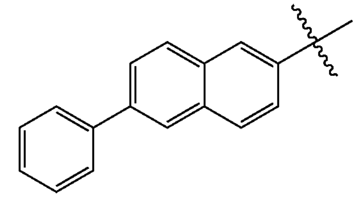 [SMILES: *c1ccc2cc(-c3ccccc3)ccc2c1] |
| 42-26 | 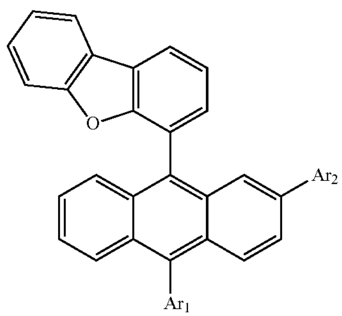 | 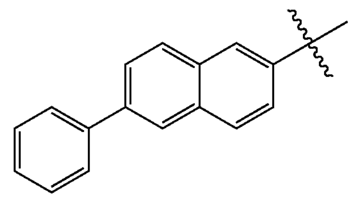 [SMILES: *c1ccc2cc(-c3ccccc3)ccc2c1] | 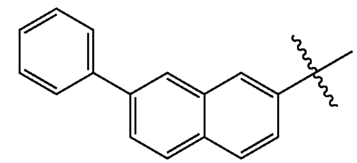 [SMILES: *c1ccc2ccc(-c3ccccc3)cc2c1] |

-continued
| No. | | Ar1 | Ar2 |
|---|---|---|---|
| 42-27 | 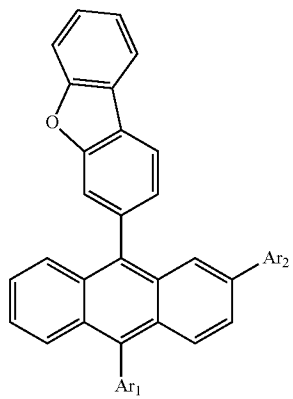 | 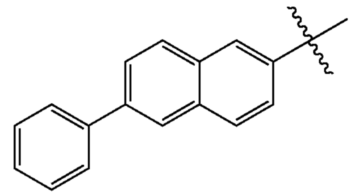 [SMILES: *c1ccc2cc(-c3ccccc3)ccc2c1] | 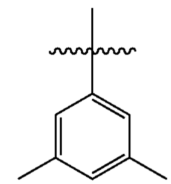 |
| 42-28 | 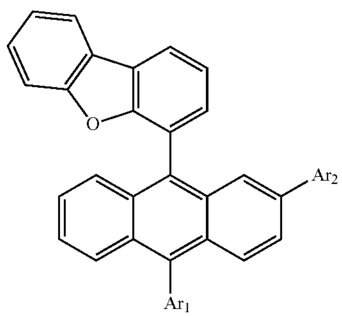 | 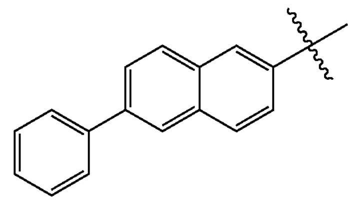 [SMILES: *c1ccc2cc(-c3ccccc3)ccc2c1] | 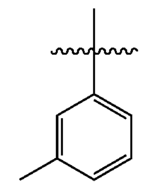 [SMILES: *c1cccc(C)c1] |

-continued
| No. | | Ar1 | Ar2 |
|---|---|---|---|
| 42-29 | 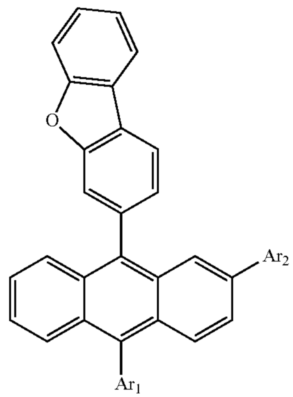 | 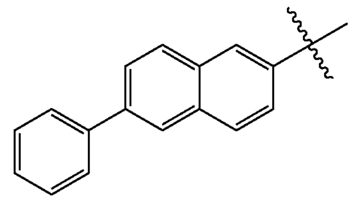 [SMILES: *c1ccc2cc(-c3ccccc3)ccc2c1] | 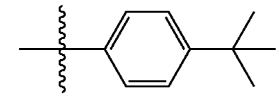 [SMILES: *c1ccc(C(C)(C)C)cc1] |
| 42-30 | 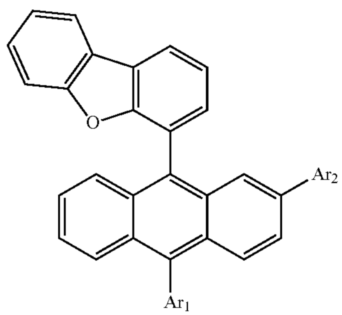 | 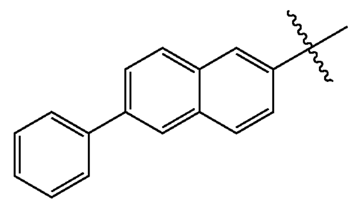 [SMILES: *c1ccc2cc(-c3ccccc3)ccc2c1] | 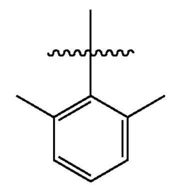 |

-continued
| No. | | Ar1 | Ar2 |
|---|---|---|---|
| 42-31 | 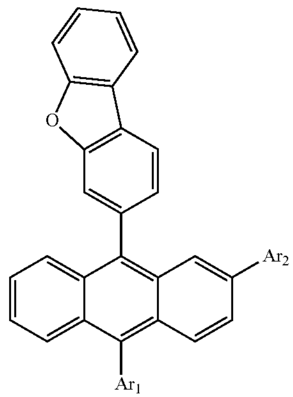 | 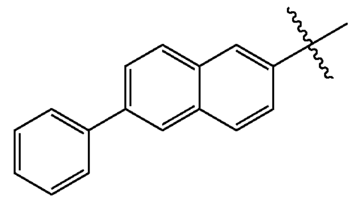 [SMILES: *c1ccc2cc(-c3ccccc3)ccc2c1] | 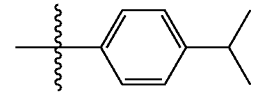 [SMILES: *c1ccc(C(C)C)cc1] |
| 43-1 | 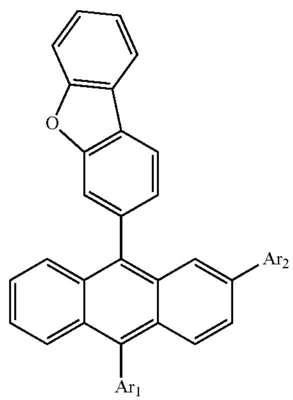 | 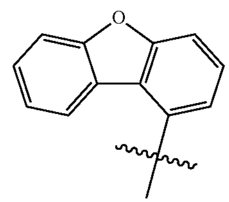 [SMILES: *c1cccc2oc3ccccc3c12] | 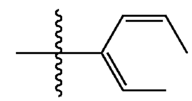 [SMILES: *C(/C=C\C)=C/C] |

-continued
| No. | | Ar1 | Ar2 |
|---|---|---|---|
| 43-2 | 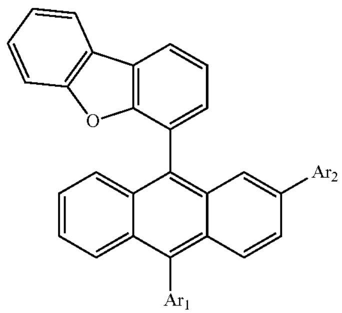 | 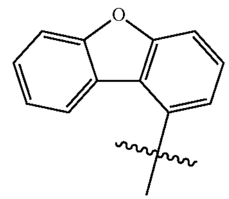 [SMILES: *c1cccc2oc3ccccc3c12] | 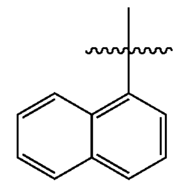 [SMILES: *c1cccc2ccccc12] |
| 43-3 | 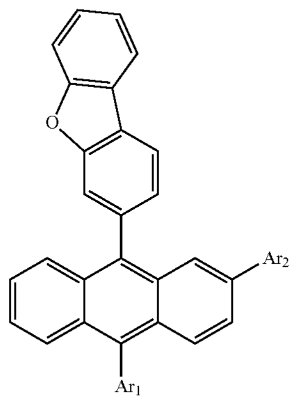 | 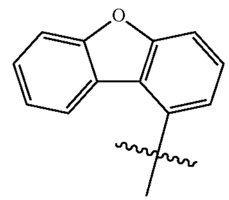 [SMILES: *c1cccc2oc3ccccc3c12] | 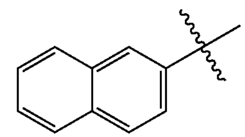 [SMILES: *c1ccc2ccccc2c1] |
| 43-4 | 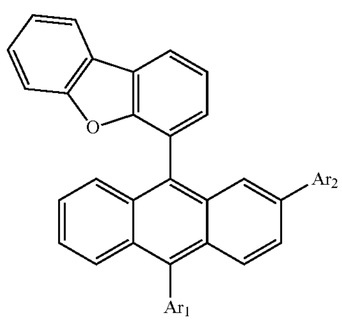 | 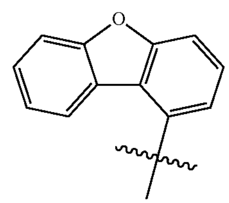 | 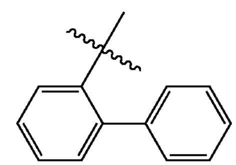 [SMILES: *c1ccccc1-c1ccccc1] |

-continued
| No. | | Ar1 | Ar2 |
|---|---|---|---|
| 43-5 | 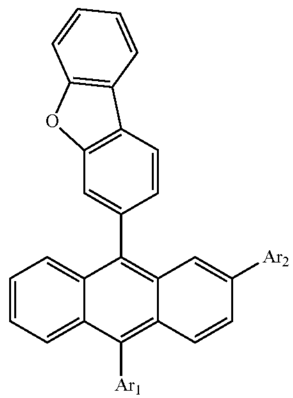 | 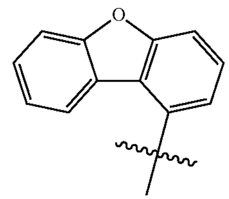 [SMILES: *c1cccc2oc3ccccc3c12] | 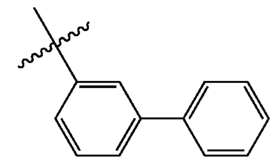 [SMILES: *c1cccc(-c2ccccc2)c1] |
| 43-6 | 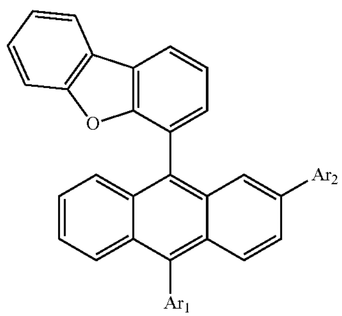 | 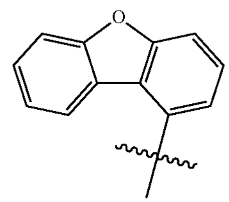 [SMILES: *c1cccc2oc3ccccc3c12] | 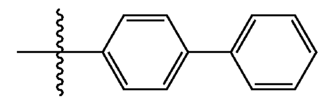 [SMILES: *c1ccc(-c2ccccc2)cc1] |

-continued
| No. | | Ar1 | Ar2 |
|---|---|---|---|
| 43-7 | 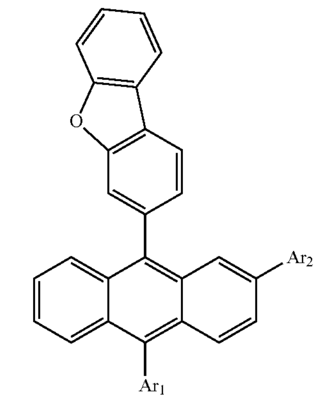  | 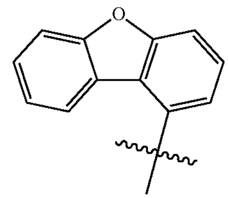 [SMILES: *c1cccc2oc3ccccc3c12]  | 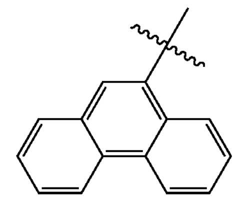 [SMILES: *c1cc2ccccc2c2ccccc12] |
| 43-8 | 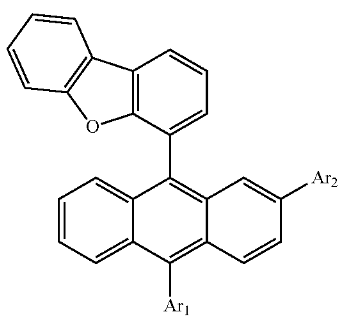  | 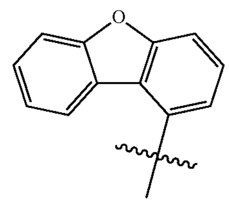 [SMILES: *c1cccc2oc3ccccc3c12]  | 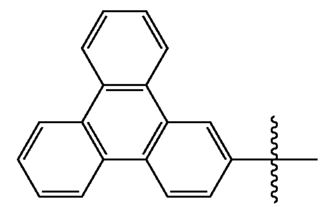 [SMILES: *c1ccc2c3ccccc3c3ccccc3c2c1] |

-continued
| No. | | Ar1 | Ar2 |
|---|---|---|---|
| 43-0 | 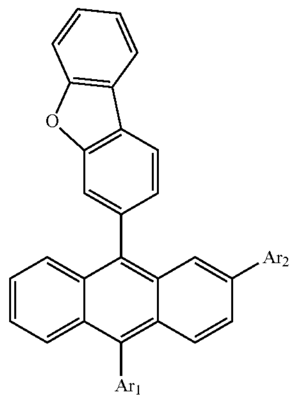 | 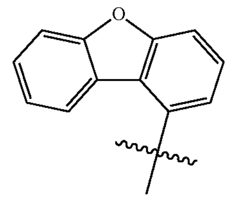 [SMILES: *c1cccc2oc3ccccc3c12] | 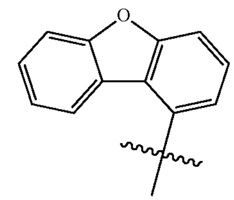 [SMILES: *c1cccc2oc3ccccc3c12] |
| 43-10 | 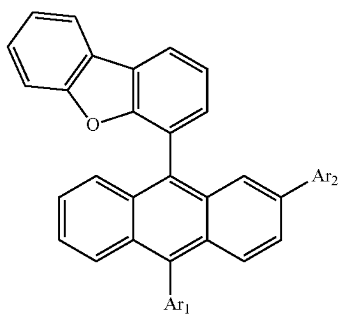 | 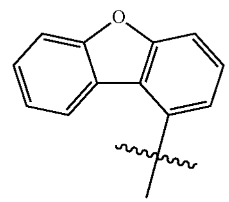 [SMILES: *c1cccc2oc3ccccc3c12] | 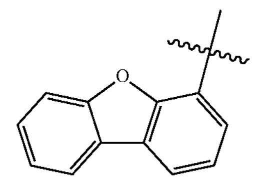 [SMILES: *c1cccc2c1oc1ccccc12] |

-continued
| No. | | Ar1 | Ar2 |
|---|---|---|---|
| 43-11 | 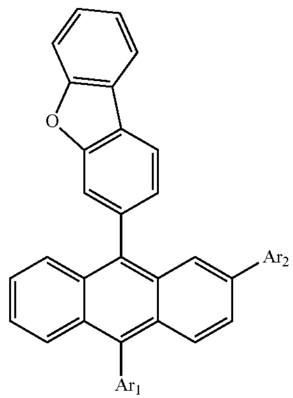 | 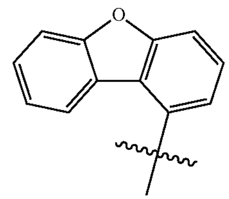 [SMILES: *c1cccc2oc3ccccc3c12] | 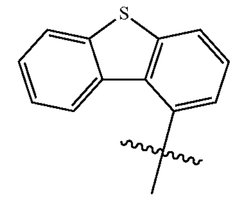 |
| 43-12 | 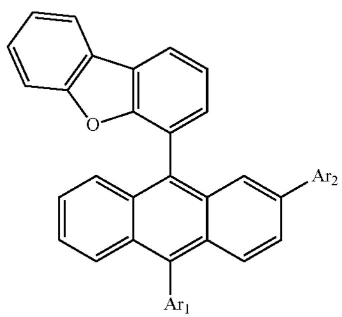 | 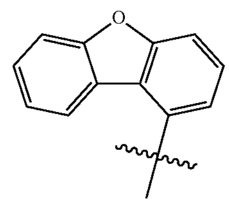 [SMILES: *c1cccc2oc3ccccc3c12] | 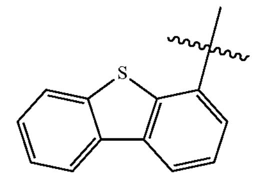 |

-continued
| No. | | Ar1 | Ar2 |
|---|---|---|---|
| 43-13 | 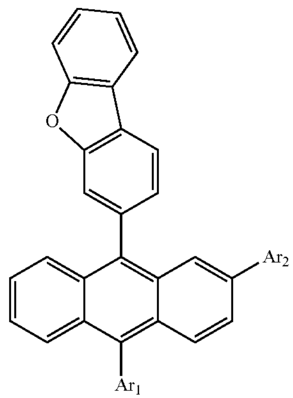 | 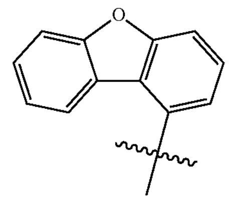 [SMILES: *c1cccc2oc3ccccc3c12] | 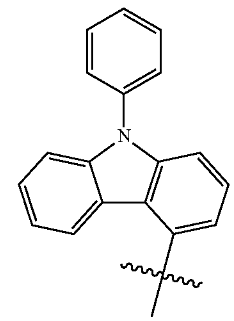 [SMILES: *c1cccc2c1c1ccccc1n2-c1ccccc1] |
| 43-14 | 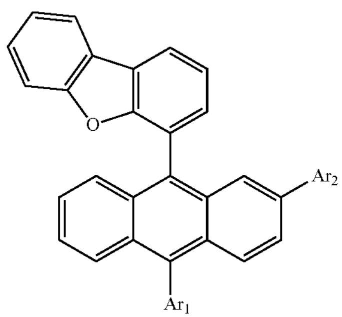 | 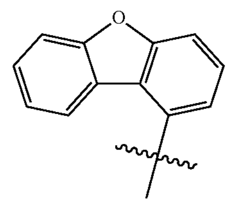 [SMILES: *c1cccc2oc3ccccc3c12] | 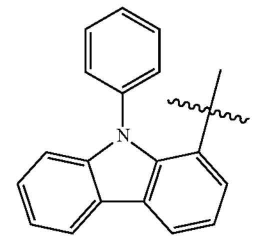 [SMILES: *c1cccc2c3ccccc3n(-c3ccccc3)c12] |

-continued
| No. | | Ar1 | Ar2 |
|---|---|---|---|
| 43-15 | 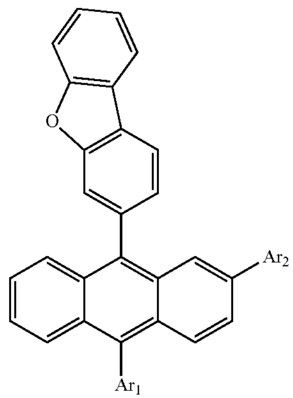 | 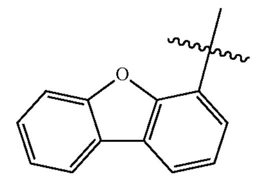 [SMILES: *c1cccc2c1oc1ccccc12] | 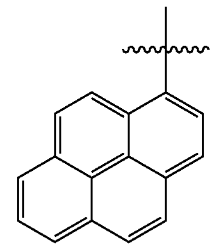 [SMILES: *c1ccc2ccc3cccc4ccc1c2c34] |
| 43-16 | 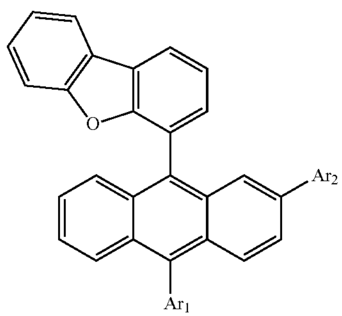 | 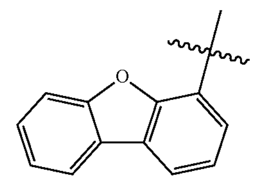 [SMILES: *c1cccc2c1oc1ccccc12] | 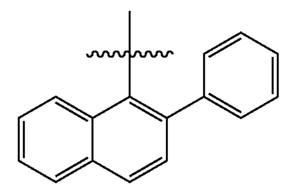 [SMILES: *c1c(-c2ccccc2)ccc2ccccc12] |

-continued
| No. | | Ar1 | Ar2 |
|---|---|---|---|
| 43-17 | 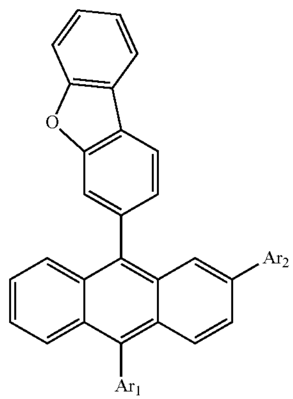 | 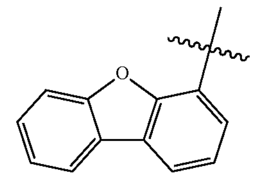 [SMILES: *c1cccc2c1oc1ccccc12] | 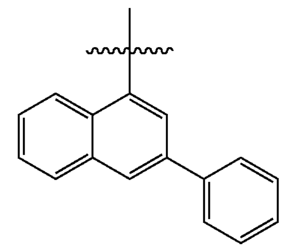 [SMILES: *c1cc(-c2ccccc2)cc2ccccc12] |
| 43-18 | 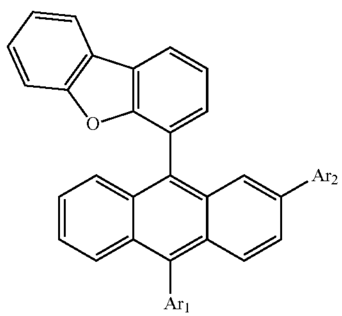 | 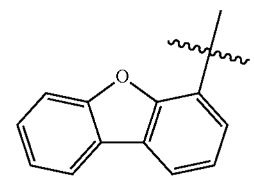 [SMILES: *c1cccc2c1oc1ccccc12] | 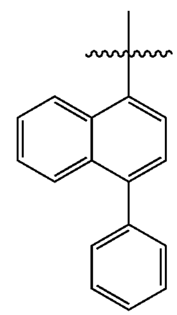 [SMILES: *c1ccc(-c2ccccc2)c2ccccc12] |

-continued
| No. | | Ar1 | Ar2 |
|---|---|---|---|
| 43-19 | 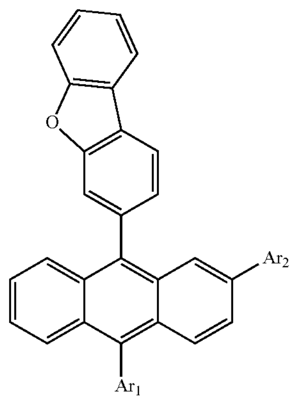 | 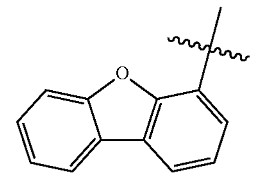 [SMILES: *c1cccc2c1oc1ccccc12] | 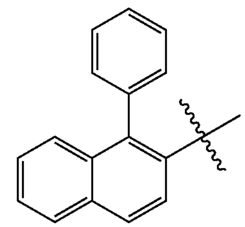 [SMILES: *c1ccc2ccccc2c1-c1ccccc1] |
| 43-20 | 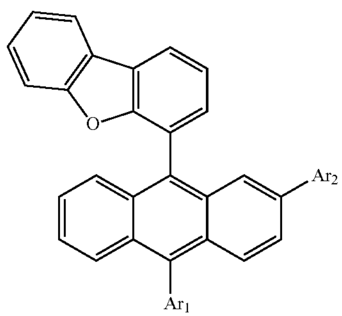 | 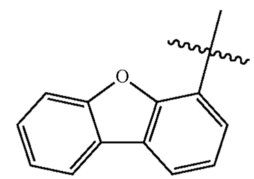 [SMILES: *c1cccc2c1oc1ccccc12] | 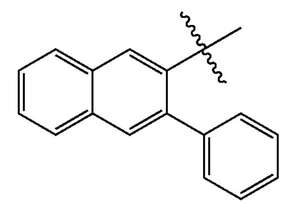 [SMILES: *c1cc2ccccc2cc1-c1ccccc1] |

-continued
| No. | | Ar1 | Ar2 |
|---|---|---|---|
| 43-21 | 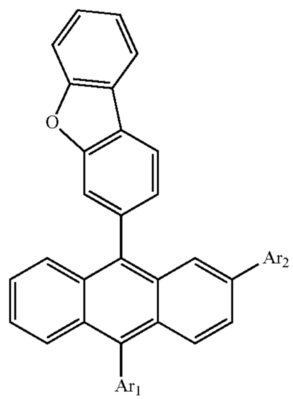 | 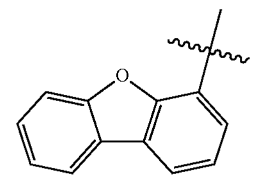 [SMILES: *c1cccc2c1oc1ccccc12] | 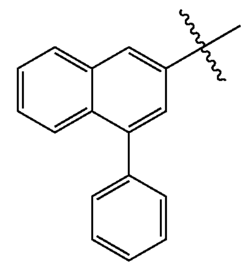 [SMILES: *c1cc(-c2ccccc2)c2ccccc2c1] |
| 43-22 | 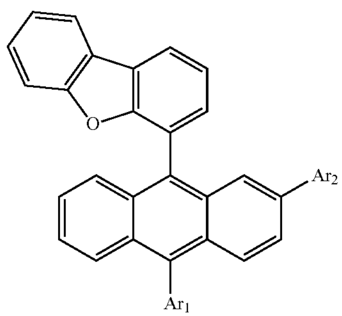 | 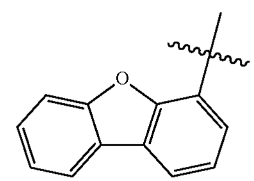 [SMILES: *c1cccc2c1oc1ccccc12] | 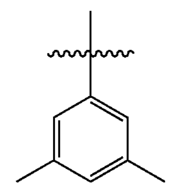 |

-continued
| No. | | Ar1 | Ar2 |
|---|---|---|---|
| 43-23 | 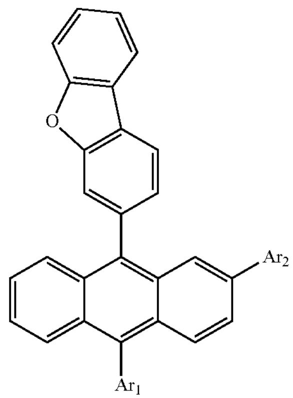 | 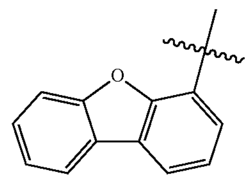 [SMILES: *c1cccc2c1oc1ccccc12] | 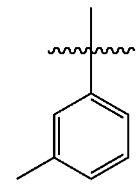 [SMILES: *c1cccc(C)c1] |
| 43-24 | 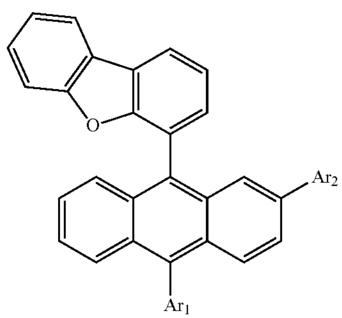 | 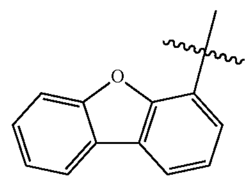 [SMILES: *c1cccc2c1oc1ccccc12] | 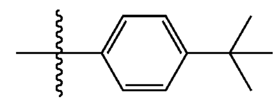 |

-continued
| No. | | Ar1 | Ar2 |
|---|---|---|---|
| 43-25 | 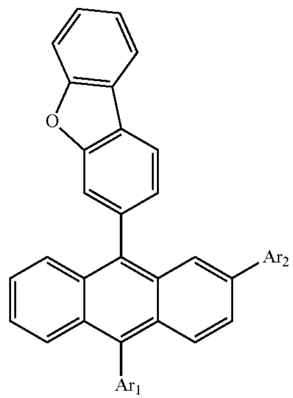 | 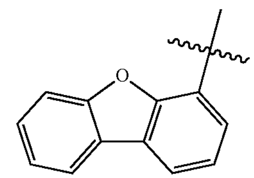 [SMILES: *c1cccc2c1oc1ccccc12] | 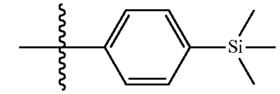 [SMILES: *c1ccc([Si](C)(C)C)cc1] |
| 43-26 | 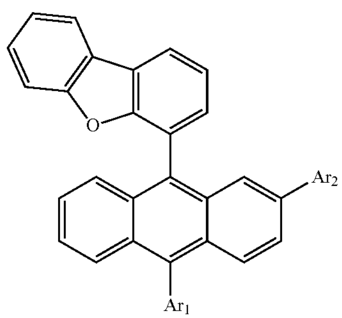 | 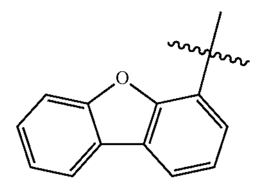 | 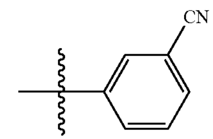 [SMILES: *c1cccc(C#N)c1] |

-continued
| No. | | Ar1 | Ar2 |
|---|---|---|---|
| 43-27 | 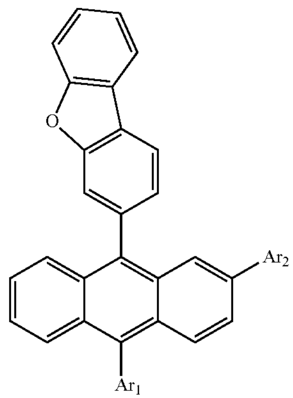 | 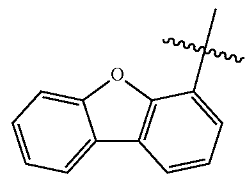 | 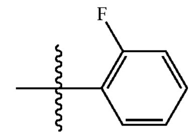 [SMILES: *c1ccccc1F] |
| 43-28 | 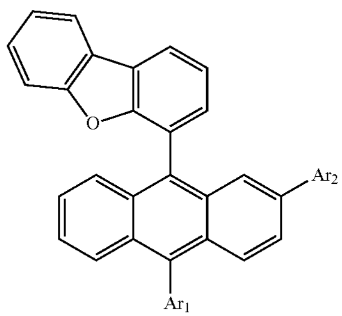 | 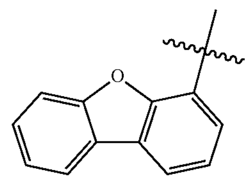 | 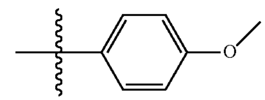 |

-continued
| No. | | Ar1 | Ar2 |
|---|---|---|---|
| 44-1 | 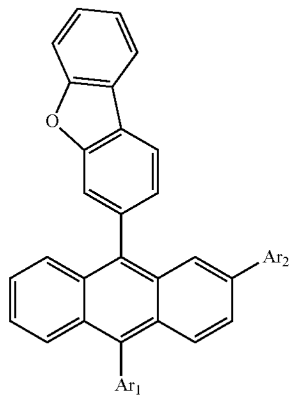 | 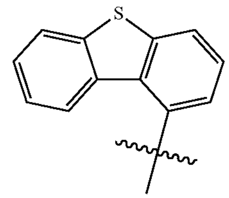 [SMILES: *c1cccc2sc3ccccc3c12] | 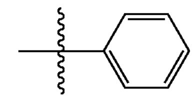 [SMILES: *c1ccccc1] |
| 44-2 | 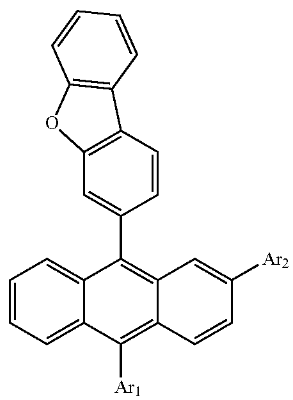 | 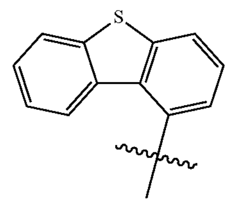 | 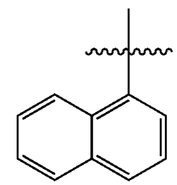 [SMILES: *c1cccc2ccccc12] |

-continued
| No. | | Ar1 | Ar2 |
| --- | --- | --- | --- |
| 44-3 | 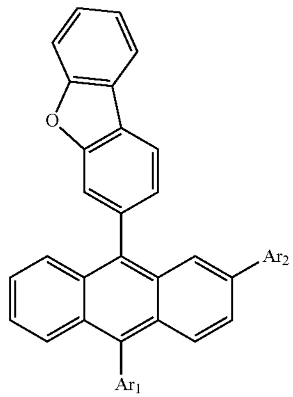 | 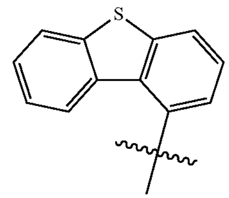 [SMILES: *c1cccc2sc3ccccc3c12] | 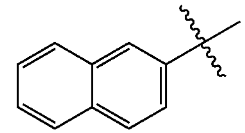 [SMILES: *c1ccc2ccccc2c1] |
| 44-4 | 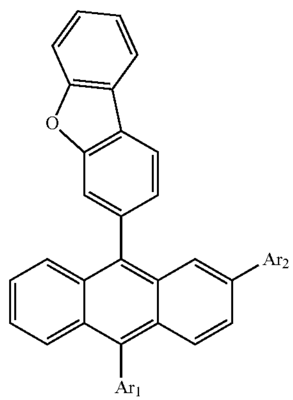 | 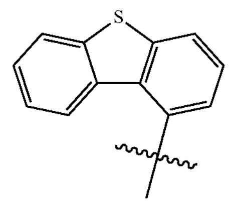 | 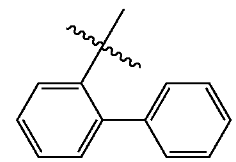 [SMILES: *c1ccccc1-c1ccccc1] |

-continued
| No. | | Ar1 | Ar2 |
| --- | --- | --- | --- |
| 44-5 | 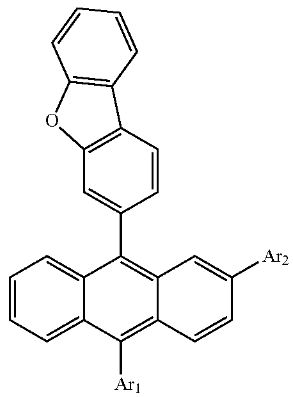 | 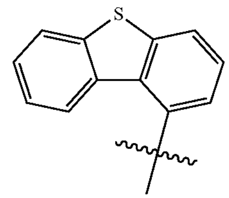 [SMILES: *c1cccc2sc3ccccc3c12] | 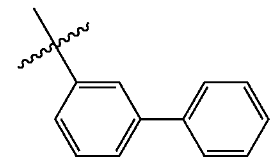 [SMILES: *c1cccc(-c2ccccc2)c1] |
| 44-6 | 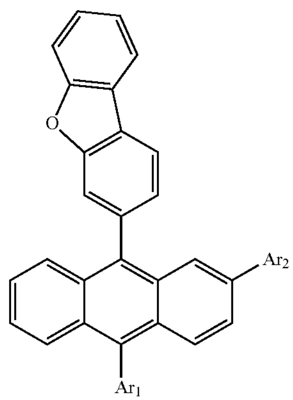 | 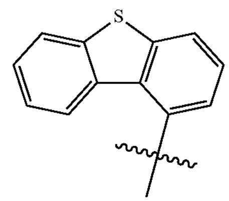 | 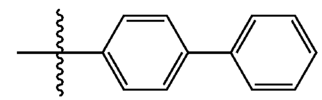 |

-continued
| No. | | Ar1 | Ar2 |
|---|---|---|---|
| 44-7 | 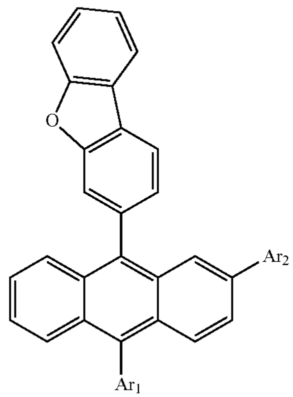 | 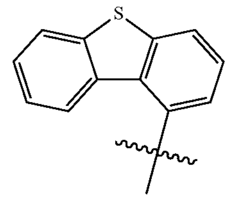 [SMILES: *c1cccc2sc3ccccc3c12] | 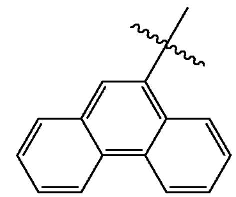 [SMILES: *c1cc2ccccc2c2ccccc12] |
| 44-8 | 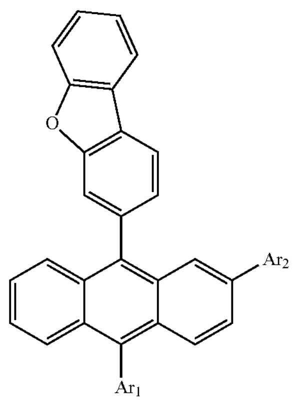 | 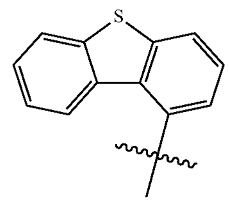 | 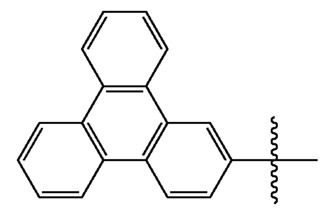 [SMILES: *c1ccc2c3ccccc3c3ccccc3c2c1] |

-continued
| No. | | Ar1 | Ar2 |
|---|---|---|---|
| 44-9 | 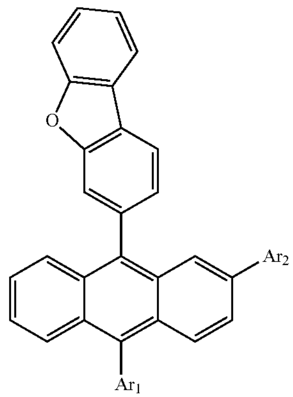 | 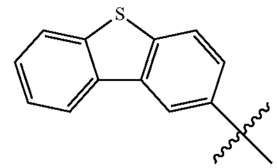 | 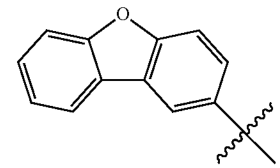 [SMILES: *c1ccc2oc3ccccc3c2c1] |
| 44-10 | 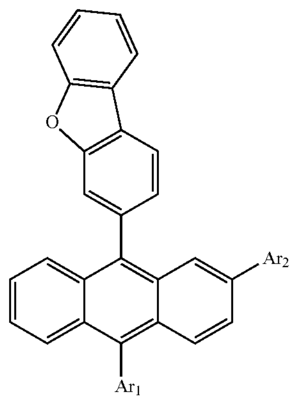 | 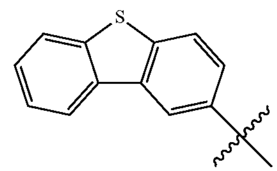 | 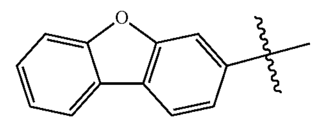 [SMILES: *c1ccc2c(c1)oc1ccccc12] |

-continued
| No. | | Ar1 | Ar2 |
|---|---|---|---|
| 44-11 | 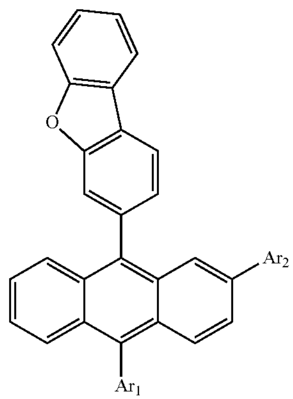 | 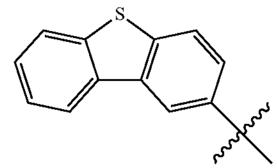 | 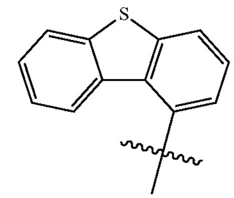 [SMILES: *c1cccc2sc3ccccc3c12] |
| 44-12 | 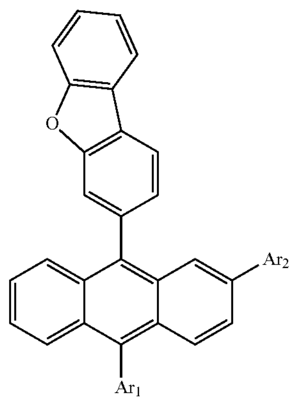 | 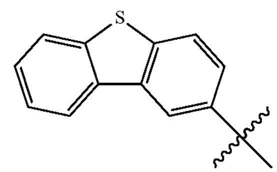 | 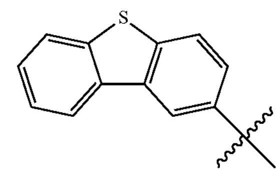 |

-continued
| No. | | Ar1 | Ar2 |
|---|---|---|---|
| 44-13 | 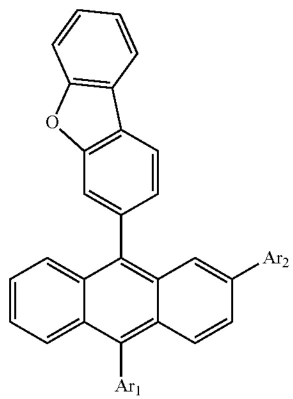 | 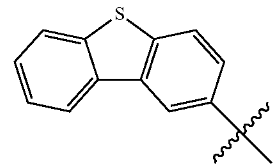 | 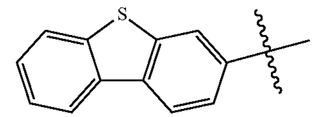 [SMILES: *c1ccc2c(c1)sc1ccccc12] |
| 44-14 | 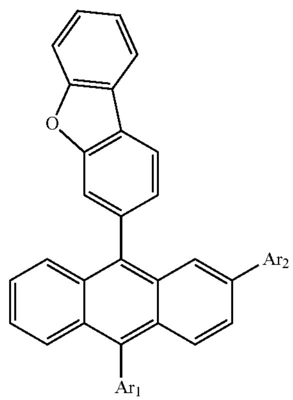 | 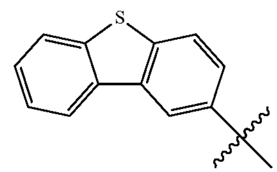 | 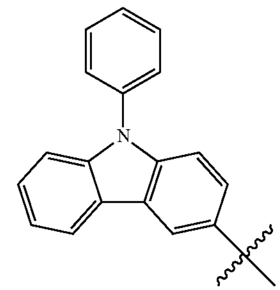 [SMILES: *c1ccc2c(c1)c1ccccc1n2-c1ccccc1] |

-continued
| No. | | Ar1 | Ar2 |
|---|---|---|---|
| 44-15 | 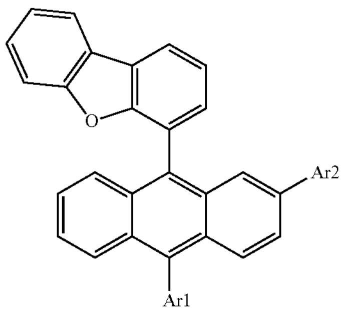  | 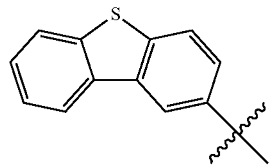  | 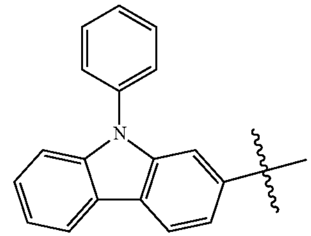 [SMILES: *c1ccc2c3ccccc3n(-c3ccccc3)c2c1]  |
| 44-16 | 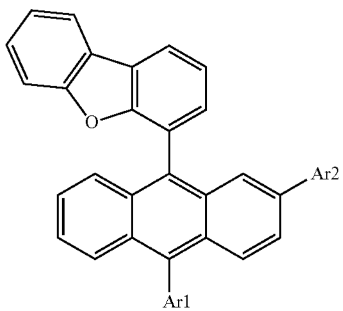  | 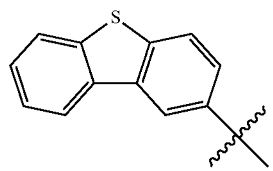  | 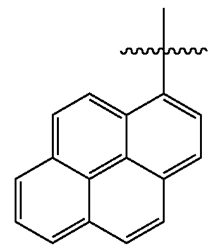 [SMILES: *c1ccc2ccc3cccc4ccc1c2c34] |
| 44-17 | 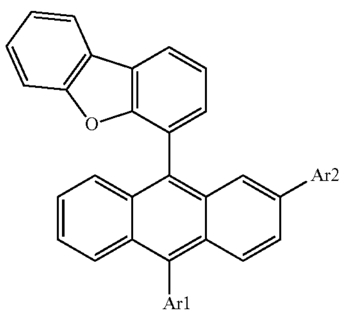  | 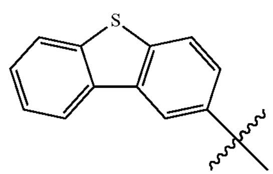  | 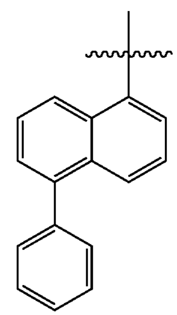 [SMILES: *c1cccc2c(-c3ccccc3)cccc12] |

-continued
| No. | | Ar1 | Ar2 |
|---|---|---|---|
| 44-18 | 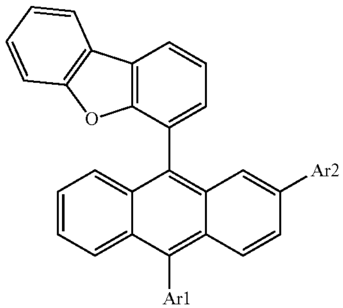 | 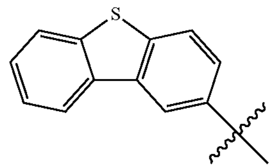 | 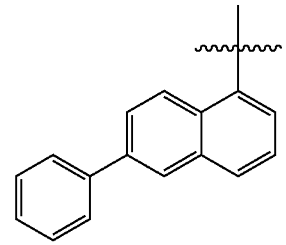 [SMILES: *c1cccc2cc(-c3ccccc3)ccc12] |
| 44-19 | 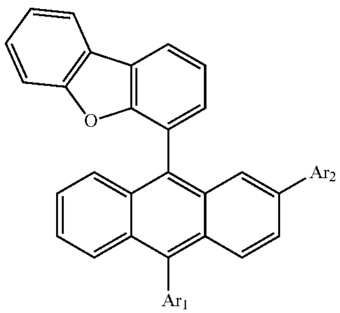 | 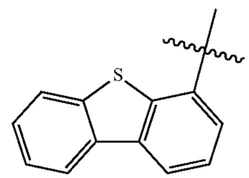 | 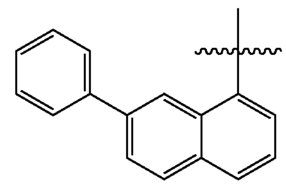 [SMILES: *c1cccc2ccc(-c3ccccc3)cc12] |
| 44-20 | 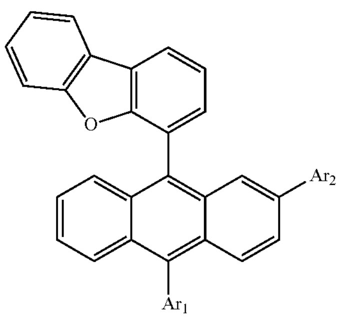 | 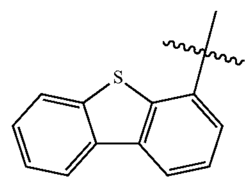 [SMILES: *c1cccc2c1sc1ccccc12] | 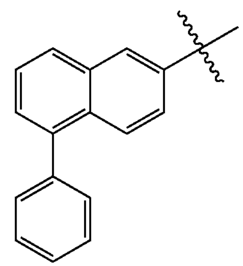 [SMILES: *c1ccc2c(-c3ccccc3)cccc2c1] |

-continued
| No. | | Ar1 | Ar2 |
|---|---|---|---|
| 44-21 | 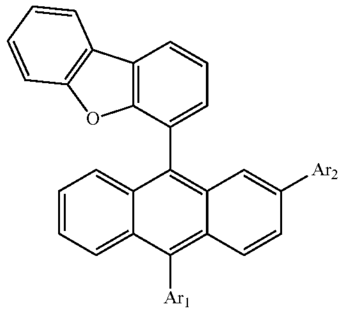 | 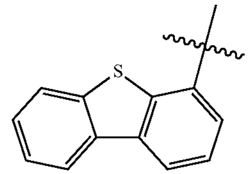 [SMILES: *c1cccc2c1sc1ccccc12] | 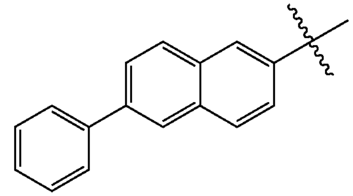 [SMILES: *c1ccc2cc(-c3ccccc3)ccc2c1] |
| 44-22 | 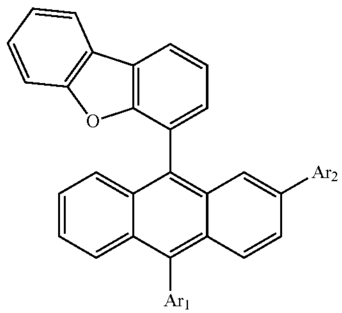 | 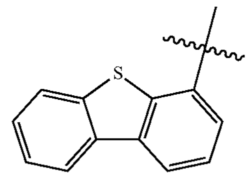 | 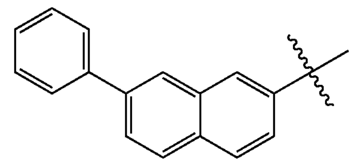 [SMILES: *c1ccc2ccc(-c3ccccc3)cc2c1] |
| 44-23 | 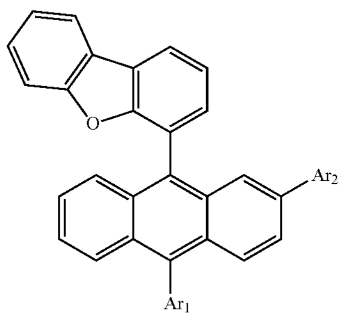 | 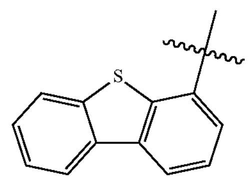 | 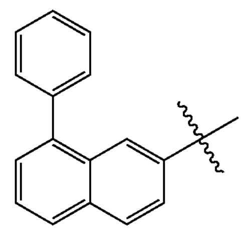 [SMILES: *c1ccc2cccc(-c3ccccc3)c2c1] |

-continued
| No. | | Ar1 | Ar2 |
|---|---|---|---|
| 44-24 | 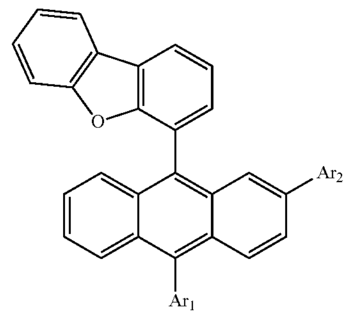 | 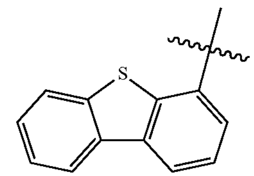 [SMILES: *c1cccc2c1sc1ccccc12] | 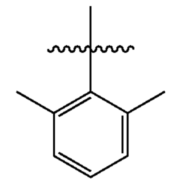 |
| 44-25 | 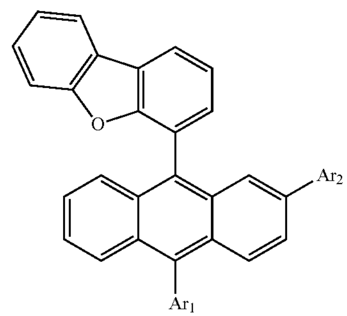 | 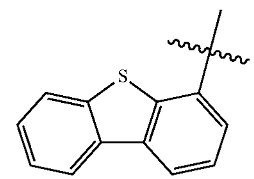 [SMILES: *c1cccc2c1sc1ccccc12] | 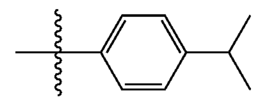 |
| 44-26 | 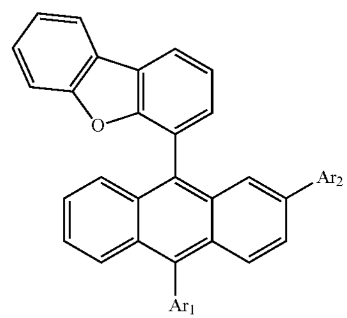 | 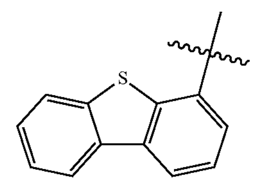 | 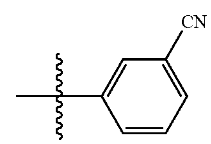 [SMILES: *c1cccc(C#N)c1] |

-continued
| No. | | Ar1 | Ar2 |
| --- | --- | --- | --- |
| 44-27 | 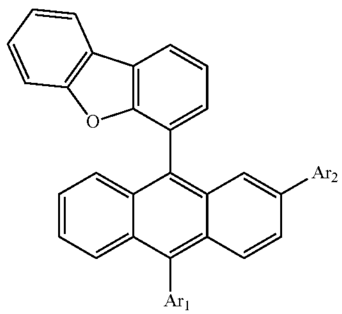 | 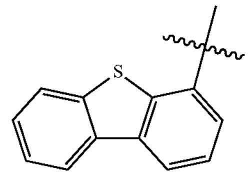 [SMILES: *c1cccc2c1sc1ccccc12] | 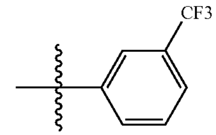 [SMILES: *c1cccc(C(F)(F)F)c1] |
| 44-28 | 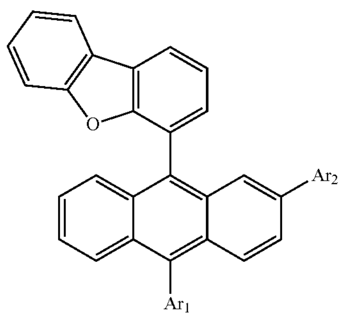 | 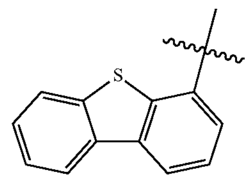 [SMILES: *c1cccc2c1sc1ccccc12] | 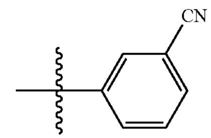 [SMILES: *c1cccc(C#N)c1] |
| 44-29 | 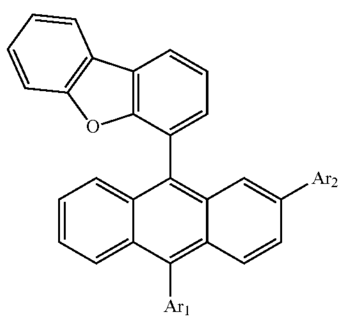 | 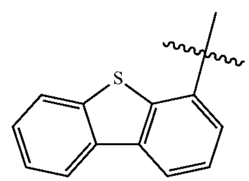 | 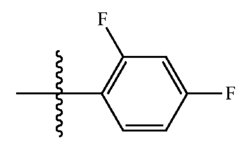 [SMILES: *c1ccc(F)cc1F] |

-continued
| No. | | Ar1 | Ar2 |
|---|---|---|---|
| 45-1 | 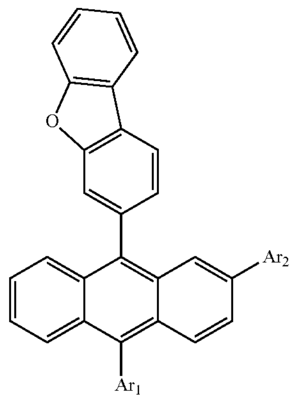 | 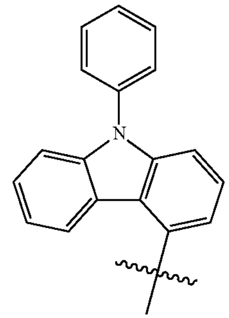 [SMILES: *c1cccc2c1c1ccccc1n2-c1ccccc1] | 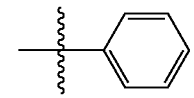 |
| 45-2 | 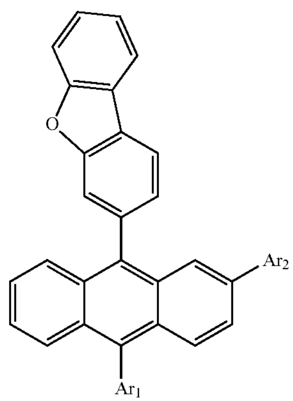 | 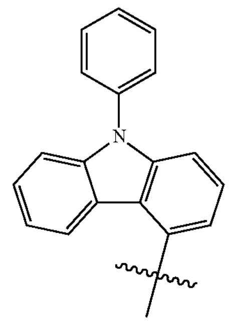 [SMILES: *c1cccc2c1c1ccccc1n2-c1ccccc1] | 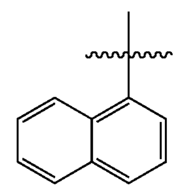 [SMILES: *c1cccc2ccccc12] |

-continued
| No. | | Ar1 | Ar2 |
|---|---|---|---|
| 45-3 | 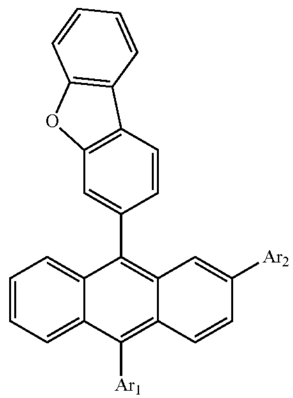 | 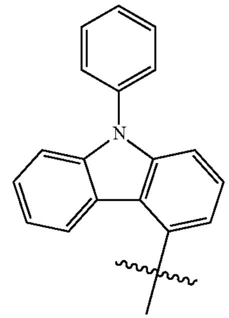 [SMILES: *c1cccc2c1c1ccccc1n2-c1ccccc1] | 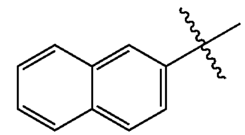 [SMILES: *c1ccc2ccccc2c1] |
| 45-4 | 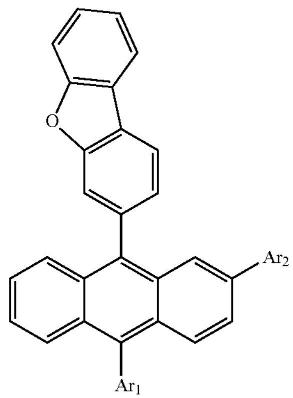 | 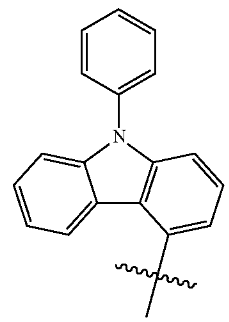 [SMILES: *c1cccc2c1c1ccccc1n2-c1ccccc1] | 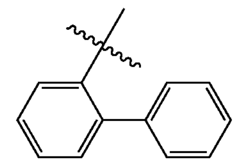 [SMILES: *c1ccccc1-c1ccccc1] |

-continued
| No. | | Ar1 | Ar2 |
|---|---|---|---|
| 45-5 | 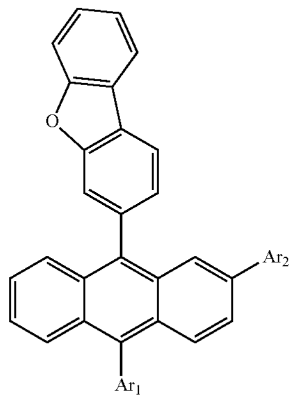 | 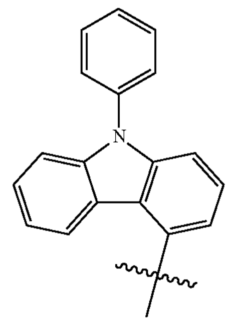 [SMILES: *c1cccc2c1c1ccccc1n2-c1ccccc1] | 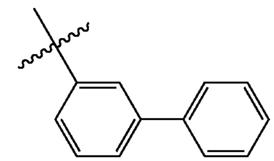 [SMILES: *c1cccc(-c2ccccc2)c1] |
| 45-6 | 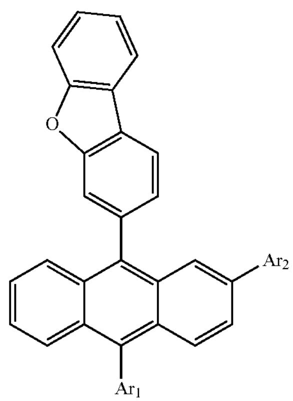 | 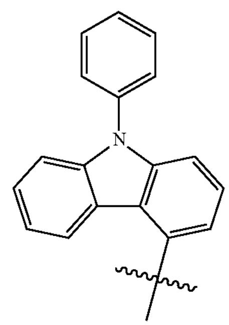 [SMILES: *c1cccc2c1c1ccccc1n2-c1ccccc1] | 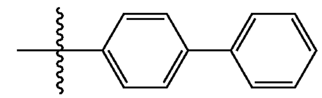 |

-continued
| No. | | Ar1 | Ar2 |
|---|---|---|---|
| 45-7 | 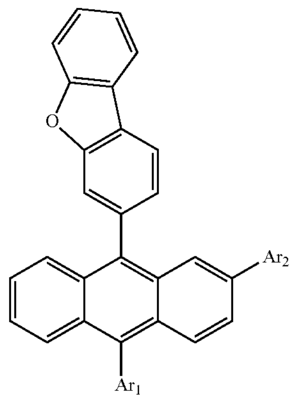 | 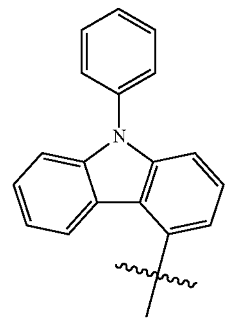 [SMILES: *c1cccc2c1c1ccccc1n2-c1ccccc1] | 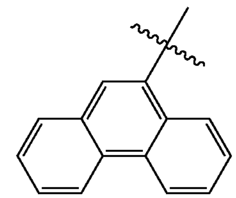 [SMILES: *c1cc2ccccc2c2ccccc12] |
| 45-8 | 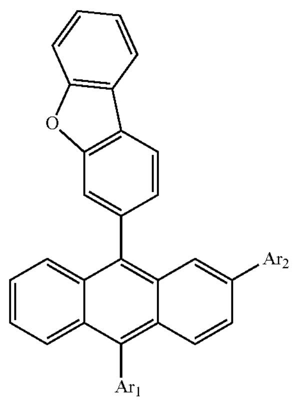 | 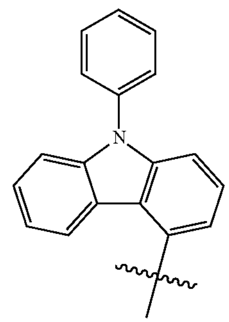 [SMILES: *c1cccc2c1c1ccccc1n2-c1ccccc1] | 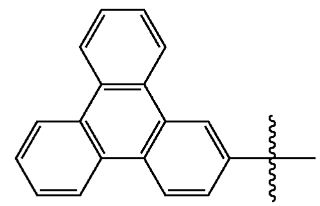 [SMILES: *c1ccc2c3ccccc3c3ccccc3c2c1] |

-continued
| No. | | Ar1 | Ar2 |
|---|---|---|---|
| 45-9 | 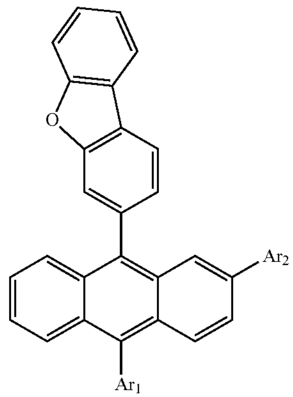 | 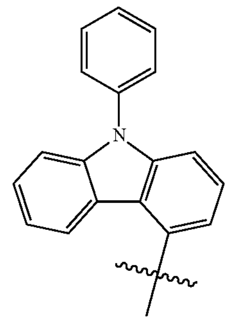 [SMILES: *c1cccc2c1c1ccccc1n2-c1ccccc1] | 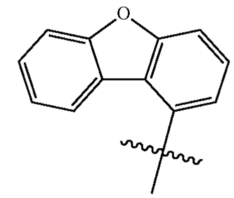 [SMILES: *c1cccc2oc3ccccc3c12] |
| 45-10 | 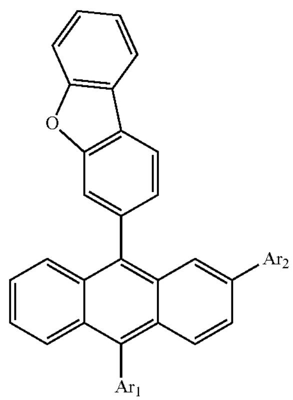 | 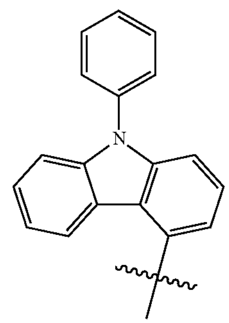 [SMILES: *c1cccc2c1c1ccccc1n2-c1ccccc1] | 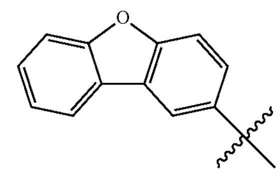 [SMILES: *c1ccc2oc3ccccc3c2c1] |

-continued
| No. | | Ar1 | Ar2 |
|---|---|---|---|
| 45-11 | 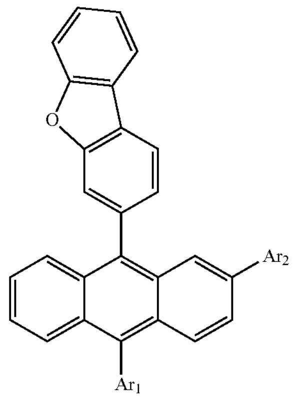 | 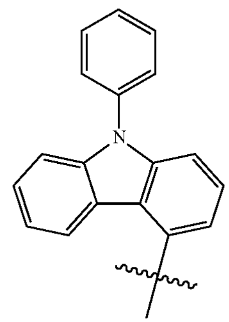 [SMILES: *c1cccc2c1c1ccccc1n2-c1ccccc1] | 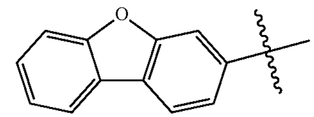 |
| 45-12 | 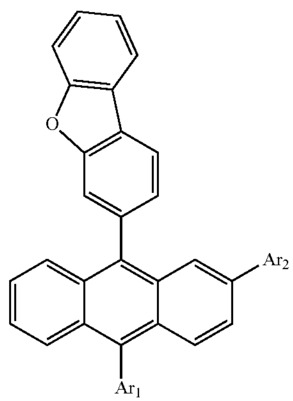 | 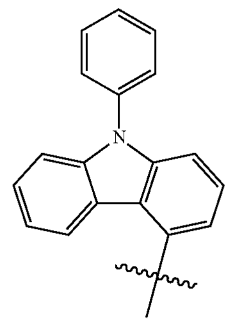 [SMILES: *c1cccc2c1c1ccccc1n2-c1ccccc1] | 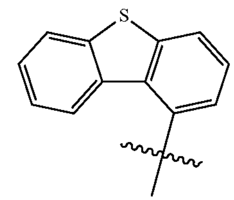 [SMILES: *c1cccc2sc3ccccc3c12] |

-continued
| No. | | Ar1 | Ar2 |
|---|---|---|---|
| 45-13 | 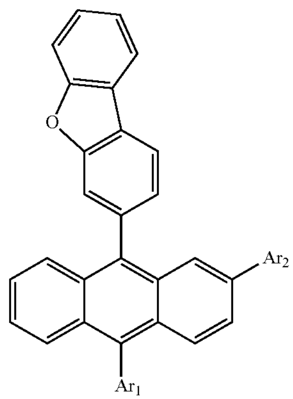 | 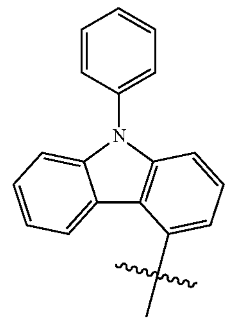 [SMILES: *c1cccc2c1c1ccccc1n2-c1ccccc1] | 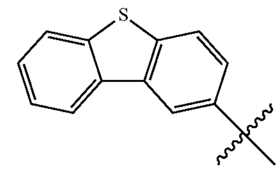 |
| 45-14 | 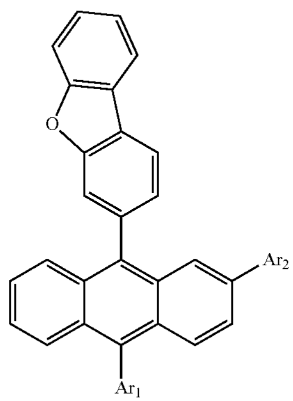 | 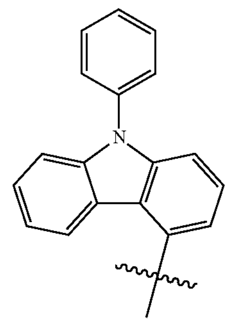 [SMILES: *c1cccc2c1c1ccccc1n2-c1ccccc1] | 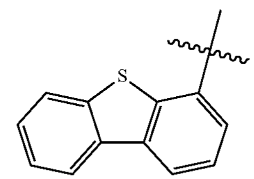 |

-continued
| No. | | Ar1 | Ar2 |
| --- | --- | --- | --- |
| 45-15 | 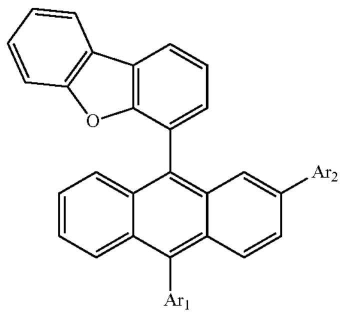 | 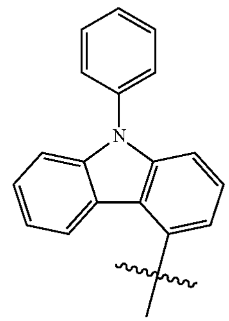 [SMILES: *c1cccc2c1c1ccccc1n2-c1ccccc1] | 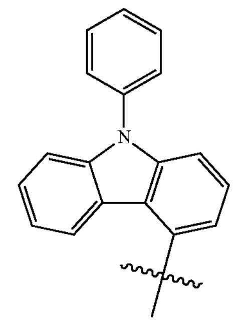 [SMILES: *c1cccc2c1c1ccccc1n2-c1ccccc1] |
| 45-16 | 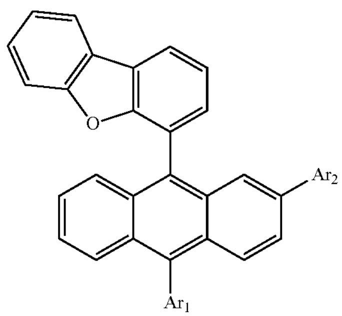 | 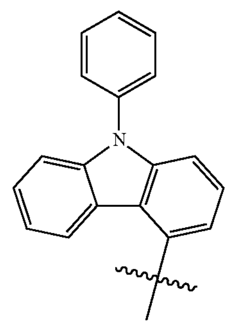 [SMILES: *c1cccc2c1c1ccccc1n2-c1ccccc1] | 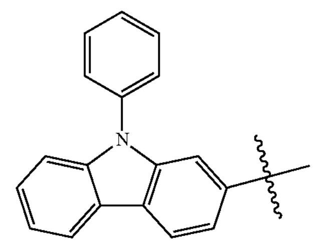 [SMILES: *c1ccc2c3ccccc3n(-c3ccccc3)c2c1] |
| 45-17 | 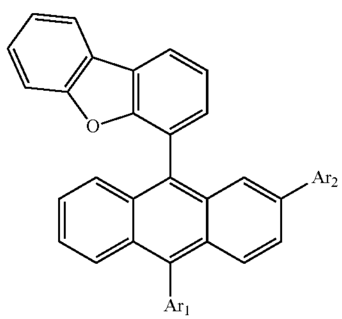 | 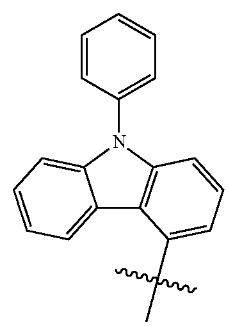 [SMILES: *c1cccc2c1c1ccccc1n2-c1ccccc1] | 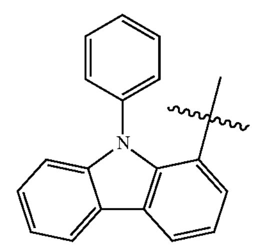 [SMILES: *c1cccc2c3ccccc3n(-c3ccccc3)c12] |

-continued
| No. | | Ar1 | Ar2 |
|---|---|---|---|
| 45-18 | 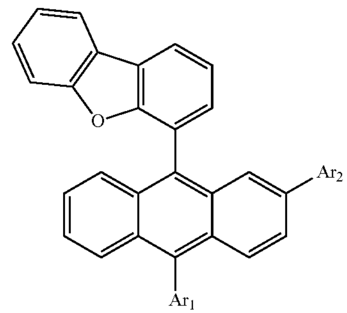 | 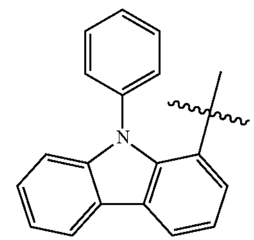 [SMILES: *c1cccc2c3ccccc3n(-c3ccccc3)c12] | 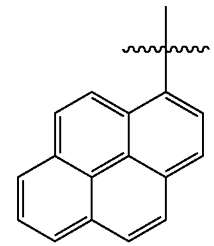 [SMILES: *c1ccc2ccc3cccc4ccc1c2c34] |
| 45-19 | 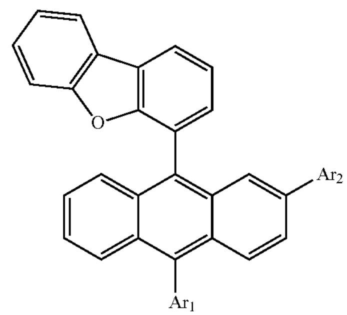 | 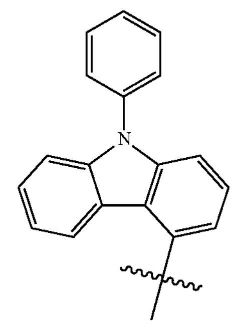 [SMILES: *c1cccc2c1c1ccccc1n2-c1ccccc1] | 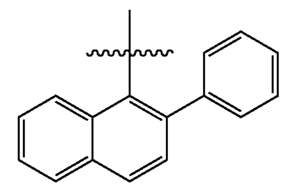 [SMILES: *c1c(-c2ccccc2)ccc2ccccc12] |
| 45-20 | 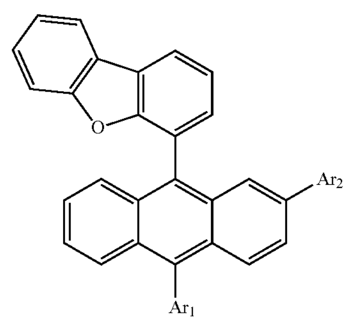 | 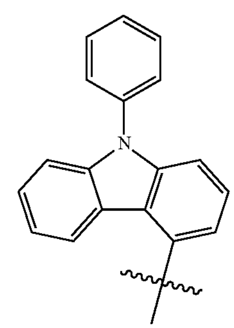 [SMILES: *c1cccc2c1c1ccccc1n2-c1ccccc1] | 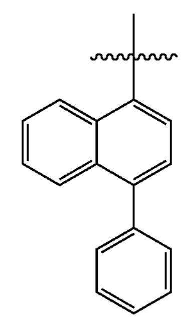 [SMILES: *c1ccc(-c2ccccc2)c2ccccc12] |

-continued
| No. | | Ar1 | Ar2 |
|---|---|---|---|
| 45-21 | 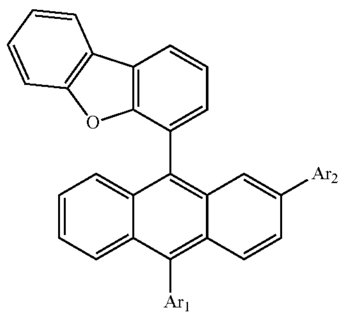 | 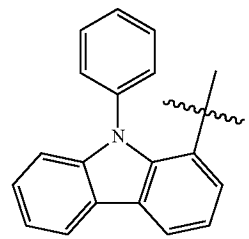 [SMILES: *c1cccc2c3ccccc3n(-c3ccccc3)c12] | 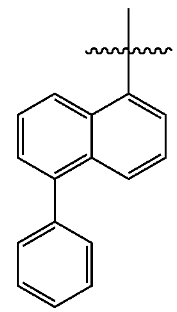 [SMILES: *c1cccc2c(-c3ccccc3)cccc12] |
| 45-22 | 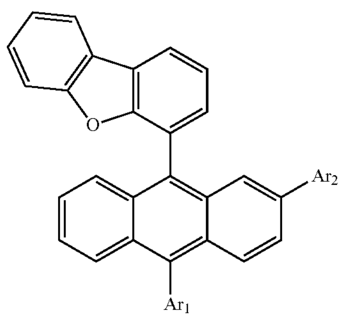 | 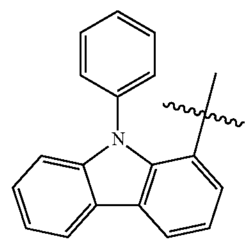 [SMILES: *c1cccc2c3ccccc3n(-c3ccccc3)c12] | 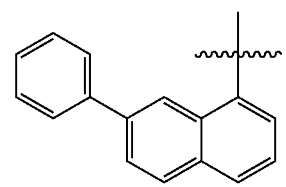 [SMILES: *c1cccc2ccc(-c3ccccc3)cc12] |
| 45-23 | 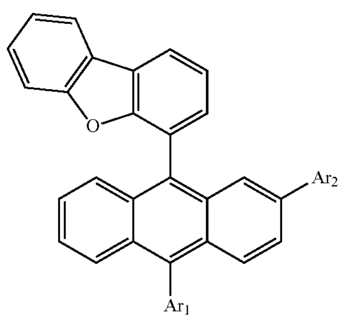 | 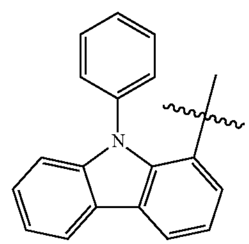 [SMILES: *c1cccc2c3ccccc3n(-c3ccccc3)c12] | 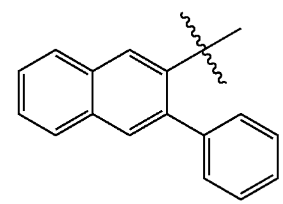 [SMILES: *c1cc2ccccc2cc1-c1ccccc1] |

-continued
| No. | | Ar1 | Ar2 |
|---|---|---|---|
| 45-24 | 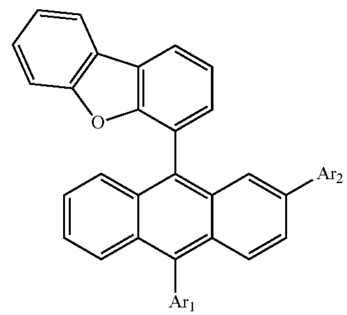 | 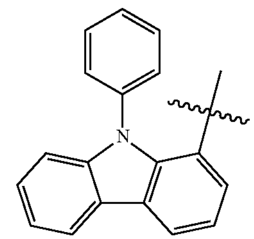 [SMILES: *c1cccc2c3ccccc3n(-c3ccccc3)c12] | 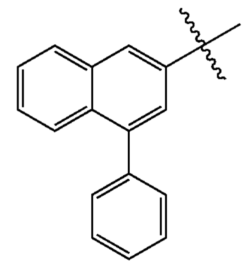 [SMILES: *c1cc(-c2ccccc2)c2ccccc2c1] |
| 45-25 | 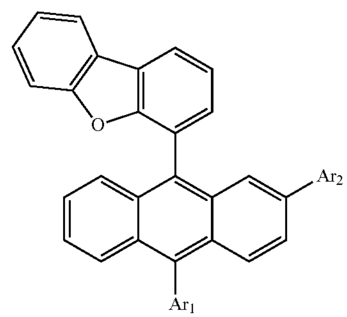 | 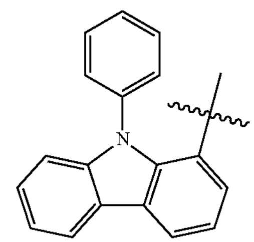 [SMILES: *c1cccc2c3ccccc3n(-c3ccccc3)c12] | 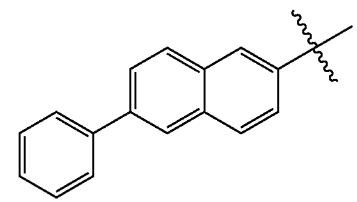 [SMILES: *c1ccc2cc(-c3ccccc3)ccc2c1] |
| 45-26 | 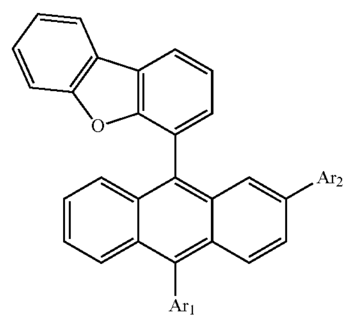 | 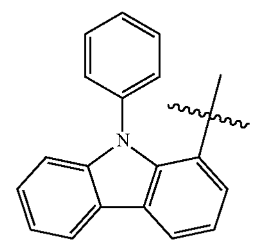 [SMILES: *c1cccc2c3ccccc3n(-c3ccccc3)c12] | 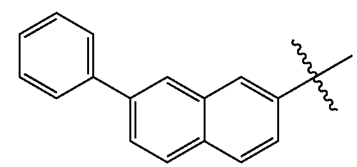 [SMILES: *c1ccc2ccc(-c3ccccc3)cc2c1] |

-continued
| No. | | Ar1 | Ar2 |
|---|---|---|---|
| 45-27 | 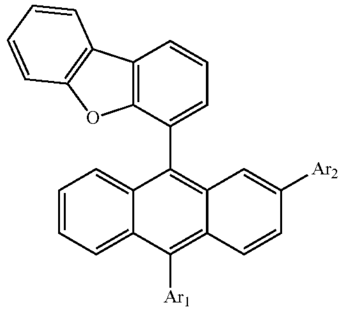 | 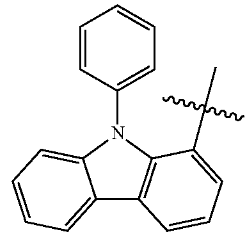 [SMILES: *c1cccc2c3ccccc3n(-c3ccccc3)c12] | 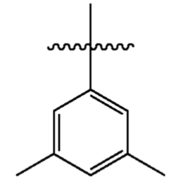 |
| 45-28 | 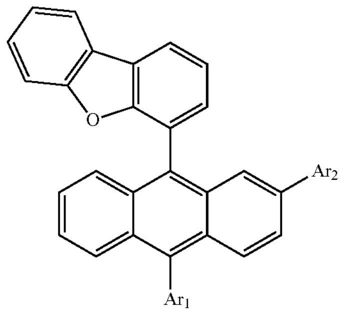 | 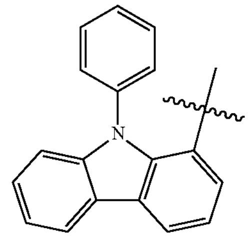 [SMILES: *c1cccc2c3ccccc3n(-c3ccccc3)c12] | 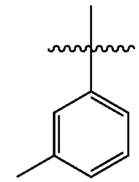 [SMILES: *c1cccc(C)c1] |
| 45-29 | 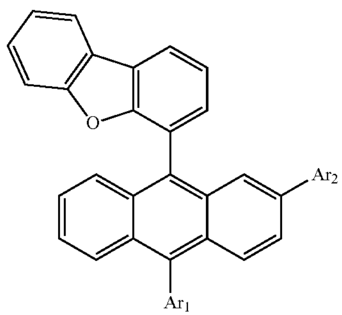 | 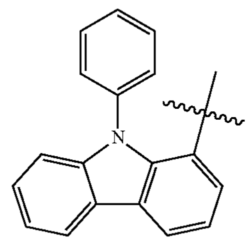 [SMILES: *c1cccc2c3ccccc3n(-c3ccccc3)c12] | 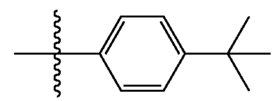 |

-continued
| No. | | Ar1 | Ar2 |
|---|---|---|---|
| 45-30 | 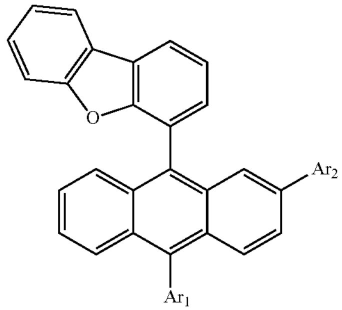 | 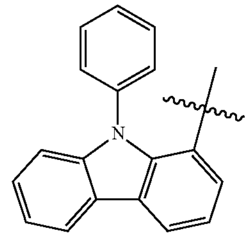 [SMILES: *c1cccc2c3ccccc3n(-c3ccccc3)c12] | 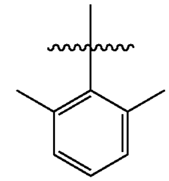 |
| 45-31 | 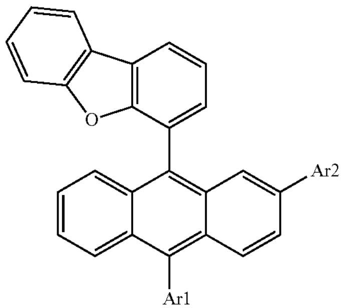 | 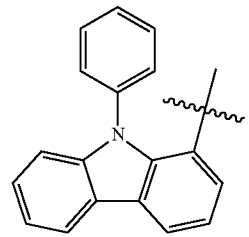 [SMILES: *c1cccc2c3ccccc3n(-c3ccccc3)c12] | 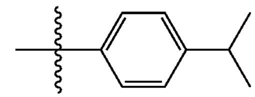 [SMILES: *c1ccc(C(C)C)cc1] |
| 46-1 | 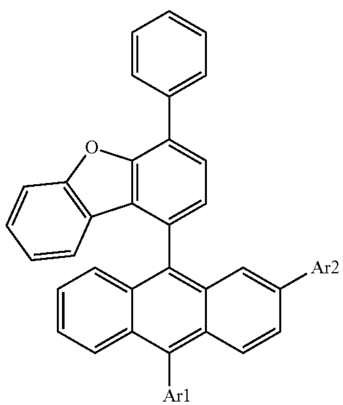 | 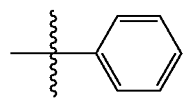 | 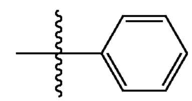 |

-continued
| No. | | Ar1 | Ar2 |
|---|---|---|---|
| 46-2 | 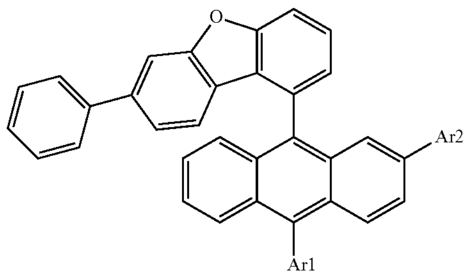 | 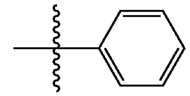 | 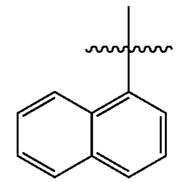 [SMILES: *c1cccc2ccccc12] |
| 46-3 | 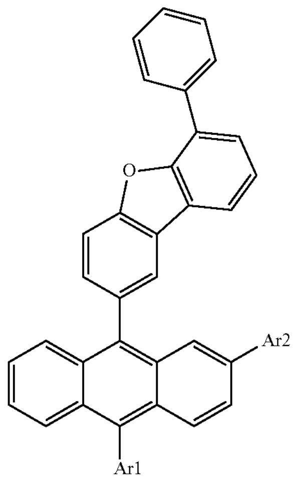 | 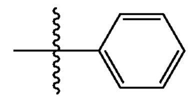 [SMILES: *c1ccccc1] | 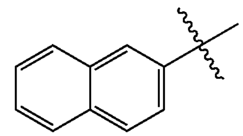 [SMILES: *c1ccc2ccccc2c1] |

-continued
| No. | | Ar1 | Ar2 |
| --- | --- | --- | --- |
| 46-4 | 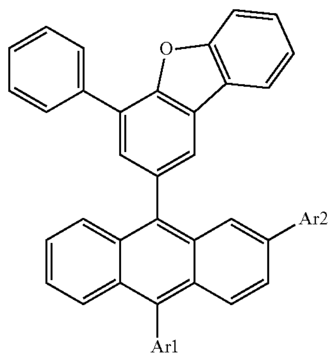 | 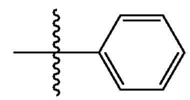 | 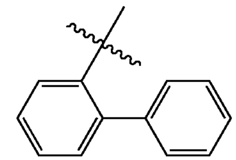 [SMILES: *c1ccccc1-c1ccccc1] |
| 46-5 | 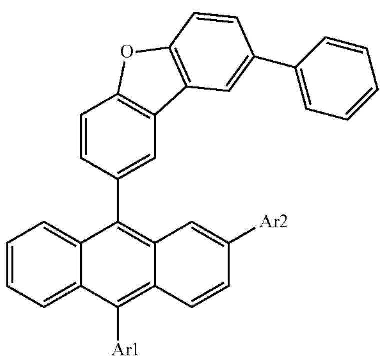 | 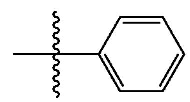 [SMILES: *c1ccccc1] | 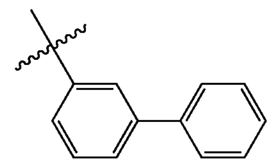 [SMILES: *c1cccc(-c2ccccc2)c1] |

-continued
| No. | | Ar1 | Ar2 |
|---|---|---|---|
| 46-6 | 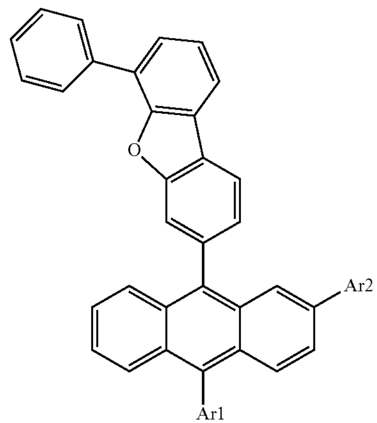 | 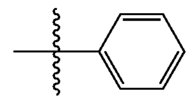 [SMILES: *c1ccccc1] | 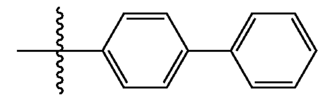 |
| 46-7 | 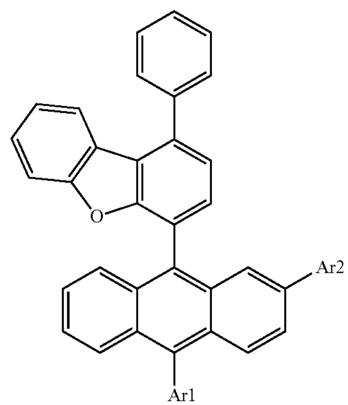 | 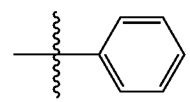 | 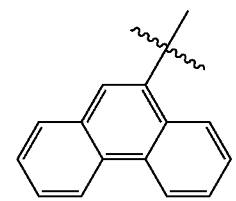 [SMILES: *c1cc2ccccc2c2ccccc12] |

-continued
| No. | | Ar1 | Ar2 |
|---|---|---|---|
| 46-8 | 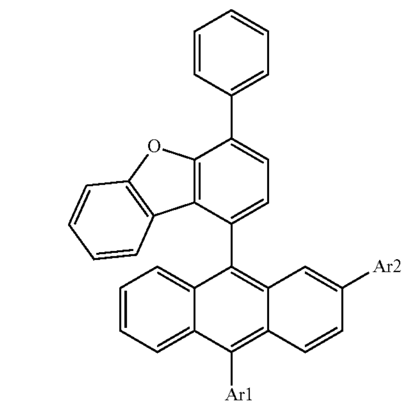 | 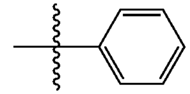 [SMILES: *c1ccccc1] | 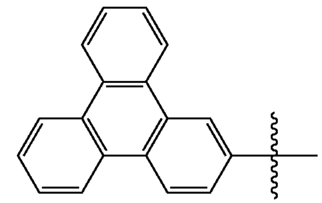 [SMILES: *c1ccc2c3ccccc3c3ccccc3c2c1] |
| 46-9 | 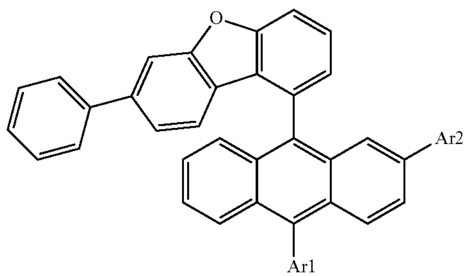 | 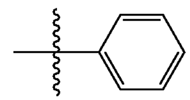 [SMILES: *c1ccccc1] | 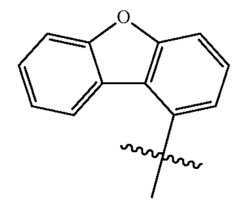 [SMILES: *c1cccc2oc3ccccc3c12] |

-continued
| No. | | Ar1 | Ar2 |
|---|---|---|---|
| 46-10 | 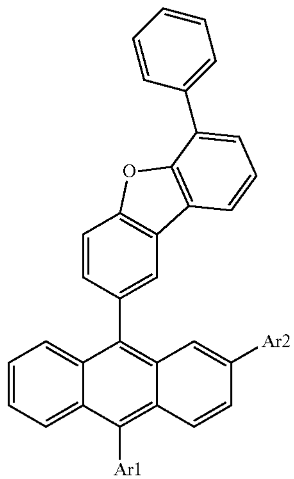 | 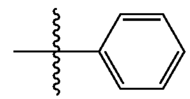 [SMILES: *c1ccccc1] | 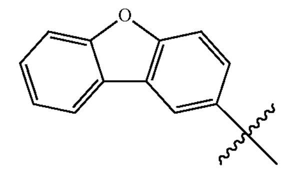 [SMILES: *c1ccc2oc3ccccc3c2c1] |
| 46-11 | 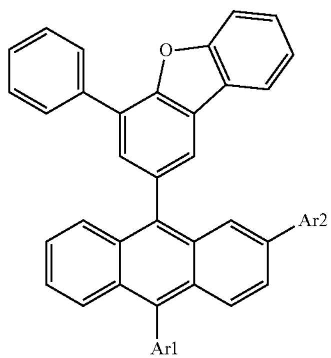 | 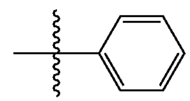 | 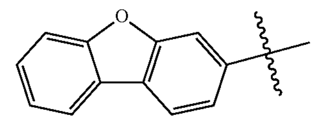 |

-continued
| No. | | Ar1 | Ar2 |
|---|---|---|---|
| 46-12 | 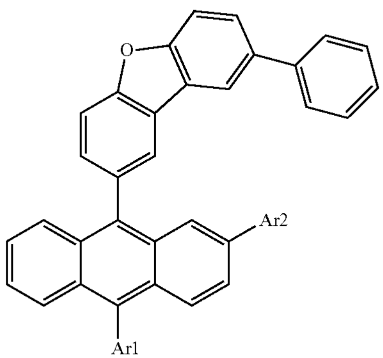 | 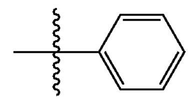 [SMILES: *c1ccccc1] | 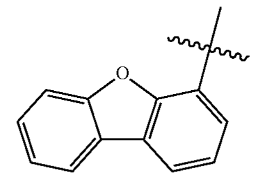 [SMILES: *c1cccc2c1oc1ccccc12] |
| 46-13 | 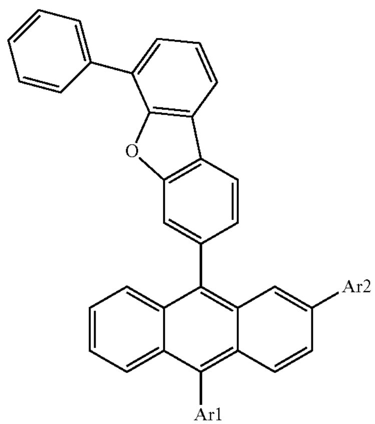 | 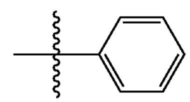 | 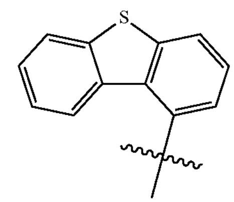 |

-continued
| No. | | Ar1 | Ar2 |
|---|---|---|---|
| 46-14 | 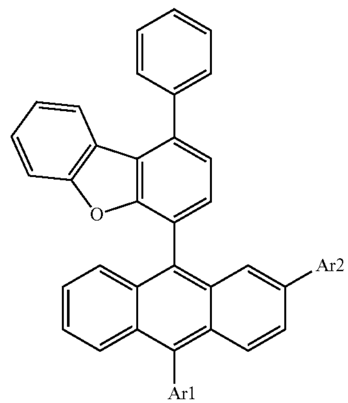 | 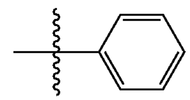 [SMILES: *c1ccccc1] | 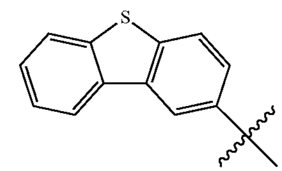 [SMILES: *c1ccc2sc3ccccc3c2c1] |
| 46-15 | 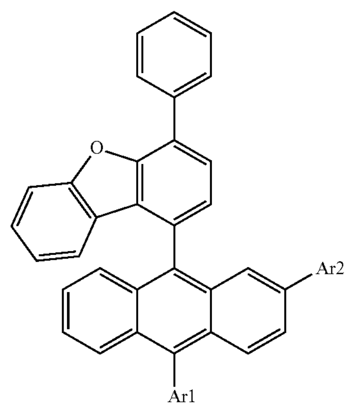 | 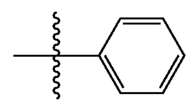 [SMILES: *c1ccccc1] | 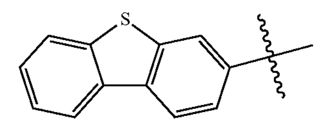 |

-continued
| No. | | Ar1 | Ar2 |
|---|---|---|---|
| 46-16 | 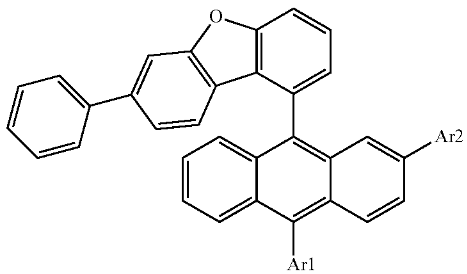 | 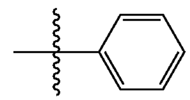 [SMILES: *c1ccccc1] | 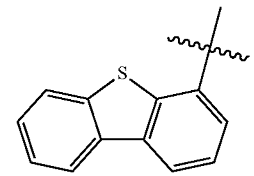 |
| 46-17 | 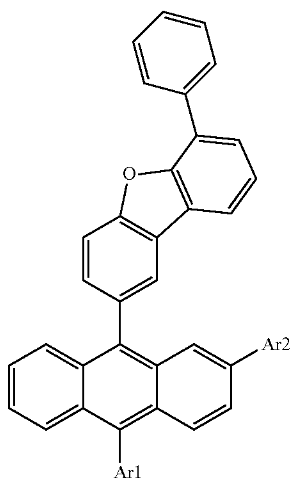 | 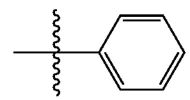 | 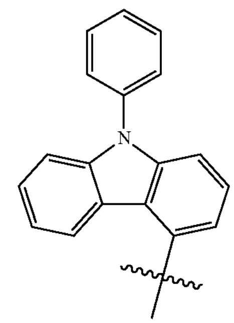 [SMILES: *c1cccc2c1c1ccccc1n2-c1ccccc1] |

-continued
| No. | | Ar1 | Ar2 |
|---|---|---|---|
| 46-18 | 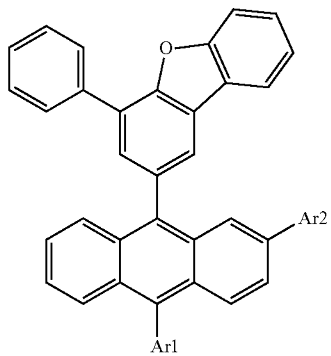 | 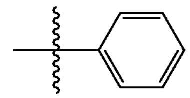 | 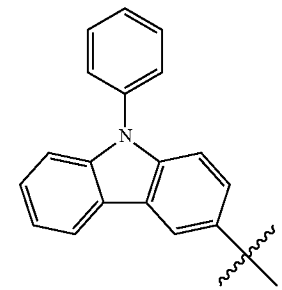 [SMILES: *c1ccc2c(c1)c1ccccc1n2-c1ccccc1] |
| 46-19 | 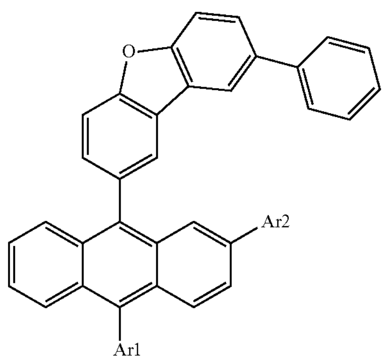 | 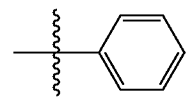 | 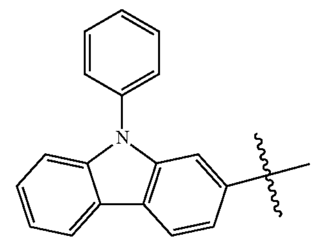 [SMILES: *c1ccc2c3ccccc3n(-c3ccccc3)c2c1] |

-continued
| No. | | Ar1 | Ar2 |
|---|---|---|---|
| 46-20 | 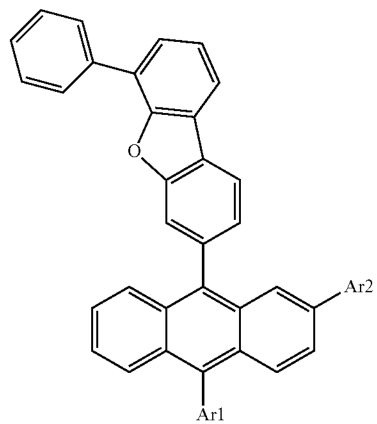 | 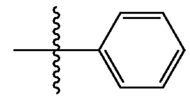 | 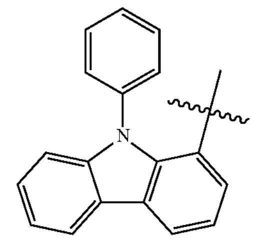 [SMILES: *c1cccc2c3ccccc3n(-c3ccccc3)c12] |
| 46-21 | 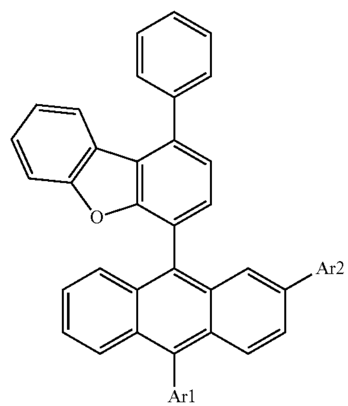 | 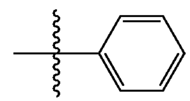 | 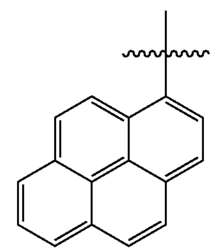 [SMILES: *c1ccc2ccc3cccc4ccc1c2c34] |

-continued
| No. | | Ar1 | Ar2 |
|---|---|---|---|
| 46-22 | 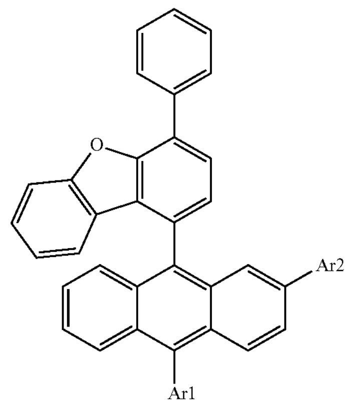 | 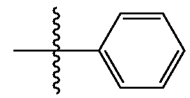 | 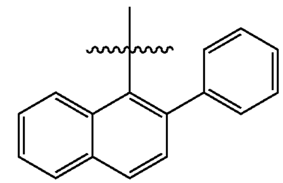 [SMILES: *c1c(-c2ccccc2)ccc2ccccc12] |
| 46-23 | 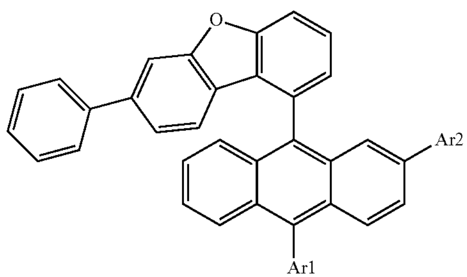 | 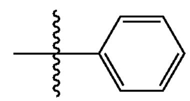 [SMILES: *c1ccccc1] | 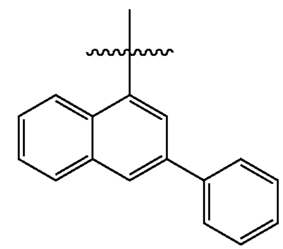 [SMILES: *c1cc(-c2ccccc2)cc2ccccc12] |

-continued
| No. | | Ar1 | Ar2 |
|---|---|---|---|
| 46-24 | 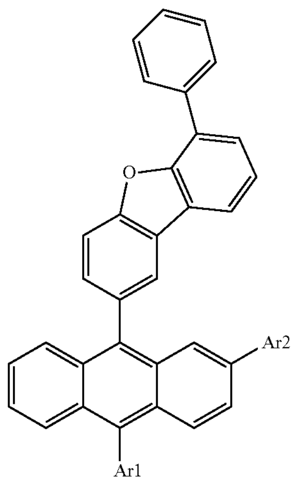 | 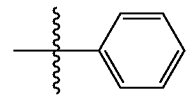 | 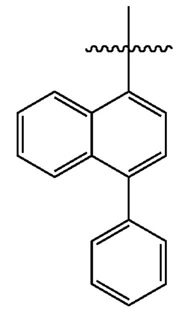 [SMILES: *c1ccc(-c2ccccc2)c2ccccc12] |
| 46-25 | 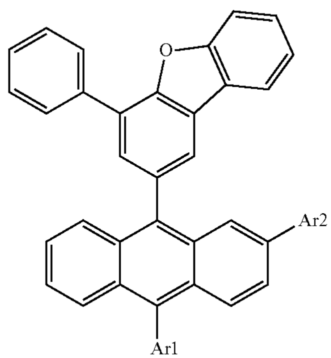 | 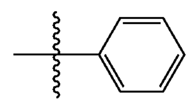 | 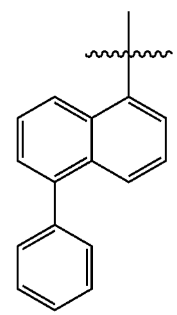 [SMILES: *c1cccc2c(-c3ccccc3)cccc12] |

-continued
| No. | | Ar1 | Ar2 |
|---|---|---|---|
| 46-26 | 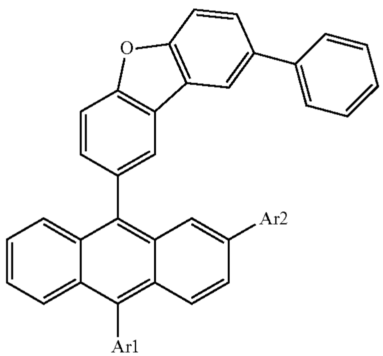 | 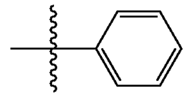 | 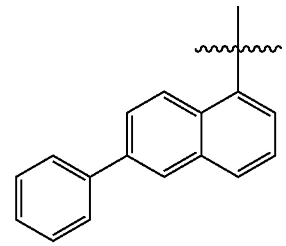 [SMILES: *c1cccc2cc(-c3ccccc3)ccc12] |
| 46-27 | 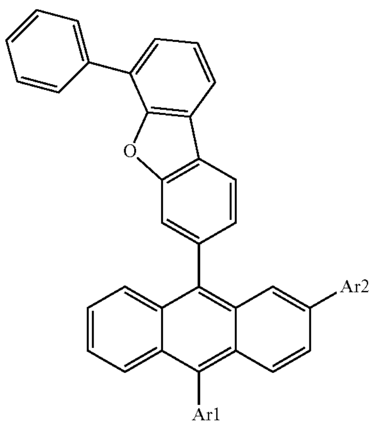 | 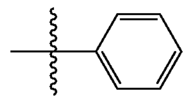 [SMILES: *c1ccccc1] | 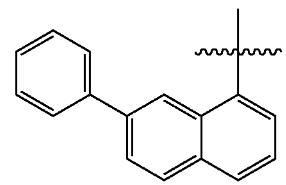 [SMILES: *c1cccc2ccc(-c3ccccc3)cc12] |

-continued
| No. | | Ar1 | Ar2 |
|---|---|---|---|
| 46-28 | 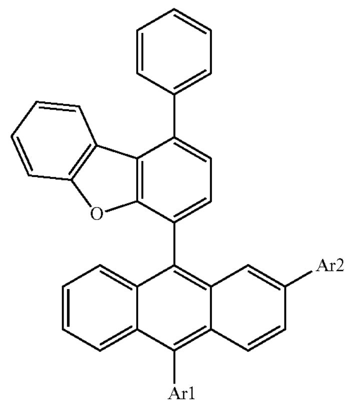 | 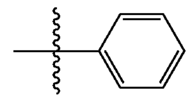 [SMILES: *c1ccccc1] | 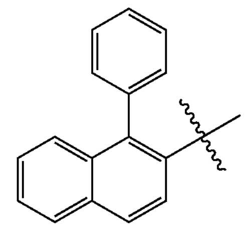 [SMILES: *c1ccc2ccccc2c1-c1ccccc1] |
| 46-29 | 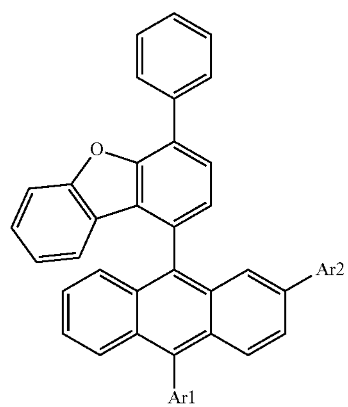 | 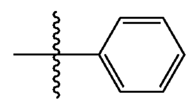 [SMILES: *c1ccccc1] | 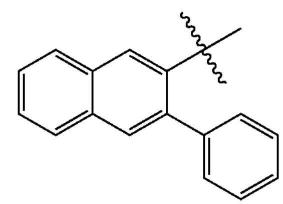 [SMILES: *c1cc2ccccc2cc1-c1ccccc1] |

-continued
| No. | | Ar1 | Ar2 |
|---|---|---|---|
| 46-30 | 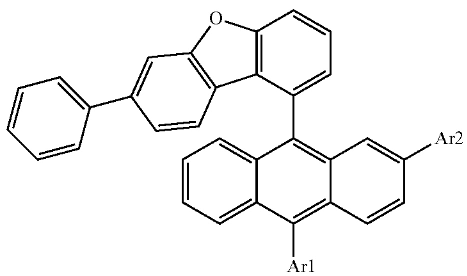 | 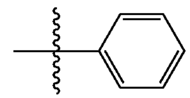 [SMILES: *c1ccccc1] | 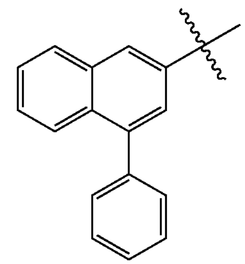 [SMILES: *c1cc(-c2ccccc2)c2ccccc2c1] |
| 46-31 | 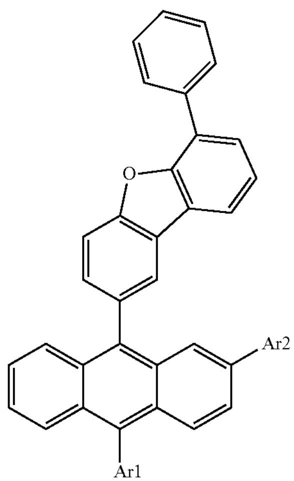 | 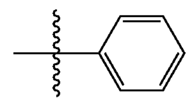 [SMILES: *c1ccccc1] | 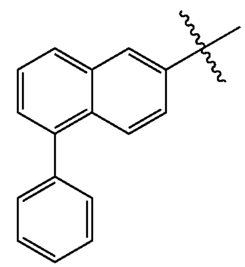 [SMILES: *c1ccc2c(-c3ccccc3)cccc2c1] |

-continued
| No. | | Ar1 | Ar2 |
| --- | --- | --- | --- |
| 46-32 | 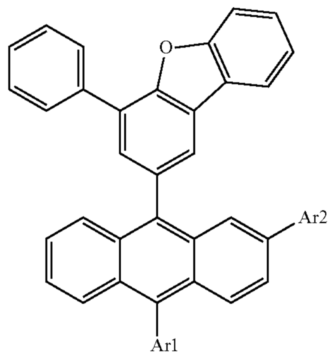 | 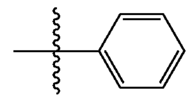 [SMILES: *c1ccccc1] | 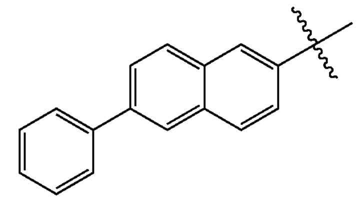 [SMILES: *c1ccc2cc(-c3ccccc3)ccc2c1] |
| 46-33 | 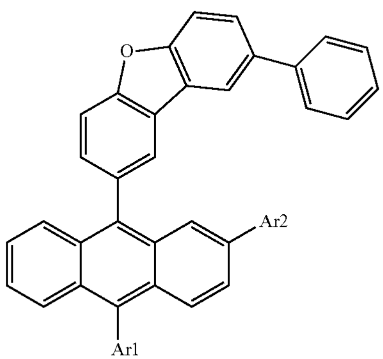 | 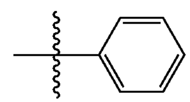 [SMILES: *c1ccccc1] | 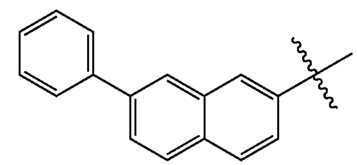 [SMILES: *c1ccc2ccc(-c3ccccc3)cc2c1] |

-continued
| No. | | Ar1 | Ar2 |
|---|---|---|---|
| 46-34 | 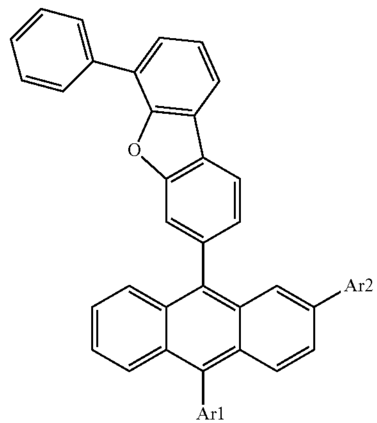 | 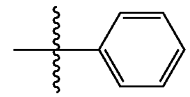 | 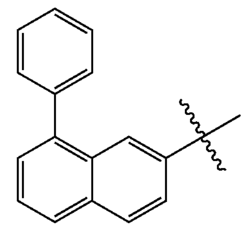 [SMILES: *c1ccc2cccc(-c3ccccc3)c2c1] |
| 46-35 | 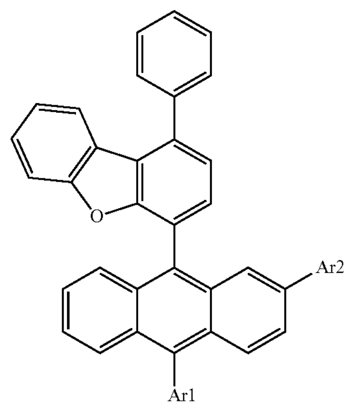 | 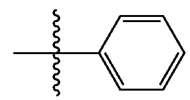 | 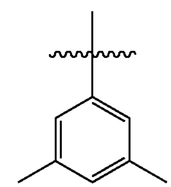 |

-continued
| No. | | Ar1 | Ar2 |
|---|---|---|---|
| 46-36 | 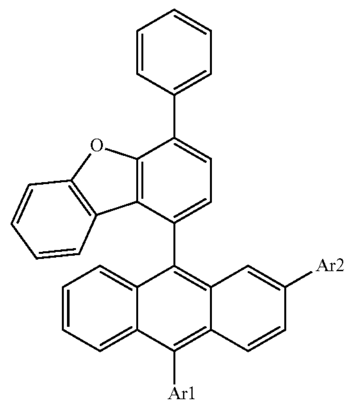 | 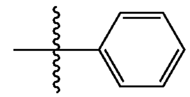 | 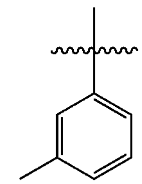 [SMILES: *c1cccc(C)c1] |
| 46-37 | 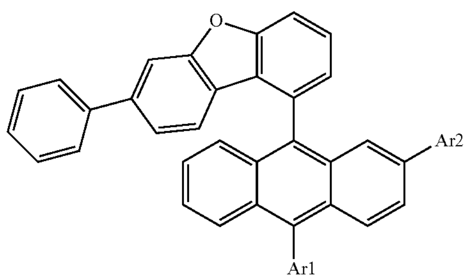 | 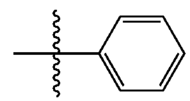 | 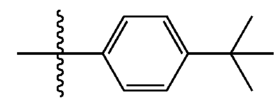 |

-continued
| No. | | Ar1 | Ar2 |
| --- | --- | --- | --- |
| 46-38 | 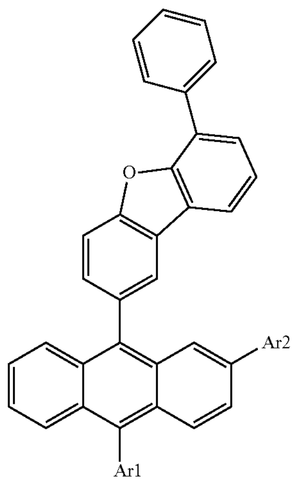 | 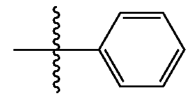 | 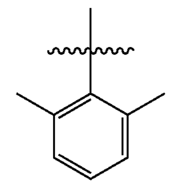 |
| 46-39 | 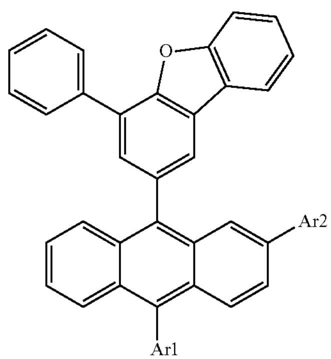 | 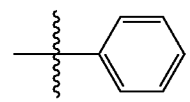 | 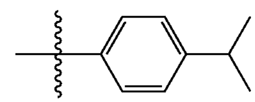 |

-continued
| No. | | Ar1 | Ar2 |
|---|---|---|---|
| 46-40 | 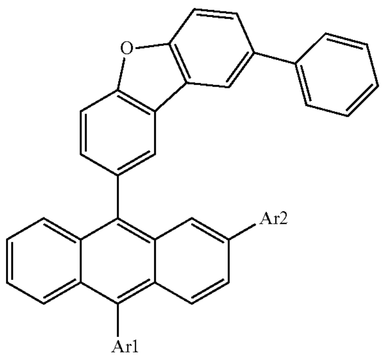 | 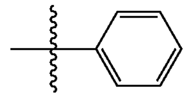 [SMILES: *c1ccccc1] | 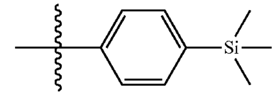 |
| 46-41 | 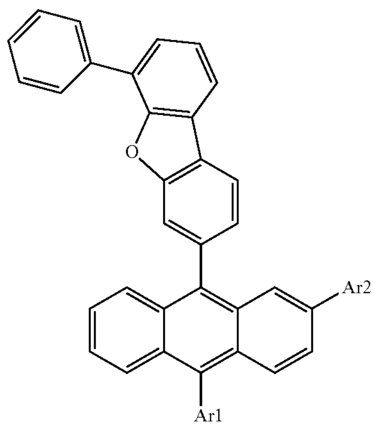 | 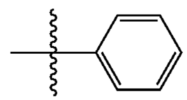 | 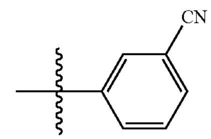 [SMILES: *c1cccc(C#N)c1] |

-continued
| No. | | Ar1 | Ar2 |
|---|---|---|---|
| 46-42 | 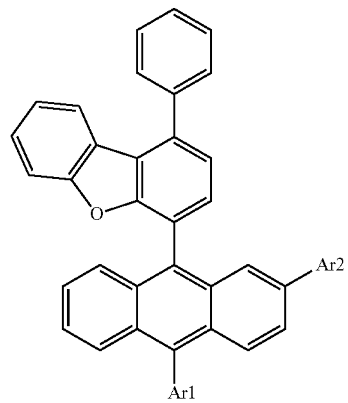 | 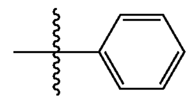 | 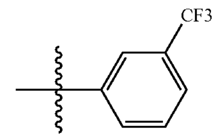 [SMILES: *c1cccc(C(F)(F)F)c1] |
| 46-43 | 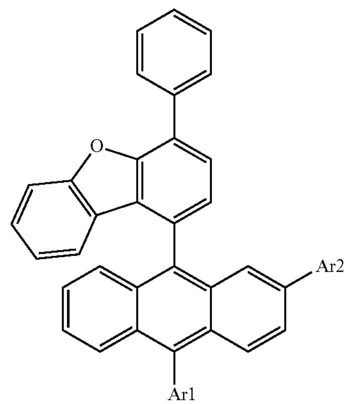 | 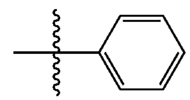 | 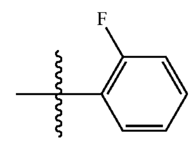 |

-continued
| No. | | Ar1 | Ar2 |
|---|---|---|---|
| 46-44 | 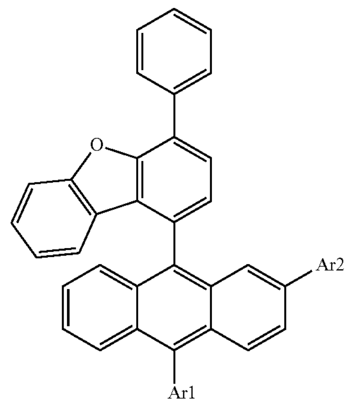 | 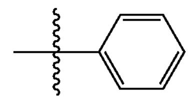 | 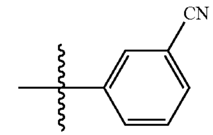 [SMILES: *c1cccc(C#N)c1] |
| 46-45 | 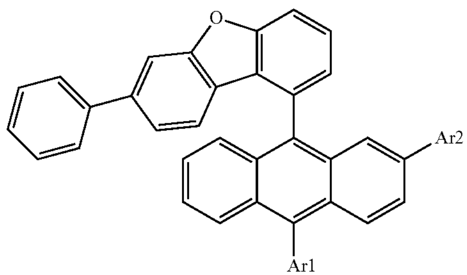 | 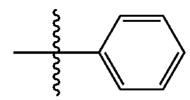 | 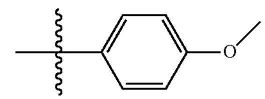 [SMILES: *c1ccc(OC)cc1] |

-continued
| No. | | Ar1 | Ar2 |
|---|---|---|---|
| 46-46 | 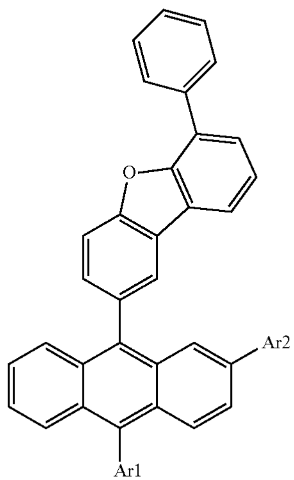 | 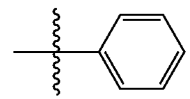 [SMILES: *c1ccccc1] | 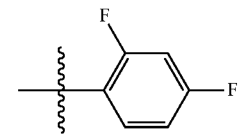 |
| 47-1 | 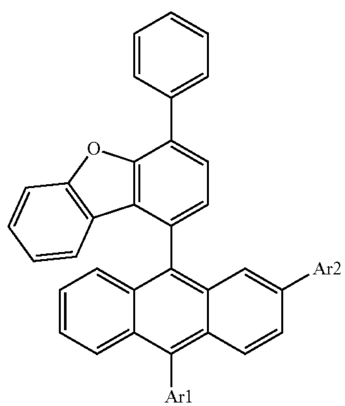 | 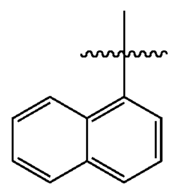 [SMILES: *c1cccc2ccccc12] | 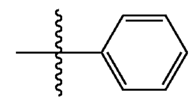 [SMILES: *c1ccccc1] |

-continued
| No. | | Ar1 | Ar2 |
|---|---|---|---|
| 47-2 | 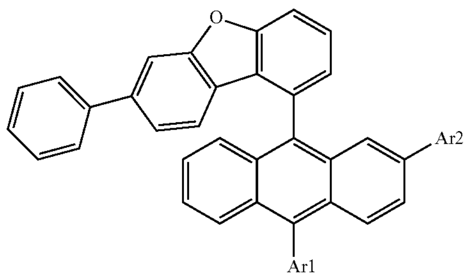 | 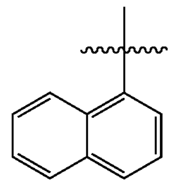 [SMILES: *c1cccc2ccccc12] | 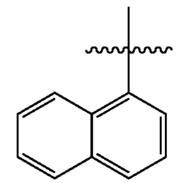 [SMILES: *c1cccc2ccccc12] |
| 47-3 | 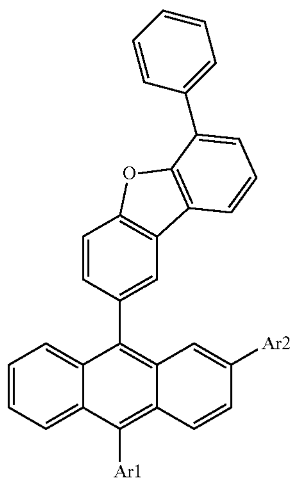 | 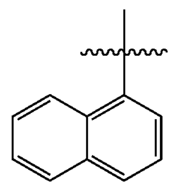 [SMILES: *c1cccc2ccccc12] | 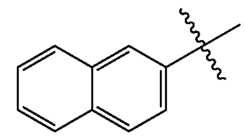 [SMILES: *c1ccc2ccccc2c1] |

-continued
| No. | | Ar1 | Ar2 |
|---|---|---|---|
| 47-4 | 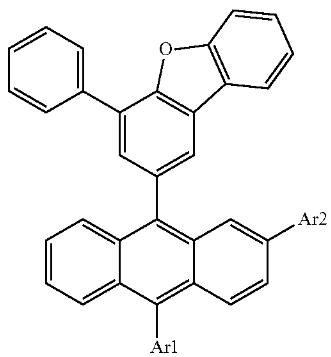  | 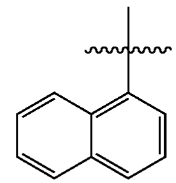 [SMILES: *c1cccc2ccccc12] | 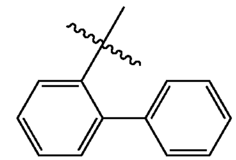 [SMILES: *c1ccccc1-c1ccccc1] |
| 47-5 | 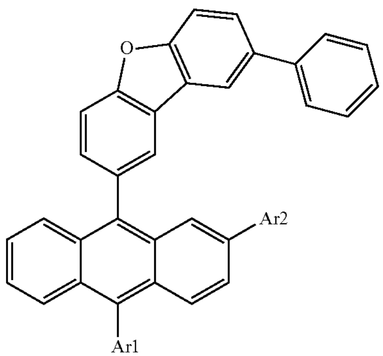  | 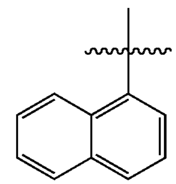 [SMILES: *c1cccc2ccccc12] | 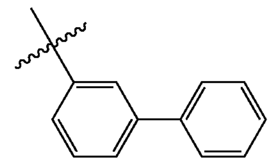 [SMILES: *c1cccc(-c2ccccc2)c1] |

-continued
| No. | | Ar1 | Ar2 |
|---|---|---|---|
| 47-6 | 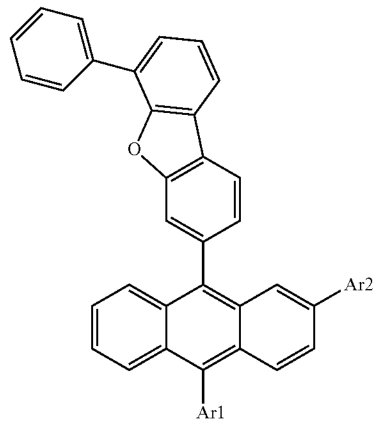 | 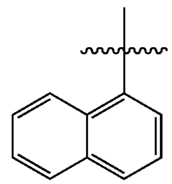 [SMILES: *c1cccc2ccccc12] | 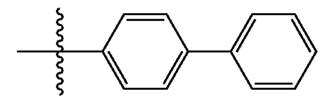 |
| 47-7 | 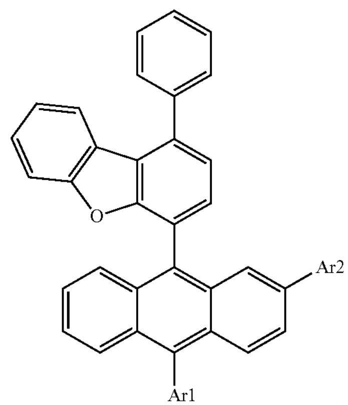 | 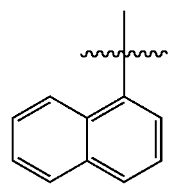 [SMILES: *c1cccc2ccccc12] | 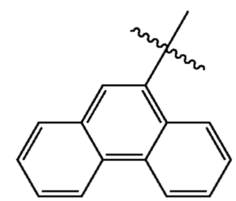 [SMILES: *c1cc2ccccc2c2ccccc12] |

-continued
| No. | | Ar1 | Ar2 |
| --- | --- | --- | --- |
| 47-8 | 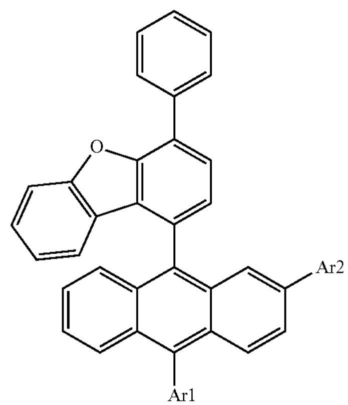 | 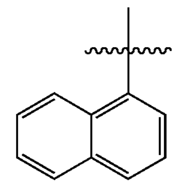 [SMILES: *c1cccc2ccccc12] | 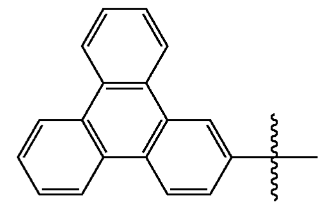 [SMILES: *c1ccc2c3ccccc3c3ccccc3c2c1] |
| 47-9 | 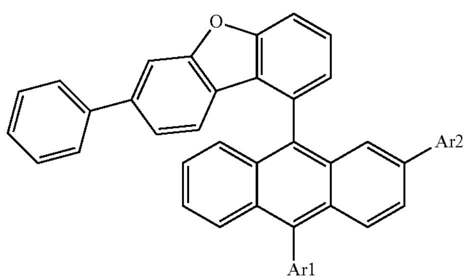 | 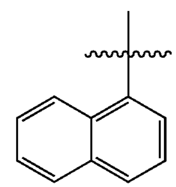 [SMILES: *c1cccc2ccccc12] | 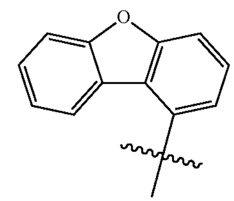 [SMILES: *c1cccc2oc3ccccc3c12] |

-continued
| No. | | Ar1 | Ar2 |
|---|---|---|---|
| 47-10 | 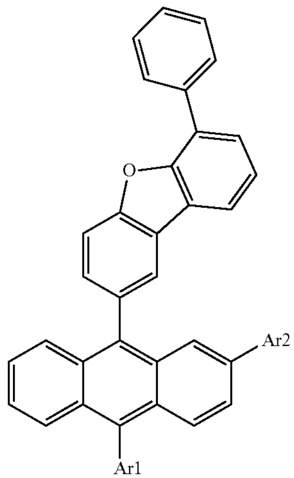 | 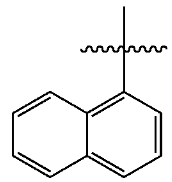 [SMILES: *c1cccc2ccccc12] | 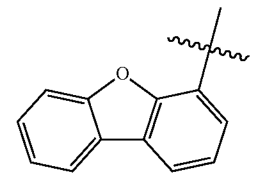 [SMILES: *c1cccc2c1oc1ccccc12] |
| 47-11 | 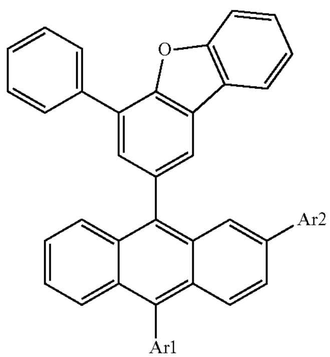 | 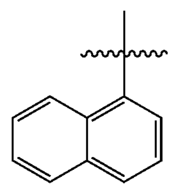 [SMILES: *c1cccc2ccccc12] | 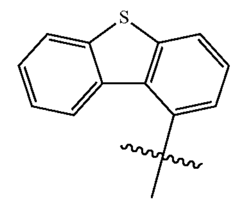 |

-continued
| No. | | Ar1 | Ar2 |
|---|---|---|---|
| 47-12 | 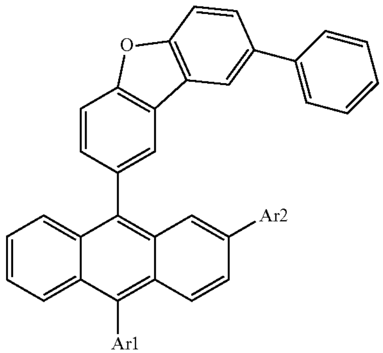 | 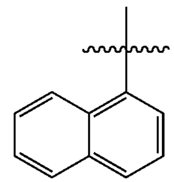 [SMILES: *c1cccc2ccccc12] | 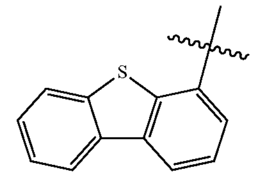 |
| 47-13 | 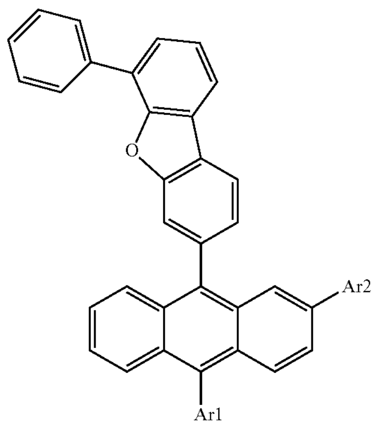 | 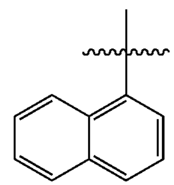 [SMILES: *c1cccc2ccccc12] | 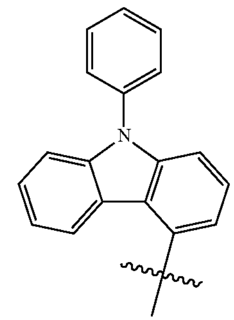 [SMILES: *c1cccc2c1c1ccccc1n2-c1ccccc1] |

-continued
| No. | | Ar1 | Ar2 |
|---|---|---|---|
| 47-14 | 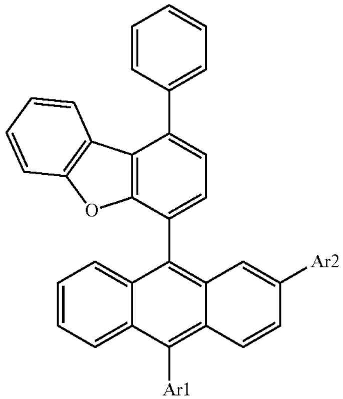 | 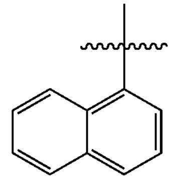 [SMILES: *c1cccc2ccccc12] | 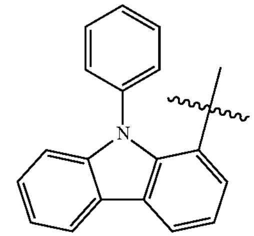 [SMILES: *c1cccc2c3ccccc3n(-c3ccccc3)c12] |
| 47-15 | 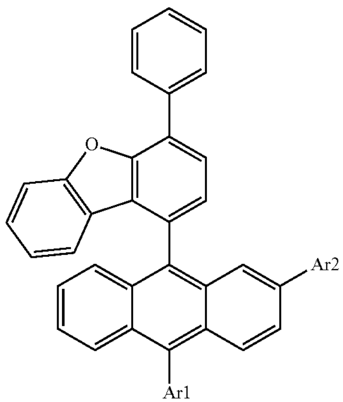 | 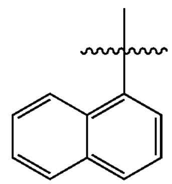 [SMILES: *c1cccc2ccccc12] | 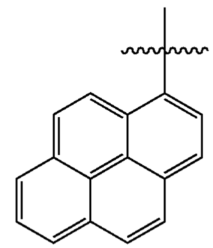 [SMILES: *c1ccc2ccc3cccc4ccc1c2c34] |

-continued
| No. | | Ar1 | Ar2 |
|---|---|---|---|
| 47-16 | 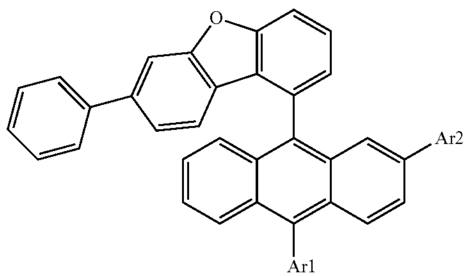 | 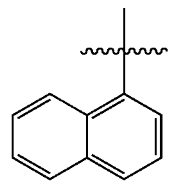 [SMILES: *c1cccc2ccccc12] | 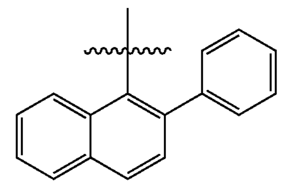 [SMILES: *c1c(-c2ccccc2)ccc2ccccc12] |
| 47-17 | 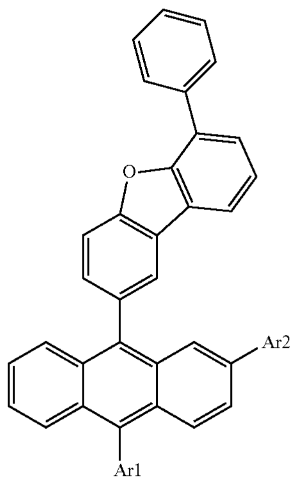 | 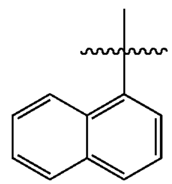 [SMILES: *c1cccc2ccccc12] | 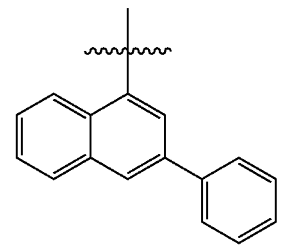 [SMILES: *c1cc(-c2ccccc2)cc2ccccc12] |

-continued
| No. | | Ar1 | Ar2 |
|---|---|---|---|
| 47-18 | 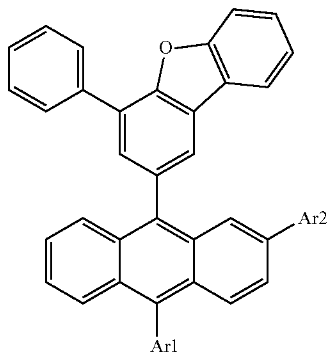 | 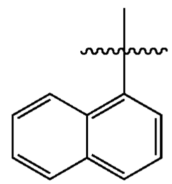 [SMILES: *c1cccc2ccccc12] | 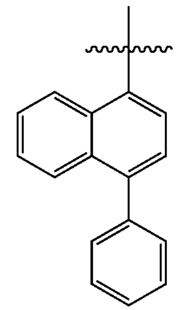 [SMILES: *c1ccc(-c2ccccc2)c2ccccc12] |
| 47-19 | 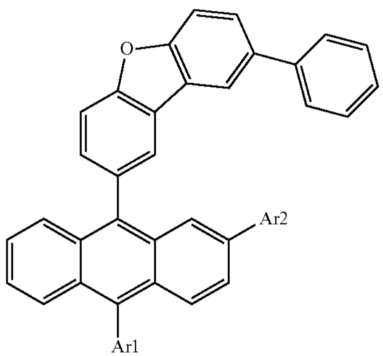 | 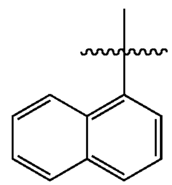 [SMILES: *c1cccc2ccccc12] | 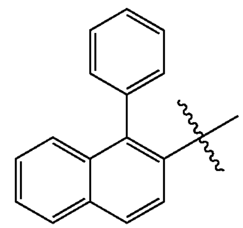 [SMILES: *c1ccc2ccccc2c1-c1ccccc1] |

-continued
| No. | | Ar1 | Ar2 |
|---|---|---|---|
| 47-20 | 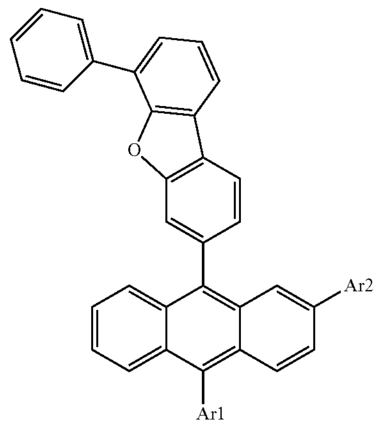 | 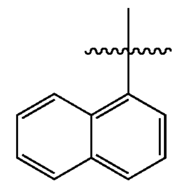 [SMILES: *c1cccc2ccccc12] | 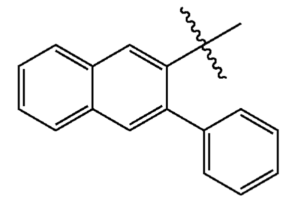 [SMILES: *c1cc2ccccc2cc1-c1ccccc1] |
| 47-21 | 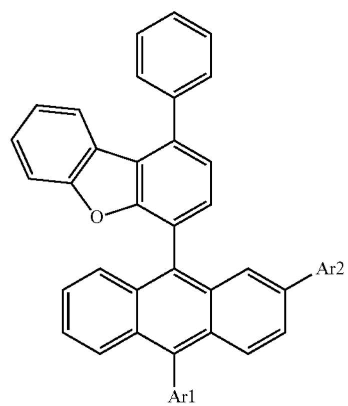 | 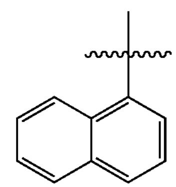 [SMILES: *c1cccc2ccccc12] | 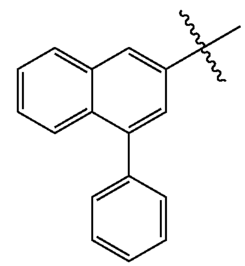 [SMILES: *c1cc(-c2ccccc2)c2ccccc2c1] |

-continued
| No. | | Ar1 | Ar2 |
|---|---|---|---|
| 47-22 | 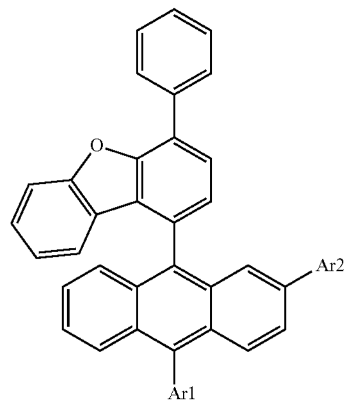 | 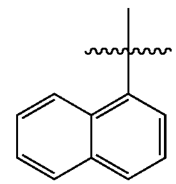 [SMILES: *c1cccc2ccccc12] | 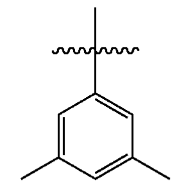 |
| 47-23 | 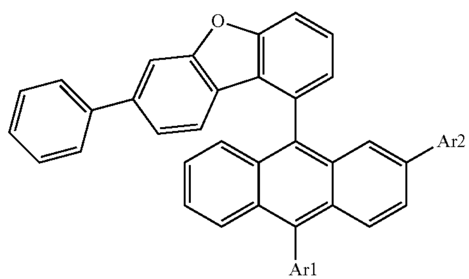 | 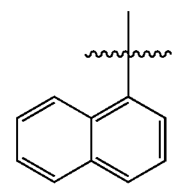 [SMILES: *c1cccc2ccccc12] | 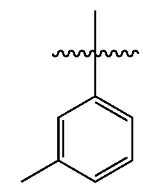 [SMILES: *c1cccc(C)c1] |

-continued
| No. | | Ar1 | Ar2 |
|---|---|---|---|
| 47-24 | 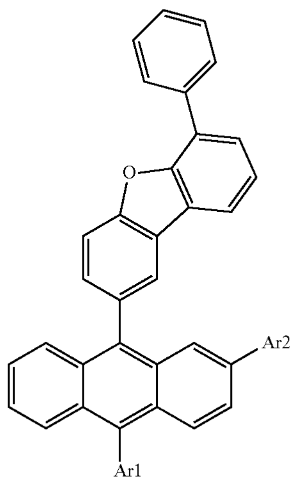<br> | 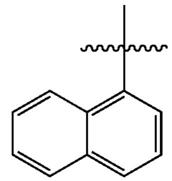 [SMILES: *c1cccc2ccccc12] | 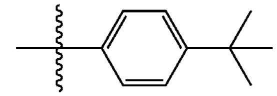 [SMILES: *c1ccc(C(C)(C)C)cc1] |
| 47-25 | 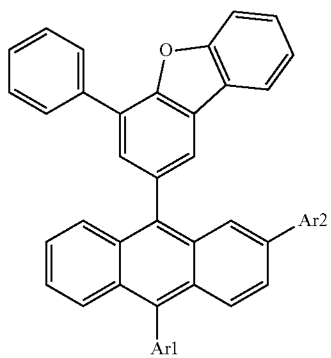<br> | 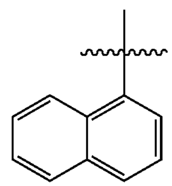 [SMILES: *c1cccc2ccccc12] | 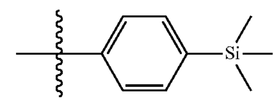<br> |

-continued
| No. | | Ar1 | Ar2 |
| --- | --- | --- | --- |
| 47-26 | 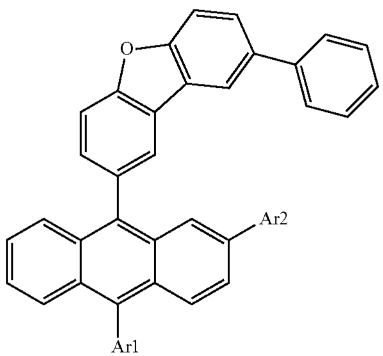 | 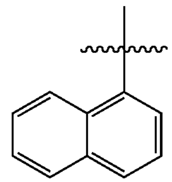 [SMILES: *c1cccc2ccccc12] | 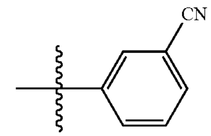 [SMILES: *c1cccc(C#N)c1] |
| 47-27 | 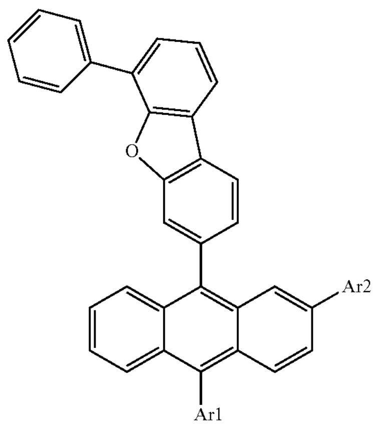 | 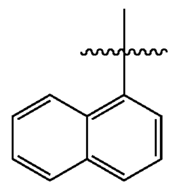 [SMILES: *c1cccc2ccccc12] | 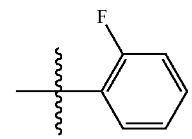 [SMILES: *c1ccccc1F] |

-continued
| No. | | Ar1 | Ar2 |
|---|---|---|---|
| 47-28 | 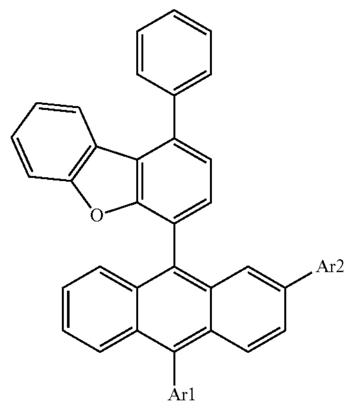 | 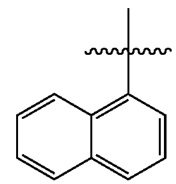 [SMILES: *c1cccc2ccccc12] | 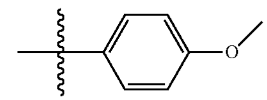 [SMILES: *c1ccc(OC)cc1] |
| 48-1 | 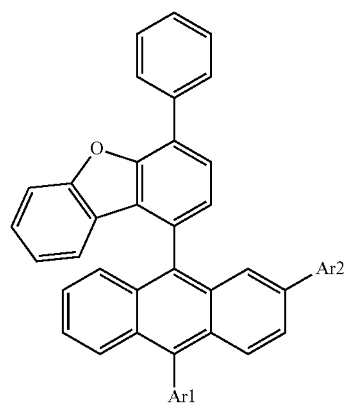 | 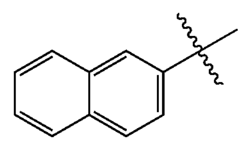 [SMILES: *c1ccc2ccccc2c1] | 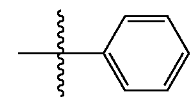 |

-continued
| No. | | Ar1 | Ar2 |
|---|---|---|---|
| 48-2 | 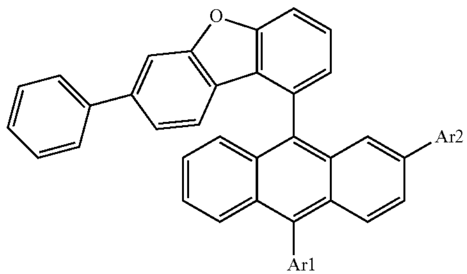 | 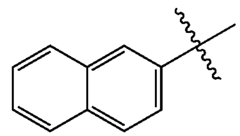 [SMILES: *c1ccc2ccccc2c1] | 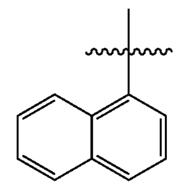 [SMILES: *c1cccc2ccccc12] |
| 48-3 | 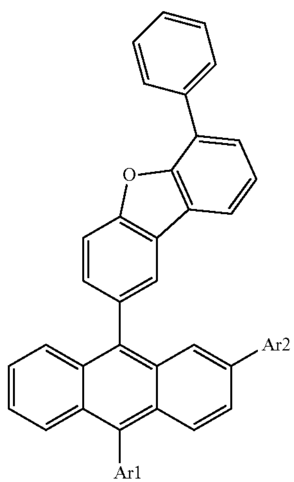 | 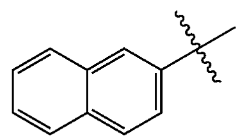 [SMILES: *c1ccc2ccccc2c1] | 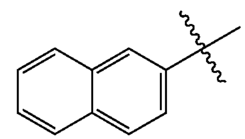 [SMILES: *c1ccc2ccccc2c1] |

-continued
| No. | | Ar1 | Ar2 |
|---|---|---|---|
| 48-4 | 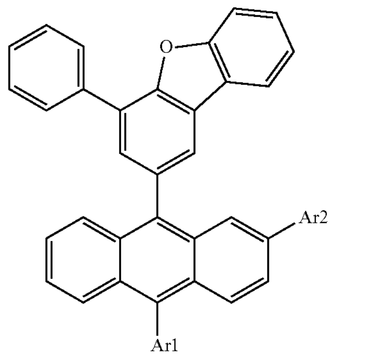 | 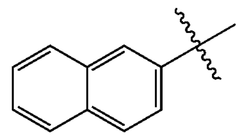 [SMILES: *c1ccc2ccccc2c1] | 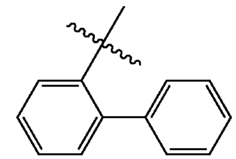 [SMILES: *c1ccccc1-c1ccccc1] |
| 48-5 | 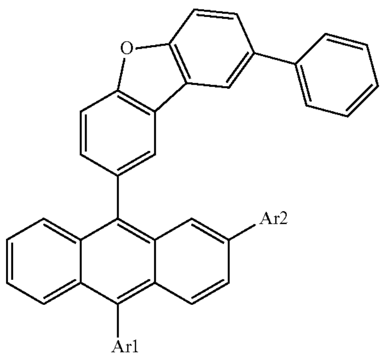 | 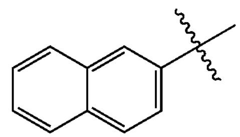 [SMILES: *c1ccc2ccccc2c1] | 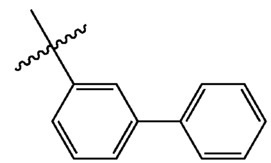 [SMILES: *c1cccc(-c2ccccc2)c1] |

-continued
| No. | | Ar1 | Ar2 |
|---|---|---|---|
| 48-6 | 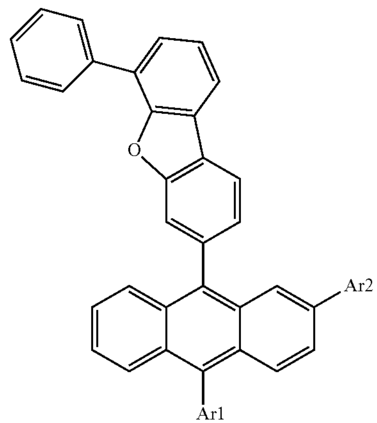 | 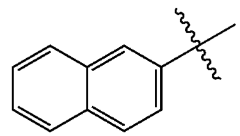 [SMILES: *c1ccc2ccccc2c1] | 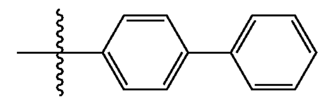 |
| 48-7 | 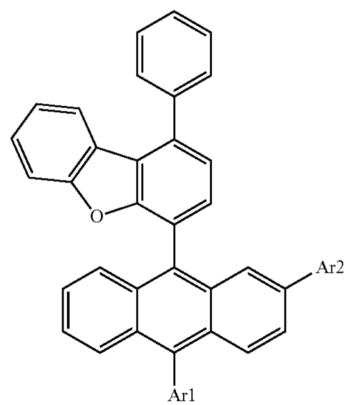 | 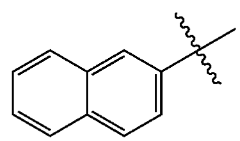 [SMILES: *c1ccc2ccccc2c1] | 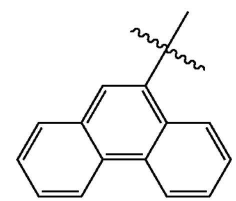 [SMILES: *c1cc2ccccc2c2ccccc12] |

-continued
| No. | | Ar1 | Ar2 |
|---|---|---|---|
| 48-8 | 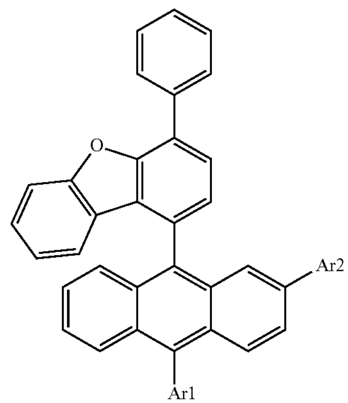 | 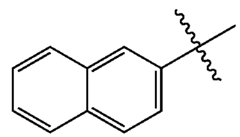 [SMILES: *c1ccc2ccccc2c1] | 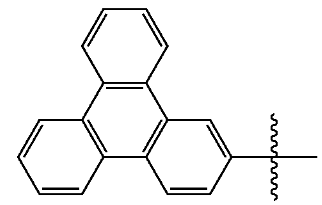 |
| 48-9 | 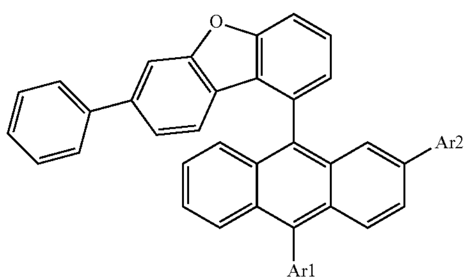 | 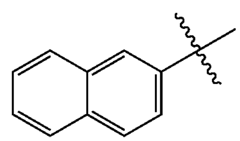 [SMILES: *c1ccc2ccccc2c1] | 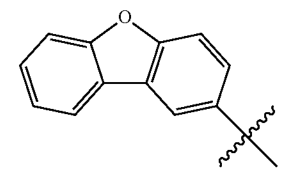 [SMILES: *c1ccc2oc3ccccc3c2c1] |

-continued
| No. | | Ar1 | Ar2 |
|---|---|---|---|
| 48-10 | 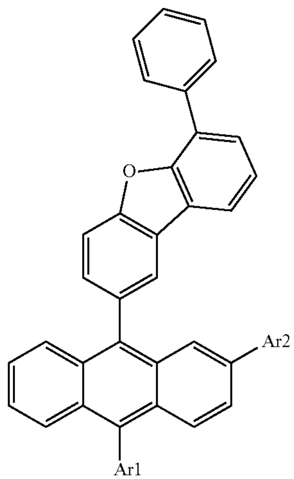 | 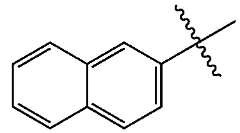 [SMILES: *c1ccc2ccccc2c1] | 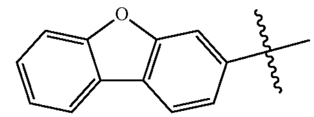 |
| 48-11 | 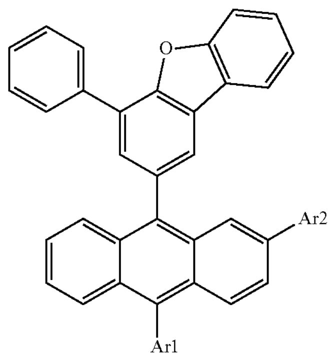 | 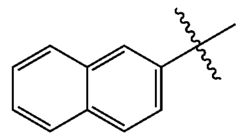 [SMILES: *c1ccc2ccccc2c1] | 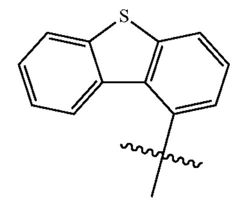 [SMILES: *c1cccc2sc3ccccc3c12] |

-continued
| No. | | Ar1 | Ar2 |
|---|---|---|---|
| 48-12 | 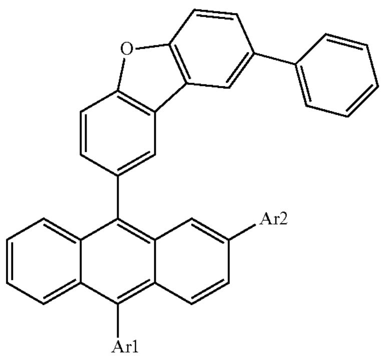 | 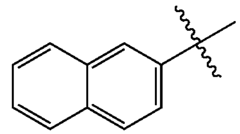 [SMILES: *c1ccc2ccccc2c1] | 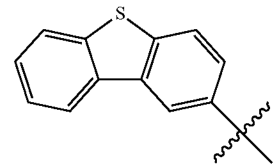 |
| 48-13 | 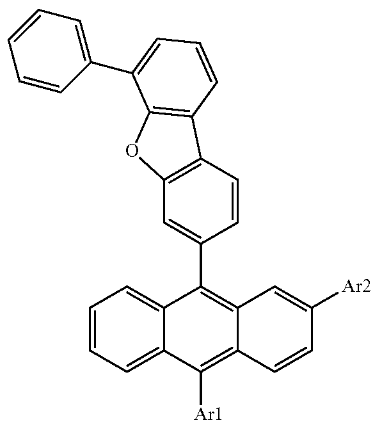 | 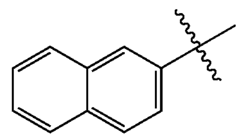 [SMILES: *c1ccc2ccccc2c1] | 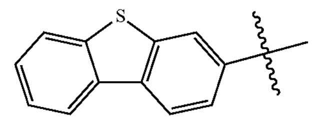 |

-continued
| No. | | Ar1 | Ar2 |
|---|---|---|---|
| 48-14 | 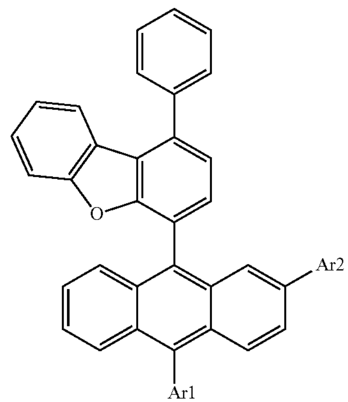 | 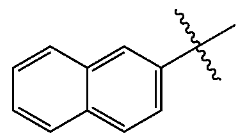 [SMILES: *c1ccc2ccccc2c1] | 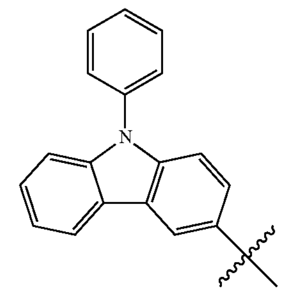 [SMILES: *c1ccc2c(c1)c1ccccc1n2-c1ccccc1] |
| 48-15 | 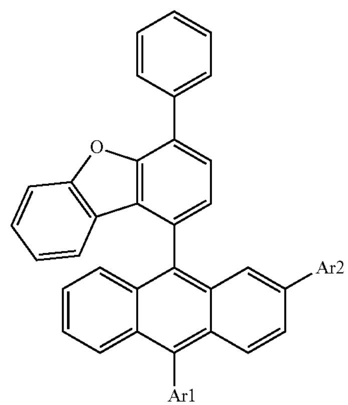 | 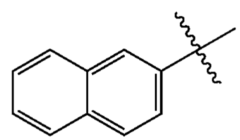 [SMILES: *c1ccc2ccccc2c1] | 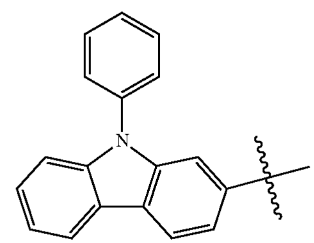 [SMILES: *c1ccc2c3ccccc3n(-c3ccccc3)c2c1] |

-continued
| No. | | Ar1 | Ar2 |
| --- | --- | --- | --- |
| 48-16 | 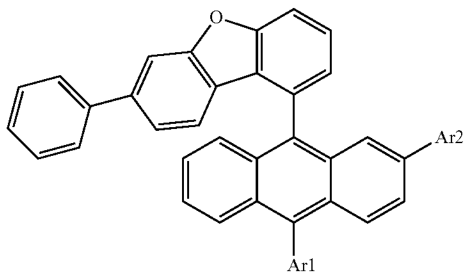 | 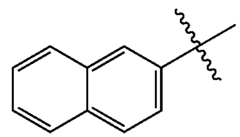 [SMILES: *c1ccc2ccccc2c1] | 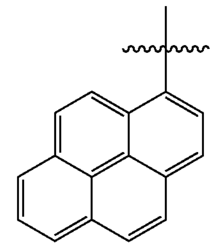 [SMILES: *c1ccc2ccc3cccc4ccc1c2c34] |
| 48-17 | 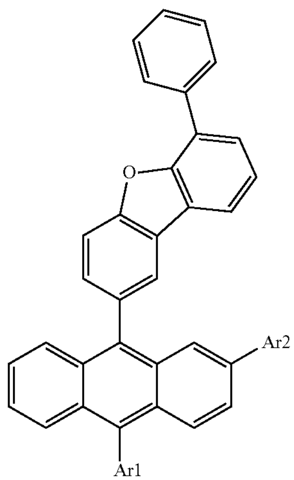 | 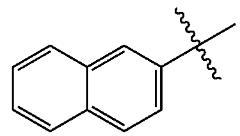 [SMILES: *c1ccc2ccccc2c1] | 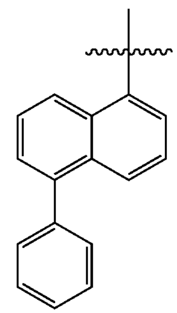 [SMILES: *c1cccc2c(-c3ccccc3)cccc12] |

-continued
| No. | | Ar1 | Ar2 |
|---|---|---|---|
| 48-18 | 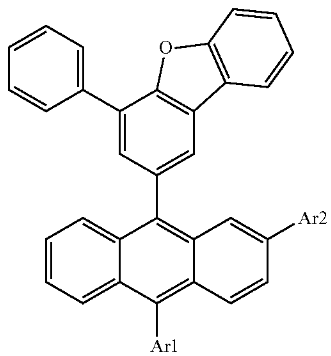 | 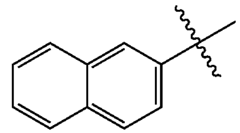 [SMILES: *c1ccc2ccccc2c1] | 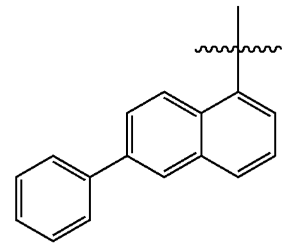 [SMILES: *c1cccc2cc(-c3ccccc3)ccc12] |
| 48-19 | 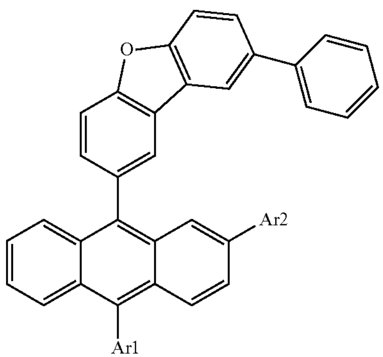 | 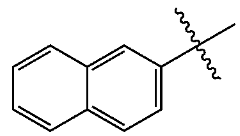 [SMILES: *c1ccc2ccccc2c1] | 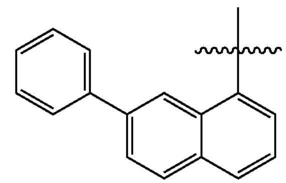 [SMILES: *c1cccc2ccc(-c3ccccc3)cc12] |

-continued
| No. | | Ar1 | Ar2 |
|---|---|---|---|
| 48-20 | 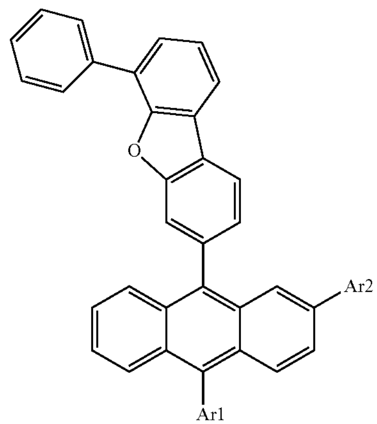 | 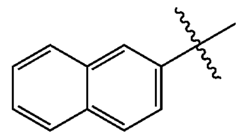 [SMILES: *c1ccc2ccccc2c1] | 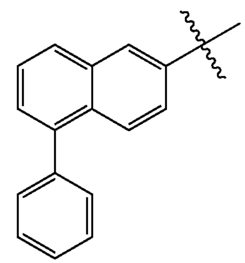 [SMILES: *c1ccc2c(-c3ccccc3)cccc2c1] |
| 48-21 | 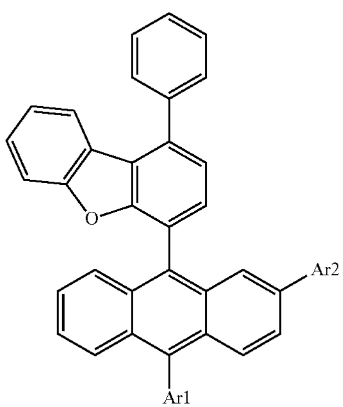 | 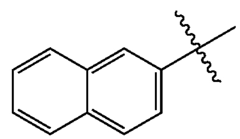 [SMILES: *c1ccc2ccccc2c1] | 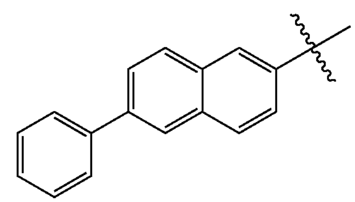 [SMILES: *c1ccc2cc(-c3ccccc3)ccc2c1] |

-continued
| No. | | Ar1 | Ar2 |
|---|---|---|---|
| 48-22 | 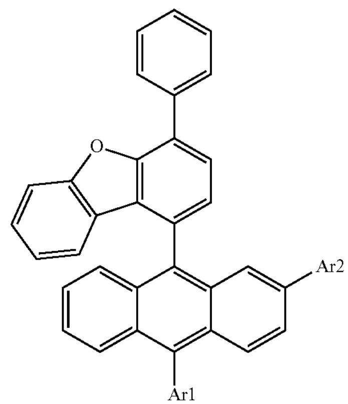 | 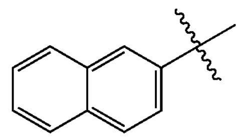 [SMILES: *c1ccc2ccccc2c1] | 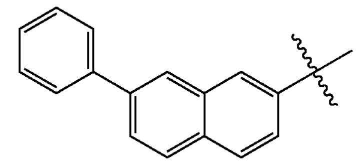 [SMILES: *c1ccc2ccc(-c3ccccc3)cc2c1] |
| 48-23 | 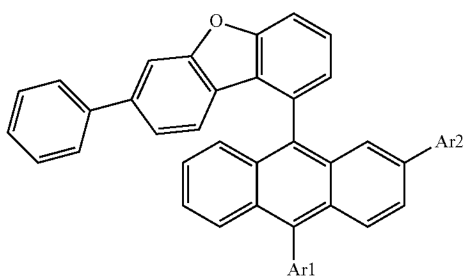 | 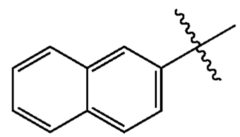 [SMILES: *c1ccc2ccccc2c1] | 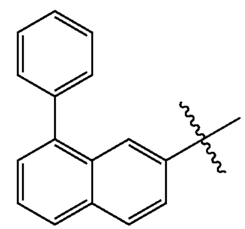 [SMILES: *c1ccc2cccc(-c3ccccc3)c2c1] |

-continued
| No. | | Ar1 | Ar2 |
|---|---|---|---|
| 48-24 | 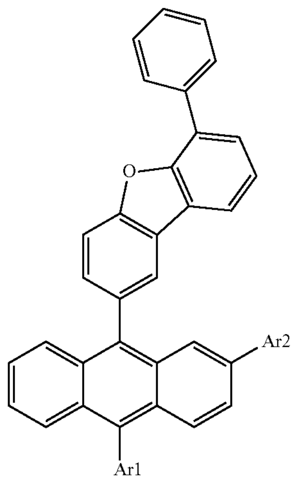 | 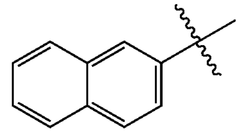 [SMILES: *c1ccc2ccccc2c1] | 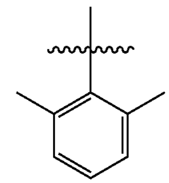 |
| 48-25 | 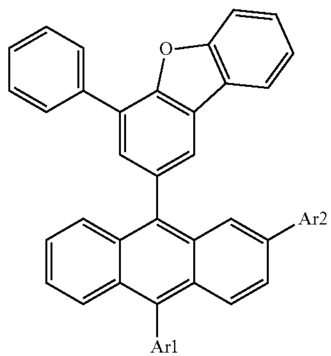 | 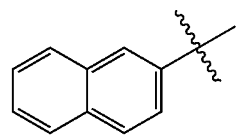 [SMILES: *c1ccc2ccccc2c1] | 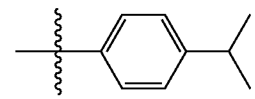 [SMILES: *c1ccc(C(C)C)cc1] |

-continued
| No. | | Ar1 | Ar2 |
|---|---|---|---|
| 48-26 | 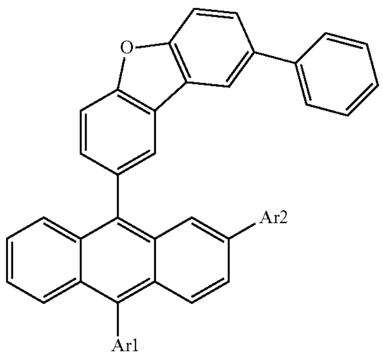 | 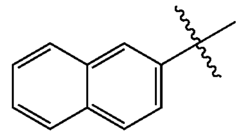 [SMILES: *c1ccc2ccccc2c1] | 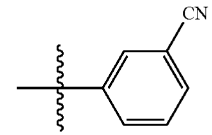 [SMILES: *c1cccc(C#N)c1] |
| 48-27 | 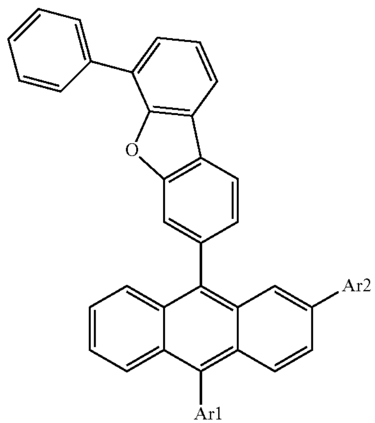 | 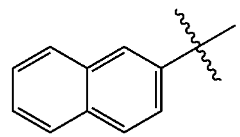 [SMILES: *c1ccc2ccccc2c1] | 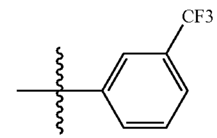 [SMILES: *c1cccc(C(F)(F)F)c1] |

-continued
| No. | | Ar1 | Ar2 |
|---|---|---|---|
| 48-28 | 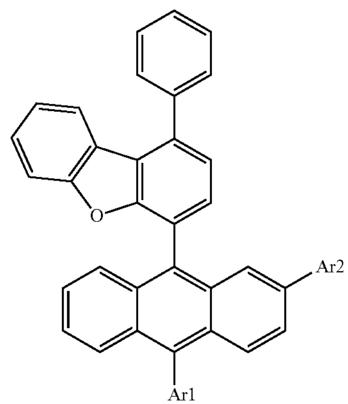 | 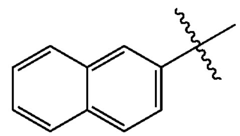 [SMILES: *c1ccc2ccccc2c1] | 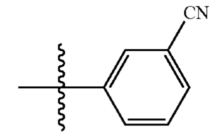 [SMILES: *c1cccc(C#N)c1] |
| 48-29 | 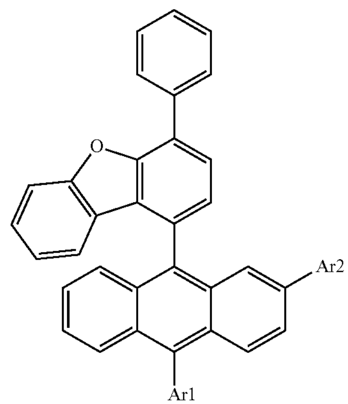 | 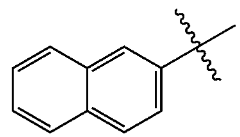 [SMILES: *c1ccc2ccccc2c1] | 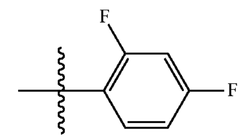 [SMILES: *c1ccc(F)cc1F] |

-continued
| No. | | Ar1 | Ar2 |
|---|---|---|---|
| 49-1 | 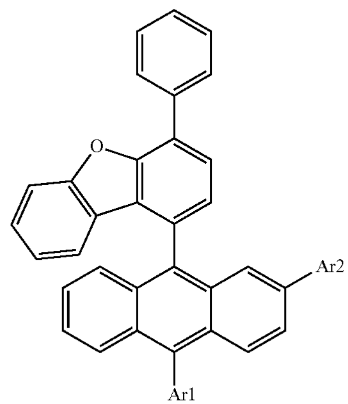 | 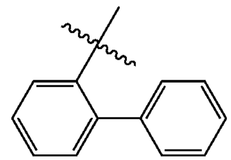 [SMILES: *c1ccccc1-c1ccccc1] | 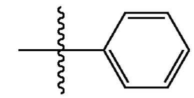 |
| 49-2 | 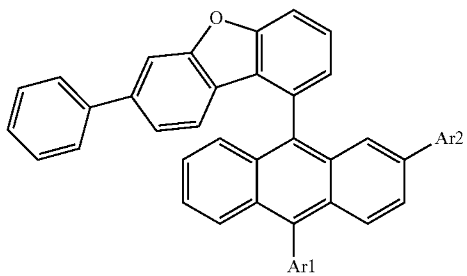 | 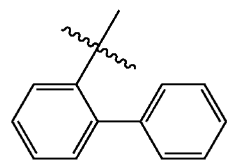 [SMILES: *c1ccccc1-c1ccccc1] | 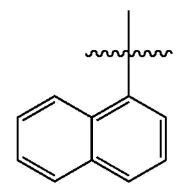 [SMILES: *c1cccc2ccccc12] |

-continued
| No. | | Ar1 | Ar2 |
|---|---|---|---|
| 49-3 | 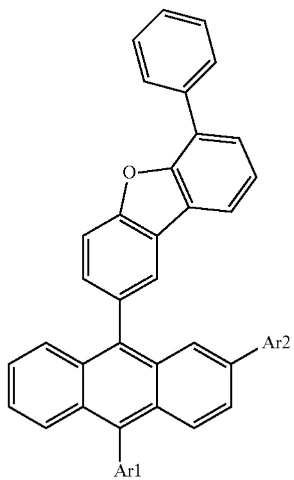 | 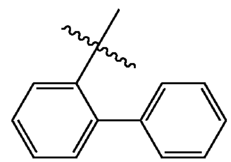 [SMILES: *c1ccccc1-c1ccccc1] | 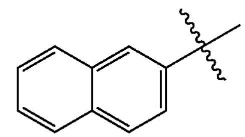 [SMILES: *c1ccc2ccccc2c1] |
| 49-4 | 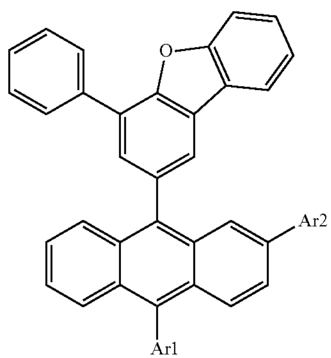 | 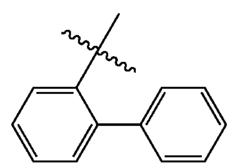 [SMILES: *c1ccccc1-c1ccccc1] | 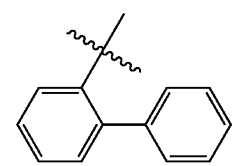 [SMILES: *c1ccccc1-c1ccccc1] |

-continued
| No. | | Ar1 | Ar2 |
|---|---|---|---|
| 49-5 | 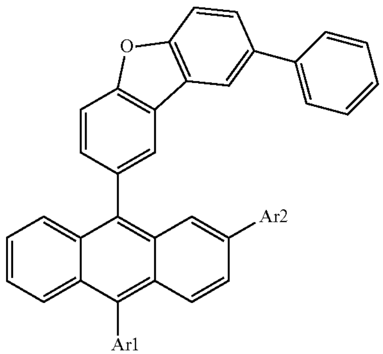 | 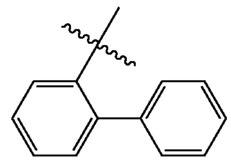 [SMILES: *c1ccccc1-c1ccccc1] | 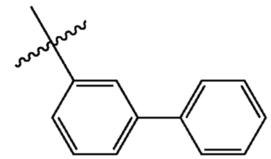 [SMILES: *c1cccc(-c2ccccc2)c1] |
| 49-6 | 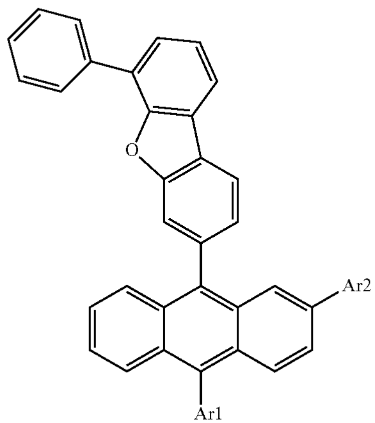 | 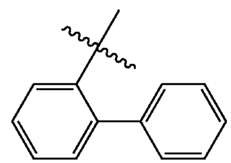 [SMILES: *c1ccccc1-c1ccccc1] | 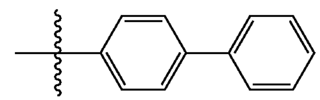 |

-continued
| No. | | Ar1 | Ar2 |
|---|---|---|---|
| 49-7 | 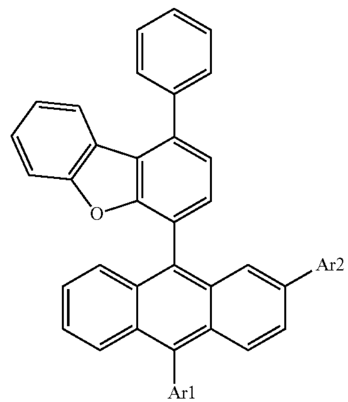 | 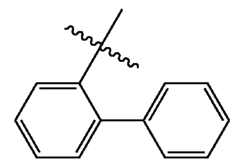 [SMILES: *c1ccccc1-c1ccccc1] | 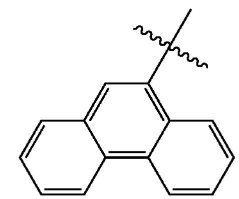 [SMILES: *c1cc2ccccc2c2ccccc12] |
| 49-8 | 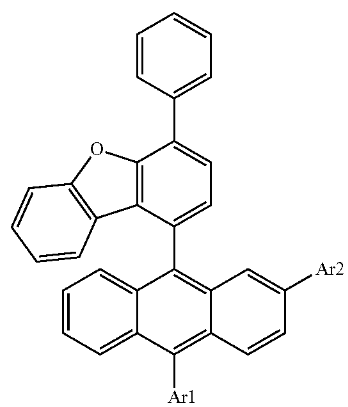 | 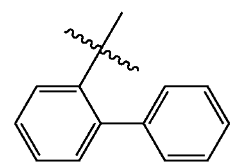 [SMILES: *c1ccccc1-c1ccccc1] | 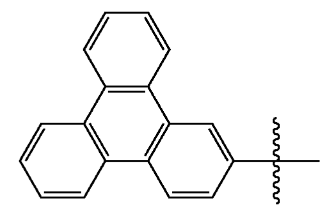 [SMILES: *c1ccc2c3ccccc3c3ccccc3c2c1] |

-continued
| No. | | Ar1 | Ar2 |
|---|---|---|---|
| 49-9 | 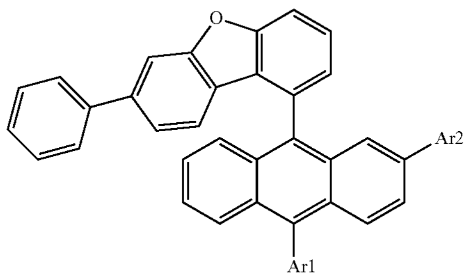 | 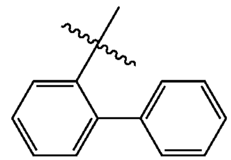 [SMILES: *c1ccccc1-c1ccccc1] | 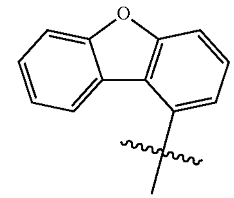 |
| 49-10 | 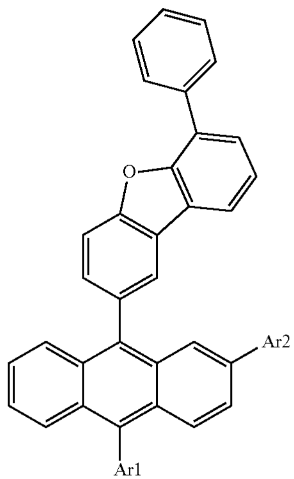 | 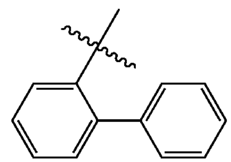 [SMILES: *c1ccccc1-c1ccccc1] | 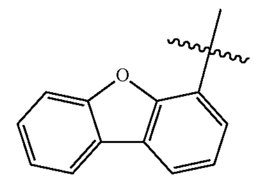 |

-continued
| No. | | Ar1 | Ar2 |
|---|---|---|---|
| 49-11 | 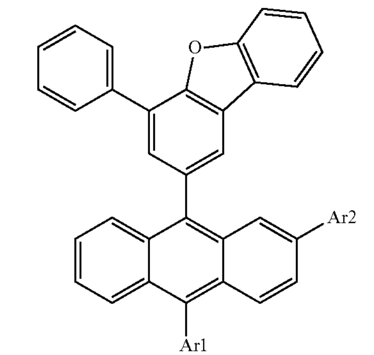 | 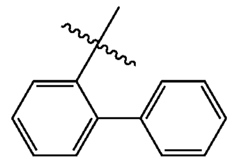 [SMILES: *c1ccccc1-c1ccccc1] | 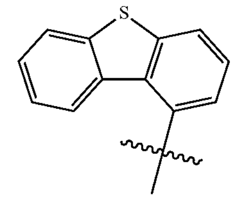 |
| 49-12 | 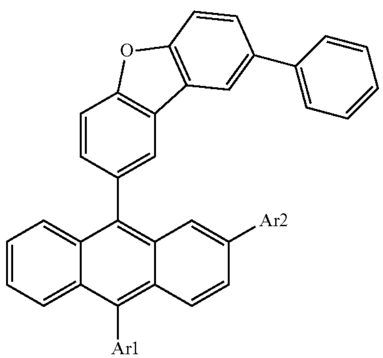 | 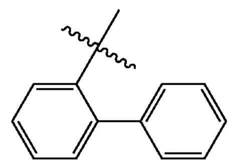 [SMILES: *c1ccccc1-c1ccccc1] | 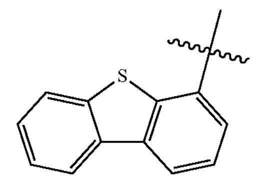 [SMILES: *c1cccc2c1sc1ccccc12] |

-continued
| No. | | Ar1 | Ar2 |
|---|---|---|---|
| 49-13 | 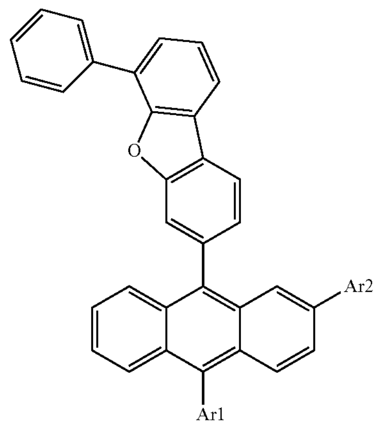 | 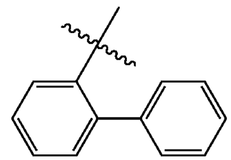 [SMILES: *c1ccccc1-c1ccccc1] | 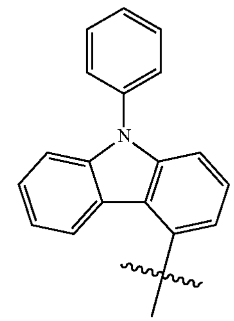 [SMILES: *c1cccc2c1c1ccccc1n2-c1ccccc1] |
| 49-14 | 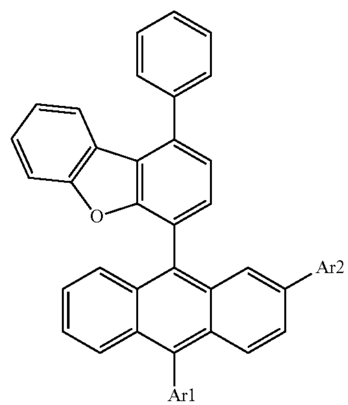 | 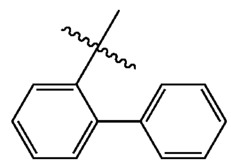 [SMILES: *c1ccccc1-c1ccccc1] | 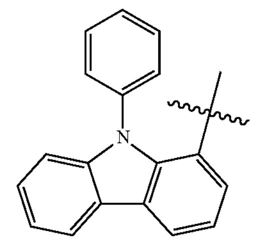 [SMILES: *c1cccc2c3ccccc3n(-c3ccccc3)c12] |

-continued
| No. | | Ar1 | Ar2 |
|---|---|---|---|
| 49-15 | 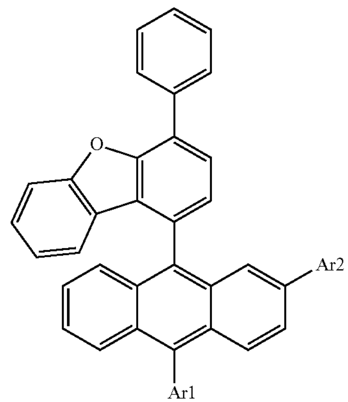 | 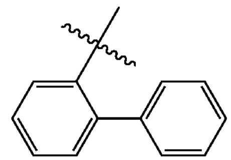 [SMILES: *c1ccccc1-c1ccccc1] | 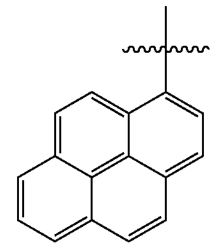 [SMILES: *c1ccc2ccc3cccc4ccc1c2c34] |
| 49-16 | 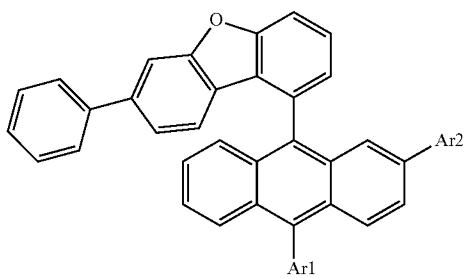 | 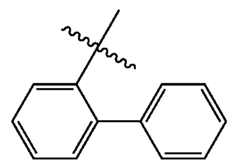 [SMILES: *c1ccccc1-c1ccccc1] | 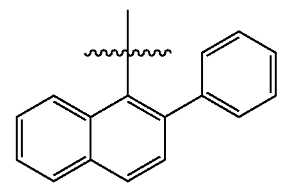 [SMILES: *c1c(-c2ccccc2)ccc2ccccc12] |

-continued
| No. | | Ar1 | Ar2 |
|---|---|---|---|
| 49-17 | 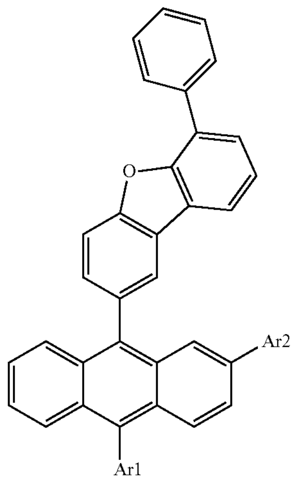 | 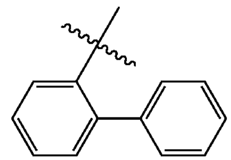 [SMILES: *c1ccccc1-c1ccccc1] | 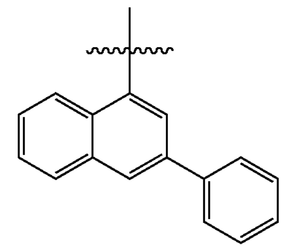 [SMILES: *c1cc(-c2ccccc2)cc2ccccc12] |
| 49-18 | 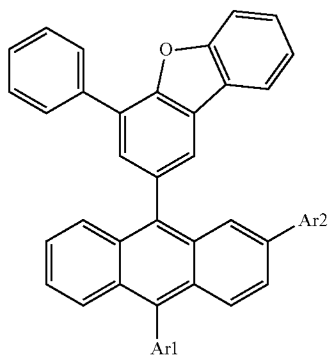 | 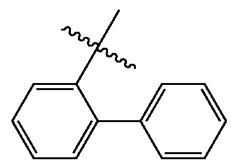 [SMILES: *c1ccccc1-c1ccccc1] | 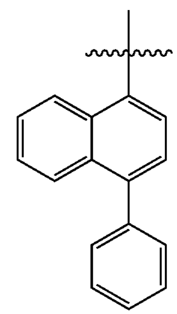 [SMILES: *c1ccc(-c2ccccc2)c2ccccc12] |

-continued
| No. | | Ar1 | Ar2 |
| --- | --- | --- | --- |
| 49-19 | 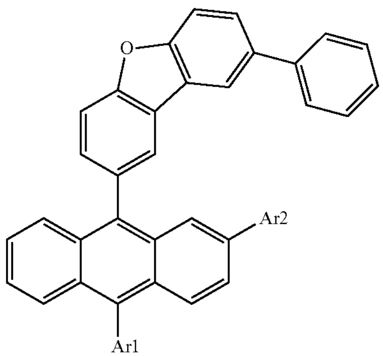 | 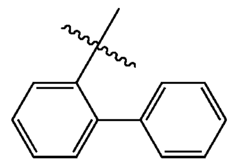 [SMILES: *c1ccccc1-c1ccccc1] | 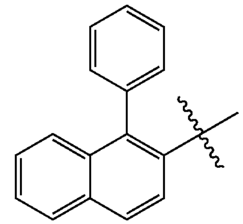 [SMILES: *c1ccc2ccccc2c1-c1ccccc1] |
| 49-20 | 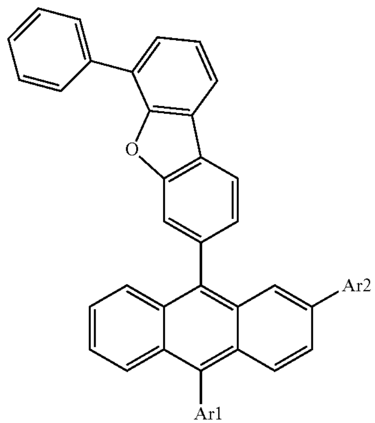 | 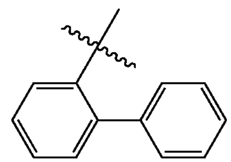 [SMILES: *c1ccccc1-c1ccccc1] | 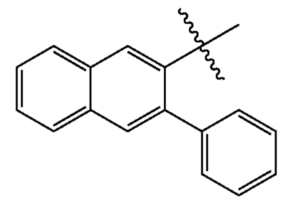 [SMILES: *c1cc2ccccc2cc1-c1ccccc1] |

-continued
| No. | | Ar1 | Ar2 |
|---|---|---|---|
| 49-21 | 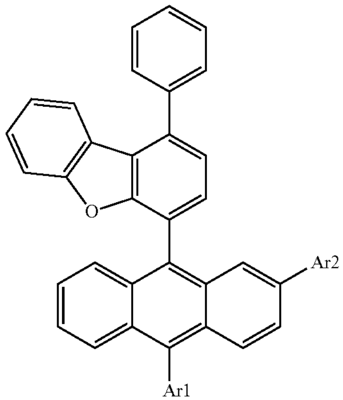  | 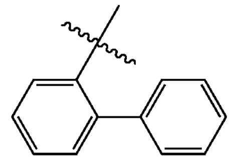 [SMILES: *c1ccccc1-c1ccccc1] | 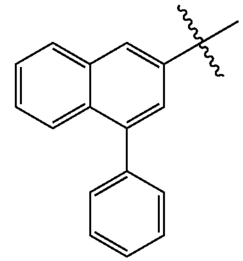 [SMILES: *c1cc(-c2ccccc2)c2ccccc2c1] |
| 49-22 | 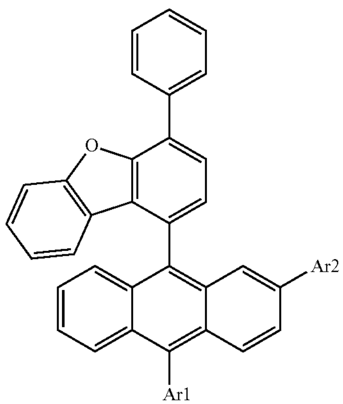  | 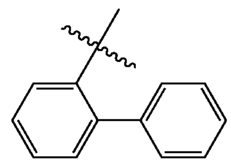 [SMILES: *c1ccccc1-c1ccccc1] | 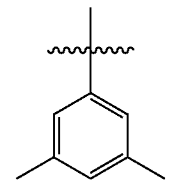 |

-continued
| No. | | Ar1 | Ar2 |
|---|---|---|---|
| 49-23 | 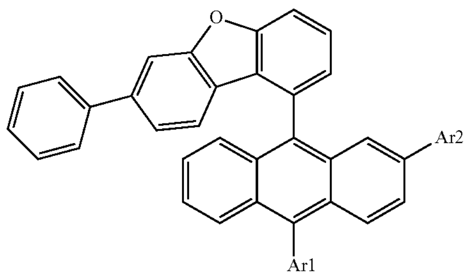 | 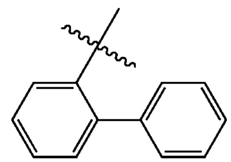 [SMILES: *c1ccccc1-c1ccccc1] | 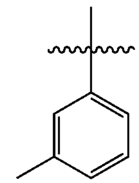 [SMILES: *c1cccc(C)c1] |
| 49-24 | 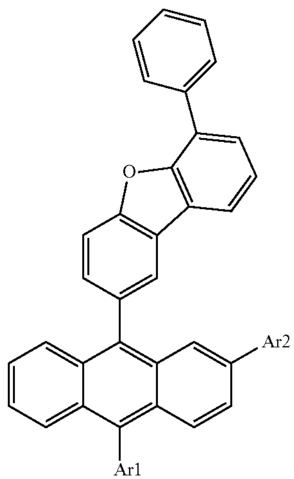 | 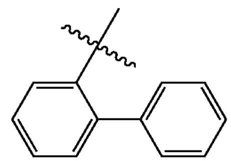 [SMILES: *c1ccccc1-c1ccccc1] | 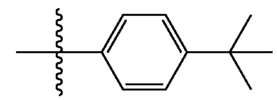 |

-continued
| No. | | Ar1 | Ar2 |
|---|---|---|---|
| 49-25 | 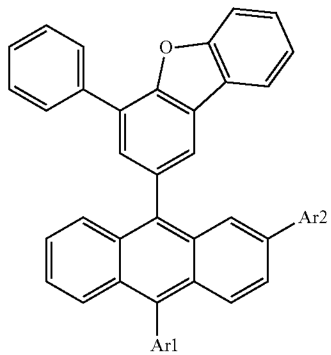 | 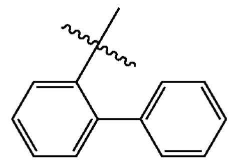 [SMILES: *c1ccccc1-c1ccccc1] | 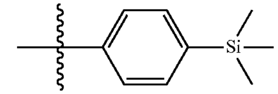 [SMILES: *c1ccc([Si](C)(C)C)cc1] |
| 49-26 | 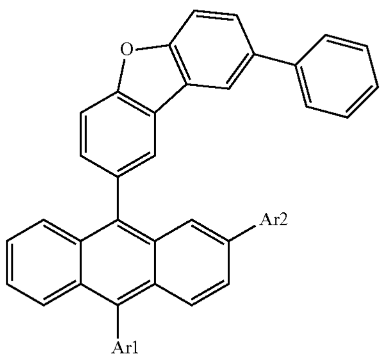 | 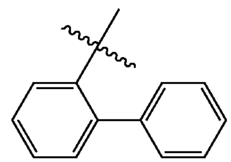 [SMILES: *c1ccccc1-c1ccccc1] | 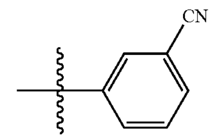 [SMILES: *c1cccc(C#N)c1] |

-continued
| No. | | Ar1 | Ar2 |
|---|---|---|---|
| 49-27 | 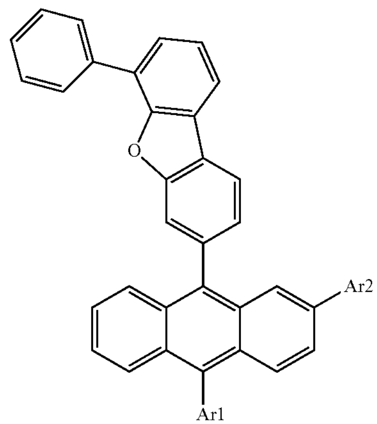 | 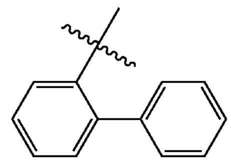 [SMILES: *c1ccccc1-c1ccccc1] | 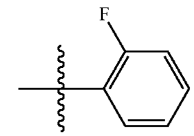 [SMILES: *c1ccccc1F] |
| 49-28 | 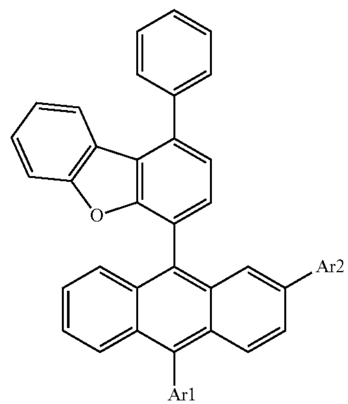 | 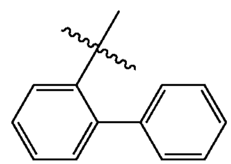 [SMILES: *c1ccccc1-c1ccccc1] | 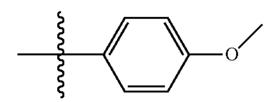 [SMILES: *c1ccc(OC)cc1] |

-continued
| No. | | Ar1 | Ar2 |
|---|---|---|---|
| 50-1 | 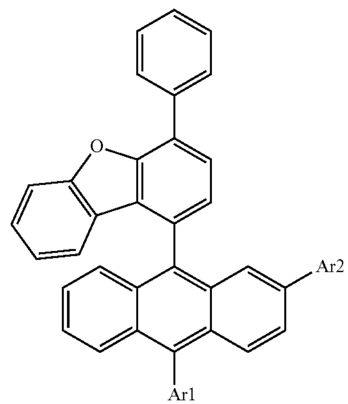 | 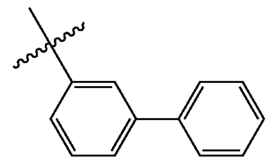 [SMILES: *c1cccc(-c2ccccc2)c1] | 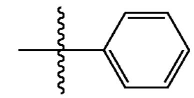 |
| 50-2 | 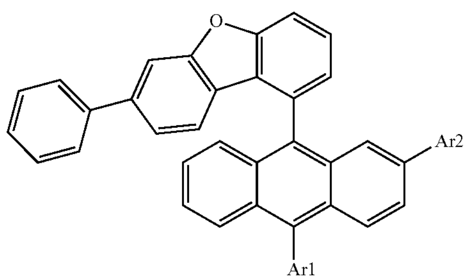 | 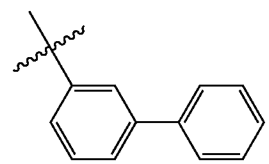 [SMILES: *c1cccc(-c2ccccc2)c1] | 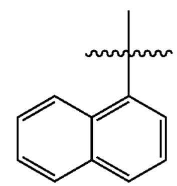 [SMILES: *c1cccc2ccccc12] |

-continued
| No. | | Ar1 | Ar2 |
|---|---|---|---|
| 50-3 | 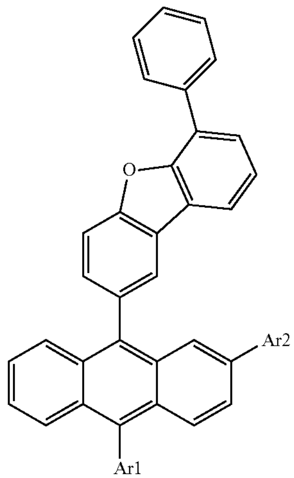  | 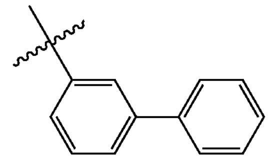 [SMILES: *c1cccc(-c2ccccc2)c1] | 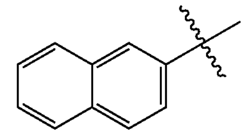 [SMILES: *c1ccc2ccccc2c1] |
| 50-4 | 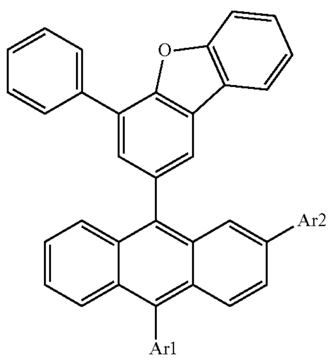  | 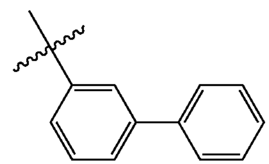 [SMILES: *c1cccc(-c2ccccc2)c1] | 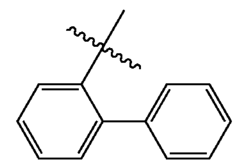 [SMILES: *c1ccccc1-c1ccccc1] |

-continued
| No. | | Ar1 | Ar2 |
|---|---|---|---|
| 50-5 | 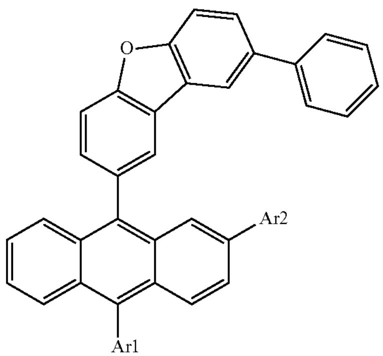 | 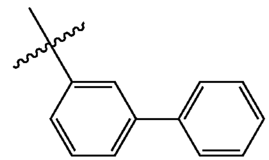 [SMILES: *c1cccc(-c2ccccc2)c1] | 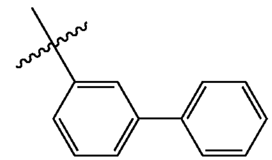 [SMILES: *c1cccc(-c2ccccc2)c1] |
| 50-6 | 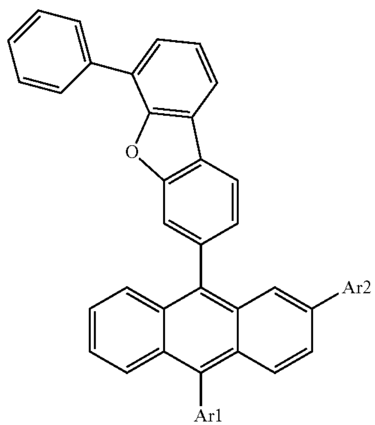 | 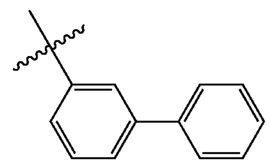 [SMILES: *c1cccc(-c2ccccc2)c1] | 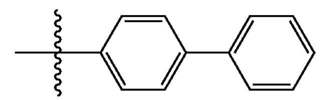 [SMILES: *c1ccc(-c2ccccc2)cc1] |

-continued
| No. | | Ar1 | Ar2 |
|---|---|---|---|
| 50-7 | 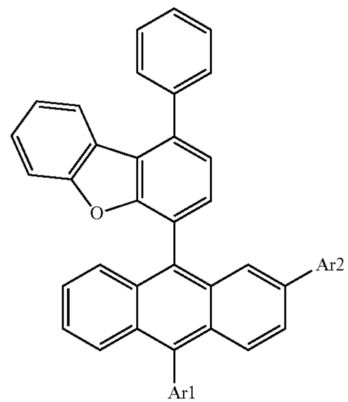 | 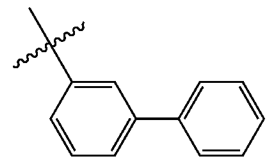 [SMILES: *c1cccc(-c2ccccc2)c1] | 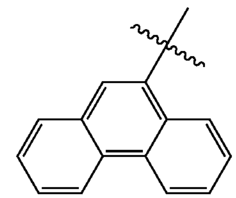 [SMILES: *c1cc2ccccc2c2ccccc12] |
| 50-8 | 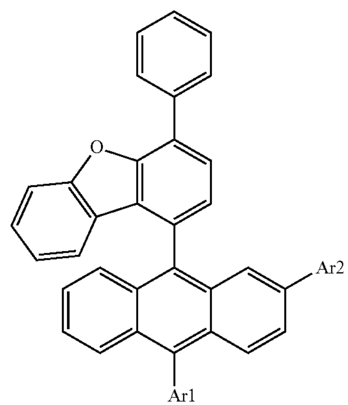 | 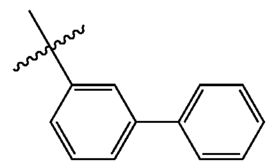 [SMILES: *c1cccc(-c2ccccc2)c1] | 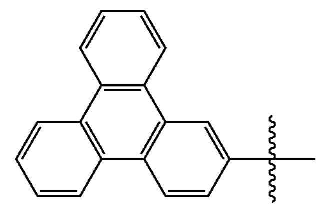 [SMILES: *c1ccc2c3ccccc3c3ccccc3c2c1] |

-continued
| No. | | Ar1 | Ar2 |
|---|---|---|---|
| 50-9 | 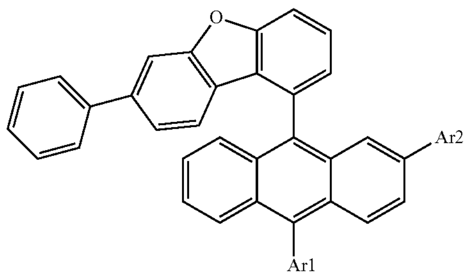 | 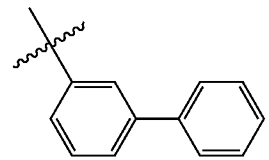 [SMILES: *c1cccc(-c2ccccc2)c1] | 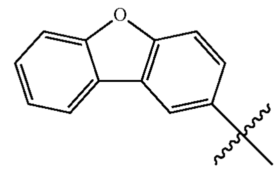 [SMILES: *c1ccc2oc3ccccc3c2c1] |
| 50-10 | 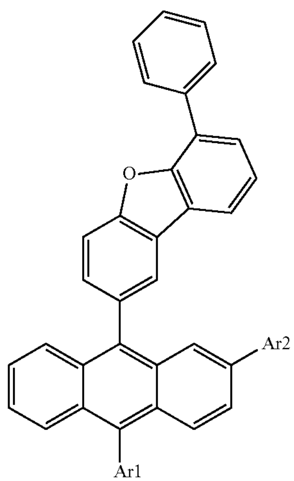 | 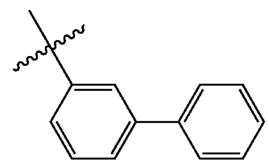 [SMILES: *c1cccc(-c2ccccc2)c1] | 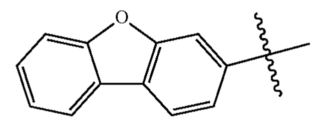 |

-continued
| No. | | Ar1 | Ar2 |
|---|---|---|---|
| 50-11 | 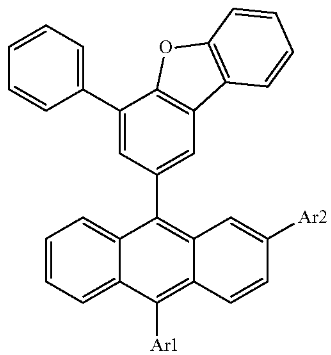 | 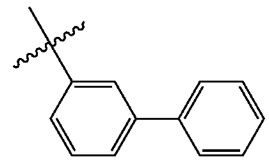 [SMILES: *c1cccc(-c2ccccc2)c1] | 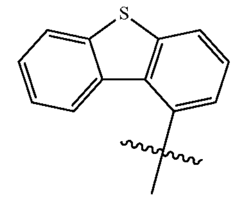 |
| 50-12 | 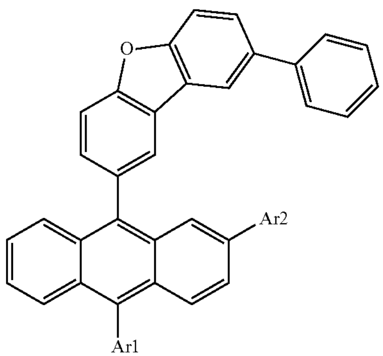 | 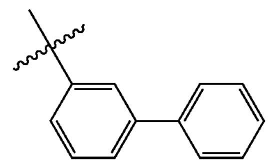 [SMILES: *c1cccc(-c2ccccc2)c1] | 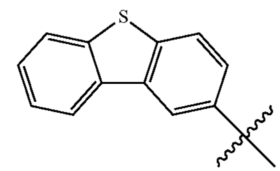 |

-continued
| No. | | Ar1 | Ar2 |
|---|---|---|---|
| 50-13 | 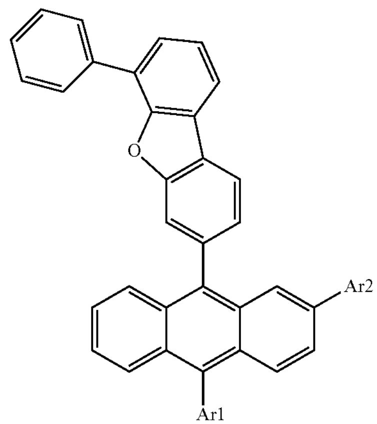 | 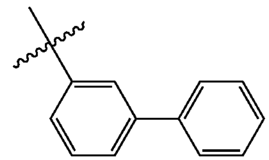 [SMILES: *c1cccc(-c2ccccc2)c1] | 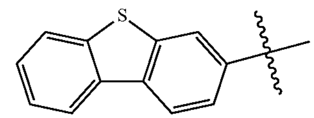 |
| 50-14 | 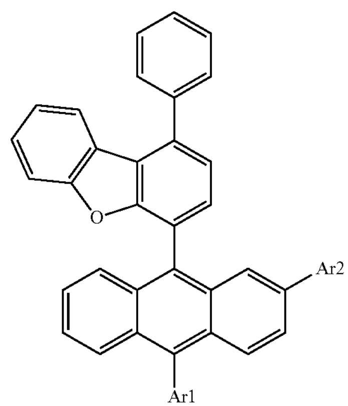 | 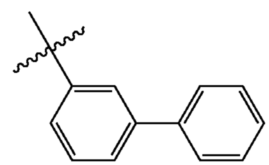 [SMILES: *c1cccc(-c2ccccc2)c1] | 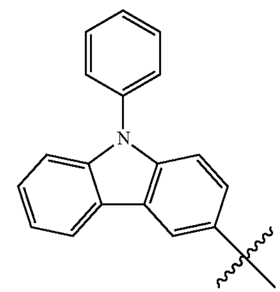 [SMILES: *c1ccc2c(c1)c1ccccc1n2-c1ccccc1] |

-continued
| No. | | Ar1 | Ar2 |
|---|---|---|---|
| 50-15 | 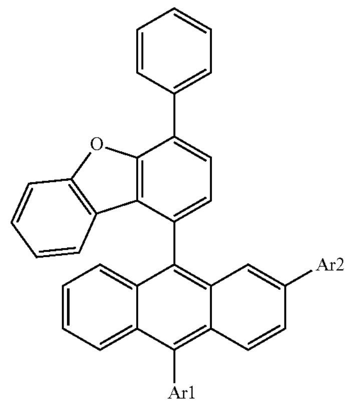 | 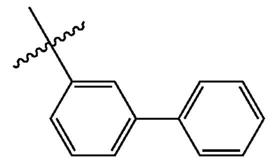 [SMILES: *c1cccc(-c2ccccc2)c1] | 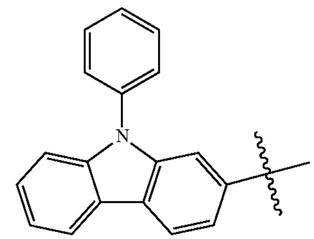 [SMILES: *c1ccc2c3ccccc3n(-c3ccccc3)c2c1] |
| 50-16 | 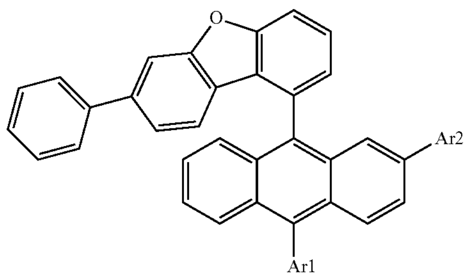 | 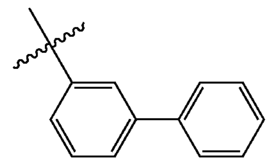 [SMILES: *c1cccc(-c2ccccc2)c1] | 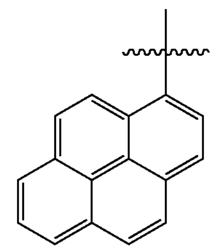 [SMILES: *c1ccc2ccc3cccc4ccc1c2c34] |

-continued
| No. | | Ar1 | Ar2 |
|---|---|---|---|
| 50-17 | 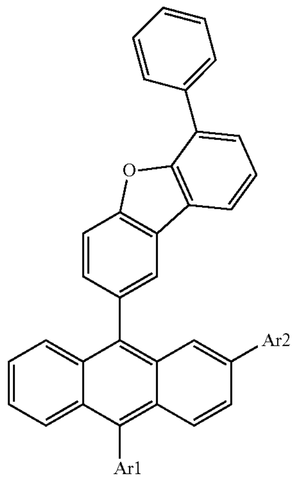 | 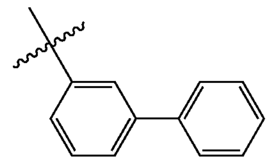 [SMILES: *c1cccc(-c2ccccc2)c1] | 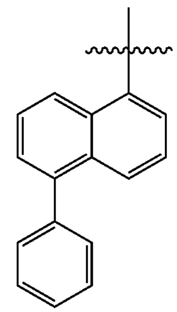 [SMILES: *c1cccc2c(-c3ccccc3)cccc12] |
| 50-18 | 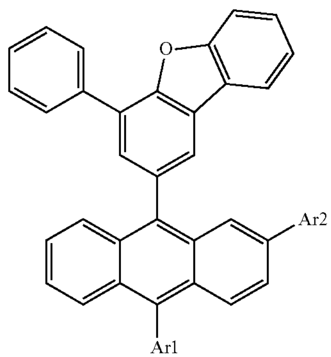 | 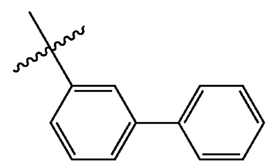 [SMILES: *c1cccc(-c2ccccc2)c1] | 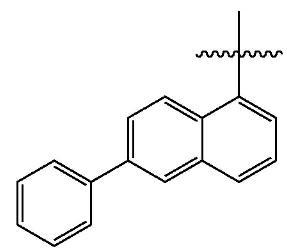 [SMILES: *c1cccc2cc(-c3ccccc3)ccc12] |

-continued
| No. | | Ar1 | Ar2 |
|---|---|---|---|
| 50-19 | 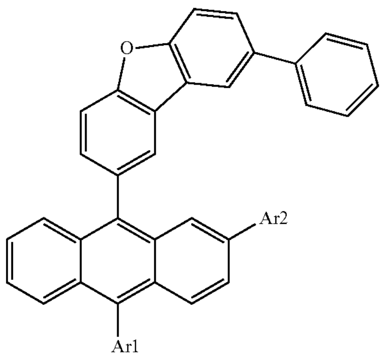 | 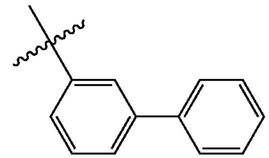 [SMILES: *c1cccc(-c2ccccc2)c1] | 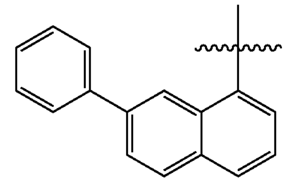 [SMILES: *c1cccc2ccc(-c3ccccc3)cc12] |
| 50-20 | 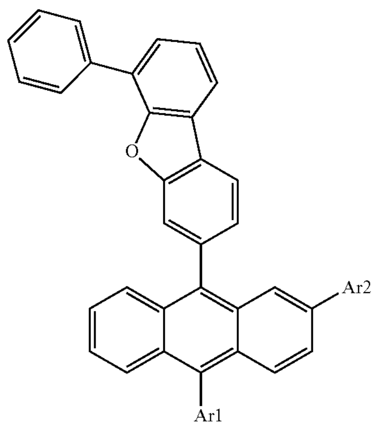 | 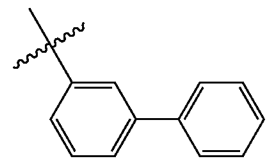 [SMILES: *c1cccc(-c2ccccc2)c1] | 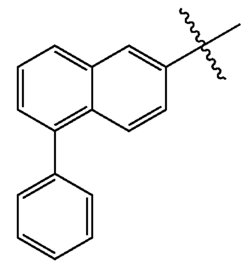 [SMILES: *c1ccc2c(-c3ccccc3)cccc2c1] |

-continued
| No. | | Ar1 | Ar2 |
|---|---|---|---|
| 50-21 | 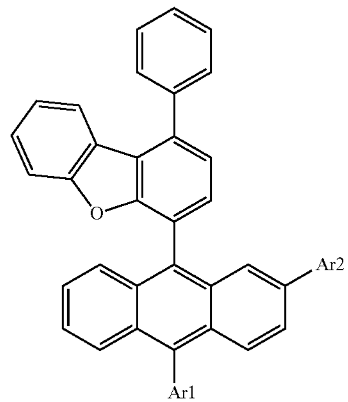 | 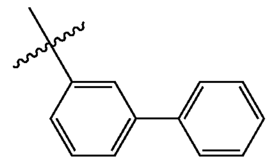 [SMILES: *c1cccc(-c2ccccc2)c1] | 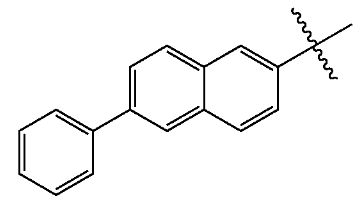 [SMILES: *c1ccc2cc(-c3ccccc3)ccc2c1] |
| 50-22 | 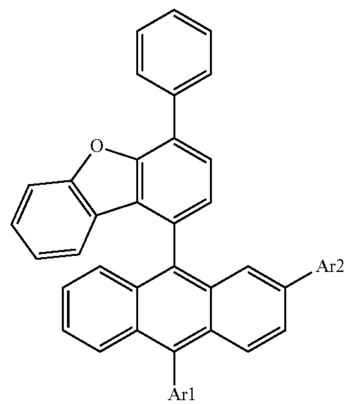 | 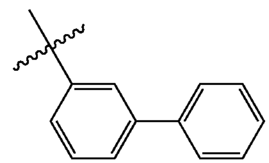 [SMILES: *c1cccc(-c2ccccc2)c1] | 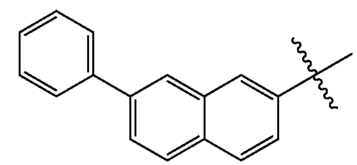 [SMILES: *c1ccc2ccc(-c3ccccc3)cc2c1] |

-continued
| No. | | Ar1 | Ar2 |
|---|---|---|---|
| 50-23 | 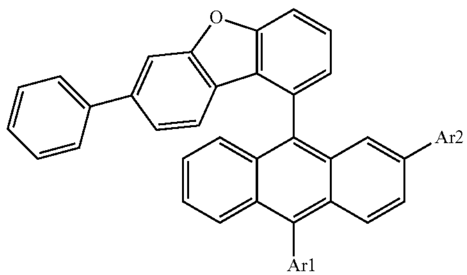 | 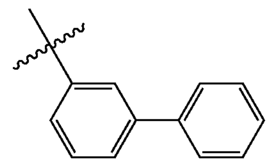 [SMILES: *c1cccc(-c2ccccc2)c1] | 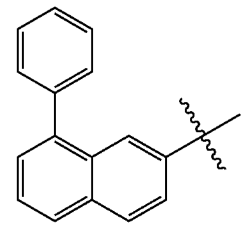 [SMILES: *c1ccc2cccc(-c3ccccc3)c2c1] |
| 50-24 | 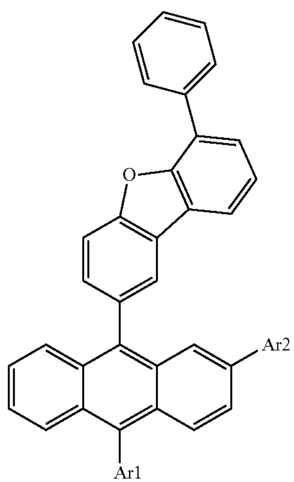 | 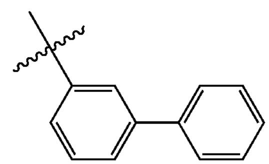 [SMILES: *c1cccc(-c2ccccc2)c1] | 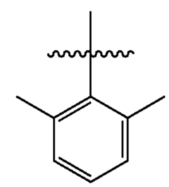 |

-continued
| No. | | Ar1 | Ar2 |
|---|---|---|---|
| 50-25 | 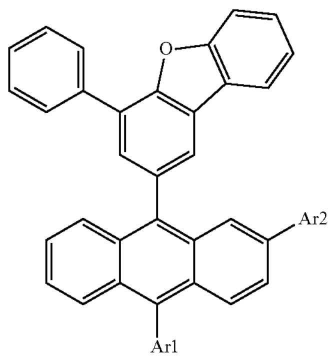 | 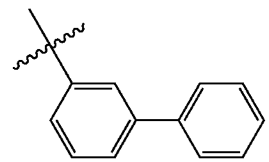 [SMILES: *c1cccc(-c2ccccc2)c1] | 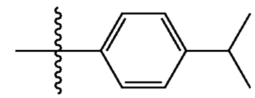 [SMILES: *c1ccc(C(C)C)cc1] |
| 50-26 | 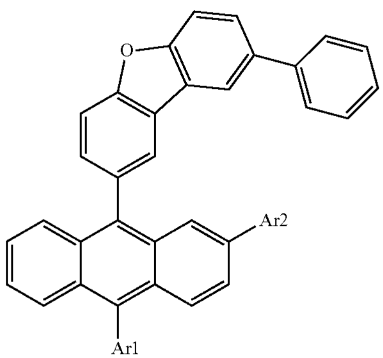 | 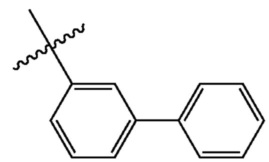 [SMILES: *c1cccc(-c2ccccc2)c1] | 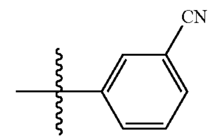 [SMILES: *c1cccc(C#N)c1] |

-continued
| No. | | Ar1 | Ar2 |
|---|---|---|---|
| 50-27 | 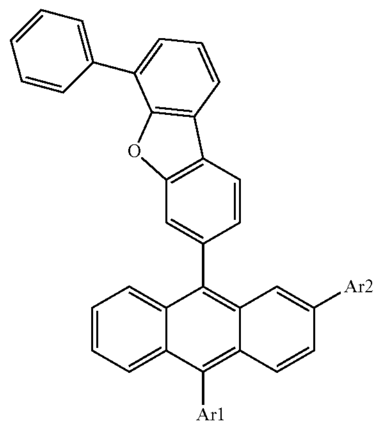 | 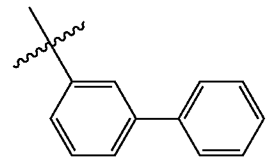 [SMILES: *c1cccc(-c2ccccc2)c1] | 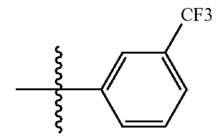 [SMILES: *c1cccc(C(F)(F)F)c1] |
| 50-28 | 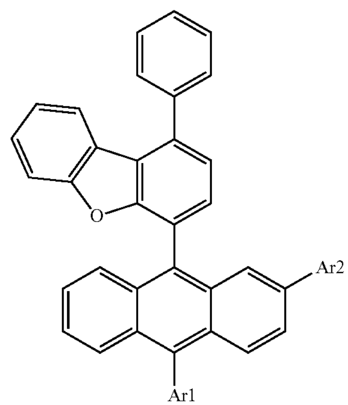 | 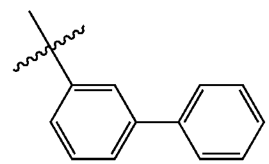 [SMILES: *c1cccc(-c2ccccc2)c1] | 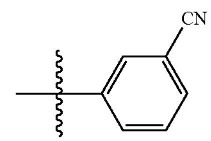 |

-continued
| No. | | Ar1 | Ar2 |
| --- | --- | --- | --- |
| 50-29 | 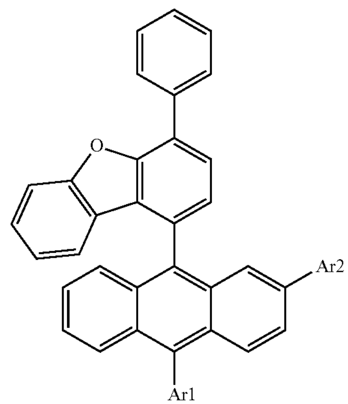 | 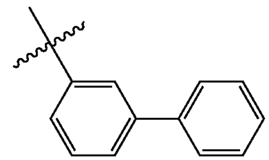 [SMILES: *c1cccc(-c2ccccc2)c1] | 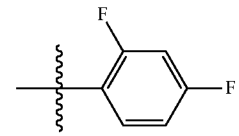 [SMILES: *c1ccc(F)cc1F] |
| 51-1 | 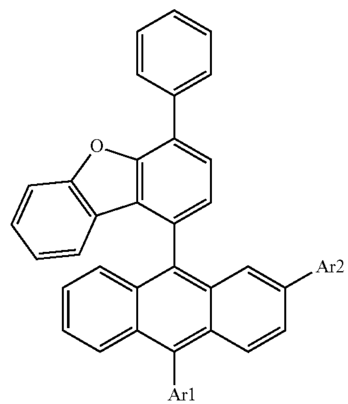 | 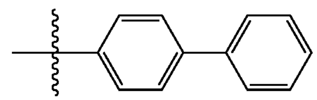 [SMILES: *c1ccc(-c2ccccc2)cc1] | 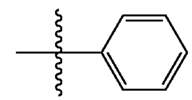 |

-continued
| No. | | Ar1 | Ar2 |
|---|---|---|---|
| 51-2 | 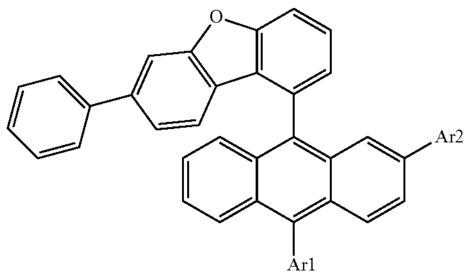 | 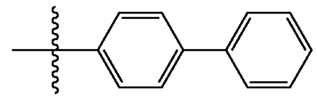 [SMILES: *c1ccc(-c2ccccc2)cc1] | 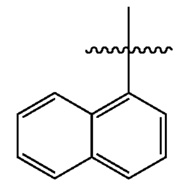 [SMILES: *c1cccc2ccccc12] |
| 51-3 | 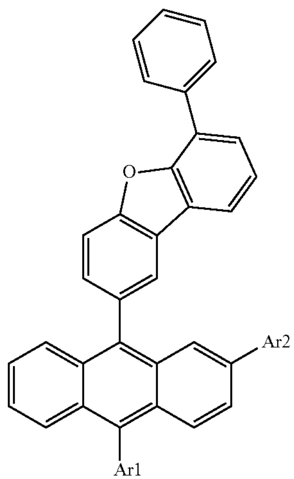 | 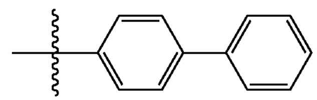 [SMILES: *c1ccc(-c2ccccc2)cc1] | 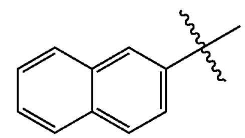 [SMILES: *c1ccc2ccccc2c1] |

-continued
| No. | | Ar1 | Ar2 |
|---|---|---|---|
| 51-4 | 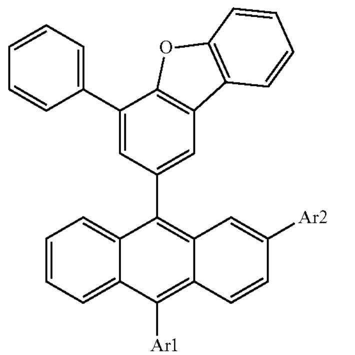 | 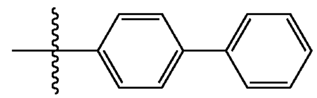 [SMILES: *c1ccc(-c2ccccc2)cc1] | 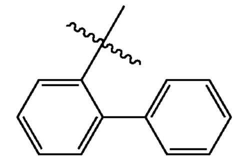 [SMILES: *c1ccccc1-c1ccccc1] |
| 51-5 | 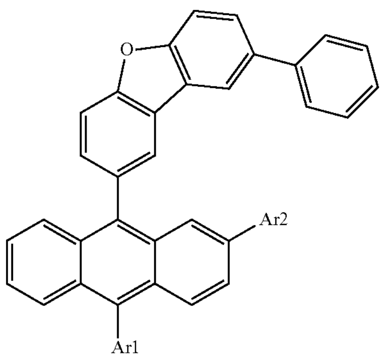 | 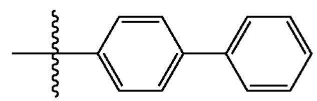 [SMILES: *c1ccc(-c2ccccc2)cc1] | 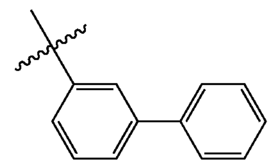 [SMILES: *c1cccc(-c2ccccc2)c1] |

-continued
| No. | | Ar1 | Ar2 |
|---|---|---|---|
| 51-6 | 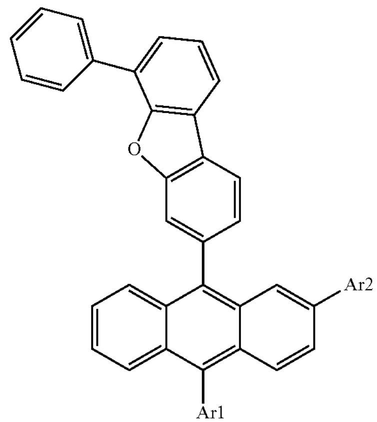 | 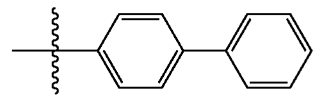 [SMILES: *c1ccc(-c2ccccc2)cc1] | 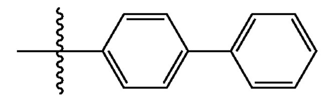 [SMILES: *c1ccc(-c2ccccc2)cc1] |
| 51-7 | 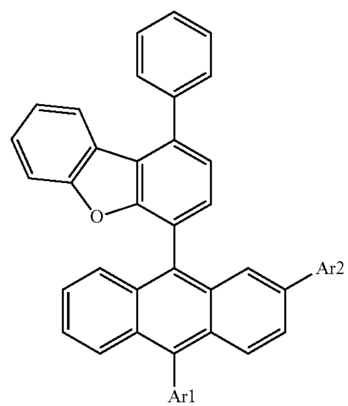 | 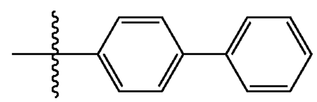 [SMILES: *c1ccc(-c2ccccc2)cc1] | 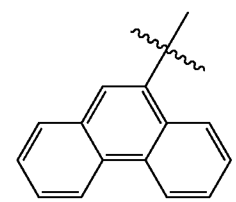 [SMILES: *c1cc2ccccc2c2ccccc12] |

-continued
| No. | | Ar1 | Ar2 |
|---|---|---|---|
| 51-8 | 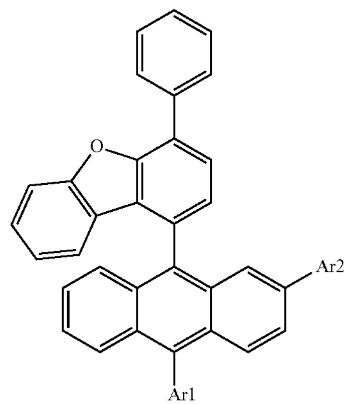 | 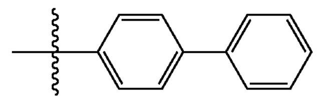 [SMILES: *c1ccc(-c2ccccc2)cc1] | 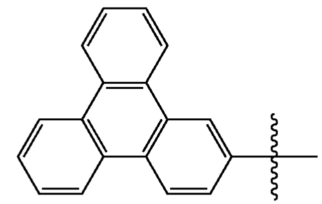 [SMILES: *c1ccc2c3ccccc3c3ccccc3c2c1] |
| 51-9 | 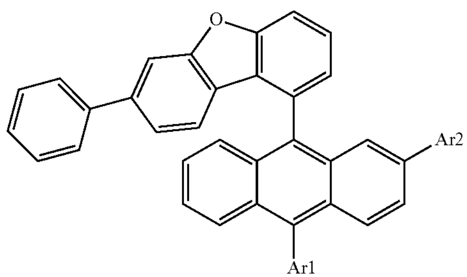 | 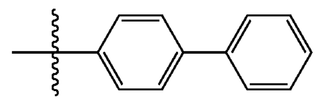 | 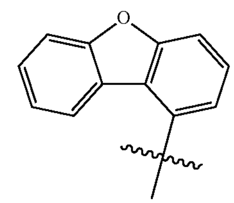 [SMILES: *c1cccc2oc3ccccc3c12] |

-continued
| No. | | Ar1 | Ar2 |
|---|---|---|---|
| 51-10 | 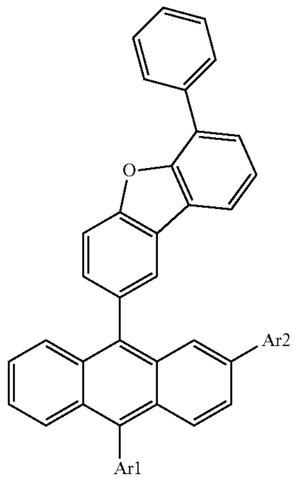 | 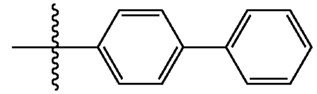 [SMILES: *c1ccc(-c2ccccc2)cc1] | 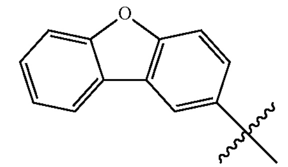 |
| 51-11 | 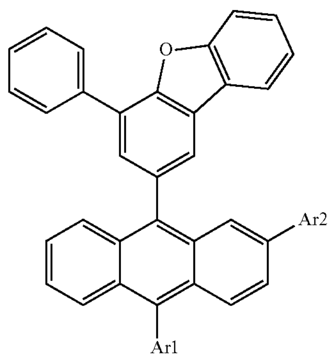 | 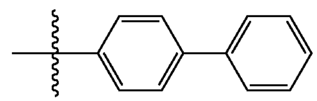 [SMILES: *c1ccc(-c2ccccc2)cc1] | 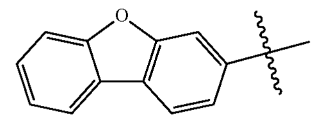 |

-continued
| No. | | Ar1 | Ar2 |
|---|---|---|---|
| 51-12 | 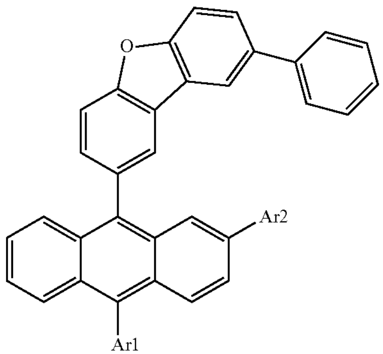 | 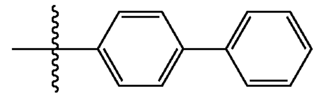 [SMILES: *c1ccc(-c2ccccc2)cc1] | 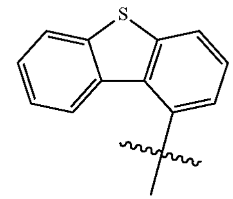 |
| 51-13 | 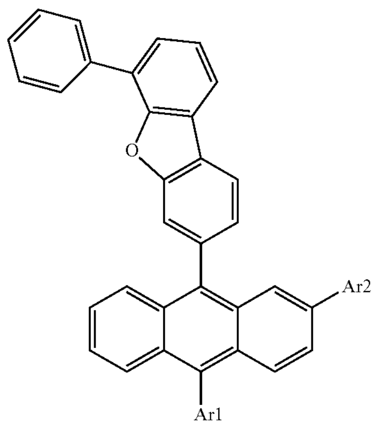 | 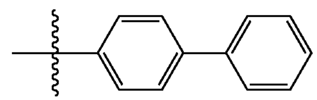 [SMILES: *c1ccc(-c2ccccc2)cc1] | 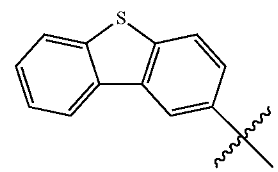 |

-continued
| No. | | Ar1 | Ar2 |
|---|---|---|---|
| 51-14 | 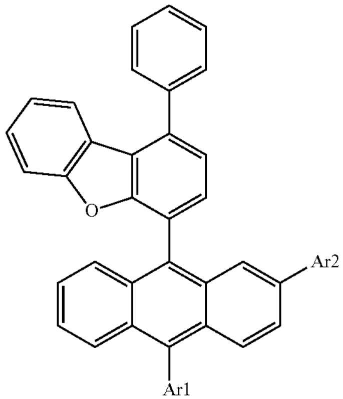 | 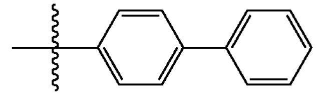 | 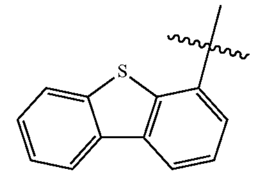 |
| 51-15 | 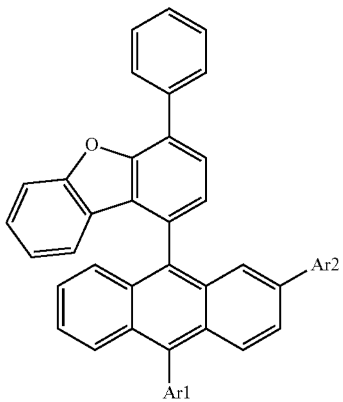 | 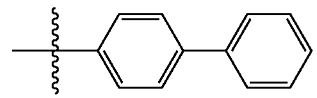 [SMILES: *c1ccc(-c2ccccc2)cc1] | 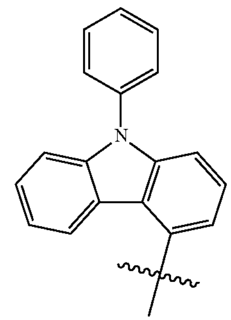 [SMILES: *c1cccc2c1c1ccccc1n2-c1ccccc1] |
| 51-16 | 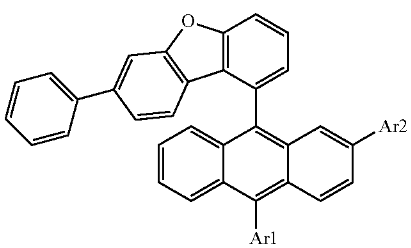 | 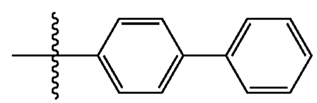 [SMILES: *c1ccc(-c2ccccc2)cc1] | 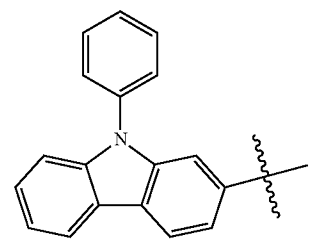 [SMILES: *c1ccc2c3ccccc3n(-c3ccccc3)c2c1] |

-continued
| No. | | Ar1 | Ar2 |
|---|---|---|---|
| 51-17 | 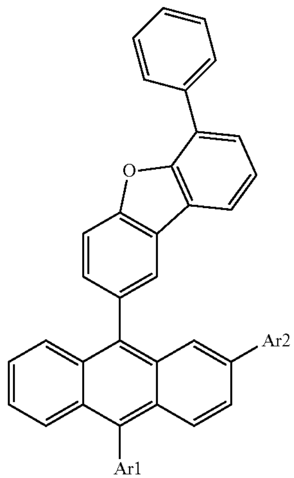 | 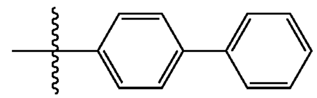 [SMILES: *c1ccc(-c2ccccc2)cc1] | 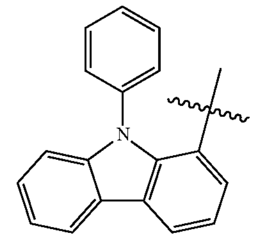 [SMILES: *c1cccc2c3ccccc3n(-c3ccccc3)c12] |
| 51-18 | 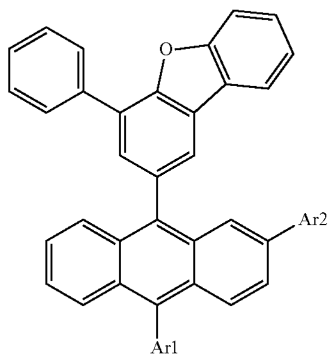 | 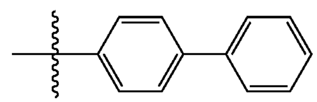 | 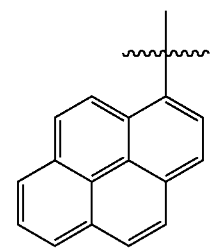 [SMILES: *c1ccc2ccc3cccc4ccc1c2c34] |

-continued
| No. | | Ar1 | Ar2 |
|---|---|---|---|
| 51-19 | 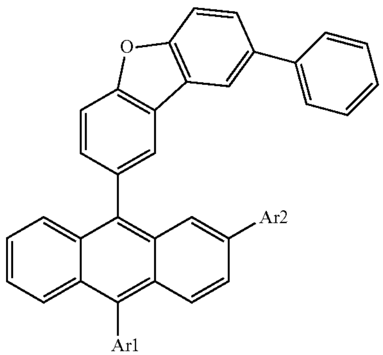 | 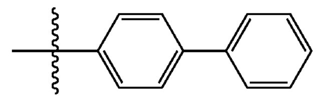 | 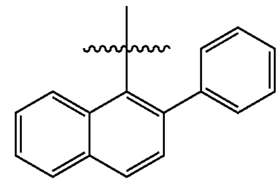 [SMILES: *c1c(-c2ccccc2)ccc2ccccc12] |
| 51-20 | 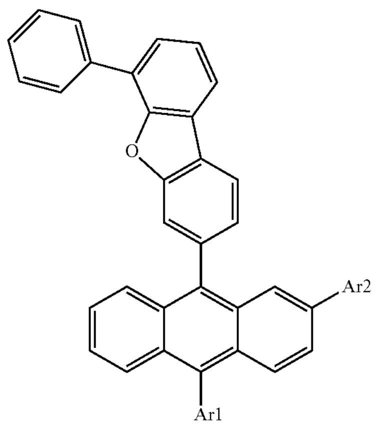 | 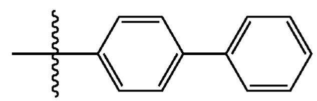 [SMILES: *c1ccc(-c2ccccc2)cc1] | 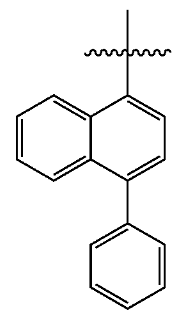 [SMILES: *c1ccc(-c2ccccc2)c2ccccc12] |

-continued
| No. | | Ar1 | Ar2 |
|---|---|---|---|
| 51-21 | 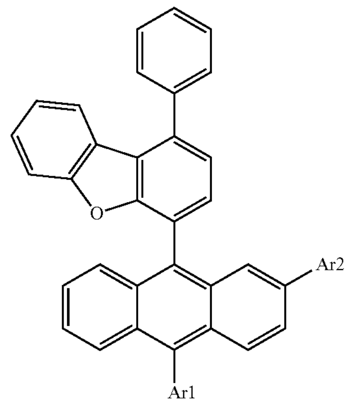 | 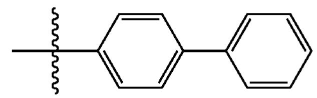 | 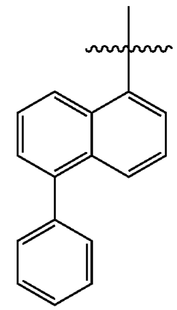 [SMILES: *c1cccc2c(-c3ccccc3)cccc12] |
| 51-22 | 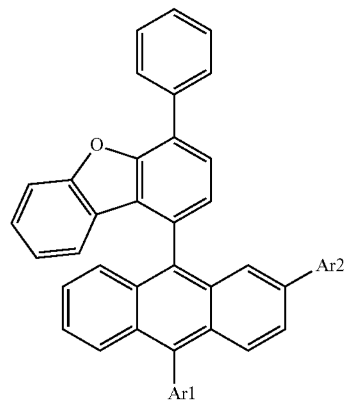 | 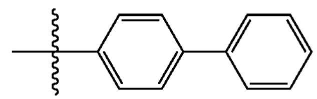 [SMILES: *c1ccc(-c2ccccc2)cc1] | 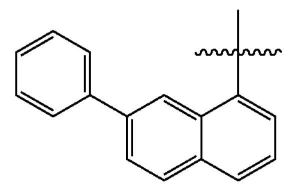 [SMILES: *c1cccc2ccc(-c3ccccc3)cc12] |

-continued
| No. | | Ar1 | Ar2 |
|---|---|---|---|
| 51-23 | 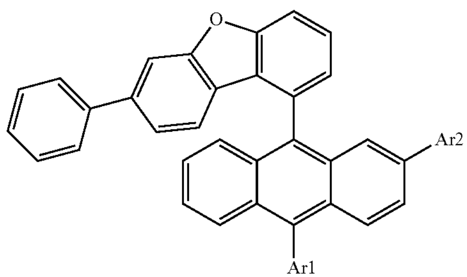 | 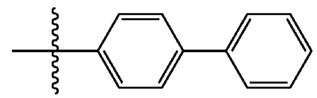 | 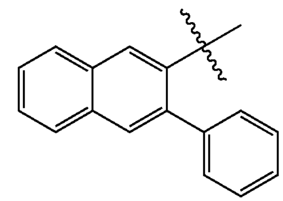 [SMILES: *c1cc2ccccc2cc1-c1ccccc1] |
| 51-24 | 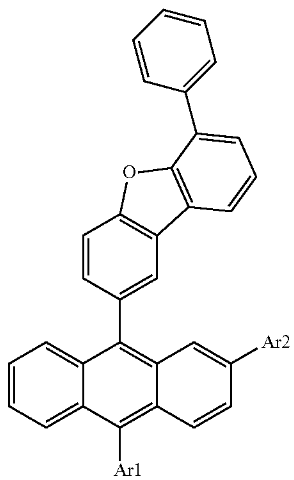 | 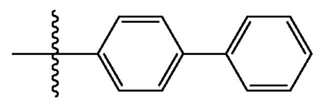 | 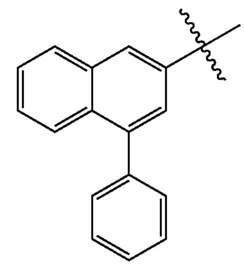 [SMILES: *c1cc(-c2ccccc2)c2ccccc2c1] |

-continued
| No. | | Ar1 | Ar2 |
|---|---|---|---|
| 51-25 | 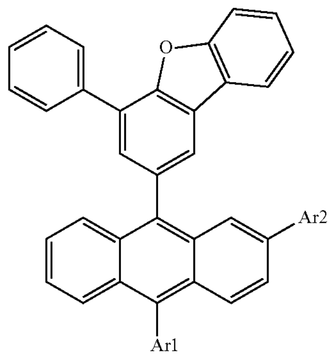 | 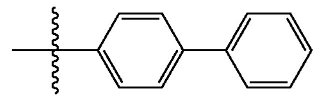 | 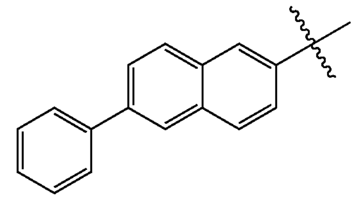 [SMILES: *c1ccc2cc(-c3ccccc3)ccc2c1] |
| 51-26 | 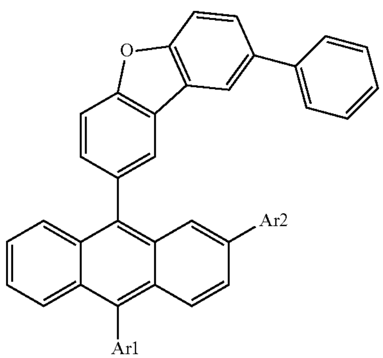 | 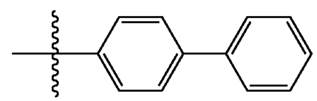 [SMILES: *c1ccc(-c2ccccc2)cc1] | 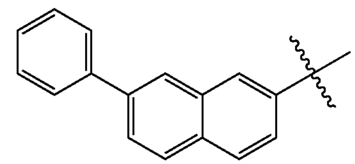 [SMILES: *c1ccc2ccc(-c3ccccc3)cc2c1] |

-continued
| No. | | Ar1 | Ar2 |
|---|---|---|---|
| 51-27 | 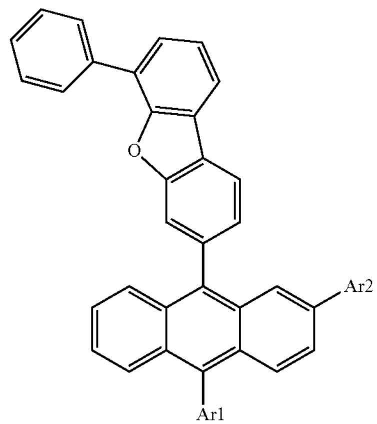 | 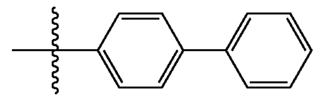 | 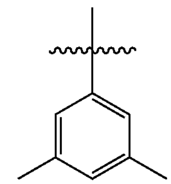 |
| 51-28 | 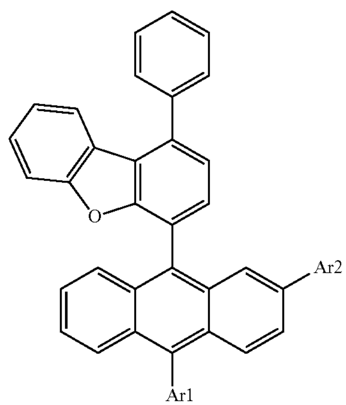 | 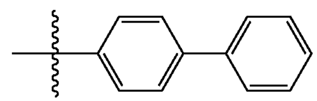 [SMILES: *c1ccc(-c2ccccc2)cc1] | 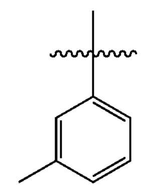 [SMILES: *c1cccc(C)c1] |

-continued
| No. | | Ar1 | Ar2 |
|---|---|---|---|
| 51-29 | 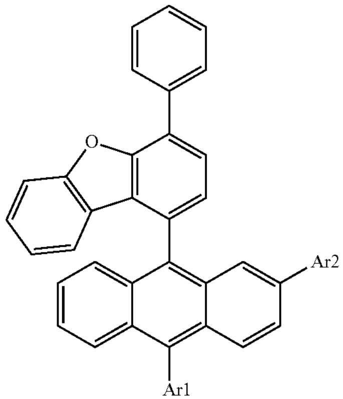 | 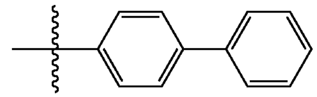 [SMILES: *c1ccc(-c2ccccc2)cc1] | 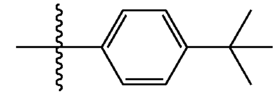 |
| 51-30 | 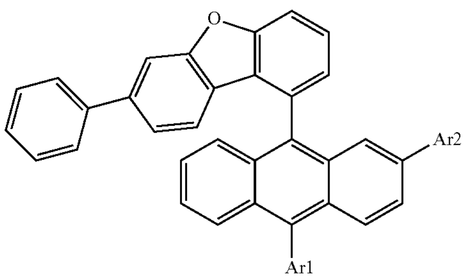 | 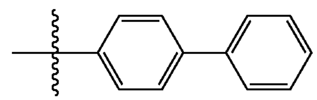 [SMILES: *c1ccc(-c2ccccc2)cc1] | 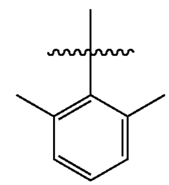 |

-continued
| No. | | Ar1 | Ar2 |
|---|---|---|---|
| 51-31 | 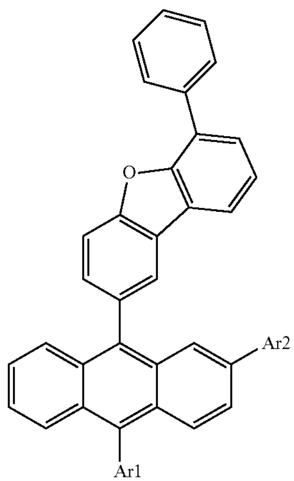 | 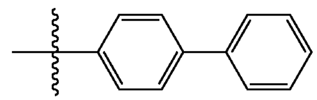 [SMILES: *c1ccc(-c2ccccc2)cc1] | 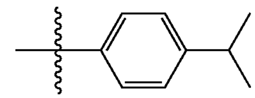 |
| 52-1 | 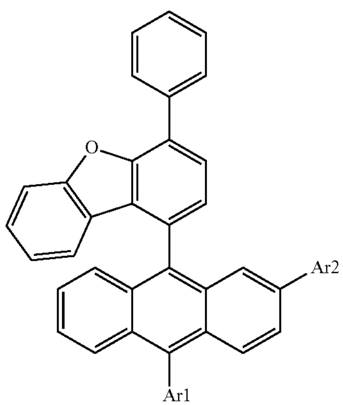 | 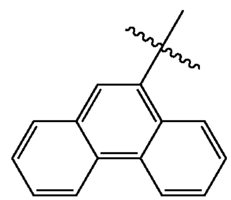 [SMILES: *c1cc2ccccc2c2ccccc12] | 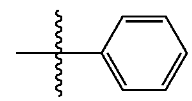 [SMILES: *c1ccccc1] |

-continued
| No. | | Ar1 | Ar2 |
| --- | --- | --- | --- |
| 52-2 | 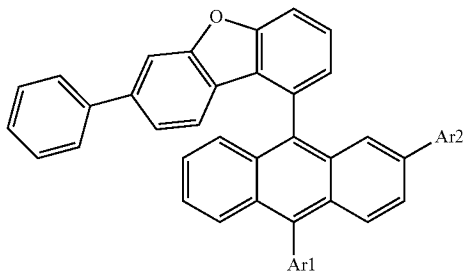 | 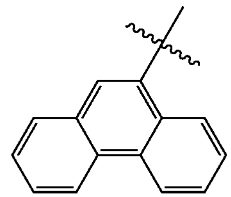 [SMILES: *c1cc2ccccc2c2ccccc12] | 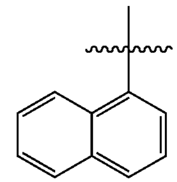 [SMILES: *c1cccc2ccccc12] |
| 52-3 | 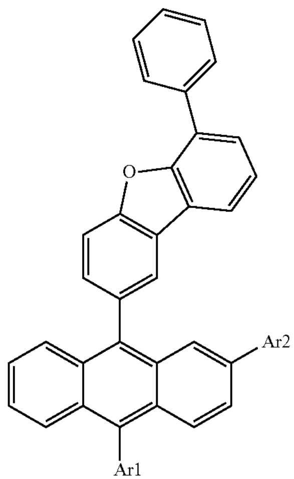 | 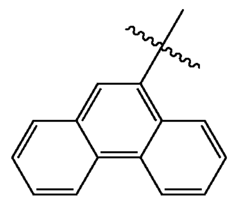 [SMILES: *c1cc2ccccc2c2ccccc12] | 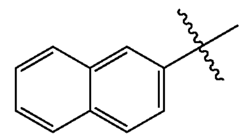 [SMILES: *c1ccc2ccccc2c1] |

-continued
| No. | | Ar1 | Ar2 |
|---|---|---|---|
| 52-4 | 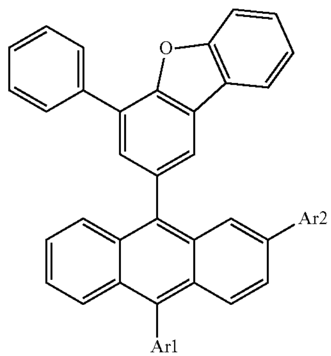 | 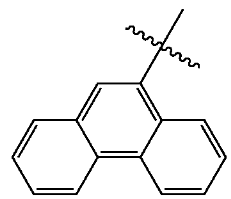 [SMILES: *c1cc2ccccc2c2ccccc12] | 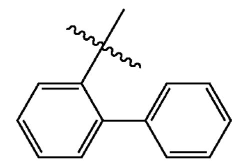 [SMILES: *c1ccccc1-c1ccccc1] |
| 52-5 | 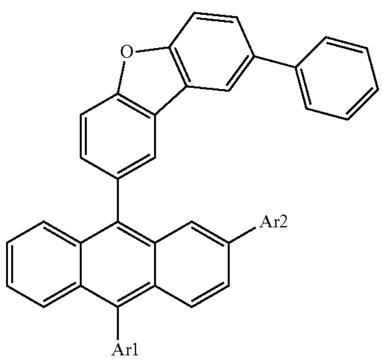 | 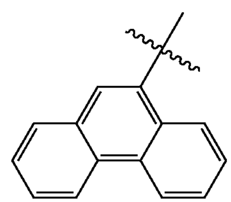 [SMILES: *c1cc2ccccc2c2ccccc12] | 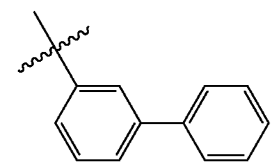 [SMILES: *c1cccc(-c2ccccc2)c1] |

-continued
| No. | | Ar1 | Ar2 |
|---|---|---|---|
| 52-6 | 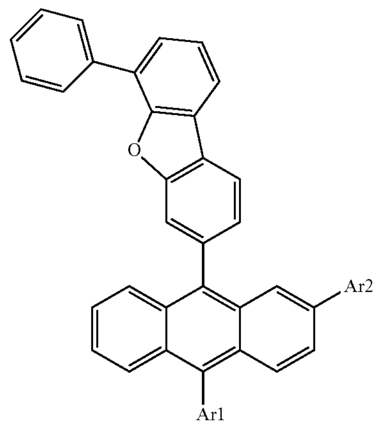 | 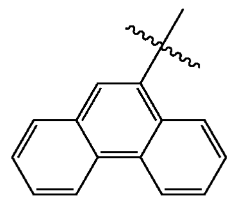 [SMILES: *c1cc2ccccc2c2ccccc12] | 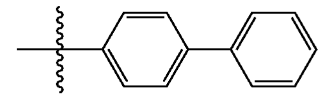 [SMILES: *c1ccc(-c2ccccc2)cc1] |
| 52-7 | 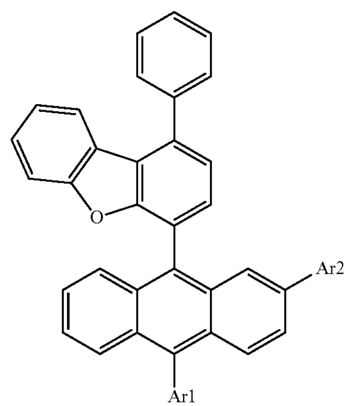 | 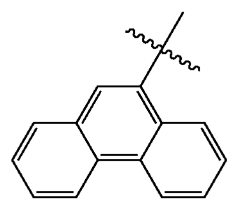 [SMILES: *c1cc2ccccc2c2ccccc12] | 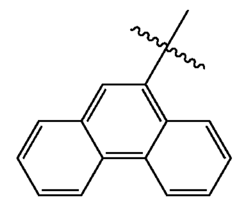 [SMILES: *c1cc2ccccc2c2ccccc12] |

-continued
| No. | | Ar1 | Ar2 |
|---|---|---|---|
| 52-8 | 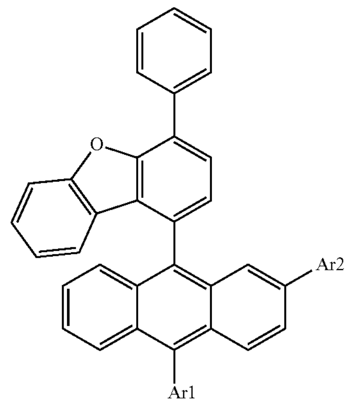 | 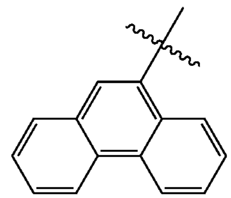 [SMILES: *c1cc2ccccc2c2ccccc12] | 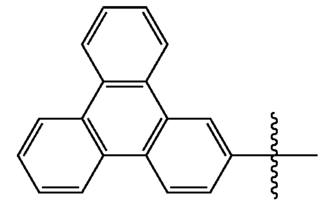 [SMILES: *c1ccc2c3ccccc3c3ccccc3c2c1] |
| 52-9 | 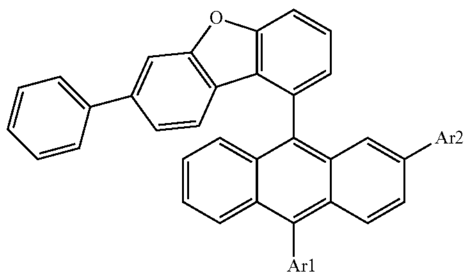 | 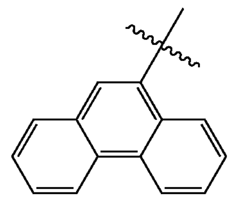 [SMILES: *c1cc2ccccc2c2ccccc12] | 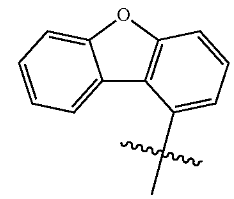 [SMILES: *c1cccc2oc3ccccc3c12] |

-continued
| No. | | Ar1 | Ar2 |
|---|---|---|---|
| 52-10 | 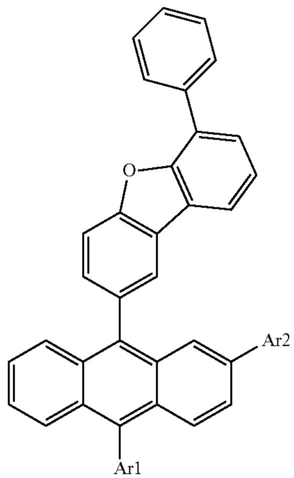 | 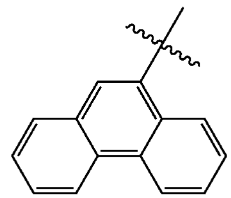 [SMILES: *c1cc2ccccc2c2ccccc12] | 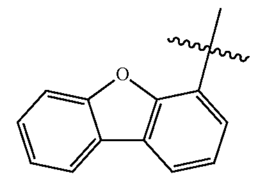 |
| 52-11 | 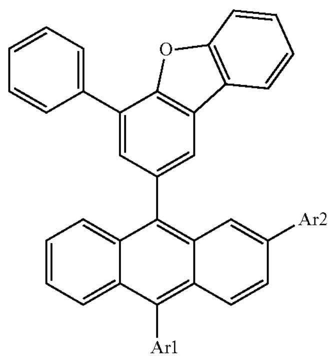 | 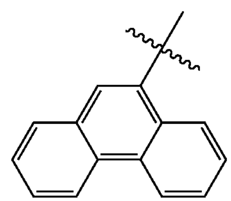 [SMILES: *c1cc2ccccc2c2ccccc12] | 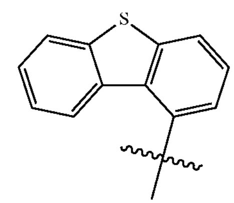 |

-continued
| No. | | Ar1 | Ar2 |
|---|---|---|---|
| 52-12 | 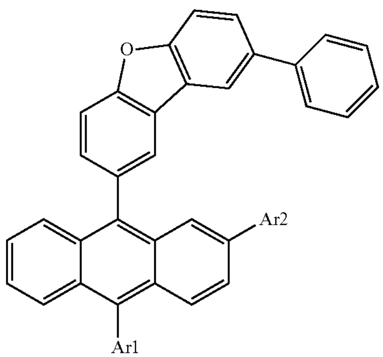 | 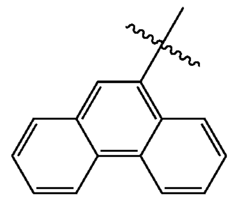 [SMILES: *c1cc2ccccc2c2ccccc12] | 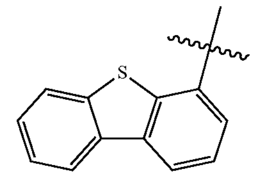 [SMILES: *c1cccc2c1sc1ccccc12] |
| 52-13 | 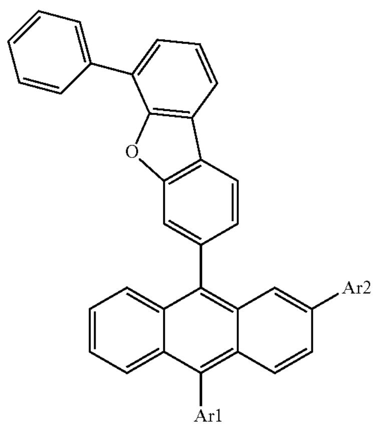 | 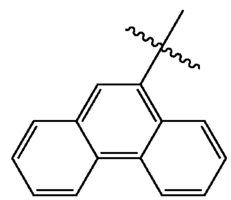 [SMILES: *c1cc2ccccc2c2ccccc12] | 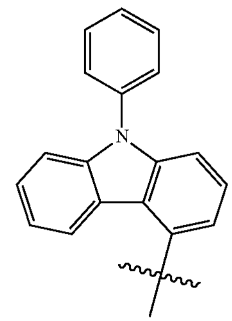 [SMILES: *c1cccc2c1c1ccccc1n2-c1ccccc1] |

-continued
| No. | | Ar1 | Ar2 |
|---|---|---|---|
| 52-14 | 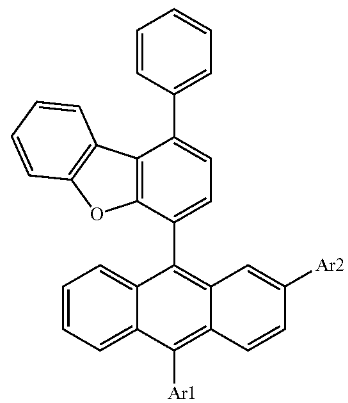 | 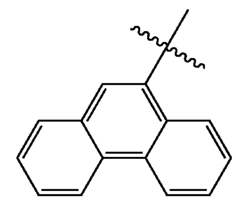 [SMILES: *c1cc2ccccc2c2ccccc12] | 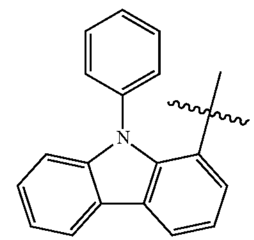 [SMILES: *c1cccc2c3ccccc3n(-c3ccccc3)c12] |
| 52-15 | 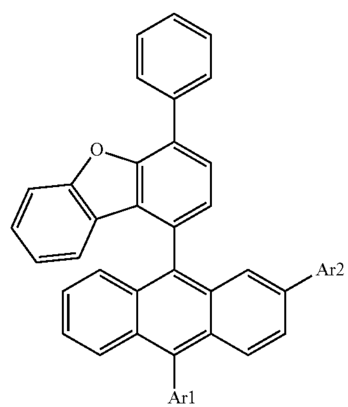 | 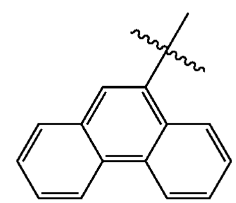 [SMILES: *c1cc2ccccc2c2ccccc12] | 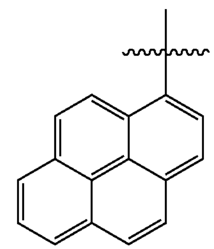 [SMILES: *c1ccc2ccc3cccc4ccc1c2c34] |

-continued
| No. | | Ar1 | Ar2 |
|---|---|---|---|
| 52-16 | 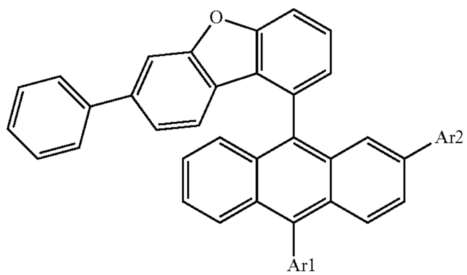 | 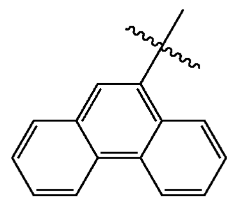 [SMILES: *c1cc2ccccc2c2ccccc12] | 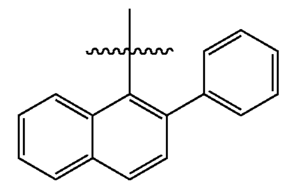 [SMILES: *c1c(-c2ccccc2)ccc2ccccc12] |
| 52-17 | 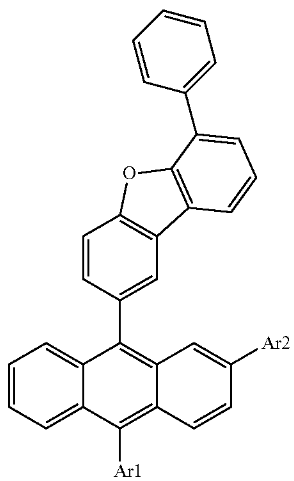 | 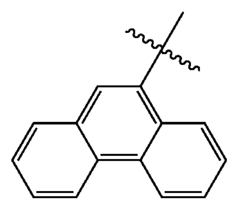 [SMILES: *c1cc2ccccc2c2ccccc12] | 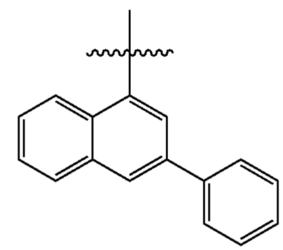 [SMILES: *c1cc(-c2ccccc2)cc2ccccc12] |

-continued
| No. | | Ar1 | Ar2 |
|---|---|---|---|
| 52-18 | 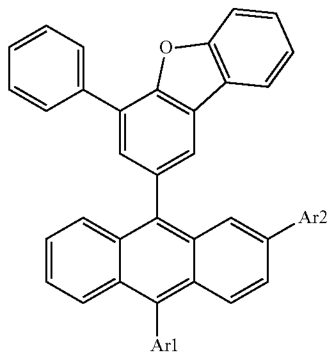 | 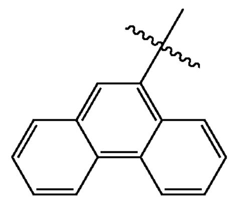 [SMILES: *c1cc2ccccc2c2ccccc12] | 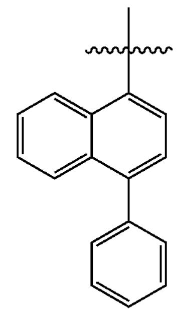 [SMILES: *c1ccc(-c2ccccc2)c2ccccc12] |
| 52-19 | 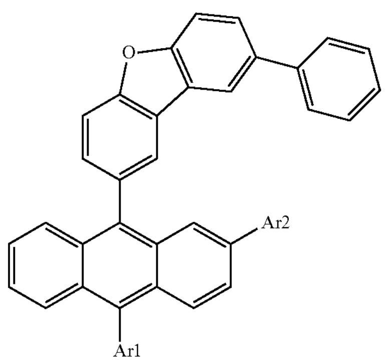 | 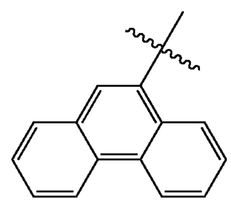 [SMILES: *c1cc2ccccc2c2ccccc12] | 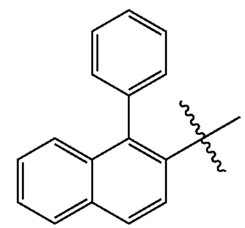 [SMILES: *c1ccc2ccccc2c1-c1ccccc1] |

-continued
| No. | | Ar1 | Ar2 |
|---|---|---|---|
| 52-20 | 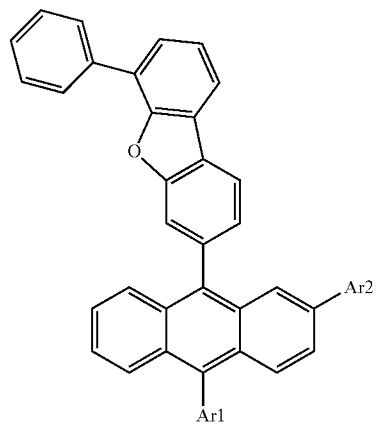 | 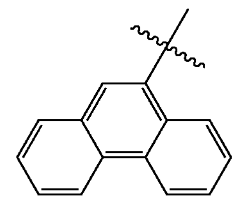 [SMILES: *c1cc2ccccc2c2ccccc12] | 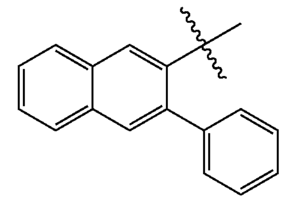 [SMILES: *c1cc2ccccc2cc1-c1ccccc1] |
| 52-21 | 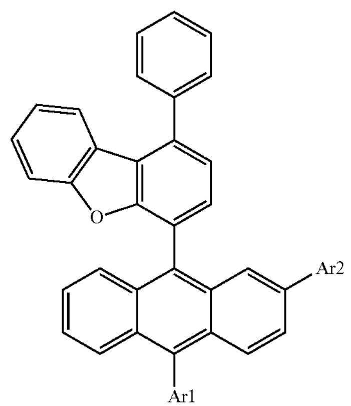 | 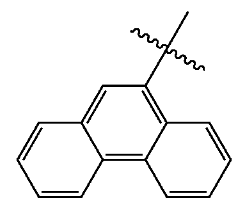 [SMILES: *c1cc2ccccc2c2ccccc12] | 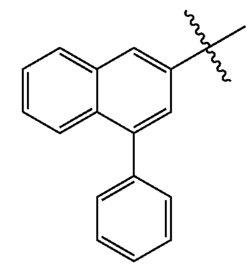 [SMILES: *c1cc(-c2ccccc2)c2ccccc2c1] |

-continued
| No. | | Ar1 | Ar2 |
|---|---|---|---|
| 52-22 | 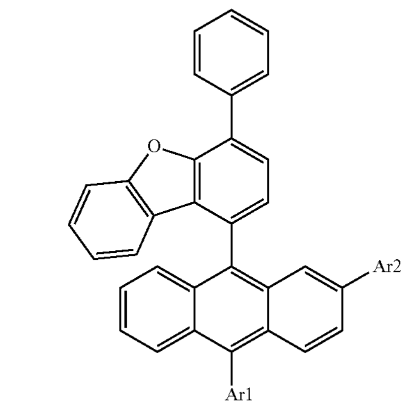 | 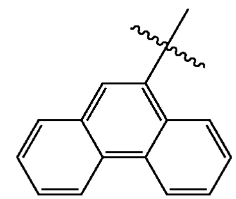 [SMILES: *c1cc2ccccc2c2ccccc12] | 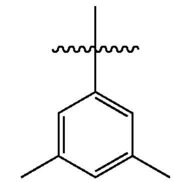 |
| 52-23 | 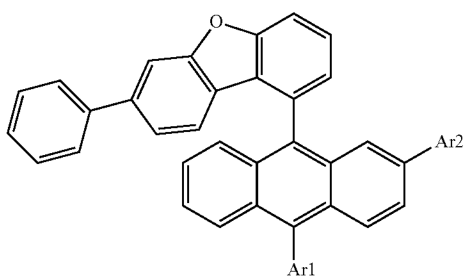 | 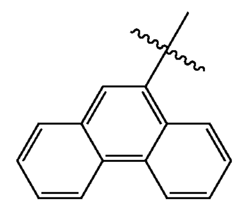 [SMILES: *c1cc2ccccc2c2ccccc12] | 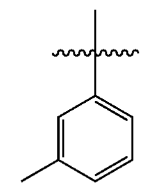 [SMILES: *c1cccc(C)c1] |

-continued
| No. | | Ar1 | Ar2 |
|---|---|---|---|
| 52-24 | 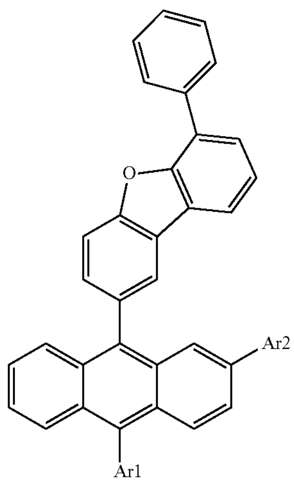 | 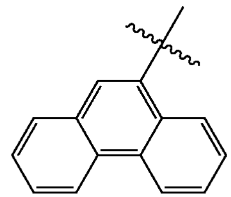 [SMILES: *c1cc2ccccc2c2ccccc12] | 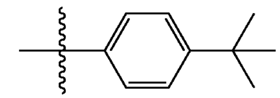 [SMILES: *c1ccc(C(C)(C)C)cc1] |
| 52-25 | 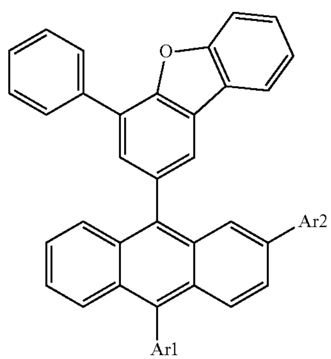 | 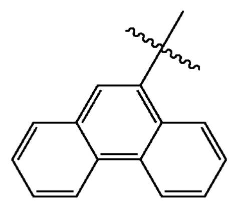 [SMILES: *c1cc2ccccc2c2ccccc12] | 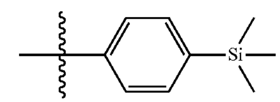 [SMILES: *c1ccc([Si](C)(C)C)cc1] |

-continued
| No. | | Ar1 | Ar2 |
|---|---|---|---|
| 52-26 | 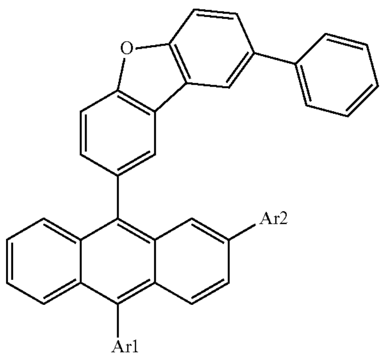  | 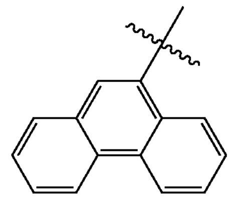 [SMILES: *c1cc2ccccc2c2ccccc12] | 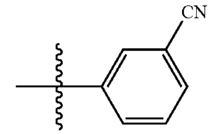 [SMILES: *c1cccc(C#N)c1]  |
| 52-27 | 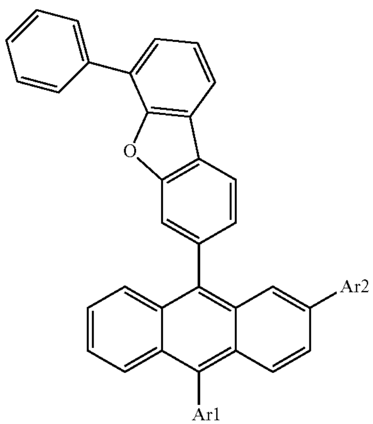  | 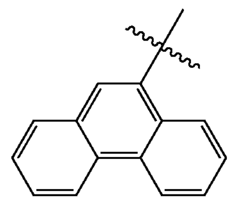 [SMILES: *c1cc2ccccc2c2ccccc12] | 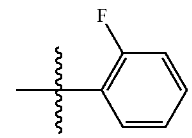 [SMILES: *c1ccccc1F]  |

-continued
| No. | | Ar1 | Ar2 |
|---|---|---|---|
| 52-28 | 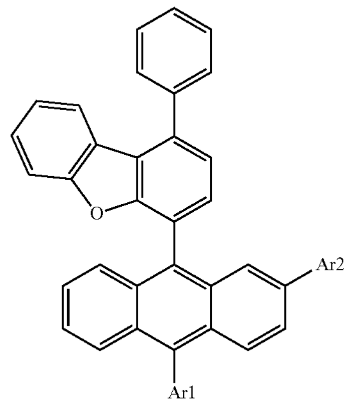 | 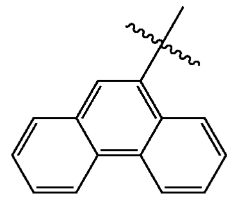 [SMILES: *c1cc2ccccc2c2ccccc12] | 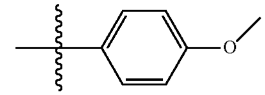 [SMILES: *c1ccc(OC)cc1] |
| 53-1 | 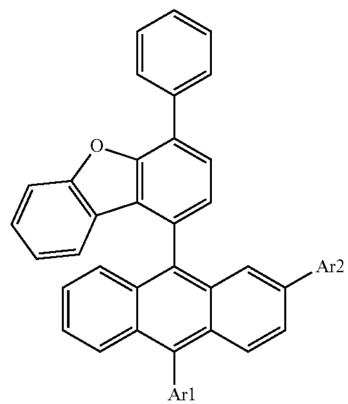 | 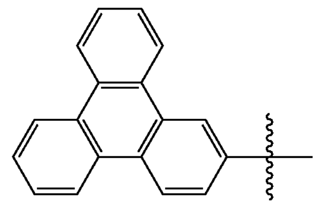 [SMILES: *c1ccc2c3ccccc3c3ccccc3c2c1] | 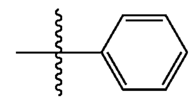 |

-continued
| No. | | Ar1 | Ar2 |
|---|---|---|---|
| 53-2 | 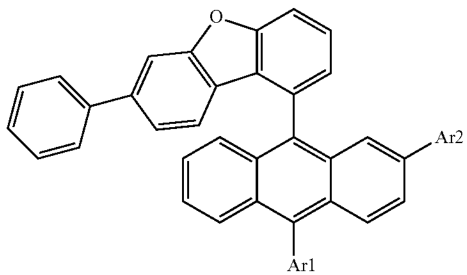 | 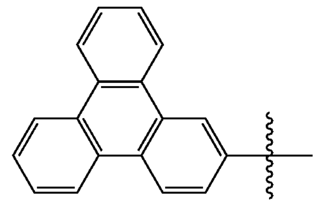 [SMILES: *c1ccc2c3ccccc3c3ccccc3c2c1] | 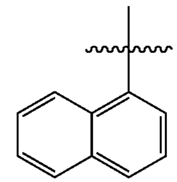 [SMILES: *c1cccc2ccccc12] |
| 53-3 | 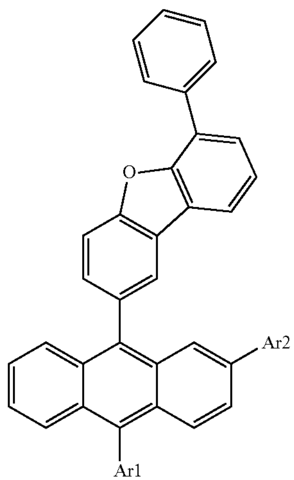 | 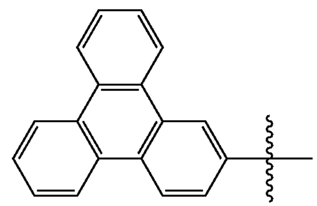 [SMILES: *c1ccc2c3ccccc3c3ccccc3c2c1] | 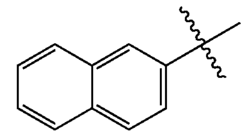 [SMILES: *c1ccc2ccccc2c1] |

-continued
| No. | | Ar1 | Ar2 |
|---|---|---|---|
| 53-4 | 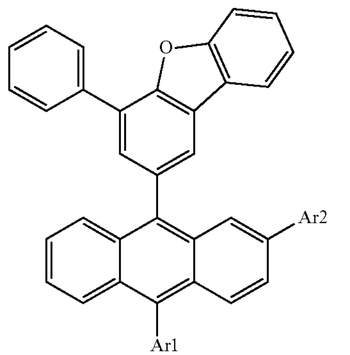 | 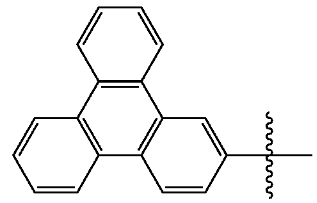 [SMILES: *c1ccc2c3ccccc3c3ccccc3c2c1] | 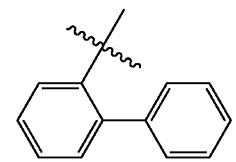 [SMILES: *c1ccccc1-c1ccccc1] |
| 53-5 | 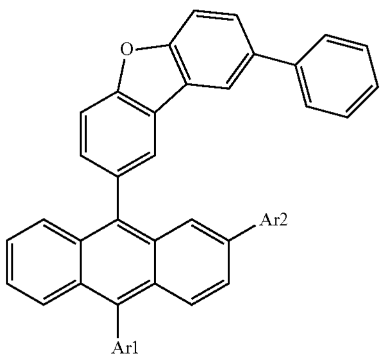 | 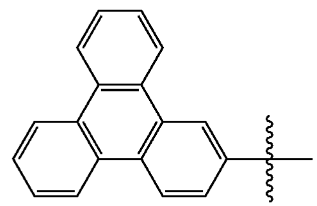 [SMILES: *c1ccc2c3ccccc3c3ccccc3c2c1] | 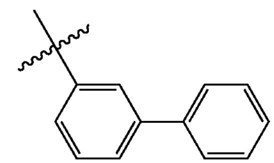 [SMILES: *c1cccc(-c2ccccc2)c1] |

-continued
| No. | | Ar1 | Ar2 |
|---|---|---|---|
| 53-6 | 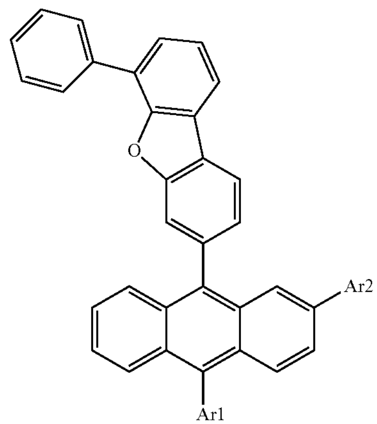 | 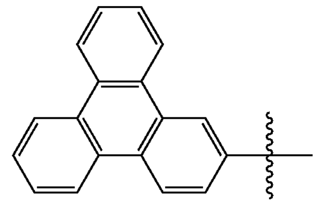 [SMILES: *c1ccc2c3ccccc3c3ccccc3c2c1] | 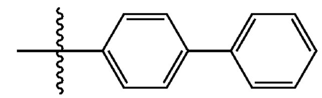 |
| 53-7 | 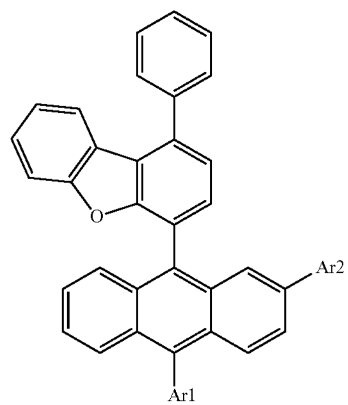 | 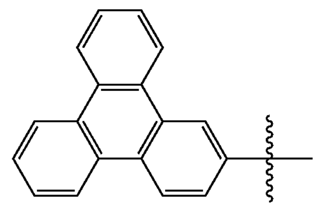 [SMILES: *c1ccc2c3ccccc3c3ccccc3c2c1] | 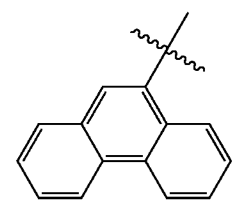 [SMILES: *c1cc2ccccc2c2ccccc12] |

-continued
| No. | | Ar1 | Ar2 |
|---|---|---|---|
| 53-8 | 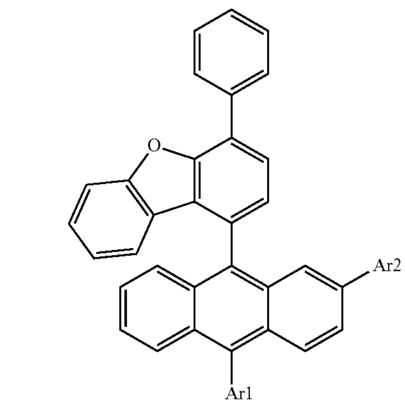  | 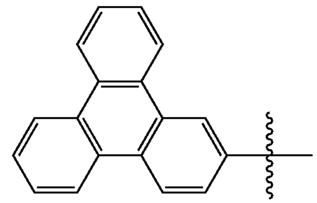 [SMILES: *c1ccc2c3ccccc3c3ccccc3c2c1] | 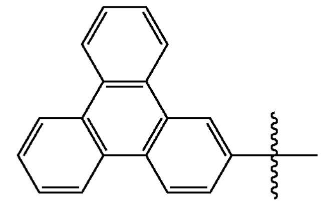 [SMILES: *c1ccc2c3ccccc3c3ccccc3c2c1] |
| 53-9 | 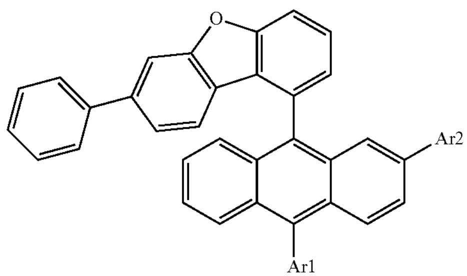  | 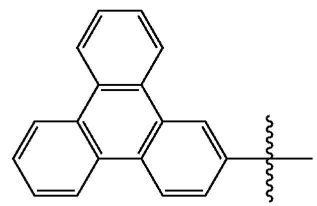 [SMILES: *c1ccc2c3ccccc3c3ccccc3c2c1] | 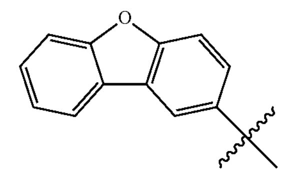  |

-continued
| No. | | Ar1 | Ar2 |
|---|---|---|---|
| 53-10 | 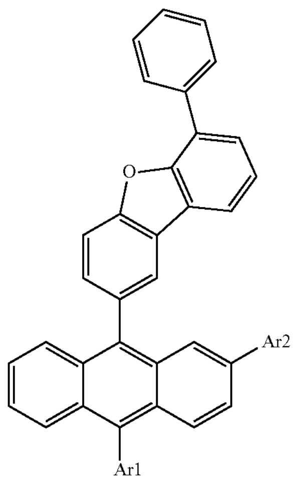 | 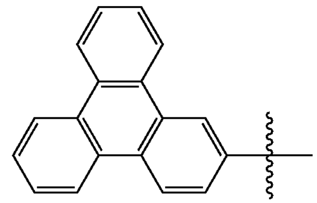 [SMILES: *c1ccc2c3ccccc3c3ccccc3c2c1] | 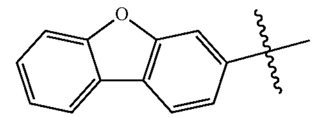 [SMILES: *c1ccc2c(c1)oc1ccccc12] |
| 53-11 | 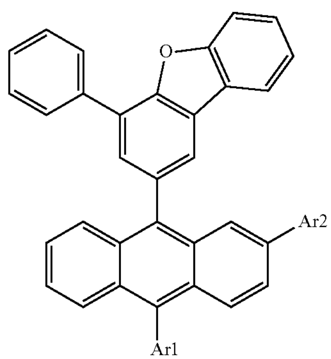 | 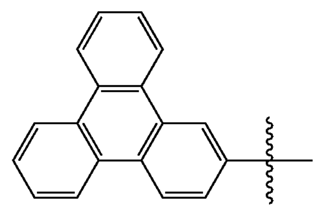 [SMILES: *c1ccc2c3ccccc3c3ccccc3c2c1] | 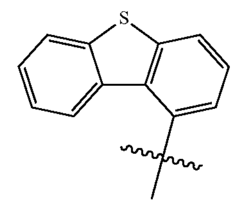 |

-continued
| No. | | Ar1 | Ar2 |
|---|---|---|---|
| 53-12 | 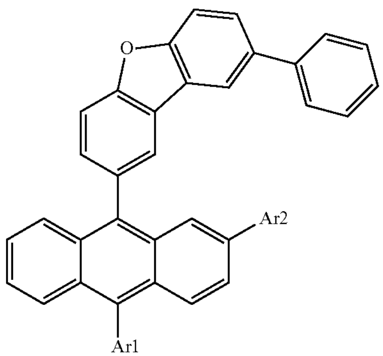 | 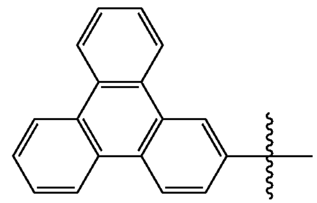 [SMILES: *c1ccc2c3ccccc3c3ccccc3c2c1] | 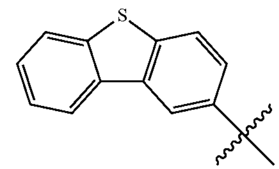 |
| 53-13 | 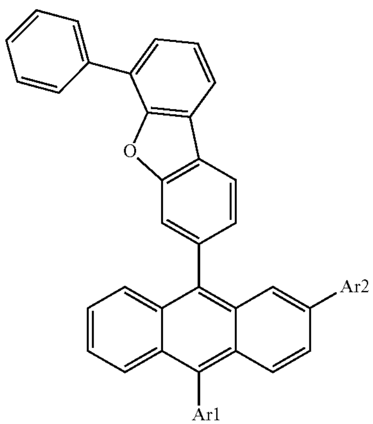 | 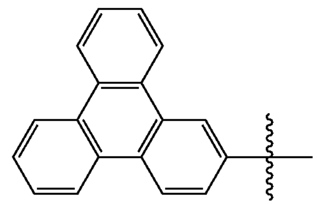 [SMILES: *c1ccc2c3ccccc3c3ccccc3c2c1] | 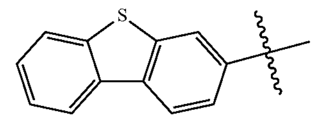 |

-continued
| No. | | Ar1 | Ar2 |
|---|---|---|---|
| 53-14 | 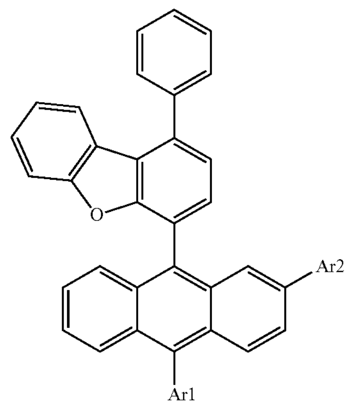 | 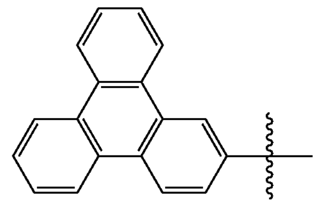 [SMILES: *c1ccc2c3ccccc3c3ccccc3c2c1] | 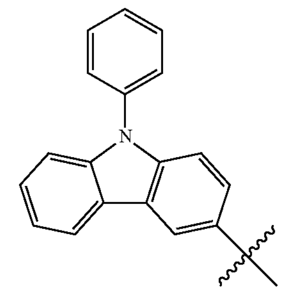 [SMILES: *c1ccc2c(c1)c1ccccc1n2-c1ccccc1] |
| 53-15 | 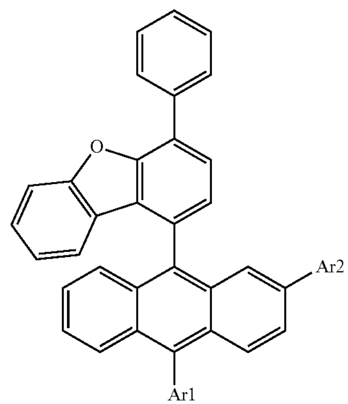 | 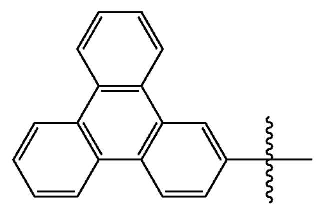 [SMILES: *c1ccc2c3ccccc3c3ccccc3c2c1] | 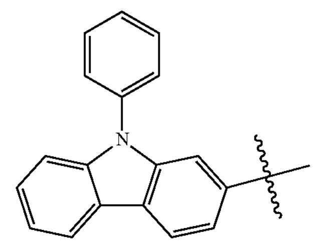 [SMILES: *c1ccc2c3ccccc3n(-c3ccccc3)c2c1] |

-continued
| No. | | Ar1 | Ar2 |
|---|---|---|---|
| 53-16 | 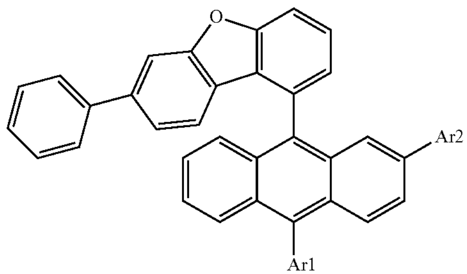 | 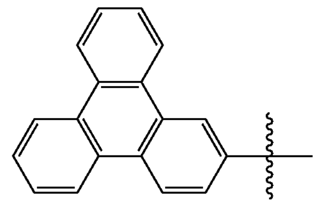 [SMILES: *c1ccc2c3ccccc3c3ccccc3c2c1] | 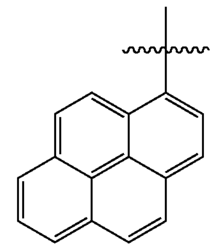 [SMILES: *c1ccc2ccc3cccc4ccc1c2c34] |
| 53-17 | 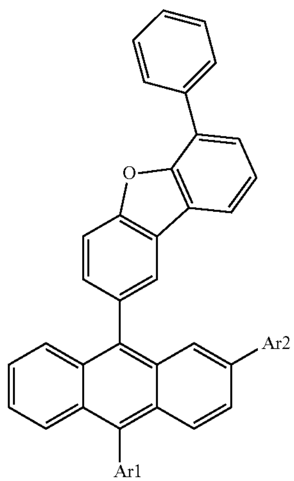 | 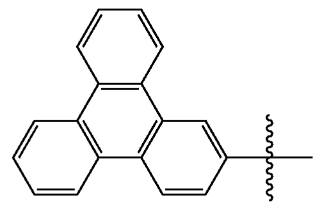 [SMILES: *c1ccc2c3ccccc3c3ccccc3c2c1] | 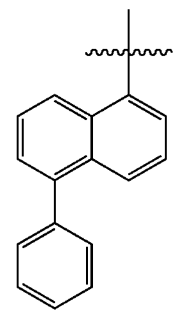 [SMILES: *c1cccc2c(-c3ccccc3)cccc12] |

-continued
| No. | | Ar1 | Ar2 |
|---|---|---|---|
| 53-18 | 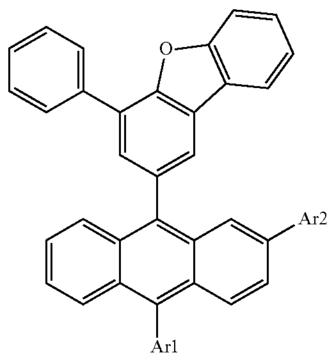 | 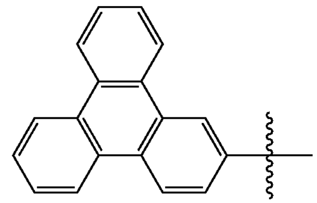 [SMILES: *c1ccc2c3ccccc3c3ccccc3c2c1] | 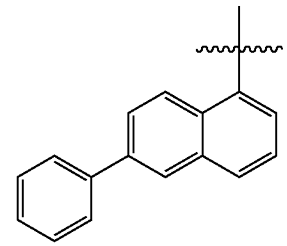 [SMILES: *c1cccc2cc(-c3ccccc3)ccc12] |
| 53-19 | 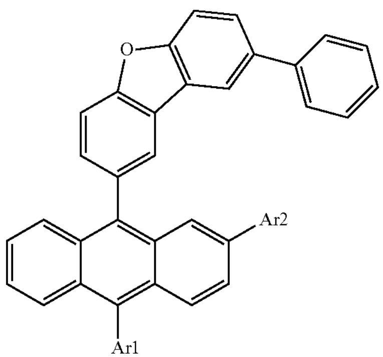 | 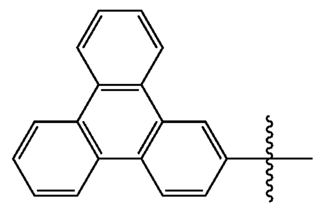 [SMILES: *c1ccc2c3ccccc3c3ccccc3c2c1] | 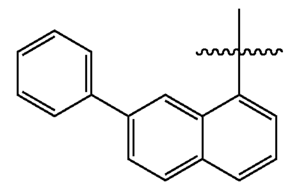 [SMILES: *c1cccc2ccc(-c3ccccc3)cc12] |

-continued
| No. | | Ar1 | Ar2 |
|---|---|---|---|
| 53-20 | 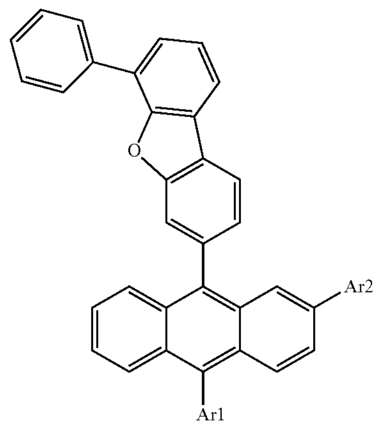 | 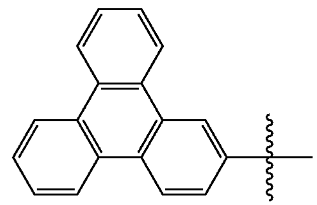 [SMILES: *c1ccc2c3ccccc3c3ccccc3c2c1] | 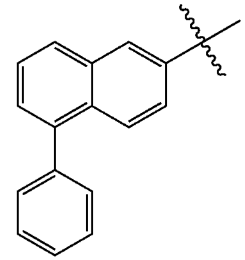 [SMILES: *c1ccc2c(-c3ccccc3)cccc2c1] |
| 53-21 | 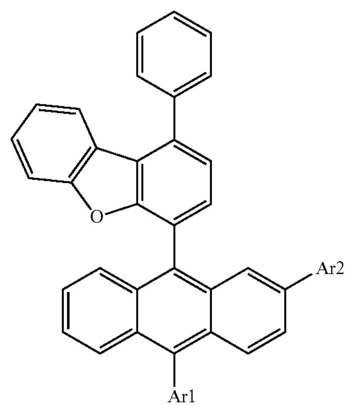 | 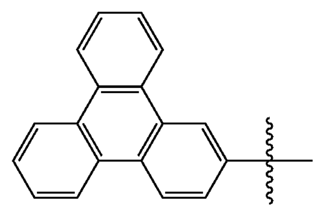 [SMILES: *c1ccc2c3ccccc3c3ccccc3c2c1] | 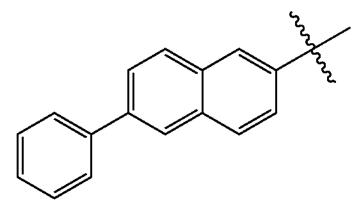 [SMILES: *c1ccc2cc(-c3ccccc3)ccc2c1] |

-continued
| No. | | Ar1 | Ar2 |
|---|---|---|---|
| 53-22 | 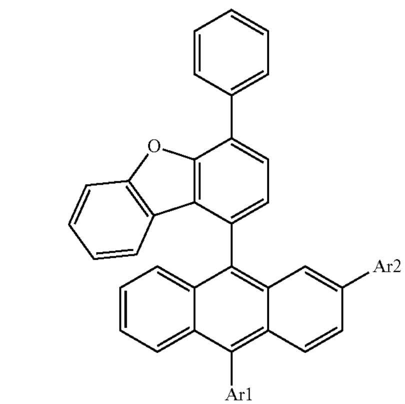 | 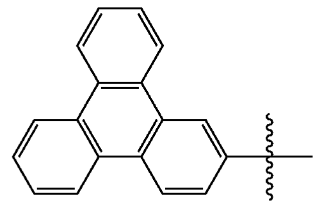 [SMILES: *c1ccc2c3ccccc3c3ccccc3c2c1] | 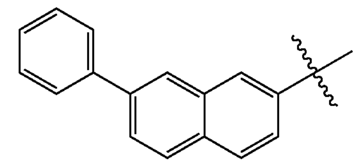 [SMILES: *c1ccc2ccc(-c3ccccc3)cc2c1] |
| 53-23 | 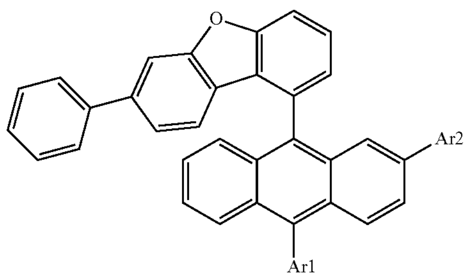 | 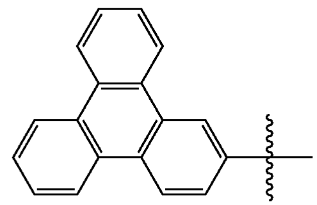 [SMILES: *c1ccc2c3ccccc3c3ccccc3c2c1] | 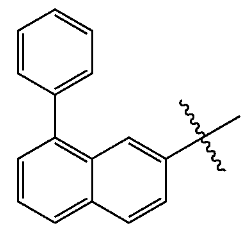 [SMILES: *c1ccc2cccc(-c3ccccc3)c2c1] |

-continued
| No. | | Ar1 | Ar2 |
|---|---|---|---|
| 53-24 | 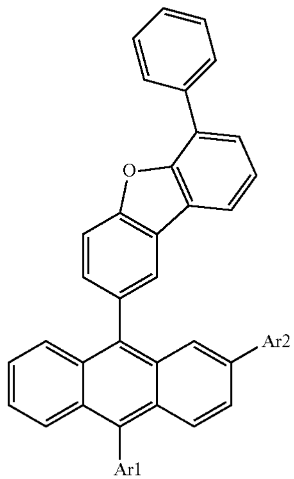 | 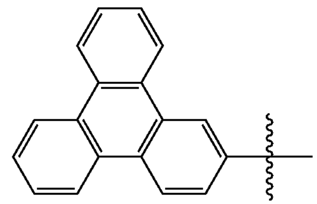 [SMILES: *c1ccc2c3ccccc3c3ccccc3c2c1] | 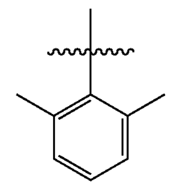 |
| 53-25 | 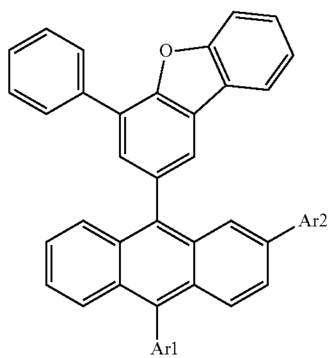 | 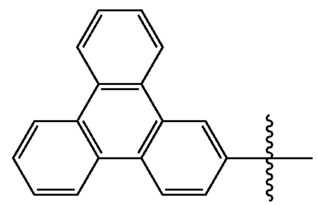 [SMILES: *c1ccc2c3ccccc3c3ccccc3c2c1] | 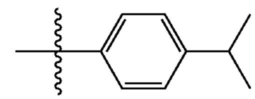 [SMILES: *c1ccc(C(C)C)cc1] |

-continued
| No. | | Ar1 | Ar2 |
|---|---|---|---|
| 53-26 | 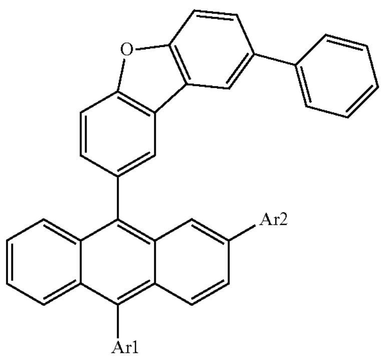 | 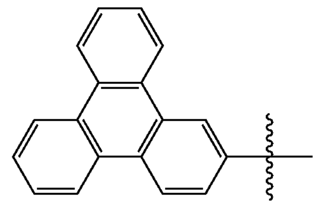 [SMILES: *c1ccc2c3ccccc3c3ccccc3c2c1] | 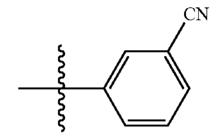 [SMILES: *c1cccc(C#N)c1] |
| 53-27 | 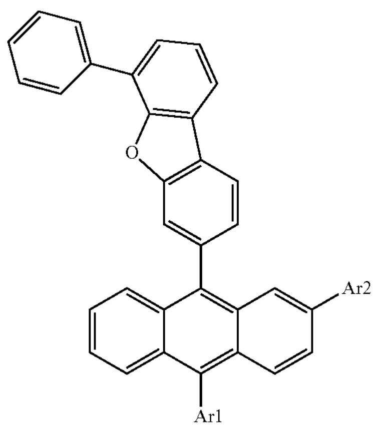 | 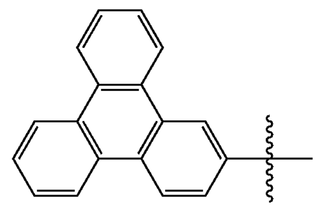 [SMILES: *c1ccc2c3ccccc3c3ccccc3c2c1] | 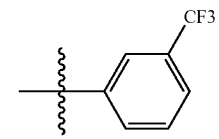 [SMILES: *c1cccc(C(F)(F)F)c1] |

-continued
| No. | | Ar1 | Ar2 |
|---|---|---|---|
| 53-28 | 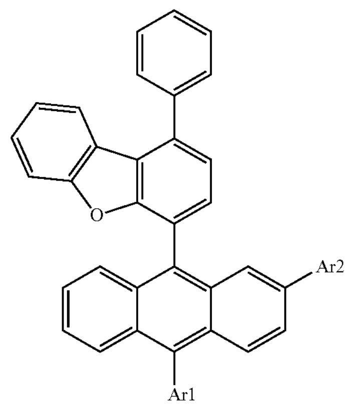 | 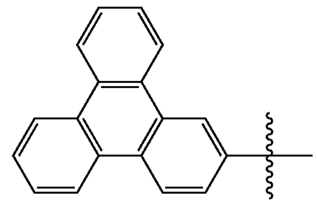 [SMILES: *c1ccc2c3ccccc3c3ccccc3c2c1] | 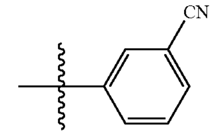 [SMILES: *c1cccc(C#N)c1] |
| 53-29 | 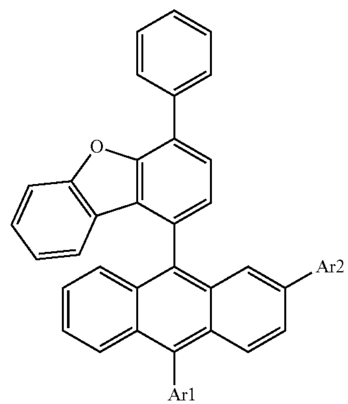 | 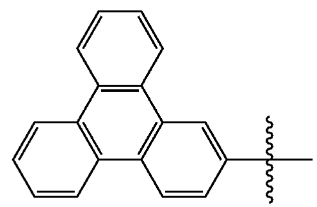 [SMILES: *c1ccc2c3ccccc3c3ccccc3c2c1] | 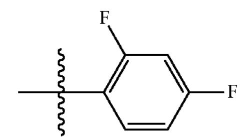 [SMILES: *c1ccc(F)cc1F] |

-continued
| No. | | Ar1 | Ar2 |
|---|---|---|---|
| 54-1 | 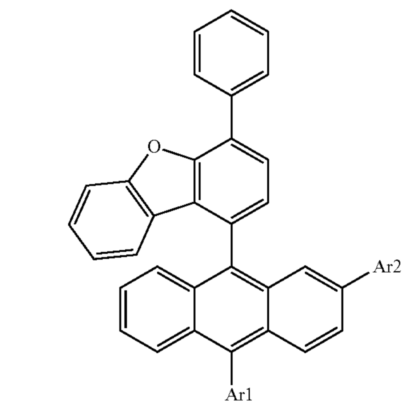 | 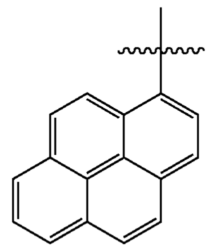 [SMILES: *c1ccc2ccc3cccc4ccc1c2c34] | 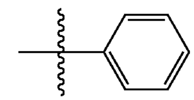 [SMILES: *c1ccccc1] |
| 54-2 | 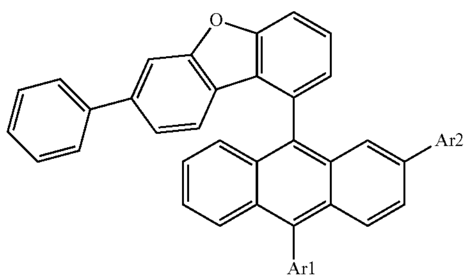 | 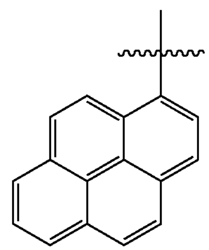 [SMILES: *c1ccc2ccc3cccc4ccc1c2c34] | 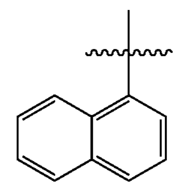 [SMILES: *c1cccc2ccccc12] |

-continued
| No. | | Ar1 | Ar2 |
|---|---|---|---|
| 54-3 | 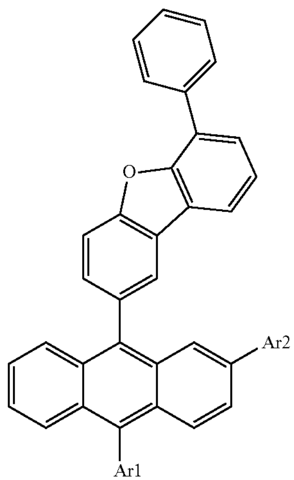 | 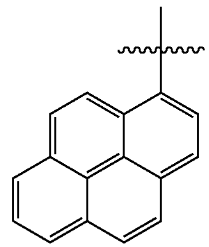 [SMILES: *c1ccc2ccc3cccc4ccc1c2c34] | 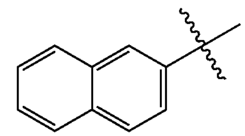 [SMILES: *c1ccc2ccccc2c1] |
| 54-4 | 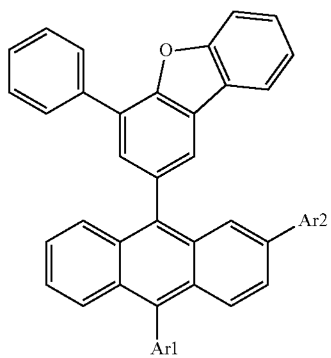 | 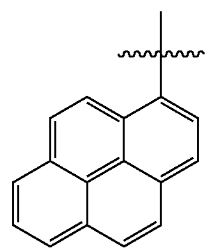 [SMILES: *c1ccc2ccc3cccc4ccc1c2c34] | 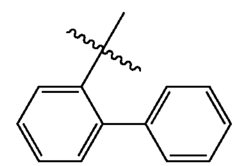 [SMILES: *c1ccccc1-c1ccccc1] |

-continued
| No. | | Ar1 | Ar2 |
|---|---|---|---|
| 54-5 | 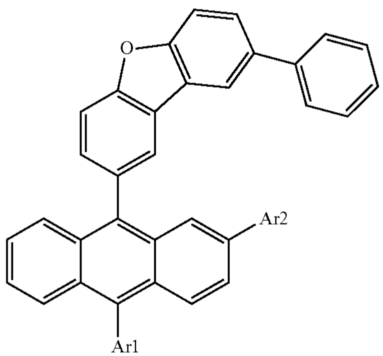 | 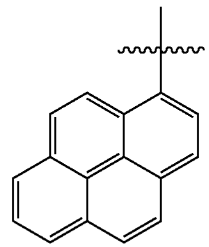 [SMILES: *c1ccc2ccc3cccc4ccc1c2c34] | 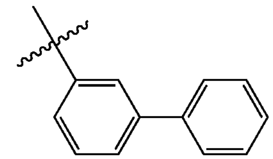 [SMILES: *c1cccc(-c2ccccc2)c1] |
| 54-6 | 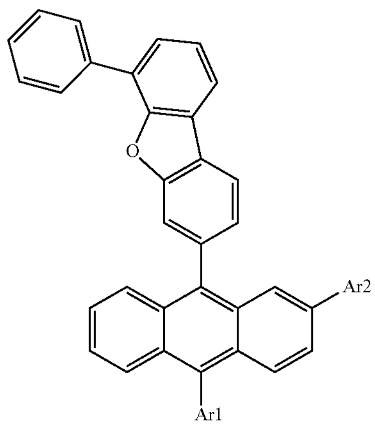 | 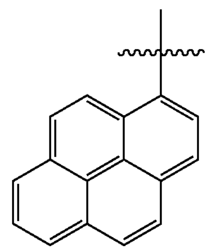 [SMILES: *c1ccc2ccc3cccc4ccc1c2c34] | 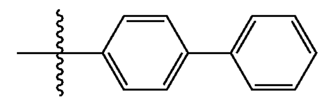 |

-continued
| No. | | Ar1 | Ar2 |
|---|---|---|---|
| 54-7 | 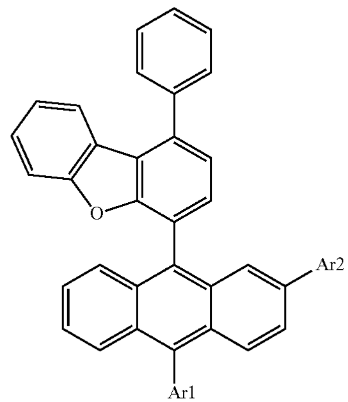 | 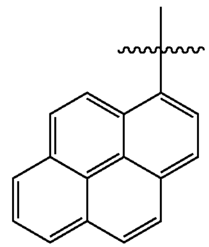 [SMILES: *c1ccc2ccc3cccc4ccc1c2c34] | 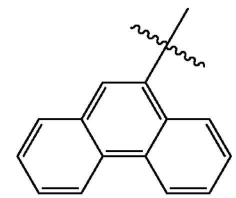 [SMILES: *c1cc2ccccc2c2ccccc12] |
| 54-8 | 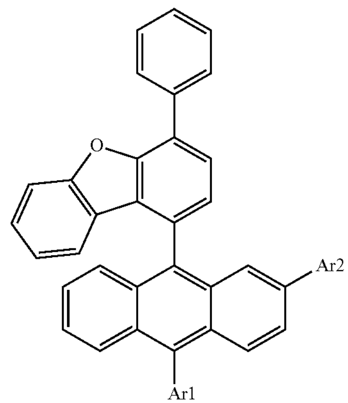 | 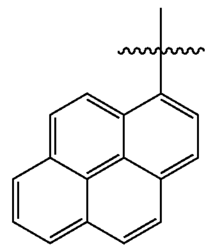 [SMILES: *c1ccc2ccc3cccc4ccc1c2c34] | 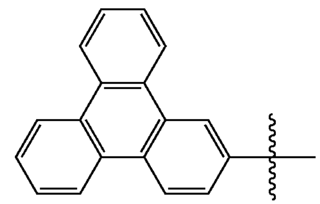 [SMILES: *c1ccc2c3ccccc3c3ccccc3c2c1] |

-continued
| No. | | Ar1 | Ar2 |
|---|---|---|---|
| 54-9 | 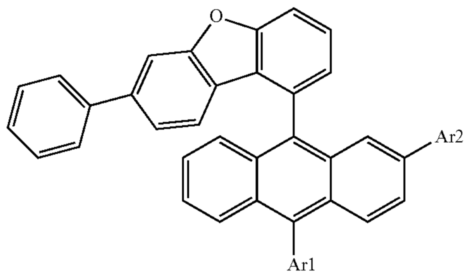 | 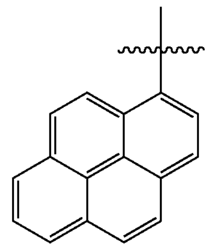 [SMILES: *c1ccc2ccc3cccc4ccc1c2c34] | 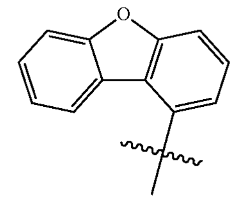 [SMILES: *c1cccc2oc3ccccc3c12] |
| 54-10 | 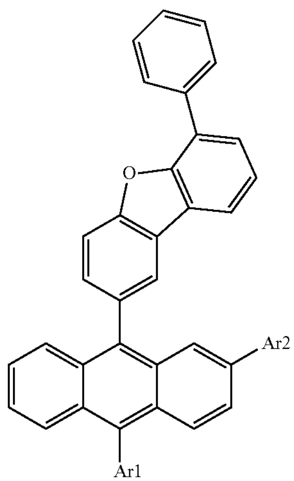 | 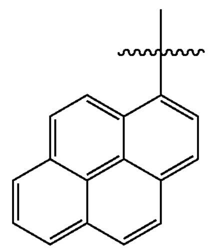 [SMILES: *c1ccc2ccc3cccc4ccc1c2c34] | 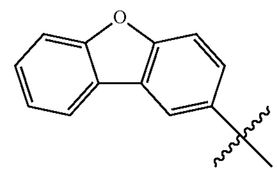 [SMILES: *c1ccc2oc3ccccc3c2c1] |

-continued
| No. | | Ar1 | Ar2 |
|---|---|---|---|
| 54-11 | 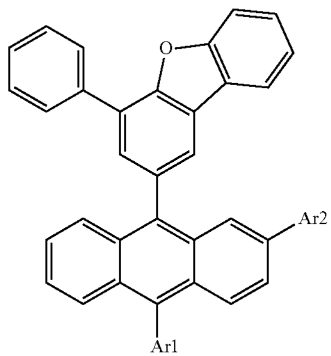 | 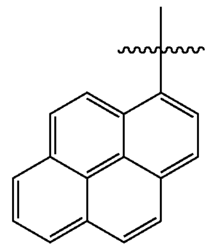 [SMILES: *c1ccc2ccc3cccc4ccc1c2c34] | 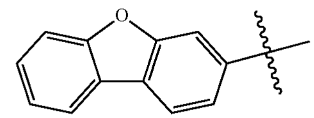 |
| 54-12 | 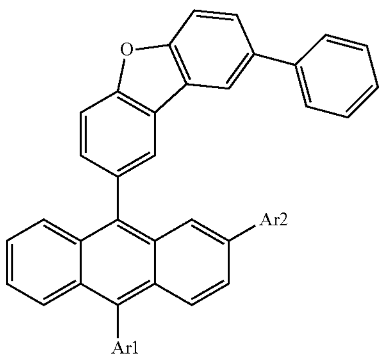 | 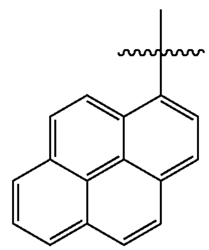 [SMILES: *c1ccc2ccc3cccc4ccc1c2c34] | 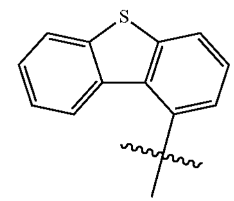 [SMILES: *c1cccc2sc3ccccc3c12] |

-continued
| No. | | Ar1 | Ar2 |
|---|---|---|---|
| 54-13 | 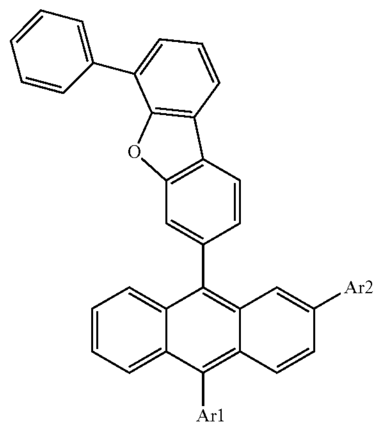 | 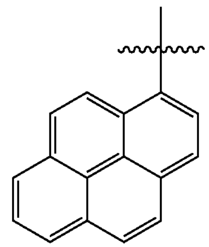 [SMILES: *c1ccc2ccc3cccc4ccc1c2c34] | 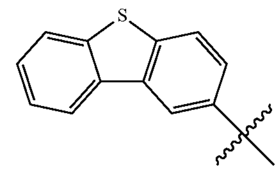 [SMILES: *c1ccc2sc3ccccc3c2c1] |
| 54-14 | 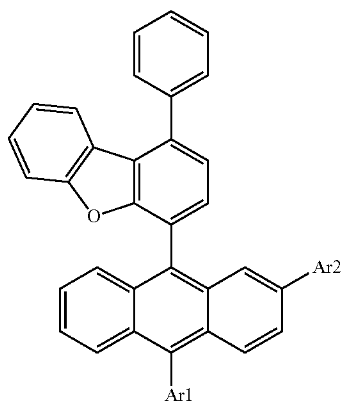 | 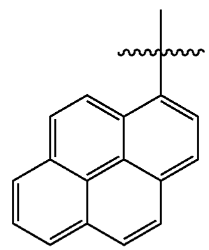 [SMILES: *c1ccc2ccc3cccc4ccc1c2c34] | 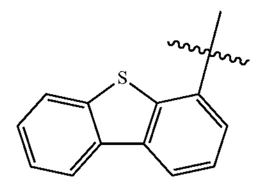 [SMILES: *c1cccc2c1sc1ccccc12] |

-continued
| No. | | Ar1 | Ar2 |
|---|---|---|---|
| 54-15 | 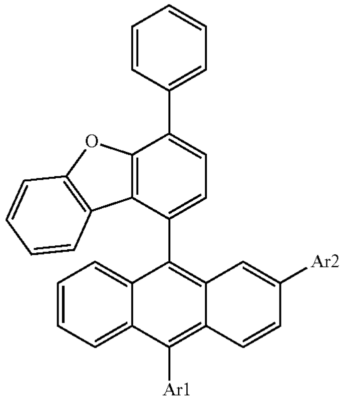 | 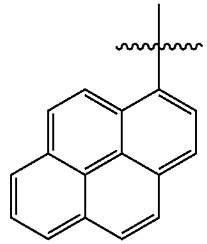 [SMILES: *c1ccc2ccc3cccc4ccc1c2c34] | 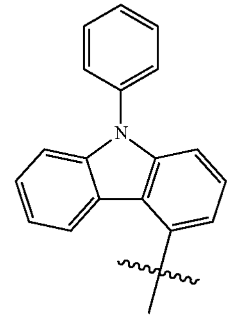 [SMILES: *c1cccc2c1c1ccccc1n2-c1ccccc1] |
| 54-16 | 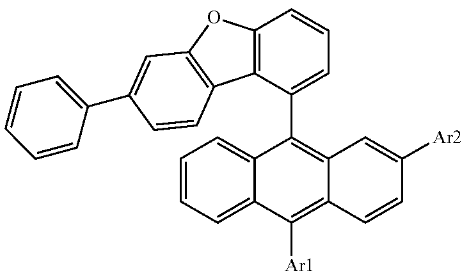 | 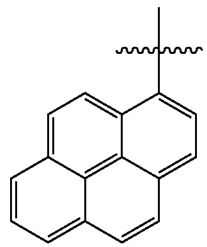 [SMILES: *c1ccc2ccc3cccc4ccc1c2c34] | 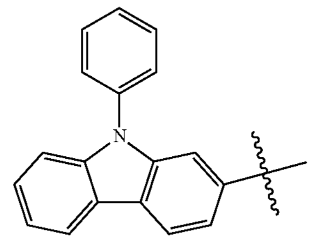 [SMILES: *c1ccc2c3ccccc3n(-c3ccccc3)c2c1] |

-continued
| No. | | Ar1 | Ar2 |
|---|---|---|---|
| 54-17 | 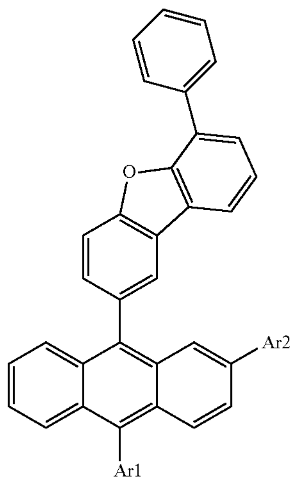 | 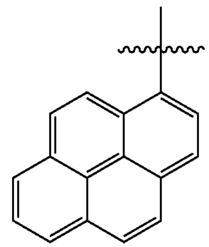 [SMILES: *c1ccc2ccc3cccc4ccc1c2c34] | 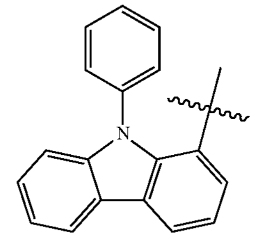 [SMILES: *c1cccc2c3ccccc3n(-c3ccccc3)c12] |
| 54-18 | 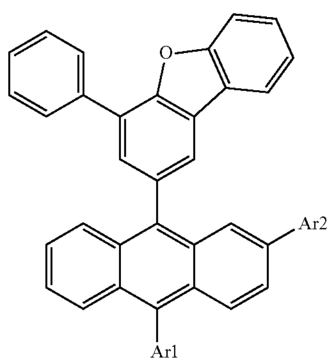 | 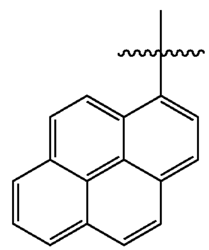 [SMILES: *c1ccc2ccc3cccc4ccc1c2c34] | 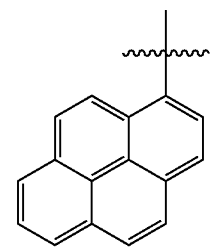 [SMILES: *c1ccc2ccc3cccc4ccc1c2c34] |

-continued
| No. | | Ar1 | Ar2 |
|---|---|---|---|
| 54-19 | 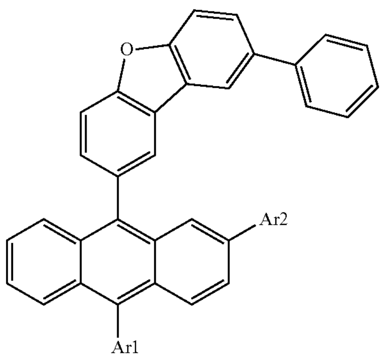 | 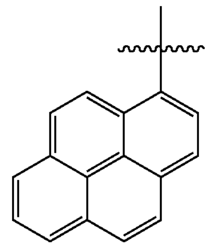 [SMILES: *c1ccc2ccc3cccc4ccc1c2c34] | 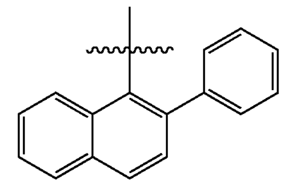 [SMILES: *c1c(-c2ccccc2)ccc2ccccc12] |
| 54-20 | 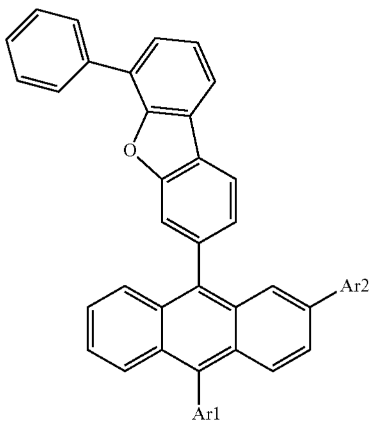 | 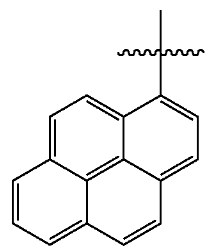 [SMILES: *c1ccc2ccc3cccc4ccc1c2c34] | 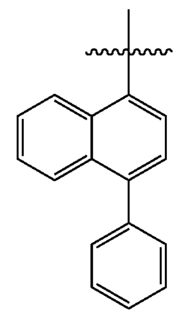 [SMILES: *c1ccc(-c2ccccc2)c2ccccc12] |

-continued
| No. | | Ar1 | Ar2 |
|---|---|---|---|
| 54-21 | 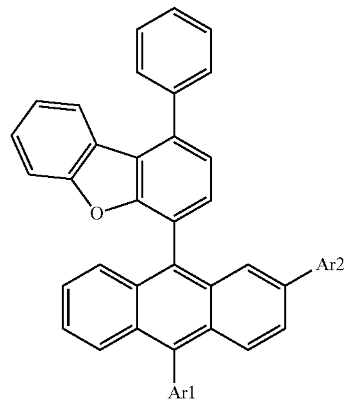 | 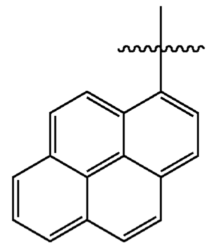 [SMILES: *c1ccc2ccc3cccc4ccc1c2c34] | 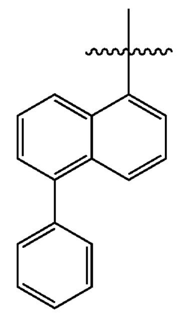 [SMILES: *c1cccc2c(-c3ccccc3)cccc12] |
| 54-22 | 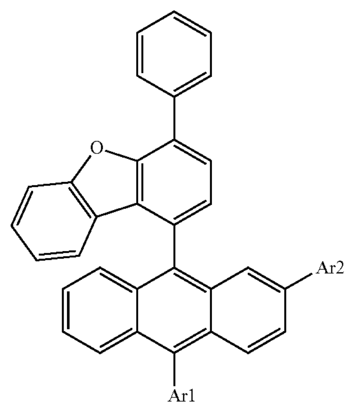 | 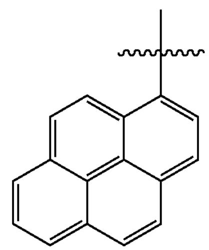 [SMILES: *c1ccc2ccc3cccc4ccc1c2c34] | 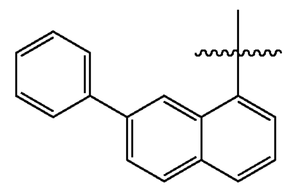 [SMILES: *c1cccc2ccc(-c3ccccc3)cc12] |

-continued
| No. | | Ar1 | Ar2 |
|---|---|---|---|
| 54-23 | 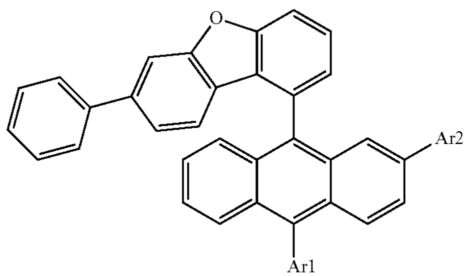 | 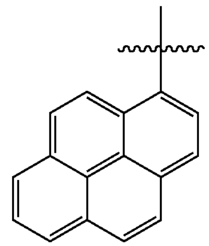 [SMILES: *c1ccc2ccc3cccc4ccc1c2c34] | 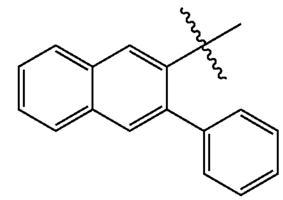 [SMILES: *c1cc2ccccc2cc1-c1ccccc1] |
| 54-24 | 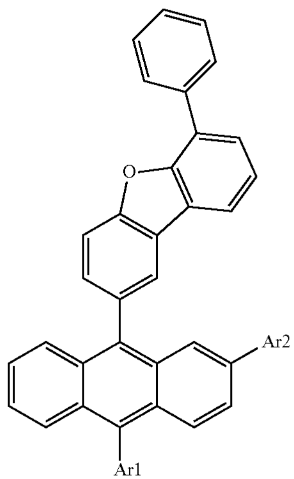 | 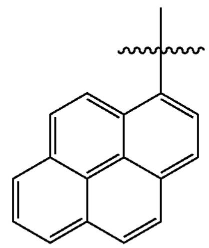 [SMILES: *c1ccc2ccc3cccc4ccc1c2c34] | 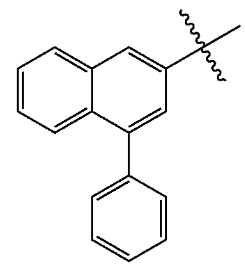 [SMILES: *c1cc(-c2ccccc2)c2ccccc2c1] |

-continued
| No. | | Ar1 | Ar2 |
|---|---|---|---|
| 54-25 | 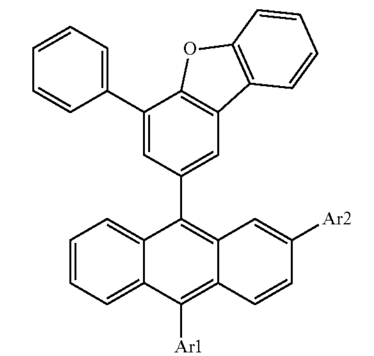 | 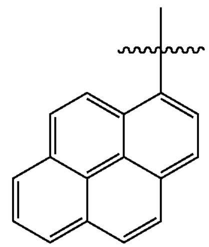 [SMILES: *c1ccc2ccc3cccc4ccc1c2c34] | 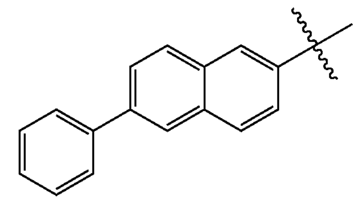 [SMILES: *c1ccc2cc(-c3ccccc3)ccc2c1] |
| 54-26 | 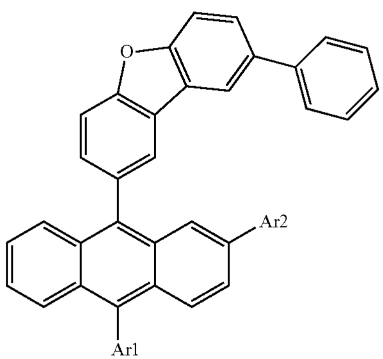 | 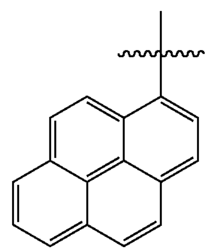 [SMILES: *c1ccc2ccc3cccc4ccc1c2c34] | 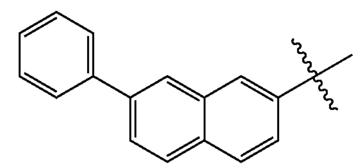 [SMILES: *c1ccc2ccc(-c3ccccc3)cc2c1] |

-continued
| No. | | Ar1 | Ar2 |
|---|---|---|---|
| 54-27 | 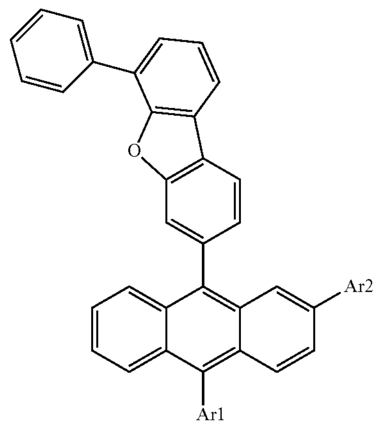 | 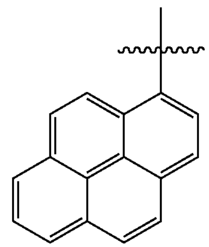 [SMILES: *c1ccc2ccc3cccc4ccc1c2c34] | 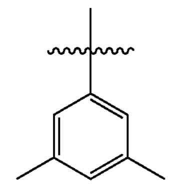 |
| 54-28 | 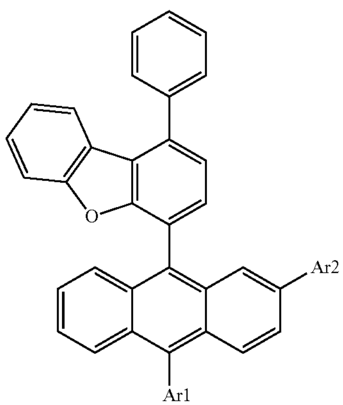 | 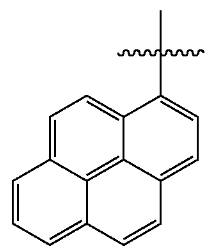 [SMILES: *c1ccc2ccc3cccc4ccc1c2c34] | 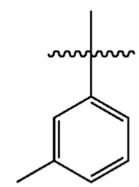 [SMILES: *c1cccc(C)c1] |

-continued
| No. | | Ar1 | Ar2 |
|---|---|---|---|
| 54-29 | 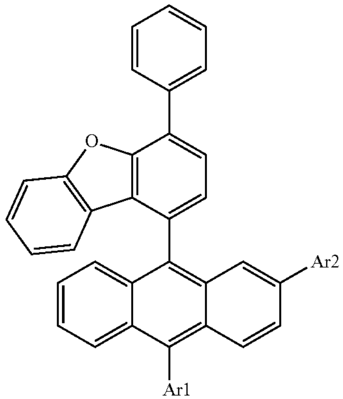 | 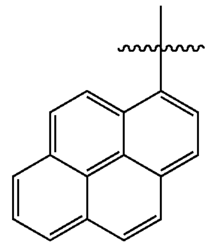 [SMILES: *c1ccc2ccc3cccc4ccc1c2c34] | 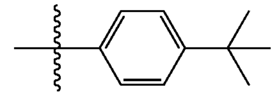 |
| 54-30 | 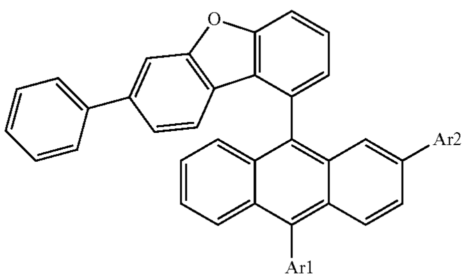 | 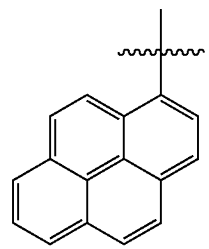 [SMILES: *c1ccc2ccc3cccc4ccc1c2c34] | 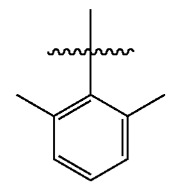 |

-continued
| No. | | Ar1 | Ar2 |
|---|---|---|---|
| 54-31 | 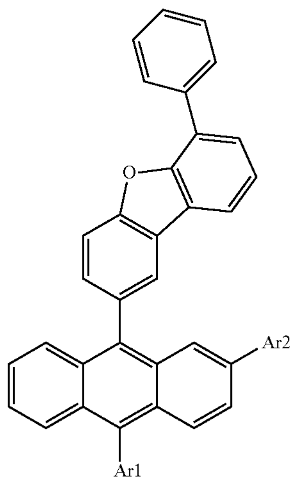 | 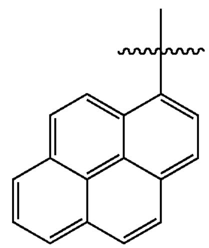 [SMILES: *c1ccc2ccc3cccc4ccc1c2c34] | 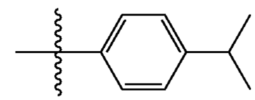 [SMILES: *c1ccc(C(C)C)cc1] |
| 55-1 | 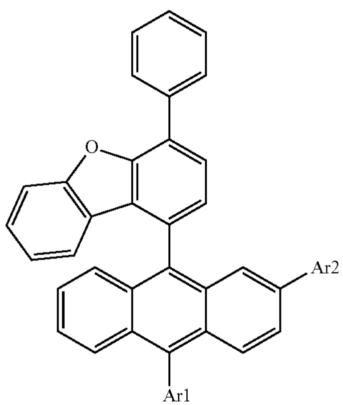 | 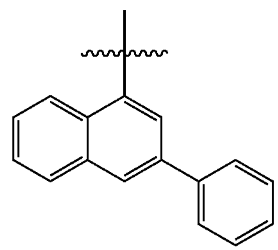 [SMILES: *c1cc(-c2ccccc2)cc2ccccc12] | 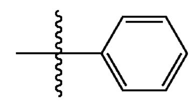 [SMILES: *c1ccccc1] |

-continued
| No. | | Ar1 | Ar2 |
| --- | --- | --- | --- |
| 55-2 | 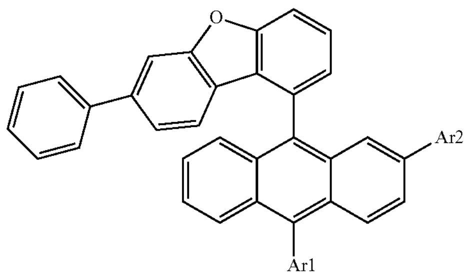 | 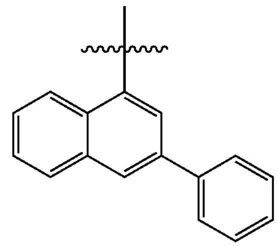 [SMILES: *c1cc(-c2ccccc2)cc2ccccc12] | 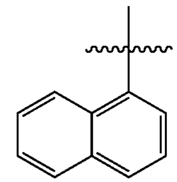 [SMILES: *c1cccc2ccccc12] |
| 55-3 | 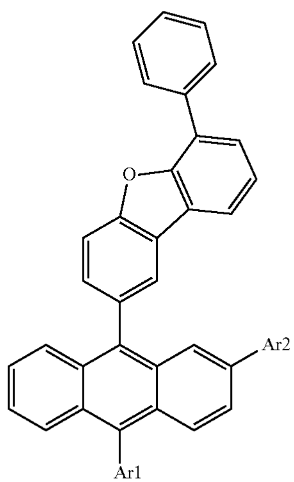 | 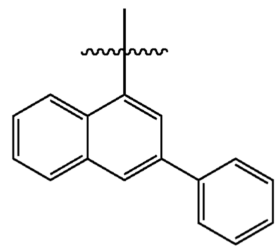 [SMILES: *c1cc(-c2ccccc2)cc2ccccc12] | 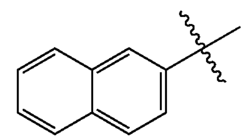 [SMILES: *c1ccc2ccccc2c1] |

-continued
| No. | | Ar1 | Ar2 |
|---|---|---|---|
| 55-4 | 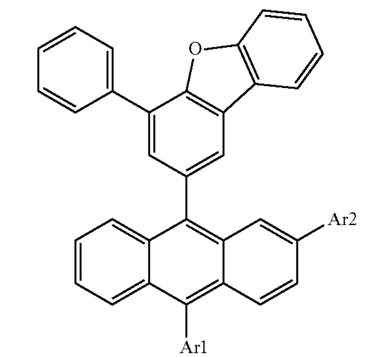 | 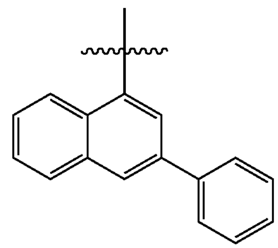 [SMILES: *c1cc(-c2ccccc2)cc2ccccc12] | 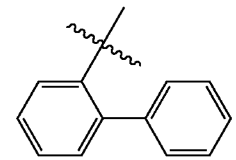 [SMILES: *c1ccccc1-c1ccccc1] |
| 55-5 | 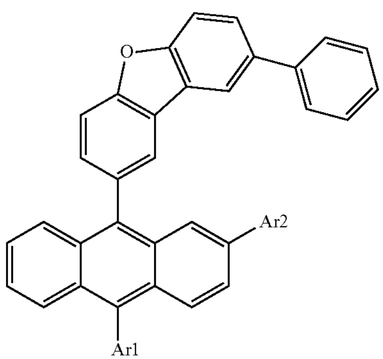 | 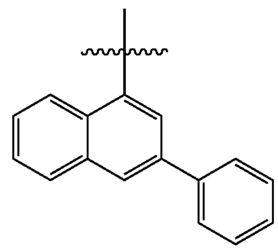 [SMILES: *c1cc(-c2ccccc2)cc2ccccc12] | 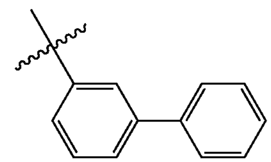 [SMILES: *c1cccc(-c2ccccc2)c1] |

-continued
| No. | | Ar1 | Ar2 |
|---|---|---|---|
| 55-6 | 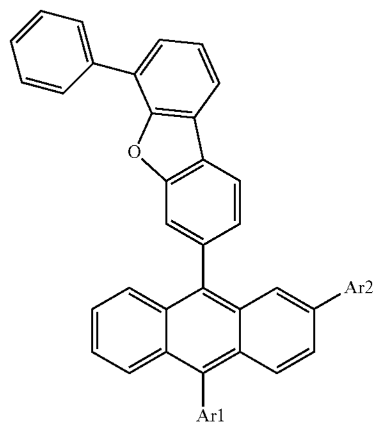 | 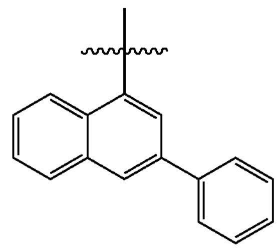 [SMILES: *c1cc(-c2ccccc2)cc2ccccc12] | 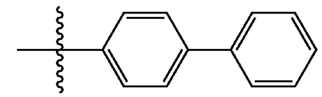 |
| 55-7 | 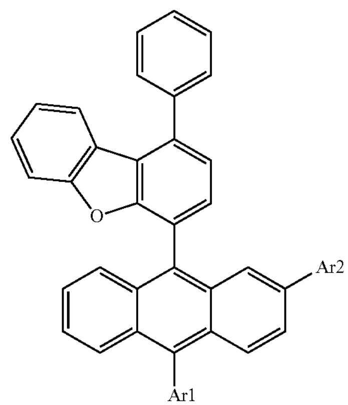 | 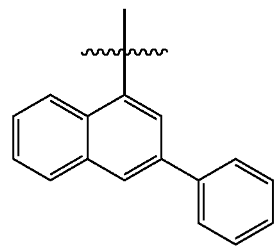 [SMILES: *c1cc(-c2ccccc2)cc2ccccc12] | 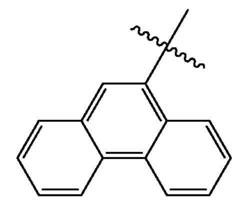 [SMILES: *c1cc2ccccc2c2ccccc12] |

-continued
| No. | | Ar1 | Ar2 |
|---|---|---|---|
| 55-8 | 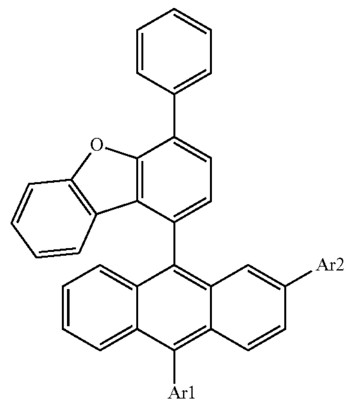 | 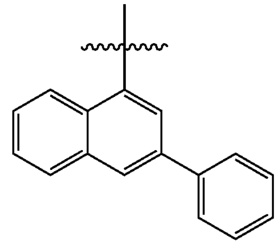 [SMILES: *c1cc(-c2ccccc2)cc2ccccc12] | 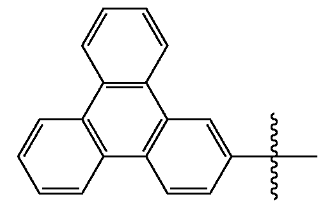 [SMILES: *c1ccc2c3ccccc3c3ccccc3c2c1] |
| 55-9 | 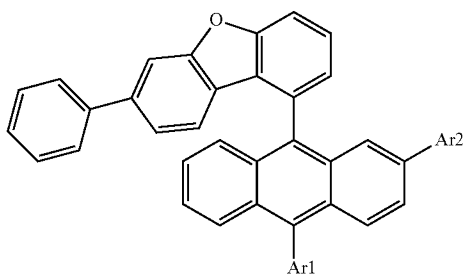 | 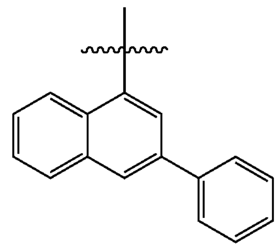 [SMILES: *c1cc(-c2ccccc2)cc2ccccc12] | 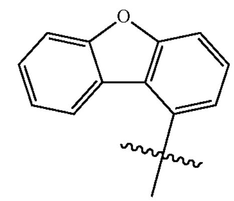 [SMILES: *c1cccc2oc3ccccc3c12] |

-continued
| No. | | Ar1 | Ar2 |
|---|---|---|---|
| 55-10 | 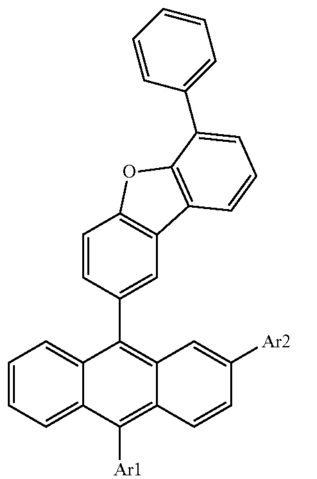 | 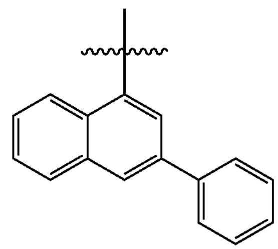 [SMILES: *c1cc(-c2ccccc2)cc2ccccc12] | 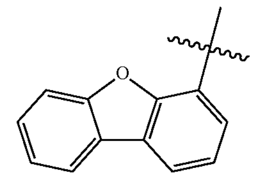 [SMILES: *c1cccc2c1oc1ccccc12] |
| 55-11 | 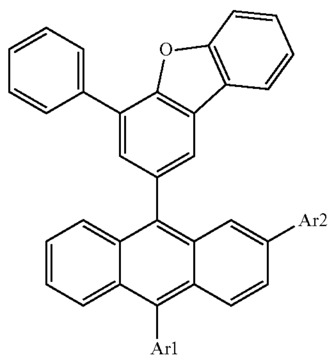 | 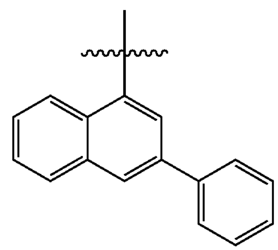 [SMILES: *c1cc(-c2ccccc2)cc2ccccc12] | 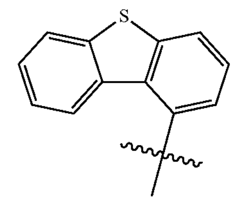 [SMILES: *c1cccc2sc3ccccc3c12] |

-continued
| No. | | Ar1 | Ar2 |
|---|---|---|---|
| 55-12 | 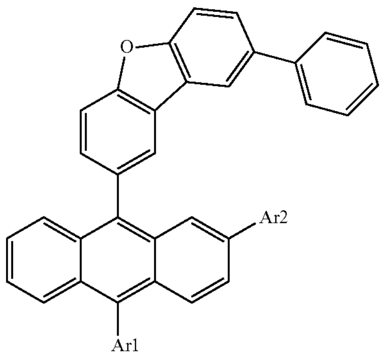 | 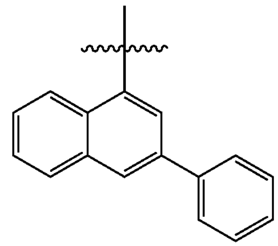 [SMILES: *c1cc(-c2ccccc2)cc2ccccc12] | 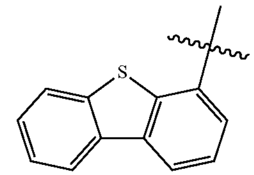 |
| 55-13 | 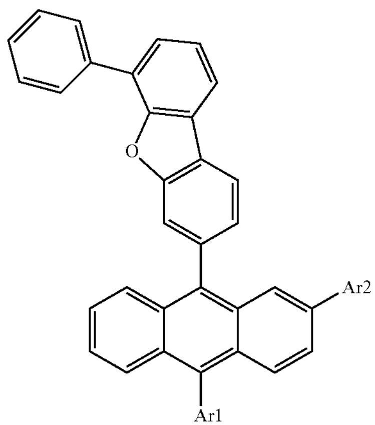 | 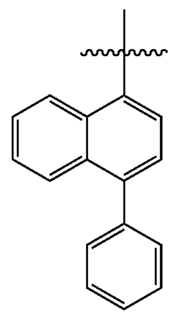 [SMILES: *c1ccc(-c2ccccc2)c2ccccc12] | 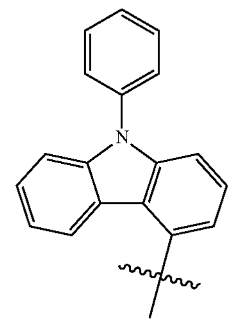 [SMILES: *c1cccc2c1c1ccccc1n2-c1ccccc1] |

-continued
| No. | | Ar1 | Ar2 |
|---|---|---|---|
| 55-14 | 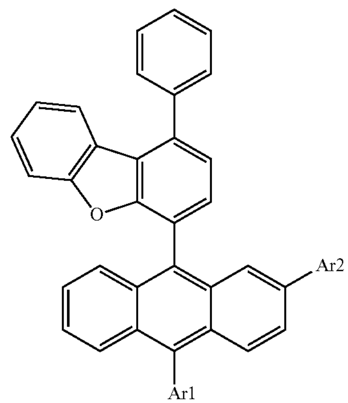 | 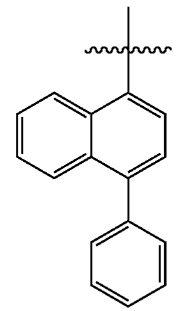 [SMILES: *c1ccc(-c2ccccc2)c2ccccc12] | 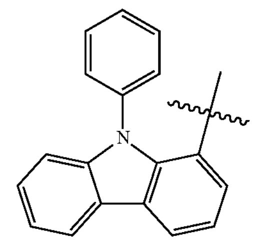 [SMILES: *c1cccc2c3ccccc3n(-c3ccccc3)c12] |
| 55-15 | 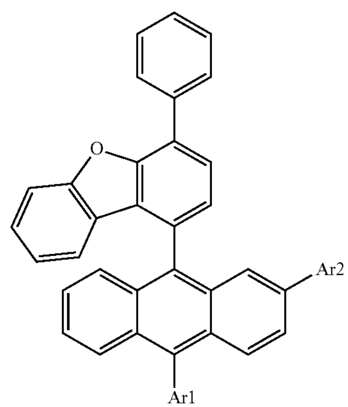 | 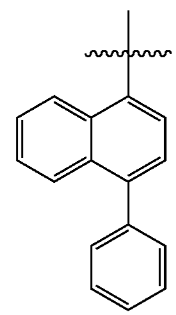 [SMILES: *c1ccc(-c2ccccc2)c2ccccc12] | 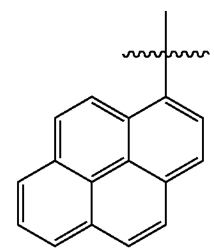 [SMILES: *c1ccc2ccc3cccc4ccc1c2c34] |

-continued
| No. | | Ar1 | Ar2 |
|---|---|---|---|
| 55-16 | 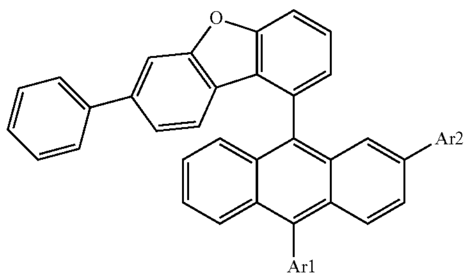 | 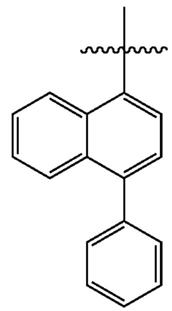 [SMILES: *c1ccc(-c2ccccc2)c2ccccc12] | 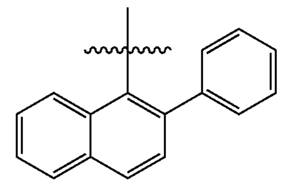 [SMILES: *c1c(-c2ccccc2)ccc2ccccc12] |
| 55-17 | 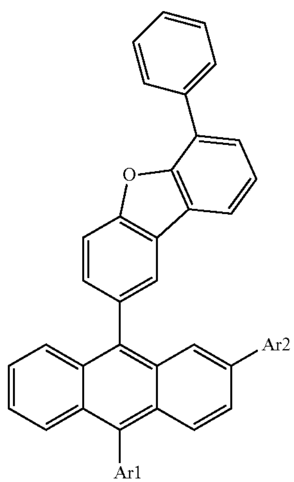 | 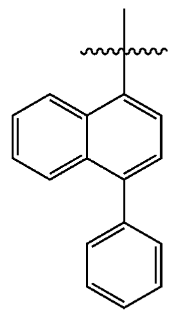 [SMILES: *c1ccc(-c2ccccc2)c2ccccc12] | 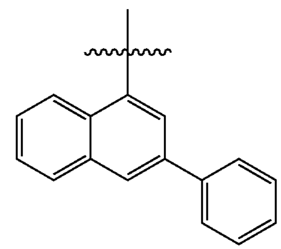 [SMILES: *c1cc(-c2ccccc2)cc2ccccc12] |

-continued
| No. | | Ar1 | Ar2 |
|---|---|---|---|
| 55-18 | 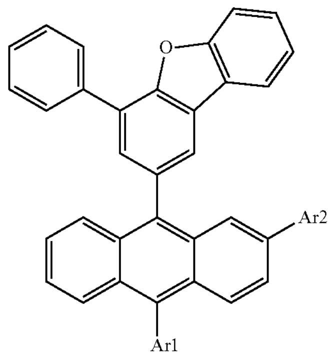 | 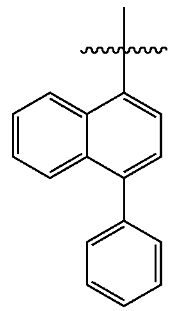 [SMILES: *c1ccc(-c2ccccc2)c2ccccc12] | 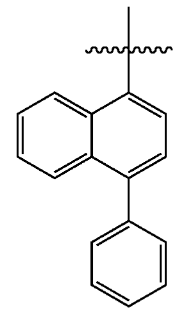 [SMILES: *c1ccc(-c2ccccc2)c2ccccc12] |
| 55-19 | 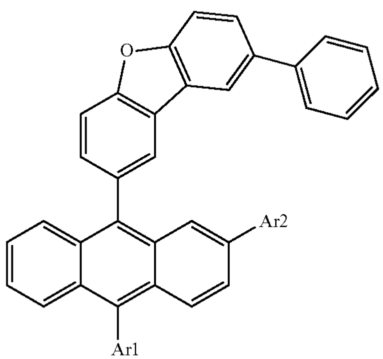 | 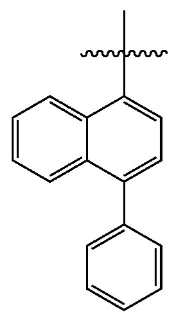 [SMILES: *c1ccc(-c2ccccc2)c2ccccc12] | 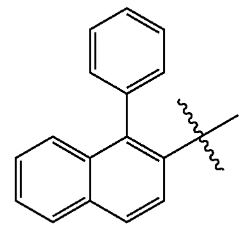 [SMILES: *c1ccc2ccccc2c1-c1ccccc1] |

-continued
| No. | | Ar1 | Ar2 |
|---|---|---|---|
| 55-20 | 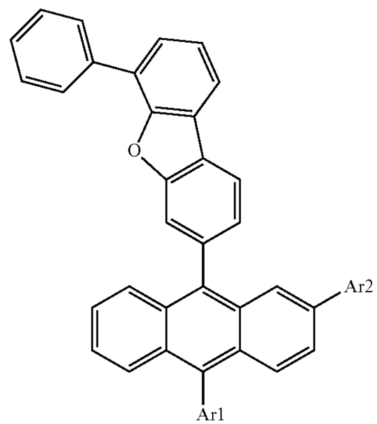 | 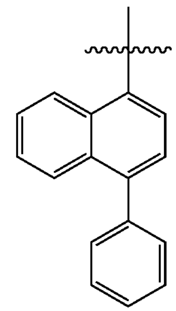 [SMILES: *c1ccc(-c2ccccc2)c2ccccc12] | 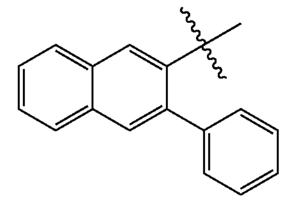 [SMILES: *c1cc2ccccc2cc1-c1ccccc1] |
| 55-21 | 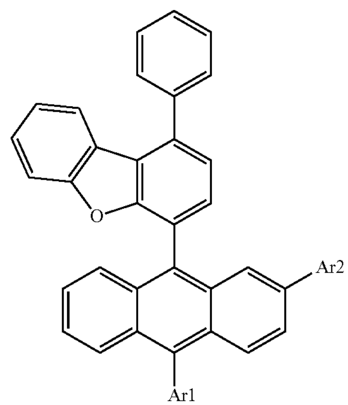 | 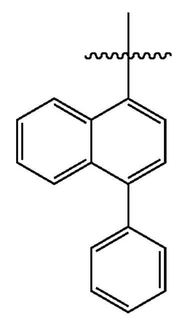 [SMILES: *c1ccc(-c2ccccc2)c2ccccc12] | 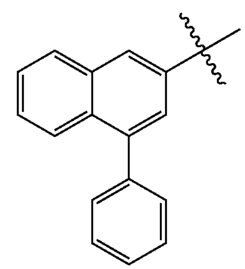 [SMILES: *c1cc(-c2ccccc2)c2ccccc2c1] |

-continued
| No. | | Ar1 | Ar2 |
|---|---|---|---|
| 55-22 | 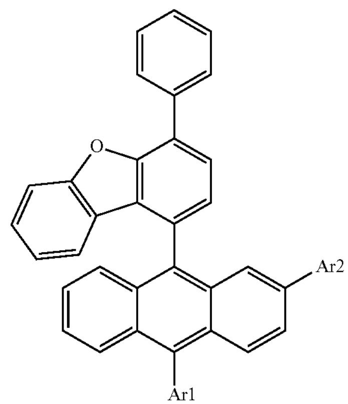 | 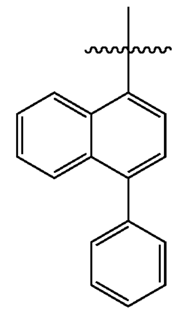 [SMILES: *c1ccc(-c2ccccc2)c2ccccc12] | 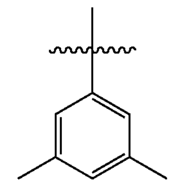 |
| 55-23 | 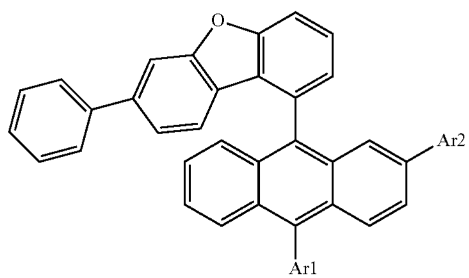 | 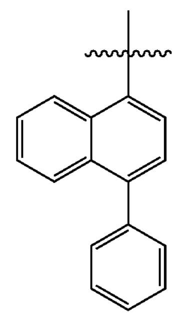 [SMILES: *c1ccc(-c2ccccc2)c2ccccc12] | 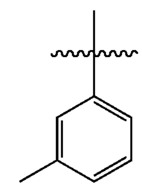 [SMILES: *c1cccc(C)c1] |

-continued
| No. | | Ar1 | Ar2 |
|---|---|---|---|
| 55-24 | 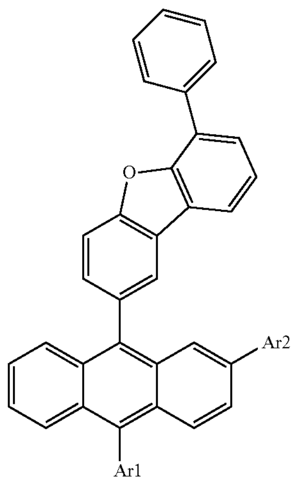 | 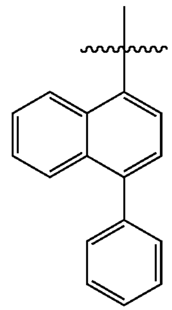 [SMILES: *c1ccc(-c2ccccc2)c2ccccc12] | 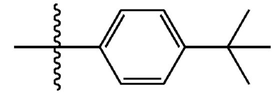 [SMILES: *c1ccc(C(C)(C)C)cc1] |
| 55-25 | 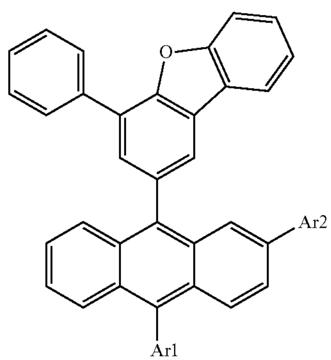 | 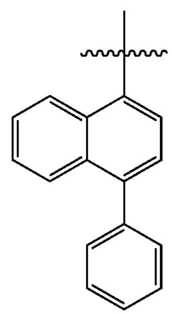 [SMILES: *c1ccc(-c2ccccc2)c2ccccc12] | 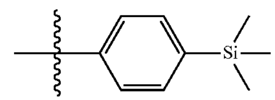 |

-continued
| No. | | Ar1 | Ar2 |
|---|---|---|---|
| 55-26 | 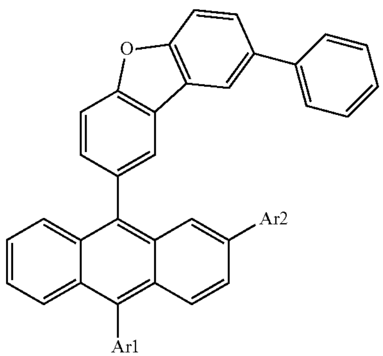 | 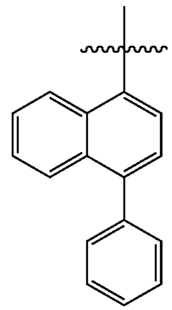 [SMILES: *c1ccc(-c2ccccc2)c2ccccc12] | 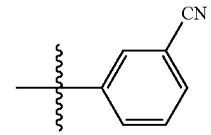 [SMILES: *c1cccc(C#N)c1] |
| 55-27 | 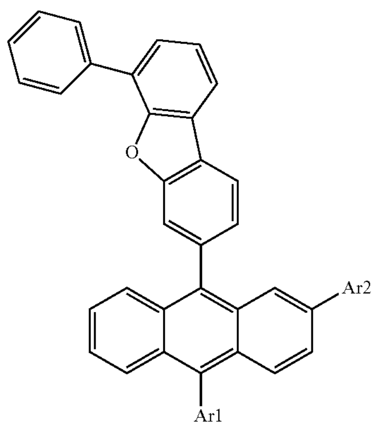 | 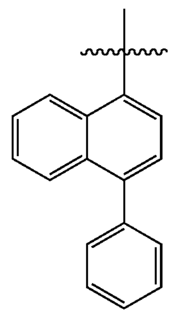 [SMILES: *c1ccc(-c2ccccc2)c2ccccc12] | 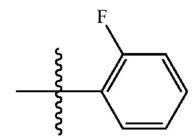 [SMILES: *c1ccccc1F] |

-continued
| No. | | Ar1 | Ar2 |
|---|---|---|---|
| 55-28 | 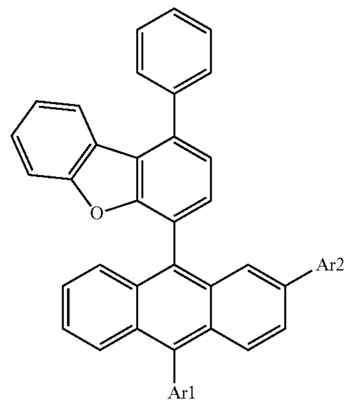 | 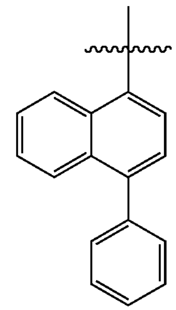 [SMILES: *c1ccc(-c2ccccc2)c2ccccc12] | 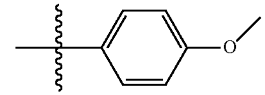 [SMILES: *c1ccc(OC)cc1] |
| 56-1 | 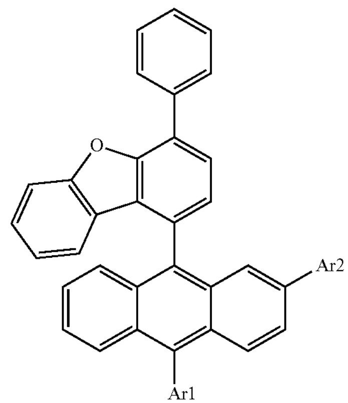 | 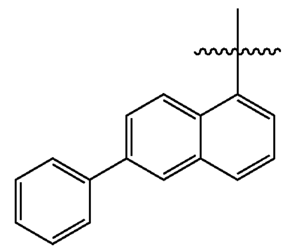 [SMILES: *c1cccc2cc(-c3ccccc3)ccc12] | 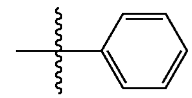 |

-continued
| No. | | Ar1 | Ar2 |
|---|---|---|---|
| 56-2 | 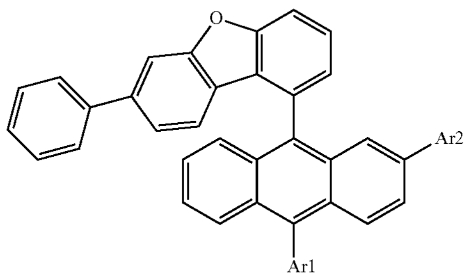 | 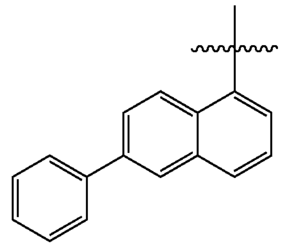 [SMILES: *c1cccc2cc(-c3ccccc3)ccc12] | 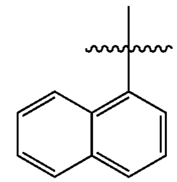 [SMILES: *c1cccc2ccccc12] |
| 56-3 | 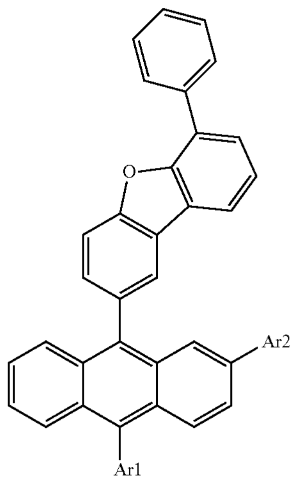 | 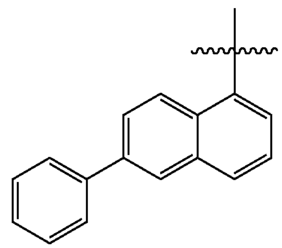 [SMILES: *c1cccc2cc(-c3ccccc3)ccc12] | 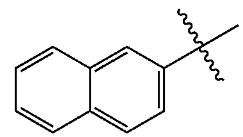 [SMILES: *c1ccc2ccccc2c1] |

-continued
| No. | | Ar1 | Ar2 |
|---|---|---|---|
| 56-4 | 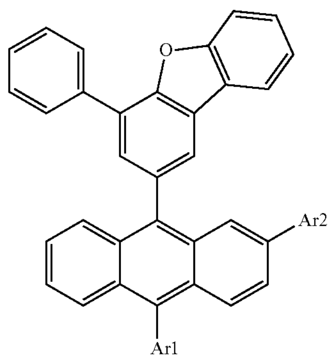 | 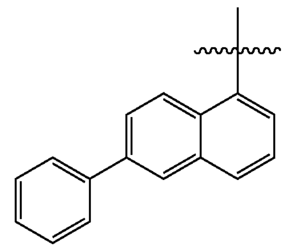 [SMILES: *c1cccc2cc(-c3ccccc3)ccc12] | 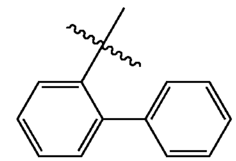 [SMILES: *c1ccccc1-c1ccccc1] |
| 56-5 | 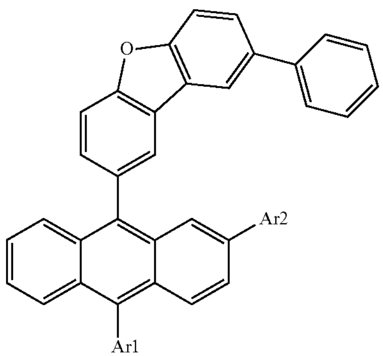 | 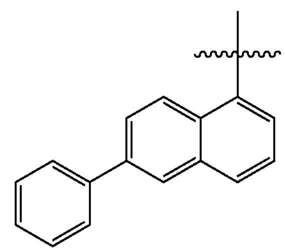 [SMILES: *c1cccc2cc(-c3ccccc3)ccc12] | 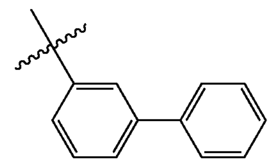 [SMILES: *c1cccc(-c2ccccc2)c1] |

-continued
| No. | | Ar1 | Ar2 |
| --- | --- | --- | --- |
| 56-6 | 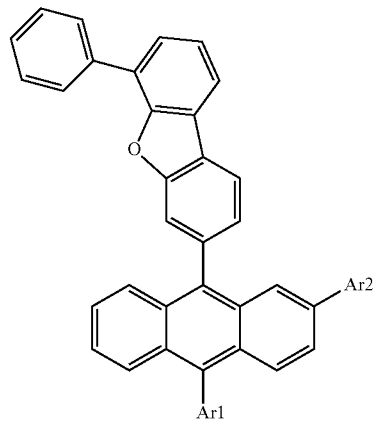 | 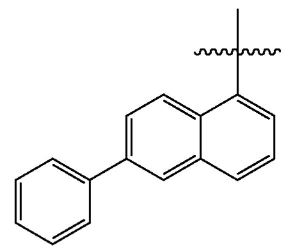 [SMILES: *c1cccc2cc(-c3ccccc3)ccc12] | 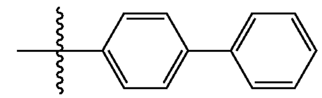 |
| 56-7 | 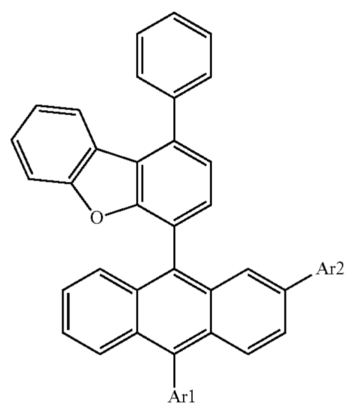 | 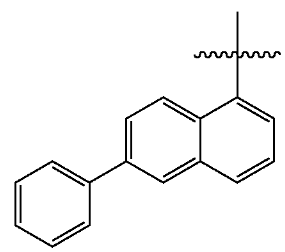 [SMILES: *c1cccc2cc(-c3ccccc3)ccc12] | 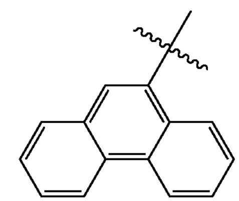 [SMILES: *c1cc2ccccc2c2ccccc12] |

-continued
| No. | | Ar1 | Ar2 |
|---|---|---|---|
| 56-8 | 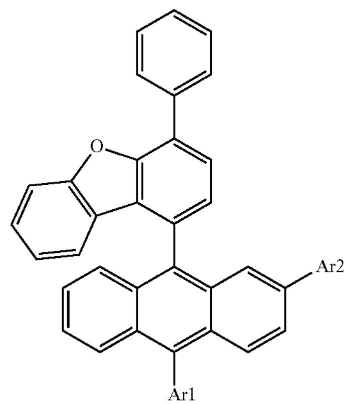 | 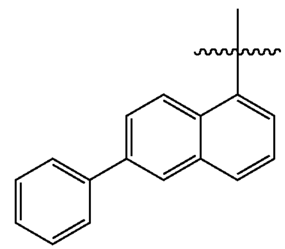 [SMILES: *c1cccc2cc(-c3ccccc3)ccc12] | 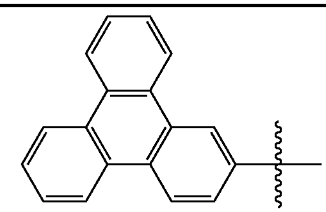 |
| 56-9 | 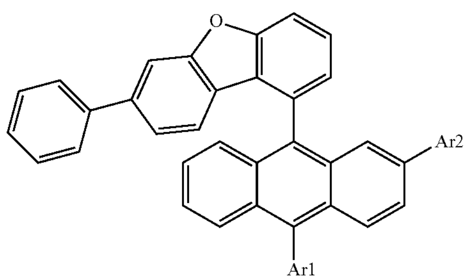 | 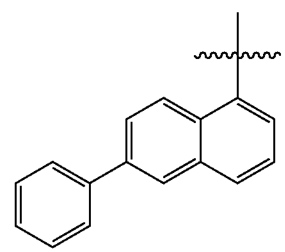 [SMILES: *c1cccc2cc(-c3ccccc3)ccc12] | 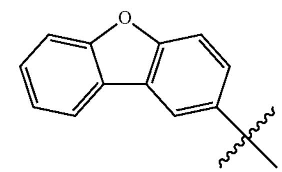 |

-continued
| No. | | Ar1 | Ar2 |
|---|---|---|---|
| 56-10 | 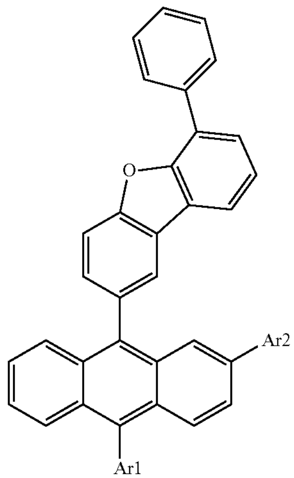 | 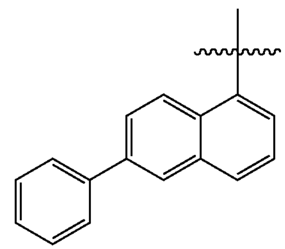 [SMILES: *c1cccc2cc(-c3ccccc3)ccc12] | 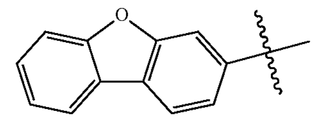 |
| 56-11 | 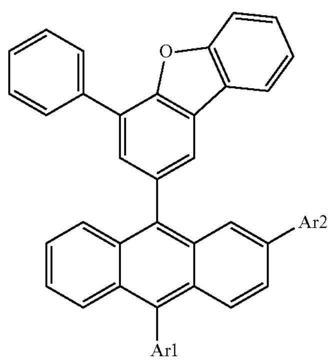 | 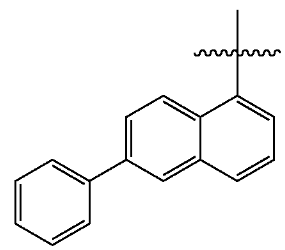 [SMILES: *c1cccc2cc(-c3ccccc3)ccc12] | 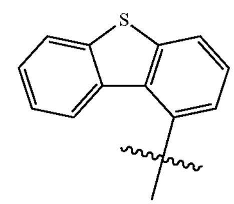 |

-continued
| No. | | Ar1 | Ar2 |
|---|---|---|---|
| 56-12 | 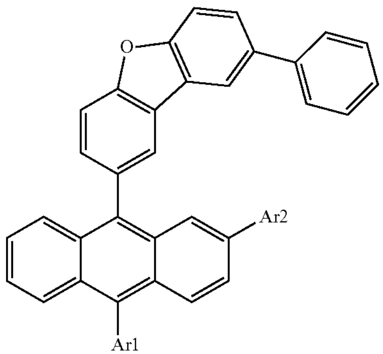 | 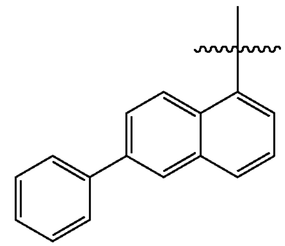 [SMILES: *c1cccc2cc(-c3ccccc3)ccc12] | 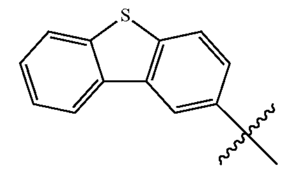 [SMILES: *c1ccc2sc3ccccc3c2c1] |
| 56-13 | 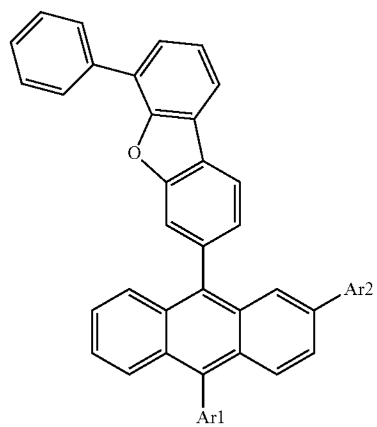 | 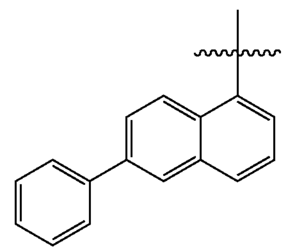 [SMILES: *c1cccc2cc(-c3ccccc3)ccc12] | 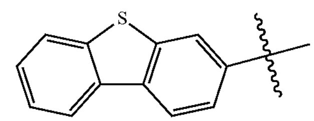 |

-continued
| No. | | Ar1 | Ar2 |
|---|---|---|---|
| 56-14 | 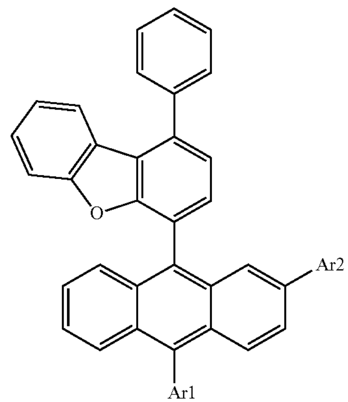 | 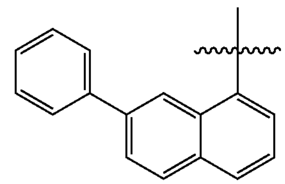 [SMILES: *c1cccc2ccc(-c3ccccc3)cc12] | 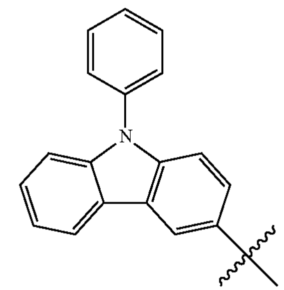 [SMILES: *c1ccc2c(c1)c1ccccc1n2-c1ccccc1] |
| 56-15 | 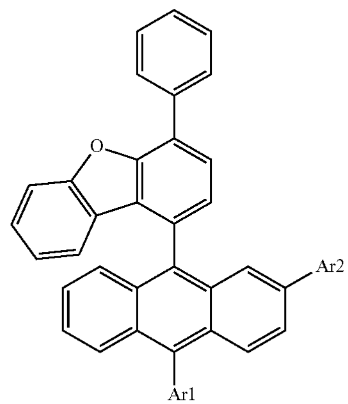 | 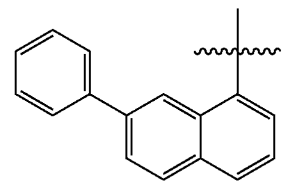 [SMILES: *c1cccc2ccc(-c3ccccc3)cc12] | 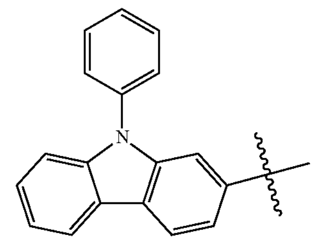 [SMILES: *c1ccc2c3ccccc3n(-c3ccccc3)c2c1] |

-continued
| No. | | Ar1 | Ar2 |
|---|---|---|---|
| 56-16 | 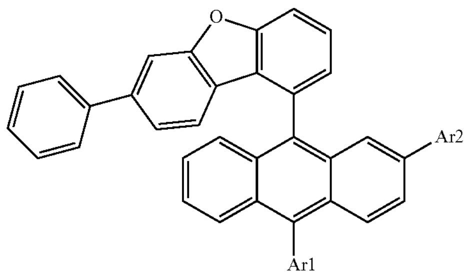 | 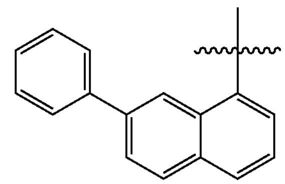 [SMILES: *c1cccc2ccc(-c3ccccc3)cc12] | 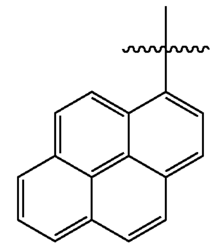 [SMILES: *c1ccc2ccc3cccc4ccc1c2c34] |
| 56-17 | 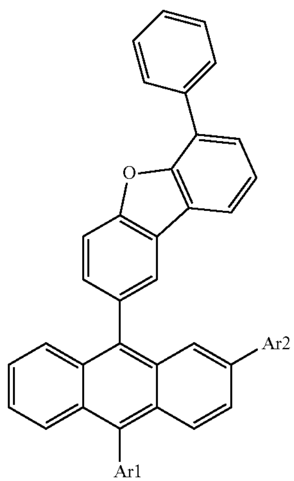 | 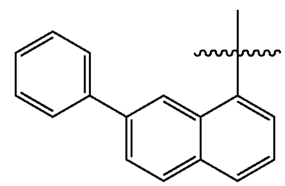 [SMILES: *c1cccc2ccc(-c3ccccc3)cc12] | 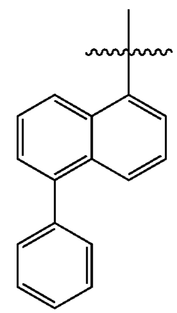 [SMILES: *c1cccc2c(-c3ccccc3)cccc12] |

-continued
| No. | | Ar1 | Ar2 |
|---|---|---|---|
| 56-18 | 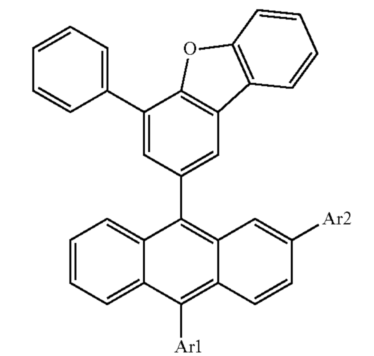 | 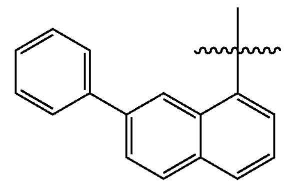 [SMILES: *c1cccc2ccc(-c3ccccc3)cc12] | 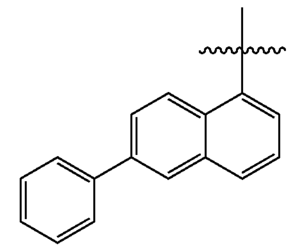 [SMILES: *c1cccc2cc(-c3ccccc3)ccc12] |
| 56-19 | 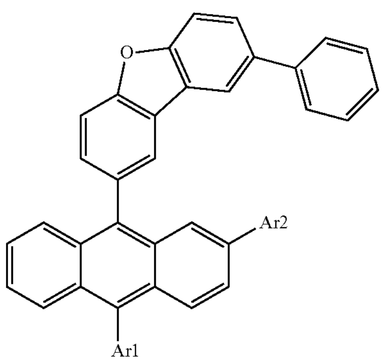 | 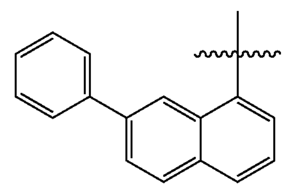 [SMILES: *c1cccc2ccc(-c3ccccc3)cc12] | 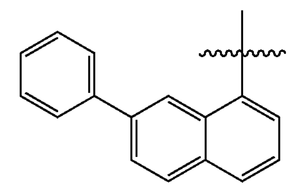 [SMILES: *c1cccc2ccc(-c3ccccc3)cc12] |

-continued
| No. | | Ar1 | Ar2 |
|---|---|---|---|
| 56-20 | 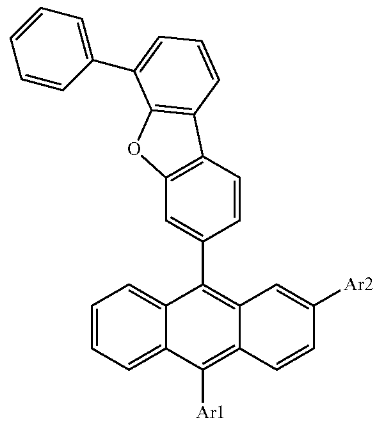 | 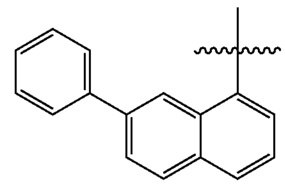 [SMILES: *c1cccc2ccc(-c3ccccc3)cc12] | 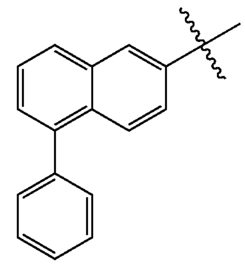 [SMILES: *c1ccc2c(-c3ccccc3)cccc2c1] |
| 56-21 | 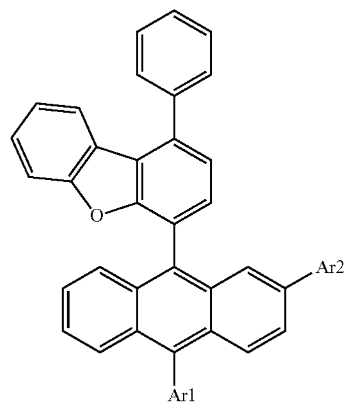 | 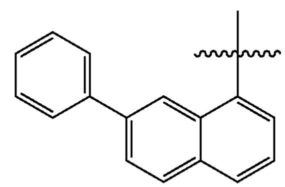 [SMILES: *c1cccc2ccc(-c3ccccc3)cc12] | 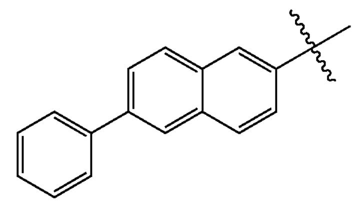 [SMILES: *c1ccc2cc(-c3ccccc3)ccc2c1] |

-continued
| No. | | Ar1 | Ar2 |
|---|---|---|---|
| 56-22 | 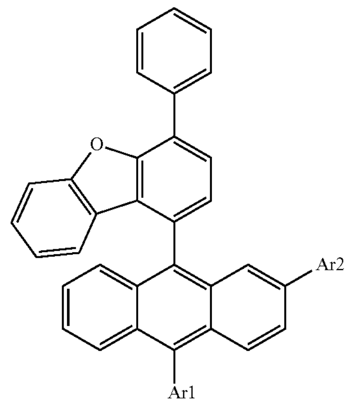 | 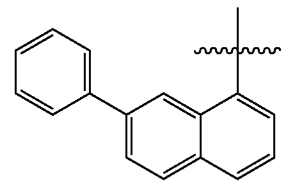 [SMILES: *c1cccc2ccc(-c3ccccc3)cc12] | 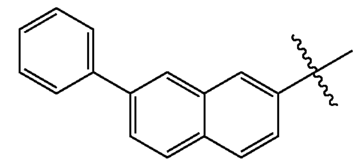 [SMILES: *c1ccc2ccc(-c3ccccc3)cc2c1] |
| 56-23 | 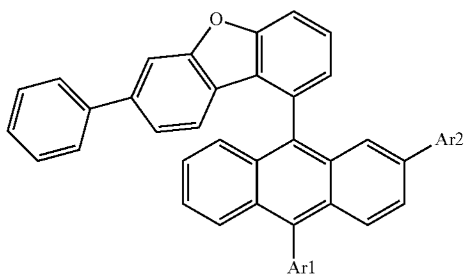 | 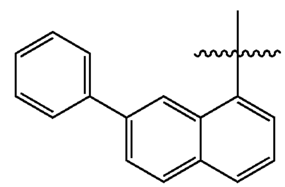 [SMILES: *c1cccc2ccc(-c3ccccc3)cc12] | 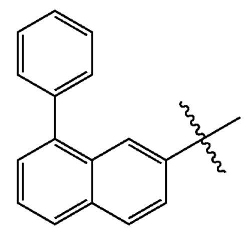 [SMILES: *c1ccc2cccc(-c3ccccc3)c2c1] |

-continued
| No. | | Ar1 | Ar2 |
|---|---|---|---|
| 56-24 | 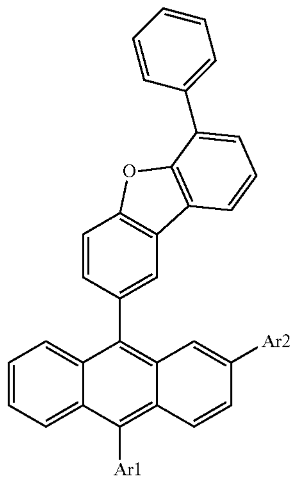 | 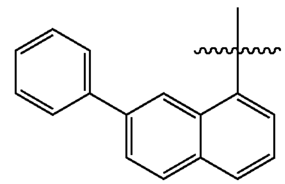 [SMILES: *c1cccc2ccc(-c3ccccc3)cc12] | 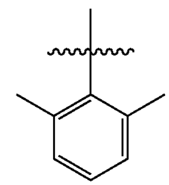 |
| 56-25 | 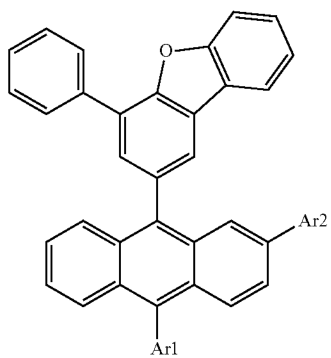 | 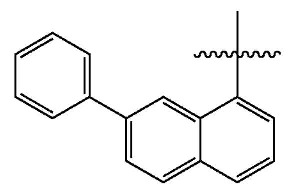 [SMILES: *c1cccc2ccc(-c3ccccc3)cc12] | 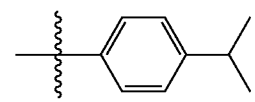 |

-continued
| No. | | Ar1 | Ar2 |
|---|---|---|---|
| 56-26 | 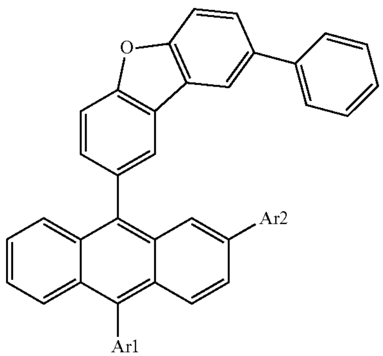 | 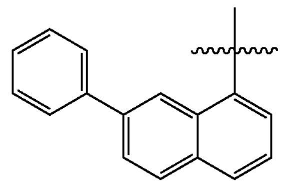 [SMILES: *c1cccc2ccc(-c3ccccc3)cc12] | 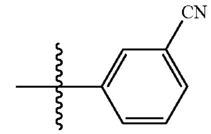 [SMILES: *c1cccc(C#N)c1] |
| 56-27 | 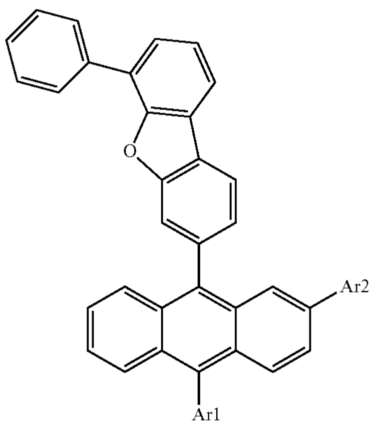 | 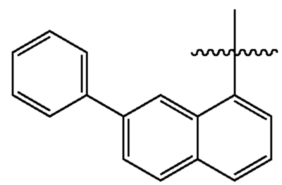 [SMILES: *c1cccc2ccc(-c3ccccc3)cc12] | 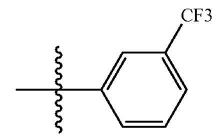 [SMILES: *c1cccc(C(F)(F)F)c1] |

-continued
| No. | | Ar1 | Ar2 |
|---|---|---|---|
| 56-28 | 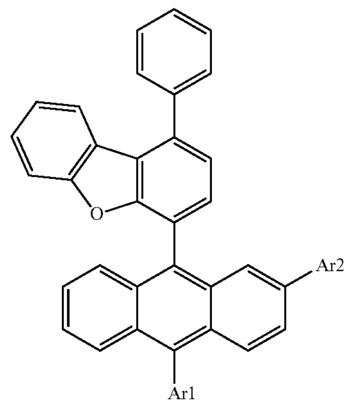 | 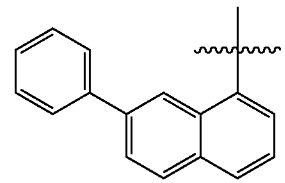 [SMILES: *c1cccc2ccc(-c3ccccc3)cc12] | 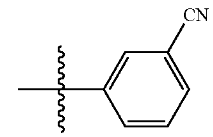 [SMILES: *c1cccc(C#N)c1] |
| 56-29 | 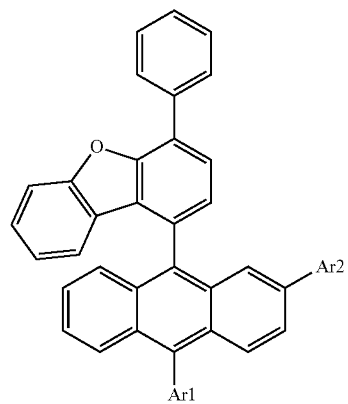 | 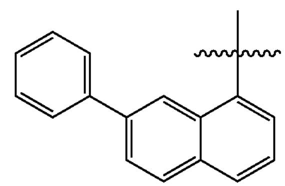 [SMILES: *c1cccc2ccc(-c3ccccc3)cc12] | 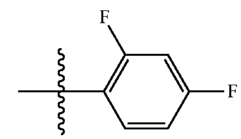 [SMILES: *c1ccc(F)cc1F] |

-continued
| No. | | Ar1 | Ar2 |
|---|---|---|---|
| 57-1 | 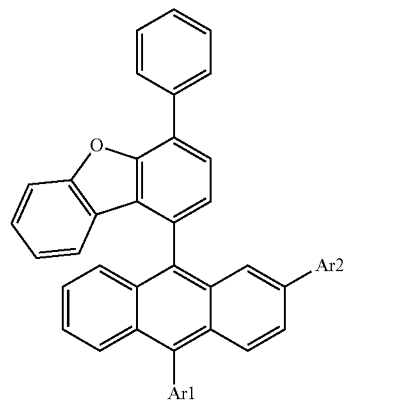 | 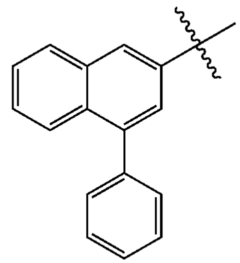 [SMILES: *c1cc(-c2ccccc2)c2ccccc2c1] | 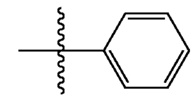 |
| 57-2 | 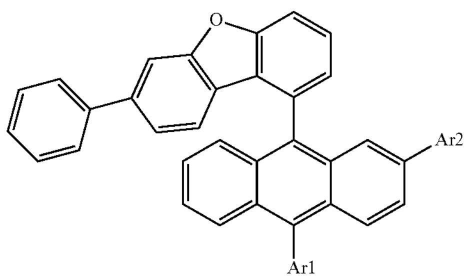 | 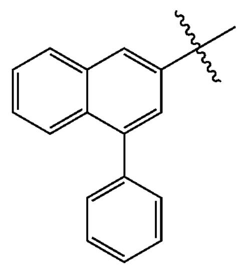 [SMILES: *c1cc(-c2ccccc2)c2ccccc2c1] | 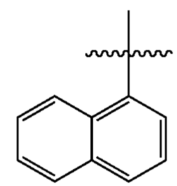 [SMILES: *c1cccc2ccccc12] |

-continued
| No. | | Ar1 | Ar2 |
|---|---|---|---|
| 57-3 | 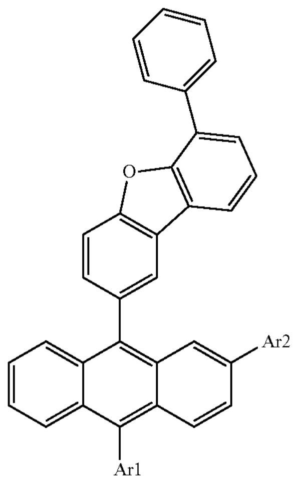 | 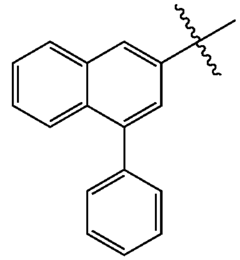 [SMILES: *c1cc(-c2ccccc2)c2ccccc2c1] | 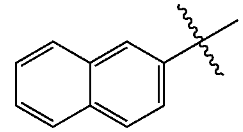 [SMILES: *c1ccc2ccccc2c1] |
| 57-4 | 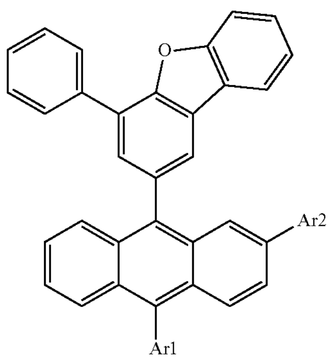 | 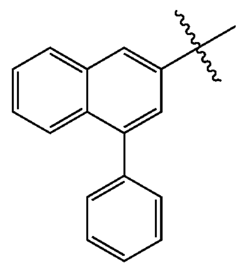 [SMILES: *c1cc(-c2ccccc2)c2ccccc2c1] | 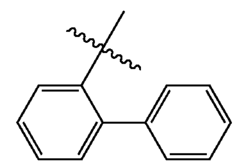 [SMILES: *c1ccccc1-c1ccccc1] |

-continued
| No. | | Ar1 | Ar2 |
|---|---|---|---|
| 57-5 | 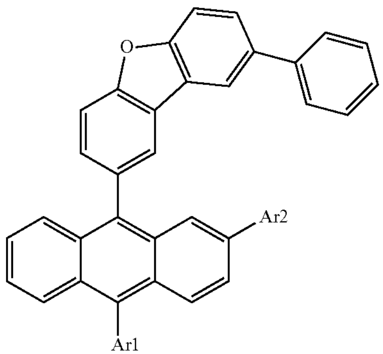 | 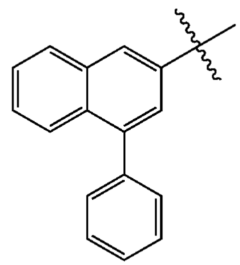 [SMILES: *c1cc(-c2ccccc2)c2ccccc2c1] | 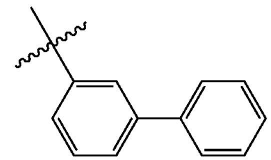 [SMILES: *c1cccc(-c2ccccc2)c1] |
| 57-6 | 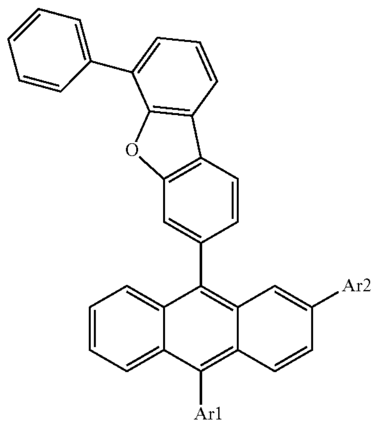 | 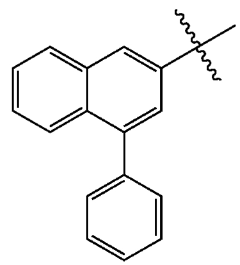 [SMILES: *c1cc(-c2ccccc2)c2ccccc2c1] | 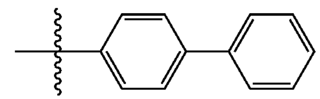 [SMILES: *c1ccc(-c2ccccc2)cc1] |

-continued
| No. | | Ar1 | Ar2 |
|---|---|---|---|
| 57-7 | 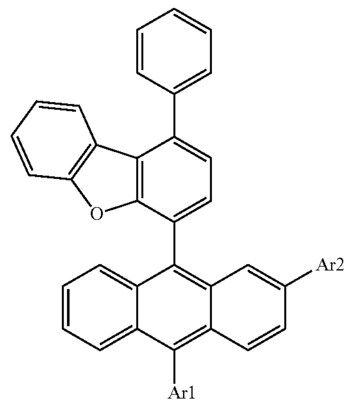 | 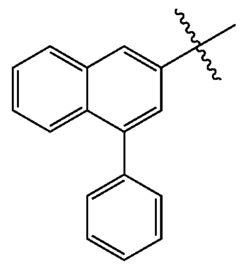 [SMILES: *c1cc(-c2ccccc2)c2ccccc2c1] | 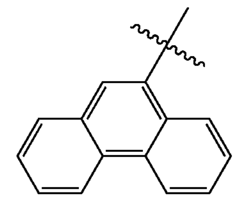 [SMILES: *c1cc2ccccc2c2ccccc12] |
| 57-8 | 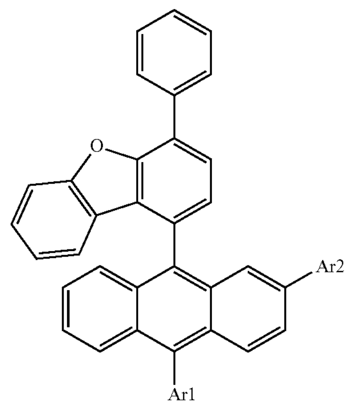 | 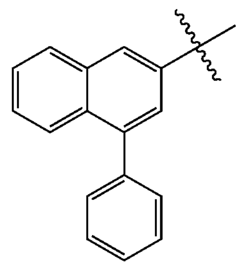 [SMILES: *c1cc(-c2ccccc2)c2ccccc2c1] | 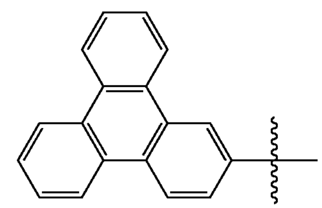 [SMILES: *c1ccc2c3ccccc3c3ccccc3c2c1] |

-continued
| No. | | Ar1 | Ar2 |
|---|---|---|---|
| 57-9 | 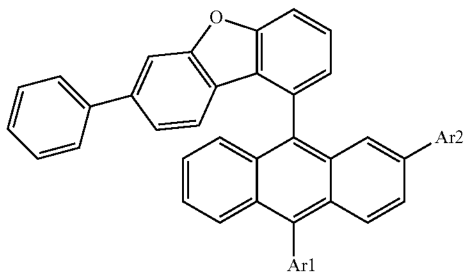 | 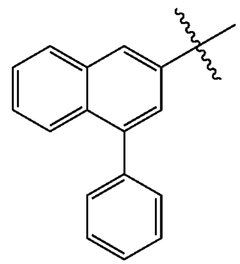 [SMILES: *c1cc(-c2ccccc2)c2ccccc2c1] | 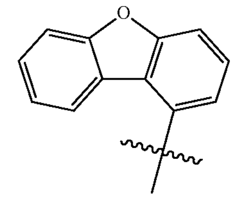 |
| 57-10 | 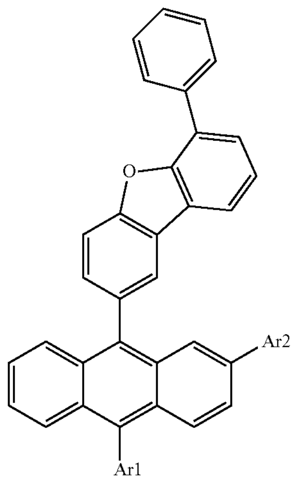 | 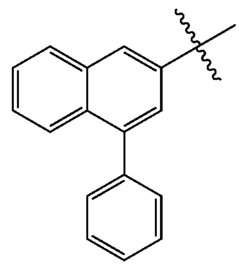 [SMILES: *c1cc(-c2ccccc2)c2ccccc2c1] | 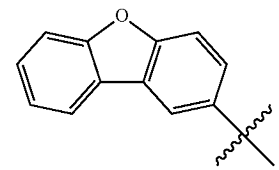 |

-continued
| No. | | Ar1 | Ar2 |
|---|---|---|---|
| 57-11 | 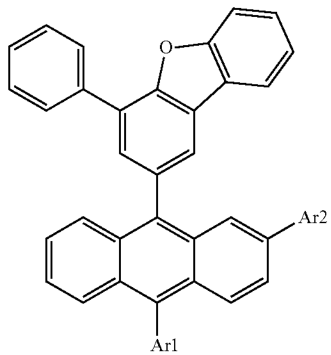 | 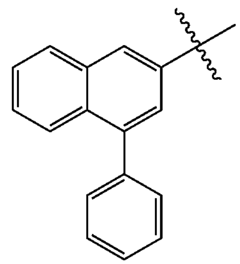 [SMILES: *c1cc(-c2ccccc2)c2ccccc2c1] | 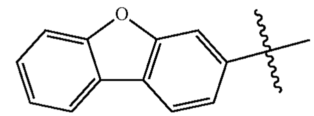 |
| 57-12 | 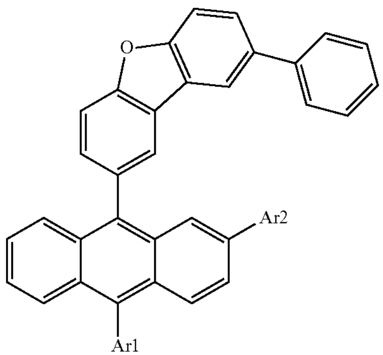 | 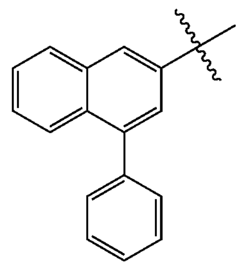 [SMILES: *c1cc(-c2ccccc2)c2ccccc2c1] | 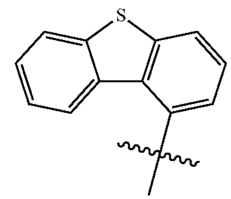 |

-continued
| No. | | Ar1 | Ar2 |
|---|---|---|---|
| 57-13 | 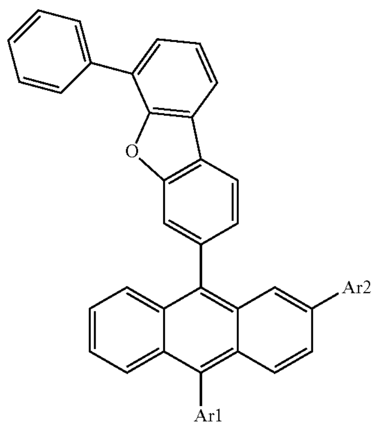 | 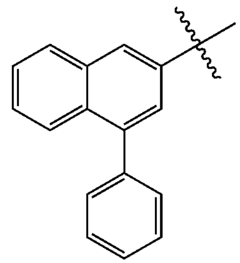 [SMILES: *c1cc(-c2ccccc2)c2ccccc2c1] | 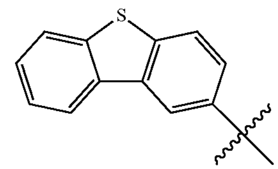 [SMILES: *c1ccc2sc3ccccc3c2c1] |
| 57-14 | 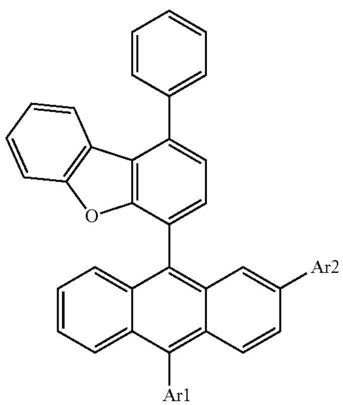 | 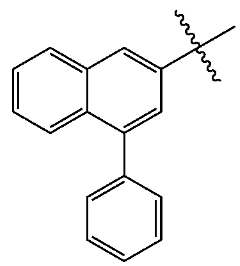 [SMILES: *c1cc(-c2ccccc2)c2ccccc2c1] | 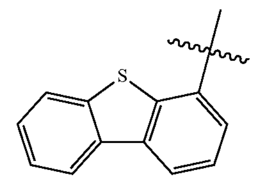 [SMILES: *c1cccc2c1sc1ccccc12] |

-continued
| No. | | Ar1 | Ar2 |
|---|---|---|---|
| 57-15 | 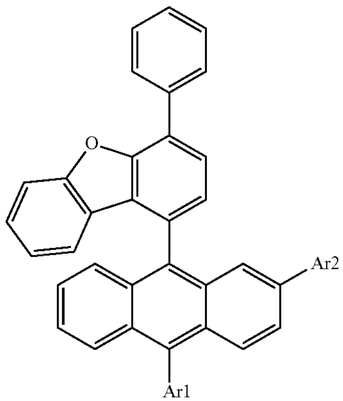 | 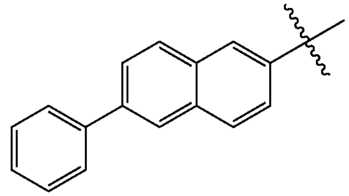 [SMILES: *c1ccc2cc(-c3ccccc3)ccc2c1] | 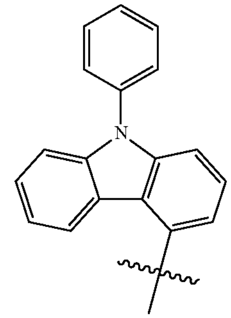 [SMILES: *c1cccc2c1c1ccccc1n2-c1ccccc1] |
| 57-16 | 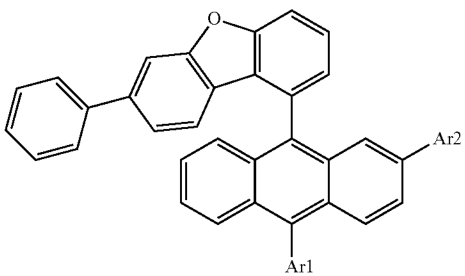 | 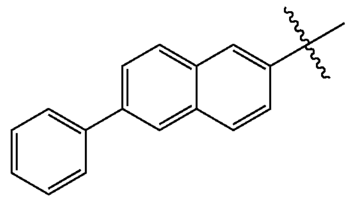 [SMILES: *c1ccc2cc(-c3ccccc3)ccc2c1] | 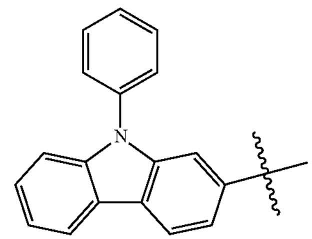 [SMILES: *c1ccc2c3ccccc3n(-c3ccccc3)c2c1] |

-continued
| No. | | Ar1 | Ar2 |
|---|---|---|---|
| 57-17 | 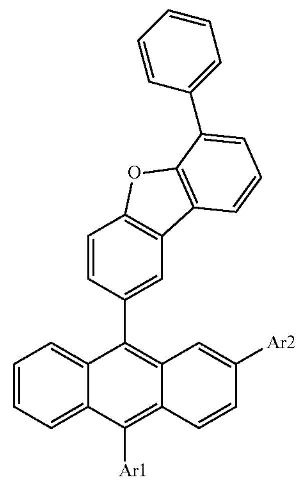 | 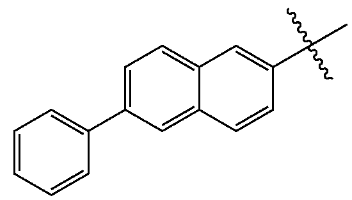 [SMILES: *c1ccc2cc(-c3ccccc3)ccc2c1] | 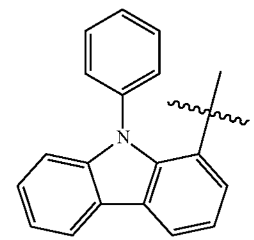 [SMILES: *c1cccc2c3ccccc3n(-c3ccccc3)c12] |
| 57-18 | 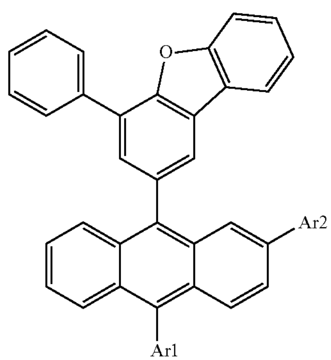 | 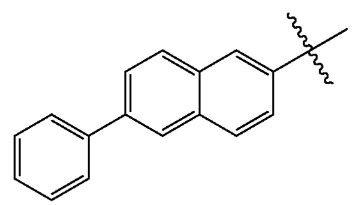 [SMILES: *c1ccc2cc(-c3ccccc3)ccc2c1] | 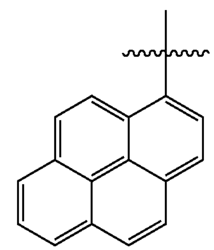 [SMILES: *c1ccc2ccc3cccc4ccc1c2c34] |

-continued
| No. | | Ar1 | Ar2 |
|---|---|---|---|
| 57-19 | 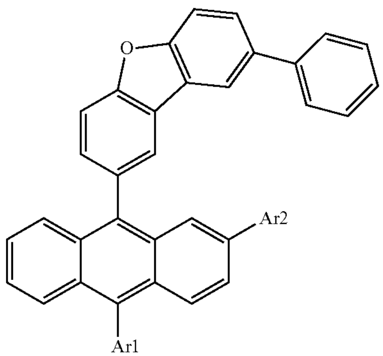 | 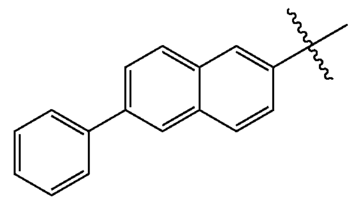 [SMILES: *c1ccc2cc(-c3ccccc3)ccc2c1] | 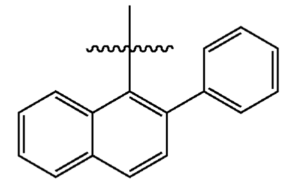 [SMILES: *c1c(-c2ccccc2)ccc2ccccc12] |
| 57-20 | 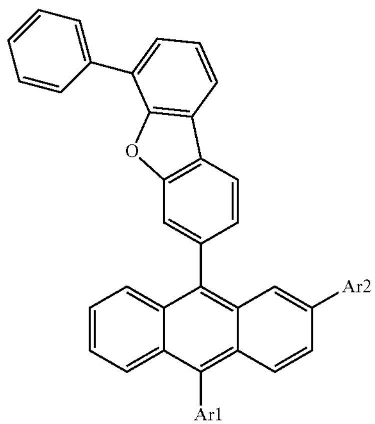 | 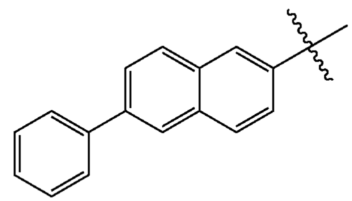 [SMILES: *c1ccc2cc(-c3ccccc3)ccc2c1] | 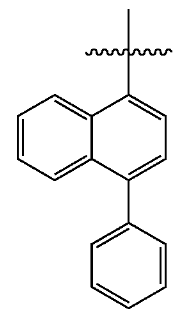 [SMILES: *c1ccc(-c2ccccc2)c2ccccc12] |

-continued
| No. | | Ar1 | Ar2 |
|---|---|---|---|
| 57-21 | 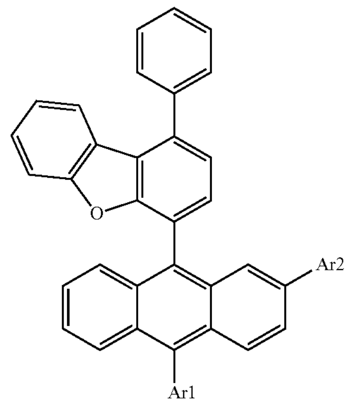 | 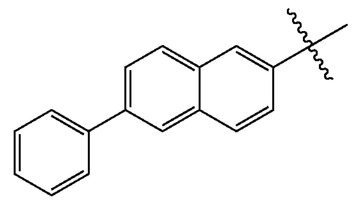 [SMILES: *c1ccc2cc(-c3ccccc3)ccc2c1] | 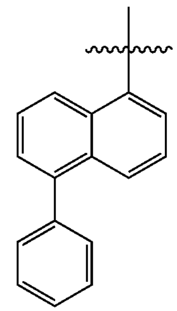 [SMILES: *c1cccc2c(-c3ccccc3)cccc12] |
| 57-22 | 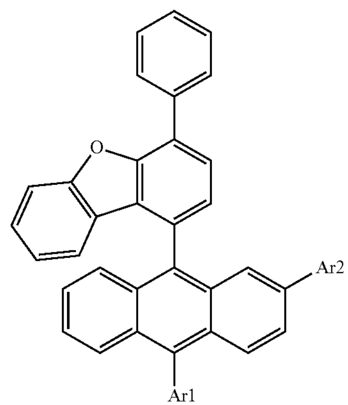 | 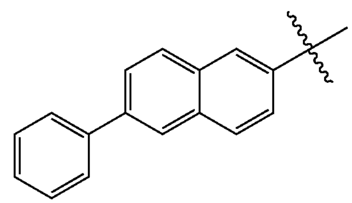 [SMILES: *c1ccc2cc(-c3ccccc3)ccc2c1] | 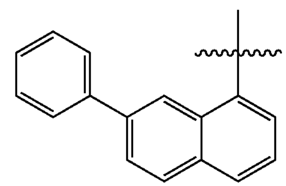 [SMILES: *c1cccc2ccc(-c3ccccc3)cc12] |

-continued
| No. | | Ar1 | Ar2 |
|---|---|---|---|
| 57-23 | 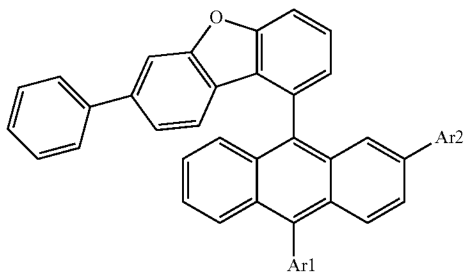 | 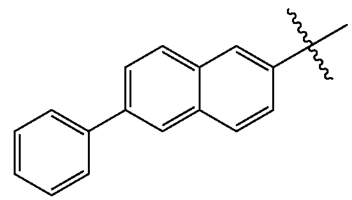 [SMILES: *c1ccc2cc(-c3ccccc3)ccc2c1] | 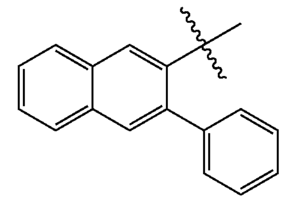 [SMILES: *c1cc2ccccc2cc1-c1ccccc1] |
| 57-24 | 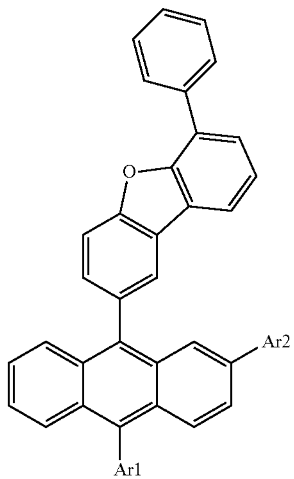 | 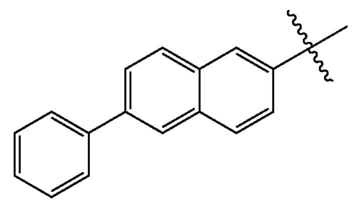 [SMILES: *c1ccc2cc(-c3ccccc3)ccc2c1] | 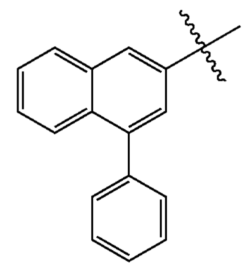 [SMILES: *c1cc(-c2ccccc2)c2ccccc2c1] |

-continued
| No. | | Ar1 | Ar2 |
|---|---|---|---|
| 57-25 | 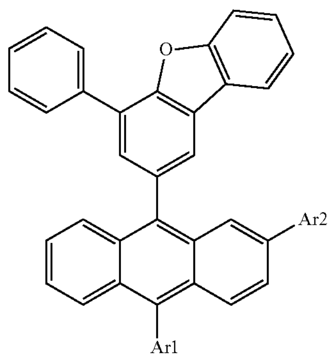 | 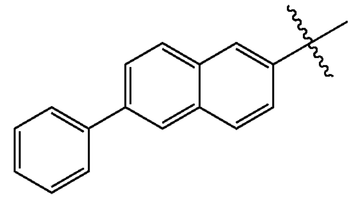 [SMILES: *c1ccc2cc(-c3ccccc3)ccc2c1] | 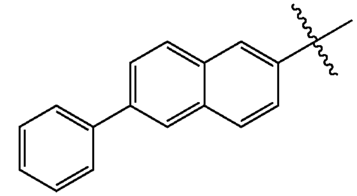 [SMILES: *c1ccc2cc(-c3ccccc3)ccc2c1] |
| 57-26 | 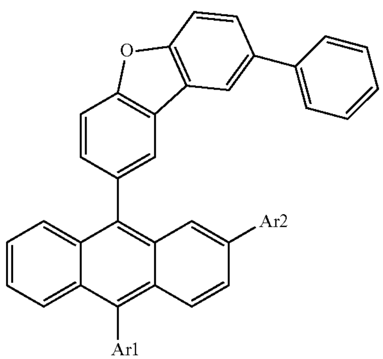 | 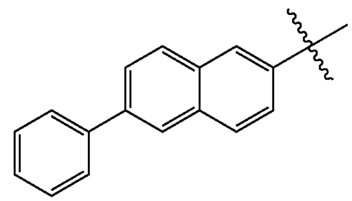 [SMILES: *c1ccc2cc(-c3ccccc3)ccc2c1] | 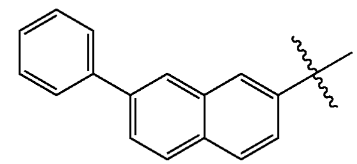 [SMILES: *c1ccc2ccc(-c3ccccc3)cc2c1] |

-continued
| No. | | Ar1 | Ar2 |
|---|---|---|---|
| 57-27 | 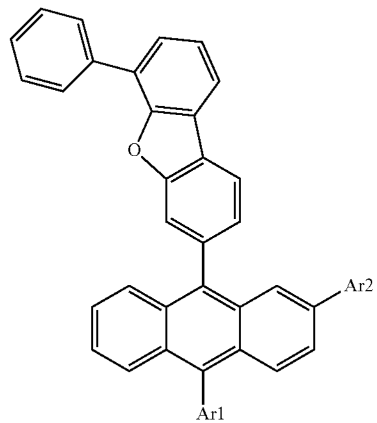 | 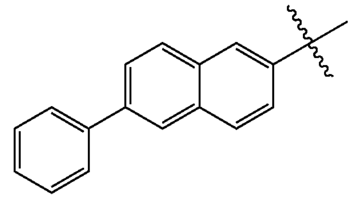 [SMILES: *c1ccc2cc(-c3ccccc3)ccc2c1] | 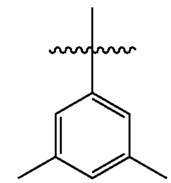 |
| 57-28 | 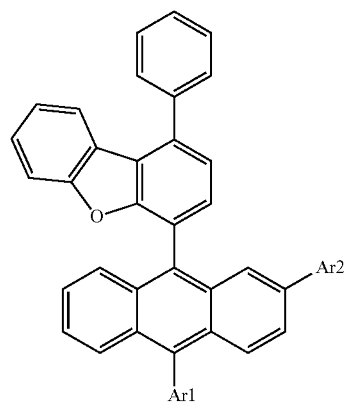 | 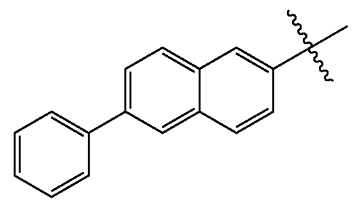 [SMILES: *c1ccc2cc(-c3ccccc3)ccc2c1] | 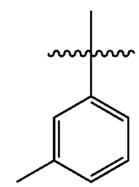 [SMILES: *c1cccc(C)c1] |

-continued
| No. | | Ar1 | Ar2 |
|---|---|---|---|
| 57-29 | 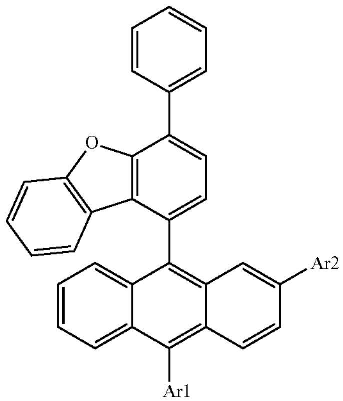 | 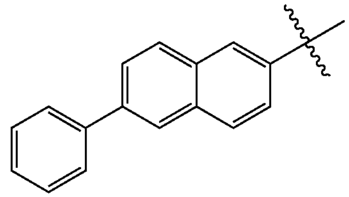 [SMILES: *c1ccc2cc(-c3ccccc3)ccc2c1] | 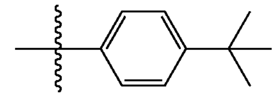 [SMILES: *c1ccc(C(C)(C)C)cc1] |
| 57-30 | 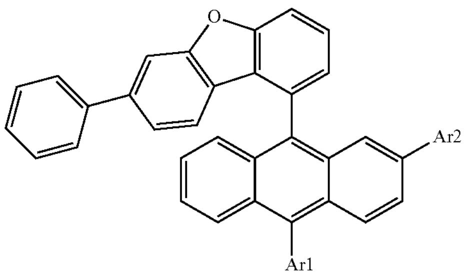 | 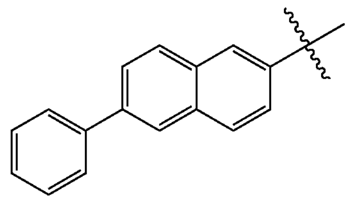 [SMILES: *c1ccc2cc(-c3ccccc3)ccc2c1] | 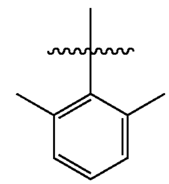 |

-continued
| No. | | Ar1 | Ar2 |
|---|---|---|---|
| 57-31 | 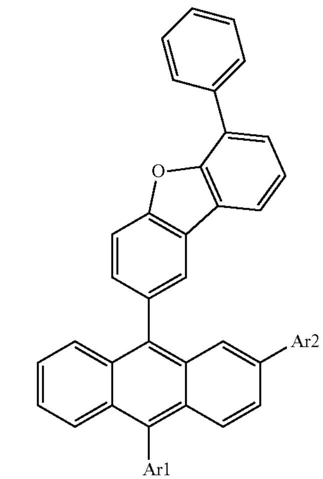 | 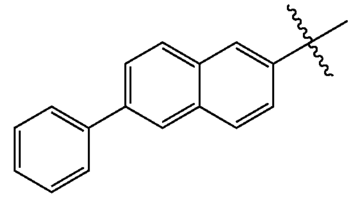 [SMILES: *c1ccc2cc(-c3ccccc3)ccc2c1] | 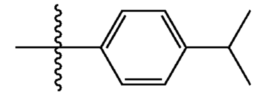 |
| 58-1 | 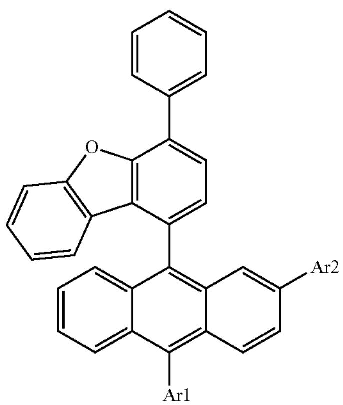 | 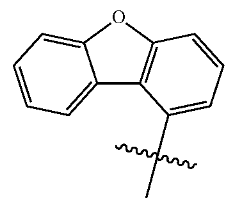 | 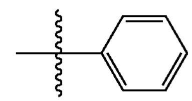 [SMILES: *c1ccccc1] |

-continued
| No. | | Ar1 | Ar2 |
|---|---|---|---|
| 58-2 | 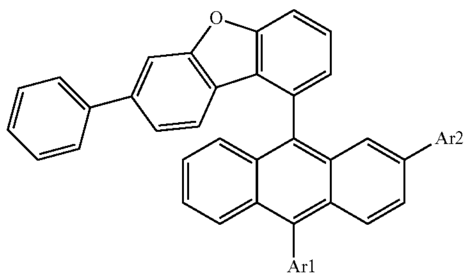 | 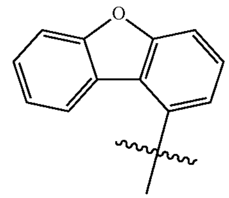 | 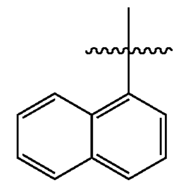 [SMILES: *c1cccc2ccccc12] |
| 58-3 | 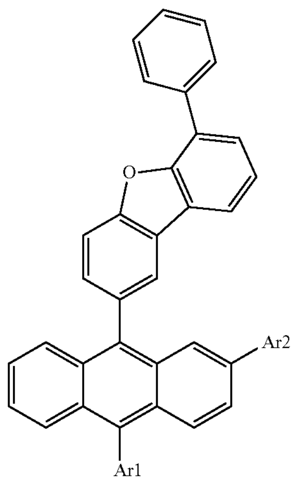 | 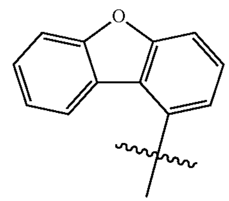 | 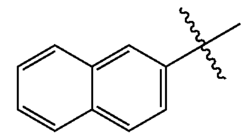 [SMILES: *c1ccc2ccccc2c1] |

-continued
| No. | | Ar1 | Ar2 |
|---|---|---|---|
| 58-4 | 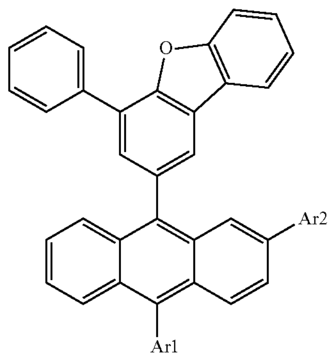 | 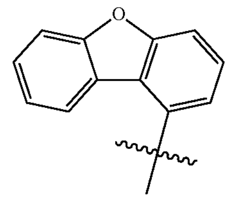 [SMILES: *c1cccc2oc3ccccc3c12] | 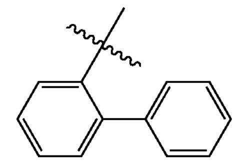 [SMILES: *c1ccccc1-c1ccccc1] |
| 58-5 | 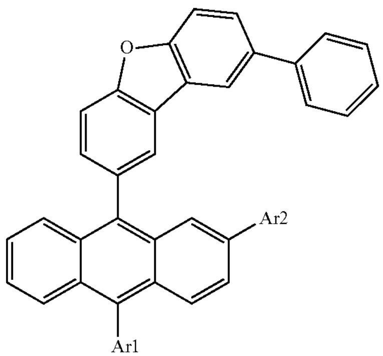 | 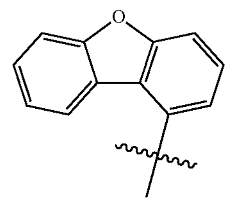 [SMILES: *c1cccc2oc3ccccc3c12] | 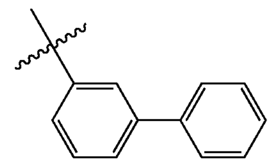 [SMILES: *c1cccc(-c2ccccc2)c1] |

-continued
| No. | | Ar1 | Ar2 |
|---|---|---|---|
| 58-6 | 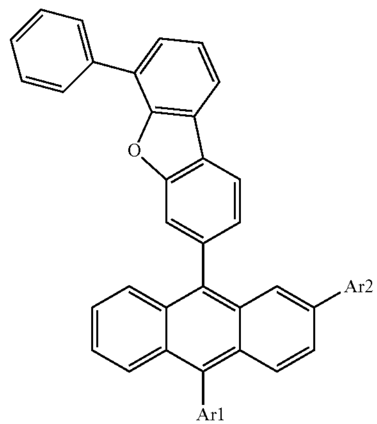 | 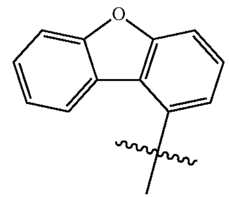 [SMILES: *c1cccc2oc3ccccc3c12] | 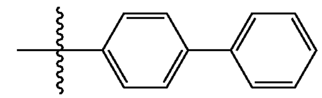 |
| 58-7 | 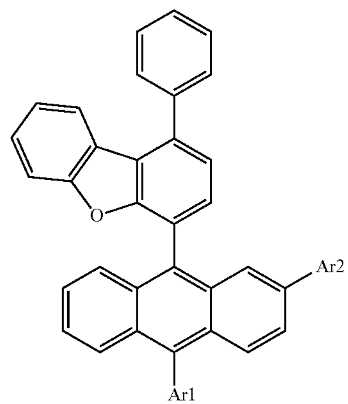 | 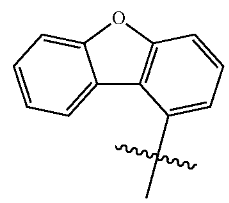 [SMILES: *c1cccc2oc3ccccc3c12] | 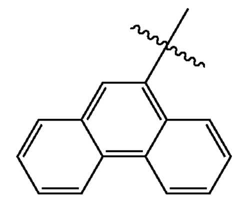 [SMILES: *c1cc2ccccc2c2ccccc12] |

-continued
| No. | | Ar1 | Ar2 |
|---|---|---|---|
| 58-8 | 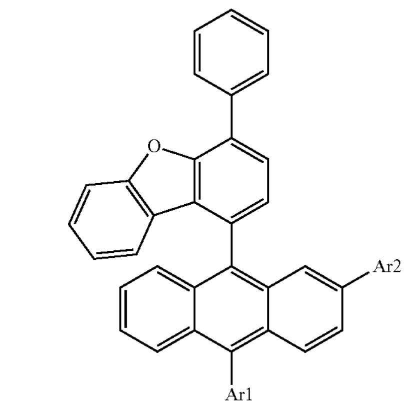 | 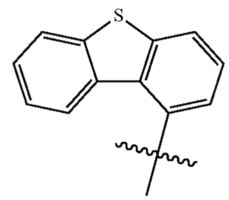 [SMILES: *c1cccc2sc3ccccc3c12] | 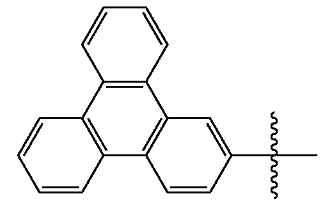 [SMILES: *c1ccc2c3ccccc3c3ccccc3c2c1] |
| 58-9 | 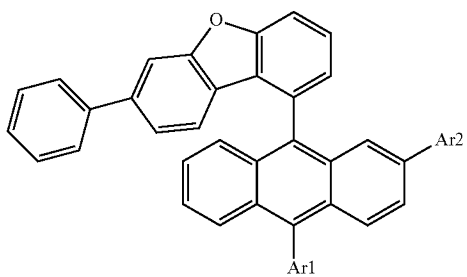 | 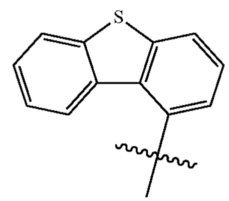 [SMILES: *c1cccc2sc3ccccc3c12] | 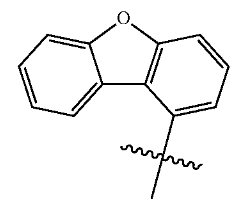 [SMILES: *c1cccc2oc3ccccc3c12] |

-continued
| No. | | Ar1 | Ar2 |
| --- | --- | --- | --- |
| 58-10 | 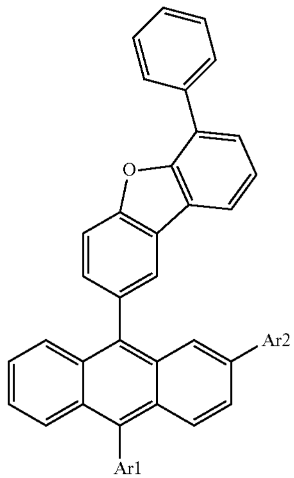 | 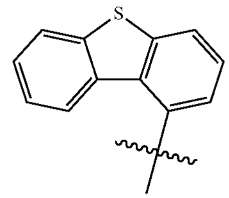 [SMILES: *c1cccc2sc3ccccc3c12] | 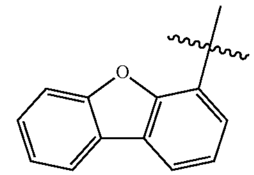 [SMILES: *c1cccc2c1oc1ccccc12] |
| 58-11 | 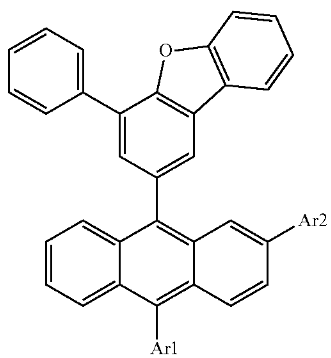 | 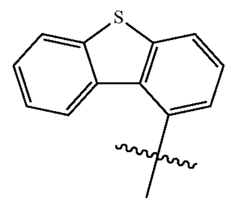 | 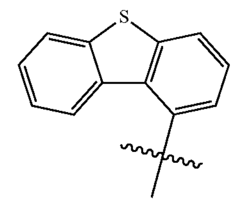 |

-continued
| No. | | Ar1 | Ar2 |
|---|---|---|---|
| 58-12 | 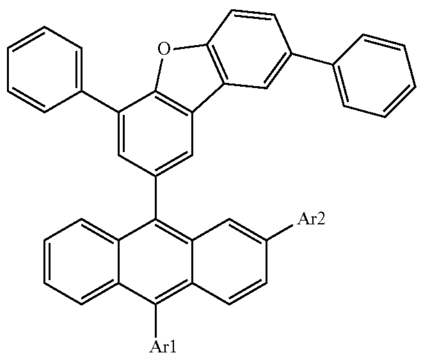 | 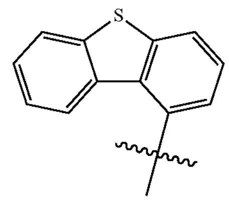 [SMILES: *c1cccc2sc3ccccc3c12] | 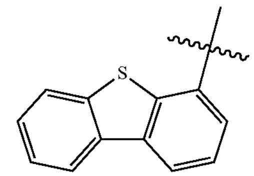 [SMILES: *c1cccc2c1sc1ccccc12] |
| 58-13 | 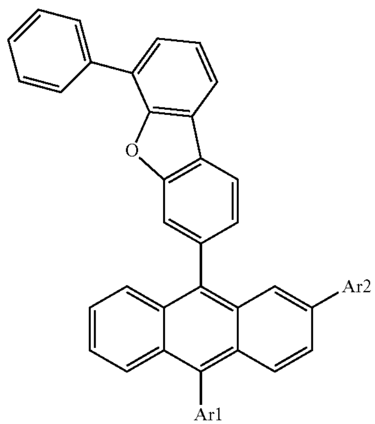 | 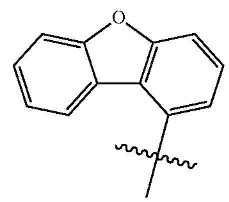 | 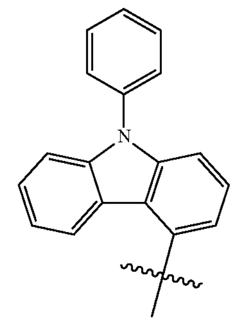 [SMILES: *c1cccc2c1c1ccccc1n2-c1ccccc1] |

-continued
| No. | | Ar1 | Ar2 |
|---|---|---|---|
| 58-14 | 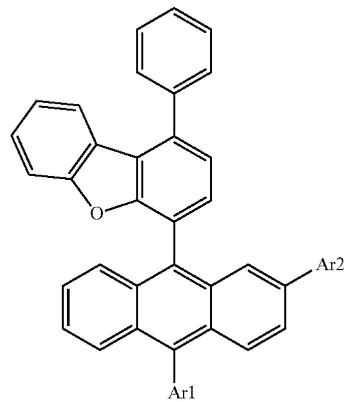 | 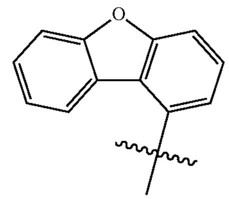 | 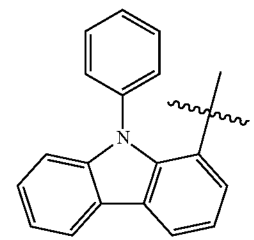 [SMILES: *c1cccc2c3ccccc3n(-c3ccccc3)c12] |
| 58-15 | 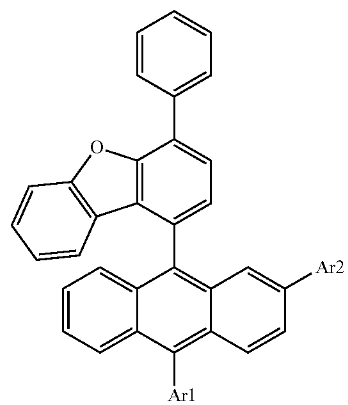 | 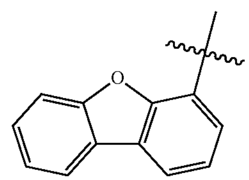 | 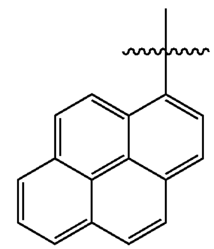 [SMILES: *c1ccc2ccc3cccc4ccc1c2c34] |

-continued
| No. | | Ar1 | Ar2 |
|---|---|---|---|
| 58-16 | 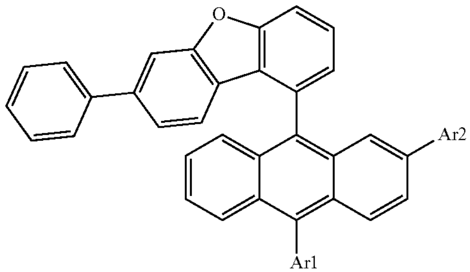 | 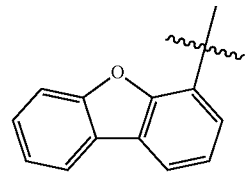 | 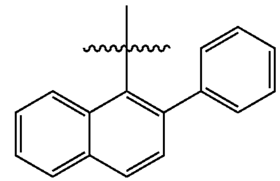 [SMILES: *c1c(-c2ccccc2)ccc2ccccc12] |
| 58-17 | 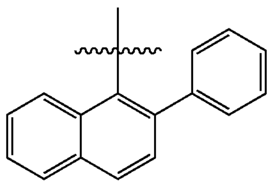 [SMILES: *c1c(-c2ccccc2)ccc2ccccc12] | 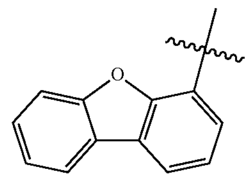 | 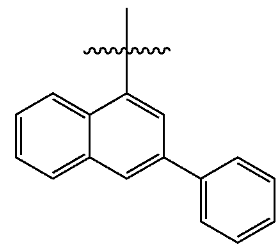 [SMILES: *c1cc(-c2ccccc2)cc2ccccc12] |
| 58-18 | 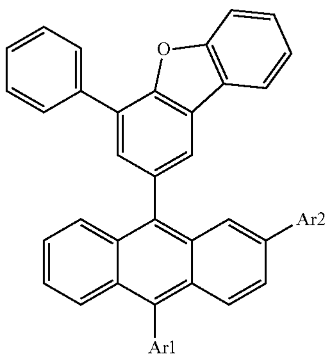 | 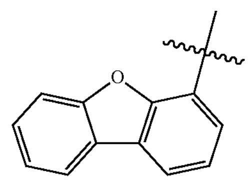 | 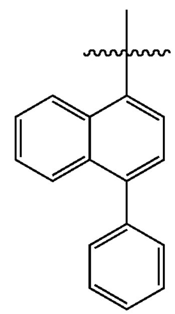 [SMILES: *c1ccc(-c2ccccc2)c2ccccc12] |

-continued
| No. | | Ar1 | Ar2 |
|---|---|---|---|
| 58-19 | 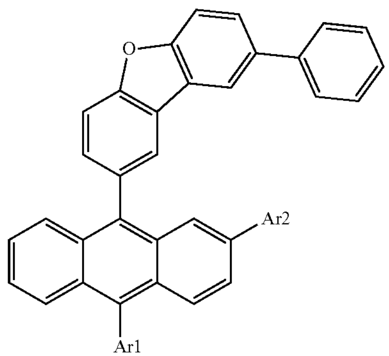 | 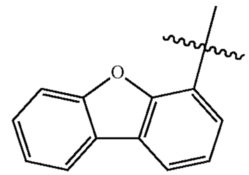 | 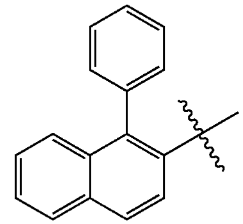 [SMILES: *c1ccc2ccccc2c1-c1ccccc1] |
| 58-20 | 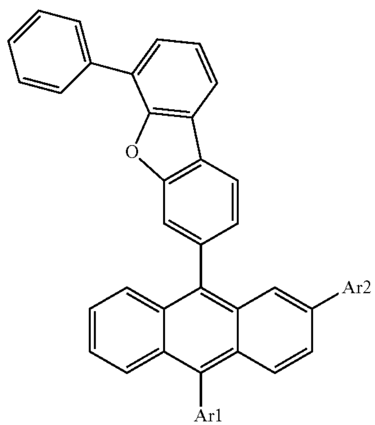 | 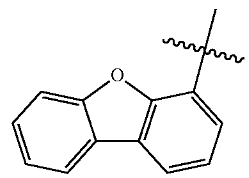 | 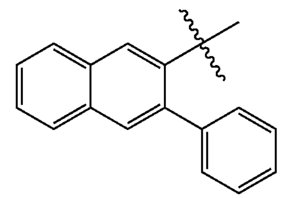 [SMILES: *c1cc2ccccc2cc1-c1ccccc1] |

-continued
| No. | | Ar1 | Ar2 |
|---|---|---|---|
| 58-21 | 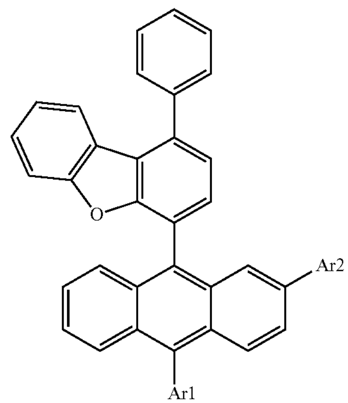  | 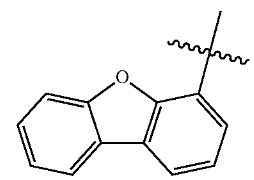  | 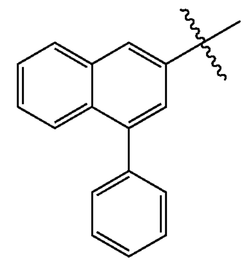 [SMILES: *c1cc(-c2ccccc2)c2ccccc2c1] |
| 58-22 | 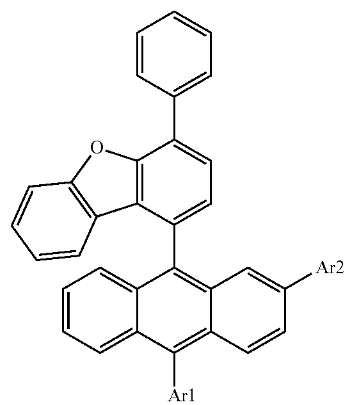  | 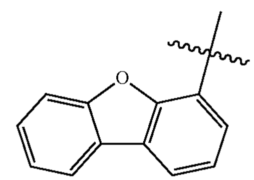  | 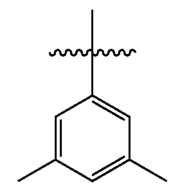 |

-continued
| No. | | Ar1 | Ar2 |
|---|---|---|---|
| 58-23 | 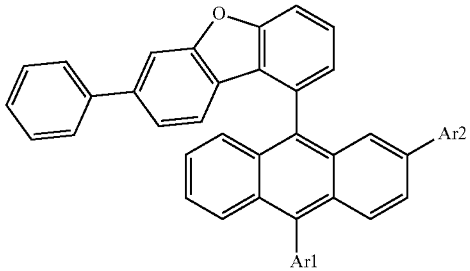 | 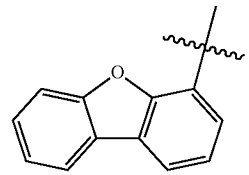 | 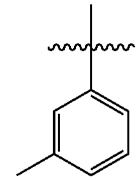 [SMILES: *c1cccc(C)c1] |
| 58-24 | 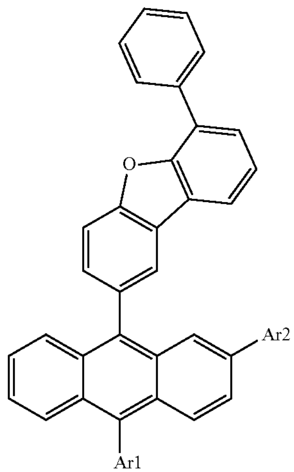 | 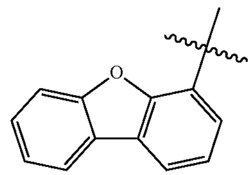 | 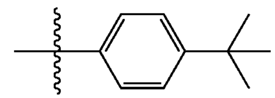 [SMILES: *c1ccc(C(C)(C)C)cc1] |

-continued
| No. | | Ar1 | Ar2 |
|---|---|---|---|
| 58-25 | 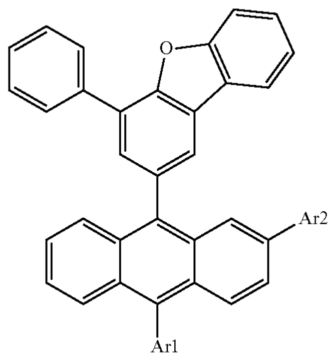 | 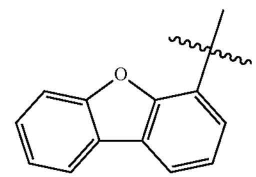 [SMILES: *c1cccc2c1oc1ccccc12] | 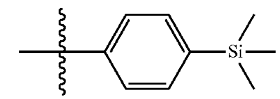 [SMILES: *c1ccc([Si](C)(C)C)cc1] |
| 58-26 | 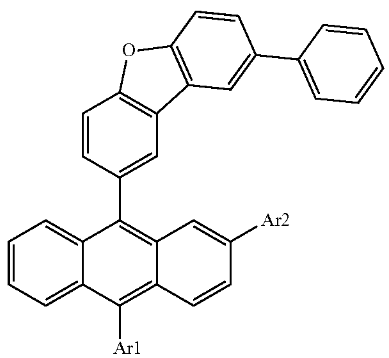 | 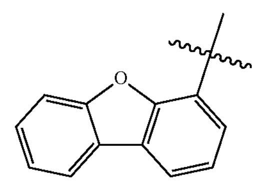 [SMILES: *c1cccc2c1oc1ccccc12] | 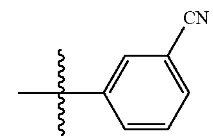 |

-continued
| No. | | Ar1 | Ar2 |
|---|---|---|---|
| 58-27 | 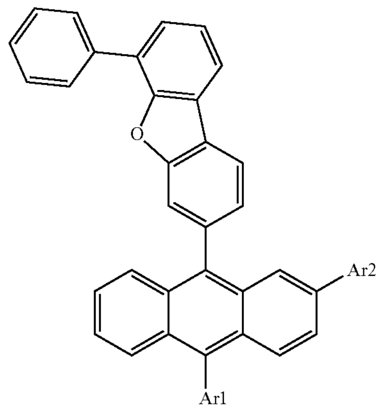 | 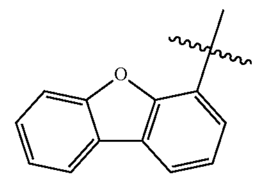 [SMILES: *c1cccc2c1oc1ccccc12] | 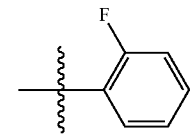 [SMILES: *c1ccccc1F] |
| 58-28 | 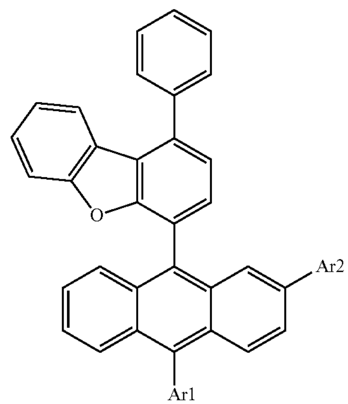 | 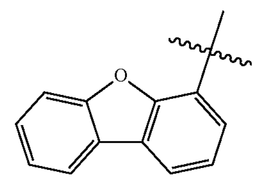 [SMILES: *c1cccc2c1oc1ccccc12] | 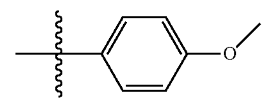 |

-continued
| No. | | Ar1 | Ar2 |
| --- | --- | --- | --- |
| 59-1 | 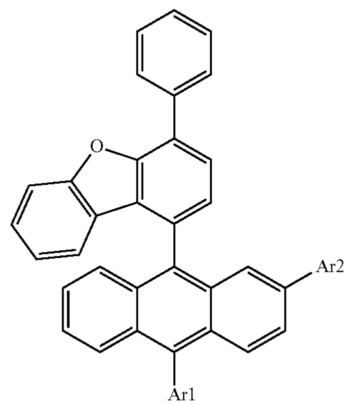 | 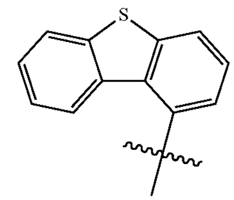 | 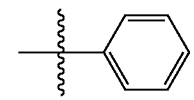 |
| 59-2 | 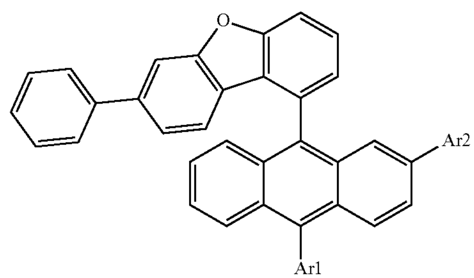 | 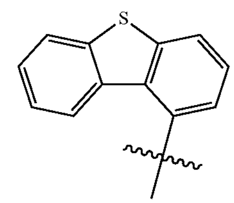 | 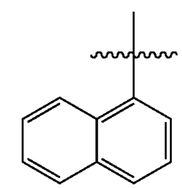 [SMILES: *c1cccc2ccccc12] |

-continued
| No. | | Ar1 | Ar2 |
|---|---|---|---|
| 59-3 | 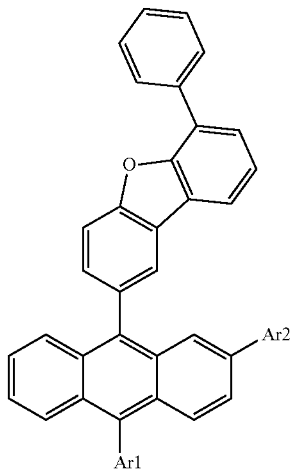 | 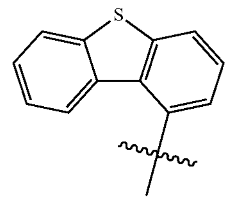 | 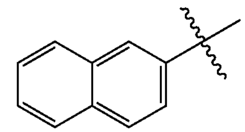 [SMILES: *c1ccc2ccccc2c1] |
| 59-4 | 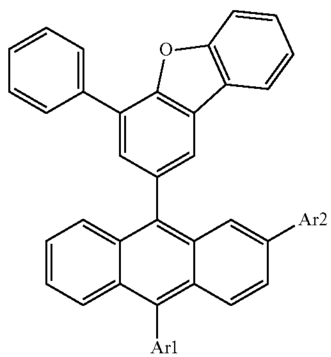 | 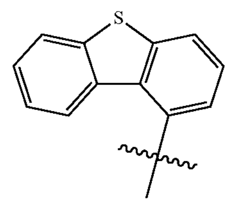 | 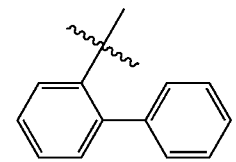 [SMILES: *c1ccccc1-c1ccccc1] |

-continued
| No. | | Ar1 | Ar2 |
|---|---|---|---|
| 59-5 | 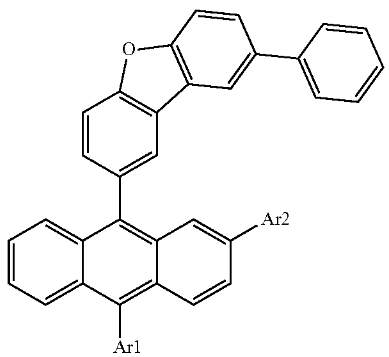 | 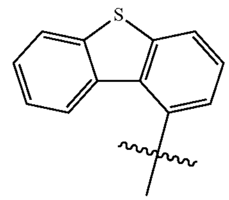 | 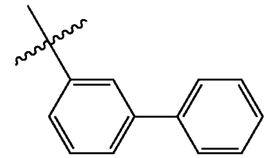 [SMILES: *c1cccc(-c2ccccc2)c1] |
| 59-6 | 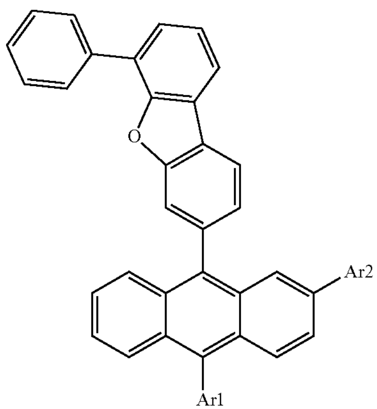 | 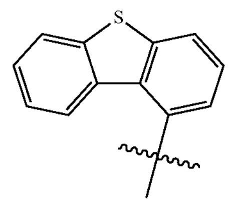 [SMILES: *c1cccc2sc3ccccc3c12] | 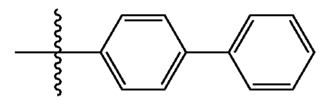 |

-continued
| No. | | Ar1 | Ar2 |
|---|---|---|---|
| 59-7 | 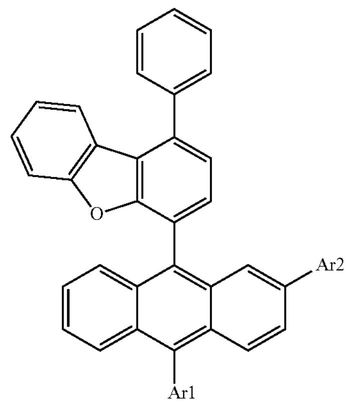 | 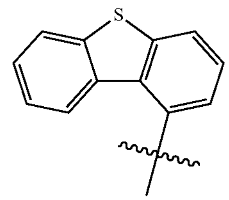 | 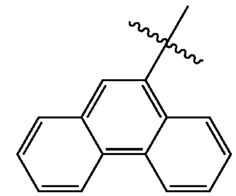 [SMILES: *c1cc2ccccc2c2ccccc12] |
| 59-8 | 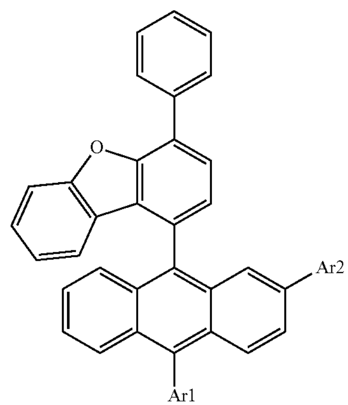 | 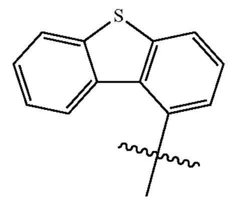 [SMILES: *c1cccc2sc3ccccc3c12] | 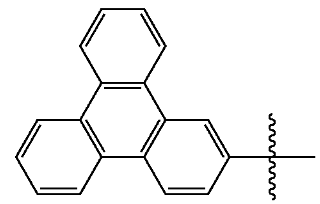 [SMILES: *c1ccc2c3ccccc3c3ccccc3c2c1] |

-continued
| No. | | Ar1 | Ar2 |
|---|---|---|---|
| 59-9 | 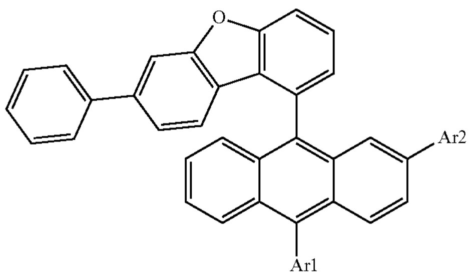 | 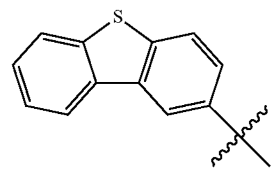 | 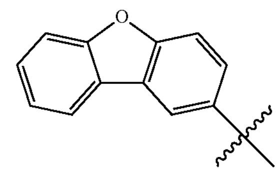 [SMILES: *c1ccc2oc3ccccc3c2c1] |
| 59-10 | 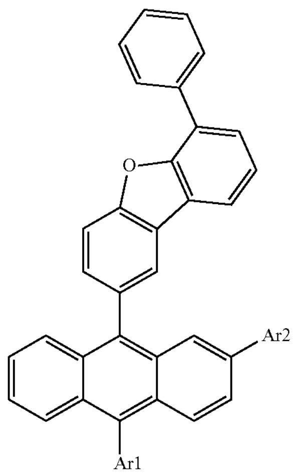 | 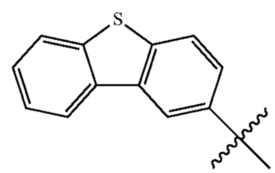 | 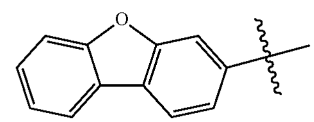 |

-continued
| No. | | Ar1 | Ar2 |
|---|---|---|---|
| 59-11 | 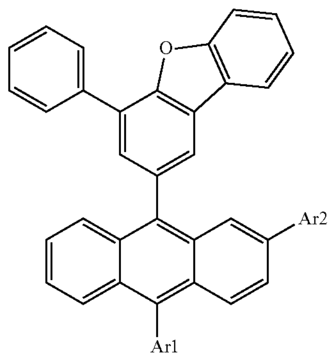 | 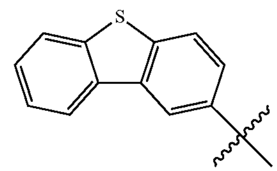 | 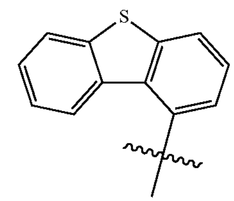 [SMILES: *c1cccc2sc3ccccc3c12] |
| 59-12 | 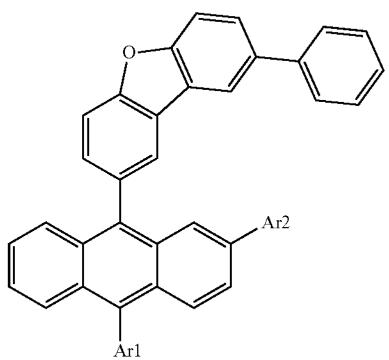 | 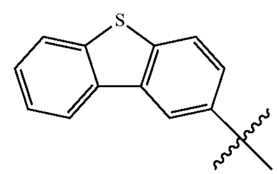 | 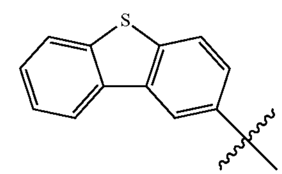 [SMILES: *c1ccc2sc3ccccc3c2c1] |

-continued
| No. | | Ar1 | Ar2 |
|---|---|---|---|
| 59-13 | 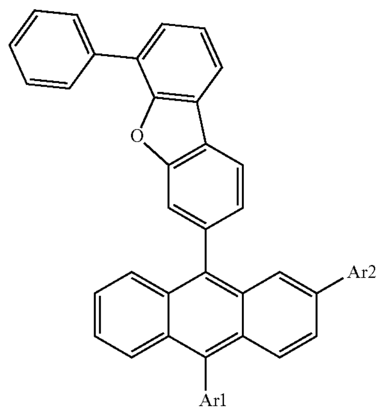 | 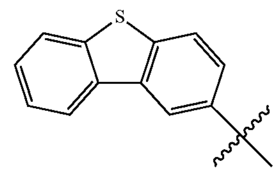 | 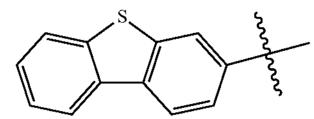 [SMILES: *c1ccc2c(c1)sc1ccccc12] |
| 59-14 | 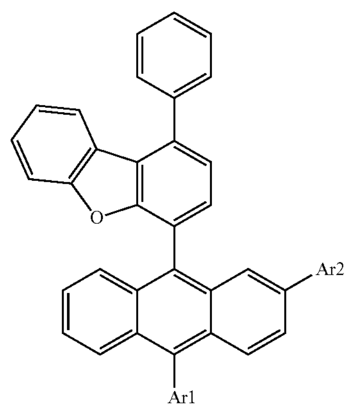 | 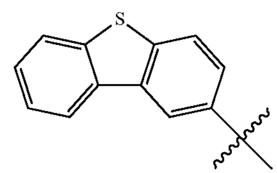 | 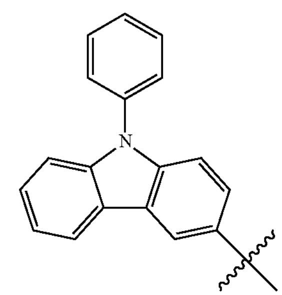 [SMILES: *c1ccc2c(c1)c1ccccc1n2-c1ccccc1] |

-continued
| No. | | Ar1 | Ar2 |
|---|---|---|---|
| 59-15 | 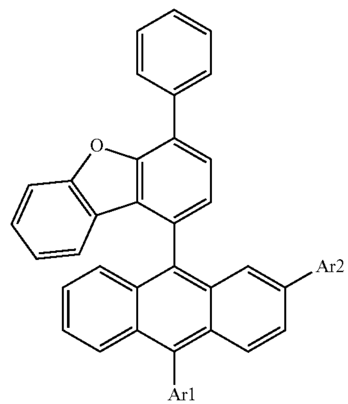 | 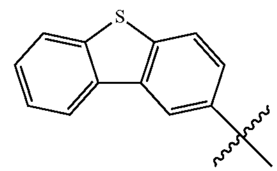 | 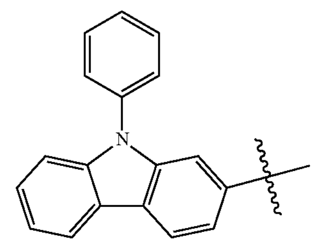 [SMILES: *c1ccc2c3ccccc3n(-c3ccccc3)c2c1] |
| 59-16 | 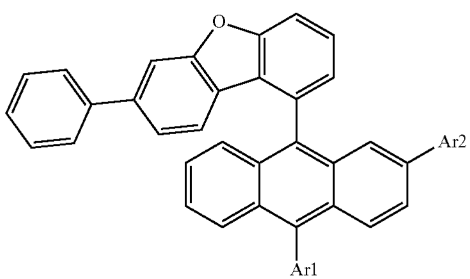 | 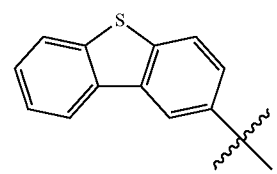 | 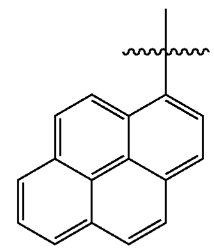 [SMILES: *c1ccc2ccc3cccc4ccc1c2c34] |

-continued
| No. | | Ar1 | Ar2 |
|---|---|---|---|
| 59-17 | 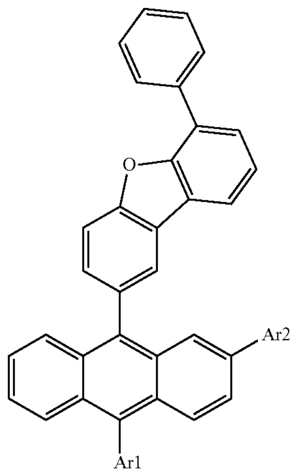 | 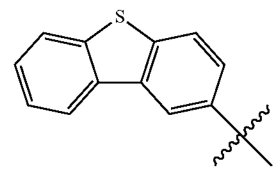 | 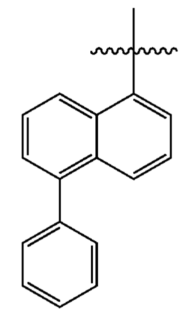 [SMILES: *c1cccc2c(-c3ccccc3)cccc12] |
| 59-18 | 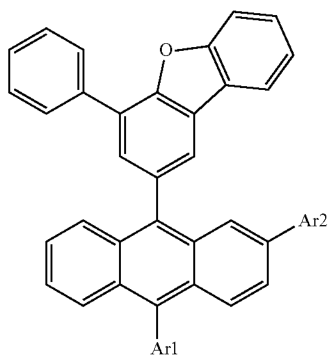 | 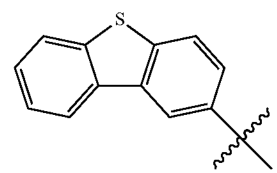 | 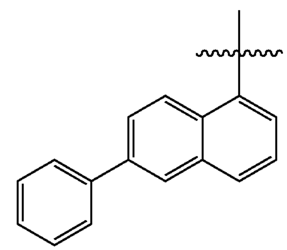 [SMILES: *c1cccc2cc(-c3ccccc3)ccc12] |

-continued
| No. | | Ar1 | Ar2 |
|---|---|---|---|
| 59-19 | 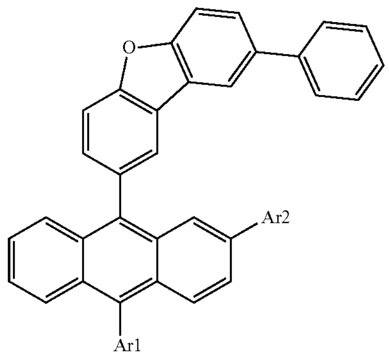 | 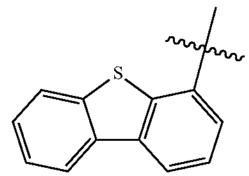 | 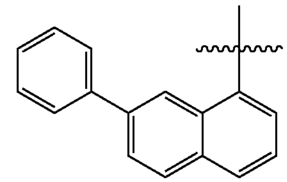 [SMILES: *c1cccc2ccc(-c3ccccc3)cc12] |
| 59-20 | 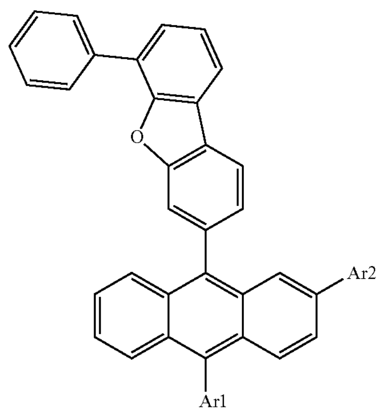 | 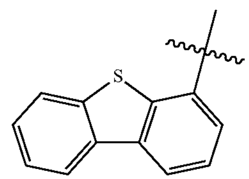 | 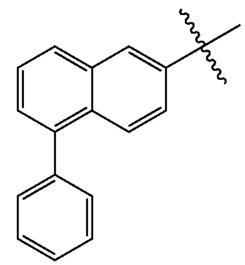 [SMILES: *c1ccc2c(-c3ccccc3)cccc2c1] |

-continued
| No. | | Ar1 | Ar2 |
| --- | --- | --- | --- |
| 59-21 | 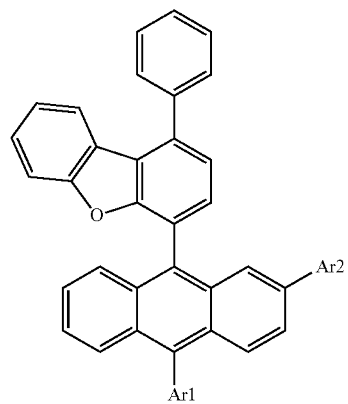 | 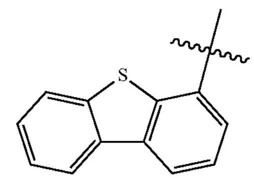 | 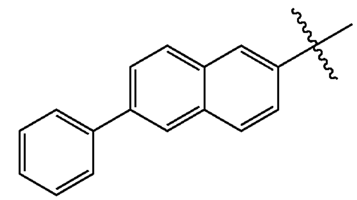 [SMILES: *c1ccc2cc(-c3ccccc3)ccc2c1] |
| 59-22 | 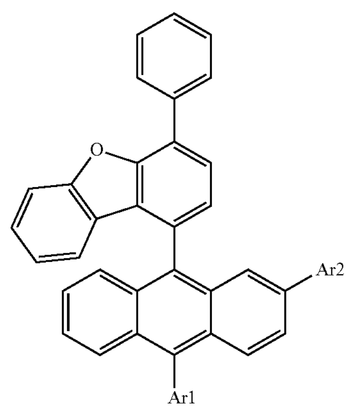 | 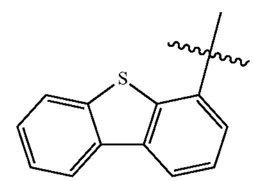 | 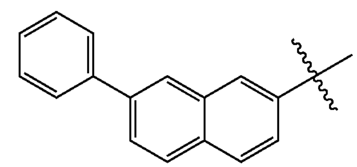 [SMILES: *c1ccc2ccc(-c3ccccc3)cc2c1] |

-continued
| No. | | Ar1 | Ar2 |
|---|---|---|---|
| 59-23 | 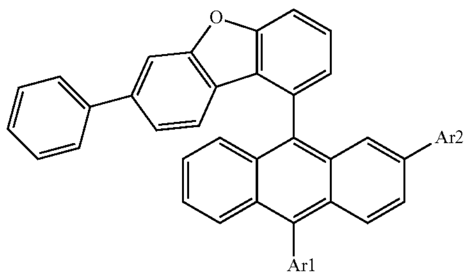 | 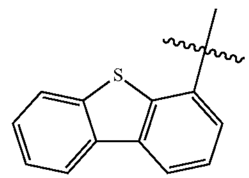 | 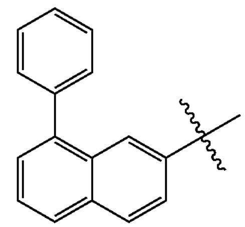 [SMILES: *c1ccc2cccc(-c3ccccc3)c2c1] |
| 59-24 | 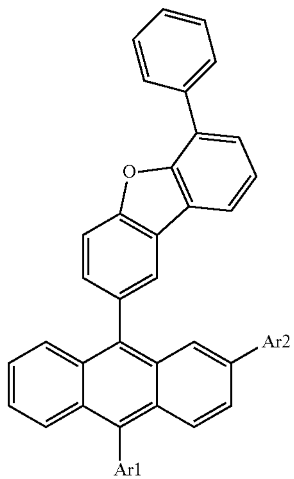 | 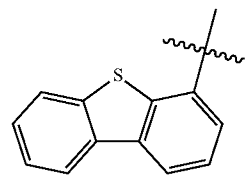 [SMILES: *c1cccc2c1sc1ccccc12] | 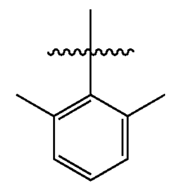 |

-continued
| No. | | Ar1 | Ar2 |
|---|---|---|---|
| 59-25 | 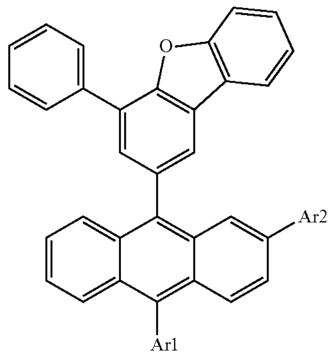 | 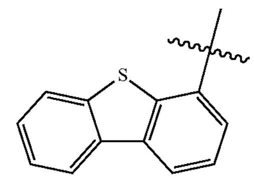 | 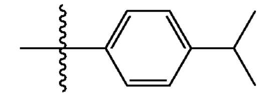 [SMILES: *c1ccc(C(C)C)cc1] |
| 59-26 | 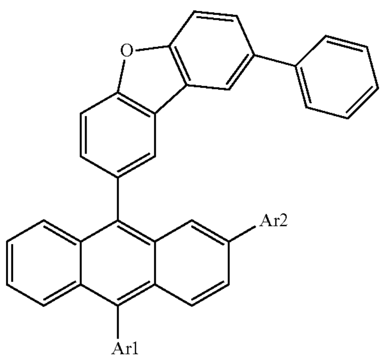 | 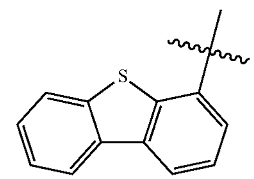 | 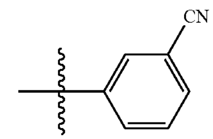 [SMILES: *c1cccc(C#N)c1] |

-continued
| No. | | Ar1 | Ar2 |
|---|---|---|---|
| 59-27 | 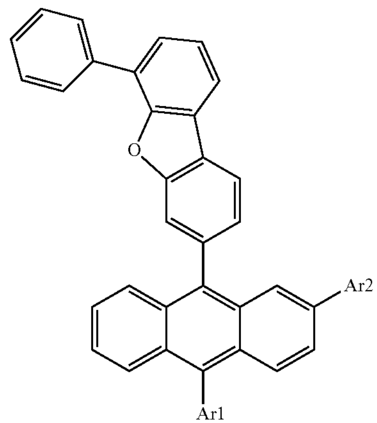 | 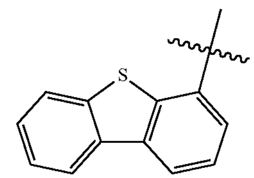 [SMILES: *c1cccc2c1sc1ccccc12] | 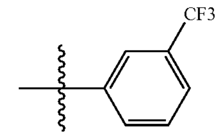 [SMILES: *c1cccc(C(F)(F)F)c1] |
| 59-28 | 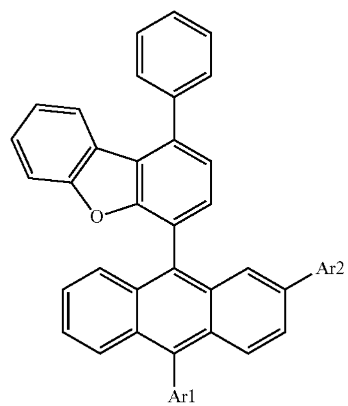 | 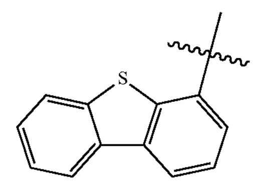 [SMILES: *c1cccc2c1sc1ccccc12] | 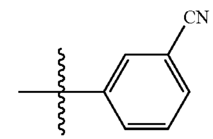 [SMILES: *c1cccc(C#N)c1] |

-continued
| No. | | Ar1 | Ar2 |
|---|---|---|---|
| 59-29 | 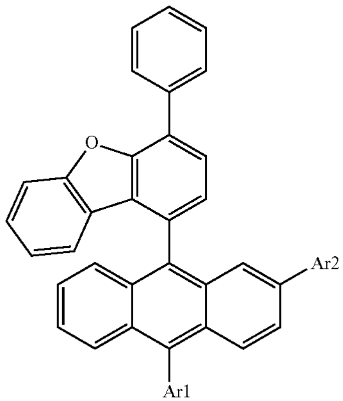 | 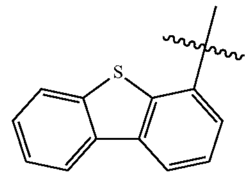 [SMILES: *c1cccc2c1sc1ccccc12] | 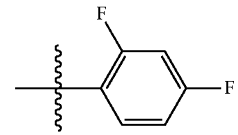 |
| 60-1 | 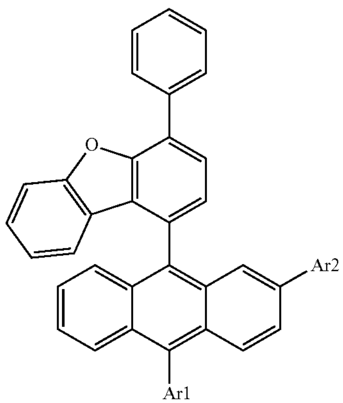 | 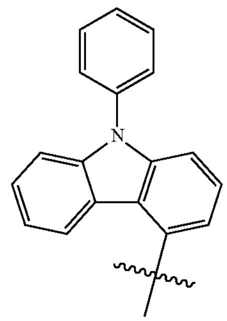 [SMILES: *c1cccc2c1c1ccccc1n2-c1ccccc1] | 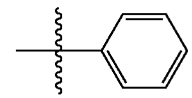 [SMILES: *c1ccccc1] |

-continued
| No. | | Ar1 | Ar2 |
| --- | --- | --- | --- |
| 60-2 | 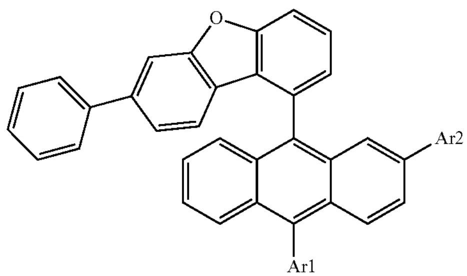 | 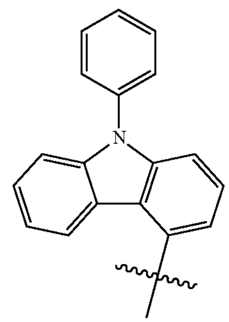 [SMILES: *c1cccc2c1c1ccccc1n2-c1ccccc1] | 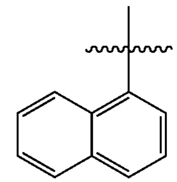 [SMILES: *c1cccc2ccccc12] |
| 60-3 | 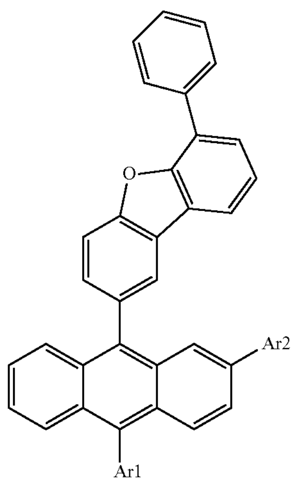 | 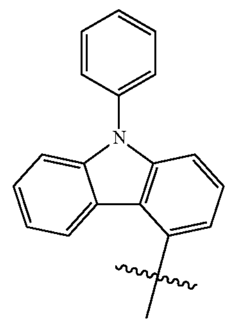 [SMILES: *c1cccc2c1c1ccccc1n2-c1ccccc1] | 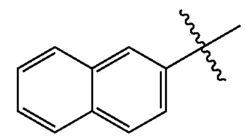 [SMILES: *c1ccc2ccccc2c1] |

-continued
| No. | | Ar1 | Ar2 |
|---|---|---|---|
| 60-4 | 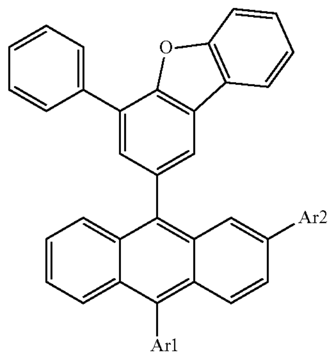 | 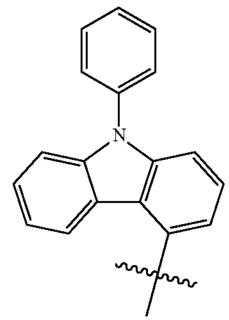 [SMILES: *c1cccc2c1c1ccccc1n2-c1ccccc1] | 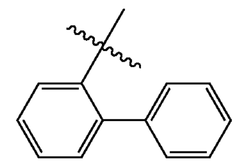 [SMILES: *c1ccccc1-c1ccccc1] |
| 60-5 | 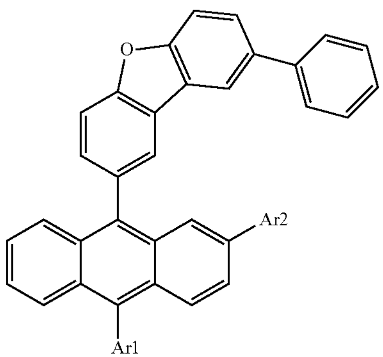 | 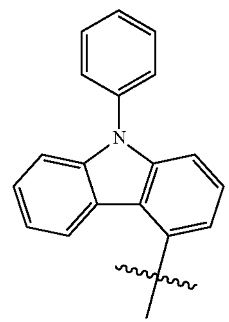 [SMILES: *c1cccc2c1c1ccccc1n2-c1ccccc1] | 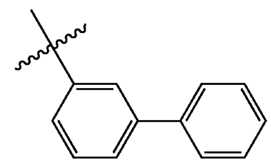 [SMILES: *c1cccc(-c2ccccc2)c1] |

-continued
| No. | | Ar1 | Ar2 |
|---|---|---|---|
| 60-6 | 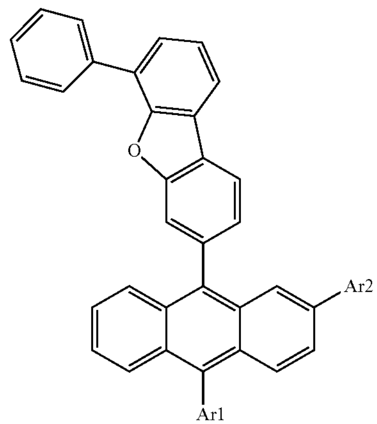 | 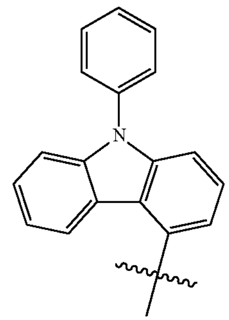 [SMILES: *c1cccc2c1c1ccccc1n2-c1ccccc1] | 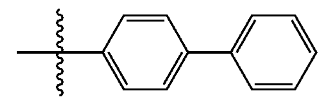 |
| 60-7 | 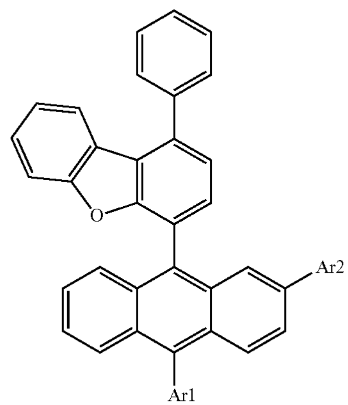 | 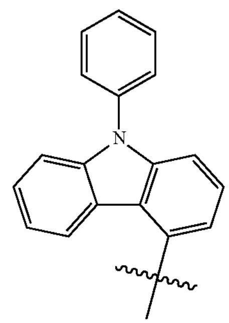 [SMILES: *c1cccc2c1c1ccccc1n2-c1ccccc1] | 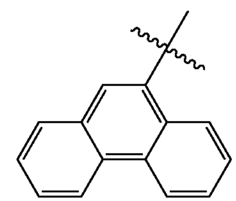 [SMILES: *c1cc2ccccc2c2ccccc12] |

-continued
| No. | | Ar1 | Ar2 |
| --- | --- | --- | --- |
| 60-8 | 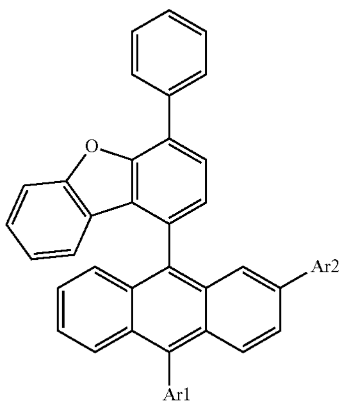 | 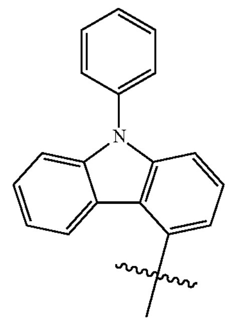 [SMILES: *c1cccc2c1c1ccccc1n2-c1ccccc1] | 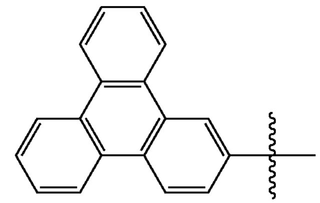 [SMILES: *c1ccc2c3ccccc3c3ccccc3c2c1] |
| 60-9 | 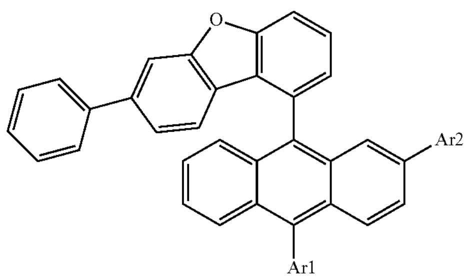 | 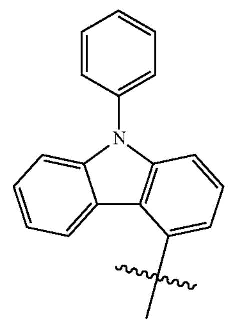 [SMILES: *c1cccc2c1c1ccccc1n2-c1ccccc1] | 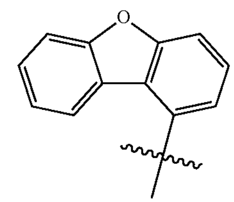 |

-continued
| No. | | Ar1 | Ar2 |
|---|---|---|---|
| 60-10 | 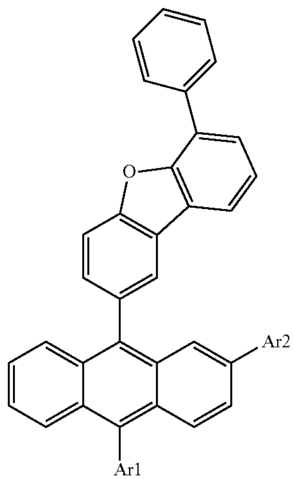 | 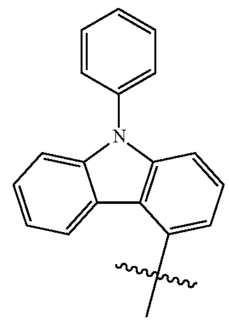 [SMILES: *c1cccc2c1c1ccccc1n2-c1ccccc1] | 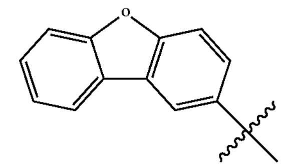 |
| 60-11 | 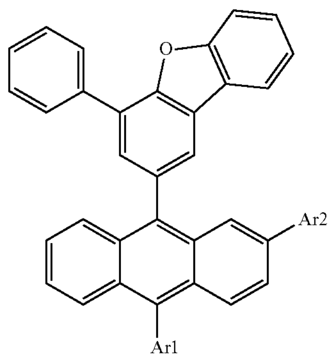 | 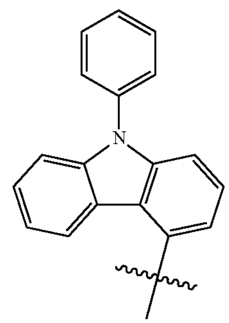 [SMILES: *c1cccc2c1c1ccccc1n2-c1ccccc1] | 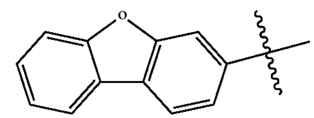 |

-continued
| No. | | Ar1 | Ar2 |
|---|---|---|---|
| 60-12 | 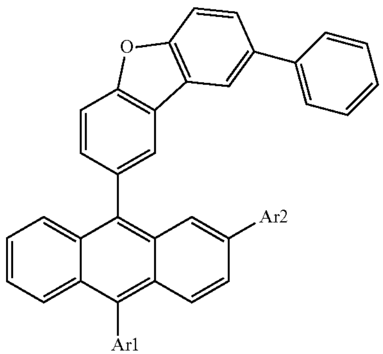  | 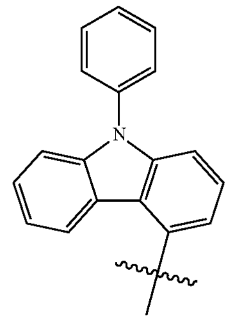 [SMILES: *c1cccc2c1c1ccccc1n2-c1ccccc1]  | 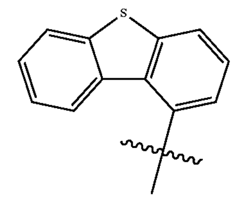  |
| 60-13 | 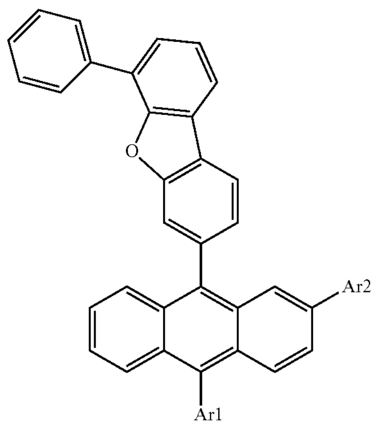  | 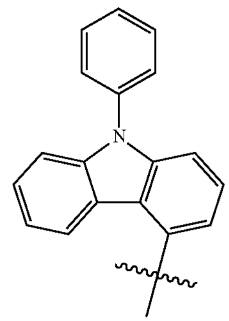 [SMILES: *c1cccc2c1c1ccccc1n2-c1ccccc1]  | 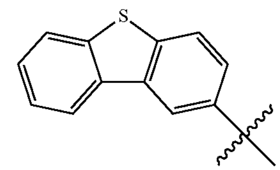  |

-continued
| No. | | Ar1 | Ar2 |
|---|---|---|---|
| 60-14 | 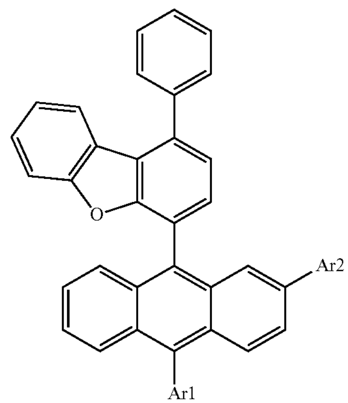 | 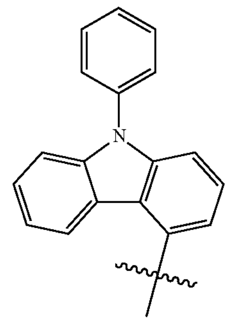 [SMILES: *c1cccc2c1c1ccccc1n2-c1ccccc1] | 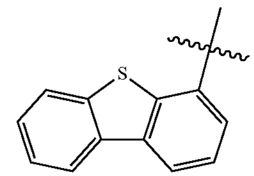 |
| 60-15 | 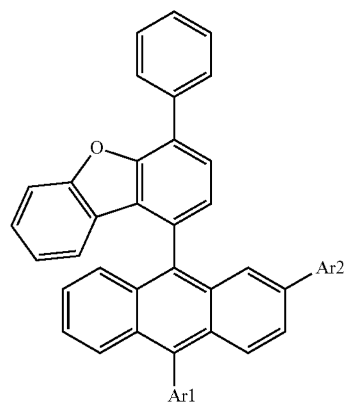 | 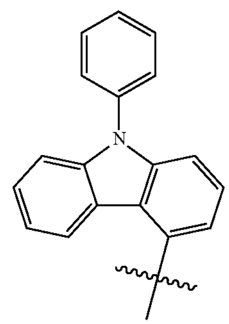 [SMILES: *c1cccc2c1c1ccccc1n2-c1ccccc1] | 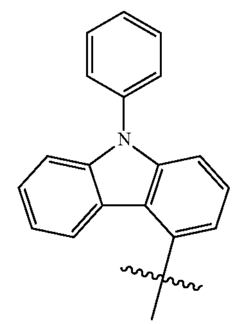 [SMILES: *c1cccc2c1c1ccccc1n2-c1ccccc1] |

-continued
| No. | | Ar1 | Ar2 |
|---|---|---|---|
| 60-16 | 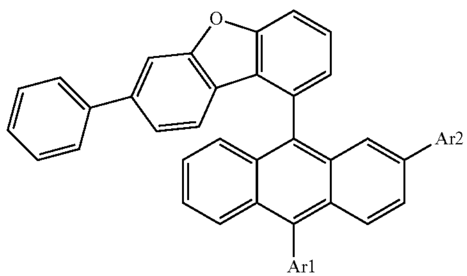 | 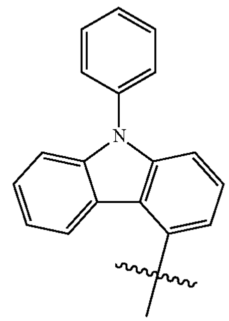 [SMILES: *c1cccc2c1c1ccccc1n2-c1ccccc1] | 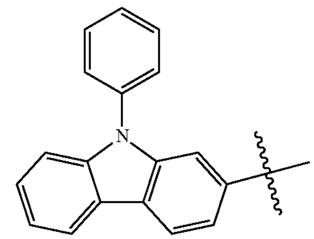 [SMILES: *c1ccc2c3ccccc3n(-c3ccccc3)c2c1] |
| 60-17 | 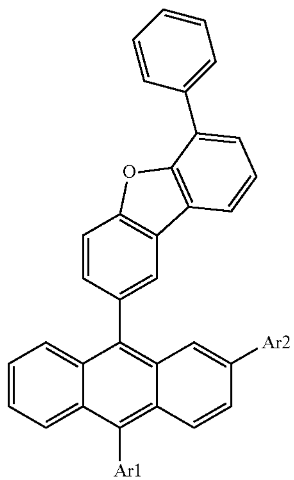 | 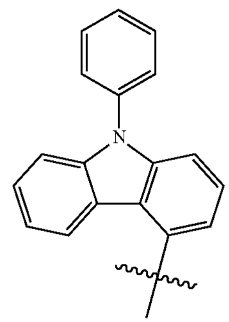 [SMILES: *c1cccc2c1c1ccccc1n2-c1ccccc1] | 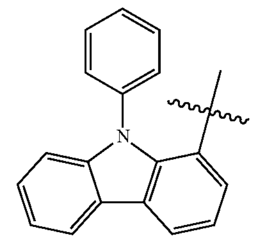 [SMILES: *c1cccc2c3ccccc3n(-c3ccccc3)c12] |

-continued
| No. | | Ar1 | Ar2 |
|---|---|---|---|
| 60-18 | 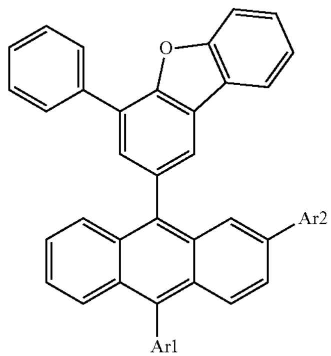 | 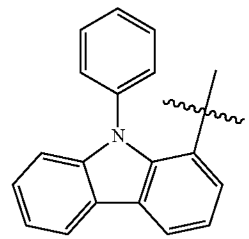 [SMILES: *c1cccc2c3ccccc3n(-c3ccccc3)c12] | 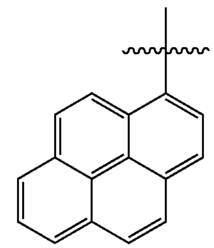 [SMILES: *c1ccc2ccc3cccc4ccc1c2c34] |
| 60-19 | 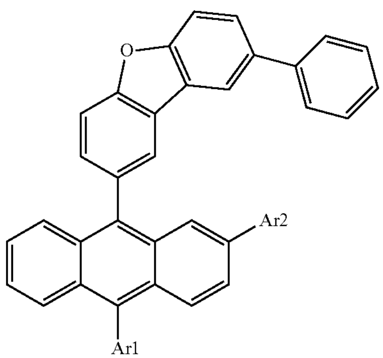 | 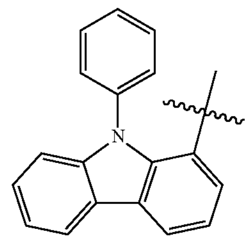 [SMILES: *c1cccc2c3ccccc3n(-c3ccccc3)c12] | 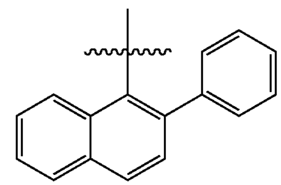 [SMILES: *c1c(-c2ccccc2)ccc2ccccc12] |

-continued
| No. | | Ar1 | Ar2 |
|---|---|---|---|
| 60-20 | 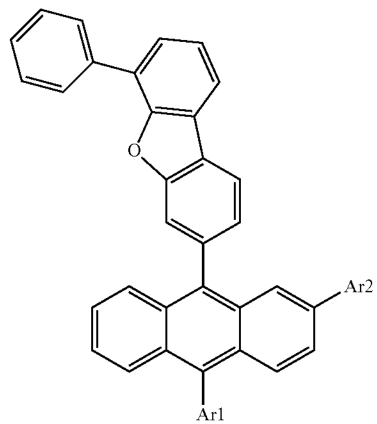 | 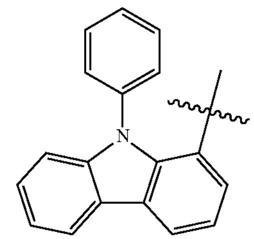 [SMILES: *c1cccc2c3ccccc3n(-c3ccccc3)c12] | 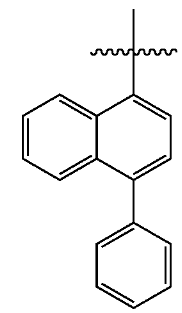 [SMILES: *c1ccc(-c2ccccc2)c2ccccc12] |
| 60-21 | 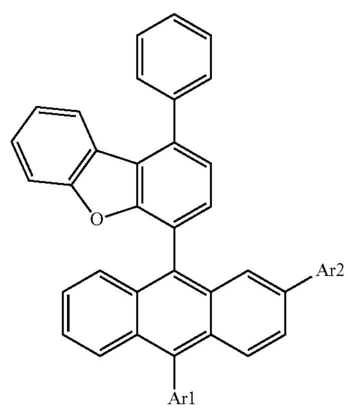 | 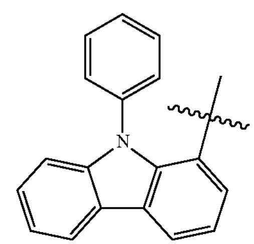 [SMILES: *c1cccc2c3ccccc3n(-c3ccccc3)c12] | 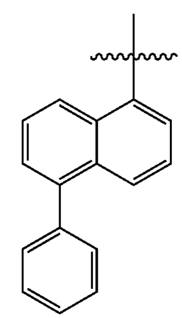 [SMILES: *c1cccc2c(-c3ccccc3)cccc12] |

-continued
| No. | | Ar1 | Ar2 |
|---|---|---|---|
| 60-22 | 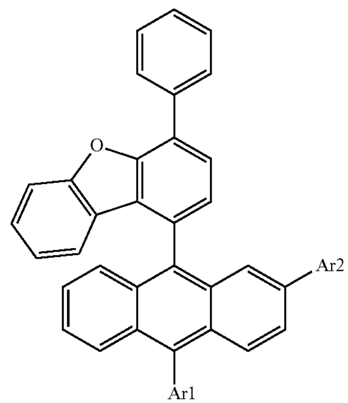 | 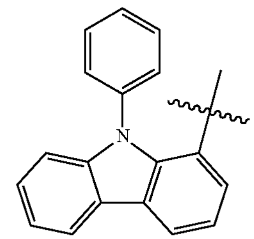 [SMILES: *c1cccc2c3ccccc3n(-c3ccccc3)c12] | 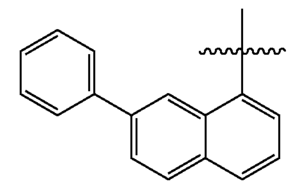 [SMILES: *c1cccc2ccc(-c3ccccc3)cc12] |
| 60-23 | 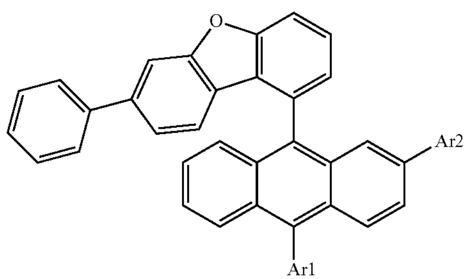 | 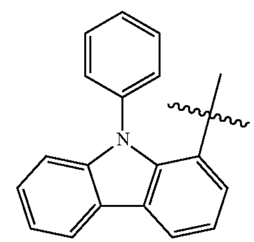 [SMILES: *c1cccc2c3ccccc3n(-c3ccccc3)c12] | 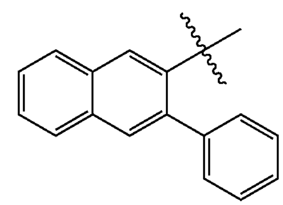 [SMILES: *c1cc2ccccc2cc1-c1ccccc1] |

-continued
| No. | | Ar1 | Ar2 |
|---|---|---|---|
| 60-24 | 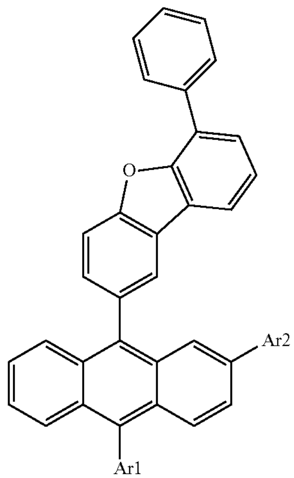 | 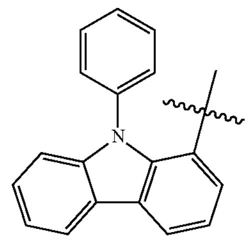 [SMILES: *c1cccc2c3ccccc3n(-c3ccccc3)c12] | 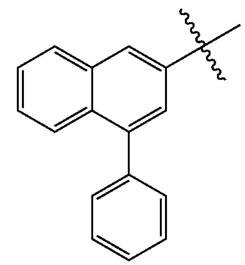 [SMILES: *c1cc(-c2ccccc2)c2ccccc2c1] |
| 60-25 | 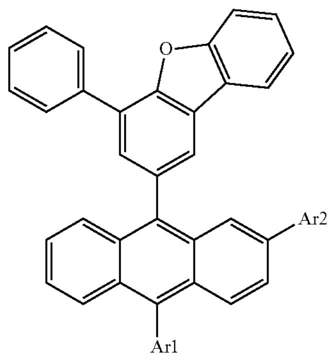 | 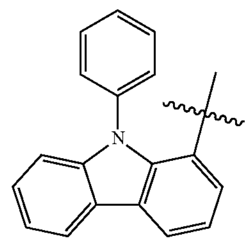 [SMILES: *c1cccc2c3ccccc3n(-c3ccccc3)c12] | 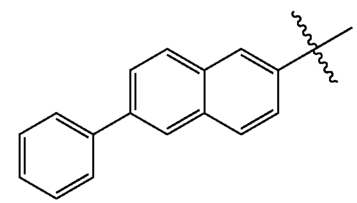 [SMILES: *c1ccc2cc(-c3ccccc3)ccc2c1] |

-continued
| No. | | Ar1 | Ar2 |
|---|---|---|---|
| 60-26 | 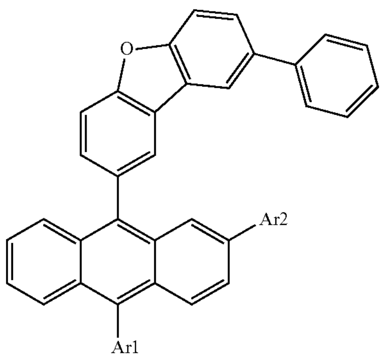 | 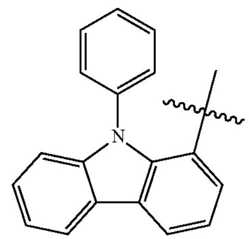 [SMILES: *c1cccc2c3ccccc3n(-c3ccccc3)c12] | 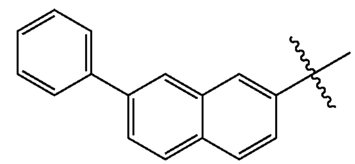 [SMILES: *c1ccc2ccc(-c3ccccc3)cc2c1] |
| 60-27 | 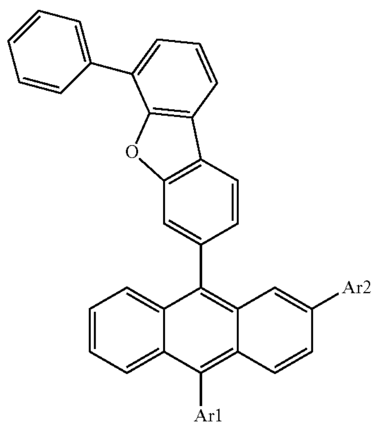 | 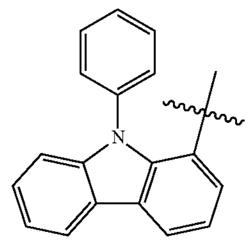 [SMILES: *c1cccc2c3ccccc3n(-c3ccccc3)c12] | 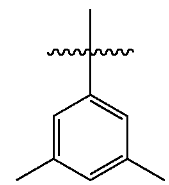 |

-continued
| No. | | Ar1 | Ar2 |
|---|---|---|---|
| 60-28 | 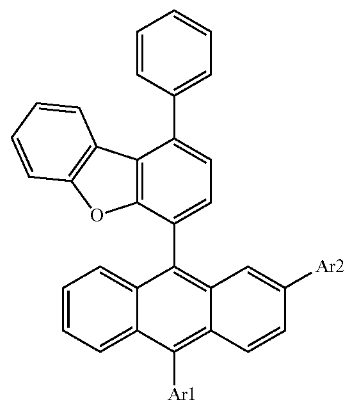  | 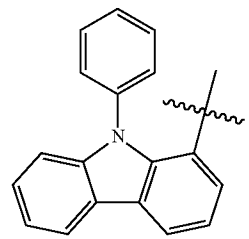 [SMILES: *c1cccc2c3ccccc3n(-c3ccccc3)c12]  | 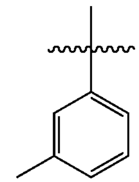 [SMILES: *c1cccc(C)c1] |
| 60-29 | 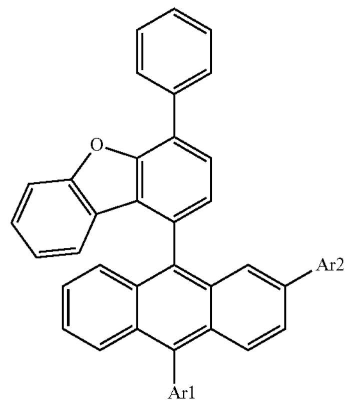  | 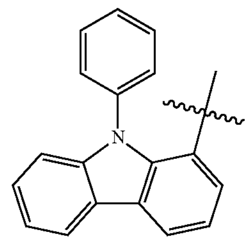 [SMILES: *c1cccc2c3ccccc3n(-c3ccccc3)c12]  | 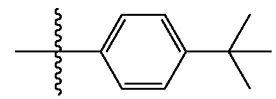 [SMILES: *c1ccc(C(C)(C)C)cc1] |

-continued
| No. | | Ar1 | Ar2 |
|---|---|---|---|
| 60-30 | 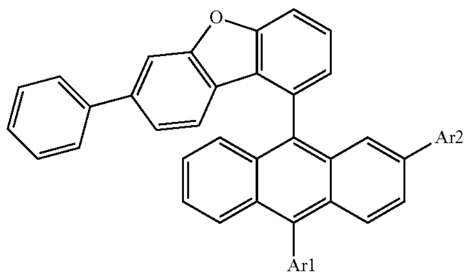  | 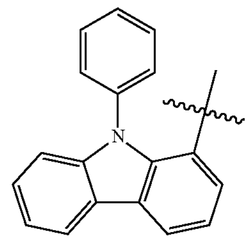 [SMILES: *c1cccc2c3ccccc3n(-c3ccccc3)c12] | 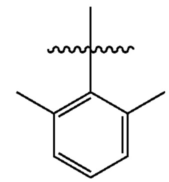 |
| 60-31 | 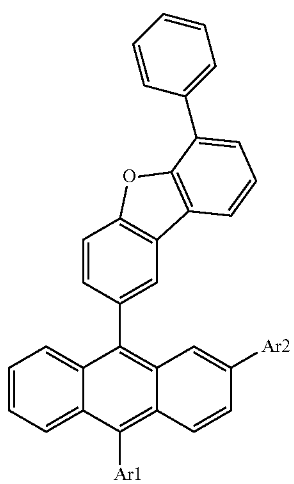  | 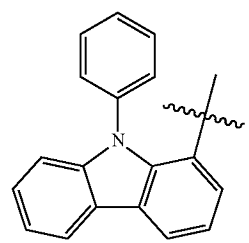 [SMILES: *c1cccc2c3ccccc3n(-c3ccccc3)c12] | 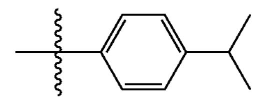 [SMILES: *c1ccc(C(C)C)cc1] |

According to one embodiment of the present disclosure, Cy1 to Cy3 are the same as or different from each other, and each independently a substituted or unsubstituted aromatic hydrocarbon ring having 6 to 60 carbon atoms; or a substituted or unsubstituted aromatic heteroring having 2 to 60 carbon atoms.

According to another embodiment, Cy1 to Cy3 are the same as or different from each other, and each independently a substituted or unsubstituted aromatic hydrocarbon ring having 6 to 30 carbon atoms; or a substituted or unsubstituted aromatic heteroring having 2 to 30 carbon atoms.

According to one embodiment of the present disclosure, Ra is a substituted or unsubstituted alkyl group; a substituted or unsubstituted aryl group; or a substituted or unsubstituted heterocyclic group, or bonds to Cy1 or Cy3 to form a substituted or unsubstituted ring.

According to one embodiment of the present disclosure, Ra is a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms, or bonds to Cy1 or Cy3 to form a substituted or unsubstituted ring.

According to one embodiment of the present disclosure, Ra is a substituted or unsubstituted alkyl group having 1 to 20 carbon atoms; a substituted or unsubstituted aryl group having 6 to 30 carbon atoms; or a substituted or unsubstituted heterocyclic group having 2 to 30 carbon atoms, or bonds to Cy1 or Cy3 to form a substituted or unsubstituted ring.

According to one embodiment of the present disclosure, Rb is a substituted or unsubstituted alkyl group; a substituted or unsubstituted aryl group; or a substituted or unsubstituted heterocyclic group, or bonds to Cy2 or Cy3 to form a substituted or unsubstituted ring.

According to one embodiment of the present disclosure, Rb is a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms, or bonds to Cy2 or Cy3 to form a substituted or unsubstituted ring.

According to one embodiment of the present disclosure, Rb is a substituted or unsubstituted alkyl group having 1 to 20 carbon atoms; a substituted or unsubstituted aryl group having 6 to 30 carbon atoms; or a substituted or unsubstituted heterocyclic group having 2 to 30 carbon atoms, or bonds to Cy2 or Cy3 to form a substituted or unsubstituted ring.

According to one embodiment of the present disclosure, Chemical Formula 2 may be any one of the following compounds, but is not limited thereto.

BD-1

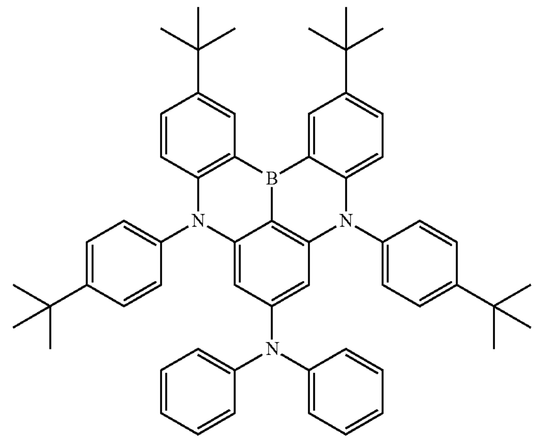

BD-2

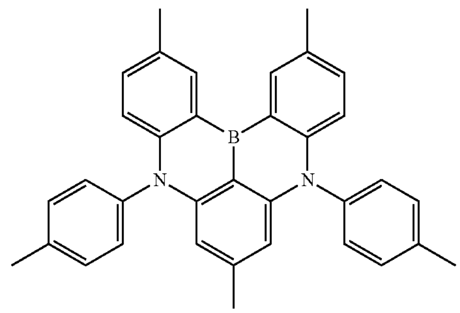

BD-3

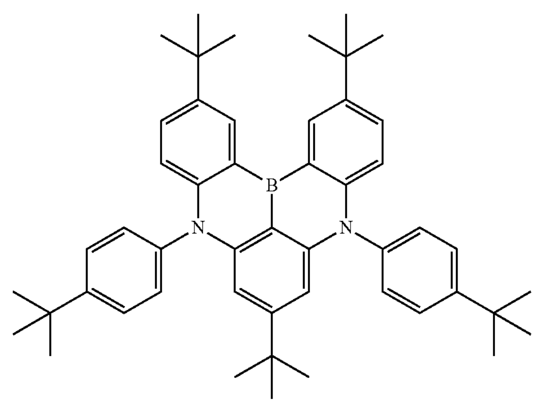

BD-4

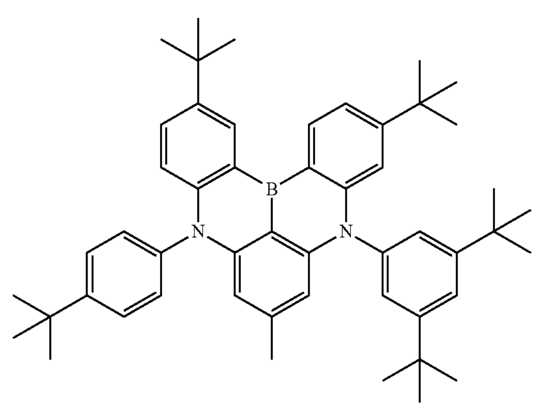

-continued
BD-5
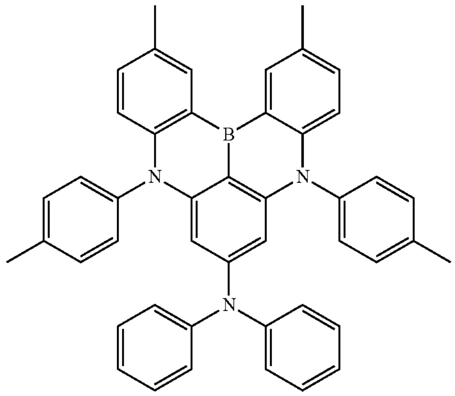
BD-6
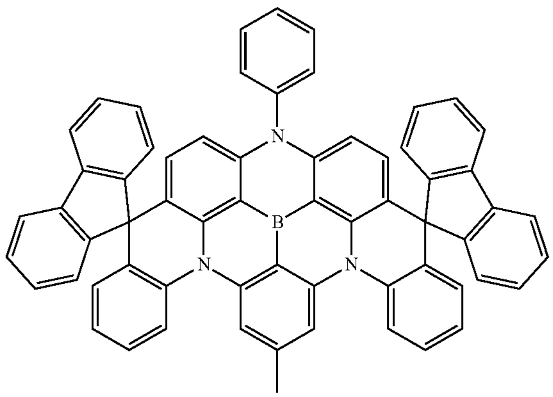
BD-7
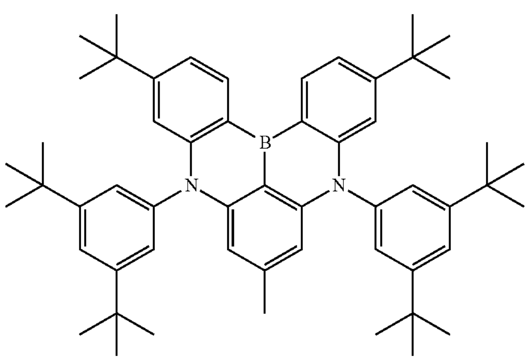
BD-8
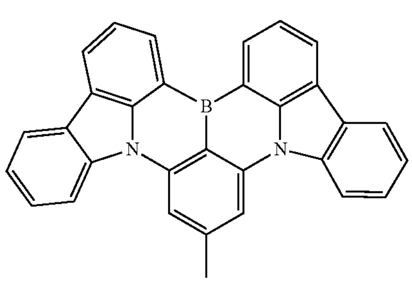
-continued
BD-9
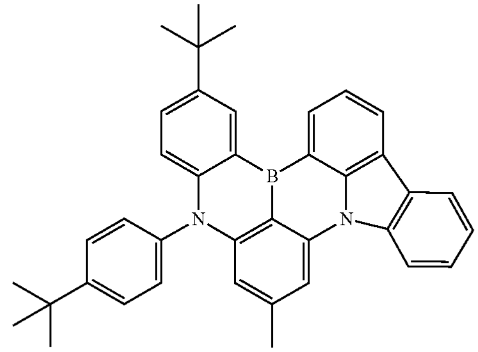
BD-10
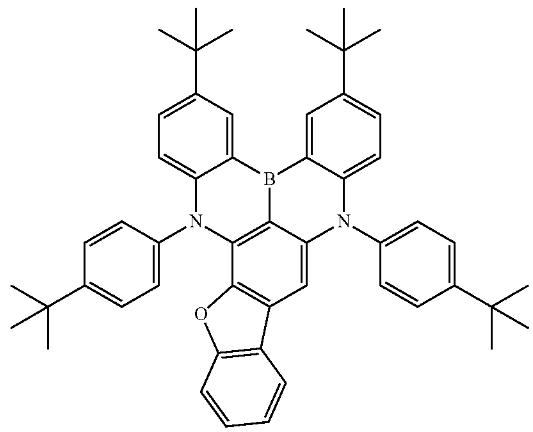
BD-11
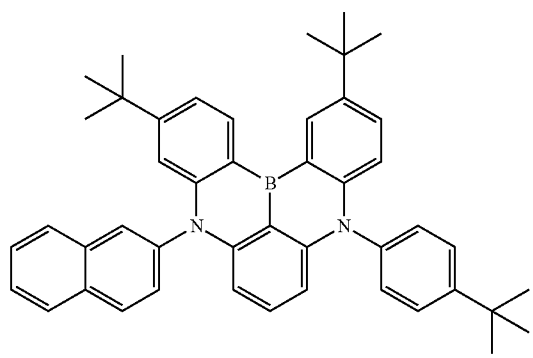
BD-12
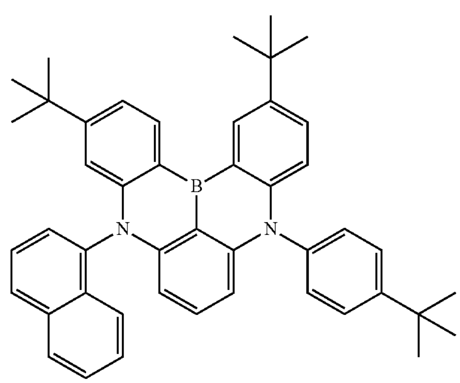

BD-13
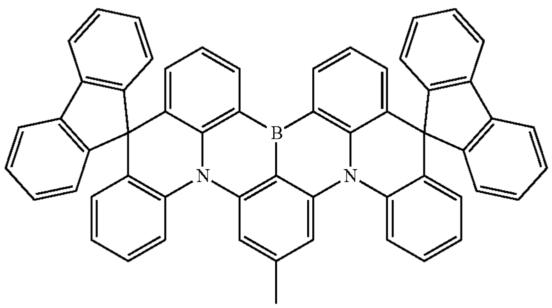
BD-14
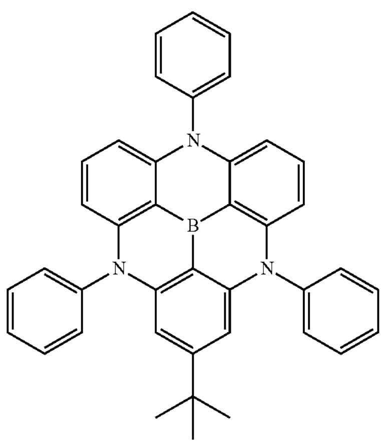
BD-15
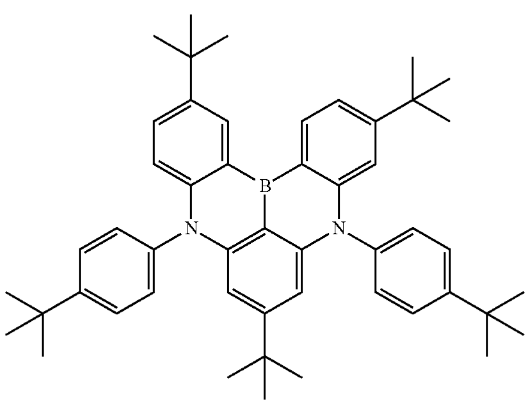
BD-16
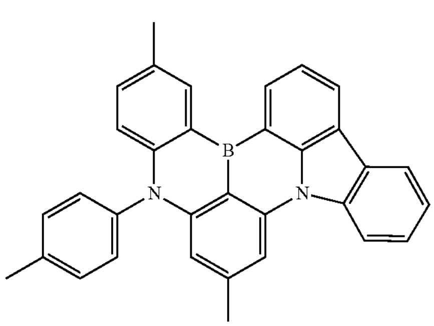
BD-17
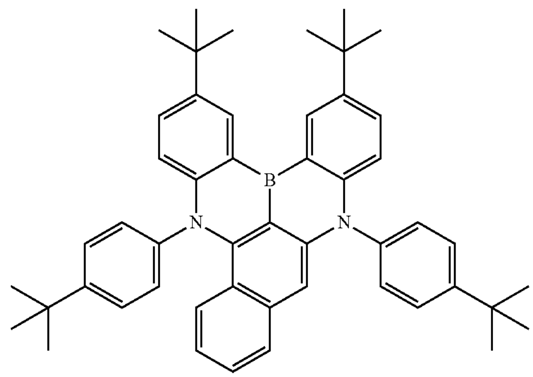
BD-18
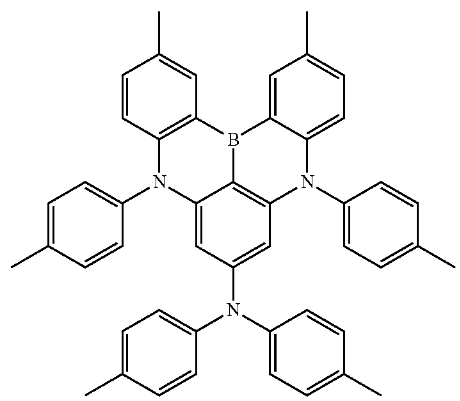
BD-19
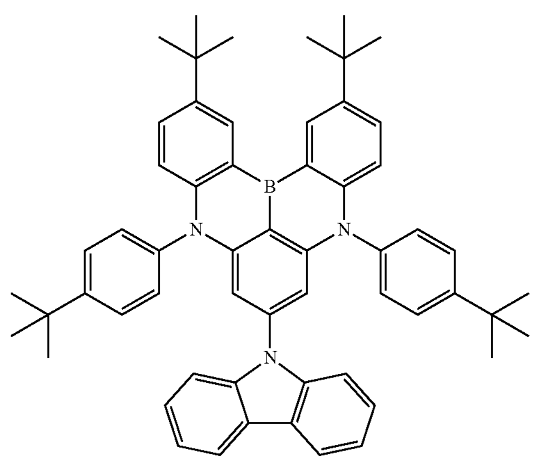
BD-20
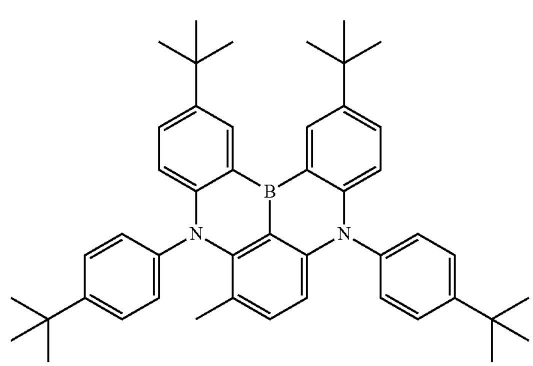

-continued

BD-21

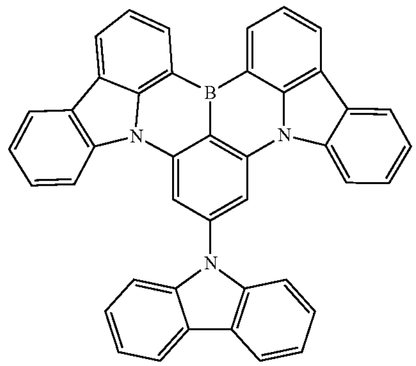

BD-22

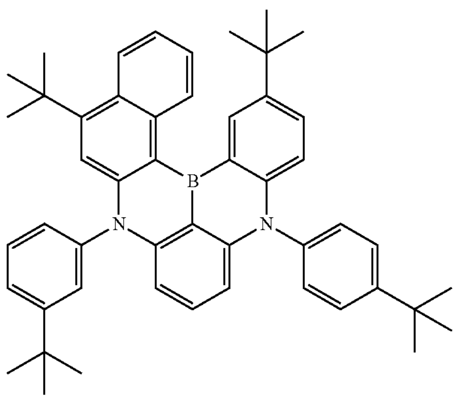

BD-23

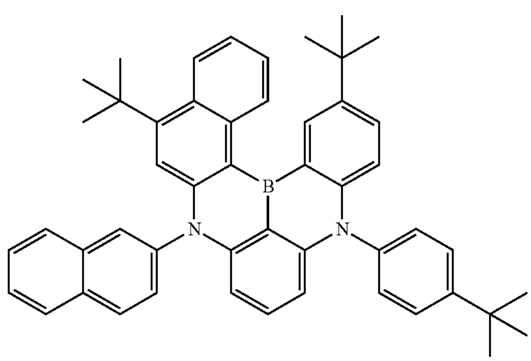

BD-24

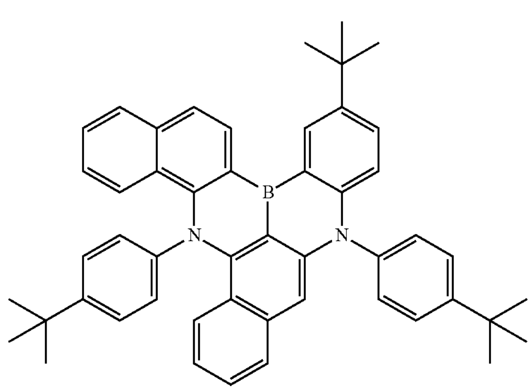

In the present disclosure, compounds having various energy band gaps may be synthesized by introducing various substituents to the core structure as above. In addition, in the present disclosure, HOMO and LUMO energy levels of the compounds may also be controlled by introducing various substituents to the core structure having a structure as above.

The compounds of Chemical Formulae 1 and 2 of the present disclosure may have the core structures prepared as in the following reaction formulae. Substituents may bond using methods known in the art, and types, positions and the number of the substituents may vary depending on technologies known in the art.

<Reaction Formula 1>

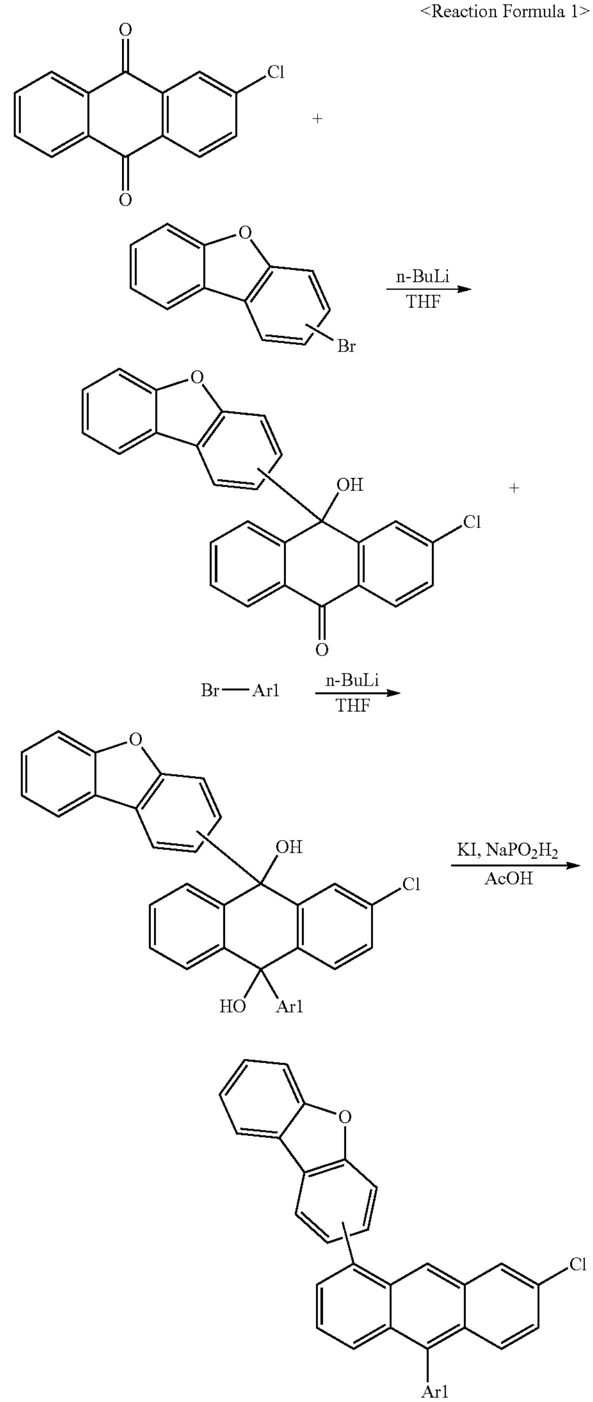

-continued

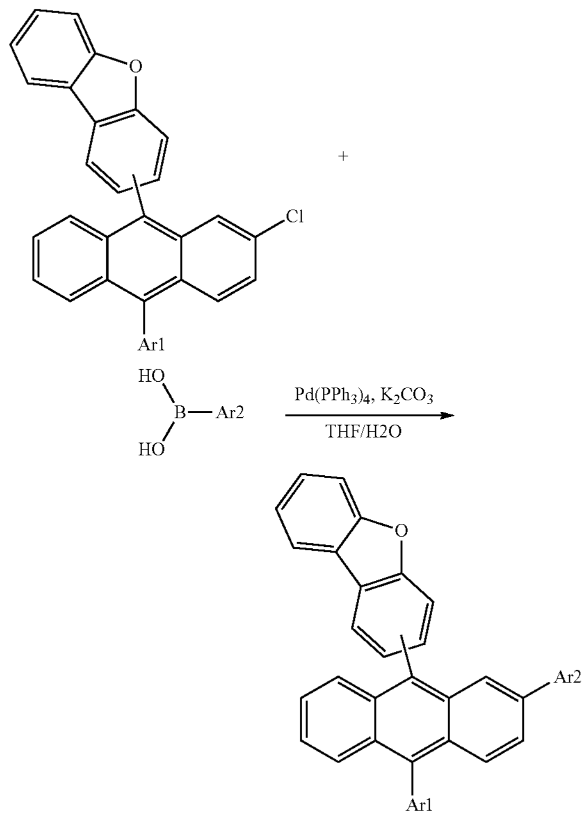

In Reaction Formula 1, L1 to L3, Ar1 to Ar3, R1, R2, n1 and n2 have the same definitions as in Chemical Formula 1 described above.

<Reaction Formula 2>

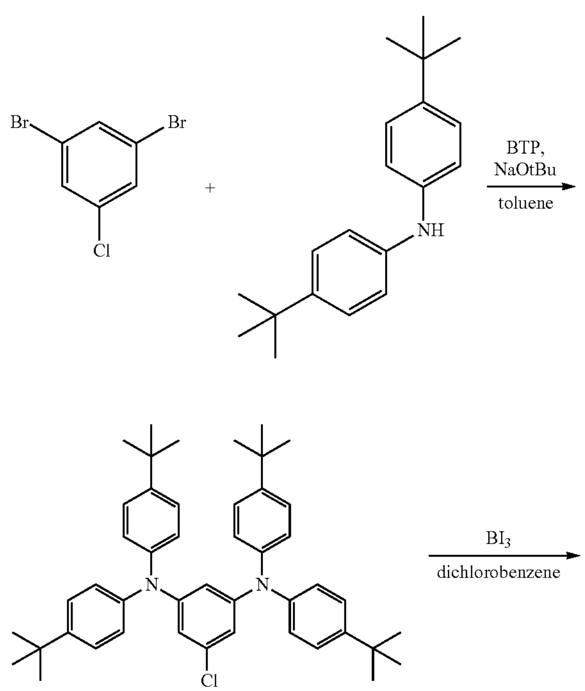

-continued

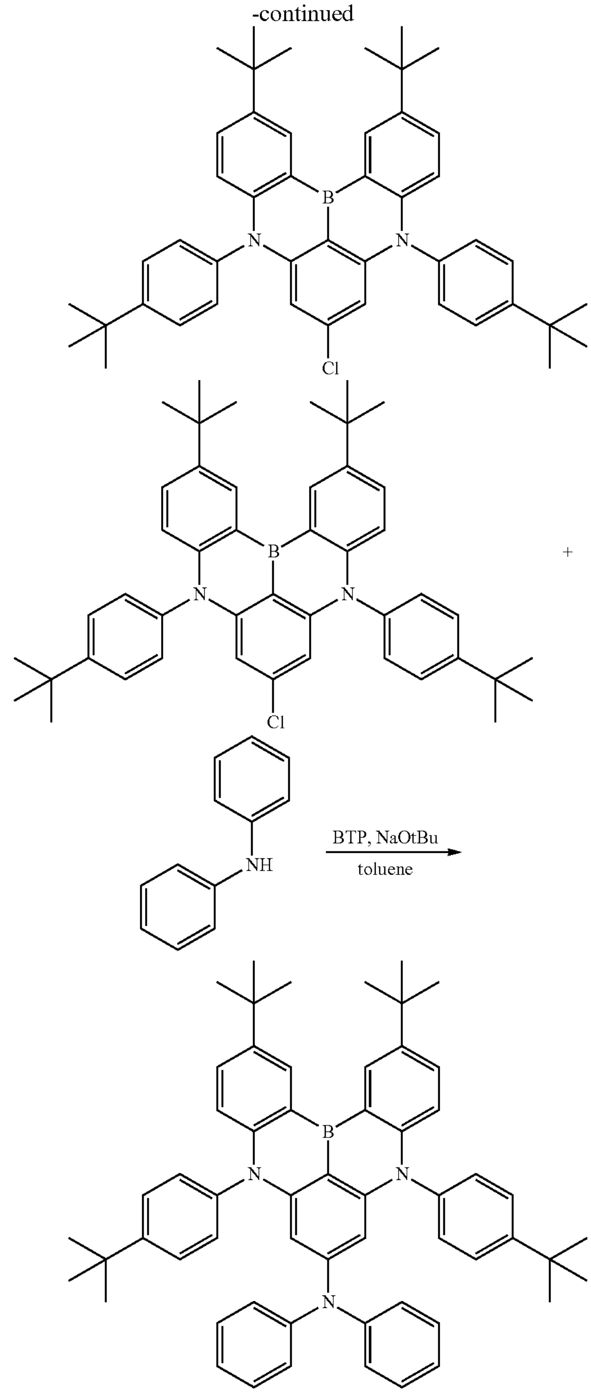

BD-1

In Reaction Formula 2, Cy1 to Cy3, Y1, Y2 and X1 have the same definitions as in Chemical Formula 2 described above.

The organic light emitting device of the present disclosure may be manufactured using common organic light emitting device manufacturing methods and materials except that a light emitting layer is formed using the compounds of Chemical Formulae 1 and 2 described above.

The compound may be formed into an organic material layer using a solution coating method as well as a vacuum deposition method when manufacturing the organic light emitting device. Herein, the solution coating method means spin coating, dip coating, inkjet printing, screen printing, a spray method, roll coating and the like, but is not limited thereto.

The organic material layer of the organic light emitting device of the present disclosure may be formed in a single layer structure, but may be formed in a multilayer structure in which two or more organic material layers are laminated. For example, the organic light emitting device of the present disclosure may have a structure including one or more of a hole transfer layer, a hole injection layer, an electron blocking layer, an electron transfer and injection layer, an electron transfer layer, an electron injection layer, a hole blocking layer, and an hole transfer and injection layer as the organic material layer. However, the structure of the organic light emitting device is not limited thereto, and may include a smaller or a larger number of organic material layers.

The organic light emitting device of the present disclosure includes an organic material layer including a light emitting layer, and the light emitting layer includes the compound of Chemical Formula 1 and the compound of Chemical Formula 2. The compound of Chemical Formula 2 may be included in 1 parts by weight to 20 parts by weight with respect to 100 parts by weight of the compound of Chemical Formula 1, and according to one embodiment, may be included in 1 parts by weight to 10 parts by weight with respect to 100 parts by weight of the compound of Chemical Formula 1. The content of the compound of Chemical Formula 2 satisfying the above-mentioned range has advantages in that the manufactured organic light emitting device has a low driving voltage and a long lifetime.

According to one embodiment, the light emitting layer of the organic light emitting device of the present disclosure includes the compound of Chemical Formula 1 as a host of the light emitting layer, and may include the compound of Chemical Formula 2 as a dopant of the light emitting layer.

In another embodiment, the light emitting layer may further include, in addition to the compound of Chemical Formula 1 and the compound of Chemical Formula 2, other organic compounds, metals or metal compounds.

In the organic light emitting device of the present disclosure, the organic material layer may include an electron blocking layer, and as the electron blocking layer, materials known in the art may be used.

In one embodiment of the present specification, the first electrode is an anode, and the second electrode is a cathode.

According to another embodiment, the first electrode is a cathode, and the second electrode is an anode.

The organic light emitting device may have, for example, a lamination structure as follows, however, the structure is not limited thereto.

Figure 2:
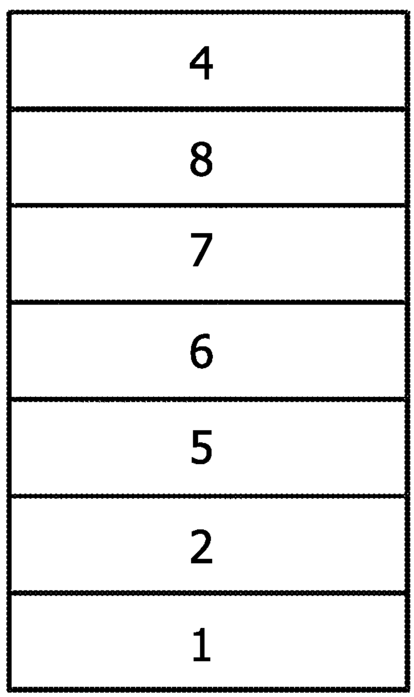
FIG. 2 illustrates an example of an organic light emitting device formed with a substrate (1), an anode (2), a hole injection layer (5), a hole transfer layer (6), a light emitting layer (7), an electron transfer layer (8) and a cathode (4).
Figure 3:
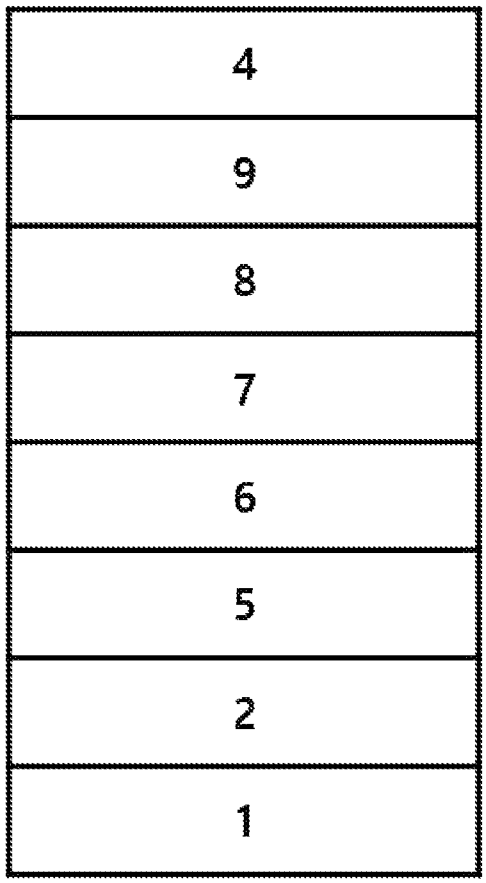
FIG. 3 illustrates an example of an organic light emitting device formed with a substrate (1), an anode (2), a hole injection layer (5), a hole transfer layer (6), a light emitting layer (7), an electron transfer layer (8), an electron injection layer (9) and a cathode (4).

(1) an anode/a hole transfer layer/a light emitting layer/a cathode
(2) an anode/a hole injection layer/a hole transfer layer/a light emitting layer/a cathode
(3) an anode/a hole injection layer/a hole buffer layer/a hole transfer layer/a light emitting layer/a cathode
(4) an anode/a hole transfer layer/a light emitting layer/an electron transfer layer/a cathode
(5) an anode/a hole transfer layer/a light emitting layer/an electron transfer layer/an electron injection layer/a cathode
(6) an anode/a hole injection layer/a hole transfer layer/a light emitting layer/an electron transfer layer/a cathode
(7) an anode/a hole injection layer/a hole transfer layer/a light emitting layer/an electron transfer layer/an electron injection layer/a cathode
(8) an anode/a hole injection layer/a hole buffer layer/a hole transfer layer/a light emitting layer/an electron transfer layer/a cathode
(9) an anode/a hole injection layer/a hole buffer layer/a hole transfer layer/a light emitting layer/an electron transfer layer/an electron injection layer/a cathode
(10) an anode/a hole transfer layer/an electron blocking layer/a light emitting layer/an electron transfer layer/a cathode
(11) an anode/a hole transfer layer/an electron blocking layer/a light emitting layer/an electron transfer layer/an electron injection layer/a cathode
(12) an anode/a hole injection layer/a hole transfer layer/an electron blocking layer/a light emitting layer/an electron transfer layer/a cathode
(13) an anode/a hole injection layer/a hole transfer layer/an electron blocking layer/a light emitting layer/an electron transfer layer/an electron injection layer/a cathode
(14) an anode/a hole transfer layer/a light emitting layer/a hole blocking layer/an electron transfer layer/a cathode
(15) an anode/a hole transfer layer/a light emitting layer/a hole blocking layer/an electron transfer layer/an electron injection layer/a cathode
(16) an anode/a hole injection layer/a hole transfer layer/a light emitting layer/a hole blocking layer/an electron transfer layer/a cathode
(17) an anode/a hole injection layer/a hole transfer layer/a light emitting layer/a hole blocking layer/an electron transfer layer/an electron injection layer/a cathode The organic light emitting device of the present disclosure may have structures as illustrated in FIG. 1 to FIG. 3, however, the structure is not limited thereto.

FIG. 1 illustrates a structure of the organic light emitting device in which an anode (2), a light emitting layer (3) and a cathode (4) are consecutively laminated on a substrate (1). In such a structure, the compound may be included in the light emitting layer (3).

FIG. 2 illustrates a structure of the organic light emitting device in which an anode (2), a hole injection layer (5), a hole transfer layer (6), a light emitting layer (7), an electron transfer layer (8) and a cathode (4) are consecutively laminated on a substrate (1). In such a structure, the compound may be included in the hole injection layer (5), the hole transfer layer (6), the light emitting layer (7) and the electron transfer layer (8).

FIG. 3 illustrates an example of the organic light emitting device formed with a substrate (1), an anode (2), a hole injection layer (5), a hole transfer layer (6), a light emitting layer (7), an electron transfer layer (8), an electron injection layer (9) and a cathode (4). In such a structure, the compound may be included in the hole injection layer (5), the hole transfer layer (6), the light emitting layer (7), the electron transfer layer (8) and the electron injection layer (9).

For example, the organic light emitting device according to the present disclosure may be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer, an electron blocking layer, an electron transfer layer and an electron injection layer thereon, and then depositing a material usable as a cathode thereon. In addition to such a method, the organic light emitting device may also be manufactured by consecutively depositing a cathode material, an organic material layer and an anode material on a substrate.

The organic material layer may further include one or more of a hole transfer layer, a hole injection layer, an electron blocking layer, an electron transfer and injection layer, an electron transfer layer, an electron injection layer, a hole blocking layer, and a hole transfer and injection layer.

The organic material layer may have a multilayer structure including a hole injection layer, a hole transfer layer, a layer carrying out electron injection and electron transfer at the same time, an electron blocking layer, a light emitting layer, an electron transfer layer, an electron injection layer, an electron transfer and injection layer, and the like, but is not limited thereto, and may have a single layer structure. In addition, using various polymer materials, the organic material layer may be prepared into a smaller number of layers using a solvent process instead of a deposition method, for example, a method such as spin coating, dip coating, doctor blading, screen printing, inkjet printing or a thermal transfer method.

The anode is an electrode injecting holes, and as the anode material, materials having large work function are normally preferred so that hole injection to an organic material layer is smooth. Specific examples of the anode material usable in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

The cathode is an electrode injecting electrons, and as the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer performing a role of facilitating hole injection from an anode to a light emitting layer. The hole injection material is a material favorably receiving holes from an anode at a low voltage, and the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto. The hole injection layer may have a thickness of 1 nm to 150 nm. The hole injection layer thickness being 1 nm or greater has an advantage of preventing hole injection properties from declining, and the thickness being 150 nm or less has an advantage of preventing an increase in the driving voltage to enhance hole migration resulting from the hole injection layer thickness being too thick.

The hole transfer layer may perform a role of facilitating hole transfer. As the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

A hole buffer layer may be further provided between the hole injection layer and the hole transfer layer, and hole injection or transfer materials known in the art may be included.

An electron blocking layer may be further provided between the hole transfer layer and the light emitting layer. As the electron blocking layer, the compounds described above or materials known in the art may be used.

In one embodiment of the present disclosure, the organic light emitting device may be provided with an additional light emitting layer in addition to including the compound of Chemical Formula 1 and the compound of Chemical Formula 2.

The additional light emitting layer may emit red, green or blue light, and may be formed with phosphorescent materials or fluorescent materials. The light emitting material is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole-based compounds; dimerized styryl compounds; BAlq; 10-hydroxybenzoquinoline-metal compounds; benzoxazole-benzothiazole- and benzimidazole-based compounds; poly(p-phenylenevinylene) (PPV)-based polymers; spiro compounds; polyfluorene, rubrene, and the like, but are not limited thereto.

A host material of the light emitting layer may include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like may be included, and as the heteroring-containing compound, carbazole derivatives, dibenzofuran derivatives, ladder-type furan compounds, pyrimidine derivatives and the like may be included, however, the host material is not limited thereto.

When the light emitting layer emits red light, phosphorescent materials such as bis(1-phenylisoquinoline)acetylacetonate iridium (PIQIr(acac)), bis(1-phenylquinoline)acetylacetonate iridium (PQIr(acac)), tris(1-phenylquinoline) iridium (PQIr) or octaethylporphyrin platinum (PtOEP), or fluorescent material such as tris(8-hydroxyquinolino)aluminum ($Alq_3$) may be used as a light emitting dopant, however, the light emitting dopant is not limited thereto. When the light emitting layer emits green light, phosphorescent materials such as fac tris(2-phenylpyridine)iridium ($Ir(ppy)_3$), or fluorescent material such as tris(8-hydroxyquinolino)aluminum ($Alq_3$) may be used as a light emitting dopant, however, the light emitting dopant is not limited thereto. When the light emitting layer emits blue light, phosphorescent materials such as $(4,6\text{-F2ppy})_2$Irpic, or fluorescent material such as spiro-DPVBi, spiro-6P, distilbenzene (DSB), distyrylarylene (DSA), PFO-based polymers or PPV-based polymers may be used as a light emitting dopant, however, the light emitting dopant is not limited thereto.

A hole blocking layer may be provided between the electron transfer layer and the light emitting layer, and materials known in the art may be used.

The electron transfer layer may perform a role of facilitating electron transfer. The electron transfer material is a material favorably receiving electrons from a cathode and moving the electrons to a light emitting layer, and materials having high mobility for the electrons are suited. Specific examples thereof include Al complexes of 8-hydroxyquinoline; complexes including $Alq_3$; organic radical compounds; hydroxyflavon-metal complexes, or the like, but are not limited thereto. The electron transfer layer may have a thickness of 1 nm to 50 nm. The electron transfer layer thickness being 1 nm or greater has an advantage of preventing electron transfer properties from declining, and the thickness being 50 nm or less has an advantage of preventing an increase in the driving voltage to enhance electron migration resulting from the electron transfer layer thickness being too thick.

The electron injection layer may perform a role of facilitating electron injection. As the electron injection material, compounds having an ability to transfer electrons, having an electron injection effect from a cathode, having an excellent electron injection effect for a light emitting layer or light emitting material, and preventing excitons generated in the light emitting layer from migrating to a hole injection layer, and in addition thereto, having an excellent thin film forming ability are preferred. Specific examples thereof include fluorenone, LiF, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium and the like, but is not limited thereto.

The hole blocking layer is a layer blocking holes from reaching a cathode, and may be generally formed under the same condition as a hole injection layer. Specific examples thereof may include oxadiazole derivatives, triazole derivatives, phenanthroline derivatives, BCP, aluminum complexes and the like, but are not limited thereto.

The organic light emitting device according to the present disclosure may be a top-emission type, a bottom-emission type or a dual-emission type depending on the materials used.

Exemplary Embodiments

Hereinafter, the present specification will be described in detail with reference to examples. However, the examples according to the present specification may be modified to various other forms, and the scope of the present application is not to be construed as being limited to the examples described below. Examples of the present application are provided in order to more fully describe the present specification to those having average knowledge in the art.

Synthesis Example

1) Synthesis of Compound 1-1

After dissolving 1-bromodibenzofuran (1 eq.) in tetrahydrofuran (THF) under the nitrogen atmosphere, n-BuLi (1.1 eq.) was slowly added dropwise thereto at −78° C. After 30 minutes, 2-chloroanthraquinone (0.5 eq.) was added thereto. The temperature was raised to room temperature, and when the reaction was finished, the result was extracted with ethyl acetate and then washed with water. Such a method was conducted once more using phenylbromide. After the reaction was finished, the result was extracted with ethyl acetate and then washed with water. After evaporating all the ethyl acetate, solids were dropped using hexane to obtain 2-chloro-9-(dibenzo[b,d]furan-1-yl)-10-phenyl-9,10-dihydroanthracene-9,10-diol in a 50% yield. 2-Chloro-9-(dibenzo[b,d]furan-1-yl)-10-phenyl-9,10-dihydroanthracene-9,10-diol (1 eq.), KI (3 eq.) and $NaPO_2H_2$ (5 eq.) were introduced to acetic acid, and after raising the temperature, the result was refluxed. After the reaction was finished, excess water was poured thereinto to filter produced solids. The solids were extracted with ethyl acetate, then washed with water, and recrystallized with toluene to obtain 1-(2-chloro-10-phenylanthracen-9-yl)dibenzo[b,d]furan in a 70% yield. 1-(2-Chloro-10-phenylanthracen-9-yl)dibenzo[b,d]furan (1 eq.), phenylboronic acid (1.1 eq.), $Pd(PPh_3)_4$ (0.1 eq.) and $K_2CO_3$ (3 eq.) were dissolved in tetrahydrofuran (THF) and water (3:1 ratio), and the result was refluxed while heating. After the reaction was finished, the result was extracted with toluene, then washed with water, and recrystallized with toluene to obtain Compound 1-1 in a 65% yield. The final compound was identified using a mass spectrometer. [cal. m/s: 496.61, exp. m/s (M+) 495.6]

2) Syntheses of Compounds 1-2, 2-1, 16-1, 16-2, 16-7, 16-9, 16-12, 17-1, 17-2, 18-2, 28-1, 28-9, 31-1, 31-2, 31-5, 32-1, 32-2 and 35-1

Compounds 1-2, 2-1, 16-1, 16-2, 16-7, 16-9, 16-12, 17-1, 17-2, 18-2, 28-1, 28-9, 31-1, 31-2, 31-5, 32-1, 32-2 and 35-1 were obtained in the same manner as in the method for synthesizing Compound 1-1, except that 2-bromodibenzofuran, 3-bromodibenzofuran or 4-bromodibenzofuran was used instead of 1-bromodibenzofuran, 1-bromonaphtalene, 2-bromonaphtalene, 1-bromodibenzofuran or 3-bromo-1,1'-biphenyl was used instead of phenylbromide, and naphthalen-1-ylboronic acid, phenanthren-9-ylboronic acid, dibenzo[b,d]furan-1-ylboronic acid, dibenzo[b,d]furan-4-ylboronic acid or [1,1'-biphenyl]-3-ylboronic acid was used instead of phenylboronic acid. The following Table 1 shows synthesis identification data of the compounds.

TABLE 1

| Compound | cal. m/s | exp. m/s [M+] |
|---|---|---|
| 1-2 | 546.7 | 545.7 |
| 2-1 | 546.7 | 545.7 |
| 16-1 | 496.6 | 495.6 |
| 16-2 | 546.7 | 545.7 |
| 16-7 | 596.7 | 595.7 |
| 16-9 | 586.7 | 585.7 |
| 16-12 | 586.7 | 585.7 |
| 17-1 | 546.7 | 545.7 |
| 17-2 | 596.7 | 595.7 |
| 18-2 | 596.7 | 595.7 |
| 28-1 | 586.7 | 585.7 |
| 28-9 | 676.8 | 675.8 |
| 31-1 | 496.6 | 495.6 |
| 31-2 | 546.7 | 545.7 |
| 31-5 | 572.7 | 571.7 |
| 32-1 | 546.7 | 545.7 |
| 32-2 | 596.7 | 595.7 |
| 35-1 | 572.7 | 571.7 |

Compounds 1-1, 1-2, 2-1, 16-1, 16-2, 16-7, 16-9, 16-12, 17-1, 17-2, 18-2, 28-1, 28-9, 31-1, 31-2, 31-5, 32-1, 32-2 and 35-1 prepared as above are as follows.
[1-1]
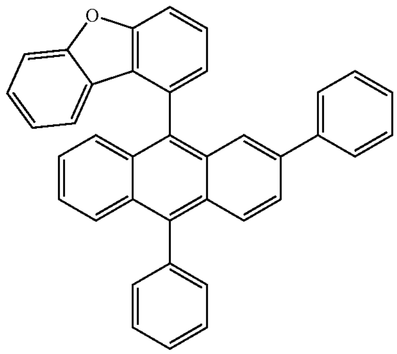
[1-2]
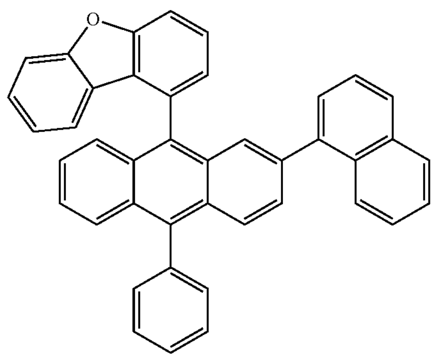
[2-1]
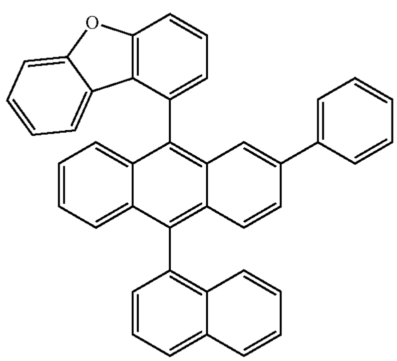
[16-1]
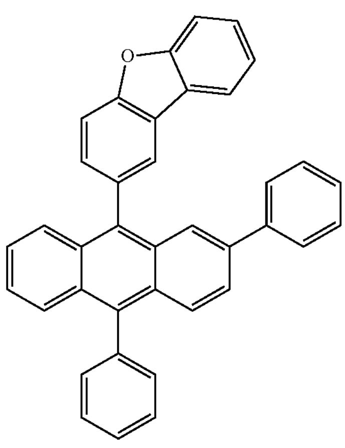
-continued
[16-2]
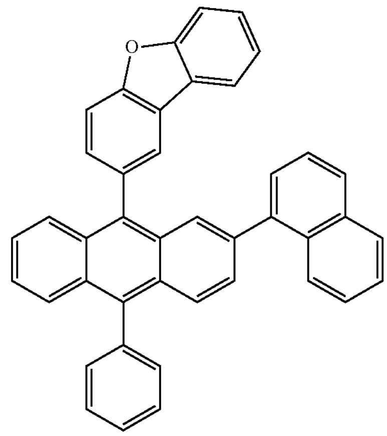
[16-7]
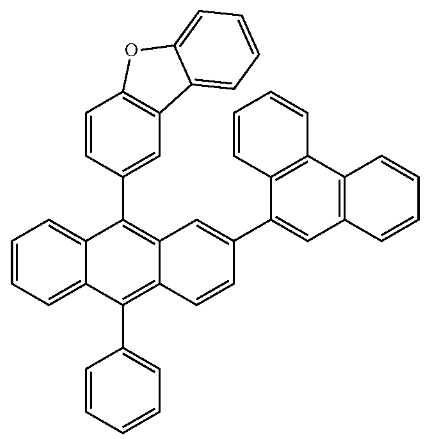
[16-9]
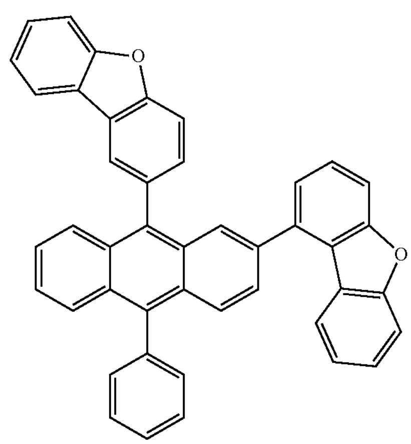

-continued
[16-12]
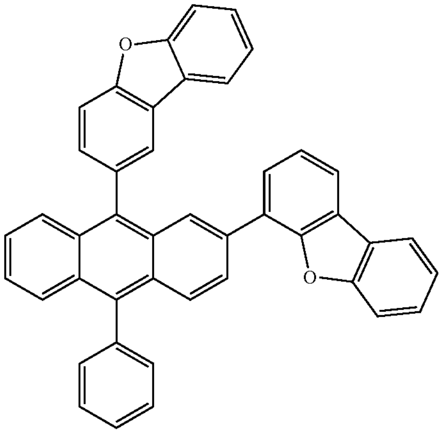
[17-1]
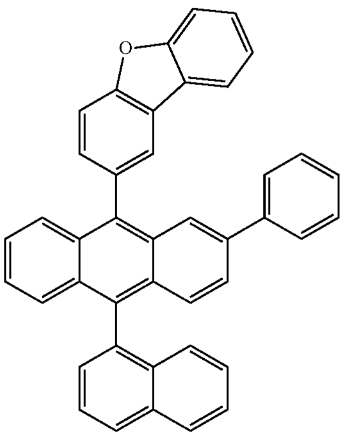
[17-2]
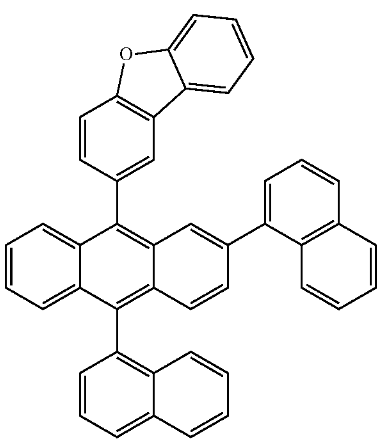
-continued
[18-2]
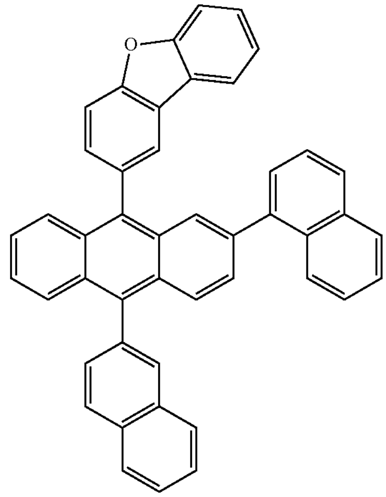
[28-1]
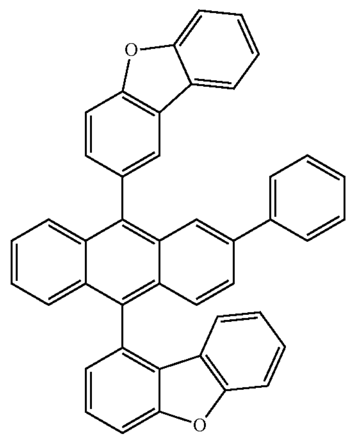
[28-9]
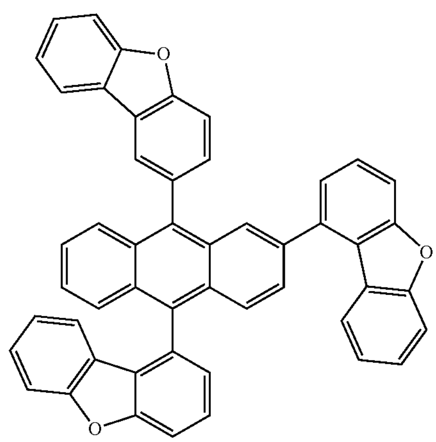

-continued

[31-1]

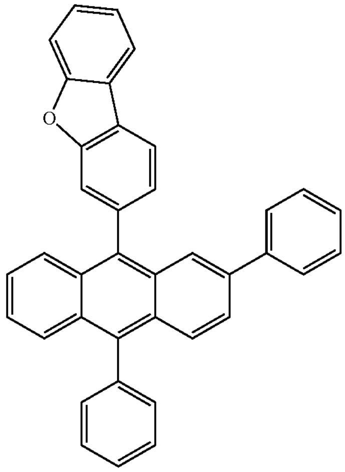

[31-2]

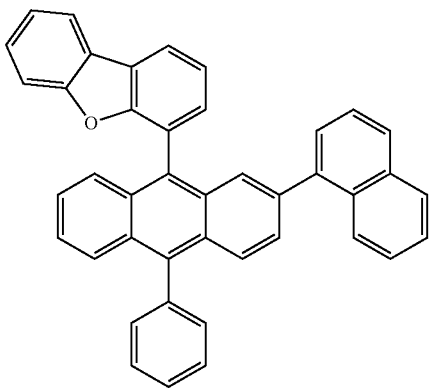

[31-5]

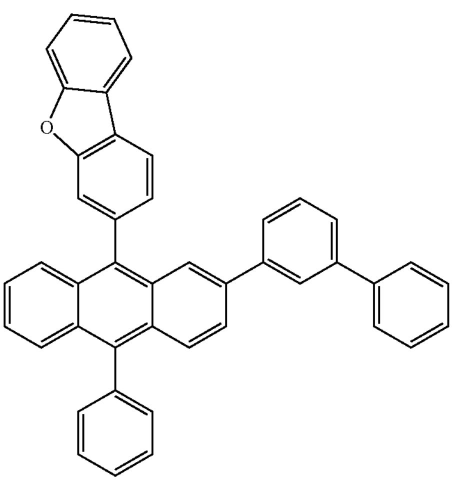

-continued

[32-1]

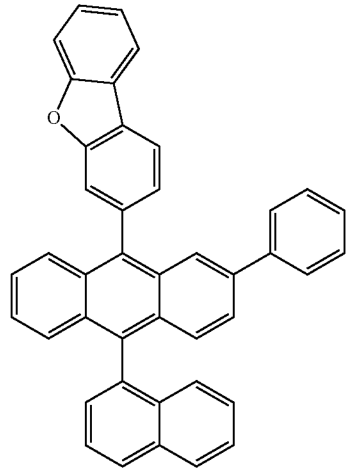

[32-2]

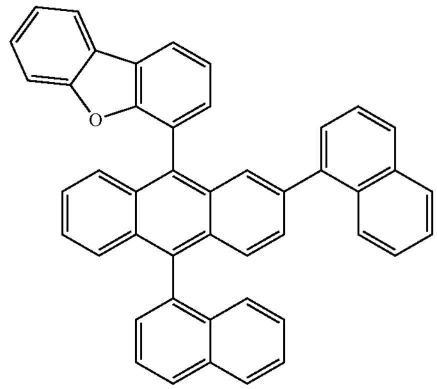

[35-1]

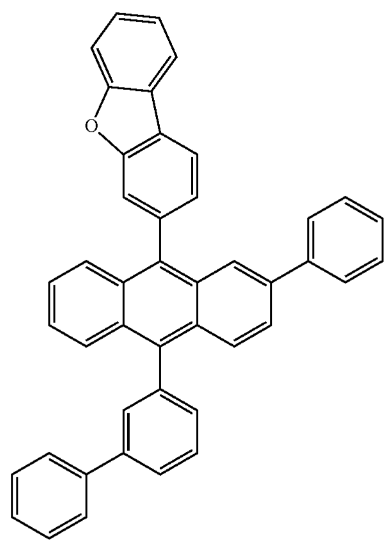

3) Synthesis of BD-1

After introducing intermediate 1,3-dibromo-5-chlorobenzene (1 eq.), bis(4-(tert-butyl)phenyl)amine (3.0 eq.), sodium t-butoxide (3 eq.) and bis(tri(tert-butyl)phosphine) palladium(0) (0.05 eq.) to toluene under the nitrogen atmosphere, the result was heated to 120° C. and stirred for 5 hours. After the reaction was finished, the reaction solution was cooled to room temperature, separated by adding water and aq. $NH_4Cl$ thereto, and treated with $MgSO_4$ (anhydrous) for filtration. The filtrate was removed by distillation under vacuum and purified by recrystallization to obtain N1,N1,N3,N3-tetrakis(4-(tert-butyl)phenyl)-5-chlorobenzene-1,3-diamine in a 58% yield.

N1,N1,N3,N3-tetrakis(4-(tert-butyl)phenyl)-5-chlorobenzene-1,3-diamine (1 eq.) and $BI_3$ (1.5 eq.) were dissolved in dichlorobenzene under the nitrogen atmosphere, and the result was stirred for 3 hours at 130° C. After the reaction was finished, the reaction solution was cooled to room temperature, extracted, and treated with $MgSO_4$ (anhydrous) for filtration. The filtrate was removed by distillation under vacuum, purified using a column (toluene/hexane), and then recrystallized to obtain 2,12-di-tert-butyl-5,9-bis(4-(tert-butyl)phenyl)-7-chloro-5,9-dihydro-5,9-diaza-13b-boranaphtho[3,2,1-de]anthracene in a 65% yield.

After introducing the intermediate 2,12-di-tert-butyl-5,9-bis(4-(tert-butyl)phenyl)-7-chloro-5,9-dihydro-5,9-diaza-13b-boranaphtho[3,2,1-de]anthracene (1 eq.), diphenylamine (1.5 eq.), sodium t-butoxide (2 eq.) and bis(tri(tert-butyl)phosphine)palladium(0) (0.03 eq.) to toluene under the nitrogen atmosphere, the result was heated to 120° C. and stirred for 5 hours. After the reaction was finished, the reaction solution was cooled to room temperature, separated by adding water and aq. $NH_4Cl$ thereto, and treated with $MgSO_4$ (anhydrous) for filtration. The filtrate was removed by distillation under vacuum and purified by recrystallization to obtain BD-1 in a 68% yield. The final compound was identified using a mass spectrometer. [cal. m/s: 811.97, exp. m/s (M+) 810.6]

Compound BD-1 prepared as above is as follows.

BD-1

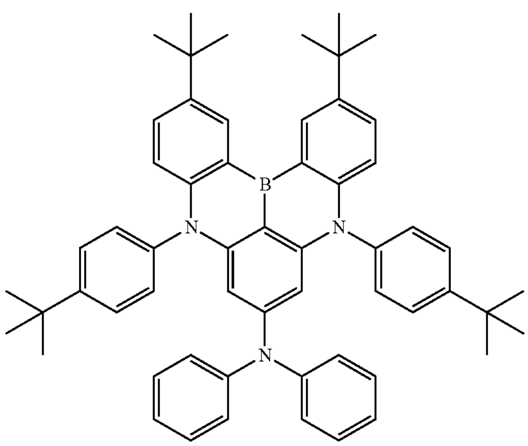

EXAMPLE

Structures of compounds used in examples and comparative examples are as follows, and among the following structures, compounds corresponding to Chemical Formulae 1 and 2 of the present application were each prepared through processes such as Reaction Formulae 1 and 2 described above.

HAT-CN

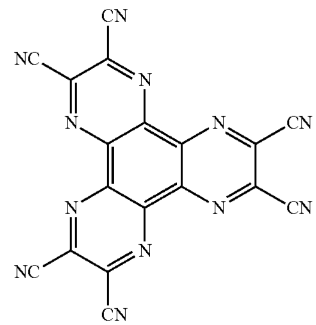

HTL1

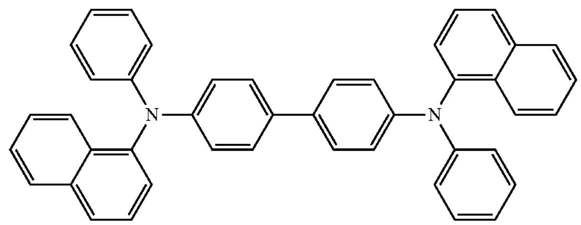

HTL2

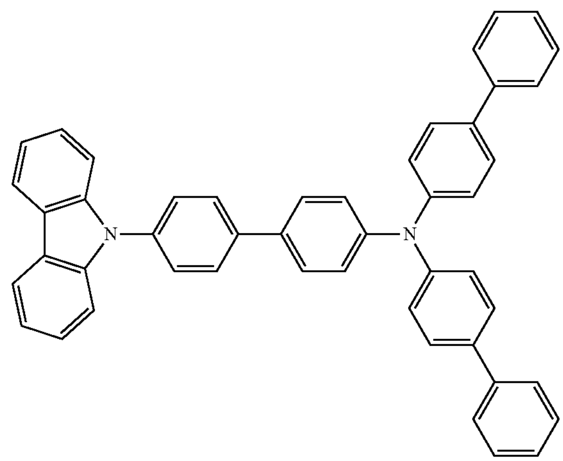

ETL

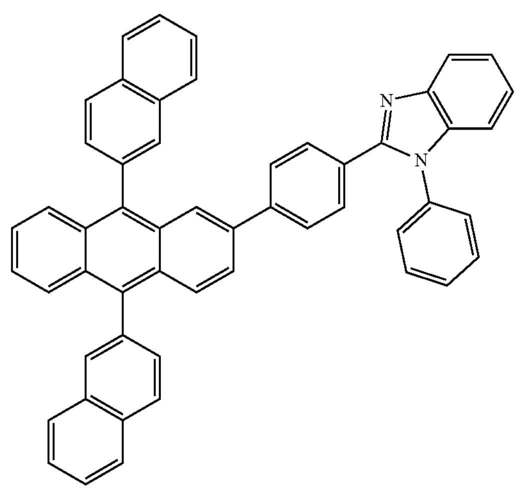

-continued

BH-A

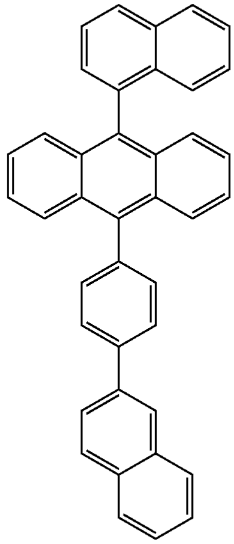

BH-B

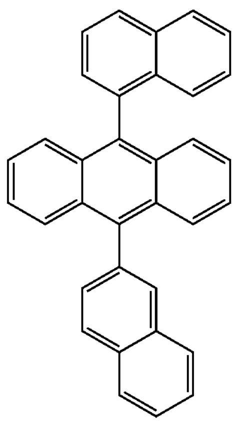

BH-C

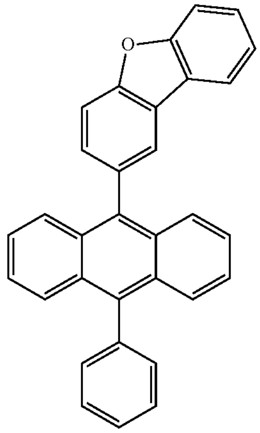

-continued

BH-D

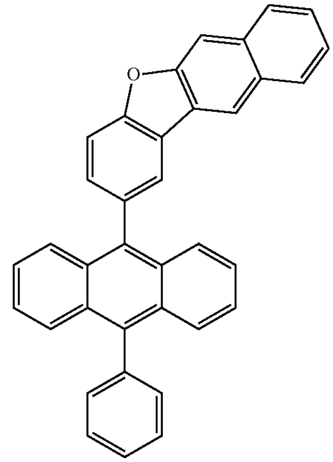

BH-E

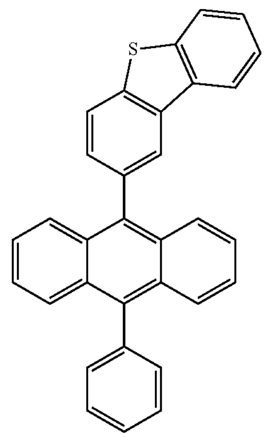

BH-F

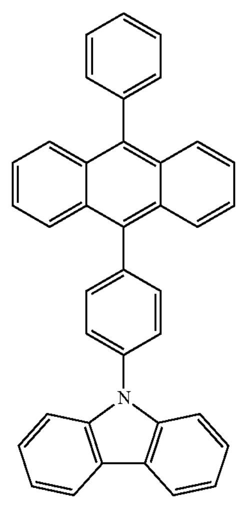

1) Example 1

A glass substrate on which indium tin oxide (ITO) was coated as a thin film to a thickness of 150 nm was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using nitrogen plasma, and then transferred to a vacuum depositor. On the transparent ITO electrode prepared as above, a hole injection layer was formed by thermal vacuum depositing the HAT-CN compound to a thickness of 5 nm. Subsequently, a hole transfer layer was formed by thermal vacuum depositing HTL1 to a thickness of 100 nm and then thermal vacuum depositing HTL2 to a thickness of 10 nm. Then, a light emitting layer having a thickness of 20 nm was formed by vacuum depositing Compound 1-1 as a host and BD-1 as a dopant (weight ratio 97:3) at the same time. Subsequently, an electron transfer layer was formed by vacuum depositing ETL to a thickness of 20 nm. Then, an electron injection layer was formed by vacuum depositing LiF to a thickness of 0.5 nm. Subsequently, a cathode was formed by depositing aluminum to a thickness of 100 nm, and as a result, an organic light emitting device was manufactured.

2) Examples 2 to 19 and Comparative Examples 1 to 6

Organic light emitting devices were manufactured in the same manner as in Example 1, except that, materials of the following Table 2 were used as the host and the dopant in the content (parts by weight based on 1, a sum of the host and the dopant) of the following Table 2, and for each of the organic light emitting devices manufactured in Examples 1 to 19 and Comparative Examples 1 to 6, driving voltage and light emission efficiency were measured at current density of 10 mA/cm$^2$, and time (LT) taken for luminance becoming 95% with respect to initial luminance was measured at current density of 20 mA/cm$^2$. The results are shown in the following Table 3.

TABLE 2

| | Host | | Dopant | |
|---|---|---|---|---|
| | Material | Content | Material | Content |
| Example 1 | 1-1 | 0.970 | BD-1 | 0.03 |
| Example 2 | 1-2 | 0.970 | BD-1 | 0.03 |
| Example 3 | 2-1 | 0.970 | BD-1 | 0.03 |
| Example 4 | 16-1 | 0.970 | BD-1 | 0.03 |
| Example 5 | 16-2 | 0.970 | BD-1 | 0.03 |
| Example 6 | 16-7 | 0.970 | BD-1 | 0.03 |
| Example 7 | 16-9 | 0.970 | BD-1 | 0.03 |
| Example 8 | 16-12 | 0.970 | BD-1 | 0.03 |
| Example 9 | 17-1 | 0.970 | BD-1 | 0.03 |
| Example 10 | 17-2 | 0.970 | BD-1 | 0.03 |
| Example 11 | 18-2 | 0.970 | BD-1 | 0.03 |
| Example 12 | 28-1 | 0.970 | BD-1 | 0.03 |
| Example 13 | 28-9 | 0.970 | BD-1 | 0.03 |
| Example 14 | 31-1 | 0.970 | BD-1 | 0.03 |
| Example 15 | 31-2 | 0.970 | BD-1 | 0.03 |
| Example 16 | 31-5 | 0.970 | BD-1 | 0.03 |
| Example 17 | 32-1 | 0.970 | BD-1 | 0.03 |
| Example 18 | 32-2 | 0.970 | BD-1 | 0.03 |
| Example 19 | 35-1 | 0.970 | BD-1 | 0.03 |
| Comparative Example 1 | BH-A | 0.970 | BD-1 | 0.03 |
| Comparative Example 2 | BH-B | 0.970 | BD-1 | 0.03 |
| Comparative Example 3 | BH-C | 0.970 | BD-1 | 0.03 |
| Comparative Example 4 | BH-D | 0.970 | BD-1 | 0.03 |

TABLE 2-continued

| | Host | | Dopant | |
|---|---|---|---|---|
| | Material | Content | Material | Content |
| Comparative Example 5 | BH-E | 0.970 | BD-1 | 0.03 |
| Comparative Example 6 | BH-F | 0.970 | BD-1 | 0.03 |

TABLE 3

| | Measurement Value at 10 mA/cm$^2$ | | | | LT (T95%) |
|---|---|---|---|---|---|
| | Vop | Cd/A | CIE_x | CIE_y | (hr) |
| Example 1 | | | 7 | 1 | |
| Example 2 | | | 4 | 7 | |
| Example 3 | | | 5 | 2 | |
| Example 4 | | | 7 | 1 | |
| Example 5 | | | 1 | 8 | |
| Example 6 | | | | 8 | |
| Example 7 | | | 4 | 5 | |
| Example 8 | | | 4 | 8 | |
| Example 9 | | | 2 | 5 | |
| Example 10 | | | 5 | 4 | |
| Example 11 | | | 9 | 1 | |
| Example 12 | | | 5 | 2 | |
| Example 13 | | | 8 | 8 | |
| Example 14 | | | 8 | 1 | |
| Example 15 | | | 5 | 3 | |
| Example 16 | | | 7 | 2 | |
| Example 17 | | | 7 | 3 | |
| Example 18 | | | 7 | 8 | |
| Example 19 | | | 4 | 9 | |
| Comparative Example 1 | | | 2 | 6 | |
| Comparative Example 2 | | | 6 | 9 | |
| Comparative Example 3 | | | 5 | 5 | |
| Comparative Example 4 | | | 1 | 2 | |
| Comparative Example 5 | | | 5 | 2 | |
| Comparative Example 6 | | | 5 | 8 | |

As shown in Table 3, Examples 1 to 19 using the compound of Chemical Formula 2 as a dopant, and using the compound of Chemical Formula 1 in which Ar2 is an aryl group or a heterocyclic group as a host exhibited properties of low driving voltage, high efficiency and long lifetime compared to Comparative Examples 1 to 6 using the compound in which Ar2 is hydrogen as a host.

Specifically, compared to Comparative Examples 1 to 6, Examples 1 to 19 had driving voltage decreasing to a maximum of approximately 0.5 (V@10 mA/cm$^2$), light emission efficiency increasing by a maximum of approximately 70%, and lifetime (LT) increasing by a maximum of approximately 185%.

The invention claimed is:

1. An organic light emitting device comprising:

a first electrode;

a second electrode provided opposite to the first electrode; and an organic material layer including a light emitting layer provided between the first electrode and the second electrode, wherein the light emitting layer includes a compound of Chemical Formula 1 and a compound of Chemical Formula 2:

Chemical Formula 1

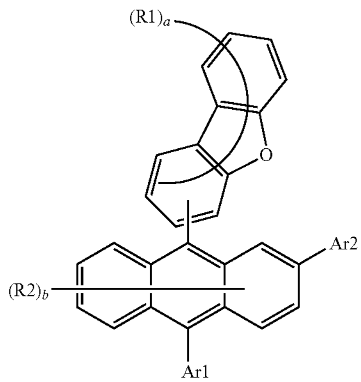

wherein in Chemical Formula 1:

Ar1 is a substituted or unsubstituted aryl group, or a substituted or unsubstituted heterocyclic group;

Ar2 is a substituted or unsubstituted aryl group of monocyclic to tricyclic ring, or a substituted or unsubstituted heterocyclic group including one or more of O or S as a heteroatom;

R1 is hydrogen, deuterium, a nitrile group, a halogen group, a silyl group, a boron group, a substituted or unsubstituted alkyl group, a substituted or unsubstituted aryloxy group, a substituted or unsubstituted aryl group, or a substituted or unsubstituted heterocyclic group, or bond to adjacent groups to form a substituted or unsubstituted ring;

R2 is hydrogen or deuterium, or two adjacent R2 groups bond together to form a substituted or unsubstituted ring; and a and b are each an integer of 0 to 7, and when a and b are each 2 or greater, substituents in the parentheses are the same as or different from each other;

Chemical Formula 2

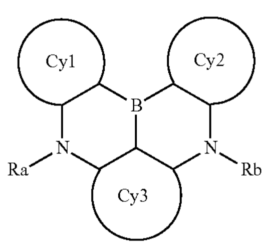

wherein in Chemical Formula 2:

Cy1 to Cy3 are the same as or different from each other, and each independently a substituted or unsubstituted aromatic hydrocarbon ring, or a substituted or unsubstituted aromatic heteroring;

Ra is a substituted or unsubstituted alkyl group, a substituted or unsubstituted aryl group, or a substituted or unsubstituted heterocyclic group, or bonds to Cy1 or Cy3 to form a substituted or unsubstituted ring; and Rb is a substituted or unsubstituted alkyl group, a substituted or unsubstituted aryl group, or a substituted or unsubstituted heterocyclic group, or bonds to Cy2 or Cy3 to form a substituted or unsubstituted ring.

2. The organic light emitting device of claim 1, wherein Chemical Formula 1 is any one of the following Chemical Formulae 1-1 to 1-4:

Chemical Formula 1-1

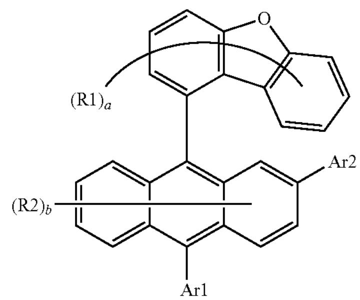

Chemical Formula 1-2

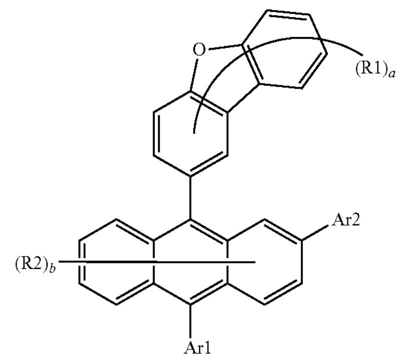

Chemical Formula 1-3

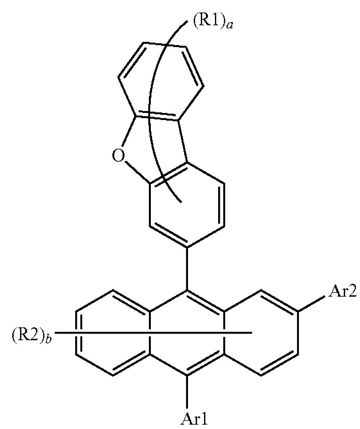

Chemical Formula 1-4

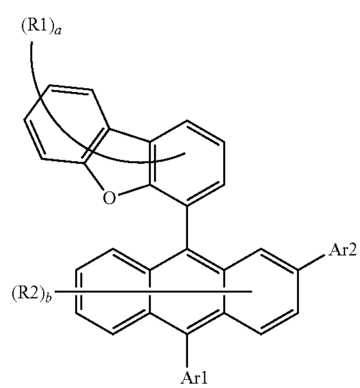

wherein in Chemical Formulae 1-1 to 1-4,

R1, R2, Ar1, Ar2, a and b have the same definitions as in Chemical Formula 1.

3. The organic light emitting device of claim 1, wherein:

Ar1 is a substituted or unsubstituted awl group having 6 to 60 carbon atoms, or a substituted or unsubstituted heteroring having 2 to 60 carbon atoms; and Ar2 is a substituted or unsubstituted aryl group of monocyclic to tricyclic ring having 6 to 60 carbon atoms, or a substituted or unsubstituted heterocyclic group including one or more of O or S as a heteroatom and having 2 to 60 carbon atoms.

4. The organic light emitting device of claim 1, wherein:

Ar1 is a substituted or unsubstituted aryl group having 6 to 60 carbon atoms; and Ar2 is a substituted or unsubstituted aryl group of monocyclic to tricyclic ring having 6 to 60 carbon atoms.

5. The organic light emitting device of claim 1, wherein Chemical Formula 1 is any one of compounds presented in the following table:

| No. | | Ar1 | Ar2 |
|---|---|---|---|
| 1-1 | 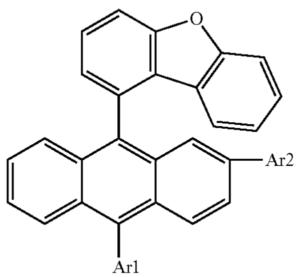 | 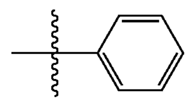 [SMILES: *c1ccccc1] | 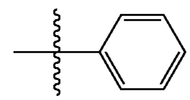 |
| 1-2 | 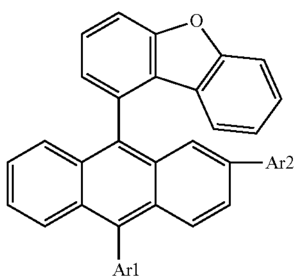 | 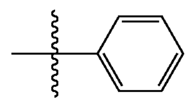 | 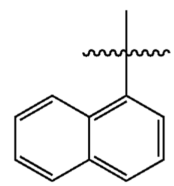 |
| 1-3 | 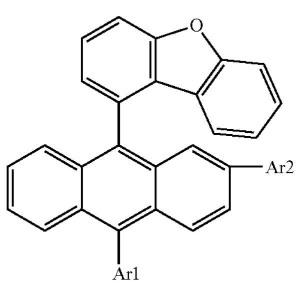 | 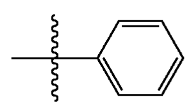 [SMILES: *c1ccccc1] | 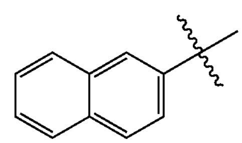 [SMILES: *c1ccc2ccccc2c1] |
| 1-4 | 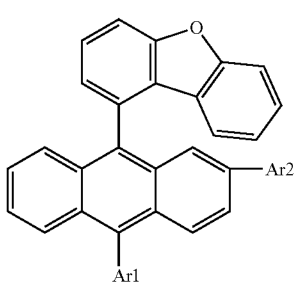 | 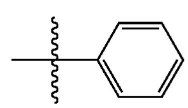 [SMILES: *c1ccccc1] | 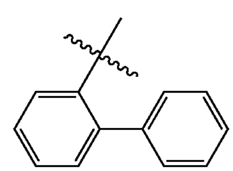 [SMILES: *c1ccccc1-c1ccccc1] |

-continued
| No. | | Ar1 | Ar2 |
|---|---|---|---|
| 1-5 | 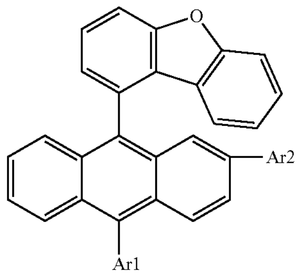 | 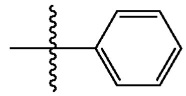 [SMILES: *c1ccccc1] | 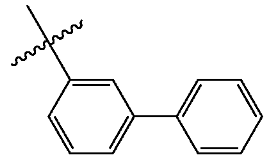 [SMILES: *c1cccc(-c2ccccc2)c1] |
| 1-6 | 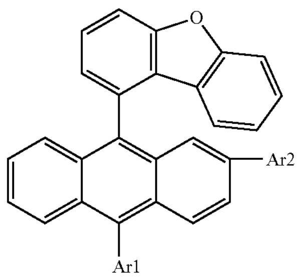 | 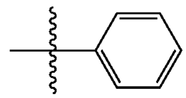 [SMILES: *c1ccccc1] | 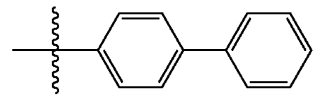 [SMILES: *c1ccc(-c2ccccc2)cc1] |
| 1-7 | 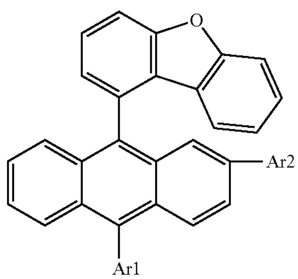 | 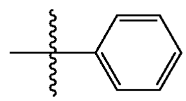 [SMILES: *c1ccccc1] | 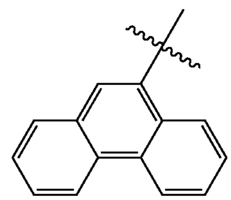 [SMILES: *c1cc2ccccc2c2ccccc12] |
| 1-9 | 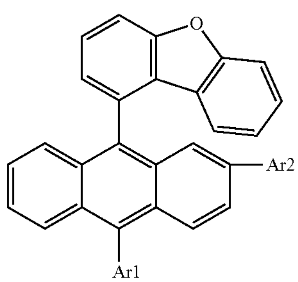 | 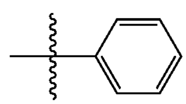 [SMILES: *c1ccccc1] | 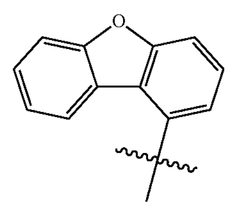 |
| 1-10 | 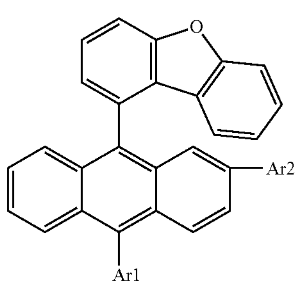 | 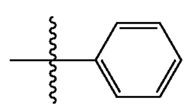 | 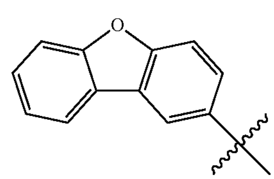 [SMILES: *c1ccc2oc3ccccc3c2c1] |

-continued
| No. | | Ar1 | Ar2 |
|---|---|---|---|
| 1-11 | 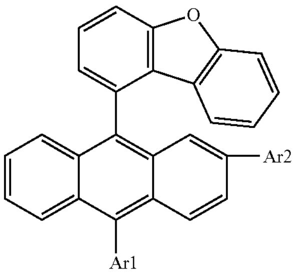 | 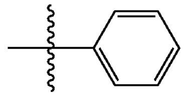 [SMILES: *c1ccccc1] | 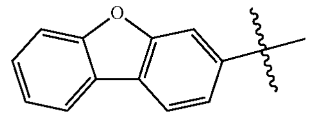 |
| 1-12 | 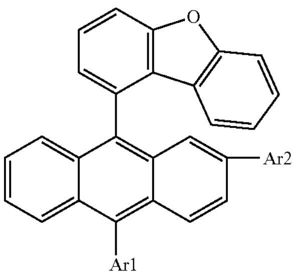 | 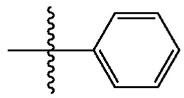 [SMILES: *c1ccccc1] | 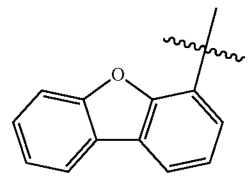 [SMILES: *c1cccc2c1oc1ccccc12] |
| 1-13 | 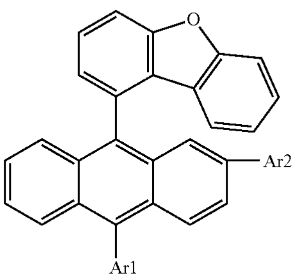 | 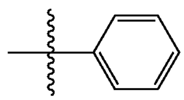 | 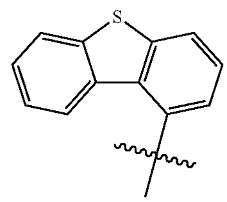 |
| 1-14 | 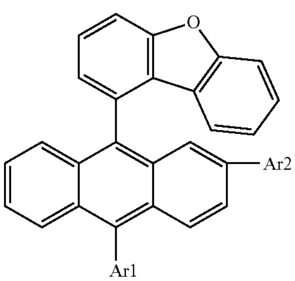 | 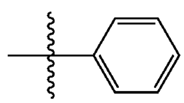 | 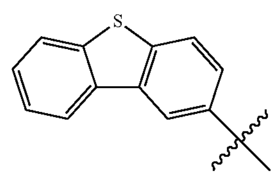 [SMILES: *c1ccc2sc3ccccc3c2c1] |
| 1-15 | 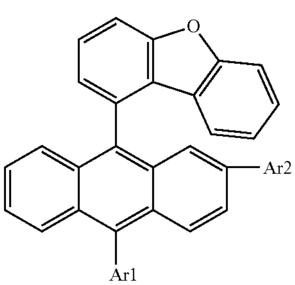 | 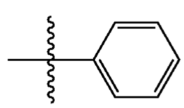 | 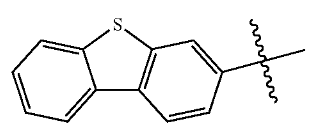 [SMILES: *c1ccc2c(c1)sc1ccccc12] |

-continued
| No. | | Ar1 | Ar2 |
|---|---|---|---|
| 1-16 | 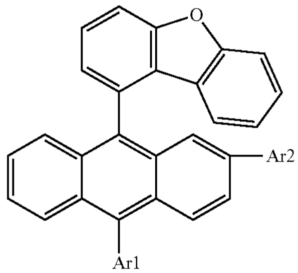 | 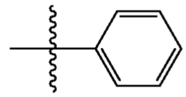 [SMILES: *c1ccccc1] | 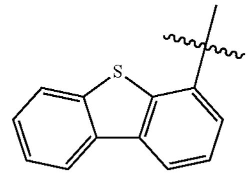 |
| 1-22 | 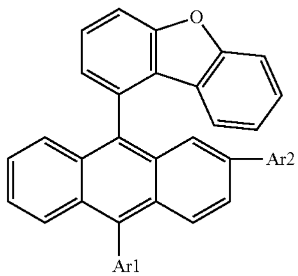 | 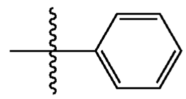 | 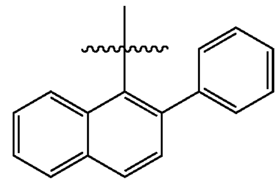 [SMILES: *c1c(-c2ccccc2)ccc2ccccc12] |
| 1-23 | 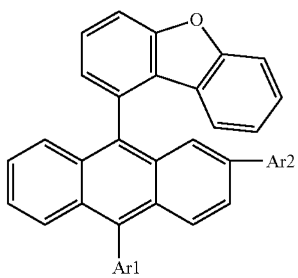 | 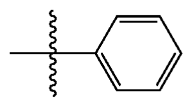 [SMILES: *c1ccccc1] | 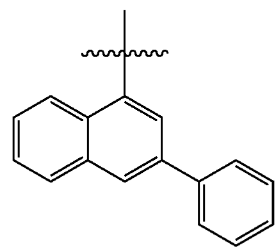 [SMILES: *c1cc(-c2ccccc2)cc2ccccc12] |
| 1-24 | 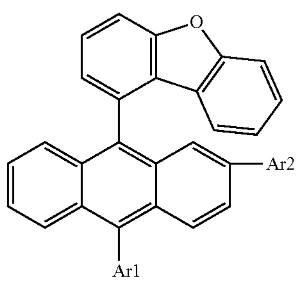 | 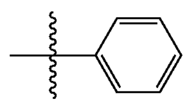 [SMILES: *c1ccccc1] | 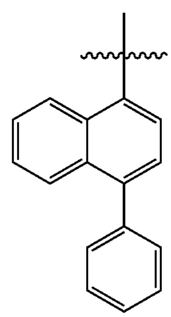 [SMILES: *c1ccc(-c2ccccc2)c2ccccc12] |
| 1-25 | 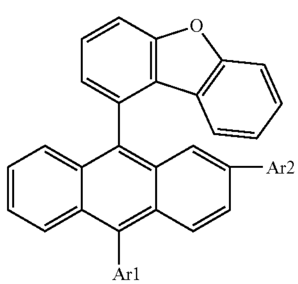 | 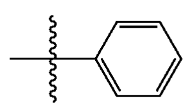 | 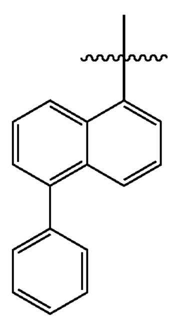 [SMILES: *c1cccc2c(-c3ccccc3)cccc12] |

-continued
| No. | | Ar1 | Ar2 |
| --- | --- | --- | --- |
| 1-26 | 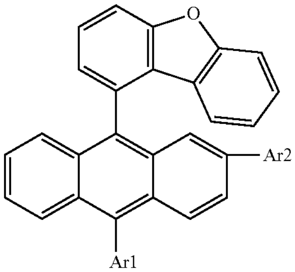 | 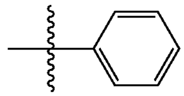 [SMILES: *c1ccccc1] | 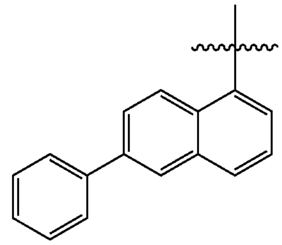 [SMILES: *c1cccc2cc(-c3ccccc3)ccc12] |
| 1-27 | 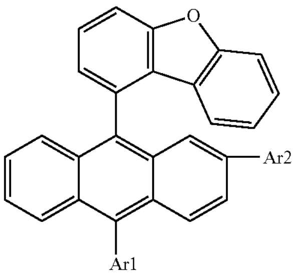 | 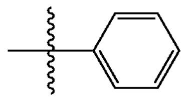 [SMILES: *c1ccccc1] | 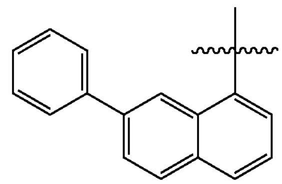 [SMILES: *c1cccc2ccc(-c3ccccc3)cc12] |
| 1-28 | 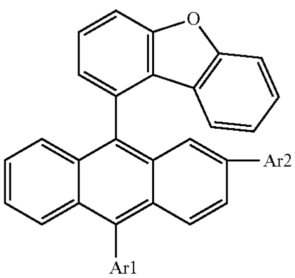 | 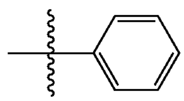 | 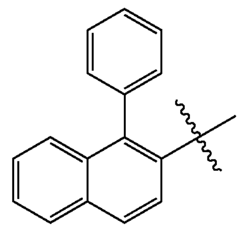 [SMILES: *c1ccc2ccccc2c1-c1ccccc1] |
| 1-29 | 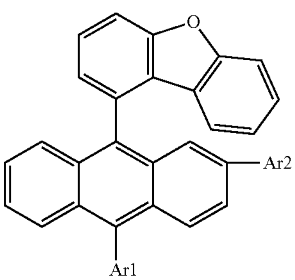 | 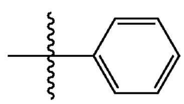 | 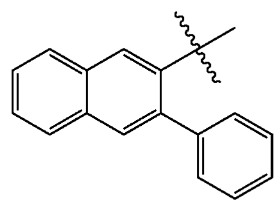 [SMILES: *c1cc2ccccc2cc1-c1ccccc1] |
| 1-30 | 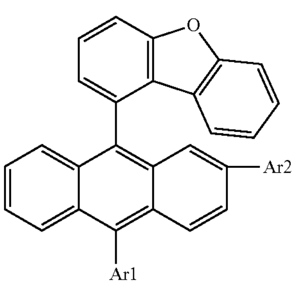 | 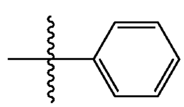 [SMILES: *c1ccccc1] | 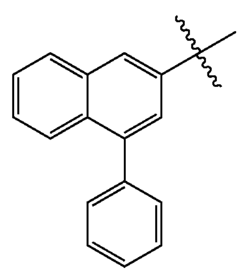 [SMILES: *c1cc(-c2ccccc2)c2ccccc2c1] |

-continued
| No. | | Ar1 | Ar2 |
|---|---|---|---|
| 1-31 | 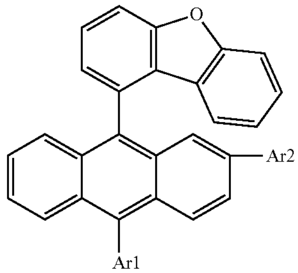 | 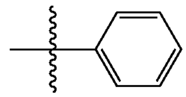 | 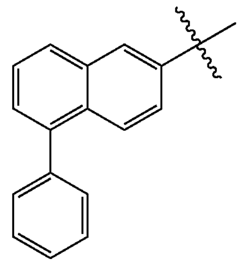 [SMILES: *c1ccc2c(-c3ccccc3)cccc2c1] |
| 1-32 | 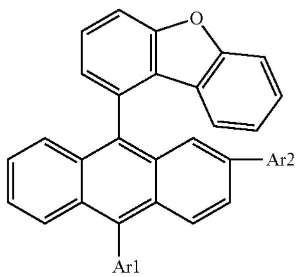 | 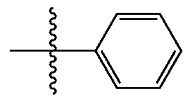 | 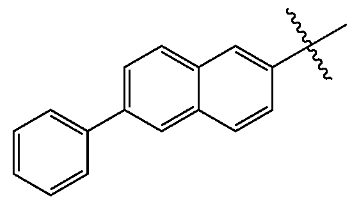 [SMILES: *c1ccc2cc(-c3ccccc3)ccc2c1] |
| 1-33 | 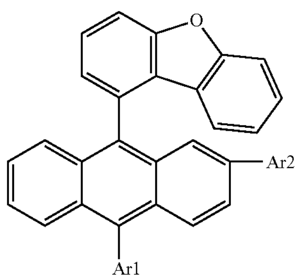 | 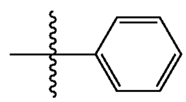 | 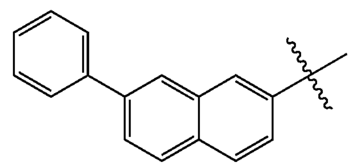 [SMILES: *c1ccc2ccc(-c3ccccc3)cc2c1] |
| 1-34 | 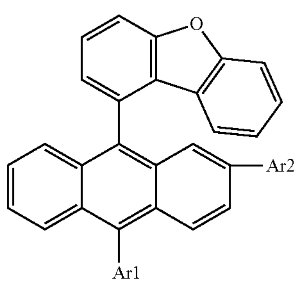 | 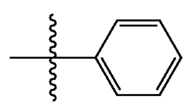 [SMILES: *c1ccccc1] | 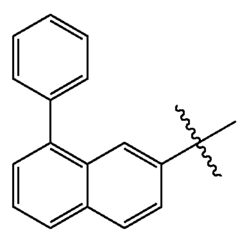 [SMILES: *c1ccc2cccc(-c3ccccc3)c2c1] |
| 1-35 | 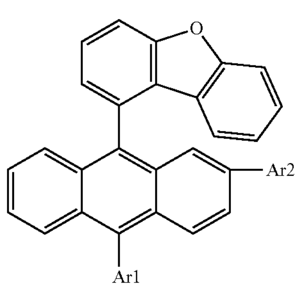 | 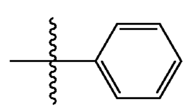 | 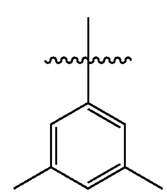 |

-continued
| No. | | Ar1 | Ar2 |
|---|---|---|---|
| 1-36 | 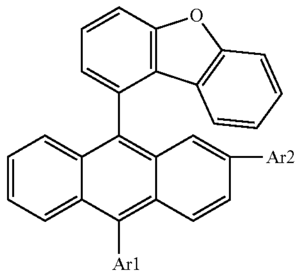 | 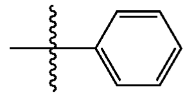 [SMILES: *c1ccccc1] | 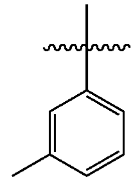 [SMILES: *c1cccc(C)c1] |
| 1-37 | 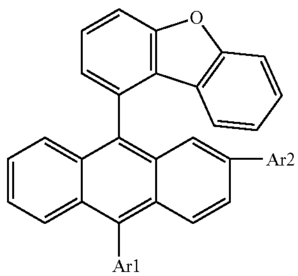 | 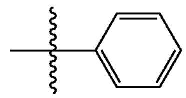 [SMILES: *c1ccccc1] | 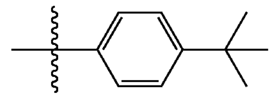 [SMILES: *c1ccc(C(C)(C)C)cc1] |
| 1-38 | 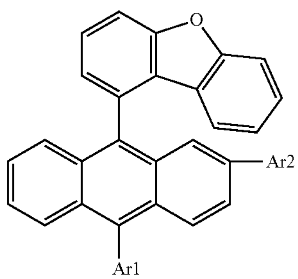 | 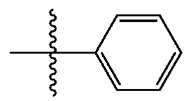 | 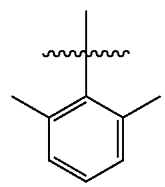 |
| 1-39 | 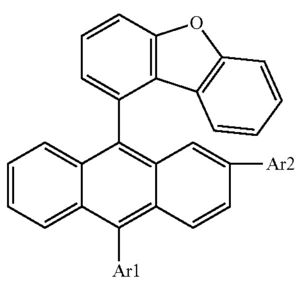 | 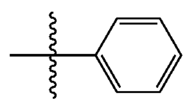 | 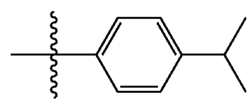 [SMILES: *c1ccc(C(C)C)cc1] |
| 1-40 | 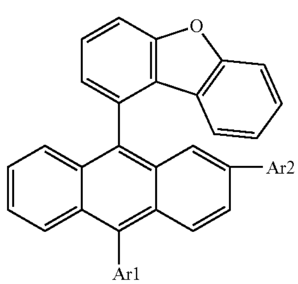 | 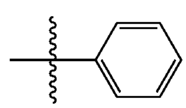 | 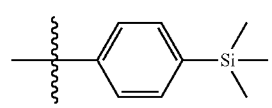 |

-continued
| No. | | Ar1 | Ar2 |
|---|---|---|---|
| 1-41 | 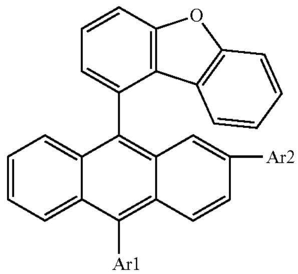 | 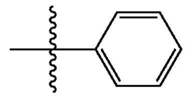 | 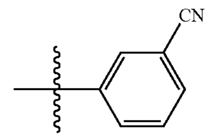 [SMILES: *c1cccc(C#N)c1] |
| 1-42 | 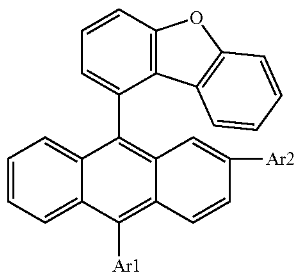 | 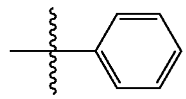 | 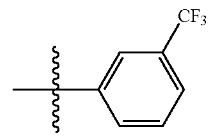 [SMILES: *c1cccc(C(F)(F)F)c1] |
| 1-43 | 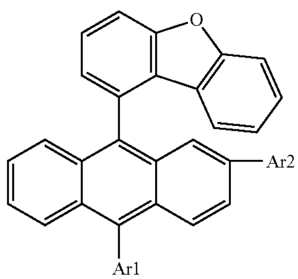 | 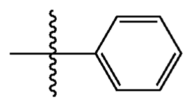 [SMILES: *c1ccccc1] | 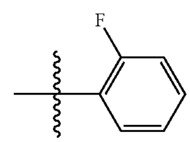 [SMILES: *c1ccccc1F] |
| 1-44 | 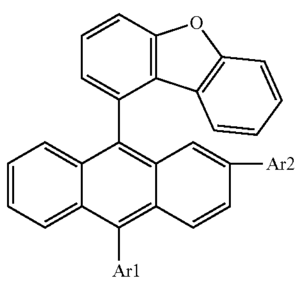 | 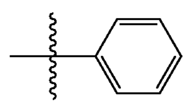 [SMILES: *c1ccccc1] | 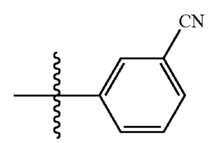 [SMILES: *c1cccc(C#N)c1] |
| 1-45 | 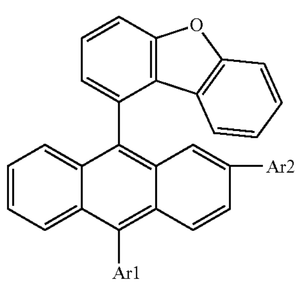 | 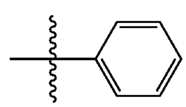 | 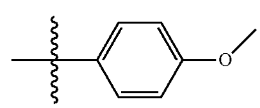 [SMILES: *c1ccc(OC)cc1] |

-continued
| No. | | Ar1 | Ar2 |
|---|---|---|---|
| 1-46 | 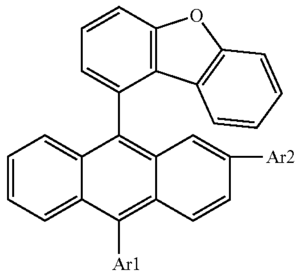 | 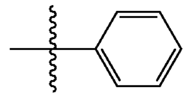 | 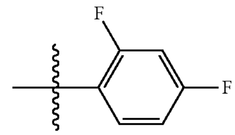 [SMILES: *c1ccc(F)cc1F] |
| 2-1 | 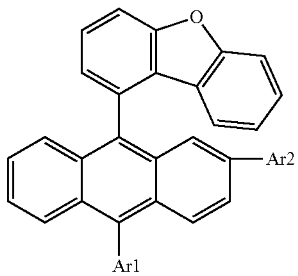 | 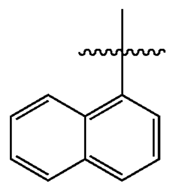 [SMILES: *c1cccc2ccccc12] | 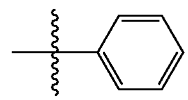 [SMILES: *c1ccccc1] |
| 2-2 | 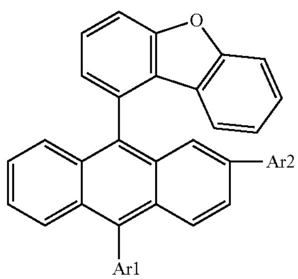 | 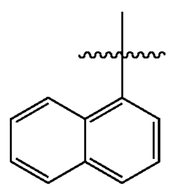 [SMILES: *c1cccc2ccccc12] | 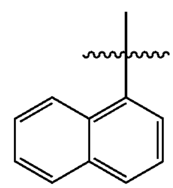 [SMILES: *c1cccc2ccccc12] |
| 2-3 | 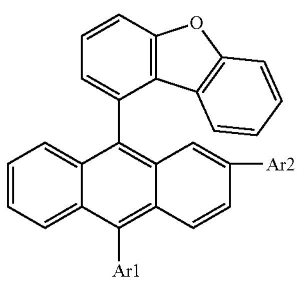 | 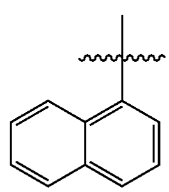 [SMILES: *c1cccc2ccccc12] | 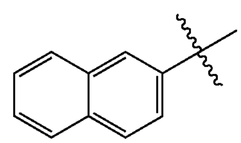 [SMILES: *c1ccc2ccccc2c1] |
| 2-4 | 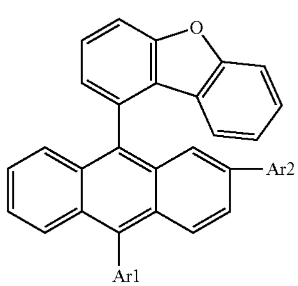 | 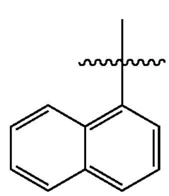 [SMILES: *c1cccc2ccccc12] | 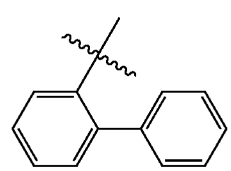 [SMILES: *c1ccccc1-c1ccccc1] |

-continued
| No. | | Ar1 | Ar2 |
|---|---|---|---|
| 2-5 | 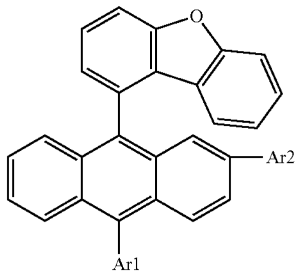 | 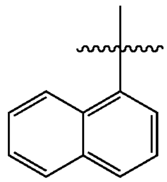 [SMILES: *c1cccc2ccccc12] | 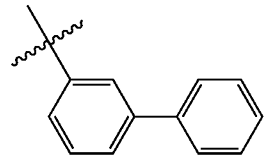 [SMILES: *c1cccc(-c2ccccc2)c1] |
| 2-6 | 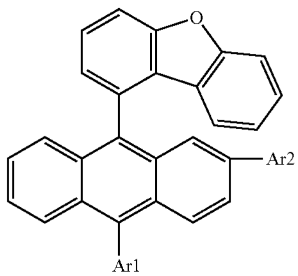 | 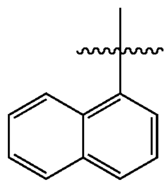 [SMILES: *c1cccc2ccccc12] | 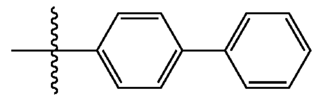 [SMILES: *c1ccc(-c2ccccc2)cc1] |
| 2-7 | 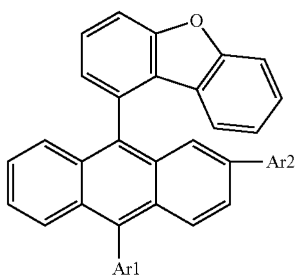 | 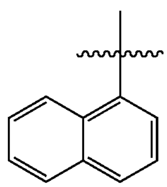 [SMILES: *c1cccc2ccccc12] | 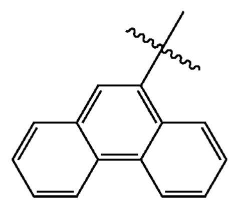 [SMILES: *c1cc2ccccc2c2ccccc12] |
| 2-9 | 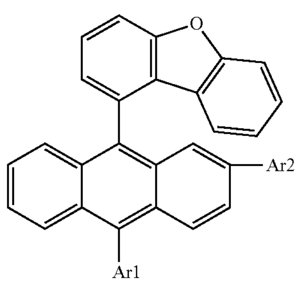 | 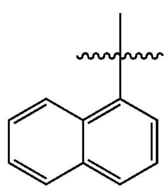 [SMILES: *c1cccc2ccccc12] | 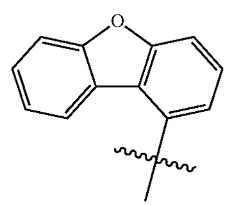 [SMILES: *c1cccc2oc3ccccc3c12] |
| 2-10 | 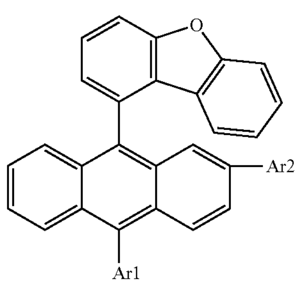 | 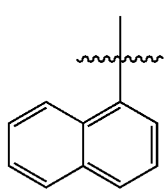 [SMILES: *c1cccc2ccccc12] | 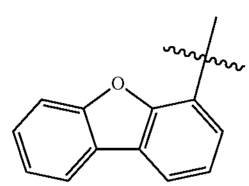 |

-continued
| No. | | Ar1 | Ar2 |
|---|---|---|---|
| 2-11 | 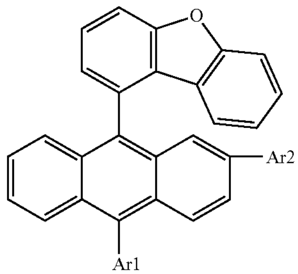 | 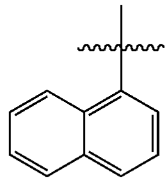 [SMILES: *c1cccc2ccccc12] | 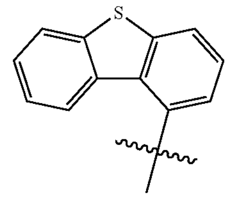 |
| 2-12 | 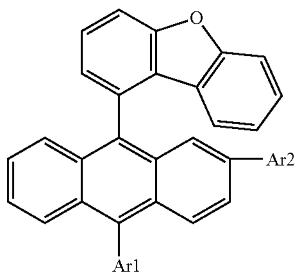 | 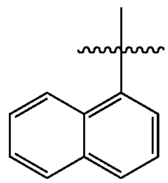 [SMILES: *c1cccc2ccccc12] | 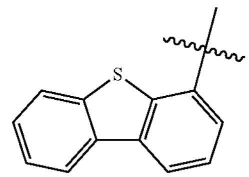 [SMILES: *c1cccc2c1sc1ccccc12] |
| 2-16 | 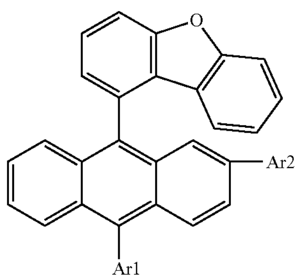 | 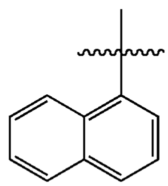 [SMILES: *c1cccc2ccccc12] | 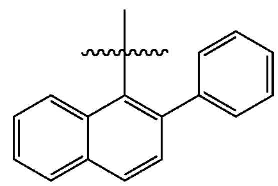 [SMILES: *c1c(-c2ccccc2)ccc2ccccc12] |
| 2-17 | 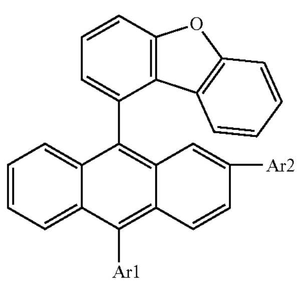 | 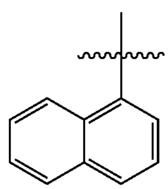 [SMILES: *c1cccc2ccccc12] | 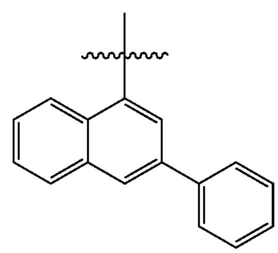 [SMILES: *c1cc(-c2ccccc2)cc2ccccc12] |
| 2-18 | 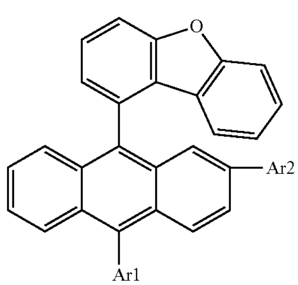 | 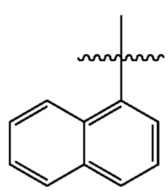 [SMILES: *c1cccc2ccccc12] | 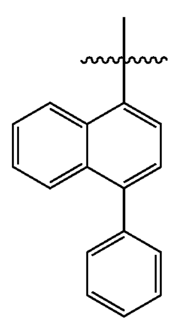 [SMILES: *c1ccc(-c2ccccc2)c2ccccc12] |

-continued
| No. | | Ar1 | Ar2 |
|---|---|---|---|
| 2-19 | 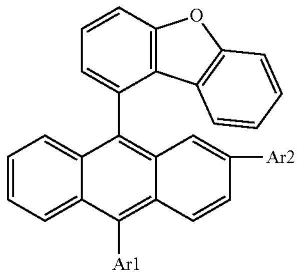 | 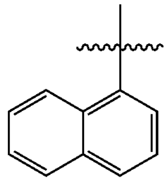 [SMILES: *c1cccc2ccccc12] | 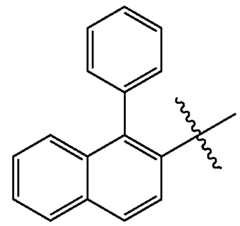 [SMILES: *c1ccc2ccccc2c1-c1ccccc1] |
| 2-20 | 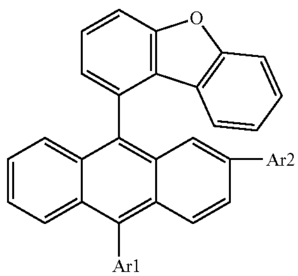 | 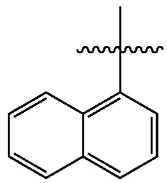 [SMILES: *c1cccc2ccccc12] | 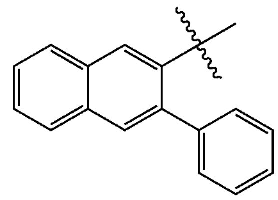 [SMILES: *c1cc2ccccc2cc1-c1ccccc1] |
| 2-21 | 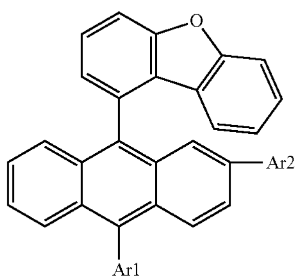 | 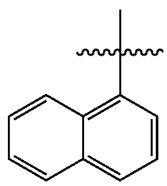 [SMILES: *c1cccc2ccccc12] | 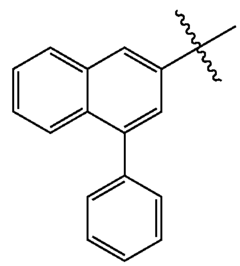 [SMILES: *c1cc(-c2ccccc2)c2ccccc2c1] |
| 2-22 | 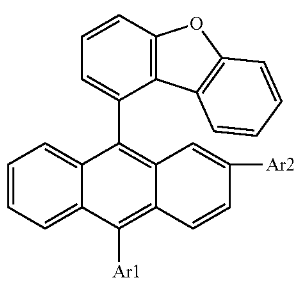 | 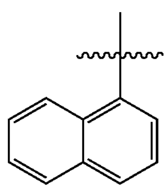 [SMILES: *c1cccc2ccccc12] | 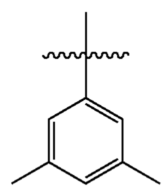 |
| 2-23 | 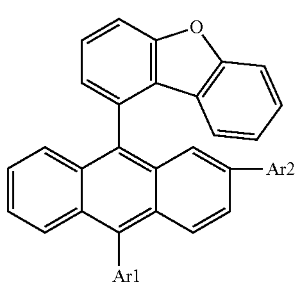 | 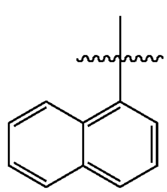 [SMILES: *c1cccc2ccccc12] | 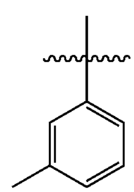 [SMILES: *c1cccc(C)c1] |

-continued
| No. | | Ar1 | Ar2 |
|---|---|---|---|
| 2-24 | 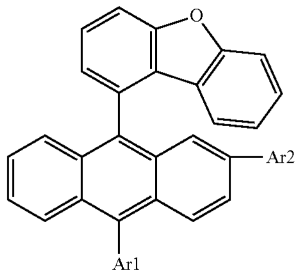 | 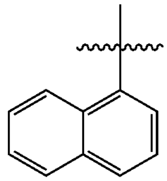 [SMILES: *c1cccc2ccccc12] | 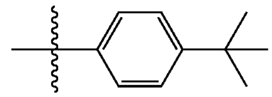 |
| 2-25 | 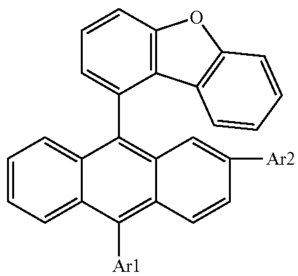 | 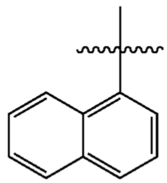 [SMILES: *c1cccc2ccccc12] | 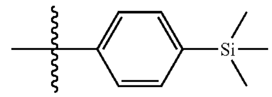 [SMILES: *c1ccc([Si](C)(C)C)cc1] |
| 2-26 | 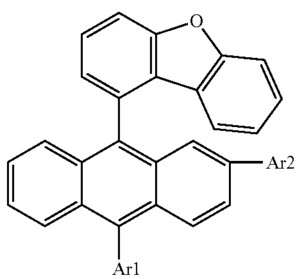 | 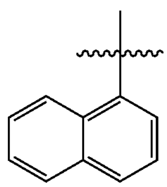 [SMILES: *c1cccc2ccccc12] | 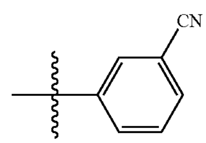 [SMILES: *c1cccc(C#N)c1] |
| 2-27 | 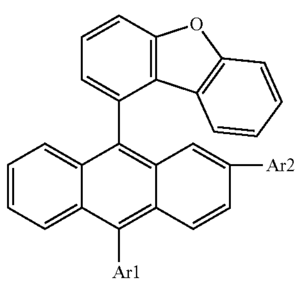 | 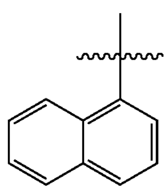 [SMILES: *c1cccc2ccccc12] | 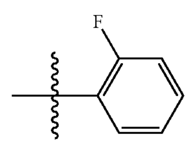 [SMILES: *c1ccccc1F] |
| 2-29 | 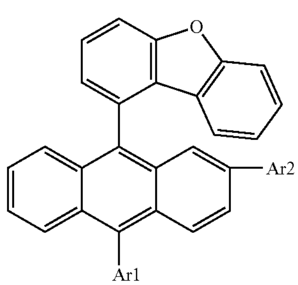 | 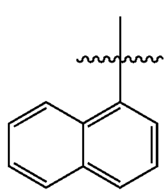 [SMILES: *c1cccc2ccccc12] | 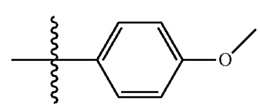 [SMILES: *c1ccc(OC)cc1] |

-continued
| No. | | Ar1 | Ar2 |
|---|---|---|---|
| 3-1 | 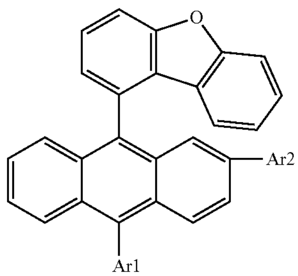 | 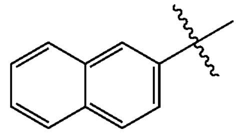 [SMILES: *c1ccc2ccccc2c1] | 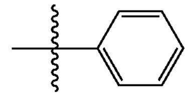 [SMILES: *c1ccccc1] |
| 3-2 | 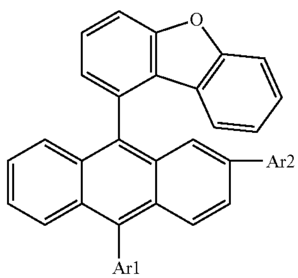 | 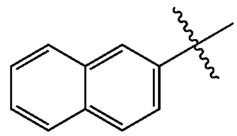 [SMILES: *c1ccc2ccccc2c1] | 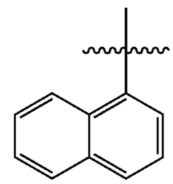 [SMILES: *c1cccc2ccccc12] |
| 3-3 | 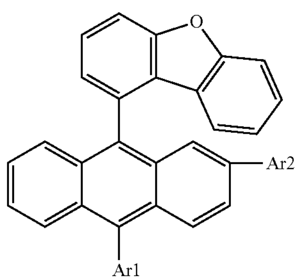 | 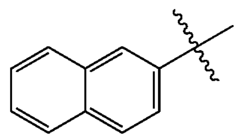 [SMILES: *c1ccc2ccccc2c1] | 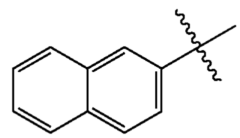 [SMILES: *c1ccc2ccccc2c1] |
| 3-4 | 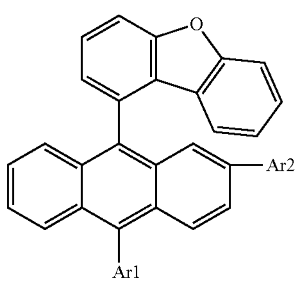 | 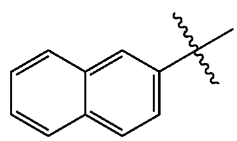 [SMILES: *c1ccc2ccccc2c1] | 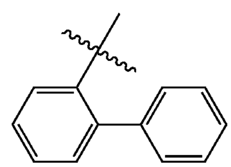 [SMILES: *c1ccccc1-c1ccccc1] |
| 3-5 | 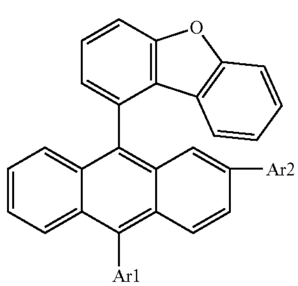 | 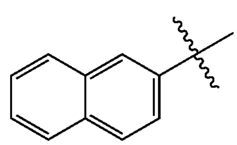 [SMILES: *c1ccc2ccccc2c1] | 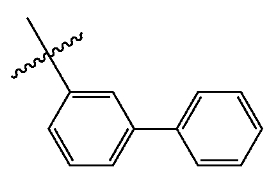 [SMILES: *c1cccc(-c2ccccc2)c1] |

-continued
| No. | | Ar1 | Ar2 |
|---|---|---|---|
| 3-6 | 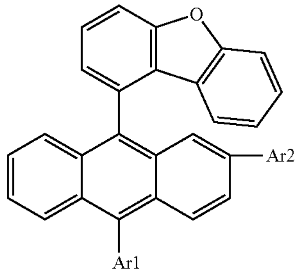 | 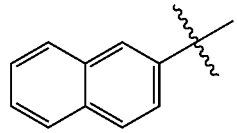 [SMILES: *c1ccc2ccccc2c1] | 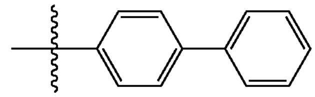 |
| 3-7 | 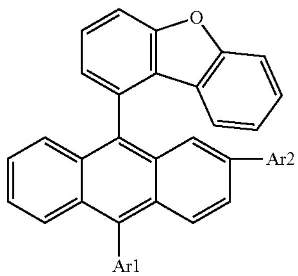 | 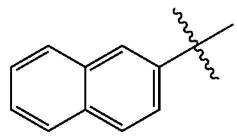 [SMILES: *c1ccc2ccccc2c1] | 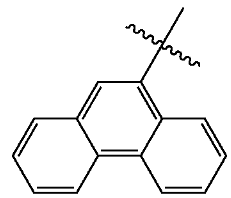 [SMILES: *c1cc2ccccc2c2ccccc12] |
| 3-9 | 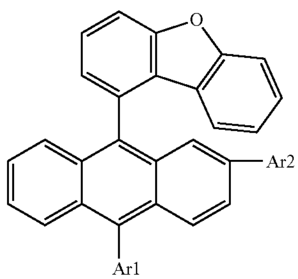 | 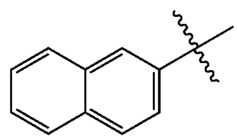 [SMILES: *c1ccc2ccccc2c1] | 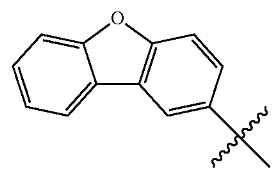 [SMILES: *c1ccc2oc3ccccc3c2c1] |
| 3-10 | 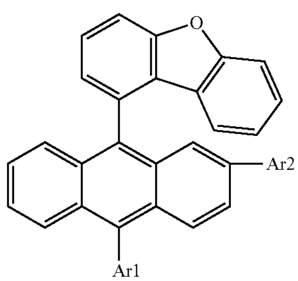 | 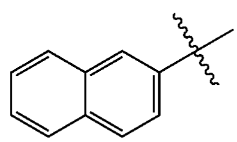 [SMILES: *c1ccc2ccccc2c1] | 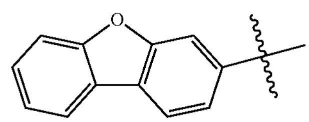 |
| 3-11 | 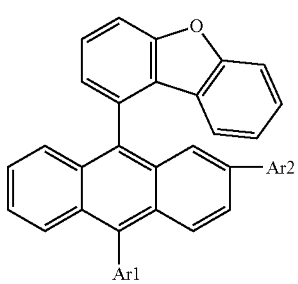 | 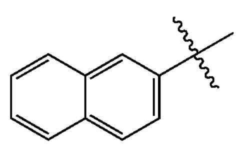 [SMILES: *c1ccc2ccccc2c1] | 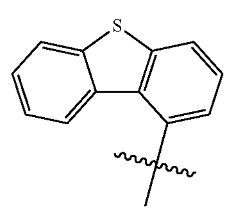 [SMILES: *c1cccc2sc3ccccc3c12] |

-continued
| No. | | Ar1 | Ar2 |
|---|---|---|---|
| 3-12 | 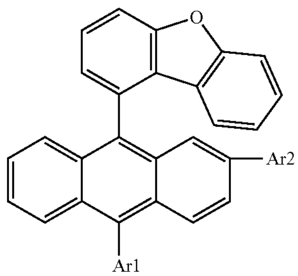 | 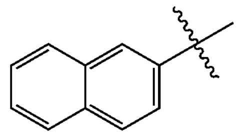 [SMILES: *c1ccc2ccccc2c1] | 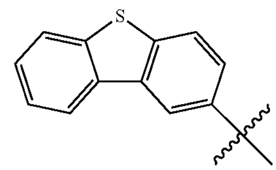 |
| 3-13 | 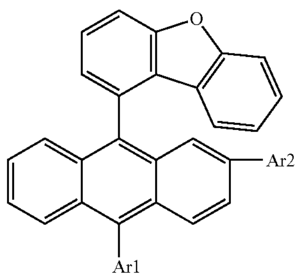 | 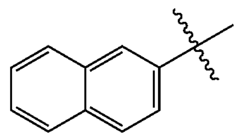 [SMILES: *c1ccc2ccccc2c1] | 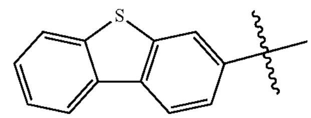 |
| 3-17 | 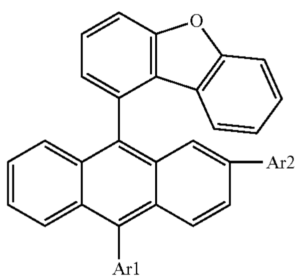 | 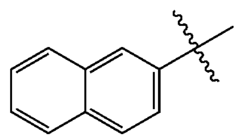 [SMILES: *c1ccc2ccccc2c1] | 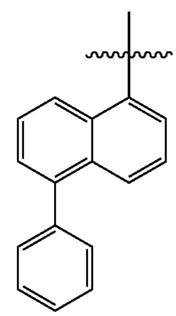 [SMILES: *c1cccc2c(-c3ccccc3)cccc12] |
| 3-18 | 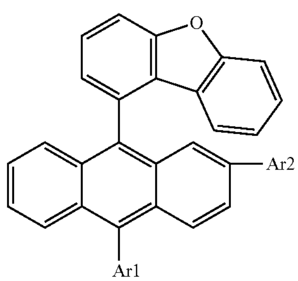 | 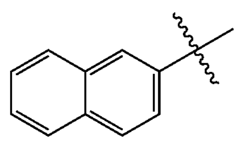 [SMILES: *c1ccc2ccccc2c1] | 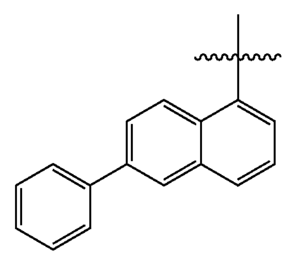 [SMILES: *c1cccc2cc(-c3ccccc3)ccc12] |
| 3-19 | 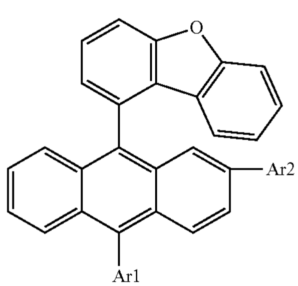 | 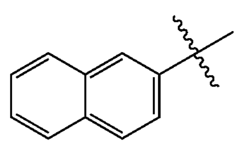 [SMILES: *c1ccc2ccccc2c1] | 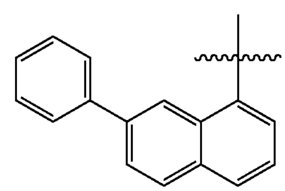 [SMILES: *c1cccc2ccc(-c3ccccc3)cc12] |

-continued
| No. | | Ar1 | Ar2 |
|---|---|---|---|
| 3-20 | 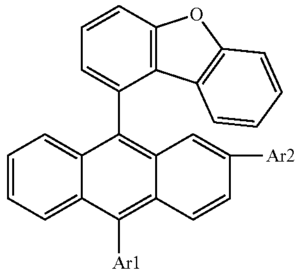 | 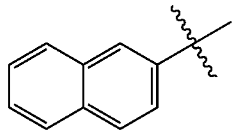 [SMILES: *c1ccc2ccccc2c1] | 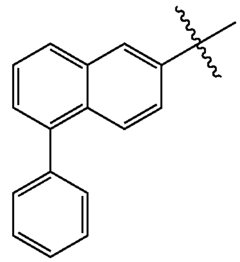 [SMILES: *c1ccc2c(-c3ccccc3)cccc2c1] |
| 3-21 | 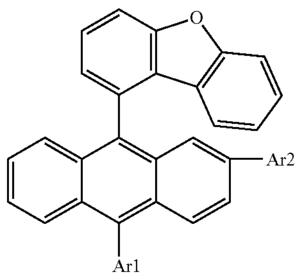 | 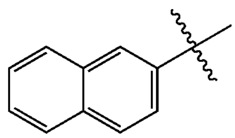 [SMILES: *c1ccc2ccccc2c1] | 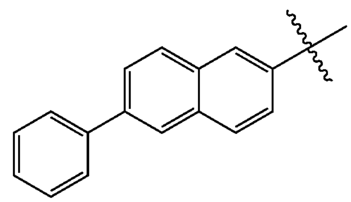 [SMILES: *c1ccc2cc(-c3ccccc3)ccc2c1] |
| 3-22 | 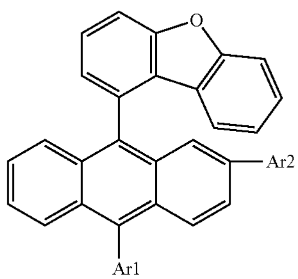 | 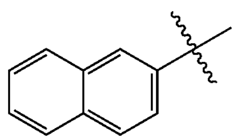 [SMILES: *c1ccc2ccccc2c1] | 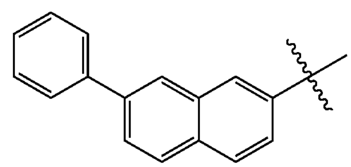 [SMILES: *c1ccc2ccc(-c3ccccc3)cc2c1] |
| 3-23 | 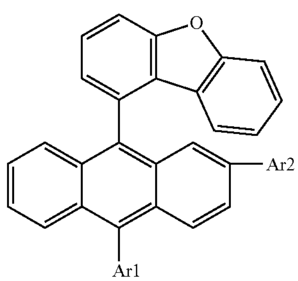 | 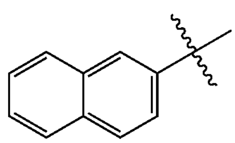 [SMILES: *c1ccc2ccccc2c1] | 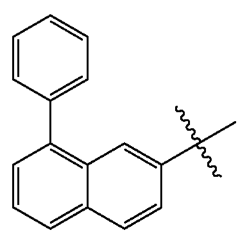 [SMILES: *c1ccc2cccc(-c3ccccc3)c2c1] |
| 3-24 | 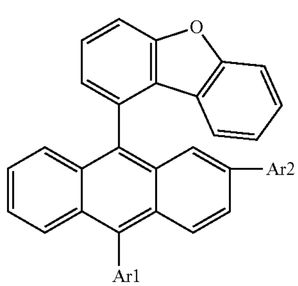 | 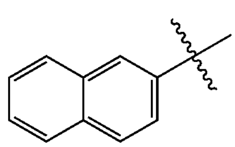 [SMILES: *c1ccc2ccccc2c1] | 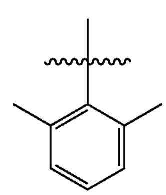 |

-continued
| No. | | Ar1 | Ar2 |
|---|---|---|---|
| 3-25 | 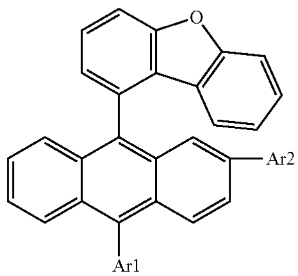 | 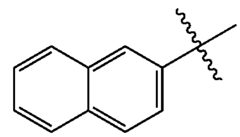 [SMILES: *c1ccc2ccccc2c1] | 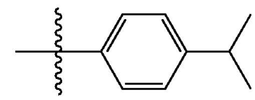 [SMILES: *c1ccc(C(C)C)cc1] |
| 3-26 | 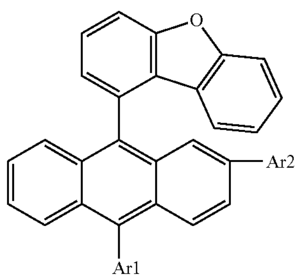 | 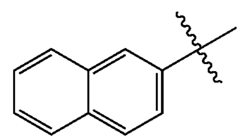 [SMILES: *c1ccc2ccccc2c1] | 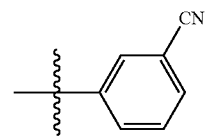 [SMILES: *c1cccc(C#N)c1] |
| 3-27 | 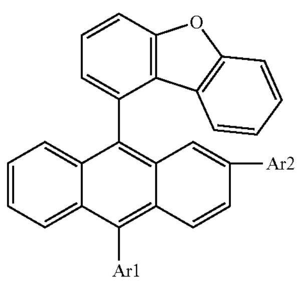 | 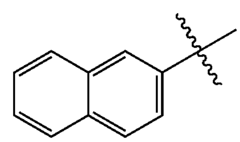 [SMILES: *c1ccc2ccccc2c1] | 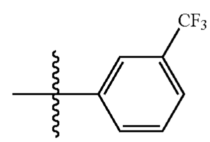 [SMILES: *c1cccc(C(F)(F)F)c1] |
| 3-28 | 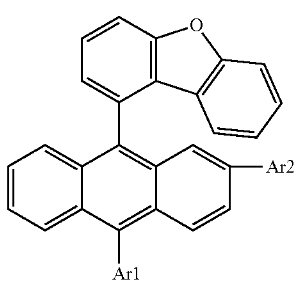 | 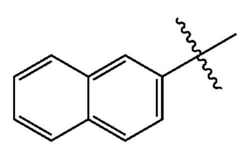 [SMILES: *c1ccc2ccccc2c1] | 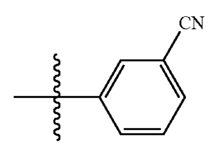 [SMILES: *c1cccc(C#N)c1] |
| 3-29 | 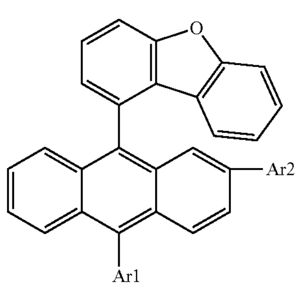 | 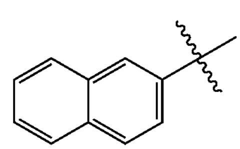 [SMILES: *c1ccc2ccccc2c1] | 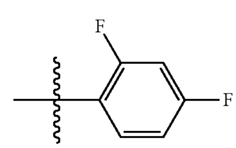 [SMILES: *c1ccc(F)cc1F] |

-continued
| No. | | Ar1 | Ar2 |
|---|---|---|---|
| 4-1 | 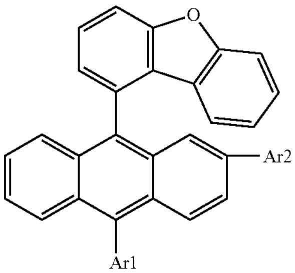 | 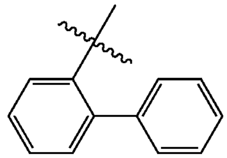 [SMILES: *c1ccccc1-c1ccccc1] | 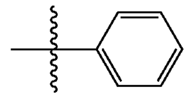 |
| 4-2 | 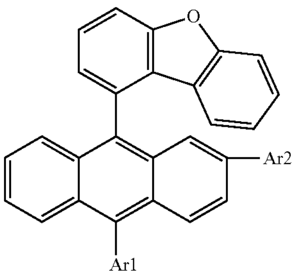 | 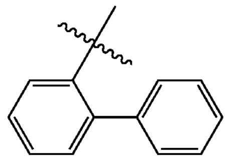 [SMILES: *c1ccccc1-c1ccccc1] | 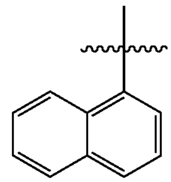 [SMILES: *c1cccc2ccccc12] |
| 4-3 | 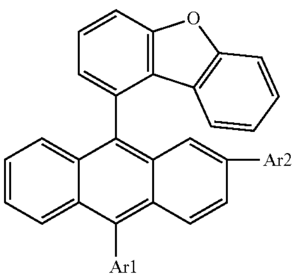 | 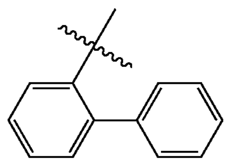 [SMILES: *c1ccccc1-c1ccccc1] | 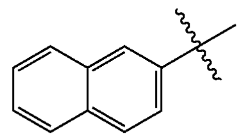 [SMILES: *c1ccc2ccccc2c1] |
| 4-4 | 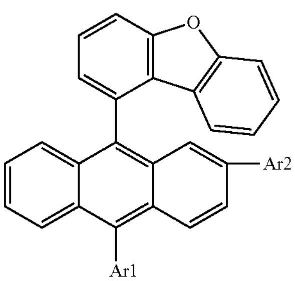 | 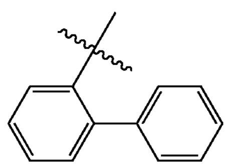 [SMILES: *c1ccccc1-c1ccccc1] | 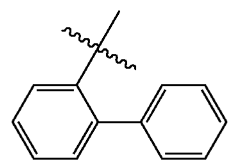 [SMILES: *c1ccccc1-c1ccccc1] |
| 4-5 | 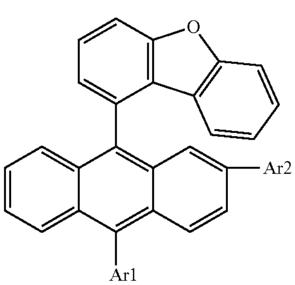 | 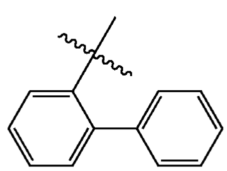 [SMILES: *c1ccccc1-c1ccccc1] | 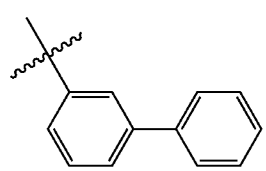 [SMILES: *c1cccc(-c2ccccc2)c1] |

-continued
| No. | | Ar1 | Ar2 |
|---|---|---|---|
| 4-6 | 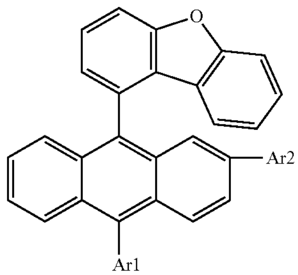 | 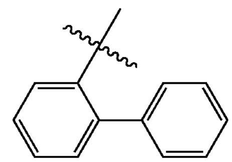 [SMILES: *c1ccccc1-c1ccccc1] | 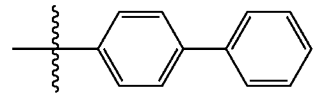 [SMILES: *c1ccc(-c2ccccc2)cc1] |
| 4-7 | 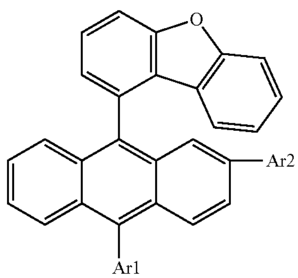 | 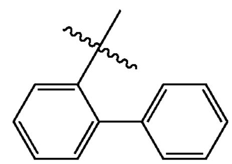 [SMILES: *c1ccccc1-c1ccccc1] | 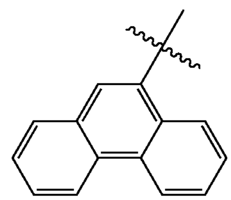 [SMILES: *c1cc2ccccc2c2ccccc12] |
| 4-9 | 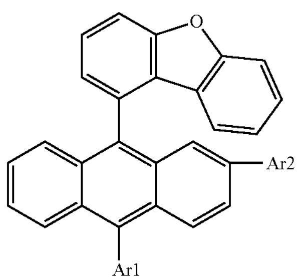 | 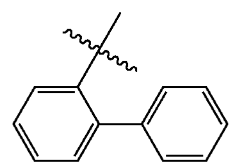 [SMILES: *c1ccccc1-c1ccccc1] | 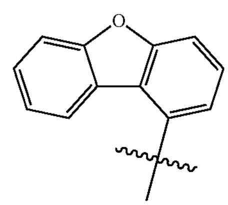 [SMILES: *c1cccc2oc3ccccc3c12] |
| 4-10 | 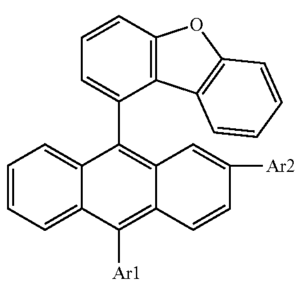 | 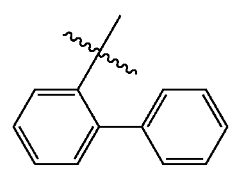 [SMILES: *c1ccccc1-c1ccccc1] | 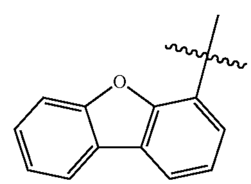 [SMILES: *c1cccc2c1oc1ccccc12] |
| 4-11 | 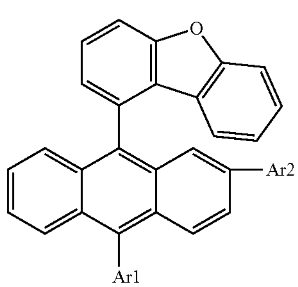 | 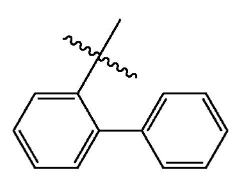 [SMILES: *c1ccccc1-c1ccccc1] | 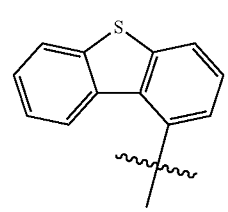 [SMILES: *c1cccc2sc3ccccc3c12] |

-continued
| No. | | Ar1 | Ar2 |
|---|---|---|---|
| 4-12 | 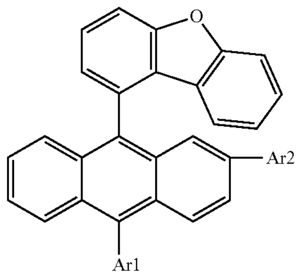 | 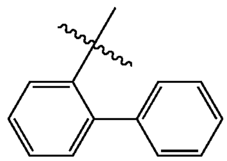 [SMILES: *c1ccccc1-c1ccccc1] | 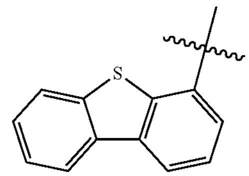 [SMILES: *c1cccc2c1sc1ccccc12] |
| 4-16 | 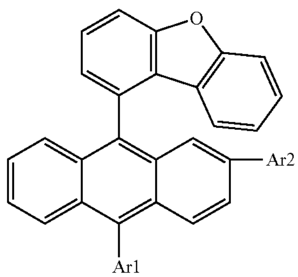 | 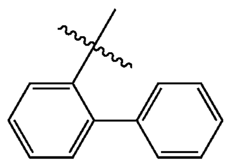 [SMILES: *c1ccccc1-c1ccccc1] | 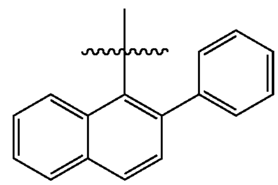 [SMILES: *c1c(-c2ccccc2)ccc2ccccc12] |
| 4-17 | 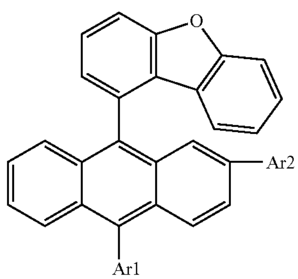 | 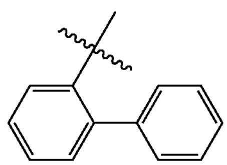 [SMILES: *c1ccccc1-c1ccccc1] | 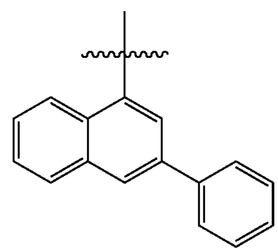 [SMILES: *c1cc(-c2ccccc2)cc2ccccc12] |
| 4-18 | 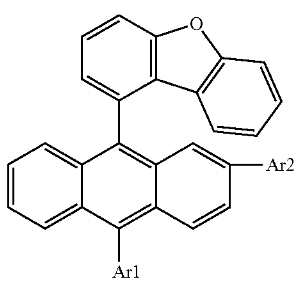 | 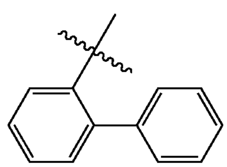 [SMILES: *c1ccccc1-c1ccccc1] | 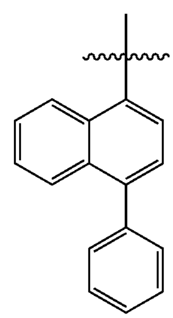 [SMILES: *c1ccc(-c2ccccc2)c2ccccc12] |
| 4-19 | 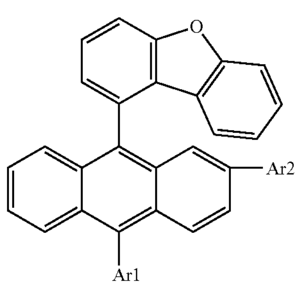 | 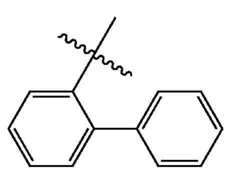 [SMILES: *c1ccccc1-c1ccccc1] | 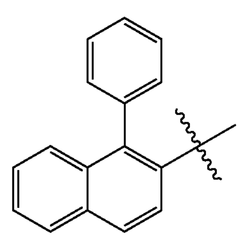 [SMILES: *c1ccc2ccccc2c1-c1ccccc1] |

-continued
| No. | | Ar1 | Ar2 |
|---|---|---|---|
| 4-20 | 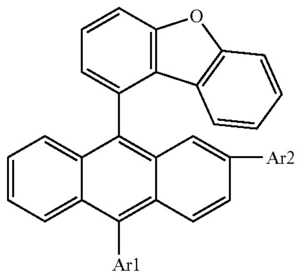 | 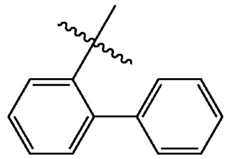 [SMILES: *c1ccccc1-c1ccccc1] | 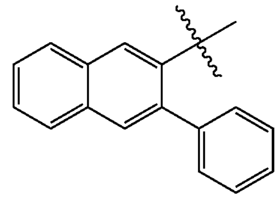 [SMILES: *c1cc2ccccc2cc1-c1ccccc1] |
| 4-21 | 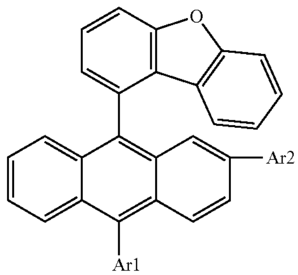 | 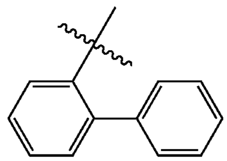 [SMILES: *c1ccccc1-c1ccccc1] | 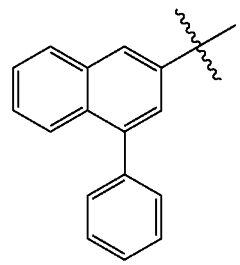 [SMILES: *c1cc(-c2ccccc2)c2ccccc2c1] |
| 4-22 | 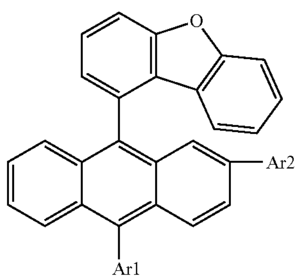 | 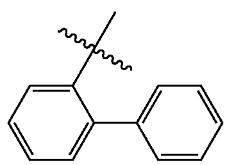 [SMILES: *c1ccccc1-c1ccccc1] | 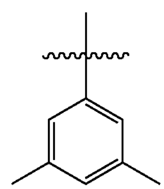 |
| 4-23 | 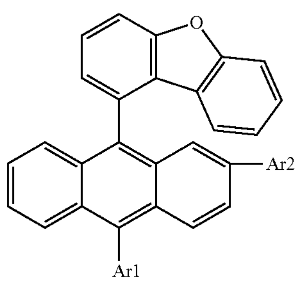 | 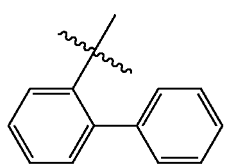 [SMILES: *c1ccccc1-c1ccccc1] | 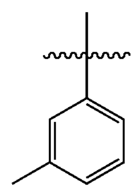 |
| 4-24 | 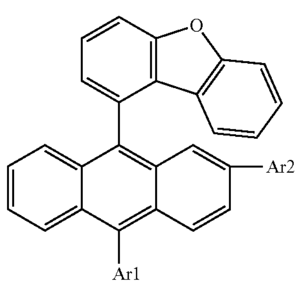 | 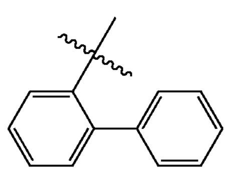 [SMILES: *c1ccccc1-c1ccccc1] | 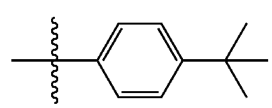 [SMILES: *c1ccc(C(C)(C)C)cc1] |

-continued
| No. | | Ar1 | Ar2 |
|---|---|---|---|
| 4-25 | 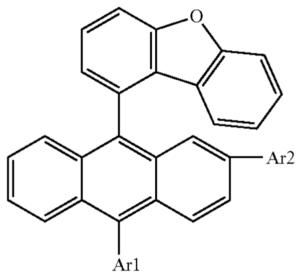 | 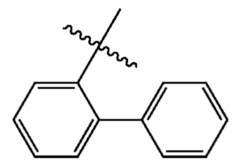 [SMILES: *c1ccccc1-c1ccccc1] | 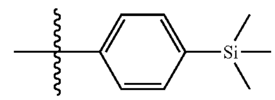 |
| 4-26 | 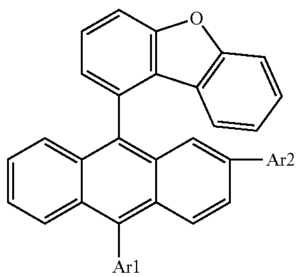 | 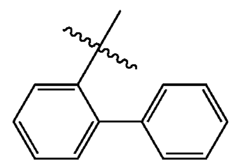 [SMILES: *c1ccccc1-c1ccccc1] | 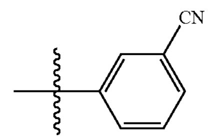 [SMILES: *c1cccc(C#N)c1] |
| 4-27 | 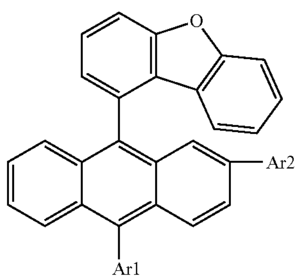 | 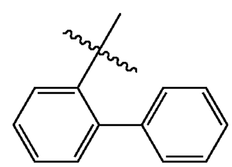 [SMILES: *c1ccccc1-c1ccccc1] | 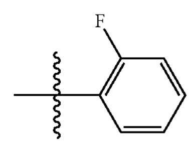 [SMILES: *c1ccccc1F] |
| 4-28 | 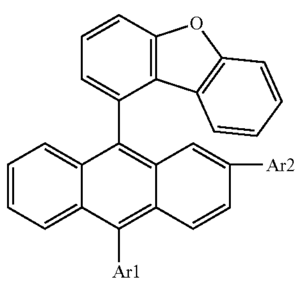 | 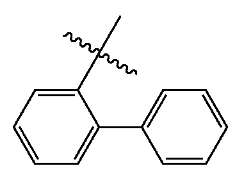 [SMILES: *c1ccccc1-c1ccccc1] | 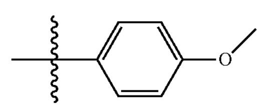 [SMILES: *c1ccc(OC)cc1] |
| 5-1 | 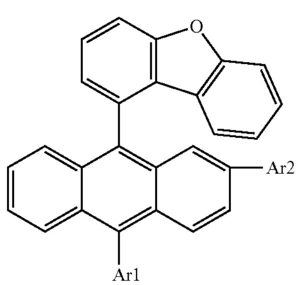 | 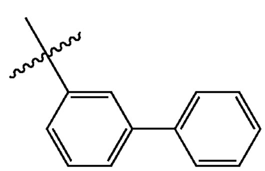 [SMILES: *c1cccc(-c2ccccc2)c1] | 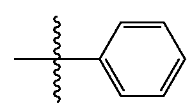 [SMILES: *c1ccccc1] |

-continued
| No. | | Ar1 | Ar2 |
|---|---|---|---|
| 5-2 | 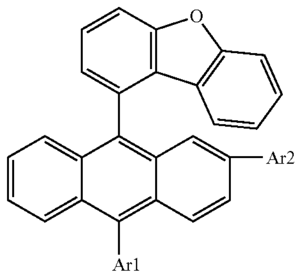 | 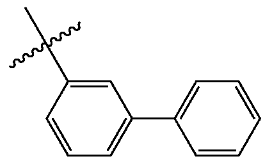 [SMILES: *c1cccc(-c2ccccc2)c1] | 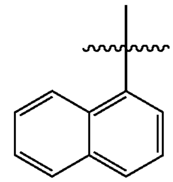 [SMILES: *c1cccc2ccccc12] |
| 5-3 | 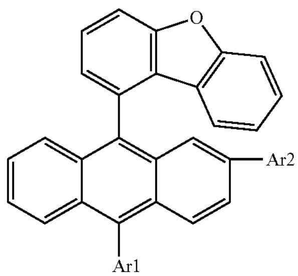 | 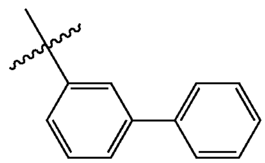 [SMILES: *c1cccc(-c2ccccc2)c1] | 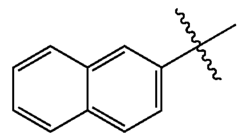 [SMILES: *c1ccc2ccccc2c1] |
| 5-4 | 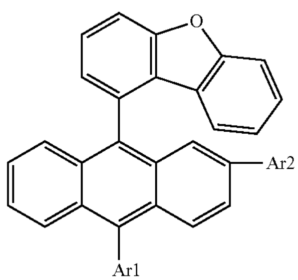 | 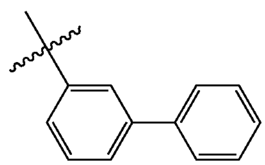 [SMILES: *c1cccc(-c2ccccc2)c1] | 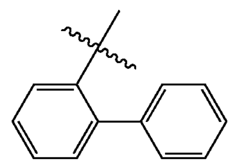 [SMILES: *c1ccccc1-c1ccccc1] |
| 5-5 | 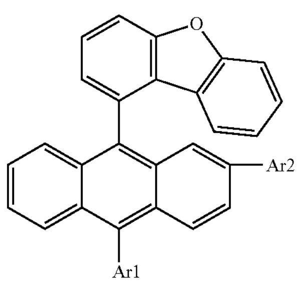 | 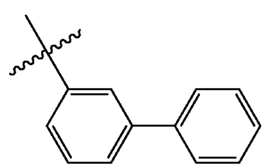 [SMILES: *c1cccc(-c2ccccc2)c1] | 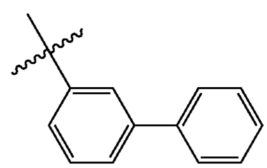 [SMILES: *c1cccc(-c2ccccc2)c1] |
| 5-6 | 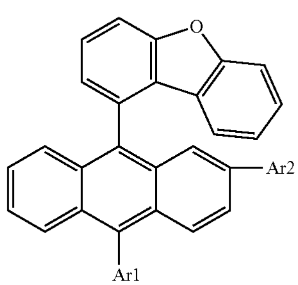 | 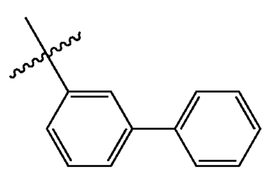 [SMILES: *c1cccc(-c2ccccc2)c1] | 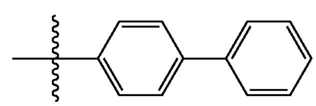 |

-continued
| No. | | Ar1 | Ar2 |
|---|---|---|---|
| 5-7 | 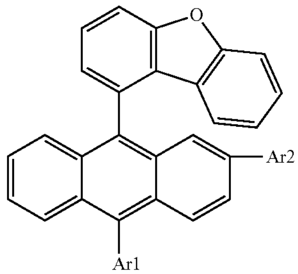 | 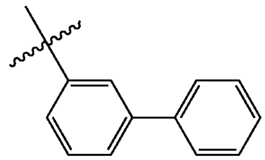 [SMILES: *c1cccc(-c2ccccc2)c1] | 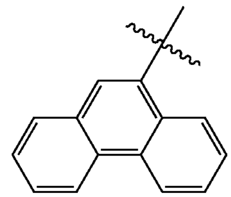 [SMILES: *c1cc2ccccc2c2ccccc12] |
| 5-9 | 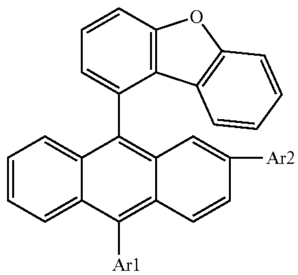 | 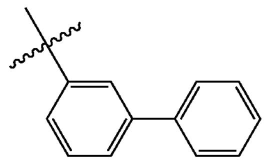 [SMILES: *c1cccc(-c2ccccc2)c1] | 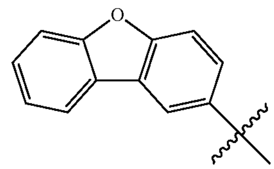 |
| 5-10 | 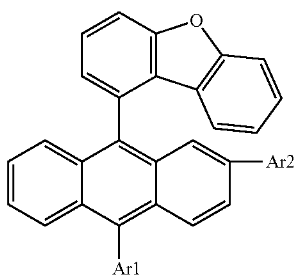 | 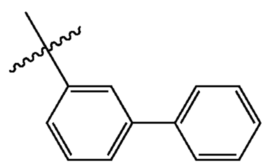 [SMILES: *c1cccc(-c2ccccc2)c1] | 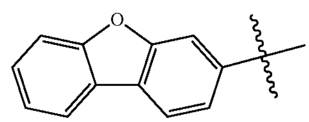 |
| 5-11 | 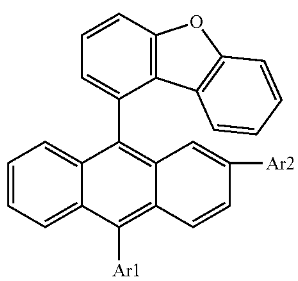 | 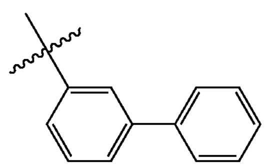 [SMILES: *c1cccc(-c2ccccc2)c1] | 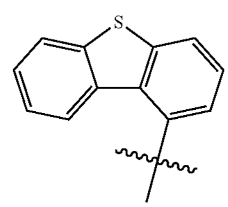 [SMILES: *c1cccc2sc3ccccc3c12] |
| 5-12 | 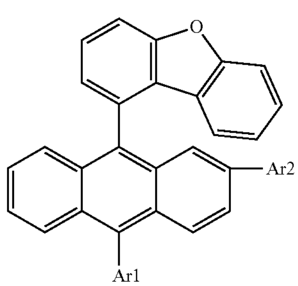 | 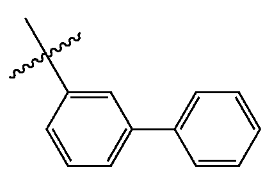 [SMILES: *c1cccc(-c2ccccc2)c1] | 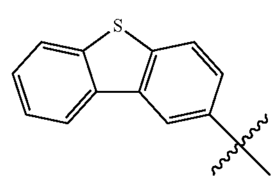 |

-continued
| No. | | Ar1 | Ar2 |
|---|---|---|---|
| 5-13 | 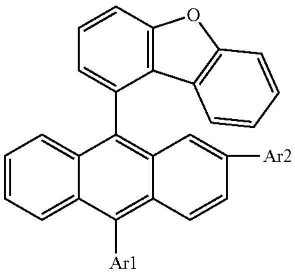 | 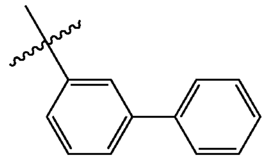 [SMILES: *c1cccc(-c2ccccc2)c1] | 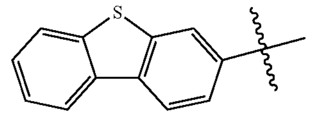 |
| 5-17 | 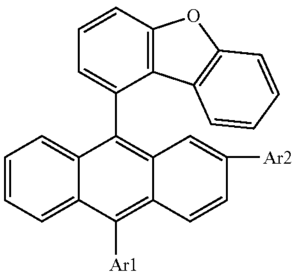 | 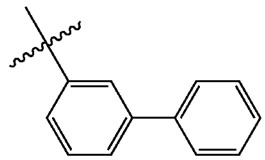 [SMILES: *c1cccc(-c2ccccc2)c1] | 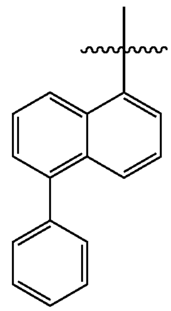 [SMILES: *c1cccc2c(-c3ccccc3)cccc12] |
| 5-18 | 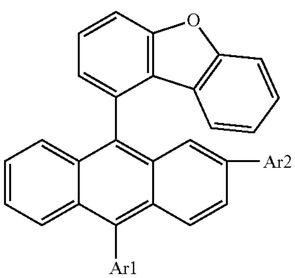 | 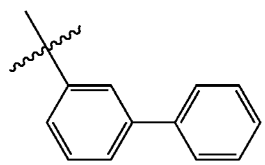 [SMILES: *c1cccc(-c2ccccc2)c1] | 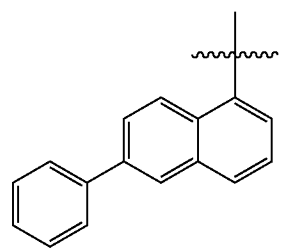 [SMILES: *c1cccc2cc(-c3ccccc3)ccc12] |
| 5-19 | 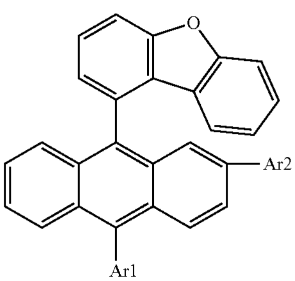 | 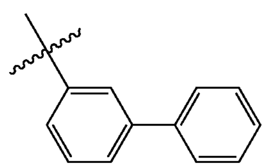 [SMILES: *c1cccc(-c2ccccc2)c1] | 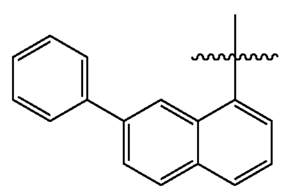 [SMILES: *c1cccc2ccc(-c3ccccc3)cc12] |
| 5-20 | 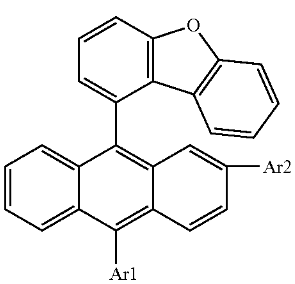 | 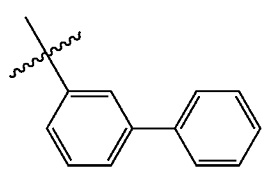 [SMILES: *c1cccc(-c2ccccc2)c1] | 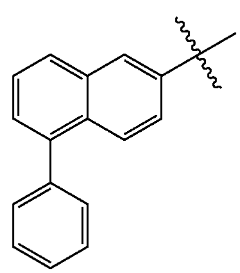 [SMILES: *c1ccc2c(-c3ccccc3)cccc2c1] |

-continued
| No. | | Ar1 | Ar2 |
|---|---|---|---|
| 5-21 | 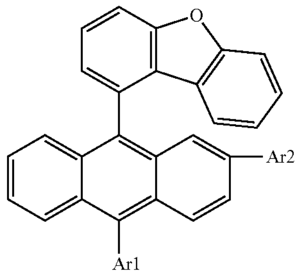 | 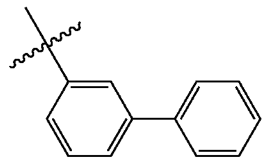 [SMILES: *c1cccc(-c2ccccc2)c1] | 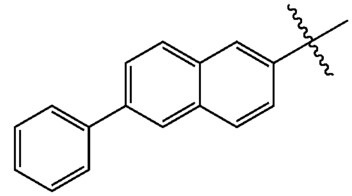 [SMILES: *c1ccc2cc(-c3ccccc3)ccc2c1] |
| 5-22 | 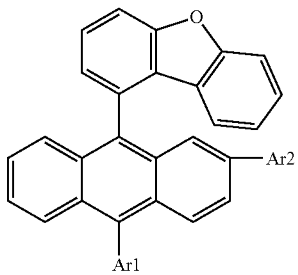 | 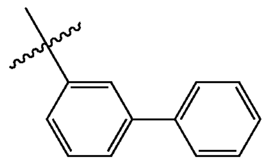 [SMILES: *c1cccc(-c2ccccc2)c1] | 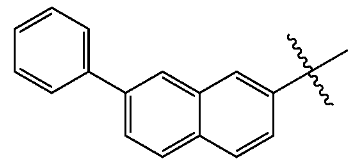 [SMILES: *c1ccc2ccc(-c3ccccc3)cc2c1] |
| 5-23 | 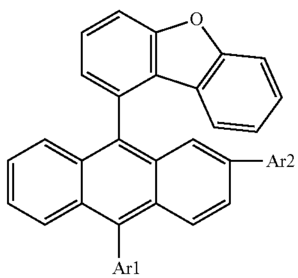 | 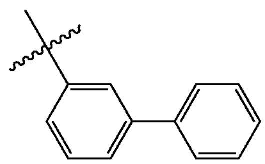 [SMILES: *c1cccc(-c2ccccc2)c1] | 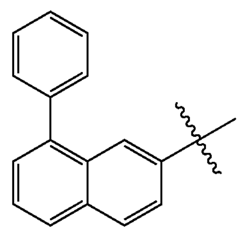 [SMILES: *c1ccc2cccc(-c3ccccc3)c2c1] |
| 5-24 | 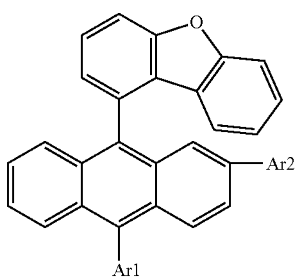 | 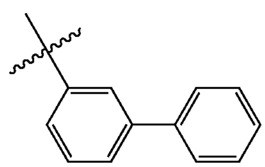 [SMILES: *c1cccc(-c2ccccc2)c1] | 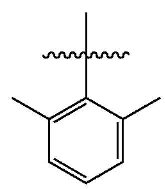 |
| 5-25 | 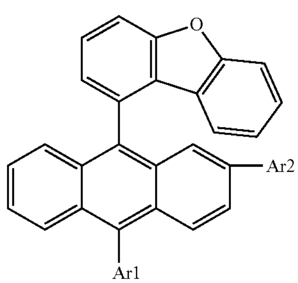 | 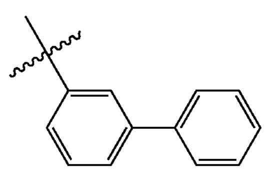 [SMILES: *c1cccc(-c2ccccc2)c1] | 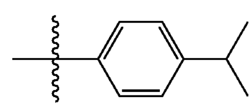 |

-continued
| No. | | Ar1 | Ar2 |
|---|---|---|---|
| 5-26 | 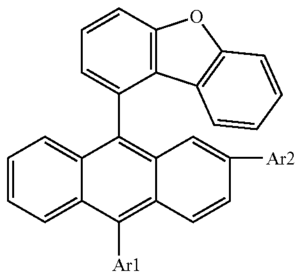 | 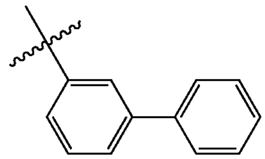 [SMILES: *c1cccc(-c2ccccc2)c1] | 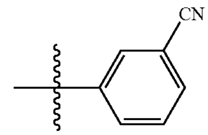 [SMILES: *c1cccc(C#N)c1] |
| 5-27 | 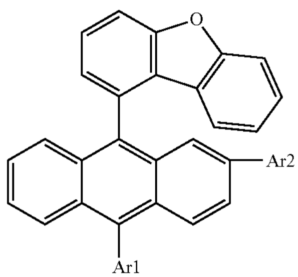 | 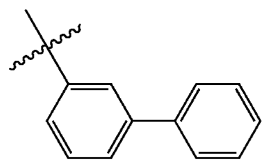 [SMILES: *c1cccc(-c2ccccc2)c1] | 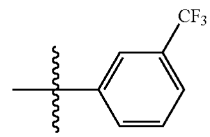 [SMILES: *c1cccc(C(F)(F)F)c1] |
| 5-28 | 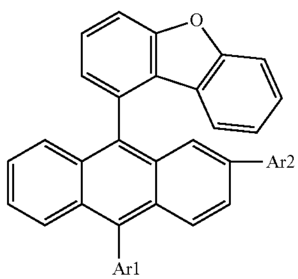 | 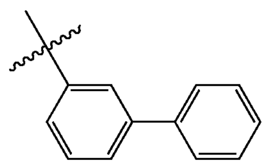 [SMILES: *c1cccc(-c2ccccc2)c1] | 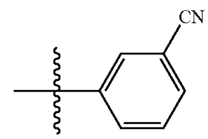 [SMILES: *c1cccc(C#N)c1] |
| 5-29 | 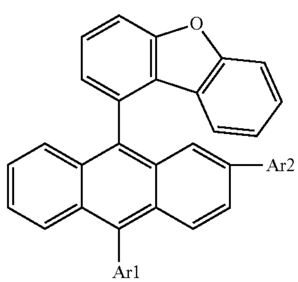 | 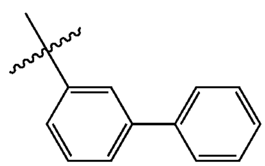 [SMILES: *c1cccc(-c2ccccc2)c1] | 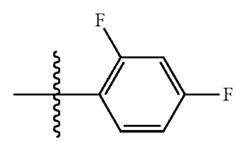 [SMILES: *c1ccc(F)cc1F] |
| 6-1 | 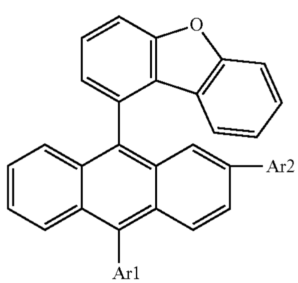 | 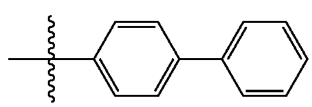 | 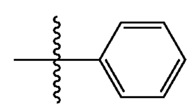 |

-continued
| No. | | Ar1 | Ar2 |
|---|---|---|---|
| 6-2 | 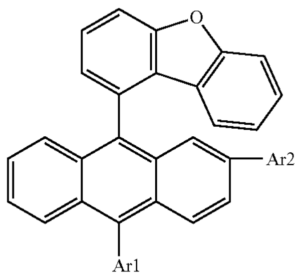 | 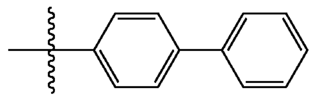 | 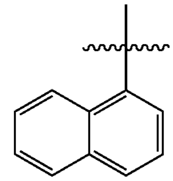 [SMILES: *c1cccc2ccccc12] |
| 6-3 | 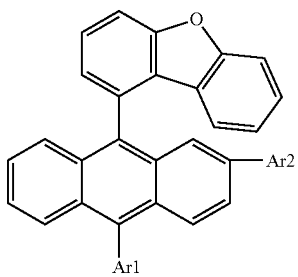 | 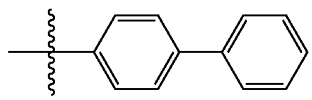 | 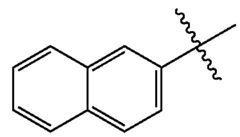 [SMILES: *c1ccc2ccccc2c1] |
| 6-4 | 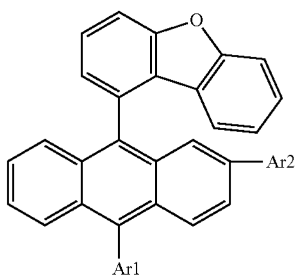 | 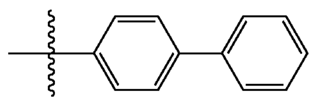 | 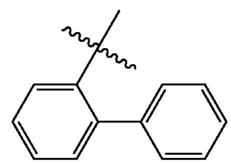 [SMILES: *c1ccccc1-c1ccccc1] |
| 6-5 | 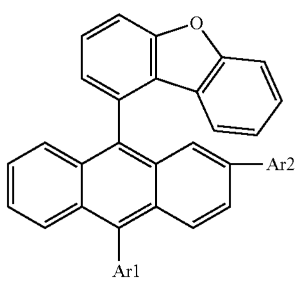 | 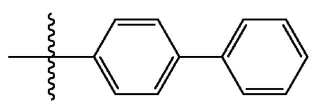 | 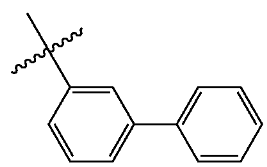 [SMILES: *c1cccc(-c2ccccc2)c1] |
| 6-6 | 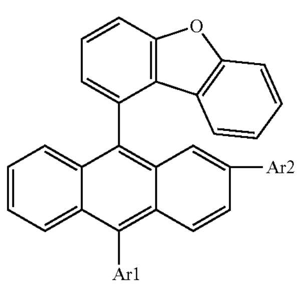 | 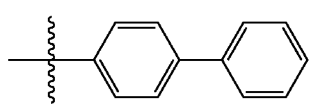 | 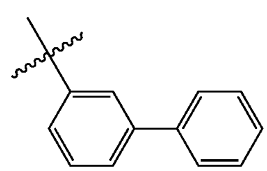 [SMILES: *c1cccc(-c2ccccc2)c1] |

-continued
| No. | | Ar1 | Ar2 |
|---|---|---|---|
| 6-7 | 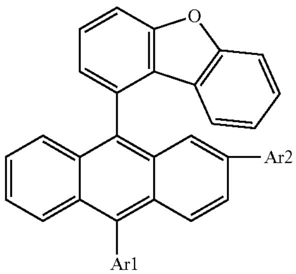 | 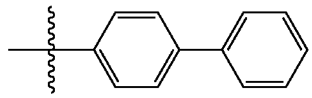 | 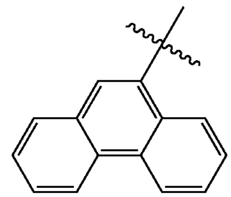 [SMILES: *c1cc2ccccc2c2ccccc12] |
| 6-9 | 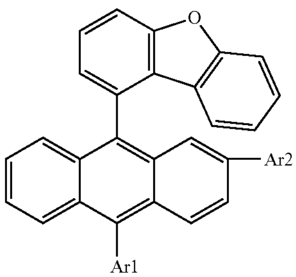 | 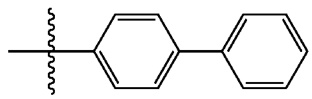 | 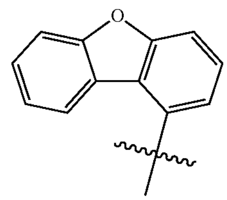 |
| 6-10 | 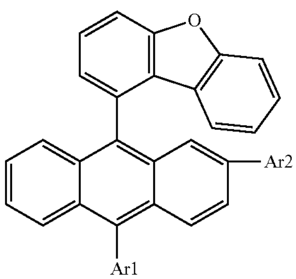 | 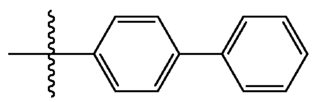 [SMILES: *c1ccc(-c2ccccc2)cc1] | 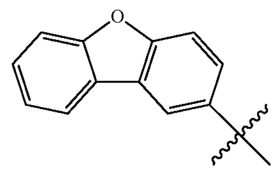 |
| 6-11 | 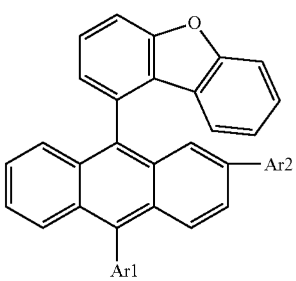 | 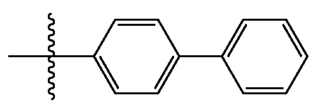 [SMILES: *c1ccc(-c2ccccc2)cc1] | 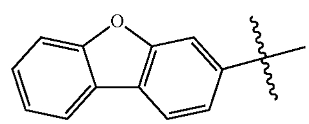 |
| 6-12 | 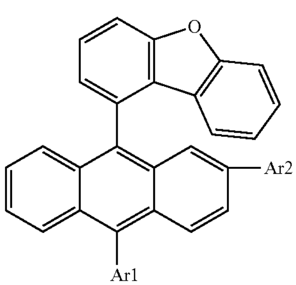 | 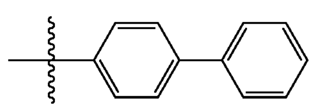 [SMILES: *c1ccc(-c2ccccc2)cc1] | 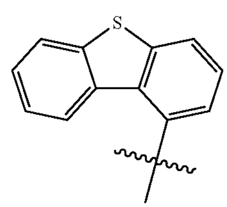 |

-continued
| No. | | Ar1 | Ar2 |
|---|---|---|---|
| 6-13 | 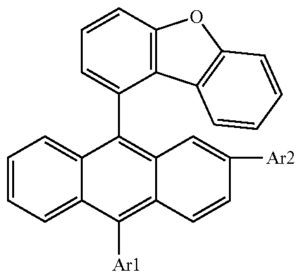 | 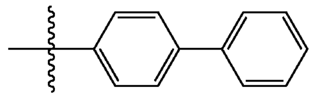 [SMILES: *c1ccc(-c2ccccc2)cc1] | 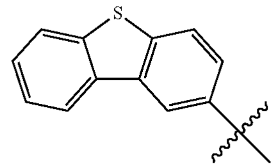 [SMILES: *c1ccc2sc3ccccc3c2c1] |
| 6-14 | 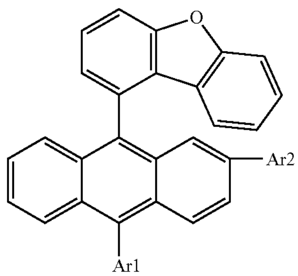 | 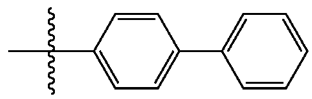 [SMILES: *c1ccc(-c2ccccc2)cc1] | 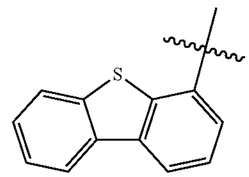 [SMILES: *c1cccc2c1sc1ccccc12] |
| 6-19 | 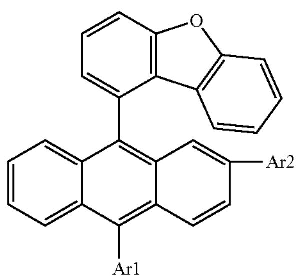 | 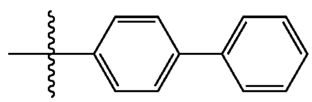 [SMILES: *c1ccc(-c2ccccc2)cc1] | 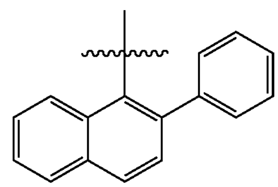 [SMILES: *c1c(-c2ccccc2)ccc2ccccc12] |
| 6-20 | 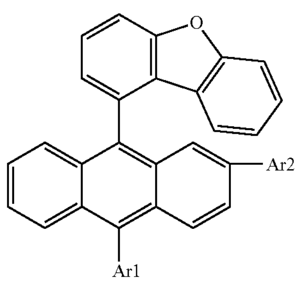 | 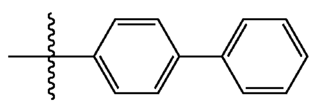 [SMILES: *c1ccc(-c2ccccc2)cc1] | 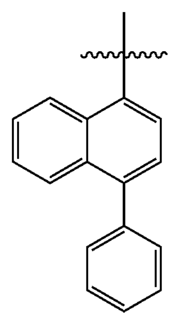 [SMILES: *c1ccc(-c2ccccc2)c2ccccc12] |
| 6-21 | 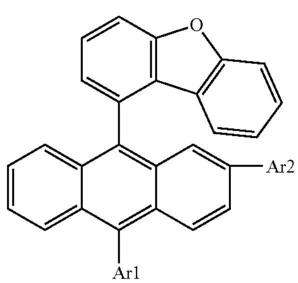 | 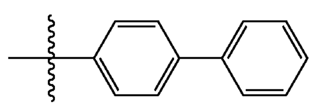 [SMILES: *c1ccc(-c2ccccc2)cc1] | 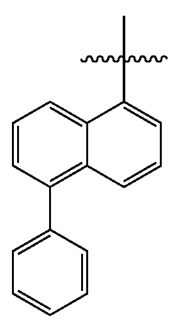 [SMILES: *c1cccc2c(-c3ccccc3)cccc12] |

-continued
| No. | | Ar1 | Ar2 |
|---|---|---|---|
| 6-22 | 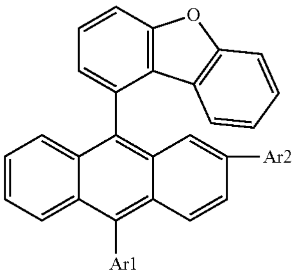 | 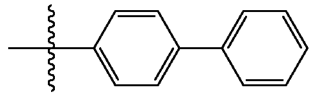 [SMILES: *c1ccc(-c2ccccc2)cc1] | 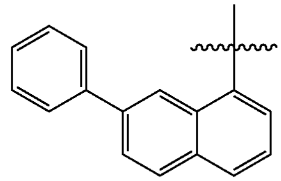 [SMILES: *c1cccc2ccc(-c3ccccc3)cc12] |
| 6-23 | 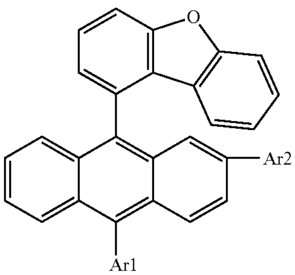 | 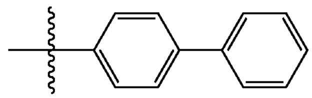 [SMILES: *c1ccc(-c2ccccc2)cc1] | 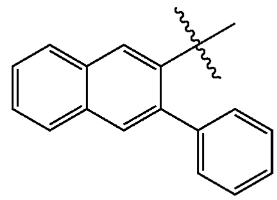 [SMILES: *c1cc2ccccc2cc1-c1ccccc1] |
| 6-24 | 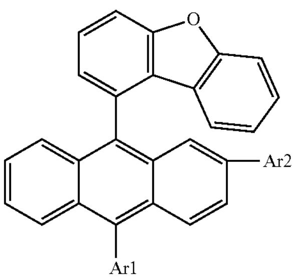 | 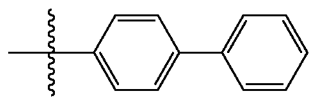 [SMILES: *c1ccc(-c2ccccc2)cc1] | 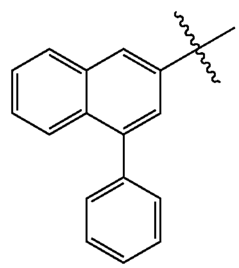 [SMILES: *c1cc(-c2ccccc2)c2ccccc2c1] |
| 6-25 | 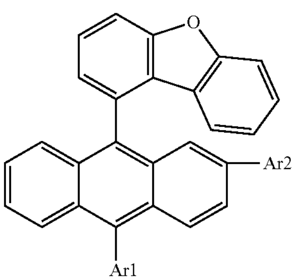 | 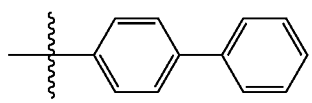 | 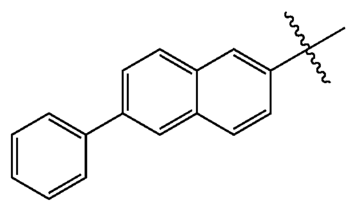 [SMILES: *c1ccc2cc(-c3ccccc3)ccc2c1] |
| 6-26 | 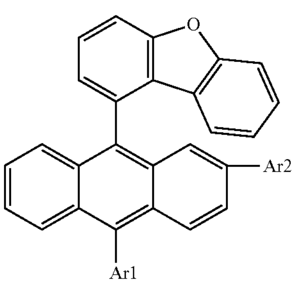 | 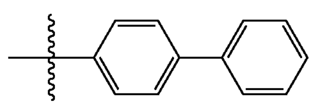 [SMILES: *c1ccc(-c2ccccc2)cc1] | 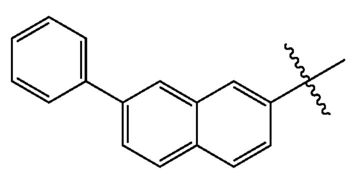 [SMILES: *c1ccc2ccc(-c3ccccc3)cc2c1] |

-continued
| No. | | Ar1 | Ar2 |
|---|---|---|---|
| 6-27 | 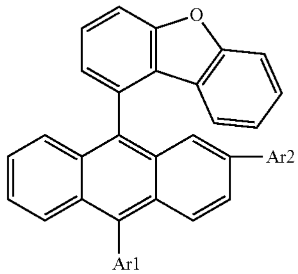 | 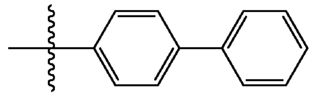 [SMILES: *c1ccc(-c2ccccc2)cc1] | 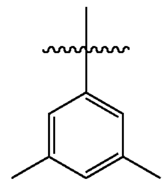 |
| 6-28 | 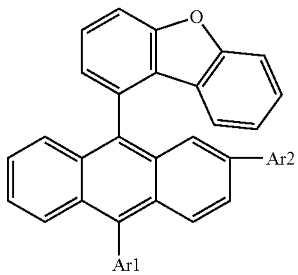 | 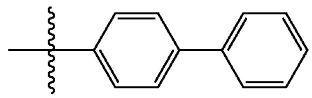 [SMILES: *c1ccc(-c2ccccc2)cc1] | 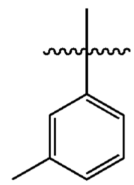 [SMILES: *c1cccc(C)c1] |
| 6-29 | 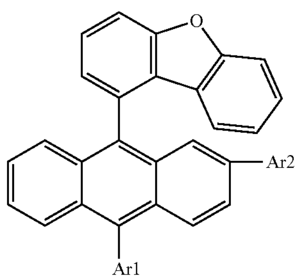 | 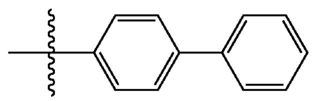 | 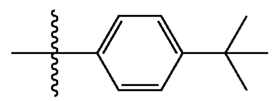 |
| 6-30 | 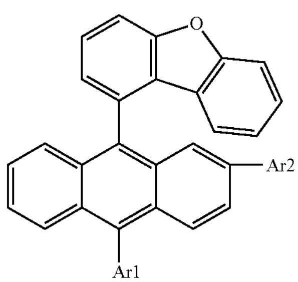 | 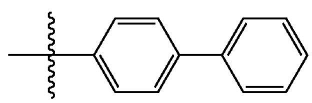 | 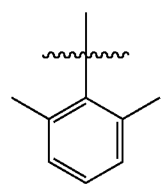 |
| 6-31 | 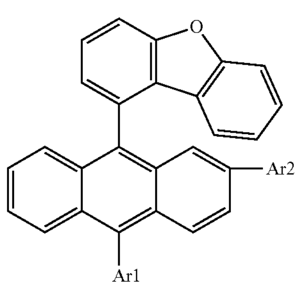 | 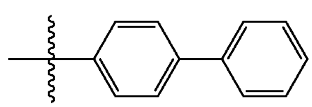 [SMILES: *c1ccc(-c2ccccc2)cc1] | 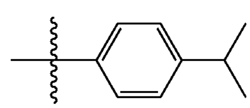 |

-continued
| No. | | Ar1 | Ar2 |
|---|---|---|---|
| 7-1 | 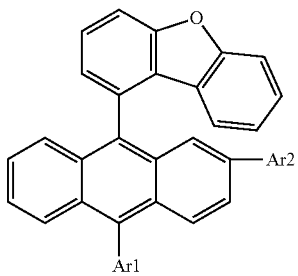 | 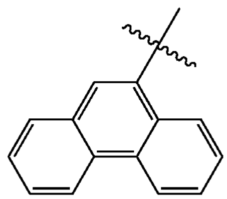 [SMILES: *c1cc2ccccc2c2ccccc12] | 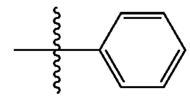 |
| 7-2 | 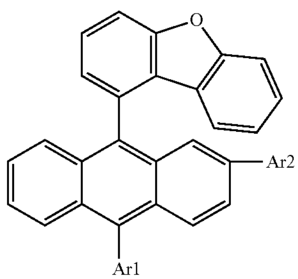 | 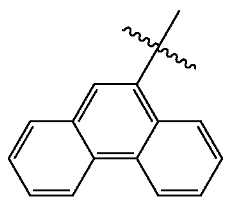 [SMILES: *c1cc2ccccc2c2ccccc12] | 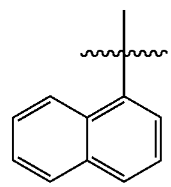 [SMILES: *c1cccc2ccccc12] |
| 7-3 | 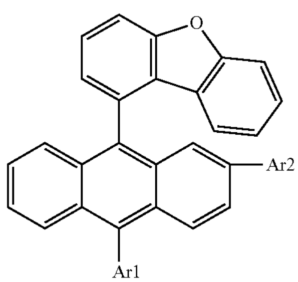 | 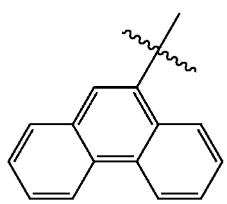 [SMILES: *c1cc2ccccc2c2ccccc12] | 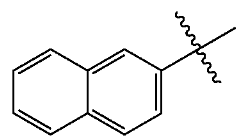 [SMILES: *c1ccc2ccccc2c1] |
| 7-4 | 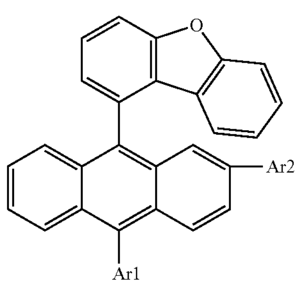 | 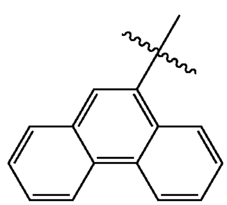 [SMILES: *c1cc2ccccc2c2ccccc12] | 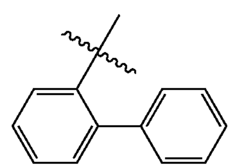 [SMILES: *c1ccccc1-c1ccccc1] |
| 7-5 | 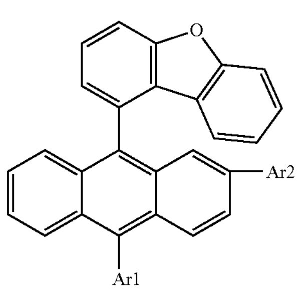 | 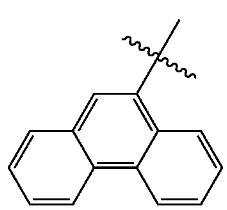 [SMILES: *c1cc2ccccc2c2ccccc12] | 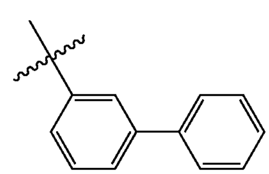 [SMILES: *c1cccc(-c2ccccc2)c1] |

-continued
| No. | | Ar1 | Ar2 |
|---|---|---|---|
| 7-6 | 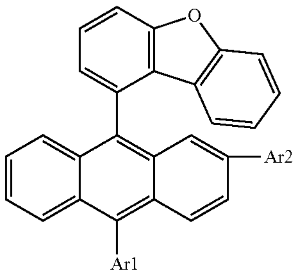 | 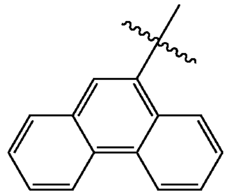 [SMILES: *c1cc2ccccc2c2ccccc12] | 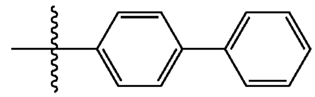 [SMILES: *c1ccc(-c2ccccc2)cc1] |
| 7-7 | 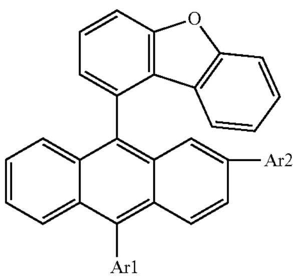 | 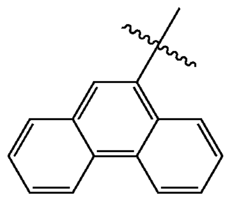 [SMILES: *c1cc2ccccc2c2ccccc12] | 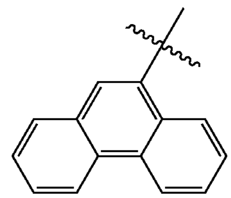 [SMILES: *c1cc2ccccc2c2ccccc12] |
| 7-9 | 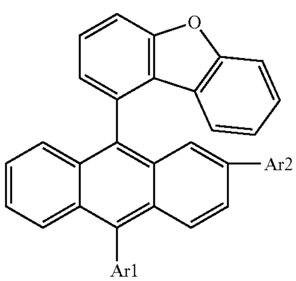 | 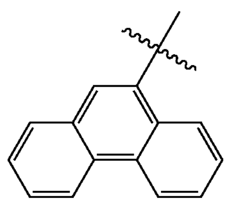 [SMILES: *c1cc2ccccc2c2ccccc12] | 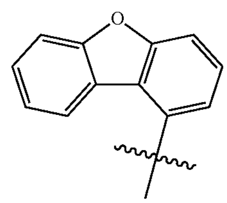 [SMILES: *c1cccc2oc3ccccc3c12] |
| 7-10 | 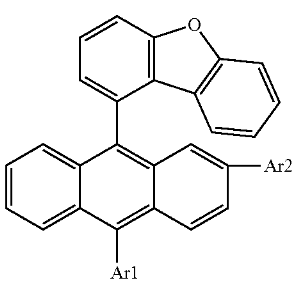 | 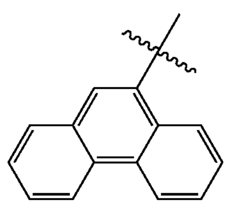 [SMILES: *c1cc2ccccc2c2ccccc12] | 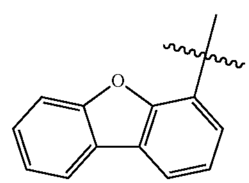 [SMILES: *c1cccc2c1oc1ccccc12] |
| 7-11 | 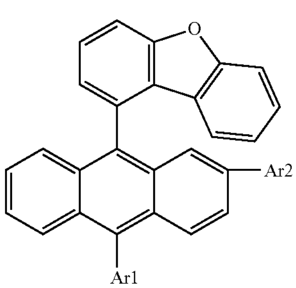 | 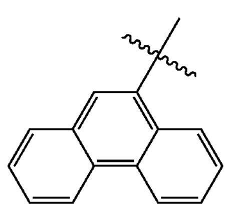 [SMILES: *c1cc2ccccc2c2ccccc12] | 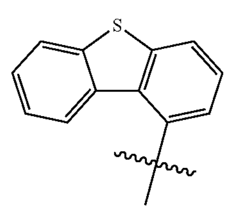 [SMILES: *c1cccc2sc3ccccc3c12] |

-continued
| No. | | Ar1 | Ar2 |
|---|---|---|---|
| 7-12 | 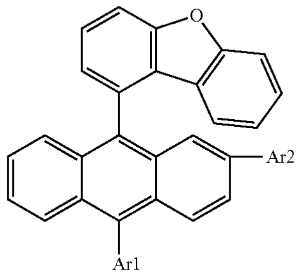 | 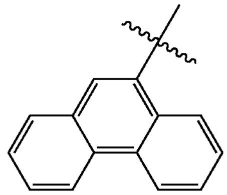 [SMILES: *c1cc2ccccc2c2ccccc12] | 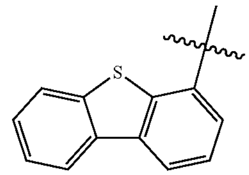 [SMILES: *c1cccc2c1sc1ccccc12] |
| 7-16 | 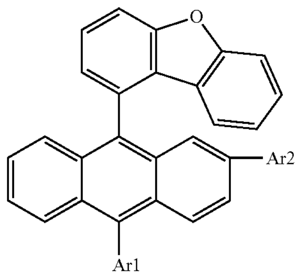 | 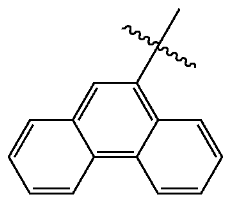 [SMILES: *c1cc2ccccc2c2ccccc12] | 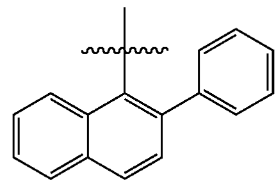 [SMILES: *c1c(-c2ccccc2)ccc2ccccc12] |
| 7-17 | 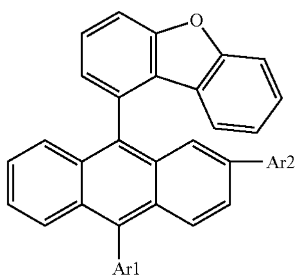 | 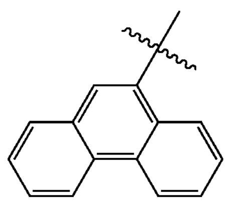 [SMILES: *c1cc2ccccc2c2ccccc12] | 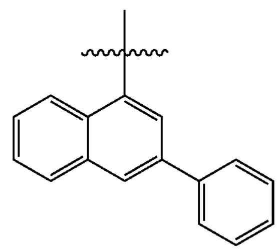 [SMILES: *c1cc(-c2ccccc2)cc2ccccc12] |
| 7-18 | 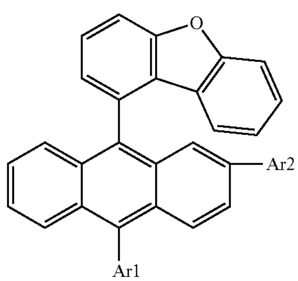 | 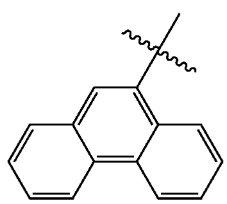 [SMILES: *c1cc2ccccc2c2ccccc12] | 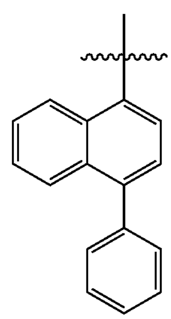 [SMILES: *c1ccc(-c2ccccc2)c2ccccc12] |
| 7-19 | 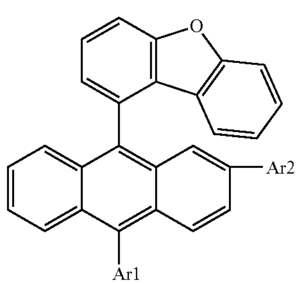 | 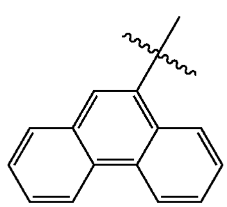 [SMILES: *c1cc2ccccc2c2ccccc12] | 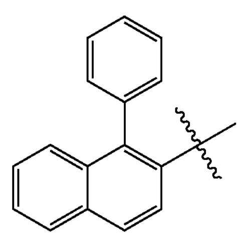 [SMILES: *c1ccc2ccccc2c1-c1ccccc1] |

-continued
| No. | | Ar1 | Ar2 |
|---|---|---|---|
| 7-20 | 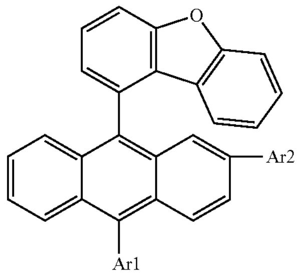 | 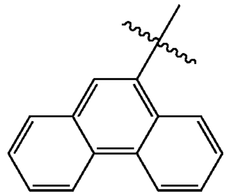 [SMILES: *c1cc2ccccc2c2ccccc12] | 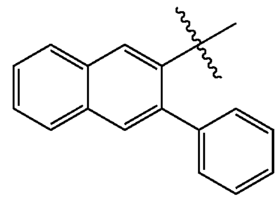 [SMILES: *c1cc2ccccc2cc1-c1ccccc1] |
| 7-21 | 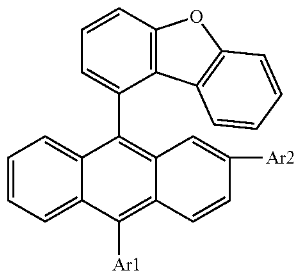 | 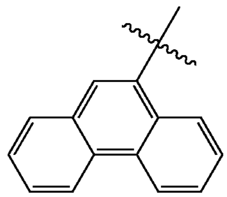 [SMILES: *c1cc2ccccc2c2ccccc12] | 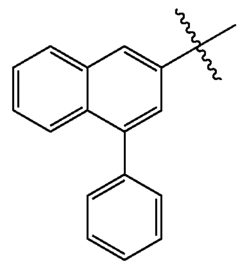 [SMILES: *c1cc(-c2ccccc2)c2ccccc2c1] |
| 7-22 | 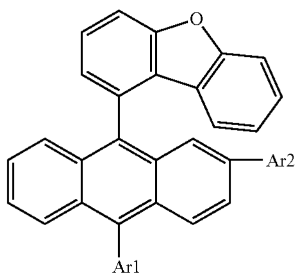 | 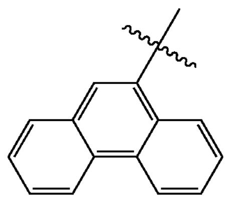 [SMILES: *c1cc2ccccc2c2ccccc12] | 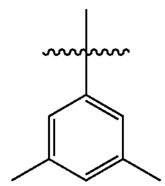 |
| 7-23 | 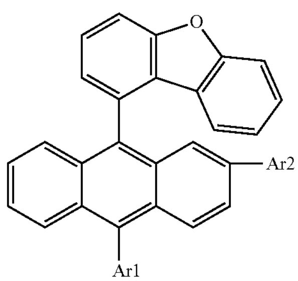 | 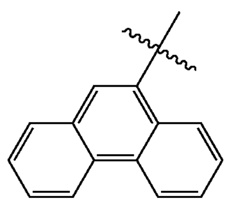 [SMILES: *c1cc2ccccc2c2ccccc12] | 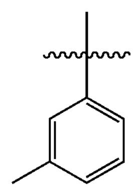 [SMILES: *c1cccc(C)c1] |
| 7-24 | 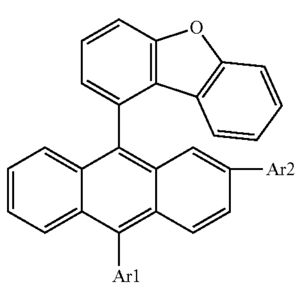 | 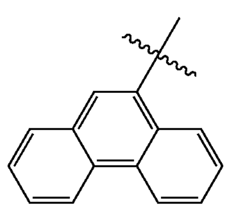 [SMILES: *c1cc2ccccc2c2ccccc12] | 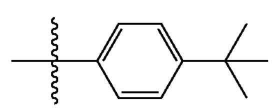 [SMILES: *c1ccc(C(C)(C)C)cc1] |

-continued
| No. | | Ar1 | Ar2 |
|---|---|---|---|
| 7-25 | 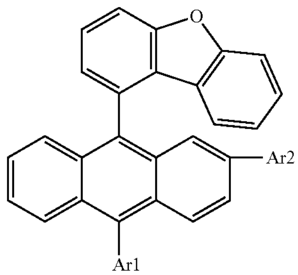 | 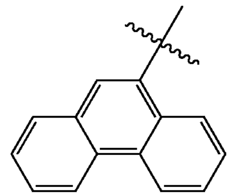 [SMILES: *c1cc2ccccc2c2ccccc12] | 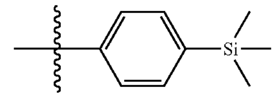 |
| 7-26 | 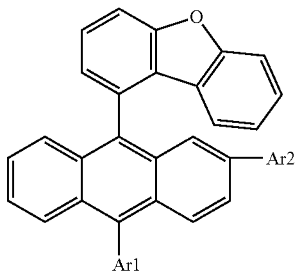 | 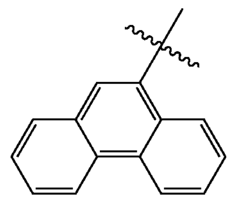 [SMILES: *c1cc2ccccc2c2ccccc12] | 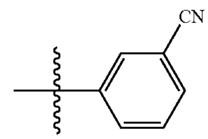 [SMILES: *c1cccc(C#N)c1] |
| 7-27 | 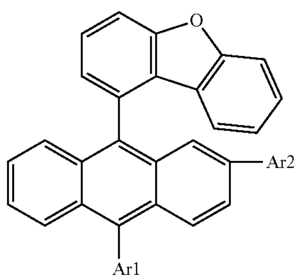 | 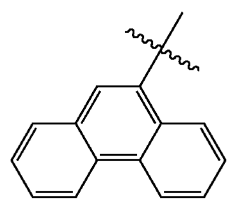 [SMILES: *c1cc2ccccc2c2ccccc12] | 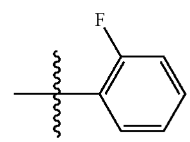 [SMILES: *c1ccccc1F] |
| 7-28 | 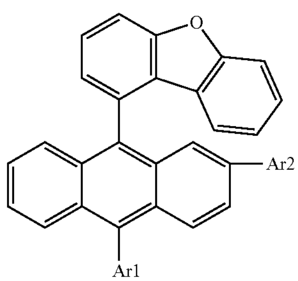 | 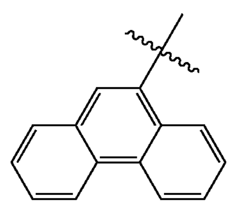 [SMILES: *c1cc2ccccc2c2ccccc12] | 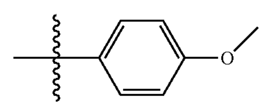 [SMILES: *c1ccc(OC)cc1] |
| 8-1 | 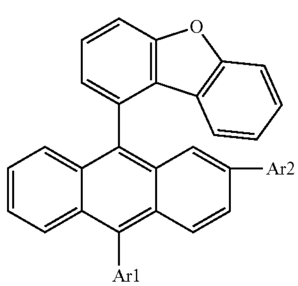 | 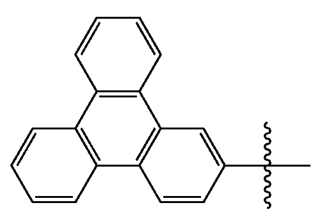 [SMILES: *c1ccc2c3ccccc3c3ccccc3c2c1] | 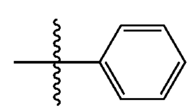 |

-continued
| No. | | Ar1 | Ar2 |
|---|---|---|---|
| 8-2 | 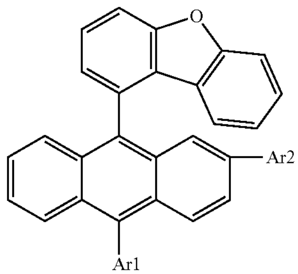 | 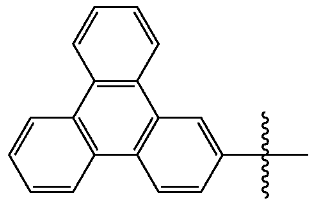 [SMILES: *c1ccc2c3ccccc3c3ccccc3c2c1] | 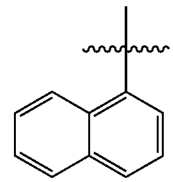 [SMILES: *c1cccc2ccccc12] |
| 8-3 | 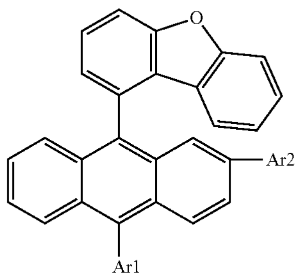 | 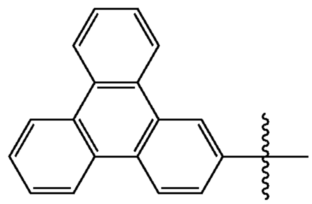 [SMILES: *c1ccc2c3ccccc3c3ccccc3c2c1] | 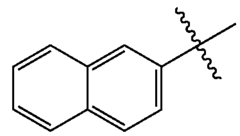 [SMILES: *c1ccc2ccccc2c1] |
| 8-4 | 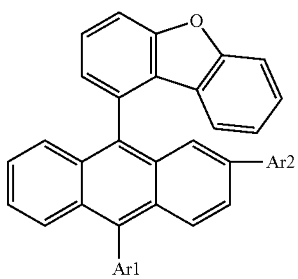 | 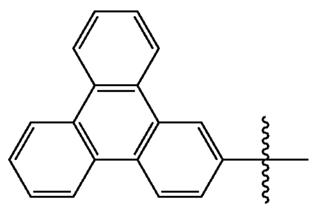 [SMILES: *c1ccc2c3ccccc3c3ccccc3c2c1] | 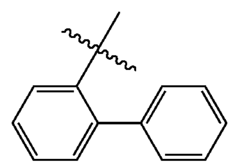 [SMILES: *c1ccccc1-c1ccccc1] |
| 8-5 | 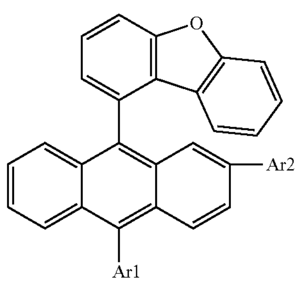 | 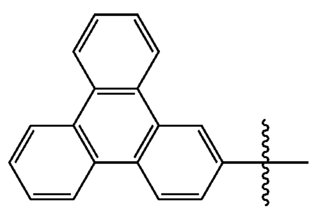 [SMILES: *c1ccc2c3ccccc3c3ccccc3c2c1] | 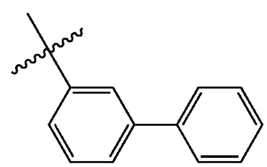 [SMILES: *c1cccc(-c2ccccc2)c1] |
| 8-6 | 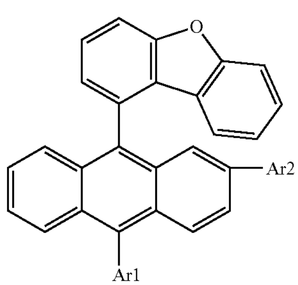 | 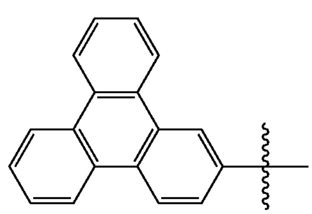 [SMILES: *c1ccc2c3ccccc3c3ccccc3c2c1] | 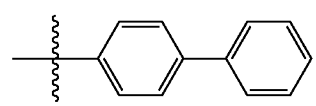 [SMILES: *c1ccc(-c2ccccc2)cc1] |

-continued
| No. | | Ar1 | Ar2 |
|---|---|---|---|
| 8-7 | 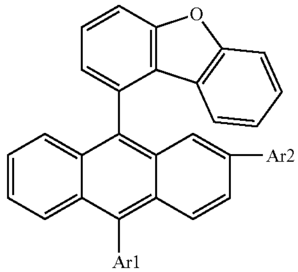 | 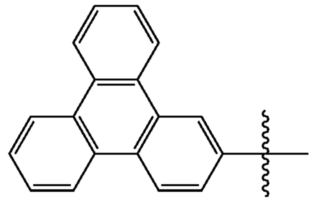 [SMILES: *c1ccc2c3ccccc3c3ccccc3c2c1] | 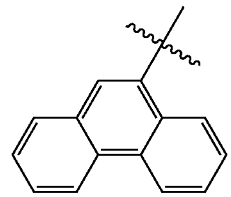 [SMILES: *c1cc2ccccc2c2ccccc12] |
| 8-9 | 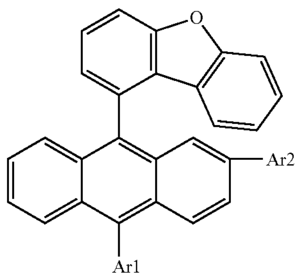 | 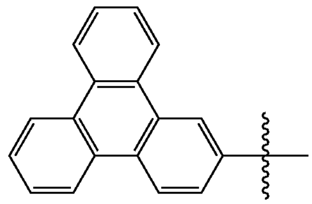 [SMILES: *c1ccc2c3ccccc3c3ccccc3c2c1] | 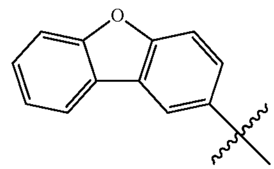 |
| 8-10 | 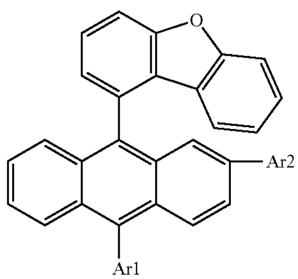 | 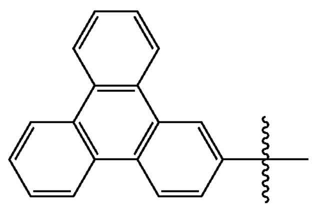 [SMILES: *c1ccc2c3ccccc3c3ccccc3c2c1] | 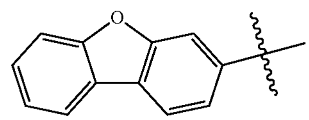 |
| 8-11 | 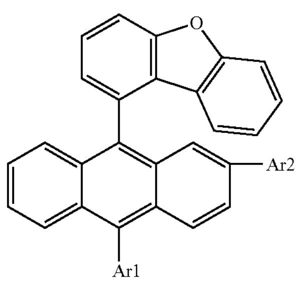 | 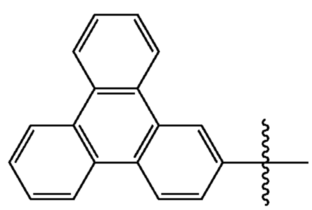 [SMILES: *c1ccc2c3ccccc3c3ccccc3c2c1] | 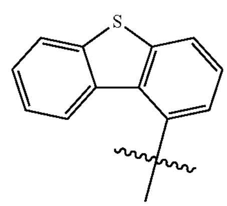 [SMILES: *c1cccc2sc3ccccc3c12] |
| 8-12 | 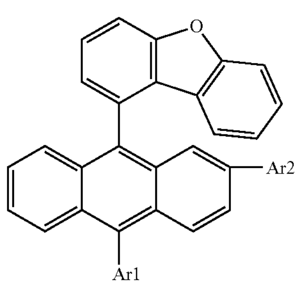 | 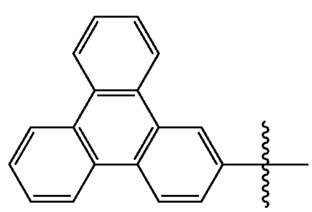 [SMILES: *c1ccc2c3ccccc3c3ccccc3c2c1] | 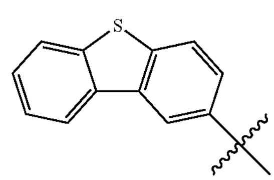 |

-continued
| No. | | Ar1 | Ar2 |
|---|---|---|---|
| 8-13 | 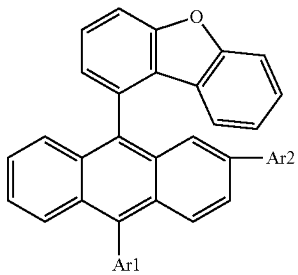 | 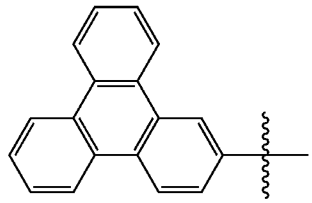 | 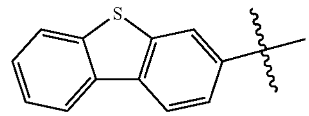 [SMILES: *c1ccc2c(c1)sc1ccccc12] |
| 8-17 | 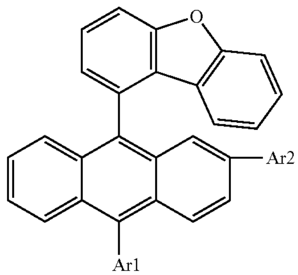 | 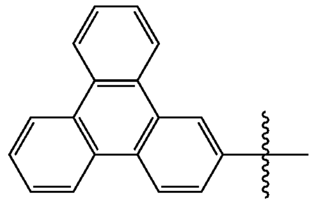 [SMILES: *c1ccc2c3ccccc3c3ccccc3c2c1] | 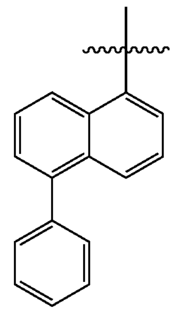 [SMILES: *c1cccc2c(-c3ccccc3)cccc12] |
| 8-18 | 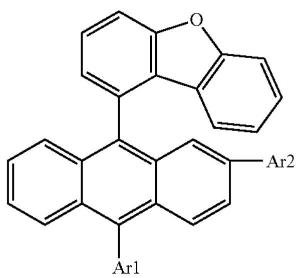 | 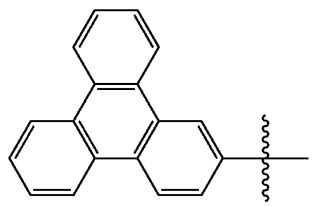 [SMILES: *c1ccc2c3ccccc3c3ccccc3c2c1] | 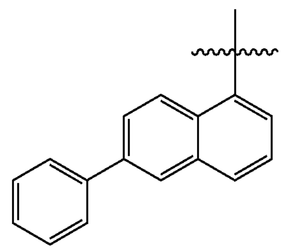 [SMILES: *c1cccc2cc(-c3ccccc3)ccc12] |
| 8-19 | 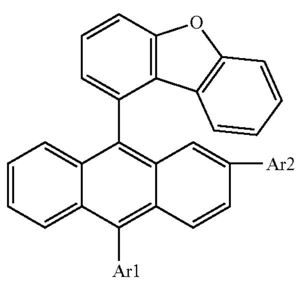 | 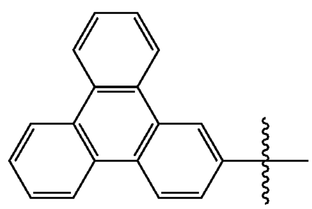 [SMILES: *c1ccc2c3ccccc3c3ccccc3c2c1] | 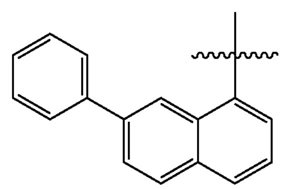 [SMILES: *c1cccc2ccc(-c3ccccc3)cc12] |
| 8-20 | 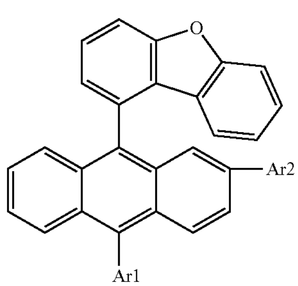 | 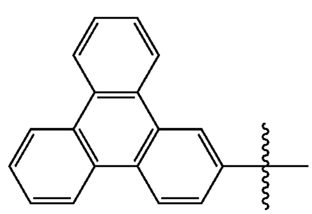 | 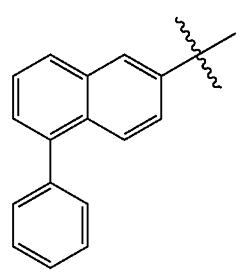 [SMILES: *c1ccc2c(-c3ccccc3)cccc2c1] |

-continued
| No. | | Ar1 | Ar2 |
| --- | --- | --- | --- |
| 8-21 | 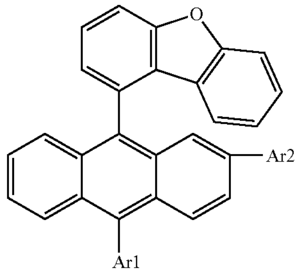 | 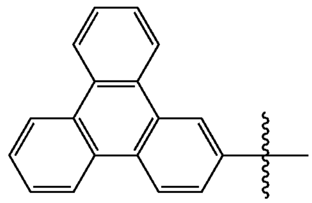 [SMILES: *c1ccc2c3ccccc3c3ccccc3c2c1] | 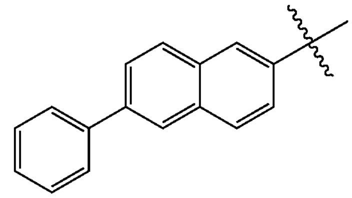 [SMILES: *c1ccc2cc(-c3ccccc3)ccc2c1] |
| 8-22 | 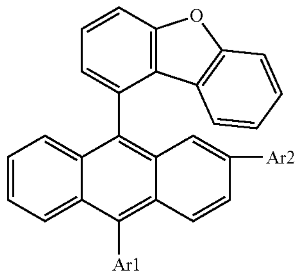 | 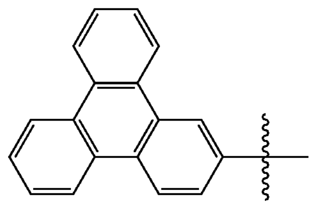 [SMILES: *c1ccc2c3ccccc3c3ccccc3c2c1] | 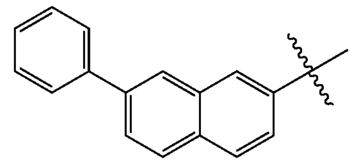 [SMILES: *c1ccc2ccc(-c3ccccc3)cc2c1] |
| 8-23 | 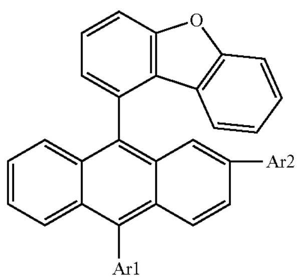 | 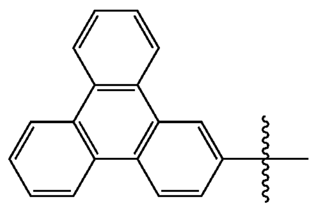 [SMILES: *c1ccc2c3ccccc3c3ccccc3c2c1] | 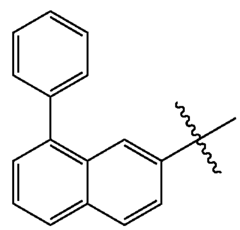 [SMILES: *c1ccc2cccc(-c3ccccc3)c2c1] |
| 8-24 | 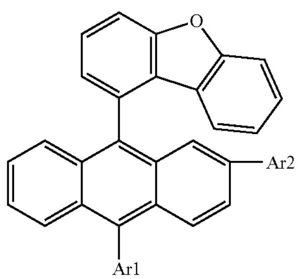 | 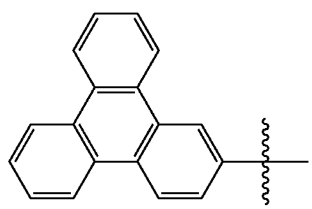 [SMILES: *c1ccc2c3ccccc3c3ccccc3c2c1] | 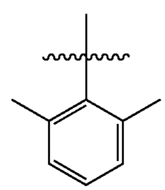 |
| 8-25 | 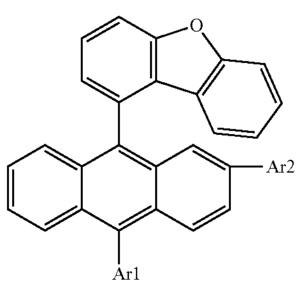 | 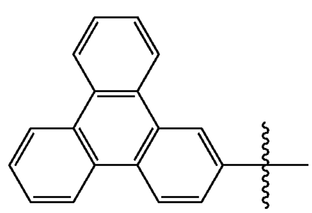 [SMILES: *c1ccc2c3ccccc3c3ccccc3c2c1] | 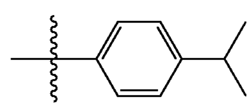 [SMILES: *c1ccc(C(C)C)cc1] |

-continued
| No. | | Ar1 | Ar2 |
|---|---|---|---|
| 8-26 | 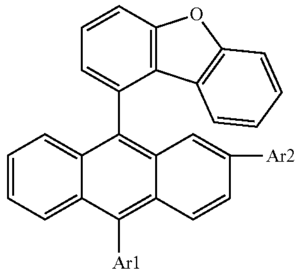 | 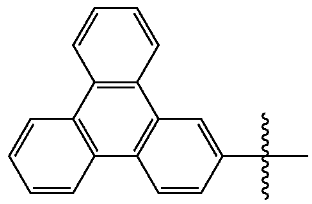 [SMILES: *c1ccc2c3ccccc3c3ccccc3c2c1] | 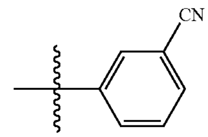 [SMILES: *c1cccc(C#N)c1] |
| 8-27 | 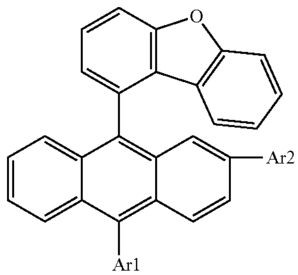 | 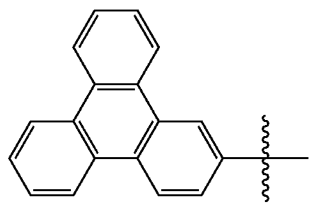 | 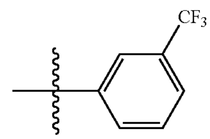 [SMILES: *c1cccc(C(F)(F)F)c1] |
| 8-28 | 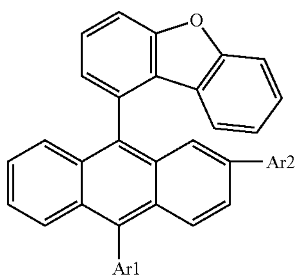 | 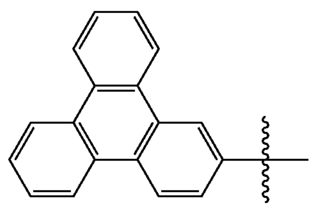 [SMILES: *c1ccc2c3ccccc3c3ccccc3c2c1] | 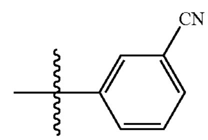 [SMILES: *c1cccc(C#N)c1] |
| 8-29 | 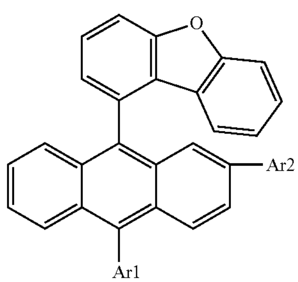 | 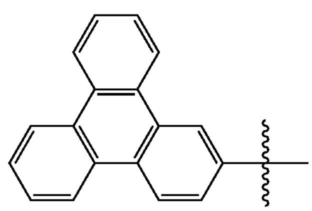 [SMILES: *c1ccc2c3ccccc3c3ccccc3c2c1] | 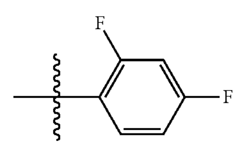 [SMILES: *c1ccc(F)cc1F] |
| 9-1 | 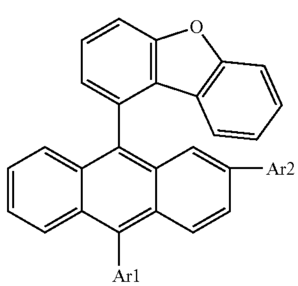 | 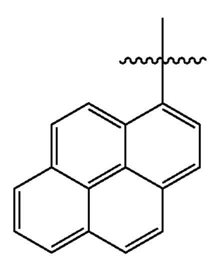 [SMILES: *c1ccc2ccc3cccc4ccc1c2c34] | 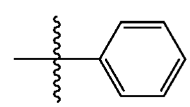 |

-continued
| No. | | Ar1 | Ar2 |
|---|---|---|---|
| 9-2 | 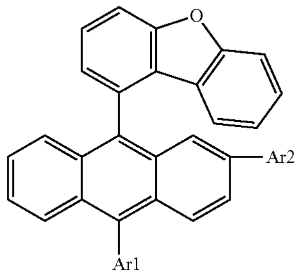 | 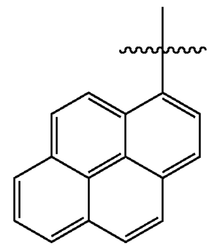 [SMILES: *c1ccc2ccc3cccc4ccc1c2c34] | 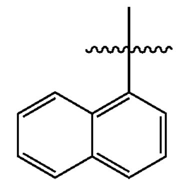 [SMILES: *c1cccc2ccccc12] |
| 9-3 | 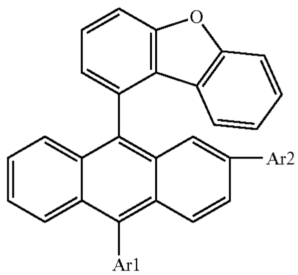 | 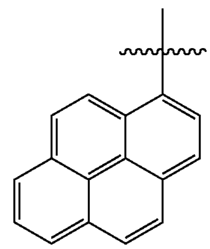 [SMILES: *c1ccc2ccc3cccc4ccc1c2c34] | 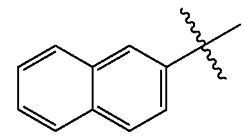 [SMILES: *c1ccc2ccccc2c1] |
| 9-4 | 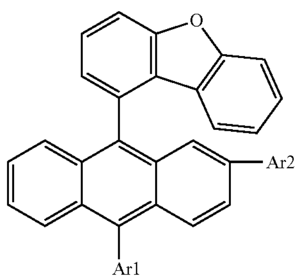 | 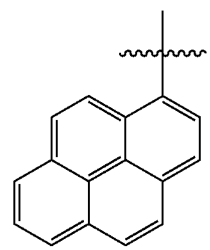 [SMILES: *c1ccc2ccc3cccc4ccc1c2c34] | 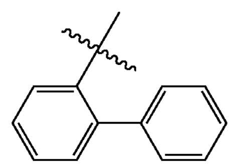 [SMILES: *c1ccccc1-c1ccccc1] |
| 9-5 | 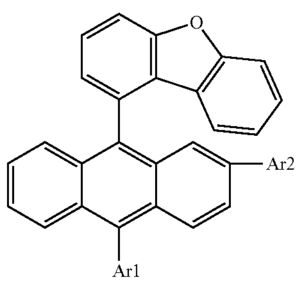 | 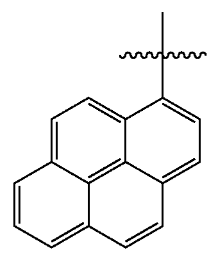 [SMILES: *c1ccc2ccc3cccc4ccc1c2c34] | 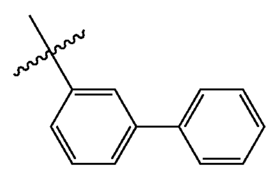 [SMILES: *c1cccc(-c2ccccc2)c1] |
| 9-6 | 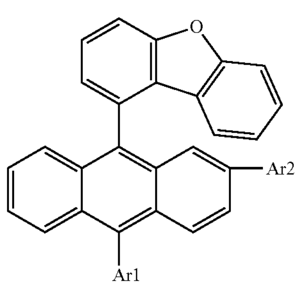 | 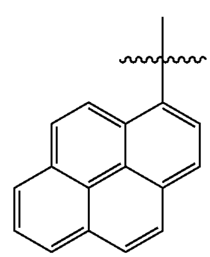 [SMILES: *c1ccc2ccc3cccc4ccc1c2c34] | 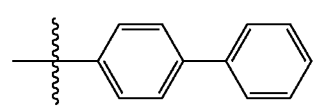 [SMILES: *c1ccc(-c2ccccc2)cc1] |

-continued
| No. | | Ar1 | Ar2 |
|---|---|---|---|
| 9-7 | 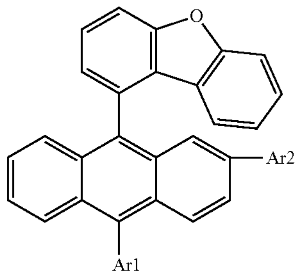 | 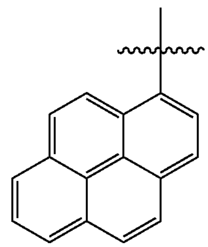 [SMILES: *c1ccc2ccc3cccc4ccc1c2c34] | 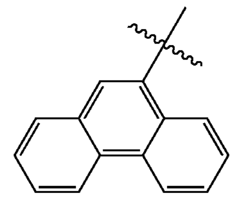 [SMILES: *c1cc2ccccc2c2ccccc12] |
| 9-9 | 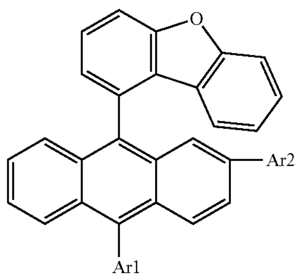 | 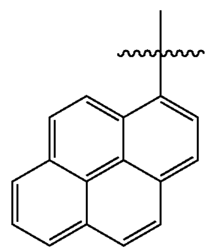 [SMILES: *c1ccc2ccc3cccc4ccc1c2c34] | 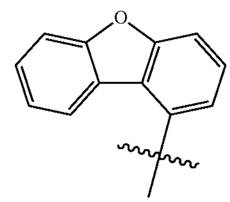 [SMILES: *c1cccc2oc3ccccc3c12] |
| 9-10 | 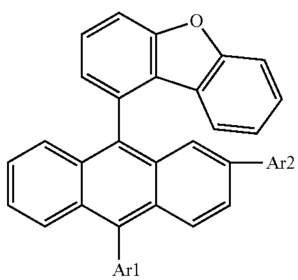 | 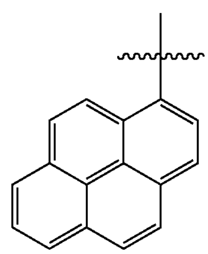 [SMILES: *c1ccc2ccc3cccc4ccc1c2c34] | 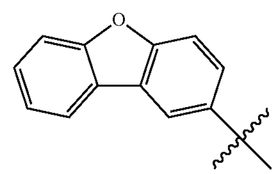 [SMILES: *c1ccc2oc3ccccc3c2c1] |
| 9-11 | 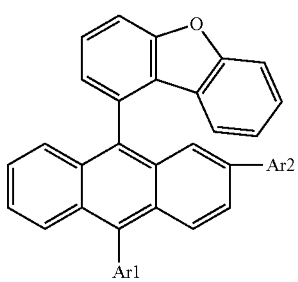 | 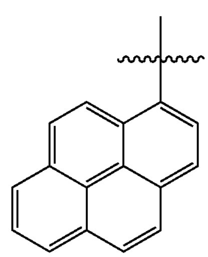 [SMILES: *c1ccc2ccc3cccc4ccc1c2c34] | 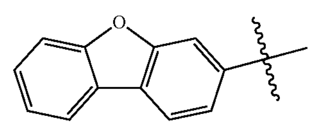 |
| 9-12 | 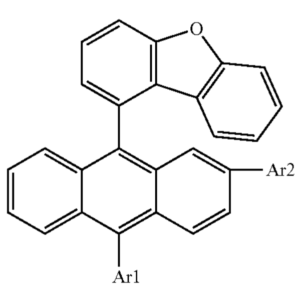 | 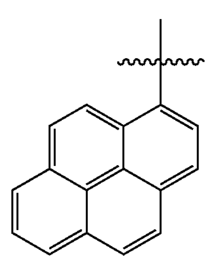 [SMILES: *c1ccc2ccc3cccc4ccc1c2c34] | 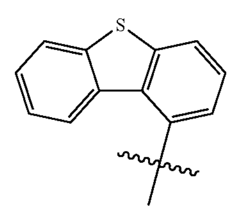 [SMILES: *c1cccc2sc3ccccc3c12] |

-continued
| No. | | Ar1 | Ar2 |
|---|---|---|---|
| 9-13 | 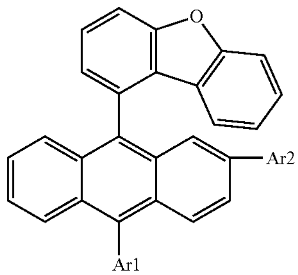 | 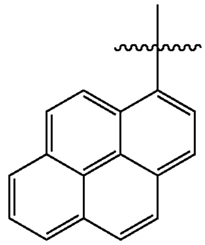 [SMILES: *c1ccc2ccc3cccc4ccc1c2c34] | 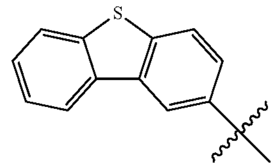 |
| 9-14 | 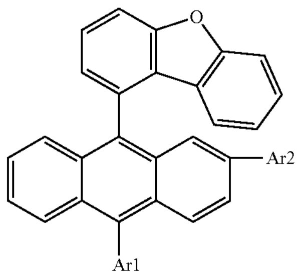 | 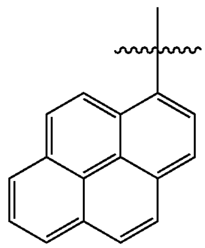 [SMILES: *c1ccc2ccc3cccc4ccc1c2c34] | 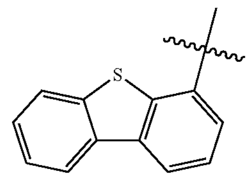 [SMILES: *c1cccc2c1sc1ccccc12] |
| 9-19 | 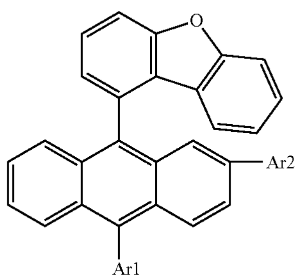 | 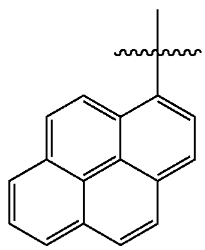 [SMILES: *c1ccc2ccc3cccc4ccc1c2c34] | 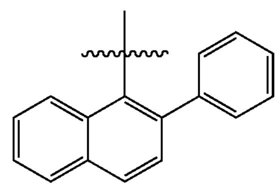 [SMILES: *c1c(-c2ccccc2)ccc2ccccc12] |
| 9-20 | 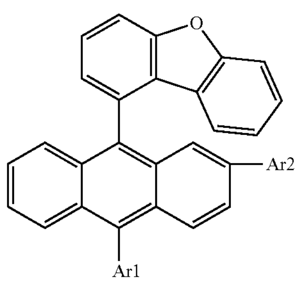 | 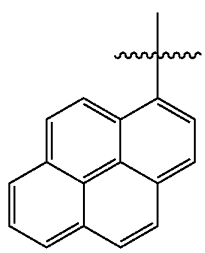 [SMILES: *c1ccc2ccc3cccc4ccc1c2c34] | 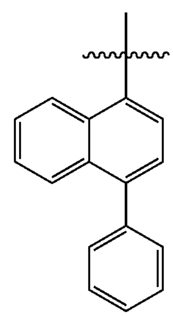 [SMILES: *c1ccc(-c2ccccc2)c2ccccc12] |
| 9-21 | 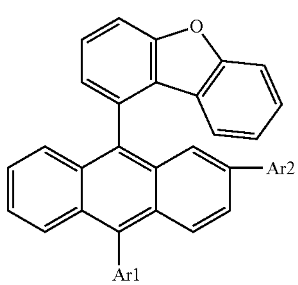 | 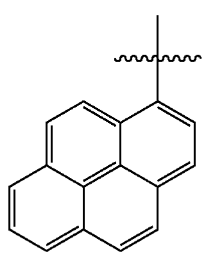 [SMILES: *c1ccc2ccc3cccc4ccc1c2c34] | 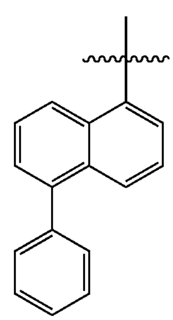 [SMILES: *c1cccc2c(-c3ccccc3)cccc12] |

-continued
| No. | | Ar1 | Ar2 |
|---|---|---|---|
| 9-22 | 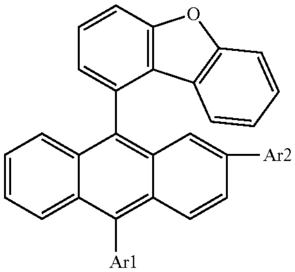 | 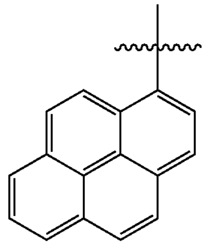 [SMILES: *c1ccc2ccc3cccc4ccc1c2c34] | 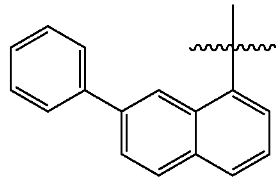 [SMILES: *c1cccc2ccc(-c3ccccc3)cc12] |
| 9-23 | 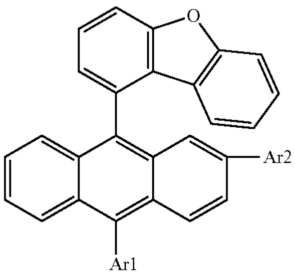 | 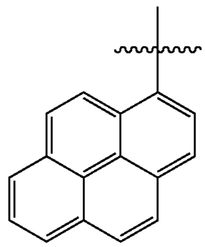 [SMILES: *c1ccc2ccc3cccc4ccc1c2c34] | 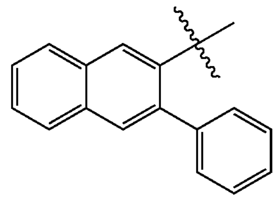 [SMILES: *c1cc2ccccc2cc1-c1ccccc1] |
| 9-24 | 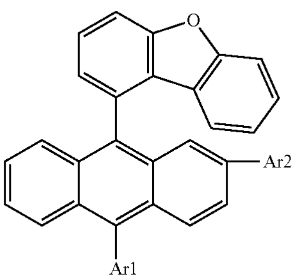 | 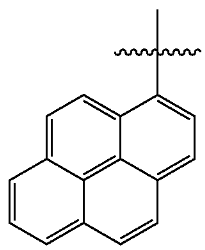 [SMILES: *c1ccc2ccc3cccc4ccc1c2c34] | 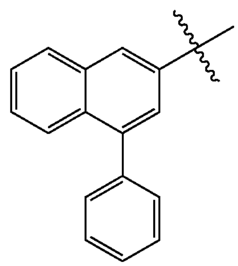 [SMILES: *c1cc(-c2ccccc2)c2ccccc2c1] |
| 9-25 | 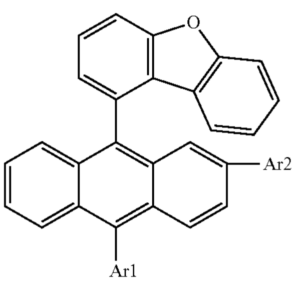 | 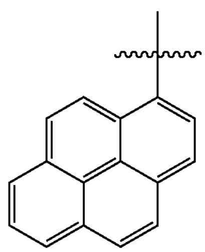 [SMILES: *c1ccc2ccc3cccc4ccc1c2c34] | 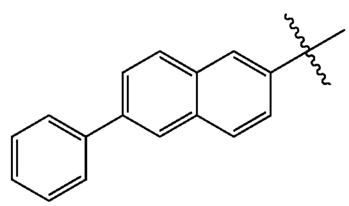 [SMILES: *c1ccc2cc(-c3ccccc3)ccc2c1] |
| 9-26 | 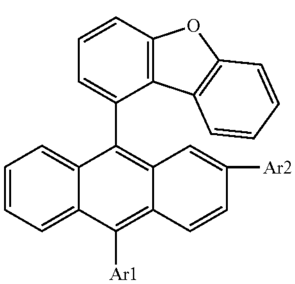 | 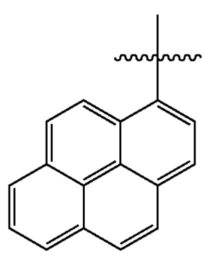 [SMILES: *c1ccc2ccc3cccc4ccc1c2c34] | 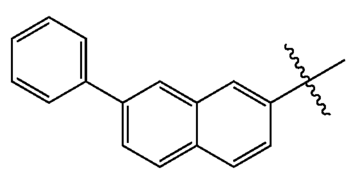 [SMILES: *c1ccc2ccc(-c3ccccc3)cc2c1] |

-continued
| No. | | Ar1 | Ar2 |
|---|---|---|---|
| 9-27 | 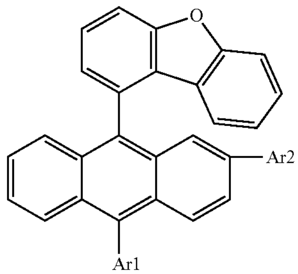 | 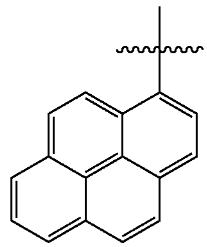 [SMILES: *c1ccc2ccc3cccc4ccc1c2c34] | 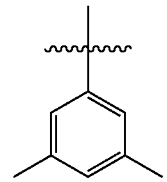 |
| 9-28 | 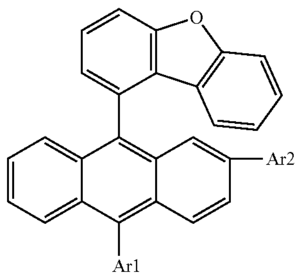 | 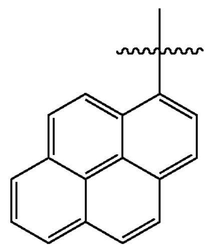 [SMILES: *c1ccc2ccc3cccc4ccc1c2c34] | 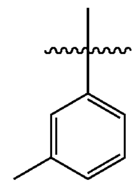 [SMILES: *c1cccc(C)c1] |
| 9-29 | 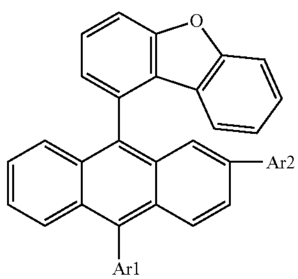 | 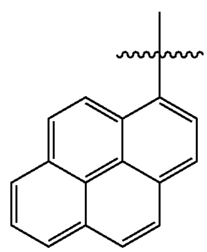 [SMILES: *c1ccc2ccc3cccc4ccc1c2c34] | 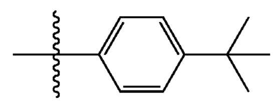 |
| 9-30 | 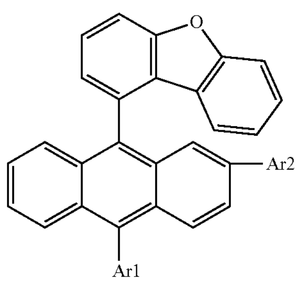 | 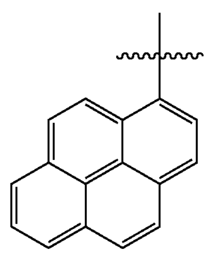 [SMILES: *c1ccc2ccc3cccc4ccc1c2c34] | 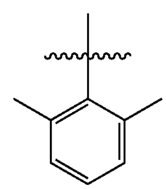 |
| 9-31 | 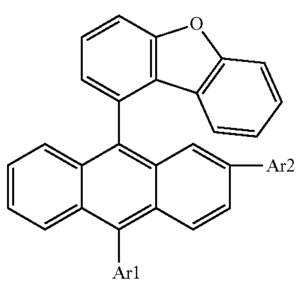 | 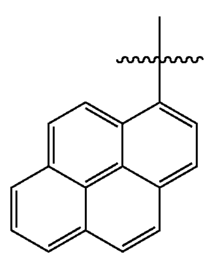 [SMILES: *c1ccc2ccc3cccc4ccc1c2c34] | 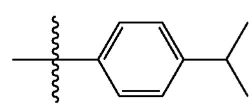 |

-continued
| No. | | Ar1 | Ar2 |
|---|---|---|---|
| 10-1 | 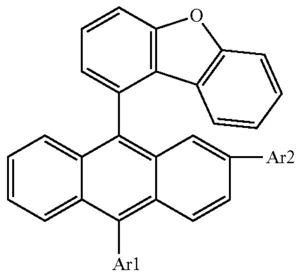 | 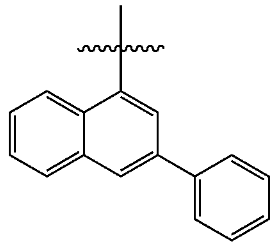 [SMILES: *c1cc(-c2ccccc2)cc2ccccc12] | 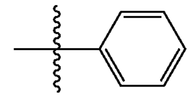 |
| 10-2 | 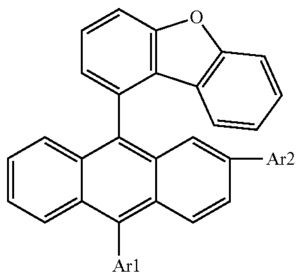 | 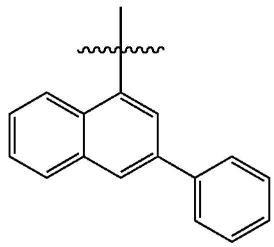 [SMILES: *c1cc(-c2ccccc2)cc2ccccc12] | 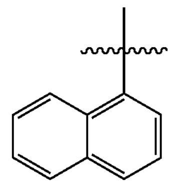 [SMILES: *c1cccc2ccccc12] |
| 10-3 | 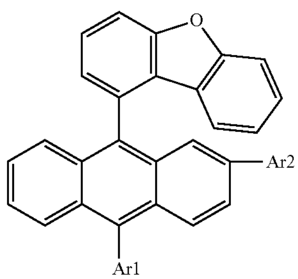 | 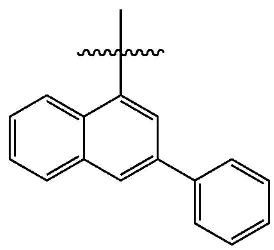 [SMILES: *c1cc(-c2ccccc2)cc2ccccc12] | 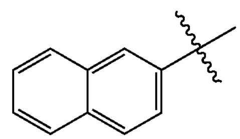 [SMILES: *c1ccc2ccccc2c1] |
| 10-4 | 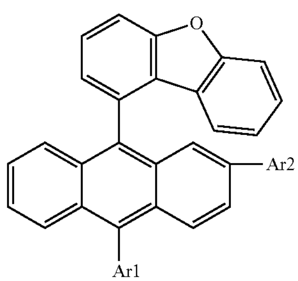 | 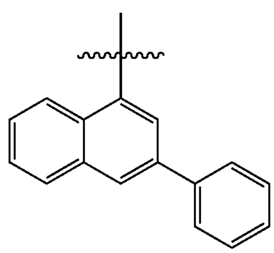 [SMILES: *c1cc(-c2ccccc2)cc2ccccc12] | 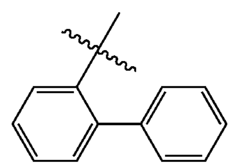 [SMILES: *c1ccccc1-c1ccccc1] |
| 10-5 | 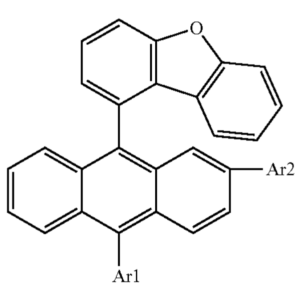 | 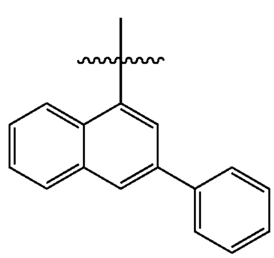 [SMILES: *c1cc(-c2ccccc2)cc2ccccc12] | 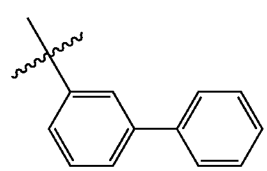 [SMILES: *c1cccc(-c2ccccc2)c1] |

-continued
| No. | | Ar1 | Ar2 |
|---|---|---|---|
| 10-6 | 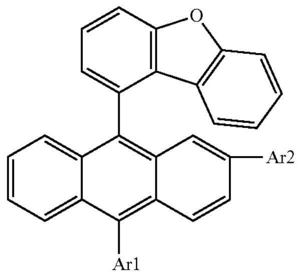 | 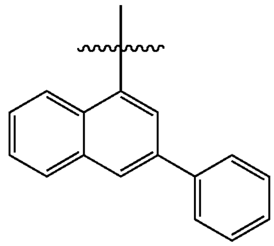 [SMILES: *c1cc(-c2ccccc2)cc2ccccc12] | 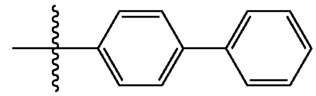 [SMILES: *c1ccc(-c2ccccc2)cc1] |
| 10-7 | 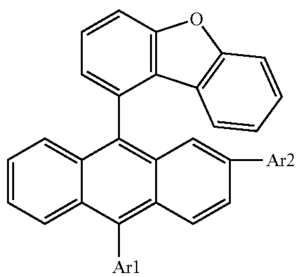 | 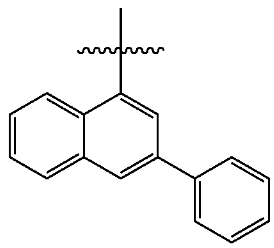 [SMILES: *c1cc(-c2ccccc2)cc2ccccc12] | 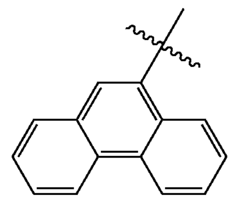 [SMILES: *c1cc2ccccc2c2ccccc12] |
| 10-9 | 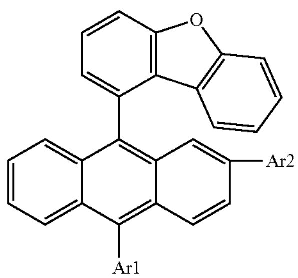 | 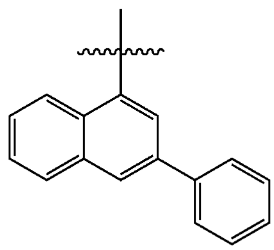 [SMILES: *c1cc(-c2ccccc2)cc2ccccc12] | 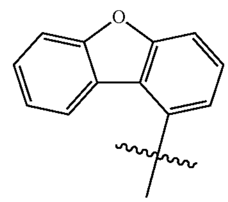 [SMILES: *c1cccc2oc3ccccc3c12] |
| 10-10 | 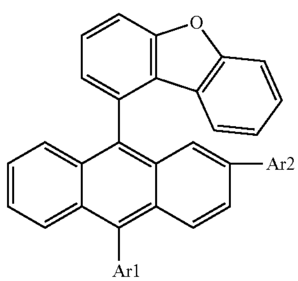 | 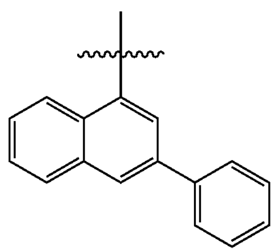 [SMILES: *c1cc(-c2ccccc2)cc2ccccc12] | 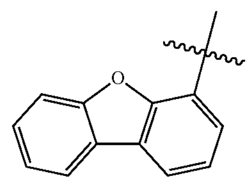 [SMILES: *c1cccc2c1oc1ccccc12] |
| 10-11 | 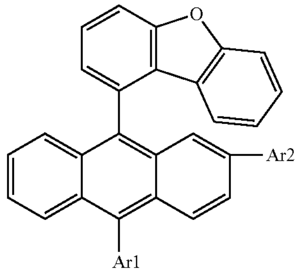 | 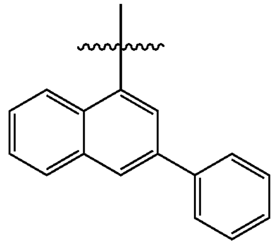 [SMILES: *c1cc(-c2ccccc2)cc2ccccc12] | 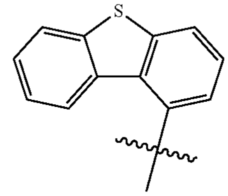 [SMILES: *c1cccc2sc3ccccc3c12] |

-continued
| No. | | Ar1 | Ar2 |
|---|---|---|---|
| 10-12 | 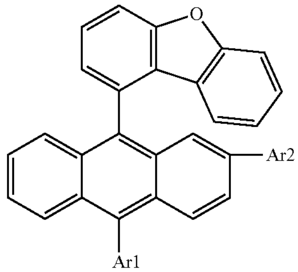 | 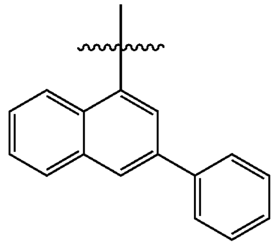 [SMILES: *c1cc(-c2ccccc2)cc2ccccc12] | 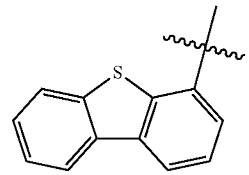 [SMILES: *c1cccc2c1sc1ccccc12] |
| 10-16 | 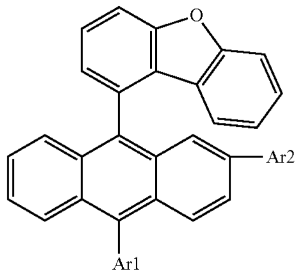 | 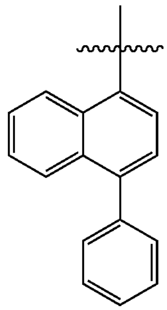 [SMILES: *c1ccc(-c2ccccc2)c2ccccc12] | 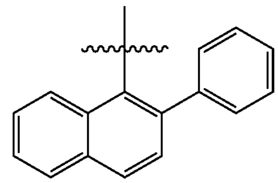 [SMILES: *c1c(-c2ccccc2)ccc2ccccc12] |
| 10-17 | 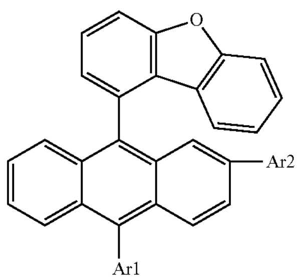 | 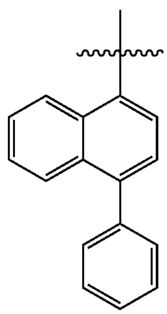 [SMILES: *c1ccc(-c2ccccc2)c2ccccc12] | 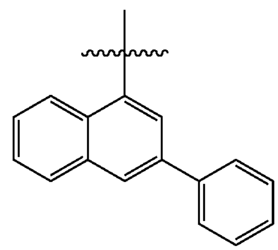 [SMILES: *c1cc(-c2ccccc2)cc2ccccc12] |
| 10-18 | 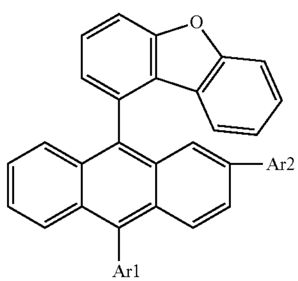 | 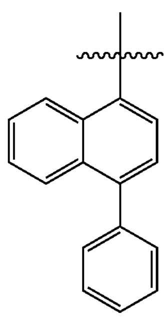 [SMILES: *c1ccc(-c2ccccc2)c2ccccc12] | 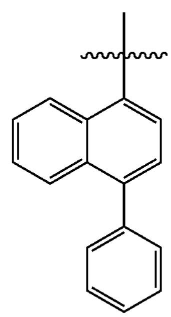 [SMILES: *c1ccc(-c2ccccc2)c2ccccc12] |
| 10-19 | 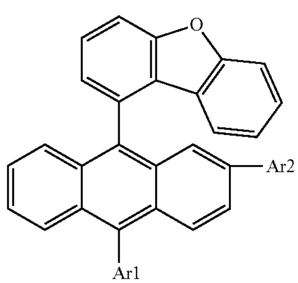 | 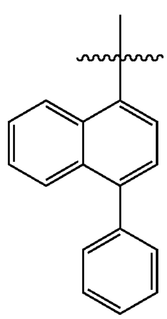 [SMILES: *c1ccc(-c2ccccc2)c2ccccc12] | 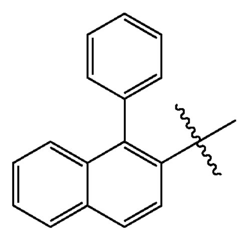 [SMILES: *c1ccc2ccccc2c1-c1ccccc1] |

-continued
| No. | | Ar1 | Ar2 |
|---|---|---|---|
| 10-20 | 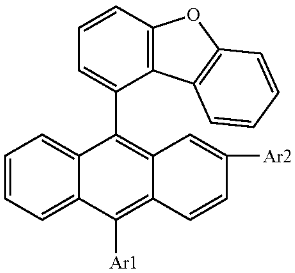 | 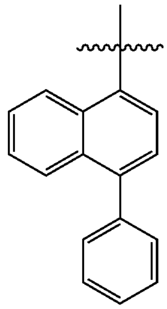 [SMILES: *c1ccc(-c2ccccc2)c2ccccc12] | 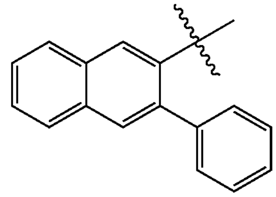 [SMILES: *c1cc2ccccc2cc1-c1ccccc1] |
| 10-21 | 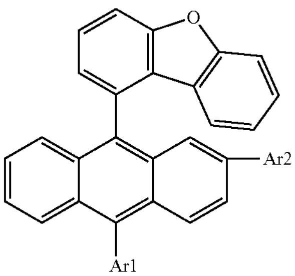 | 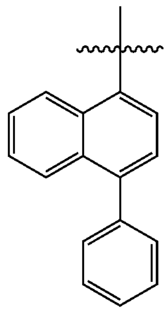 [SMILES: *c1ccc(-c2ccccc2)c2ccccc12] | 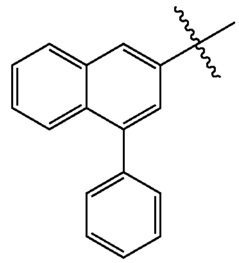 [SMILES: *c1cc(-c2ccccc2)c2ccccc2c1] |
| 10-22 | 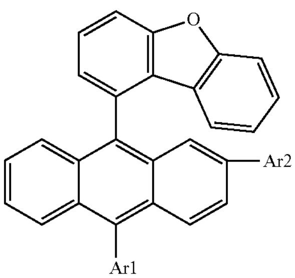 | 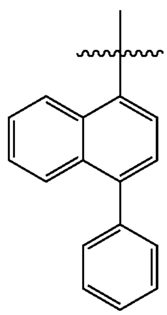 [SMILES: *c1ccc(-c2ccccc2)c2ccccc12] | 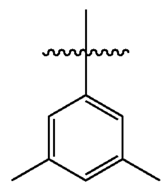 |
| 10-23 | 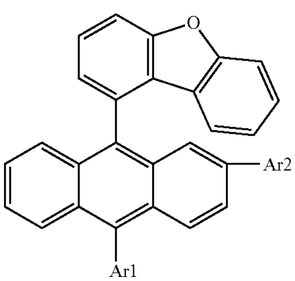 | 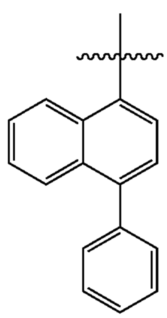 [SMILES: *c1ccc(-c2ccccc2)c2ccccc12] | 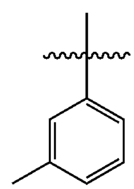 |
| 10-24 | 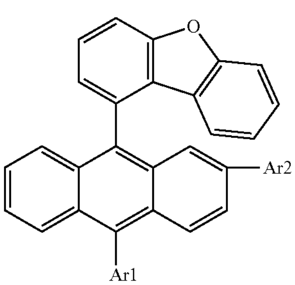 | 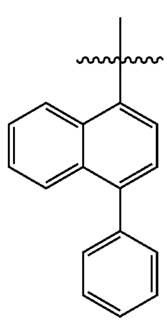 [SMILES: *c1ccc(-c2ccccc2)c2ccccc12] | 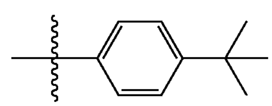 |

-continued
| No. | | Ar1 | Ar2 |
|---|---|---|---|
| 10-25 | 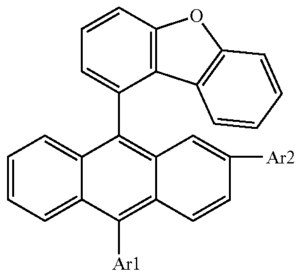 | 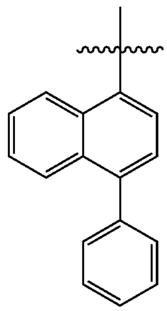 [SMILES: *c1ccc(-c2ccccc2)c2ccccc12] | 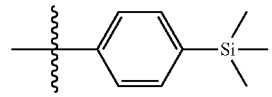 [SMILES: *c1ccc([Si](C)(C)C)cc1] |
| 10-26 | 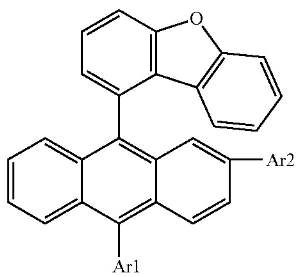 | 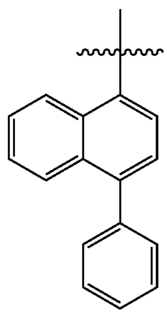 [SMILES: *c1ccc(-c2ccccc2)c2ccccc12] | 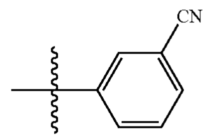 [SMILES: *c1cccc(C#N)c1] |
| 10-27 | 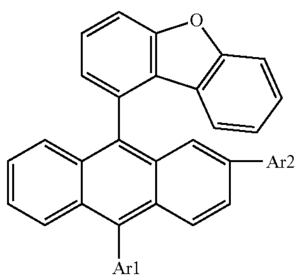 | 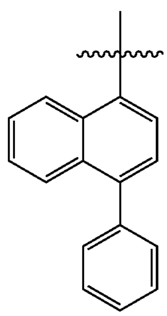 [SMILES: *c1ccc(-c2ccccc2)c2ccccc12] | 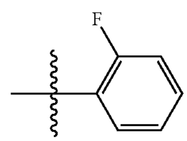 [SMILES: *c1ccccc1F] |
| 10-28 | 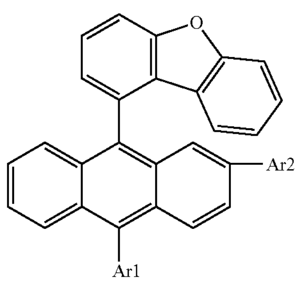 | 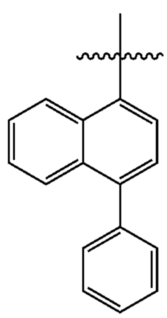 [SMILES: *c1ccc(-c2ccccc2)c2ccccc12] | 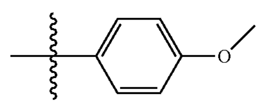 [SMILES: *c1ccc(OC)cc1] |
| 11-1 | 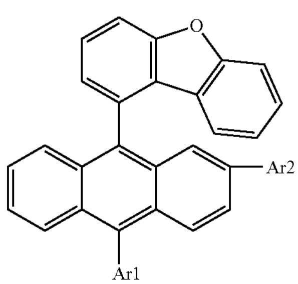 | 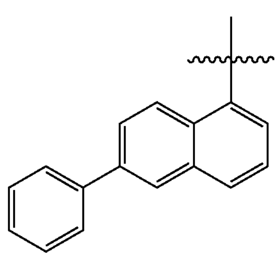 [SMILES: *c1cccc2cc(-c3ccccc3)ccc12] | 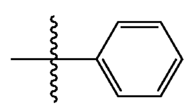 |

-continued
| No. | | Ar1 | Ar2 |
|---|---|---|---|
| 11-2 | 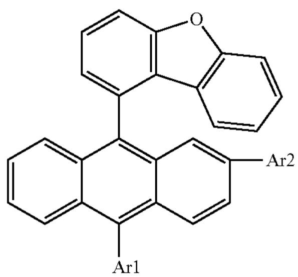 | 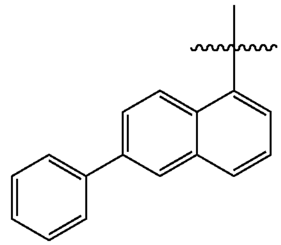 [SMILES: *c1cccc2cc(-c3ccccc3)ccc12] | 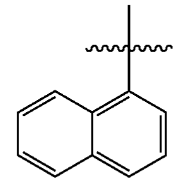 [SMILES: *c1cccc2ccccc12] |
| 11-3 | 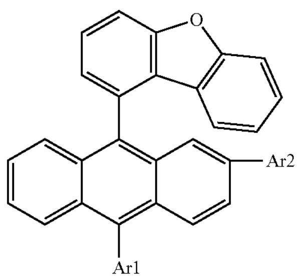 | 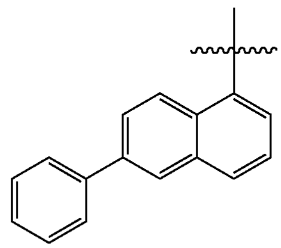 [SMILES: *c1cccc2cc(-c3ccccc3)ccc12] | 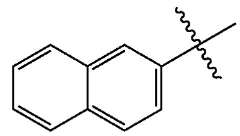 [SMILES: *c1ccc2ccccc2c1] |
| 11-4 | 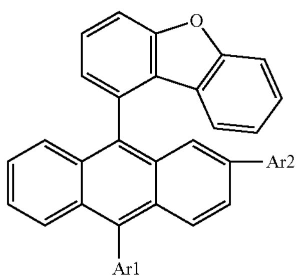 | 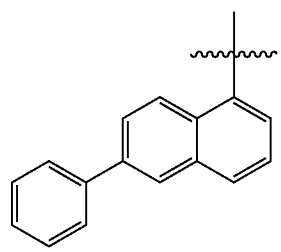 [SMILES: *c1cccc2cc(-c3ccccc3)ccc12] | 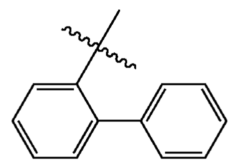 [SMILES: *c1ccccc1-c1ccccc1] |
| 11-5 | 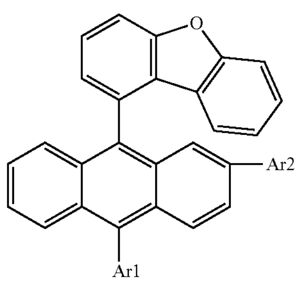 | 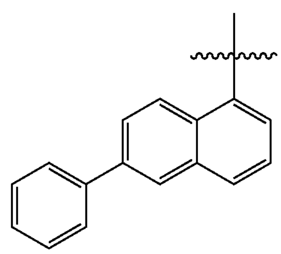 [SMILES: *c1cccc2cc(-c3ccccc3)ccc12] | 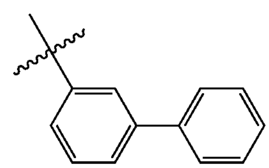 [SMILES: *c1cccc(-c2ccccc2)c1] |
| 11-6 | 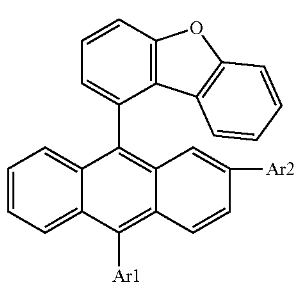 | 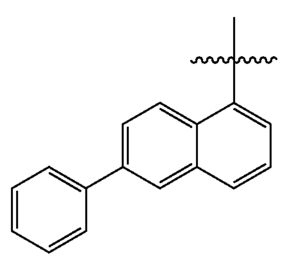 [SMILES: *c1cccc2cc(-c3ccccc3)ccc12] | 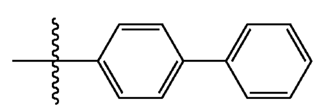 [SMILES: *c1ccc(-c2ccccc2)cc1] |

-continued
| No. | | Ar1 | Ar2 |
|---|---|---|---|
| 11-7 | 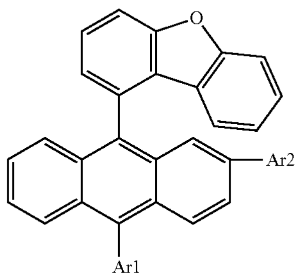 | 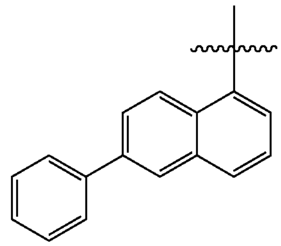 [SMILES: *c1cccc2cc(-c3ccccc3)ccc12] | 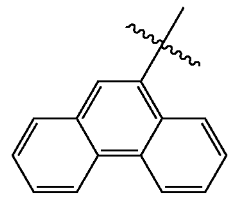 [SMILES: *c1cc2ccccc2c2ccccc12] |
| 11-9 | 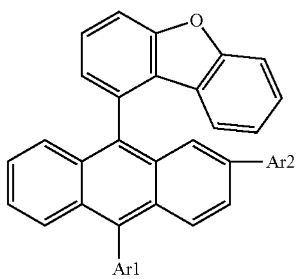 | 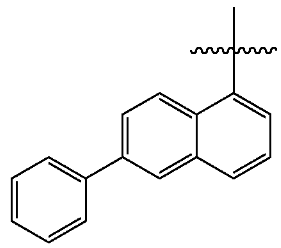 [SMILES: *c1cccc2cc(-c3ccccc3)ccc12] | 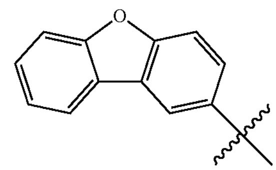 |
| 11-10 | 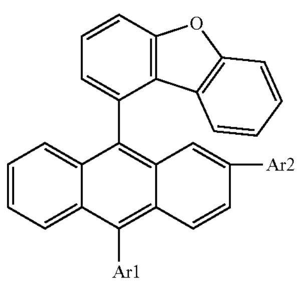 | 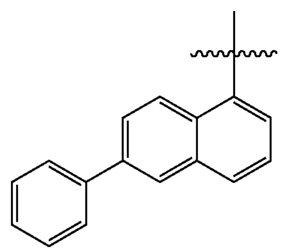 [SMILES: *c1cccc2cc(-c3ccccc3)ccc12] | 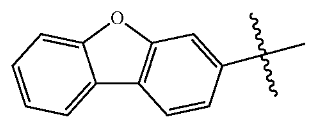 |
| 11-11 | 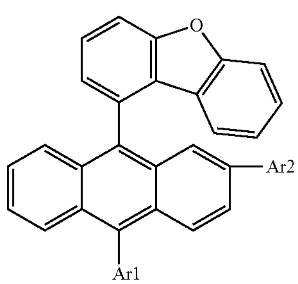 | 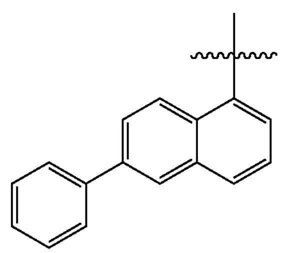 [SMILES: *c1cccc2cc(-c3ccccc3)ccc12] | 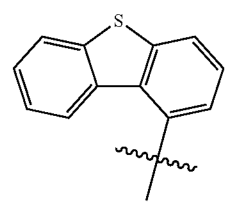 |
| 11-12 | 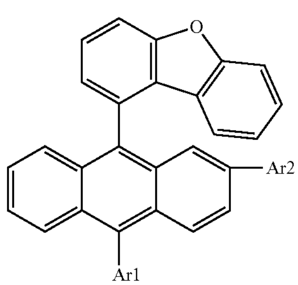 | 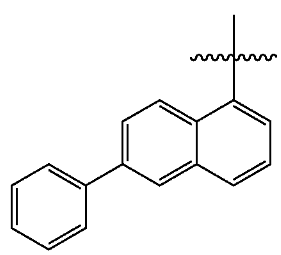 [SMILES: *c1cccc2cc(-c3ccccc3)ccc12] | 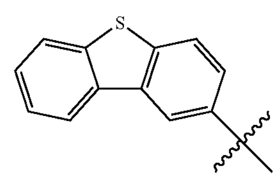 [SMILES: *c1ccc2sc3ccccc3c2c1] |

-continued
| No. | | Ar1 | Ar2 |
|---|---|---|---|
| 11-13 | 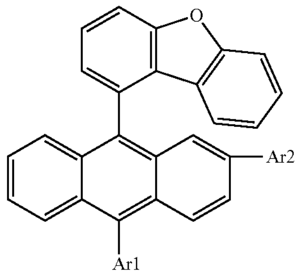 | 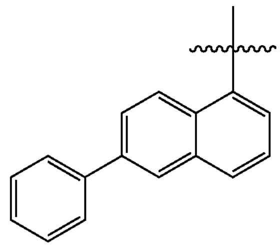 [SMILES: *c1cccc2cc(-c3ccccc3)ccc12] | 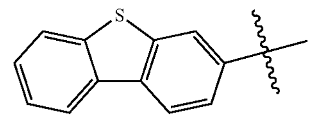 [SMILES: *c1ccc2c(c1)sc1ccccc12] |
| 11-17 | 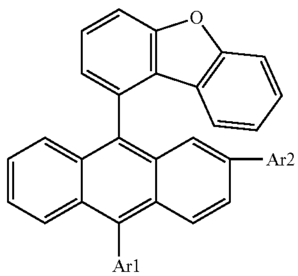 | 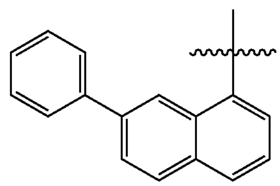 [SMILES: *c1cccc2ccc(-c3ccccc3)cc12] | 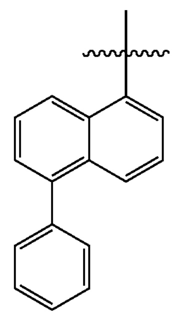 [SMILES: *c1cccc2c(-c3ccccc3)cccc12] |
| 11-18 | 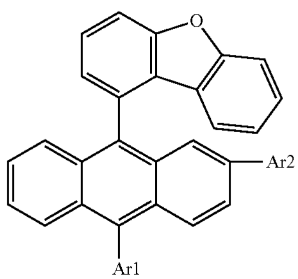 | 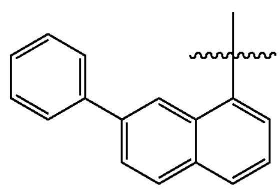 [SMILES: *c1cccc2ccc(-c3ccccc3)cc12] | 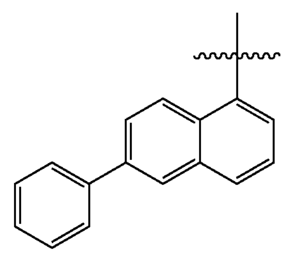 [SMILES: *c1cccc2cc(-c3ccccc3)ccc12] |
| 11-19 | 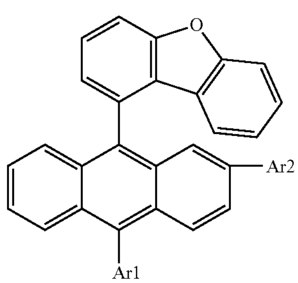 | 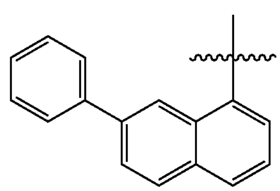 [SMILES: *c1cccc2ccc(-c3ccccc3)cc12] | 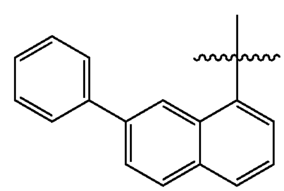 [SMILES: *c1cccc2ccc(-c3ccccc3)cc12] |
| 11-20 | 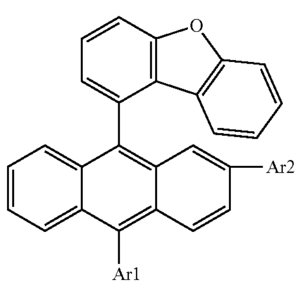 | 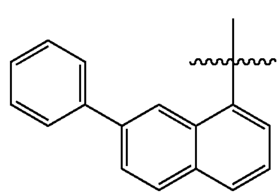 [SMILES: *c1cccc2ccc(-c3ccccc3)cc12] | 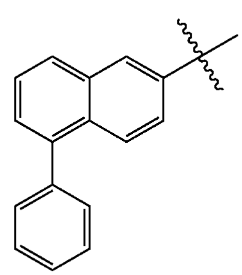 [SMILES: *c1ccc2c(-c3ccccc3)cccc2c1] |

-continued
| No. | | Ar1 | Ar2 |
|---|---|---|---|
| 11-21 | 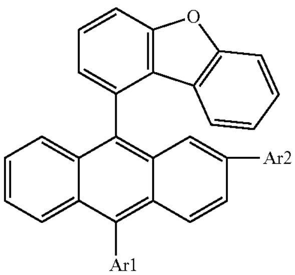 | 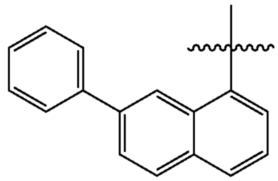 [SMILES: *c1cccc2ccc(-c3ccccc3)cc12] | 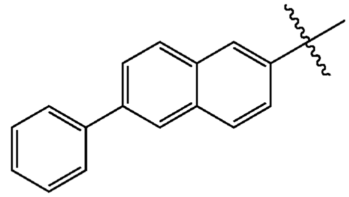 [SMILES: *c1ccc2cc(-c3ccccc3)ccc2c1] |
| 11-22 | 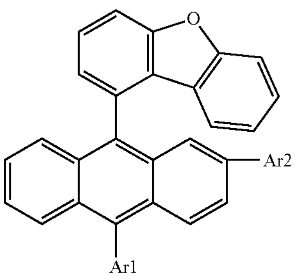 | 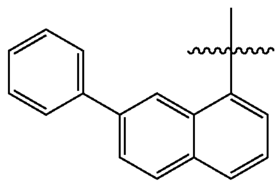 [SMILES: *c1cccc2ccc(-c3ccccc3)cc12] | 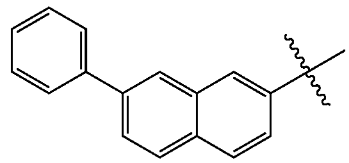 [SMILES: *c1ccc2ccc(-c3ccccc3)cc2c1] |
| 11-23 | 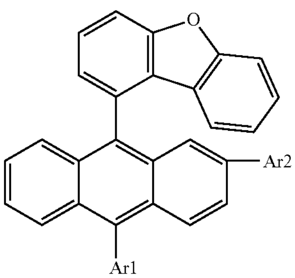 | 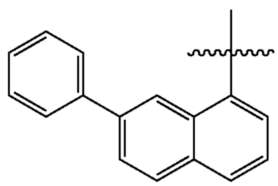 [SMILES: *c1cccc2ccc(-c3ccccc3)cc12] | 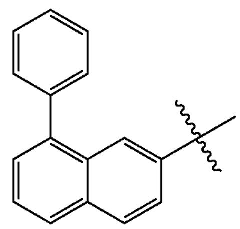 [SMILES: *c1ccc2cccc(-c3ccccc3)c2c1] |
| 11-24 | 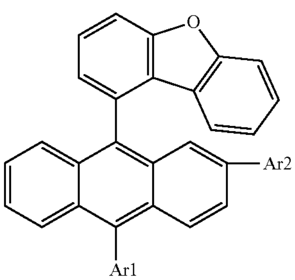 | 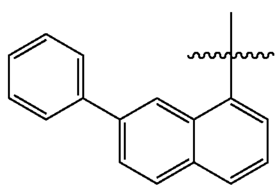 [SMILES: *c1cccc2ccc(-c3ccccc3)cc12] | 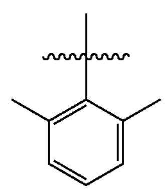 |
| 11-25 | 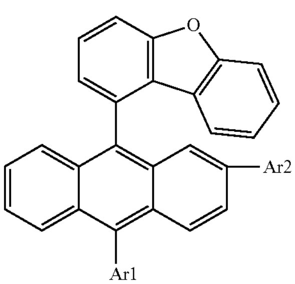 | 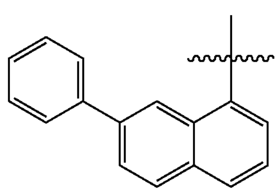 [SMILES: *c1cccc2ccc(-c3ccccc3)cc12] | 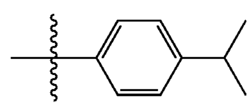 [SMILES: *c1ccc(C(C)C)cc1] |

-continued
| No. | | Ar1 | Ar2 |
|---|---|---|---|
| 11-26 | 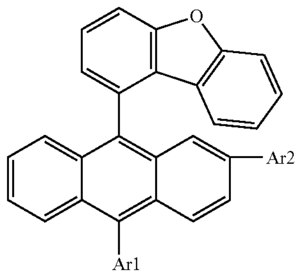 | 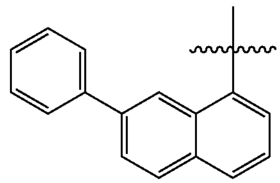 [SMILES: *c1cccc2ccc(-c3ccccc3)cc12] | 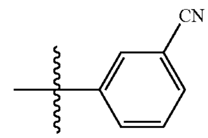 [SMILES: *c1cccc(C#N)c1] |
| 11-27 | 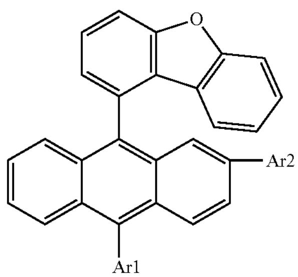 | 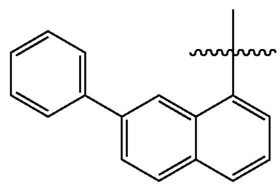 [SMILES: *c1cccc2ccc(-c3ccccc3)cc12] | 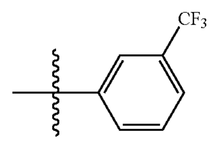 [SMILES: *c1cccc(C(F)(F)F)c1] |
| 11-28 | 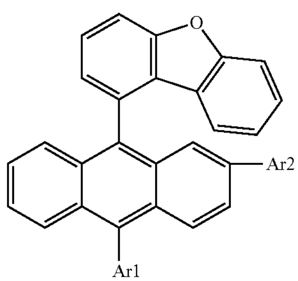 | 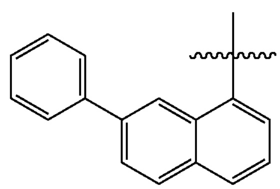 [SMILES: *c1cccc2ccc(-c3ccccc3)cc12] | 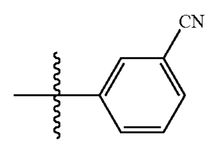 [SMILES: *c1cccc(C#N)c1] |
| 11-29 | 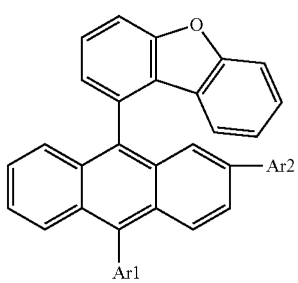 | 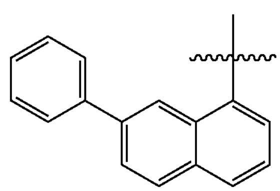 [SMILES: *c1cccc2ccc(-c3ccccc3)cc12] | 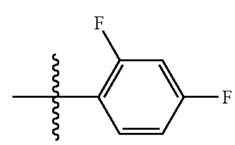 [SMILES: *c1ccc(F)cc1F] |
| 12-1 | 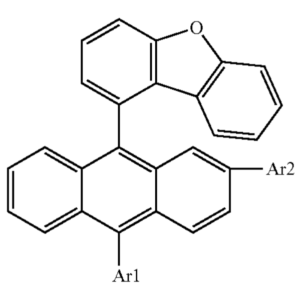 | 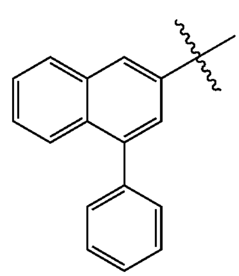 [SMILES: *c1cc(-c2ccccc2)c2ccccc2c1] | 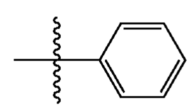 |

-continued
| No. | | Ar1 | Ar2 |
|---|---|---|---|
| 12-2 | 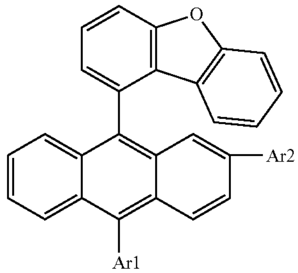 | 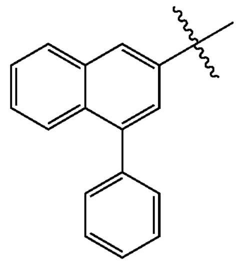 [SMILES: *c1cc(-c2ccccc2)c2ccccc2c1] | 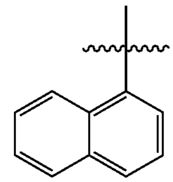 [SMILES: *c1cccc2ccccc12] |
| 12-3 | 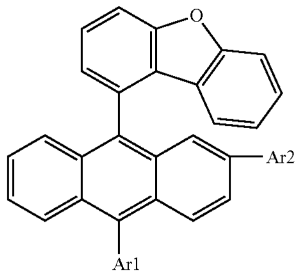 | 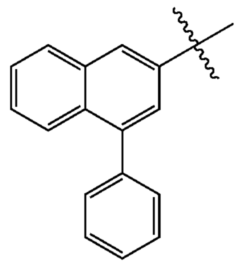 [SMILES: *c1cc(-c2ccccc2)c2ccccc2c1] | 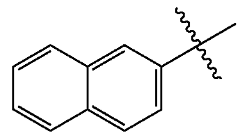 [SMILES: *c1ccc2ccccc2c1] |
| 12-4 | 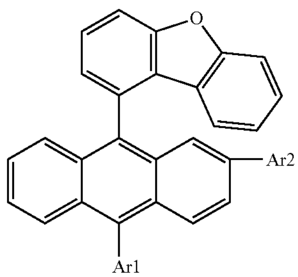 | 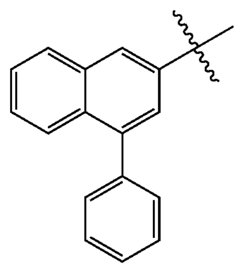 [SMILES: *c1cc(-c2ccccc2)c2ccccc2c1] | 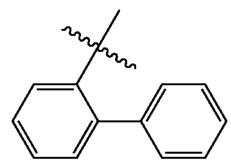 [SMILES: *c1ccccc1-c1ccccc1] |
| 12-5 | 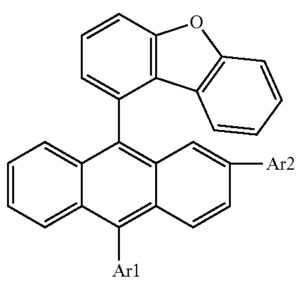 | 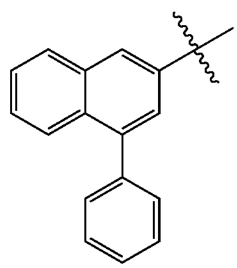 [SMILES: *c1cc(-c2ccccc2)c2ccccc2c1] | 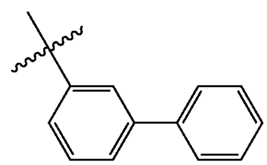 [SMILES: *c1cccc(-c2ccccc2)c1] |
| 12-6 | 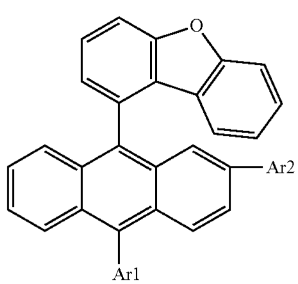 | 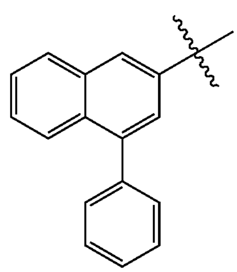 [SMILES: *c1cc(-c2ccccc2)c2ccccc2c1] | 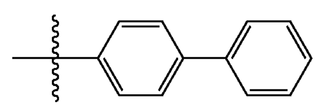 [SMILES: *c1ccc(-c2ccccc2)cc1] |

-continued
| No. | | Ar1 | Ar2 |
|---|---|---|---|
| 12-7 | 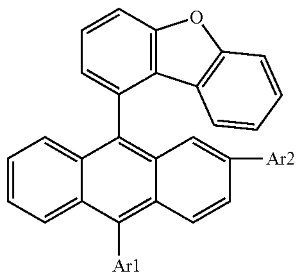 | 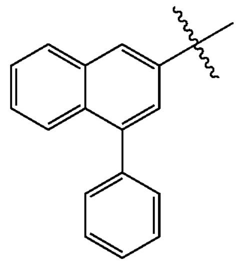 [SMILES: *c1cc(-c2ccccc2)c2ccccc2c1] | 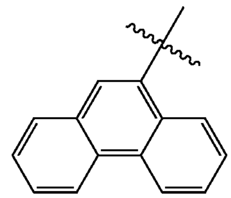 [SMILES: *c1cc2ccccc2c2ccccc12] |
| 12-9 | 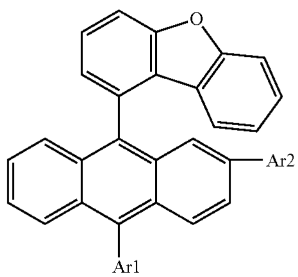 | 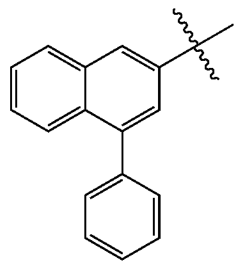 [SMILES: *c1cc(-c2ccccc2)c2ccccc2c1] | 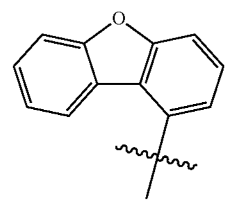 [SMILES: *c1cccc2oc3ccccc3c12] |
| 12-10 | 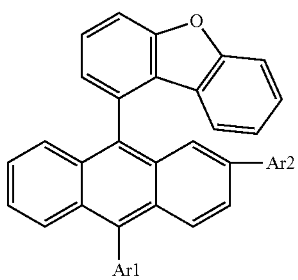 | 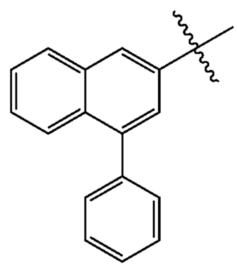 [SMILES: *c1cc(-c2ccccc2)c2ccccc2c1] | 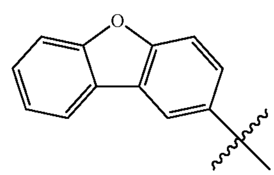 |
| 12-11 | 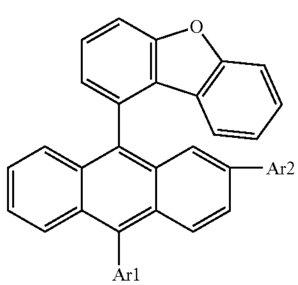 | 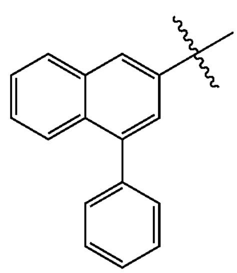 [SMILES: *c1cc(-c2ccccc2)c2ccccc2c1] | 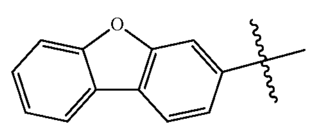 |
| 12-12 | 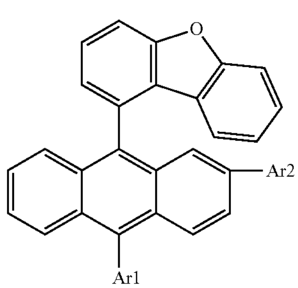 | 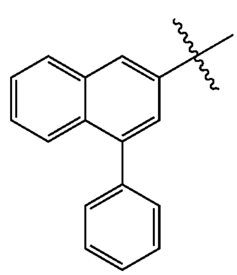 [SMILES: *c1cc(-c2ccccc2)c2ccccc2c1] | 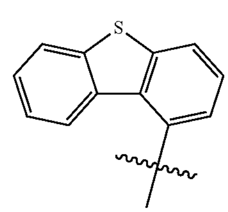 |

-continued
| No. | | Ar1 | Ar2 |
|---|---|---|---|
| 12-13 | 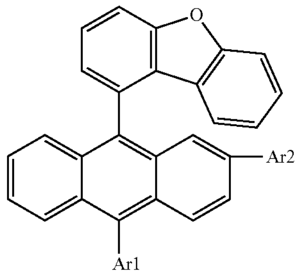 | 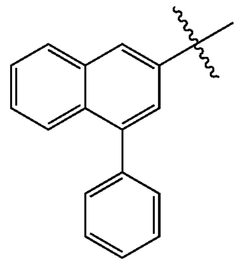 [SMILES: *c1cc(-c2ccccc2)c2ccccc2c1] | 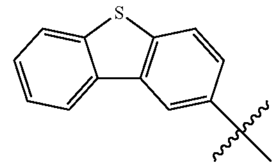 [SMILES: *c1ccc2sc3ccccc3c2c1] |
| 12-14 | 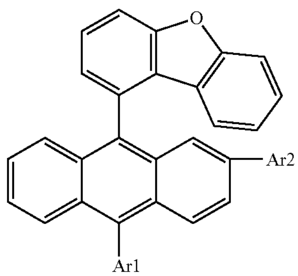 | 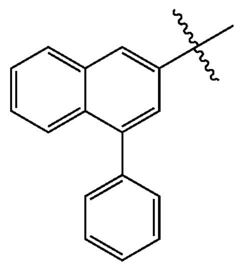 [SMILES: *c1cc(-c2ccccc2)c2ccccc2c1] | 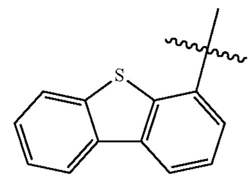 [SMILES: *c1cccc2c1sc1ccccc12] |
| 12-19 | 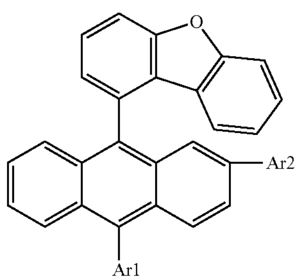 | 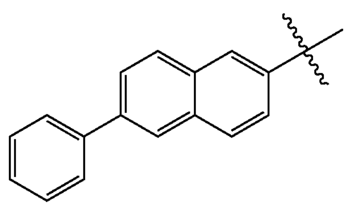 [SMILES: *c1ccc2cc(-c3ccccc3)ccc2c1] | 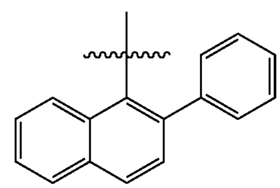 [SMILES: *c1c(-c2ccccc2)ccc2ccccc12] |
| 12-20 | 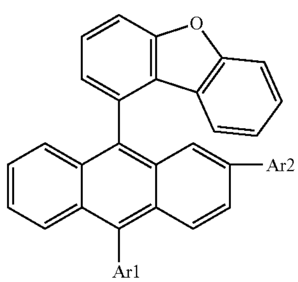 | 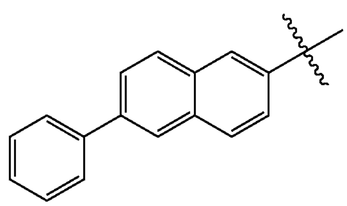 [SMILES: *c1ccc2cc(-c3ccccc3)ccc2c1] | 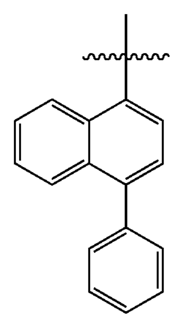 [SMILES: *c1ccc(-c2ccccc2)c2ccccc12] |
| 12-21 | 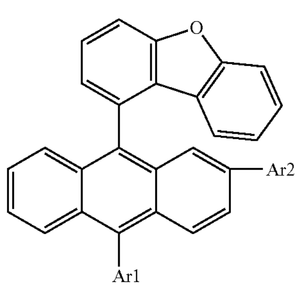 | 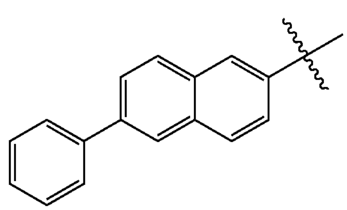 [SMILES: *c1ccc2cc(-c3ccccc3)ccc2c1] | 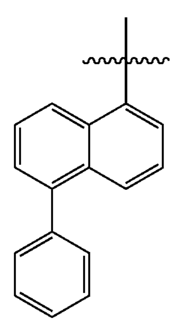 [SMILES: *c1cccc2c(-c3ccccc3)cccc12] |

-continued
| No. | Ar1 | Ar2 |
|---|---|---|
| 12-22 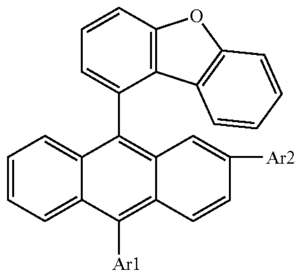 | 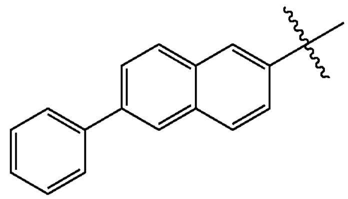 [SMILES: *c1ccc2cc(-c3ccccc3)ccc2c1] | 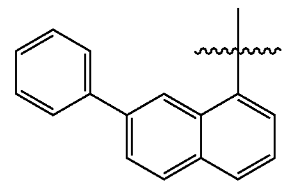 [SMILES: *c1cccc2ccc(-c3ccccc3)cc12] |
| 12-23 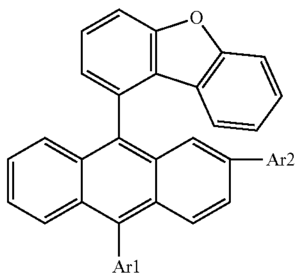 | 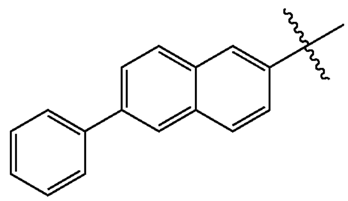 [SMILES: *c1ccc2cc(-c3ccccc3)ccc2c1] | 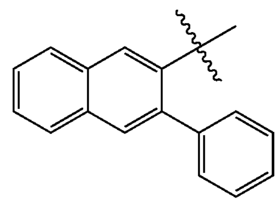 [SMILES: *c1cc2ccccc2cc1-c1ccccc1] |
| 12-24 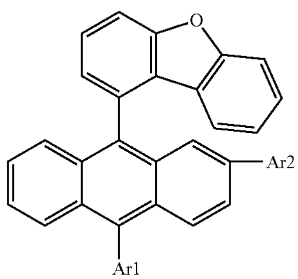 | 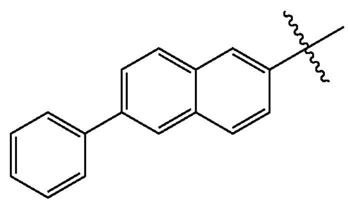 [SMILES: *c1ccc2cc(-c3ccccc3)ccc2c1] | 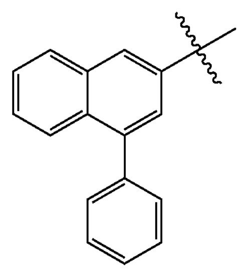 [SMILES: *c1cc(-c2ccccc2)c2ccccc2c1] |
| 12-25 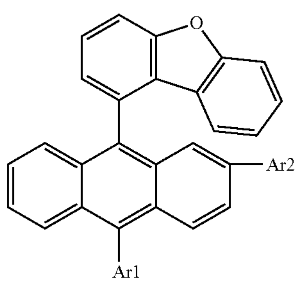 | 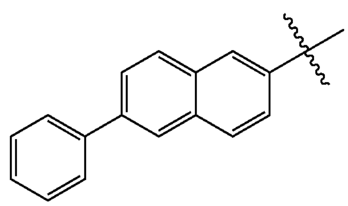 [SMILES: *c1ccc2cc(-c3ccccc3)ccc2c1] | 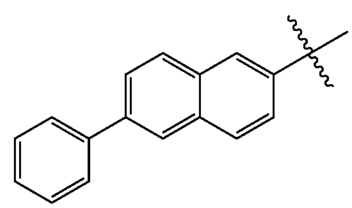 [SMILES: *c1ccc2cc(-c3ccccc3)ccc2c1] |
| 12-26 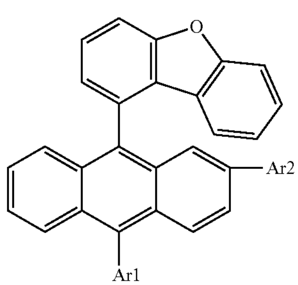 | 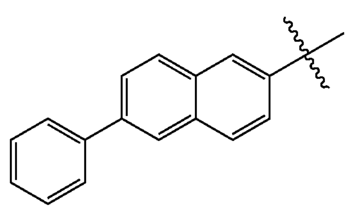 [SMILES: *c1ccc2cc(-c3ccccc3)ccc2c1] | 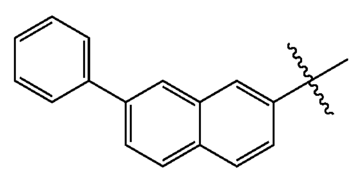 [SMILES: *c1ccc2ccc(-c3ccccc3)cc2c1] |

-continued
| No. | | Ar1 | Ar2 |
|---|---|---|---|
| 12-27 | 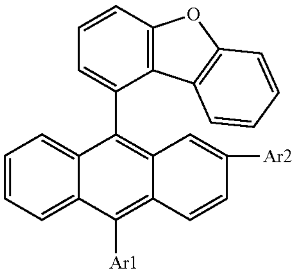 | 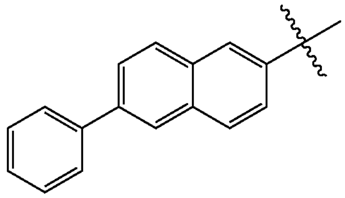 [SMILES: *c1ccc2cc(-c3ccccc3)ccc2c1] | 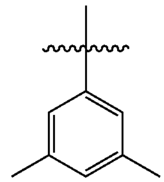 |
| 12-28 | 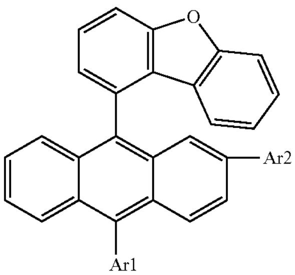 | 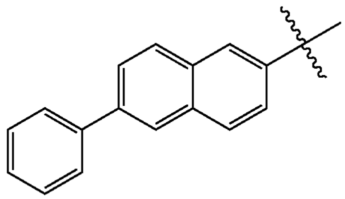 [SMILES: *c1ccc2cc(-c3ccccc3)ccc2c1] | 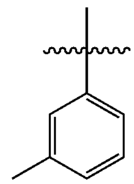 [SMILES: *c1cccc(C)c1] |
| 12-29 | 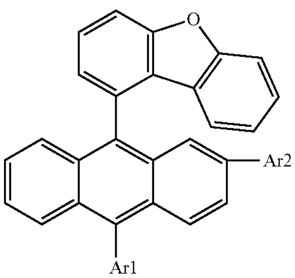 | 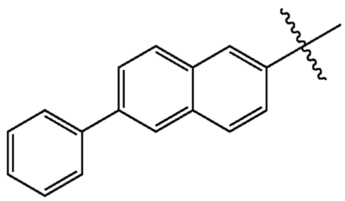 [SMILES: *c1ccc2cc(-c3ccccc3)ccc2c1] | 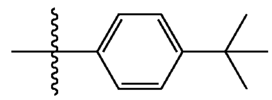 [SMILES: *c1ccc(C(C)(C)C)cc1] |
| 12-30 | 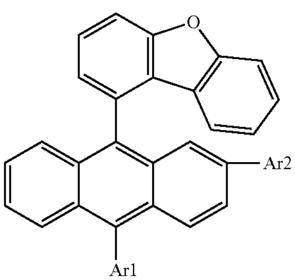 | 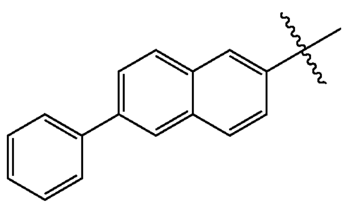 [SMILES: *c1ccc2cc(-c3ccccc3)ccc2c1] | 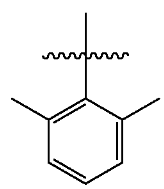 |
| 12-31 | 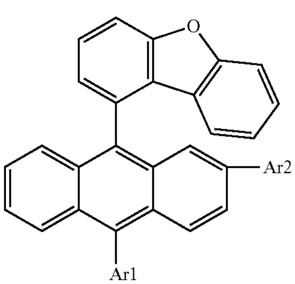 | 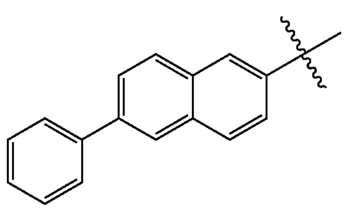 [SMILES: *c1ccc2cc(-c3ccccc3)ccc2c1] | 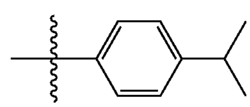 [SMILES: *c1ccc(C(C)C)cc1] |

-continued
| No. | | Ar1 | Ar2 |
|---|---|---|---|
| 13-1 | 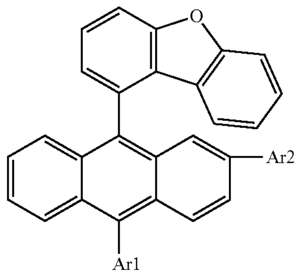 | 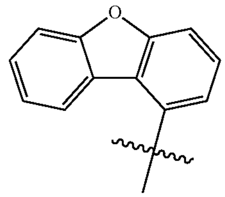 | 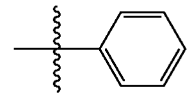 [SMILES: *c1ccccc1] |
| 13-2 | 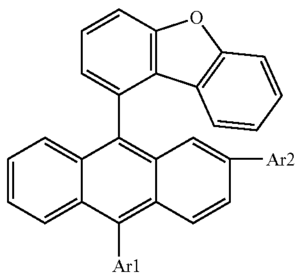 | 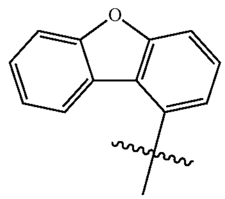 [SMILES: *c1cccc2oc3ccccc3c12] | 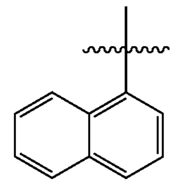 [SMILES: *c1cccc2ccccc12] |
| 13-3 | 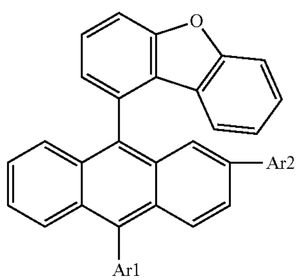 | 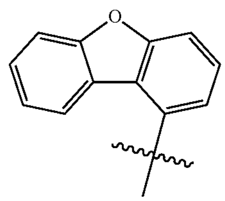 [SMILES: *c1cccc2oc3ccccc3c12] | 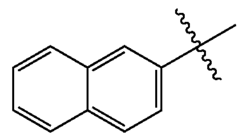 [SMILES: *c1ccc2ccccc2c1] |
| 13-4 | 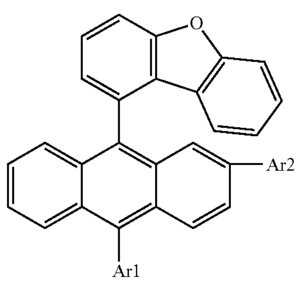 | 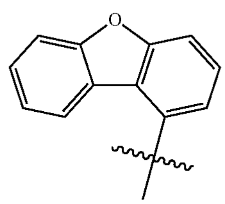 [SMILES: *c1cccc2oc3ccccc3c12] | 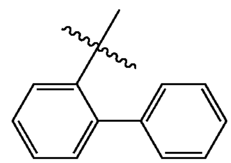 [SMILES: *c1ccccc1-c1ccccc1] |
| 13-5 | 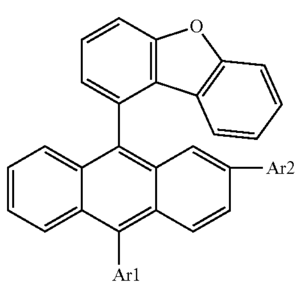 | 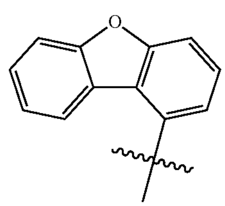 [SMILES: *c1cccc2oc3ccccc3c12] | 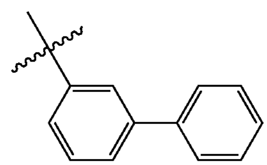 [SMILES: *c1cccc(-c2ccccc2)c1] |

-continued
| No. | | Ar1 | Ar2 |
|---|---|---|---|
| 13-6 | 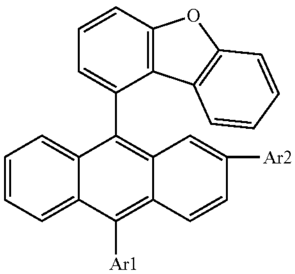 | 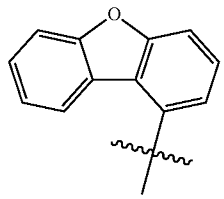 [SMILES: *c1cccc2oc3ccccc3c12] | 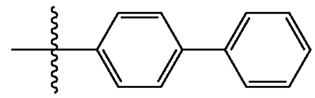 [SMILES: *c1ccc(-c2ccccc2)cc1] |
| 13-7 | 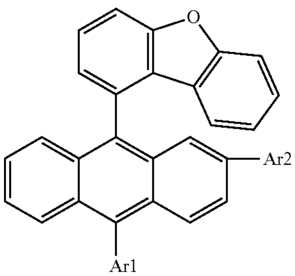 | 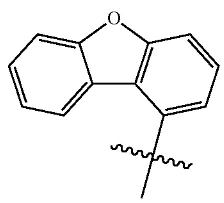 [SMILES: *c1cccc2oc3ccccc3c12] | 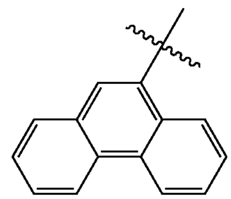 [SMILES: *c1cc2ccccc2c2ccccc12] |
| 13-9 | 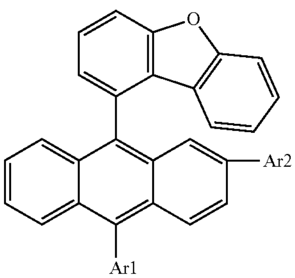 | 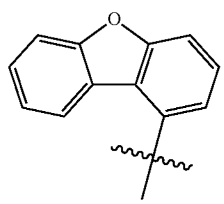 | 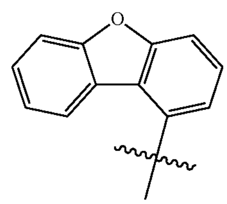 |
| 13-10 | 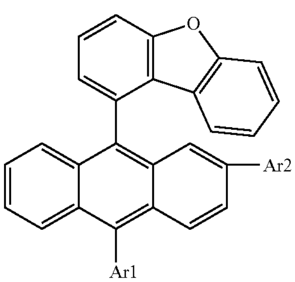 | 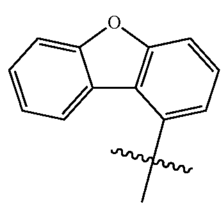 | 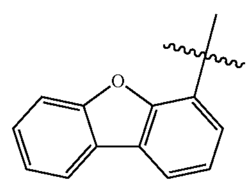 [SMILES: *c1cccc2c1oc1ccccc12] |
| 13-11 | 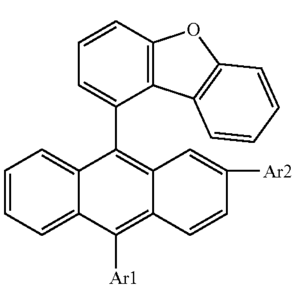 | 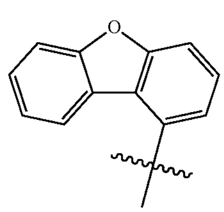 | 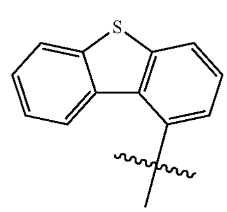 |

-continued
| No. | | Ar1 | Ar2 |
|---|---|---|---|
| 13-12 | 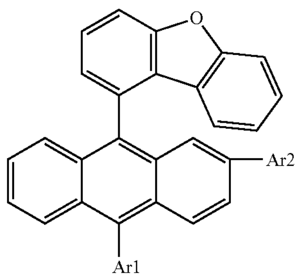 | 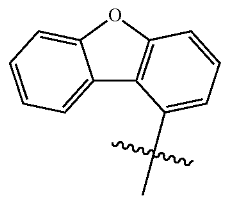 [SMILES: *c1cccc2oc3ccccc3c12] | 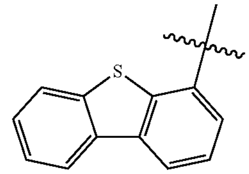 [SMILES: *c1cccc2c1sc1ccccc12] |
| 13-16 | 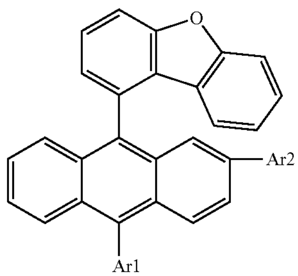 | 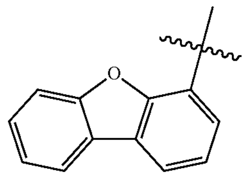 [SMILES: *c1cccc2c1oc1ccccc12] | 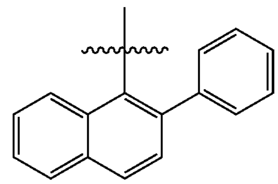 [SMILES: *c1c(-c2ccccc2)ccc2ccccc12] |
| 13-17 | 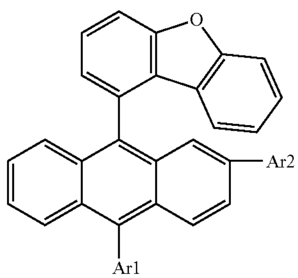 | 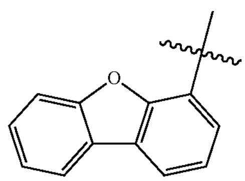 [SMILES: *c1cccc2c1oc1ccccc12] | 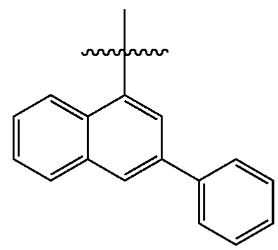 [SMILES: *c1cc(-c2ccccc2)cc2ccccc12] |
| 13-18 | 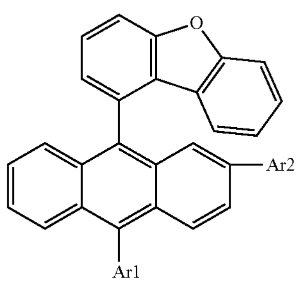 | 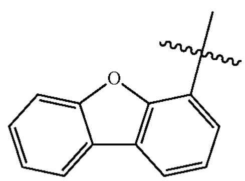 [SMILES: *c1cccc2c1oc1ccccc12] | 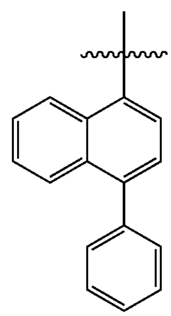 [SMILES: *c1ccc(-c2ccccc2)c2ccccc12] |
| 13-19 | 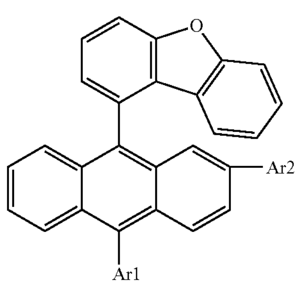 | 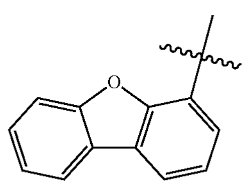 | 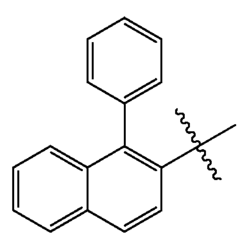 [SMILES: *c1ccc2ccccc2c1-c1ccccc1] |

-continued
| No. | | Ar1 | Ar2 |
|---|---|---|---|
| 13-20 | 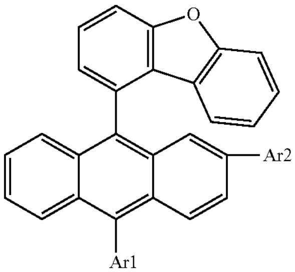 | 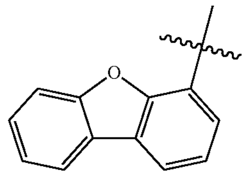 [SMILES: *c1cccc2c1oc1ccccc12] | 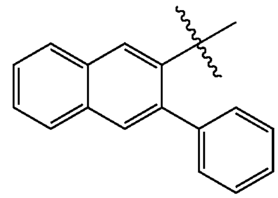 [SMILES: *c1cc2ccccc2cc1-c1ccccc1] |
| 13-21 | 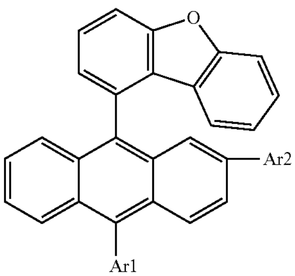 | 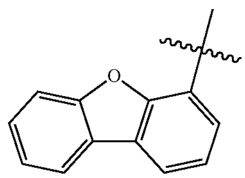 [SMILES: *c1cccc2c1oc1ccccc12] | 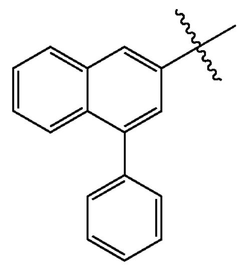 [SMILES: *c1cc(-c2ccccc2)c2ccccc2c1] |
| 13-22 | 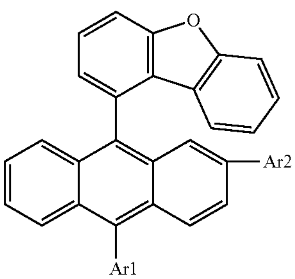 | 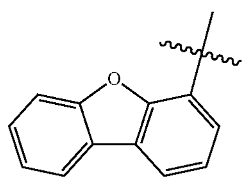 [SMILES: *c1cccc2c1oc1ccccc12] | 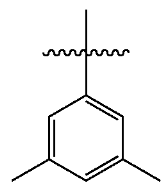 |
| 13-23 | 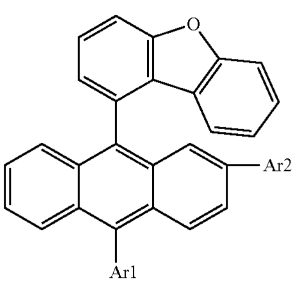 | 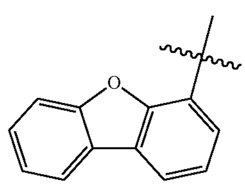 [SMILES: *c1cccc2c1oc1ccccc12] | 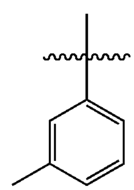 |
| 13-24 | 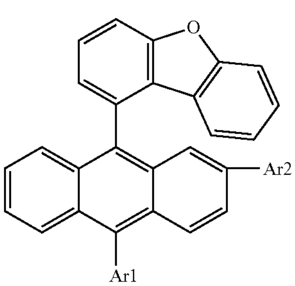 | 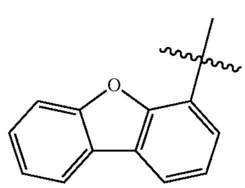 | 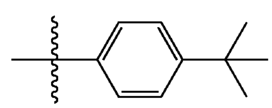 |

-continued
| No. | | Ar1 | Ar2 |
|---|---|---|---|
| 13-25 | 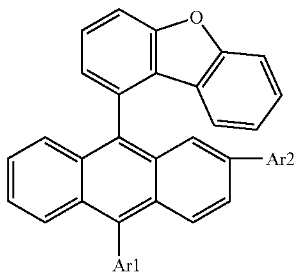 | 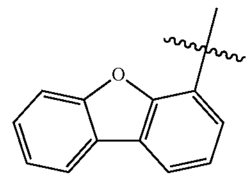 [SMILES: *c1cccc2c1oc1ccccc12] | 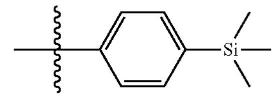 |
| 13-26 | 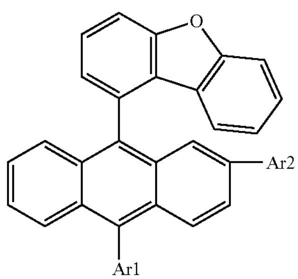 | 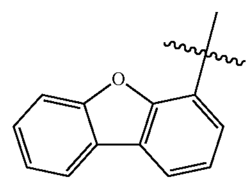 [SMILES: *c1cccc2c1oc1ccccc12] | 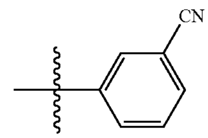 [SMILES: *c1cccc(C#N)c1] |
| 13-27 | 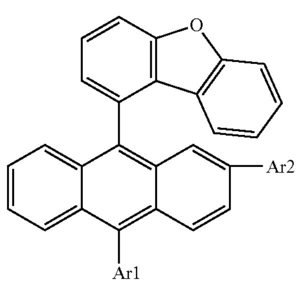 | 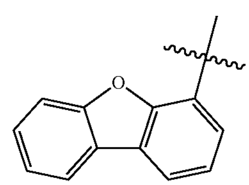 | 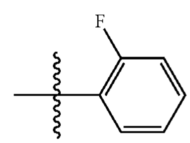 [SMILES: *c1ccccc1F] |
| 13-28 | 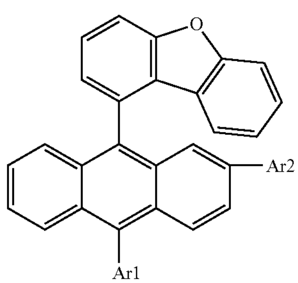 | 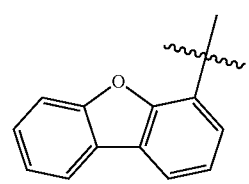 | 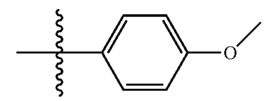 [SMILES: *c1ccc(OC)cc1] |
| 14-1 | 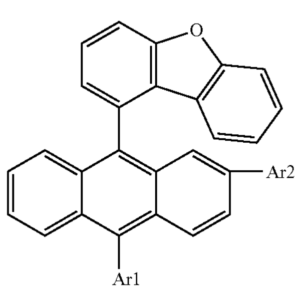 | 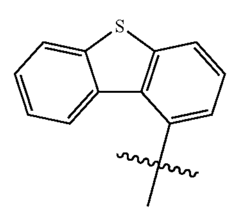 | 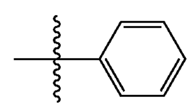 |

-continued
| No. | | Ar1 | Ar2 |
|---|---|---|---|
| 14-2 | 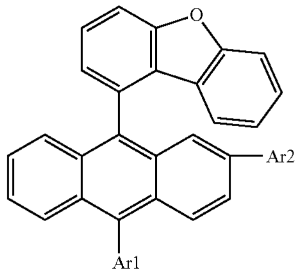 | 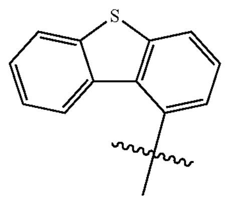 | 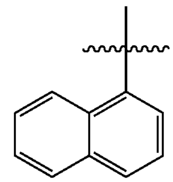 [SMILES: *c1cccc2ccccc12] |
| 14-3 | 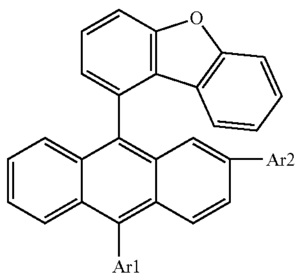 | 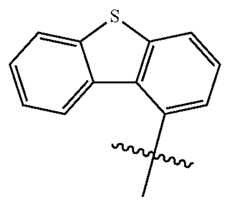 | 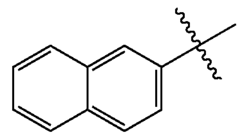 [SMILES: *c1ccc2ccccc2c1] |
| 14-4 | 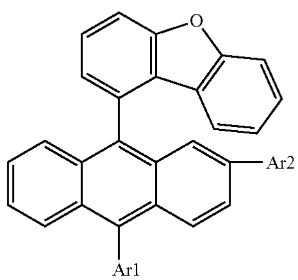 | 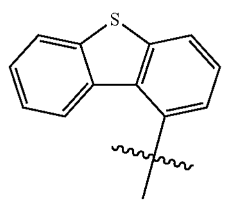 [SMILES: *c1cccc2sc3ccccc3c12] | 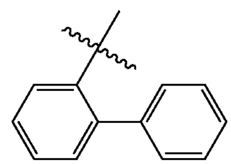 [SMILES: *c1ccccc1-c1ccccc1] |
| 14-5 | 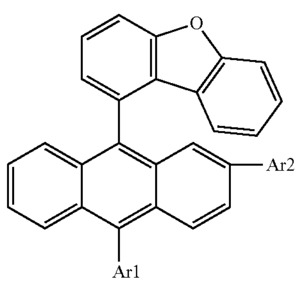 | 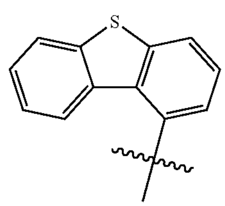 [SMILES: *c1cccc2sc3ccccc3c12] | 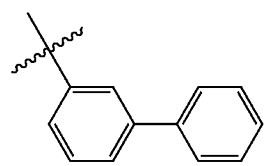 [SMILES: *c1cccc(-c2ccccc2)c1] |
| 14-6 | 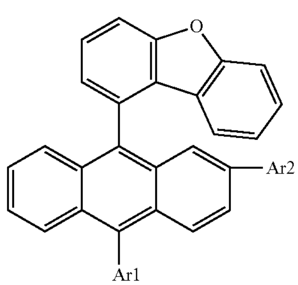 | 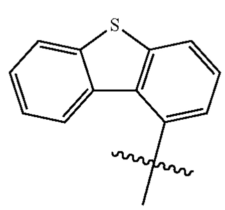 [SMILES: *c1cccc2sc3ccccc3c12] | 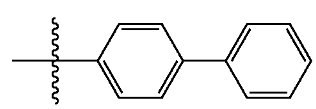 [SMILES: *c1ccc(-c2ccccc2)cc1] |

-continued
| No. | | Ar1 | Ar2 |
|---|---|---|---|
| 14-7 | 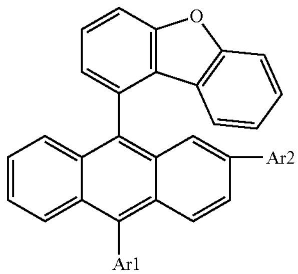 | 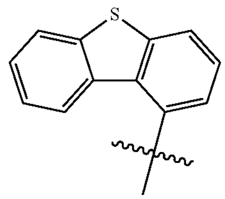 | 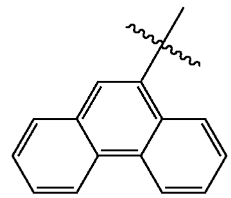 [SMILES: *c1cc2ccccc2c2ccccc12] |
| 14-9 | 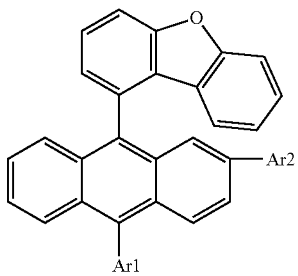 | 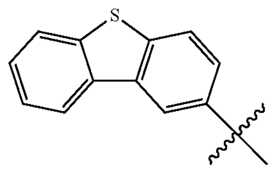 | 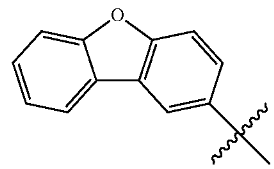 [SMILES: *c1ccc2oc3ccccc3c2c1] |
| 14-10 | 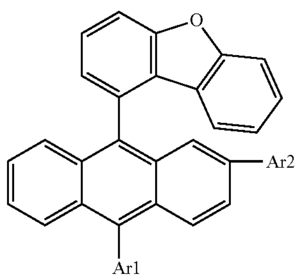 | 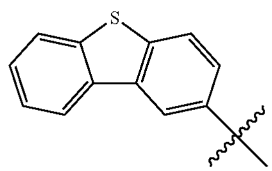 | 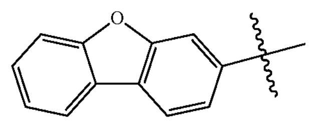 |
| 14-11 | 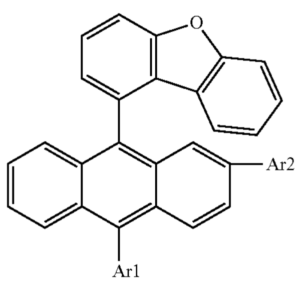 | 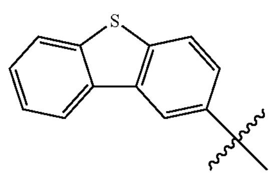 | 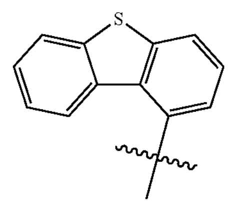 [SMILES: *c1cccc2sc3ccccc3c12] |
| 14-12 | 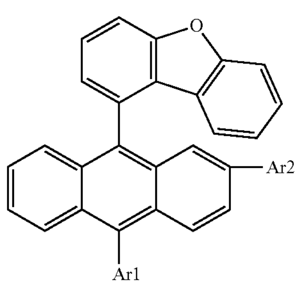 | 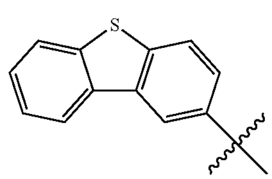 | 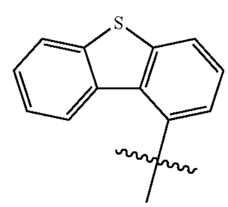 [SMILES: *c1cccc2sc3ccccc3c12] |

-continued
| No. | | Ar1 | Ar2 |
|---|---|---|---|
| 14-13 | 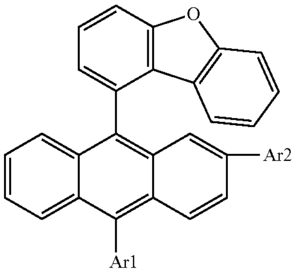 | 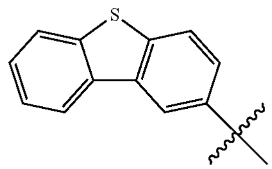 [SMILES: *c1ccc2sc3ccccc3c2c1] | 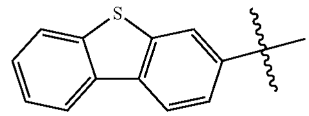 |
| 14-17 | 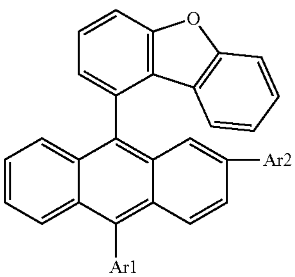 | 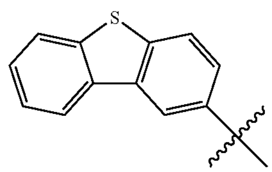 | 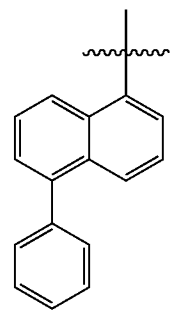 [SMILES: *c1cccc2c(-c3ccccc3)cccc12] |
| 14-18 | 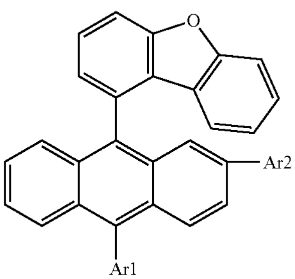 | 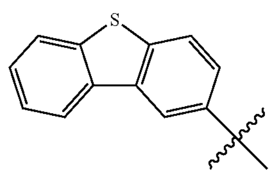 | 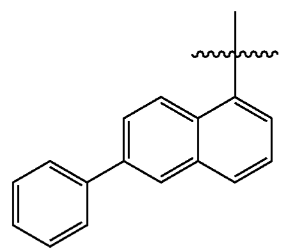 [SMILES: *c1cccc2cc(-c3ccccc3)ccc12] |
| 14-19 | 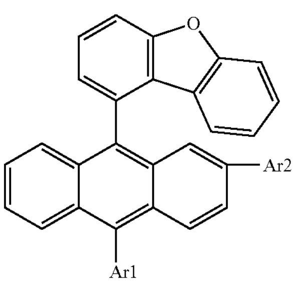 | 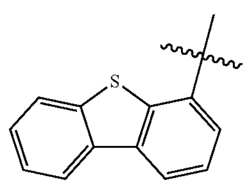 [SMILES: *c1cccc2c1sc1ccccc12] | 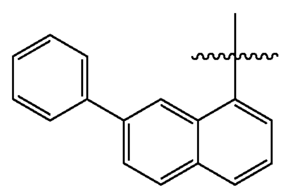 [SMILES: *c1cccc2ccc(-c3ccccc3)cc12] |
| 14-20 | 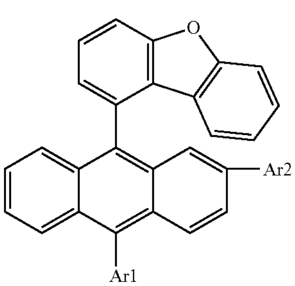 | 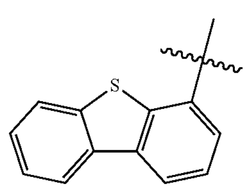 [SMILES: *c1cccc2c1sc1ccccc12] | 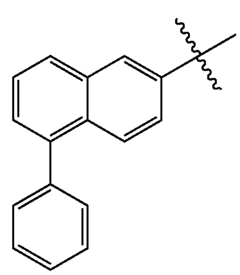 [SMILES: *c1ccc2c(-c3ccccc3)cccc2c1] |

-continued
| No. | | Ar1 | Ar2 |
|---|---|---|---|
| 14-21 | 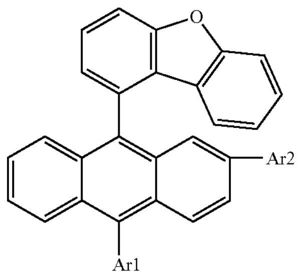 | 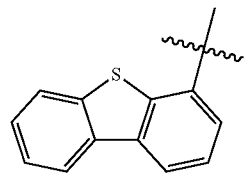 [SMILES: *c1cccc2c1sc1ccccc12] | 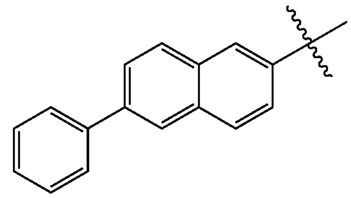 [SMILES: *c1ccc2cc(-c3ccccc3)ccc2c1] |
| 14-22 | 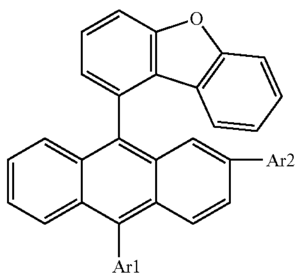 | 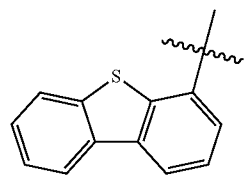 | 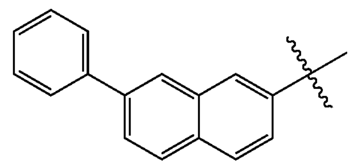 [SMILES: *c1ccc2ccc(-c3ccccc3)cc2c1] |
| 14-23 | 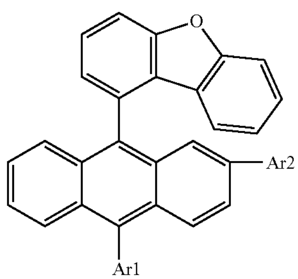 | 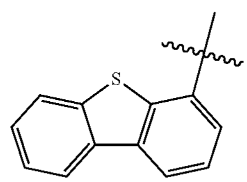 | 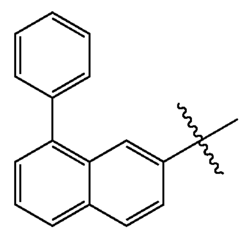 [SMILES: *c1ccc2cccc(-c3ccccc3)c2c1] |
| 14-24 | 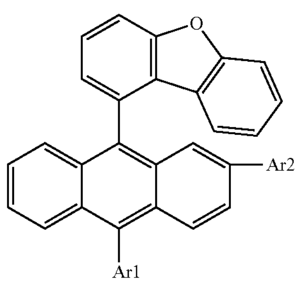 | 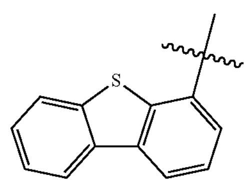 [SMILES: *c1cccc2c1sc1ccccc12] | 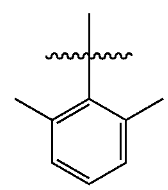 |
| 14-25 | 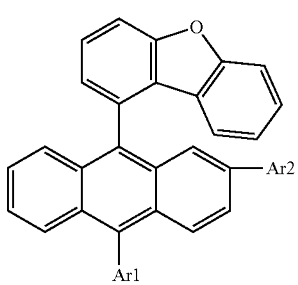 | 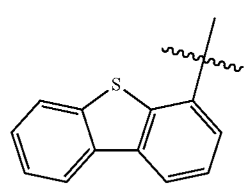 | 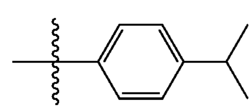 [SMILES: *c1ccc(C(C)C)cc1] |

-continued
| No. | | Ar1 | Ar2 |
|---|---|---|---|
| 14-26 | 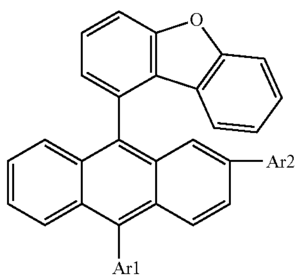 | 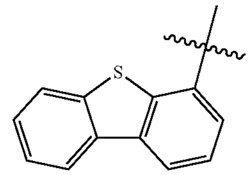 | 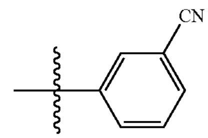 [SMILES: *c1cccc(C#N)c1] |
| 14-27 | 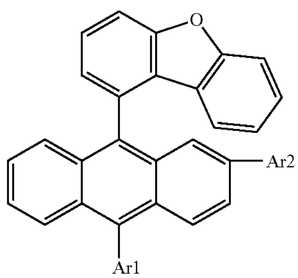 | 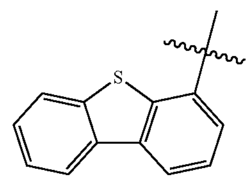 | 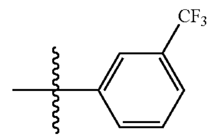 [SMILES: *c1cccc(C(F)(F)F)c1] |
| 14-28 | 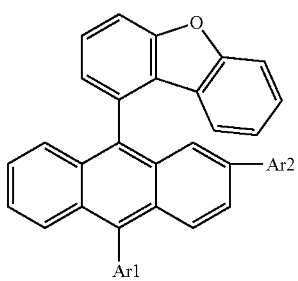 | 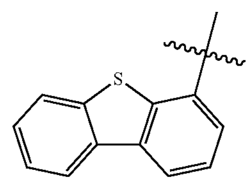 | 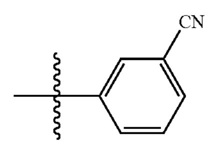 [SMILES: *c1cccc(C#N)c1] |
| 14-29 | 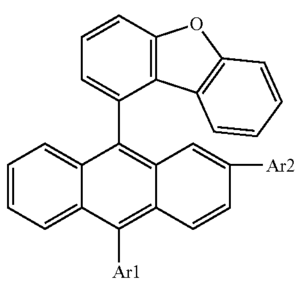 | 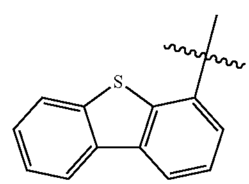 | 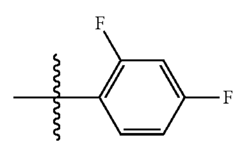 [SMILES: *c1ccc(F)cc1F] |
| 15-1 | 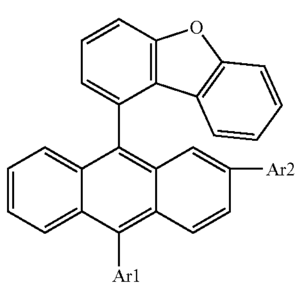 | 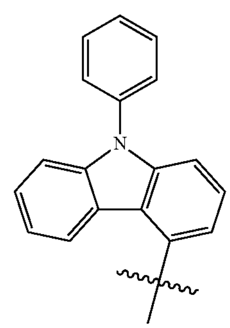 [SMILES: *c1cccc2c1c1ccccc1n2-c1ccccc1] | 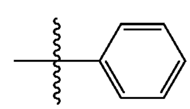 [SMILES: *c1ccccc1] |

-continued
| No. | | Ar1 | Ar2 |
|---|---|---|---|
| 15-2 | 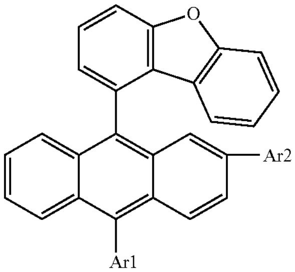  | 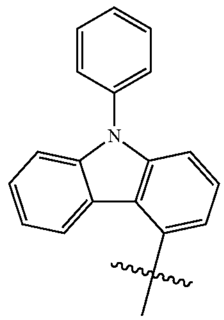 [SMILES: *c1cccc2c1c1ccccc1n2-c1ccccc1] | 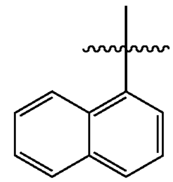 [SMILES: *c1cccc2ccccc12] |
| 15-3 | 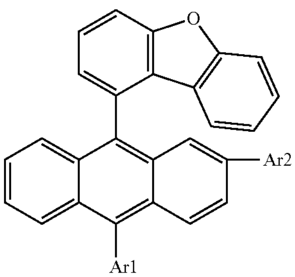  | 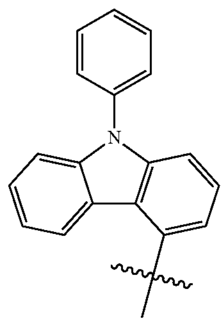 [SMILES: *c1cccc2c1c1ccccc1n2-c1ccccc1] | 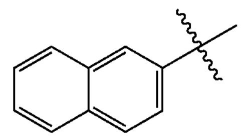 [SMILES: *c1ccc2ccccc2c1] |
| 15-4 | 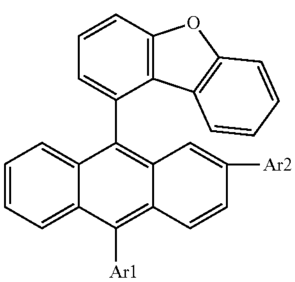  | 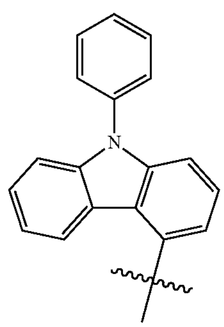 [SMILES: *c1cccc2c1c1ccccc1n2-c1ccccc1] | 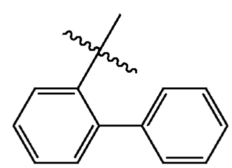 [SMILES: *c1ccccc1-c1ccccc1] |
| 15-5 | 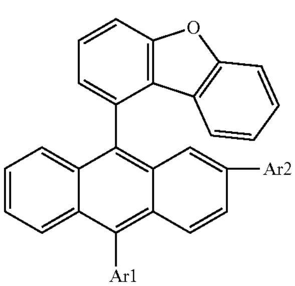  | 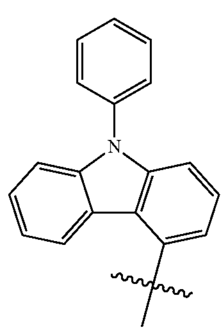 [SMILES: *c1cccc2c1c1ccccc1n2-c1ccccc1] | 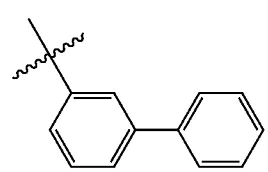 [SMILES: *c1cccc(-c2ccccc2)c1] |

-continued
| No. | | Ar1 | Ar2 |
|---|---|---|---|
| 15-6 | 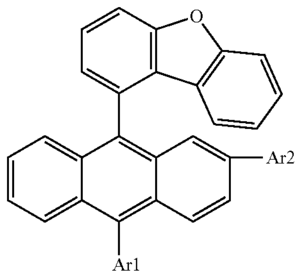 | 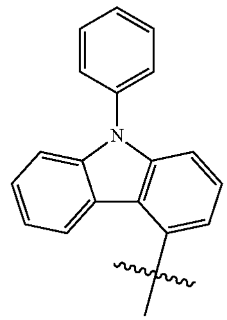 [SMILES: *c1cccc2c1c1ccccc1n2-c1ccccc1] | 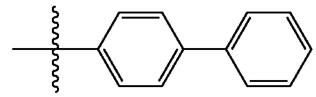 |
| 15-7 | 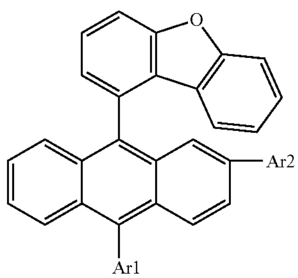 | 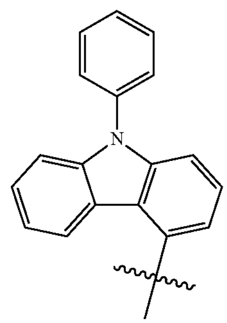 [SMILES: *c1cccc2c1c1ccccc1n2-c1ccccc1] | 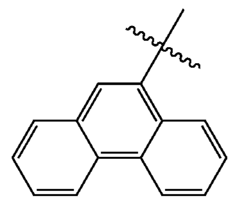 [SMILES: *c1cc2ccccc2c2ccccc12] |
| 15-9 | 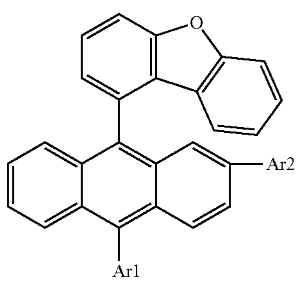 | 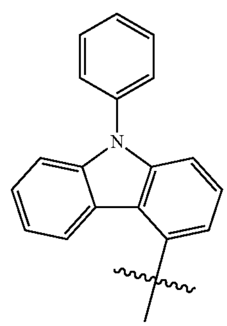 [SMILES: *c1cccc2c1c1ccccc1n2-c1ccccc1] | 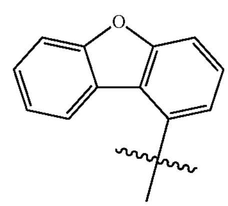 [SMILES: *c1cccc2oc3ccccc3c12] |
| 15-10 | 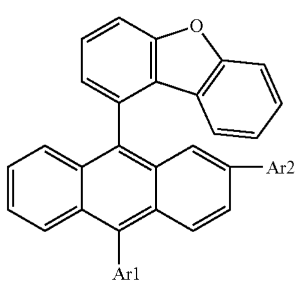 | 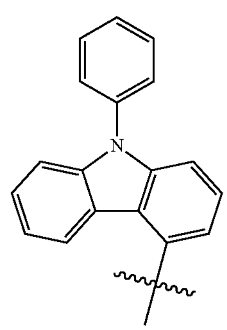 [SMILES: *c1cccc2c1c1ccccc1n2-c1ccccc1] | 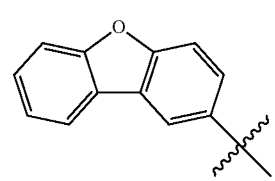 |

-continued
| No. | | Ar1 | Ar2 |
|---|---|---|---|
| 15-11 | 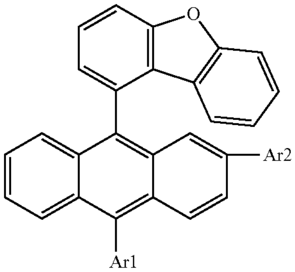 | 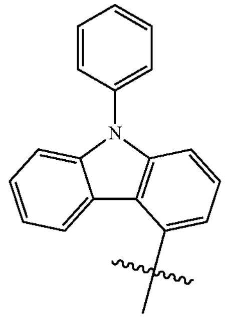 [SMILES: *c1cccc2c1c1ccccc1n2-c1ccccc1] | 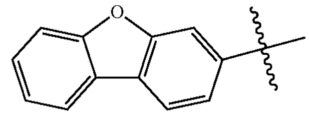 |
| 15-12 | 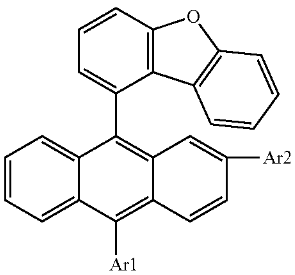 | 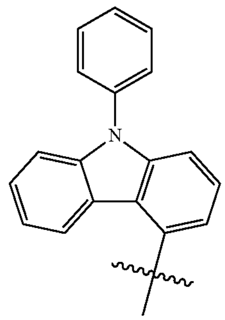 [SMILES: *c1cccc2c1c1ccccc1n2-c1ccccc1] | 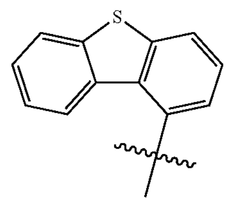 [SMILES: *c1cccc2sc3ccccc3c12] |
| 15-13 | 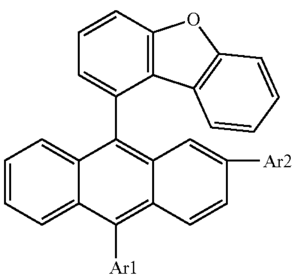 | 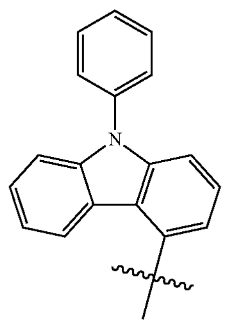 [SMILES: *c1cccc2c1c1ccccc1n2-c1ccccc1] | 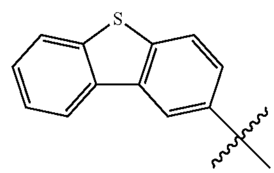 |
| 15-14 | 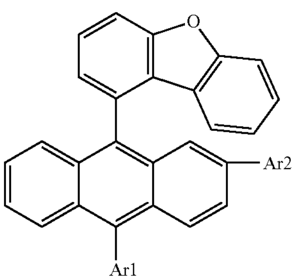 | 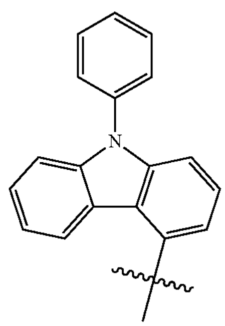 [SMILES: *c1cccc2c1c1ccccc1n2-c1ccccc1] | 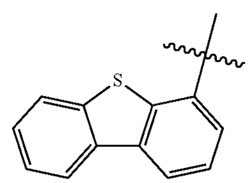 [SMILES: *c1cccc2c1sc1ccccc12] |
| 15-19 | 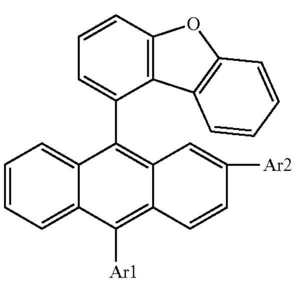 | 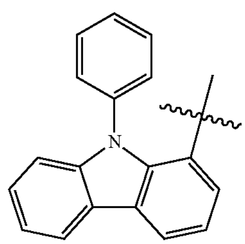 [SMILES: *c1cccc2c3ccccc3n(-c3ccccc3)c12] | 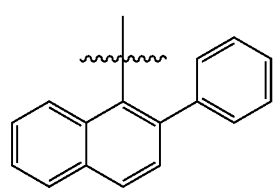 [SMILES: *c1c(-c2ccccc2)ccc2ccccc12] |

-continued
| No. | | Ar1 | Ar2 |
|---|---|---|---|
| 15-20 | 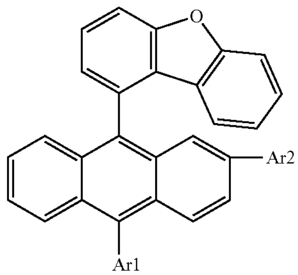 | 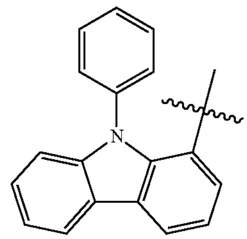 [SMILES: *c1cccc2c3ccccc3n(-c3ccccc3)c12] | 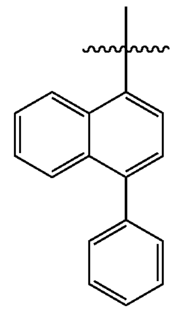 [SMILES: *c1ccc(-c2ccccc2)c2ccccc12] |
| 15-21 | 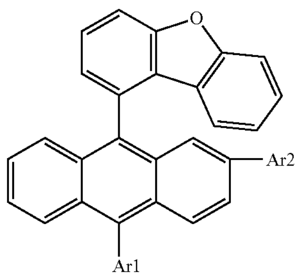 | 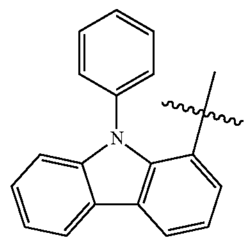 [SMILES: *c1cccc2c3ccccc3n(-c3ccccc3)c12] | 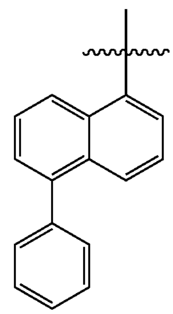 [SMILES: *c1cccc2c(-c3ccccc3)cccc12] |
| 15-22 | 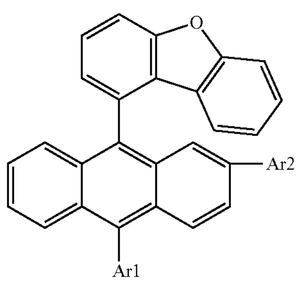 | 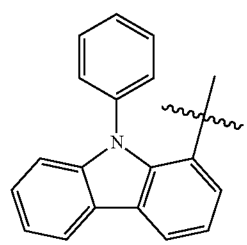 [SMILES: *c1cccc2c3ccccc3n(-c3ccccc3)c12] | 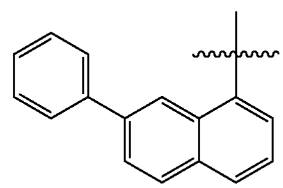 [SMILES: *c1cccc2ccc(-c3ccccc3)cc12] |
| 15-23 | 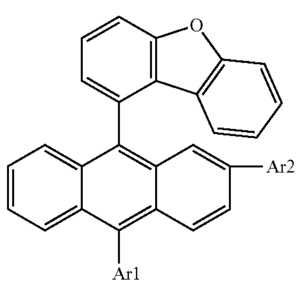 | 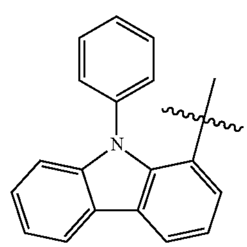 [SMILES: *c1cccc2c3ccccc3n(-c3ccccc3)c12] | 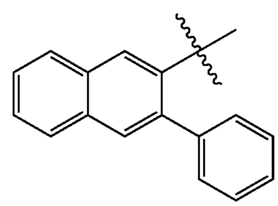 [SMILES: *c1cc2ccccc2cc1-c1ccccc1] |
| 15-24 | 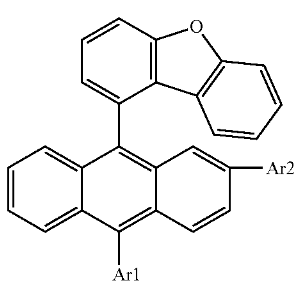 | 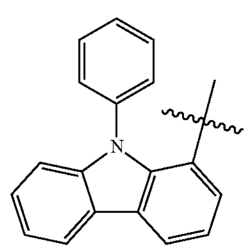 [SMILES: *c1cccc2c3ccccc3n(-c3ccccc3)c12] | 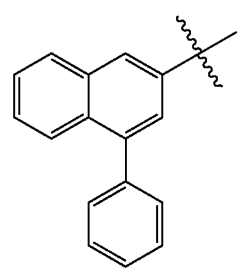 [SMILES: *c1cc(-c2ccccc2)c2ccccc2c1] |

-continued
| No. | | Ar1 | Ar2 |
|---|---|---|---|
| 15-25 | 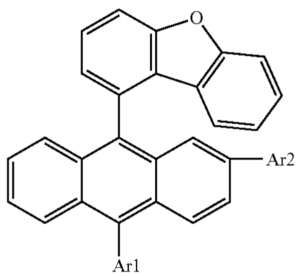 | 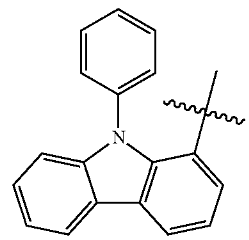 [SMILES: *c1cccc2c3ccccc3n(-c3ccccc3)c12] | 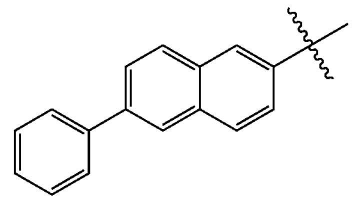 [SMILES: *c1ccc2cc(-c3ccccc3)ccc2c1] |
| 15-26 | 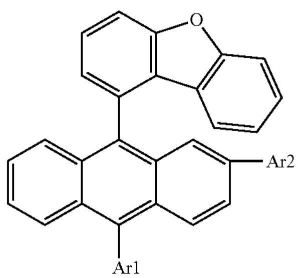 | 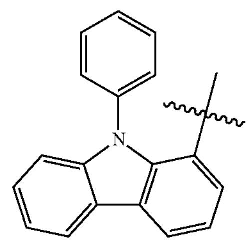 [SMILES: *c1cccc2c3ccccc3n(-c3ccccc3)c12] | 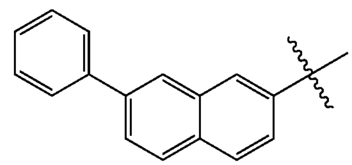 [SMILES: *c1ccc2ccc(-c3ccccc3)cc2c1] |
| 15-27 | 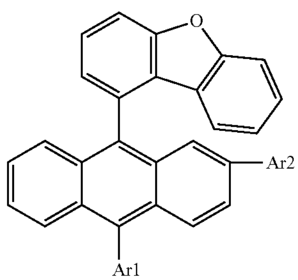 | 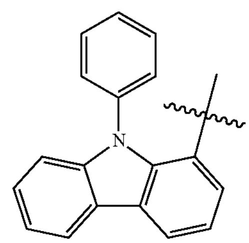 [SMILES: *c1cccc2c3ccccc3n(-c3ccccc3)c12] | 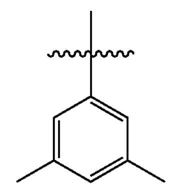 |
| 15-28 | 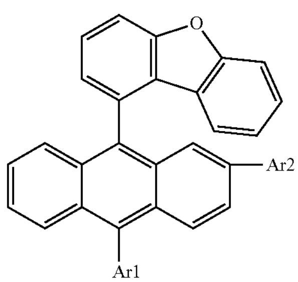 | 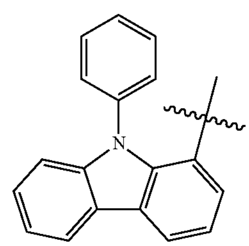 [SMILES: *c1cccc2c3ccccc3n(-c3ccccc3)c12] | 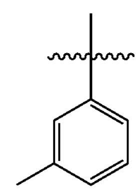 [SMILES: *c1cccc(C)c1] |
| 15-29 | 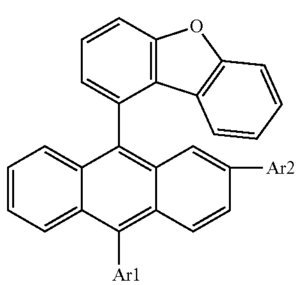 | 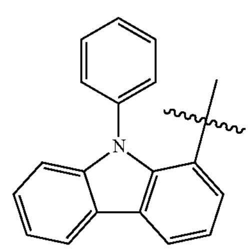 [SMILES: *c1cccc2c3ccccc3n(-c3ccccc3)c12] | 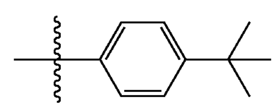 [SMILES: *c1ccc(C(C)(C)C)cc1] |

-continued
| No. | | Ar1 | Ar2 |
|---|---|---|---|
| 15-30 | 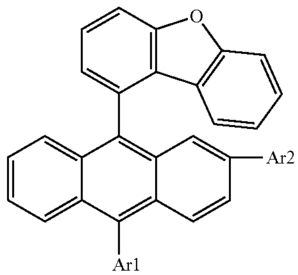 | 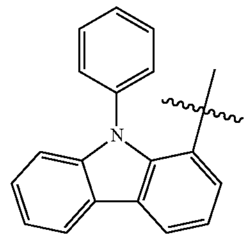 [SMILES: *c1cccc2c3ccccc3n(-c3ccccc3)c12] | 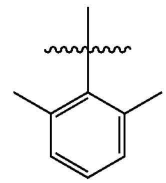 |
| 15-31 | 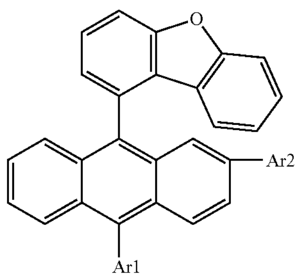 | 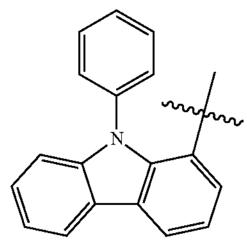 [SMILES: *c1cccc2c3ccccc3n(-c3ccccc3)c12] | 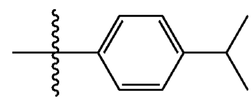 [SMILES: *c1ccc(C(C)C)cc1] |
| 16-1 | 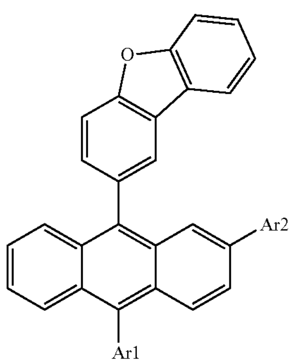 | 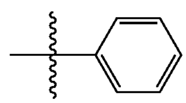 [SMILES: *c1ccccc1] | 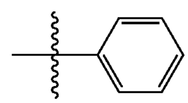 [SMILES: *c1ccccc1] |
| 16-2 | 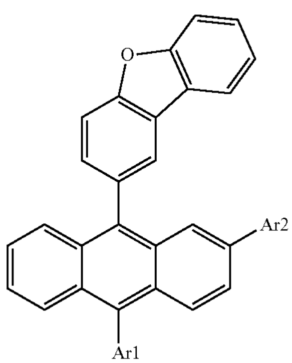 | 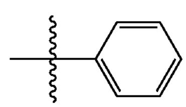 [SMILES: *c1ccccc1] | 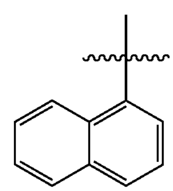 [SMILES: *c1cccc2ccccc12] |

-continued
| No. | | Ar1 | Ar2 |
|---|---|---|---|
| 16-3 | 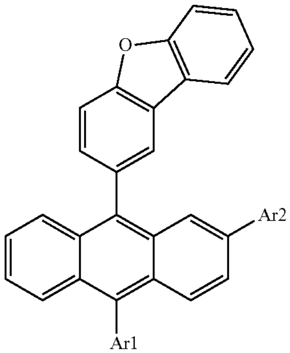 | 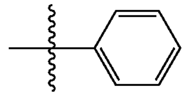 | 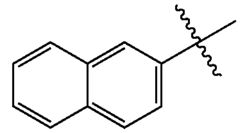 [SMILES: *c1ccc2ccccc2c1] |
| 16-4 | 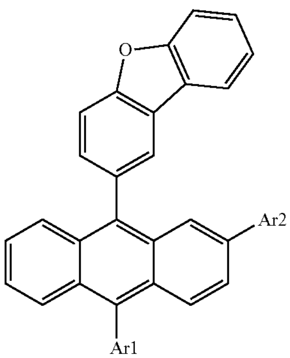 | 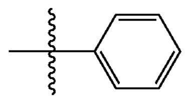 [SMILES: *c1ccccc1] | 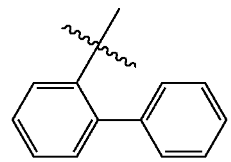 [SMILES: *c1ccccc1-c1ccccc1] |
| 16-5 | 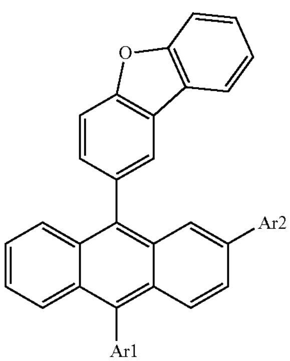 | 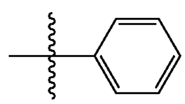 | 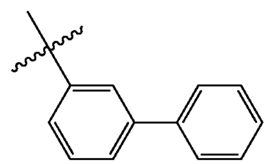 [SMILES: *c1cccc(-c2ccccc2)c1] |
| 16-6 | 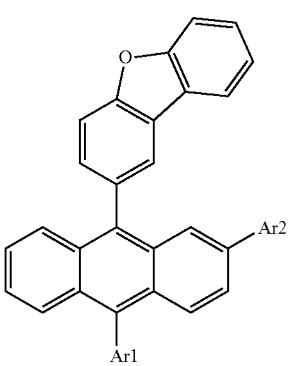 | 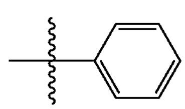 [SMILES: *c1ccccc1] | 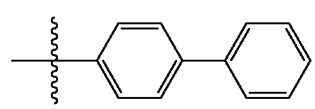 [SMILES: *c1ccc(-c2ccccc2)cc1] |

-continued
| No. | | Ar1 | Ar2 |
|---|---|---|---|
| 16-7 | 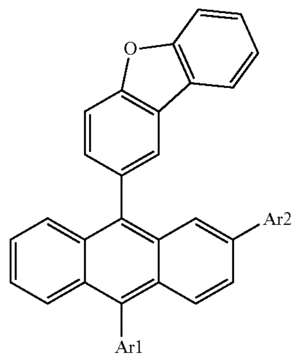 | 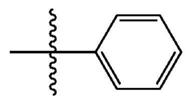 [SMILES: *c1ccccc1] | 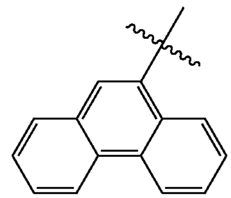 [SMILES: *c1cc2ccccc2c2ccccc12] |
| 16-9 | 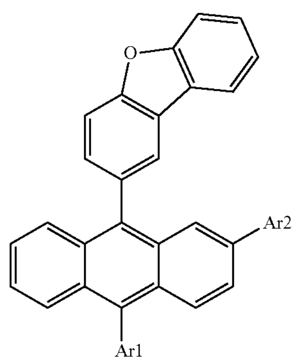 | 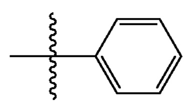 | 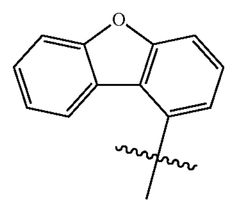 |
| 16-10 | 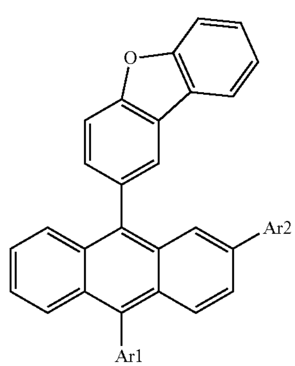 | 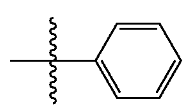 | 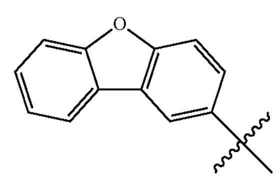 [SMILES: *c1ccc2oc3ccccc3c2c1] |
| 16-11 | 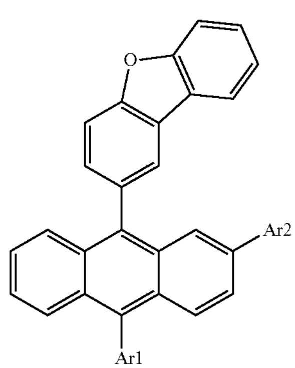 | 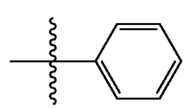 [SMILES: *c1ccccc1] | 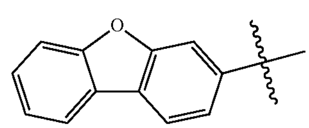 [SMILES: *c1ccc2c(c1)oc1ccccc12] |

-continued
| No. | | Ar1 | Ar2 |
|---|---|---|---|
| 16-12 | 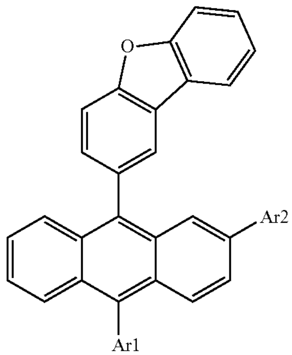 | 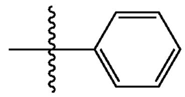 [SMILES: *c1ccccc1] | 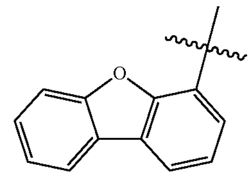 |
| 16-13 | 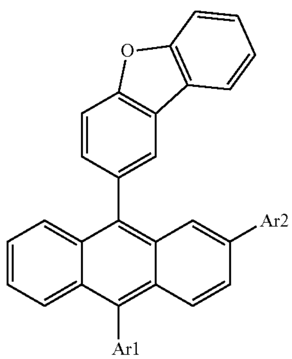 | 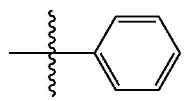 [SMILES: *c1ccccc1] | 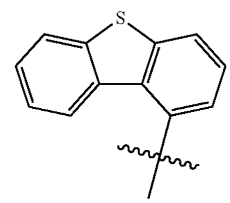 |
| 16-14 | 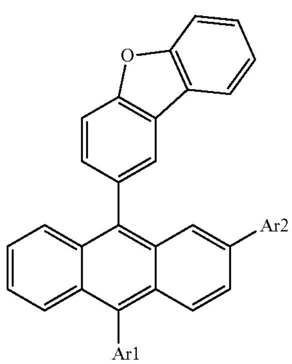 | 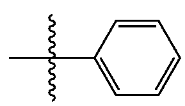 | 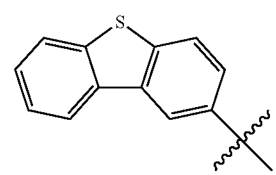 |
| 16-15 | 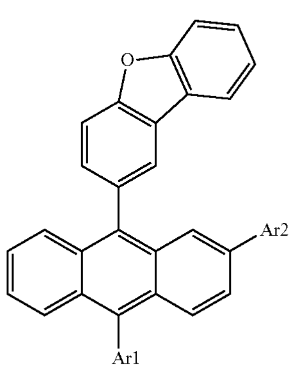 | 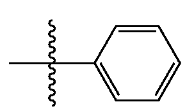 [SMILES: *c1ccccc1] | 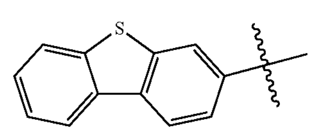 [SMILES: *c1ccc2c(c1)sc1ccccc12] |

-continued
| No. | | Ar1 | Ar2 |
|---|---|---|---|
| 16-16 | 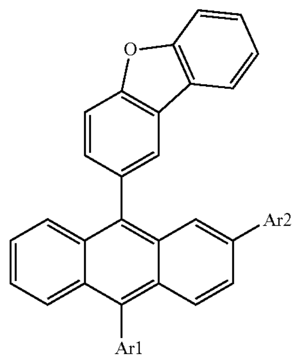 | 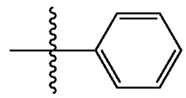 [SMILES: *c1ccccc1] | 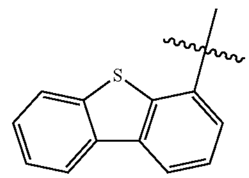 |
| 16-22 | 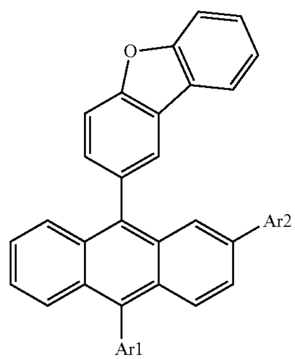 | 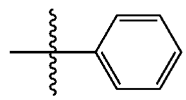 | 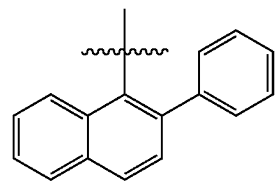 [SMILES: *c1c(-c2ccccc2)ccc2ccccc12] |
| 16-23 | 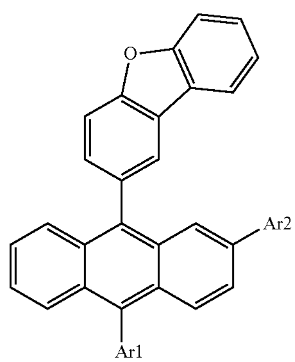 | 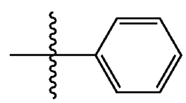 [SMILES: *c1ccccc1] | 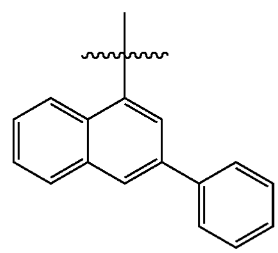 [SMILES: *c1cc(-c2ccccc2)cc2ccccc12] |
| 16-24 | 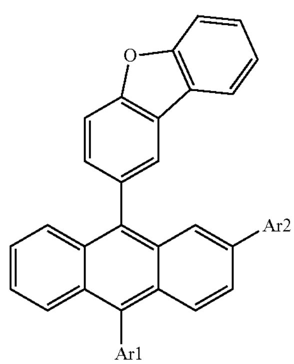 | 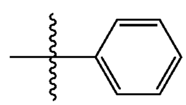 | 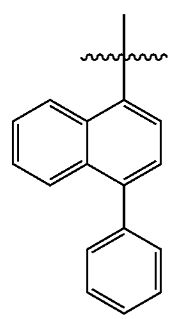 [SMILES: *c1ccc(-c2ccccc2)c2ccccc12] |

-continued
| No. | | Ar1 | Ar2 |
|---|---|---|---|
| 16-25 | 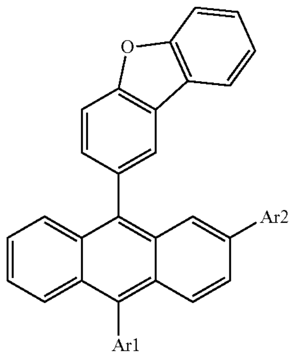 | 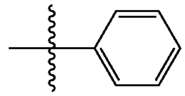 | 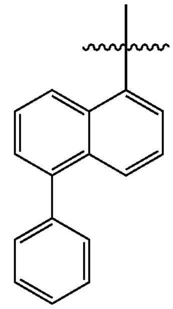 [SMILES: *c1cccc2c(-c3ccccc3)cccc12] |
| 16-26 | 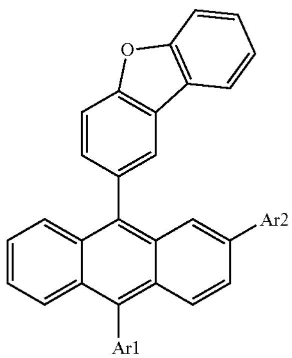 | 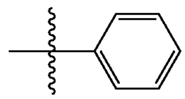 [SMILES: *c1ccccc1] | 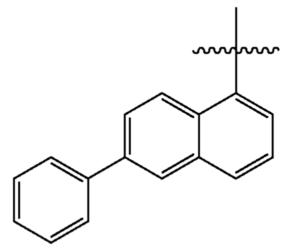 [SMILES: *c1cccc2cc(-c3ccccc3)ccc12] |
| 16-27 | 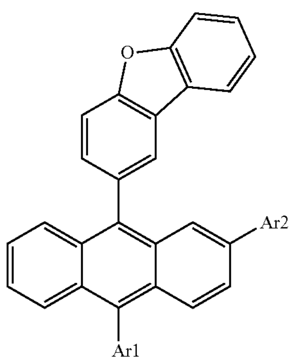 | 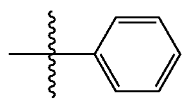 [SMILES: *c1ccccc1] | 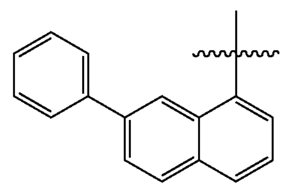 [SMILES: *c1cccc2ccc(-c3ccccc3)cc12] |
| 16-28 | 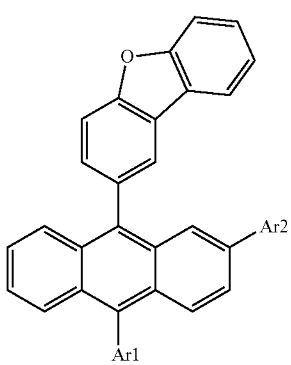 | 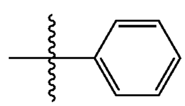 | 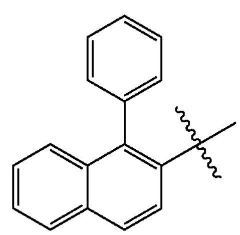 [SMILES: *c1ccc2ccccc2c1-c1ccccc1] |

-continued
| No. | | Ar1 | Ar2 |
|---|---|---|---|
| 16-29 | 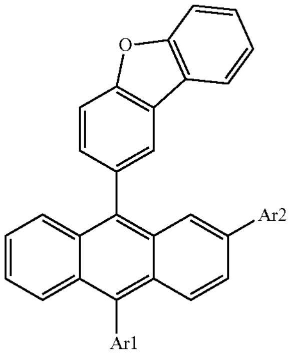 | 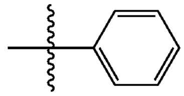 | 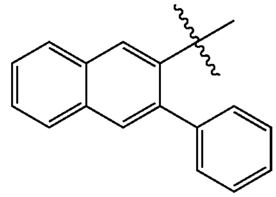 [SMILES: *c1cc2ccccc2cc1-c1ccccc1] |
| 16-30 | 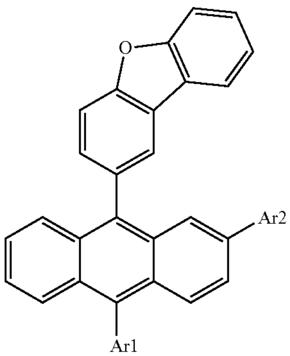 | 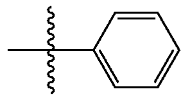 | 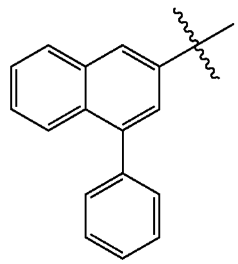 [SMILES: *c1cc(-c2ccccc2)c2ccccc2c1] |
| 16-31 | 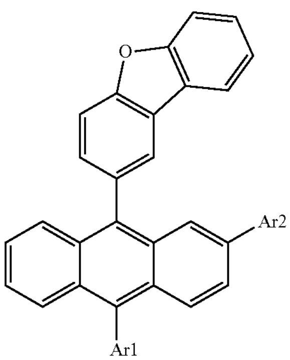 | 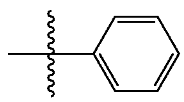 | 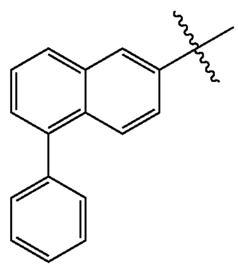 [SMILES: *c1ccc2c(-c3ccccc3)cccc2c1] |
| 16-32 | 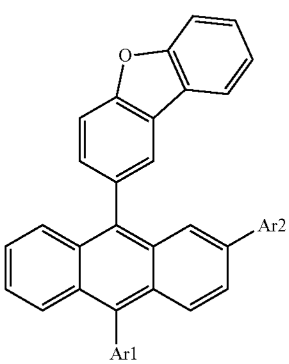 | 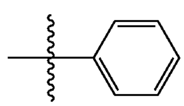 | 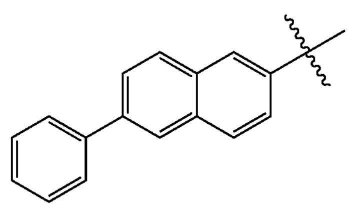 [SMILES: *c1ccc2cc(-c3ccccc3)ccc2c1] |

-continued
| No. | | Ar1 | Ar2 |
|---|---|---|---|
| 16-33 | 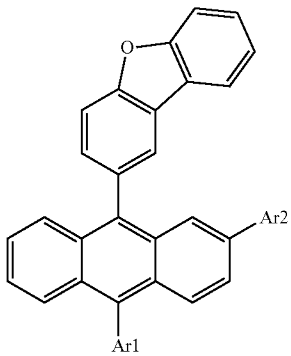 | 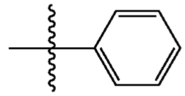 | 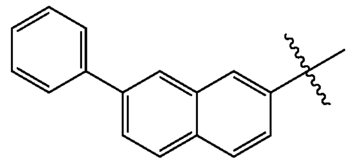 [SMILES: *c1ccc2ccc(-c3ccccc3)cc2c1] |
| 16-34 | 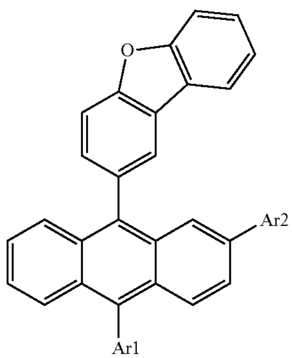 | 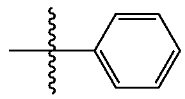 [SMILES: *c1ccccc1] | 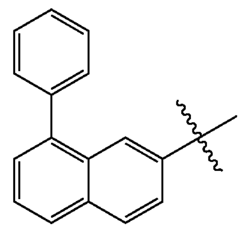 [SMILES: *c1ccc2cccc(-c3ccccc3)c2c1] |
| 16-35 | 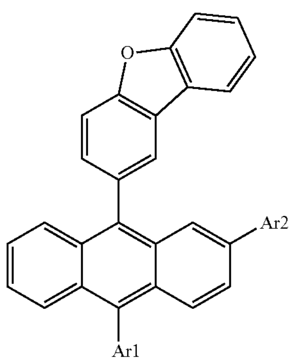 | 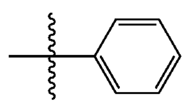 | 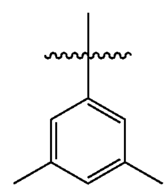 |
| 16-36 | 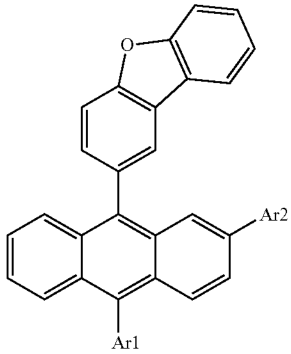 | 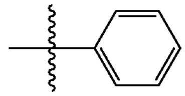 | 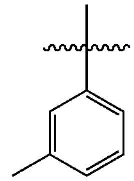 |

-continued
| No. | | Ar1 | Ar2 |
|---|---|---|---|
| 16-37 | 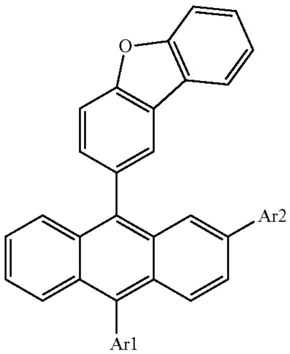 | 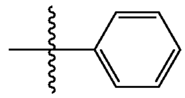 [SMILES: *c1ccccc1] | 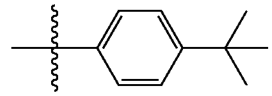 [SMILES: *c1ccc(C(C)(C)C)cc1] |
| 16-38 | 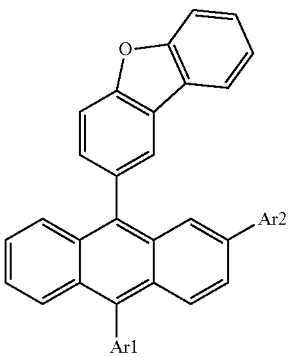 | 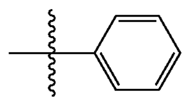 | 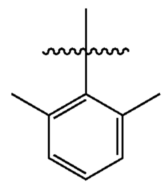 |
| 16-39 | 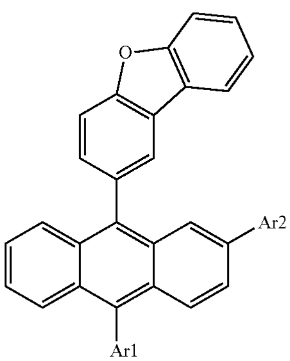 | 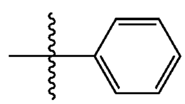 [SMILES: *c1ccccc1] | 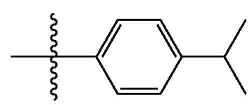 [SMILES: *c1ccc(C(C)C)cc1] |
| 16-40 | 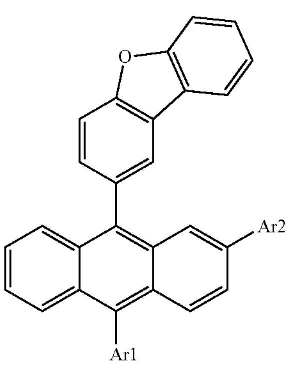 | 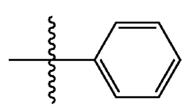 | 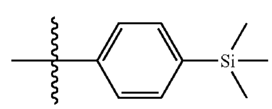 [SMILES: *c1ccc([Si](C)(C)C)cc1] |

-continued
| No. | | Ar1 | Ar2 |
|---|---|---|---|
| 16-41 | 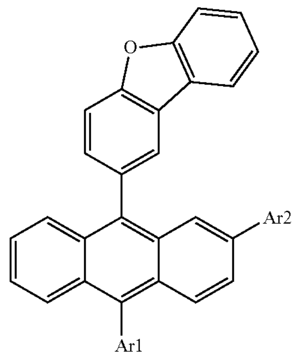 | 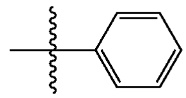 | 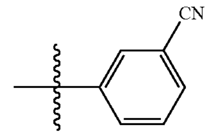 [SMILES: *c1cccc(C#N)c1] |
| 16-42 | 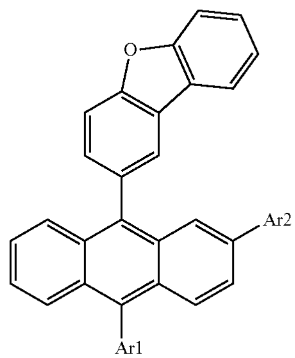 | 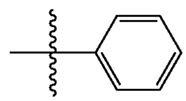 [SMILES: *c1ccccc1] | 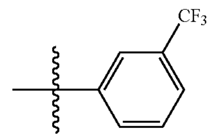 [SMILES: *c1cccc(C(F)(F)F)c1] |
| 16-43 | 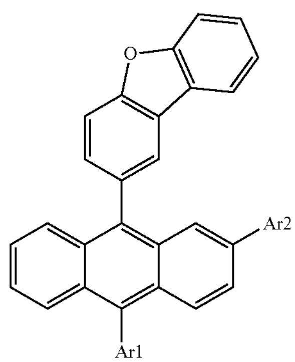 | 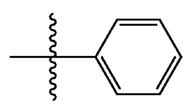 | 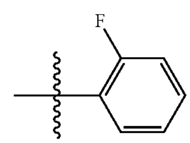 [SMILES: *c1ccccc1F] |
| 16-44 | 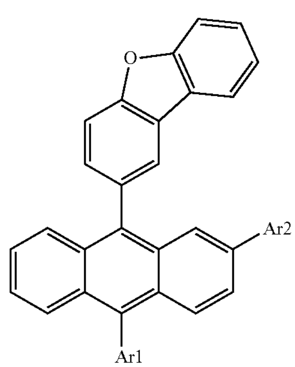 | 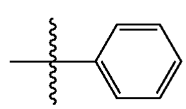 | 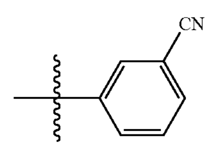 [SMILES: *c1cccc(C#N)c1] |

-continued
| No. | | Ar1 | Ar2 |
|---|---|---|---|
| 16-45 | 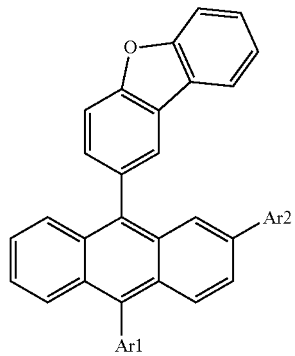 | 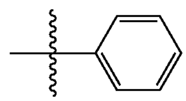 | 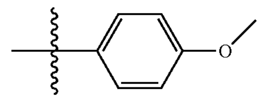 [SMILES: *c1ccc(OC)cc1] |
| 16-46 | 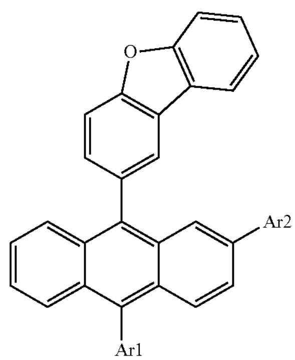 | 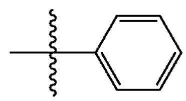 [SMILES: *c1ccccc1] | 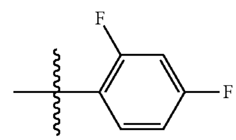 [SMILES: *c1ccc(F)cc1F] |
| 17-1 | 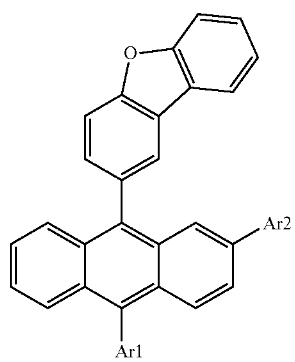 | 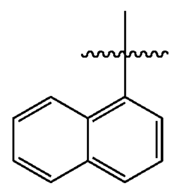 [SMILES: *c1cccc2ccccc12] | 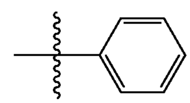 [SMILES: *c1ccccc1] |
| 17-2 | 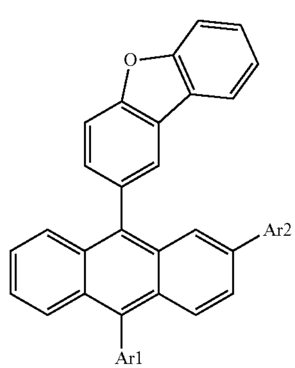 | 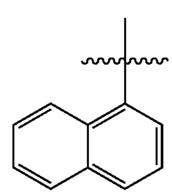 [SMILES: *c1cccc2ccccc12] | 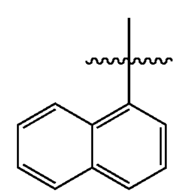 [SMILES: *c1cccc2ccccc12] |

-continued
| No. | | Ar1 | Ar2 |
|---|---|---|---|
| 17-3 | 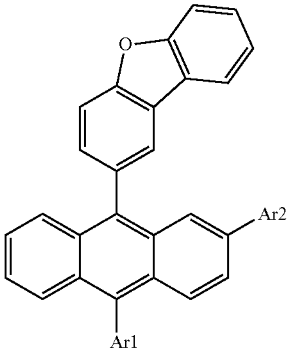 | 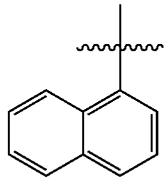 [SMILES: *c1cccc2ccccc12] | 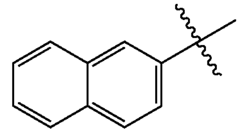 [SMILES: *c1ccc2ccccc2c1] |
| 17-4 | 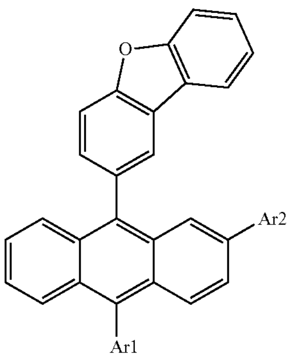 | 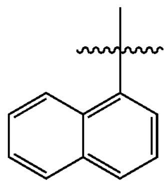 [SMILES: *c1cccc2ccccc12] | 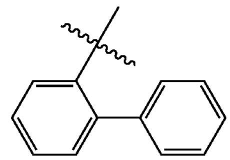 [SMILES: *c1ccccc1-c1ccccc1] |
| 17-5 | 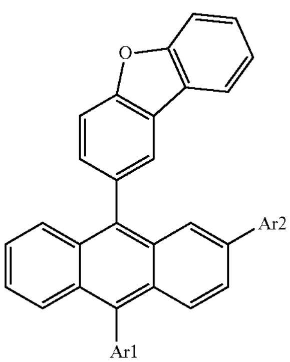 | 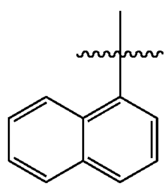 [SMILES: *c1cccc2ccccc12] | 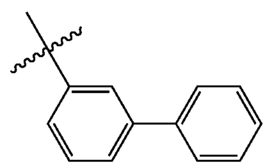 [SMILES: *c1cccc(-c2ccccc2)c1] |
| 17-6 | 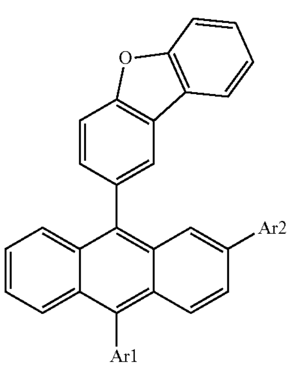 | 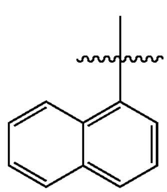 [SMILES: *c1cccc2ccccc12] | 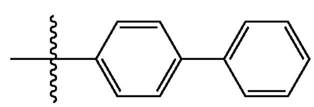 |

-continued
| No. | | Ar1 | Ar2 |
|---|---|---|---|
| 17-7 | 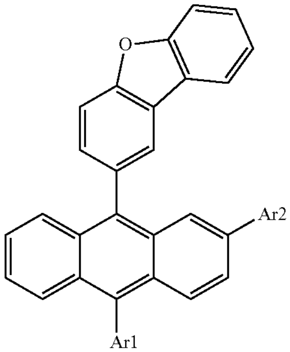 | 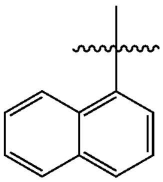 [SMILES: *c1cccc2ccccc12] | 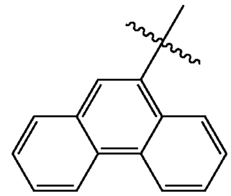 [SMILES: *c1cc2ccccc2c2ccccc12] |
| 17-9 | 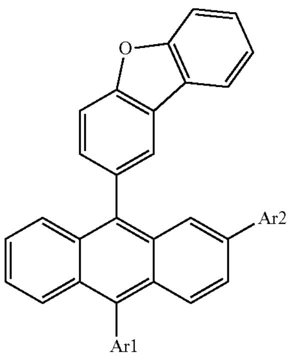 | 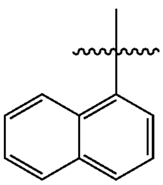 [SMILES: *c1cccc2ccccc12] | 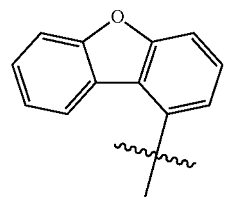 [SMILES: *c1cccc2oc3ccccc3c12] |
| 17-10 | 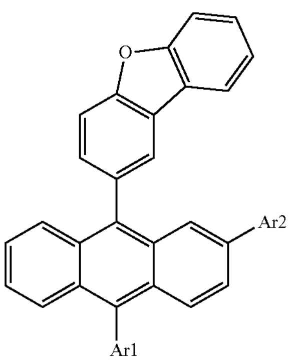 | 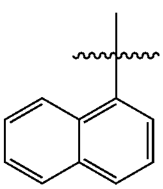 [SMILES: *c1cccc2ccccc12] | 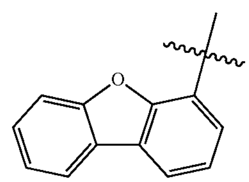 [SMILES: *c1cccc2c1oc1ccccc12] |
| 17-11 | 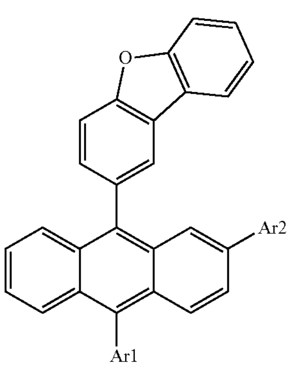 | 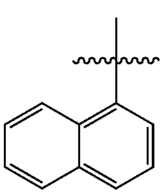 [SMILES: *c1cccc2ccccc12] | 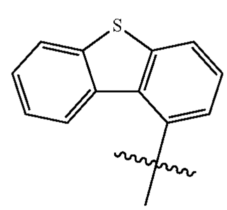 |

-continued
| No. | | Ar1 | Ar2 |
|---|---|---|---|
| 17-12 | 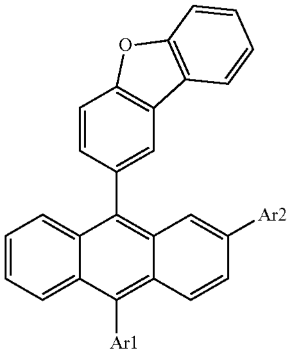 | 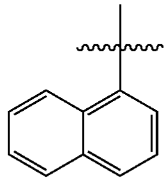 [SMILES: *c1cccc2ccccc12] | 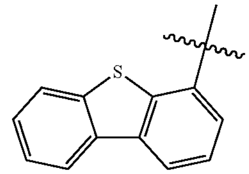 |
| 17-16 | 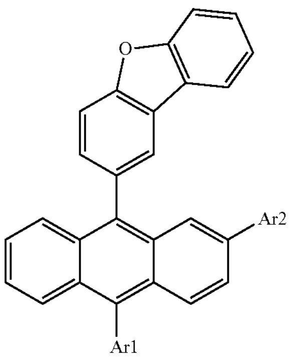 | 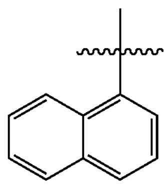 [SMILES: *c1cccc2ccccc12] | 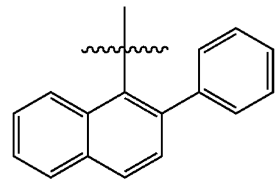 [SMILES: *c1c(-c2ccccc2)ccc2ccccc12] |
| 17-17 | 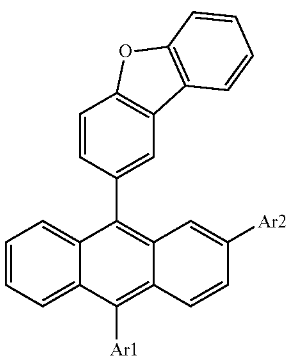 | 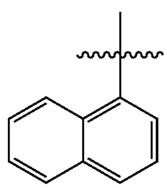 [SMILES: *c1cccc2ccccc12] | 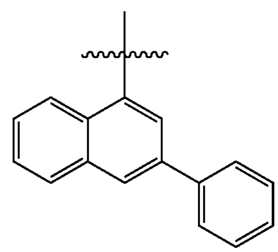 [SMILES: *c1cc(-c2ccccc2)cc2ccccc12] |
| 17-18 | 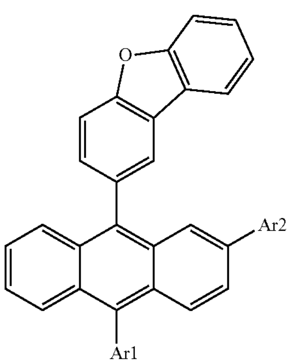 | 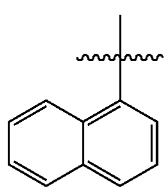 [SMILES: *c1cccc2ccccc12] | 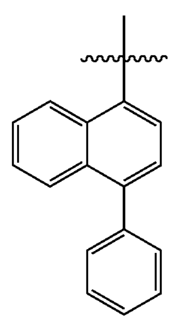 [SMILES: *c1ccc(-c2ccccc2)c2ccccc12] |

-continued
| No. | | Ar1 | Ar2 |
|---|---|---|---|
| 17-19 | 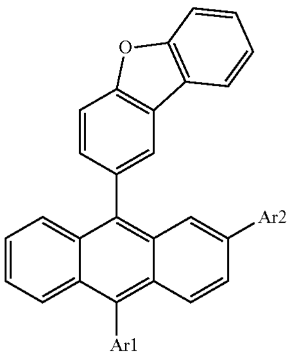 | 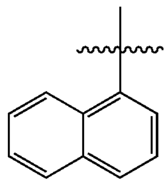 [SMILES: *c1cccc2ccccc12] | 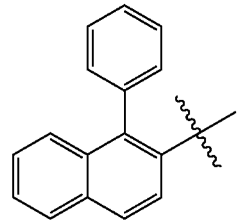 [SMILES: *c1ccc2ccccc2c1-c1ccccc1] |
| 17-20 | 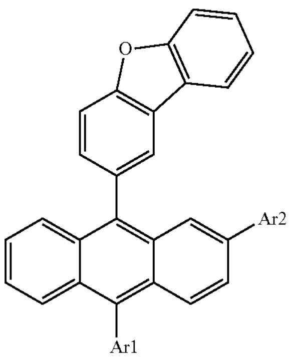 | 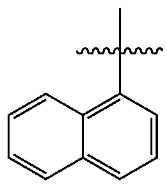 [SMILES: *c1cccc2ccccc12] | 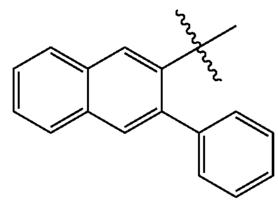 [SMILES: *c1cc2ccccc2cc1-c1ccccc1] |
| 17-21 | 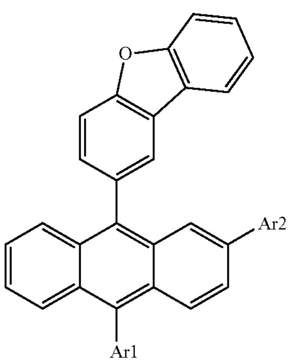 | 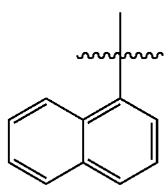 [SMILES: *c1cccc2ccccc12] | 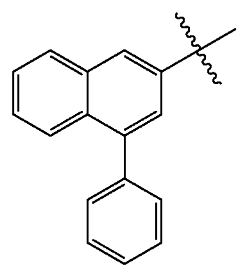 [SMILES: *c1cc(-c2ccccc2)c2ccccc2c1] |
| 17-22 | 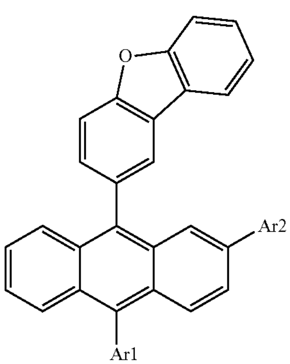 | 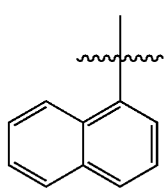 [SMILES: *c1cccc2ccccc12] | 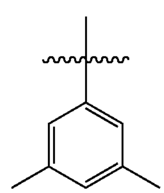 |

-continued
| No. | | Ar1 | Ar2 |
|---|---|---|---|
| 17-23 | 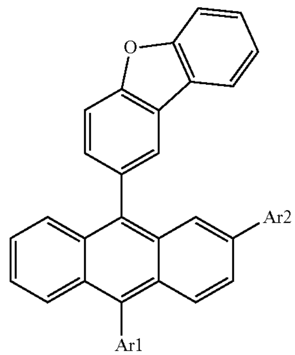 | 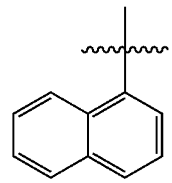 [SMILES: *c1cccc2ccccc12] | 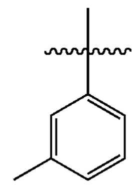 |
| 17-24 | 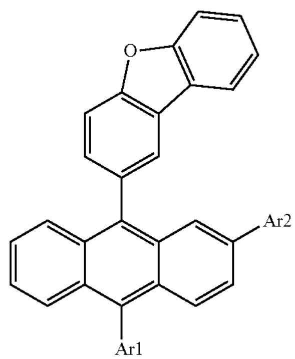 | 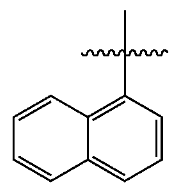 [SMILES: *c1cccc2ccccc12] | 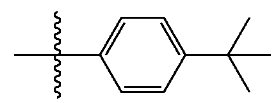 |
| 17-25 | 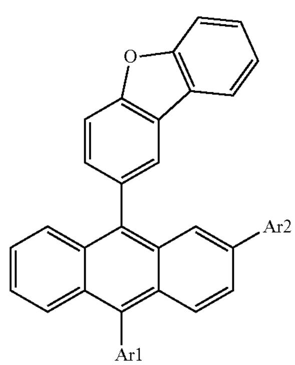 | 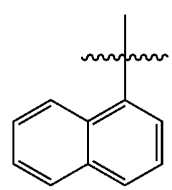 [SMILES: *c1cccc2ccccc12] | 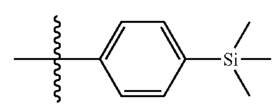 |
| 17-26 | 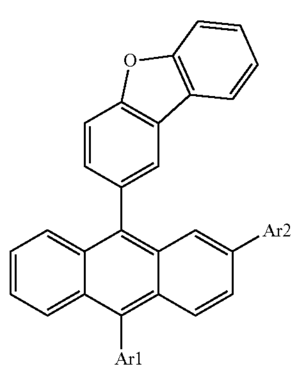 | 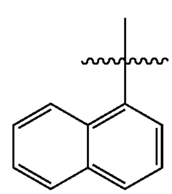 [SMILES: *c1cccc2ccccc12] | 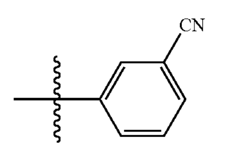 [SMILES: *c1cccc(C#N)c1] |

-continued
| No. | | Ar1 | Ar2 |
|---|---|---|---|
| 17-27 | 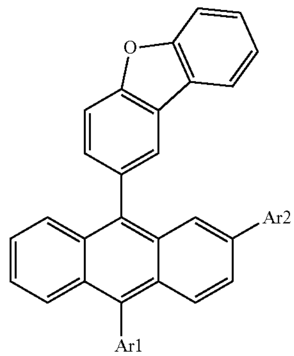 | 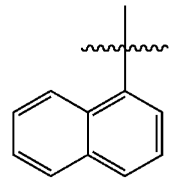 [SMILES: *c1cccc2ccccc12] | 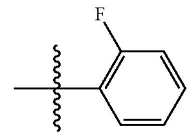 [SMILES: *c1ccccc1F] |
| 17-28 | 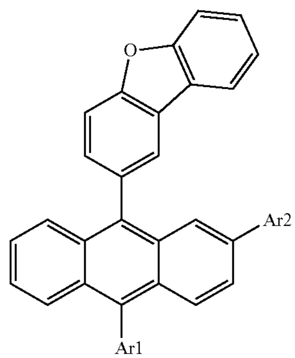 | 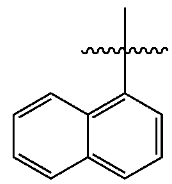 [SMILES: *c1cccc2ccccc12] | 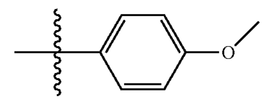 [SMILES: *c1ccc(OC)cc1] |
| 18-1 | 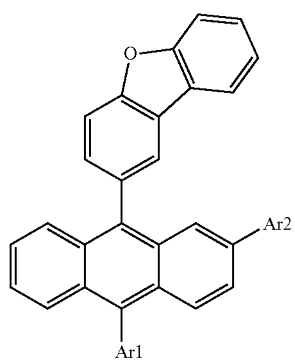 | 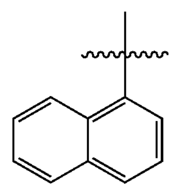 [SMILES: *c1cccc2ccccc12] | 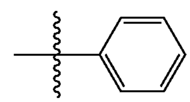 [SMILES: *c1ccccc1] |
| 18-2 | 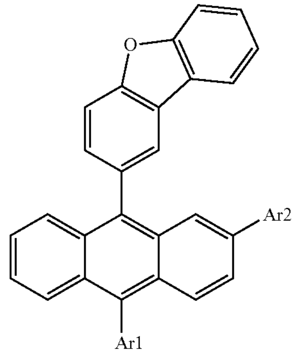 | 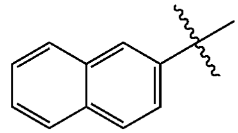 [SMILES: *c1ccc2ccccc2c1] | 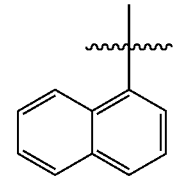 [SMILES: *c1cccc2ccccc12] |

-continued
| No. | | Ar1 | Ar2 |
|---|---|---|---|
| 18-3 | 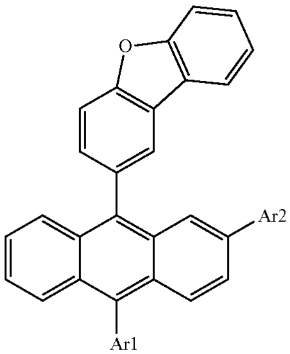 | 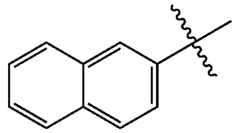 [SMILES: *c1ccc2ccccc2c1] | 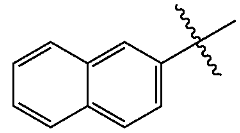 [SMILES: *c1ccc2ccccc2c1] |
| 18-4 | 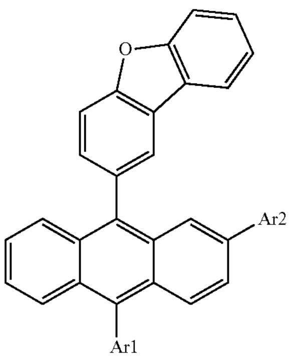 | 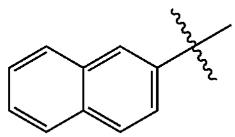 [SMILES: *c1ccc2ccccc2c1] | 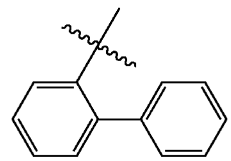 [SMILES: *c1ccccc1-c1ccccc1] |
| 18-5 | 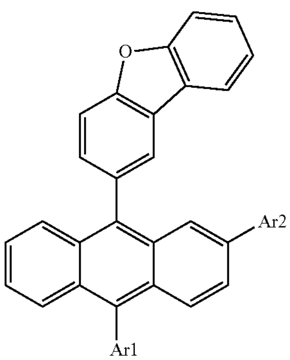 | 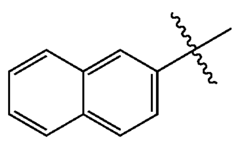 [SMILES: *c1ccc2ccccc2c1] | 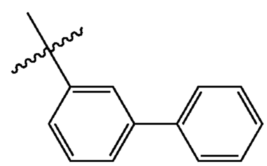 [SMILES: *c1cccc(-c2ccccc2)c1] |
| 18-6 | 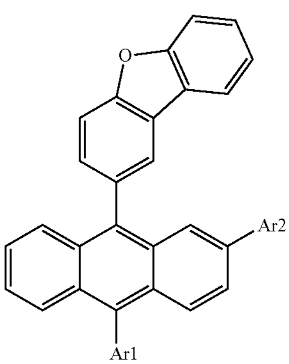 | 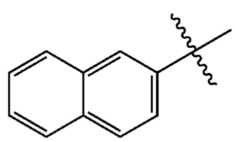 [SMILES: *c1ccc2ccccc2c1] | 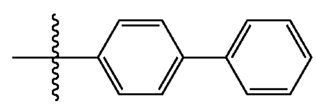 [SMILES: *c1ccc(-c2ccccc2)cc1] |

-continued
| No. | | Ar1 | Ar2 |
|---|---|---|---|
| 18-7 | 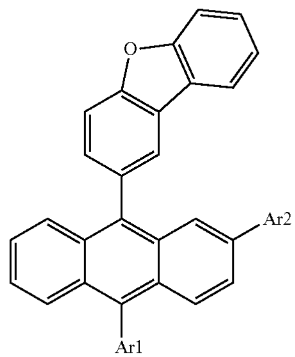 | 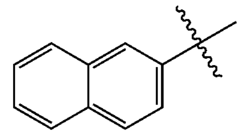 [SMILES: *c1ccc2ccccc2c1] | 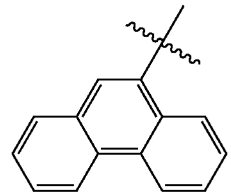 [SMILES: *c1cc2ccccc2c2ccccc12] |
| 18-9 | 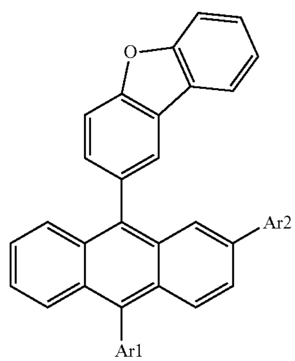 | 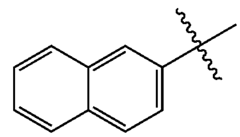 [SMILES: *c1ccc2ccccc2c1] | 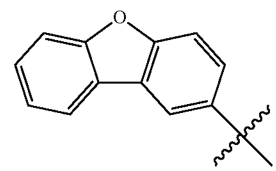 [SMILES: *c1ccc2oc3ccccc3c2c1] |
| 18-10 | 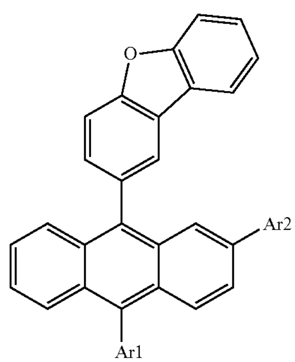 | 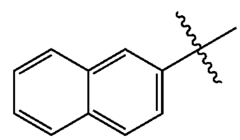 [SMILES: *c1ccc2ccccc2c1] | 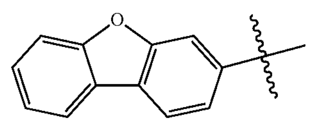 |
| 18-11 | 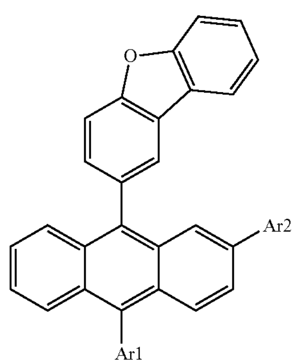 | 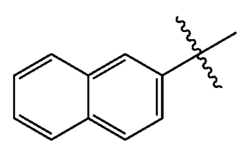 [SMILES: *c1ccc2ccccc2c1] | 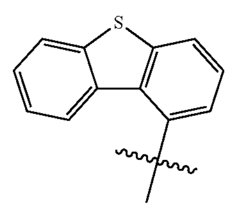 [SMILES: *c1cccc2sc3ccccc3c12] |

-continued
| No. | | Ar1 | Ar2 |
|---|---|---|---|
| 18-12 | 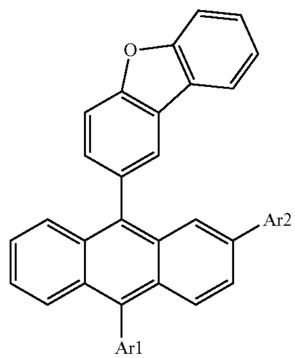 | 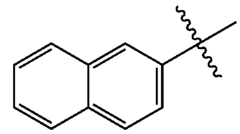 [SMILES: *c1ccc2ccccc2c1] | 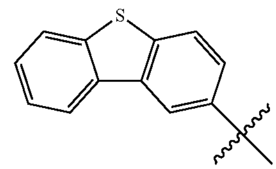 |
| 18-13 | 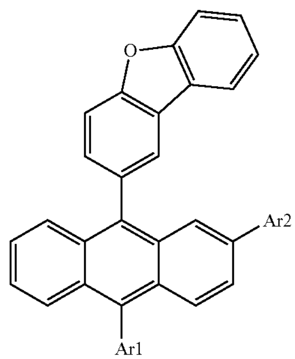 | 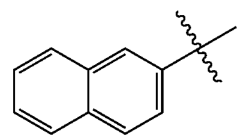 [SMILES: *c1ccc2ccccc2c1] | 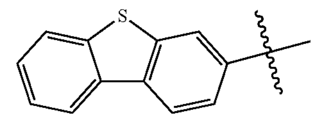 |
| 18-17 | 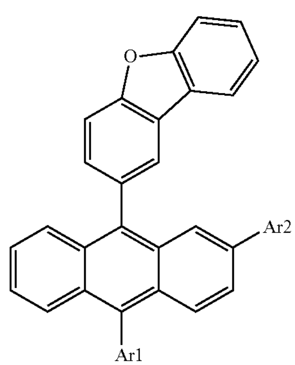 | 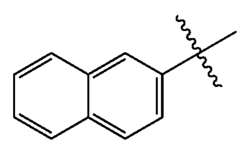 [SMILES: *c1ccc2ccccc2c1] | 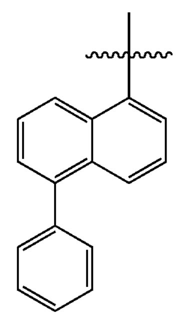 [SMILES: *c1cccc2c(-c3ccccc3)cccc12] |
| 18-18 | 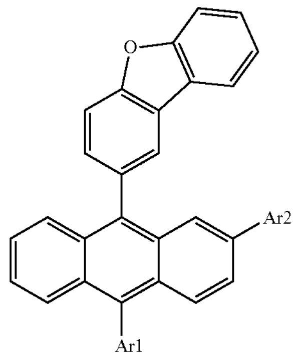 | 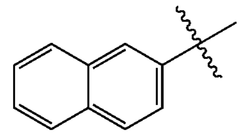 [SMILES: *c1ccc2ccccc2c1] | 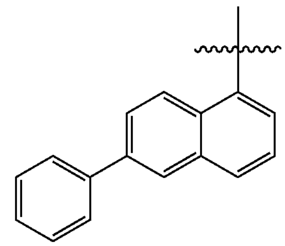 [SMILES: *c1cccc2cc(-c3ccccc3)ccc12] |

-continued
| No. | | Ar1 | Ar2 |
|---|---|---|---|
| 18-19 | 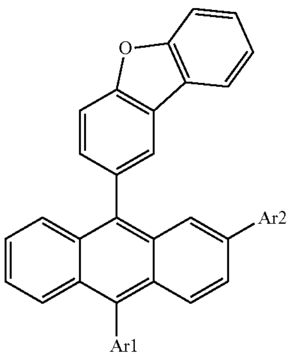 | 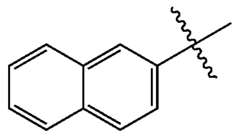 [SMILES: *c1ccc2ccccc2c1] | 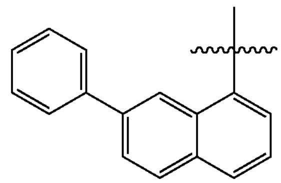 [SMILES: *c1cccc2ccc(-c3ccccc3)cc12] |
| 18-20 | 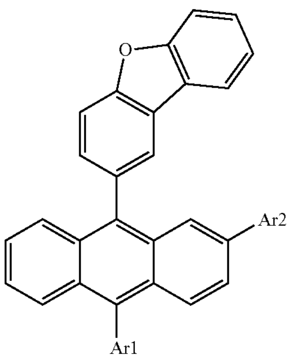 | 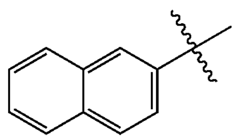 [SMILES: *c1ccc2ccccc2c1] | 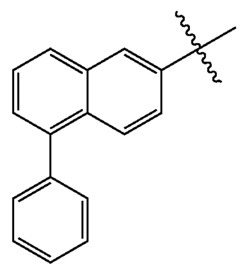 [SMILES: *c1ccc2c(-c3ccccc3)cccc2c1] |
| 18-21 | 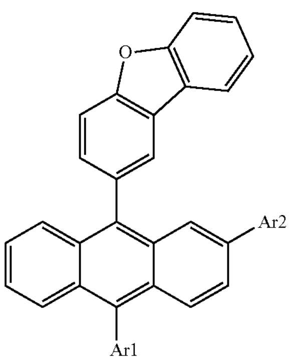 | 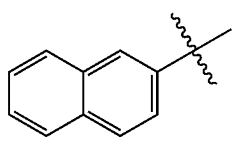 [SMILES: *c1ccc2ccccc2c1] | 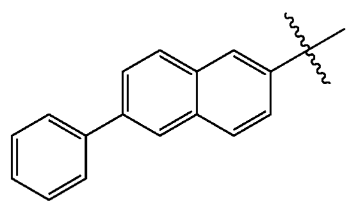 [SMILES: *c1ccc2cc(-c3ccccc3)ccc2c1] |
| 18-22 | 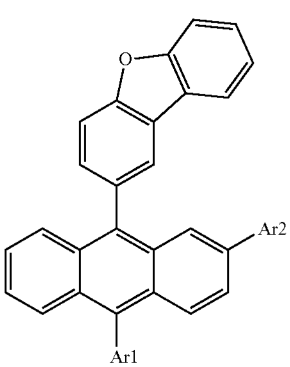 | 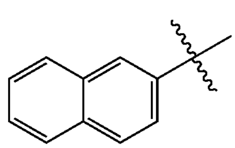 [SMILES: *c1ccc2ccccc2c1] | 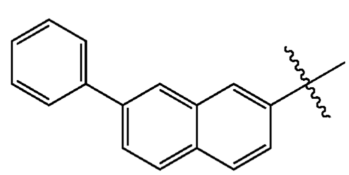 [SMILES: *c1ccc2ccc(-c3ccccc3)cc2c1] |

-continued
| No. | | Ar1 | Ar2 |
|---|---|---|---|
| 18-23 | 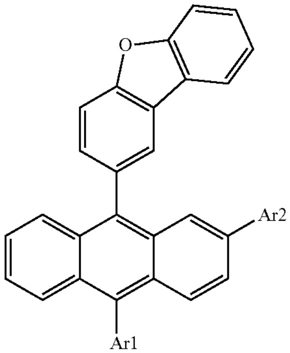 | 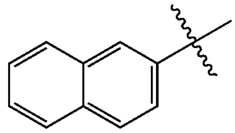 [SMILES: *c1ccc2ccccc2c1] | 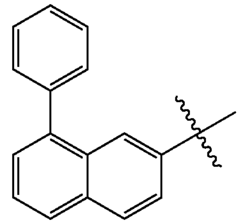 [SMILES: *c1ccc2cccc(-c3ccccc3)c2c1] |
| 18-24 | 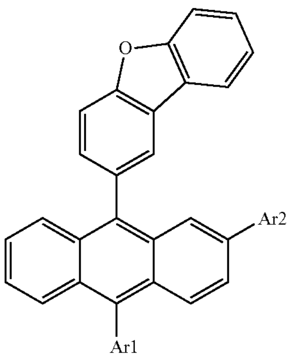 | 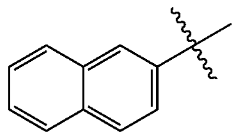 [SMILES: *c1ccc2ccccc2c1] | 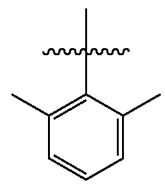 |
| 18-25 | 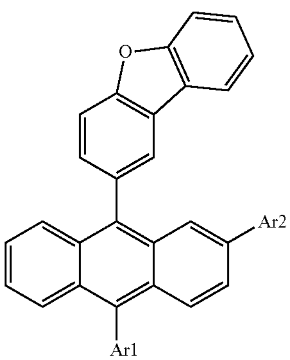 | 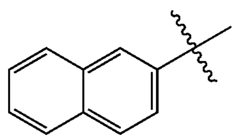 [SMILES: *c1ccc2ccccc2c1] | 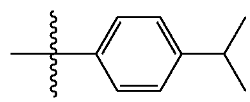 |
| 18-26 | 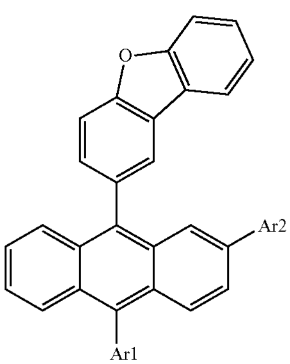 | 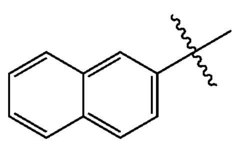 [SMILES: *c1ccc2ccccc2c1] | 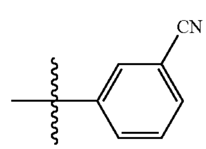 [SMILES: *c1cccc(C#N)c1] |

-continued
| No. | | Ar1 | Ar2 |
|---|---|---|---|
| 18-27 | 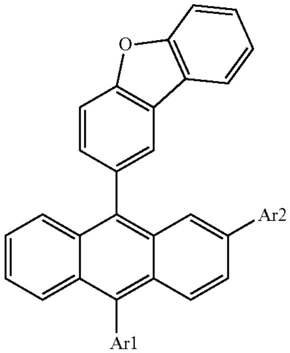 | 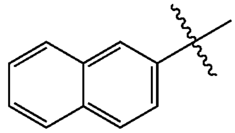 [SMILES: *c1ccc2ccccc2c1] | 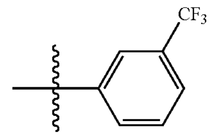 [SMILES: *c1cccc(C(F)(F)F)c1] |
| 18-28 | 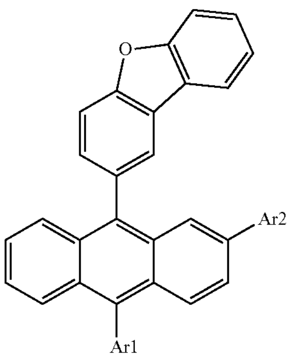 | 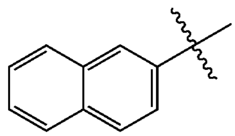 [SMILES: *c1ccc2ccccc2c1] | 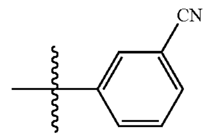 [SMILES: *c1cccc(C#N)c1] |
| 18-29 | 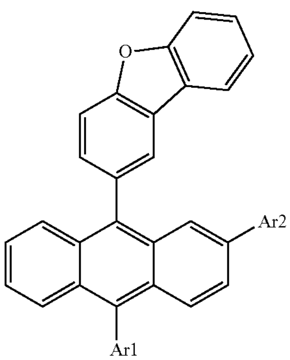 | 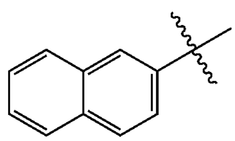 [SMILES: *c1ccc2ccccc2c1] | 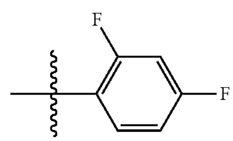 [SMILES: *c1ccc(F)cc1F] |
| 19-1 | 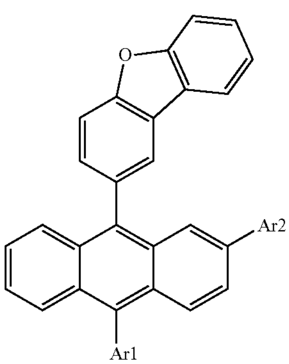 | 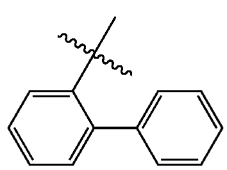 [SMILES: *c1ccccc1-c1ccccc1] | 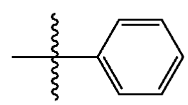 [SMILES: *c1ccccc1] |

-continued
| No. | | Ar1 | Ar2 |
|---|---|---|---|
| 19-2 | 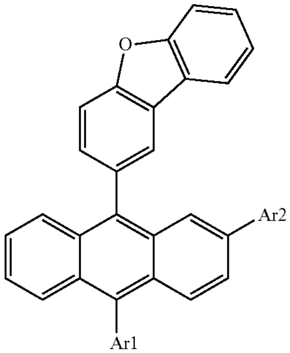 | 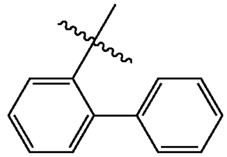 [SMILES: *c1ccccc1-c1ccccc1] | 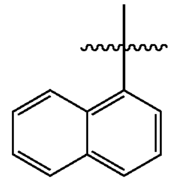 [SMILES: *c1cccc2ccccc12] |
| 19-3 | 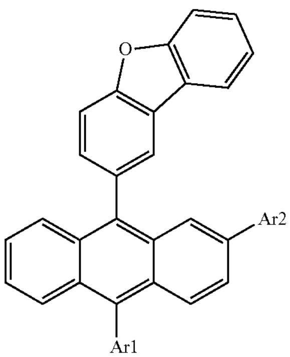 | 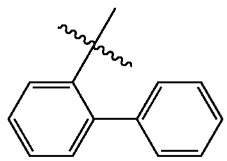 [SMILES: *c1ccccc1-c1ccccc1] | 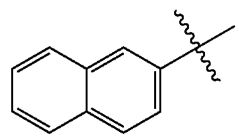 [SMILES: *c1ccc2ccccc2c1] |
| 19-4 | 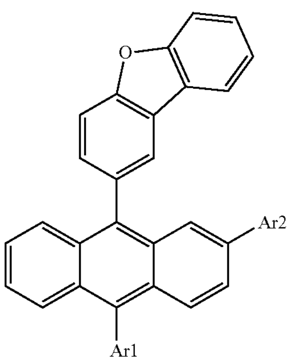 | 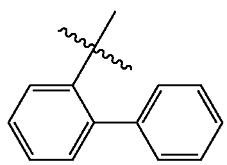 [SMILES: *c1ccccc1-c1ccccc1] | 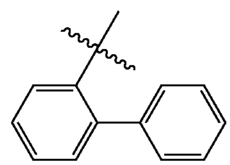 [SMILES: *c1ccccc1-c1ccccc1] |
| 19-5 | 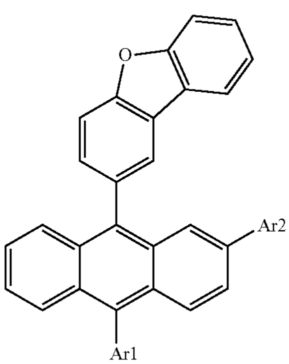 | 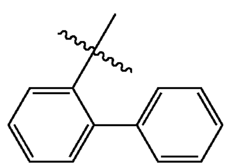 [SMILES: *c1ccccc1-c1ccccc1] | 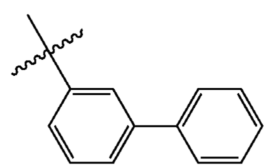 [SMILES: *c1cccc(-c2ccccc2)c1] |

-continued
| No. | | Ar1 | Ar2 |
|---|---|---|---|
| 19-6 | 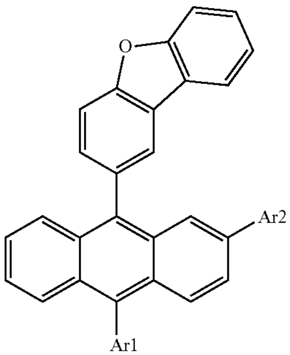 | 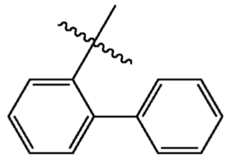 [SMILES: *c1ccccc1-c1ccccc1] | 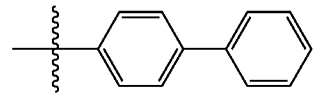 [SMILES: *c1ccc(-c2ccccc2)cc1] |
| 19-7 | 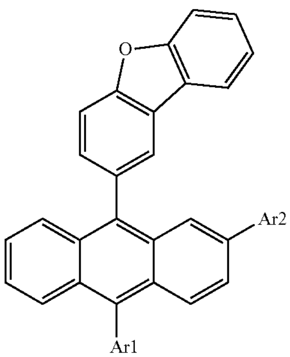 | 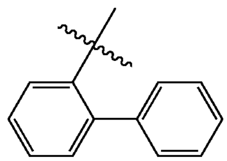 [SMILES: *c1ccccc1-c1ccccc1] | 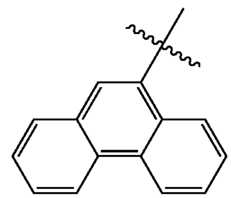 [SMILES: *c1cc2ccccc2c2ccccc12] |
| 19-9 | 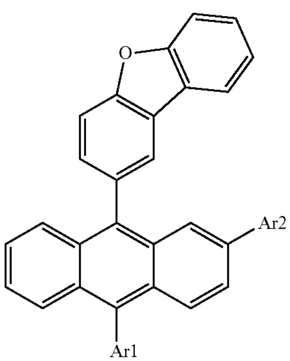 | 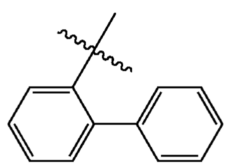 [SMILES: *c1ccccc1-c1ccccc1] | 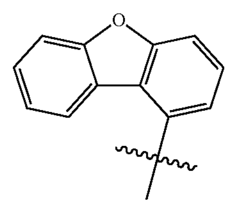 [SMILES: *c1cccc2oc3ccccc3c12] |
| 19-10 | 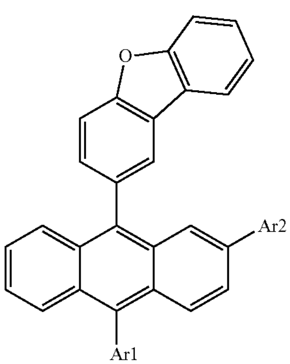 | 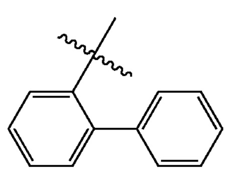 [SMILES: *c1ccccc1-c1ccccc1] | 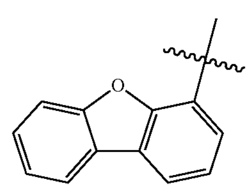 |

-continued
| No. | | Ar1 | Ar2 |
|---|---|---|---|
| 19-11 | 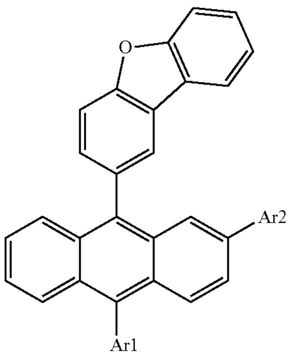 | 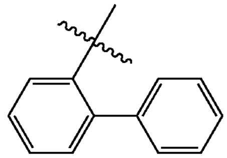 [SMILES: *c1ccccc1-c1ccccc1] | 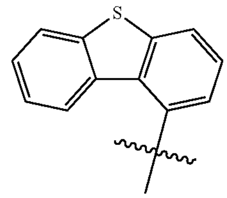 |
| 19-12 | 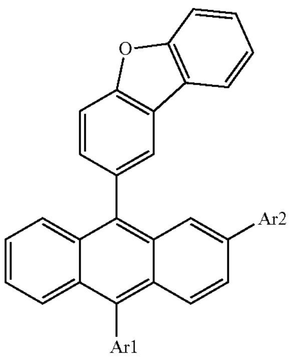 | 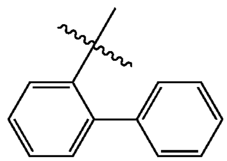 [SMILES: *c1ccccc1-c1ccccc1] | 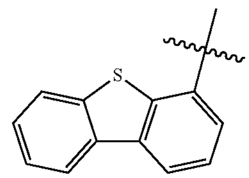 [SMILES: *c1cccc2c1sc1ccccc12] |
| 19-16 | 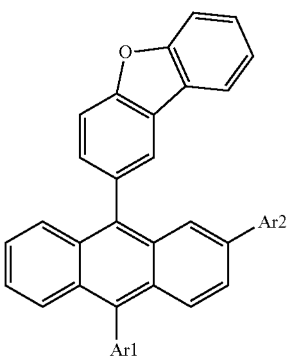 | 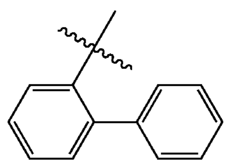 [SMILES: *c1ccccc1-c1ccccc1] | 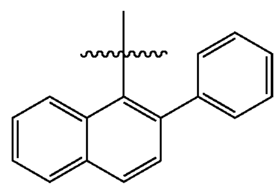 [SMILES: *c1c(-c2ccccc2)ccc2ccccc12] |
| 19-17 | 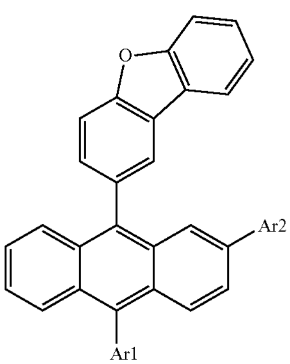 | 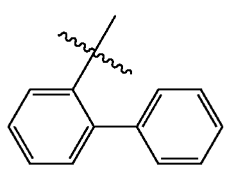 [SMILES: *c1ccccc1-c1ccccc1] | 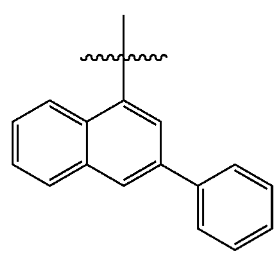 [SMILES: *c1cc(-c2ccccc2)cc2ccccc12] |

-continued
| No. | | Ar1 | Ar2 |
|---|---|---|---|
| 19-18 | 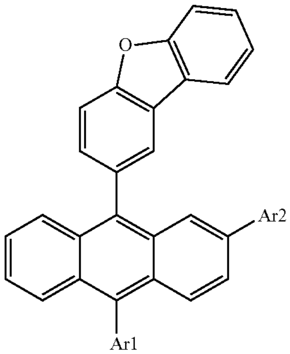 | 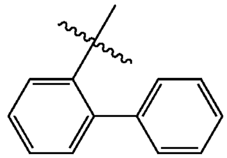 [SMILES: *c1ccccc1-c1ccccc1] | 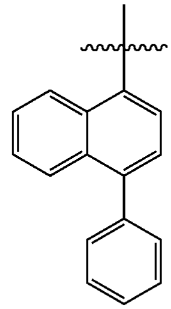 [SMILES: *c1ccc(-c2ccccc2)c2ccccc12] |
| 19-19 | 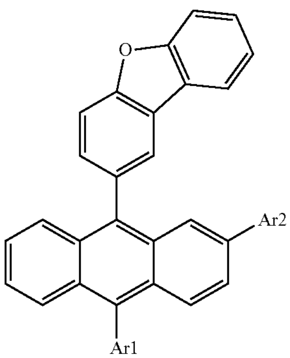 | 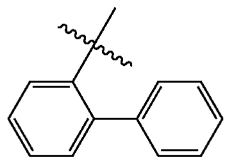 [SMILES: *c1ccccc1-c1ccccc1] | 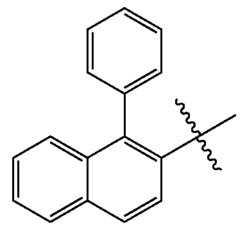 [SMILES: *c1ccc2ccccc2c1-c1ccccc1] |
| 19-20 | 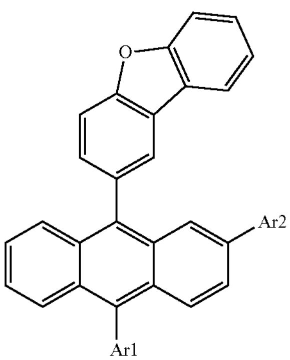 | 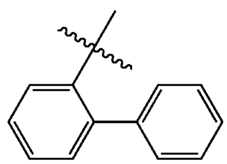 [SMILES: *c1ccccc1-c1ccccc1] | 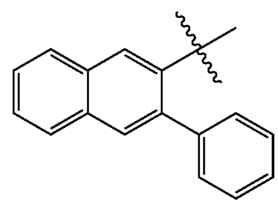 [SMILES: *c1cc2ccccc2cc1-c1ccccc1] |
| 19-21 | 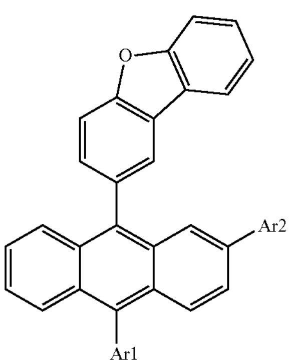 | 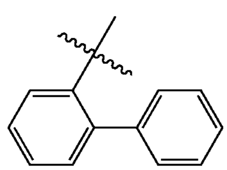 [SMILES: *c1ccccc1-c1ccccc1] | 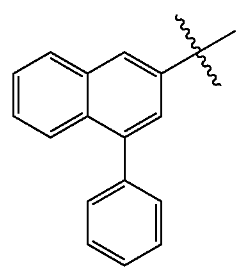 [SMILES: *c1cc(-c2ccccc2)c2ccccc2c1] |

-continued
| No. | | Ar1 | Ar2 |
|---|---|---|---|
| 19-22 | 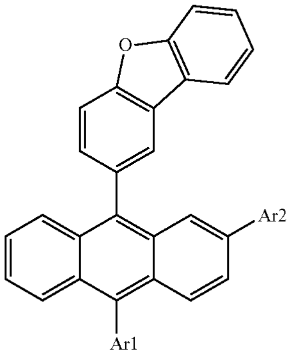 | 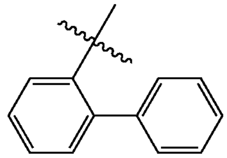 [SMILES: *c1ccccc1-c1ccccc1] | 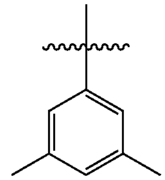 |
| 19-23 | 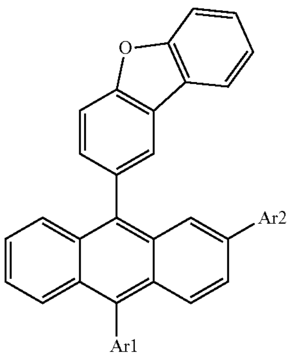 | 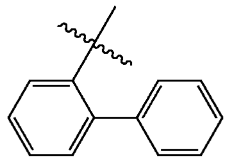 [SMILES: *c1ccccc1-c1ccccc1] | 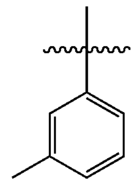 |
| 19-24 | 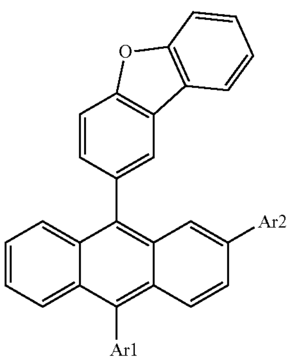 | 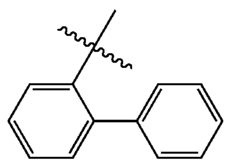 [SMILES: *c1ccccc1-c1ccccc1] | 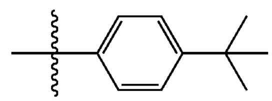 |
| 19-25 | 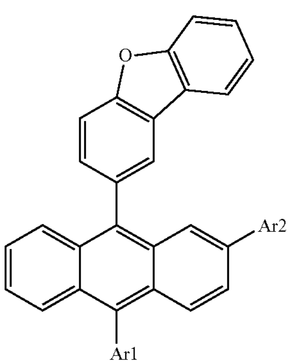 | 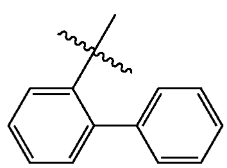 [SMILES: *c1ccccc1-c1ccccc1] | 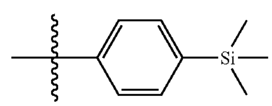 |

-continued
| No. | | Ar1 | Ar2 |
|---|---|---|---|
| 19-26 | 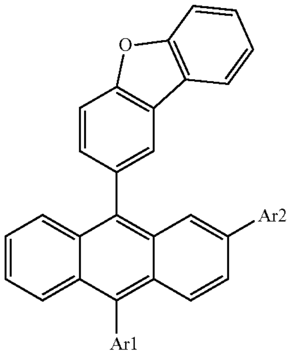 | 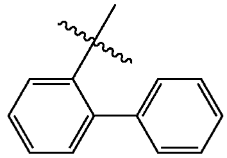 [SMILES: *c1ccccc1-c1ccccc1] | 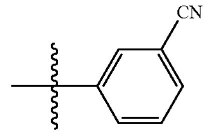 [SMILES: *c1cccc(C#N)c1] |
| 19-27 | 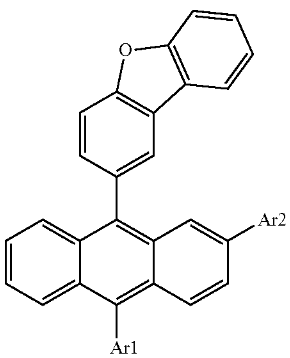 | 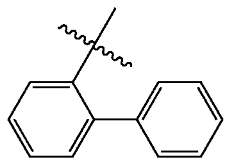 [SMILES: *c1ccccc1-c1ccccc1] | 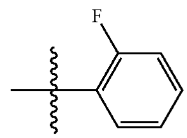 [SMILES: *c1ccccc1F] |
| 19-28 | 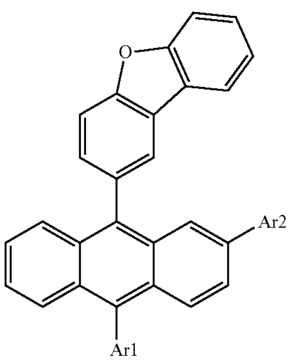 | 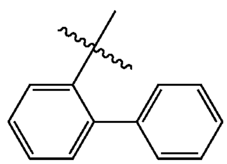 [SMILES: *c1ccccc1-c1ccccc1] | 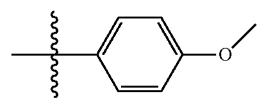 [SMILES: *c1ccc(OC)cc1] |
| 20-1 | 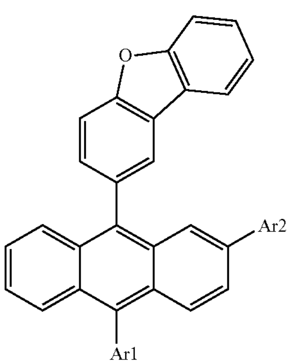 | 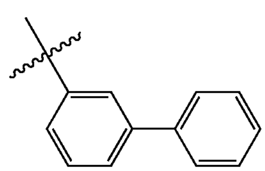 [SMILES: *c1cccc(-c2ccccc2)c1] | 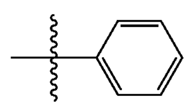 [SMILES: *c1ccccc1] |

-continued
| No. | | Ar1 | Ar2 |
|---|---|---|---|
| 20-2 | 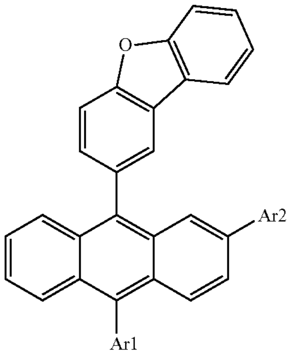 | 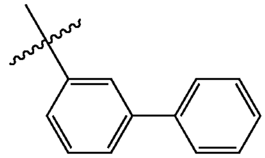 [SMILES: *c1cccc(-c2ccccc2)c1] | 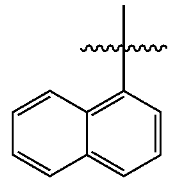 [SMILES: *c1cccc2ccccc12] |
| 20-3 | 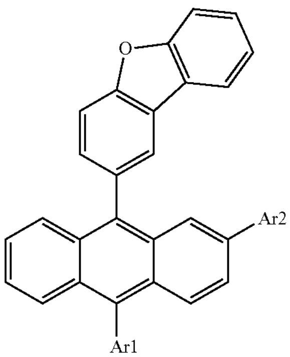 | 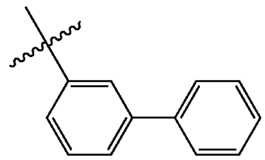 [SMILES: *c1cccc(-c2ccccc2)c1] | 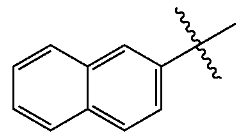 [SMILES: *c1ccc2ccccc2c1] |
| 20-4 | 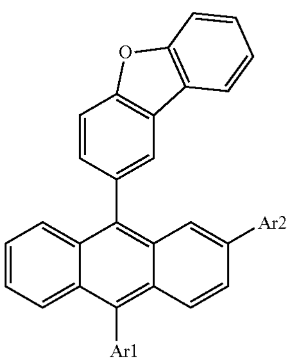 | 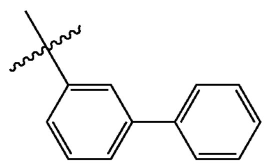 [SMILES: *c1cccc(-c2ccccc2)c1] | 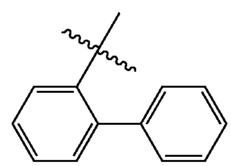 [SMILES: *c1ccccc1-c1ccccc1] |
| 20-5 | 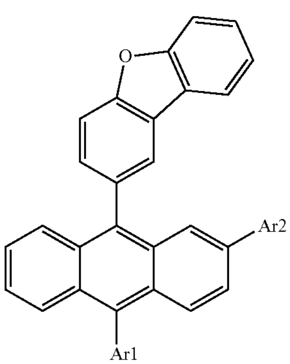 | 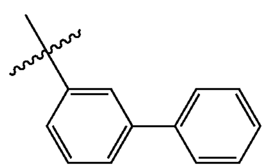 [SMILES: *c1cccc(-c2ccccc2)c1] | 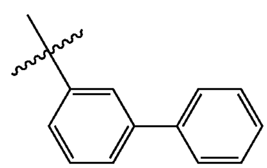 [SMILES: *c1cccc(-c2ccccc2)c1] |

-continued
| No. | | Ar1 | Ar2 |
|---|---|---|---|
| 20-6 | 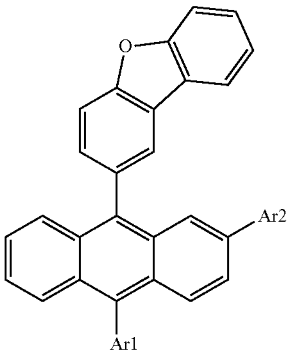 | 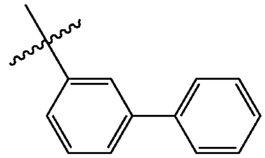 [SMILES: *c1cccc(-c2ccccc2)c1] | 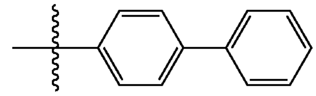 |
| 20-7 | 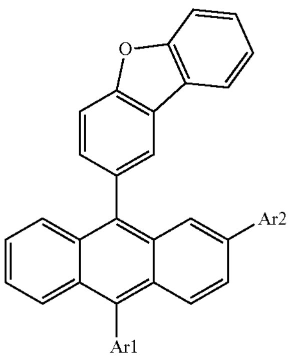 | 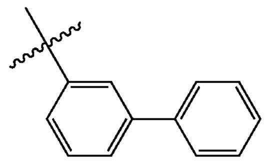 [SMILES: *c1cccc(-c2ccccc2)c1] | 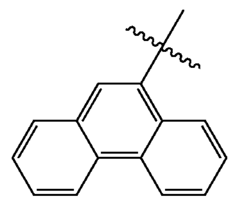 [SMILES: *c1cc2ccccc2c2ccccc12] |
| 20-9 | 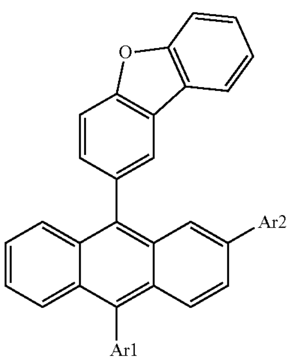 | 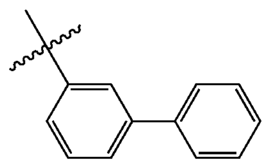 [SMILES: *c1cccc(-c2ccccc2)c1] | 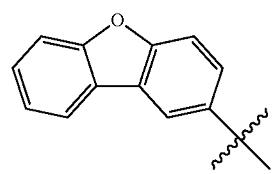 [SMILES: *c1ccc2oc3ccccc3c2c1] |
| 20-10 | 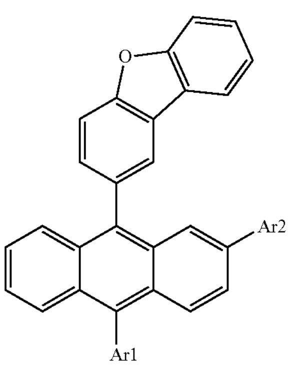 | 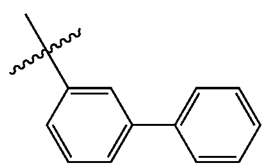 [SMILES: *c1cccc(-c2ccccc2)c1] | 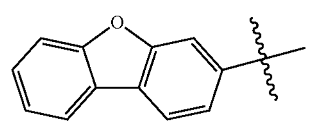 |

-continued
| No. | | Ar1 | Ar2 |
|---|---|---|---|
| 20-11 | 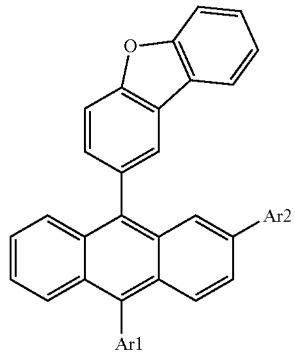 | 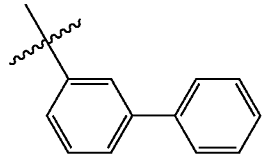 [SMILES: *c1cccc(-c2ccccc2)c1] | 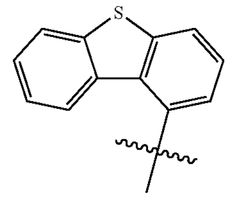 [SMILES: *c1cccc2sc3ccccc3c12] |
| 20-12 | 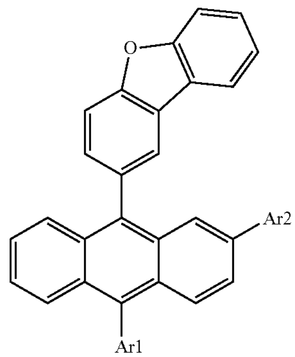 | 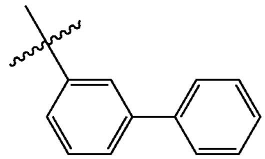 [SMILES: *c1cccc(-c2ccccc2)c1] | 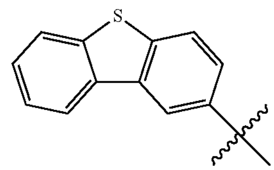 |
| 20-13 | 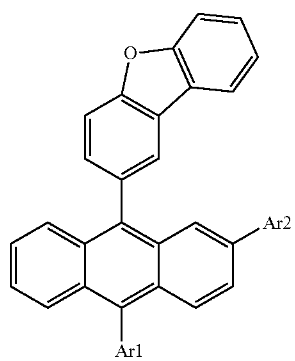 | 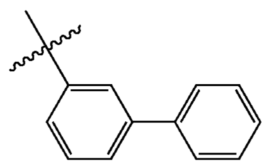 [SMILES: *c1cccc(-c2ccccc2)c1] | 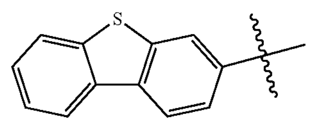 |
| 20-17 | 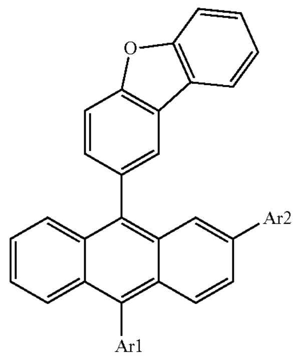 | 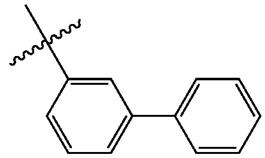 [SMILES: *c1cccc(-c2ccccc2)c1] | 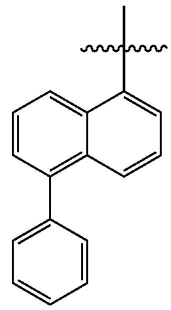 [SMILES: *c1cccc2c(-c3ccccc3)cccc12] |

-continued
| No. | | Ar1 | Ar2 |
|---|---|---|---|
| 20-18 | 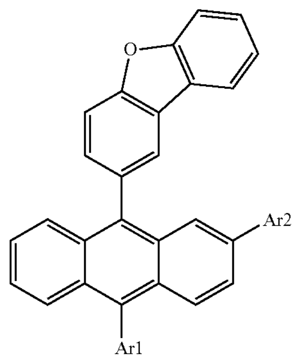 | 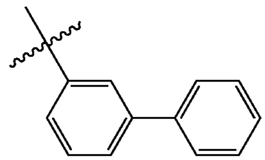 [SMILES: *c1cccc(-c2ccccc2)c1] | 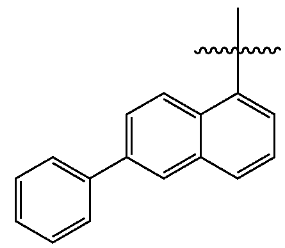 [SMILES: *c1cccc2cc(-c3ccccc3)ccc12] |
| 20-19 | 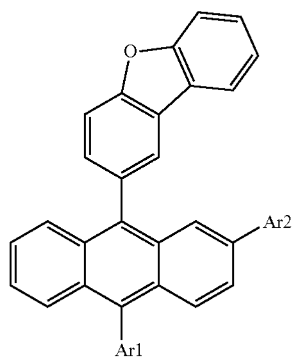 | 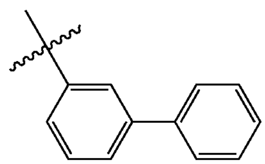 [SMILES: *c1cccc(-c2ccccc2)c1] | 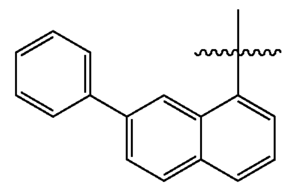 [SMILES: *c1cccc2ccc(-c3ccccc3)cc12] |
| 20-20 | 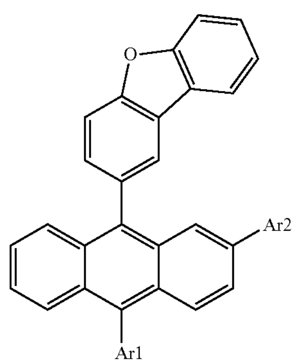 | 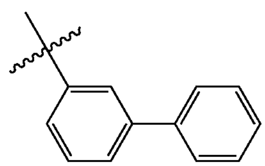 [SMILES: *c1cccc(-c2ccccc2)c1] | 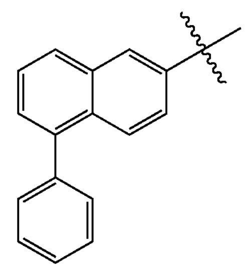 [SMILES: *c1ccc2c(-c3ccccc3)cccc2c1] |
| 20-21 | 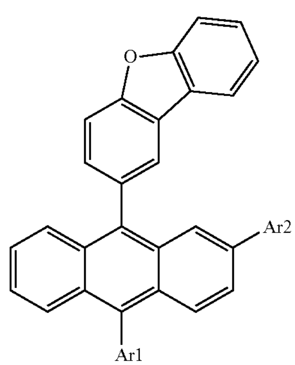 | 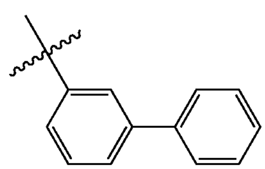 [SMILES: *c1cccc(-c2ccccc2)c1] | 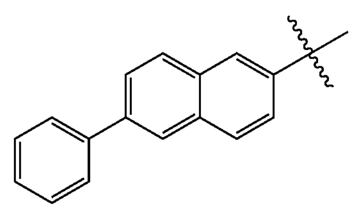 [SMILES: *c1ccc2cc(-c3ccccc3)ccc2c1] |

-continued
| No. | | Ar1 | Ar2 |
|---|---|---|---|
| 20-22 | 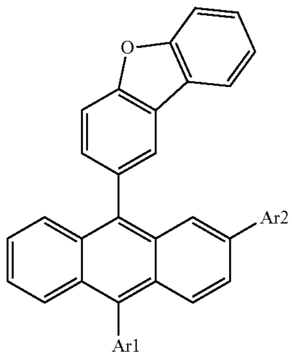 | 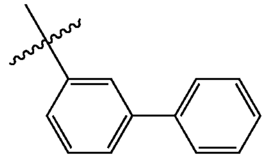 [SMILES: *c1cccc(-c2ccccc2)c1] | 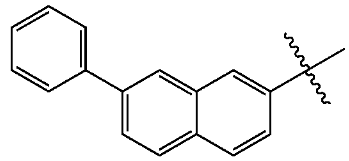 [SMILES: *c1ccc2ccc(-c3ccccc3)cc2c1] |
| 20-23 | 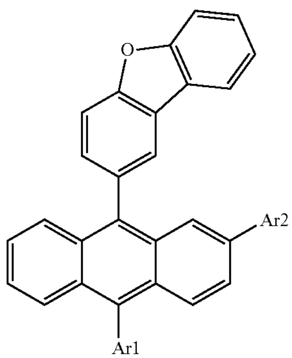 | 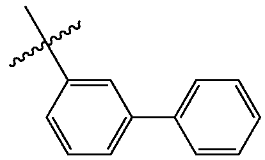 [SMILES: *c1cccc(-c2ccccc2)c1] | 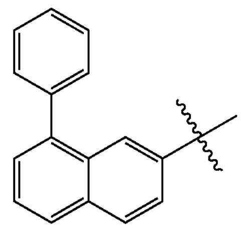 [SMILES: *c1ccc2cccc(-c3ccccc3)c2c1] |
| 20-24 | 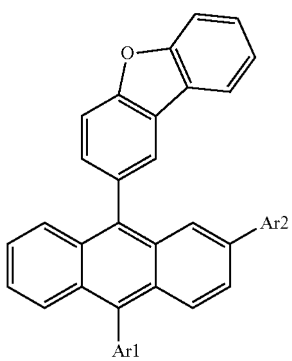 | 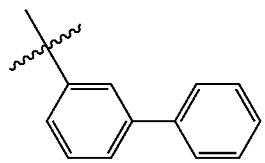 [SMILES: *c1cccc(-c2ccccc2)c1] | 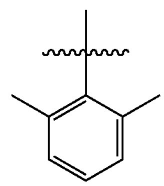 |
| 20-25 | 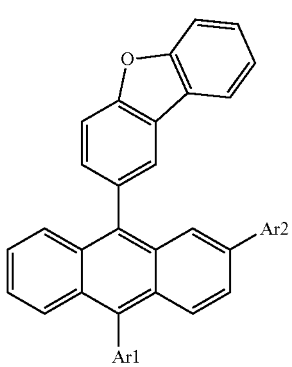 | 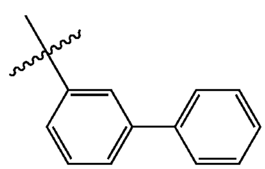 [SMILES: *c1cccc(-c2ccccc2)c1] | 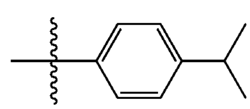 [SMILES: *c1ccc(C(C)C)cc1] |

-continued
| No. | | Ar1 | Ar2 |
|---|---|---|---|
| 20-26 | 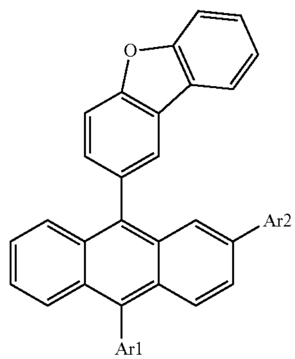 | 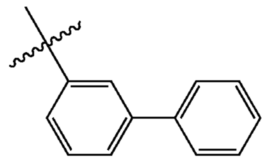 [SMILES: *c1cccc(-c2ccccc2)c1] | 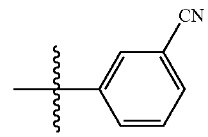 [SMILES: *c1cccc(C#N)c1] |
| 20-27 | 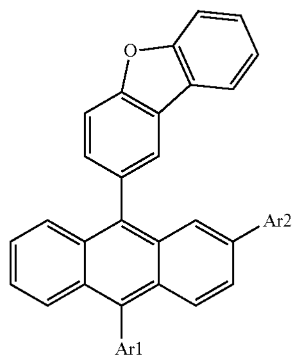 | 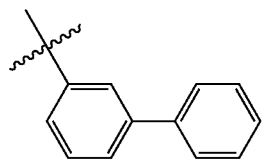 [SMILES: *c1cccc(-c2ccccc2)c1] | 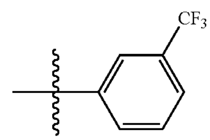 [SMILES: *c1cccc(C(F)(F)F)c1] |
| 20-28 | 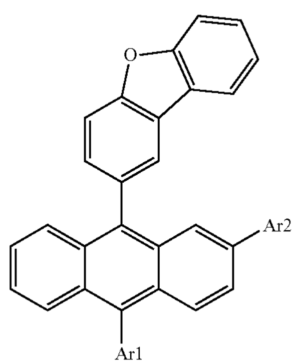 | 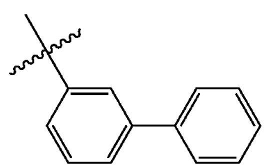 [SMILES: *c1cccc(-c2ccccc2)c1] | 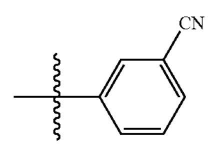 [SMILES: *c1cccc(C#N)c1] |
| 20-29 | 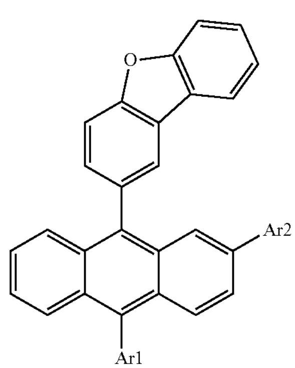 | 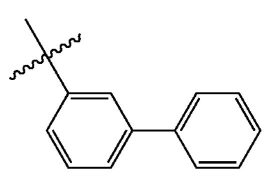 [SMILES: *c1cccc(-c2ccccc2)c1] | 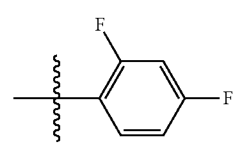 [SMILES: *c1ccc(F)cc1F] |

-continued
| No. | | Ar1 | Ar2 |
|---|---|---|---|
| 21-1 | 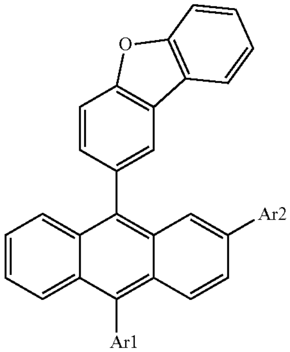 | 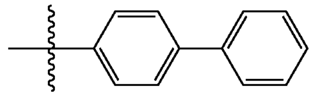 | 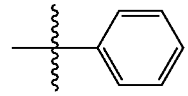 [SMILES: *c1ccccc1] |
| 21-2 | 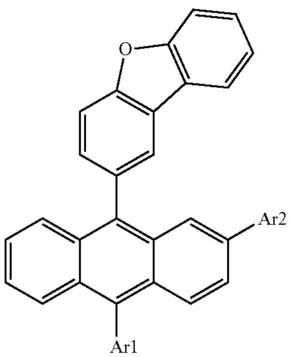 | 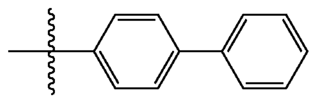 [SMILES: *c1ccc(-c2ccccc2)cc1] | 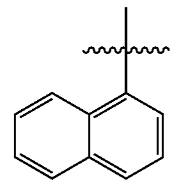 [SMILES: *c1cccc2ccccc12] |
| 21-3 | 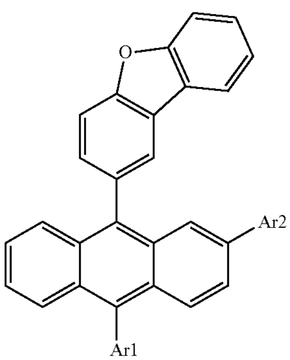 | 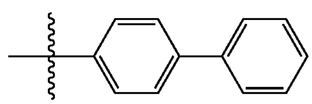 | 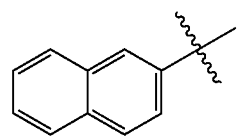 [SMILES: *c1ccc2ccccc2c1] |
| 21-4 | 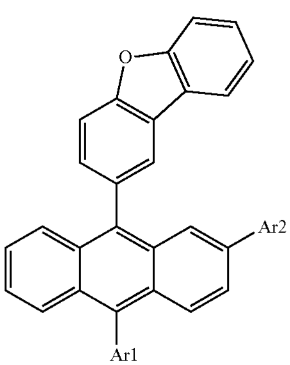 | 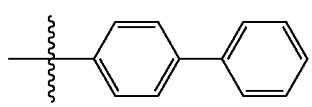 | 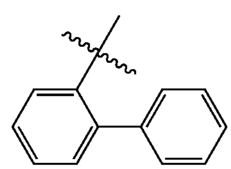 [SMILES: *c1ccccc1-c1ccccc1] |

-continued
| No. | | Ar1 | Ar2 |
|---|---|---|---|
| 21-5 | 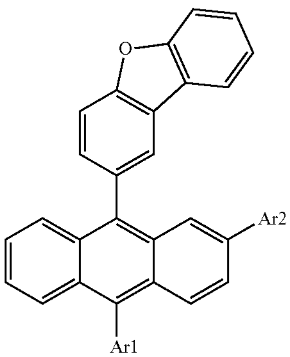 | 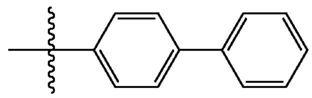 | 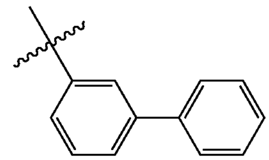 [SMILES: *c1cccc(-c2ccccc2)c1] |
| 21-6 | 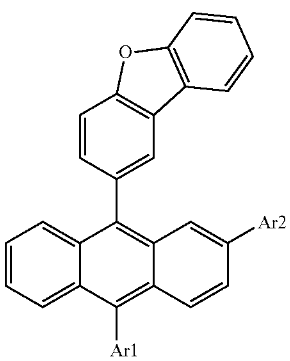 | 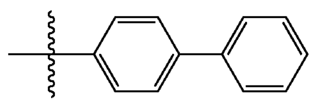 [SMILES: *c1ccc(-c2ccccc2)cc1] | 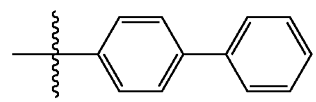 [SMILES: *c1ccc(-c2ccccc2)cc1] |
| 21-7 | 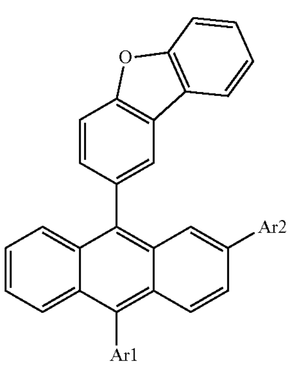 | 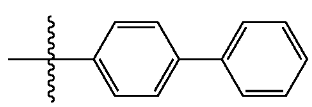 | 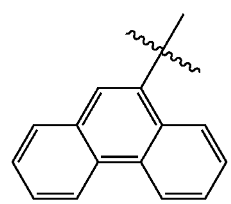 [SMILES: *c1cc2ccccc2c2ccccc12] |
| 21-9 | 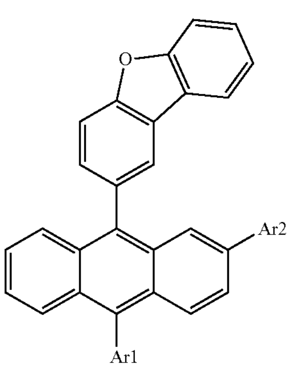 | 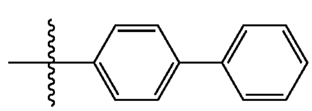 [SMILES: *c1ccc(-c2ccccc2)cc1] | 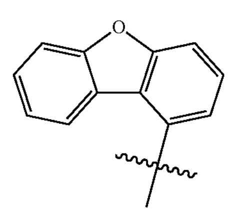 |

-continued
| No. | | Ar1 | Ar2 |
|---|---|---|---|
| 21-10 | 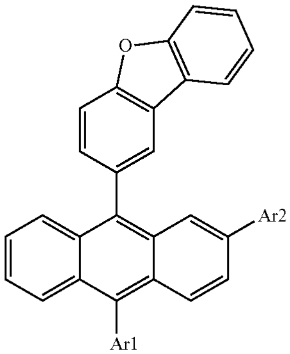 | 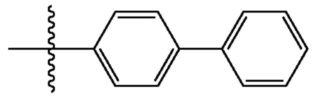 [SMILES: *c1ccc(-c2ccccc2)cc1] | 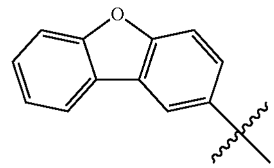 [SMILES: *c1ccc2oc3ccccc3c2c1] |
| 21-11 | 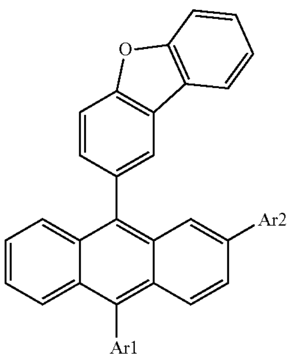 | 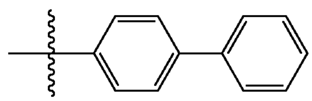 [SMILES: *c1ccc(-c2ccccc2)cc1] | 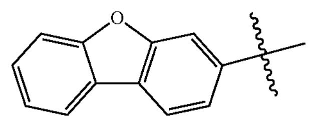 |
| 21-12 | 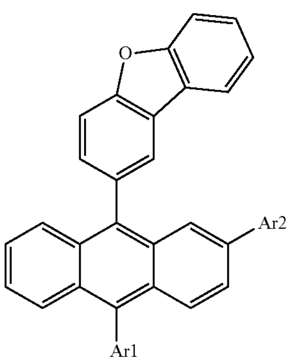 | 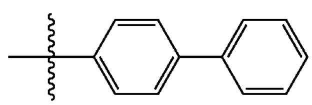 | 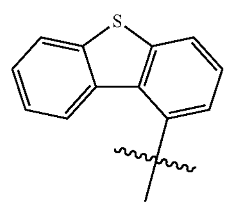 |
| 21-13 | 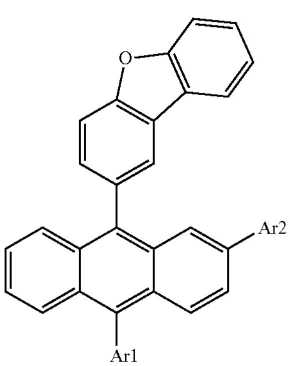 | 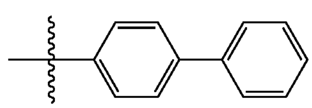 [SMILES: *c1ccc(-c2ccccc2)cc1] | 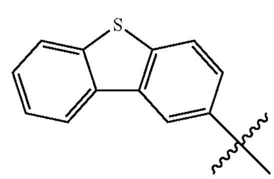 [SMILES: *c1ccc2sc3ccccc3c2c1] |

-continued
| No. | | Ar1 | Ar2 |
|---|---|---|---|
| 21-14 | 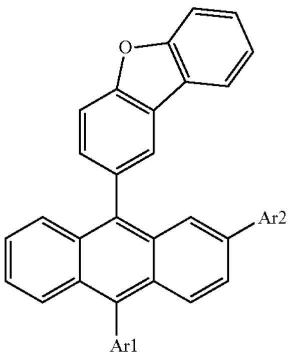 | 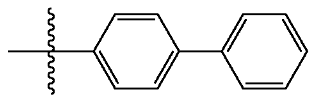 [SMILES: *c1ccc(-c2ccccc2)cc1] | 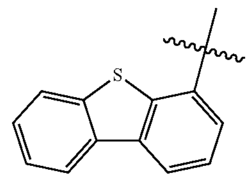 [SMILES: *c1cccc2c1sc1ccccc12] |
| 21-19 | 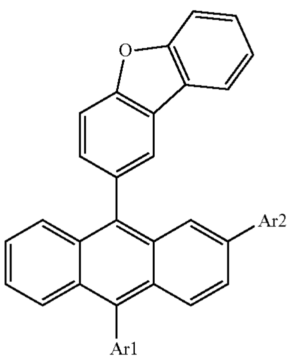 | 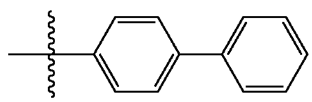 [SMILES: *c1ccc(-c2ccccc2)cc1] | 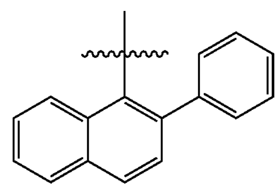 [SMILES: *c1c(-c2ccccc2)ccc2ccccc12] |
| 21-20 | 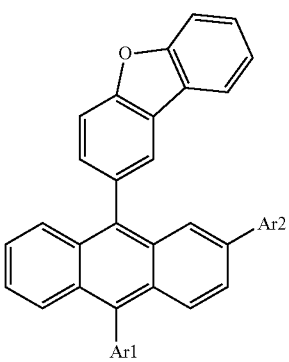 | 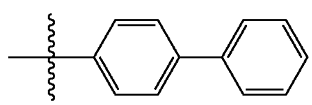 [SMILES: *c1ccc(-c2ccccc2)cc1] | 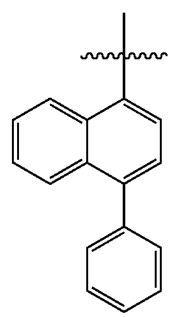 [SMILES: *c1ccc(-c2ccccc2)c2ccccc12] |
| 21-21 | 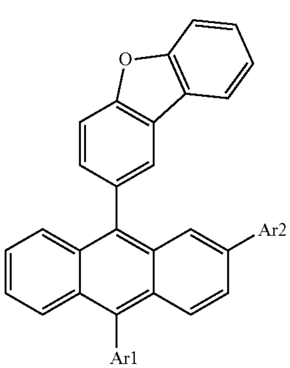 | 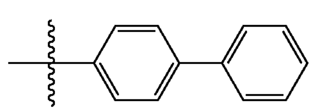 | 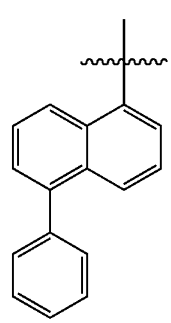 [SMILES: *c1cccc2c(-c3ccccc3)cccc12] |

-continued
| No. | | Ar1 | Ar2 |
|---|---|---|---|
| 21-22 | 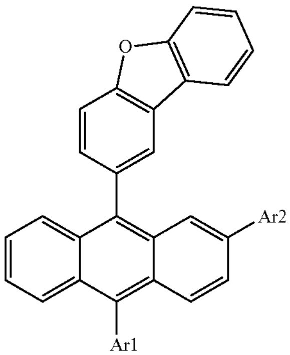 | 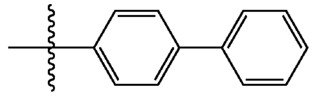 [SMILES: *c1ccc(-c2ccccc2)cc1] | 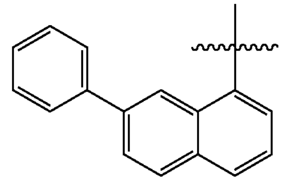 [SMILES: *c1cccc2ccc(-c3ccccc3)cc12] |
| 21-23 | 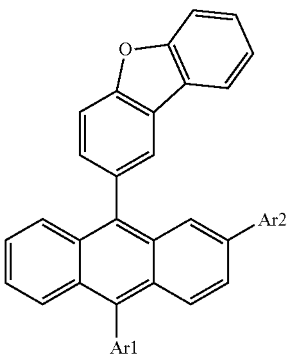 | 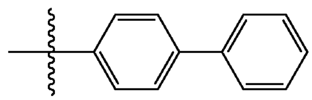 | 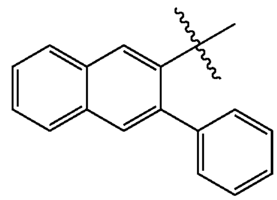 [SMILES: *c1cc2ccccc2cc1-c1ccccc1] |
| 21-24 | 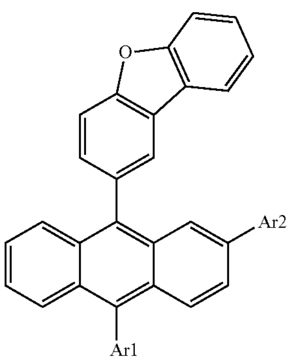 | 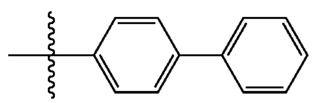 [SMILES: *c1ccc(-c2ccccc2)cc1] | 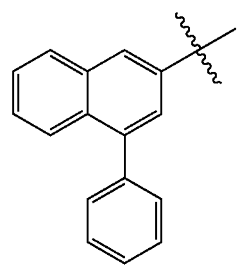 [SMILES: *c1cc(-c2ccccc2)c2ccccc2c1] |
| 21-25 | 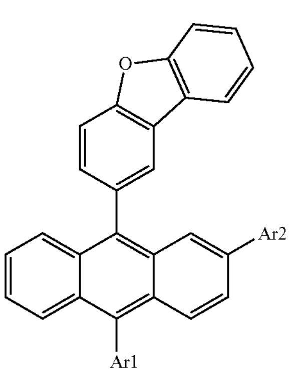 | 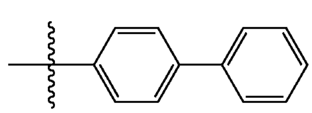 [SMILES: *c1ccc(-c2ccccc2)cc1] | 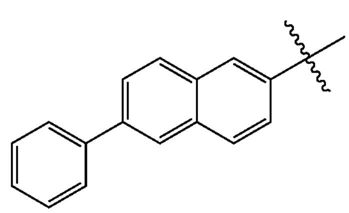 [SMILES: *c1ccc2cc(-c3ccccc3)ccc2c1] |

-continued
| No. | | Ar1 | Ar2 |
|---|---|---|---|
| 21-26 | 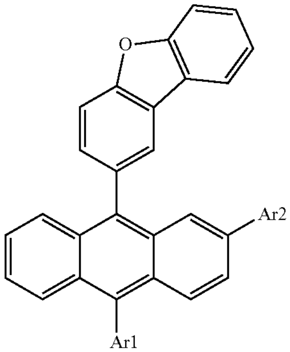 | 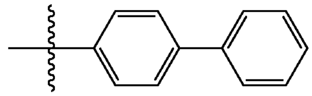 [SMILES: *c1ccc(-c2ccccc2)cc1] | 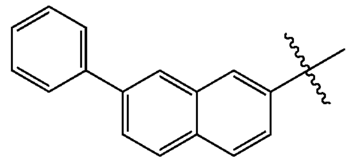 [SMILES: *c1ccc2ccc(-c3ccccc3)cc2c1] |
| 21-27 | 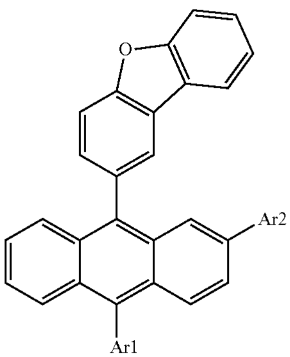 | 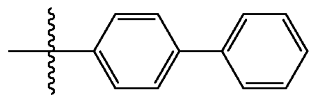 | 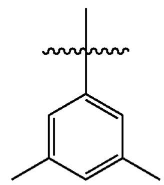 |
| 21-28 | 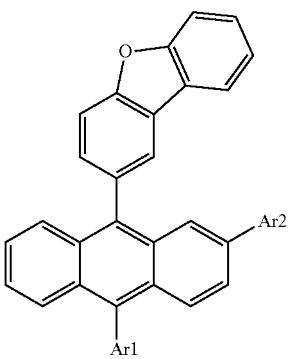 | 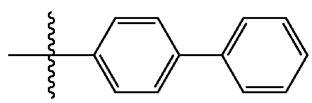 | 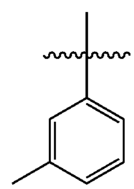 |
| 21-29 | 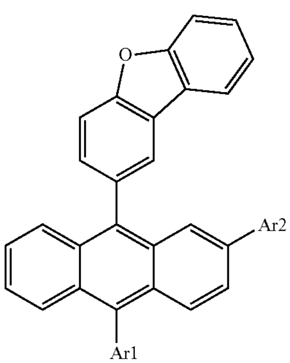 | 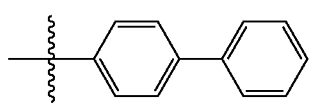 | 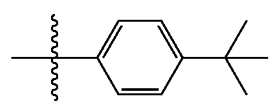 |

-continued
| No. | | Ar1 | Ar2 |
|---|---|---|---|
| 21-30 | 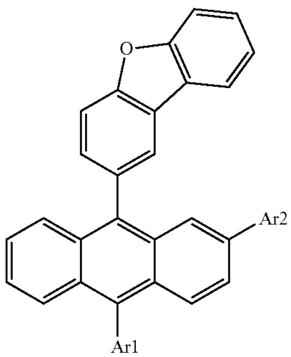 | 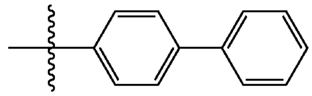 [SMILES: *c1ccc(-c2ccccc2)cc1] | 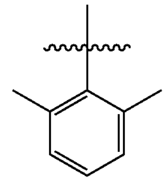 |
| 21-31 | 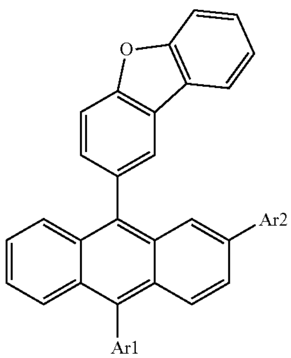 | 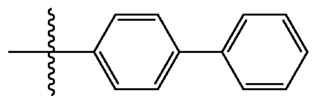 | 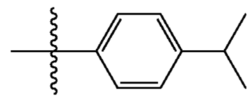 [SMILES: *c1ccc(C(C)C)cc1] |
| 22-1 | 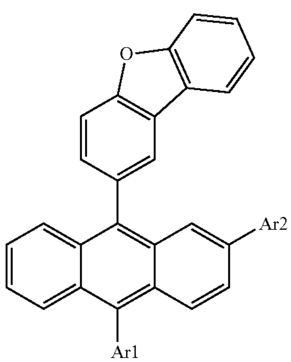 | 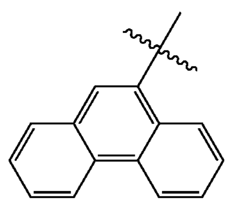 [SMILES: *c1cc2ccccc2c2ccccc12] | 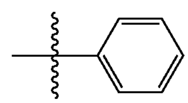 [SMILES: *c1ccccc1] |
| 22-2 | 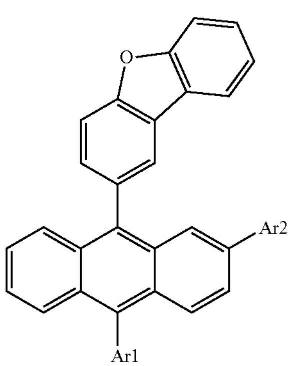 | 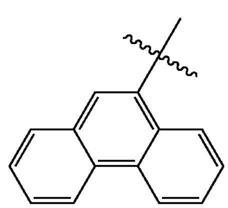 [SMILES: *c1cc2ccccc2c2ccccc12] | 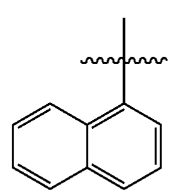 [SMILES: *c1cccc2ccccc12] |

-continued
| No. | | Ar1 | Ar2 |
|---|---|---|---|
| 22-3 | 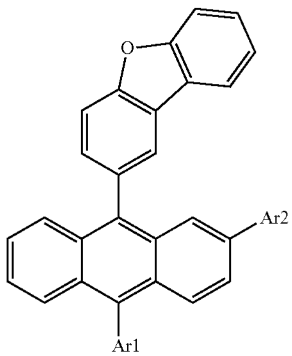 | 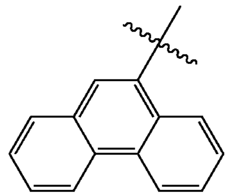 [SMILES: *c1cc2ccccc2c2ccccc12] | 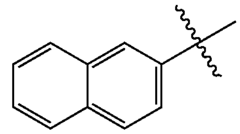 [SMILES: *c1ccc2ccccc2c1] |
| 22-4 | 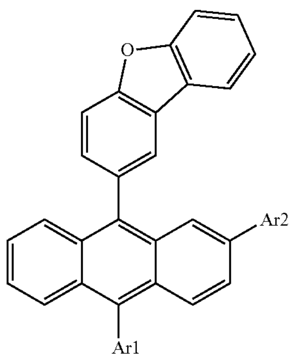 | 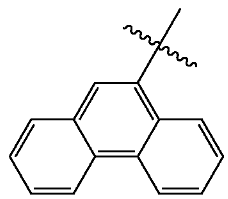 [SMILES: *c1cc2ccccc2c2ccccc12] | 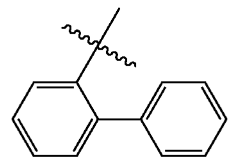 [SMILES: *c1ccccc1-c1ccccc1] |
| 22-5 | 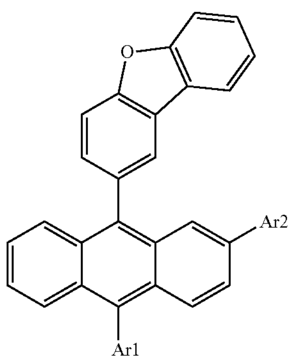 | 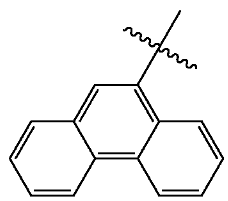 [SMILES: *c1cc2ccccc2c2ccccc12] | 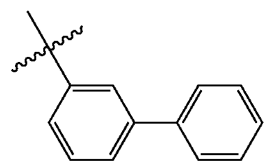 [SMILES: *c1cccc(-c2ccccc2)c1] |
| 22-6 | 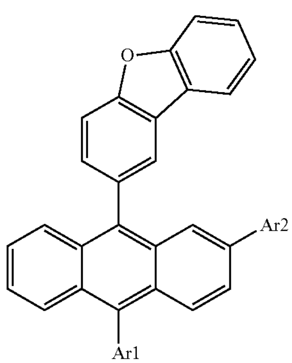 | 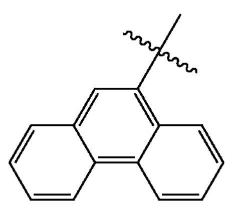 [SMILES: *c1cc2ccccc2c2ccccc12] | 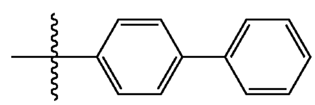 |

-continued
| No. | | Ar1 | Ar2 |
|---|---|---|---|
| 22-7 | 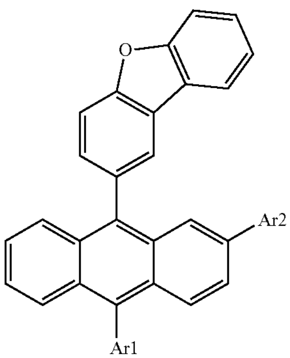 | 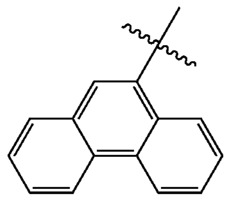 [SMILES: *c1cc2ccccc2c2ccccc12] | 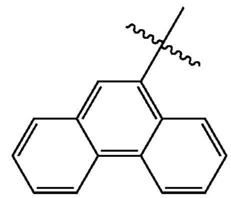 [SMILES: *c1cc2ccccc2c2ccccc12] |
| 22-9 | 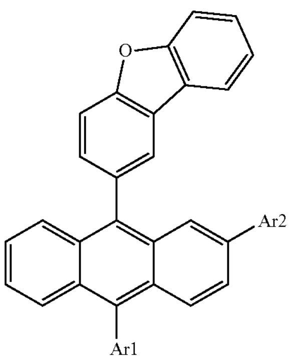 | 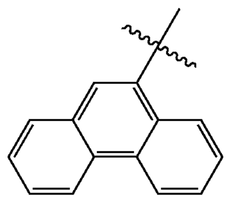 [SMILES: *c1cc2ccccc2c2ccccc12] | 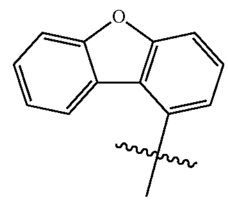 [SMILES: *c1cccc2oc3ccccc3c12] |
| 22-10 | 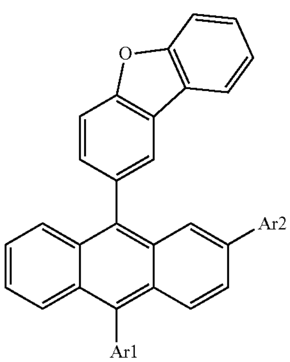 | 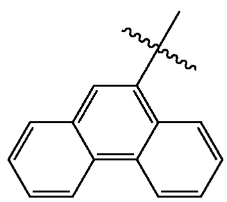 [SMILES: *c1cc2ccccc2c2ccccc12] | 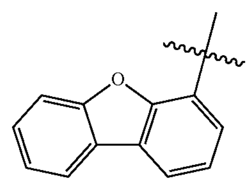 |
| 22-11 | 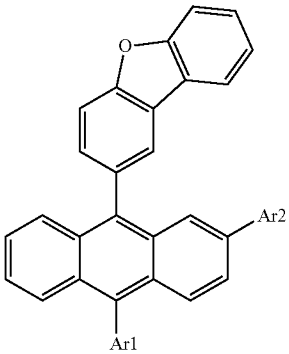 | 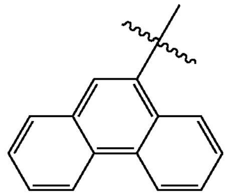 [SMILES: *c1cc2ccccc2c2ccccc12] | 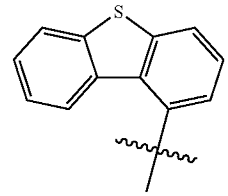 [SMILES: *c1cccc2sc3ccccc3c12] |

-continued
| No. | | Ar1 | Ar2 |
|---|---|---|---|
| 22-12 | 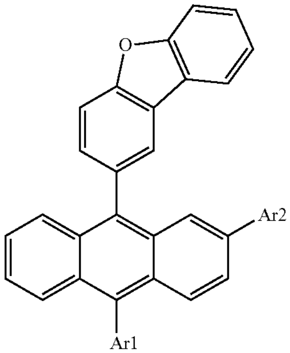 | 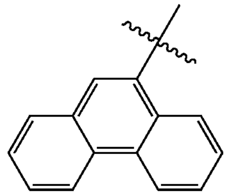 [SMILES: *c1cc2ccccc2c2ccccc12] | 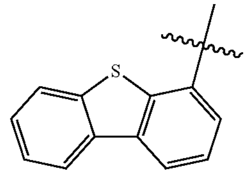 |
| 22-16 | 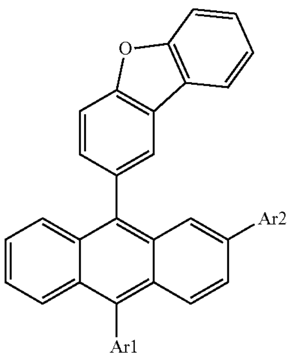 | 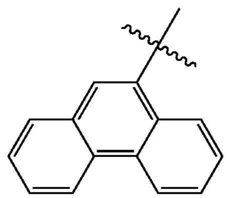 [SMILES: *c1cc2ccccc2c2ccccc12] | 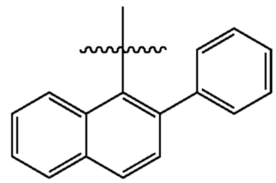 [SMILES: *c1c(-c2ccccc2)ccc2ccccc12] |
| 22-17 | 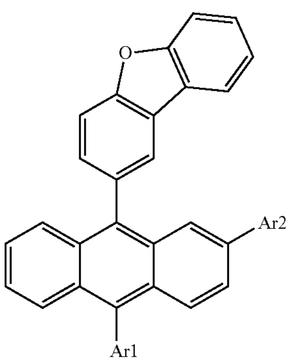 | 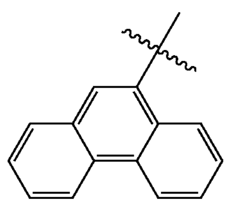 [SMILES: *c1cc2ccccc2c2ccccc12] | 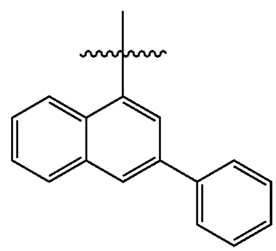 [SMILES: *c1cc(-c2ccccc2)cc2ccccc12] |
| 22-18 | 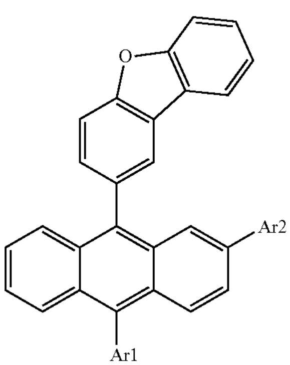 | 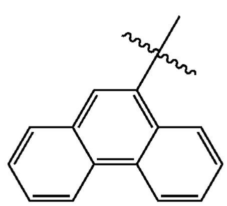 [SMILES: *c1cc2ccccc2c2ccccc12] | 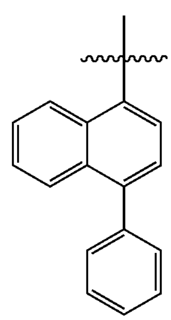 [SMILES: *c1ccc(-c2ccccc2)c2ccccc12] |

-continued
| No. | | Ar1 | Ar2 |
|---|---|---|---|
| 22-19 | 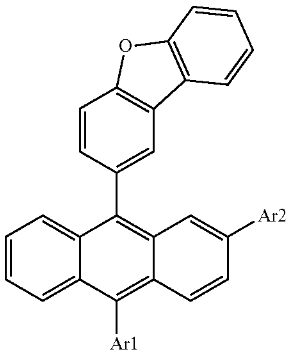 | 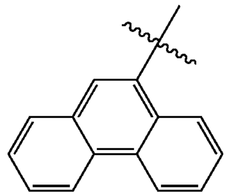 [SMILES: *c1cc2ccccc2c2ccccc12] | 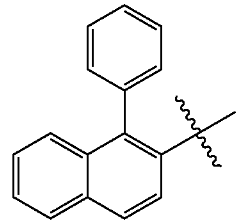 [SMILES: *c1ccc2ccccc2c1-c1ccccc1] |
| 22-20 | 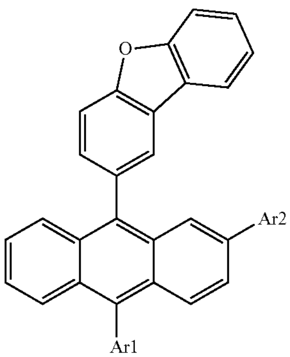 | 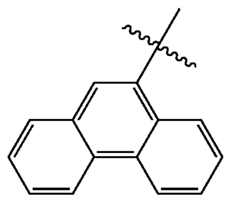 [SMILES: *c1cc2ccccc2c2ccccc12] | 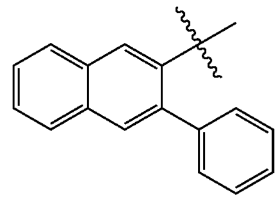 [SMILES: *c1cc2ccccc2cc1-c1ccccc1] |
| 22-21 | 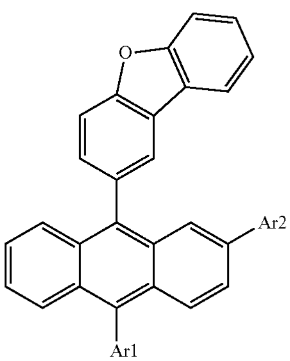 | 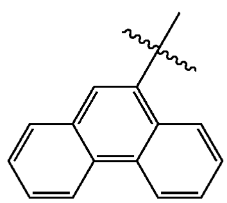 [SMILES: *c1cc2ccccc2c2ccccc12] | 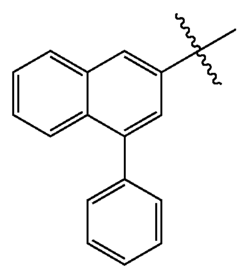 [SMILES: *c1cc(-c2ccccc2)c2ccccc2c1] |
| 22-22 | 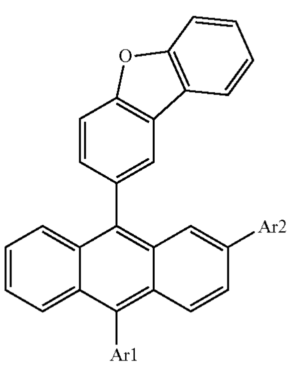 | 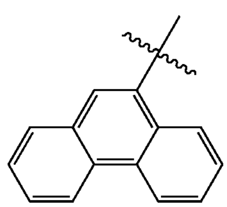 [SMILES: *c1cc2ccccc2c2ccccc12] | 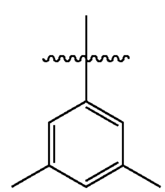 |

-continued
| No. | | Ar1 | Ar2 |
|---|---|---|---|
| 22-23 | 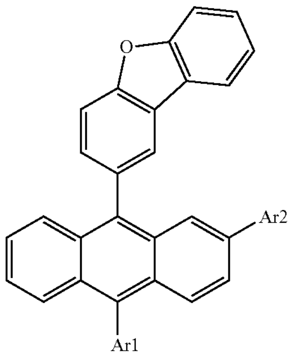 | 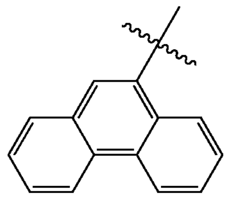 [SMILES: *c1cc2ccccc2c2ccccc12] | 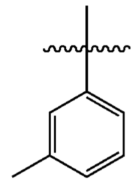 |
| 22-24 | 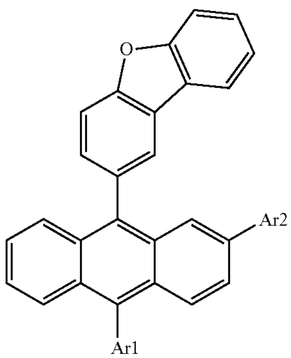 | 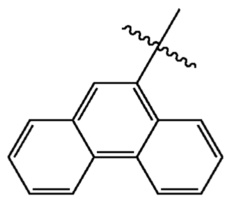 [SMILES: *c1cc2ccccc2c2ccccc12] | 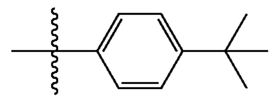 |
| 22-25 | 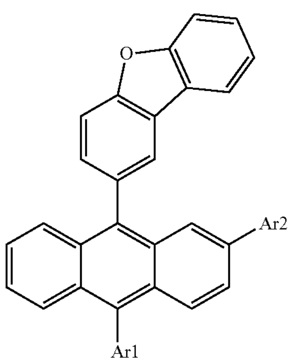 | 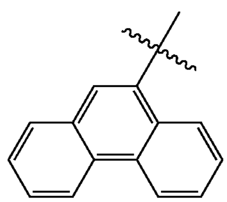 [SMILES: *c1cc2ccccc2c2ccccc12] | 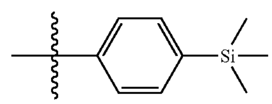 |
| 22-26 | 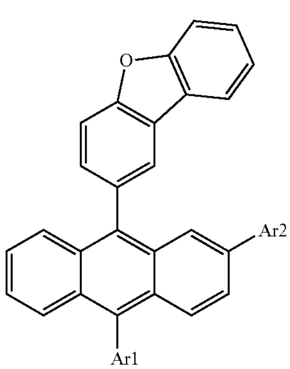 | 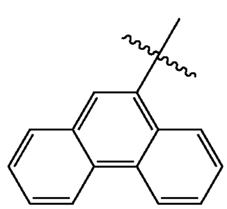 [SMILES: *c1cc2ccccc2c2ccccc12] | 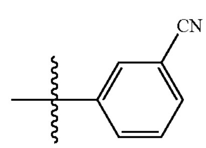 [SMILES: *c1cccc(C#N)c1] |

-continued
| No. | | Ar1 | Ar2 |
|---|---|---|---|
| 22-27 | 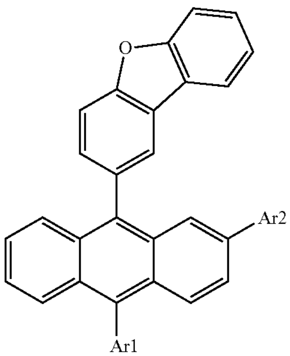 | 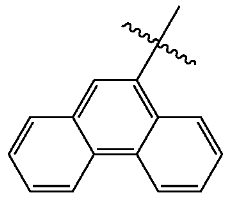 [SMILES: *c1cc2ccccc2c2ccccc12] | 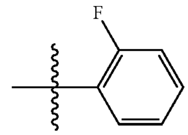 [SMILES: *c1ccccc1F] |
| 22-28 | 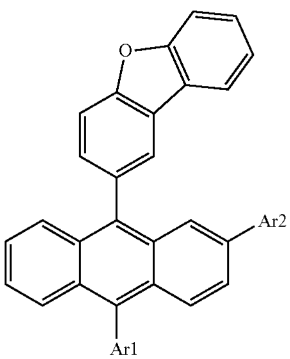 | 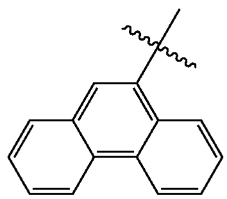 [SMILES: *c1cc2ccccc2c2ccccc12] | 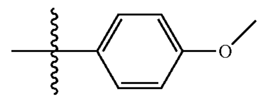 [SMILES: *c1ccc(OC)cc1] |
| 23-1 | 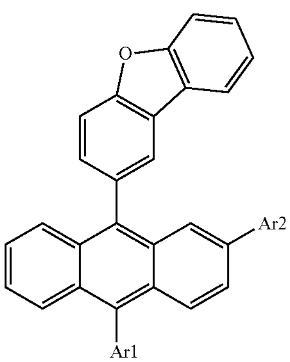 | 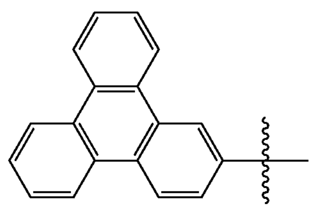 [SMILES: *c1ccc2c3ccccc3c3ccccc3c2c1] | 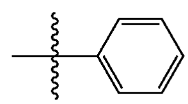 |
| 23-2 | 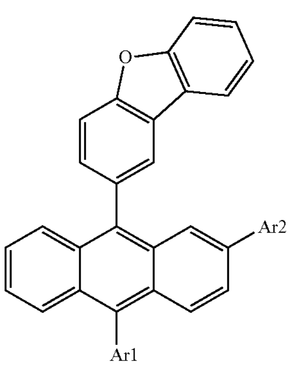 | 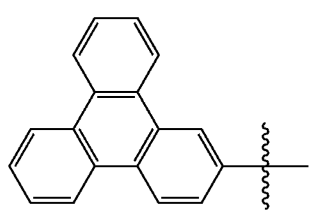 [SMILES: *c1ccc2c3ccccc3c3ccccc3c2c1] | 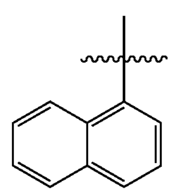 [SMILES: *c1cccc2ccccc12] |

-continued
| No. | | Ar1 | Ar2 |
|---|---|---|---|
| 23-3 | 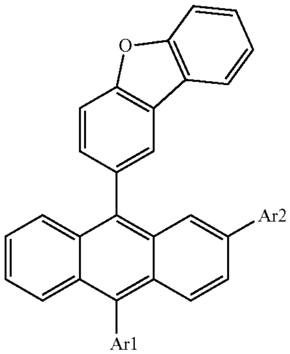 | 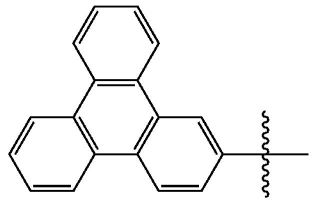 [SMILES: *c1ccc2c3ccccc3c3ccccc3c2c1] | 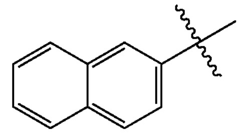 [SMILES: *c1ccc2ccccc2c1] |
| 23-4 | 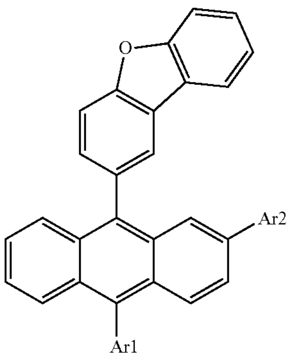 | 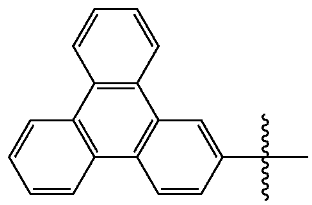 [SMILES: *c1ccc2c3ccccc3c3ccccc3c2c1] | 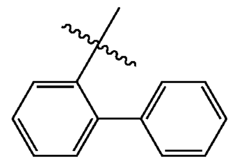 [SMILES: *c1ccccc1-c1ccccc1] |
| 23-5 | 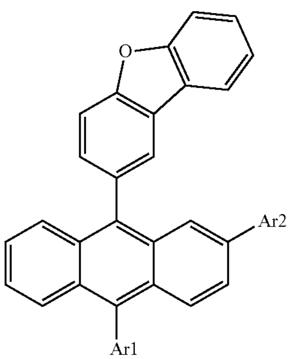 | 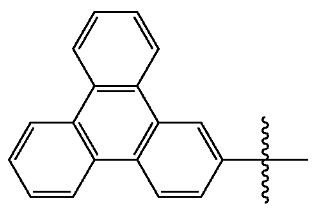 [SMILES: *c1ccc2c3ccccc3c3ccccc3c2c1] | 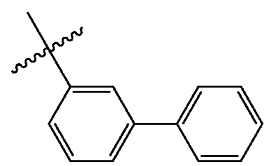 [SMILES: *c1cccc(-c2ccccc2)c1] |
| 23-6 | 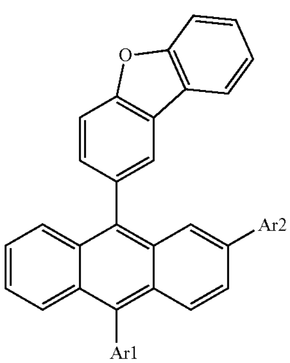 | 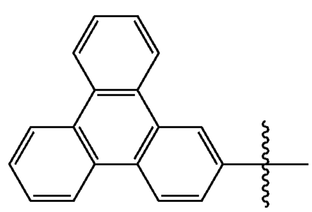 [SMILES: *c1ccc2c3ccccc3c3ccccc3c2c1] | 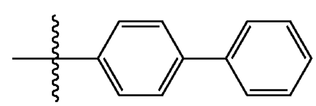 [SMILES: *c1ccc(-c2ccccc2)cc1] |

-continued
| No. | | Ar1 | Ar2 |
|---|---|---|---|
| 23-7 | 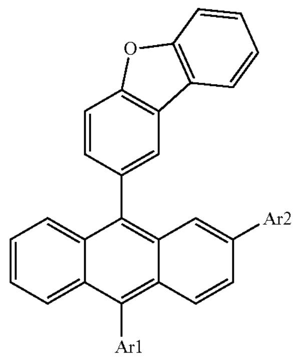 | 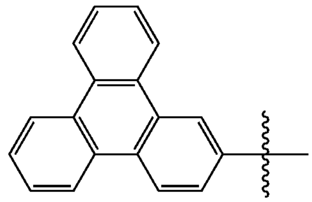 [SMILES: *c1ccc2c3ccccc3c3ccccc3c2c1] | 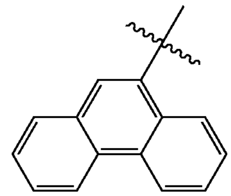 [SMILES: *c1cc2ccccc2c2ccccc12] |
| 23-9 | 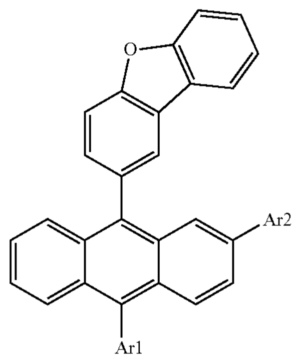 | 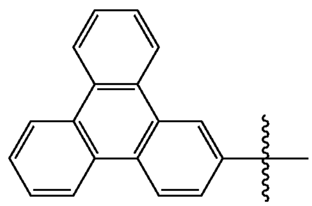 [SMILES: *c1ccc2c3ccccc3c3ccccc3c2c1] | 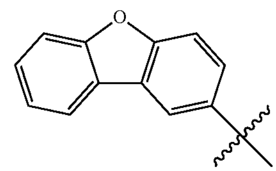 |
| 23-10 | 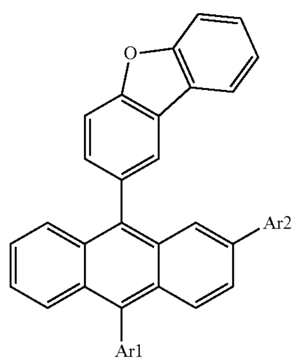 | 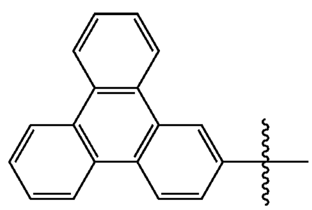 [SMILES: *c1ccc2c3ccccc3c3ccccc3c2c1] | 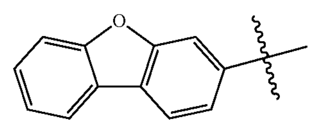 [SMILES: *c1ccc2c(c1)oc1ccccc12] |
| 23-11 | 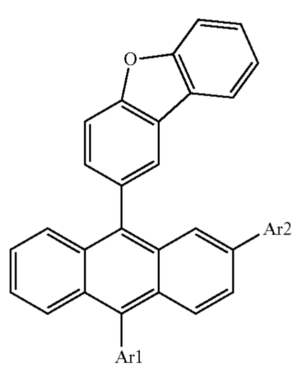 | 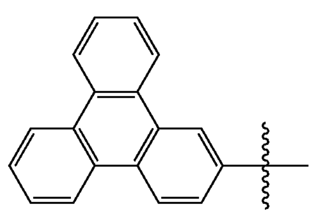 [SMILES: *c1ccc2c3ccccc3c3ccccc3c2c1] | 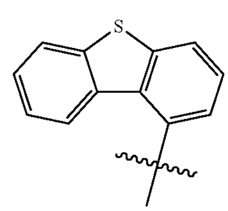 [SMILES: *c1cccc2sc3ccccc3c12] |

-continued
| No. | | Ar1 | Ar2 |
|---|---|---|---|
| 23-12 | 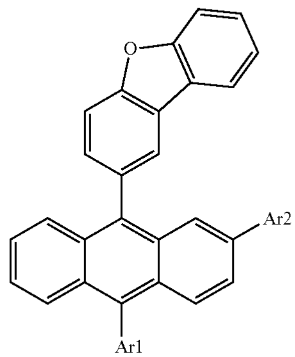 | 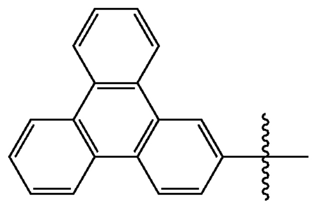 [SMILES: *c1ccc2c3ccccc3c3ccccc3c2c1] | 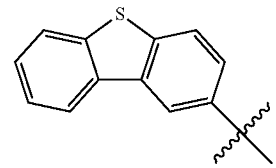 |
| 23-13 | 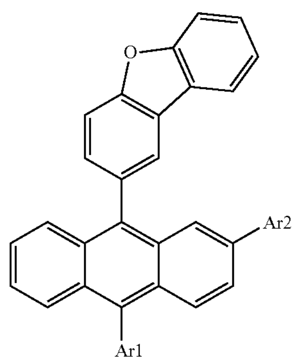 | 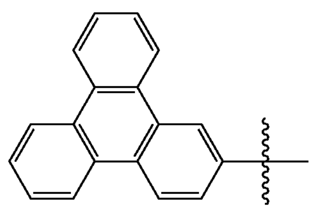 [SMILES: *c1ccc2c3ccccc3c3ccccc3c2c1] | 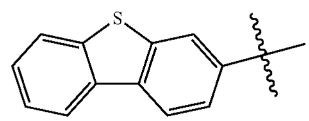 |
| 23-17 | 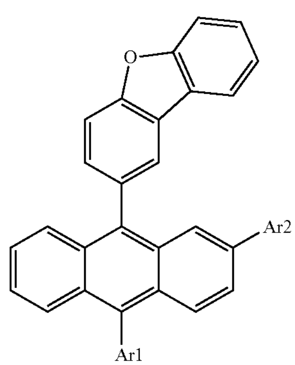 | 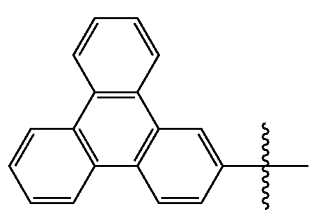 [SMILES: *c1ccc2c3ccccc3c3ccccc3c2c1] | 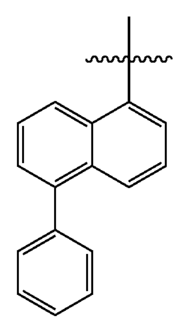 [SMILES: *c1cccc2c(-c3ccccc3)cccc12] |
| 23-18 | 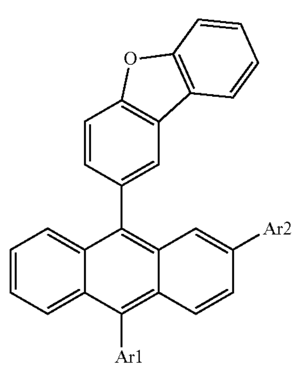 | 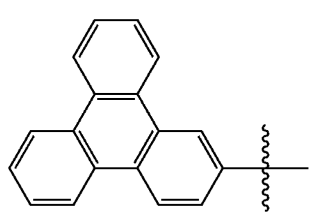 [SMILES: *c1ccc2c3ccccc3c3ccccc3c2c1] | 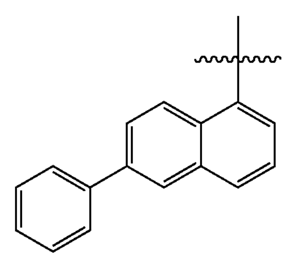 [SMILES: *c1cccc2cc(-c3ccccc3)ccc12] |

-continued
| No. | | Ar1 | Ar2 |
|---|---|---|---|
| 23-19 | 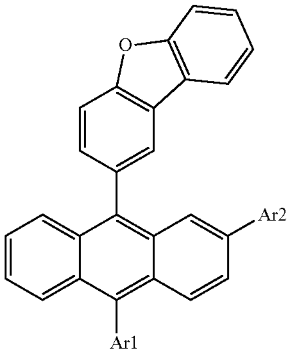 | 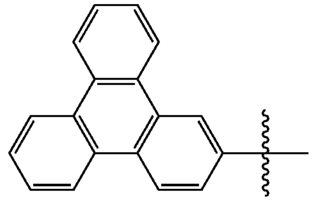 [SMILES: *c1ccc2c3ccccc3c3ccccc3c2c1] | 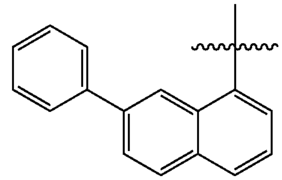 [SMILES: *c1cccc2ccc(-c3ccccc3)cc12] |
| 23-20 | 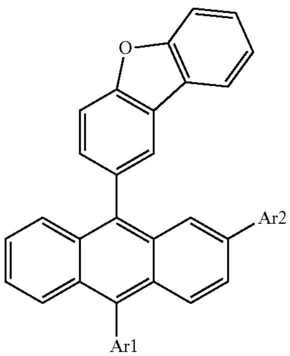 | 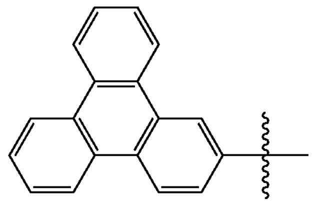 | 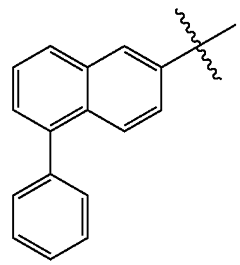 [SMILES: *c1ccc2c(-c3ccccc3)cccc2c1] |
| 23-21 | 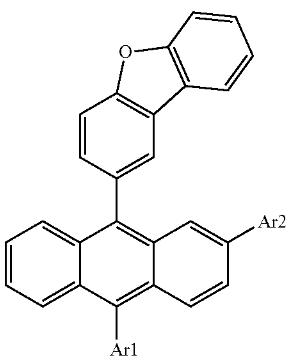 | 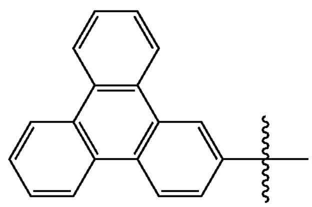 [SMILES: *c1ccc2c3ccccc3c3ccccc3c2c1] | 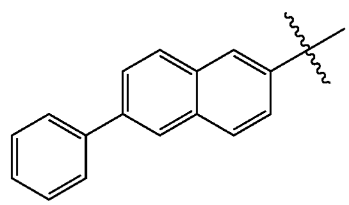 [SMILES: *c1ccc2cc(-c3ccccc3)ccc2c1] |
| 23-22 | 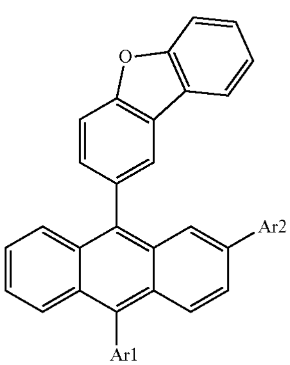 | 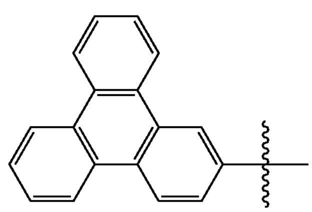 [SMILES: *c1ccc2c3ccccc3c3ccccc3c2c1] | 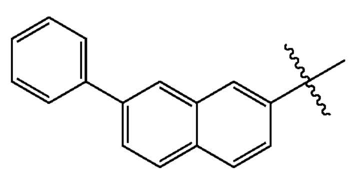 [SMILES: *c1ccc2ccc(-c3ccccc3)cc2c1] |

-continued
| No. | | Ar1 | Ar2 |
|---|---|---|---|
| 23-23 | 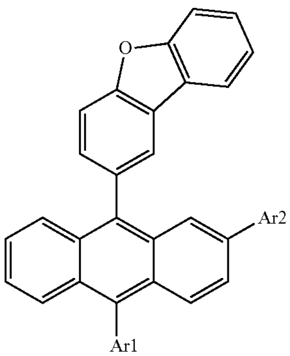 | 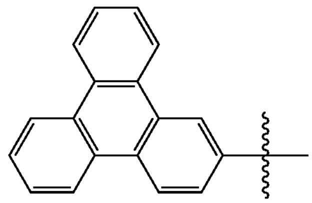 [SMILES: *c1ccc2c3ccccc3c3ccccc3c2c1] | 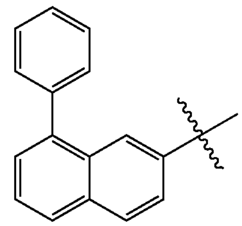 [SMILES: *c1ccc2cccc(-c3ccccc3)c2c1] |
| 23-24 | 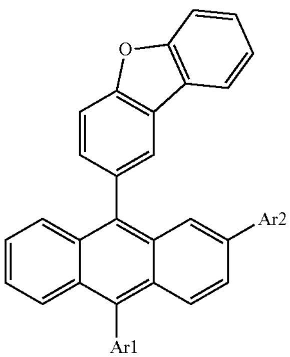 | 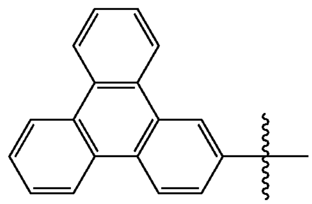 | 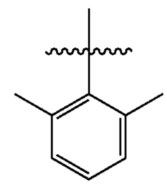 |
| 23-25 | 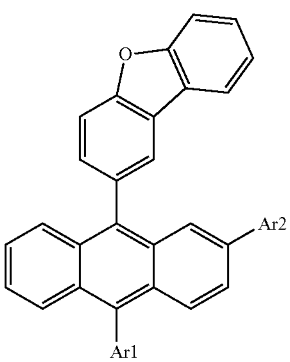 | 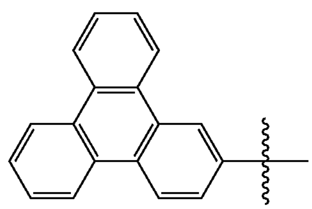 [SMILES: *c1ccc2c3ccccc3c3ccccc3c2c1] | 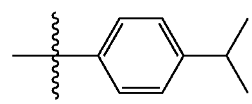 [SMILES: *c1ccc(C(C)C)cc1] |
| 23-26 | 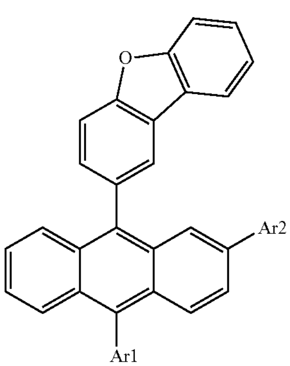 | 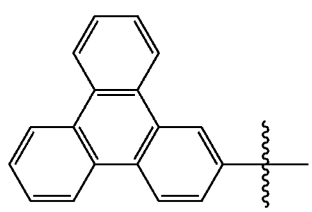 [SMILES: *c1ccc2c3ccccc3c3ccccc3c2c1] | 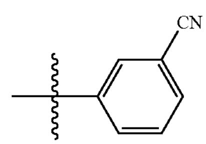 [SMILES: *c1cccc(C#N)c1] |

-continued
| No. | | Ar1 | Ar2 |
|---|---|---|---|
| 23-27 | 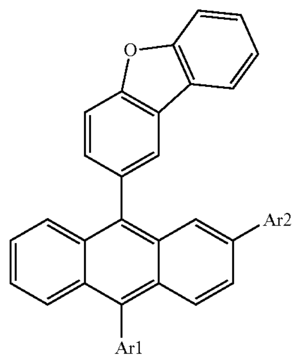 | 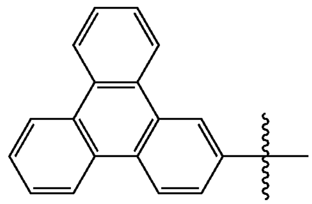 [SMILES: *c1ccc2c3ccccc3c3ccccc3c2c1] | 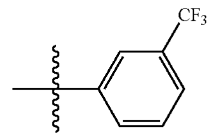 [SMILES: *c1cccc(C(F)(F)F)c1] |
| 23-28 | 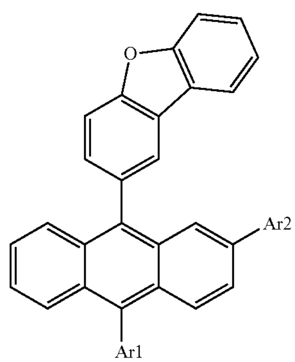 | 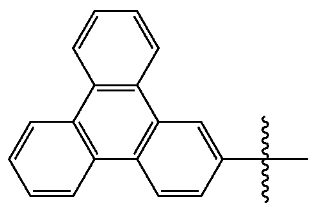 [SMILES: *c1ccc2c3ccccc3c3ccccc3c2c1] | 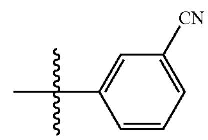 [SMILES: *c1cccc(C#N)c1] |
| 23-29 | 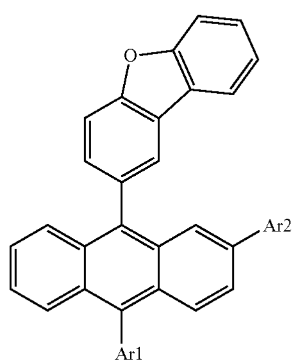 | 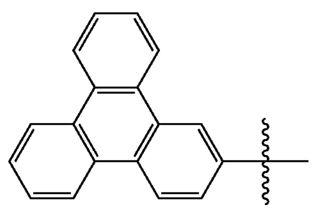 [SMILES: *c1ccc2c3ccccc3c3ccccc3c2c1] | 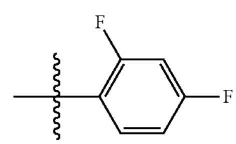 [SMILES: *c1ccc(F)cc1F] |
| 24-1 | 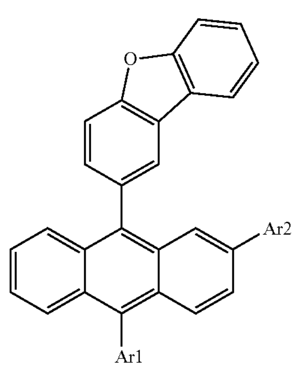 | 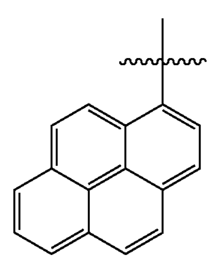 [SMILES: *c1ccc2ccc3cccc4ccc1c2c34] | 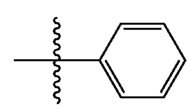 [SMILES: *c1ccccc1] |

-continued
| No. | | Ar1 | Ar2 |
|---|---|---|---|
| 24-2 | 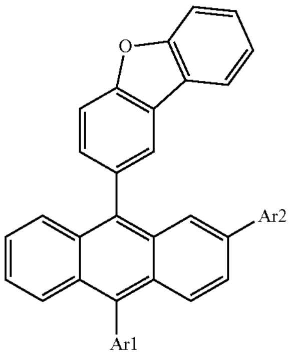 | 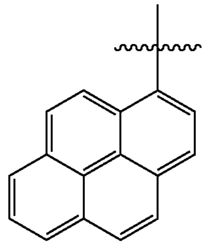 [SMILES: *c1ccc2ccc3cccc4ccc1c2c34] | 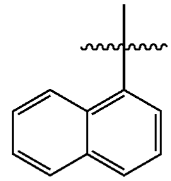 [SMILES: *c1cccc2ccccc12] |
| 24-3 | 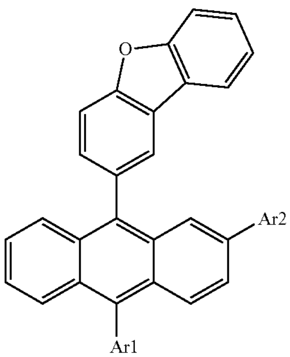 | 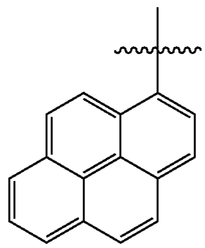 [SMILES: *c1ccc2ccc3cccc4ccc1c2c34] | 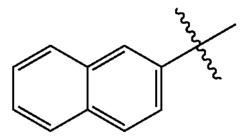 [SMILES: *c1ccc2ccccc2c1] |
| 24-4 | 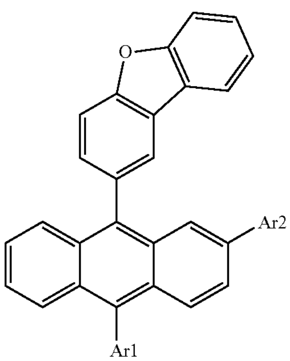 | 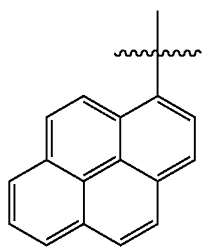 [SMILES: *c1ccc2ccc3cccc4ccc1c2c34] | 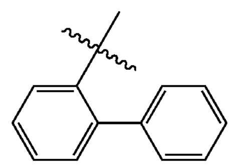 [SMILES: *c1ccccc1-c1ccccc1] |
| 24-5 | 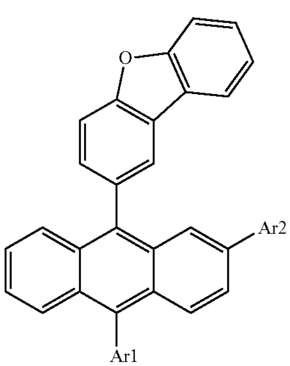 | 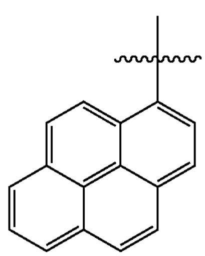 [SMILES: *c1ccc2ccc3cccc4ccc1c2c34] | 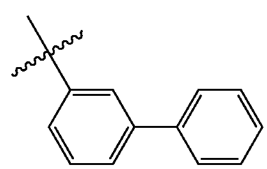 [SMILES: *c1cccc(-c2ccccc2)c1] |

-continued
| No. | | Ar1 | Ar2 |
|---|---|---|---|
| 24-6 | 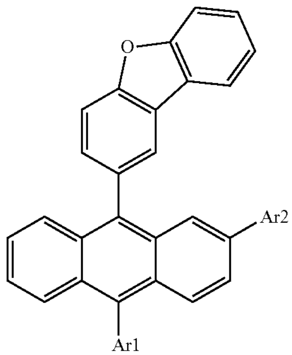 | 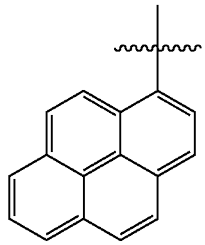 [SMILES: *c1ccc2ccc3cccc4ccc1c2c34] | 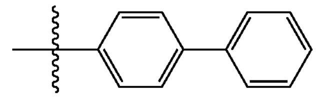 [SMILES: *c1ccc(-c2ccccc2)cc1] |
| 24-7 | 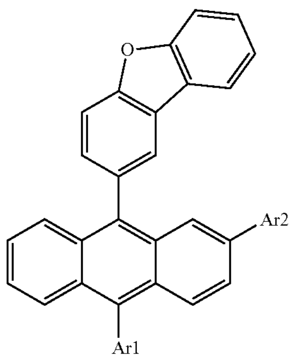 | 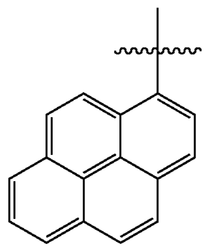 [SMILES: *c1ccc2ccc3cccc4ccc1c2c34] | 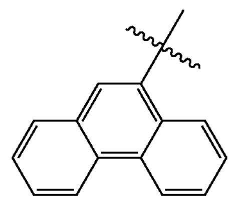 [SMILES: *c1cc2ccccc2c2ccccc12] |
| 24-9 | 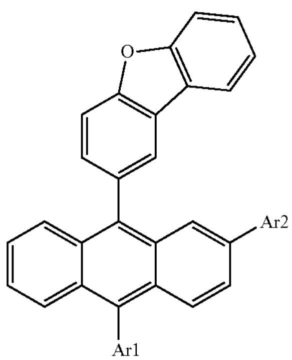 | 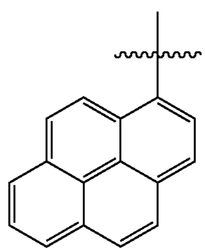 [SMILES: *c1ccc2ccc3cccc4ccc1c2c34] | 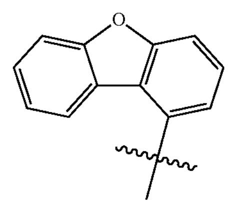 |
| 24-10 | 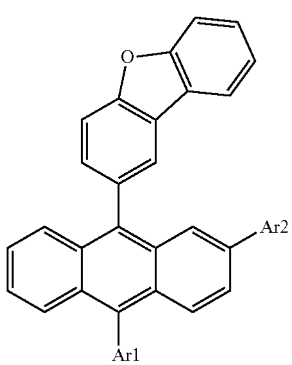 | 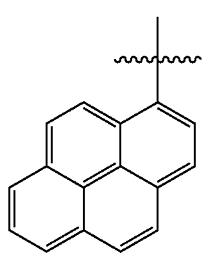 [SMILES: *c1ccc2ccc3cccc4ccc1c2c34] | 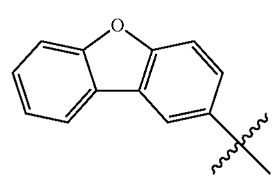 [SMILES: *c1ccc2oc3ccccc3c2c1] |

-continued
| No. | | Ar1 | Ar2 |
|---|---|---|---|
| 24-11 | 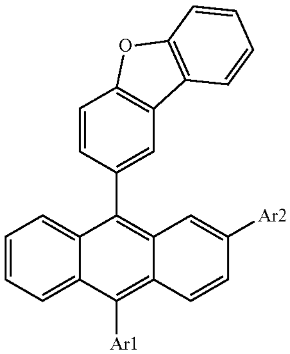 | 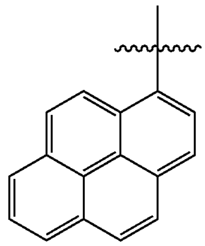 [SMILES: *c1ccc2ccc3cccc4ccc1c2c34] | 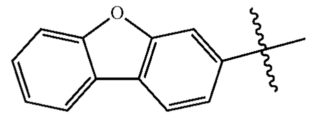 |
| 24-12 | 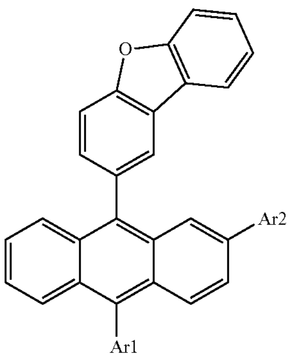 | 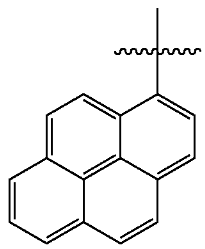 [SMILES: *c1ccc2ccc3cccc4ccc1c2c34] | 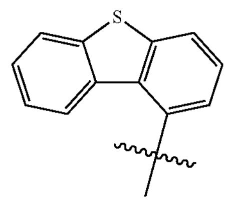 |
| 24-13 | 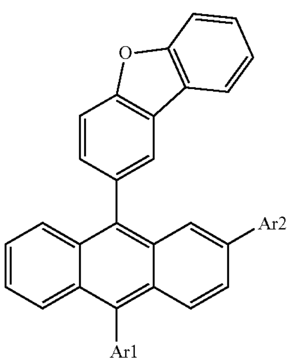 | 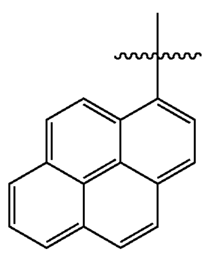 [SMILES: *c1ccc2ccc3cccc4ccc1c2c34] | 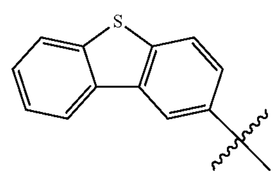 [SMILES: *c1ccc2sc3ccccc3c2c1] |
| 24-14 | 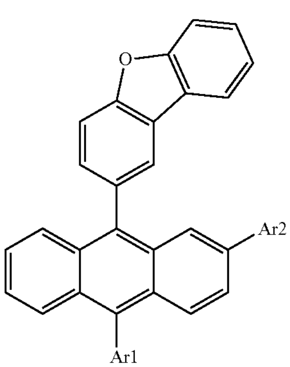 | 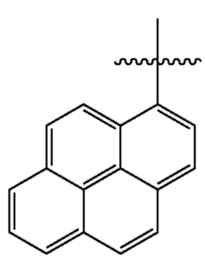 [SMILES: *c1ccc2ccc3cccc4ccc1c2c34] | 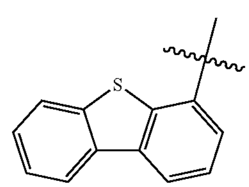 [SMILES: *c1cccc2c1sc1ccccc12] |

-continued
| No. | | Ar1 | Ar2 |
|---|---|---|---|
| 24-19 | 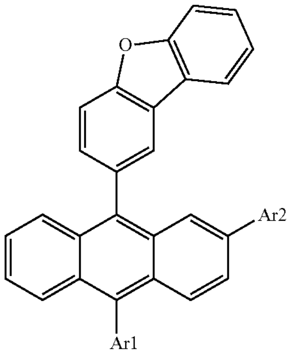 | 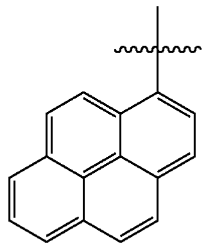 [SMILES: *c1ccc2ccc3cccc4ccc1c2c34] | 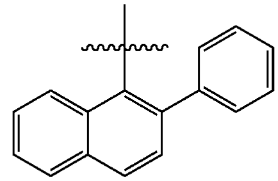 [SMILES: *c1c(-c2ccccc2)ccc2ccccc12] |
| 24-20 | 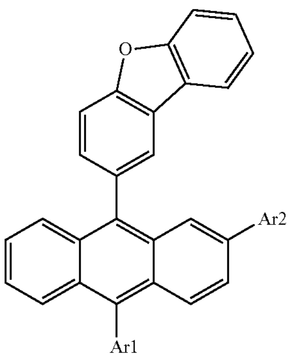 | 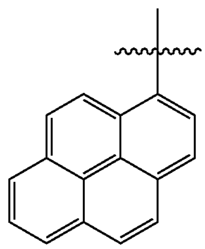 [SMILES: *c1ccc2ccc3cccc4ccc1c2c34] | 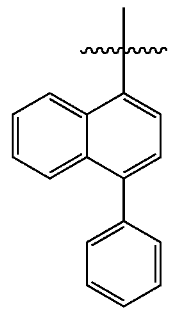 [SMILES: *c1ccc(-c2ccccc2)c2ccccc12] |
| 24-21 | 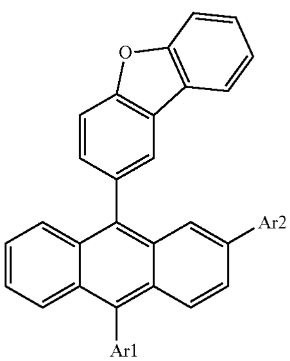 | 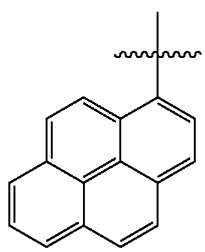 [SMILES: *c1ccc2ccc3cccc4ccc1c2c34] | 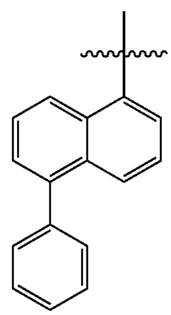 [SMILES: *c1cccc2c(-c3ccccc3)cccc12] |
| 24-22 | 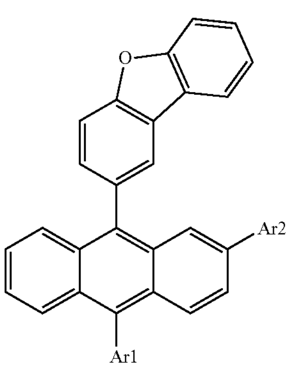 | 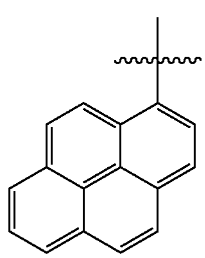 [SMILES: *c1ccc2ccc3cccc4ccc1c2c34] | 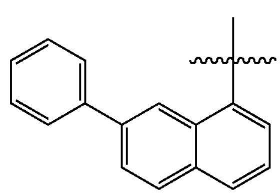 [SMILES: *c1cccc2ccc(-c3ccccc3)cc12] |

-continued
| No. | | Ar1 | Ar2 |
|---|---|---|---|
| 24-23 | 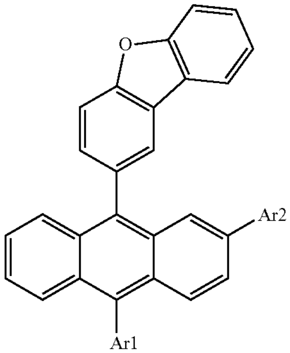  | 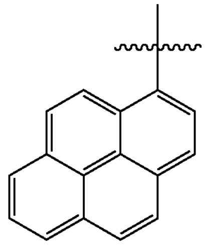 [SMILES: *c1ccc2ccc3cccc4ccc1c2c34] | 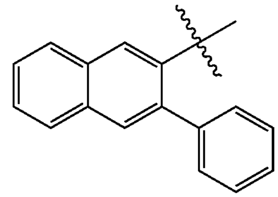 [SMILES: *c1cc2ccccc2cc1-c1ccccc1] |
| 24-24 | 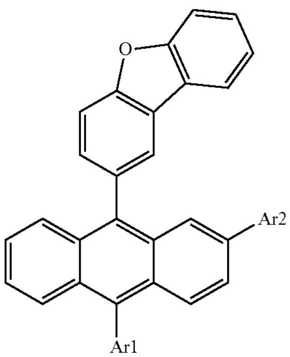  | 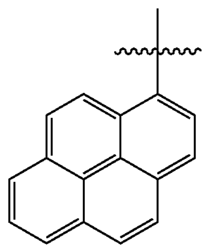 [SMILES: *c1ccc2ccc3cccc4ccc1c2c34] | 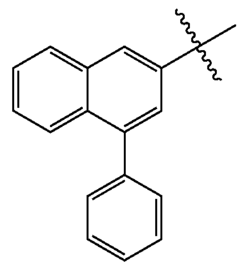 [SMILES: *c1cc(-c2ccccc2)c2ccccc2c1] |
| 24-25 | 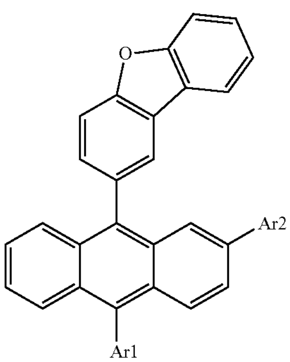  | 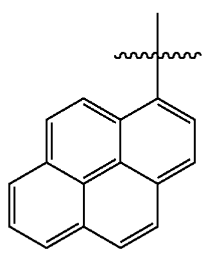 [SMILES: *c1ccc2ccc3cccc4ccc1c2c34] | 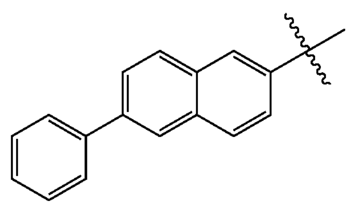 [SMILES: *c1ccc2cc(-c3ccccc3)ccc2c1] |
| 24-26 | 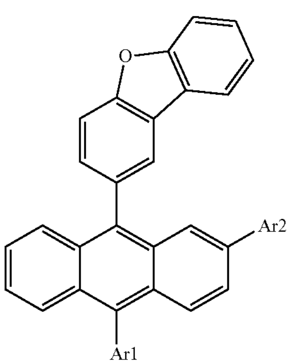  | 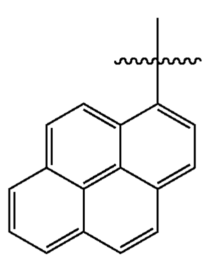 [SMILES: *c1ccc2ccc3cccc4ccc1c2c34] | 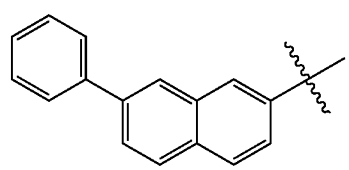 [SMILES: *c1ccc2ccc(-c3ccccc3)cc2c1] |

-continued
| No. | | Ar1 | Ar2 |
|---|---|---|---|
| 24-27 | 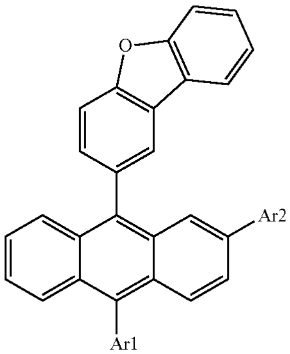 | 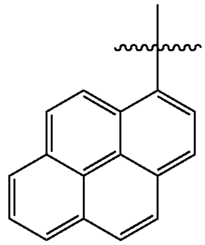 [SMILES: *c1ccc2ccc3cccc4ccc1c2c34] | 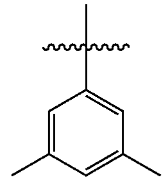 |
| 24-28 | 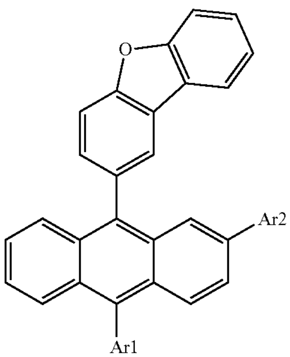 | 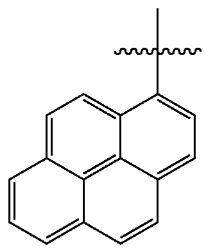 [SMILES: *c1ccc2ccc3cccc4ccc1c2c34] | 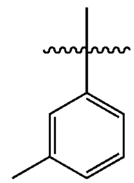 [SMILES: *c1cccc(C)c1] |
| 24-29 | 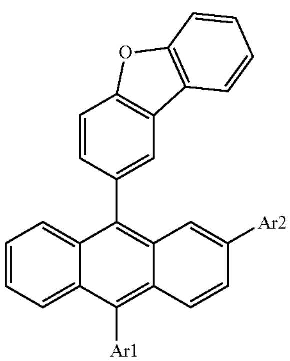 | 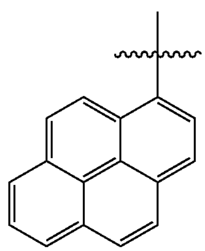 [SMILES: *c1ccc2ccc3cccc4ccc1c2c34] | 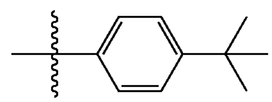 |
| 24-30 | 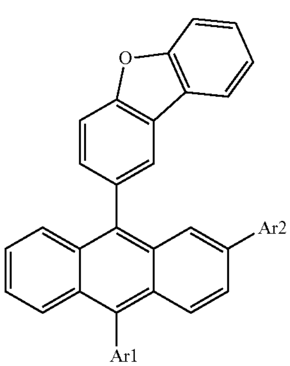 | 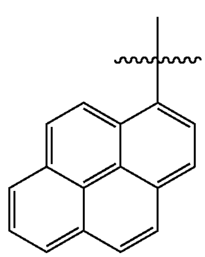 [SMILES: *c1ccc2ccc3cccc4ccc1c2c34] | 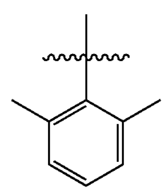 |

-continued
| No. | | Ar1 | Ar2 |
|---|---|---|---|
| 24-31 | 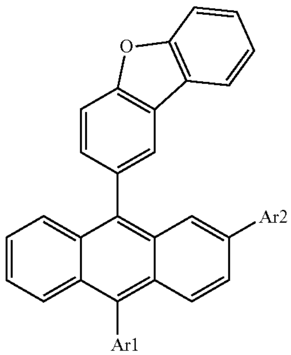 | 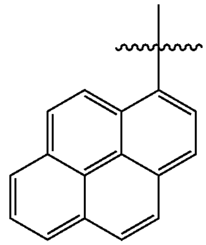 [SMILES: *c1ccc2ccc3cccc4ccc1c2c34] | 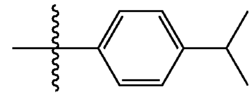 [SMILES: *c1ccc(C(C)C)cc1] |
| 25-1 | 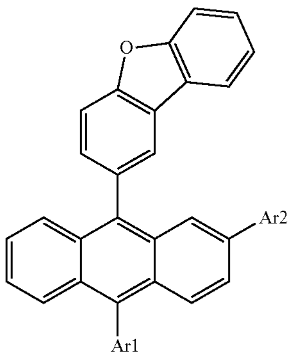 | 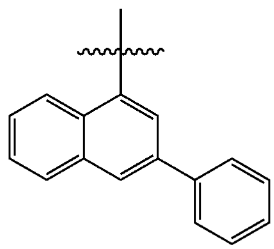 [SMILES: *c1cc(-c2ccccc2)cc2ccccc12] | 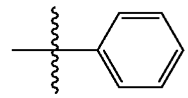 |
| 25-2 | 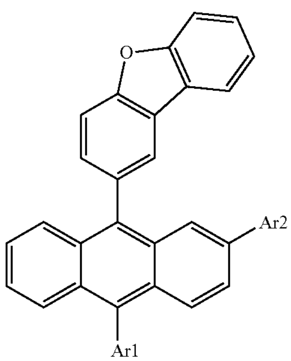 | 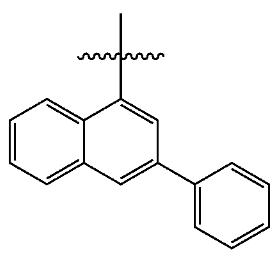 [SMILES: *c1cc(-c2ccccc2)cc2ccccc12] | 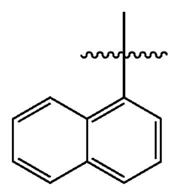 [SMILES: *c1cccc2ccccc12] |
| 25-3 | 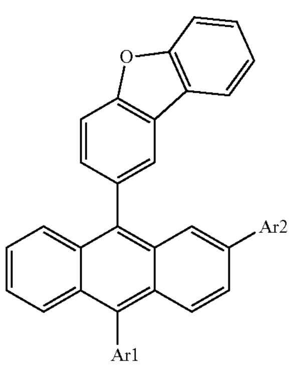 | 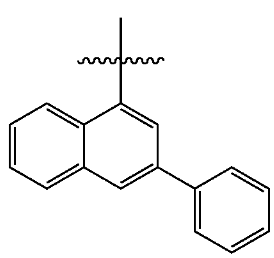 [SMILES: *c1cc(-c2ccccc2)cc2ccccc12] | 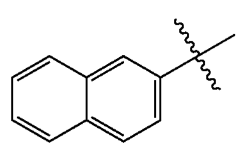 [SMILES: *c1ccc2ccccc2c1] |

-continued
| No. | | Ar1 | Ar2 |
| --- | --- | --- | --- |
| 25-4 | 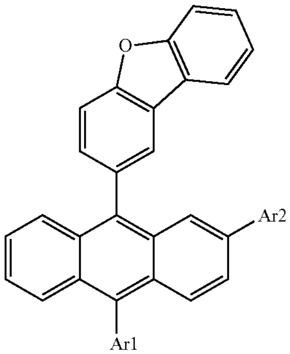 | 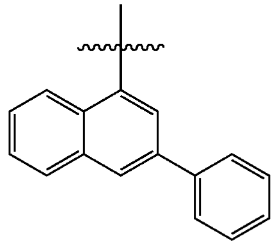 [SMILES: *c1cc(-c2ccccc2)cc2ccccc12] | 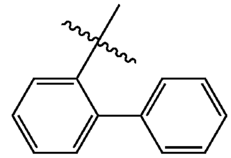 [SMILES: *c1ccccc1-c1ccccc1] |
| 25-5 | 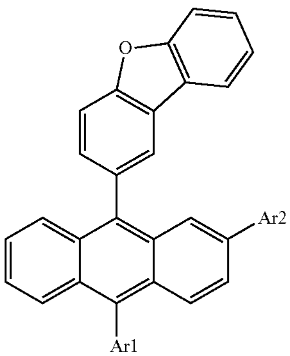 | 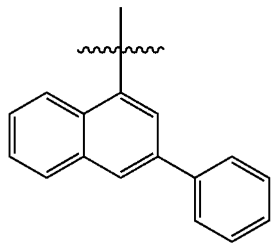 [SMILES: *c1cc(-c2ccccc2)cc2ccccc12] | 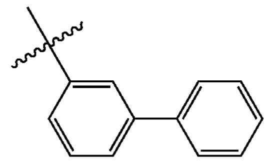 [SMILES: *c1cccc(-c2ccccc2)c1] |
| 25-6 | 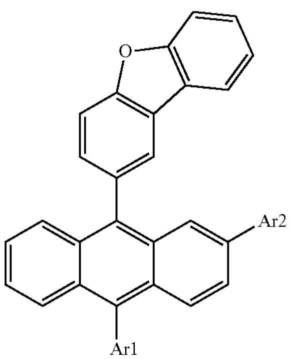 | 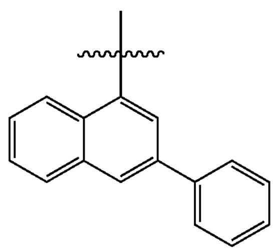 [SMILES: *c1cc(-c2ccccc2)cc2ccccc12] | 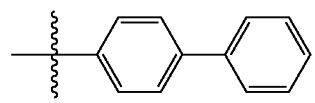 [SMILES: *c1ccc(-c2ccccc2)cc1] |
| 25-7 | 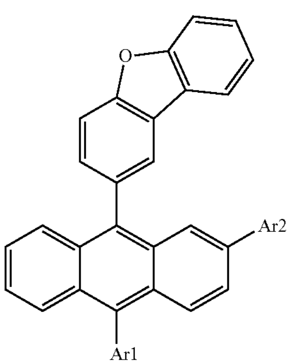 | 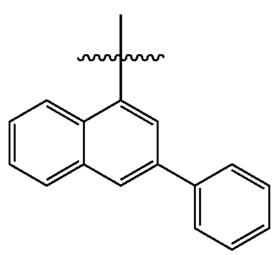 [SMILES: *c1cc(-c2ccccc2)cc2ccccc12] | 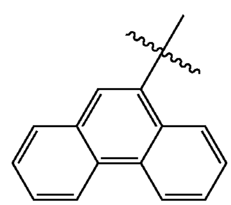 [SMILES: *c1cc2ccccc2c2ccccc12] |

-continued
| No. | | Ar1 | Ar2 |
|---|---|---|---|
| 25-9 | 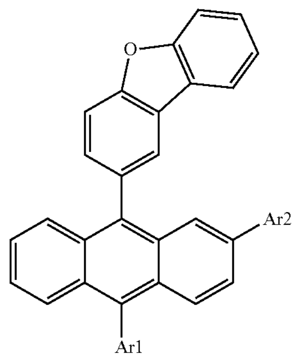 | 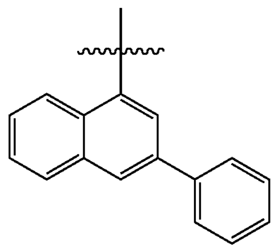 [SMILES: *c1cc(-c2ccccc2)cc2ccccc12] | 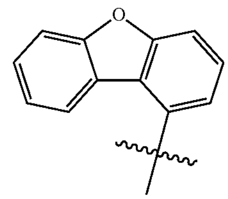 [SMILES: *c1cccc2oc3ccccc3c12] |
| 25-10 | 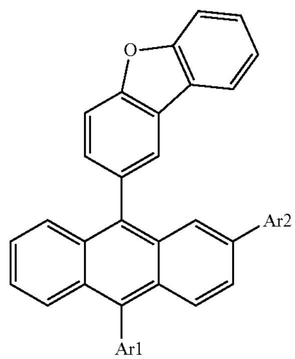 | 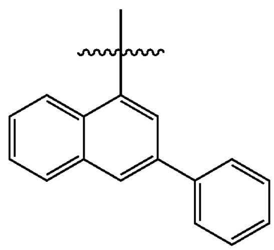 [SMILES: *c1cc(-c2ccccc2)cc2ccccc12] | 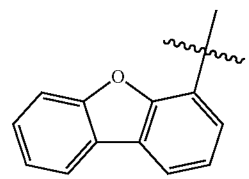 [SMILES: *c1cccc2c1oc1ccccc12] |
| 25-11 | 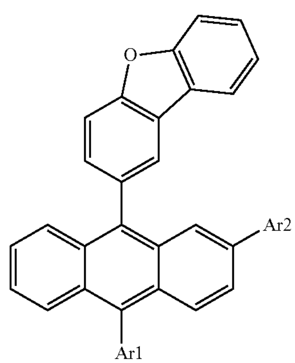 | 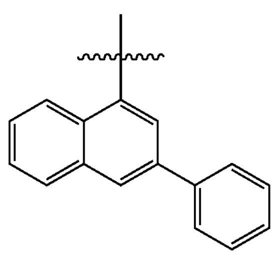 [SMILES: *c1cc(-c2ccccc2)cc2ccccc12] | 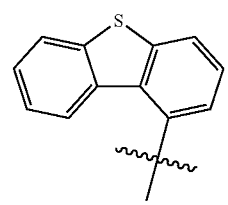 [SMILES: *c1cccc2sc3ccccc3c12] |
| 25-12 | 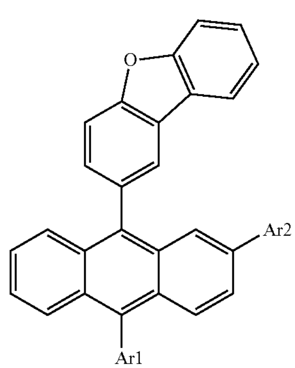 | 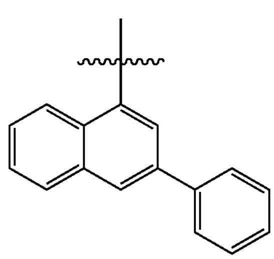 [SMILES: *c1cc(-c2ccccc2)cc2ccccc12] | 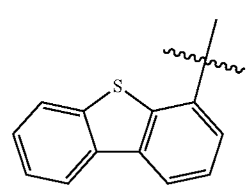 [SMILES: *c1cccc2c1sc1ccccc12] |

-continued
| No. | | Ar1 | Ar2 |
| --- | --- | --- | --- |
| 25-16 | 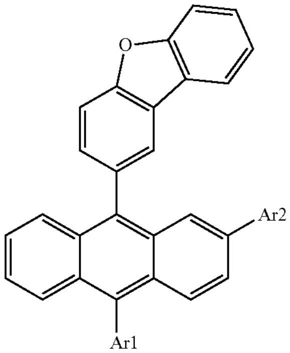 | 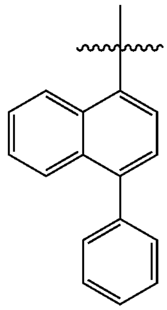 [SMILES: *c1ccc(-c2ccccc2)c2ccccc12] | 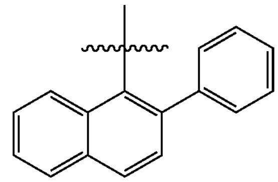 [SMILES: *c1c(-c2ccccc2)ccc2ccccc12] |
| 25-17 | 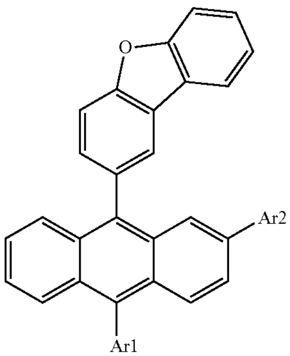 | 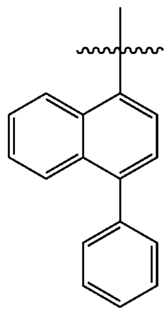 [SMILES: *c1ccc(-c2ccccc2)c2ccccc12] | 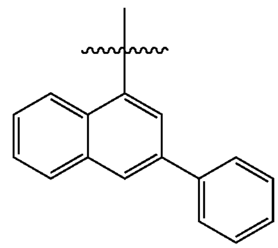 [SMILES: *c1cc(-c2ccccc2)cc2ccccc12] |
| 25-18 | 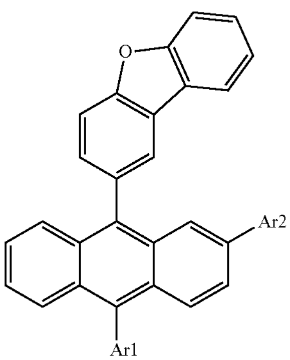 | 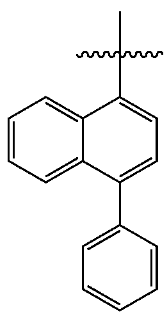 [SMILES: *c1ccc(-c2ccccc2)c2ccccc12] | 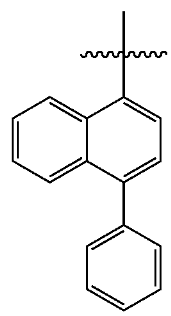 [SMILES: *c1ccc(-c2ccccc2)c2ccccc12] |
| 25-19 | 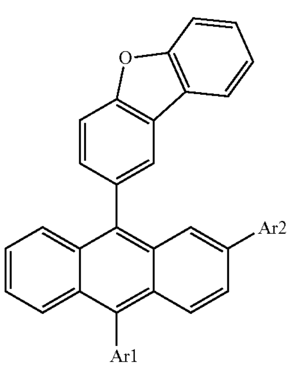 | 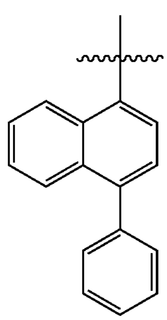 [SMILES: *c1ccc(-c2ccccc2)c2ccccc12] | 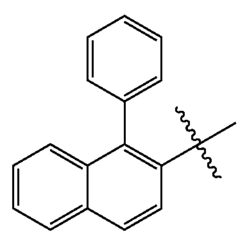 [SMILES: *c1ccc2ccccc2c1-c1ccccc1] |

-continued
| No. | | Ar1 | Ar2 |
|---|---|---|---|
| 25-20 | 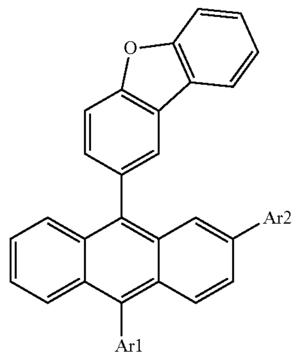 | 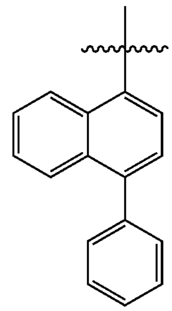 [SMILES: *c1ccc(-c2ccccc2)c2ccccc12] | 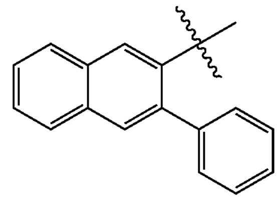 [SMILES: *c1cc2ccccc2cc1-c1ccccc1] |
| 25-21 | 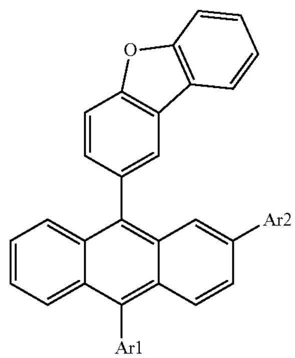 | 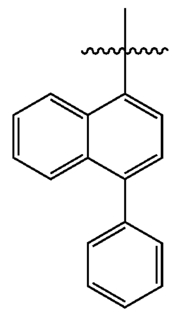 [SMILES: *c1ccc(-c2ccccc2)c2ccccc12] | 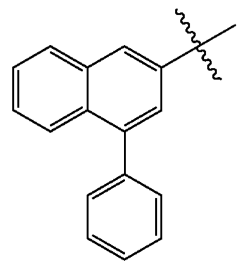 [SMILES: *c1cc(-c2ccccc2)c2ccccc2c1] |
| 25-22 | 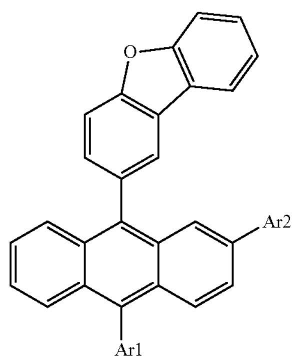 | 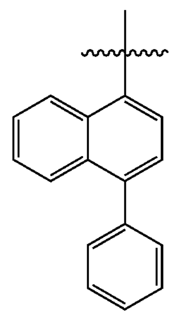 [SMILES: *c1ccc(-c2ccccc2)c2ccccc12] | 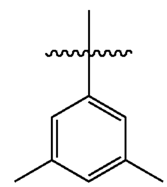 |
| 25-23 | 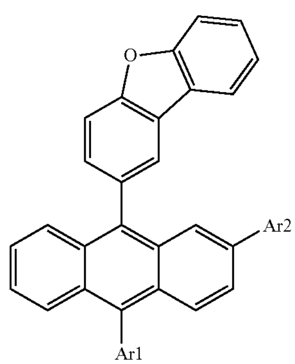 | 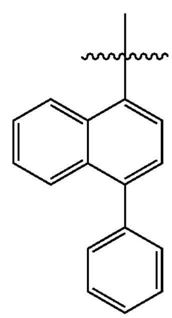 [SMILES: *c1ccc(-c2ccccc2)c2ccccc12] | 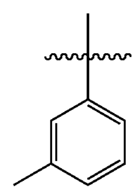 [SMILES: *c1cccc(C)c1] |

-continued
| No. | | Ar1 | Ar2 |
|---|---|---|---|
| 25-24 | 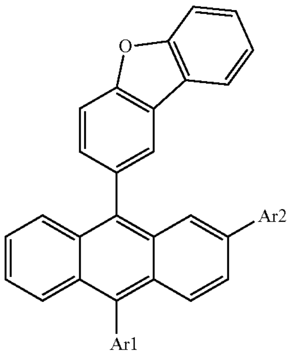 | 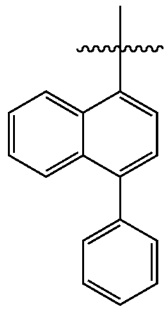 [SMILES: *c1ccc(-c2ccccc2)c2ccccc12] | 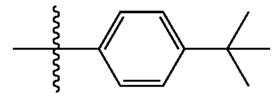 [SMILES: *c1ccc(C(C)(C)C)cc1] |
| 25-25 | 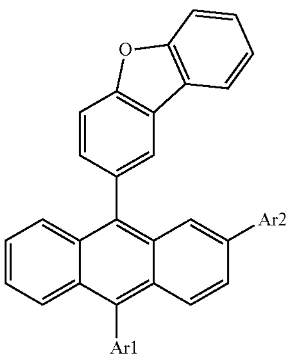 | 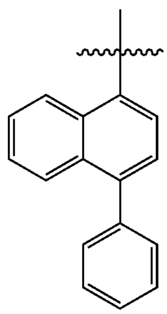 [SMILES: *c1ccc(-c2ccccc2)c2ccccc12] | 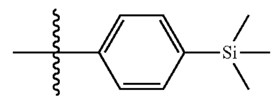 |
| 25-26 | 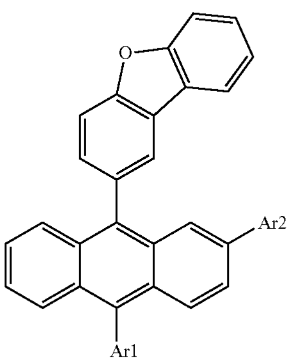 | 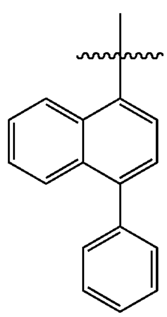 [SMILES: *c1ccc(-c2ccccc2)c2ccccc12] | 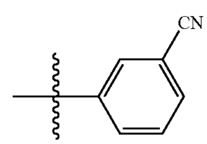 [SMILES: *c1cccc(C#N)c1] |
| 25-27 | 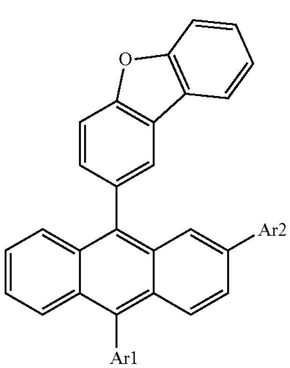 | 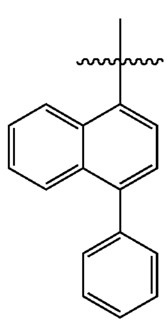 [SMILES: *c1ccc(-c2ccccc2)c2ccccc12] | 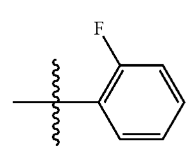 [SMILES: *c1ccccc1F] |

-continued
| No. | | Ar1 | Ar2 |
|---|---|---|---|
| 25-28 | 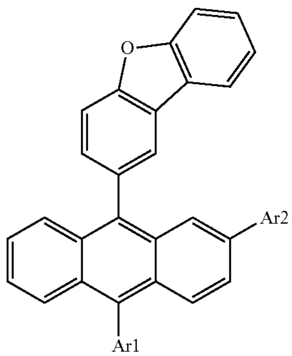 | 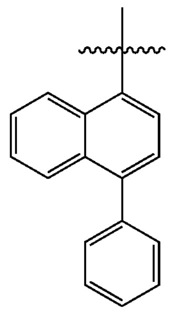 [SMILES: *c1ccc(-c2ccccc2)c2ccccc12] | 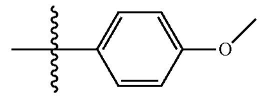 |
| 26-1 | 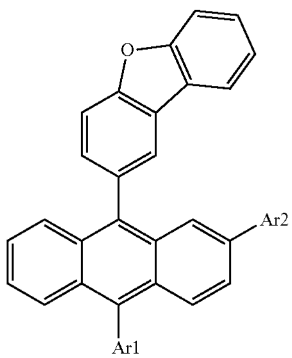 | 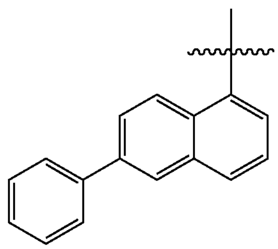 [SMILES: *c1cccc2cc(-c3ccccc3)ccc12] | 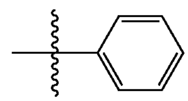 |
| 26-2 | 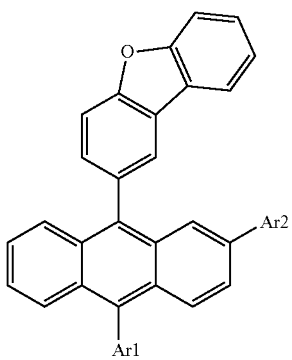 | 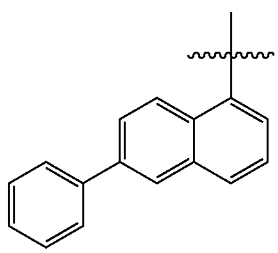 [SMILES: *c1cccc2cc(-c3ccccc3)ccc12] | 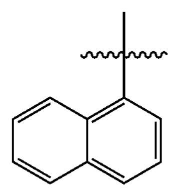 [SMILES: *c1cccc2ccccc12] |
| 26-3 | 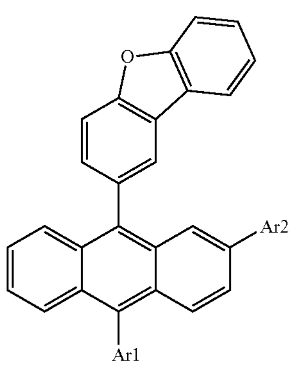 | 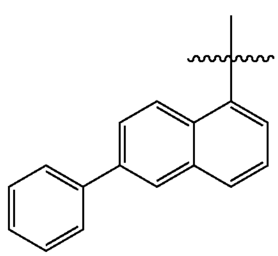 [SMILES: *c1cccc2cc(-c3ccccc3)ccc12] | 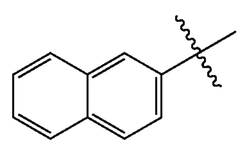 [SMILES: *c1ccc2ccccc2c1] |

-continued
| No. | | Ar1 | Ar2 |
|---|---|---|---|
| 26-4 | 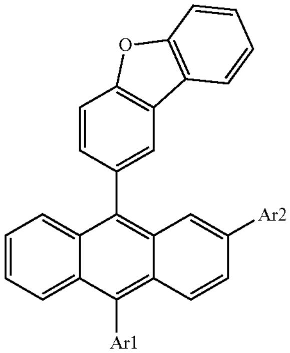 | 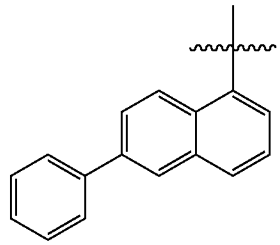 [SMILES: *c1cccc2cc(-c3ccccc3)ccc12] | 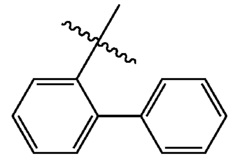 [SMILES: *c1ccccc1-c1ccccc1] |
| 26-5 | 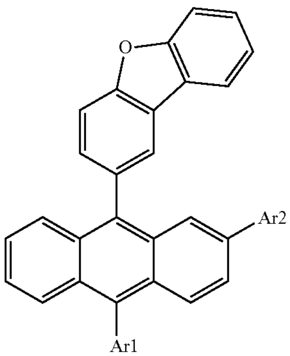 | 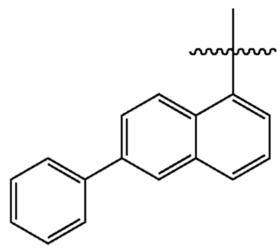 [SMILES: *c1cccc2cc(-c3ccccc3)ccc12] | 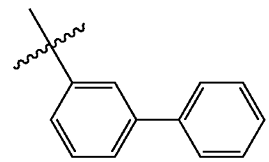 [SMILES: *c1cccc(-c2ccccc2)c1] |
| 26-6 | 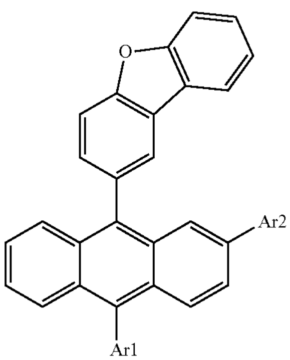 | 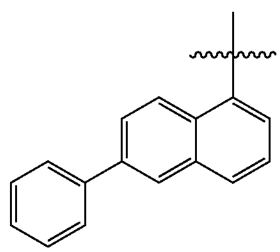 [SMILES: *c1cccc2cc(-c3ccccc3)ccc12] | 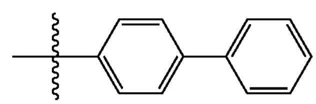 |
| 26-7 | 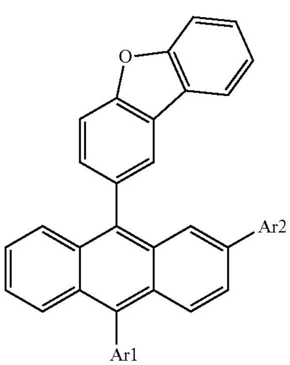 | 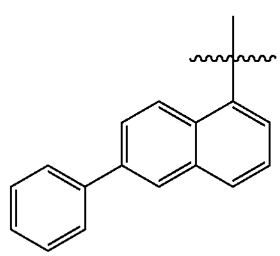 [SMILES: *c1cccc2cc(-c3ccccc3)ccc12] | 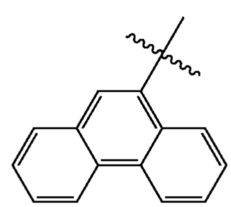 [SMILES: *c1cc2ccccc2c2ccccc12] |

-continued
| No. | | Ar1 | Ar2 |
|---|---|---|---|
| 26-9 | 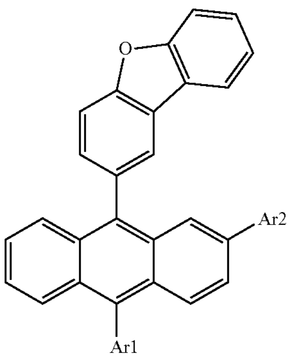  | 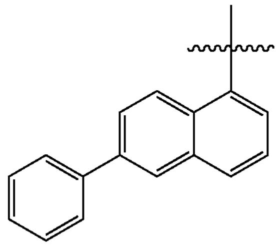 [SMILES: *c1cccc2cc(-c3ccccc3)ccc12] | 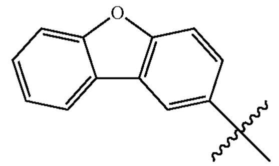 [SMILES: *c1ccc2oc3ccccc3c2c1]  |
| 26-10 | 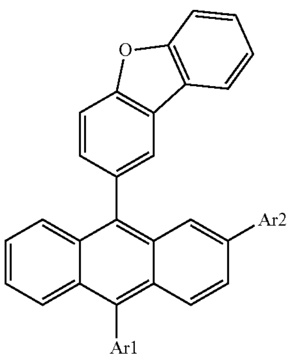  | 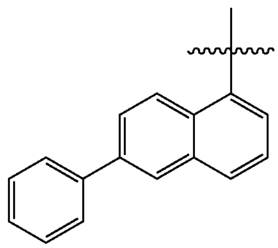 [SMILES: *c1cccc2cc(-c3ccccc3)ccc12] | 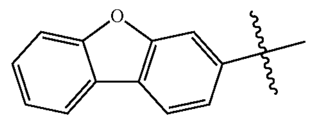  |
| 26-11 | 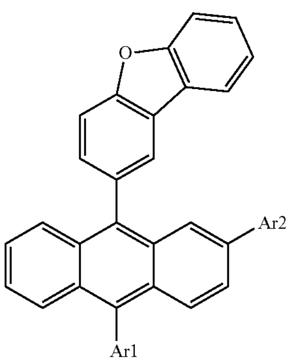  | 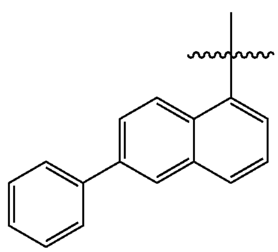 [SMILES: *c1cccc2cc(-c3ccccc3)ccc12] | 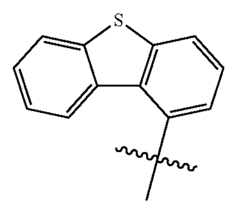 [SMILES: *c1cccc2sc3ccccc3c12]  |
| 26-12 | 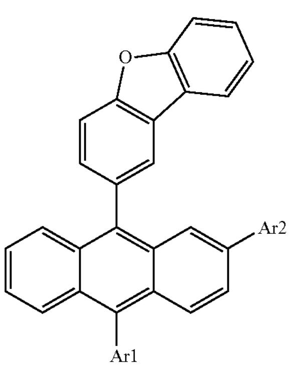  | 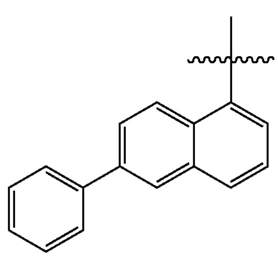 [SMILES: *c1cccc2cc(-c3ccccc3)ccc12] | 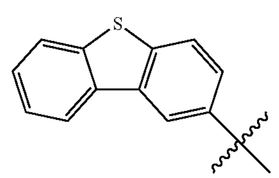 [SMILES: *c1ccc2sc3ccccc3c2c1]  |

-continued
| No. | | Ar1 | Ar2 |
|---|---|---|---|
| 26-13 | 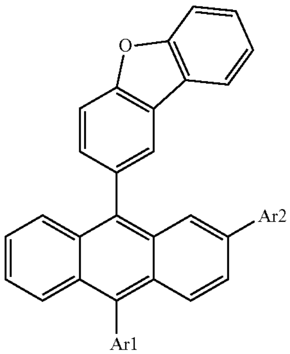 | 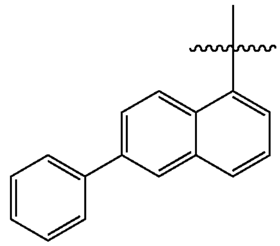 [SMILES: *c1cccc2cc(-c3ccccc3)ccc12] | 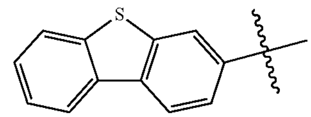 |
| 26-17 | 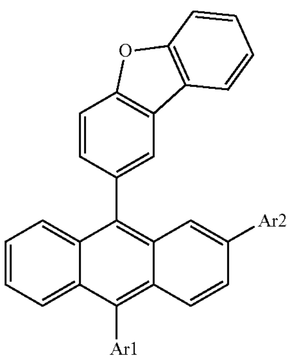 | 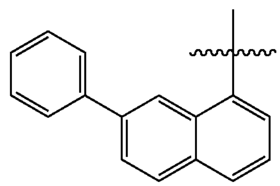 [SMILES: *c1cccc2ccc(-c3ccccc3)cc12] | 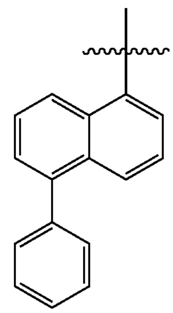 [SMILES: *c1cccc2c(-c3ccccc3)cccc12] |
| 26-18 | 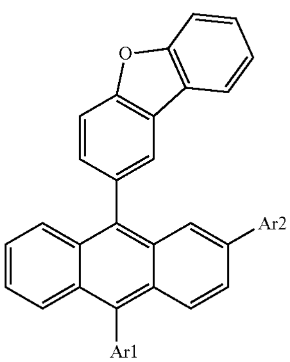 | 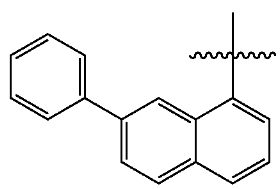 [SMILES: *c1cccc2ccc(-c3ccccc3)cc12] | 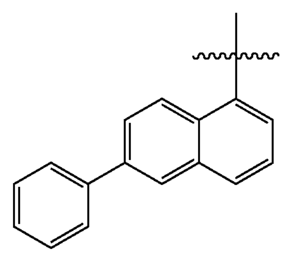 [SMILES: *c1cccc2cc(-c3ccccc3)ccc12] |
| 26-19 | 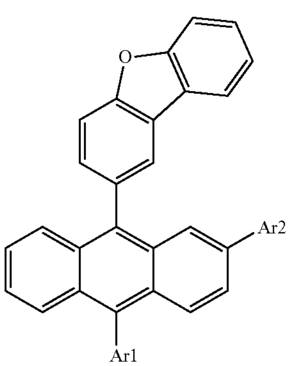 | 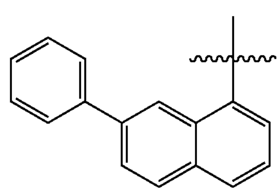 [SMILES: *c1cccc2ccc(-c3ccccc3)cc12] | 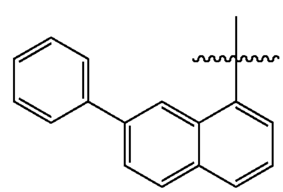 [SMILES: *c1cccc2ccc(-c3ccccc3)cc12] |

-continued
| No. | | Ar1 | Ar2 |
|---|---|---|---|
| 26-20 | 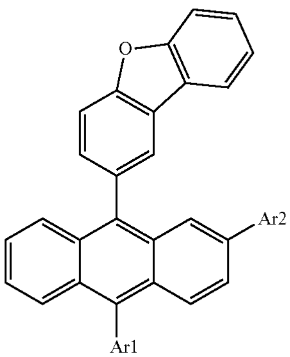 | 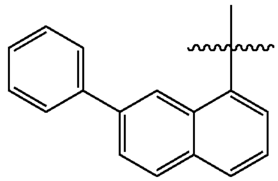 [SMILES: *c1cccc2ccc(-c3ccccc3)cc12] | 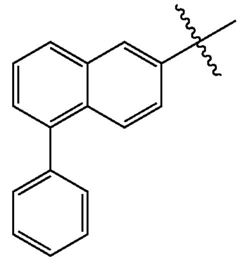 [SMILES: *c1ccc2c(-c3ccccc3)cccc2c1] |
| 26-21 | 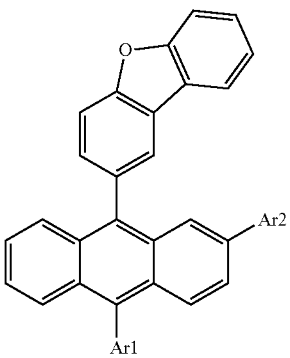 | 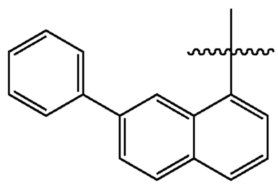 [SMILES: *c1cccc2ccc(-c3ccccc3)cc12] | 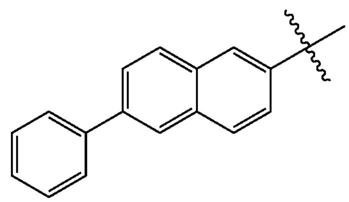 [SMILES: *c1ccc2cc(-c3ccccc3)ccc2c1] |
| 26-22 | 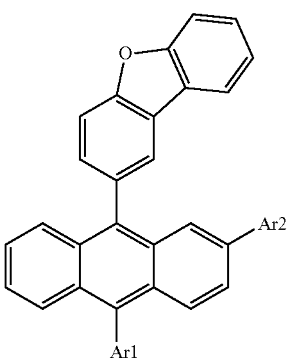 | 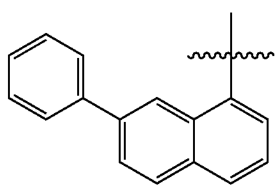 [SMILES: *c1cccc2ccc(-c3ccccc3)cc12] | 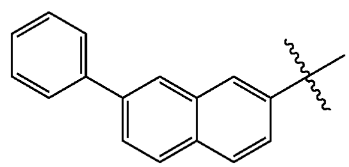 [SMILES: *c1ccc2ccc(-c3ccccc3)cc2c1] |
| 26-23 | 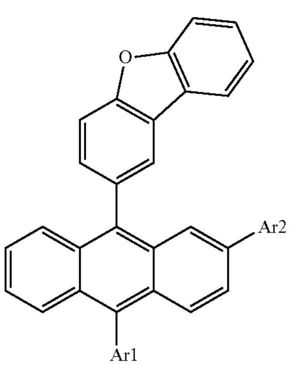 | 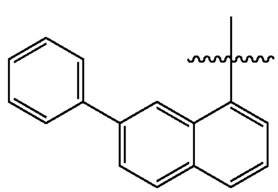 [SMILES: *c1cccc2ccc(-c3ccccc3)cc12] | 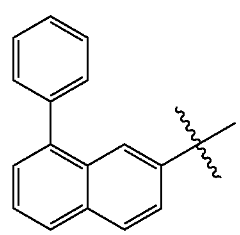 [SMILES: *c1ccc2cccc(-c3ccccc3)c2c1] |

-continued
| No. | | Ar1 | Ar2 |
|---|---|---|---|
| 26-24 | 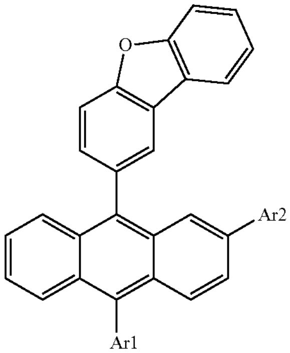 | 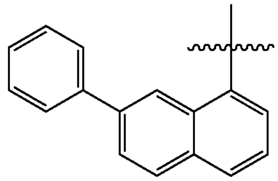 [SMILES: *c1cccc2ccc(-c3ccccc3)cc12] | 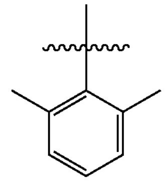 |
| 26-25 | 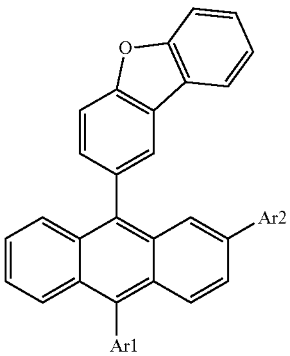 | 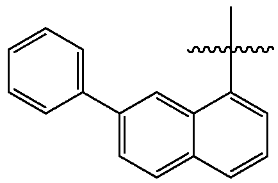 [SMILES: *c1cccc2ccc(-c3ccccc3)cc12] | 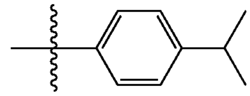 [SMILES: *c1ccc(C(C)C)cc1] |
| 26-26 | 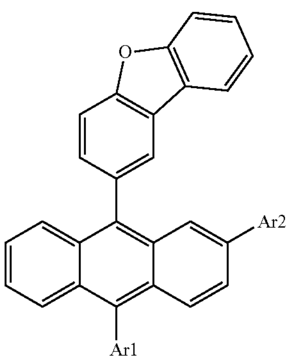 | 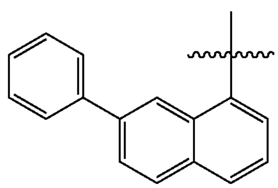 [SMILES: *c1cccc2ccc(-c3ccccc3)cc12] | 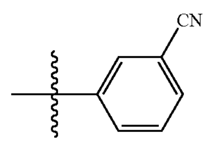 [SMILES: *c1cccc(C#N)c1] |
| 26-27 | 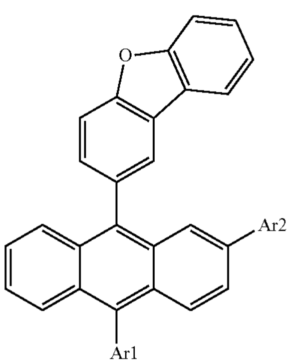 | 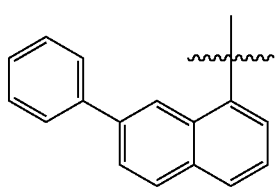 [SMILES: *c1cccc2ccc(-c3ccccc3)cc12] | 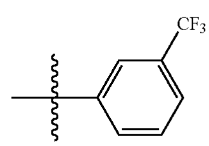 [SMILES: *c1cccc(C(F)(F)F)c1] |

-continued
| No. | | Ar1 | Ar2 |
|---|---|---|---|
| 26-28 | 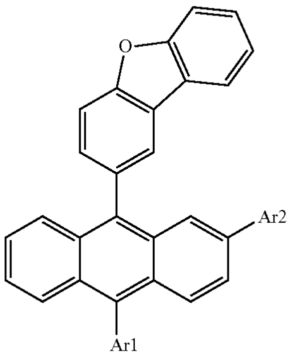 | 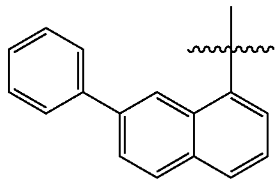 [SMILES: *c1cccc2ccc(-c3ccccc3)cc12] | 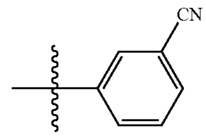 [SMILES: *c1cccc(C#N)c1] |
| 26-29 | 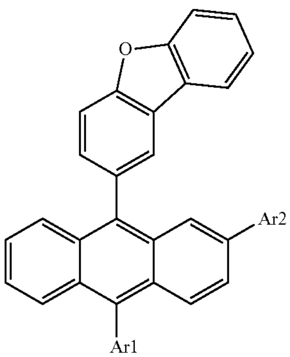 | 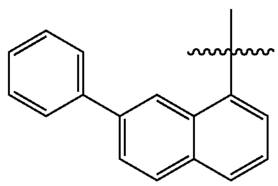 [SMILES: *c1cccc2ccc(-c3ccccc3)cc12] | 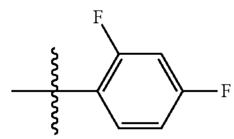 [SMILES: *c1ccc(F)cc1F] |
| 27-1 | 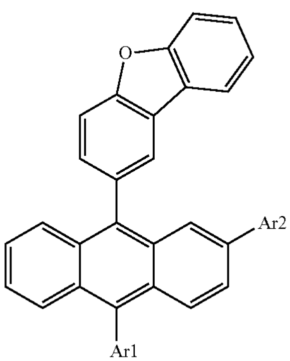 | 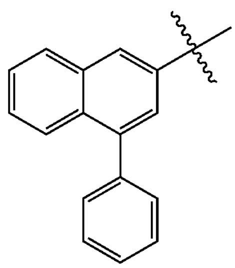 [SMILES: *c1cc(-c2ccccc2)c2ccccc2c1] | 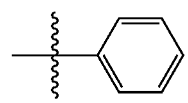 [SMILES: *c1ccccc1] |
| 27-2 | 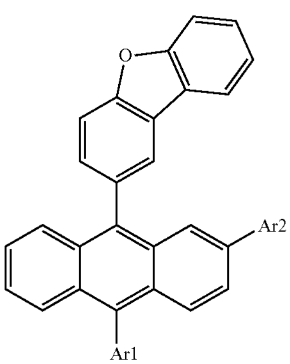 | 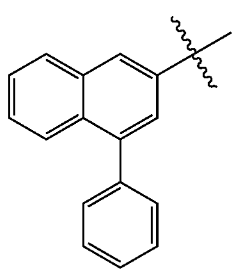 [SMILES: *c1cc(-c2ccccc2)c2ccccc2c1] | 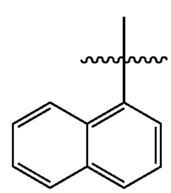 [SMILES: *c1cccc2ccccc12] |

-continued
| No. | | Ar1 | Ar2 |
|---|---|---|---|
| 27-3 | 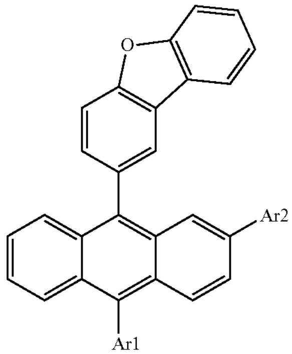 | 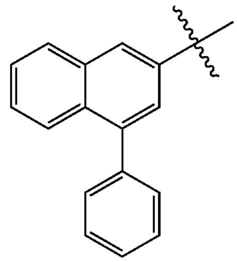 [SMILES: *c1cc(-c2ccccc2)c2ccccc2c1] | 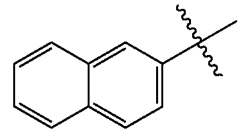 [SMILES: *c1ccc2ccccc2c1] |
| 27-4 | 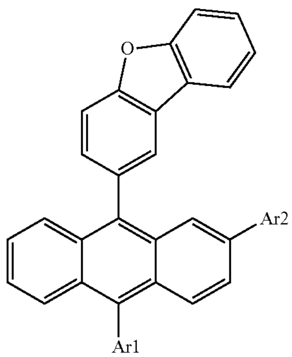 | 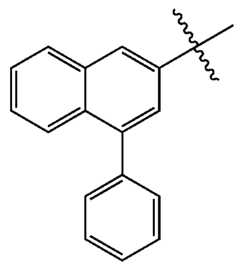 [SMILES: *c1cc(-c2ccccc2)c2ccccc2c1] | 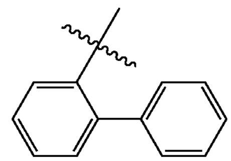 [SMILES: *c1ccccc1-c1ccccc1] |
| 27-5 | 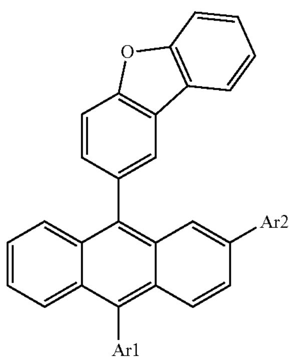 | 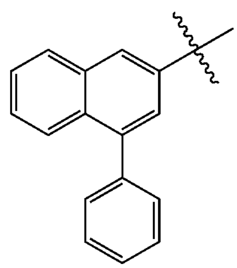 [SMILES: *c1cc(-c2ccccc2)c2ccccc2c1] | 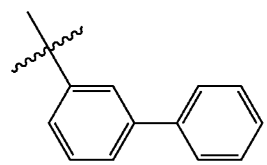 [SMILES: *c1cccc(-c2ccccc2)c1] |
| 27-6 | 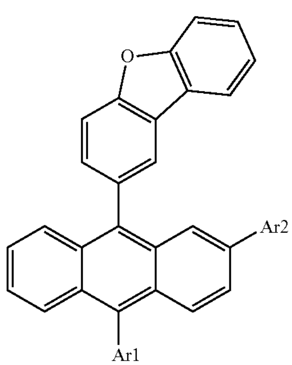 | 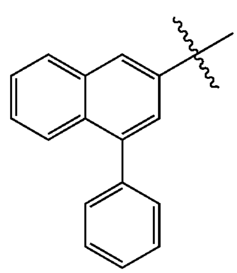 [SMILES: *c1cc(-c2ccccc2)c2ccccc2c1] | 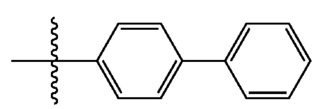 |

-continued
| No. | | Ar1 | Ar2 |
|---|---|---|---|
| 27-7 | 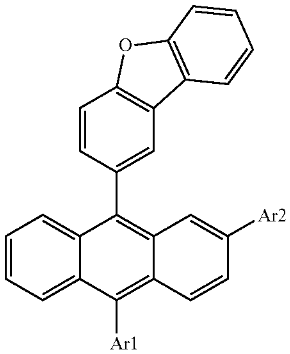 | 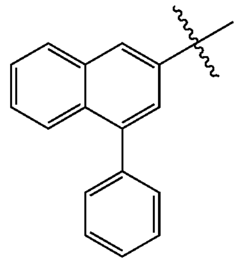 [SMILES: *c1cc(-c2ccccc2)c2ccccc2c1] | 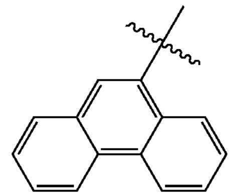 [SMILES: *c1cc2ccccc2c2ccccc12] |
| 27-9 | 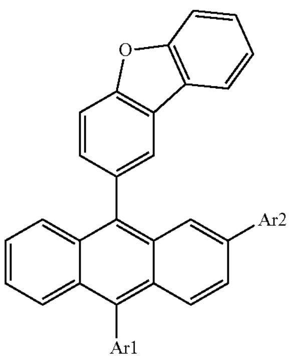 | 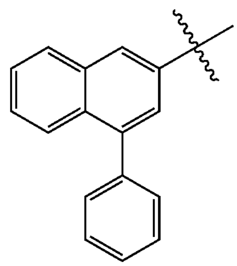 [SMILES: *c1cc(-c2ccccc2)c2ccccc2c1] | 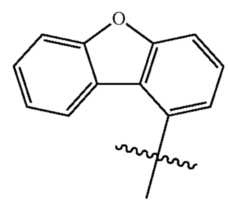 |
| 27-10 | 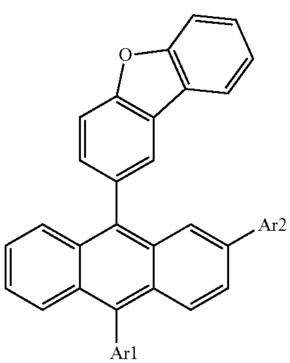 | 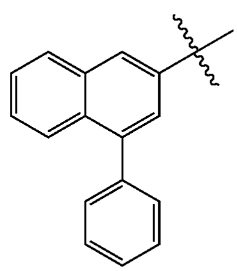 [SMILES: *c1cc(-c2ccccc2)c2ccccc2c1] | 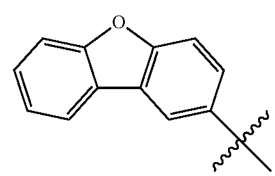 |
| 27-11 | 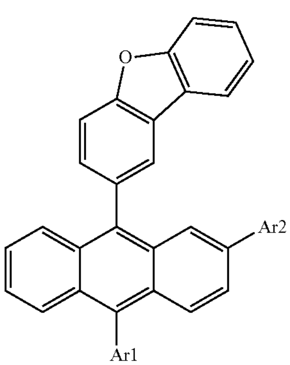 | 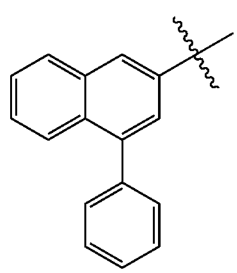 [SMILES: *c1cc(-c2ccccc2)c2ccccc2c1] | 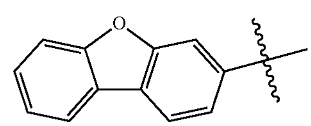 |

-continued
| No. | | Ar1 | Ar2 |
| --- | --- | --- | --- |
| 27-12 | 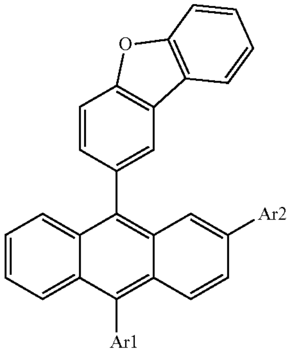 | 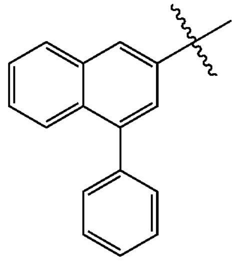 [SMILES: *c1cc(-c2ccccc2)c2ccccc2c1] | 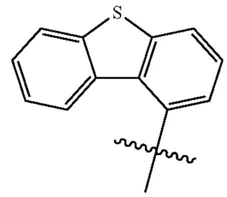 [SMILES: *c1cccc2sc3ccccc3c12] |
| 27-13 | 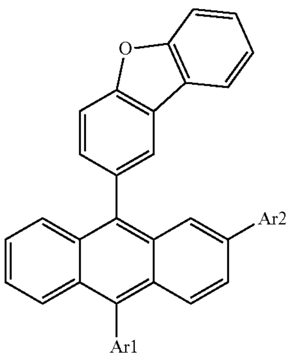 | 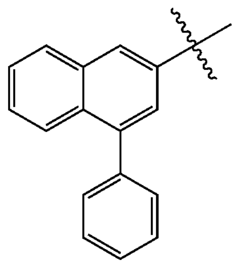 [SMILES: *c1cc(-c2ccccc2)c2ccccc2c1] | 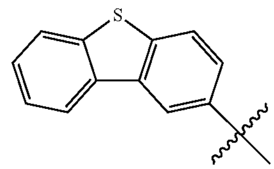 [SMILES: *c1ccc2sc3ccccc3c2c1] |
| 27-14 | 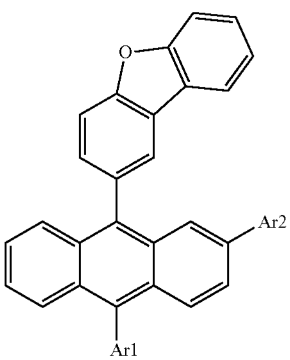 | 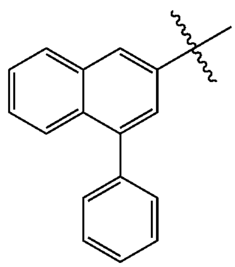 [SMILES: *c1cc(-c2ccccc2)c2ccccc2c1] | 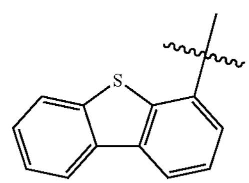 |
| 27-19 | 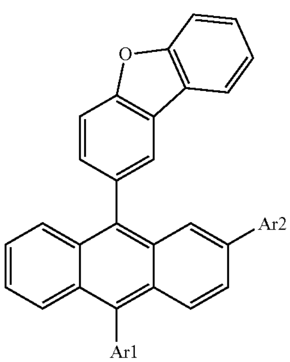 | 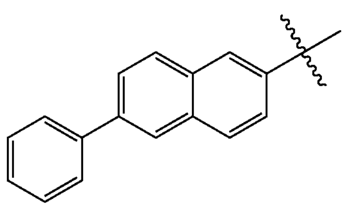 [SMILES: *c1ccc2cc(-c3ccccc3)ccc2c1] | 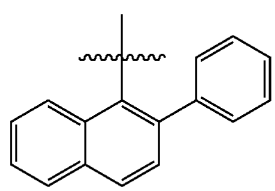 [SMILES: *c1c(-c2ccccc2)ccc2ccccc12] |

-continued
| No. | | Ar1 | Ar2 |
|---|---|---|---|
| 27-20 | 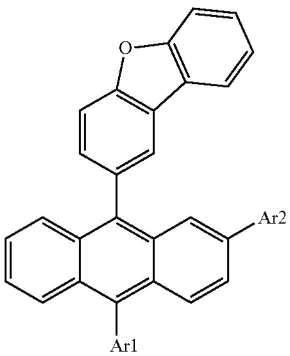 | 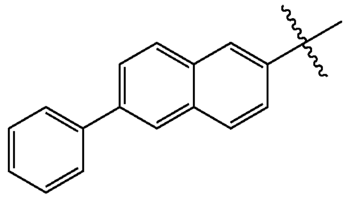 [SMILES: *c1ccc2cc(-c3ccccc3)ccc2c1] | 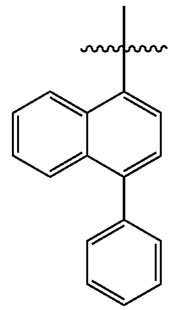 [SMILES: *c1ccc(-c2ccccc2)c2ccccc12] |
| 27-21 | 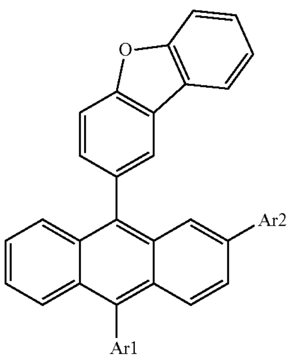 | 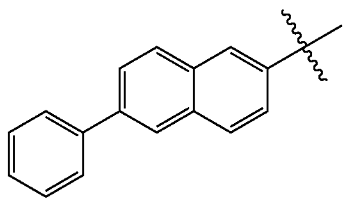 [SMILES: *c1ccc2cc(-c3ccccc3)ccc2c1] | 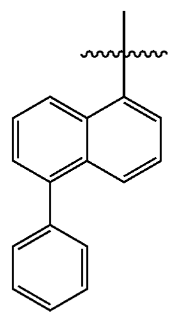 [SMILES: *c1cccc2c(-c3ccccc3)cccc12] |
| 27-22 | 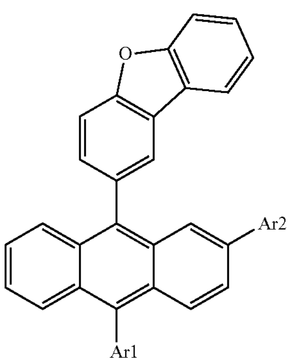 | 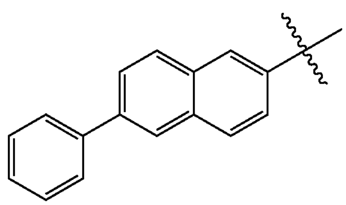 [SMILES: *c1ccc2cc(-c3ccccc3)ccc2c1] | 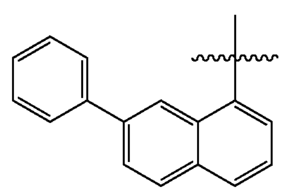 [SMILES: *c1cccc2ccc(-c3ccccc3)cc12] |
| 27-23 | 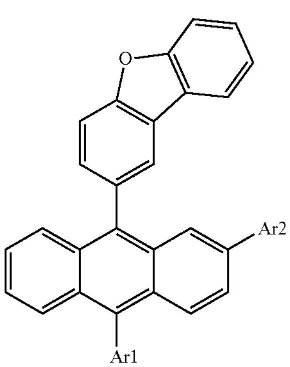 | 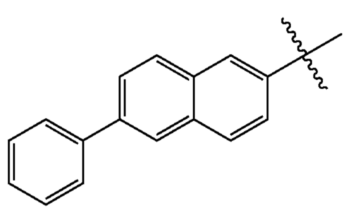 [SMILES: *c1ccc2cc(-c3ccccc3)ccc2c1] | 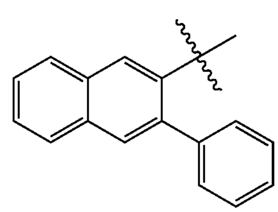 [SMILES: *c1cc2ccccc2cc1-c1ccccc1] |

-continued
| No. | | Ar1 | Ar2 |
|---|---|---|---|
| 27-24 | 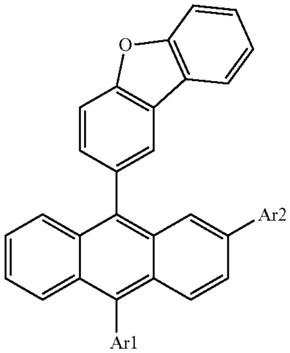 | 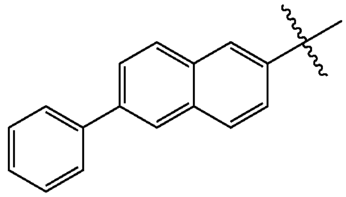 [SMILES: *c1ccc2cc(-c3ccccc3)ccc2c1] | 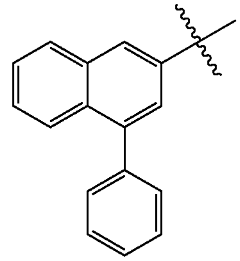 [SMILES: *c1cc(-c2ccccc2)c2ccccc2c1] |
| 27-25 | 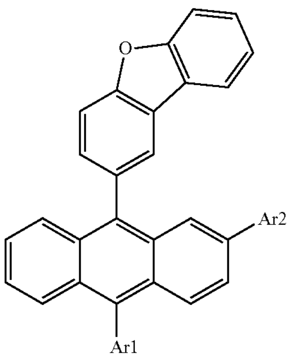 | 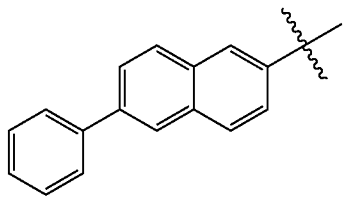 [SMILES: *c1ccc2cc(-c3ccccc3)ccc2c1] | 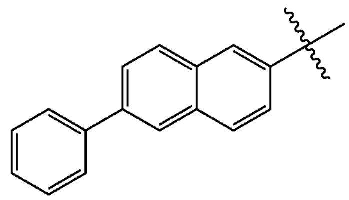 [SMILES: *c1ccc2cc(-c3ccccc3)ccc2c1] |
| 27-26 | 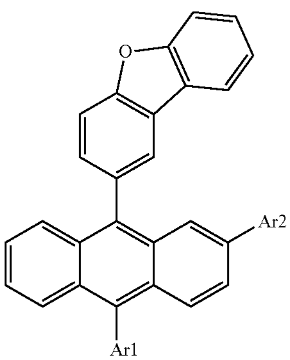 | 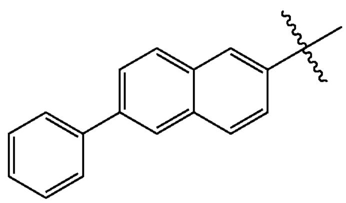 [SMILES: *c1ccc2cc(-c3ccccc3)ccc2c1] | 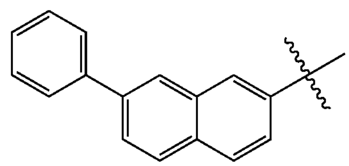 [SMILES: *c1ccc2ccc(-c3ccccc3)cc2c1] |
| 27-27 | 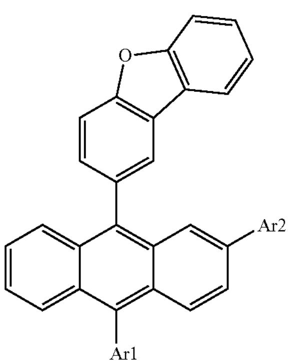 | 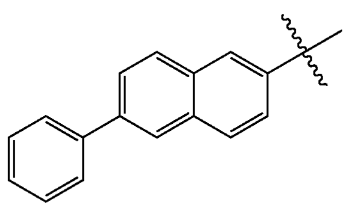 [SMILES: *c1ccc2cc(-c3ccccc3)ccc2c1] | 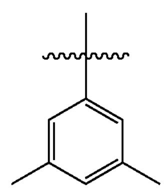 |

-continued
| No. | | Ar1 | Ar2 |
|---|---|---|---|
| 27-28 | 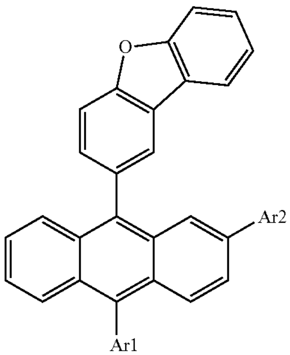 | 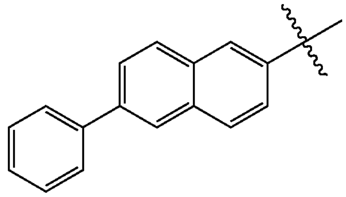 [SMILES: *c1ccc2cc(-c3ccccc3)ccc2c1] | 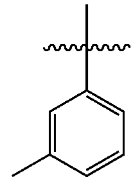 |
| 27-29 | 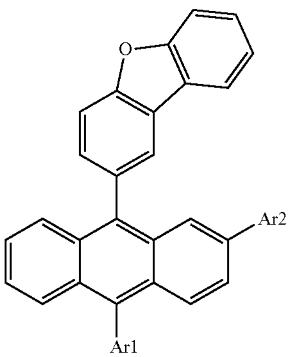 | 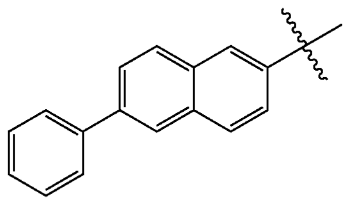 [SMILES: *c1ccc2cc(-c3ccccc3)ccc2c1] | 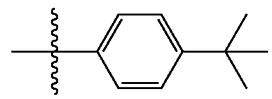 |
| 27-30 | 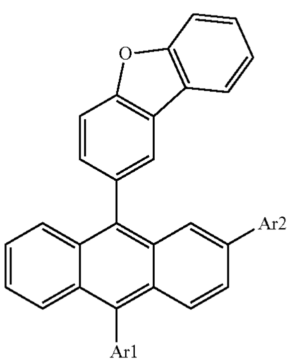 | 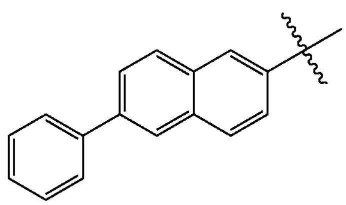 [SMILES: *c1ccc2cc(-c3ccccc3)ccc2c1] | 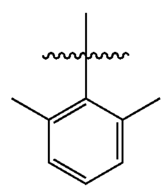 |
| 27-31 | 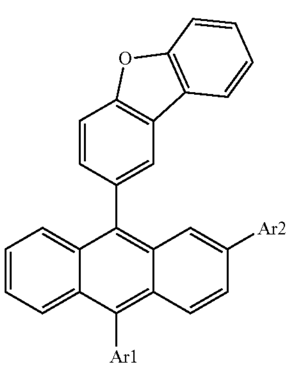 | 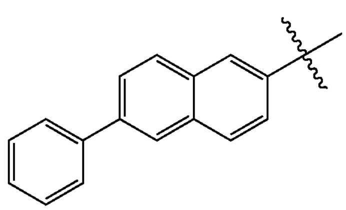 [SMILES: *c1ccc2cc(-c3ccccc3)ccc2c1] | 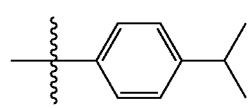 [SMILES: *c1ccc(C(C)C)cc1] |

-continued
| No. | | Ar1 | Ar2 |
|---|---|---|---|
| 28-1 | 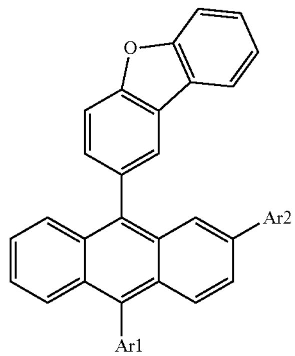 | 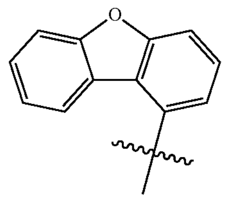 [SMILES: *c1cccc2oc3ccccc3c12] | 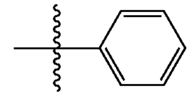 |
| 28-2 | 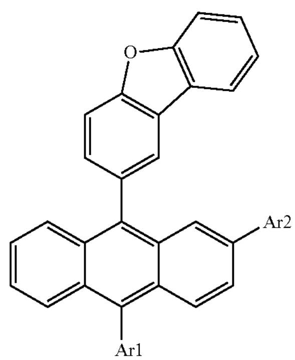 | 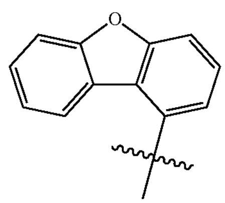 | 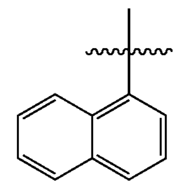 [SMILES: *c1cccc2ccccc12] |
| 28-3 | 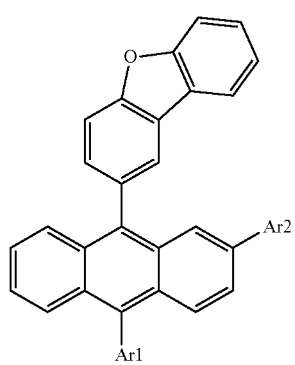 | 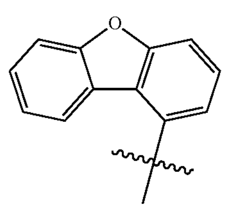 [SMILES: *c1cccc2oc3ccccc3c12] | 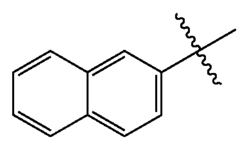 [SMILES: *c1ccc2ccccc2c1] |
| 28-4 | 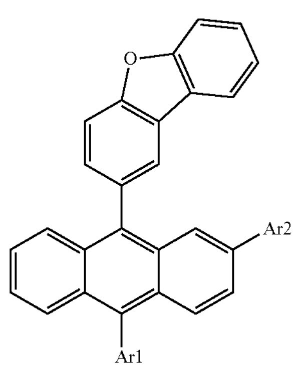 | 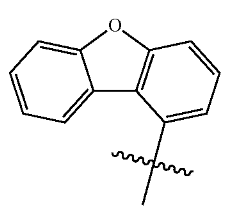 [SMILES: *c1cccc2oc3ccccc3c12] | 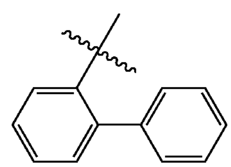 [SMILES: *c1ccccc1-c1ccccc1] |

-continued
| No. | | Ar1 | Ar2 |
|---|---|---|---|
| 28-5 | 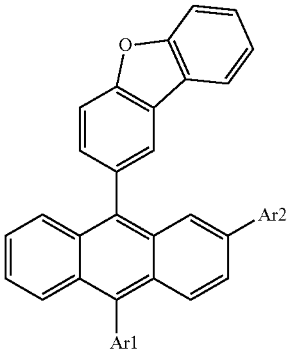 | 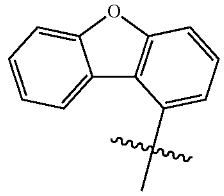 [SMILES: *c1cccc2oc3ccccc3c12] | 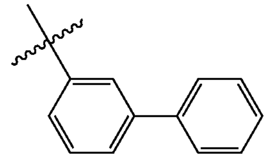 [SMILES: *c1cccc(-c2ccccc2)c1] |
| 28-6 | 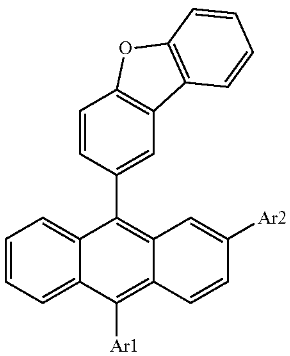 | 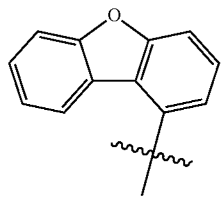 [SMILES: *c1cccc2oc3ccccc3c12] | 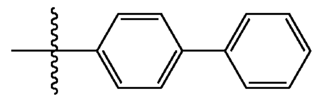 |
| 28-7 | 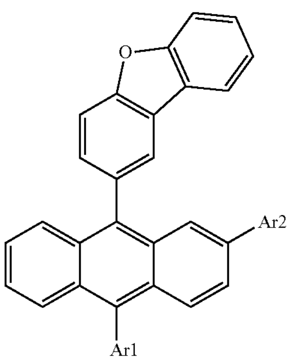 | 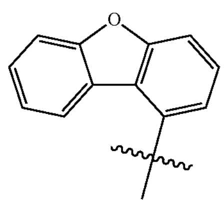 [SMILES: *c1cccc2oc3ccccc3c12] | 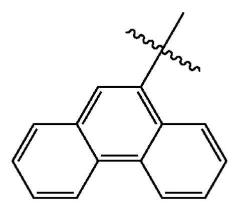 [SMILES: *c1cc2ccccc2c2ccccc12] |
| 28-9 | 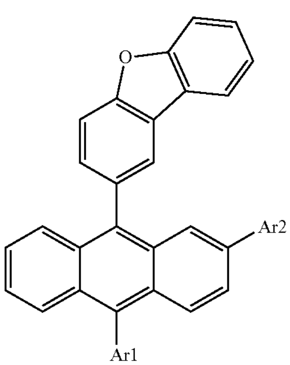 | 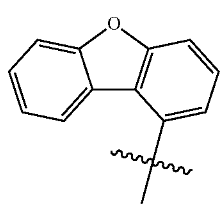 | 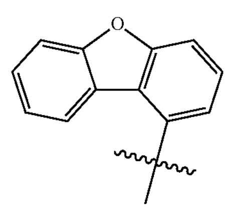 |

-continued
| No. | | Ar1 | Ar2 |
|---|---|---|---|
| 28-10 | 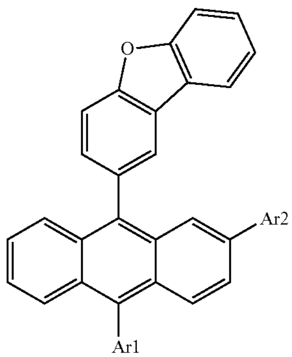 | 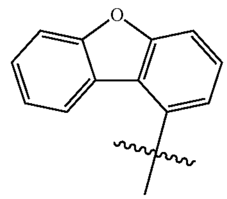 [SMILES: *c1cccc2oc3ccccc3c12] | 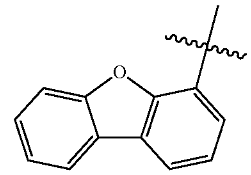 [SMILES: *c1cccc2c1oc1ccccc12] |
| 28-11 | 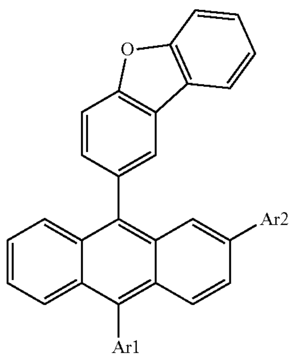 | 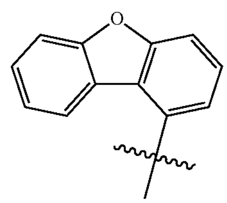 [SMILES: *c1cccc2oc3ccccc3c12] | 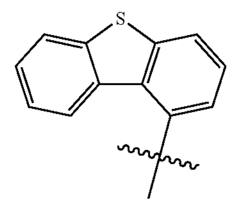 |
| 28-12 | 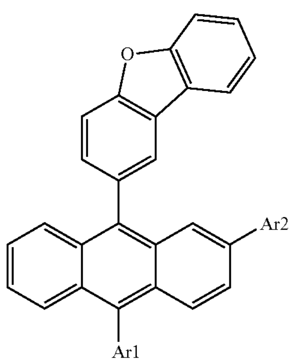 | 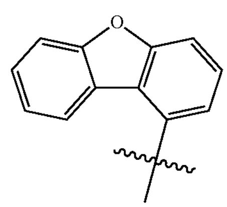 [SMILES: *c1cccc2oc3ccccc3c12] | 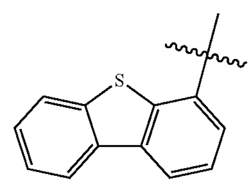 |
| 28-16 | 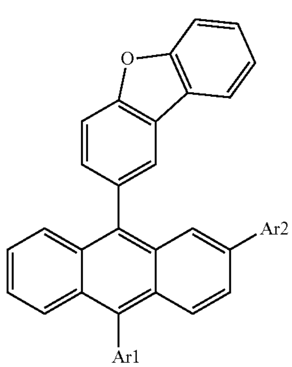 | 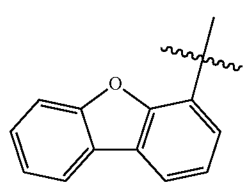 [SMILES: *c1cccc2c1oc1ccccc12] | 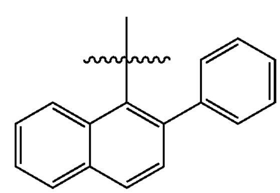 [SMILES: *c1c(-c2ccccc2)ccc2ccccc12] |

-continued
| No. | | Ar1 | Ar2 |
|---|---|---|---|
| 28-17 | 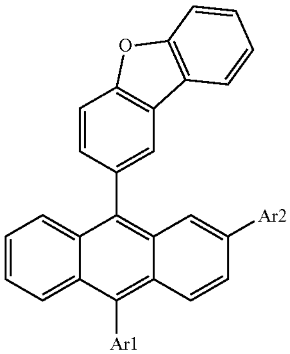 | 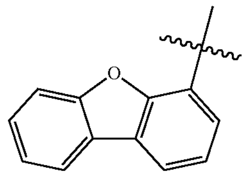 [SMILES: *c1cccc2c1oc1ccccc12] | 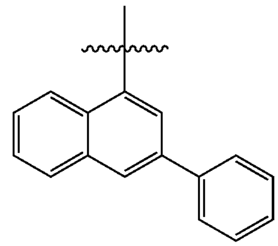 [SMILES: *c1cc(-c2ccccc2)cc2ccccc12] |
| 28-18 | 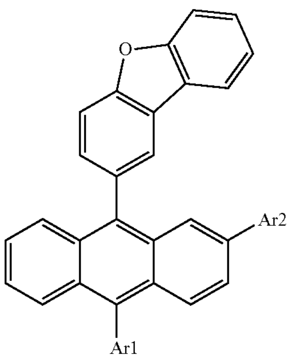 | 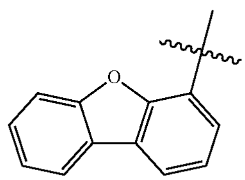 [SMILES: *c1cccc2c1oc1ccccc12] | 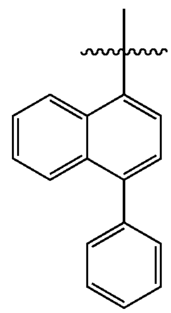 [SMILES: *c1ccc(-c2ccccc2)c2ccccc12] |
| 28-19 | 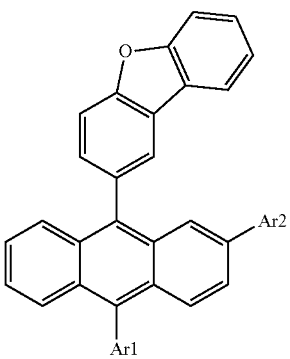 | 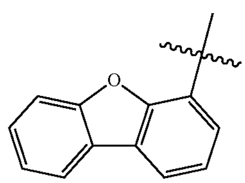 | 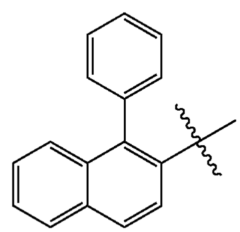 [SMILES: *c1ccc2ccccc2c1-c1ccccc1] |
| 28-20 | 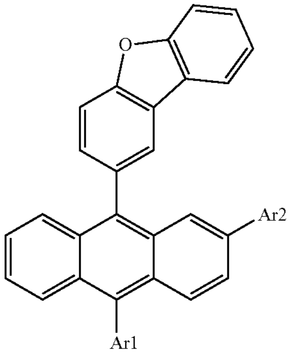 | 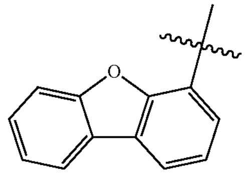 [SMILES: *c1cccc2c1oc1ccccc12] | 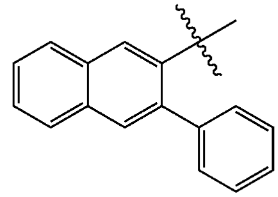 [SMILES: *c1cc2ccccc2cc1-c1ccccc1] |

-continued
| No. | | Ar1 | Ar2 |
|---|---|---|---|
| 28-21 | 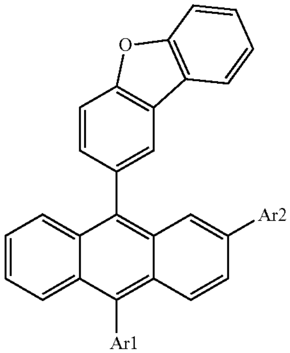 | 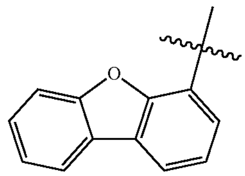 | 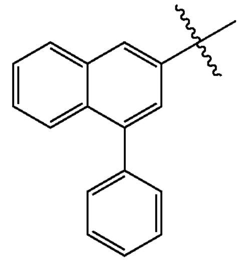 [SMILES: *c1cc(-c2ccccc2)c2ccccc2c1] |
| 28-22 | 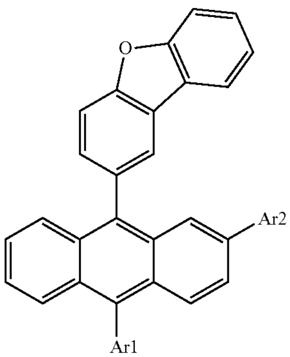 | 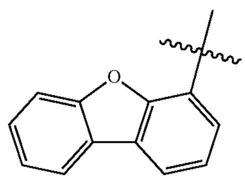 | 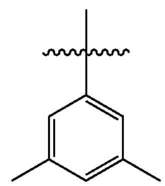 |
| 28-23 | 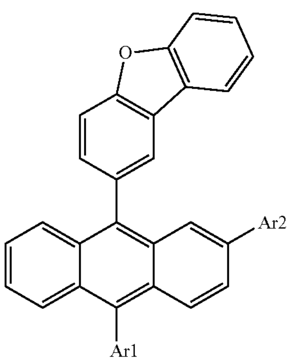 | 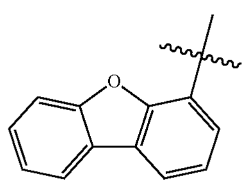 | 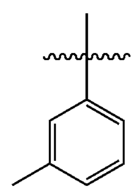 |
| 28-24 | 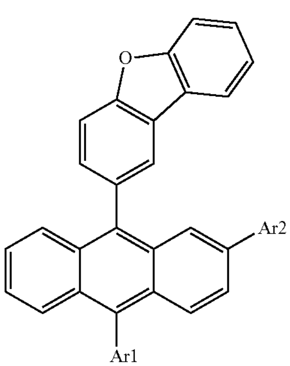 | 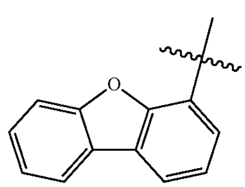 | 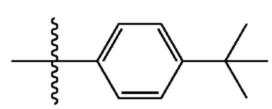 |

-continued
| No. | | Ar1 | Ar2 |
|---|---|---|---|
| 28-25 | 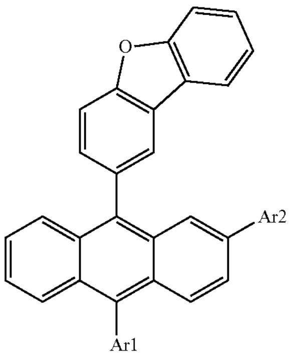 | 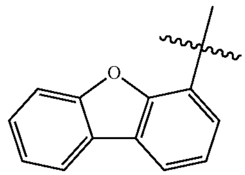 | 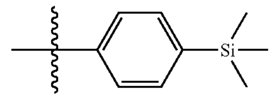 [SMILES: *c1ccc([Si](C)(C)C)cc1] |
| 28-26 | 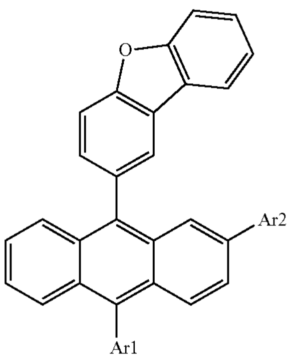 | 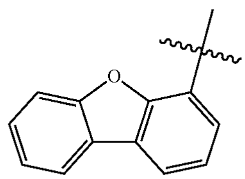 | 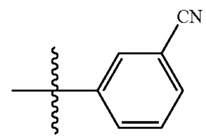 [SMILES: *c1cccc(C#N)c1] |
| 28-27 | 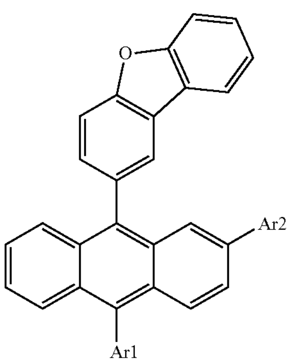 | 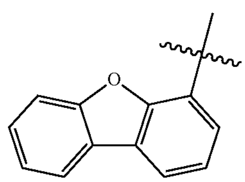 [SMILES: *c1cccc2c1oc1ccccc12] | 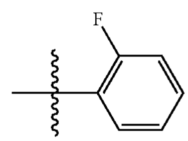 [SMILES: *c1ccccc1F] |
| 28-28 | 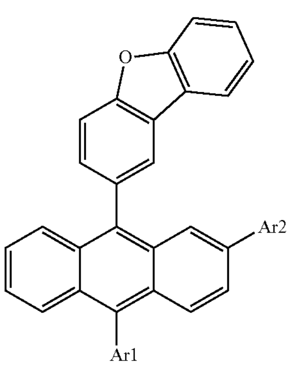 | 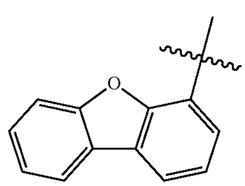 | 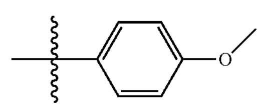 [SMILES: *c1ccc(OC)cc1] |

-continued
| No. | | Ar1 | Ar2 |
|---|---|---|---|
| 29-1 | 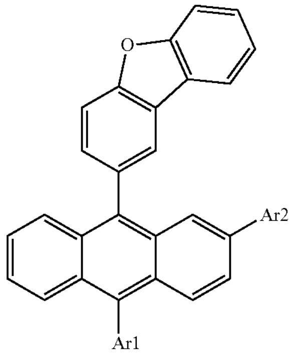 | 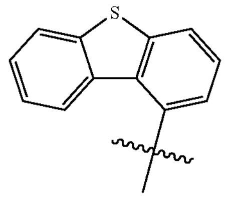 | 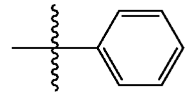 [SMILES: *c1ccccc1] |
| 29-2 | 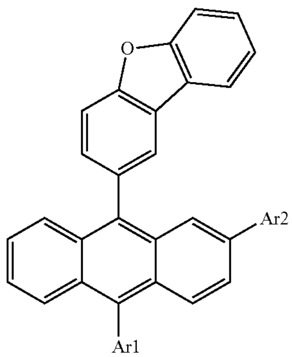 | 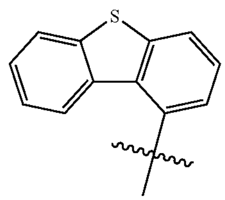 | 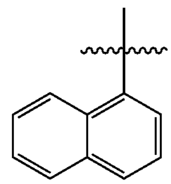 [SMILES: *c1cccc2ccccc12] |
| 29-3 | 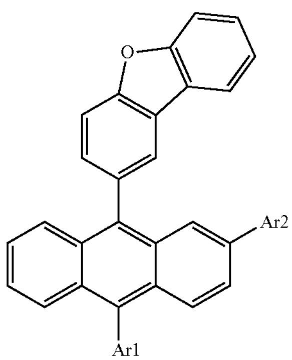 | 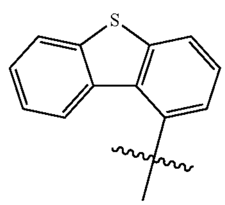 | 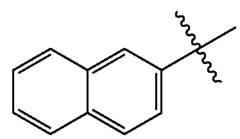 [SMILES: *c1ccc2ccccc2c1] |
| 29-4 | 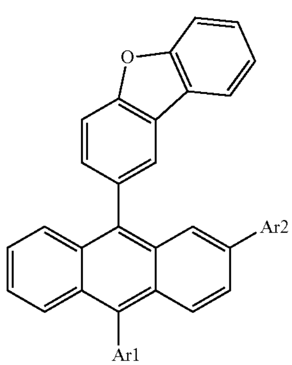 | 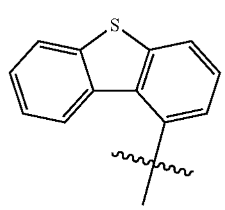 | 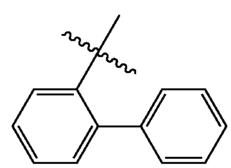 [SMILES: *c1ccccc1-c1ccccc1] |

-continued
| No. | | Ar1 | Ar2 |
|---|---|---|---|
| 29-5 | 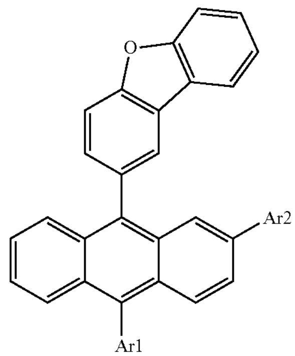 | 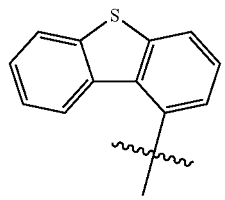 | 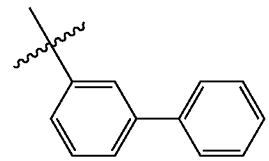 [SMILES: *c1cccc(-c2ccccc2)c1] |
| 29-6 | 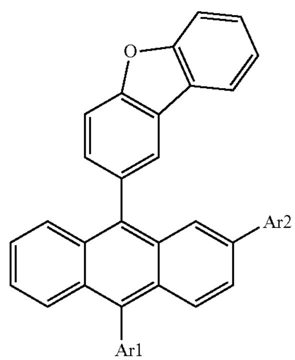 | 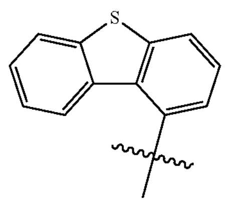 [SMILES: *c1cccc2sc3ccccc3c12] | 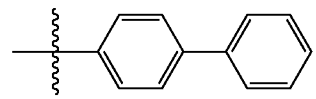 |
| 29-7 | 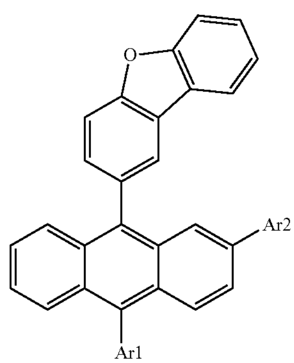 | 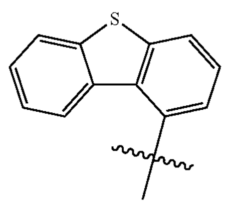 [SMILES: *c1cccc2sc3ccccc3c12] | 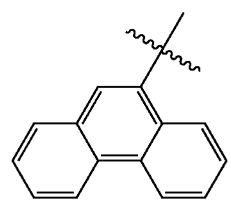 [SMILES: *c1cc2ccccc2c2ccccc12] |
| 29-9 | 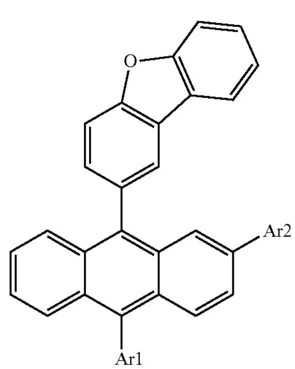 | 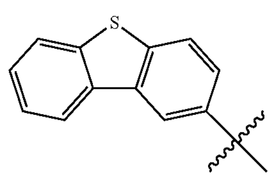 | 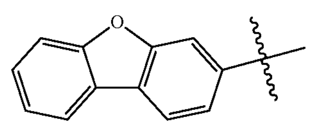 |

-continued
| No. | | Ar1 | Ar2 |
|---|---|---|---|
| 29-10 | 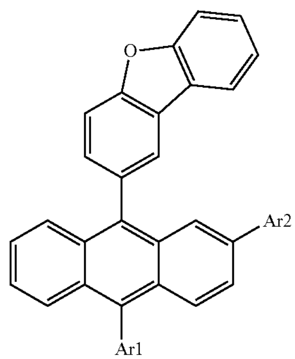 | 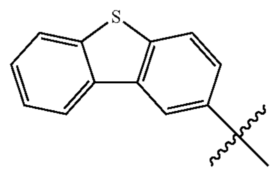 | 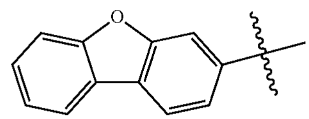 |
| 29-11 | 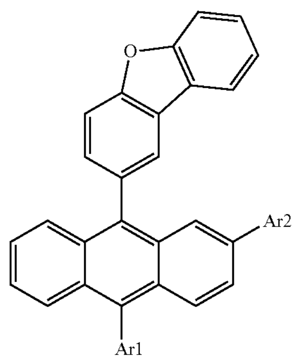 | 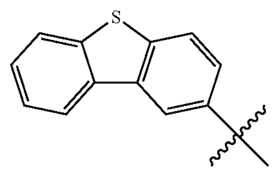 | 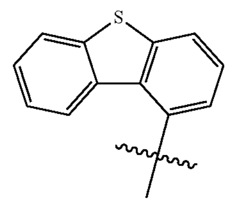 [SMILES: *c1cccc2sc3ccccc3c12] |
| 29-12 | 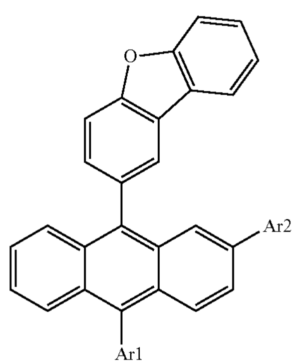 | 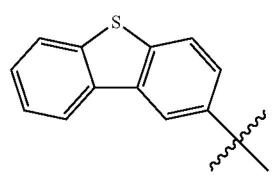 | 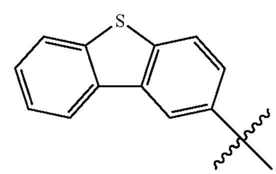 [SMILES: *c1ccc2sc3ccccc3c2c1] |
| 29-13 | 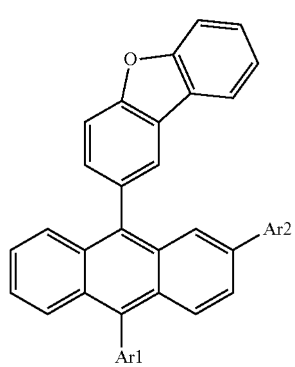 | 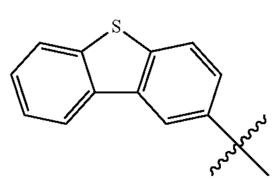 | 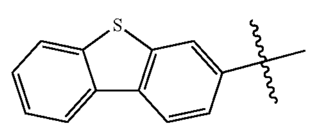 [SMILES: *c1ccc2c(c1)sc1ccccc12] |

-continued
| No. | | Ar1 | Ar2 |
| --- | --- | --- | --- |
| 29-17 | 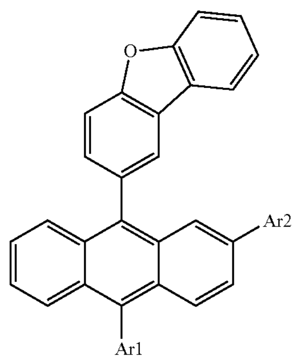 | 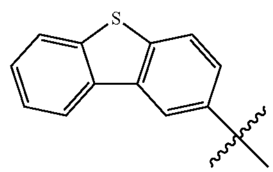 | 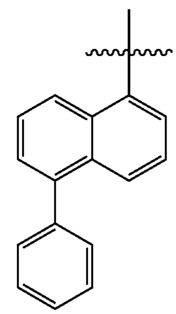 [SMILES: *c1cccc2c(-c3ccccc3)cccc12] |
| 29-18 | 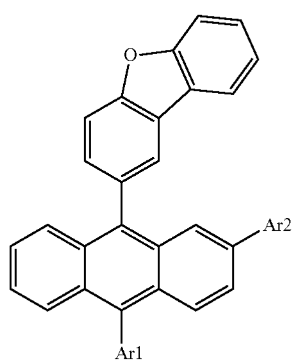 | 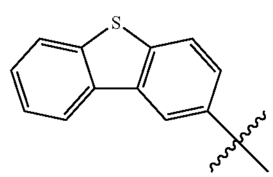 [SMILES: *c1ccc2sc3ccccc3c2c1] | 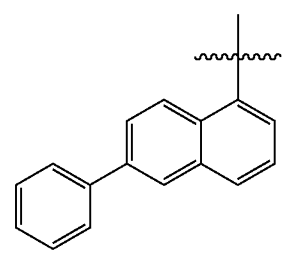 [SMILES: *c1cccc2cc(-c3ccccc3)ccc12] |
| 29-19 | 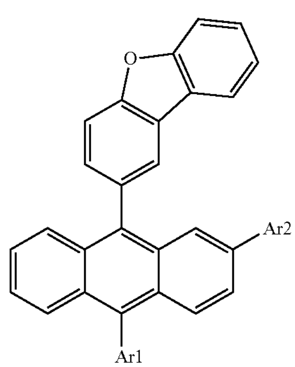 | 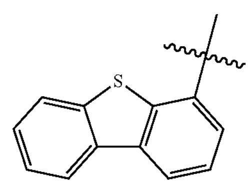 [SMILES: *c1cccc2c1sc1ccccc12] | 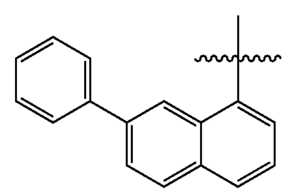 [SMILES: *c1cccc2ccc(-c3ccccc3)cc12] |
| 29-20 | 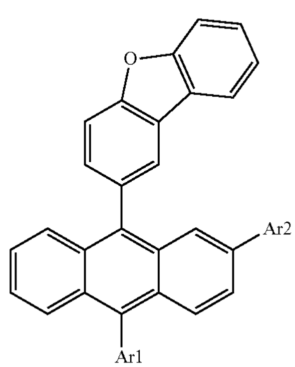 | 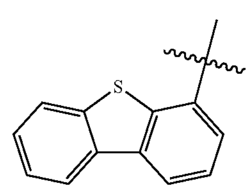 [SMILES: *c1cccc2c1sc1ccccc12] | 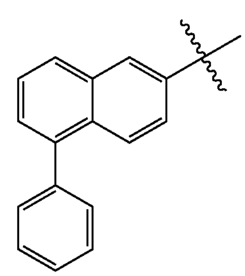 [SMILES: *c1ccc2c(-c3ccccc3)cccc2c1] |

-continued
| No. | | Ar1 | Ar2 |
|---|---|---|---|
| 29-21 | 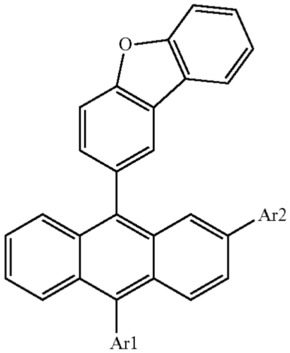 | 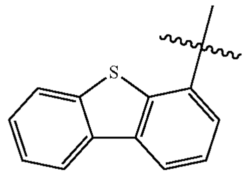 [SMILES: *c1cccc2c1sc1ccccc12] | 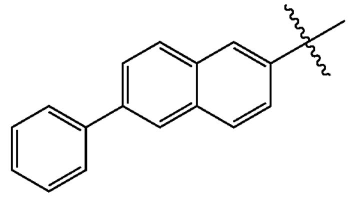 [SMILES: *c1ccc2cc(-c3ccccc3)ccc2c1] |
| 29-22 | 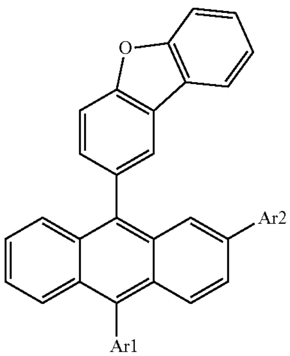 | 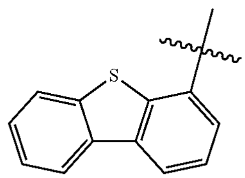 [SMILES: *c1cccc2c1sc1ccccc12] | 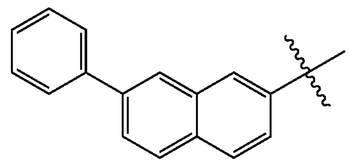 [SMILES: *c1ccc2ccc(-c3ccccc3)cc2c1] |
| 29-23 | 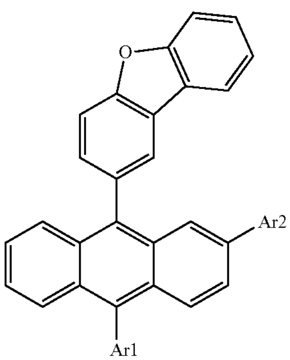 | 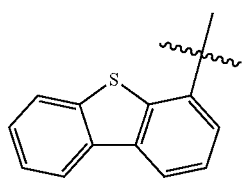 [SMILES: *c1cccc2c1sc1ccccc12] | 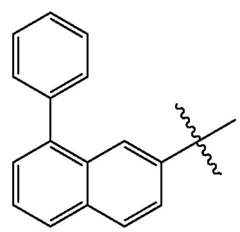 [SMILES: *c1ccc2cccc(-c3ccccc3)c2c1] |
| 29-24 | 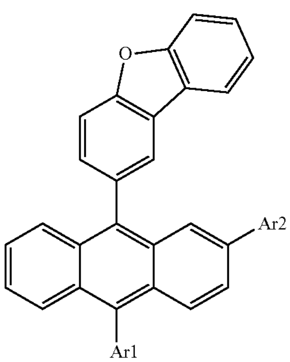 | 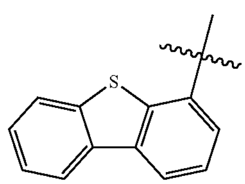 [SMILES: *c1cccc2c1sc1ccccc12] | 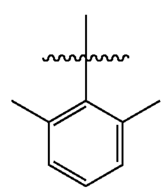 |

-continued
| No. | | Ar1 | Ar2 |
|---|---|---|---|
| 29-25 | 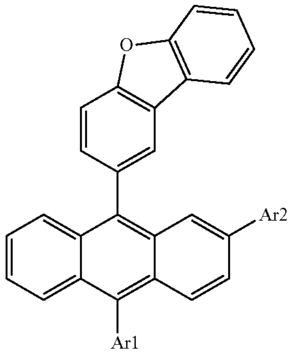 | 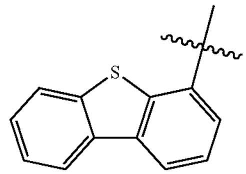 | 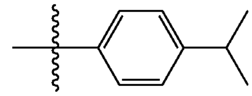 |
| 29-26 | 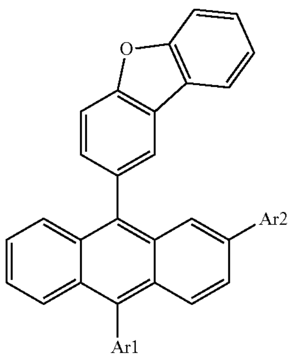 | 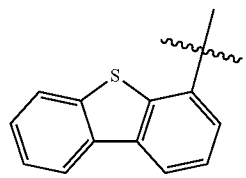 | 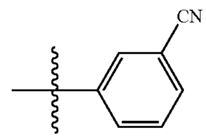 [SMILES: *c1cccc(C#N)c1] |
| 29-27 | 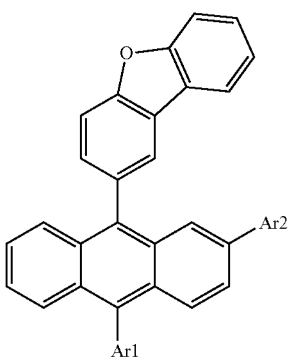 | 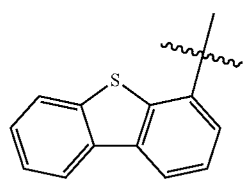 | 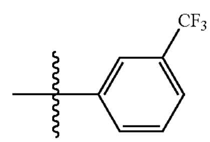 [SMILES: *c1cccc(C(F)(F)F)c1] |
| 29-28 | 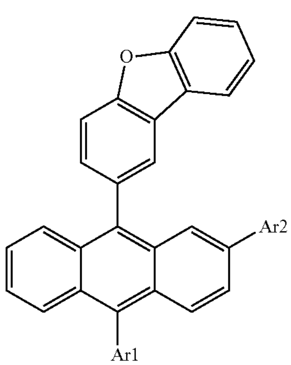 | 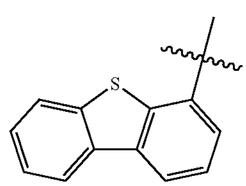 | 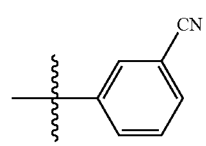 [SMILES: *c1cccc(C#N)c1] |

-continued
| No. | | Ar1 | Ar2 |
|---|---|---|---|
| 29-29 | 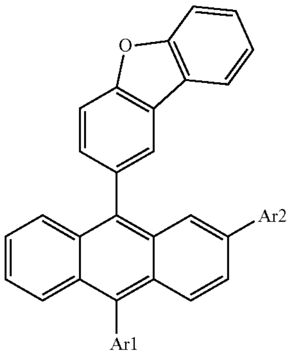 | 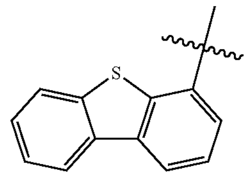 | 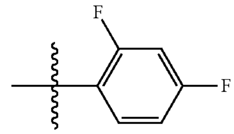 [SMILES: *c1ccc(F)cc1F] |
| 30-1 | 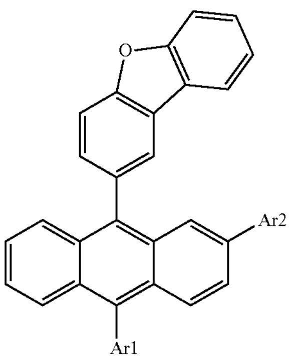 | 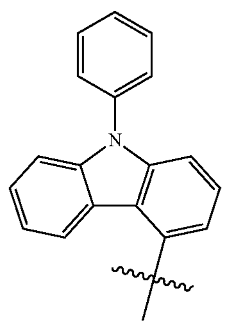 [SMILES: *c1cccc2c1c1ccccc1n2-c1ccccc1] | 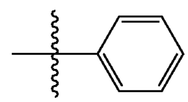 |
| 30-2 | 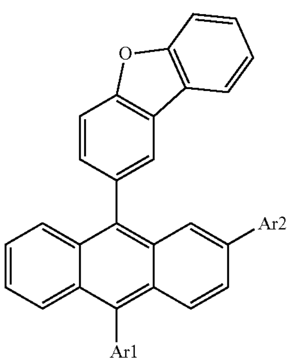 | 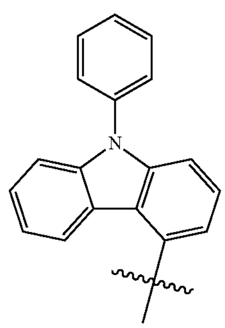 [SMILES: *c1cccc2c1c1ccccc1n2-c1ccccc1] | 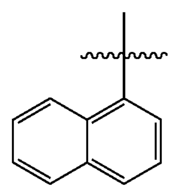 [SMILES: *c1cccc2ccccc12] |
| 30-3 | 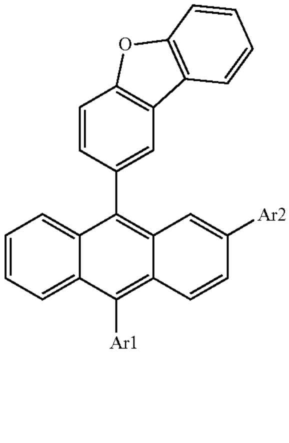 | 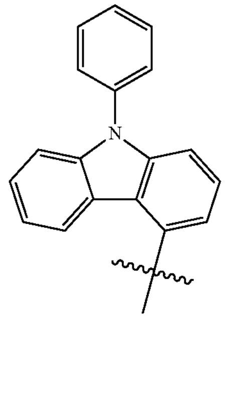 [SMILES: *c1cccc2c1c1ccccc1n2-c1ccccc1] | 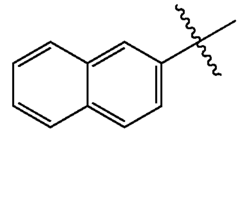 [SMILES: *c1ccc2ccccc2c1] |

-continued
| No. | | Ar1 | Ar2 |
|---|---|---|---|
| 30-4 | 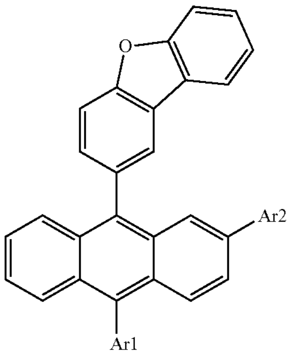 | 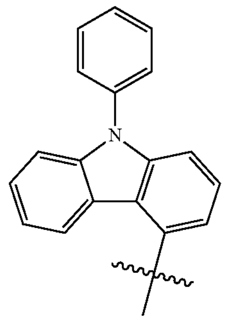 [SMILES: *c1cccc2c1c1ccccc1n2-c1ccccc1] | 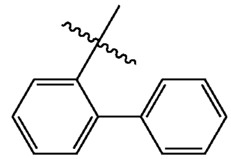 [SMILES: *c1ccccc1-c1ccccc1] |
| 30-5 | 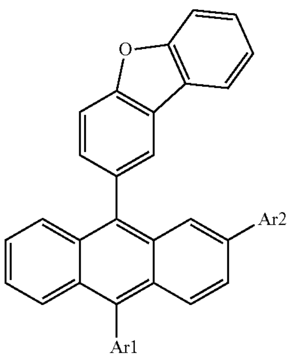 | 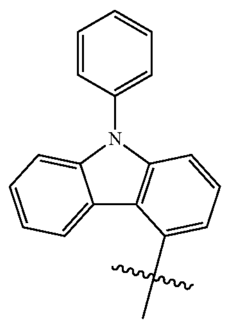 [SMILES: *c1cccc2c1c1ccccc1n2-c1ccccc1] | 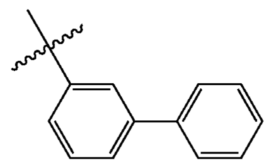 [SMILES: *c1cccc(-c2ccccc2)c1] |
| 30-6 | 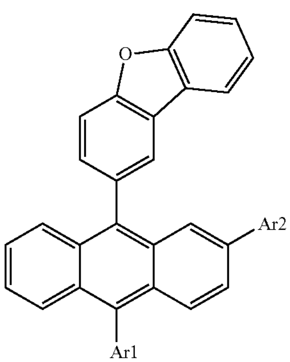 | 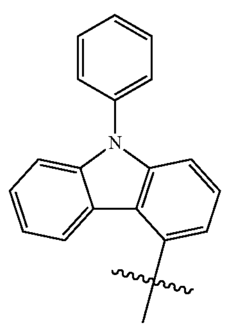 [SMILES: *c1cccc2c1c1ccccc1n2-c1ccccc1] | 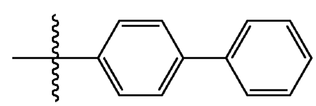 [SMILES: *c1ccc(-c2ccccc2)cc1] |
| 30-7 | 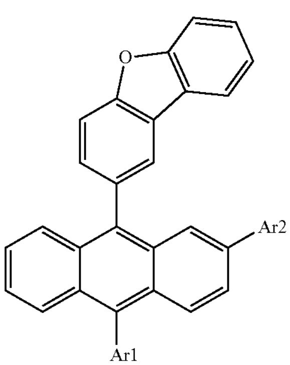 | 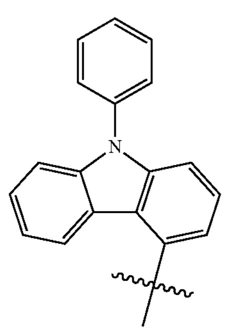 [SMILES: *c1cccc2c1c1ccccc1n2-c1ccccc1] | 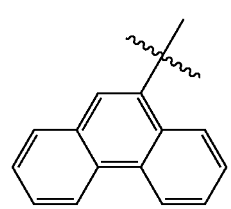 [SMILES: *c1cc2ccccc2c2ccccc12] |

-continued
| No. | | Ar1 | Ar2 |
|---|---|---|---|
| 30-9 | 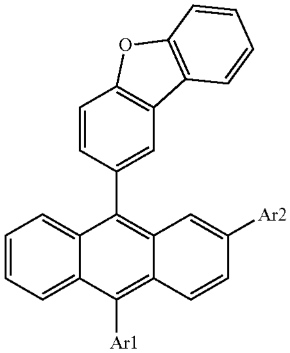 | 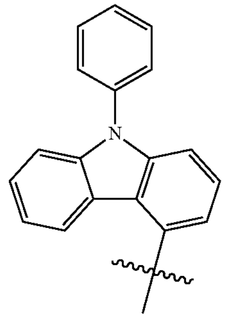 [SMILES: *c1cccc2c1c1ccccc1n2-c1ccccc1] | 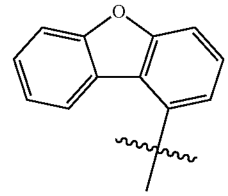 [SMILES: *c1cccc2oc3ccccc3c12] |
| 30-10 | 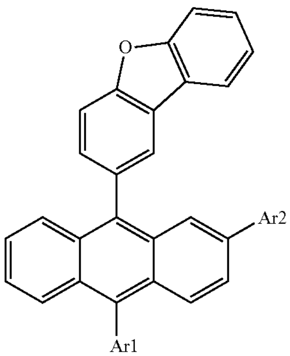 | 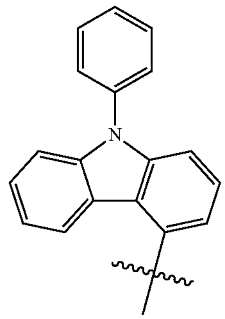 [SMILES: *c1cccc2c1c1ccccc1n2-c1ccccc1] | 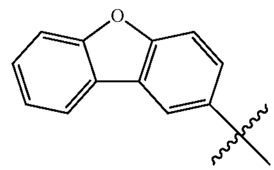 [SMILES: *c1ccc2oc3ccccc3c2c1] |
| 30-11 | 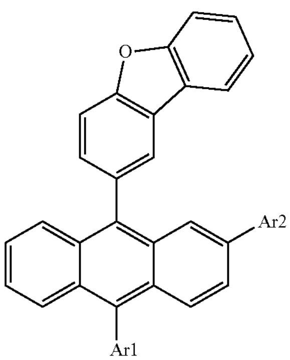 | 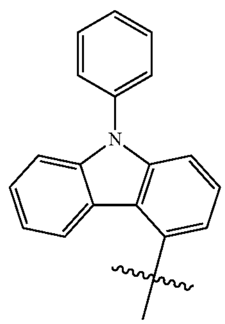 [SMILES: *c1cccc2c1c1ccccc1n2-c1ccccc1] | 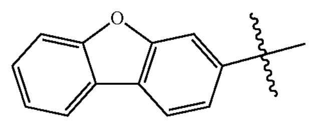 |
| 30-12 | 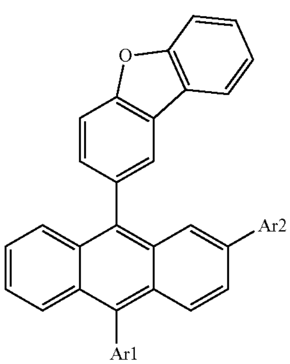 | 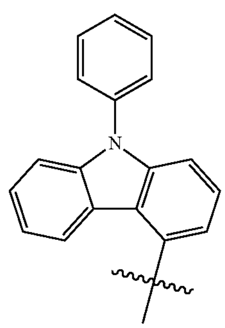 [SMILES: *c1cccc2c1c1ccccc1n2-c1ccccc1] | 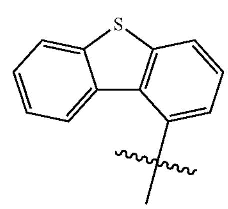 [SMILES: *c1cccc2sc3ccccc3c12] |

-continued
| No. | | Ar1 | Ar2 |
|---|---|---|---|
| 30-13 | 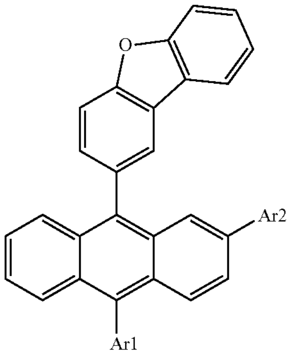 | 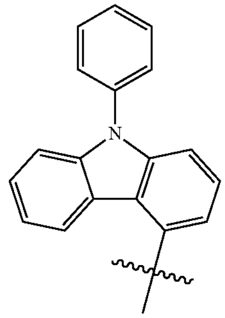 [SMILES: *c1cccc2c1c1ccccc1n2-c1ccccc1] | 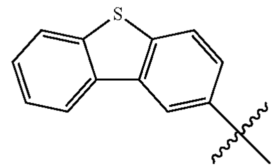 |
| 30-14 | 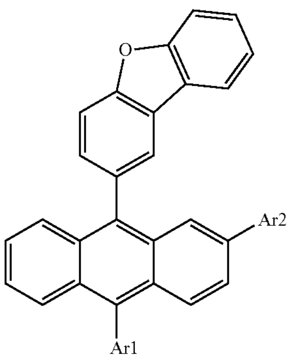 | 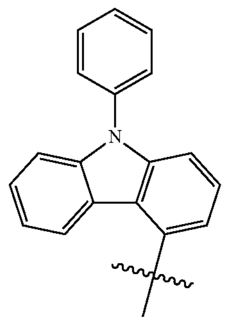 [SMILES: *c1cccc2c1c1ccccc1n2-c1ccccc1] | 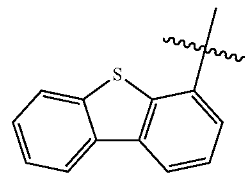 |
| 30-19 | 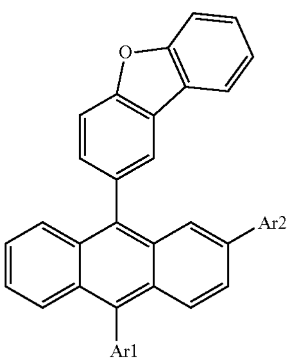 | 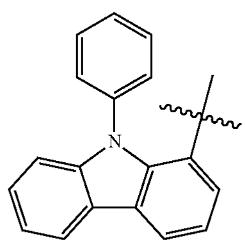 [SMILES: *c1cccc2c3ccccc3n(-c3ccccc3)c12] | 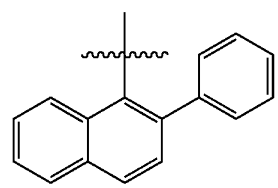 [SMILES: *c1c(-c2ccccc2)ccc2ccccc12] |
| 30-20 | 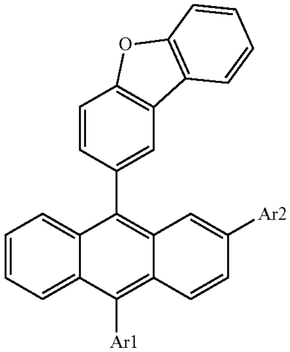 | 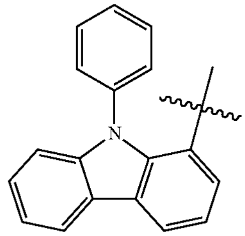 [SMILES: *c1cccc2c3ccccc3n(-c3ccccc3)c12] | 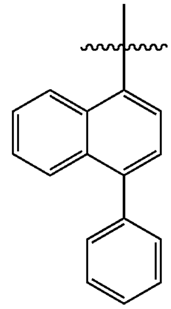 [SMILES: *c1ccc(-c2ccccc2)c2ccccc12] |

-continued
| No. | | Ar1 | Ar2 |
|---|---|---|---|
| 30-21 | 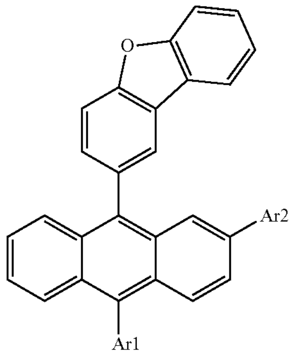 | 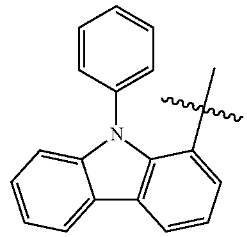 [SMILES: *c1cccc2c3ccccc3n(-c3ccccc3)c12] | 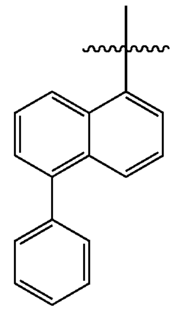 [SMILES: *c1cccc2c(-c3ccccc3)cccc12] |
| 30-22 | 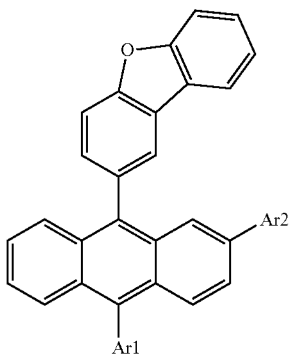 | 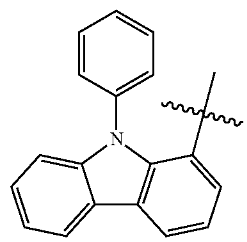 [SMILES: *c1cccc2c3ccccc3n(-c3ccccc3)c12] | 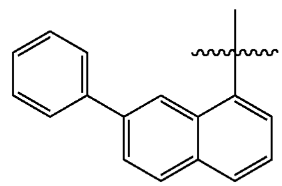 [SMILES: *c1cccc2ccc(-c3ccccc3)cc12] |
| 30-23 | 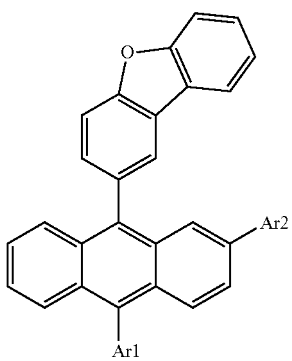 | 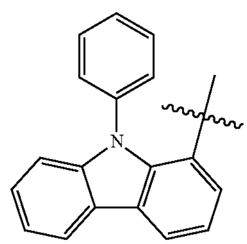 [SMILES: *c1cccc2c3ccccc3n(-c3ccccc3)c12] | 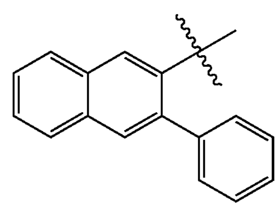 [SMILES: *c1cc2ccccc2cc1-c1ccccc1] |
| 30-24 | 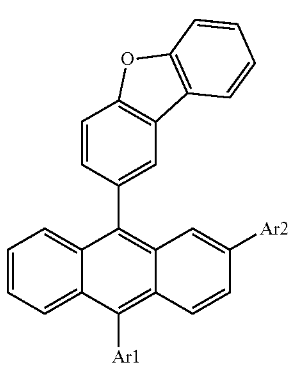 | 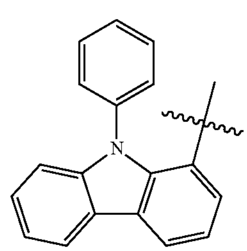 [SMILES: *c1cccc2c3ccccc3n(-c3ccccc3)c12] | 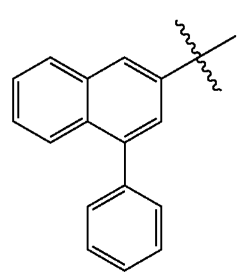 [SMILES: *c1cc(-c2ccccc2)c2ccccc2c1] |

-continued
| No. | | Ar1 | Ar2 |
|---|---|---|---|
| 30-25 | 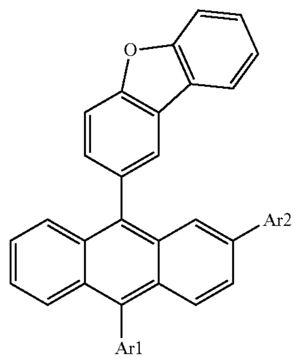 | 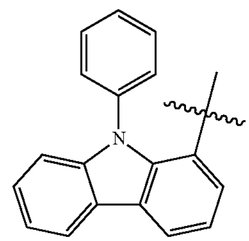 [SMILES: *c1cccc2c3ccccc3n(-c3ccccc3)c12] | 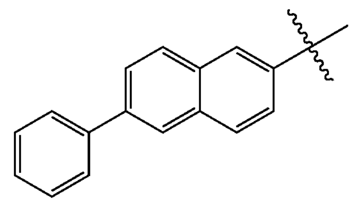 [SMILES: *c1ccc2cc(-c3ccccc3)ccc2c1] |
| 30-26 | 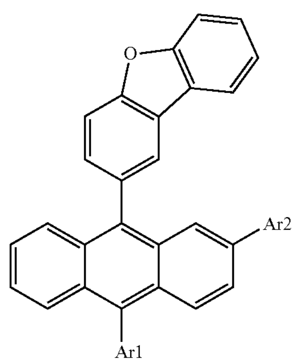 | 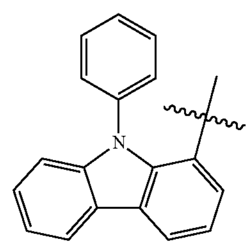 [SMILES: *c1cccc2c3ccccc3n(-c3ccccc3)c12] | 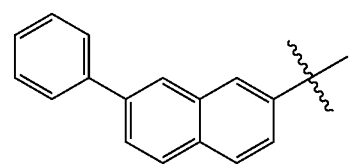 [SMILES: *c1ccc2ccc(-c3ccccc3)cc2c1] |
| 30-27 | 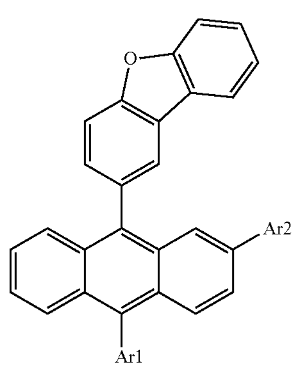 | 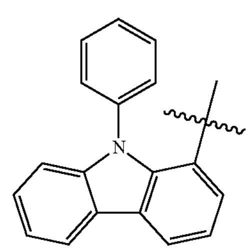 [SMILES: *c1cccc2c3ccccc3n(-c3ccccc3)c12] | 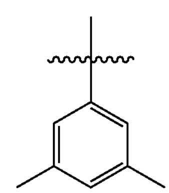 |
| 30-28 | 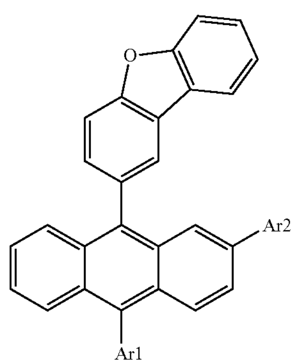 | 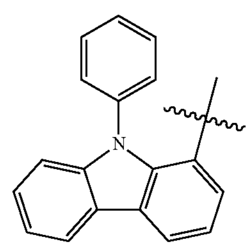 [SMILES: *c1cccc2c3ccccc3n(-c3ccccc3)c12] | 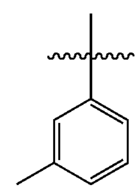 [SMILES: *c1cccc(C)c1] |

-continued
| No. | | Ar1 | Ar2 |
|---|---|---|---|
| 30-29 | 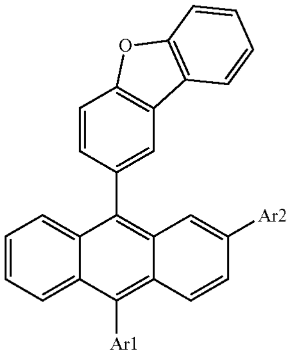 | 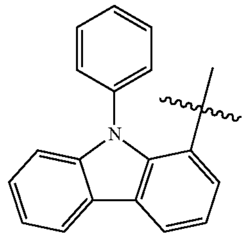 [SMILES: *c1cccc2c3ccccc3n(-c3ccccc3)c12] | 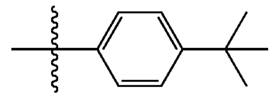 |
| 30-30 | 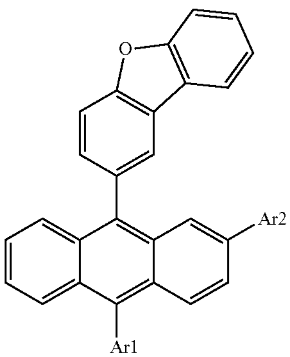 | 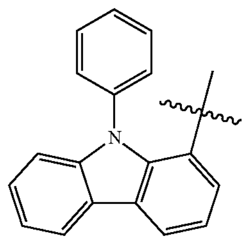 [SMILES: *c1cccc2c3ccccc3n(-c3ccccc3)c12] | 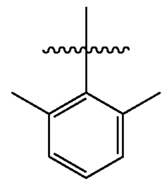 |
| 30-31 | 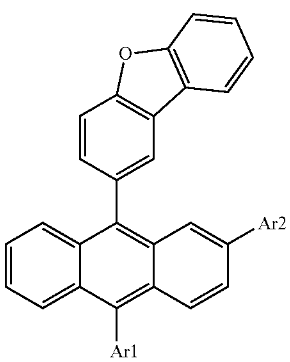 | 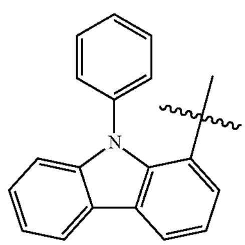 [SMILES: *c1cccc2c3ccccc3n(-c3ccccc3)c12] | 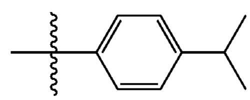 [SMILES: *c1ccc(C(C)C)cc1] |
| 31-1 | 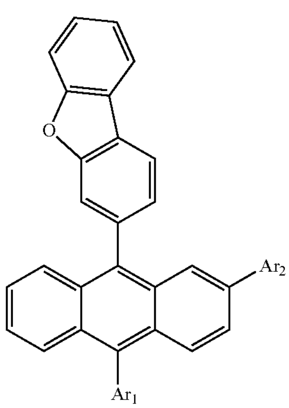 | 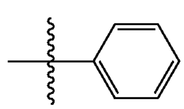 [SMILES: *c1ccccc1] | 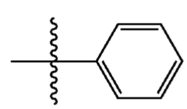 [SMILES: *c1ccccc1] |

-continued
| No. | | Ar1 | Ar2 |
|---|---|---|---|
| 31-2 | 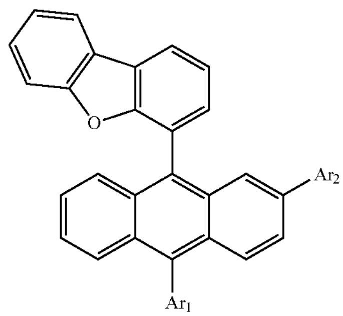 | 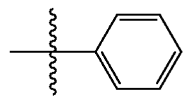 [SMILES: *c1ccccc1] | 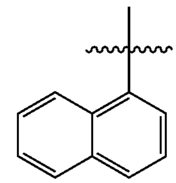 [SMILES: *c1cccc2ccccc12] |
| 31-3 | 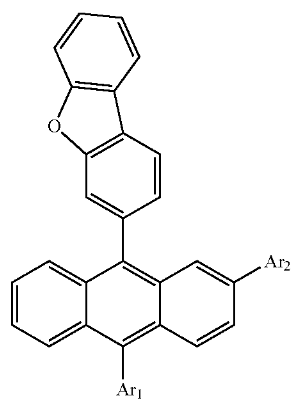 | 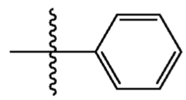 [SMILES: *c1ccccc1] | 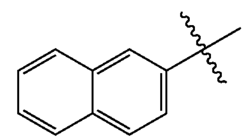 [SMILES: *c1ccc2ccccc2c1] |
| 31-4 | 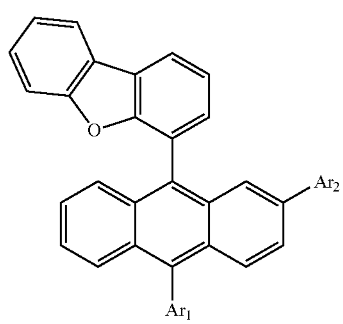 | 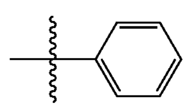 [SMILES: *c1ccccc1] | 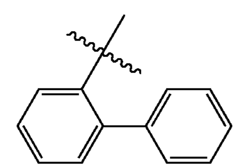 [SMILES: *c1ccccc1-c1ccccc1] |
| 31-5 | 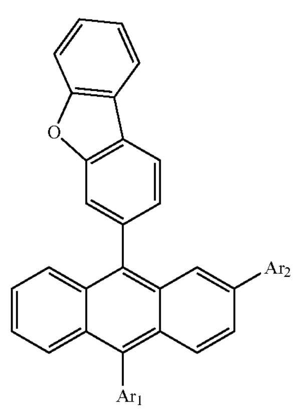 | 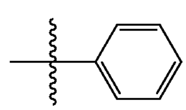 [SMILES: *c1ccccc1] | 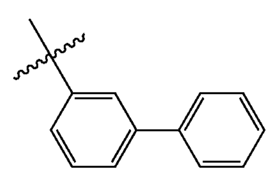 [SMILES: *c1cccc(-c2ccccc2)c1] |

-continued
| No. | | Ar1 | Ar2 |
|---|---|---|---|
| 31-6 | 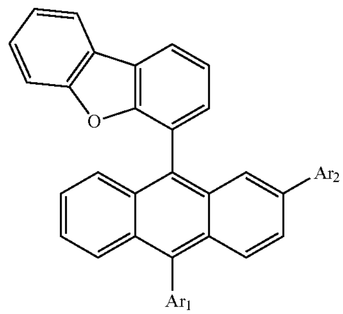 | 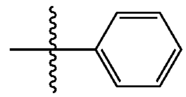 | 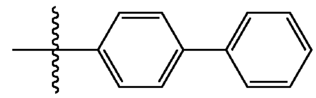 |
| 31-7 | 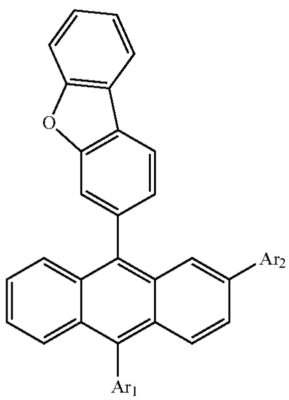 | 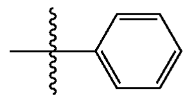 | 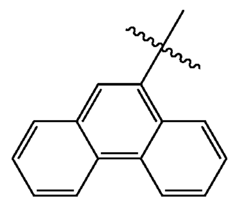 [SMILES: *c1cc2ccccc2c2ccccc12] |
| 31-9 | 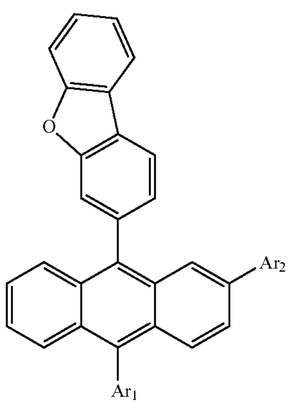 | 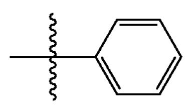 [SMILES: *c1ccccc1] | 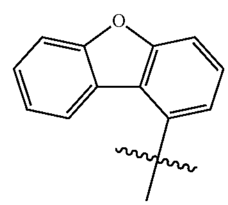 [SMILES: *c1cccc2oc3ccccc3c12] |
| 31-10 | 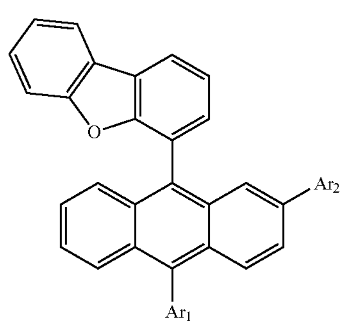 | 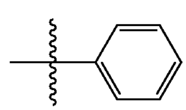 [SMILES: *c1ccccc1] | 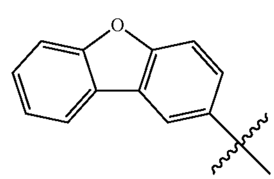 |

-continued
| No. | | Ar1 | Ar2 |
|---|---|---|---|
| 31-11 | 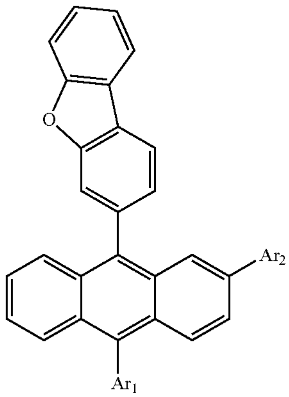 | 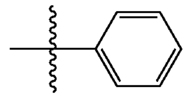 | 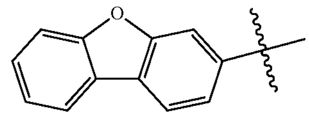 |
| 31-12 | 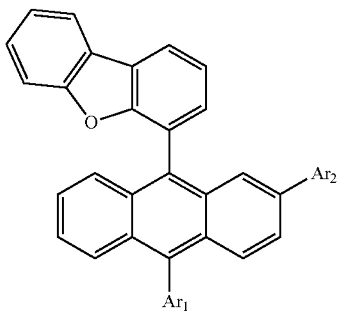 | 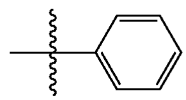 [SMILES: *c1ccccc1] | 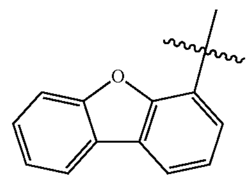 |
| 31-13 | 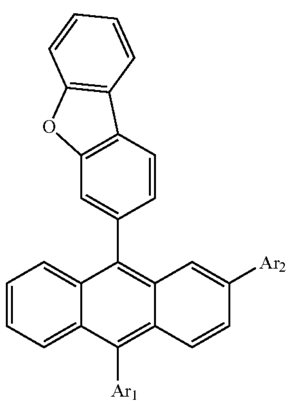 | 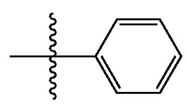 | 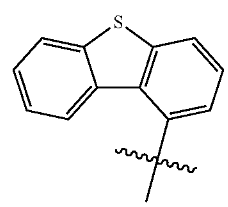 [SMILES: *c1cccc2sc3ccccc3c12] |
| 31-14 | 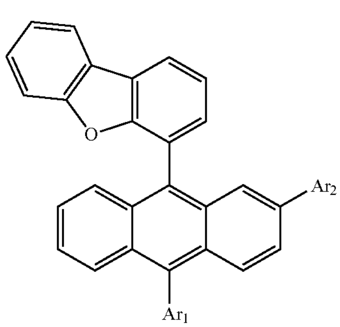 | 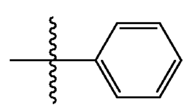 [SMILES: *c1ccccc1] | 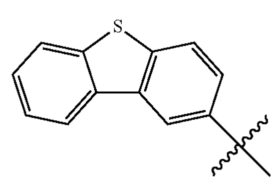 |

-continued
| No. | | Ar1 | Ar2 |
|---|---|---|---|
| 31-15 | 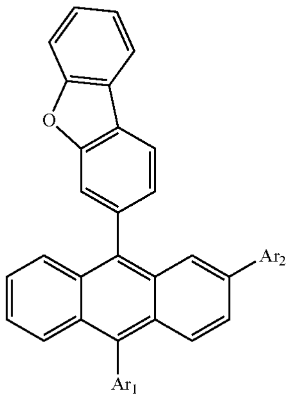 | 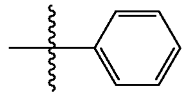 | 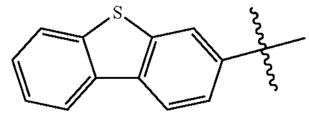 |
| 31-16 | 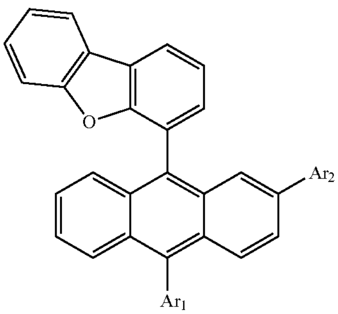 | 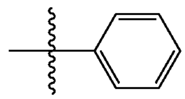 | 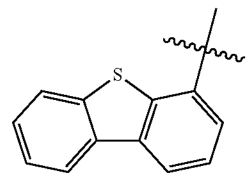 |
| 31-22 | 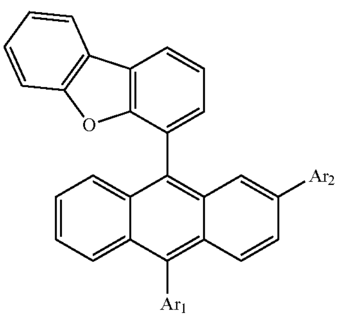 | 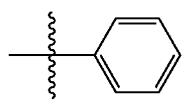 [SMILES: *c1ccccc1] | 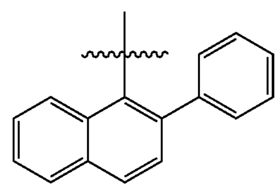 [SMILES: *c1c(-c2ccccc2)ccc2ccccc12] |
| 31-23 | 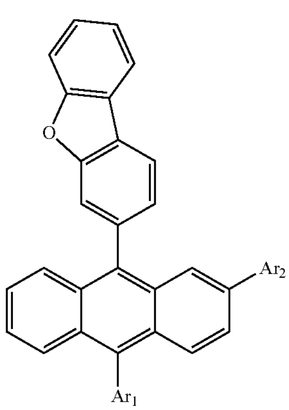 | 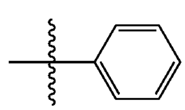 [SMILES: *c1ccccc1] | 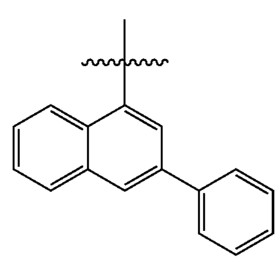 [SMILES: *c1cc(-c2ccccc2)cc2ccccc12] |

-continued
| No. | | Ar1 | Ar2 |
|---|---|---|---|
| 31-24 | 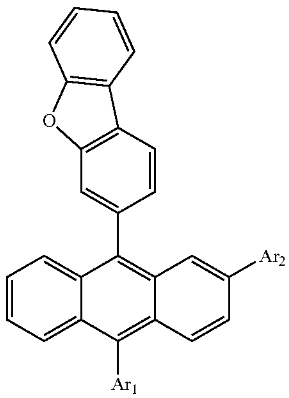 | 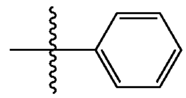 [SMILES: *c1ccccc1] | 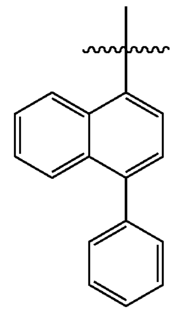 [SMILES: *c1ccc(-c2ccccc2)c2ccccc12] |
| 31-25 | 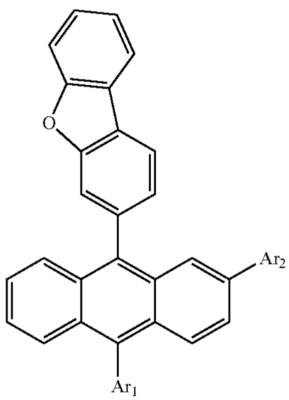 | 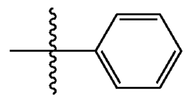 | 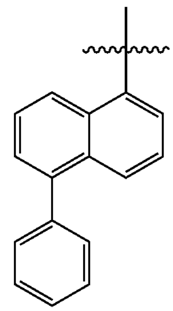 [SMILES: *c1cccc2c(-c3ccccc3)cccc12] |
| 31-26 | 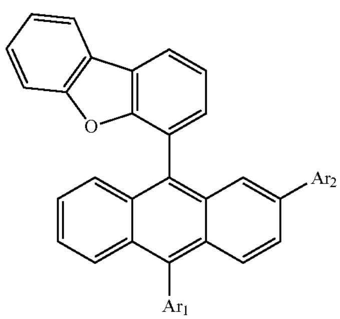 | 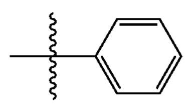 | 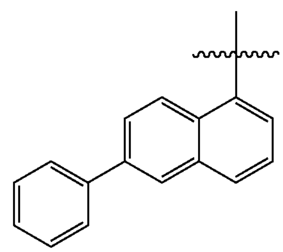 [SMILES: *c1cccc2cc(-c3ccccc3)ccc12] |
| 31-27 | 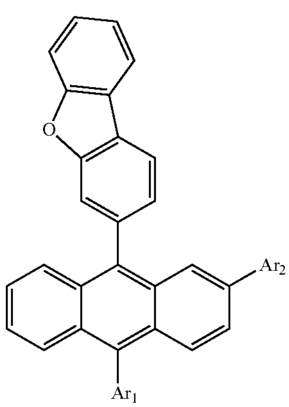 | 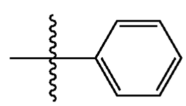 | 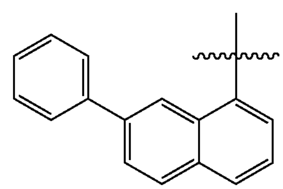 [SMILES: *c1cccc2ccc(-c3ccccc3)cc12] |

-continued
| No. | | Ar1 | Ar2 |
|---|---|---|---|
| 31-28 | 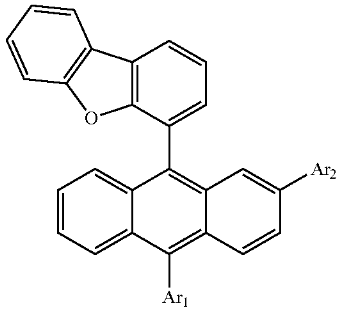 | 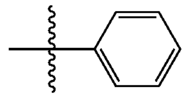 | 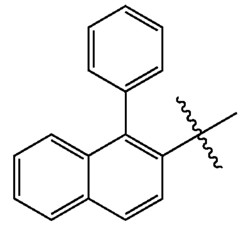 [SMILES: *c1ccc2ccccc2c1-c1ccccc1] |
| 31-29 | 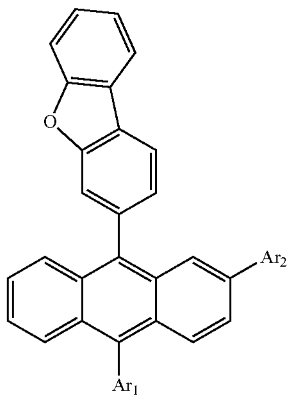 | 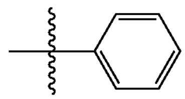 [SMILES: *c1ccccc1] | 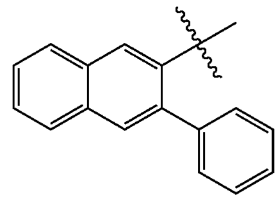 [SMILES: *c1cc2ccccc2cc1-c1ccccc1] |
| 31-30 | 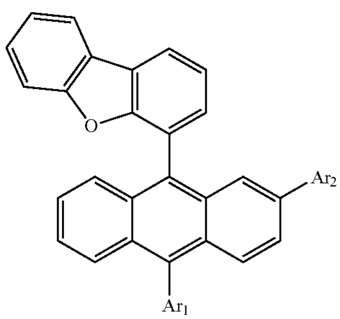 | 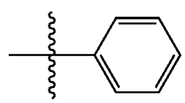 [SMILES: *c1ccccc1] | 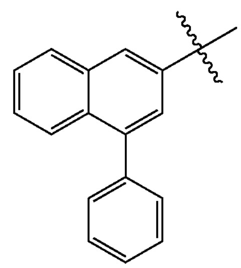 [SMILES: *c1cc(-c2ccccc2)c2ccccc2c1] |
| 31-31 | 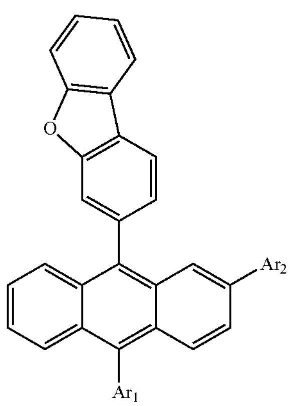 | 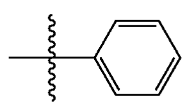 | 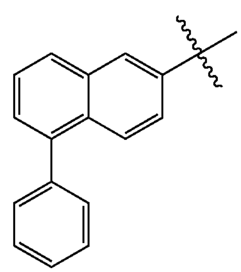 [SMILES: *c1ccc2c(-c3ccccc3)cccc2c1] |

-continued
| No. | | Ar1 | Ar2 |
|---|---|---|---|
| 31-32 | 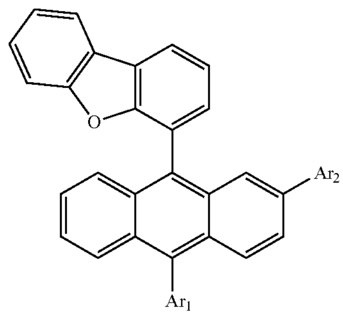 | 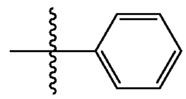 | 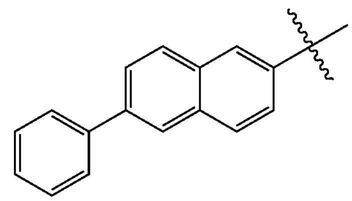 [SMILES: *c1ccc2cc(-c3ccccc3)ccc2c1] |
| 31-33 | 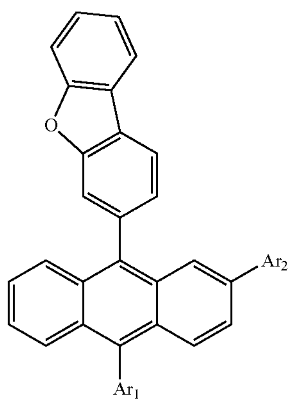 | 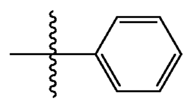 | 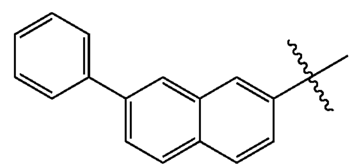 [SMILES: *c1ccc2ccc(-c3ccccc3)cc2c1] |
| 31-34 | 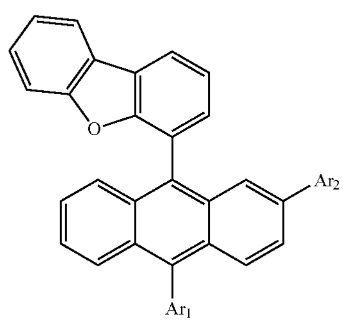 | 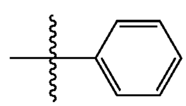 [SMILES: *c1ccccc1] | 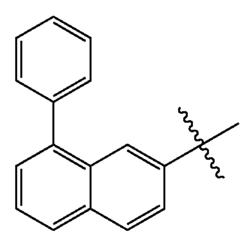 [SMILES: *c1ccc2cccc(-c3ccccc3)c2c1] |
| 31-35 | 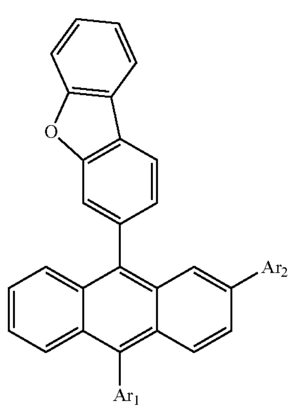 | 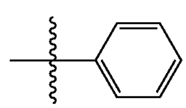 [SMILES: *c1ccccc1] | 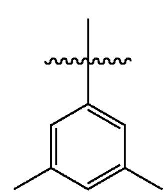 |

-continued
| No. | | Ar1 | Ar2 |
|---|---|---|---|
| 31-36 | 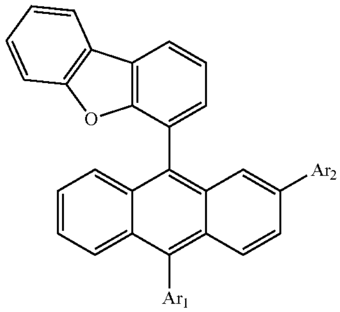 | 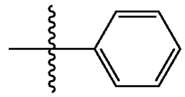 | 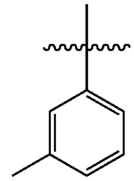 |
| 31-37 | 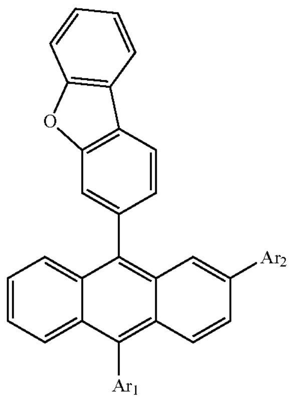 | 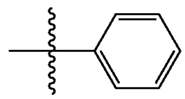 [SMILES: *c1ccccc1] | 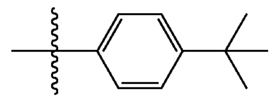 |
| 31-38 | 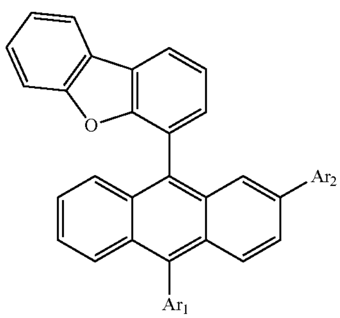 | 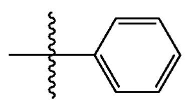 | 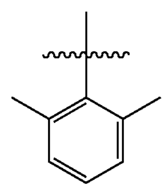 |
| 31-39 | 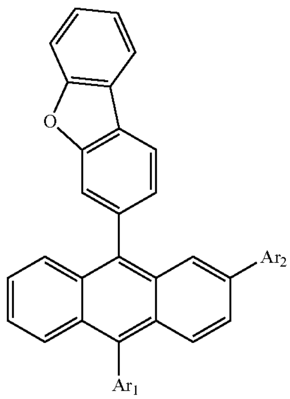 | 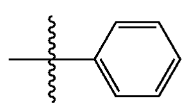 [SMILES: *c1ccccc1] | 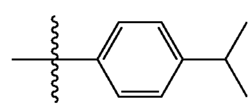 [SMILES: *c1ccc(C(C)C)cc1] |

-continued
| No. | | Ar1 | Ar2 |
|---|---|---|---|
| 31-40 | 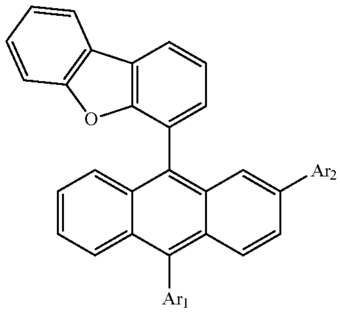 | 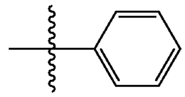 [SMILES: *c1ccccc1] | 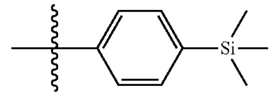 [SMILES: *c1ccc([Si](C)(C)C)cc1] |
| 31-41 | 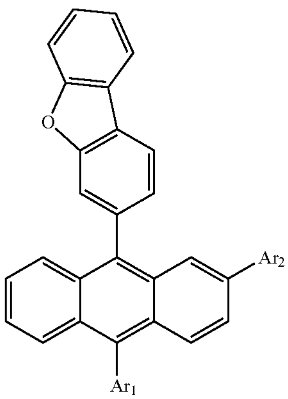 | 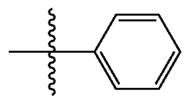 | 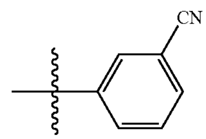 [SMILES: *c1cccc(C#N)c1] |
| 31-42 | 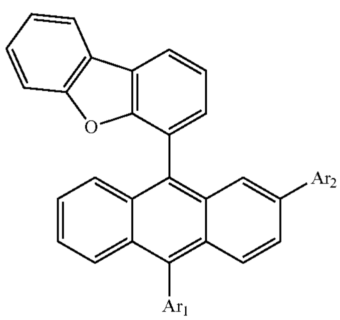 | 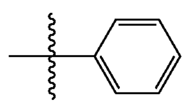 [SMILES: *c1ccccc1] | 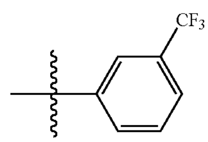 [SMILES: *c1cccc(C(F)(F)F)c1] |
| 31-43 | 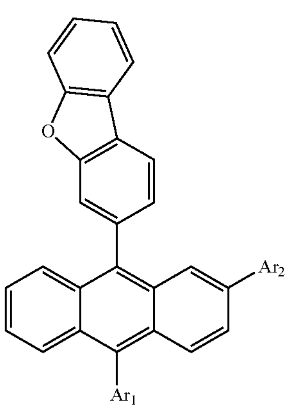 | 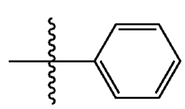 [SMILES: *c1ccccc1] | 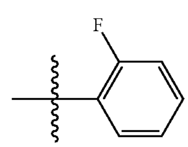 [SMILES: *c1ccccc1F] |

-continued
| No. | | Ar1 | Ar2 |
|---|---|---|---|
| 31-44 | 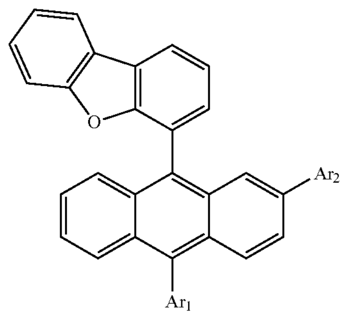 | 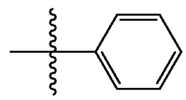 [SMILES: *c1ccccc1] | 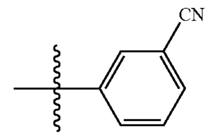 [SMILES: *c1cccc(C#N)c1] |
| 31-45 | 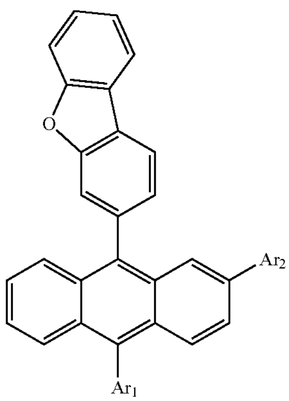 | 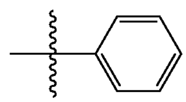 | 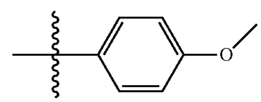 [SMILES: *c1ccc(OC)cc1] |
| 31-46 | 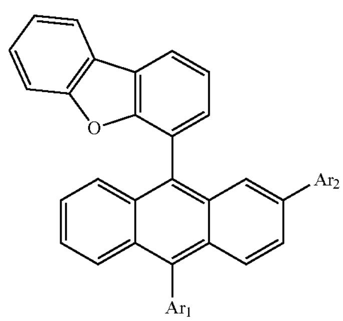 | 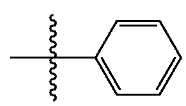 [SMILES: *c1ccccc1] | 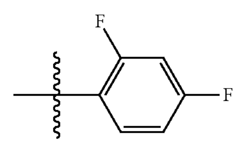 [SMILES: *c1ccc(F)cc1F] |
| 32-1 | 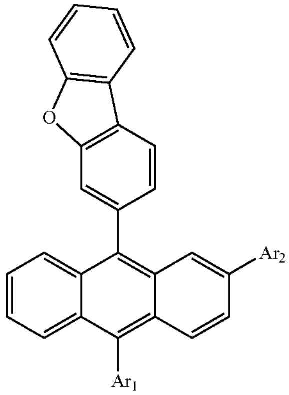 | 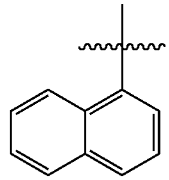 [SMILES: *c1cccc2ccccc12] | 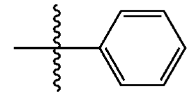 |

-continued
| No. | | Ar1 | Ar2 |
|---|---|---|---|
| 32-2 | 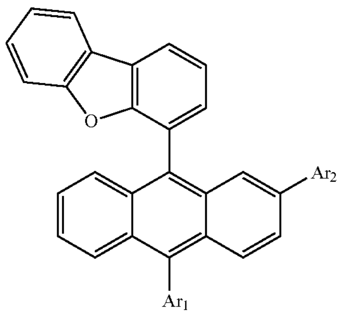 | 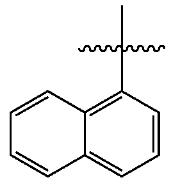 [SMILES: *c1cccc2ccccc12] | 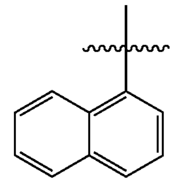 [SMILES: *c1cccc2ccccc12] |
| 32-3 | 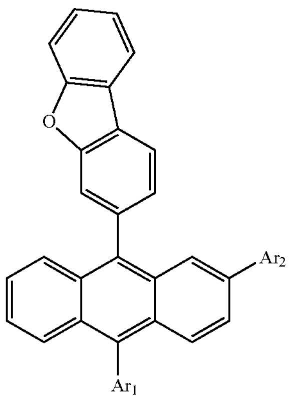 | 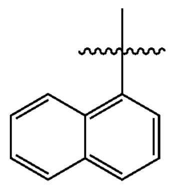 [SMILES: *c1cccc2ccccc12] | 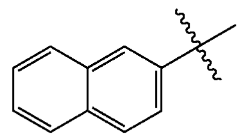 [SMILES: *c1ccc2ccccc2c1] |
| 32-4 | 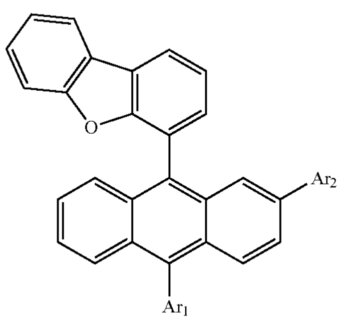 | 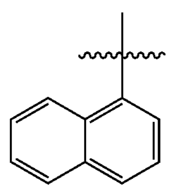 [SMILES: *c1cccc2ccccc12] | 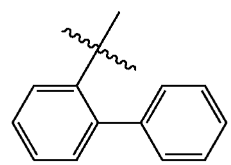 [SMILES: *c1ccccc1-c1ccccc1] |
| 32-5 | 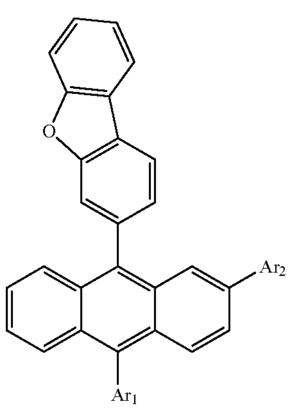 | 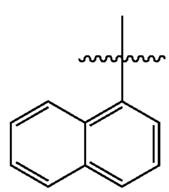 [SMILES: *c1cccc2ccccc12] | 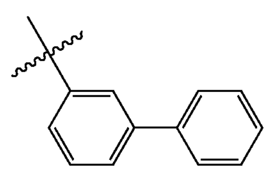 [SMILES: *c1cccc(-c2ccccc2)c1] |

-continued
| No. | | Ar1 | Ar2 |
|---|---|---|---|
| 32-6 | 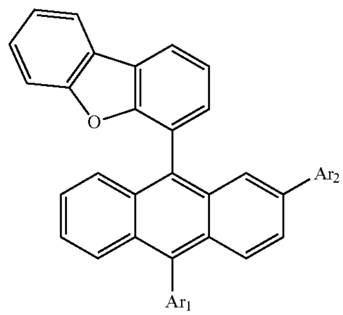 | 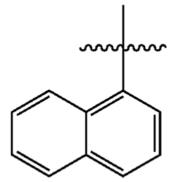 [SMILES: *c1cccc2ccccc12] | 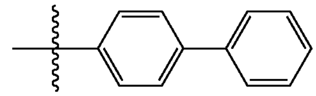 [SMILES: *c1ccc(-c2ccccc2)cc1] |
| 32-7 | 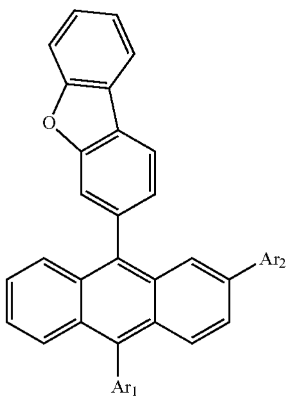 | 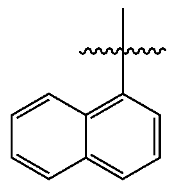 [SMILES: *c1cccc2ccccc12] | 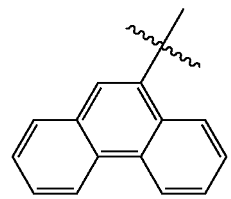 [SMILES: *c1cc2ccccc2c2ccccc12] |
| 32-9 | 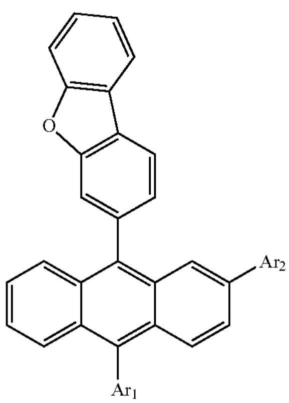 | 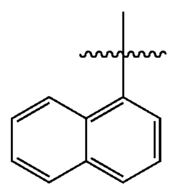 [SMILES: *c1cccc2ccccc12] | 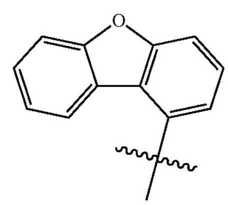 |
| 32-10 | 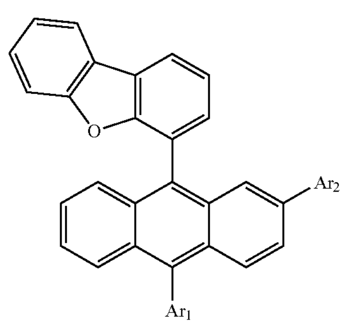 | 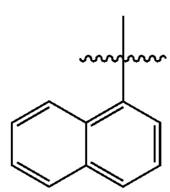 [SMILES: *c1cccc2ccccc12] | 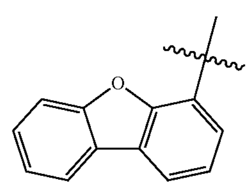 [SMILES: *c1cccc2c1oc1ccccc12] |

-continued
| No. | | Ar1 | Ar2 |
|---|---|---|---|
| 32-11 | 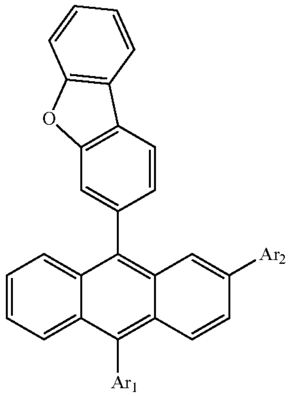 | 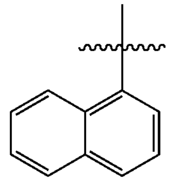 [SMILES: *c1cccc2ccccc12] | 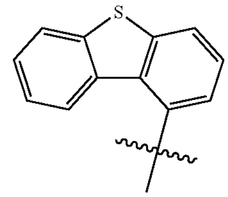 [SMILES: *c1cccc2sc3ccccc3c12] |
| 32-12 | 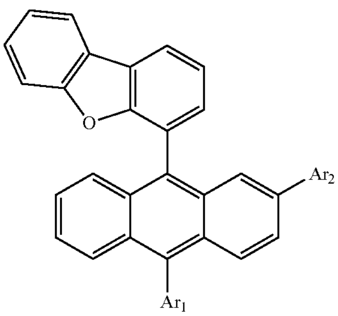 | 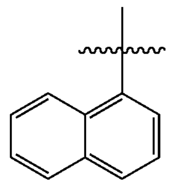 [SMILES: *c1cccc2ccccc12] | 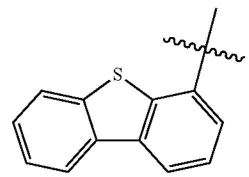 |
| 32-16 | 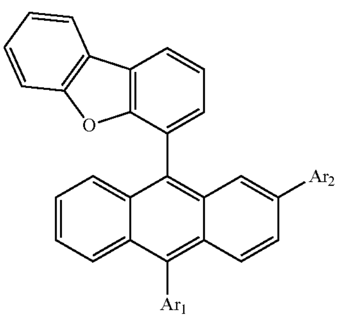 | 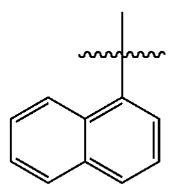 [SMILES: *c1cccc2ccccc12] | 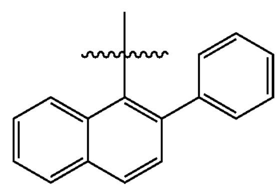 [SMILES: *c1c(-c2ccccc2)ccc2ccccc12] |
| 32-17 | 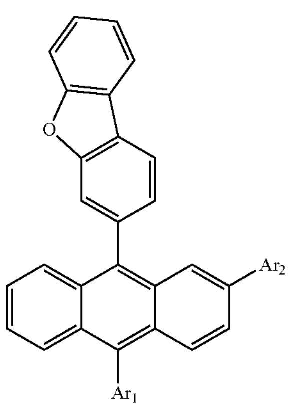 | 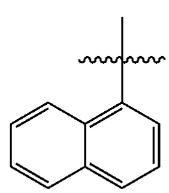 [SMILES: *c1cccc2ccccc12] | 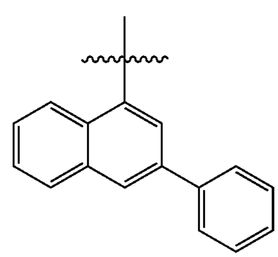 [SMILES: *c1cc(-c2ccccc2)cc2ccccc12] |

-continued
| No. | | Ar1 | Ar2 |
|---|---|---|---|
| 32-18 | 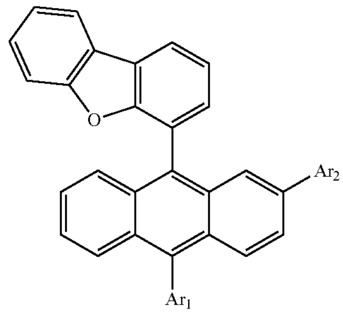 | 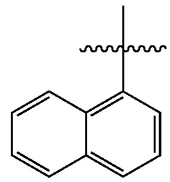 [SMILES: *c1cccc2ccccc12] | 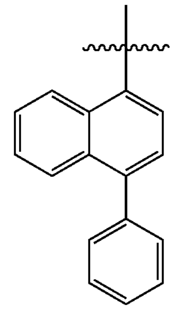 [SMILES: *c1ccc(-c2ccccc2)c2ccccc12] |
| 32-19 | 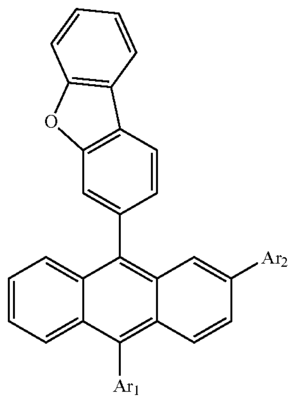 | 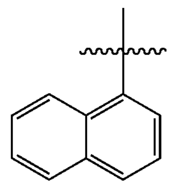 [SMILES: *c1cccc2ccccc12] | 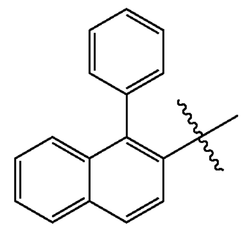 [SMILES: *c1ccc2ccccc2c1-c1ccccc1] |
| 32-20 | 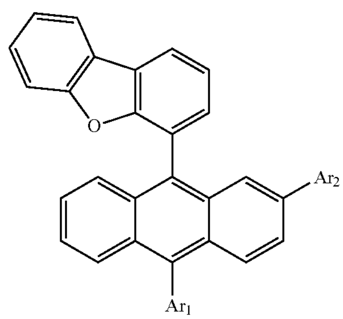 | 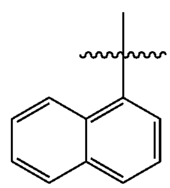 [SMILES: *c1cccc2ccccc12] | 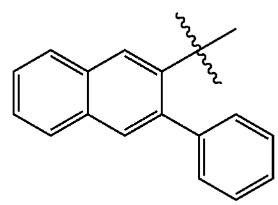 [SMILES: *c1cc2ccccc2cc1-c1ccccc1] |
| 32-21 | 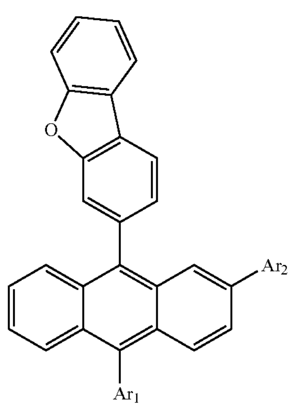 | 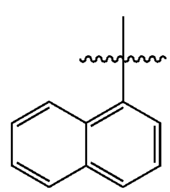 [SMILES: *c1cccc2ccccc12] | 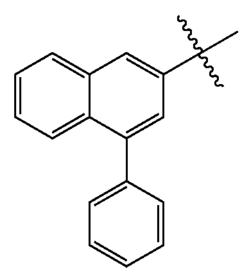 [SMILES: *c1cc(-c2ccccc2)c2ccccc2c1] |

-continued
| No. | | Ar1 | Ar2 |
|---|---|---|---|
| 32-22 | 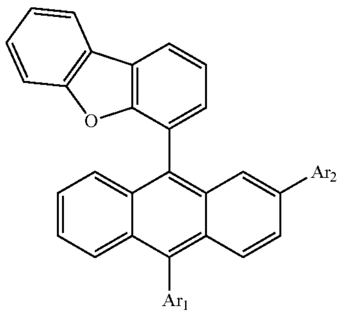 | 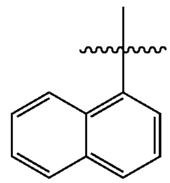 [SMILES: *c1cccc2ccccc12] | 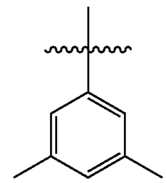 |
| 32-23 | 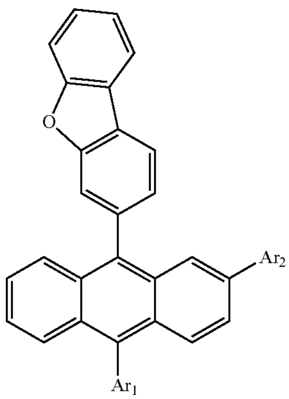 | 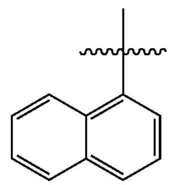 [SMILES: *c1cccc2ccccc12] | 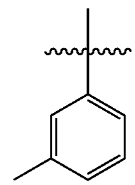 [SMILES: *c1cccc(C)c1] |
| 32-24 | 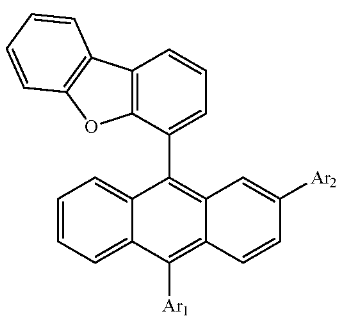 | 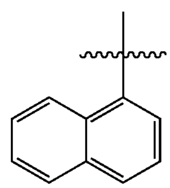 [SMILES: *c1cccc2ccccc12] | 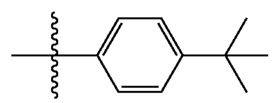 |
| 32-25 | 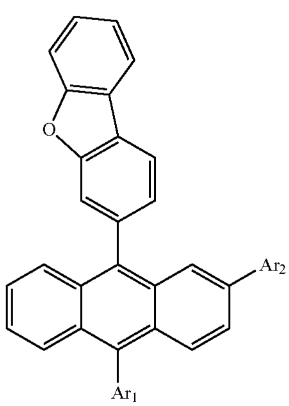 | 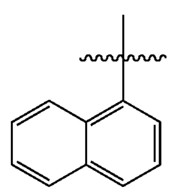 [SMILES: *c1cccc2ccccc12] | 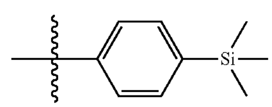 [SMILES: *c1ccc([Si](C)(C)C)cc1] |

-continued
| No. | | Ar1 | Ar2 |
|---|---|---|---|
| 32-26 | 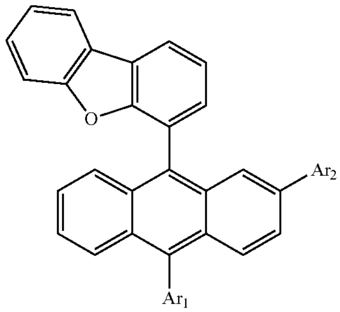 | 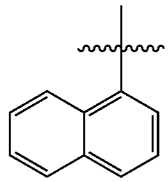 [SMILES: *c1cccc2ccccc12] | 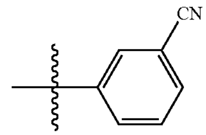 [SMILES: *c1cccc(C#N)c1] |
| 32-27 | 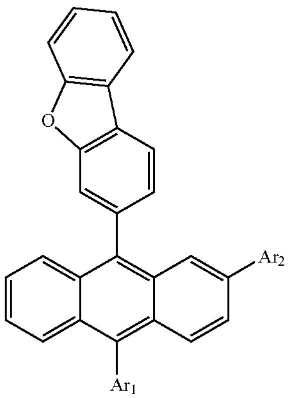 | 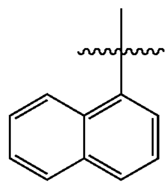 [SMILES: *c1cccc2ccccc12] | 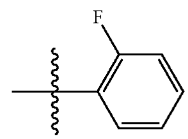 [SMILES: *c1ccccc1F] |
| 32-28 | 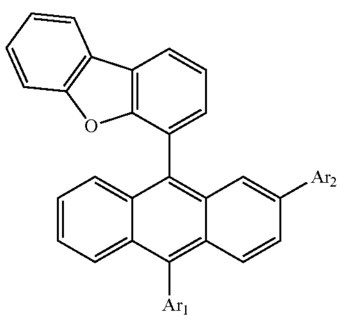 | 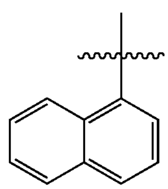 [SMILES: *c1cccc2ccccc12] | 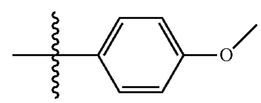 [SMILES: *c1ccc(OC)cc1] |
| 33-1 | 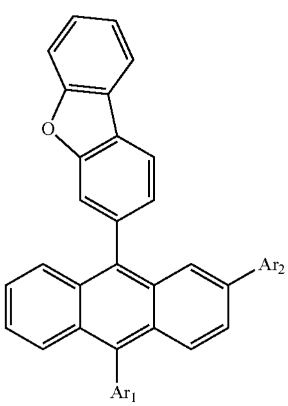 | 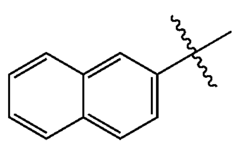 [SMILES: *c1ccc2ccccc2c1] | 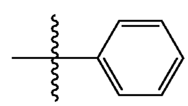 |

-continued
| No. | | Ar1 | Ar2 |
|---|---|---|---|
| 33-2 | 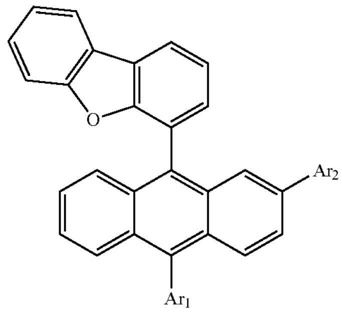 | 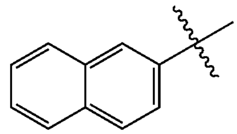 [SMILES: *c1ccc2ccccc2c1] | 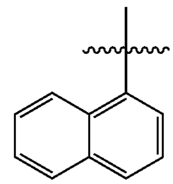 [SMILES: *c1cccc2ccccc12] |
| 33-3 | 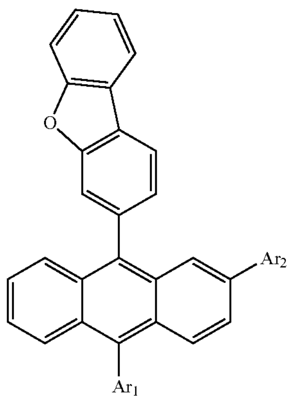 | 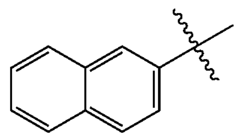 [SMILES: *c1ccc2ccccc2c1] | 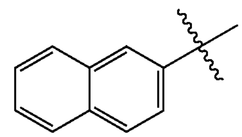 [SMILES: *c1ccc2ccccc2c1] |
| 33-4 | 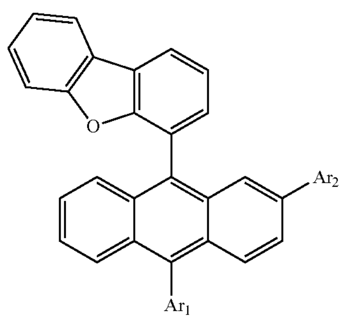 | 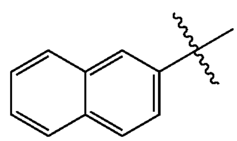 [SMILES: *c1ccc2ccccc2c1] | 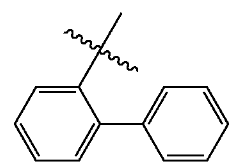 [SMILES: *c1ccccc1-c1ccccc1] |
| 33-5 | 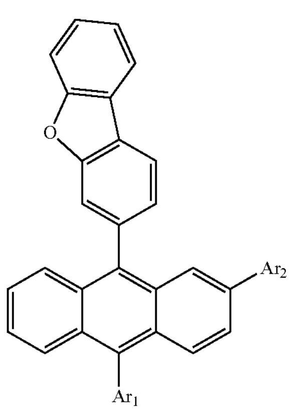 | 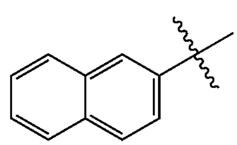 [SMILES: *c1ccc2ccccc2c1] | 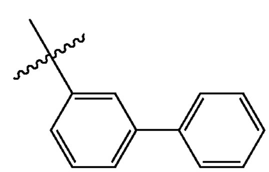 [SMILES: *c1cccc(-c2ccccc2)c1] |

-continued
| No. | | Ar1 | Ar2 |
|---|---|---|---|
| 33-6 | 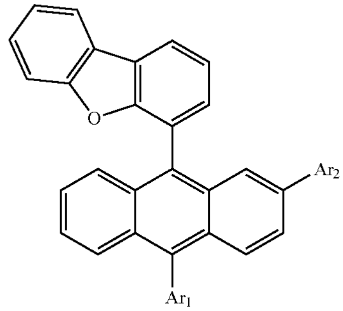  | 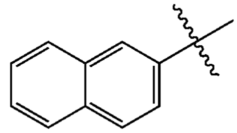 [SMILES: *c1ccc2ccccc2c1] | 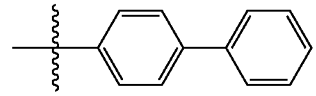 [SMILES: *c1ccc(-c2ccccc2)cc1] |
| 33-7 | 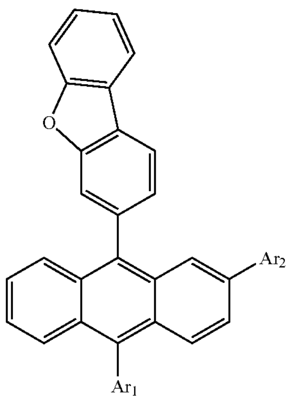  | 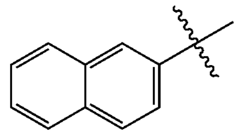 [SMILES: *c1ccc2ccccc2c1] | 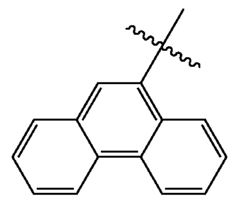 [SMILES: *c1cc2ccccc2c2ccccc12] |
| 33-9 | 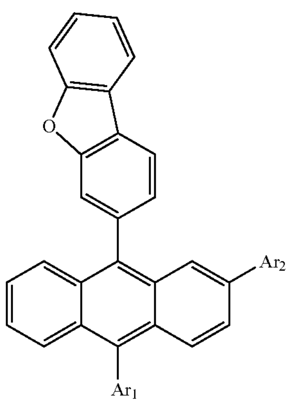  | 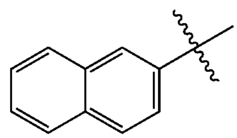 [SMILES: *c1ccc2ccccc2c1] | 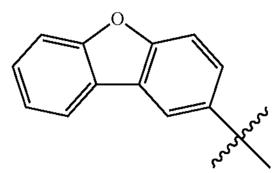  |
| 33-10 | 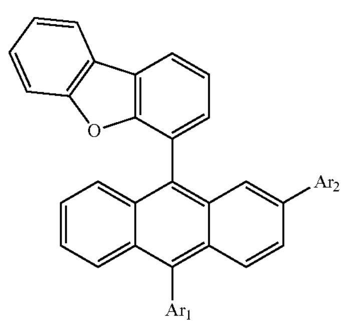  | 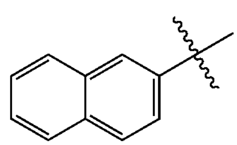 [SMILES: *c1ccc2ccccc2c1] | 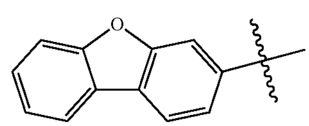  |

-continued
| No. | | Ar1 | Ar2 |
|---|---|---|---|
| 33-11 | 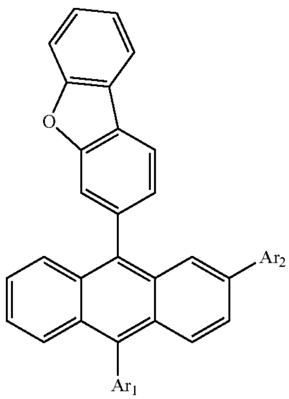 | 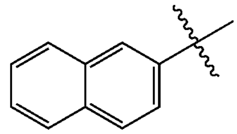 [SMILES: *c1ccc2ccccc2c1] | 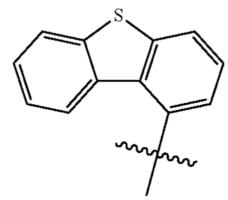 [SMILES: *c1cccc2sc3ccccc3c12] |
| 33-12 | 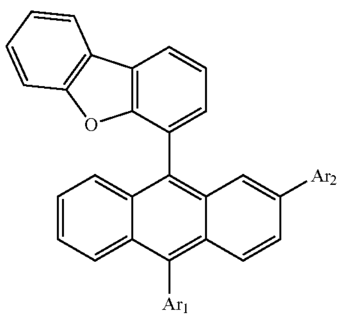 | 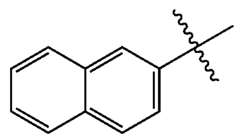 [SMILES: *c1ccc2ccccc2c1] | 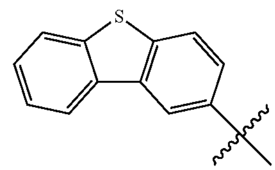 |
| 33-13 | 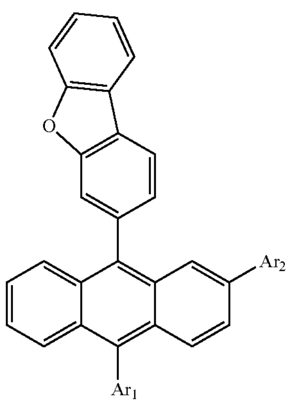 | 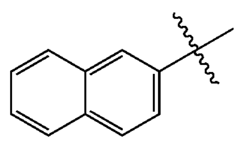 [SMILES: *c1ccc2ccccc2c1] | 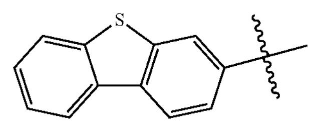 [SMILES: *c1ccc2c(c1)sc1ccccc12] |
| 33-17 | 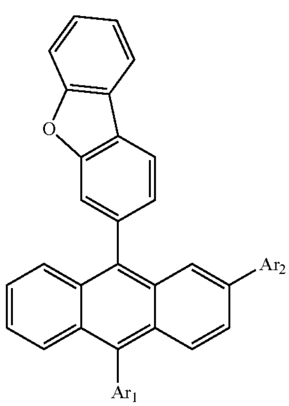 | 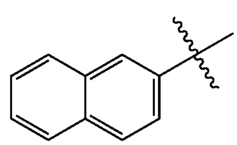 [SMILES: *c1ccc2ccccc2c1] | 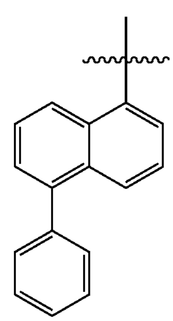 [SMILES: *c1cccc2c(-c3ccccc3)cccc12] |

-continued
| No. | | Ar1 | Ar2 |
|---|---|---|---|
| 33-18 | 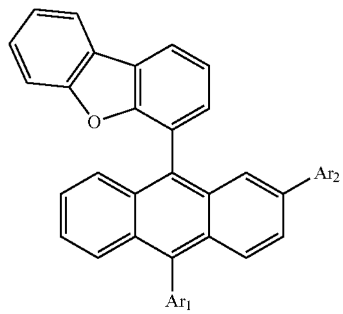 | 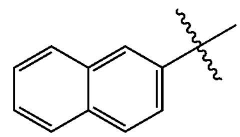 [SMILES: *c1ccc2ccccc2c1] | 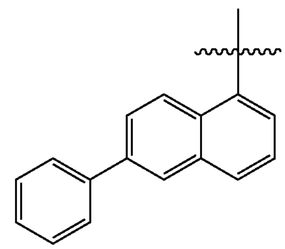 [SMILES: *c1cccc2cc(-c3ccccc3)ccc12] |
| 33-19 | 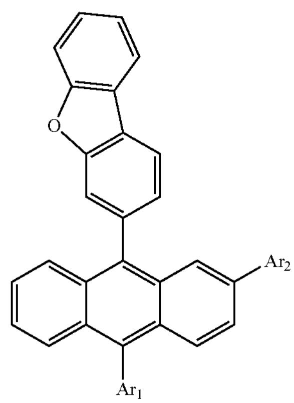 | 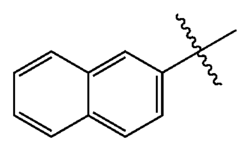 [SMILES: *c1ccc2ccccc2c1] | 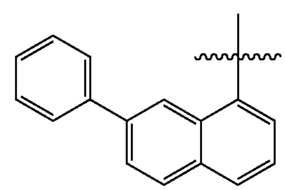 [SMILES: *c1cccc2ccc(-c3ccccc3)cc12] |
| 33-20 | 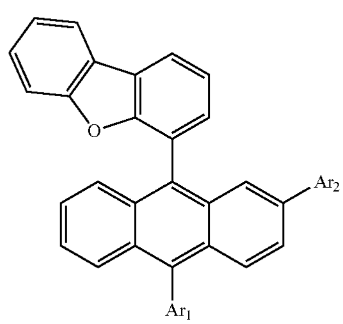 | 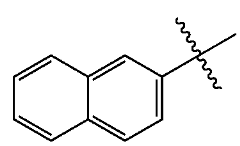 [SMILES: *c1ccc2ccccc2c1] | 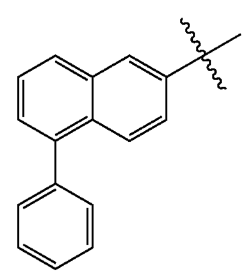 [SMILES: *c1ccc2c(-c3ccccc3)cccc2c1] |
| 33-21 | 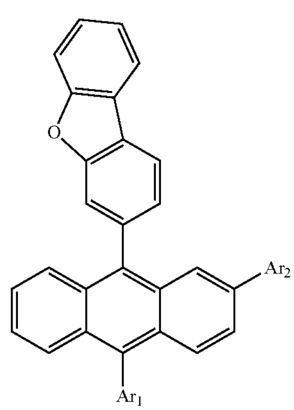 | 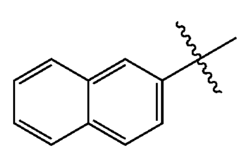 [SMILES: *c1ccc2ccccc2c1] | 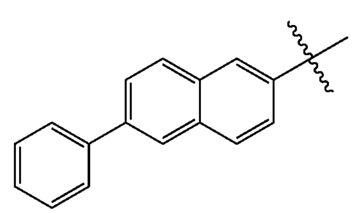 [SMILES: *c1ccc2cc(-c3ccccc3)ccc2c1] |

-continued
| No. | | Ar1 | Ar2 |
|---|---|---|---|
| 33-22 | 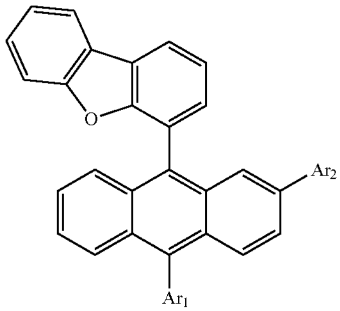 | 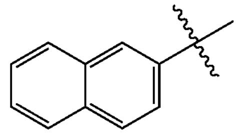 [SMILES: *c1ccc2ccccc2c1] | 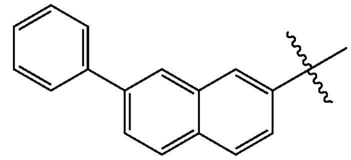 [SMILES: *c1ccc2ccc(-c3ccccc3)cc2c1] |
| 33-23 | 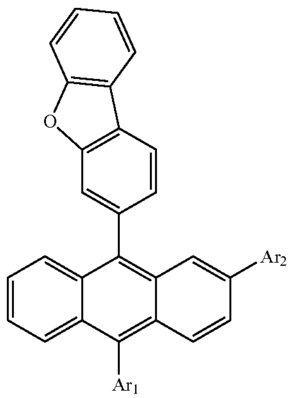 | 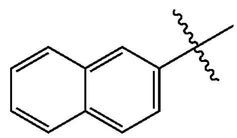 [SMILES: *c1ccc2ccccc2c1] | 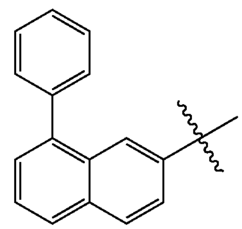 [SMILES: *c1ccc2cccc(-c3ccccc3)c2c1] |
| 33-24 | 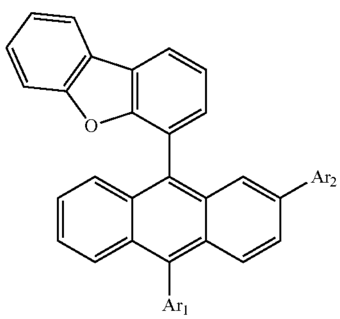 | 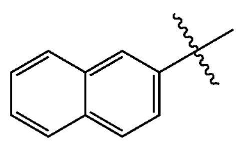 [SMILES: *c1ccc2ccccc2c1] | 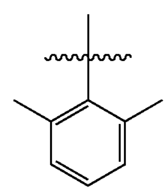 |
| 33-25 | 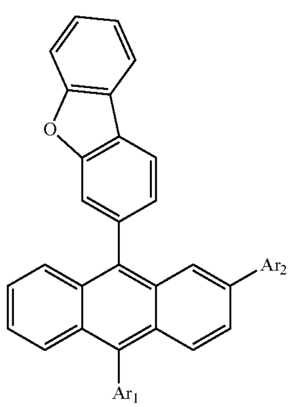 | 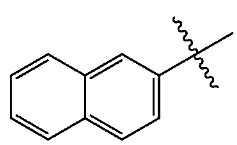 [SMILES: *c1ccc2ccccc2c1] | 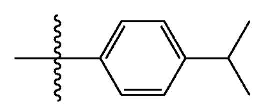 [SMILES: *c1ccc(C(C)C)cc1] |

-continued
| No. | | Ar1 | Ar2 |
|---|---|---|---|
| 33-26 | 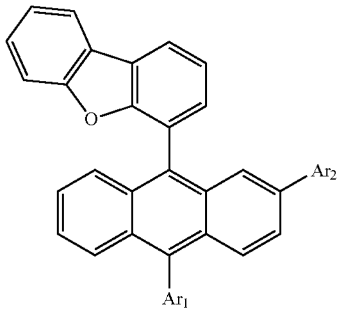 | 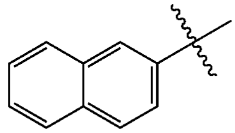 [SMILES: *c1ccc2ccccc2c1] | 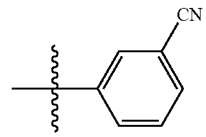 [SMILES: *c1cccc(C#N)c1] |
| 33-27 | 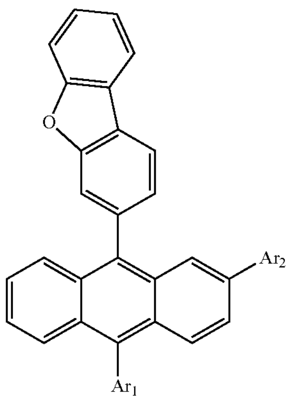 | 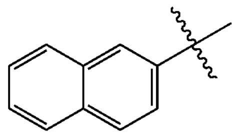 [SMILES: *c1ccc2ccccc2c1] | 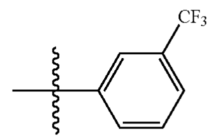 [SMILES: *c1cccc(C(F)(F)F)c1] |
| 33-28 | 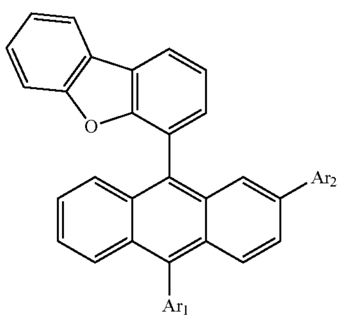 | 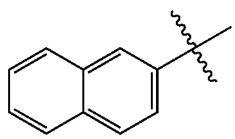 [SMILES: *c1ccc2ccccc2c1] | 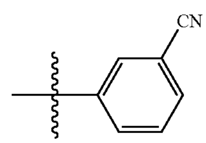 [SMILES: *c1cccc(C#N)c1] |
| 33-29 | 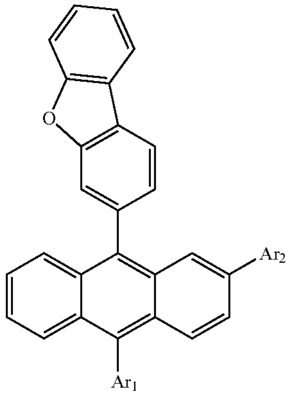 | 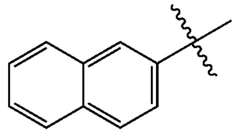 [SMILES: *c1ccc2ccccc2c1] | 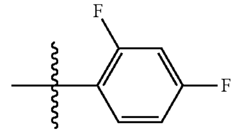 [SMILES: *c1ccc(F)cc1F] |

-continued
| No. | | Ar1 | Ar2 |
|---|---|---|---|
| 34-1 | 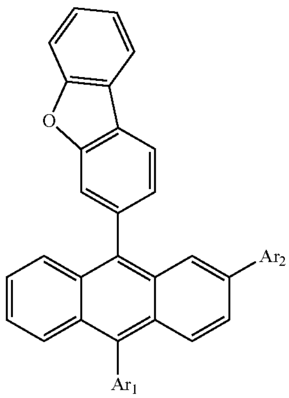 | 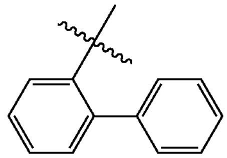 [SMILES: *c1ccccc1-c1ccccc1] | 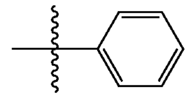 |
| 34-2 | 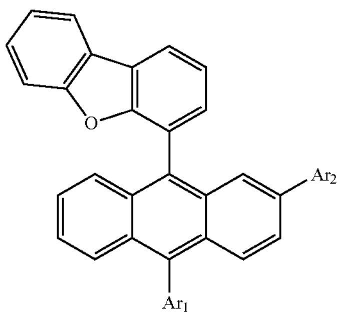 | 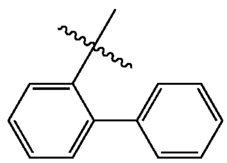 [SMILES: *c1ccccc1-c1ccccc1] | 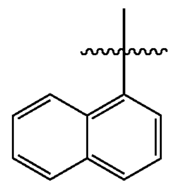 [SMILES: *c1cccc2ccccc12] |
| 34-3 | 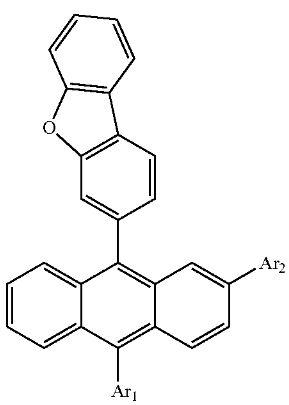 | 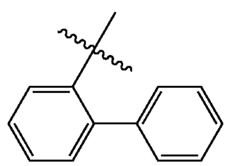 [SMILES: *c1ccccc1-c1ccccc1] | 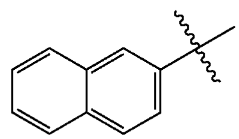 [SMILES: *c1ccc2ccccc2c1] |
| 34-4 | 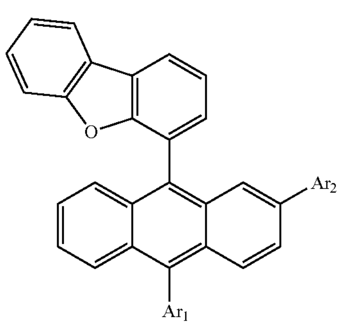 | 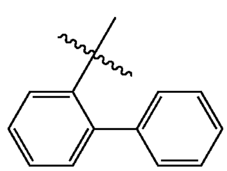 [SMILES: *c1ccccc1-c1ccccc1] | 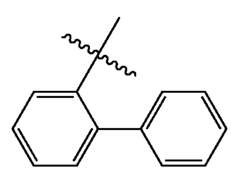 [SMILES: *c1ccccc1-c1ccccc1] |

-continued
| No. | | Ar1 | Ar2 |
|---|---|---|---|
| 34-5 | 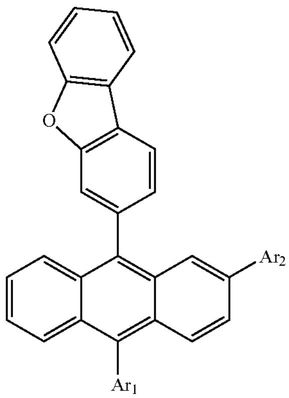 | 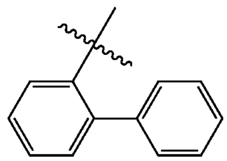 [SMILES: *c1ccccc1-c1ccccc1] | 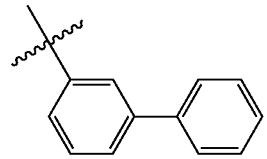 [SMILES: *c1cccc(-c2ccccc2)c1] |
| 34-6 | 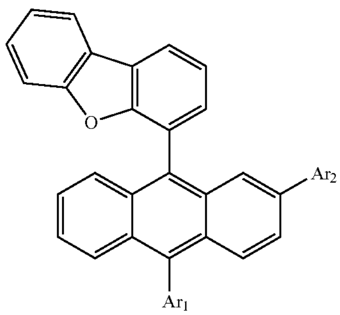 | 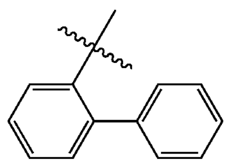 [SMILES: *c1ccccc1-c1ccccc1] | 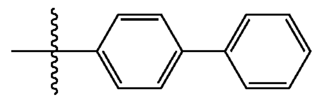 [SMILES: *c1ccc(-c2ccccc2)cc1] |
| 34-7 | 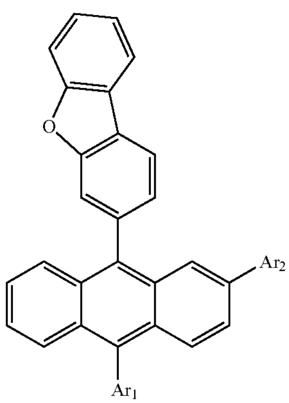 | 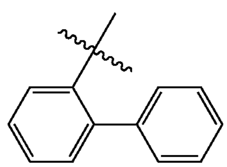 [SMILES: *c1ccccc1-c1ccccc1] | 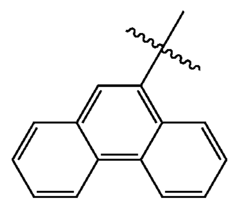 [SMILES: *c1cc2ccccc2c2ccccc12] |
| 34-9 | 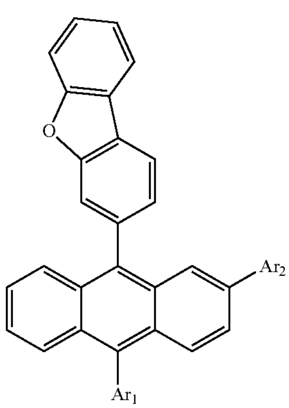 | 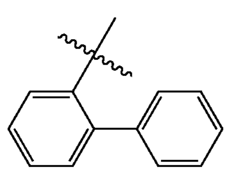 [SMILES: *c1ccccc1-c1ccccc1] | 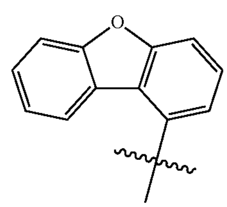 [SMILES: *c1cccc2oc3ccccc3c12] |

-continued
| No. | | Ar1 | Ar2 |
|---|---|---|---|
| 34-10 | 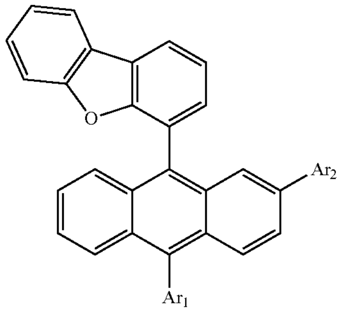 | 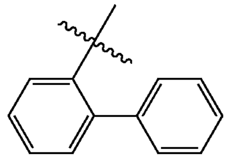 [SMILES: *c1ccccc1-c1ccccc1] | 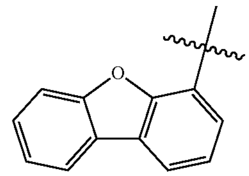 |
| 34-11 | 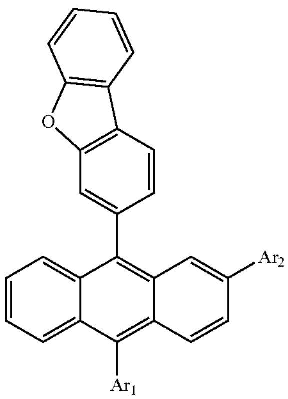 | 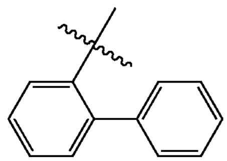 [SMILES: *c1ccccc1-c1ccccc1] | 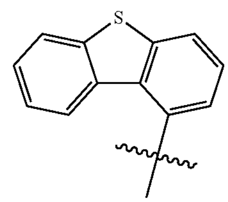 [SMILES: *c1cccc2sc3ccccc3c12] |
| 34-12 | 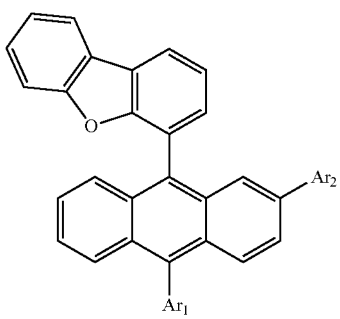 | 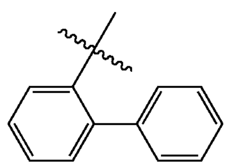 [SMILES: *c1ccccc1-c1ccccc1] | 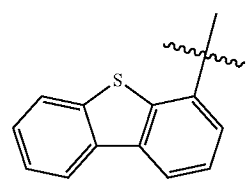 [SMILES: *c1cccc2c1sc1ccccc12] |
| 34-16 | 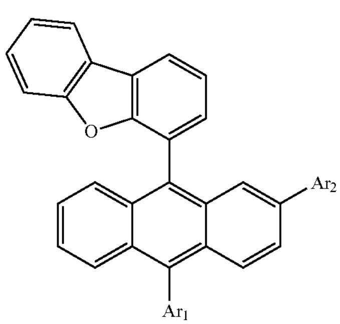 | 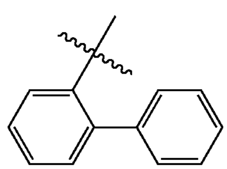 [SMILES: *c1ccccc1-c1ccccc1] | 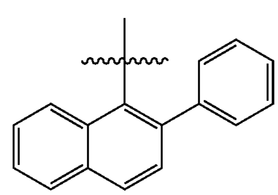 [SMILES: *c1c(-c2ccccc2)ccc2ccccc12] |

-continued
| No. | | Ar1 | Ar2 |
| --- | --- | --- | --- |
| 34-17 | 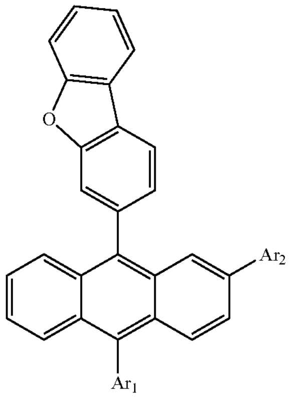 | 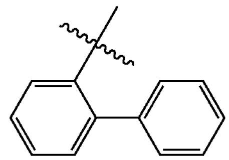 [SMILES: *c1ccccc1-c1ccccc1] | 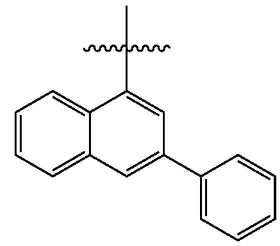 [SMILES: *c1cc(-c2ccccc2)cc2ccccc12] |
| 34-18 | 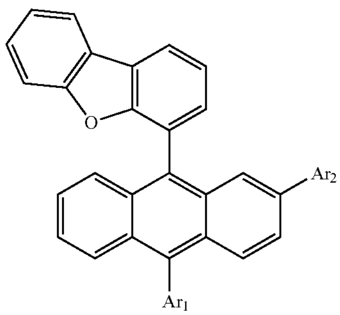 | 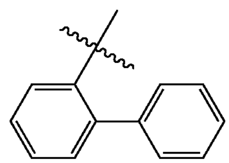 [SMILES: *c1ccccc1-c1ccccc1] | 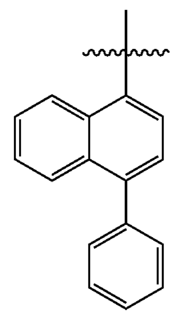 [SMILES: *c1ccc(-c2ccccc2)c2ccccc12] |
| 34-19 | 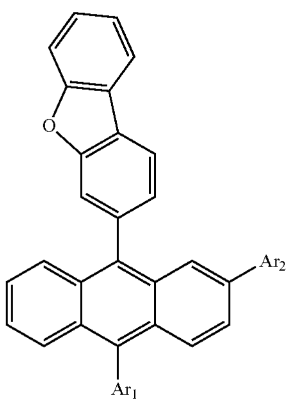 | 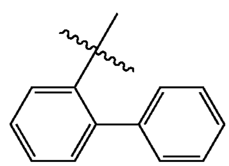 [SMILES: *c1ccccc1-c1ccccc1] | 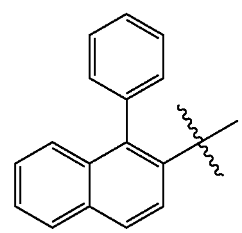 [SMILES: *c1ccc2ccccc2c1-c1ccccc1] |
| 34-20 | 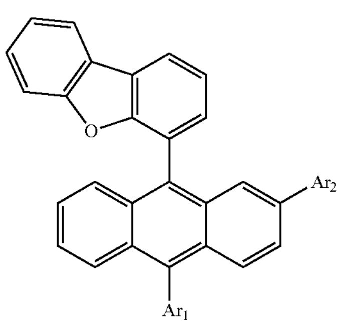 | 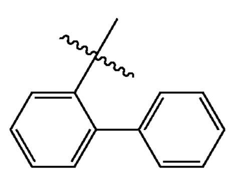 [SMILES: *c1ccccc1-c1ccccc1] | 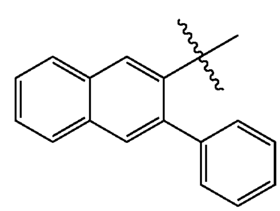 [SMILES: *c1cc2ccccc2cc1-c1ccccc1] |

-continued
| No. | | Ar1 | Ar2 |
|---|---|---|---|
| 34-21 | 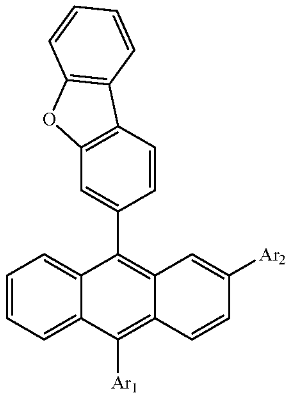 | 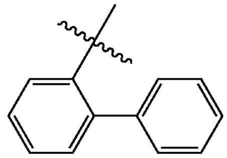 [SMILES: *c1ccccc1-c1ccccc1] | 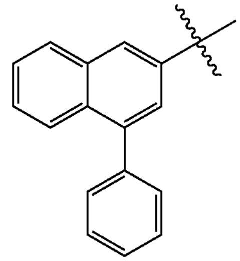 [SMILES: *c1cc(-c2ccccc2)c2ccccc2c1] |
| 34-22 | 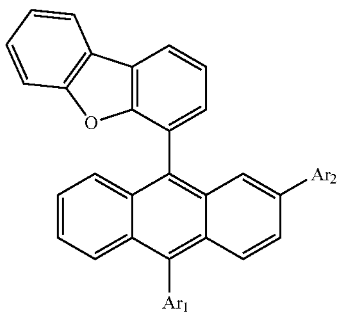 | 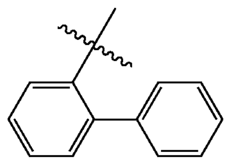 [SMILES: *c1ccccc1-c1ccccc1] | 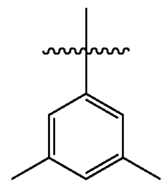 |
| 34-23 | 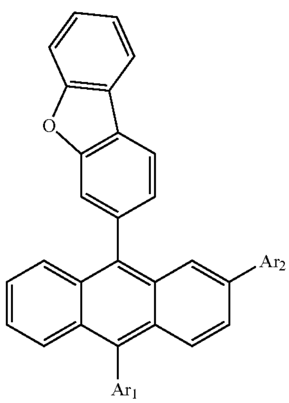 | 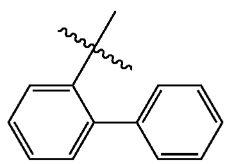 [SMILES: *c1ccccc1-c1ccccc1] | 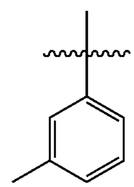 |
| 34-24 | 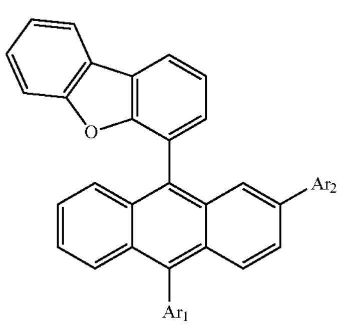 | 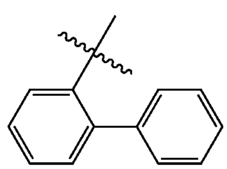 [SMILES: *c1ccccc1-c1ccccc1] | 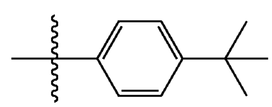 |

-continued
| No. | | Ar1 | Ar2 |
|---|---|---|---|
| 34-25 | 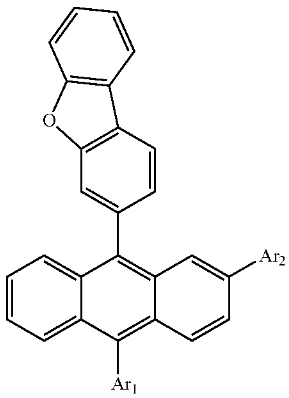 | 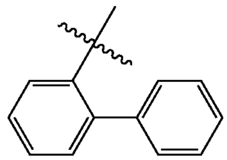 [SMILES: *c1ccccc1-c1ccccc1] | 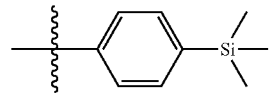 [SMILES: *c1ccc([Si](C)(C)C)cc1] |
| 34-26 | 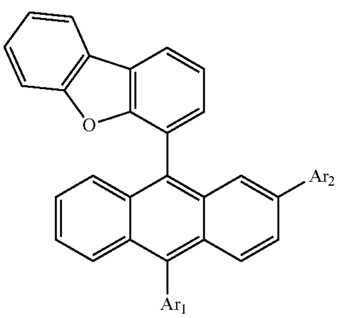 | 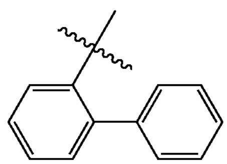 [SMILES: *c1ccccc1-c1ccccc1] | 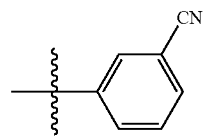 [SMILES: *c1cccc(C#N)c1] |
| 34-27 | 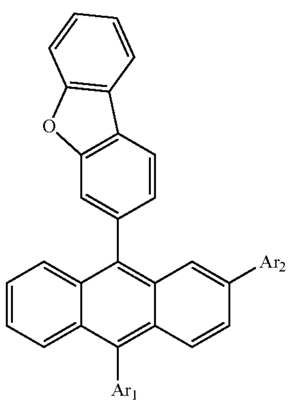 | 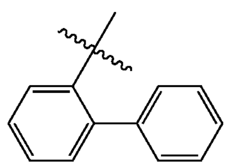 [SMILES: *c1ccccc1-c1ccccc1] | 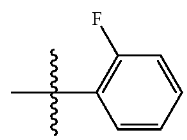 [SMILES: *c1ccccc1F] |
| 34-28 | 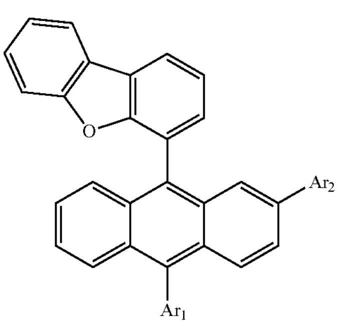 | 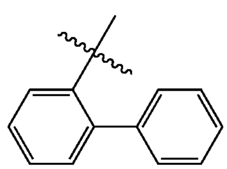 [SMILES: *c1ccccc1-c1ccccc1] | 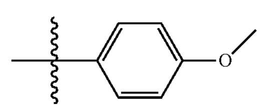 [SMILES: *c1ccc(OC)cc1] |

-continued
| No. | | Ar1 | Ar2 |
|---|---|---|---|
| 35-1 | 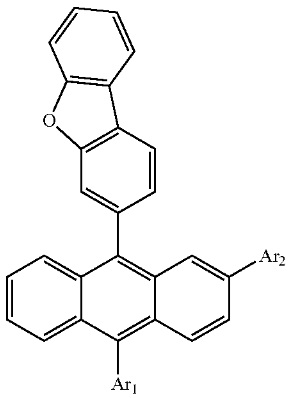 | 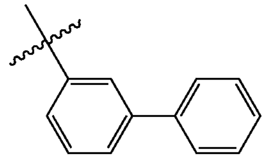 [SMILES: *c1cccc(-c2ccccc2)c1] | 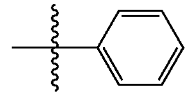 [SMILES: *c1ccccc1] |
| 35-2 | 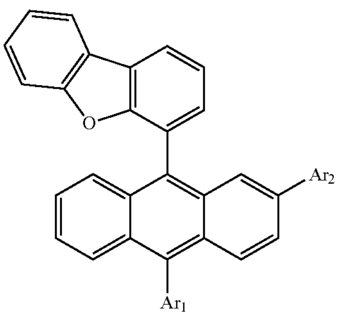 | 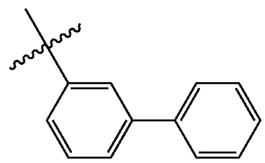 [SMILES: *c1cccc(-c2ccccc2)c1] | 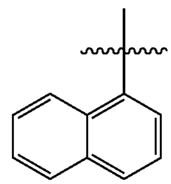 [SMILES: *c1cccc2ccccc12] |
| 35-3 | 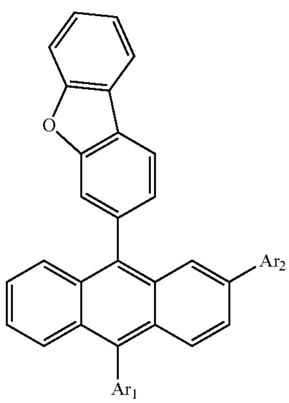 | 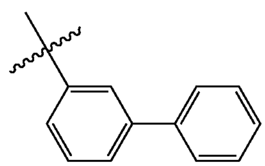 [SMILES: *c1cccc(-c2ccccc2)c1] | 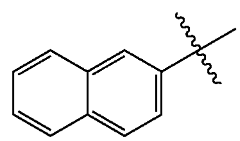 [SMILES: *c1ccc2ccccc2c1] |
| 35-4 | 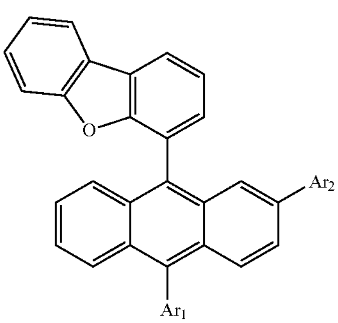 | 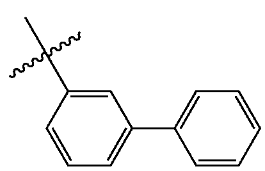 [SMILES: *c1cccc(-c2ccccc2)c1] | 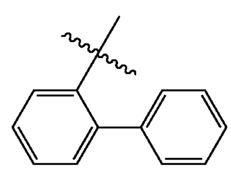 [SMILES: *c1ccccc1-c1ccccc1] |

-continued
| No. | | Ar1 | Ar2 |
| --- | --- | --- | --- |
| 35-5 | 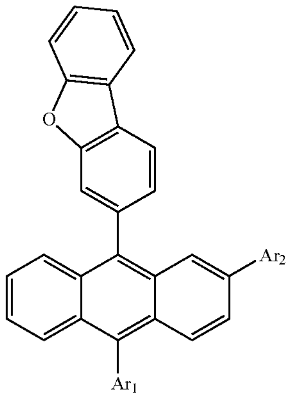 | 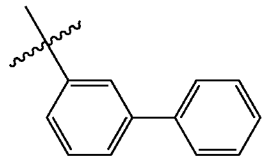 [SMILES: *c1cccc(-c2ccccc2)c1] | 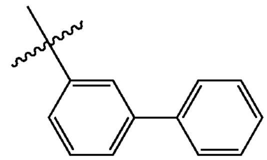 [SMILES: *c1cccc(-c2ccccc2)c1] |
| 35-6 | 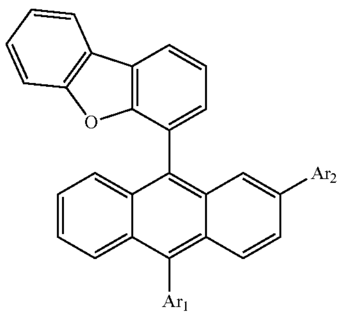 | 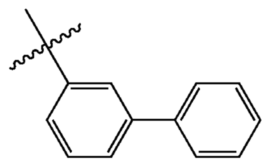 [SMILES: *c1cccc(-c2ccccc2)c1] | 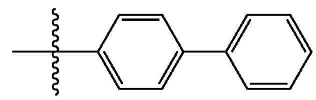 |
| 35-7 | 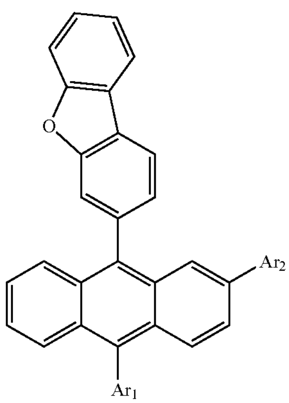 | 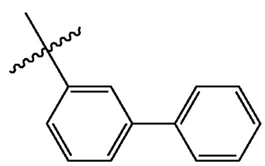 [SMILES: *c1cccc(-c2ccccc2)c1] | 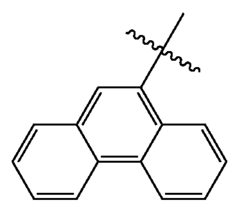 [SMILES: *c1cc2ccccc2c2ccccc12] |
| 35-9 | 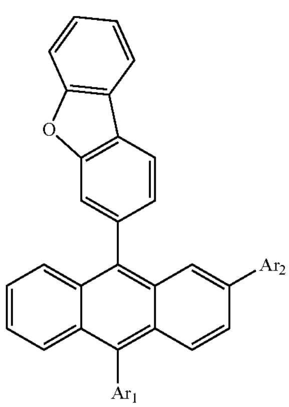 | 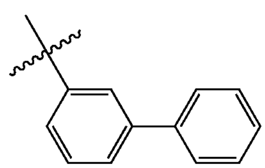 [SMILES: *c1cccc(-c2ccccc2)c1] | 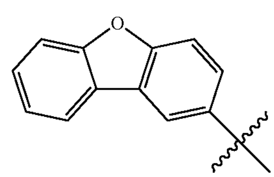 |

-continued
| No. | | Ar1 | Ar2 |
|---|---|---|---|
| 35-10 | 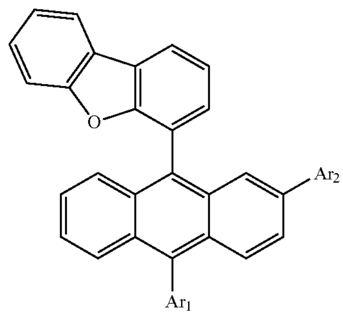 | 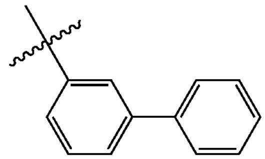 [SMILES: *c1cccc(-c2ccccc2)c1] | 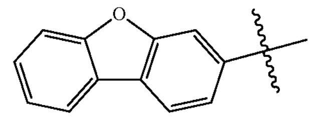 |
| 35-11 | 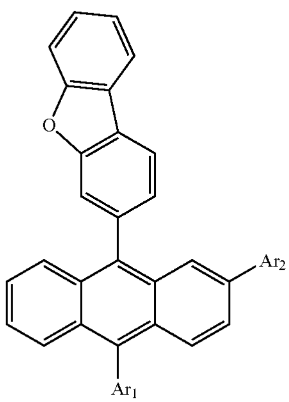 | 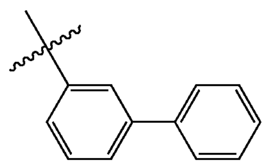 [SMILES: *c1cccc(-c2ccccc2)c1] | 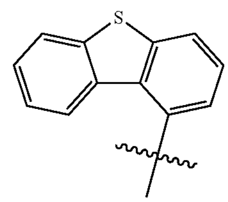 [SMILES: *c1cccc2sc3ccccc3c12] |
| 35-12 | 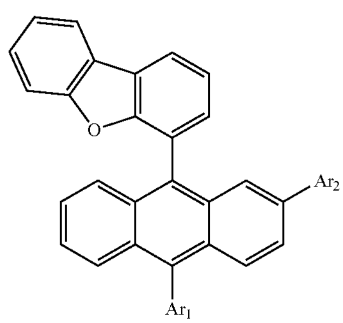 | 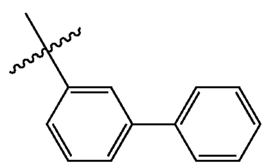 [SMILES: *c1cccc(-c2ccccc2)c1] | 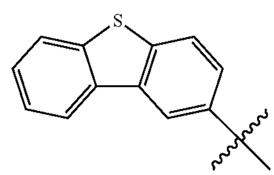 [SMILES: *c1ccc2sc3ccccc3c2c1] |
| 35-13 | 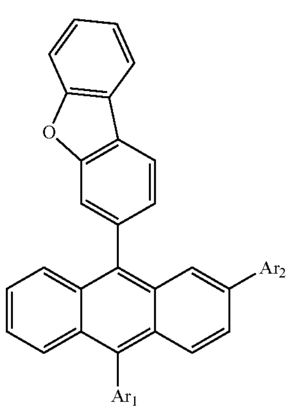 | 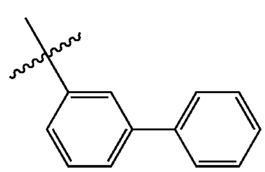 [SMILES: *c1cccc(-c2ccccc2)c1] | 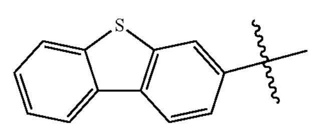 [SMILES: *c1ccc2c(c1)sc1ccccc12] |

-continued
| No. | | Ar1 | Ar2 |
|---|---|---|---|
| 35-17 | 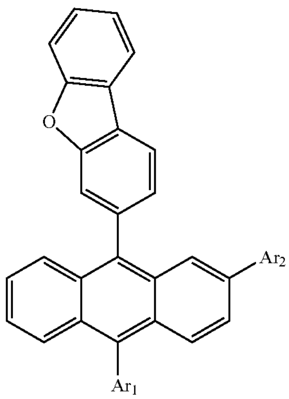 | 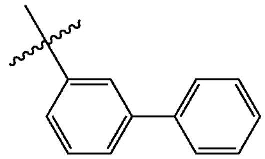 [SMILES: *c1cccc(-c2ccccc2)c1] | 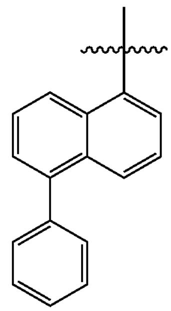 [SMILES: *c1cccc2c(-c3ccccc3)cccc12] |
| 35-18 | 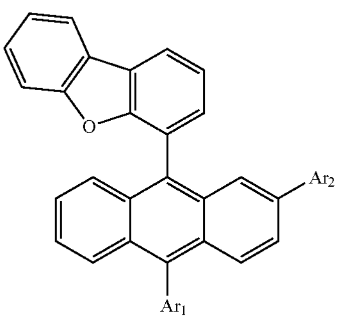 | 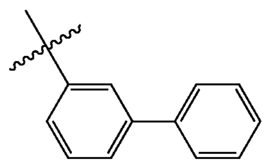 [SMILES: *c1cccc(-c2ccccc2)c1] | 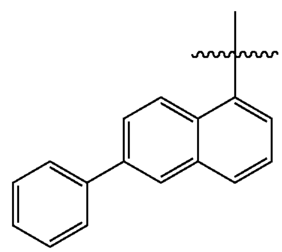 [SMILES: *c1cccc2cc(-c3ccccc3)ccc12] |
| 35-19 | 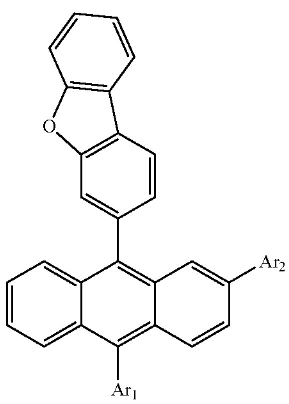 | 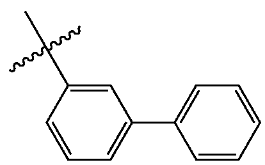 [SMILES: *c1cccc(-c2ccccc2)c1] | 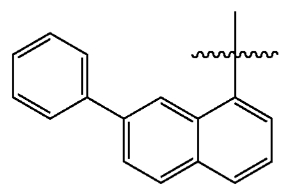 [SMILES: *c1cccc2ccc(-c3ccccc3)cc12] |
| 35-20 | 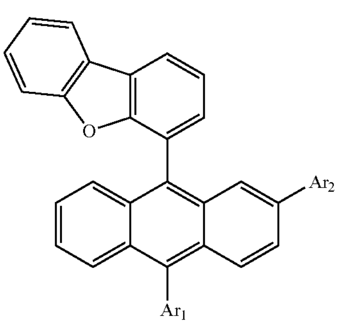 | 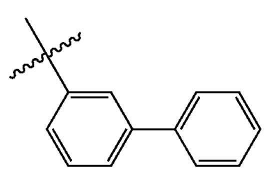 [SMILES: *c1cccc(-c2ccccc2)c1] | 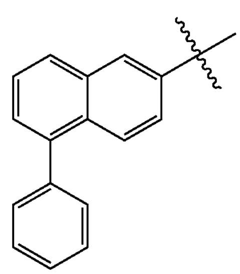 [SMILES: *c1ccc2c(-c3ccccc3)cccc2c1] |

-continued
| No. | | Ar1 | Ar2 |
|---|---|---|---|
| 35-21 | 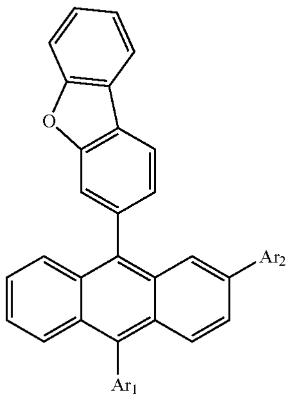 | 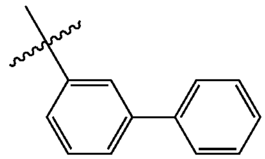 [SMILES: *c1cccc(-c2ccccc2)c1] | 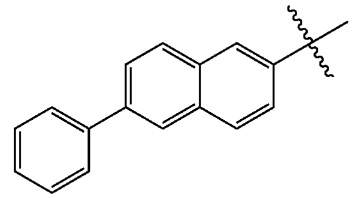 [SMILES: *c1ccc2cc(-c3ccccc3)ccc2c1] |
| 35-22 | 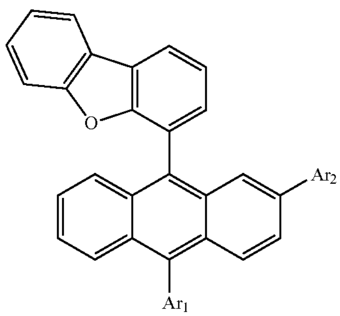 | 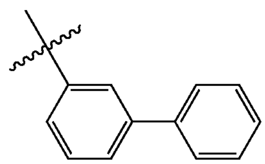 [SMILES: *c1cccc(-c2ccccc2)c1] | 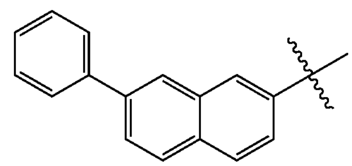 [SMILES: *c1ccc2ccc(-c3ccccc3)cc2c1] |
| 35-23 | 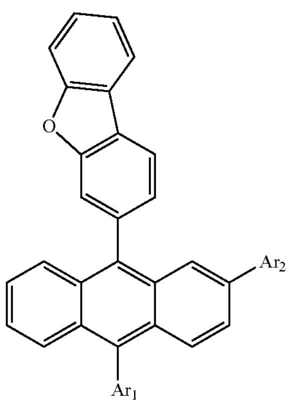 | 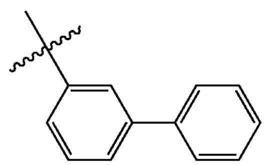 [SMILES: *c1cccc(-c2ccccc2)c1] | 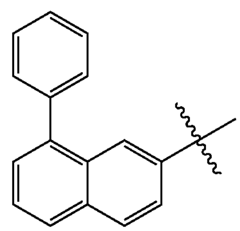 [SMILES: *c1ccc2cccc(-c3ccccc3)c2c1] |
| 35-24 | 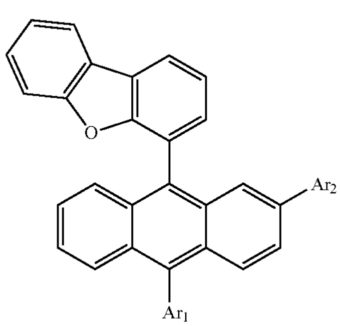 | 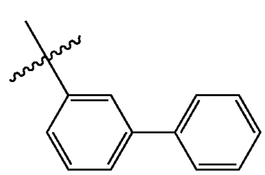 [SMILES: *c1cccc(-c2ccccc2)c1] | 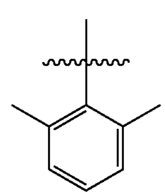 |

-continued
| No. | | Ar1 | Ar2 |
|---|---|---|---|
| 35-25 | 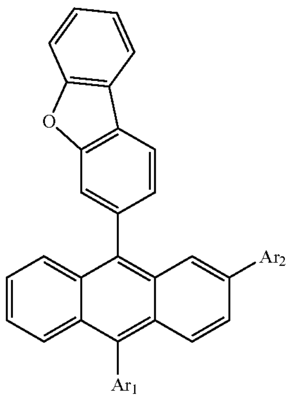 | 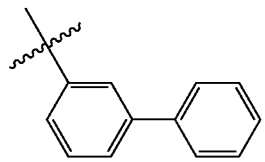 [SMILES: *c1cccc(-c2ccccc2)c1] | 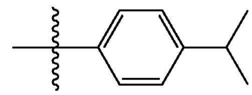 [SMILES: *c1ccc(C(C)C)cc1] |
| 35-26 | 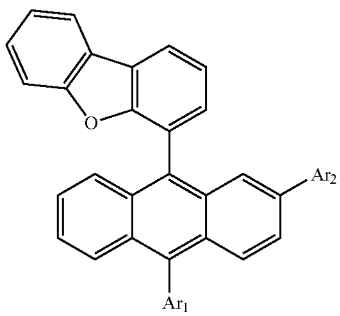 | 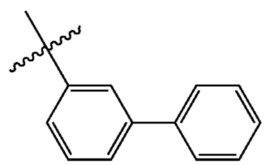 [SMILES: *c1cccc(-c2ccccc2)c1] | 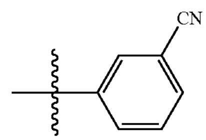 [SMILES: *c1cccc(C#N)c1] |
| 35-27 | 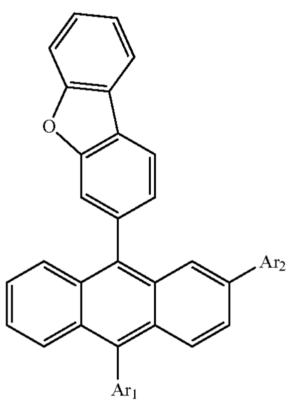 | 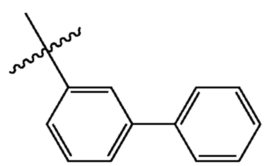 [SMILES: *c1cccc(-c2ccccc2)c1] | 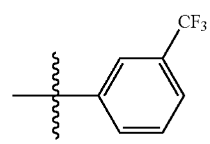 [SMILES: *c1cccc(C(F)(F)F)c1] |
| 35-28 | 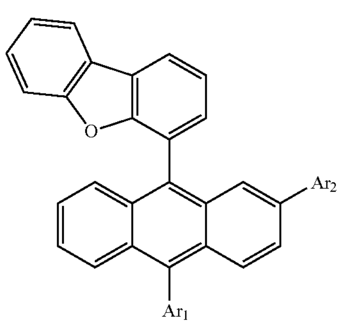 | 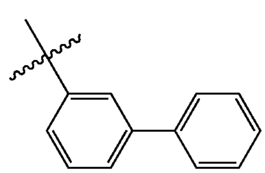 [SMILES: *c1cccc(-c2ccccc2)c1] | 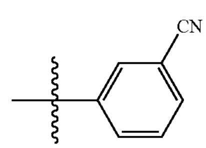 [SMILES: *c1cccc(C#N)c1] |

-continued
| No. | | Ar1 | Ar2 |
|---|---|---|---|
| 35-29 | 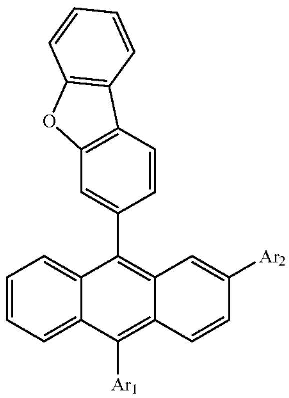 | 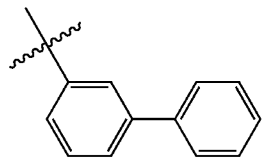 [SMILES: *c1cccc(-c2ccccc2)c1] | 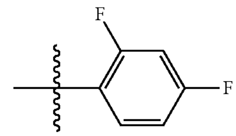 [SMILES: *c1ccc(F)cc1F] |
| 36-1 | 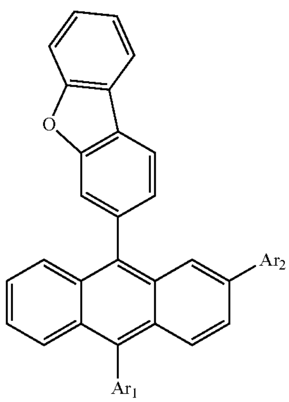 | 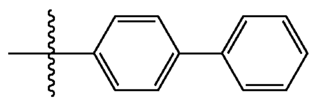 [SMILES: *c1ccc(-c2ccccc2)cc1] | 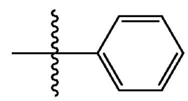 [SMILES: *c1ccccc1] |
| 36-2 | 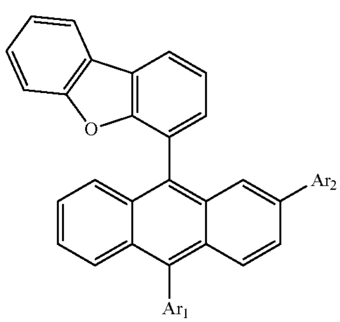 | 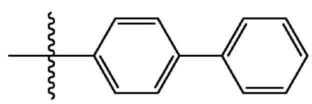 | 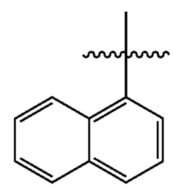 [SMILES: *c1cccc2ccccc12] |
| 36-3 | 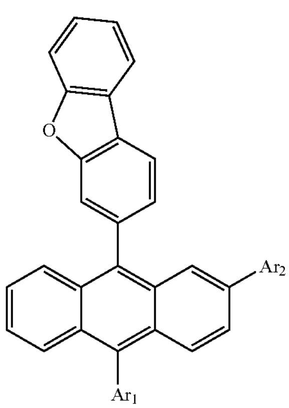 | 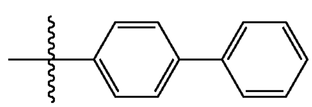 [SMILES: *c1ccc(-c2ccccc2)cc1] | 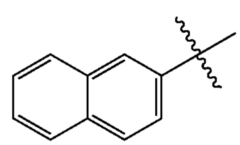 [SMILES: *c1ccc2ccccc2c1] |

-continued
| No. | | Ar1 | Ar2 |
|---|---|---|---|
| 36-4 | 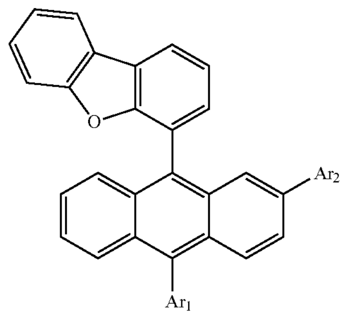 | 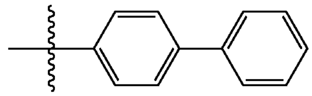 [SMILES: *c1ccc(-c2ccccc2)cc1] | 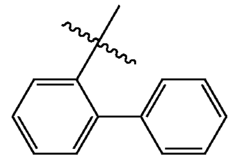 [SMILES: *c1ccccc1-c1ccccc1] |
| 36-5 | 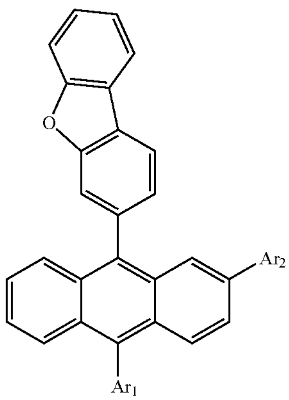 | 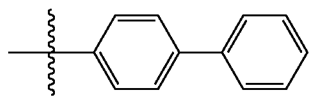 | 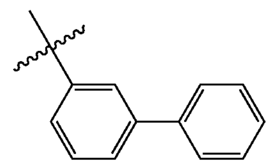 [SMILES: *c1cccc(-c2ccccc2)c1] |
| 36-6 | 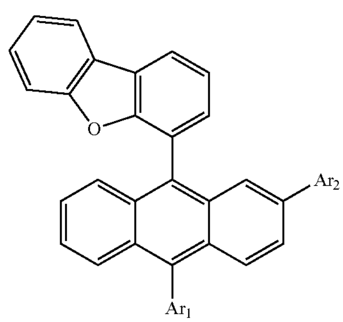 | 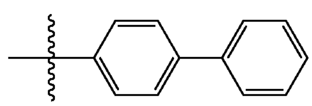 [SMILES: *c1ccc(-c2ccccc2)cc1] | 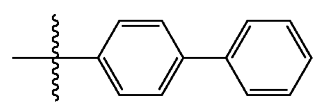 [SMILES: *c1ccc(-c2ccccc2)cc1] |
| 36-7 | 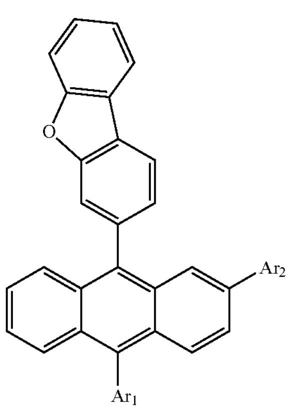 | 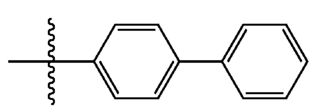 [SMILES: *c1ccc(-c2ccccc2)cc1] | 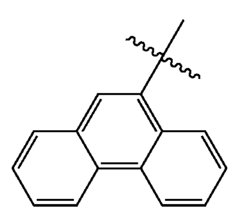 [SMILES: *c1cc2ccccc2c2ccccc12] |

-continued
| No. | | Ar1 | Ar2 |
|---|---|---|---|
| 36-9 | 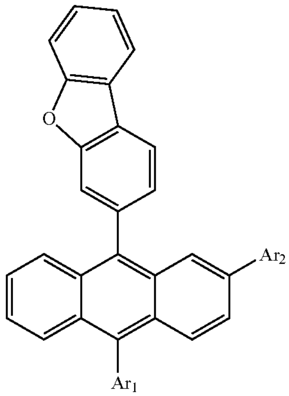  | 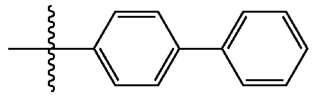 [SMILES: *c1ccc(-c2ccccc2)cc1] | 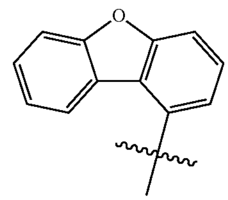 [SMILES: *c1cccc2oc3ccccc3c12]  |
| 36-10 | 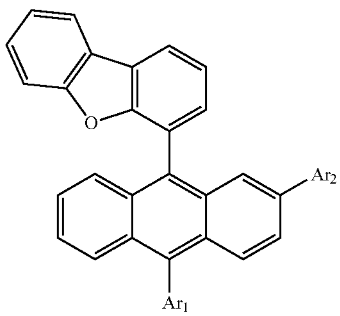  | 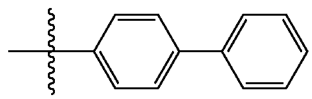 [SMILES: *c1ccc(-c2ccccc2)cc1] | 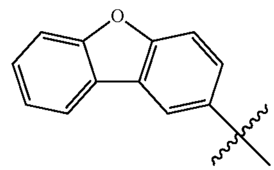  |
| 36-11 | 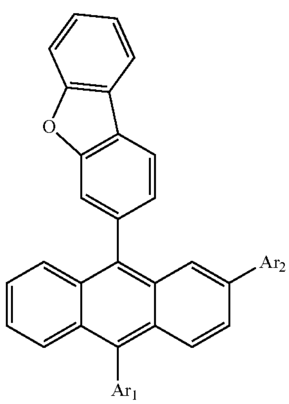  | 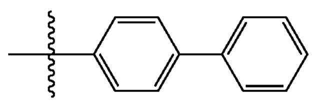 | 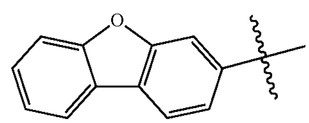  |
| 36-12 | 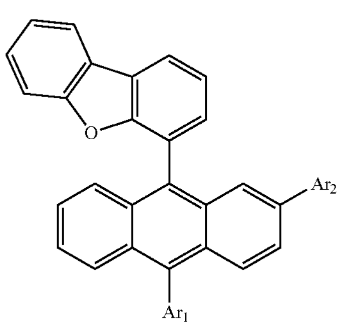  | 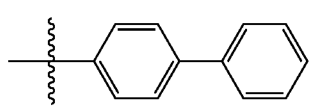 [SMILES: *c1ccc(-c2ccccc2)cc1] | 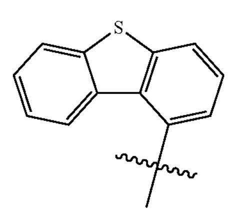 [SMILES: *c1cccc2sc3ccccc3c12]  |

-continued
| No. | | Ar1 | Ar2 |
|---|---|---|---|
| 36-13 | 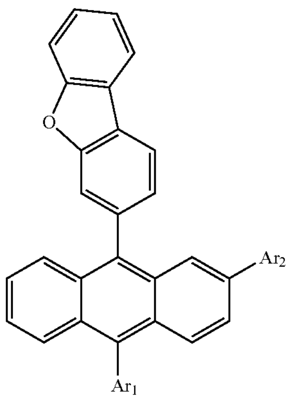 | 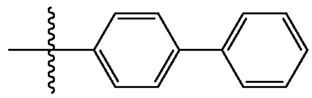 | 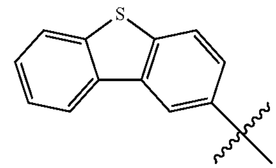 |
| 36-14 | 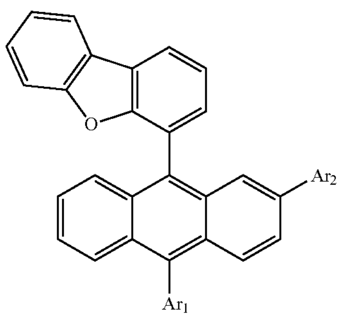 | 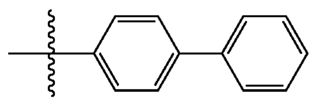 [SMILES: *c1ccc(-c2ccccc2)cc1] | 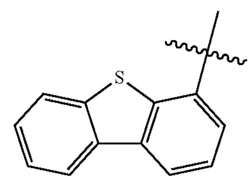 [SMILES: *c1cccc2c1sc1ccccc12] |
| 36-19 | 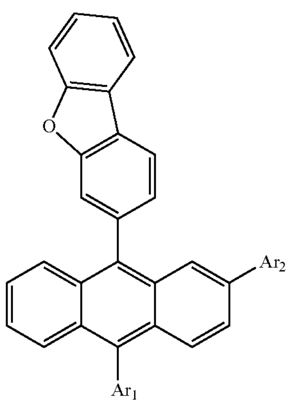 | 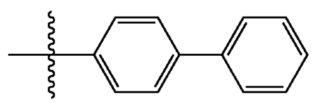 | 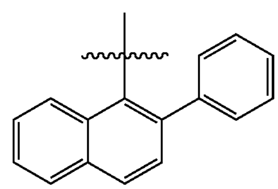 [SMILES: *c1c(-c2ccccc2)ccc2ccccc12] |
| 36-20 | 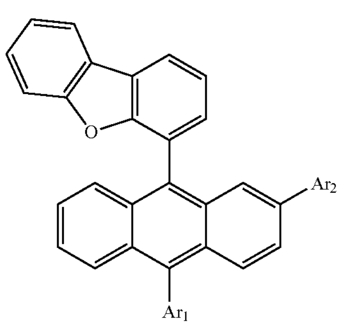 | 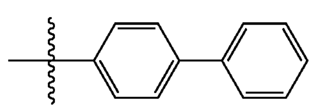 [SMILES: *c1ccc(-c2ccccc2)cc1] | 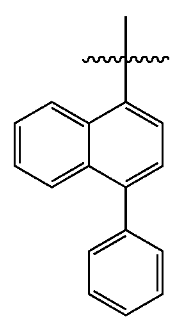 [SMILES: *c1ccc(-c2ccccc2)c2ccccc12] |

-continued
| No. | | Ar1 | Ar2 |
|---|---|---|---|
| 36-21 | 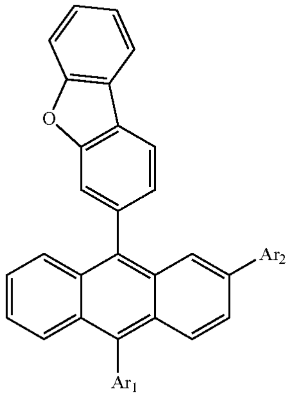 | 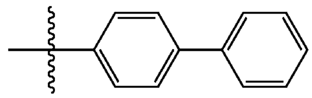 [SMILES: *c1ccc(-c2ccccc2)cc1] | 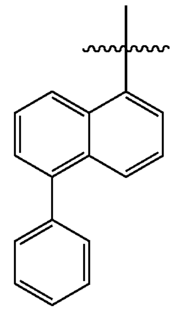 [SMILES: *c1cccc2c(-c3ccccc3)cccc12] |
| 36-22 | 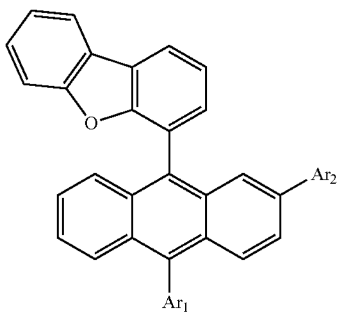 | 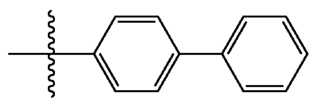 | 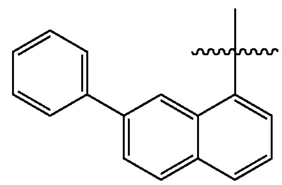 [SMILES: *c1cccc2ccc(-c3ccccc3)cc12] |
| 36-23 | 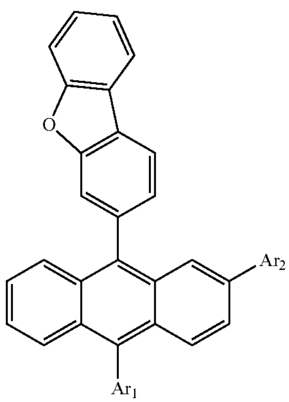 | 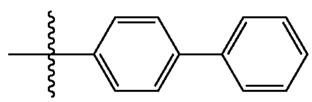 | 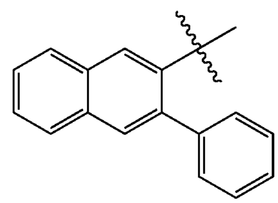 [SMILES: *c1cc2ccccc2cc1-c1ccccc1] |
| 36-24 | 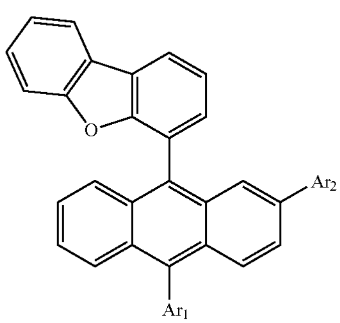 | 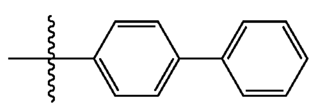 [SMILES: *c1ccc(-c2ccccc2)cc1] | 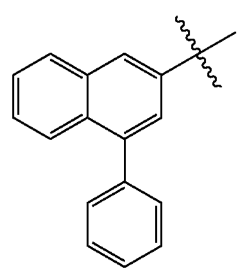 [SMILES: *c1cc(-c2ccccc2)c2ccccc2c1] |

-continued
| No. | | Ar1 | Ar2 |
|---|---|---|---|
| 36-25 | 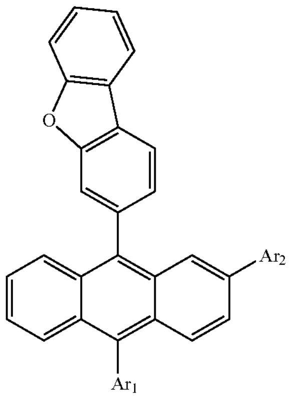 | 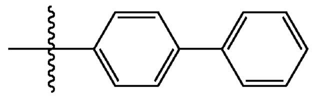 [SMILES: *c1ccc(-c2ccccc2)cc1] | 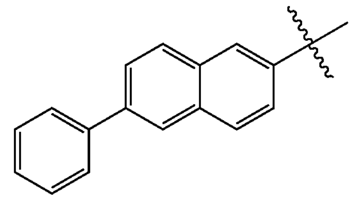 [SMILES: *c1ccc2cc(-c3ccccc3)ccc2c1] |
| 36-26 | 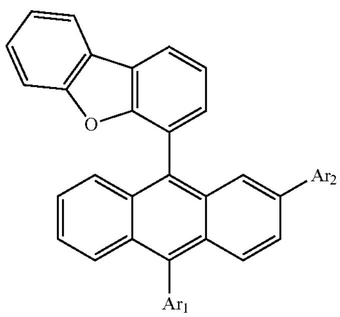 | 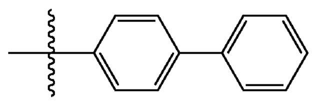 [SMILES: *c1ccc(-c2ccccc2)cc1] | 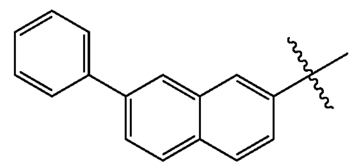 [SMILES: *c1ccc2ccc(-c3ccccc3)cc2c1] |
| 36-27 | 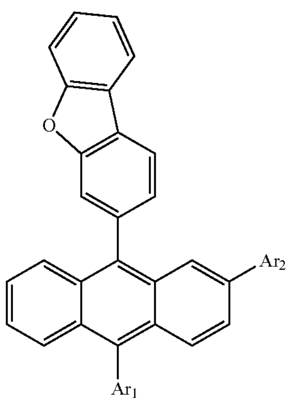 | 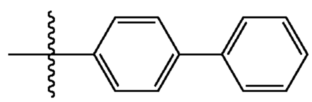 [SMILES: *c1ccc(-c2ccccc2)cc1] | 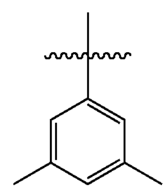 |
| 36-28 | 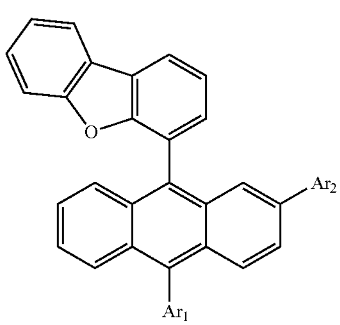 | 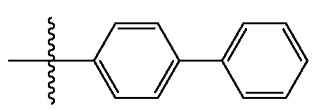 [SMILES: *c1ccc(-c2ccccc2)cc1] | 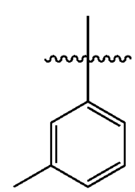 [SMILES: *c1cccc(C)c1] |

-continued
| No. | | Ar1 | Ar2 |
|---|---|---|---|
| 36-29 | 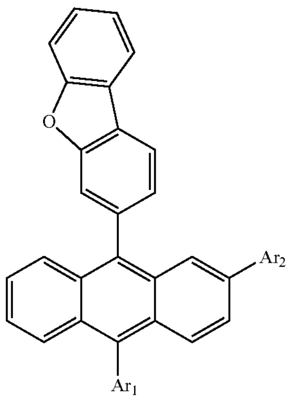 | 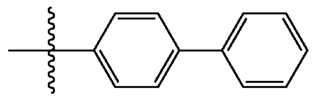 | 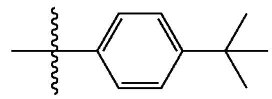 [SMILES: *c1ccc(C(C)(C)C)cc1] |
| 36-30 | 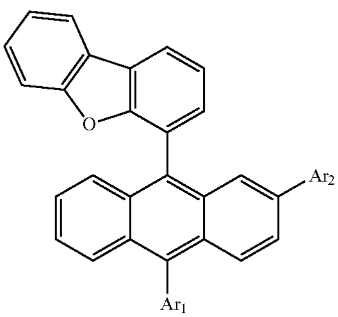 | 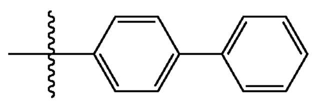 [SMILES: *c1ccc(-c2ccccc2)cc1] | 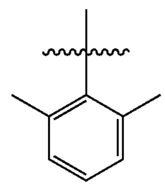 |
| 36-31 | 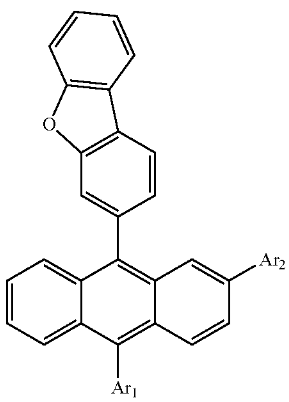 | 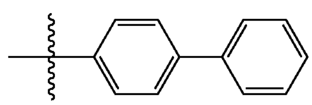 | 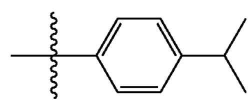 [SMILES: *c1ccc(C(C)C)cc1] |
| 37-1 | 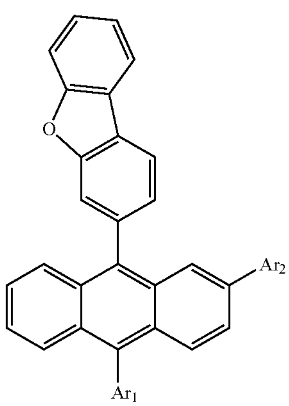 | 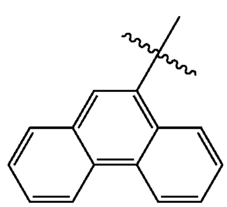 [SMILES: *c1cc2ccccc2c2ccccc12] | 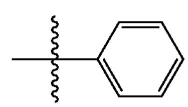 [SMILES: *c1ccccc1] |

-continued
| No. | | Ar1 | Ar2 |
|---|---|---|---|
| 37-2 | 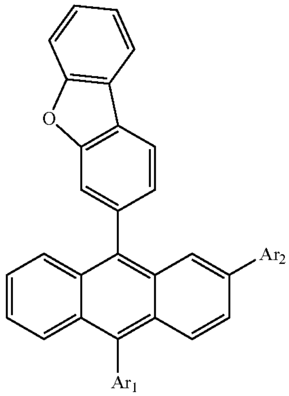 | 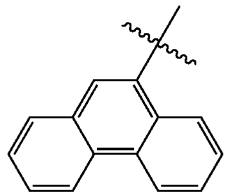 [SMILES: *c1cc2ccccc2c2ccccc12] | 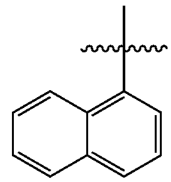 [SMILES: *c1cccc2ccccc12] |
| 37-3 | 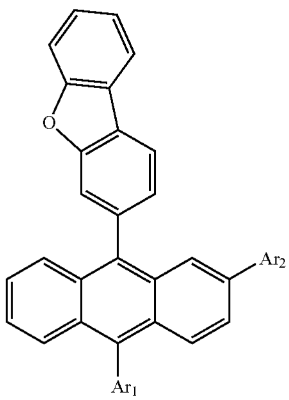 | 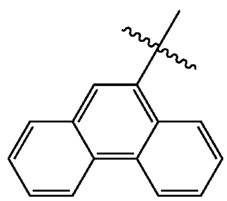 [SMILES: *c1cc2ccccc2c2ccccc12] | 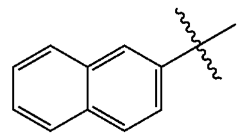 [SMILES: *c1ccc2ccccc2c1] |
| 37-4 | 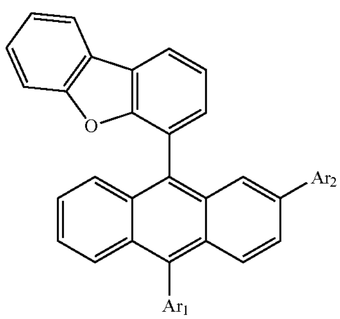 | 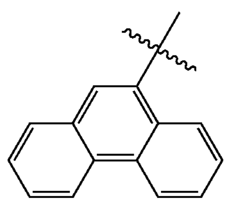 [SMILES: *c1cc2ccccc2c2ccccc12] | 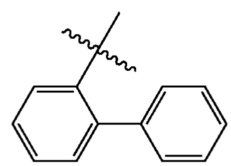 [SMILES: *c1ccccc1-c1ccccc1] |
| 37-5 | 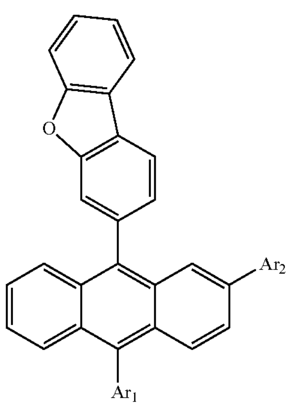 | 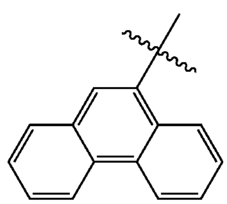 [SMILES: *c1cc2ccccc2c2ccccc12] | 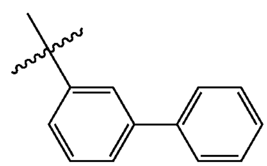 [SMILES: *c1cccc(-c2ccccc2)c1] |

-continued
| No. | | Ar1 | Ar2 |
|---|---|---|---|
| 37-6 | 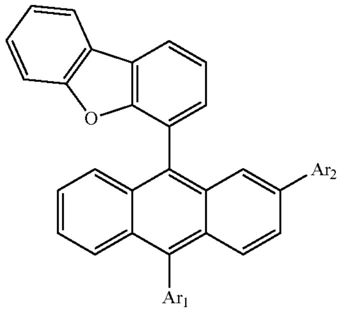 | 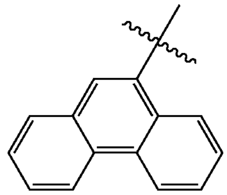 [SMILES: *c1cc2ccccc2c2ccccc12] | 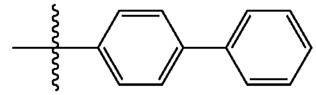 [SMILES: *c1ccc(-c2ccccc2)cc1] |
| 37-7 | 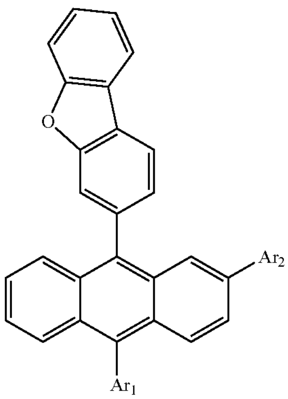 | 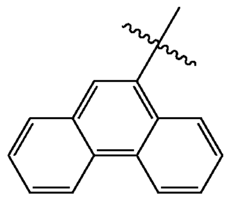 [SMILES: *c1cc2ccccc2c2ccccc12] | 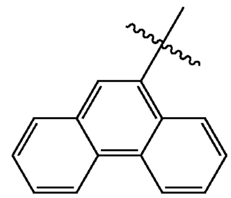 [SMILES: *c1cc2ccccc2c2ccccc12] |
| 37-9 | 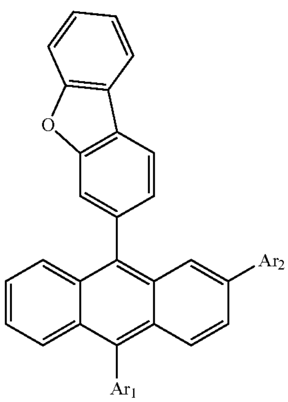 | 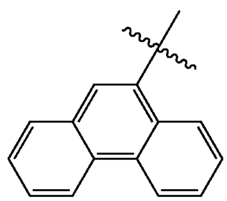 [SMILES: *c1cc2ccccc2c2ccccc12] | 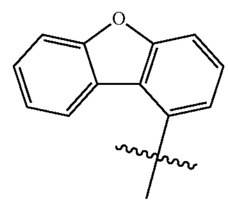 [SMILES: *c1cccc2oc3ccccc3c12] |
| 37-10 | 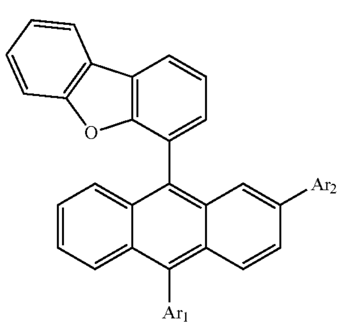 | 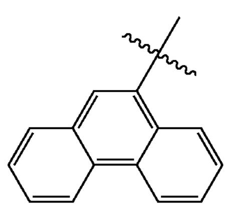 [SMILES: *c1cc2ccccc2c2ccccc12] | 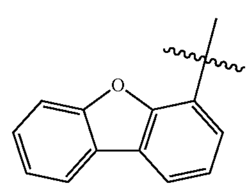 [SMILES: *c1cccc2c1oc1ccccc12] |

-continued
| No. | | Ar1 | Ar2 |
|---|---|---|---|
| 37-11 | 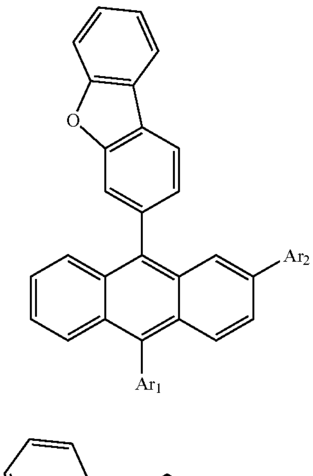 | 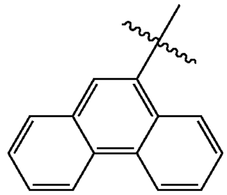 [SMILES: *c1cc2ccccc2c2ccccc12] | 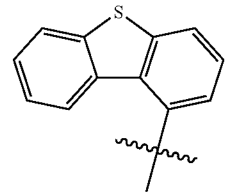 [SMILES: *c1cccc2sc3ccccc3c12] |
| 37-12 | 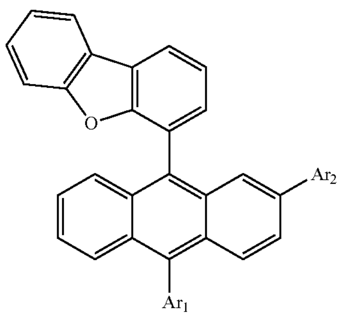 | 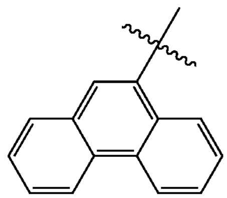 [SMILES: *c1cc2ccccc2c2ccccc12] | 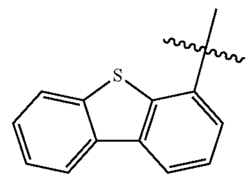 |
| 37-16 | 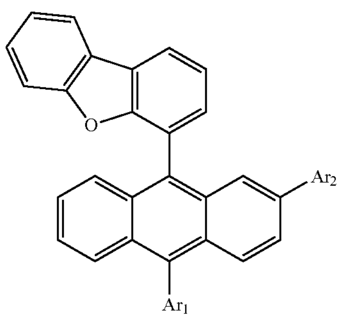 | 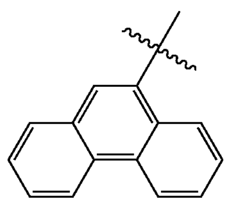 [SMILES: *c1cc2ccccc2c2ccccc12] | 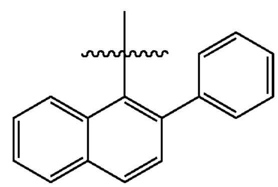 [SMILES: *c1c(-c2ccccc2)ccc2ccccc12] |
| 37-17 | 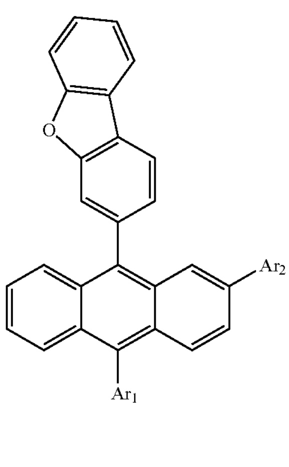 | 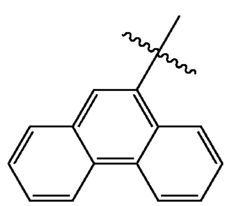 [SMILES: *c1cc2ccccc2c2ccccc12] | 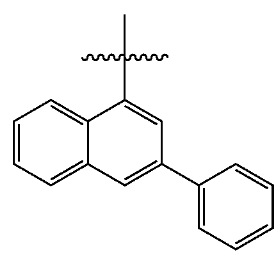 [SMILES: *c1cc(-c2ccccc2)cc2ccccc12] |

-continued
| No. | | Ar1 | Ar2 |
|---|---|---|---|
| 37-18 | 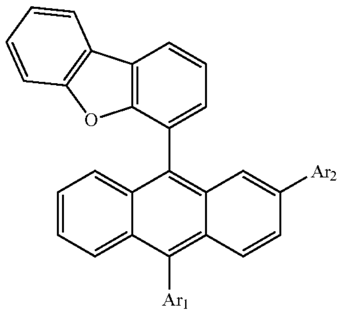 | 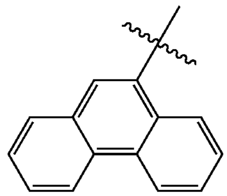 [SMILES: *c1cc2ccccc2c2ccccc12] | 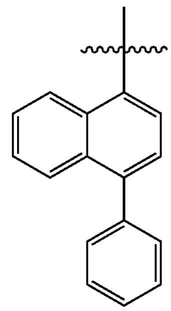 [SMILES: *c1ccc(-c2ccccc2)c2ccccc12] |
| 37-19 | 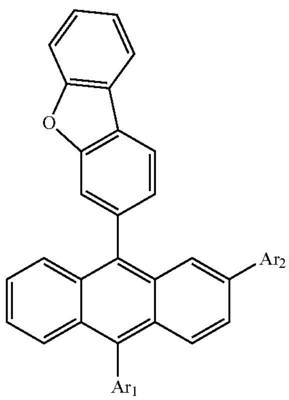 | 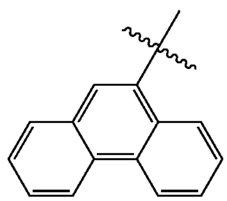 [SMILES: *c1cc2ccccc2c2ccccc12] | 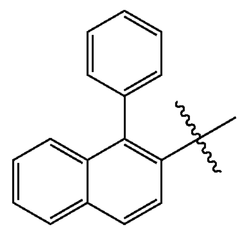 [SMILES: *c1ccc2ccccc2c1-c1ccccc1] |
| 37-20 | 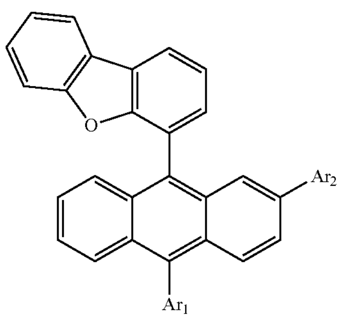 | 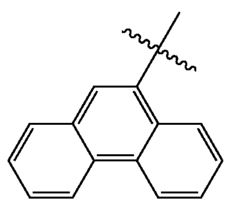 [SMILES: *c1cc2ccccc2c2ccccc12] | 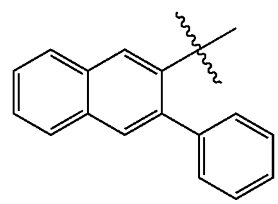 [SMILES: *c1cc2ccccc2cc1-c1ccccc1] |
| 37-21 | 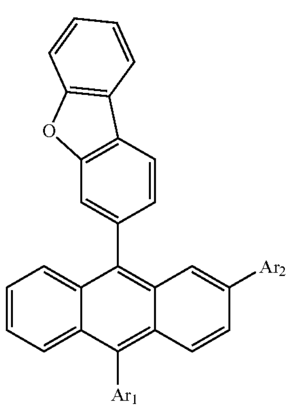 | 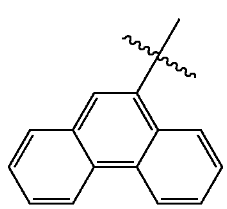 [SMILES: *c1cc2ccccc2c2ccccc12] | 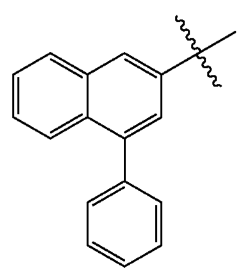 [SMILES: *c1cc(-c2ccccc2)c2ccccc2c1] |

-continued
| No. | | Ar1 | Ar2 |
|---|---|---|---|
| 37-22 | 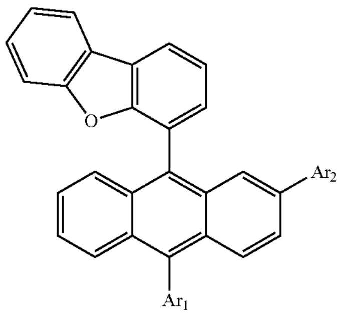 | 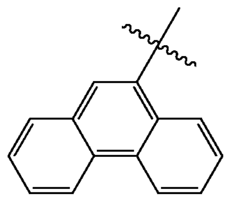 [SMILES: *c1cc2ccccc2c2ccccc12] | 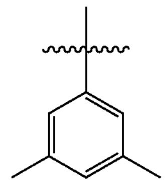 |
| 37-23 | 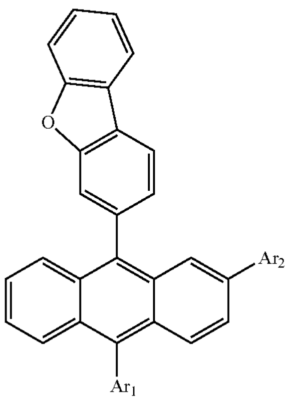 | 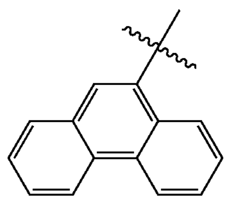 [SMILES: *c1cc2ccccc2c2ccccc12] | 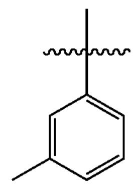 |
| 37-24 | 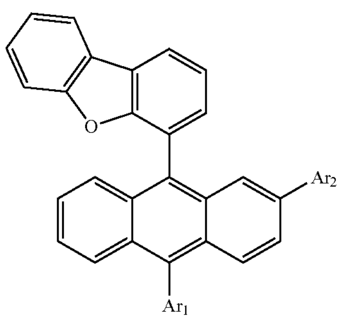 | 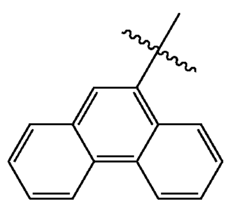 [SMILES: *c1cc2ccccc2c2ccccc12] | 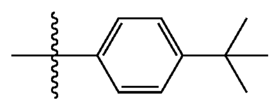 |
| 37-25 | 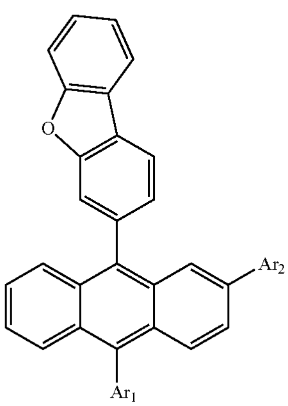 | 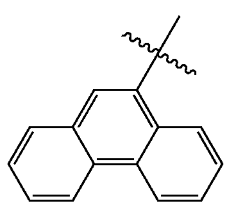 [SMILES: *c1cc2ccccc2c2ccccc12] | 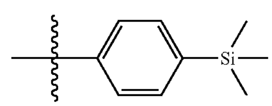 [SMILES: *c1ccc([Si](C)(C)C)cc1] |

-continued
| No. | | Ar1 | Ar2 |
|---|---|---|---|
| 37-26 | 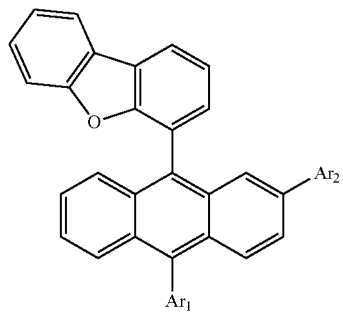 | 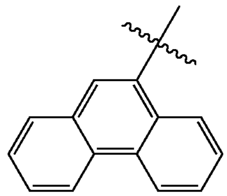 [SMILES: *c1cc2ccccc2c2ccccc12] | 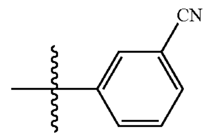 [SMILES: *c1cccc(C#N)c1] |
| 37-27 | 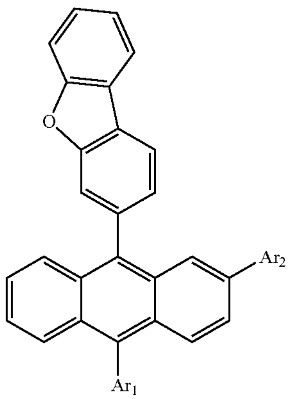 | 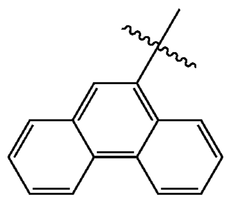 [SMILES: *c1cc2ccccc2c2ccccc12] | 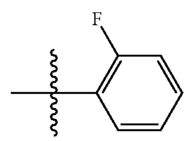 [SMILES: *c1ccccc1F] |
| 37-28 | 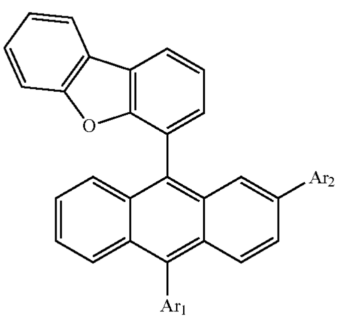 | 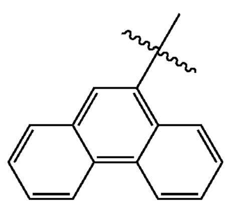 [SMILES: *c1cc2ccccc2c2ccccc12] | 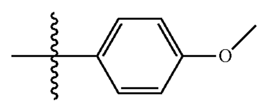 [SMILES: *c1ccc(OC)cc1] |
| 38-1 | 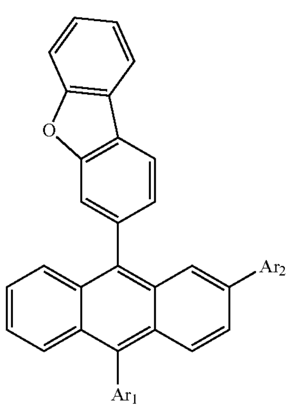 | 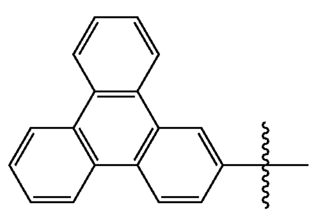 [SMILES: *c1ccc2c3ccccc3c3ccccc3c2c1] | 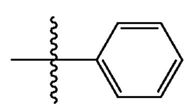 |

-continued
| No. | | Ar1 | Ar2 |
|---|---|---|---|
| 38-2 | 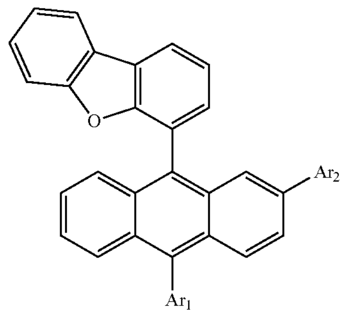 | 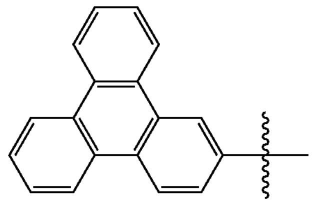 [SMILES: *c1ccc2c3ccccc3c3ccccc3c2c1] | 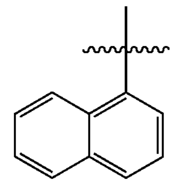 [SMILES: *c1cccc2ccccc12] |
| 38-3 | 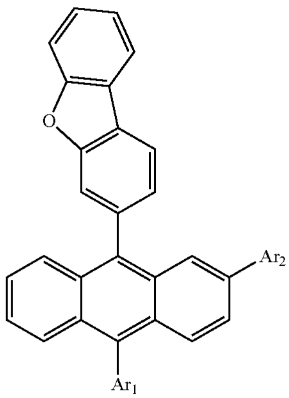 | 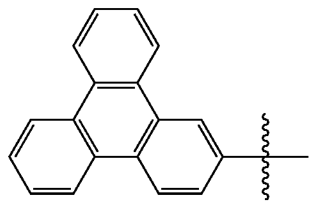 [SMILES: *c1ccc2c3ccccc3c3ccccc3c2c1] | 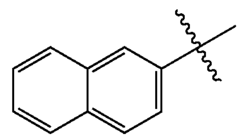 [SMILES: *c1ccc2ccccc2c1] |
| 38-4 | 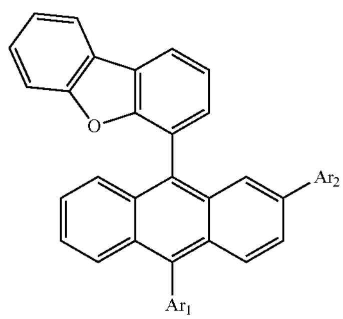 | 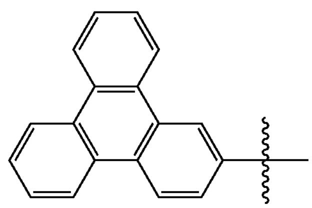 [SMILES: *c1ccc2c3ccccc3c3ccccc3c2c1] | 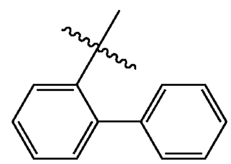 [SMILES: *c1ccccc1-c1ccccc1] |
| 38-5 | 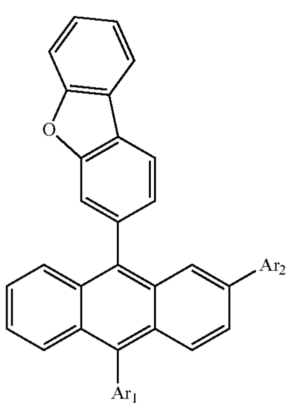 | 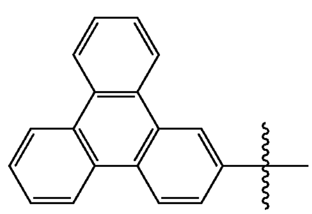 [SMILES: *c1ccc2c3ccccc3c3ccccc3c2c1] | 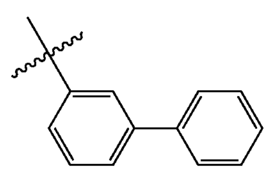 [SMILES: *c1cccc(-c2ccccc2)c1] |

-continued
| No. | | Ar1 | Ar2 |
|---|---|---|---|
| 38-6 | 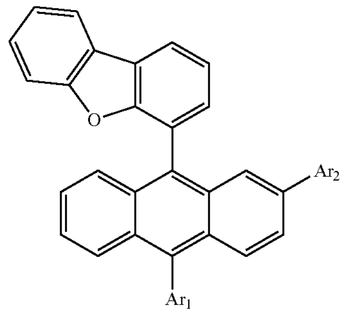 | 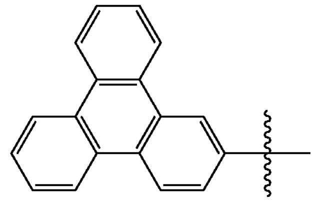 [SMILES: *c1ccc2c3ccccc3c3ccccc3c2c1] | 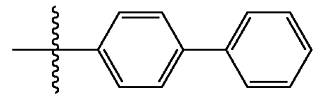 |
| 38-7 | 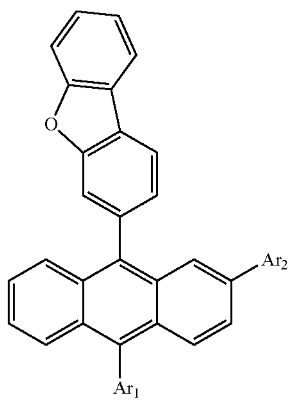 | 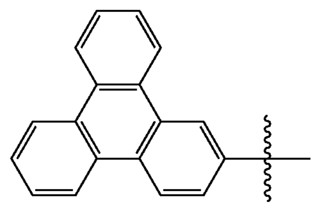 [SMILES: *c1ccc2c3ccccc3c3ccccc3c2c1] | 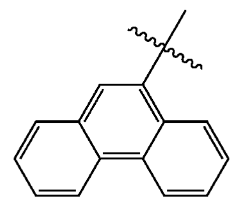 [SMILES: *c1cc2ccccc2c2ccccc12] |
| 38-9 | 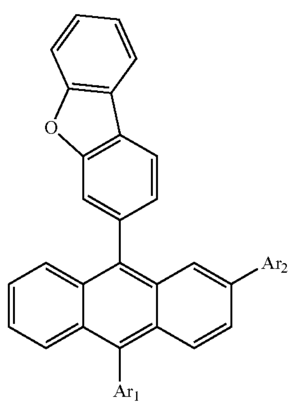 | 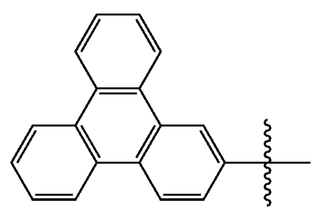 [SMILES: *c1ccc2c3ccccc3c3ccccc3c2c1] | 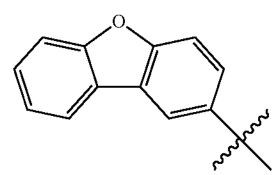 [SMILES: *c1ccc2oc3ccccc3c2c1] |
| 38-10 | 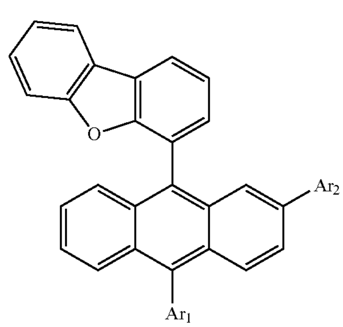 | 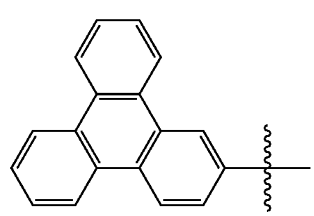 [SMILES: *c1ccc2c3ccccc3c3ccccc3c2c1] | 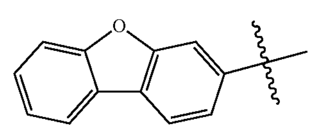 |

-continued
| No. | | Ar1 | Ar2 |
|---|---|---|---|
| 38-11 | 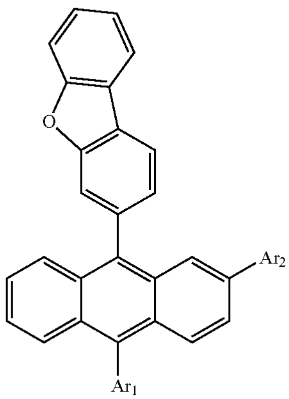 | 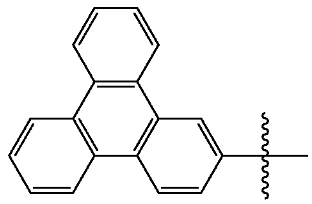 | 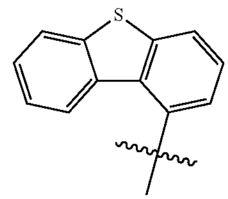 |
| 38-12 | 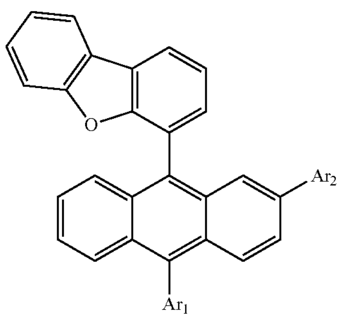 | 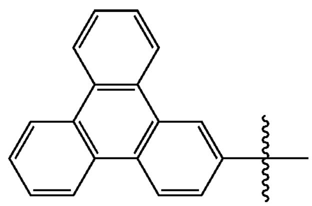 | 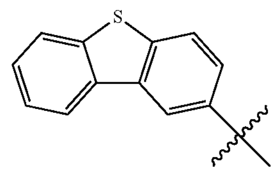 |
| 38-13 | 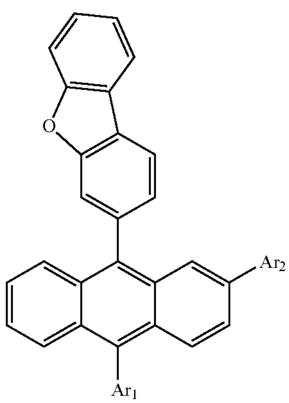 | 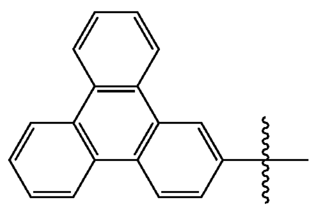 [SMILES: *c1ccc2c3ccccc3c3ccccc3c2c1] | 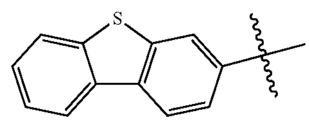 |
| 38-17 | 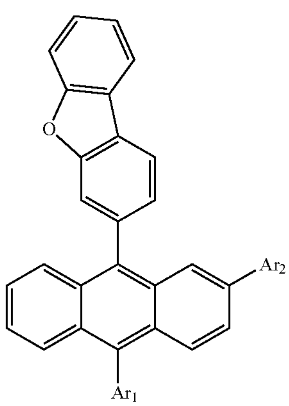 | 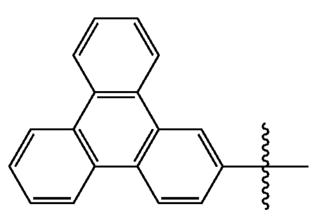 [SMILES: *c1ccc2c3ccccc3c3ccccc3c2c1] | 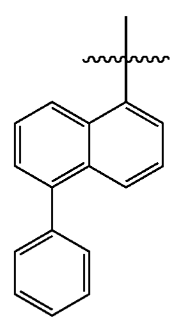 [SMILES: *c1cccc2c(-c3ccccc3)cccc12] |

-continued
| No. | | Ar1 | Ar2 |
|---|---|---|---|
| 38-18 | 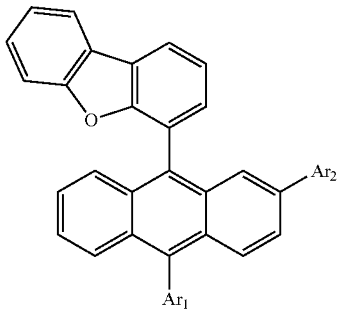 | 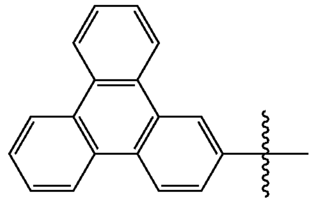 [SMILES: *c1ccc2c3ccccc3c3ccccc3c2c1] | 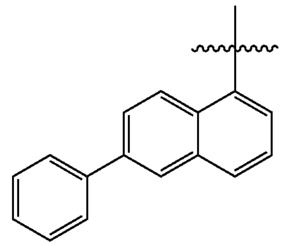 [SMILES: *c1cccc2cc(-c3ccccc3)ccc12] |
| 38-19 | 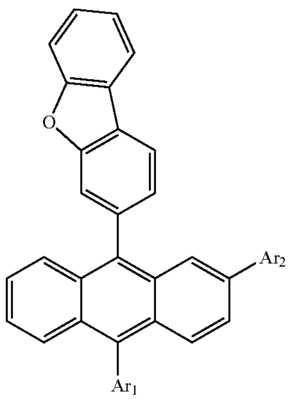 | 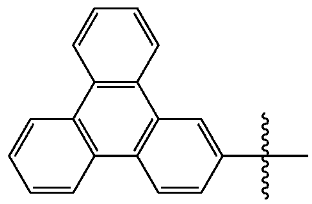 [SMILES: *c1ccc2c3ccccc3c3ccccc3c2c1] | 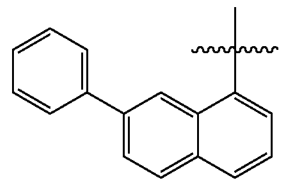 [SMILES: *c1cccc2ccc(-c3ccccc3)cc12] |
| 38-20 | 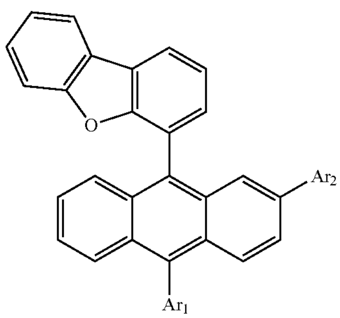 | 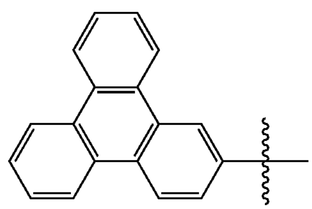 [SMILES: *c1ccc2c3ccccc3c3ccccc3c2c1] | 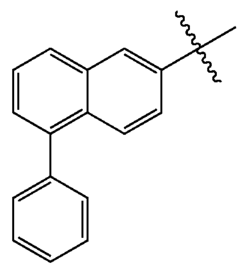 [SMILES: *c1ccc2c(-c3ccccc3)cccc2c1] |
| 38-21 | 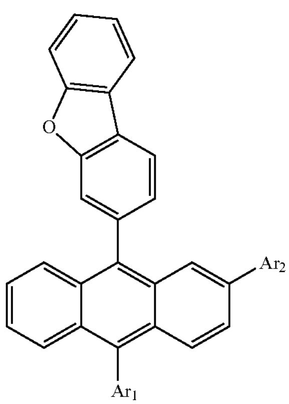 | 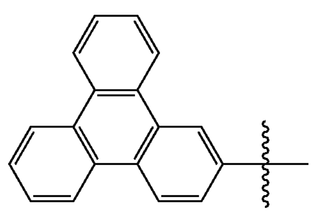 [SMILES: *c1ccc2c3ccccc3c3ccccc3c2c1] | 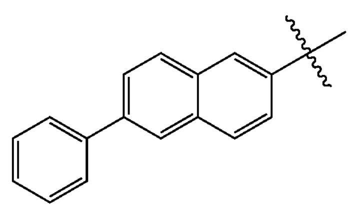 [SMILES: *c1ccc2cc(-c3ccccc3)ccc2c1] |

-continued
| No. | | Ar1 | Ar2 |
|---|---|---|---|
| 38-22 | 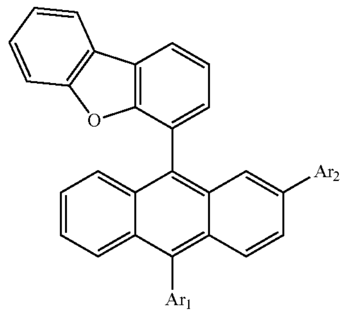 | 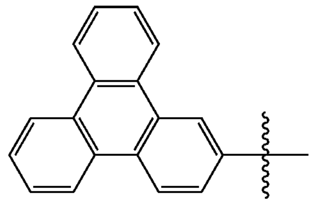 [SMILES: *c1ccc2c3ccccc3c3ccccc3c2c1] | 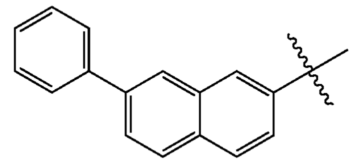 [SMILES: *c1ccc2ccc(-c3ccccc3)cc2c1] |
| 38-23 | 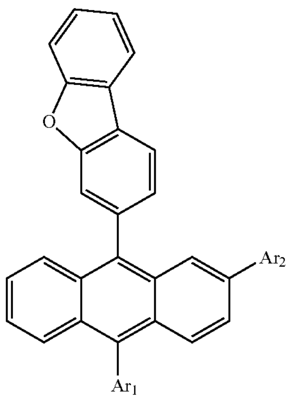 | 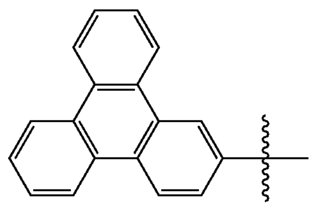 | 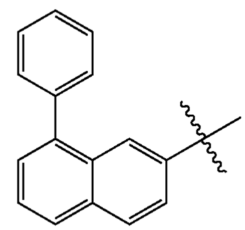 [SMILES: *c1ccc2cccc(-c3ccccc3)c2c1] |
| 38-24 | 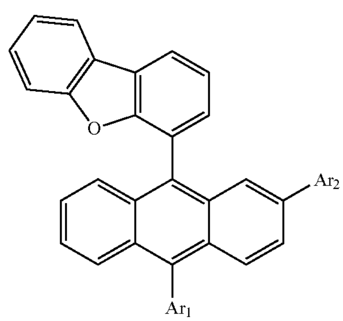 | 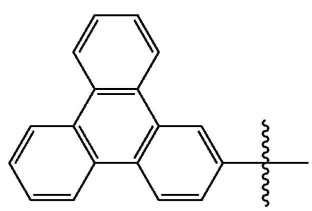 [SMILES: *c1ccc2c3ccccc3c3ccccc3c2c1] | 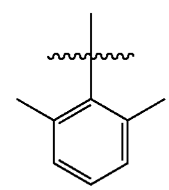 |
| 38-25 | 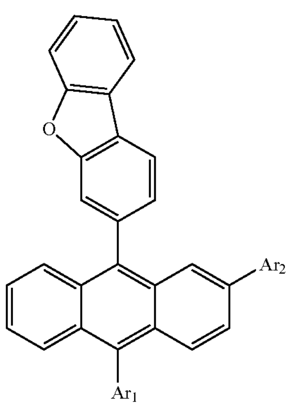 | 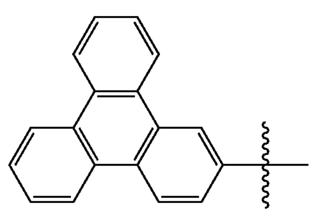 [SMILES: *c1ccc2c3ccccc3c3ccccc3c2c1] | 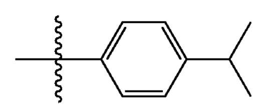 [SMILES: *c1ccc(C(C)C)cc1] |

-continued
| No. | | Ar1 | Ar2 |
|---|---|---|---|
| 38-26 | 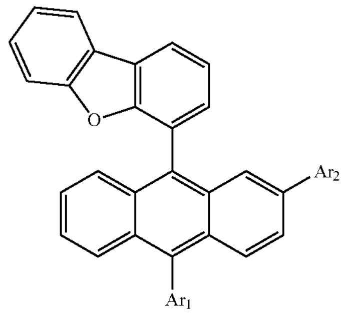 | 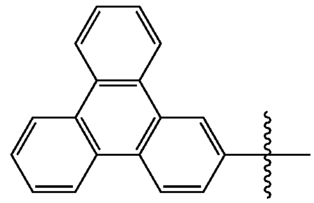 | 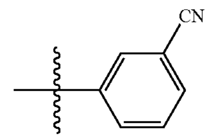 [SMILES: *c1cccc(C#N)c1] |
| 38-27 | 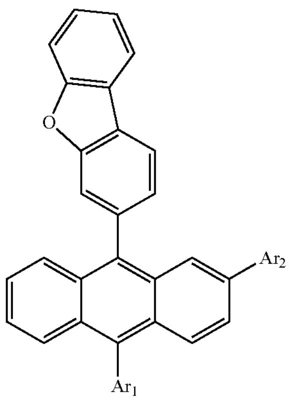 | 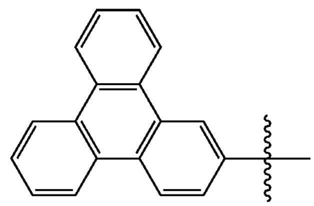 [SMILES: *c1ccc2c3ccccc3c3ccccc3c2c1] | 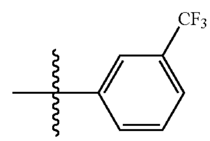 [SMILES: *c1cccc(C(F)(F)F)c1] |
| 38-28 | 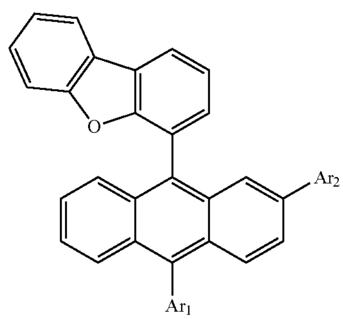 | 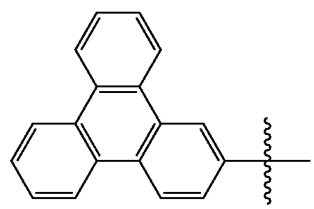 | 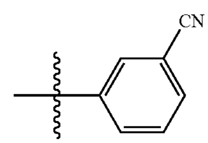 [SMILES: *c1cccc(C#N)c1] |
| 38-29 | 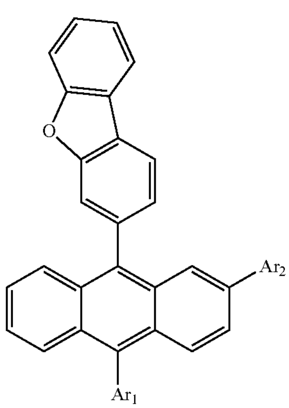 | 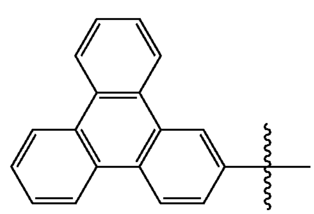 [SMILES: *c1ccc2c3ccccc3c3ccccc3c2c1] | 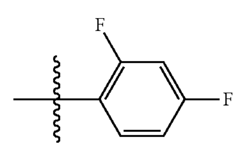 [SMILES: *c1ccc(F)cc1F] |

-continued
| No. | | Ar1 | Ar2 |
|---|---|---|---|
| 39-1 | 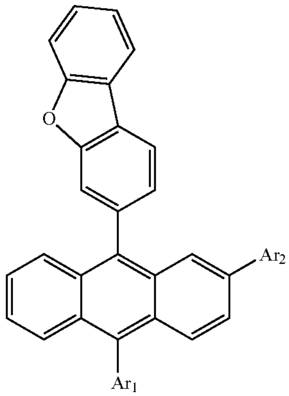 | 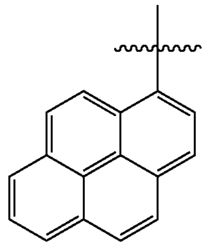 [SMILES: *c1ccc2ccc3cccc4ccc1c2c34] | 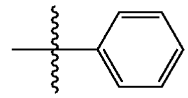 [SMILES: *c1ccccc1] |
| 39-2 | 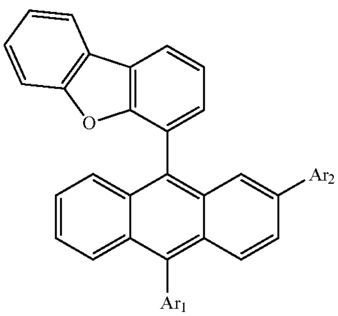 | 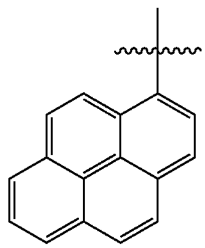 [SMILES: *c1ccc2ccc3cccc4ccc1c2c34] | 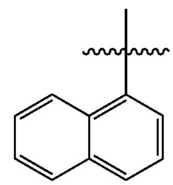 [SMILES: *c1cccc2ccccc12] |
| 39-3 | 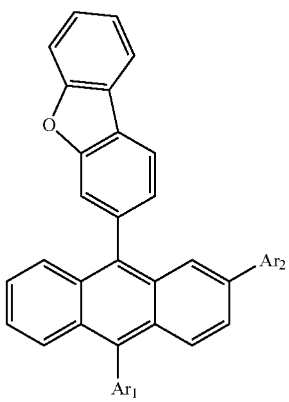 | 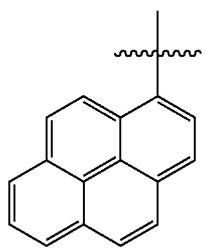 [SMILES: *c1ccc2ccc3cccc4ccc1c2c34] | 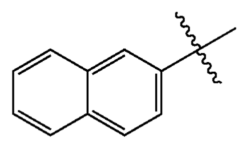 [SMILES: *c1ccc2ccccc2c1] |
| 39-4 | 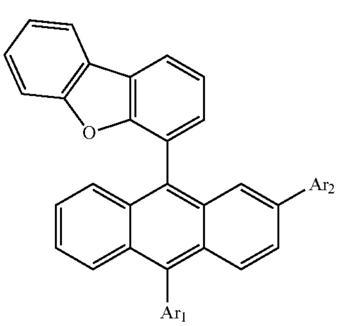 | 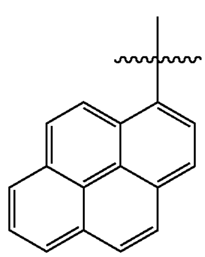 [SMILES: *c1ccc2ccc3cccc4ccc1c2c34] | 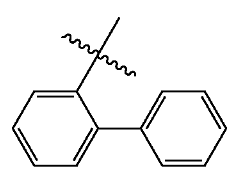 [SMILES: *c1ccccc1-c1ccccc1] |

-continued
| No. | | Ar1 | Ar2 |
|---|---|---|---|
| 39-5 | 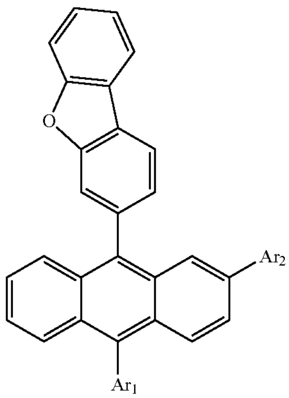 | 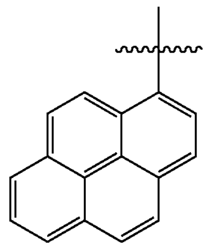 [SMILES: *c1ccc2ccc3cccc4ccc1c2c34] | 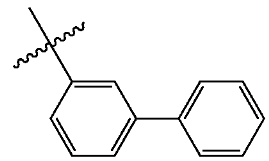 [SMILES: *c1cccc(-c2ccccc2)c1] |
| 39-6 | 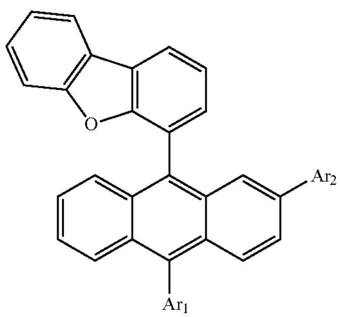 | 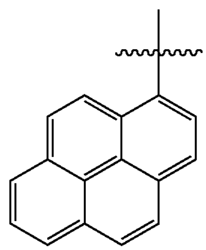 [SMILES: *c1ccc2ccc3cccc4ccc1c2c34] | 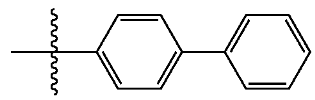 |
| 39-7 | 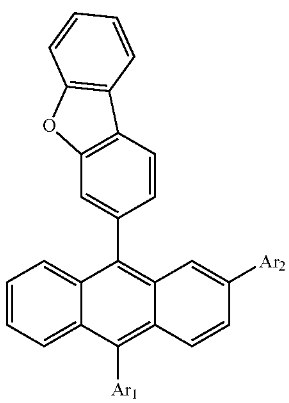 | 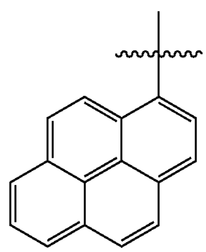 [SMILES: *c1ccc2ccc3cccc4ccc1c2c34] | 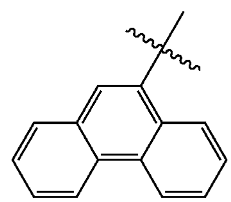 [SMILES: *c1cc2ccccc2c2ccccc12] |
| 39-9 | 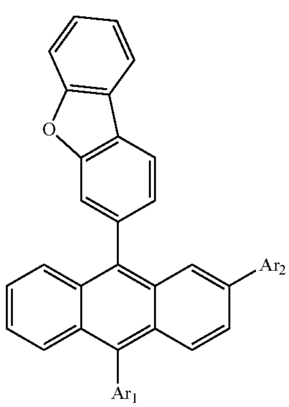 | 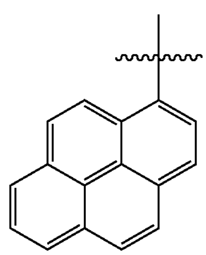 [SMILES: *c1ccc2ccc3cccc4ccc1c2c34] | 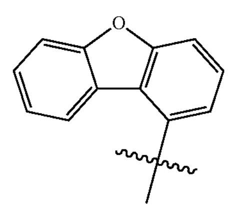 |

-continued
| No. | | Ar1 | Ar2 |
|---|---|---|---|
| 39-10 | 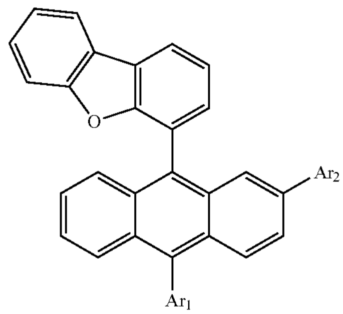 | 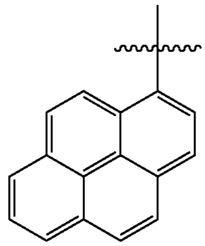 [SMILES: *c1ccc2ccc3cccc4ccc1c2c34] | 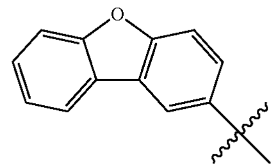 |
| 39-11 | 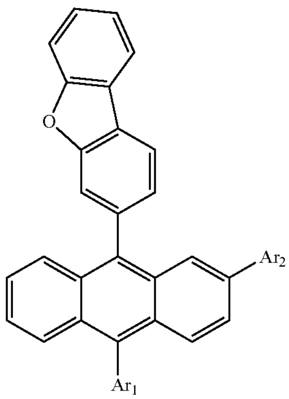 | 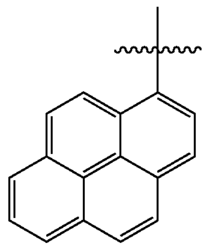 [SMILES: *c1ccc2ccc3cccc4ccc1c2c34] | 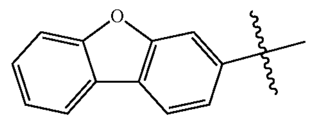 |
| 39-12 | 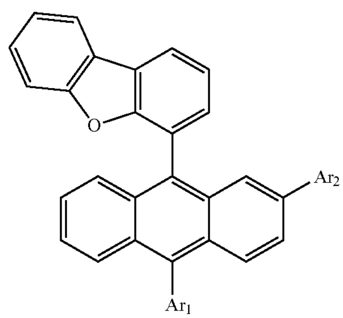 | 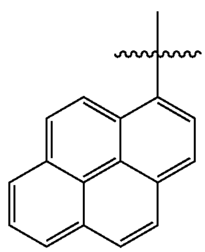 [SMILES: *c1ccc2ccc3cccc4ccc1c2c34] | 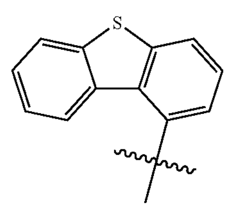 |
| 39-13 | 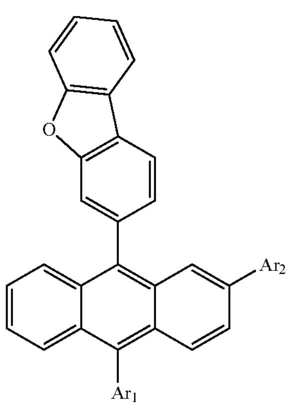 | 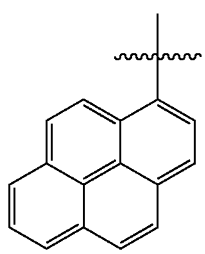 [SMILES: *c1ccc2ccc3cccc4ccc1c2c34] | 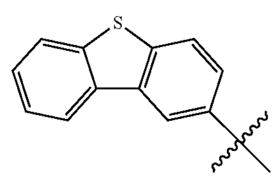 [SMILES: *c1ccc2sc3ccccc3c2c1] |

-continued
| No. | | Ar1 | Ar2 |
|---|---|---|---|
| 39-14 | 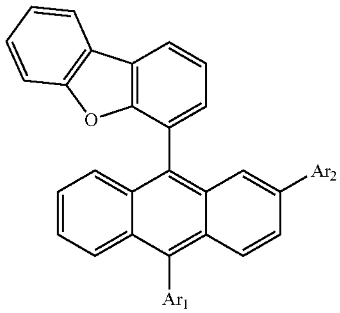 | 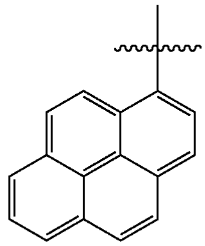 [SMILES: *c1ccc2ccc3cccc4ccc1c2c34] | 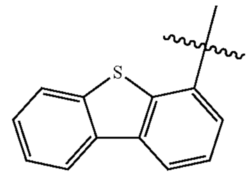 |
| 39-19 | 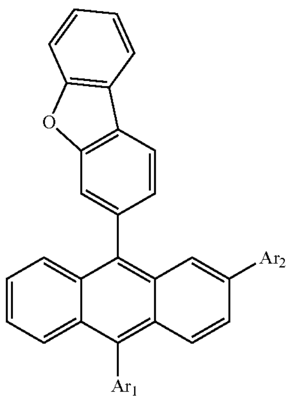 | 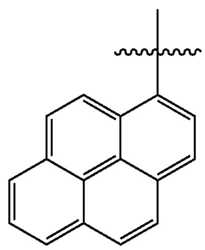 [SMILES: *c1ccc2ccc3cccc4ccc1c2c34] | 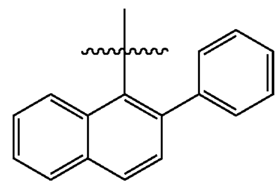 [SMILES: *c1c(-c2ccccc2)ccc2ccccc12] |
| 39-20 | 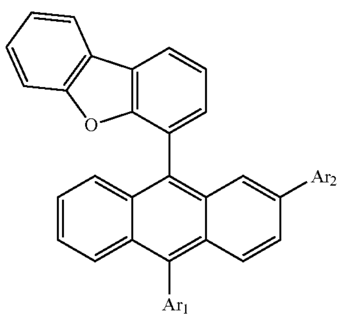 | 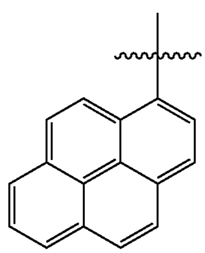 [SMILES: *c1ccc2ccc3cccc4ccc1c2c34] | 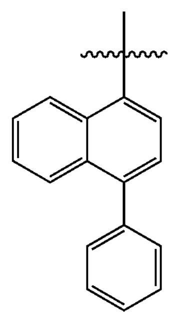 [SMILES: *c1ccc(-c2ccccc2)c2ccccc12] |
| 39-21 | 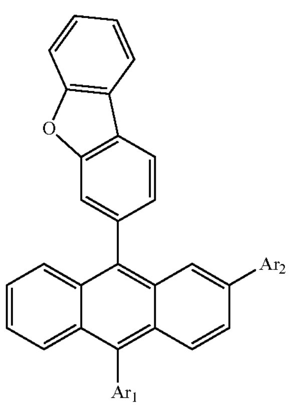 | 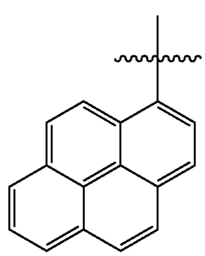 [SMILES: *c1ccc2ccc3cccc4ccc1c2c34] | 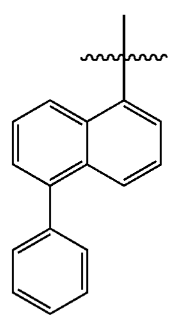 [SMILES: *c1cccc2c(-c3ccccc3)cccc12] |

-continued
| No. | | Ar1 | Ar2 |
|---|---|---|---|
| 39-22 | 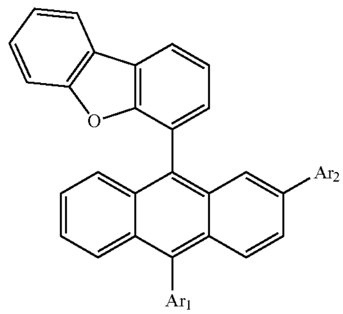 | 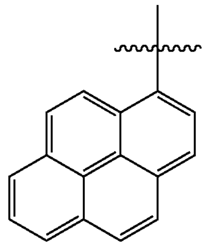 [SMILES: *c1ccc2ccc3cccc4ccc1c2c34] | 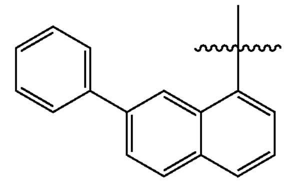 [SMILES: *c1cccc2ccc(-c3ccccc3)cc12] |
| 39-23 | 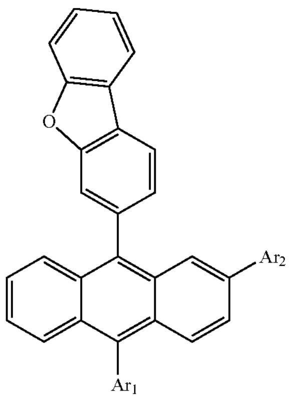 | 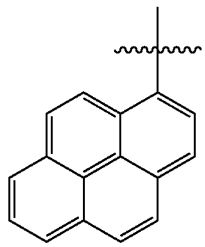 [SMILES: *c1ccc2ccc3cccc4ccc1c2c34] | 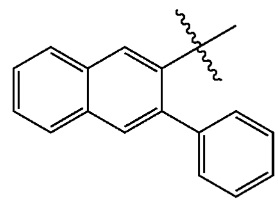 [SMILES: *c1cc2ccccc2cc1-c1ccccc1] |
| 39-24 | 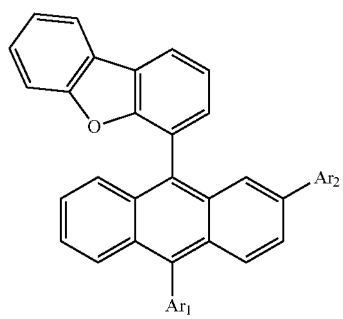 | 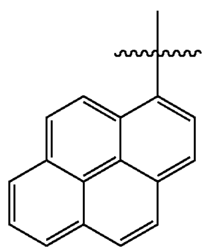 [SMILES: *c1ccc2ccc3cccc4ccc1c2c34] | 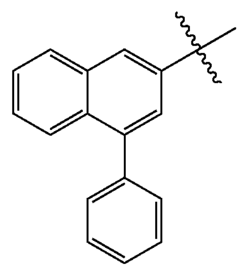 [SMILES: *c1cc(-c2ccccc2)c2ccccc2c1] |
| 39-25 | 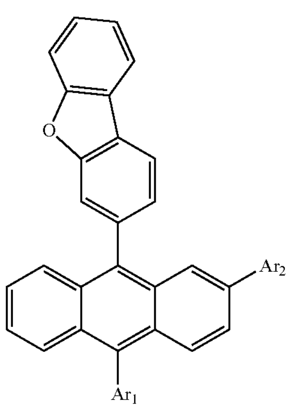 | 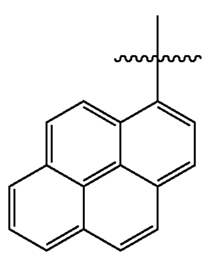 [SMILES: *c1ccc2ccc3cccc4ccc1c2c34] | 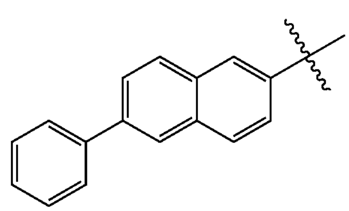 [SMILES: *c1ccc2cc(-c3ccccc3)ccc2c1] |

-continued
| No. | | Ar1 | Ar2 |
|---|---|---|---|
| 39-26 | 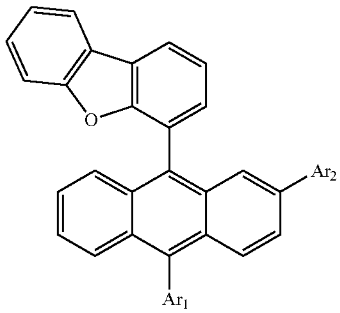 | 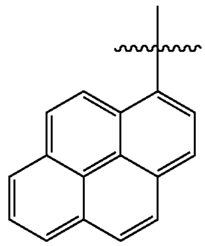 [SMILES: *c1ccc2ccc3cccc4ccc1c2c34] | 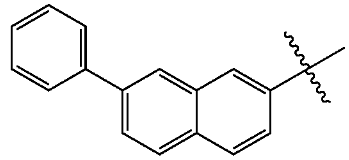 [SMILES: *c1ccc2ccc(-c3ccccc3)cc2c1] |
| 39-27 | 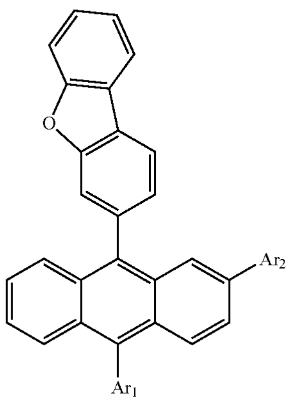 | 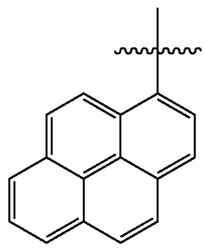 [SMILES: *c1ccc2ccc3cccc4ccc1c2c34] | 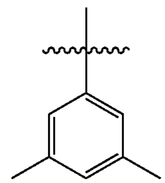 |
| 39-28 | 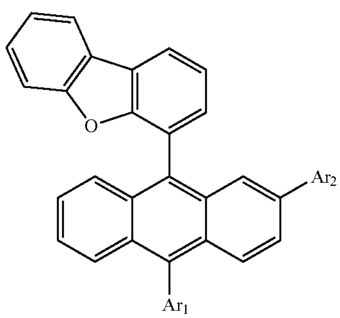 | 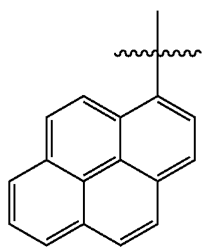 [SMILES: *c1ccc2ccc3cccc4ccc1c2c34] | 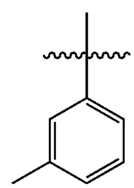 |
| 39-29 | 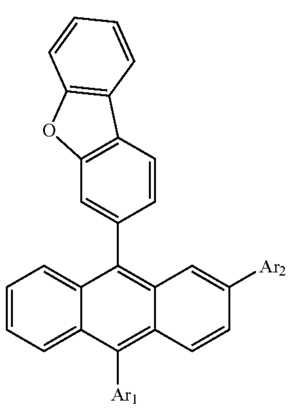 | 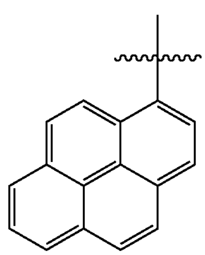 [SMILES: *c1ccc2ccc3cccc4ccc1c2c34] | 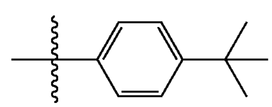 [SMILES: *c1ccc(C(C)(C)C)cc1] |

-continued
| No. | | Ar1 | Ar2 |
|---|---|---|---|
| 39-30 | 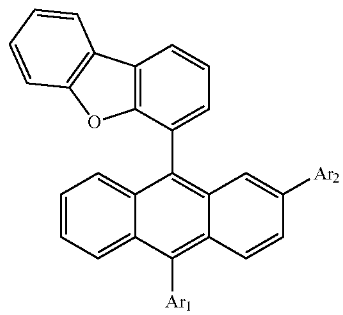  | 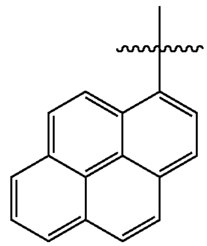 [SMILES: *c1ccc2ccc3cccc4ccc1c2c34] | 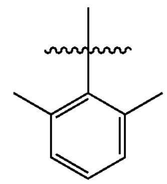 |
| 39-31 | 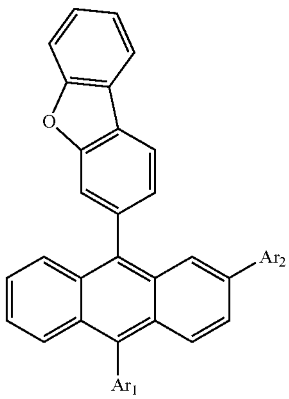  | 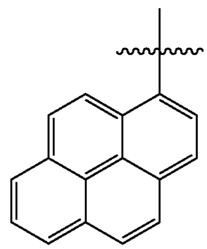 [SMILES: *c1ccc2ccc3cccc4ccc1c2c34] | 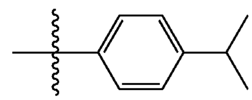 [SMILES: *c1ccc(C(C)C)cc1] |
| 40-1 | 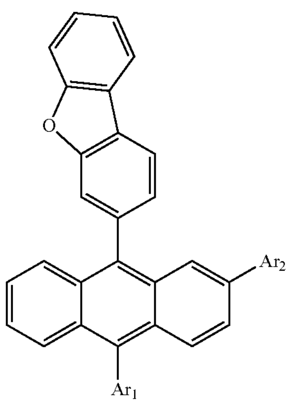  | 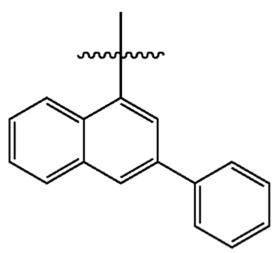 [SMILES: *c1cc(-c2ccccc2)cc2ccccc12] | 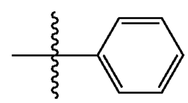 [SMILES: *c1ccccc1] |
| 40-2 | 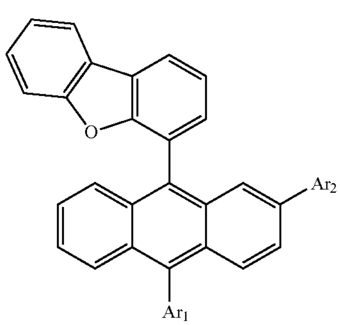  | 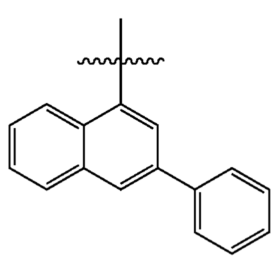 [SMILES: *c1cc(-c2ccccc2)cc2ccccc12] | 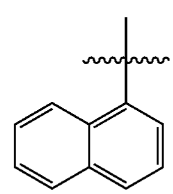 [SMILES: *c1cccc2ccccc12] |

-continued
| No. | | Ar1 | Ar2 |
|---|---|---|---|
| 40-3 | 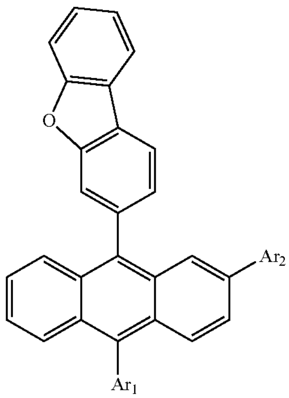 | 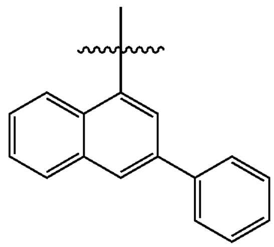 [SMILES: *c1cc(-c2ccccc2)cc2ccccc12] | 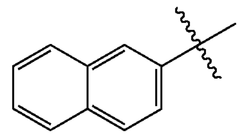 [SMILES: *c1ccc2ccccc2c1] |
| 40-4 | 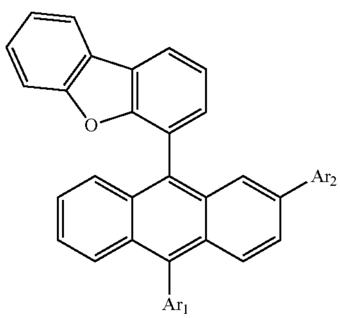 | 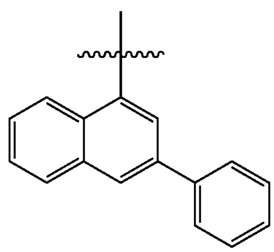 [SMILES: *c1cc(-c2ccccc2)cc2ccccc12] | 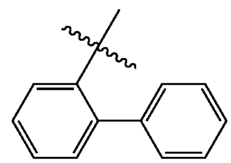 [SMILES: *c1ccccc1-c1ccccc1] |
| 40-5 | 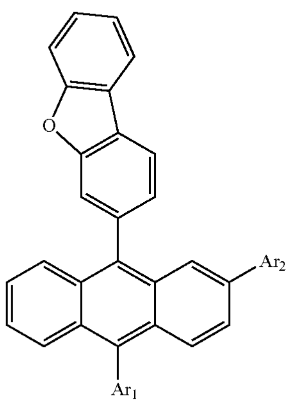 | 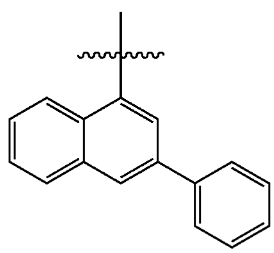 [SMILES: *c1cc(-c2ccccc2)cc2ccccc12] | 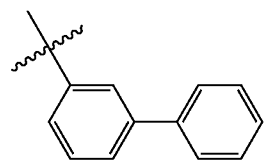 [SMILES: *c1cccc(-c2ccccc2)c1] |
| 40-6 | 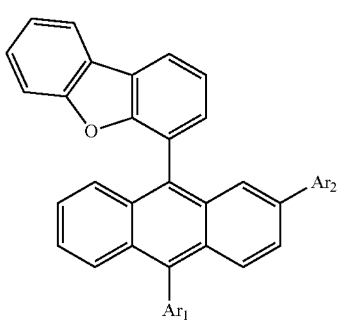 | 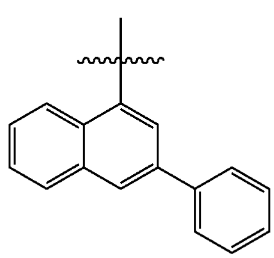 [SMILES: *c1cc(-c2ccccc2)cc2ccccc12] | 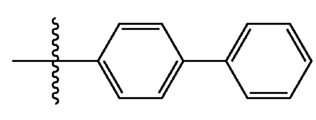 |

-continued
| No. | | Ar1 | Ar2 |
|---|---|---|---|
| 40-7 | 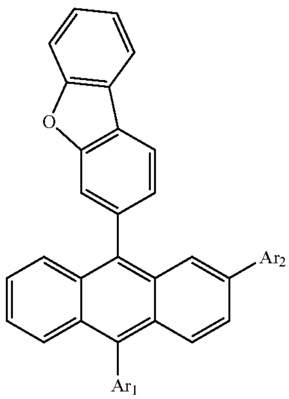 | 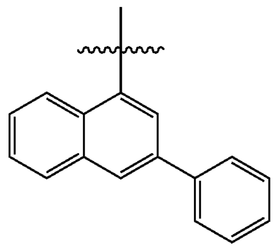 [SMILES: *c1cc(-c2ccccc2)cc2ccccc12] | 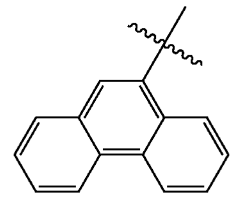 [SMILES: *c1cc2ccccc2c2ccccc12] |
| 40-9 | 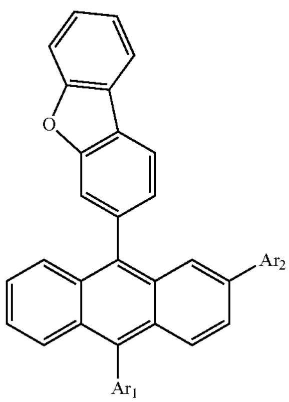 | 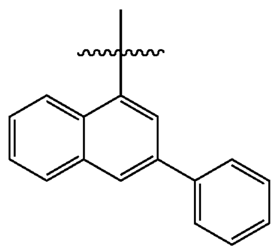 [SMILES: *c1cc(-c2ccccc2)cc2ccccc12] | 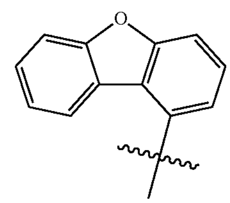 [SMILES: *c1cccc2oc3ccccc3c12] |
| 40-10 | 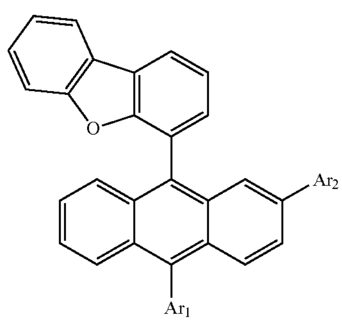 | 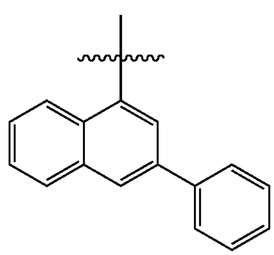 [SMILES: *c1cc(-c2ccccc2)cc2ccccc12] | 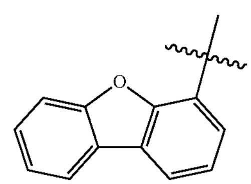 |
| 40-11 | 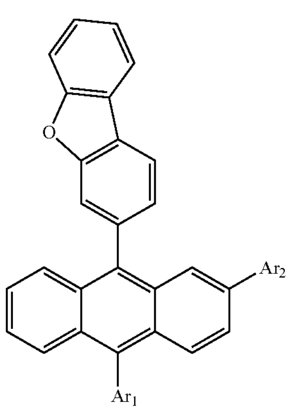 | 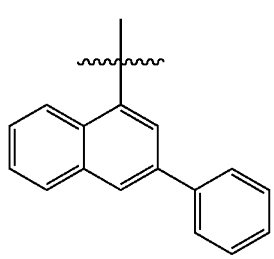 [SMILES: *c1cc(-c2ccccc2)cc2ccccc12] | 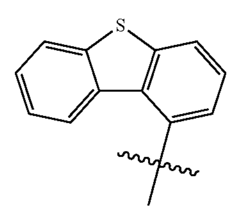 |

-continued
| No. | | Ar1 | Ar2 |
|---|---|---|---|
| 40-12 | 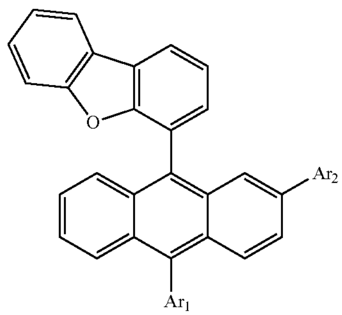 | 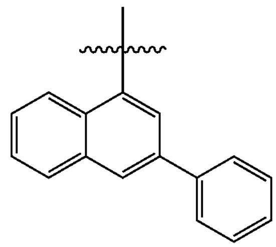 [SMILES: *c1cc(-c2ccccc2)cc2ccccc12] | 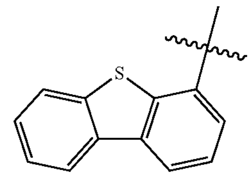 [SMILES: *c1cccc2c1sc1ccccc12] |
| 40-16 | 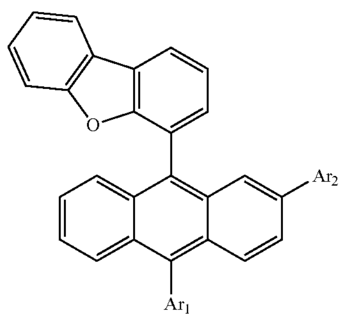 | 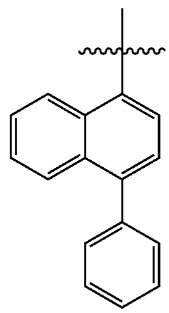 [SMILES: *c1ccc(-c2ccccc2)c2ccccc12] | 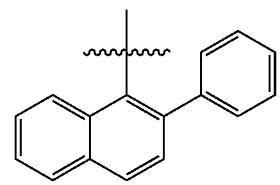 [SMILES: *c1c(-c2ccccc2)ccc2ccccc12] |
| 40-17 | 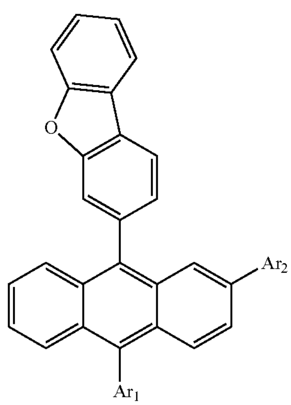 | 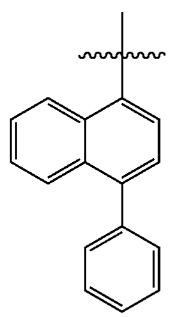 [SMILES: *c1ccc(-c2ccccc2)c2ccccc12] | 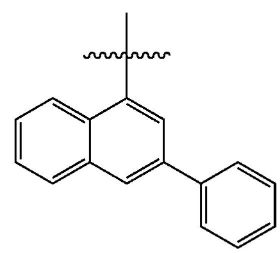 [SMILES: *c1cc(-c2ccccc2)cc2ccccc12] |
| 40-18 | 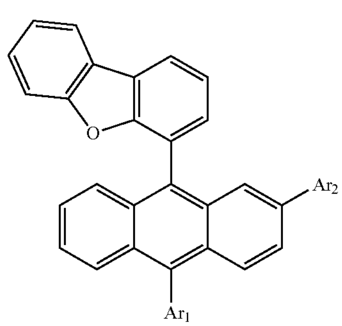 | 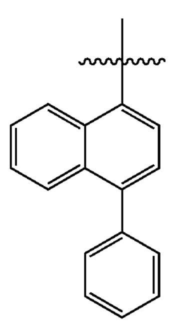 [SMILES: *c1ccc(-c2ccccc2)c2ccccc12] | 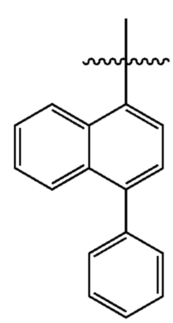 [SMILES: *c1ccc(-c2ccccc2)c2ccccc12] |

-continued
| No. | | Ar1 | Ar2 |
|---|---|---|---|
| 40-19 | 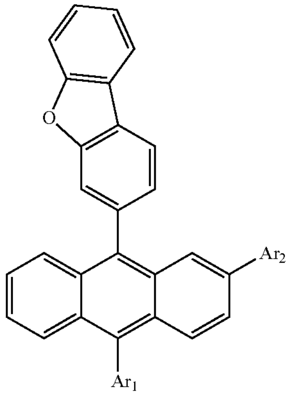 | 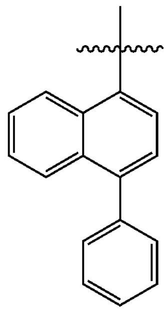 [SMILES: *c1ccc(-c2ccccc2)c2ccccc12] | 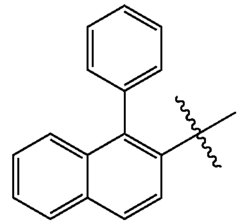 [SMILES: *c1ccc2ccccc2c1-c1ccccc1] |
| 40-20 | 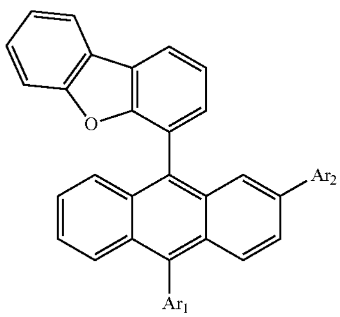 | 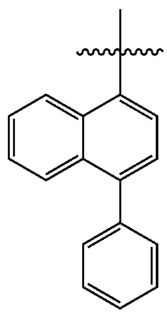 [SMILES: *c1ccc(-c2ccccc2)c2ccccc12] | 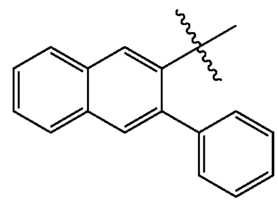 [SMILES: *c1cc2ccccc2cc1-c1ccccc1] |
| 40-21 | 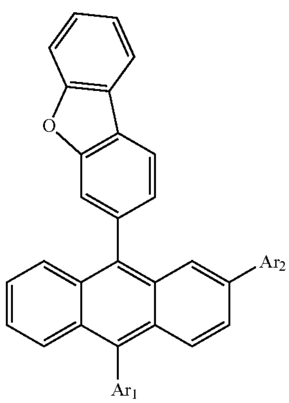 | 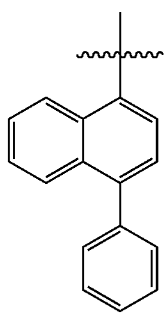 [SMILES: *c1ccc(-c2ccccc2)c2ccccc12] | 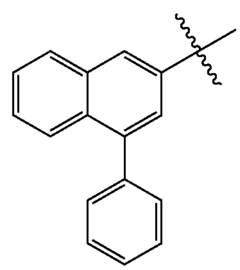 [SMILES: *c1cc(-c2ccccc2)c2ccccc2c1] |
| 40-22 | 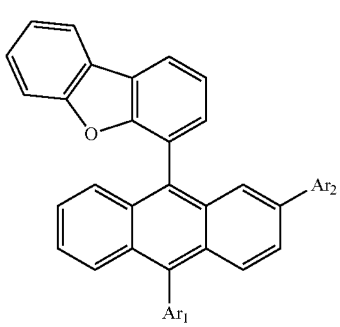 | 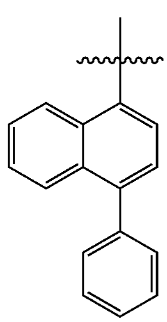 [SMILES: *c1ccc(-c2ccccc2)c2ccccc12] | 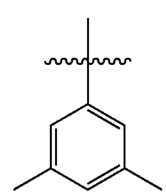 |

-continued
| No. | | Ar1 | Ar2 |
| --- | --- | --- | --- |
| 40-23 | 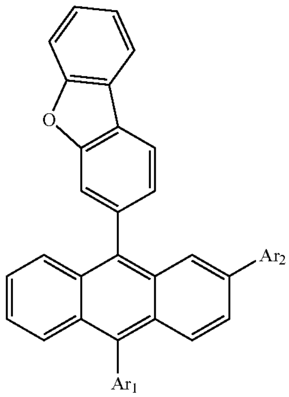 | 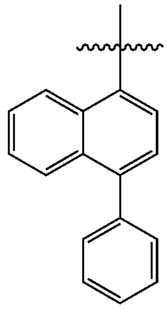 [SMILES: *c1ccc(-c2ccccc2)c2ccccc12] | 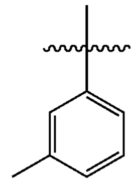 |
| 40-24 | 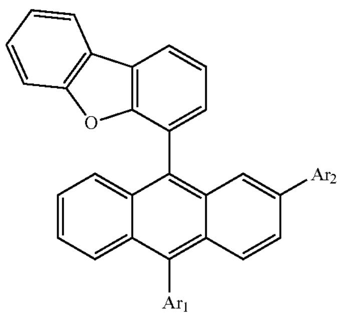 | 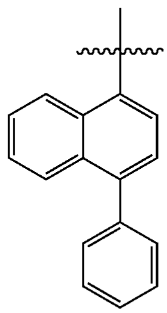 [SMILES: *c1ccc(-c2ccccc2)c2ccccc12] | 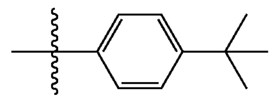 [SMILES: *c1ccc(C(C)(C)C)cc1] |
| 40-25 | 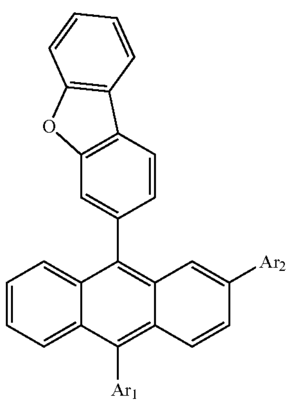 | 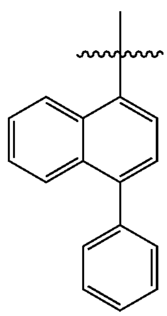 [SMILES: *c1ccc(-c2ccccc2)c2ccccc12] | 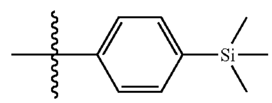 [SMILES: *c1ccc([Si](C)(C)C)cc1] |
| 40-26 | 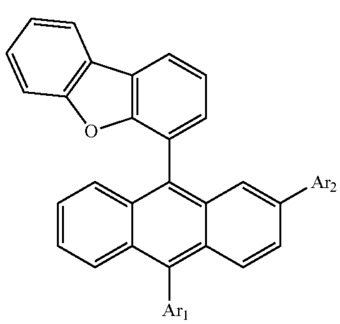 | 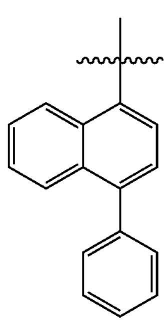 [SMILES: *c1ccc(-c2ccccc2)c2ccccc12] | 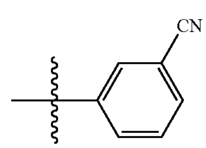 [SMILES: *c1cccc(C#N)c1] |

-continued
| No. | | Ar1 | Ar2 |
|---|---|---|---|
| 40-27 | 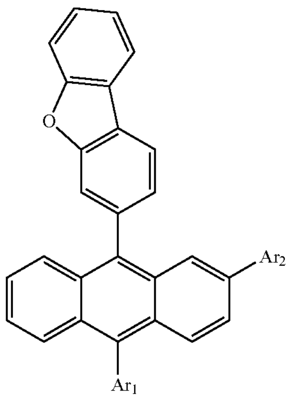 | 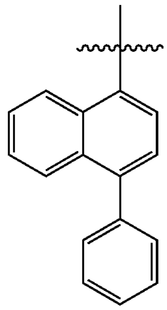 [SMILES: *c1ccc(-c2ccccc2)c2ccccc12] | 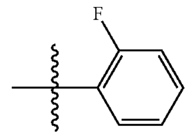 [SMILES: *c1ccccc1F] |
| 40-28 | 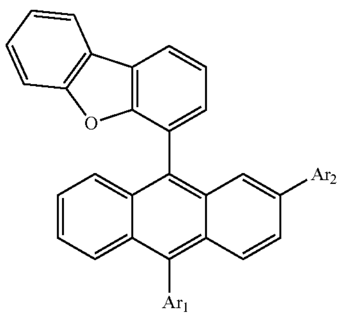 | 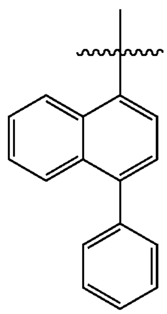 [SMILES: *c1ccc(-c2ccccc2)c2ccccc12] | 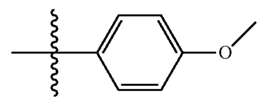 [SMILES: *c1ccc(OC)cc1] |
| 41-1 | 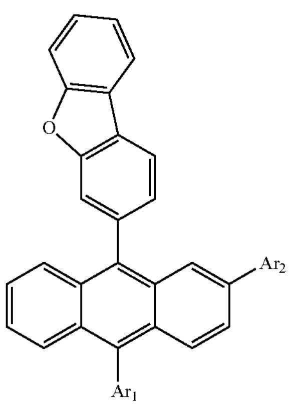 | 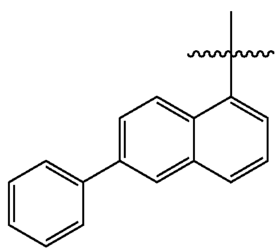 [SMILES: *c1cccc2cc(-c3ccccc3)ccc12] | 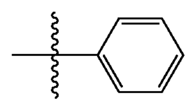 |
| 41-2 | 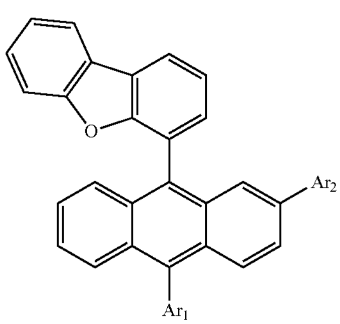 | 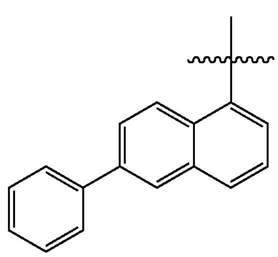 [SMILES: *c1cccc2cc(-c3ccccc3)ccc12] | 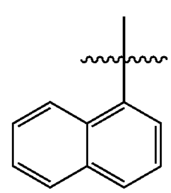 [SMILES: *c1cccc2ccccc12] |

-continued
| No. | | Ar1 | Ar2 |
|---|---|---|---|
| 41-3 | 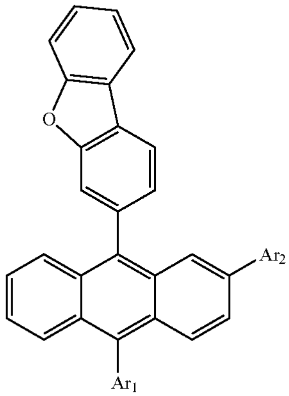 | 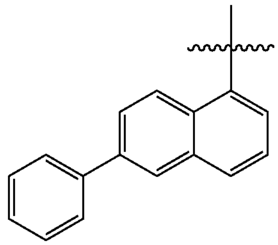 [SMILES: *c1cccc2cc(-c3ccccc3)ccc12] | 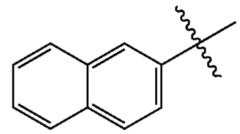 [SMILES: *c1ccc2ccccc2c1] |
| 41-4 | 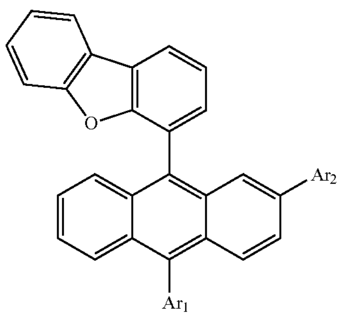 | 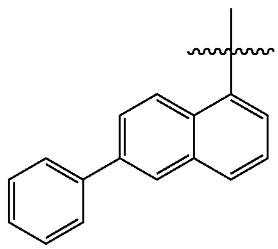 [SMILES: *c1cccc2cc(-c3ccccc3)ccc12] | 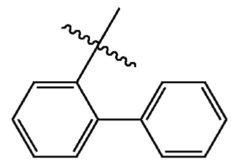 [SMILES: *c1ccccc1-c1ccccc1] |
| 41-5 | 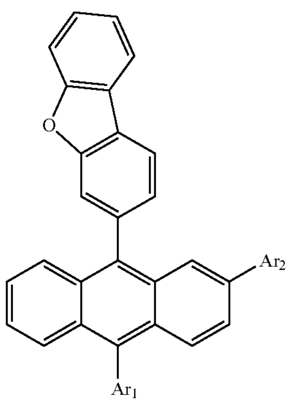 | 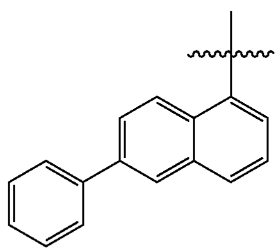 [SMILES: *c1cccc2cc(-c3ccccc3)ccc12] | 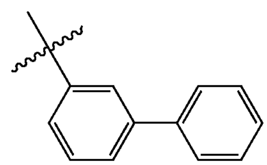 [SMILES: *c1cccc(-c2ccccc2)c1] |
| 41-6 | 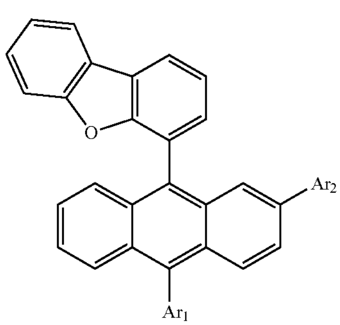 | 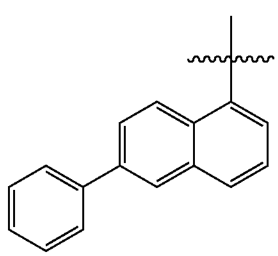 [SMILES: *c1cccc2cc(-c3ccccc3)ccc12] | 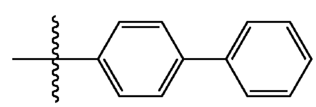 |

-continued
| No. | | Ar1 | Ar2 |
|---|---|---|---|
| 41-7 | 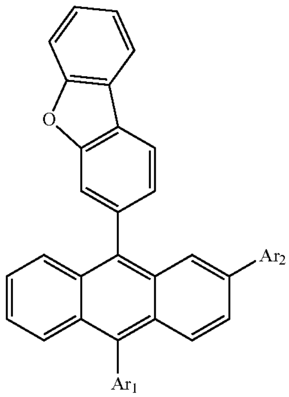 | 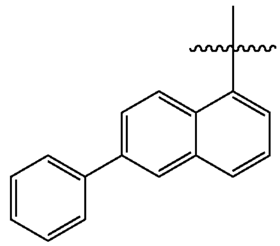 [SMILES: *c1cccc2cc(-c3ccccc3)ccc12] | 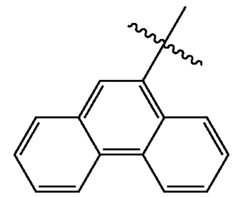 [SMILES: *c1cc2ccccc2c2ccccc12] |
| 41-9 | 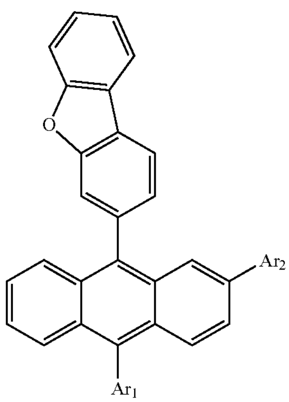 | 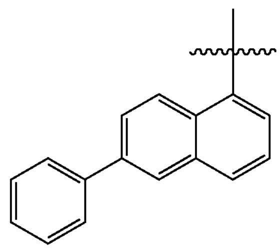 [SMILES: *c1cccc2cc(-c3ccccc3)ccc12] | 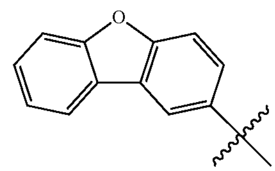 [SMILES: *c1ccc2oc3ccccc3c2c1] |
| 41-10 | 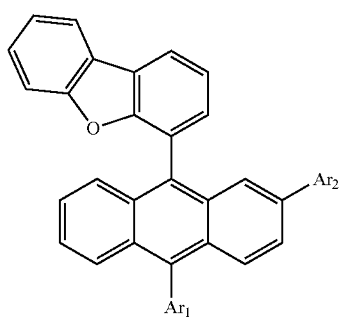 | 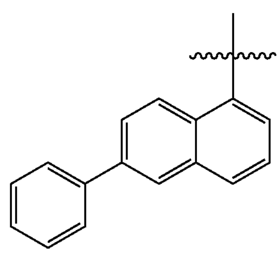 [SMILES: *c1cccc2cc(-c3ccccc3)ccc12] | 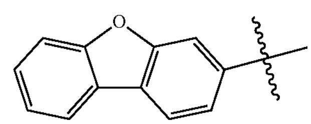 |
| 41-11 | 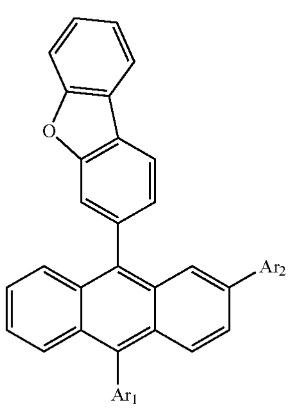 | 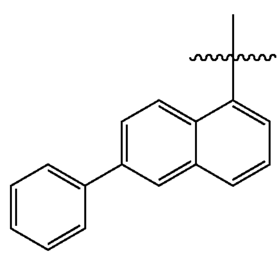 [SMILES: *c1cccc2cc(-c3ccccc3)ccc12] | 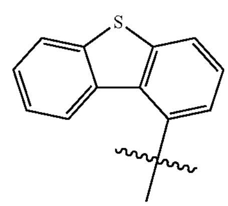 [SMILES: *c1cccc2sc3ccccc3c12] |

-continued
| No. | | Ar1 | Ar2 |
|---|---|---|---|
| 41-12 | 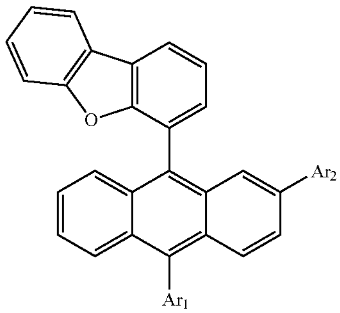 | 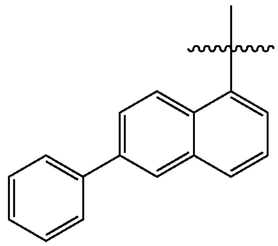 [SMILES: *c1cccc2cc(-c3ccccc3)ccc12] | 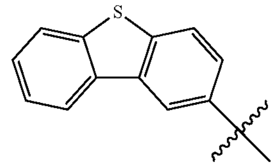 |
| 41-13 | 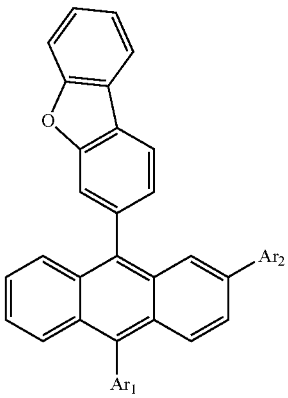 | 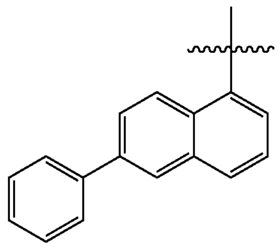 [SMILES: *c1cccc2cc(-c3ccccc3)ccc12] | 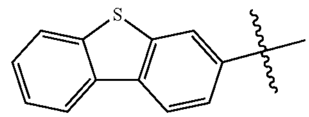 |
| 41-17 | 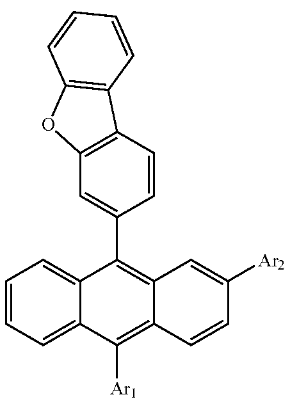 | 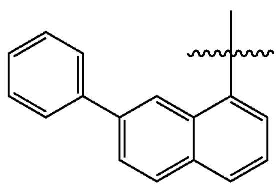 [SMILES: *c1cccc2ccc(-c3ccccc3)cc12] | 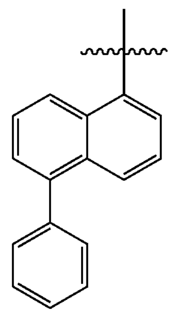 [SMILES: *c1cccc2c(-c3ccccc3)cccc12] |
| 41-18 | 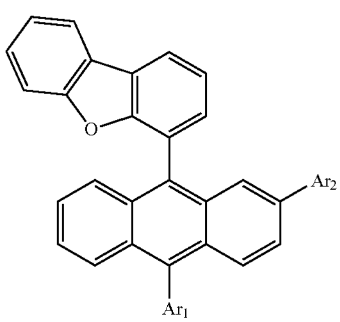 | 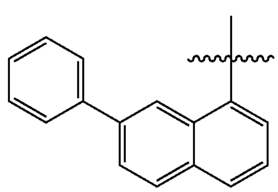 [SMILES: *c1cccc2ccc(-c3ccccc3)cc12] | 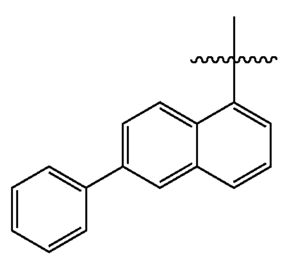 [SMILES: *c1cccc2cc(-c3ccccc3)ccc12] |

-continued
| No. | | Ar1 | Ar2 |
|---|---|---|---|
| 41-19 | 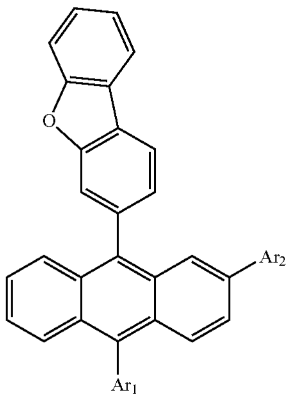 | 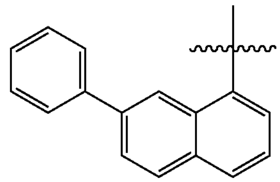 [SMILES: *c1cccc2ccc(-c3ccccc3)cc12] | 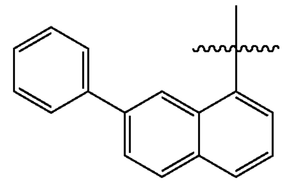 [SMILES: *c1cccc2ccc(-c3ccccc3)cc12] |
| 41-20 | 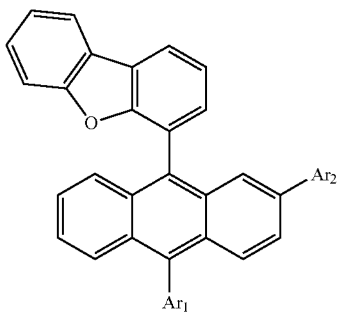 | 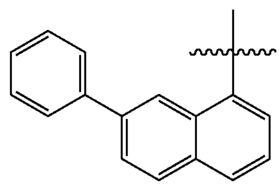 [SMILES: *c1cccc2ccc(-c3ccccc3)cc12] | 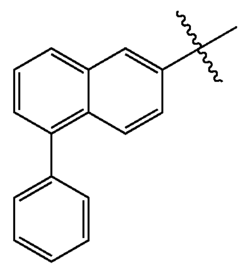 [SMILES: *c1ccc2c(-c3ccccc3)cccc2c1] |
| 41-21 | 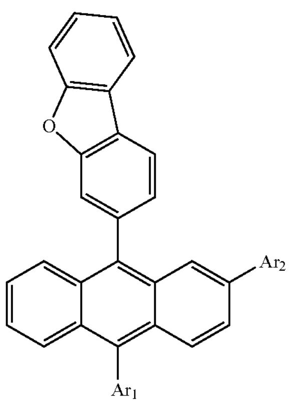 | 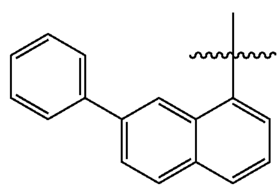 [SMILES: *c1cccc2ccc(-c3ccccc3)cc12] | 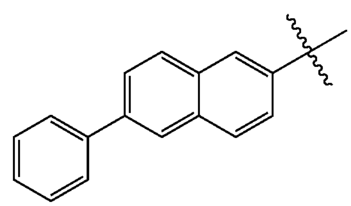 [SMILES: *c1ccc2cc(-c3ccccc3)ccc2c1] |
| 41-22 | 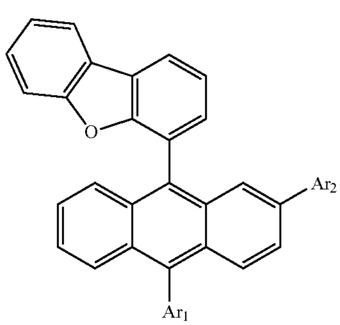 | 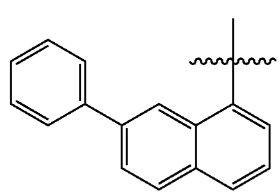 [SMILES: *c1cccc2ccc(-c3ccccc3)cc12] | 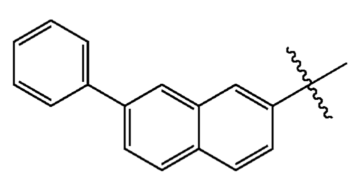 [SMILES: *c1ccc2ccc(-c3ccccc3)cc2c1] |

-continued
| No. | | Ar1 | Ar2 |
|---|---|---|---|
| 41-23 | 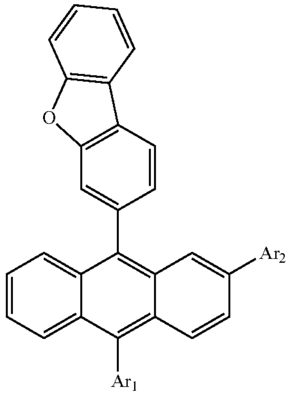 | 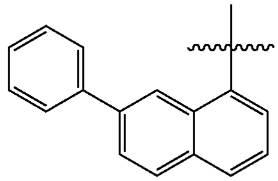 [SMILES: *c1cccc2ccc(-c3ccccc3)cc12] | 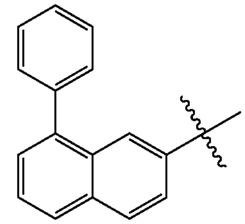 [SMILES: *c1ccc2cccc(-c3ccccc3)c2c1] |
| 41-24 | 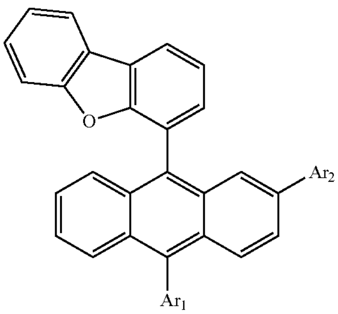 | 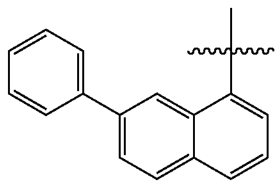 [SMILES: *c1cccc2ccc(-c3ccccc3)cc12] | 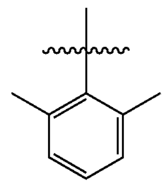 |
| 41-25 | 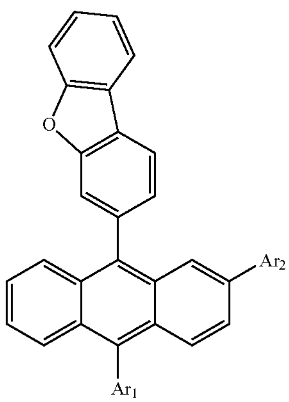 | 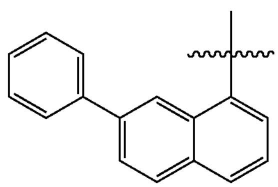 [SMILES: *c1cccc2ccc(-c3ccccc3)cc12] | 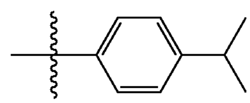 [SMILES: *c1ccc(C(C)C)cc1] |
| 41-26 | 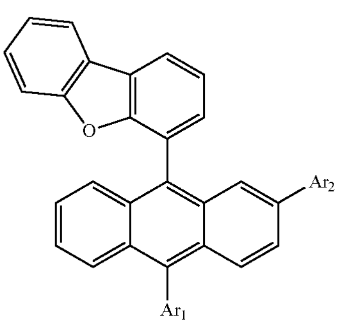 | 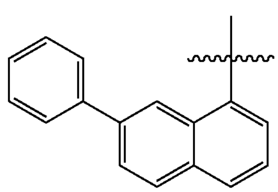 [SMILES: *c1cccc2ccc(-c3ccccc3)cc12] | 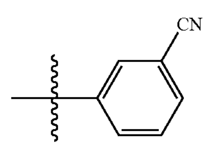 [SMILES: *c1cccc(C#N)c1] |

-continued
| No. | | Ar1 | Ar2 |
|---|---|---|---|
| 41-27 | 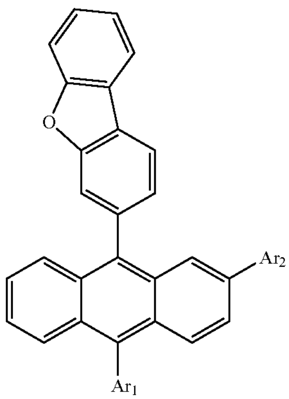 | 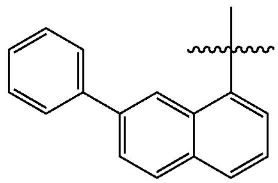 [SMILES: *c1cccc2ccc(-c3ccccc3)cc12] | 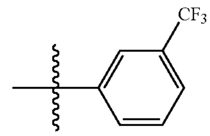 [SMILES: *c1cccc(C(F)(F)F)c1] |
| 41-28 | 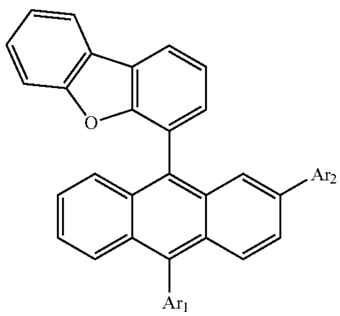 | 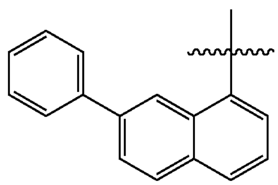 [SMILES: *c1cccc2ccc(-c3ccccc3)cc12] | 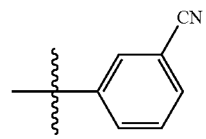 [SMILES: *c1cccc(C#N)c1] |
| 41-29 | 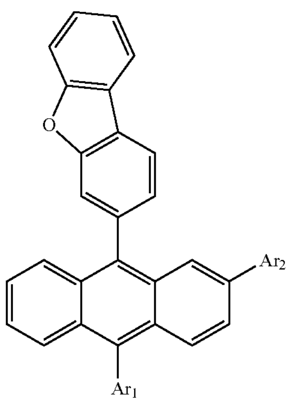 | 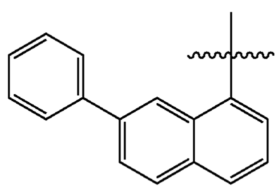 [SMILES: *c1cccc2ccc(-c3ccccc3)cc12] | 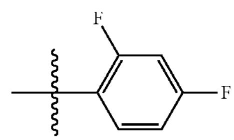 [SMILES: *c1ccc(F)cc1F] |
| 42-1 | 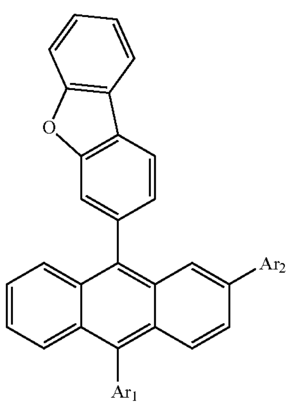 | 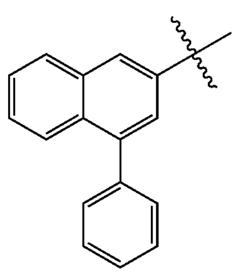 [SMILES: *c1cc(-c2ccccc2)c2ccccc2c1] | 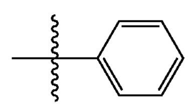 [SMILES: *c1ccccc1] |

-continued
| No. | | Ar1 | Ar2 |
|---|---|---|---|
| 42-2 | 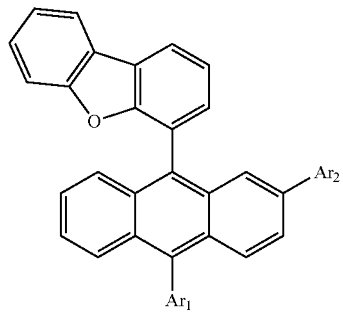  | 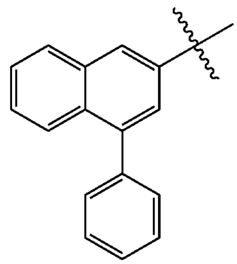 [SMILES: *c1cc(-c2ccccc2)c2ccccc2c1] | 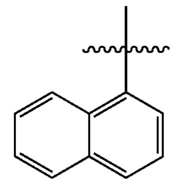 [SMILES: *c1cccc2ccccc12] |
| 42-3 | 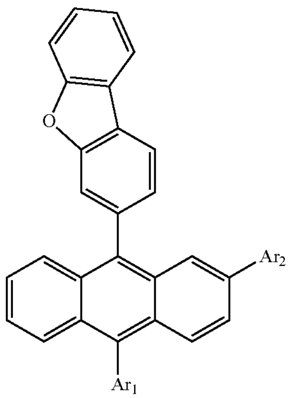  | 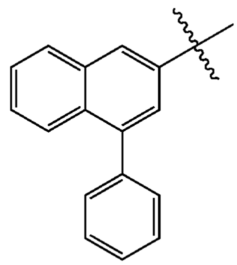 [SMILES: *c1cc(-c2ccccc2)c2ccccc2c1] | 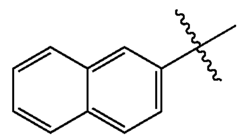 [SMILES: *c1ccc2ccccc2c1] |
| 42-4 | 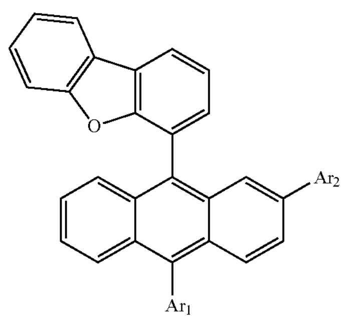  | 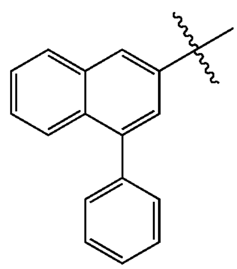 [SMILES: *c1cc(-c2ccccc2)c2ccccc2c1] | 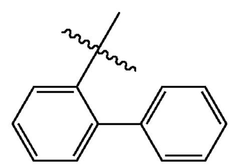 [SMILES: *c1ccccc1-c1ccccc1] |
| 42-5 | 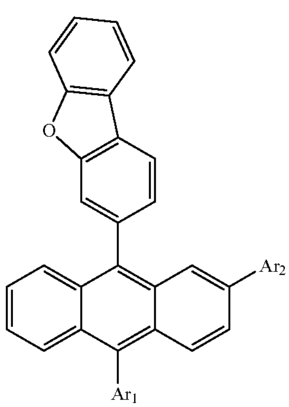  | 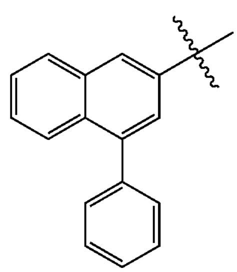 [SMILES: *c1cc(-c2ccccc2)c2ccccc2c1] | 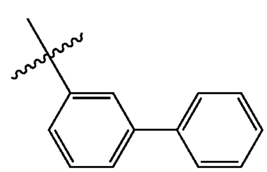 [SMILES: *c1cccc(-c2ccccc2)c1] |

-continued
| No. | | Ar1 | Ar2 |
|---|---|---|---|
| 42-6 | 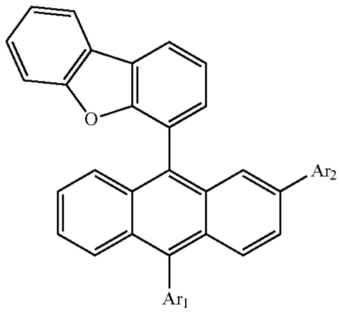 | 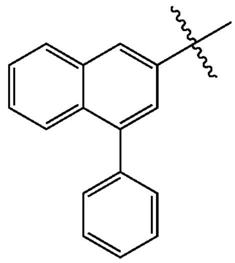 [SMILES: *c1cc(-c2ccccc2)c2ccccc2c1] | 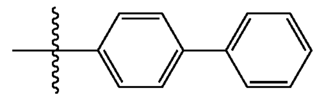 |
| 42-7 | 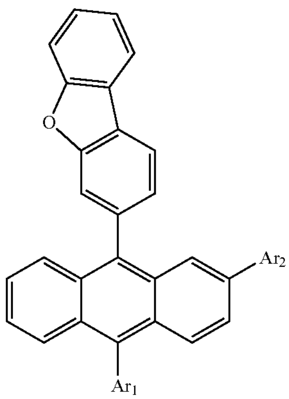 | 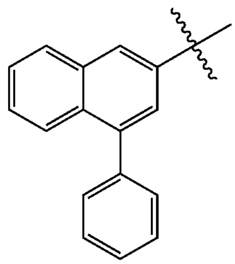 [SMILES: *c1cc(-c2ccccc2)c2ccccc2c1] | 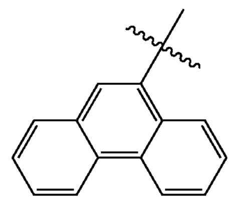 [SMILES: *c1cc2ccccc2c2ccccc12] |
| 42-9 | 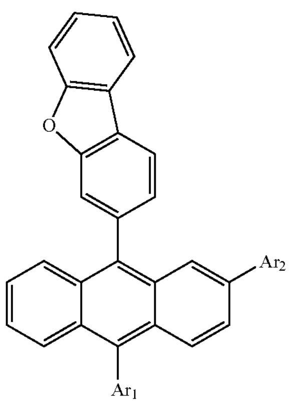 | 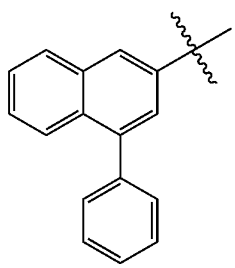 [SMILES: *c1cc(-c2ccccc2)c2ccccc2c1] | 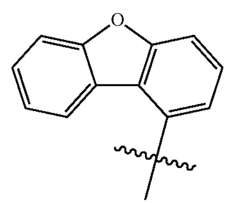 [SMILES: *c1cccc2oc3ccccc3c12] |
| 42-10 | 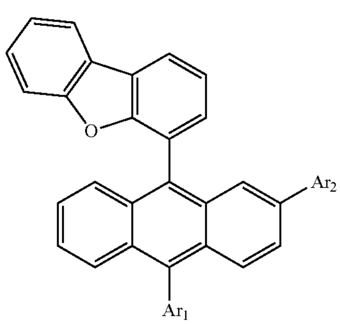 | 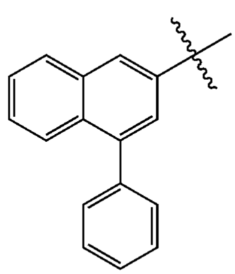 [SMILES: *c1cc(-c2ccccc2)c2ccccc2c1] | 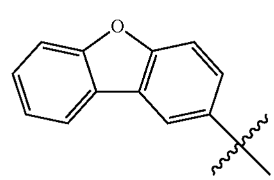 |

-continued
| No. | | Ar1 | Ar2 |
|---|---|---|---|
| 42-11 | 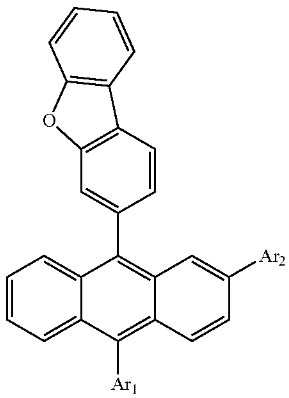 | 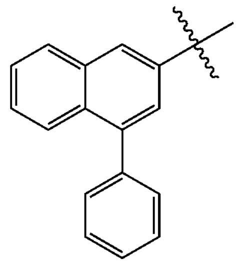 [SMILES: *c1cc(-c2ccccc2)c2ccccc2c1] | 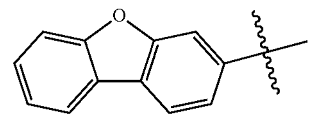 [SMILES: *c1ccc2c(c1)oc1ccccc12] |
| 42-12 | 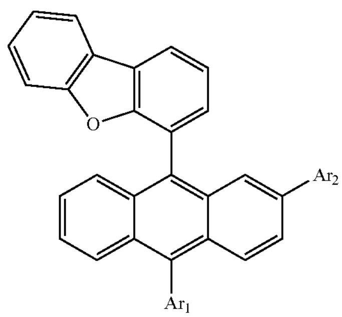 | 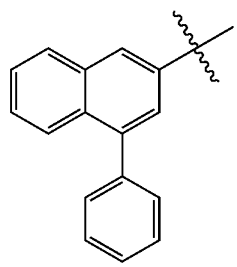 [SMILES: *c1cc(-c2ccccc2)c2ccccc2c1] | 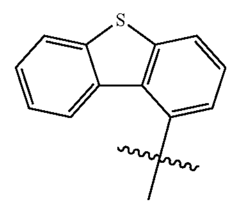 |
| 42-13 | 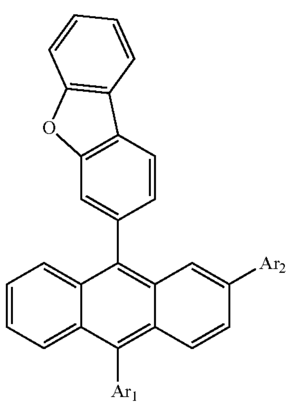 | 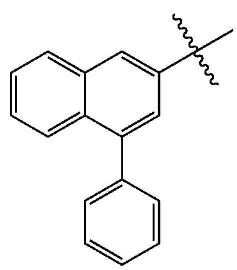 [SMILES: *c1cc(-c2ccccc2)c2ccccc2c1] | 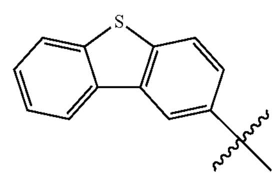 |
| 42-14 | 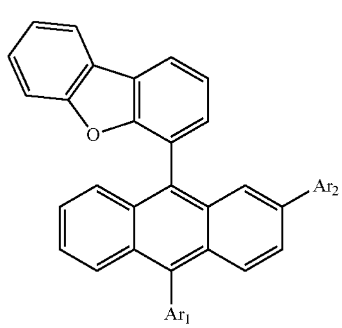 | 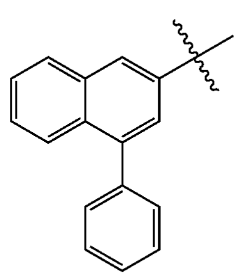 [SMILES: *c1cc(-c2ccccc2)c2ccccc2c1] | 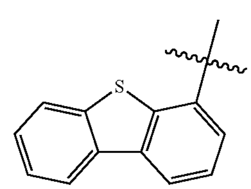 |

-continued
| No. | | Ar1 | Ar2 |
|---|---|---|---|
| 42-19 | 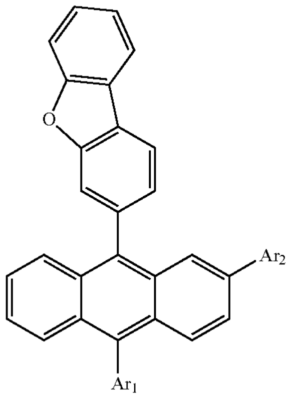 | 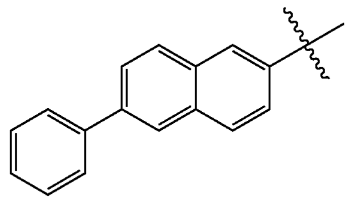 [SMILES: *c1ccc2cc(-c3ccccc3)ccc2c1] | 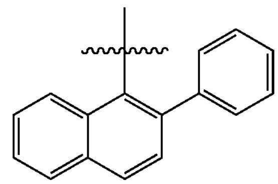 [SMILES: *c1c(-c2ccccc2)ccc2ccccc12] |
| 42-20 | 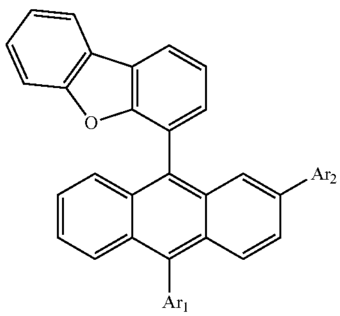 | 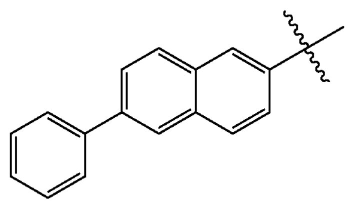 [SMILES: *c1ccc2cc(-c3ccccc3)ccc2c1] | 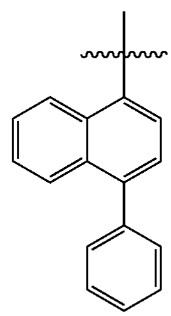 [SMILES: *c1ccc(-c2ccccc2)c2ccccc12] |
| 42-21 | 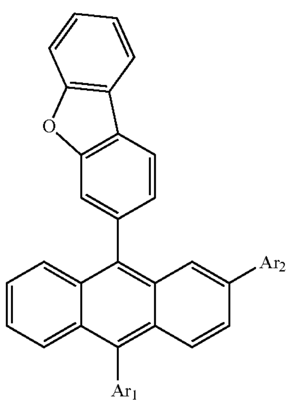 | 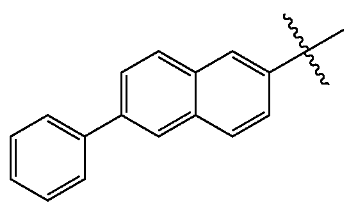 [SMILES: *c1ccc2cc(-c3ccccc3)ccc2c1] | 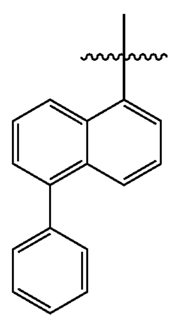 [SMILES: *c1cccc2c(-c3ccccc3)cccc12] |
| 42-22 | 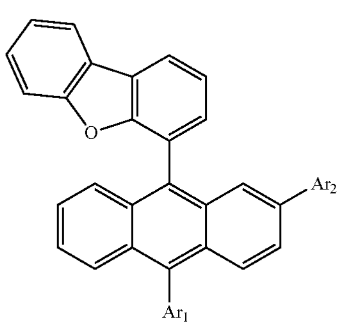 | 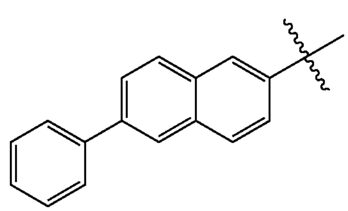 [SMILES: *c1ccc2cc(-c3ccccc3)ccc2c1] | 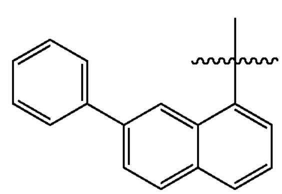 [SMILES: *c1cccc2ccc(-c3ccccc3)cc12] |

-continued
| No. | | Ar1 | Ar2 |
|---|---|---|---|
| 42-23 | 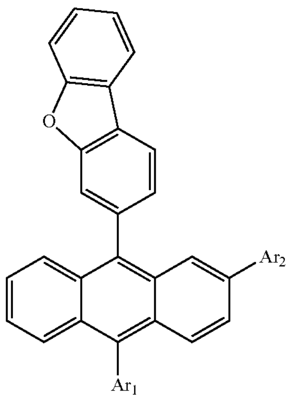 | 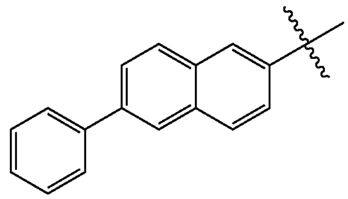 [SMILES: *c1ccc2cc(-c3ccccc3)ccc2c1] | 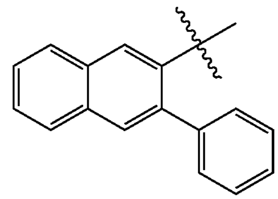 [SMILES: *c1cc2ccccc2cc1-c1ccccc1] |
| 42-24 | 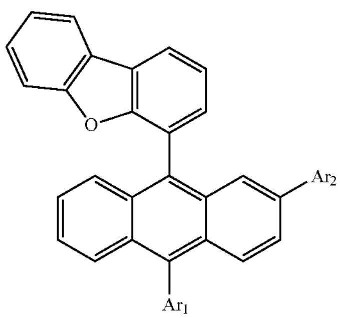 | 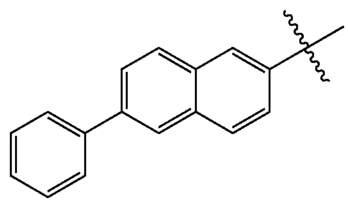 [SMILES: *c1ccc2cc(-c3ccccc3)ccc2c1] | 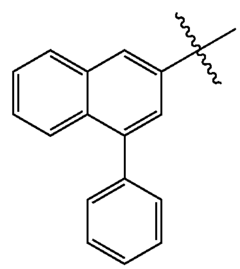 [SMILES: *c1cc(-c2ccccc2)c2ccccc2c1] |
| 42-25 | 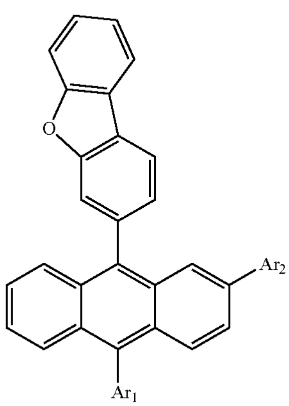 | 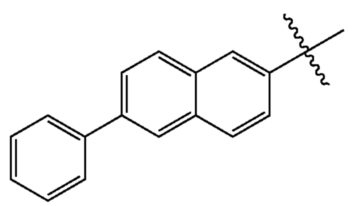 [SMILES: *c1ccc2cc(-c3ccccc3)ccc2c1] | 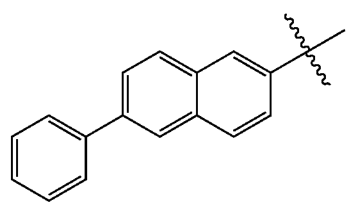 [SMILES: *c1ccc2cc(-c3ccccc3)ccc2c1] |
| 42-26 | 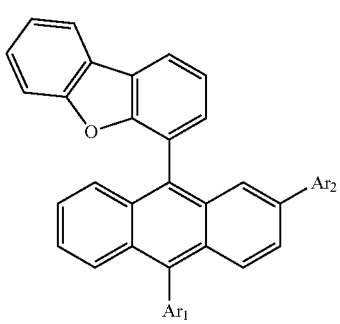 | 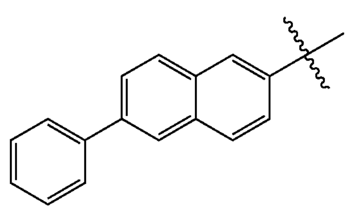 [SMILES: *c1ccc2cc(-c3ccccc3)ccc2c1] | 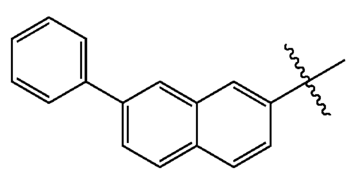 [SMILES: *c1ccc2ccc(-c3ccccc3)cc2c1] |

-continued
| No. | | Ar1 | Ar2 |
| --- | --- | --- | --- |
| 42-27 | 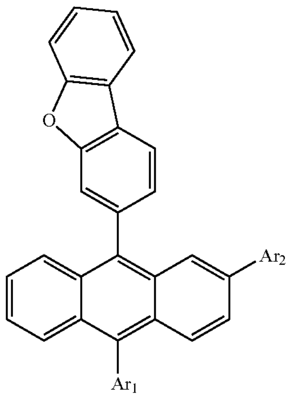 | 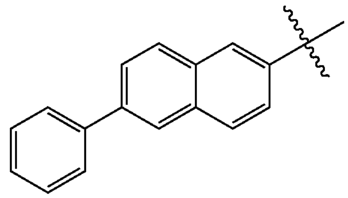 [SMILES: *c1ccc2cc(-c3ccccc3)ccc2c1] | 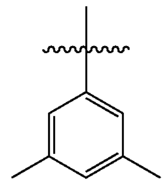 |
| 42-28 | 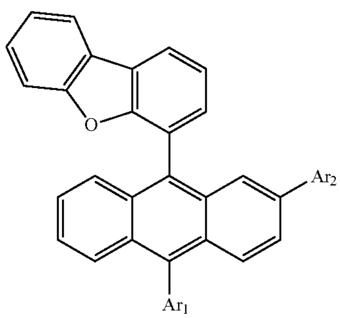 | 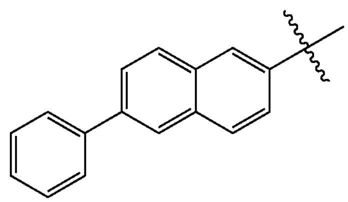 [SMILES: *c1ccc2cc(-c3ccccc3)ccc2c1] | 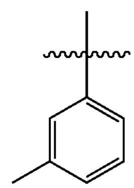 |
| 42-29 | 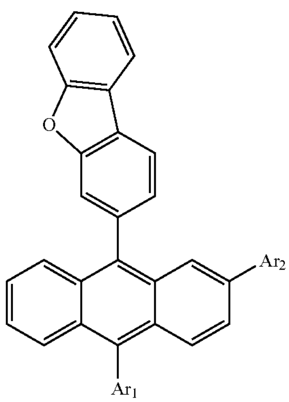 | 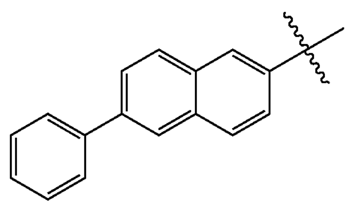 [SMILES: *c1ccc2cc(-c3ccccc3)ccc2c1] | 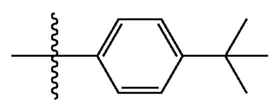 |
| 42-30 | 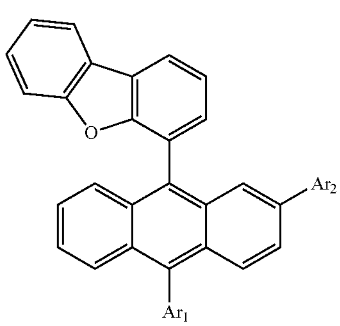 | 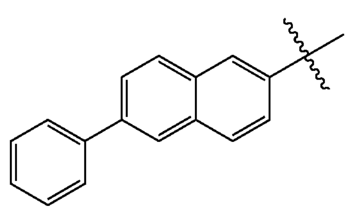 [SMILES: *c1ccc2cc(-c3ccccc3)ccc2c1] | 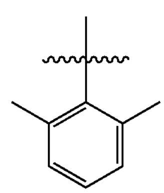 |

-continued
| No. | | Ar1 | Ar2 |
|---|---|---|---|
| 42-31 | 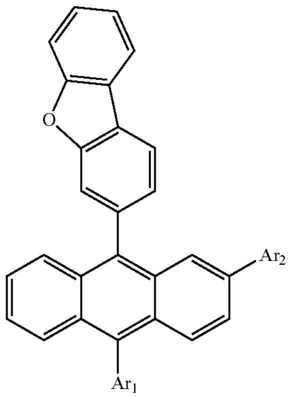 | 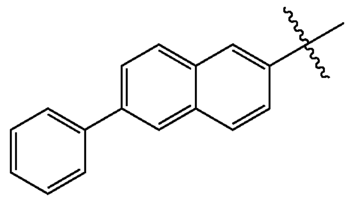 [SMILES: *c1ccc2cc(-c3ccccc3)ccc2c1] | 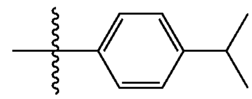 [SMILES: *c1ccc(C(C)C)cc1] |
| 43-1 | 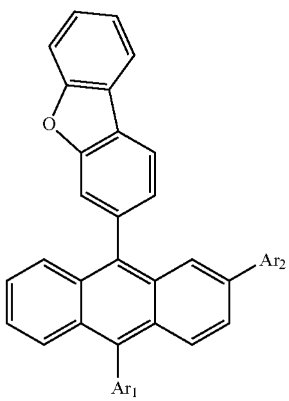 | 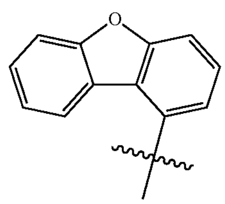 [SMILES: *c1cccc2oc3ccccc3c12] | 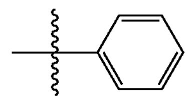 |
| 43-2 | 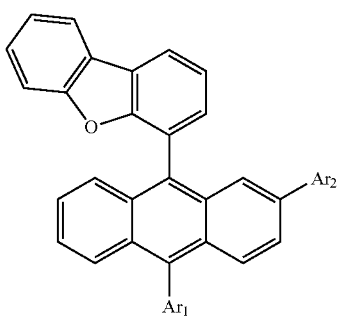 | 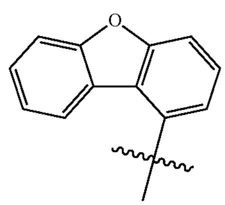 [SMILES: *c1cccc2oc3ccccc3c12] | 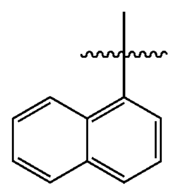 [SMILES: *c1cccc2ccccc12] |
| 43-3 | 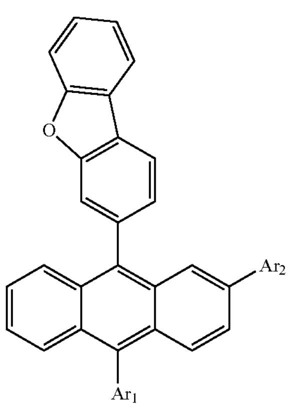 | 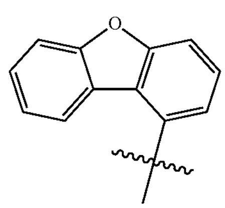 | 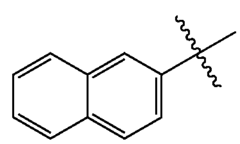 [SMILES: *c1ccc2ccccc2c1] |

-continued
| No. | | Ar1 | Ar2 |
|---|---|---|---|
| 43-4 | 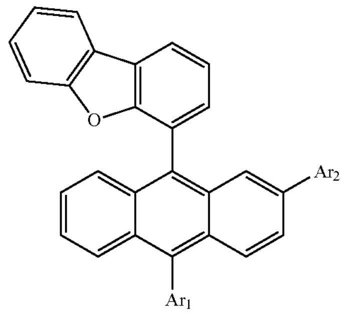 | 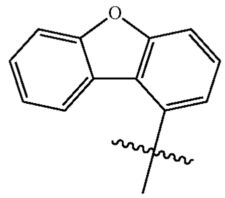 | 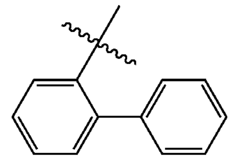 [SMILES: *c1ccccc1-c1ccccc1] |
| 43-5 | 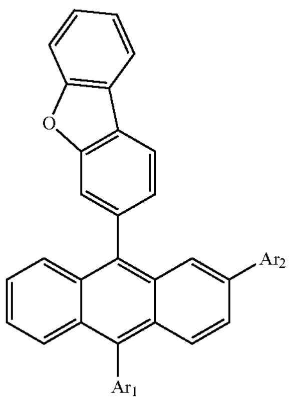 | 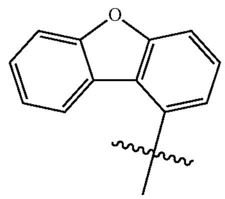 [SMILES: *c1cccc2oc3ccccc3c12] | 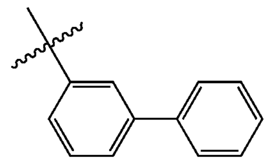 [SMILES: *c1cccc(-c2ccccc2)c1] |
| 43-6 | 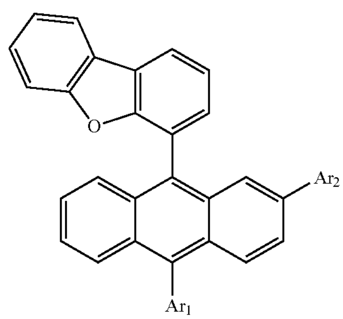 | 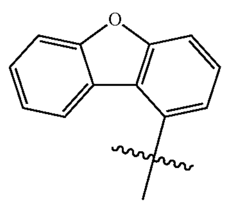 [SMILES: *c1cccc2oc3ccccc3c12] | 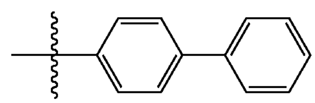 [SMILES: *c1ccc(-c2ccccc2)cc1] |
| 43-7 | 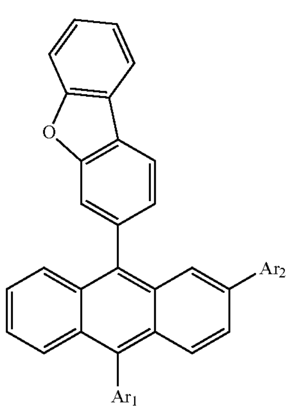 | 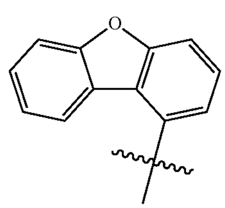 [SMILES: *c1cccc2oc3ccccc3c12] | 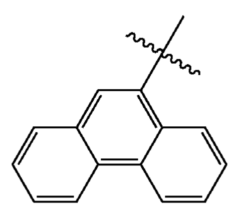 [SMILES: *c1cc2ccccc2c2ccccc12] |

-continued
| No. | | Ar1 | Ar2 |
|---|---|---|---|
| 43-9 | 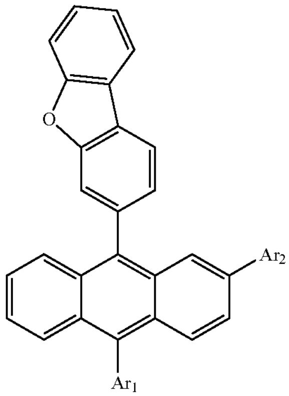 | 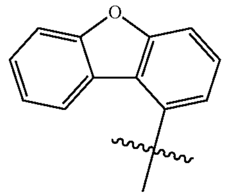 [SMILES: *c1cccc2oc3ccccc3c12] | 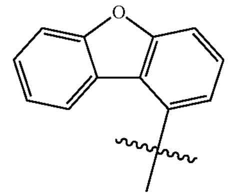 [SMILES: *c1cccc2oc3ccccc3c12] |
| 43-10 | 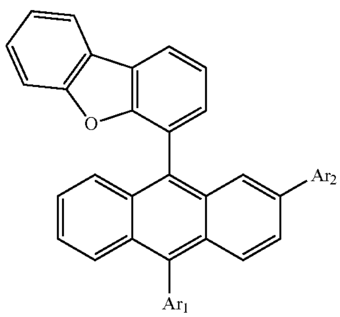 | 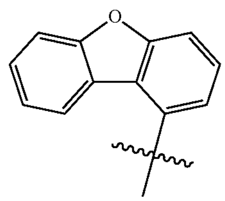 [SMILES: *c1cccc2oc3ccccc3c12] | 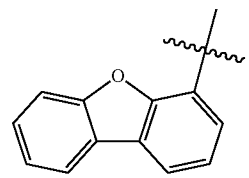 [SMILES: *c1cccc2c1oc1ccccc12] |
| 43-11 | 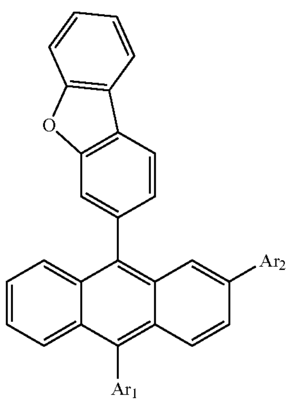 | 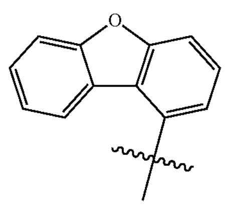 [SMILES: *c1cccc2oc3ccccc3c12] | 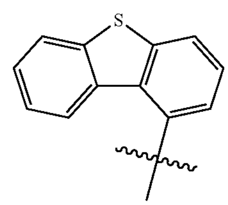 [SMILES: *c1cccc2sc3ccccc3c12] |
| 43-12 | 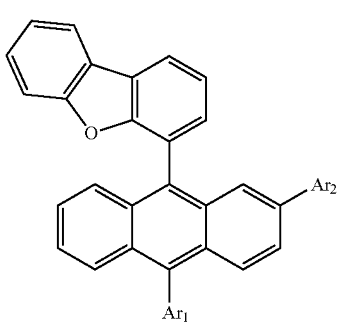 | 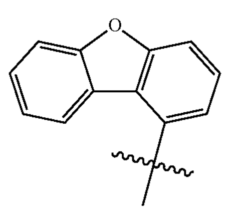 [SMILES: *c1cccc2oc3ccccc3c12] | 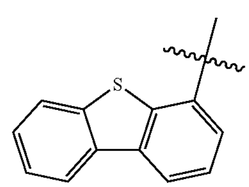 |

-continued
| No. | | Ar1 | Ar2 |
|---|---|---|---|
| 43-16 | 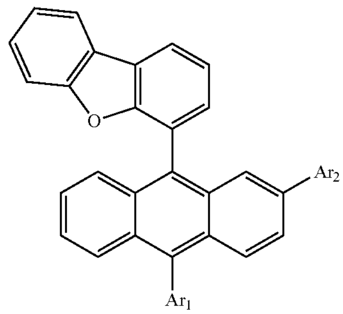 | 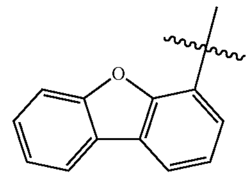 [SMILES: *c1cccc2c1oc1ccccc12] | 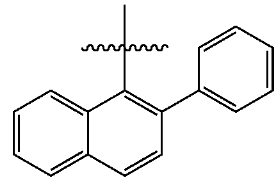 [SMILES: *c1c(-c2ccccc2)ccc2ccccc12] |
| 43-17 | 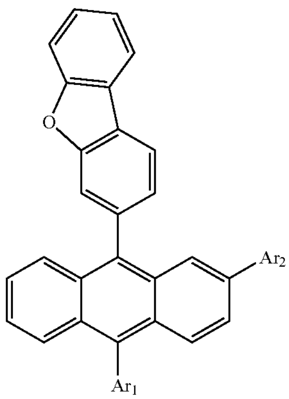 | 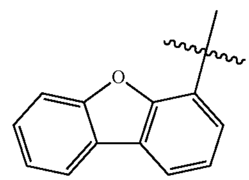 [SMILES: *c1cccc2c1oc1ccccc12] | 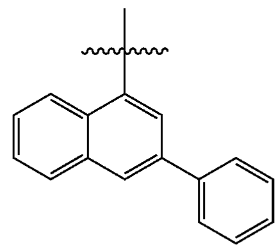 [SMILES: *c1cc(-c2ccccc2)cc2ccccc12] |
| 43-18 | 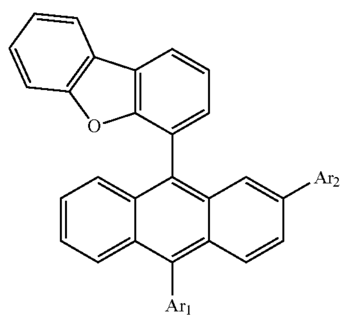 | 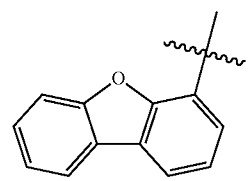 | 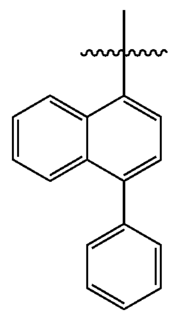 [SMILES: *c1ccc(-c2ccccc2)c2ccccc12] |
| 43-19 | 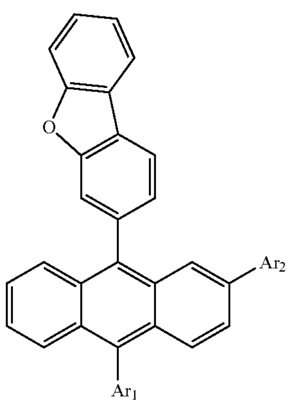 | 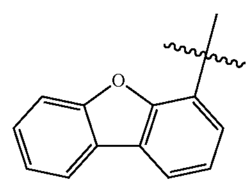 | 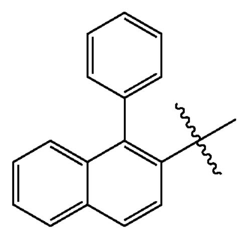 [SMILES: *c1ccc2ccccc2c1-c1ccccc1] |

-continued
| No. | | Ar1 | Ar2 |
|---|---|---|---|
| 43-20 | 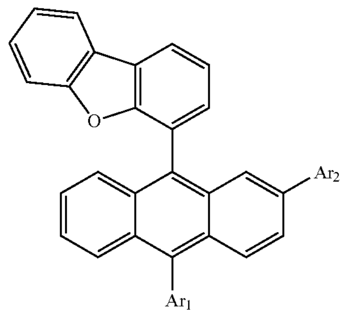 | 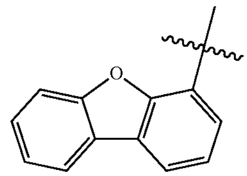 | 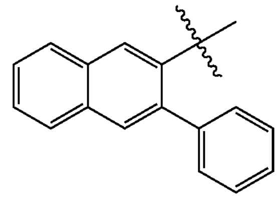 [SMILES: *c1cc2ccccc2cc1-c1ccccc1] |
| 43-21 | 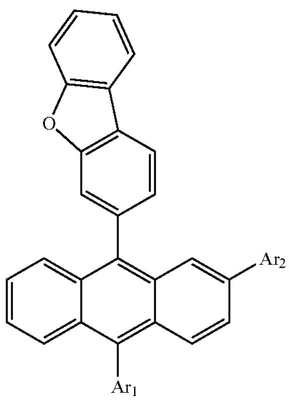 | 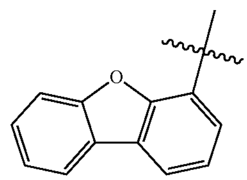 | 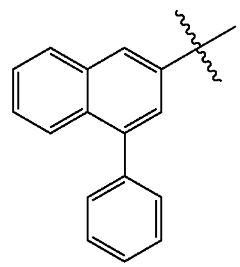 [SMILES: *c1cc(-c2ccccc2)c2ccccc2c1] |
| 43-22 | 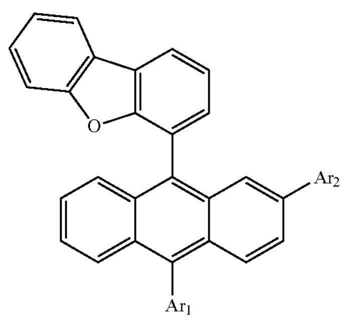 | 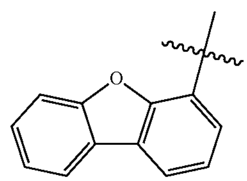 | 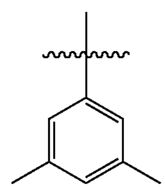 |
| 43-23 | 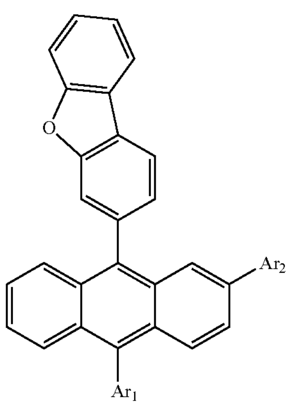 | 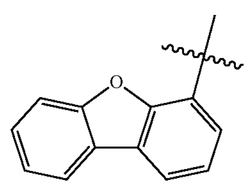 [SMILES: *c1cccc2c1oc1ccccc12] | 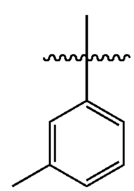 [SMILES: *c1cccc(C)c1] |

-continued
| No. | | Ar1 | Ar2 |
|---|---|---|---|
| 43-24 | 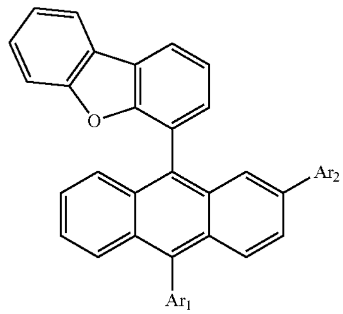 | 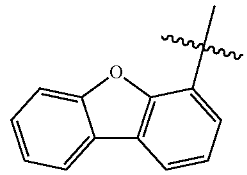 [SMILES: *c1cccc2c1oc1ccccc12] | 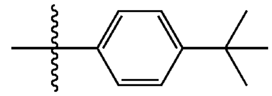 |
| 43-25 | 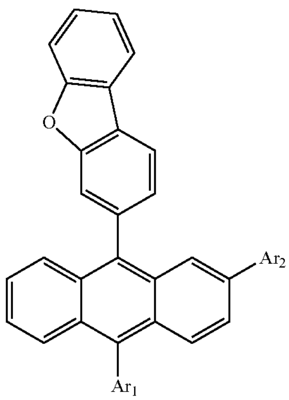 | 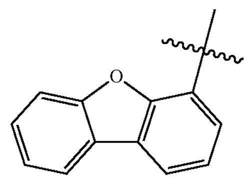 [SMILES: *c1cccc2c1oc1ccccc12] | 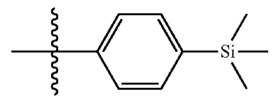 [SMILES: *c1ccc([Si](C)(C)C)cc1] |
| 43-26 | 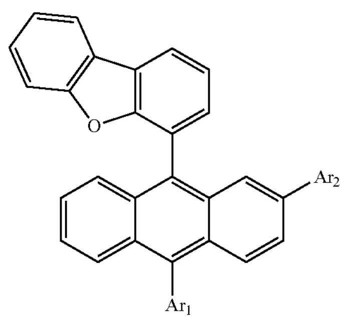 | 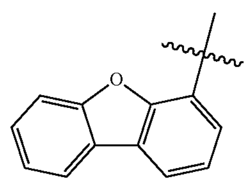 | 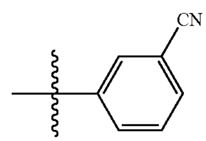 [SMILES: *c1cccc(C#N)c1] |
| 43-27 | 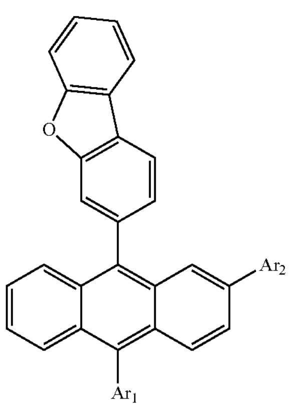 | 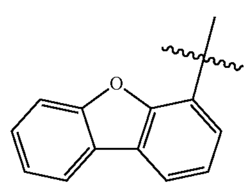 [SMILES: *c1cccc2c1oc1ccccc12] | 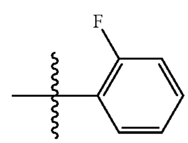 [SMILES: *c1ccccc1F] |

-continued
| No. | | Ar1 | Ar2 |
|---|---|---|---|
| 43-28 | 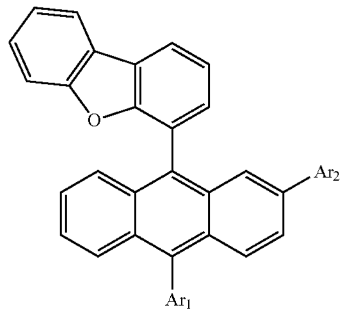 | 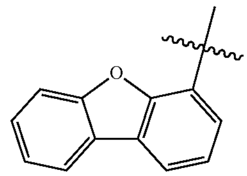 | 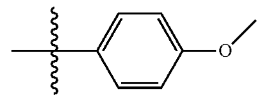 [SMILES: *c1ccc(OC)cc1] |
| 44-1 | 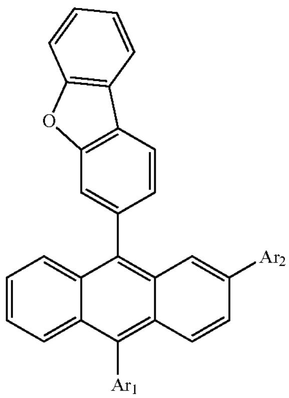 | 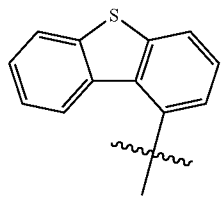 [SMILES: *c1cccc2sc3ccccc3c12] | 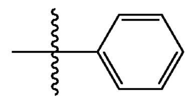 |
| 44-2 | 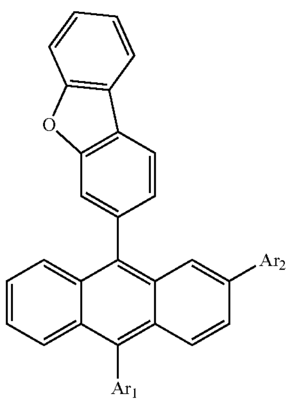 | 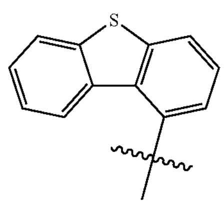 [SMILES: *c1cccc2sc3ccccc3c12] | 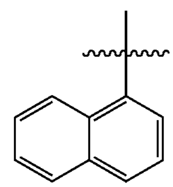 [SMILES: *c1cccc2ccccc12] |
| 44-3 | 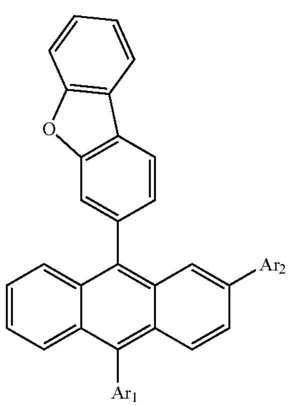 | 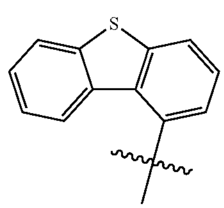 [SMILES: *c1cccc2sc3ccccc3c12] | 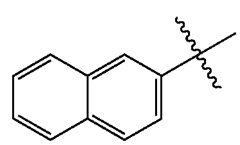 [SMILES: *c1ccc2ccccc2c1] |

-continued
| No. | | Ar1 | Ar2 |
|---|---|---|---|
| 44-4 | 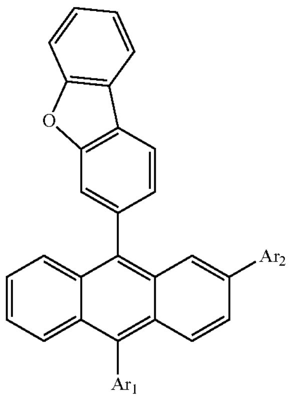 | 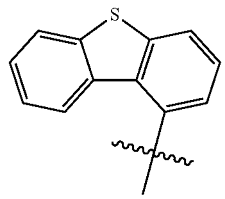 [SMILES: *c1cccc2sc3ccccc3c12] | 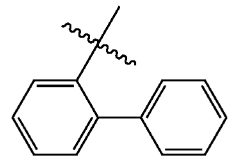 [SMILES: *c1ccccc1-c1ccccc1] |
| 44-5 | 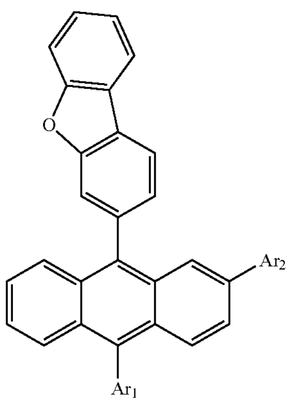 | 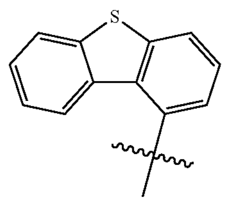 [SMILES: *c1cccc2sc3ccccc3c12] | 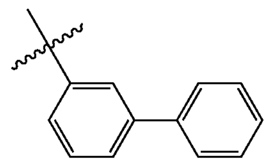 [SMILES: *c1cccc(-c2ccccc2)c1] |
| 44-6 | 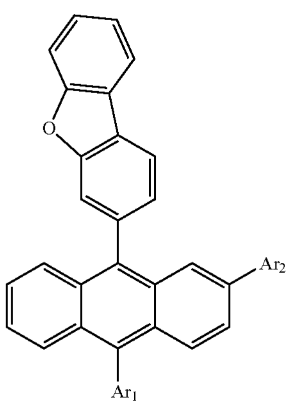 | 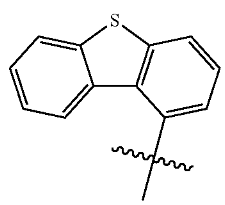 [SMILES: *c1cccc2sc3ccccc3c12] | 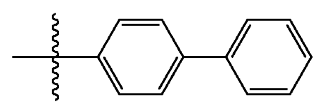 [SMILES: *c1ccc(-c2ccccc2)cc1] |
| 44-7 | 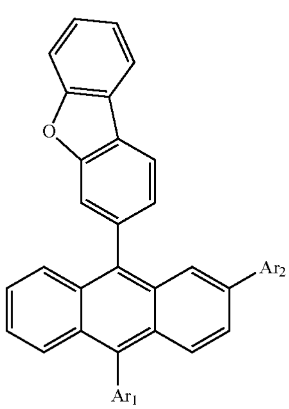 | 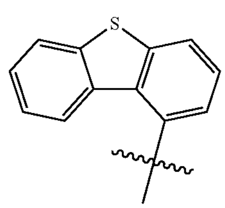 [SMILES: *c1cccc2sc3ccccc3c12] | 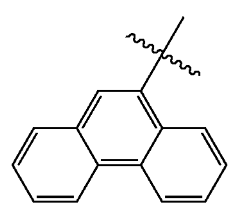 [SMILES: *c1cc2ccccc2c2ccccc12] |

-continued
| No. | | Ar1 | Ar2 |
|---|---|---|---|
| 44-9 | 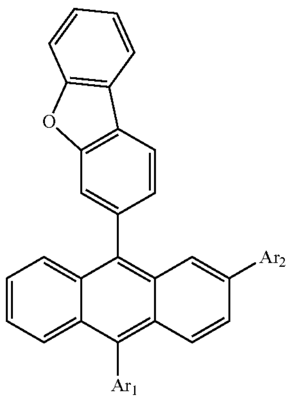 | 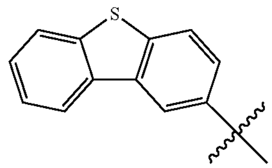 [SMILES: *c1ccc2sc3ccccc3c2c1] | 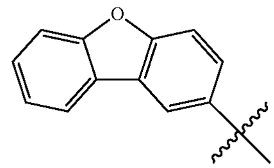 [SMILES: *c1ccc2oc3ccccc3c2c1] |
| 44-10 | 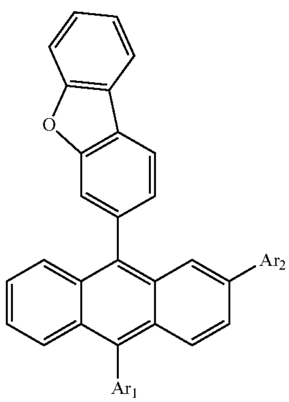 | 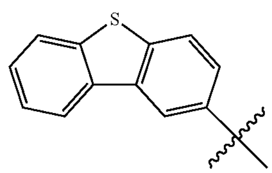 | 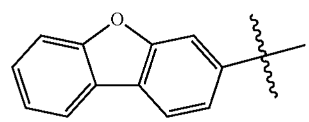 |
| 44-11 | 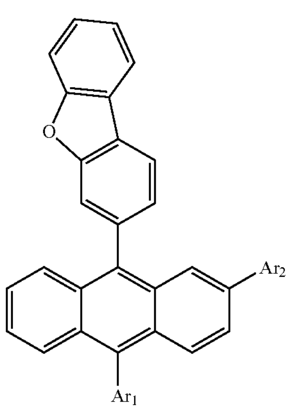 | 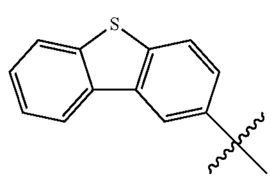 [SMILES: *c1ccc2sc3ccccc3c2c1] | 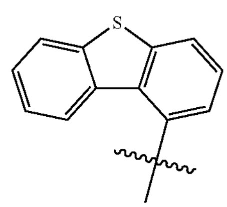 [SMILES: *c1cccc2sc3ccccc3c12] |

-continued
| No. | | Ar1 | Ar2 |
|---|---|---|---|
| 44-12 | 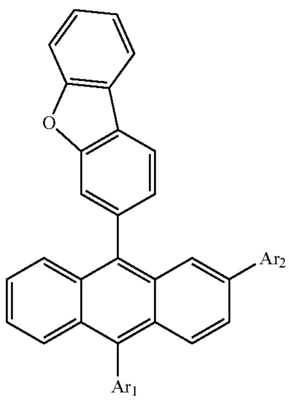 | 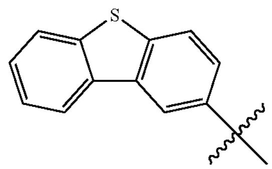 [SMILES: *c1ccc2sc3ccccc3c2c1] | 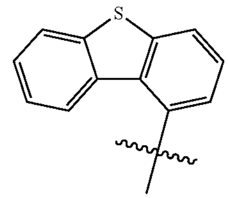 [SMILES: *c1cccc2sc3ccccc3c12] |
| 44-13 | 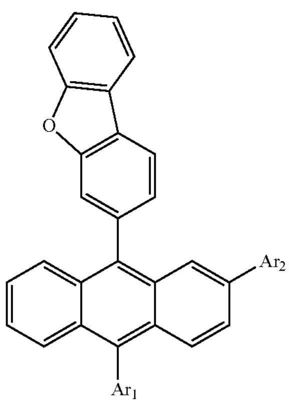 | 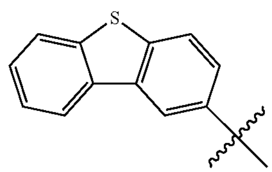 | 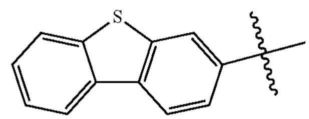 |
| 44-17 | 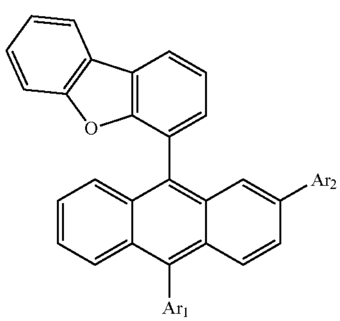 | 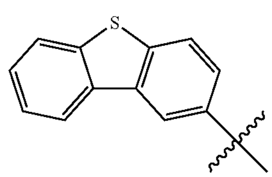 | 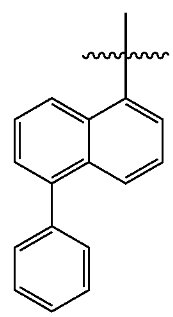 [SMILES: *c1cccc2c(-c3ccccc3)cccc12] |
| 44-18 | 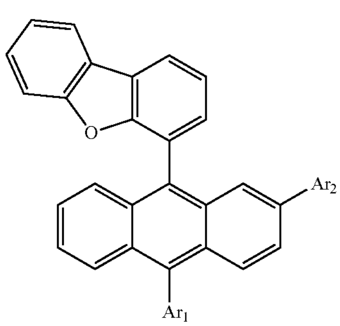 | 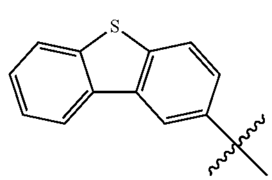 | 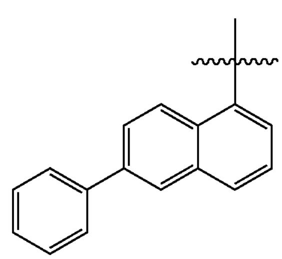 [SMILES: *c1cccc2cc(-c3ccccc3)ccc12] |

-continued
| No. | | Ar1 | Ar2 |
| --- | --- | --- | --- |
| 44-19 | 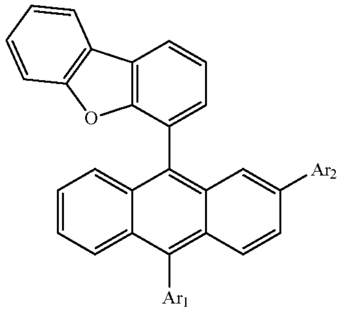 | 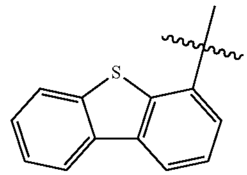 [SMILES: *c1cccc2c1sc1ccccc12] | 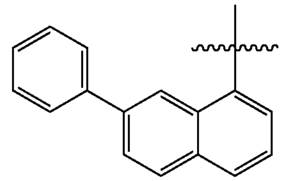 [SMILES: *c1cccc2ccc(-c3ccccc3)cc12] |
| 44-20 | 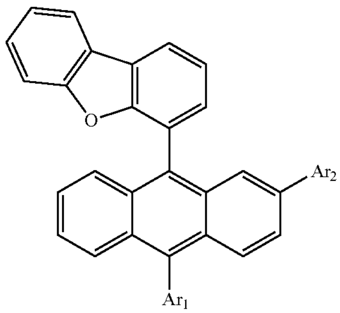 | 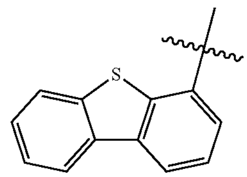 | 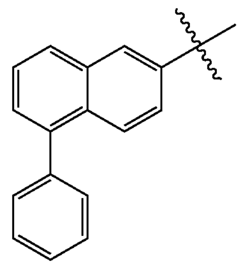 [SMILES: *c1ccc2c(-c3ccccc3)cccc2c1] |
| 44-21 | 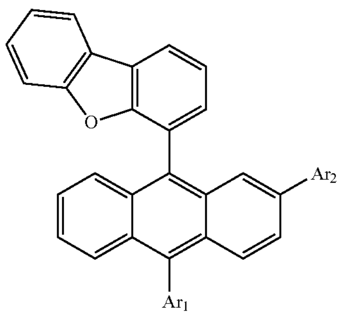 | 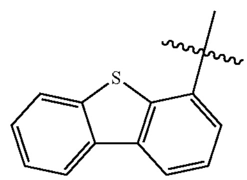 | 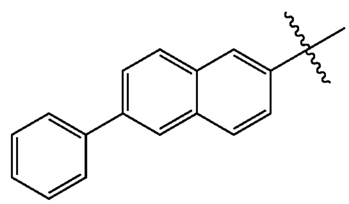 [SMILES: *c1ccc2cc(-c3ccccc3)ccc2c1] |
| 44-22 | 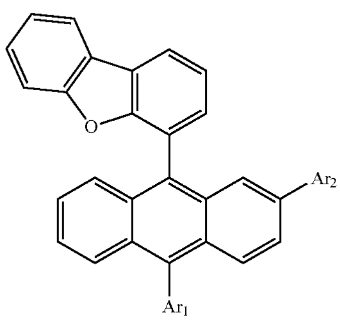 | 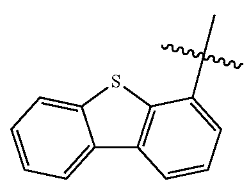 [SMILES: *c1cccc2c1sc1ccccc12] | 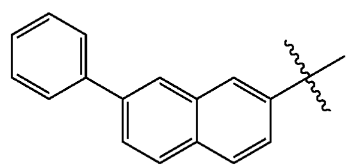 [SMILES: *c1ccc2ccc(-c3ccccc3)cc2c1] |
| 44-23 | 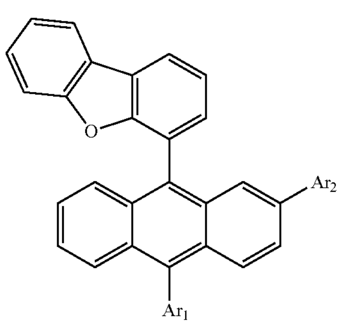 | 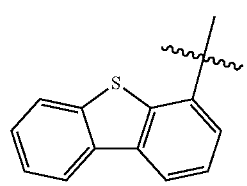 | 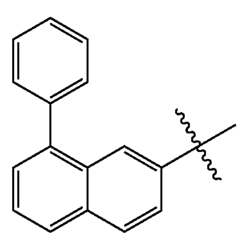 [SMILES: *c1ccc2cccc(-c3ccccc3)c2c1] |

-continued
| No. | | Ar1 | Ar2 |
| --- | --- | --- | --- |
| 44-24 | 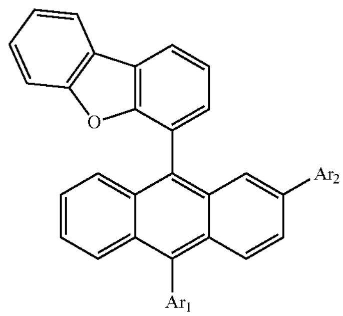 | 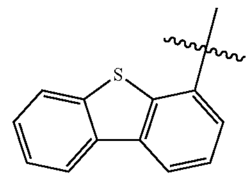 | 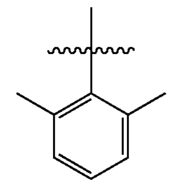 |
| 44-25 | 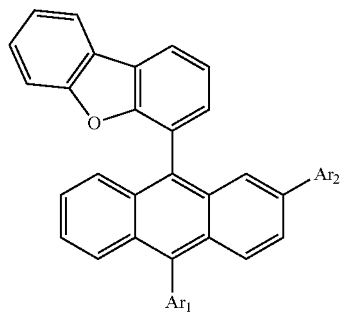 | 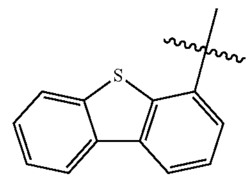 [SMILES: *c1cccc2c1sc1ccccc12] | 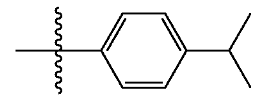 [SMILES: *c1ccc(C(C)C)cc1] |
| 44-26 | 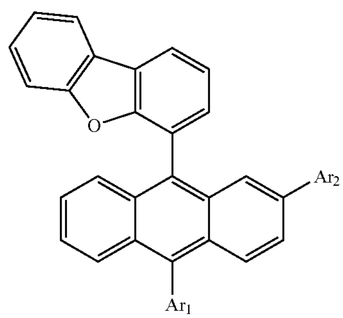 | 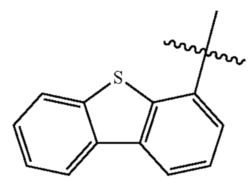 [SMILES: *c1cccc2c1sc1ccccc12] | 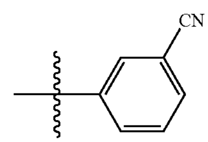 [SMILES: *c1cccc(C#N)c1] |
| 44-27 | 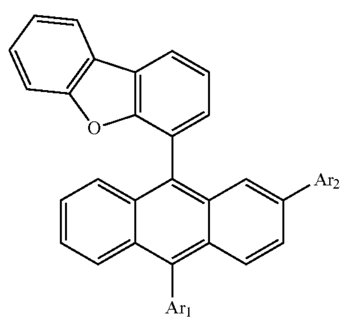 | 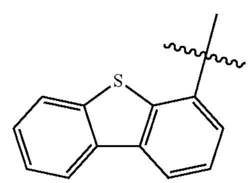 [SMILES: *c1cccc2c1sc1ccccc12] | 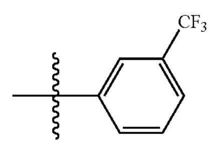 [SMILES: *c1cccc(C(F)(F)F)c1] |
| 44-28 | 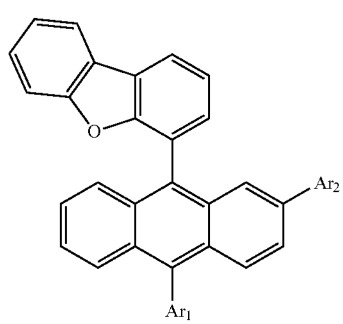 | 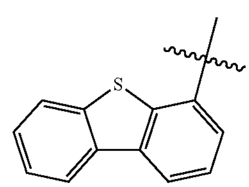 [SMILES: *c1cccc2c1sc1ccccc12] | 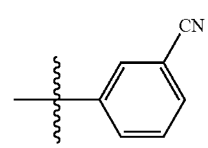 [SMILES: *c1cccc(C#N)c1] |

-continued
| No. | | Ar1 | Ar2 |
|---|---|---|---|
| 44-29 | 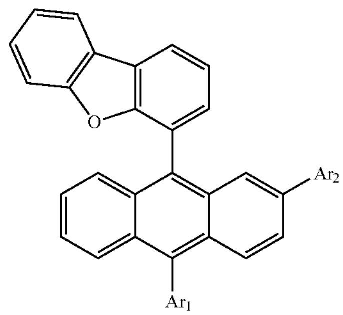 | 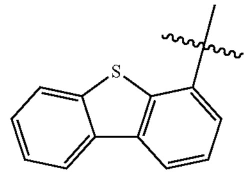 | 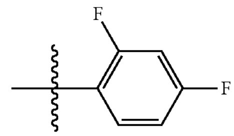 [SMILES: *c1ccc(F)cc1F] |
| 45-1 | 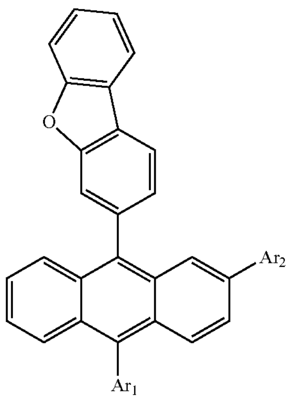 | 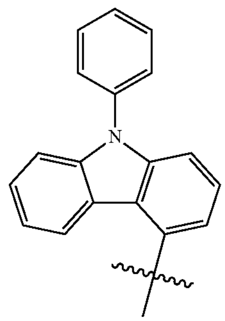 [SMILES: *c1cccc2c1c1ccccc1n2-c1ccccc1] | 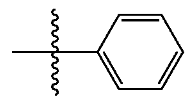 [SMILES: *c1ccccc1] |
| 45-2 | 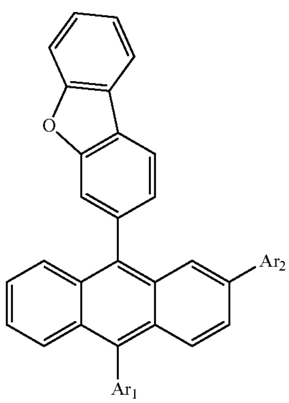 | 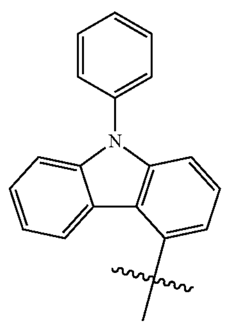 [SMILES: *c1cccc2c1c1ccccc1n2-c1ccccc1] | 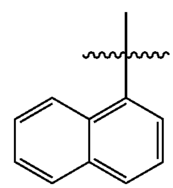 [SMILES: *c1cccc2ccccc12] |
| 45-3 | 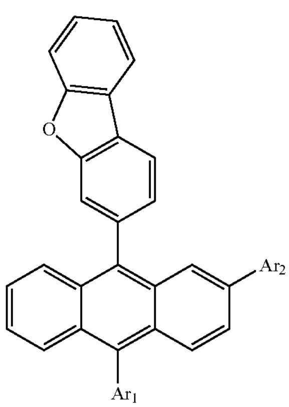 | 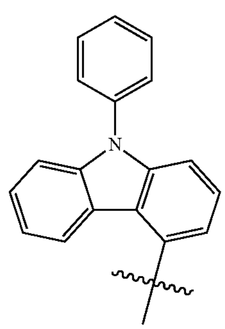 [SMILES: *c1cccc2c1c1ccccc1n2-c1ccccc1] | 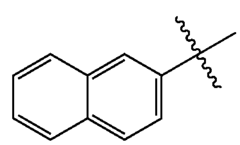 [SMILES: *c1ccc2ccccc2c1] |

-continued
| No. | | Ar1 | Ar2 |
| --- | --- | --- | --- |
| 45-4 | 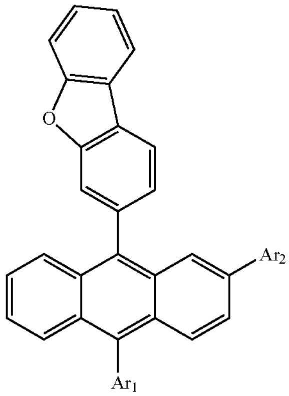 | 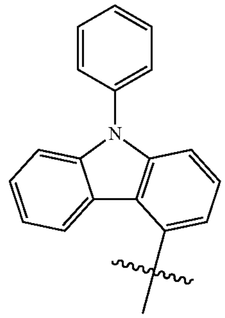 [SMILES: *c1cccc2c1c1ccccc1n2-c1ccccc1] | 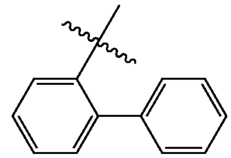 [SMILES: *c1ccccc1-c1ccccc1] |
| 45-5 | 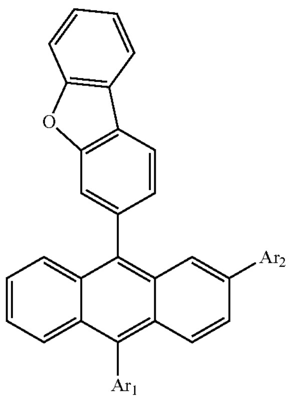 | 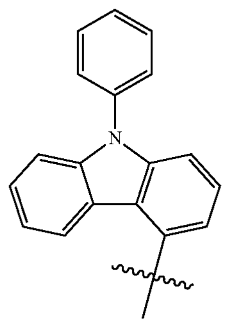 [SMILES: *c1cccc2c1c1ccccc1n2-c1ccccc1] | 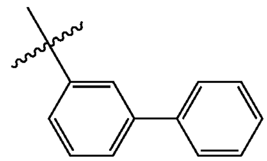 [SMILES: *c1cccc(-c2ccccc2)c1] |
| 45-6 | 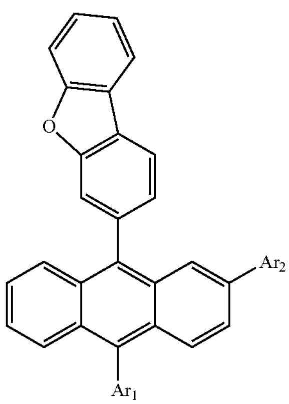 | 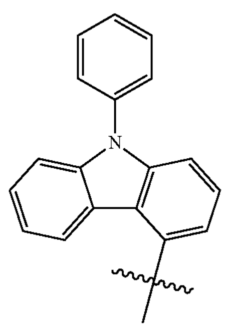 [SMILES: *c1cccc2c1c1ccccc1n2-c1ccccc1] | 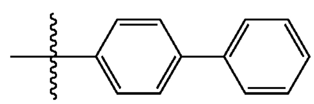 |
| 45-7 | 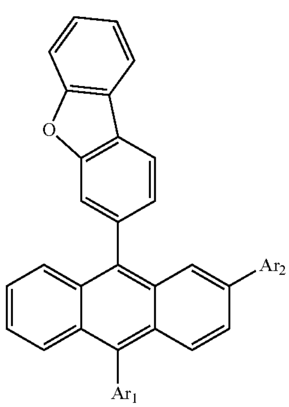 | 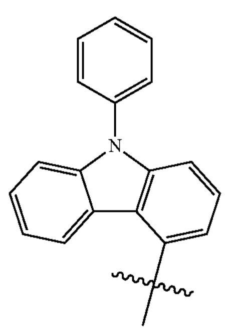 [SMILES: *c1cccc2c1c1ccccc1n2-c1ccccc1] | 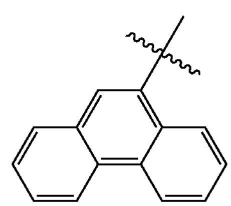 [SMILES: *c1cc2ccccc2c2ccccc12] |

-continued
| No. | | Ar1 | Ar2 |
|---|---|---|---|
| 45-9 | 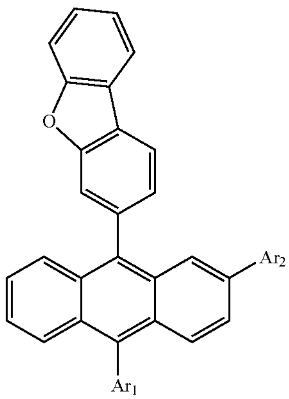 | 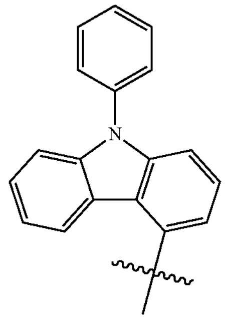 [SMILES: *c1cccc2c1c1ccccc1n2-c1ccccc1] | 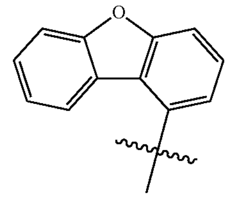 |
| 45-10 | 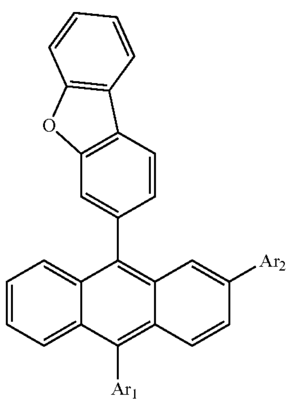 | 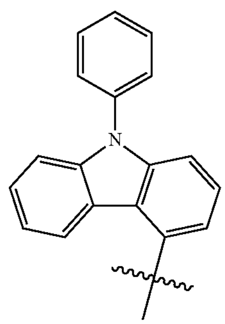 [SMILES: *c1cccc2c1c1ccccc1n2-c1ccccc1] | 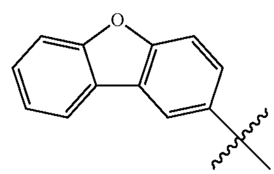 [SMILES: *c1ccc2oc3ccccc3c2c1] |
| 45-11 | 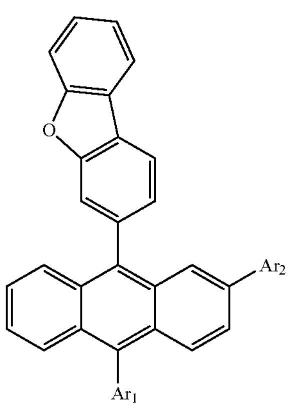 | 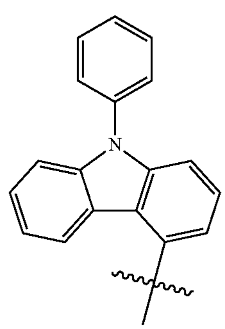 [SMILES: *c1cccc2c1c1ccccc1n2-c1ccccc1] | 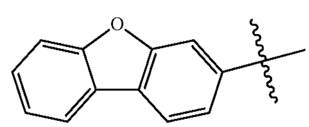 |

-continued
| No. | | Ar1 | Ar2 |
|---|---|---|---|
| 45-12 | 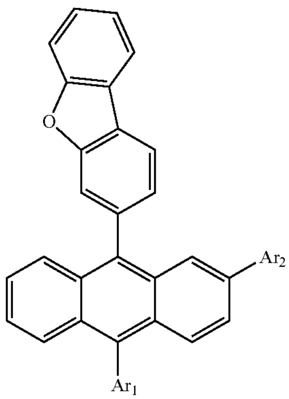 | 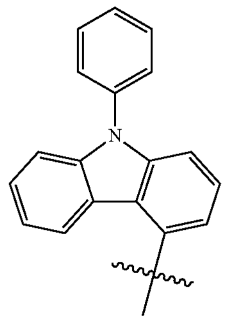 [SMILES: *c1cccc2c1c1ccccc1n2-c1ccccc1] | 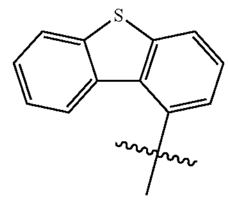 [SMILES: *c1cccc2sc3ccccc3c12] |
| 45-13 | 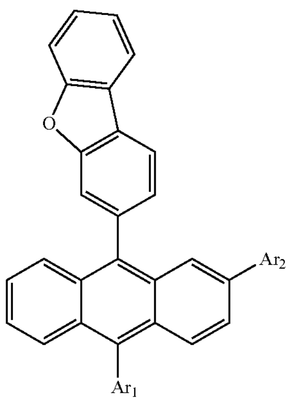 | 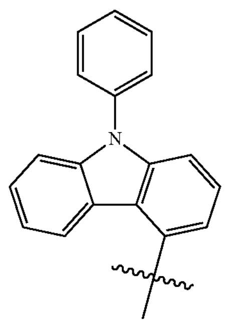 [SMILES: *c1cccc2c1c1ccccc1n2-c1ccccc1] | 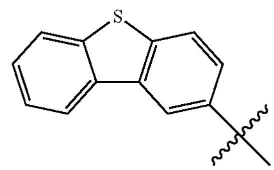 [SMILES: *c1ccc2sc3ccccc3c2c1] |
| 45-14 | 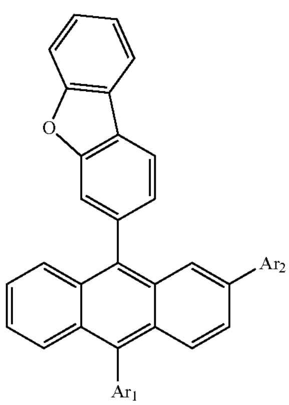 | 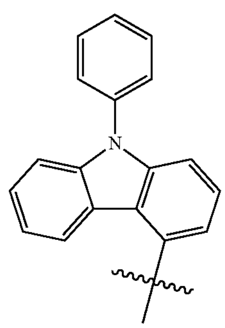 [SMILES: *c1cccc2c1c1ccccc1n2-c1ccccc1] | 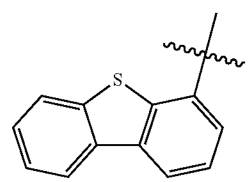 [SMILES: *c1cccc2c1sc1ccccc12] |
| 45-19 | 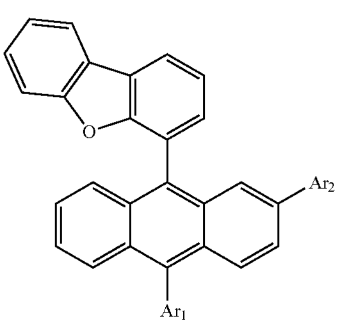 | 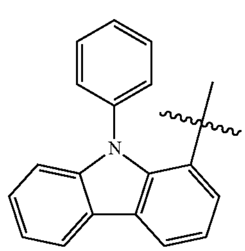 [SMILES: *c1cccc2c3ccccc3n(-c3ccccc3)c12] | 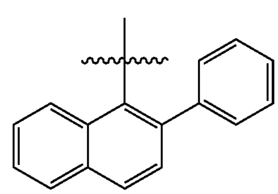 [SMILES: *c1c(-c2ccccc2)ccc2ccccc12] |

-continued
| No. | | Ar1 | Ar2 |
|---|---|---|---|
| 45-20 | 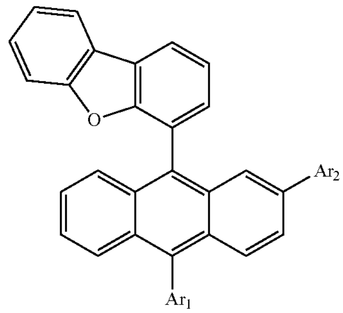 | 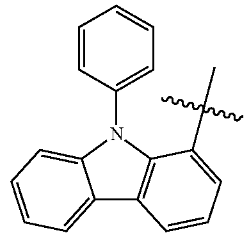 [SMILES: *c1cccc2c3ccccc3n(-c3ccccc3)c12] | 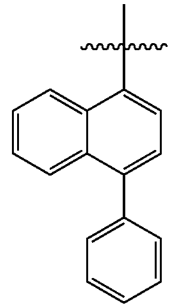 [SMILES: *c1ccc(-c2ccccc2)c2ccccc12] |
| 45-21 | 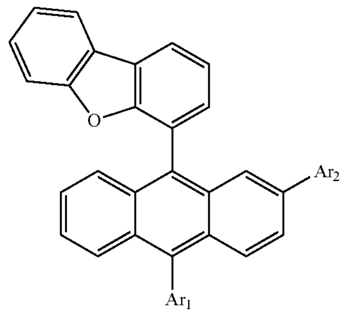 | 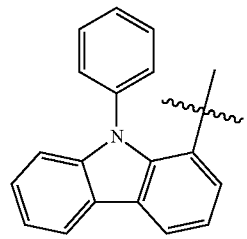 [SMILES: *c1cccc2c3ccccc3n(-c3ccccc3)c12] | 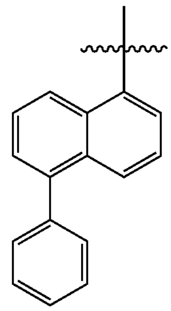 [SMILES: *c1cccc2c(-c3ccccc3)cccc12] |
| 45-22 | 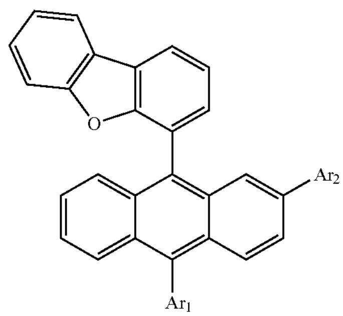 | 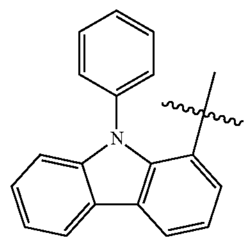 [SMILES: *c1cccc2c3ccccc3n(-c3ccccc3)c12] | 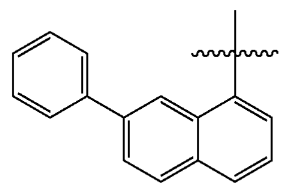 [SMILES: *c1cccc2ccc(-c3ccccc3)cc12] |
| 45-23 | 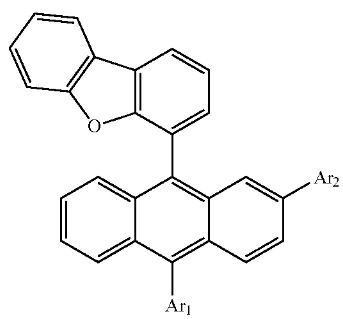 | 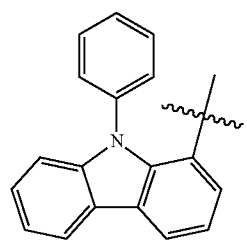 [SMILES: *c1cccc2c3ccccc3n(-c3ccccc3)c12] | 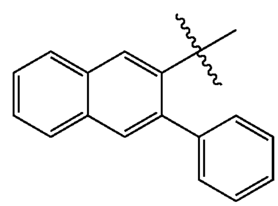 [SMILES: *c1cc2ccccc2cc1-c1ccccc1] |
| 45-24 | 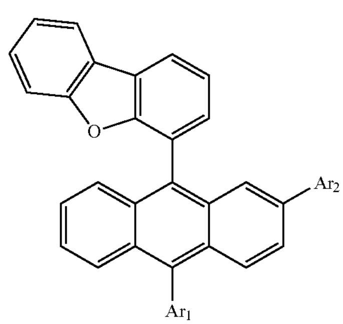 | 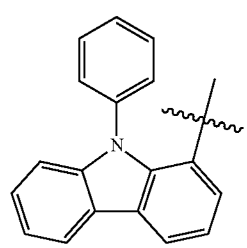 [SMILES: *c1cccc2c3ccccc3n(-c3ccccc3)c12] | 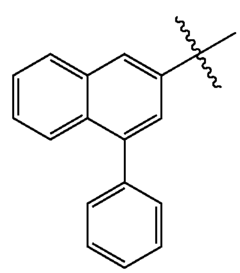 [SMILES: *c1cc(-c2ccccc2)c2ccccc2c1] |

-continued
| No. | | Ar1 | Ar2 |
|---|---|---|---|
| 45-25 | 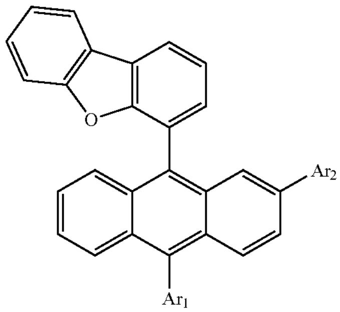 | 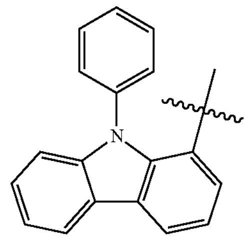 [SMILES: *c1cccc2c3ccccc3n(-c3ccccc3)c12] | 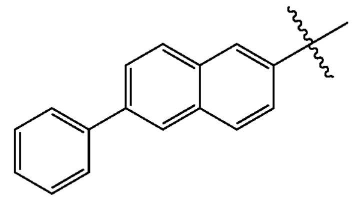 [SMILES: *c1ccc2cc(-c3ccccc3)ccc2c1] |
| 45-26 | 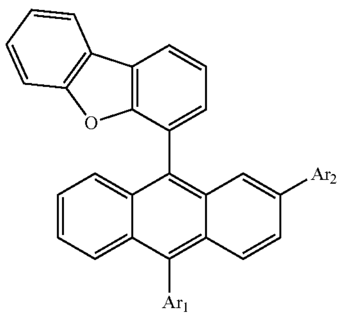 | 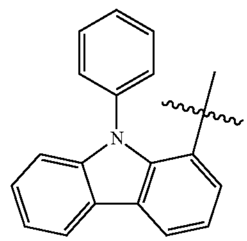 [SMILES: *c1cccc2c3ccccc3n(-c3ccccc3)c12] | 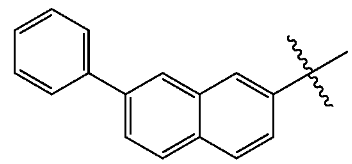 [SMILES: *c1ccc2ccc(-c3ccccc3)cc2c1] |
| 45-27 | 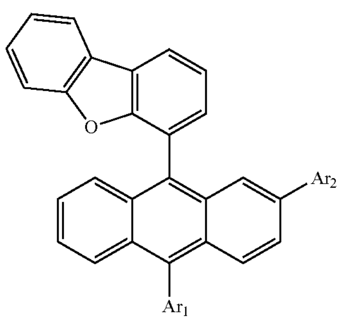 | 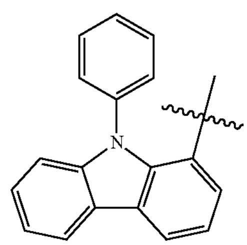 [SMILES: *c1cccc2c3ccccc3n(-c3ccccc3)c12] | 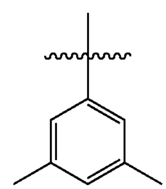 |
| 45-28 | 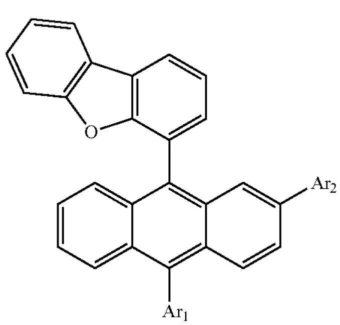 | 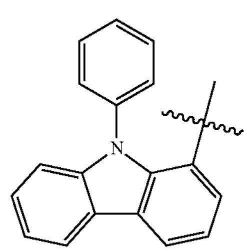 [SMILES: *c1cccc2c3ccccc3n(-c3ccccc3)c12] | 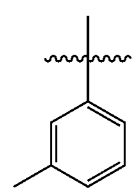 [SMILES: *c1cccc(C)c1] |

-continued
| No. | | Ar1 | Ar2 |
|---|---|---|---|
| 45-29 | 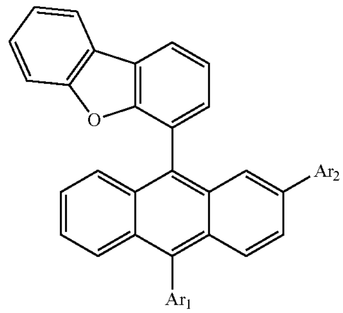 | 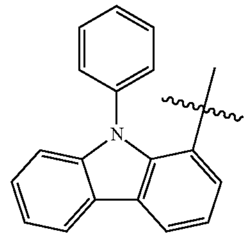 [SMILES: *c1cccc2c3ccccc3n(-c3ccccc3)c12] | 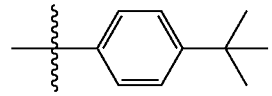 |
| 45-30 | 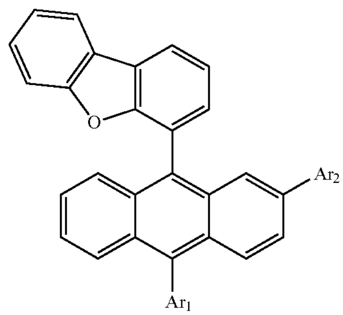 | 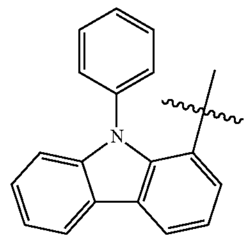 [SMILES: *c1cccc2c3ccccc3n(-c3ccccc3)c12] | 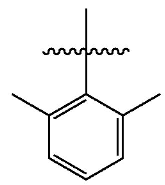 |
| 45-31 | 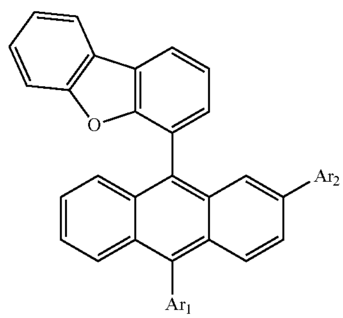 | 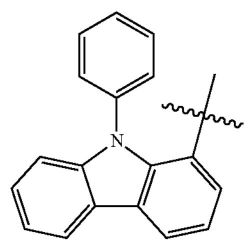 [SMILES: *c1cccc2c3ccccc3n(-c3ccccc3)c12] | 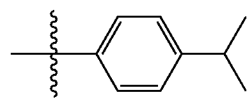 [SMILES: *c1ccc(C(C)C)cc1] |
| 46-1 | 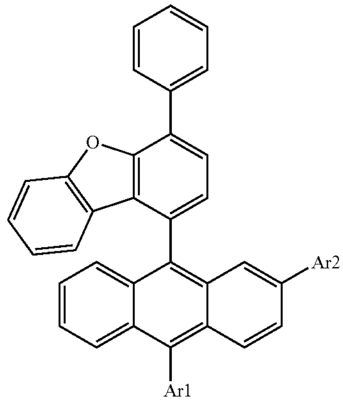 | 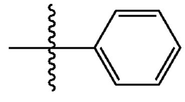 [SMILES: *c1ccccc1] | 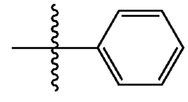 [SMILES: *c1ccccc1] |

-continued
| No. | | Ar1 | Ar2 |
|---|---|---|---|
| 46-2 | 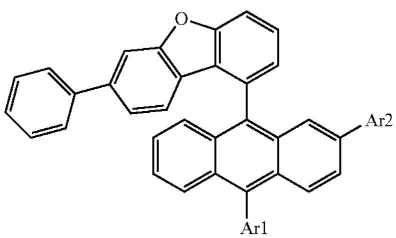 | 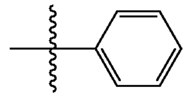 | 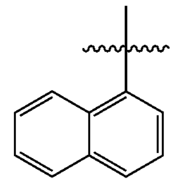 [SMILES: *c1cccc2ccccc12] |
| 46-3 | 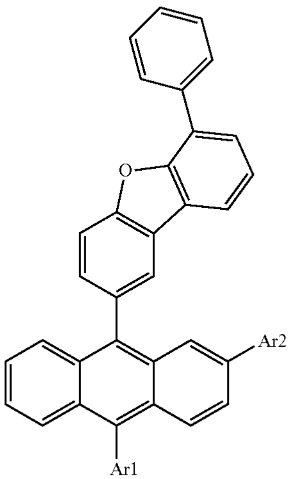 | 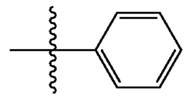 | 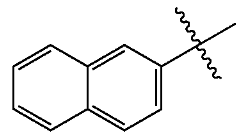 [SMILES: *c1ccc2ccccc2c1] |
| 46-4 | 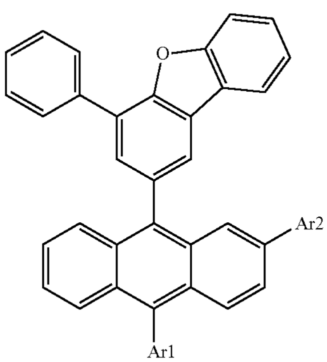 | 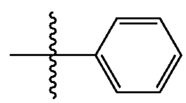 [SMILES: *c1ccccc1] | 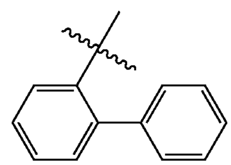 [SMILES: *c1ccccc1-c1ccccc1] |
| 46-5 | 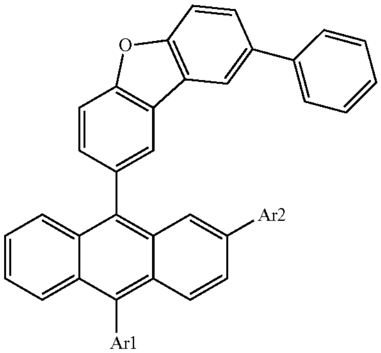 | 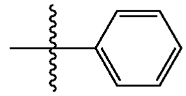 [SMILES: *c1ccccc1] | 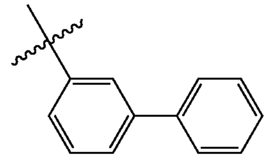 [SMILES: *c1cccc(-c2ccccc2)c1] |

-continued
| No. | | Ar1 | Ar2 |
|---|---|---|---|
| 46-6 | 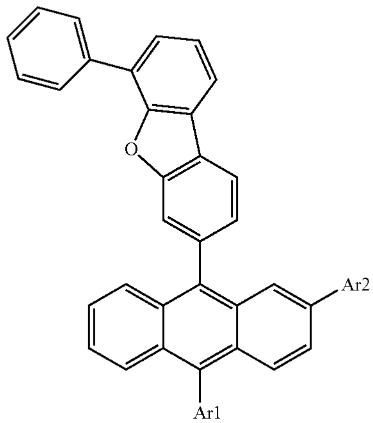 | 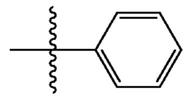 | 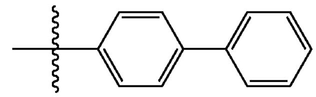 [SMILES: *c1ccc(-c2ccccc2)cc1] |
| 46-7 | 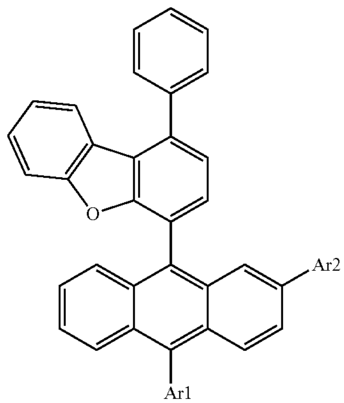 | 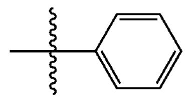 | 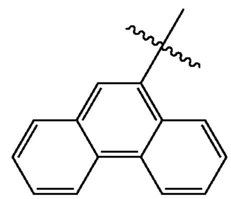 |
| 46-9 | 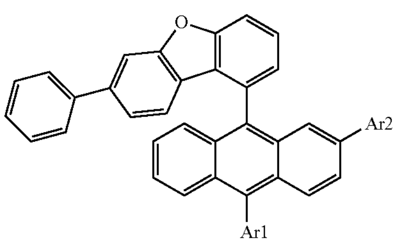 | 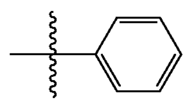 [SMILES: *c1ccccc1] | 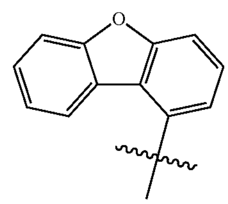 [SMILES: *c1cccc2oc3ccccc3c12] |
| 46-10 | 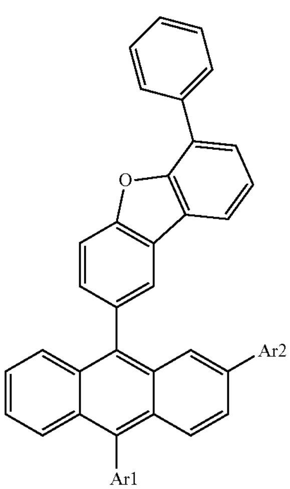 | 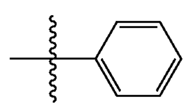 [SMILES: *c1ccccc1] | 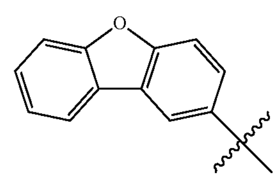 |

-continued
| No. | | Ar1 | Ar2 |
|---|---|---|---|
| 46-11 | 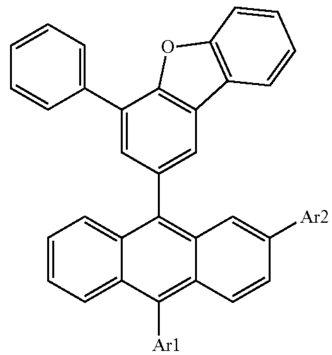 | 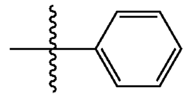 [SMILES: *c1ccccc1] | 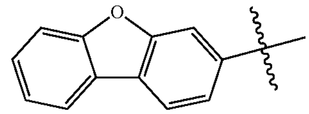 |
| 46-12 | 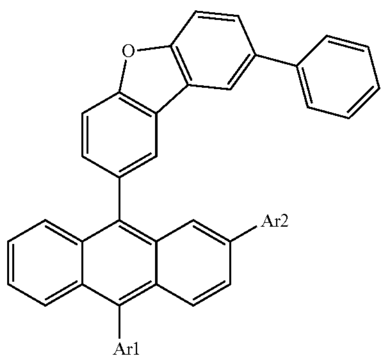 | 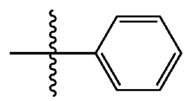 | 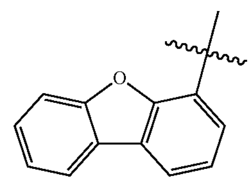 |
| 46-13 | 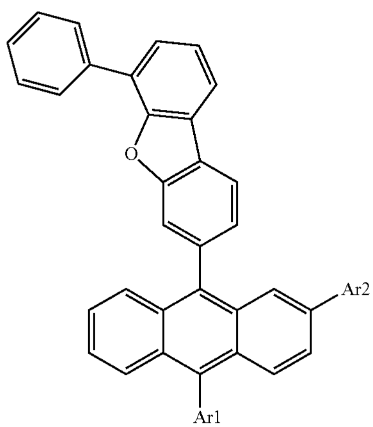 | 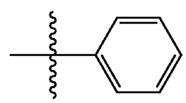 [SMILES: *c1ccccc1] | 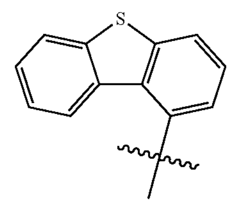 [SMILES: *c1cccc2sc3ccccc3c12] |
| 46-14 | 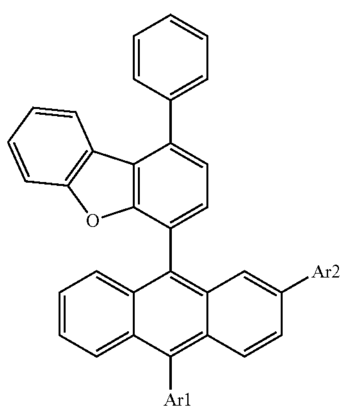 | 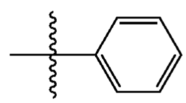 [SMILES: *c1ccccc1] | 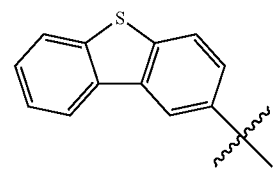 [SMILES: *c1ccc2sc3ccccc3c2c1] |

-continued
| No. | | Ar1 | Ar2 |
|---|---|---|---|
| 46-15 | 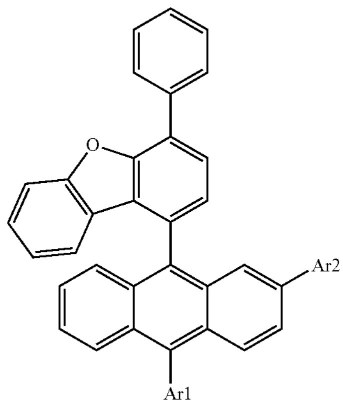 | 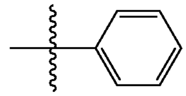 | 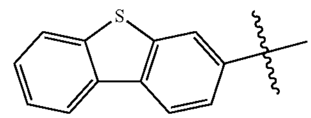 |
| 46-16 | 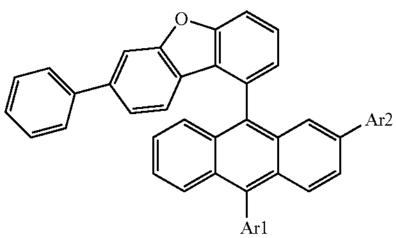 | 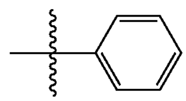 | 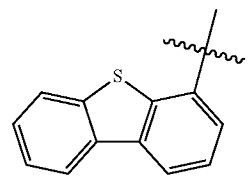 [SMILES: *c1cccc2c1sc1ccccc12] |
| 46-22 | 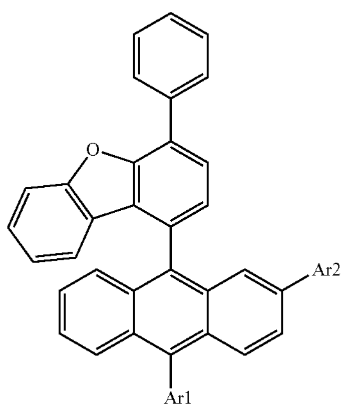 | 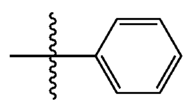 | 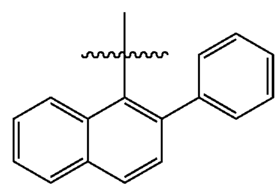 [SMILES: *c1c(-c2ccccc2)ccc2ccccc12] |
| 46-23 | 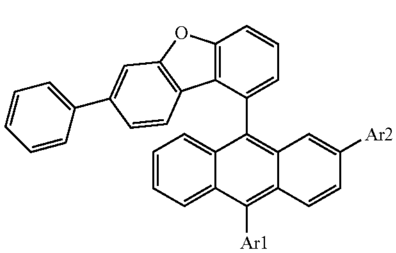 | 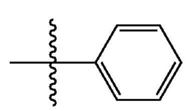 [SMILES: *c1ccccc1] | 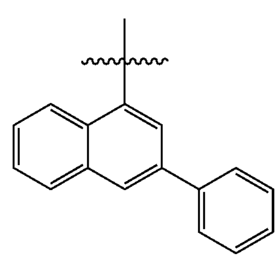 [SMILES: *c1cc(-c2ccccc2)cc2ccccc12] |

-continued
| No. | | Ar1 | Ar2 |
|---|---|---|---|
| 46-24 | 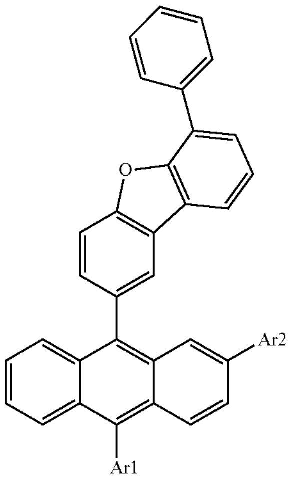 | 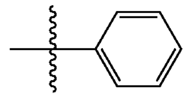 | 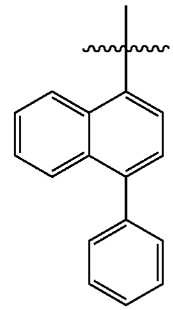 [SMILES: *c1ccc(-c2ccccc2)c2ccccc12] |
| 46-25 | 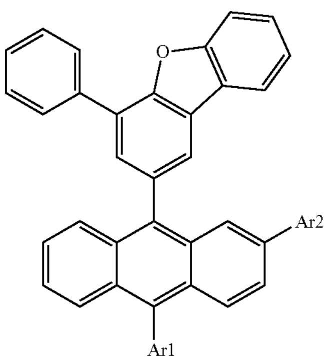 | 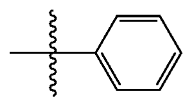 [SMILES: *c1ccccc1] | 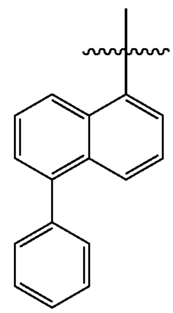 [SMILES: *c1cccc2c(-c3ccccc3)cccc12] |
| 46-26 | 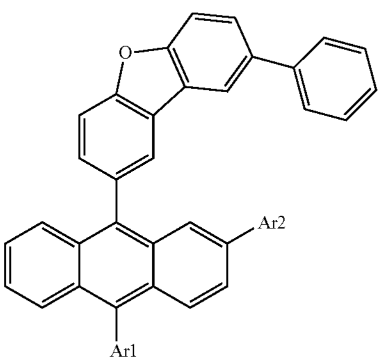 | 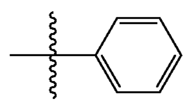 | 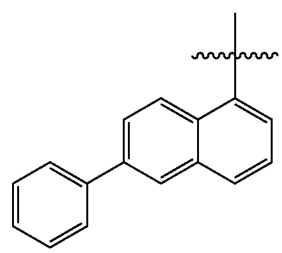 [SMILES: *c1cccc2cc(-c3ccccc3)ccc12] |
| 46-27 | 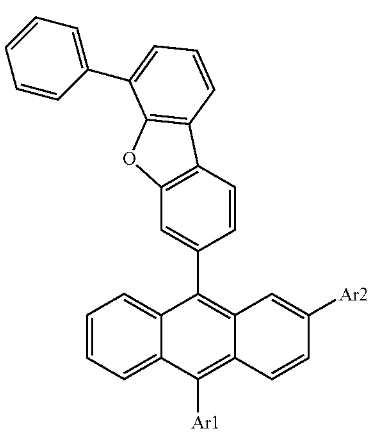 | 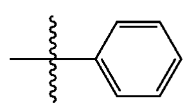 [SMILES: *c1ccccc1] | 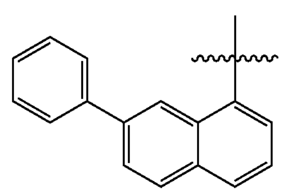 [SMILES: *c1cccc2ccc(-c3ccccc3)cc12] |

-continued
| No. | | Ar1 | Ar2 |
|---|---|---|---|
| 46-28 | 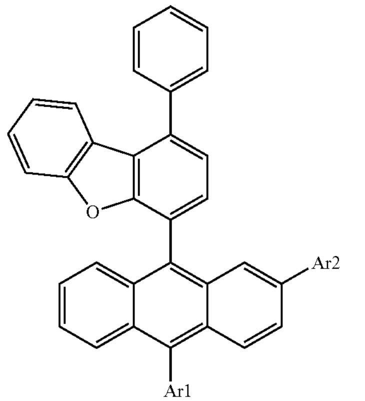 | 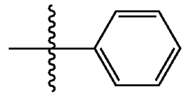 [SMILES: *c1ccccc1] | 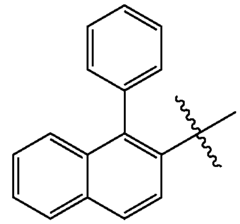 [SMILES: *c1ccc2ccccc2c1-c1ccccc1] |
| 46-29 | 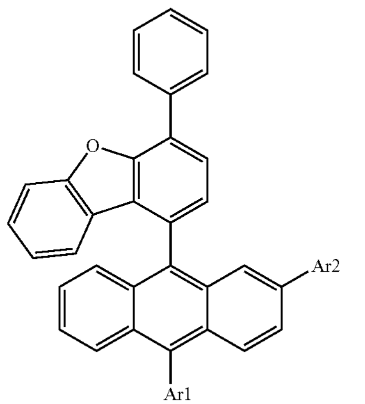 | 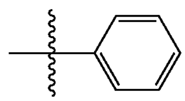 | 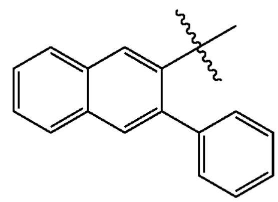 [SMILES: *c1cc2ccccc2cc1-c1ccccc1] |
| 46-30 | 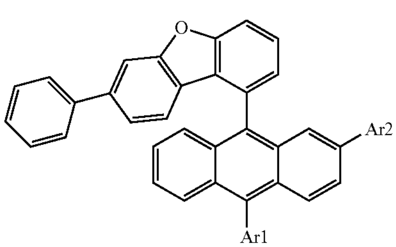 | 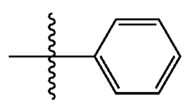 [SMILES: *c1ccccc1] | 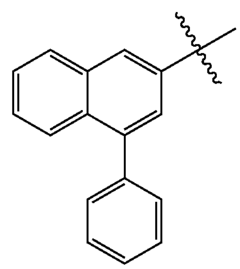 [SMILES: *c1cc(-c2ccccc2)c2ccccc2c1] |
| 46-31 | 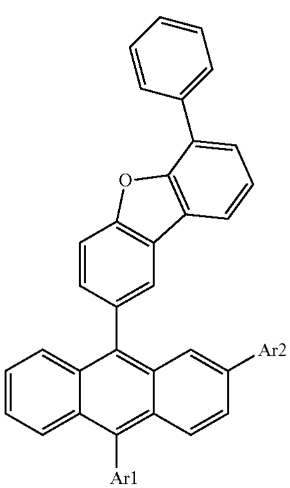 | 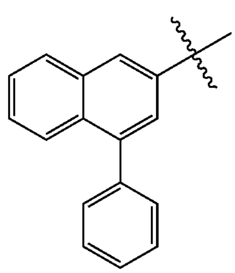 [SMILES: *c1cc(-c2ccccc2)c2ccccc2c1] | 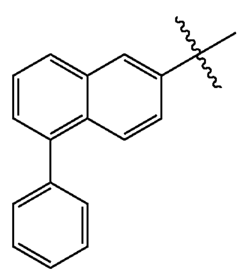 [SMILES: *c1ccc2c(-c3ccccc3)cccc2c1] |

-continued
| No. | | Ar1 | Ar2 |
|---|---|---|---|
| 46-32 | 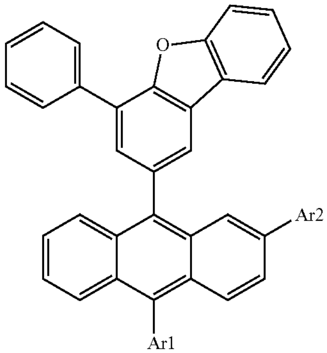 | 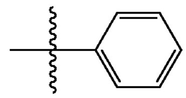 | 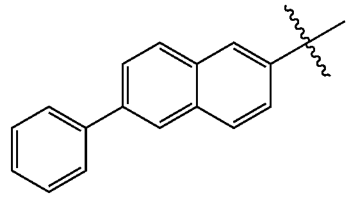 [SMILES: *c1ccc2cc(-c3ccccc3)ccc2c1] |
| 46-33 | 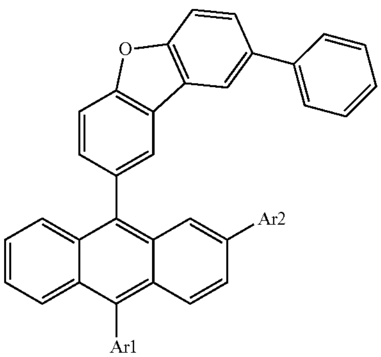 | 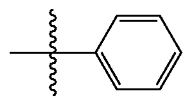 [SMILES: *c1ccccc1] | 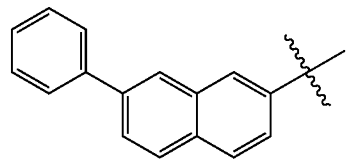 [SMILES: *c1ccc2ccc(-c3ccccc3)cc2c1] |
| 46-34 | 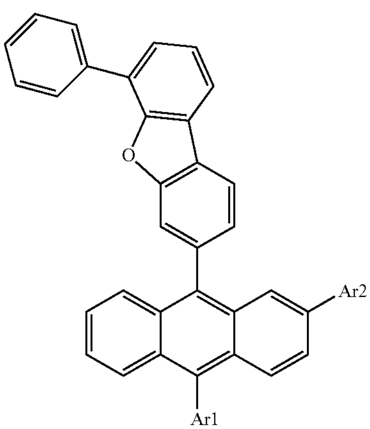 | 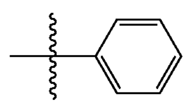 [SMILES: *c1ccccc1] | 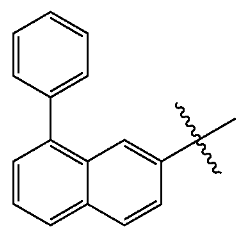 [SMILES: *c1ccc2cccc(-c3ccccc3)c2c1] |
| 46-35 | 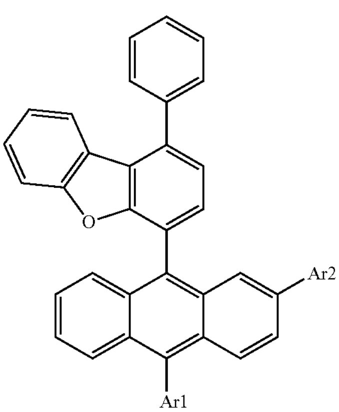 | 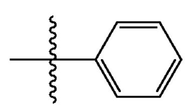 [SMILES: *c1ccccc1] | 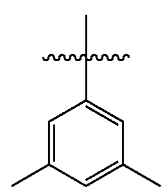 |

-continued
| No. | | Ar1 | Ar2 |
|---|---|---|---|
| 46-36 | 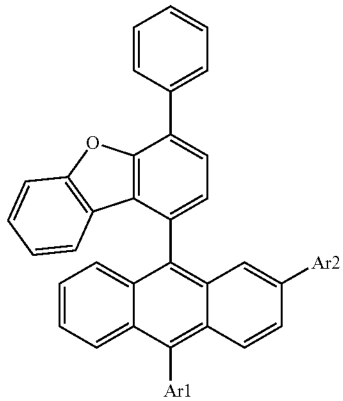 | 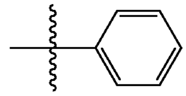 | 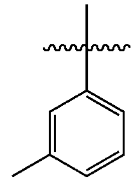 |
| 46-37 | 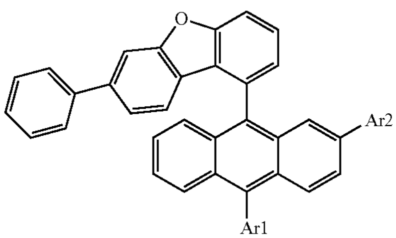 | 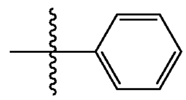 | 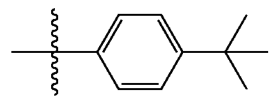 |
| 46-38 | 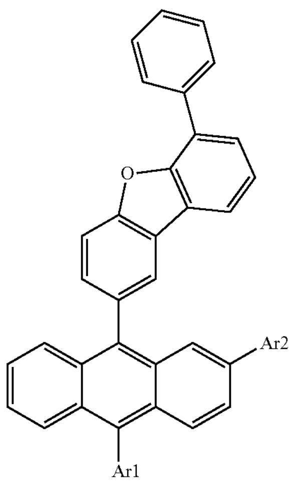 | 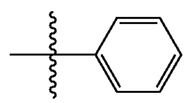 [SMILES: *c1ccccc1] | 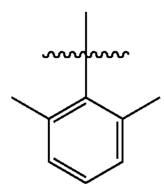 |
| 46-39 | 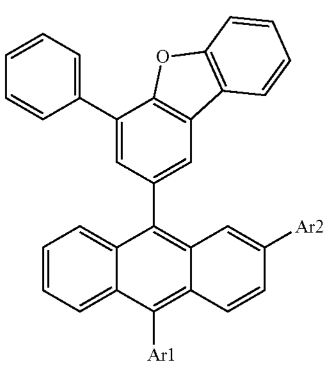 | 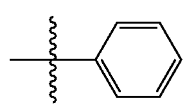 [SMILES: *c1ccccc1] | 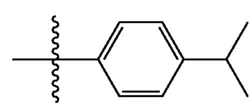 [SMILES: *c1ccc(C(C)C)cc1] |

-continued
| No. | | Ar1 | Ar2 |
|---|---|---|---|
| 46-40 | 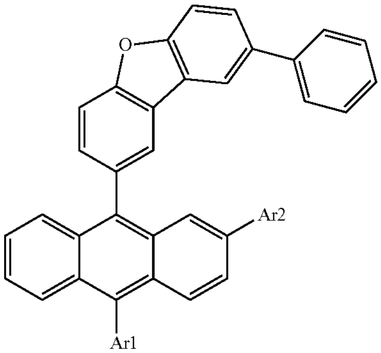 | 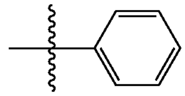 | 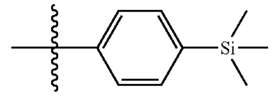 |
| 46-41 | 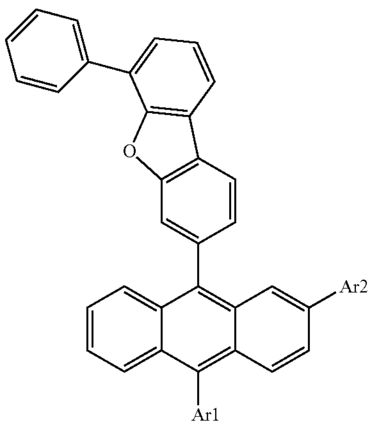 | 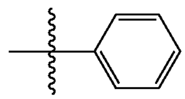 | 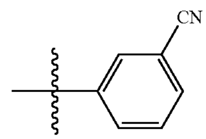 [SMILES: *c1cccc(C#N)c1] |
| 46-42 | 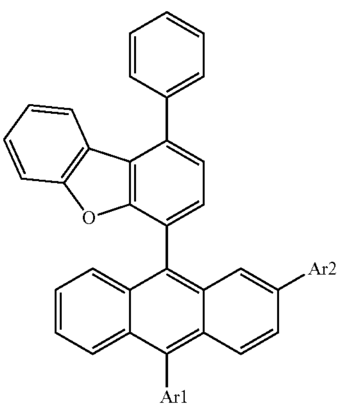 | 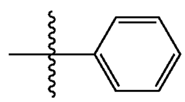 | 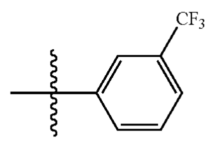 [SMILES: *c1cccc(C(F)(F)F)c1] |
| 46-43 | 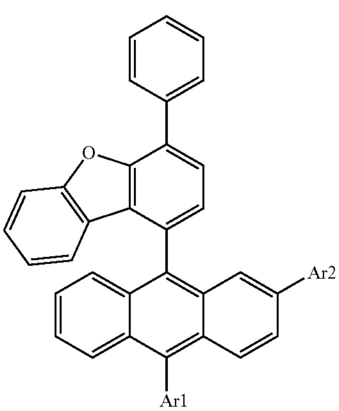 | 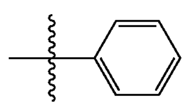 | 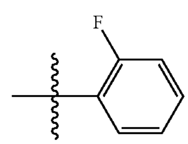 [SMILES: *c1ccccc1F] |

-continued
| No. | | Ar1 | Ar2 |
|---|---|---|---|
| 46-44 | 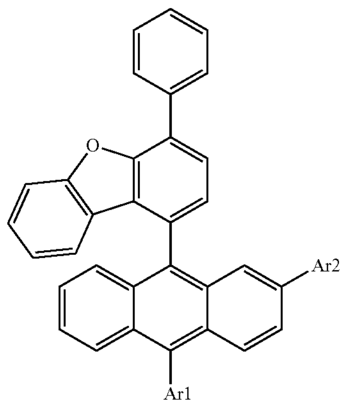 | 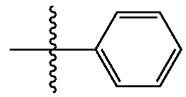 [SMILES: *c1ccccc1] | 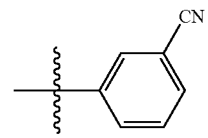 [SMILES: *c1cccc(C#N)c1] |
| 46-45 | 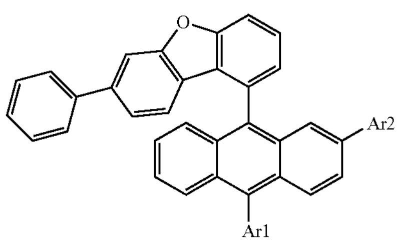 | 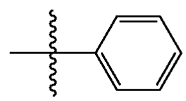 [SMILES: *c1ccccc1] | 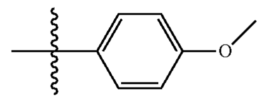 [SMILES: *c1ccc(OC)cc1] |
| 46-46 | 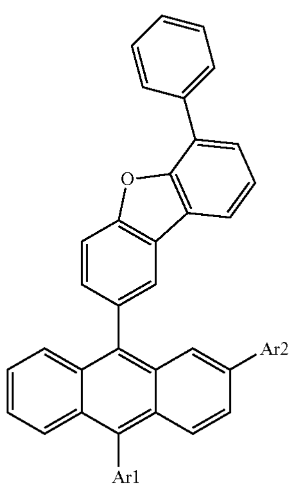 | 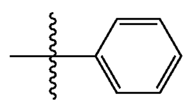 | 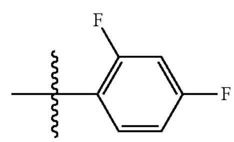 [SMILES: *c1ccc(F)cc1F] |
| 47-1 | 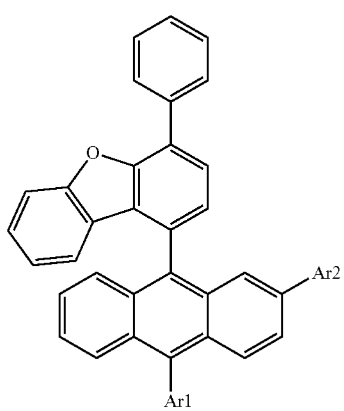 | 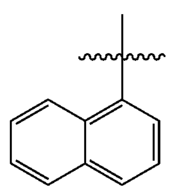 [SMILES: *c1cccc2ccccc12] | 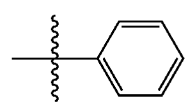 |

-continued
| No. | | Ar1 | Ar2 |
|---|---|---|---|
| 47-2 | 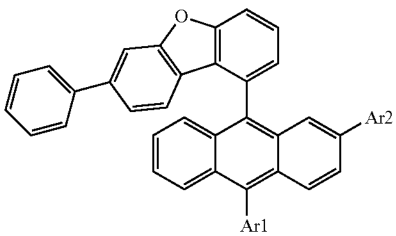 | 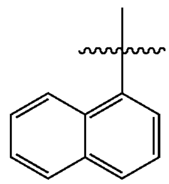 [SMILES: *c1cccc2ccccc12] | 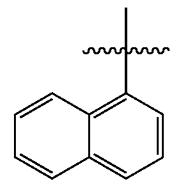 [SMILES: *c1cccc2ccccc12] |
| 47-3 | 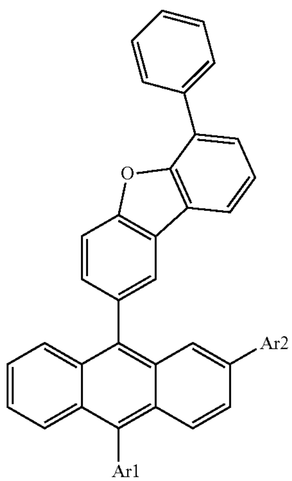 | 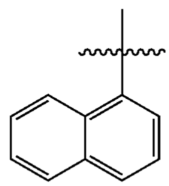 [SMILES: *c1cccc2ccccc12] | 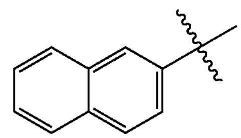 [SMILES: *c1ccc2ccccc2c1] |
| 47-4 | 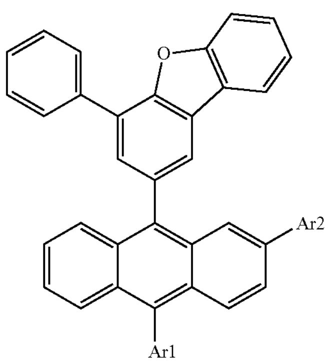 | 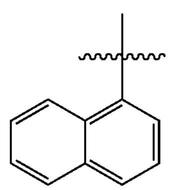 [SMILES: *c1cccc2ccccc12] | 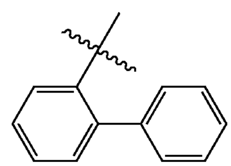 [SMILES: *c1ccccc1-c1ccccc1] |
| 47-5 | 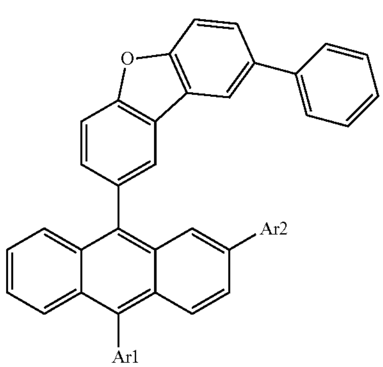 | 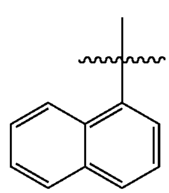 [SMILES: *c1cccc2ccccc12] | 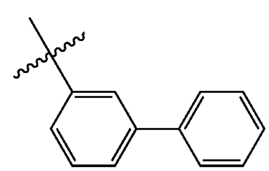 [SMILES: *c1cccc(-c2ccccc2)c1] |

-continued
| No. | | Ar1 | Ar2 |
|---|---|---|---|
| 47-6 | 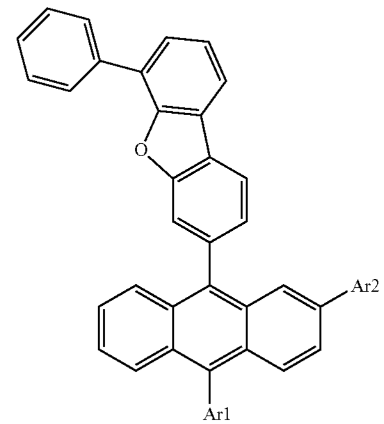 | 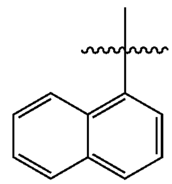 [SMILES: *c1cccc2ccccc12] | 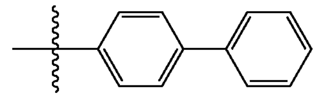 |
| 47-7 | 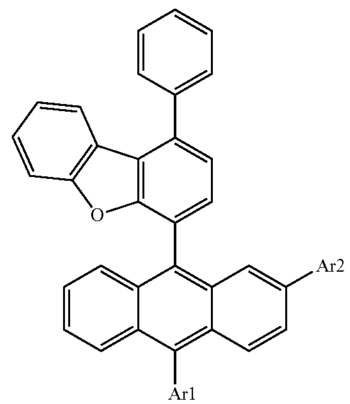 | 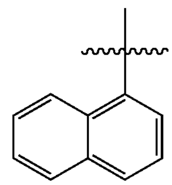 [SMILES: *c1cccc2ccccc12] | 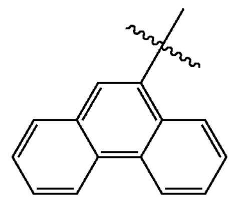 [SMILES: *c1cc2ccccc2c2ccccc12] |
| 47-9 | 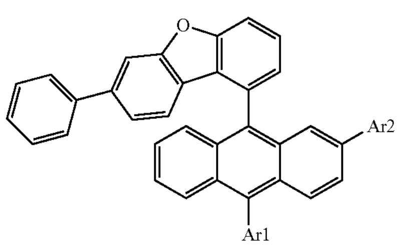 | 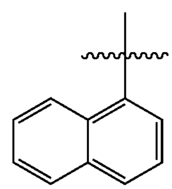 [SMILES: *c1cccc2ccccc12] | 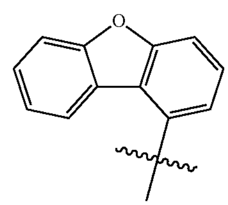 |
| 47-10 | 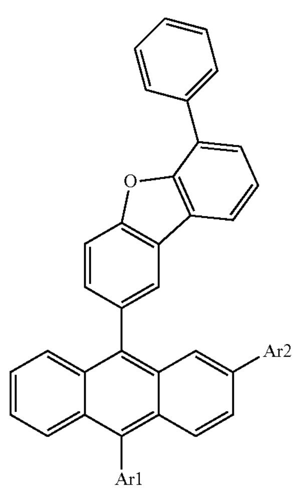 | 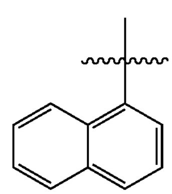 [SMILES: *c1cccc2ccccc12] | 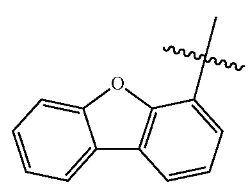 [SMILES: *c1cccc2c1oc1ccccc12] |

-continued
| No. | | Ar1 | Ar2 |
|---|---|---|---|
| 47-11 | 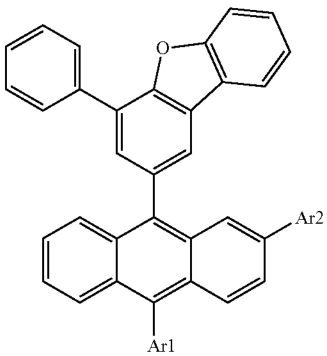 | 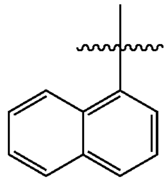 [SMILES: *c1cccc2ccccc12] | 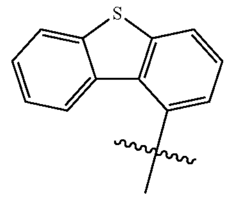 [SMILES: *c1cccc2sc3ccccc3c12] |
| 47-12 | 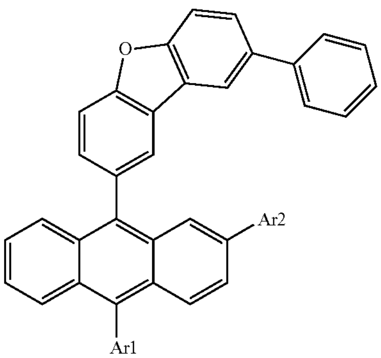 | 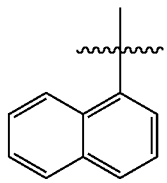 [SMILES: *c1cccc2ccccc12] | 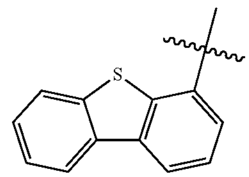 |
| 47-16 | 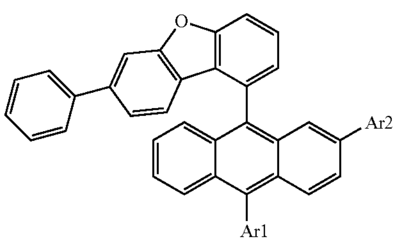 | 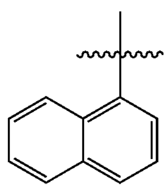 [SMILES: *c1cccc2ccccc12] | 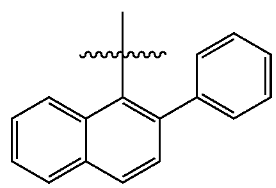 [SMILES: *c1c(-c2ccccc2)ccc2ccccc12] |
| 47-17 | 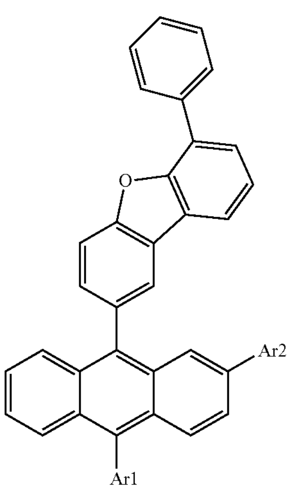 | 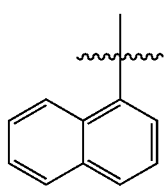 [SMILES: *c1cccc2ccccc12] | 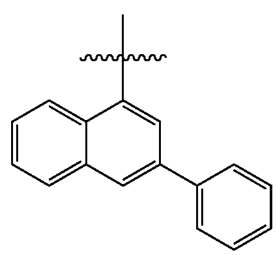 [SMILES: *c1cc(-c2ccccc2)cc2ccccc12] |

-continued
| No. | | Ar1 | Ar2 |
|---|---|---|---|
| 47-18 | 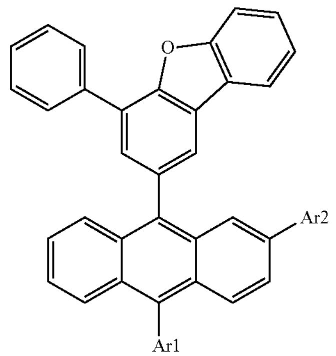 | 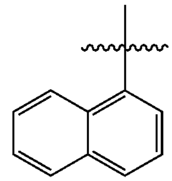 [SMILES: *c1cccc2ccccc12] | 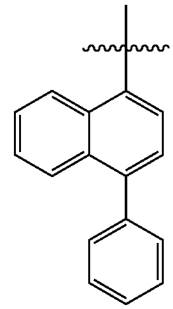 [SMILES: *c1ccc(-c2ccccc2)c2ccccc12] |
| 47-19 | 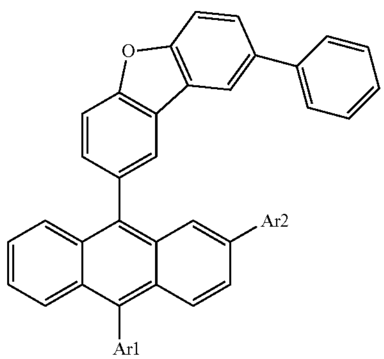 | 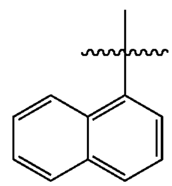 [SMILES: *c1cccc2ccccc12] | 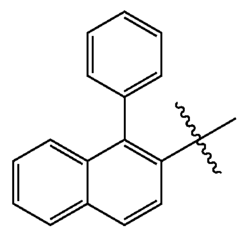 [SMILES: *c1ccc2ccccc2c1-c1ccccc1] |
| 47-20 | 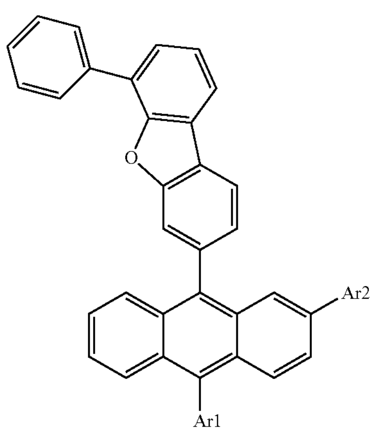 | 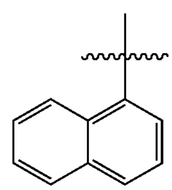 [SMILES: *c1cccc2ccccc12] | 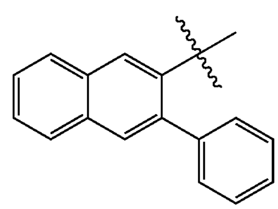 [SMILES: *c1cc2ccccc2cc1-c1ccccc1] |
| 47-21 | 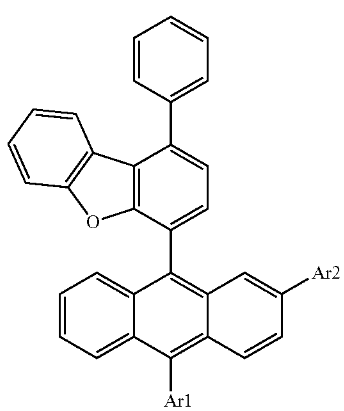 | 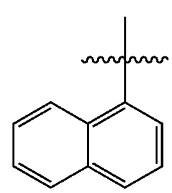 [SMILES: *c1cccc2ccccc12] | 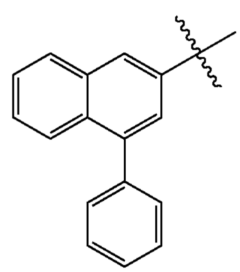 [SMILES: *c1cc(-c2ccccc2)c2ccccc2c1] |

-continued
| No. | | Ar1 | Ar2 |
|---|---|---|---|
| 47-22 | 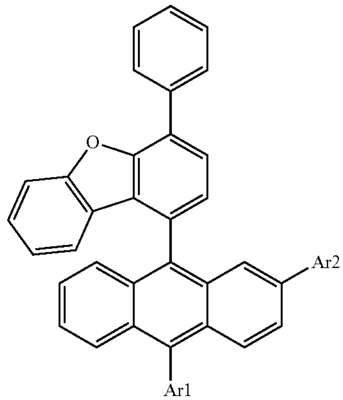 | 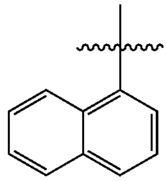 [SMILES: *c1cccc2ccccc12] | 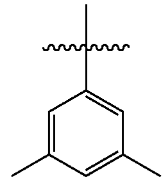 |
| 47-23 | 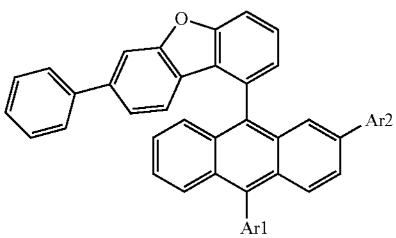 | 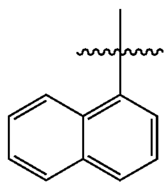 [SMILES: *c1cccc2ccccc12] | 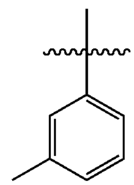 |
| 47-24 | 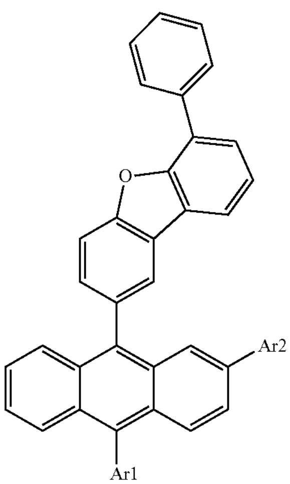 | 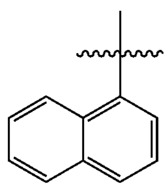 [SMILES: *c1cccc2ccccc12] | 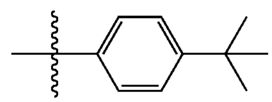 |
| 47-25 | 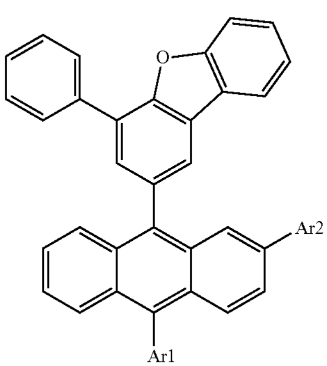 | 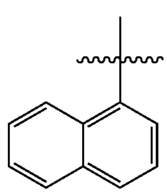 [SMILES: *c1cccc2ccccc12] | 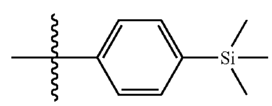 |

-continued
| No. | | Ar1 | Ar2 |
|---|---|---|---|
| 47-26 | 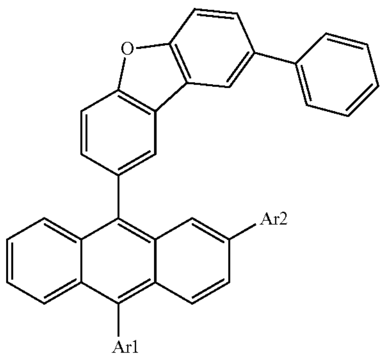 | 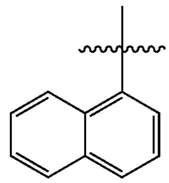 [SMILES: *c1cccc2ccccc12] | 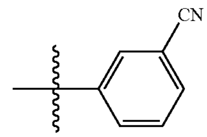 [SMILES: *c1cccc(C#N)c1] |
| 47-27 | 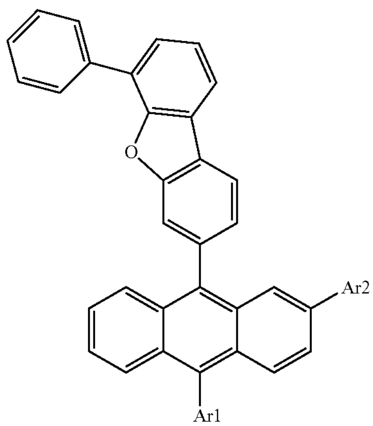 | 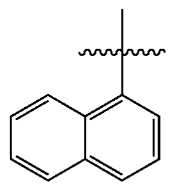 [SMILES: *c1cccc2ccccc12] | 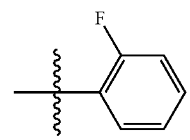 [SMILES: *c1ccccc1F] |
| 47-28 | 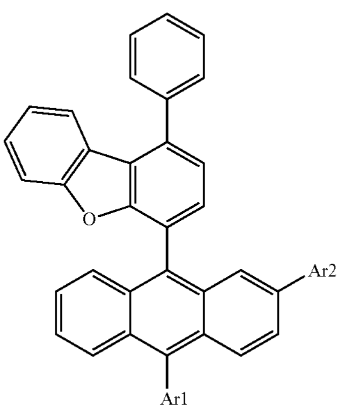 | 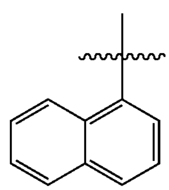 [SMILES: *c1cccc2ccccc12] | 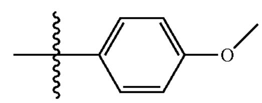 [SMILES: *c1ccc(OC)cc1] |
| 48-1 | 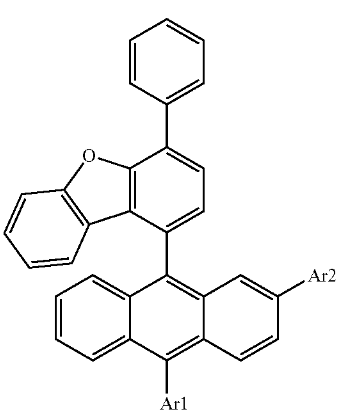 | 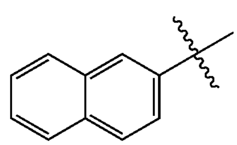 [SMILES: *c1ccc2ccccc2c1] | 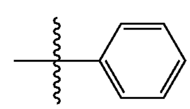 [SMILES: *c1ccccc1] |

-continued
| No. | | Ar1 | Ar2 |
|---|---|---|---|
| 48-2 | 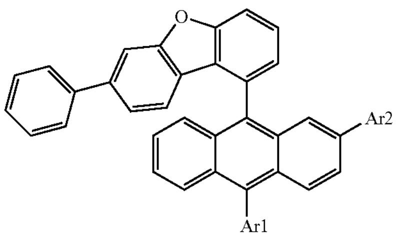 | 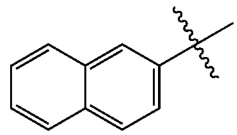 [SMILES: *c1ccc2ccccc2c1] | 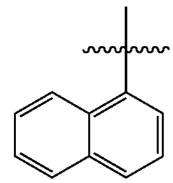 [SMILES: *c1cccc2ccccc12] |
| 48-3 | 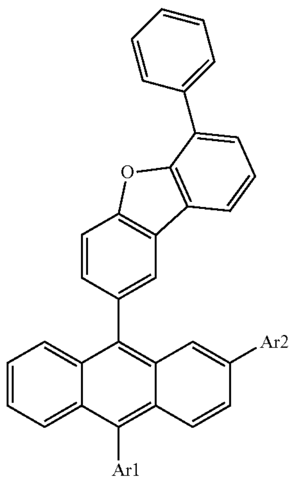 | 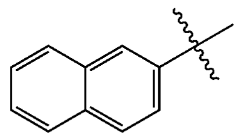 [SMILES: *c1ccc2ccccc2c1] | 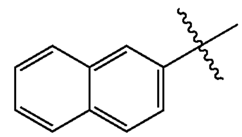 [SMILES: *c1ccc2ccccc2c1] |
| 48-4 | 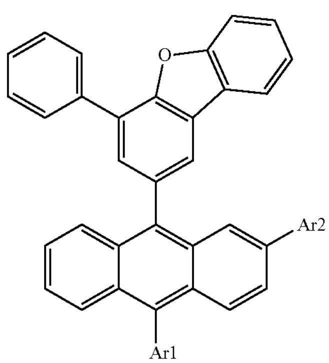 | 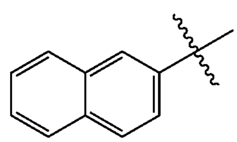 [SMILES: *c1ccc2ccccc2c1] | 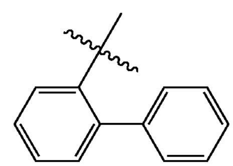 [SMILES: *c1ccccc1-c1ccccc1] |
| 48-5 | 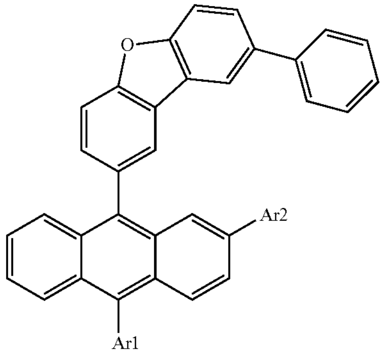 | 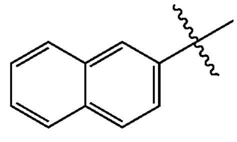 [SMILES: *c1ccc2ccccc2c1] | 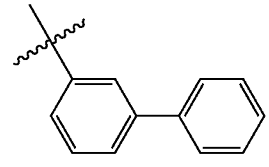 [SMILES: *c1cccc(-c2ccccc2)c1] |

-continued
| No. | Ar1 | Ar2 |
| --- | --- | --- |
| 48-6 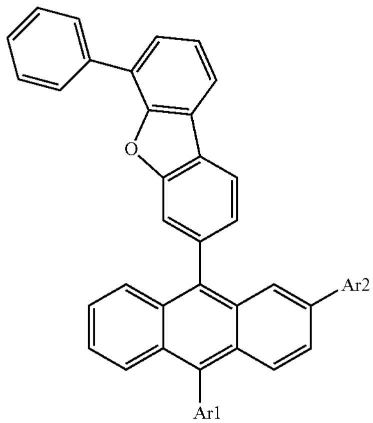 | 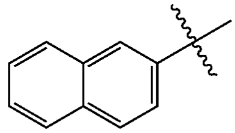 [SMILES: *c1ccc2ccccc2c1] | 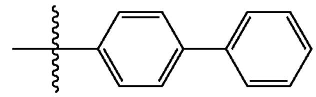 |
| 48-7 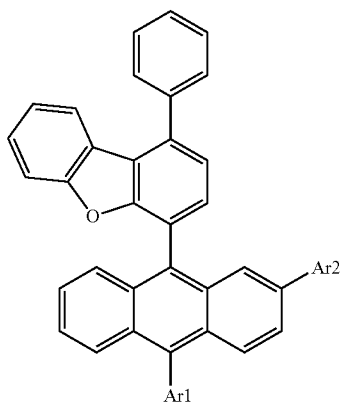 | 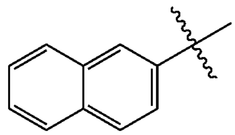 [SMILES: *c1ccc2ccccc2c1] | 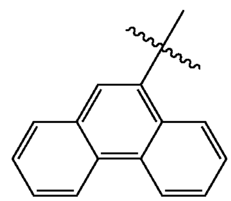 [SMILES: *c1cc2ccccc2c2ccccc12] |
| 48-9 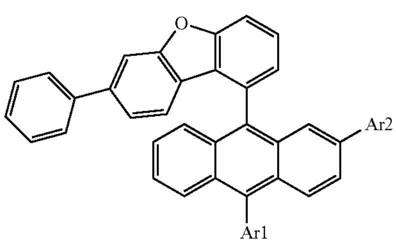 | 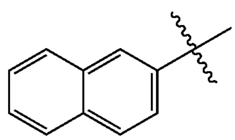 [SMILES: *c1ccc2ccccc2c1] | 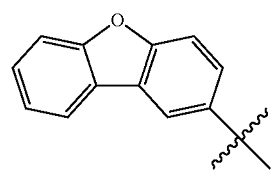 [SMILES: *c1ccc2oc3ccccc3c2c1] |
| 48-10 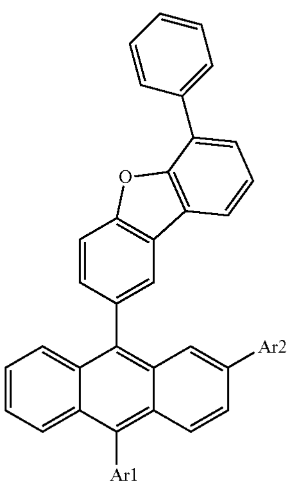 | 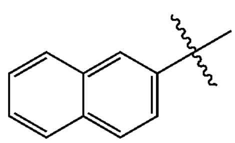 [SMILES: *c1ccc2ccccc2c1] | 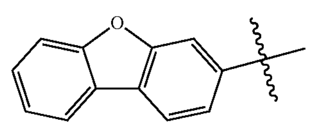 |

-continued
| No. | | Ar1 | Ar2 |
|---|---|---|---|
| 48-11 | 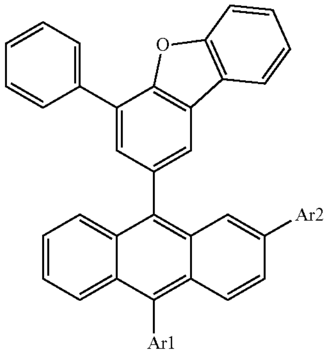 | 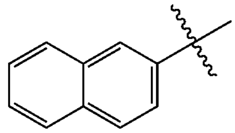 [SMILES: *c1ccc2ccccc2c1] | 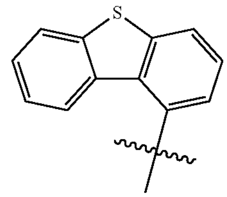 [SMILES: *c1cccc2sc3ccccc3c12] |
| 48-12 | 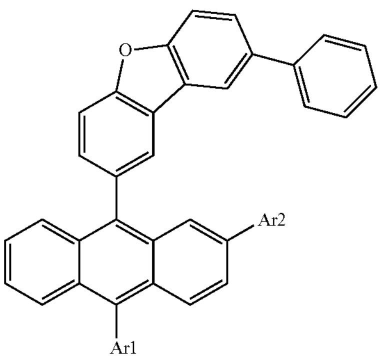 | 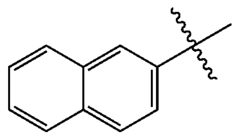 [SMILES: *c1ccc2ccccc2c1] | 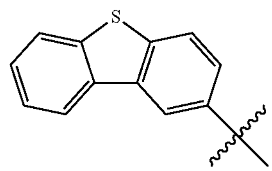 [SMILES: *c1ccc2sc3ccccc3c2c1] |
| 48-13 | 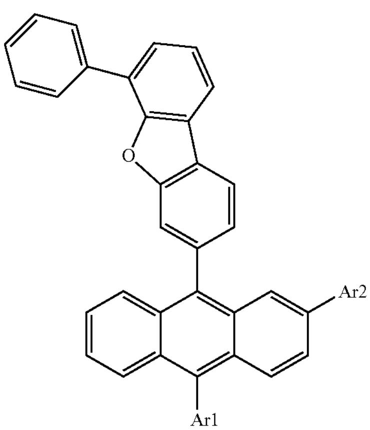 | 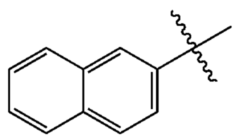 [SMILES: *c1ccc2ccccc2c1] | 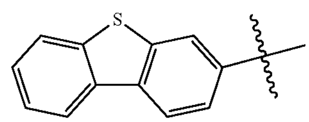 |
| 48-17 | 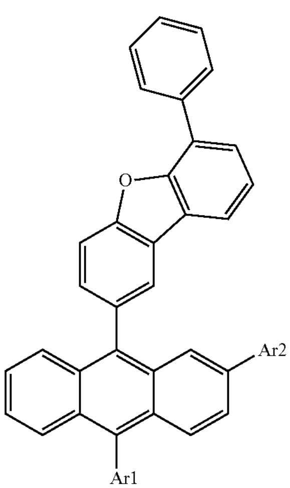 | 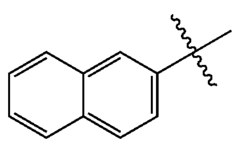 [SMILES: *c1ccc2ccccc2c1] | 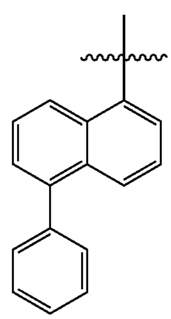 [SMILES: *c1cccc2c(-c3ccccc3)cccc12] |

-continued
| No. | | Ar1 | Ar2 |
|---|---|---|---|
| 48-18 | 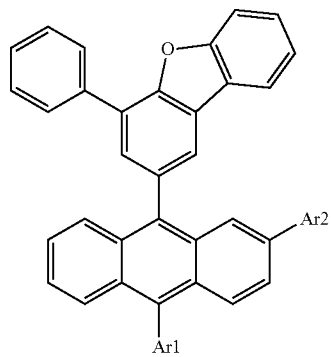 | 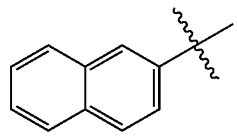 [SMILES: *c1ccc2ccccc2c1] | 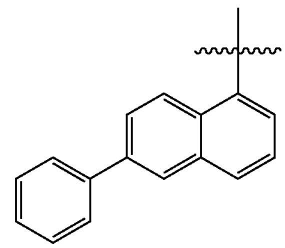 [SMILES: *c1cccc2cc(-c3ccccc3)ccc12] |
| 48-19 | 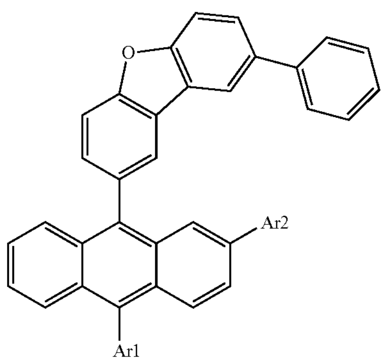 | 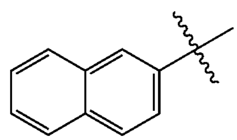 [SMILES: *c1ccc2ccccc2c1] | 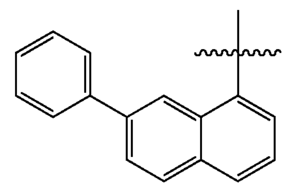 [SMILES: *c1cccc2ccc(-c3ccccc3)cc12] |
| 48-20 | 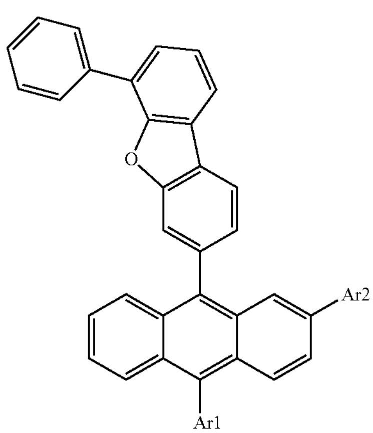 | 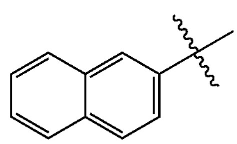 [SMILES: *c1ccc2ccccc2c1] | 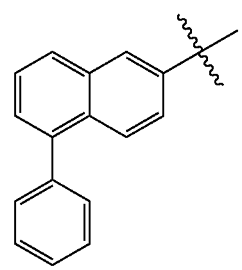 [SMILES: *c1ccc2c(-c3ccccc3)cccc2c1] |
| 48-21 | 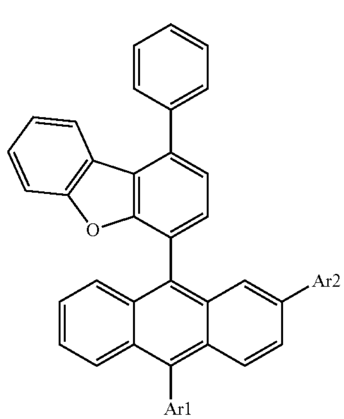 | 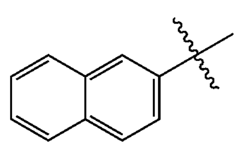 [SMILES: *c1ccc2ccccc2c1] | 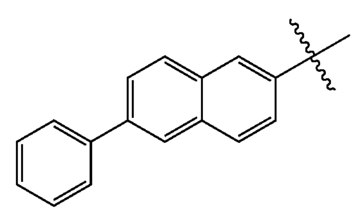 [SMILES: *c1ccc2cc(-c3ccccc3)ccc2c1] |

-continued
| No. | | Ar1 | Ar2 |
|---|---|---|---|
| 48-22 | 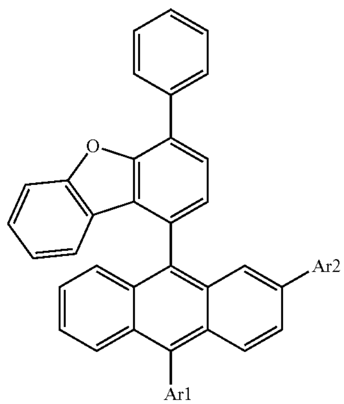 | 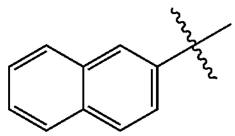 [SMILES: *c1ccc2ccccc2c1] | 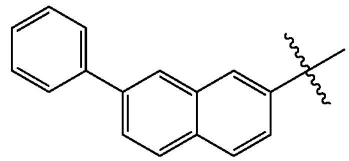 [SMILES: *c1ccc2ccc(-c3ccccc3)cc2c1] |
| 48-23 | 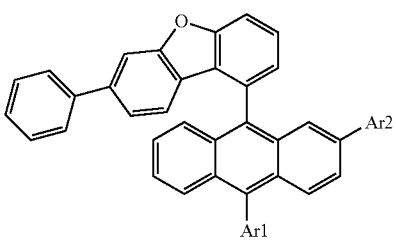 | 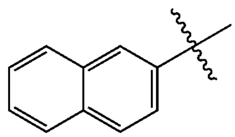 [SMILES: *c1ccc2ccccc2c1] | 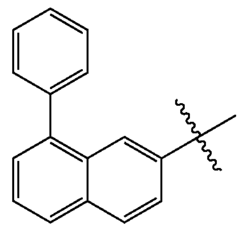 [SMILES: *c1ccc2cccc(-c3ccccc3)c2c1] |
| 48-24 | 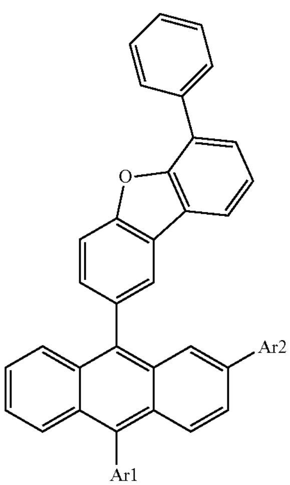 | 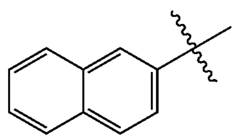 [SMILES: *c1ccc2ccccc2c1] | 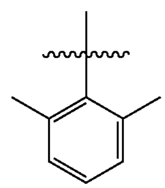 |
| 48-25 | 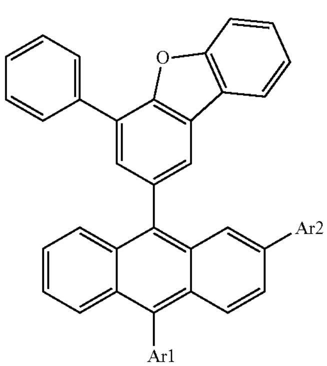 | 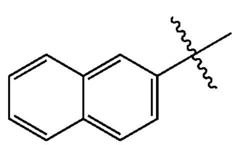 [SMILES: *c1ccc2ccccc2c1] | 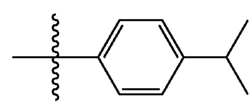 [SMILES: *c1ccc(C(C)C)cc1] |

-continued
| No. | | Ar1 | Ar2 |
|---|---|---|---|
| 48-26 | 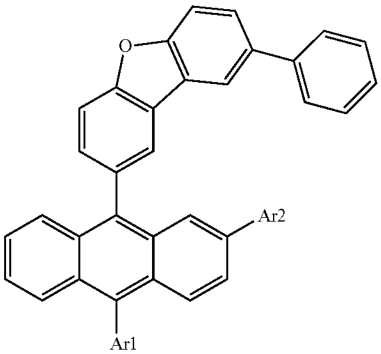 | 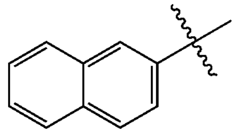 [SMILES: *c1ccc2ccccc2c1] | 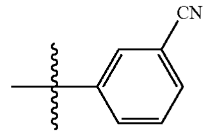 [SMILES: *c1cccc(C#N)c1] |
| 48-27 | 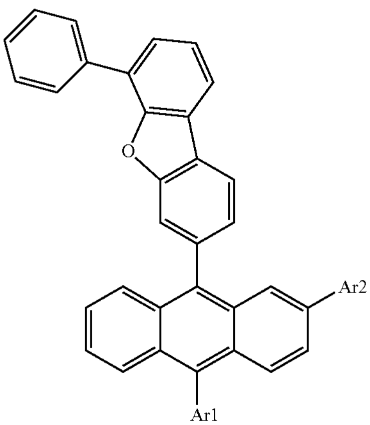 | 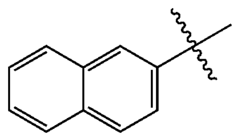 [SMILES: *c1ccc2ccccc2c1] | 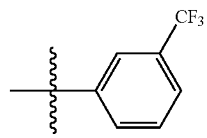 [SMILES: *c1cccc(C(F)(F)F)c1] |
| 48-28 | 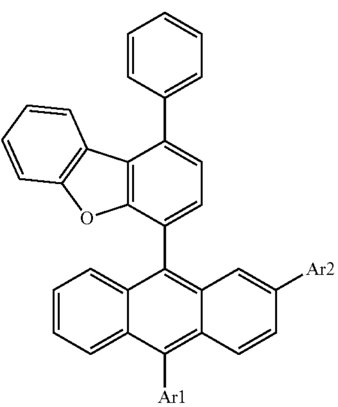 | 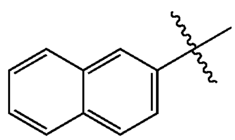 [SMILES: *c1ccc2ccccc2c1] | 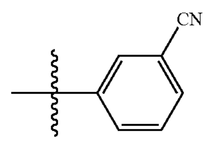 [SMILES: *c1cccc(C#N)c1] |
| 48-29 | 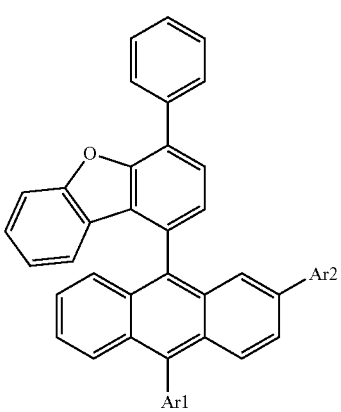 | 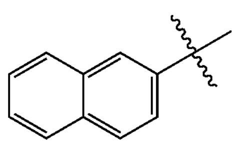 [SMILES: *c1ccc2ccccc2c1] | 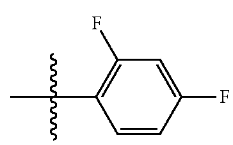 [SMILES: *c1ccc(F)cc1F] |

-continued
| No. | | Ar1 | Ar2 |
|---|---|---|---|
| 49-1 | 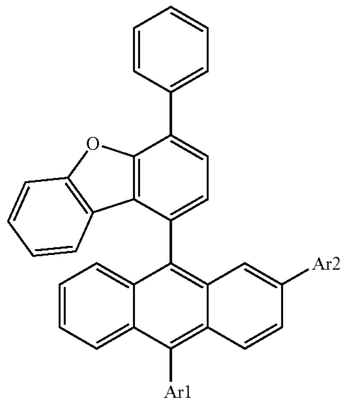 | 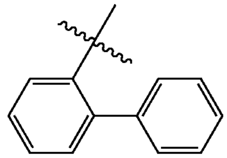 [SMILES: *c1ccccc1-c1ccccc1] | 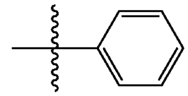 [SMILES: *c1ccccc1] |
| 49-2 | 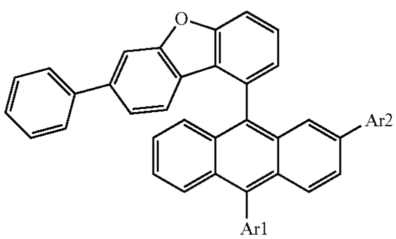 | 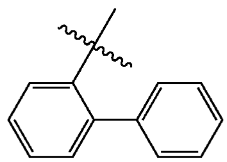 [SMILES: *c1ccccc1-c1ccccc1] | 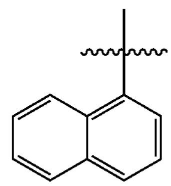 [SMILES: *c1cccc2ccccc12] |
| 49-3 | 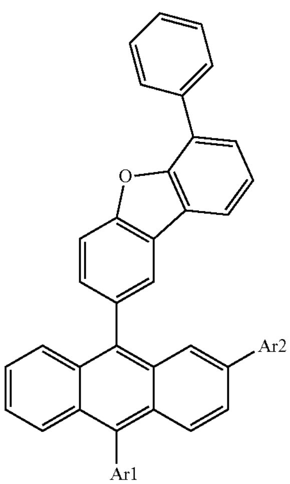 | 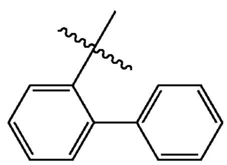 [SMILES: *c1ccccc1-c1ccccc1] | 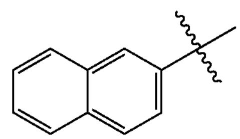 [SMILES: *c1ccc2ccccc2c1] |
| 49-4 | 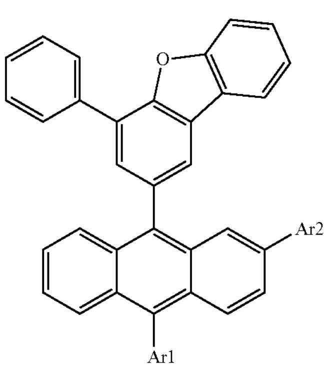 | 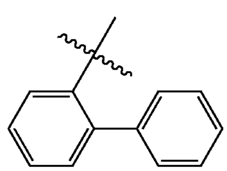 [SMILES: *c1ccccc1-c1ccccc1] | 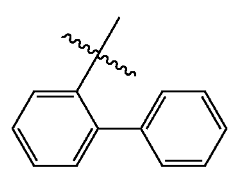 [SMILES: *c1ccccc1-c1ccccc1] |

-continued
| No. | | Ar1 | Ar2 |
|---|---|---|---|
| 49-5 | 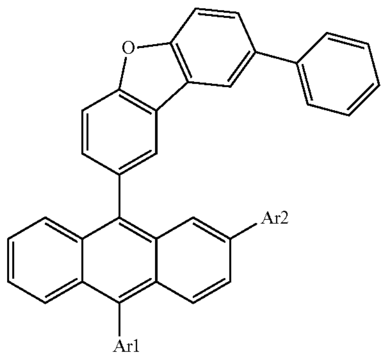 | 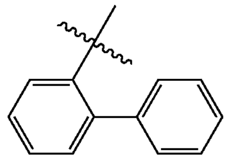 [SMILES: *c1ccccc1-c1ccccc1] | 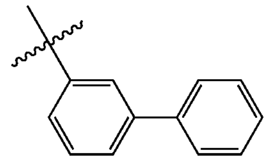 [SMILES: *c1cccc(-c2ccccc2)c1] |
| 49-6 | 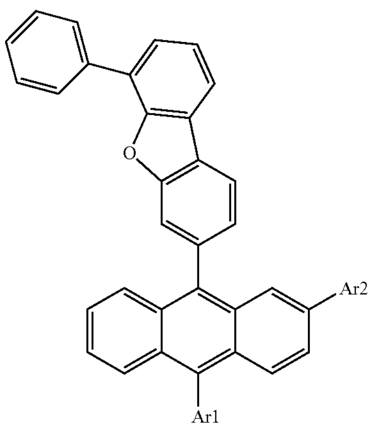 | 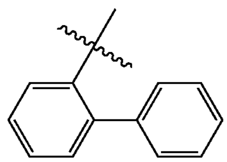 [SMILES: *c1ccccc1-c1ccccc1] | 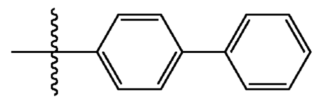 [SMILES: *c1ccc(-c2ccccc2)cc1] |
| 49-7 | 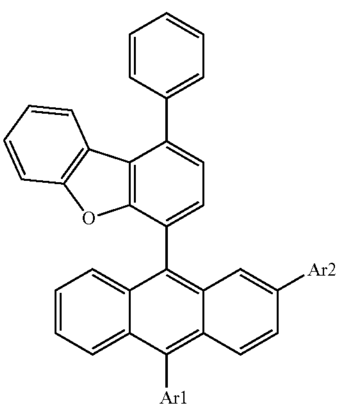 | 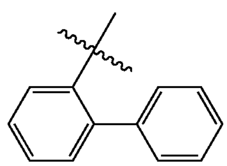 [SMILES: *c1ccccc1-c1ccccc1] | 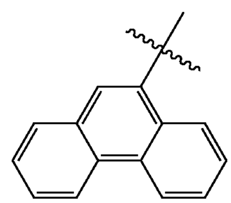 [SMILES: *c1cc2ccccc2c2ccccc12] |
| 49-9 | 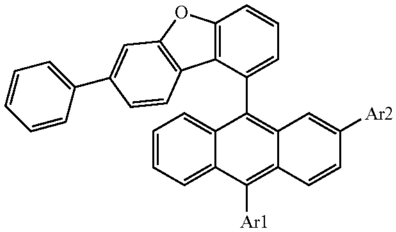 | 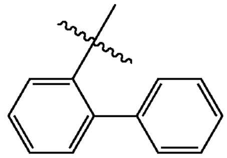 [SMILES: *c1ccccc1-c1ccccc1] | 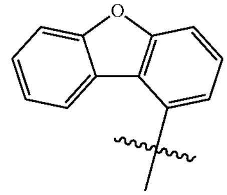 [SMILES: *c1cccc2oc3ccccc3c12] |

-continued
| No. | | Ar1 | Ar2 |
|---|---|---|---|
| 49-10 | 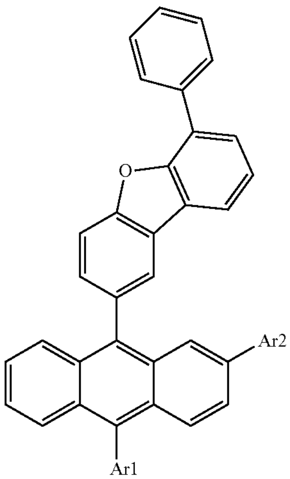 | 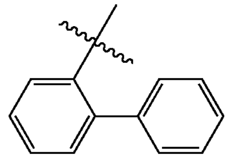 [SMILES: *c1ccccc1-c1ccccc1] | 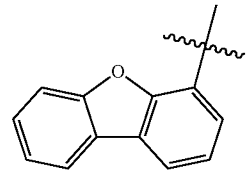 |
| 49-11 | 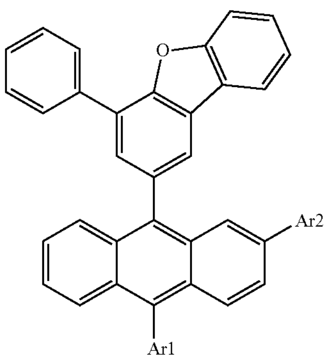 | 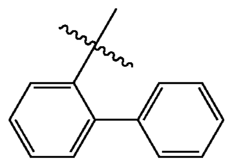 [SMILES: *c1ccccc1-c1ccccc1] | 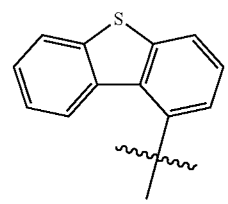 [SMILES: *c1cccc2sc3ccccc3c12] |
| 49-12 | 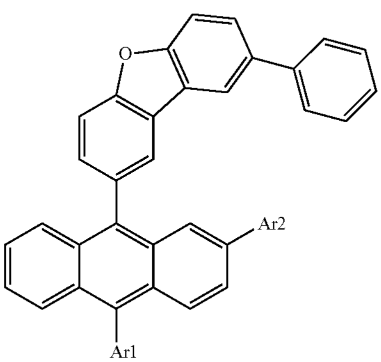 | 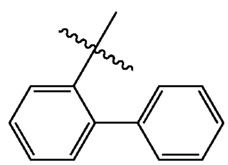 [SMILES: *c1ccccc1-c1ccccc1] | 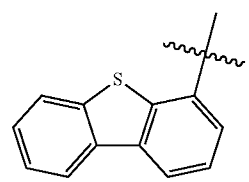 |
| 49-16 | 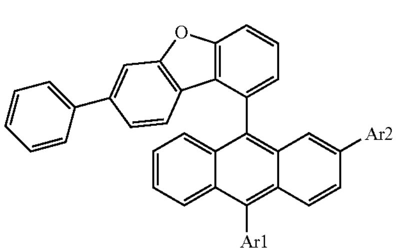 | 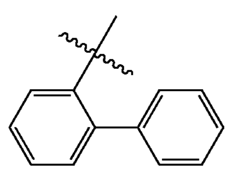 [SMILES: *c1ccccc1-c1ccccc1] | 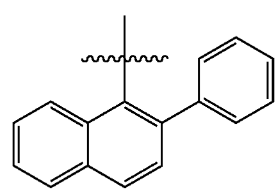 [SMILES: *c1c(-c2ccccc2)ccc2ccccc12] |

-continued
| No. | | Ar1 | Ar2 |
|---|---|---|---|
| 49-17 | 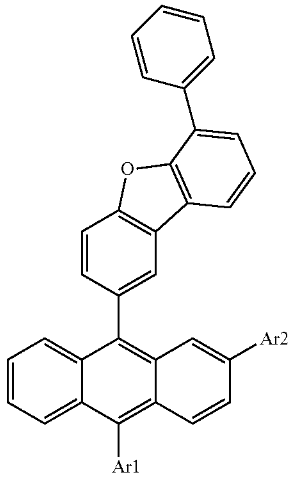 | 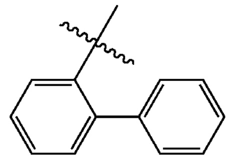 [SMILES: *c1ccccc1-c1ccccc1] | 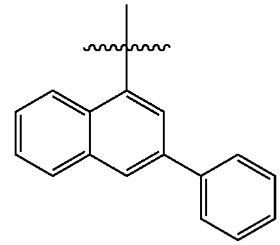 [SMILES: *c1cc(-c2ccccc2)cc2ccccc12] |
| 49-18 | 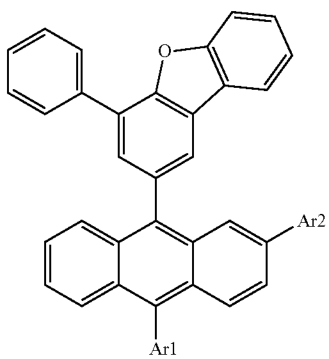 | 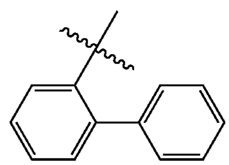 [SMILES: *c1ccccc1-c1ccccc1] | 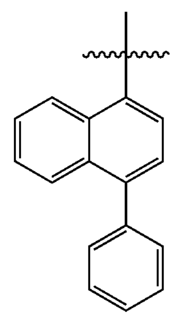 [SMILES: *c1ccc(-c2ccccc2)c2ccccc12] |
| 49-19 | 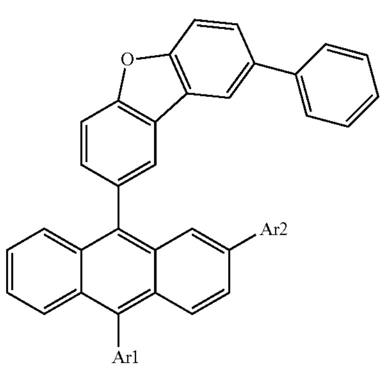 | 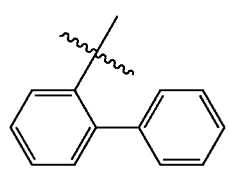 [SMILES: *c1ccccc1-c1ccccc1] | 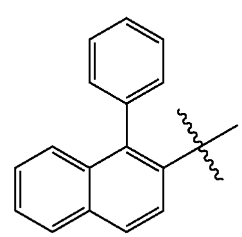 [SMILES: *c1ccc2ccccc2c1-c1ccccc1] |

-continued
| No. | | Ar1 | Ar2 |
|---|---|---|---|
| 49-20 | 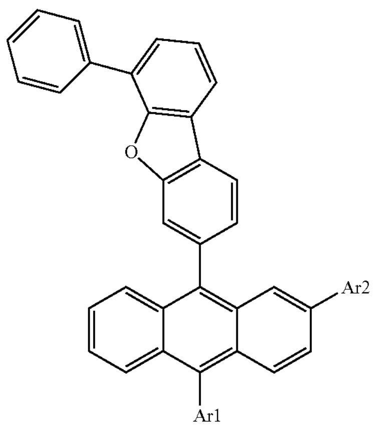 | 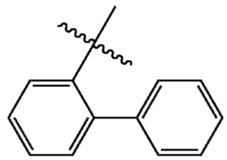 [SMILES: *c1ccccc1-c1ccccc1] | 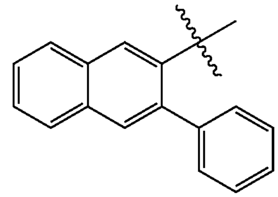 [SMILES: *c1cc2ccccc2cc1-c1ccccc1] |
| 49-21 | 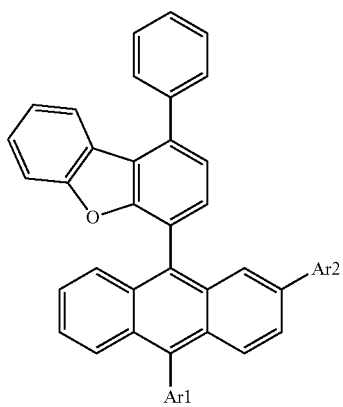 | 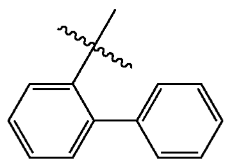 [SMILES: *c1ccccc1-c1ccccc1] | 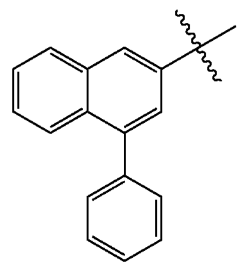 [SMILES: *c1cc(-c2ccccc2)c2ccccc2c1] |
| 49-22 | 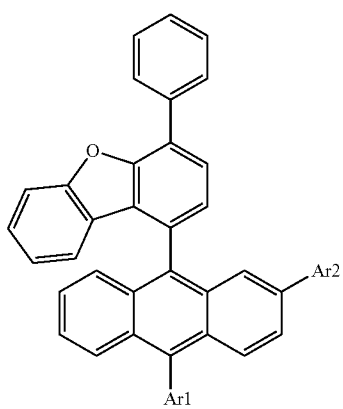 | 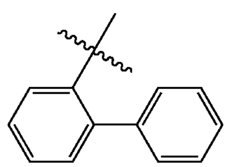 [SMILES: *c1ccccc1-c1ccccc1] | 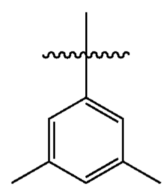 |
| 49-23 | 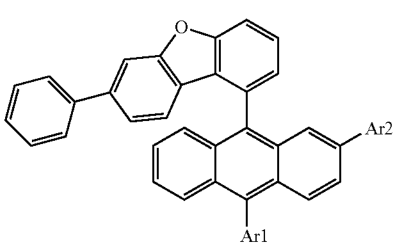 | 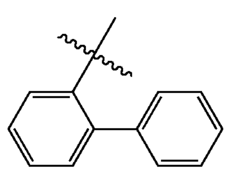 [SMILES: *c1ccccc1-c1ccccc1] | 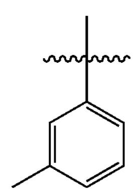 [SMILES: *c1cccc(C)c1] |

-continued
| No. | | Ar1 | Ar2 |
|---|---|---|---|
| 49-24 | 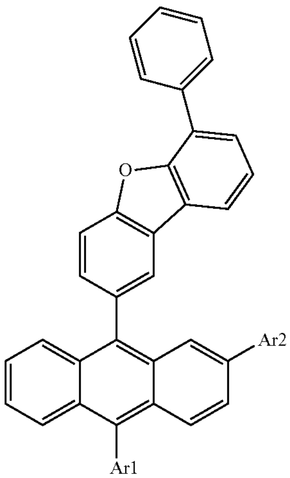 | 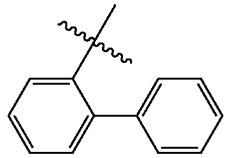 [SMILES: *c1ccccc1-c1ccccc1] | 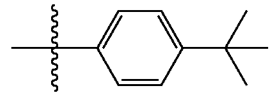 |
| 49-25 | 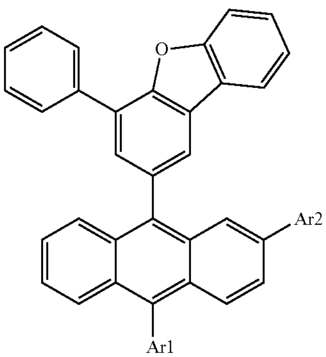 | 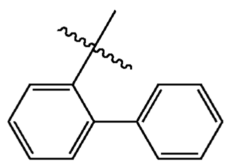 [SMILES: *c1ccccc1-c1ccccc1] | 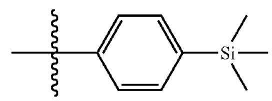 [SMILES: *c1ccc([Si](C)(C)C)cc1] |
| 49-26 | 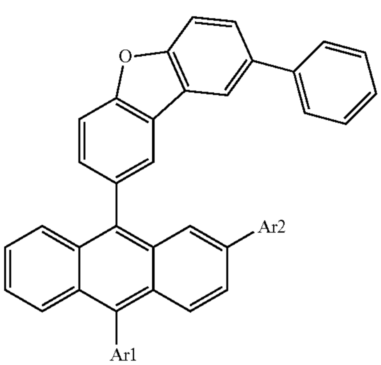 | 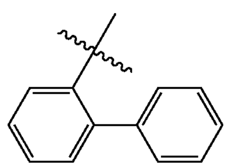 [SMILES: *c1ccccc1-c1ccccc1] | 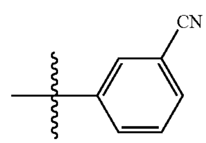 [SMILES: *c1cccc(C#N)c1] |

-continued
| No. | | Ar1 | Ar2 |
|---|---|---|---|
| 49-27 | 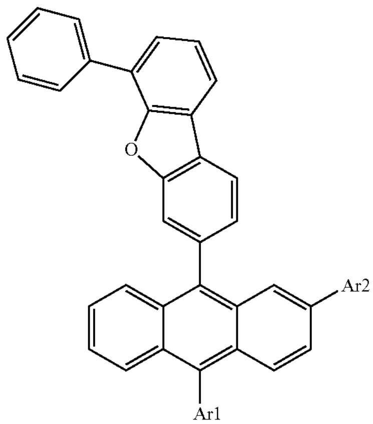 | 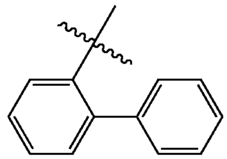 [SMILES: *c1ccccc1-c1ccccc1] | 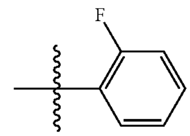 [SMILES: *c1ccccc1F] |
| 49-28 | 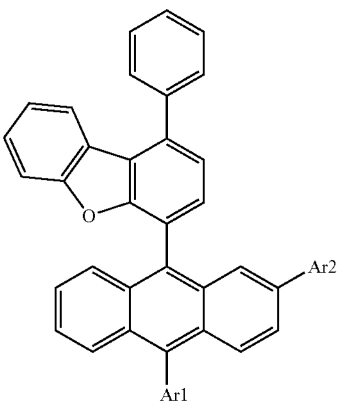 | 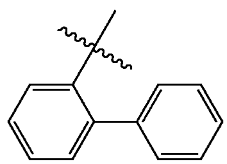 [SMILES: *c1ccccc1-c1ccccc1] | 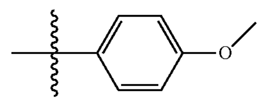 [SMILES: *c1ccc(OC)cc1] |
| 50-1 | 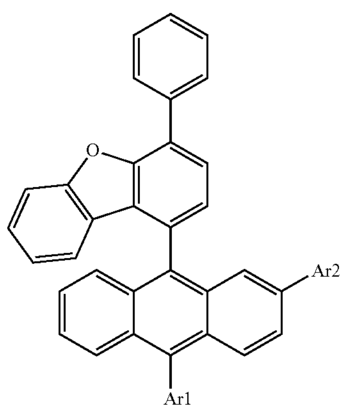 | 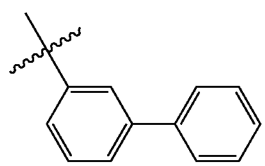 [SMILES: *c1cccc(-c2ccccc2)c1] | 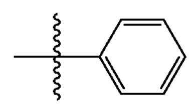 [SMILES: *c1ccccc1] |
| 50-2 | 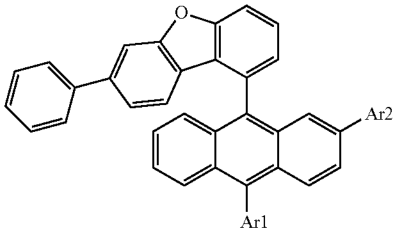 | 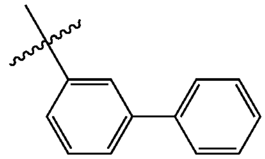 [SMILES: *c1cccc(-c2ccccc2)c1] | 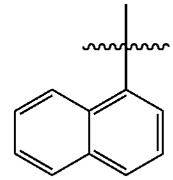 [SMILES: *c1cccc2ccccc12] |

-continued
| No. | | Ar1 | Ar2 |
|---|---|---|---|
| 50-3 | 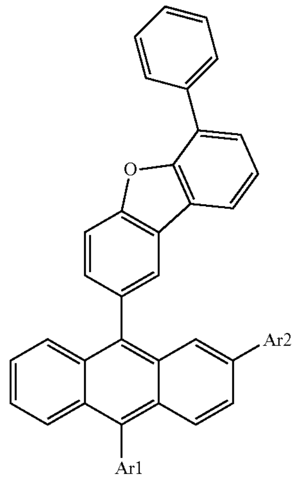 | 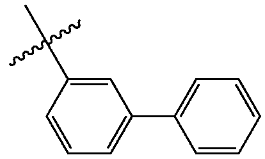 [SMILES: *c1cccc(-c2ccccc2)c1] | 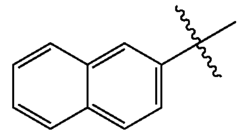 [SMILES: *c1ccc2ccccc2c1] |
| 50-4 | 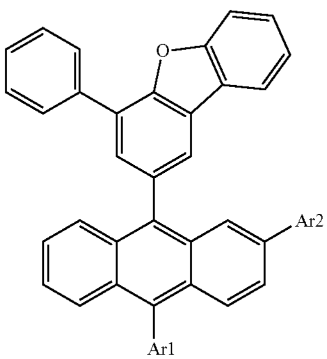 | 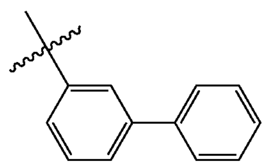 [SMILES: *c1cccc(-c2ccccc2)c1] | 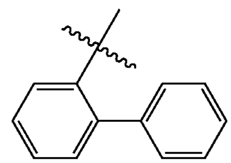 [SMILES: *c1ccccc1-c1ccccc1] |
| 50-5 | 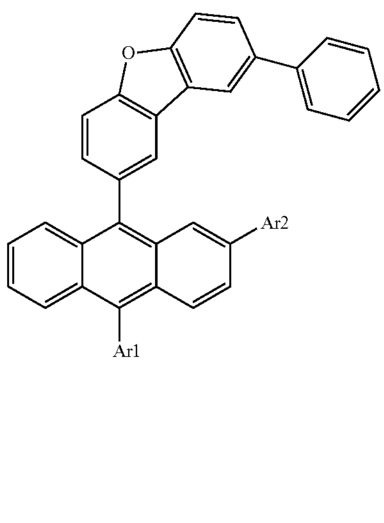 | 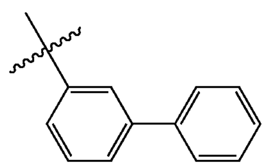 [SMILES: *c1cccc(-c2ccccc2)c1] | 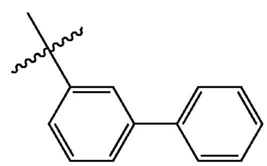 [SMILES: *c1cccc(-c2ccccc2)c1] |

-continued
| No. | | Ar1 | Ar2 |
|---|---|---|---|
| 50-6 | 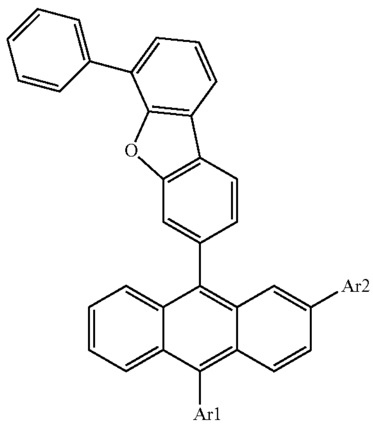 | 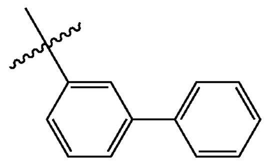 [SMILES: *c1cccc(-c2ccccc2)c1] | 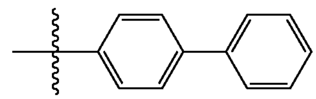 [SMILES: *c1ccc(-c2ccccc2)cc1] |
| 50-7 | 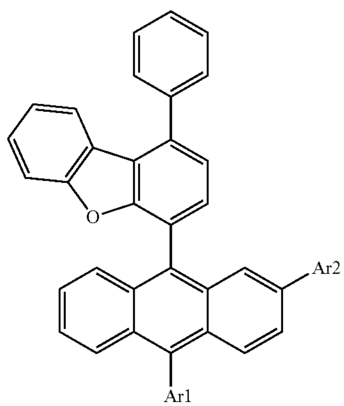 | 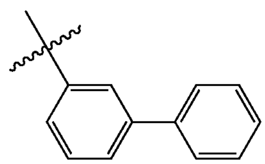 [SMILES: *c1cccc(-c2ccccc2)c1] | 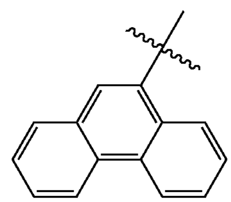 [SMILES: *c1cc2ccccc2c2ccccc12] |
| 50-9 | 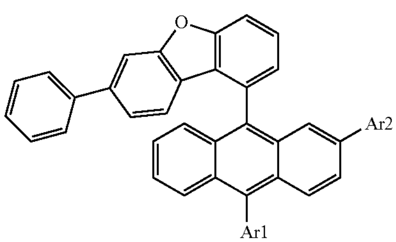 | 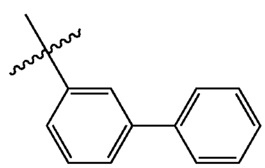 [SMILES: *c1cccc(-c2ccccc2)c1] | 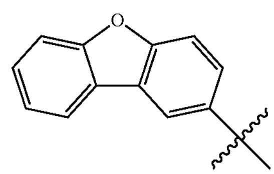 |
| 50-10 | 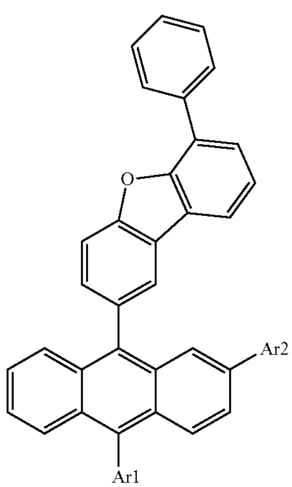 | 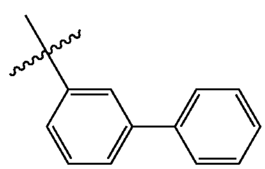 [SMILES: *c1cccc(-c2ccccc2)c1] | 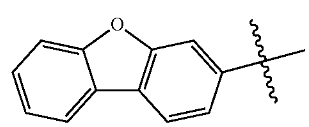 |

-continued
| No. | | Ar1 | Ar2 |
|---|---|---|---|
| 50-11 | 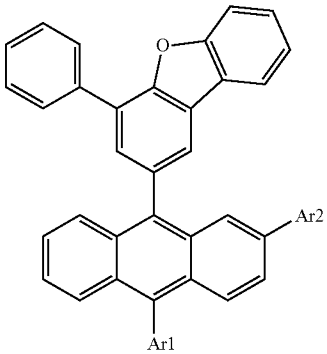 | 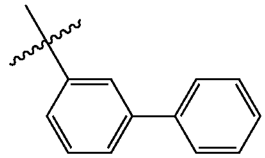 [SMILES: *c1cccc(-c2ccccc2)c1] | 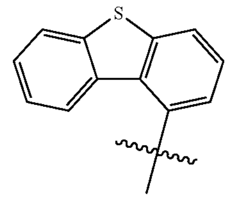 |
| 50-12 | 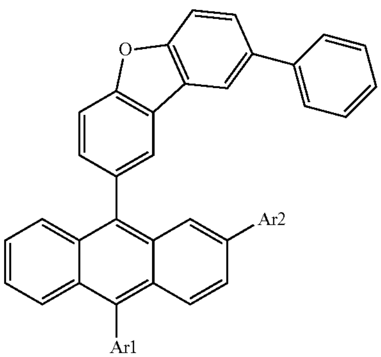 | 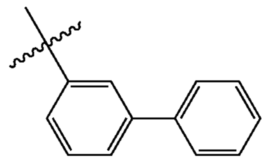 [SMILES: *c1cccc(-c2ccccc2)c1] | 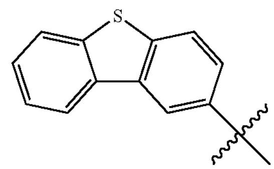 [SMILES: *c1ccc2sc3ccccc3c2c1] |
| 50-13 | 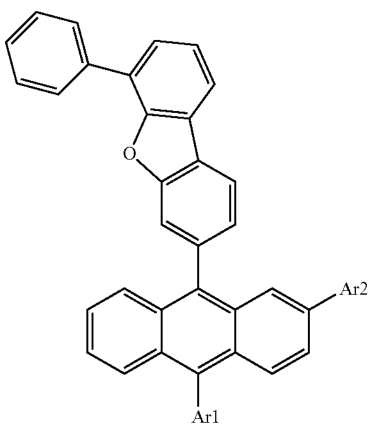 | 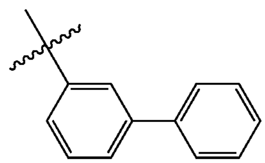 [SMILES: *c1cccc(-c2ccccc2)c1] | 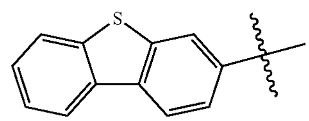 [SMILES: *c1ccc2c(c1)sc1ccccc12] |
| 50-17 | 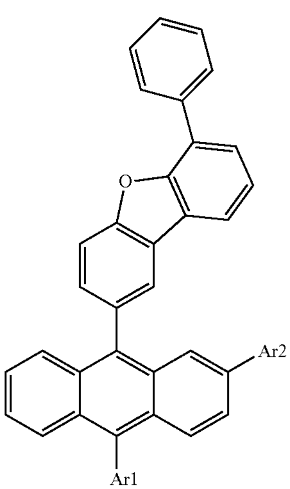 | 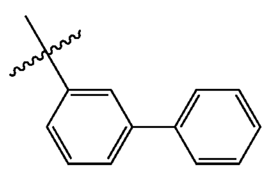 [SMILES: *c1cccc(-c2ccccc2)c1] | 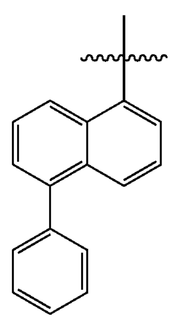 [SMILES: *c1cccc2c(-c3ccccc3)cccc12] |

-continued
| No. | | Ar1 | Ar2 |
|---|---|---|---|
| 50-18 | 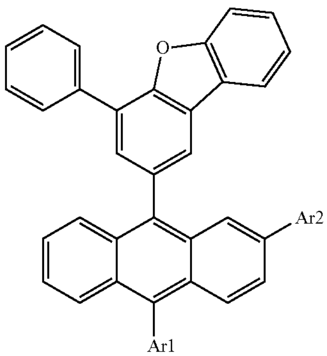 | 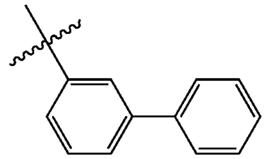 [SMILES: *c1cccc(-c2ccccc2)c1] | 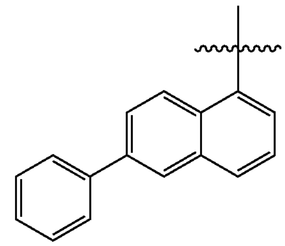 [SMILES: *c1cccc2cc(-c3ccccc3)ccc12] |
| 50-19 | 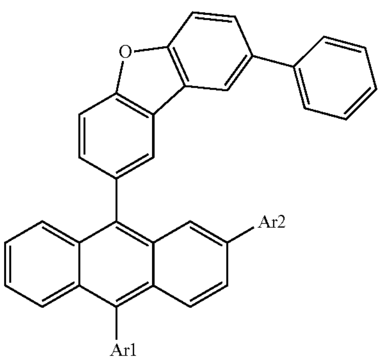 | 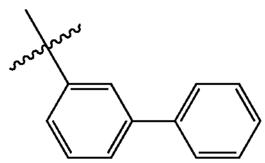 [SMILES: *c1cccc(-c2ccccc2)c1] | 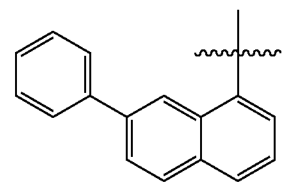 [SMILES: *c1cccc2ccc(-c3ccccc3)cc12] |
| 50-20 | 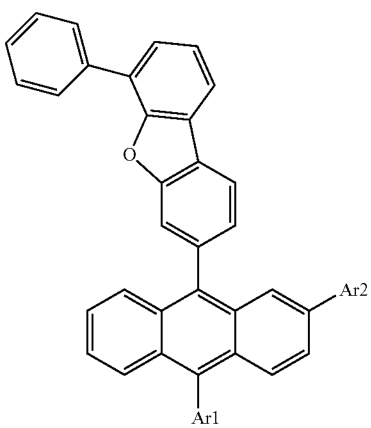 | 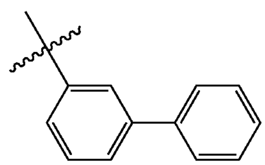 [SMILES: *c1cccc(-c2ccccc2)c1] | 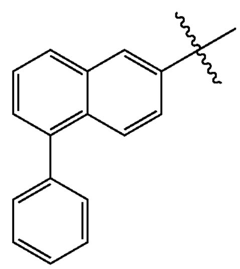 [SMILES: *c1ccc2c(-c3ccccc3)cccc2c1] |
| 50-21 | 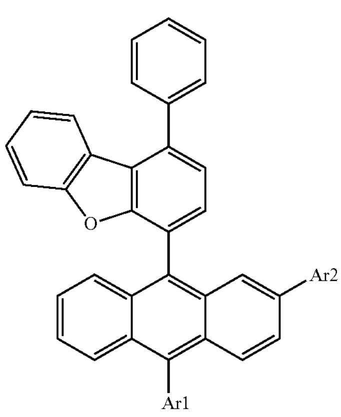 | 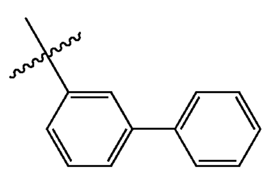 [SMILES: *c1cccc(-c2ccccc2)c1] | 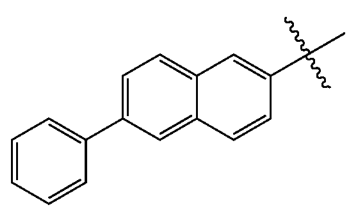 [SMILES: *c1ccc2cc(-c3ccccc3)ccc2c1] |

-continued
| No. | | Ar1 | Ar2 |
|---|---|---|---|
| 50-22 | 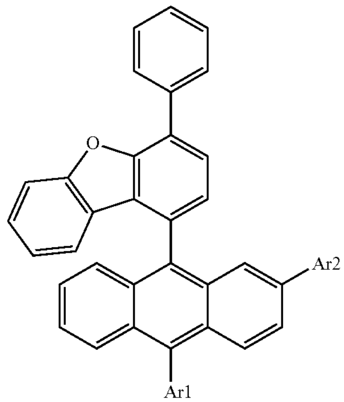 | 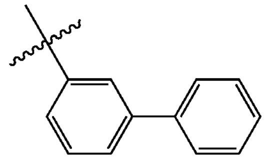 [SMILES: *c1cccc(-c2ccccc2)c1] | 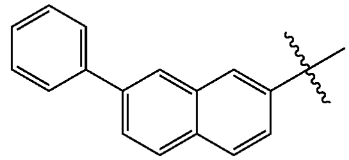 [SMILES: *c1ccc2ccc(-c3ccccc3)cc2c1] |
| 50-23 | 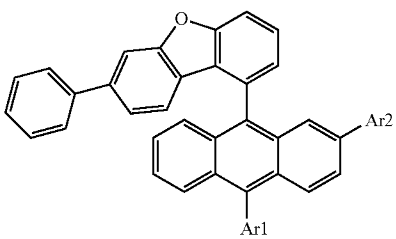 | 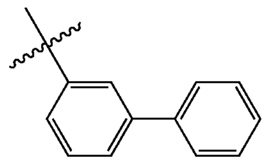 [SMILES: *c1cccc(-c2ccccc2)c1] | 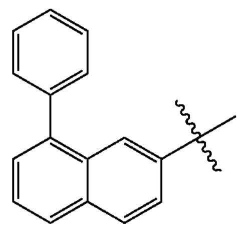 [SMILES: *c1ccc2cccc(-c3ccccc3)c2c1] |
| 50-24 | 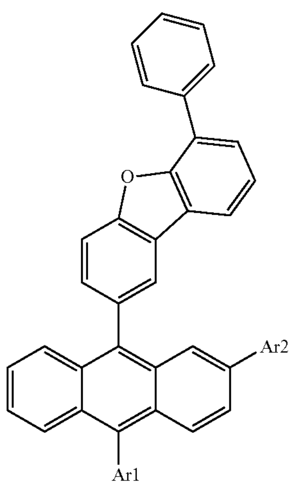 | 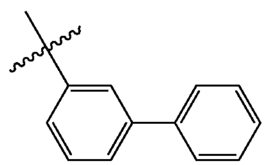 [SMILES: *c1cccc(-c2ccccc2)c1] | 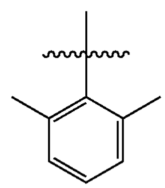 |
| 50-25 | 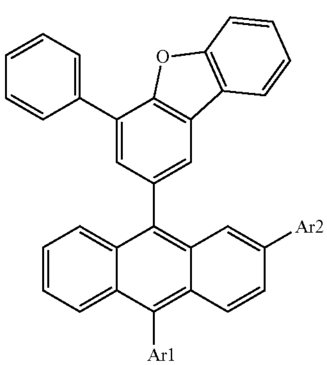 | 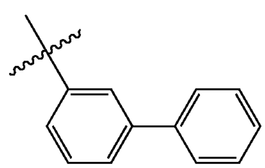 [SMILES: *c1cccc(-c2ccccc2)c1] | 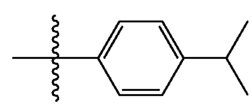 |

-continued
| No. | | Ar1 | Ar2 |
|---|---|---|---|
| 50-26 | 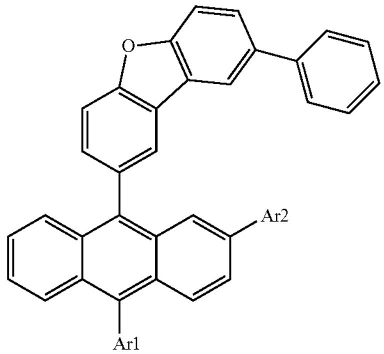 | 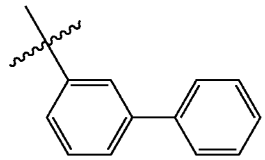 [SMILES: *c1cccc(-c2ccccc2)c1] | 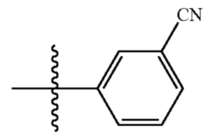 [SMILES: *c1cccc(C#N)c1] |
| 50-27 | 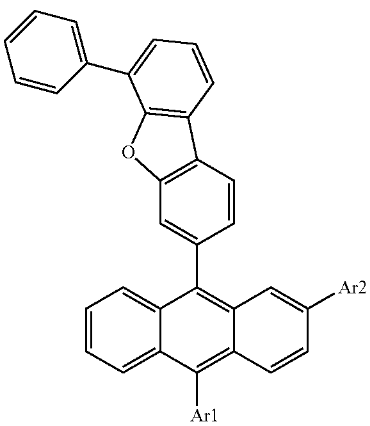 | 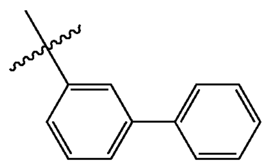 [SMILES: *c1cccc(-c2ccccc2)c1] | 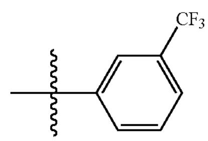 [SMILES: *c1cccc(C(F)(F)F)c1] |
| 50-28 | 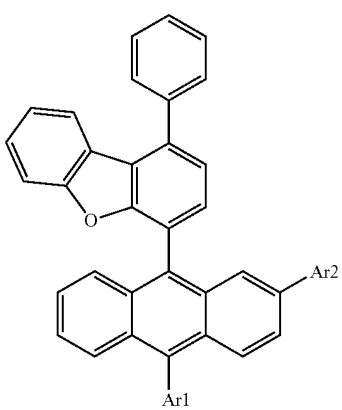 | 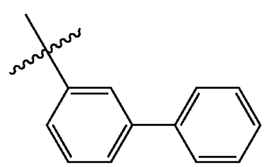 [SMILES: *c1cccc(-c2ccccc2)c1] | 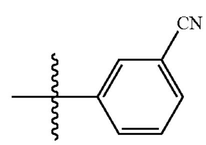 [SMILES: *c1cccc(C#N)c1] |
| 50-29 | 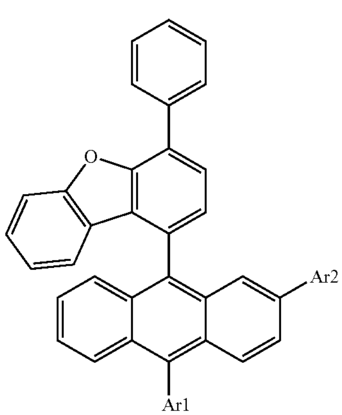 | 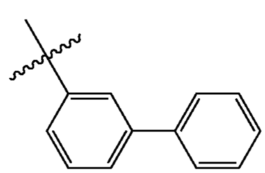 [SMILES: *c1cccc(-c2ccccc2)c1] | 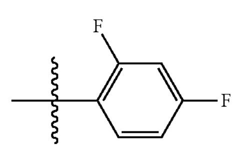 [SMILES: *c1ccc(F)cc1F] |

-continued
| No. | | Ar1 | Ar2 |
|---|---|---|---|
| 51-1 | 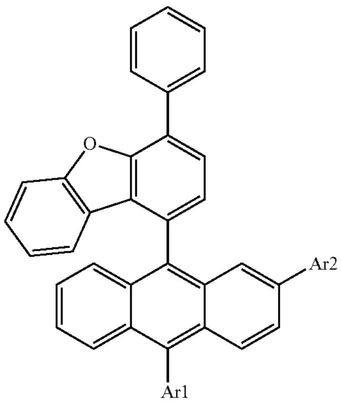 | 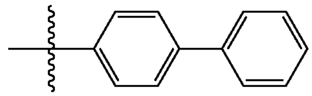 [SMILES: *c1ccc(-c2ccccc2)cc1] | 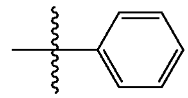 |
| 51-2 | 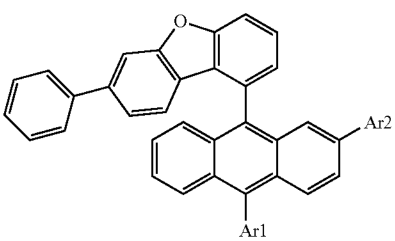 | 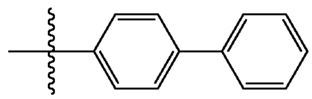 | 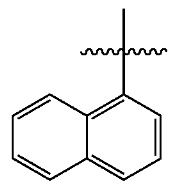 [SMILES: *c1cccc2ccccc12] |
| 51-3 | 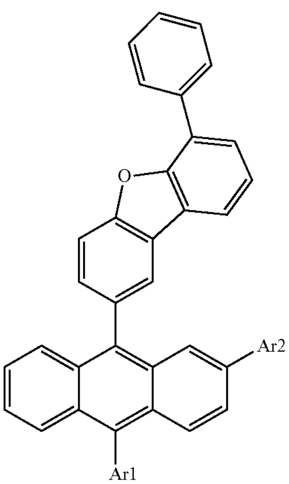 | 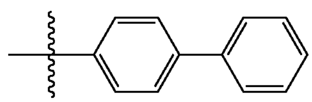 [SMILES: *c1ccc(-c2ccccc2)cc1] | 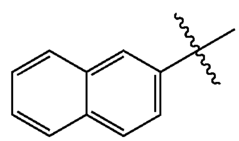 [SMILES: *c1ccc2ccccc2c1] |
| 51-4 | 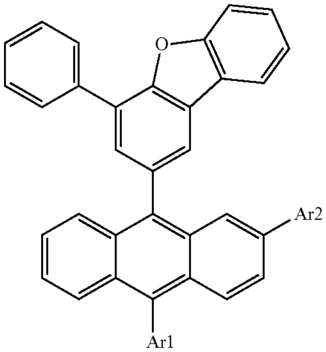 | 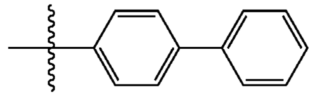 [SMILES: *c1ccc(-c2ccccc2)cc1] | 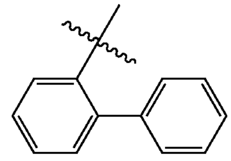 [SMILES: *c1ccccc1-c1ccccc1] |

-continued
| No. | | Ar1 | Ar2 |
|---|---|---|---|
| 51-5 | 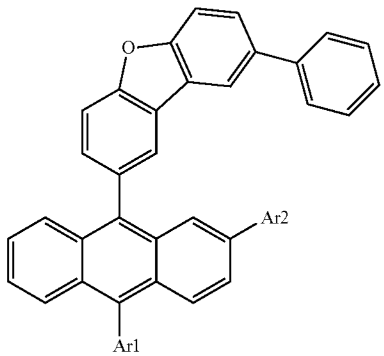 | 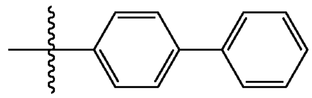 | 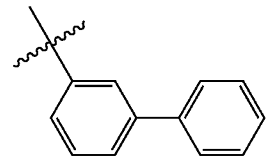 [SMILES: *c1cccc(-c2ccccc2)c1] |
| 51-6 | 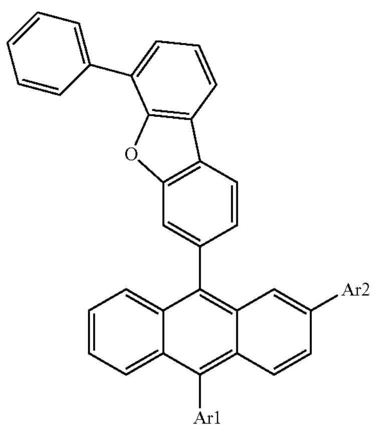 | 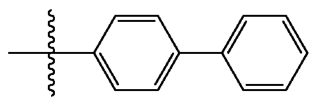 | 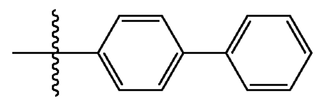 |
| 51-7 | 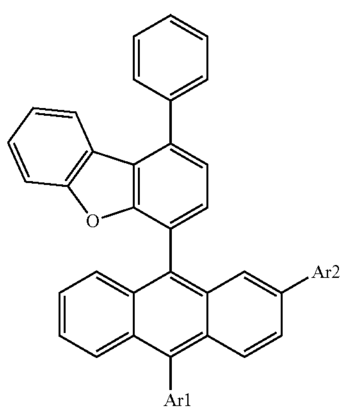 | 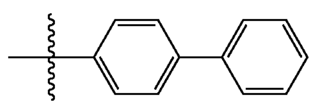 | 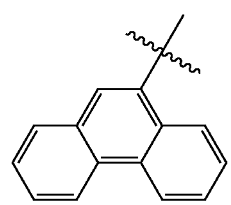 [SMILES: *c1cc2ccccc2c2ccccc12] |
| 51-9 | 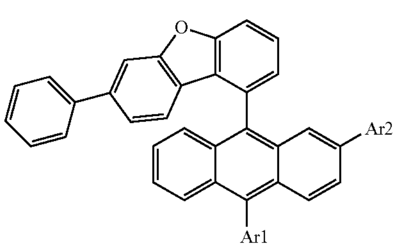 | 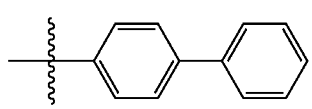 | 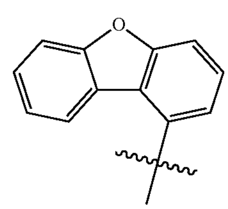 |

-continued
| No. | | Ar1 | Ar2 |
|---|---|---|---|
| 51-10 | 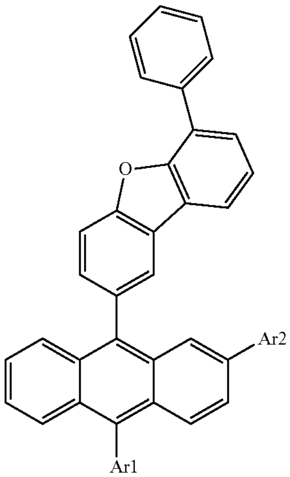 | 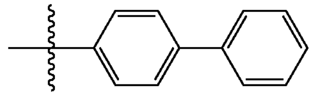 | 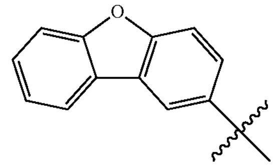 |
| 51-11 | 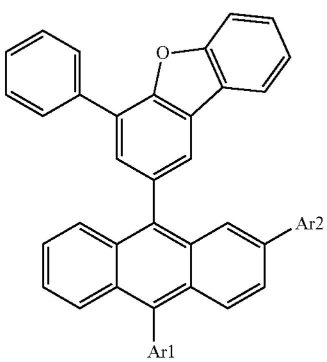 | 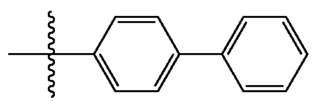 | 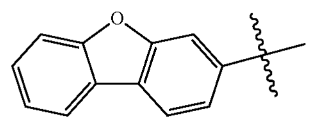 |
| 51-12 | 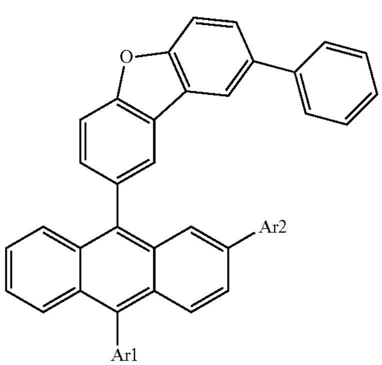 | 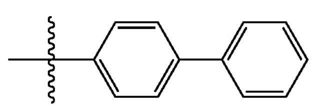 [SMILES: *c1ccc(-c2ccccc2)cc1] | 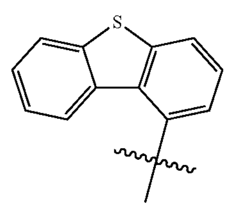 [SMILES: *c1cccc2sc3ccccc3c12] |

-continued
| No. | | Ar1 | Ar2 |
|---|---|---|---|
| 51-13 | 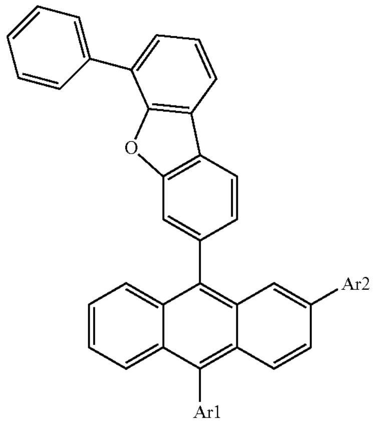 | 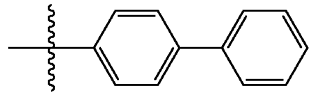 [SMILES: *c1ccc(-c2ccccc2)cc1] | 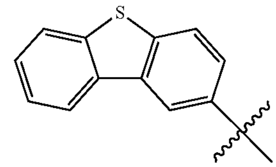 |
| 51-14 | 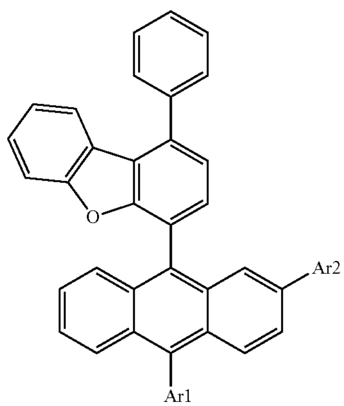 | 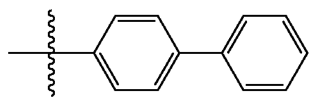 | 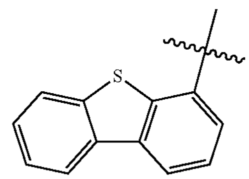 |
| 51-19 | 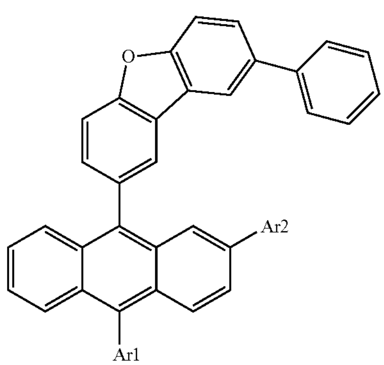 | 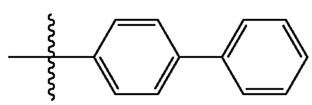 | 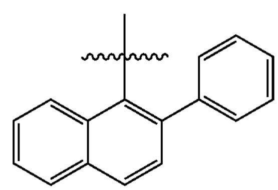 [SMILES: *c1c(-c2ccccc2)ccc2ccccc12] |
| 51-20 | 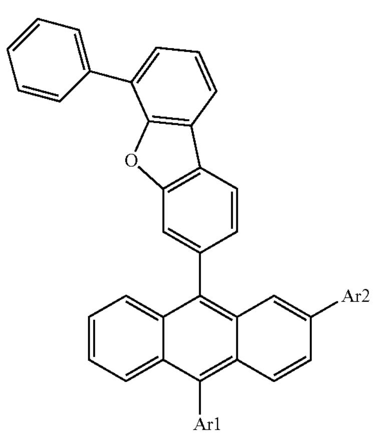 | 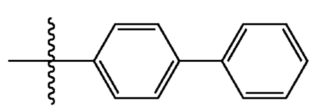 [SMILES: *c1ccc(-c2ccccc2)cc1] | 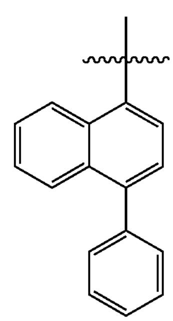 [SMILES: *c1ccc(-c2ccccc2)c2ccccc12] |

-continued
| No. | | Ar1 | Ar2 |
|---|---|---|---|
| 51-21 | 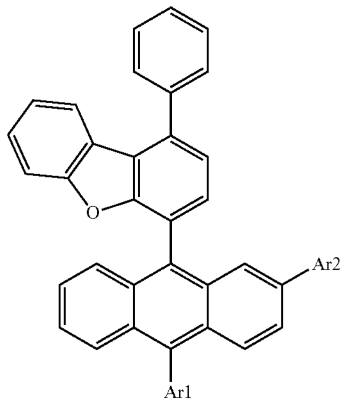 | 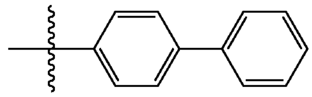 [SMILES: *c1ccc(-c2ccccc2)cc1] | 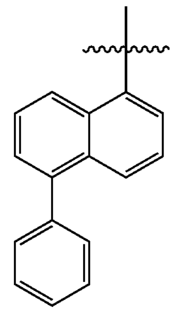 [SMILES: *c1cccc2c(-c3ccccc3)cccc12] |
| 51-22 | 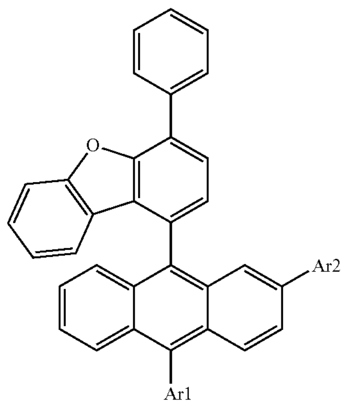 | 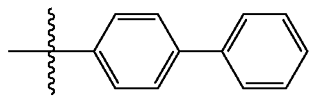 [SMILES: *c1ccc(-c2ccccc2)cc1] | 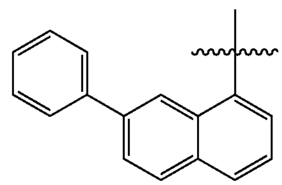 [SMILES: *c1cccc2ccc(-c3ccccc3)cc12] |
| 51-23 | 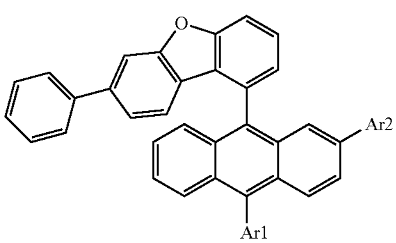 | 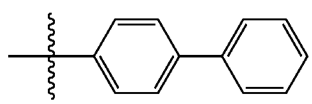 | 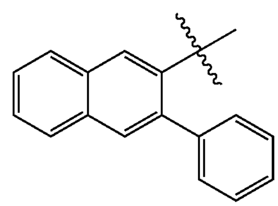 [SMILES: *c1cc2ccccc2cc1-c1ccccc1] |
| 51-24 | 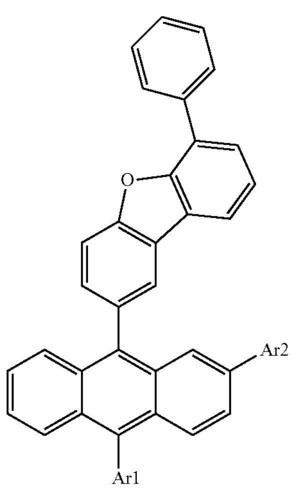 | 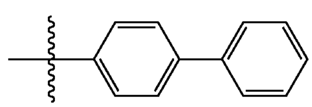 [SMILES: *c1ccc(-c2ccccc2)cc1] | 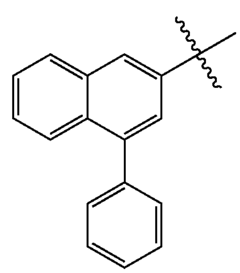 [SMILES: *c1cc(-c2ccccc2)c2ccccc2c1] |

-continued
| No. | | Ar1 | Ar2 |
|---|---|---|---|
| 51-25 | 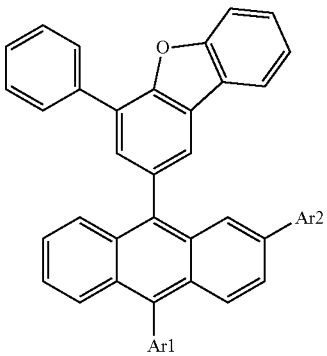 | 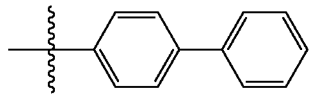 [SMILES: *c1ccc(-c2ccccc2)cc1] | 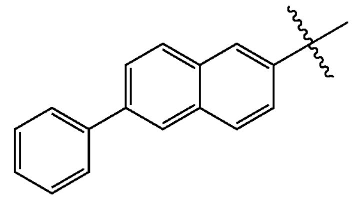 [SMILES: *c1ccc2cc(-c3ccccc3)ccc2c1] |
| 51-26 | 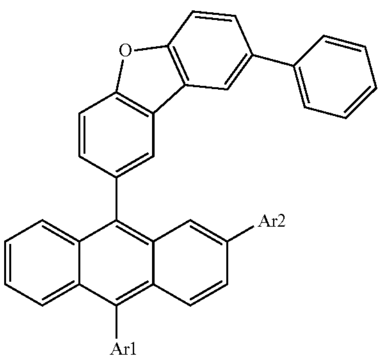 | 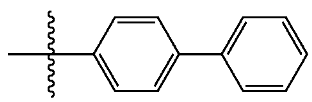 | 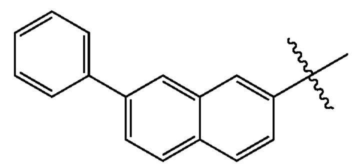 [SMILES: *c1ccc2ccc(-c3ccccc3)cc2c1] |
| 51-27 | 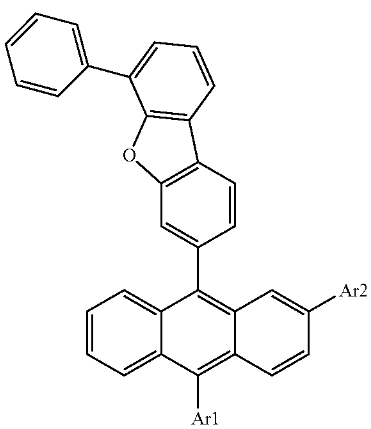 | 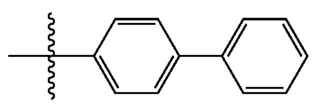 | 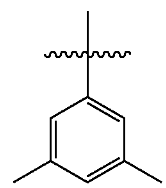 |
| 51-28 | 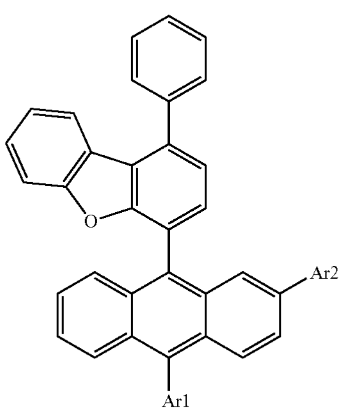 | 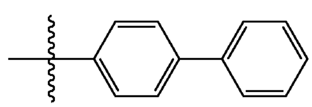 | 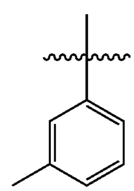 |

-continued
| No. | | Ar1 | Ar2 |
|---|---|---|---|
| 51-29 | 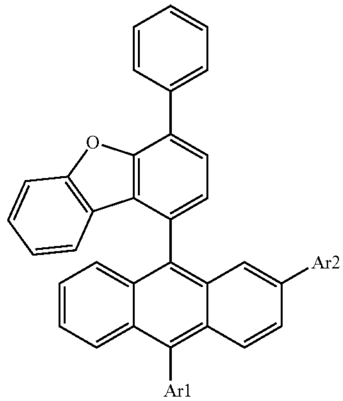  | 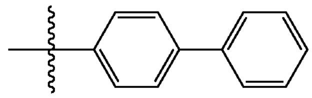 [SMILES: *c1ccc(-c2ccccc2)cc1] | 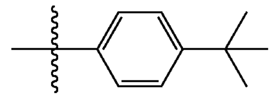 [SMILES: *c1ccc(C(C)(C)C)cc1] |
| 51-30 | 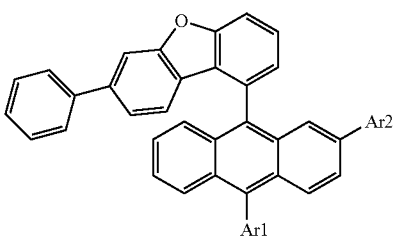  | 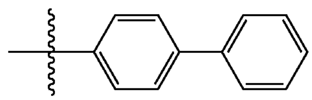 [SMILES: *c1ccc(-c2ccccc2)cc1] | 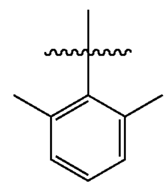 |
| 51-31 | 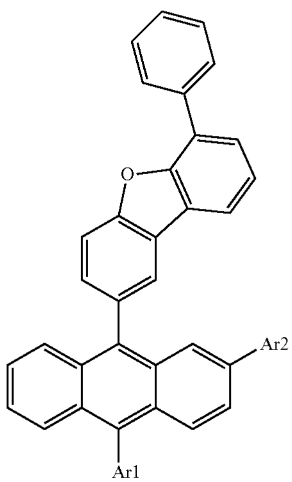  | 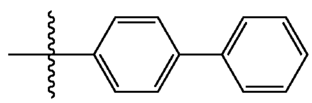 [SMILES: *c1ccc(-c2ccccc2)cc1] | 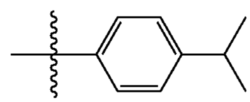 [SMILES: *c1ccc(C(C)C)cc1] |
| 52-1 | 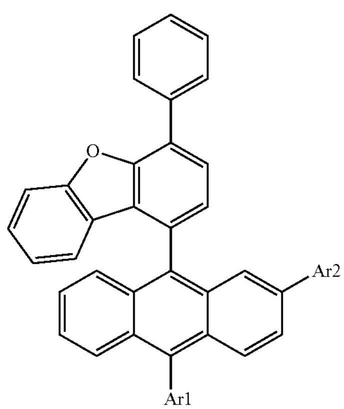  | 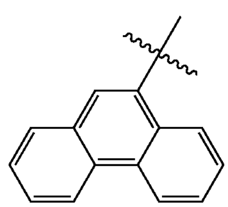 [SMILES: *c1cc2ccccc2c2ccccc12] | 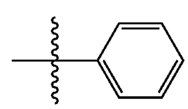 [SMILES: *c1ccccc1] |

-continued
| No. | | Ar1 | Ar2 |
|---|---|---|---|
| 52-2 | 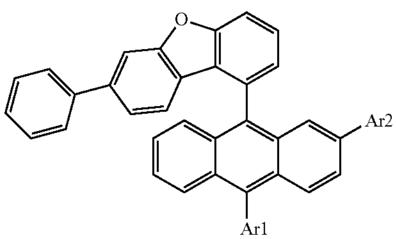 | 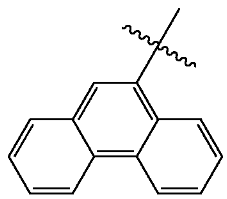 [SMILES: *c1cc2ccccc2c2ccccc12] | 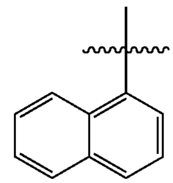 [SMILES: *c1cccc2ccccc12] |
| 52-3 | 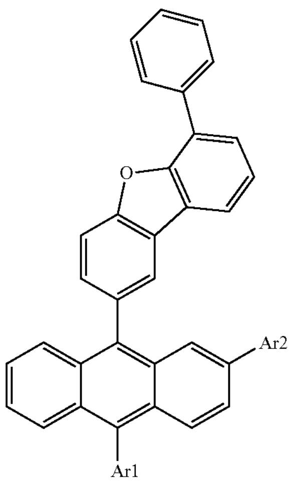 | 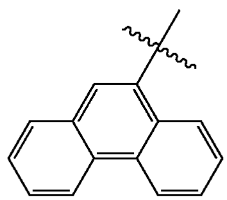 [SMILES: *c1cc2ccccc2c2ccccc12] | 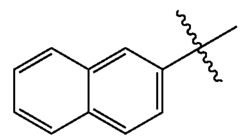 [SMILES: *c1ccc2ccccc2c1] |
| 52-4 | 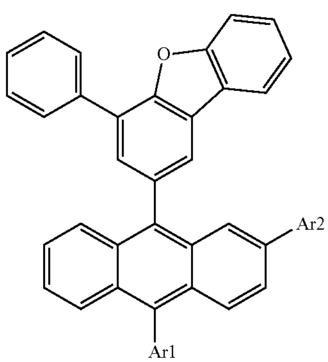 | 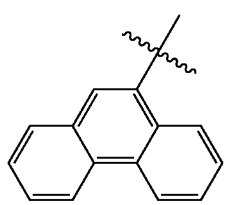 [SMILES: *c1cc2ccccc2c2ccccc12] | 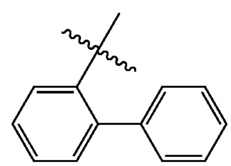 [SMILES: *c1ccccc1-c1ccccc1] |
| 52-5 | 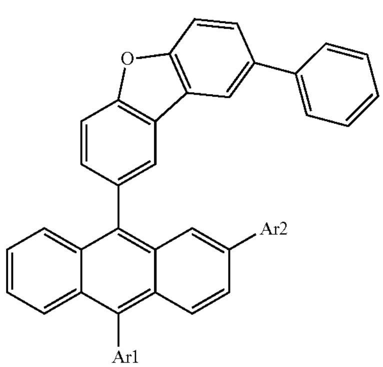 | 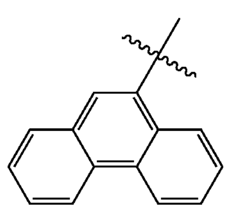 [SMILES: *c1cc2ccccc2c2ccccc12] | 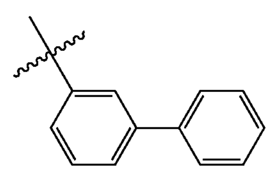 [SMILES: *c1cccc(-c2ccccc2)c1] |

-continued
| No. | | Ar1 | Ar2 |
|---|---|---|---|
| 52-6 | 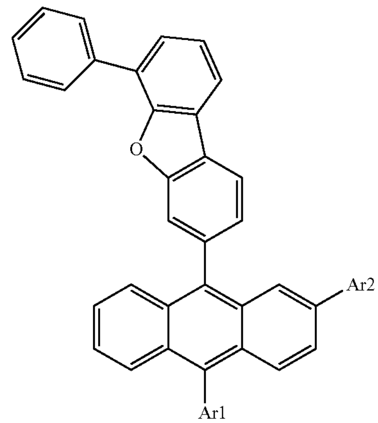 | 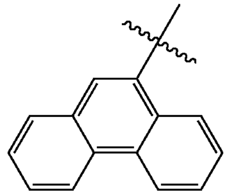 [SMILES: *c1cc2ccccc2c2ccccc12] | 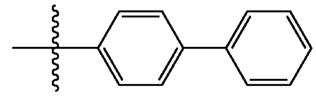 |
| 52-7 | 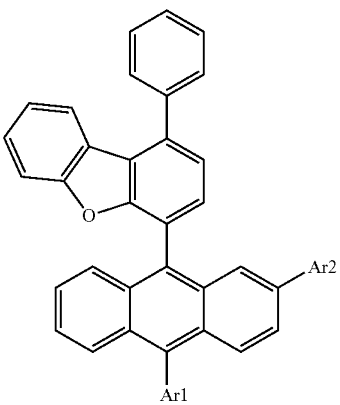 | 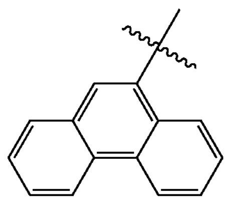 [SMILES: *c1cc2ccccc2c2ccccc12] | 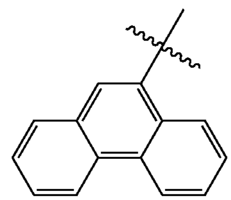 [SMILES: *c1cc2ccccc2c2ccccc12] |
| 52-9 | 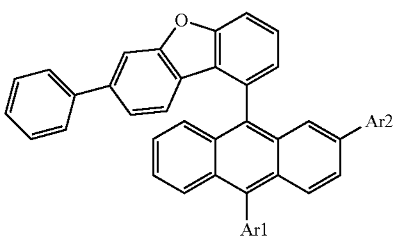 | 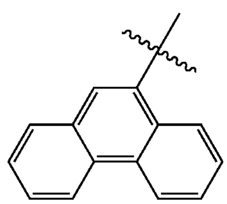 [SMILES: *c1cc2ccccc2c2ccccc12] | 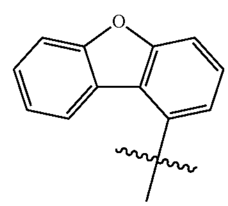 [SMILES: *c1cccc2oc3ccccc3c12] |
| 52-10 | 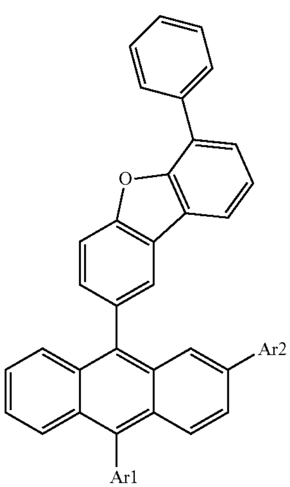 | 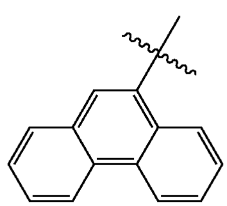 [SMILES: *c1cc2ccccc2c2ccccc12] | 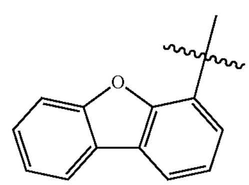 [SMILES: *c1cccc2c1oc1ccccc12] |

-continued
| No. | | Ar1 | Ar2 |
|---|---|---|---|
| 52-11 | 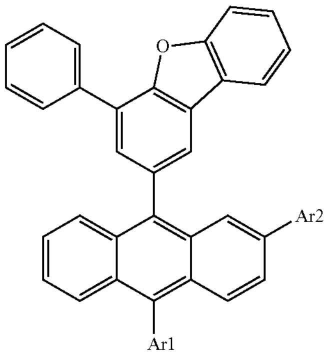 | 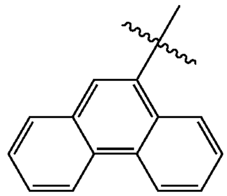 [SMILES: *c1cc2ccccc2c2ccccc12] | 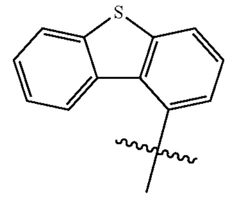 [SMILES: *c1cccc2sc3ccccc3c12] |
| 52-12 | 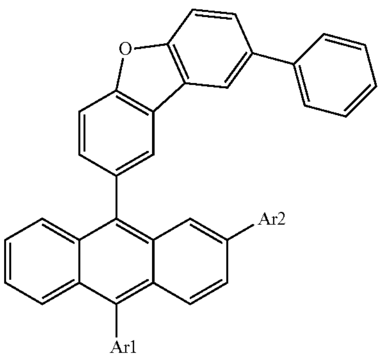 | 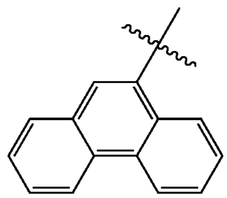 [SMILES: *c1cc2ccccc2c2ccccc12] | 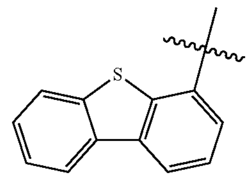 [SMILES: *c1cccc2c1sc1ccccc12] |
| 52-16 | 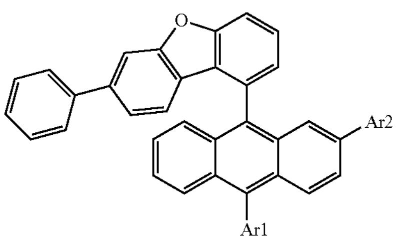 | 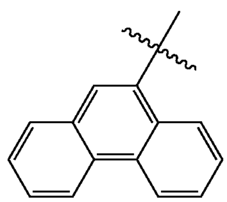 [SMILES: *c1cc2ccccc2c2ccccc12] | 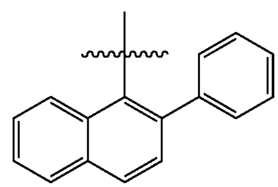 [SMILES: *c1c(-c2ccccc2)ccc2ccccc12] |
| 52-17 | 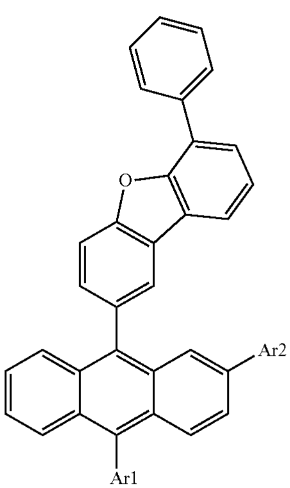 | 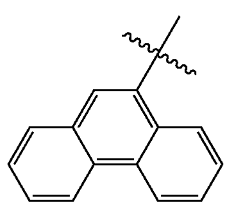 [SMILES: *c1cc2ccccc2c2ccccc12] | 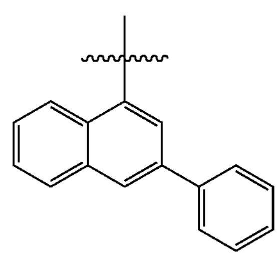 [SMILES: *c1cc(-c2ccccc2)cc2ccccc12] |

-continued
| No. | | Ar1 | Ar2 |
|---|---|---|---|
| 52-18 | 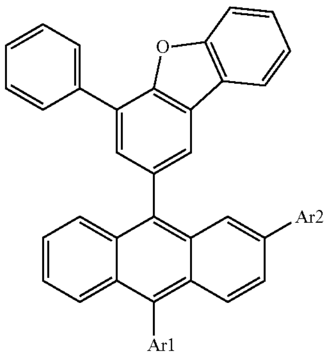 | 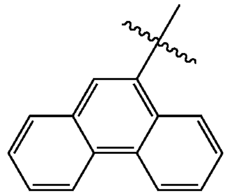 [SMILES: *c1cc2ccccc2c2ccccc12] | 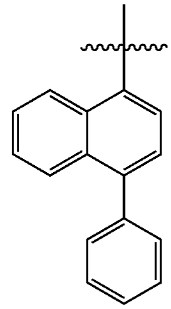 [SMILES: *c1ccc(-c2ccccc2)c2ccccc12] |
| 52-19 | 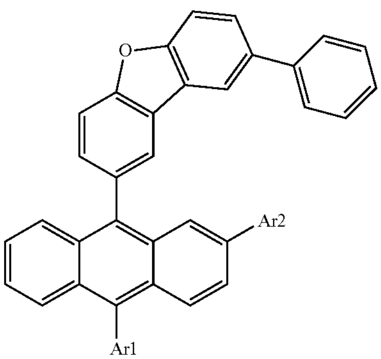 | 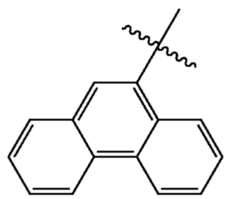 [SMILES: *c1cc2ccccc2c2ccccc12] | 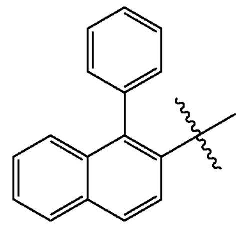 [SMILES: *c1ccc2ccccc2c1-c1ccccc1] |
| 52-20 | 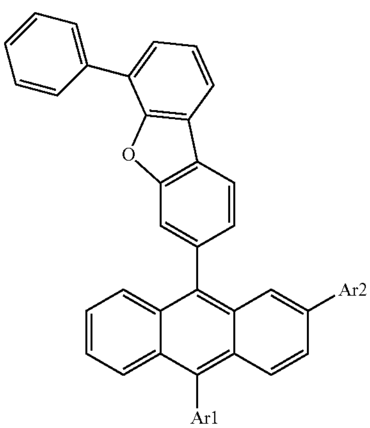 | 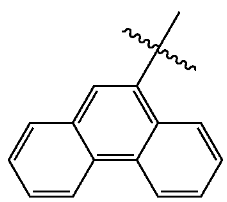 [SMILES: *c1cc2ccccc2c2ccccc12] | 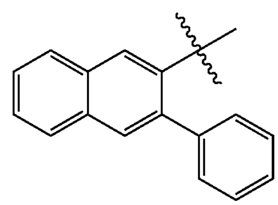 [SMILES: *c1cc2ccccc2cc1-c1ccccc1] |
| 52-21 | 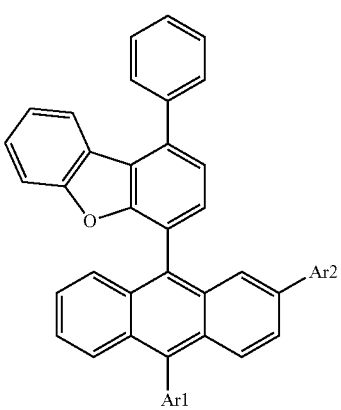 | 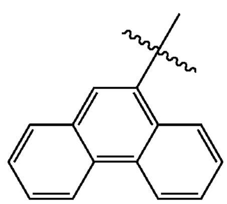 [SMILES: *c1cc2ccccc2c2ccccc12] | 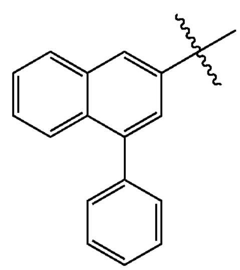 [SMILES: *c1cc(-c2ccccc2)c2ccccc2c1] |

-continued
| No. | | Ar1 | Ar2 |
|---|---|---|---|
| 52-22 | 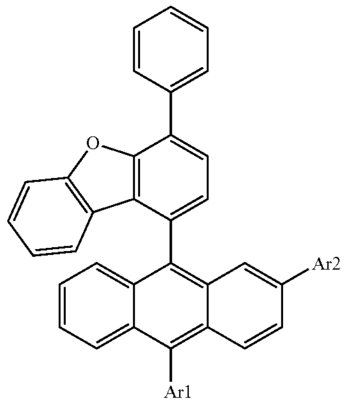 | 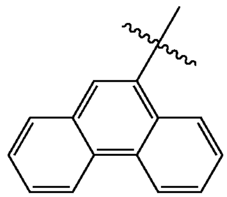 [SMILES: *c1cc2ccccc2c2ccccc12] | 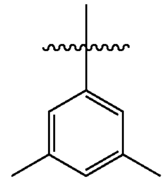 |
| 52-23 | 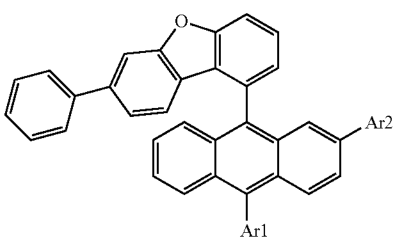 | 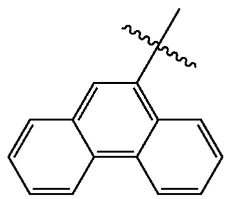 [SMILES: *c1cc2ccccc2c2ccccc12] | 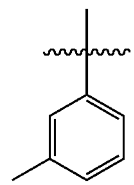 |
| 52-24 | 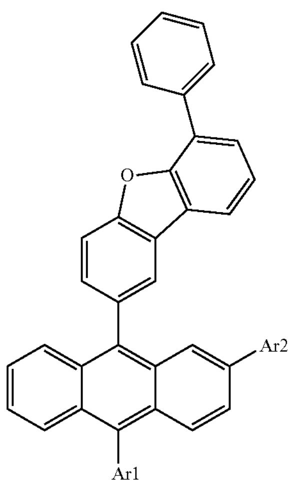 | 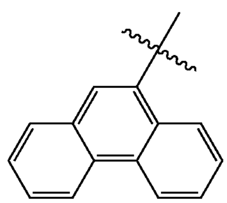 [SMILES: *c1cc2ccccc2c2ccccc12] | 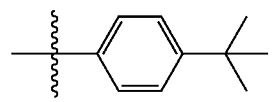 [SMILES: *c1ccc(C(C)(C)C)cc1] |
| 52-25 | 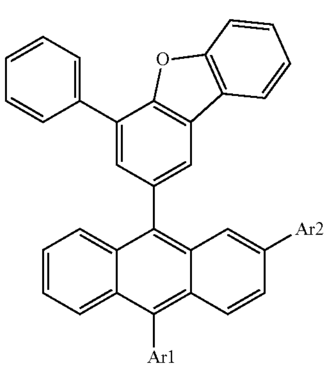 | 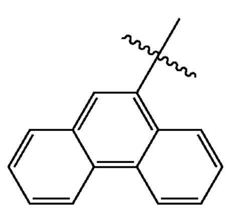 [SMILES: *c1cc2ccccc2c2ccccc12] | 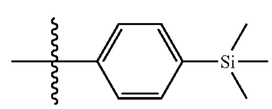 |

-continued
| No. | | Ar1 | Ar2 |
|---|---|---|---|
| 52-26 | 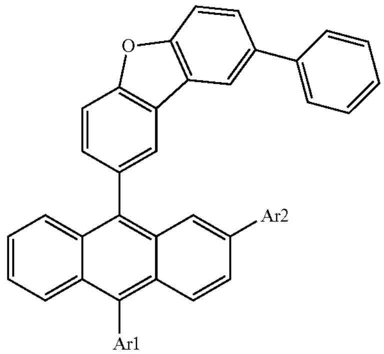 | 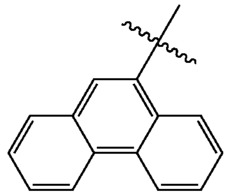 [SMILES: *c1cc2ccccc2c2ccccc12] | 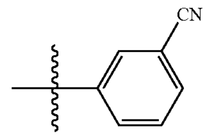 [SMILES: *c1cccc(C#N)c1] |
| 52-27 | 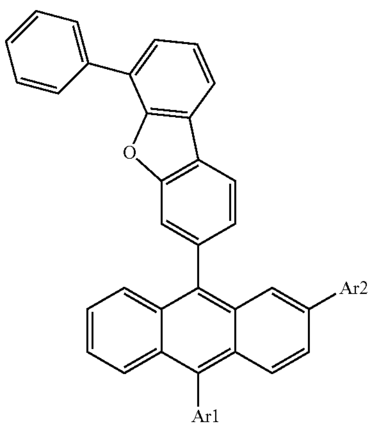 | 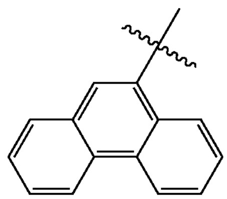 [SMILES: *c1cc2ccccc2c2ccccc12] | 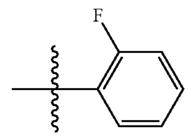 [SMILES: *c1ccccc1F] |
| 52-28 | 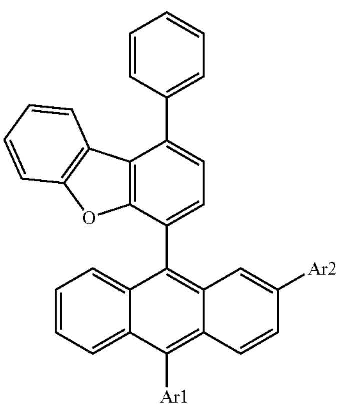 | 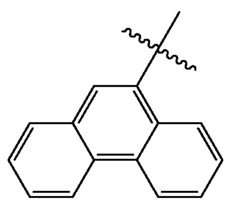 [SMILES: *c1cc2ccccc2c2ccccc12] | 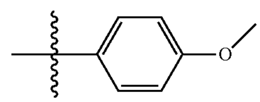 [SMILES: *c1ccc(OC)cc1] |
| 53-1 | 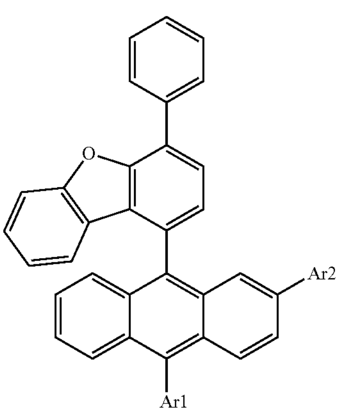 | 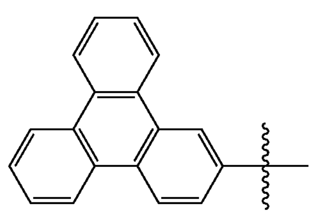 [SMILES: *c1ccc2c3ccccc3c3ccccc3c2c1] | 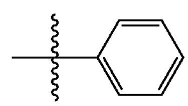 [SMILES: *c1ccccc1] |

-continued
| No. | | Ar1 | Ar2 |
|---|---|---|---|
| 53-2 | 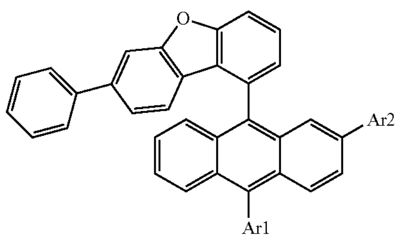 | 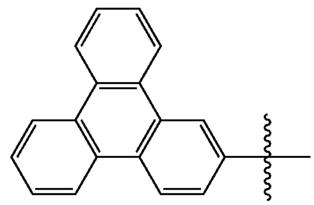 [SMILES: *c1ccc2c3ccccc3c3ccccc3c2c1] | 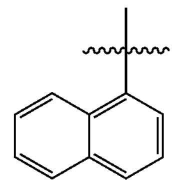 [SMILES: *c1cccc2ccccc12] |
| 53-3 | 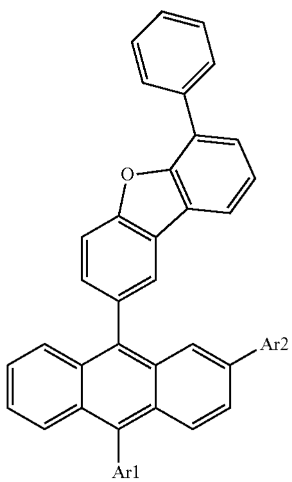 | 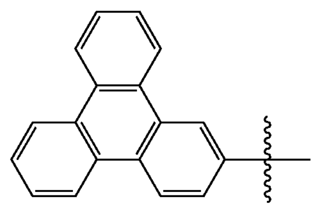 [SMILES: *c1ccc2c3ccccc3c3ccccc3c2c1] | 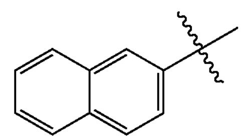 [SMILES: *c1ccc2ccccc2c1] |
| 53-4 | 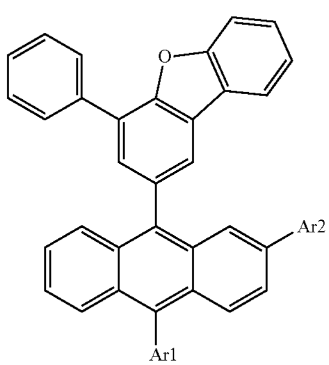 | 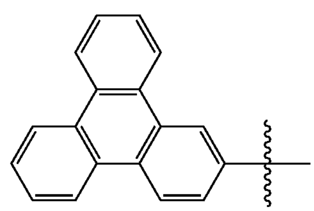 [SMILES: *c1ccc2c3ccccc3c3ccccc3c2c1] | 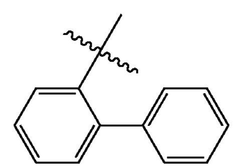 [SMILES: *c1ccccc1-c1ccccc1] |
| 53-5 | 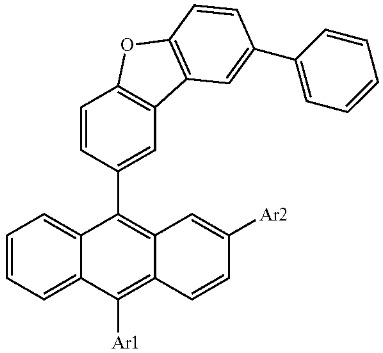 | 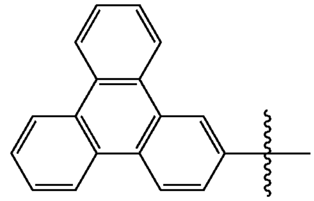 [SMILES: *c1ccc2c3ccccc3c3ccccc3c2c1] | 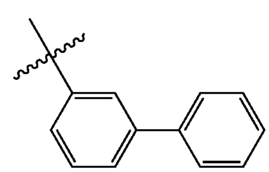 [SMILES: *c1cccc(-c2ccccc2)c1] |

-continued
| No. | | Ar1 | Ar2 |
|---|---|---|---|
| 53-6 | 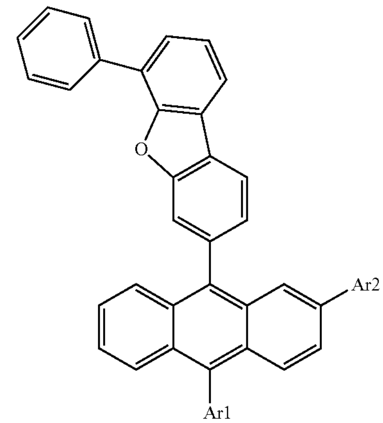 | 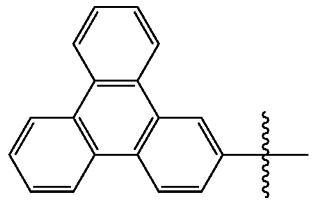 [SMILES: *c1ccc2c3ccccc3c3ccccc3c2c1] | 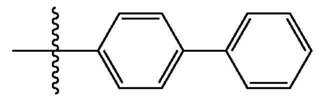 |
| 53-7 | 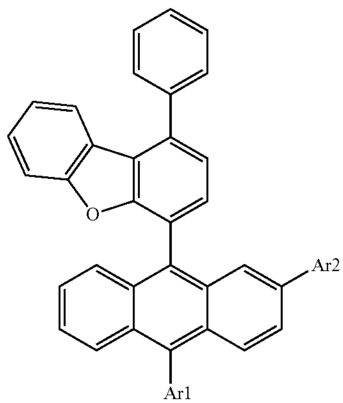 | 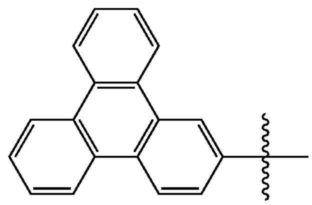 [SMILES: *c1ccc2c3ccccc3c3ccccc3c2c1] | 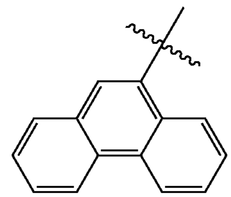 [SMILES: *c1cc2ccccc2c2ccccc12] |
| 53-9 | 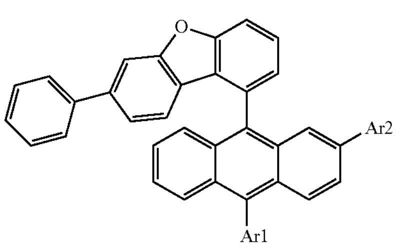 | 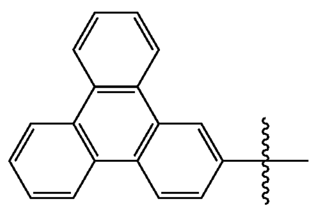 | 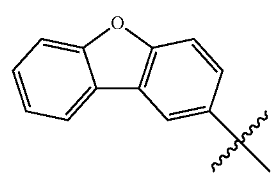 |
| 53-10 | 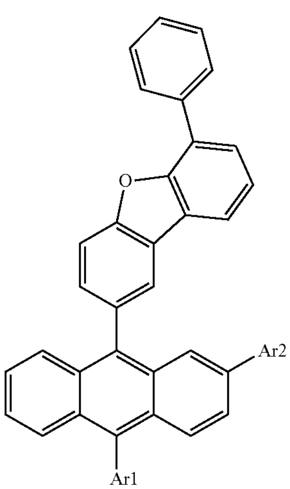 | 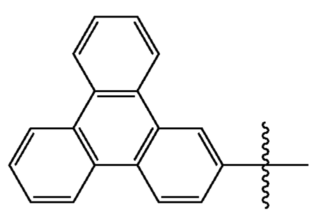 [SMILES: *c1ccc2c3ccccc3c3ccccc3c2c1] | 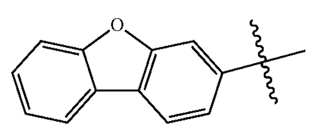 |

-continued
| No. | | Ar1 | Ar2 |
| --- | --- | --- | --- |
| 53-11 | 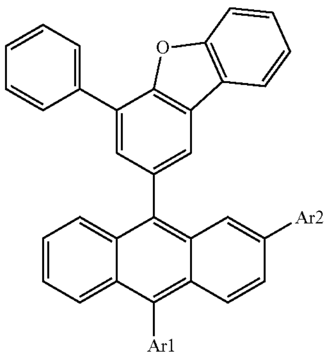  | 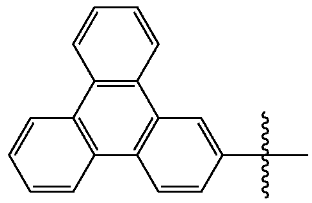 [SMILES: *c1ccc2c3ccccc3c3ccccc3c2c1] | 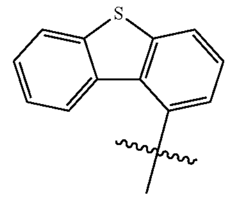 |
| 53-12 | 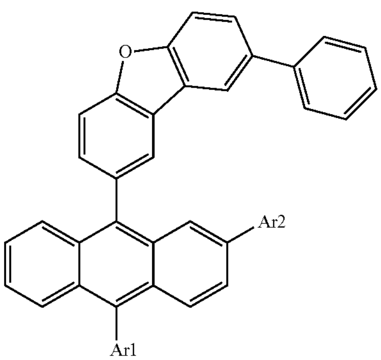  | 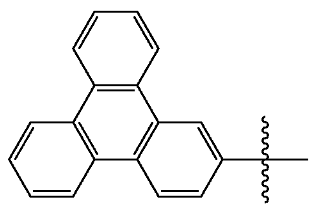 | 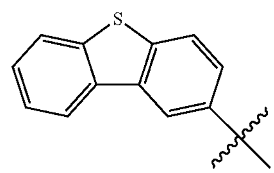 |
| 53-13 | 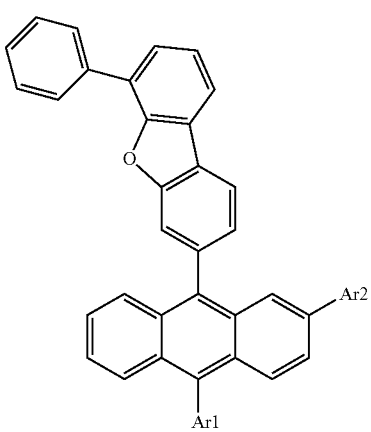  | 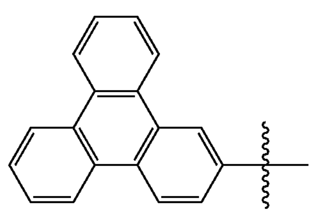 [SMILES: *c1ccc2c3ccccc3c3ccccc3c2c1] | 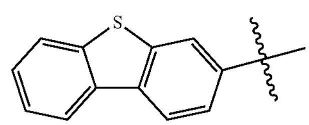 |

-continued
| No. | | Ar1 | Ar2 |
|---|---|---|---|
| 53-17 | 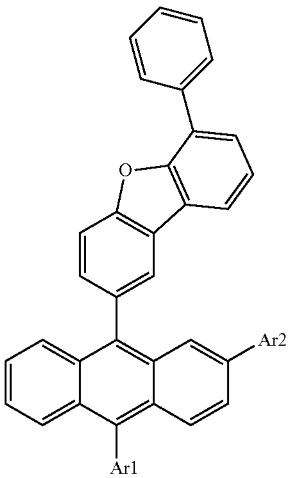 | 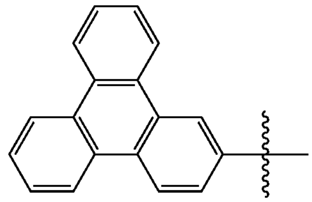 [SMILES: *c1ccc2c3ccccc3c3ccccc3c2c1] | 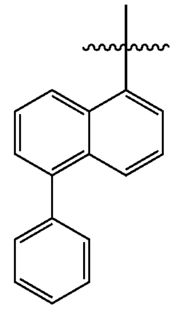 [SMILES: *c1cccc2c(-c3ccccc3)cccc12] |
| 53-18 | 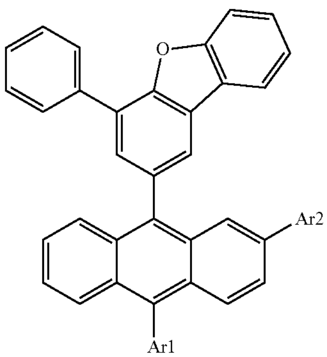 | 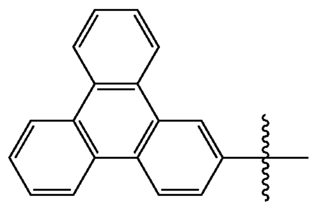 [SMILES: *c1ccc2c3ccccc3c3ccccc3c2c1] | 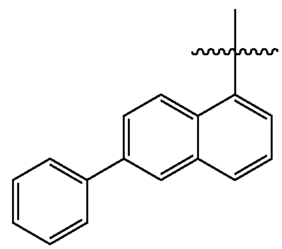 [SMILES: *c1cccc2cc(-c3ccccc3)ccc12] |
| 53-19 | 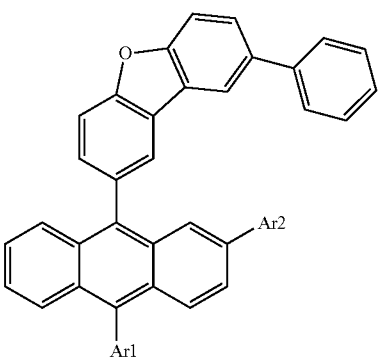 | 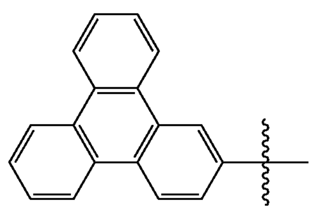 [SMILES: *c1ccc2c3ccccc3c3ccccc3c2c1] | 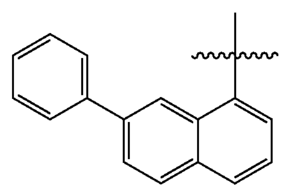 [SMILES: *c1cccc2ccc(-c3ccccc3)cc12] |
| 53-20 | 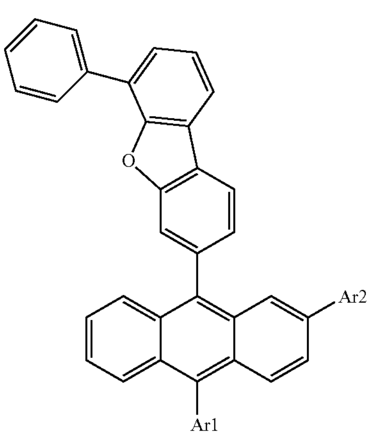 | 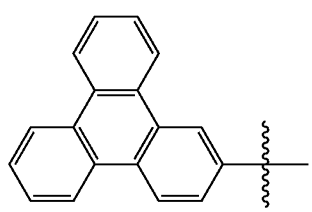 [SMILES: *c1ccc2c3ccccc3c3ccccc3c2c1] | 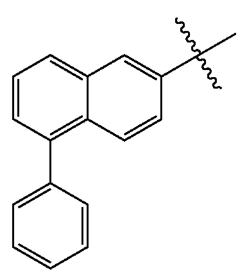 [SMILES: *c1ccc2c(-c3ccccc3)cccc2c1] |

-continued
| No. | | Ar1 | Ar2 |
|---|---|---|---|
| 53-21 | 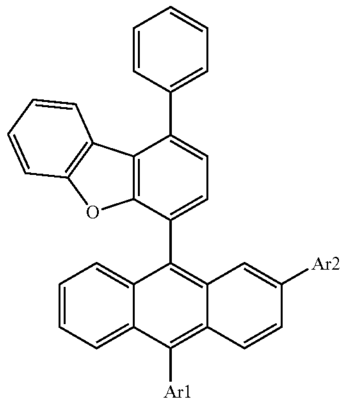 | 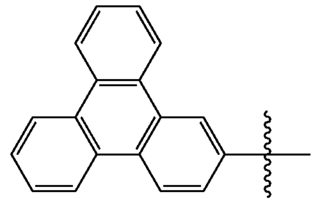 [SMILES: *c1ccc2c3ccccc3c3ccccc3c2c1] | 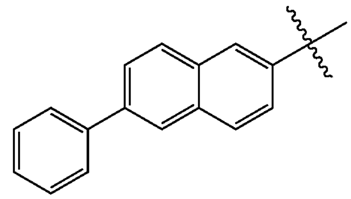 [SMILES: *c1ccc2cc(-c3ccccc3)ccc2c1] |
| 53-22 | 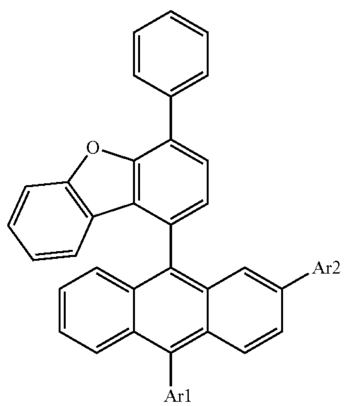 | 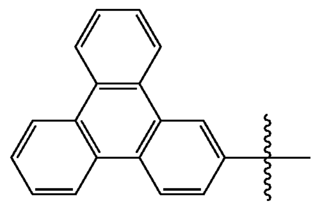 [SMILES: *c1ccc2c3ccccc3c3ccccc3c2c1] | 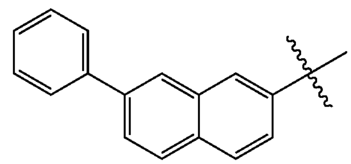 [SMILES: *c1ccc2ccc(-c3ccccc3)cc2c1] |
| 53-23 | 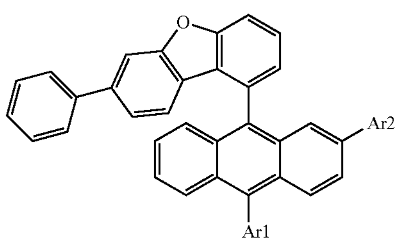 | 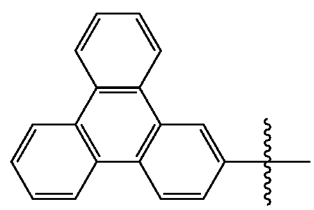 [SMILES: *c1ccc2c3ccccc3c3ccccc3c2c1] | 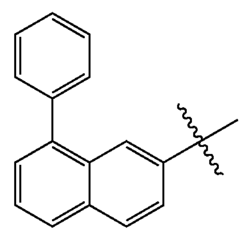 [SMILES: *c1ccc2cccc(-c3ccccc3)c2c1] |
| 53-24 | 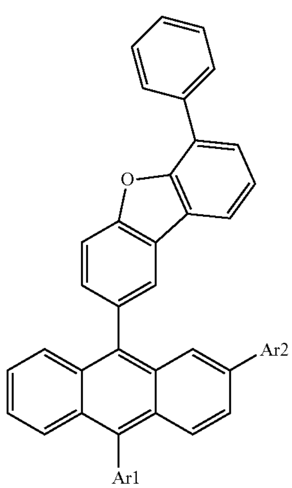 | 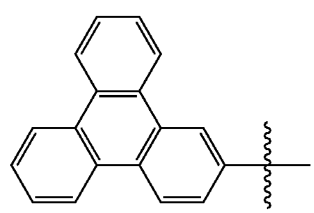 | 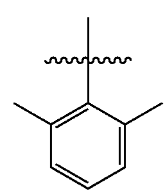 |

-continued
| No. | | Ar1 | Ar2 |
|---|---|---|---|
| 53-25 | 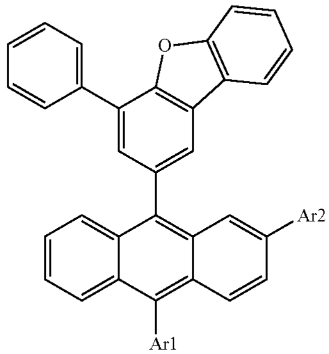 | 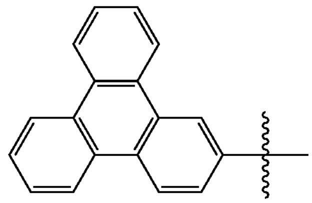 [SMILES: *c1ccc2c3ccccc3c3ccccc3c2c1] | 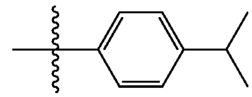 |
| 53-26 | 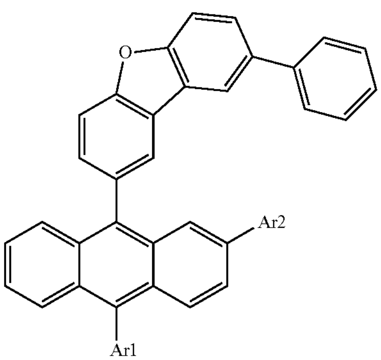 | 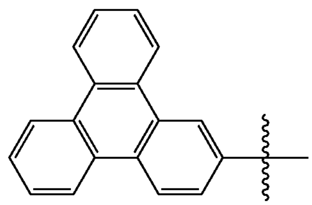 [SMILES: *c1ccc2c3ccccc3c3ccccc3c2c1] | 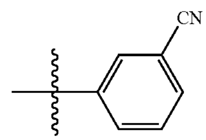 [SMILES: *c1cccc(C#N)c1] |
| 53-27 | 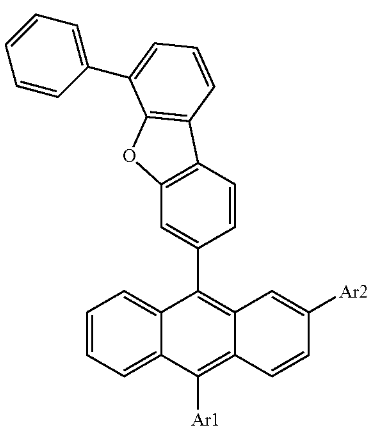 | 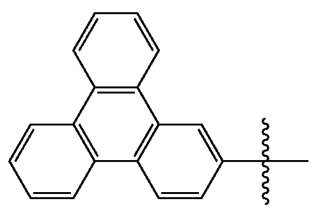 [SMILES: *c1ccc2c3ccccc3c3ccccc3c2c1] | 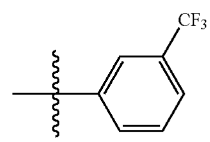 [SMILES: *c1cccc(C(F)(F)F)c1] |
| 53-28 | 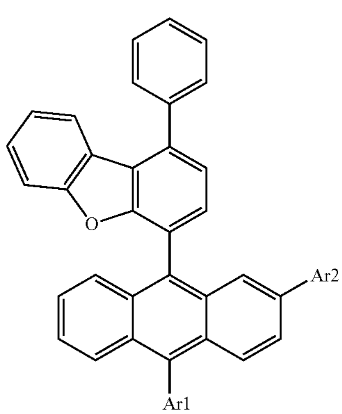 | 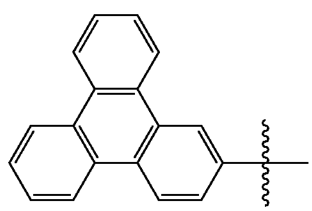 [SMILES: *c1ccc2c3ccccc3c3ccccc3c2c1] | 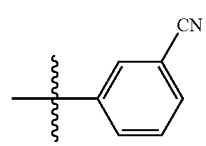 [SMILES: *c1cccc(C#N)c1] |

-continued
| No. | | Ar1 | Ar2 |
|---|---|---|---|
| 53-29 | 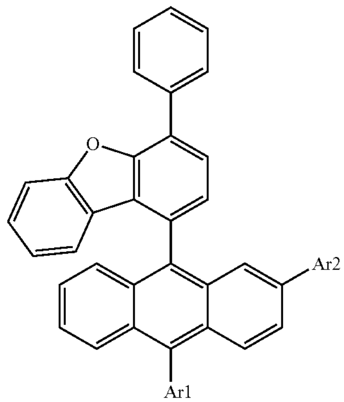 | 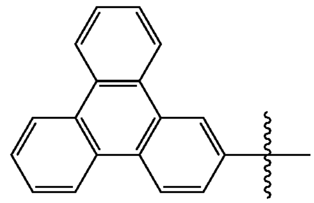 [SMILES: *c1ccc2c3ccccc3c3ccccc3c2c1] | 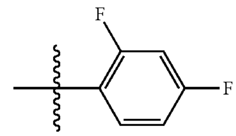 [SMILES: *c1ccc(F)cc1F] |
| 54-1 | 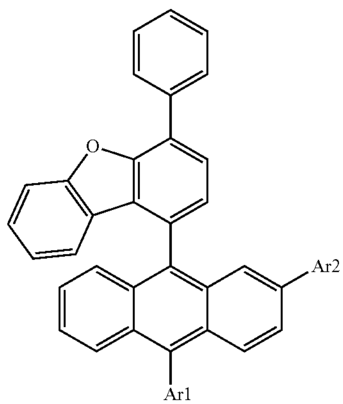 | 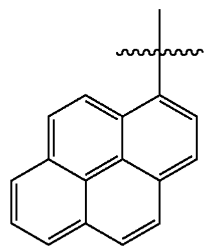 [SMILES: *c1ccc2ccc3cccc4ccc1c2c34] | 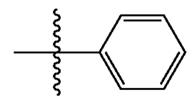 |
| 54-2 | 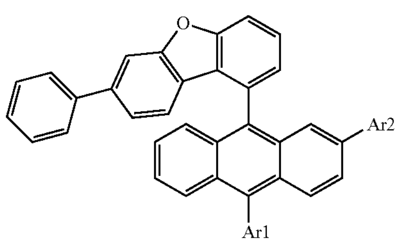 | 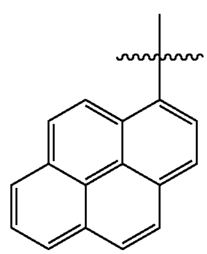 [SMILES: *c1ccc2ccc3cccc4ccc1c2c34] | 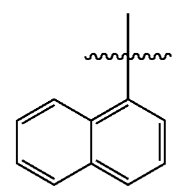 [SMILES: *c1cccc2ccccc12] |
| 54-3 | 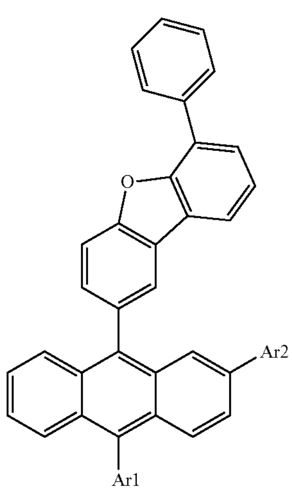 | 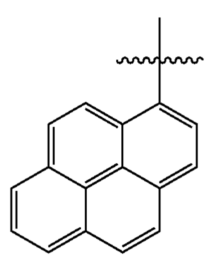 [SMILES: *c1ccc2ccc3cccc4ccc1c2c34] | 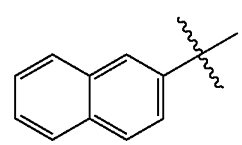 [SMILES: *c1ccc2ccccc2c1] |

-continued
| No. | | Ar1 | Ar2 |
|---|---|---|---|
| 54-4 | 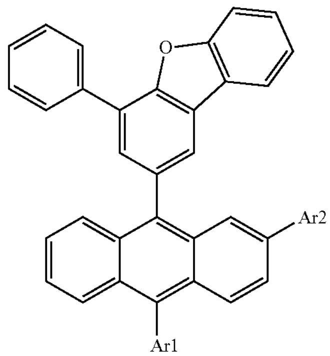 | 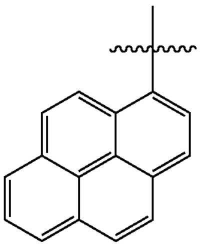 [SMILES: *c1ccc2ccc3cccc4ccc1c2c34] | 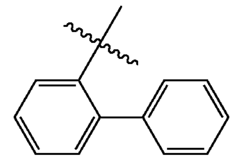 [SMILES: *c1ccccc1-c1ccccc1] |
| 54-5 | 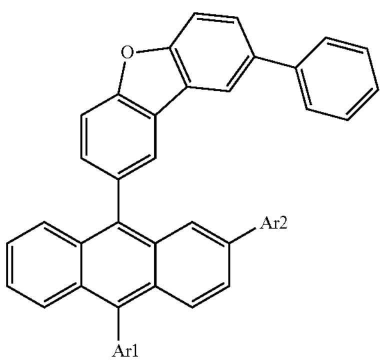 | 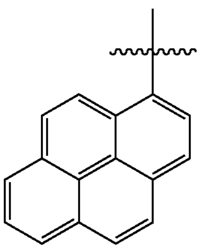 [SMILES: *c1ccc2ccc3cccc4ccc1c2c34] | 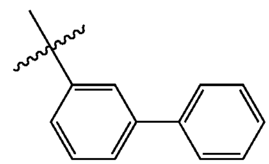 [SMILES: *c1cccc(-c2ccccc2)c1] |
| 54-6 | 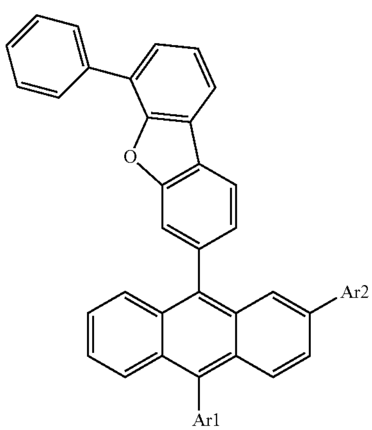 | 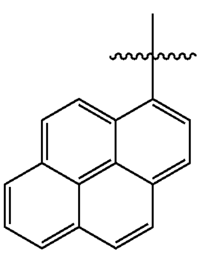 [SMILES: *c1ccc2ccc3cccc4ccc1c2c34] | 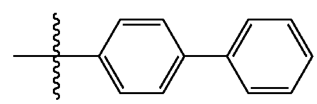 |
| 54-7 | 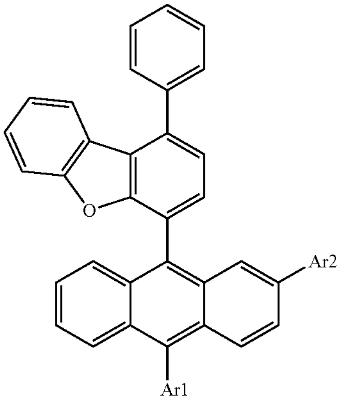 | 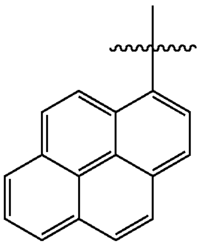 [SMILES: *c1ccc2ccc3cccc4ccc1c2c34] | 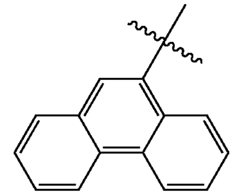 [SMILES: *c1cc2ccccc2c2ccccc12] |

-continued
| No. | | Ar1 | Ar2 |
|---|---|---|---|
| 54-9 | 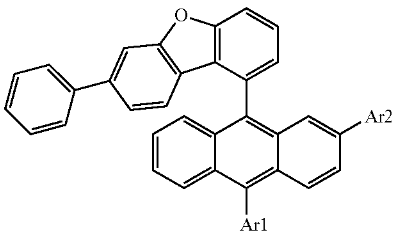 | 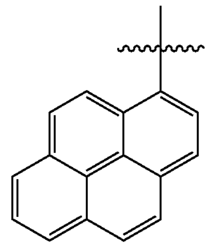 [SMILES: *c1ccc2ccc3cccc4ccc1c2c34] | 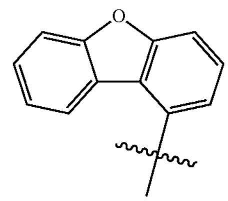 [SMILES: *c1cccc2oc3ccccc3c12] |
| 54-10 | 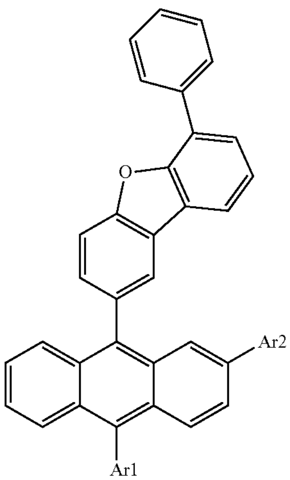 | 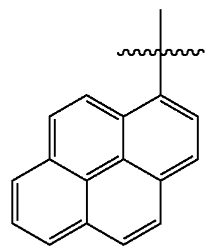 [SMILES: *c1ccc2ccc3cccc4ccc1c2c34] | 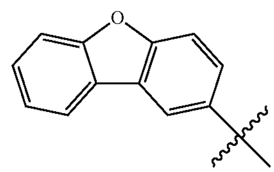 [SMILES: *c1ccc2oc3ccccc3c2c1] |
| 54-11 | 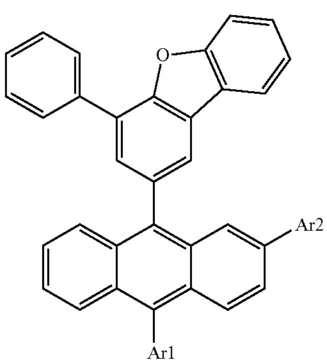 | 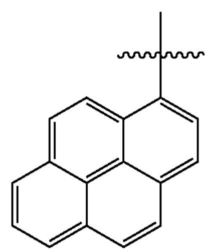 [SMILES: *c1ccc2ccc3cccc4ccc1c2c34] | 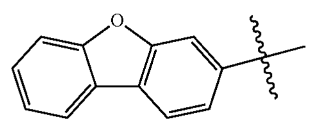 [SMILES: *c1ccc2c(c1)oc1ccccc12] |
| 54-12 | 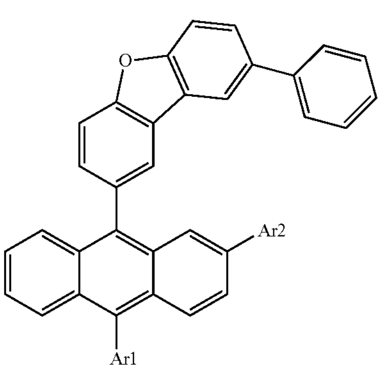 | 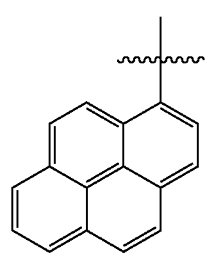 [SMILES: *c1ccc2ccc3cccc4ccc1c2c34] | 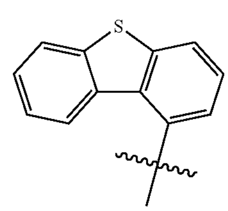 [SMILES: *c1cccc2sc3ccccc3c12] |

-continued
| No. | | Ar1 | Ar2 |
|---|---|---|---|
| 54-13 | 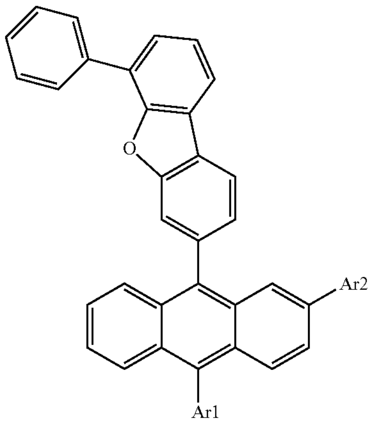 | 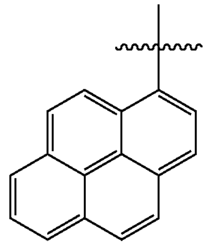 [SMILES: *c1ccc2ccc3cccc4ccc1c2c34] | 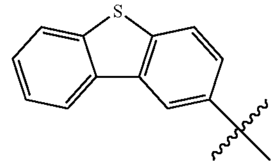 |
| 54-14 | 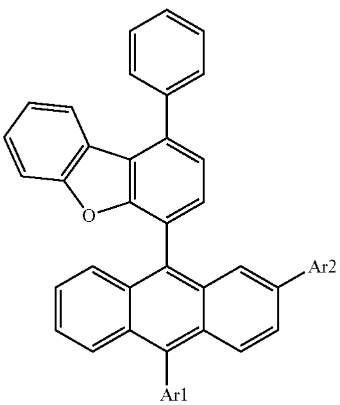 | 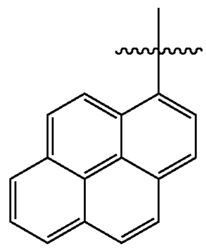 [SMILES: *c1ccc2ccc3cccc4ccc1c2c34] | 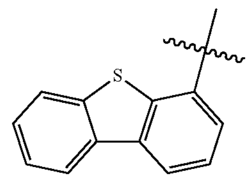 |
| 54-19 | 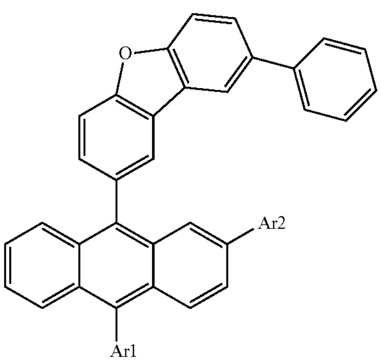 | 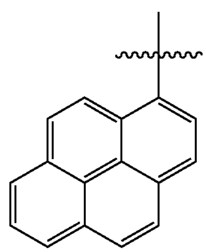 [SMILES: *c1ccc2ccc3cccc4ccc1c2c34] | 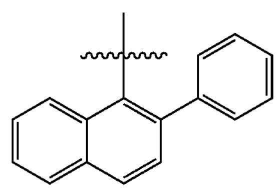 [SMILES: *c1c(-c2ccccc2)ccc2ccccc12] |
| 54-20 | 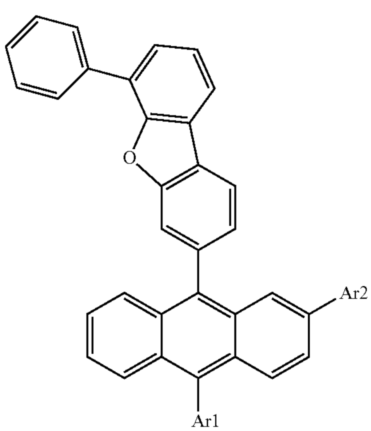 | 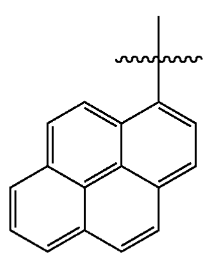 [SMILES: *c1ccc2ccc3cccc4ccc1c2c34] | 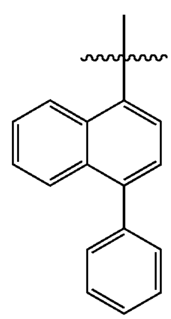 [SMILES: *c1ccc(-c2ccccc2)c2ccccc12] |

-continued
| No. | | Ar1 | Ar2 |
|---|---|---|---|
| 54-21 | 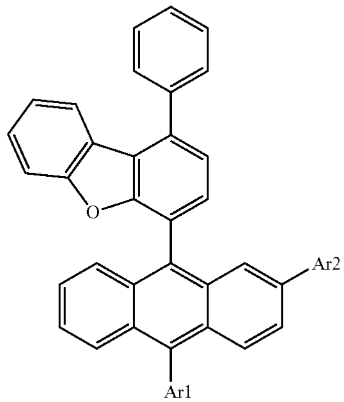 | 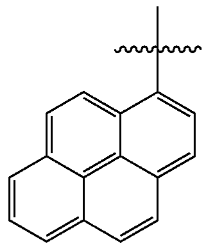 [SMILES: *c1ccc2ccc3cccc4ccc1c2c34] | 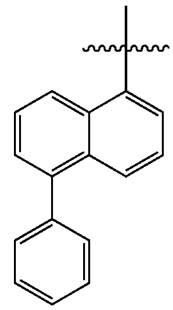 [SMILES: *c1cccc2c(-c3ccccc3)cccc12] |
| 54-22 | 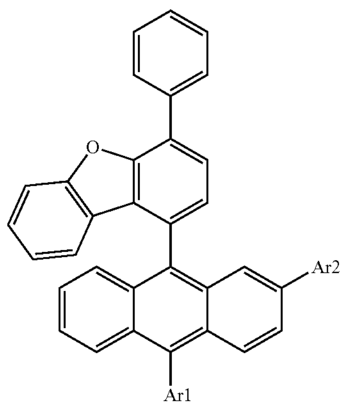 | 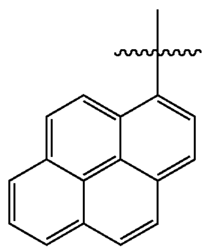 [SMILES: *c1ccc2ccc3cccc4ccc1c2c34] | 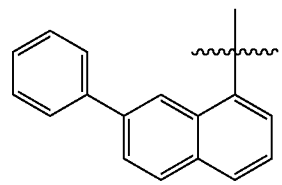 [SMILES: *c1cccc2ccc(-c3ccccc3)cc12] |
| 54-23 | 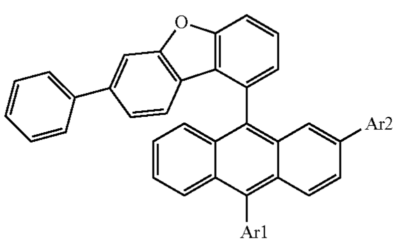 | 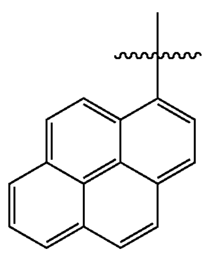 [SMILES: *c1ccc2ccc3cccc4ccc1c2c34] | 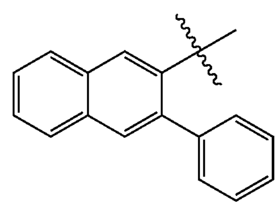 [SMILES: *c1cc2ccccc2cc1-c1ccccc1] |
| 54-24 | 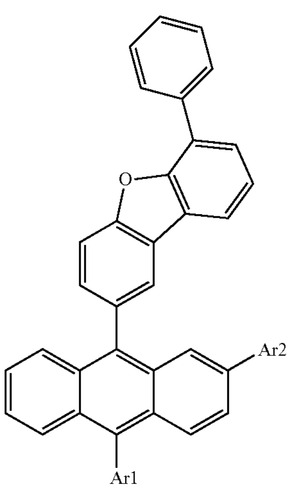 | 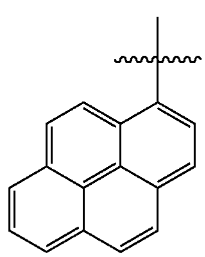 [SMILES: *c1ccc2ccc3cccc4ccc1c2c34] | 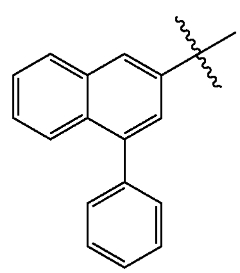 [SMILES: *c1cc(-c2ccccc2)c2ccccc2c1] |

-continued
| No. | | Ar1 | Ar2 |
|---|---|---|---|
| 54-25 | 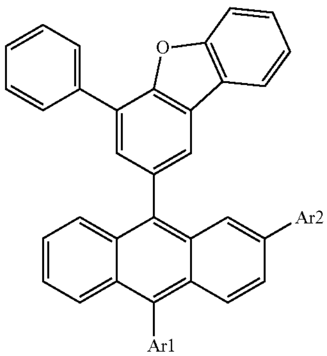 | 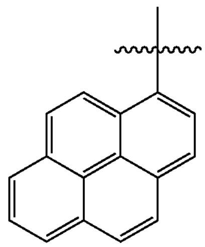 [SMILES: *c1ccc2ccc3cccc4ccc1c2c34] | 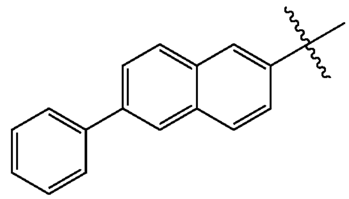 [SMILES: *c1ccc2cc(-c3ccccc3)ccc2c1] |
| 54-26 | 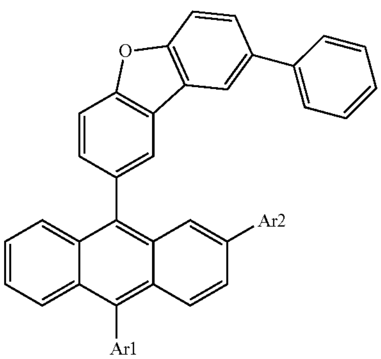 | 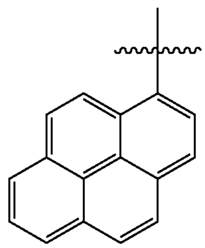 [SMILES: *c1ccc2ccc3cccc4ccc1c2c34] | 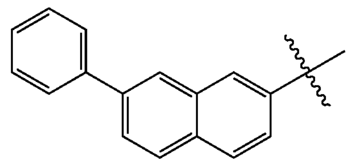 [SMILES: *c1ccc2ccc(-c3ccccc3)cc2c1] |
| 54-27 | 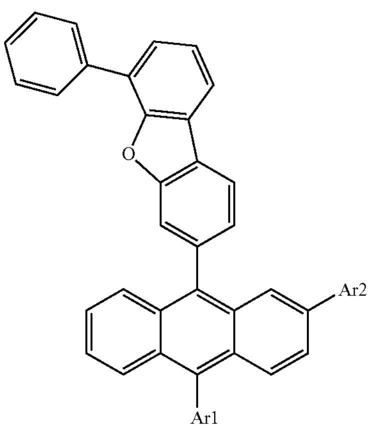 | 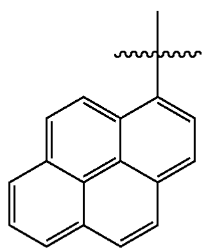 [SMILES: *c1ccc2ccc3cccc4ccc1c2c34] | 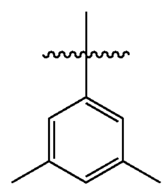 |
| 54-28 | 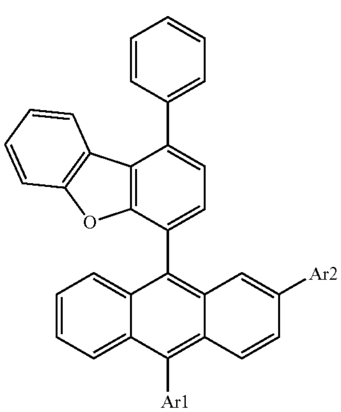 | 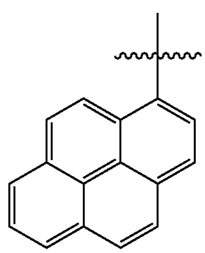 [SMILES: *c1ccc2ccc3cccc4ccc1c2c34] | 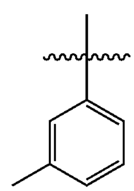 |

-continued
| No. | | Ar1 | Ar2 |
|---|---|---|---|
| 54-29 | 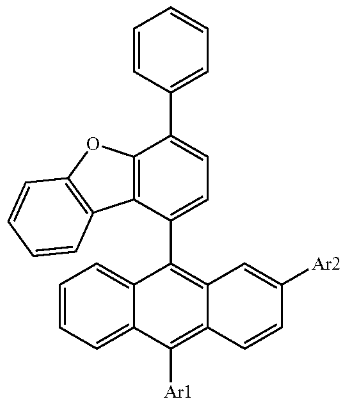 | 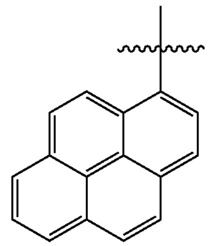 [SMILES: *c1ccc2ccc3cccc4ccc1c2c34] | 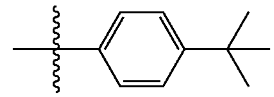 |
| 54-30 | 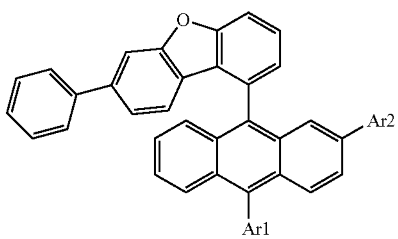 | 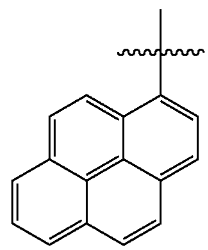 [SMILES: *c1ccc2ccc3cccc4ccc1c2c34] | 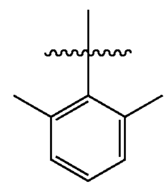 |
| 54-31 | 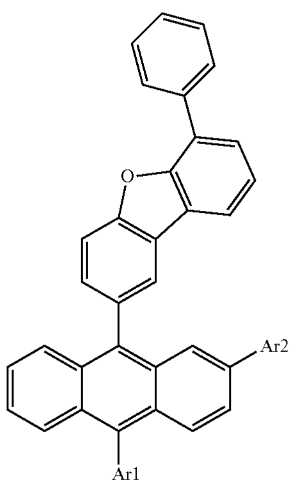 | 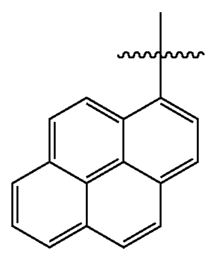 [SMILES: *c1ccc2ccc3cccc4ccc1c2c34] | 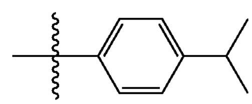 [SMILES: *c1ccc(C(C)C)cc1] |
| 55-1 | 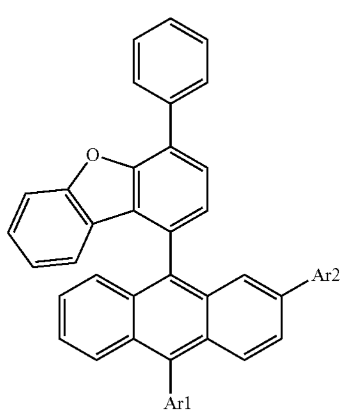 | 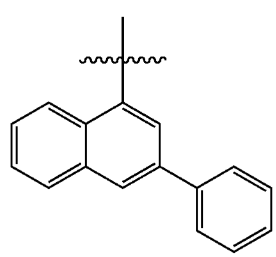 [SMILES: *c1cc(-c2ccccc2)cc2ccccc12] | 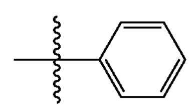 |

-continued
| No. | | Ar1 | Ar2 |
|---|---|---|---|
| 55-2 | 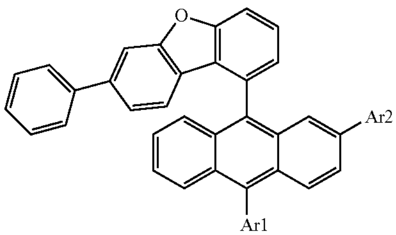 | 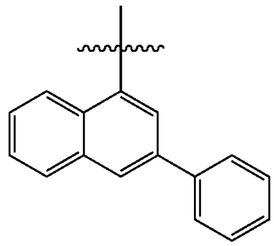 [SMILES: *c1cc(-c2ccccc2)cc2ccccc12] | 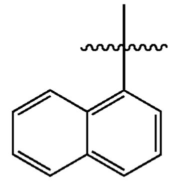 [SMILES: *c1cccc2ccccc12] |
| 55-3 | 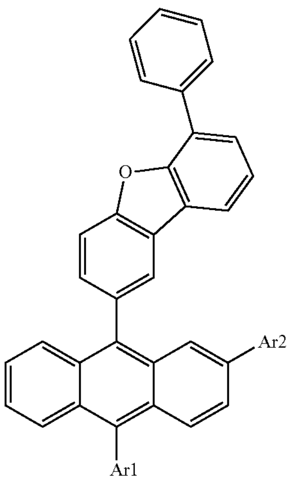 | 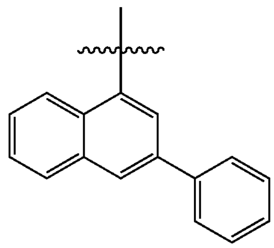 [SMILES: *c1cc(-c2ccccc2)cc2ccccc12] | 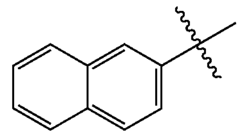 [SMILES: *c1ccc2ccccc2c1] |
| 55-4 | 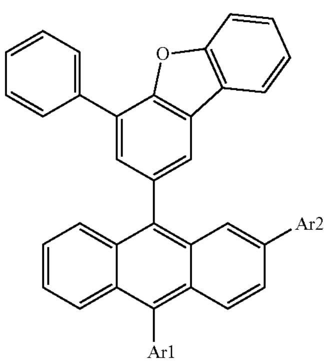 | 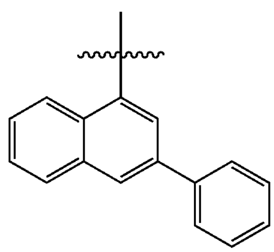 [SMILES: *c1cc(-c2ccccc2)cc2ccccc12] | 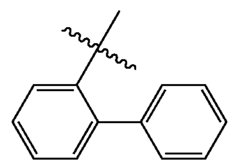 [SMILES: *c1ccccc1-c1ccccc1] |
| 55-5 | 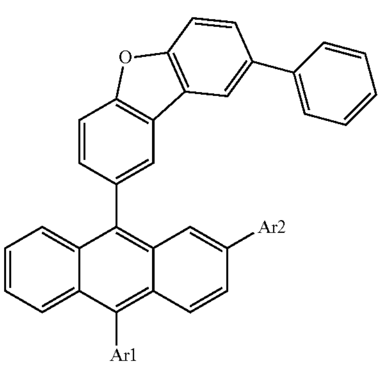 | 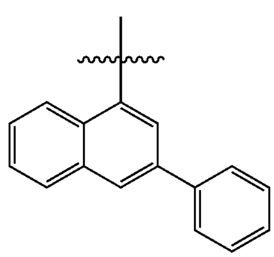 [SMILES: *c1cc(-c2ccccc2)cc2ccccc12] | 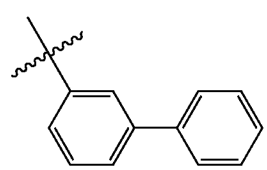 [SMILES: *c1cccc(-c2ccccc2)c1] |

-continued
| No. | | Ar1 | Ar2 |
|---|---|---|---|
| 55-6 | 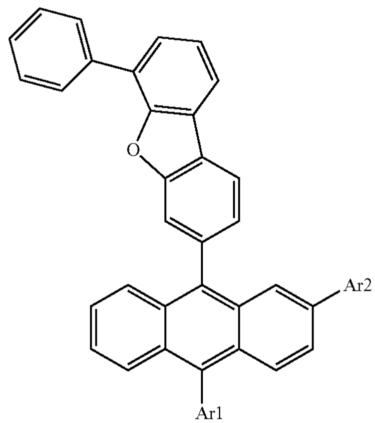 | 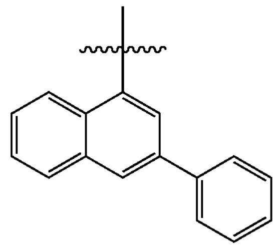 [SMILES: *c1cc(-c2ccccc2)cc2ccccc12] | 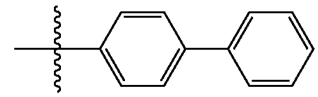 [SMILES: *c1ccc(-c2ccccc2)cc1] |
| 55-7 | 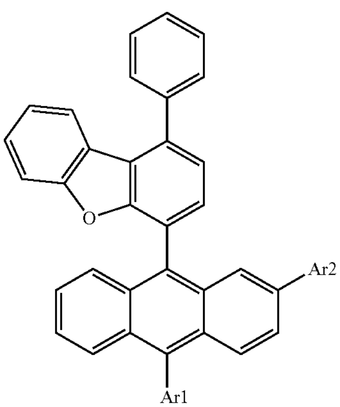 | 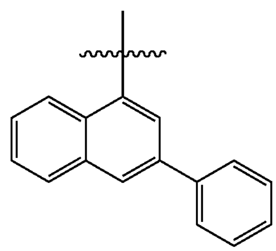 [SMILES: *c1cc(-c2ccccc2)cc2ccccc12] | 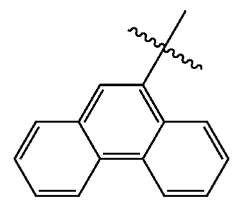 [SMILES: *c1cc2ccccc2c2ccccc12] |
| 55-9 | 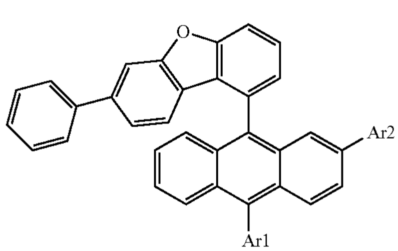 | 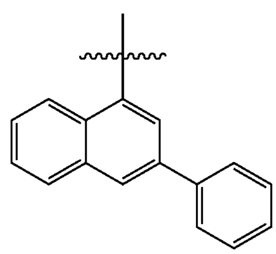 [SMILES: *c1cc(-c2ccccc2)cc2ccccc12] | 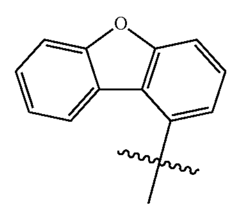 [SMILES: *c1cccc2oc3ccccc3c12] |
| 55-10 | 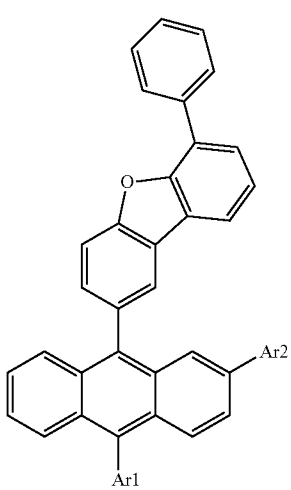 | 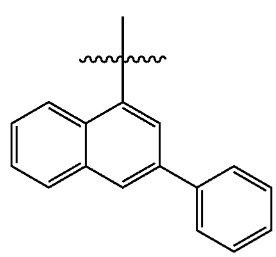 [SMILES: *c1cc(-c2ccccc2)cc2ccccc12] | 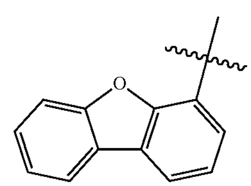 [SMILES: *c1cccc2c1oc1ccccc12] |

-continued
| No. | | Ar1 | Ar2 |
|---|---|---|---|
| 55-11 | 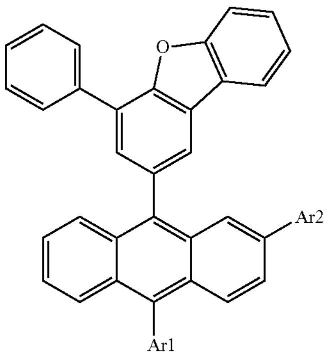 | 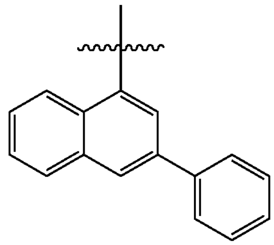 [SMILES: *c1cc(-c2ccccc2)cc2ccccc12] | 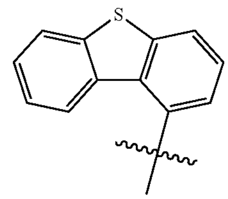 [SMILES: *c1cccc2sc3ccccc3c12] |
| 55-12 | 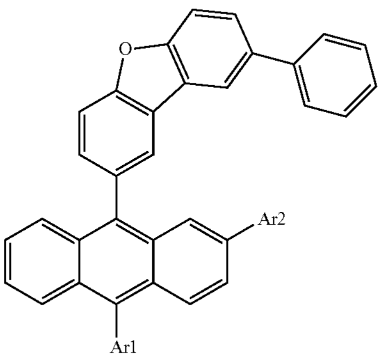 | 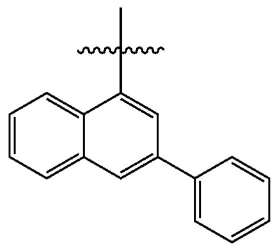 [SMILES: *c1cc(-c2ccccc2)cc2ccccc12] | 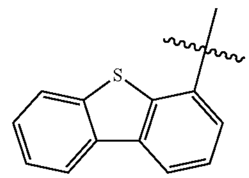 |
| 55-16 | 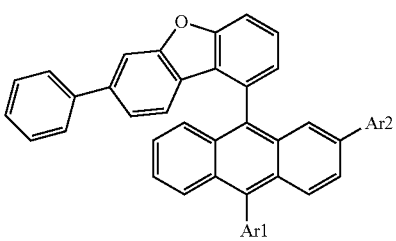 | 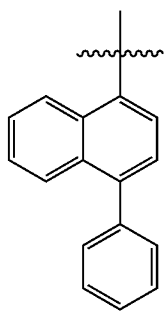 [SMILES: *c1ccc(-c2ccccc2)c2ccccc12] | 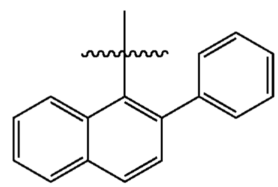 [SMILES: *c1c(-c2ccccc2)ccc2ccccc12] |
| 55-17 | 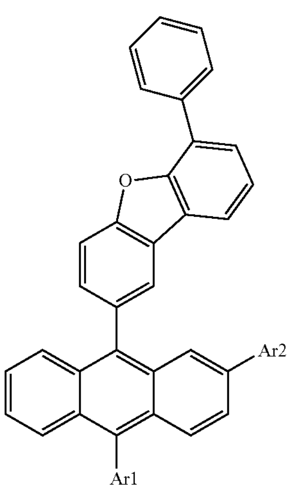 | 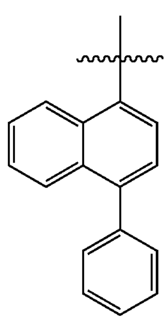 [SMILES: *c1ccc(-c2ccccc2)c2ccccc12] | 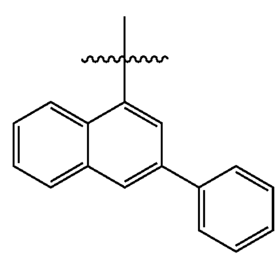 [SMILES: *c1cc(-c2ccccc2)cc2ccccc12] |

-continued
| No. | | Ar1 | Ar2 |
|---|---|---|---|
| 55-18 | 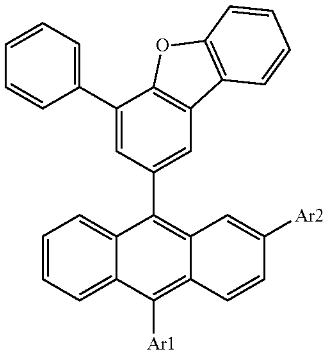 | 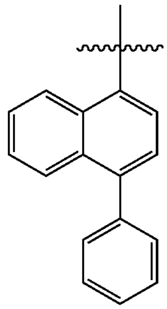 [SMILES: *c1ccc(-c2ccccc2)c2ccccc12] | 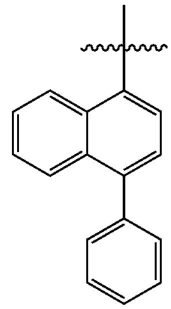 [SMILES: *c1ccc(-c2ccccc2)c2ccccc12] |
| 55-19 | 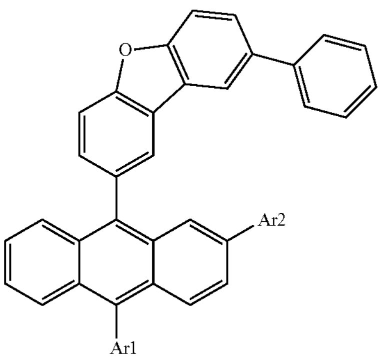 | 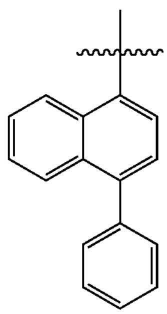 [SMILES: *c1ccc(-c2ccccc2)c2ccccc12] | 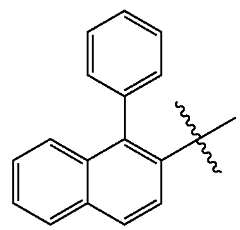 [SMILES: *c1ccc2ccccc2c1-c1ccccc1] |
| 55-20 | 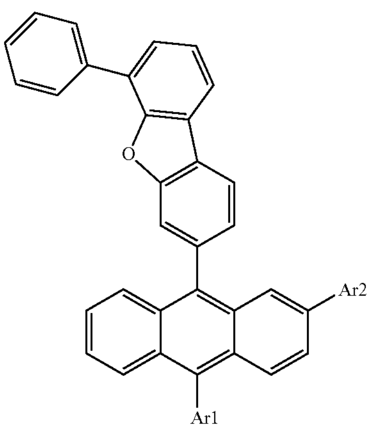 | 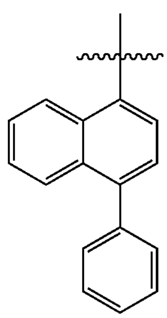 [SMILES: *c1ccc(-c2ccccc2)c2ccccc12] | 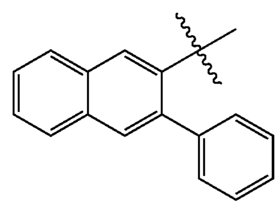 [SMILES: *c1cc2ccccc2cc1-c1ccccc1] |
| 55-21 | 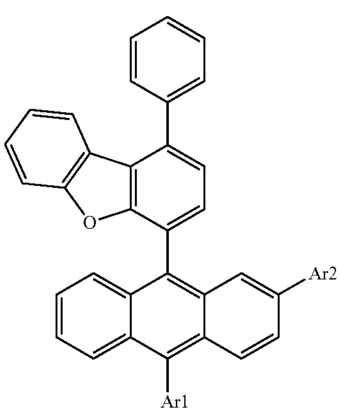 | 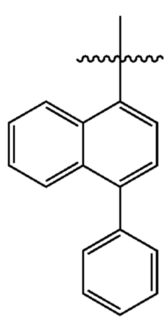 [SMILES: *c1ccc(-c2ccccc2)c2ccccc12] | 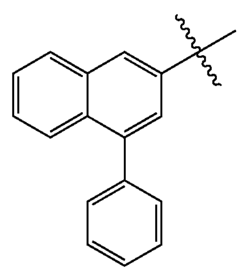 [SMILES: *c1cc(-c2ccccc2)c2ccccc2c1] |

-continued
| No. | | Ar1 | Ar2 |
|---|---|---|---|
| 55-22 | 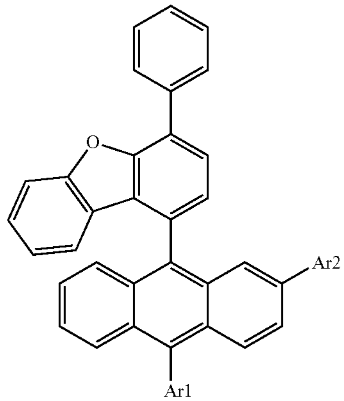 | 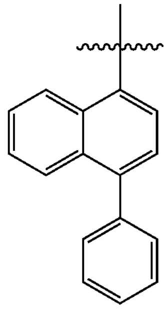 [SMILES: *c1ccc(-c2ccccc2)c2ccccc12] | 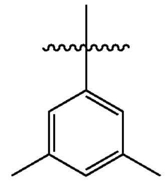 |
| 55-23 | 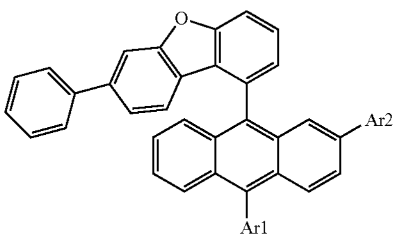 | 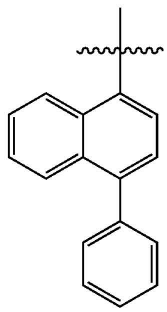 [SMILES: *c1ccc(-c2ccccc2)c2ccccc12] | 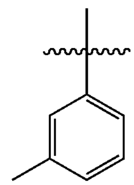 |
| 55-24 | 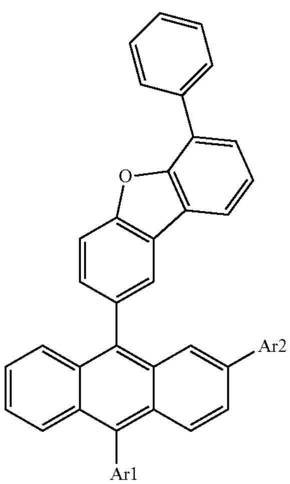 | 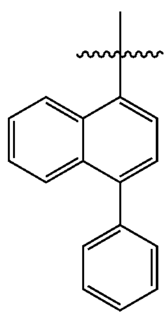 [SMILES: *c1ccc(-c2ccccc2)c2ccccc12] | 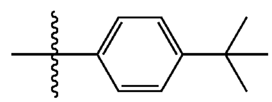 |
| 55-25 | 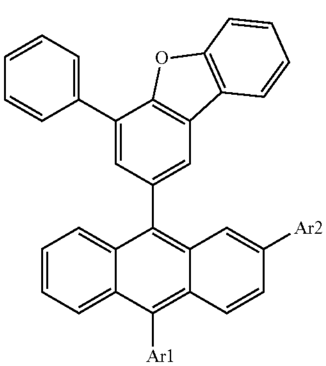 | 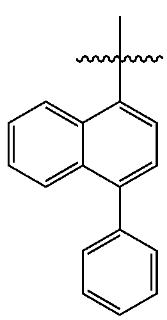 [SMILES: *c1ccc(-c2ccccc2)c2ccccc12] | 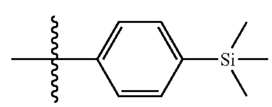 [SMILES: *c1ccc([Si](C)(C)C)cc1] |

-continued
| No. | | Ar1 | Ar2 |
|---|---|---|---|
| 55-26 | 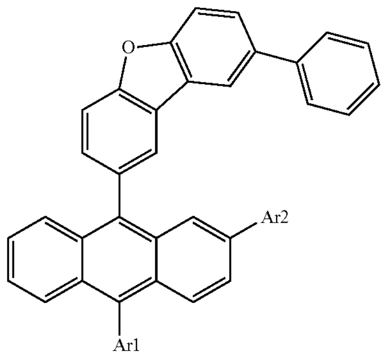 | 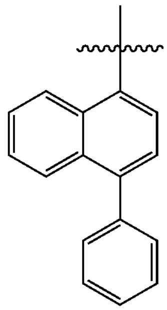 [SMILES: *c1ccc(-c2ccccc2)c2ccccc12] | 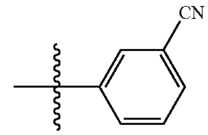 [SMILES: *c1cccc(C#N)c1] |
| 55-27 | 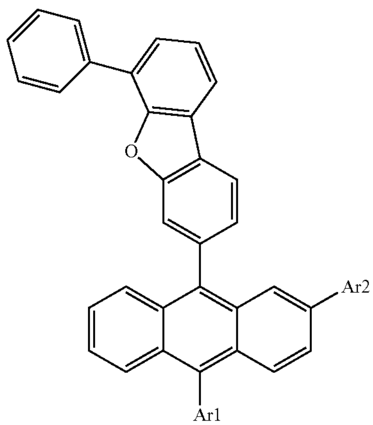 | 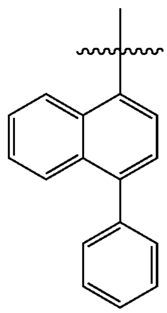 [SMILES: *c1ccc(-c2ccccc2)c2ccccc12] | 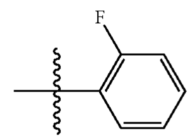 [SMILES: *c1ccccc1F] |
| 55-28 | 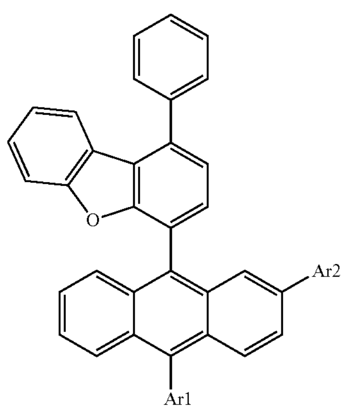 | 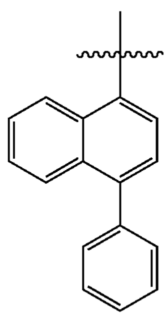 [SMILES: *c1ccc(-c2ccccc2)c2ccccc12] | 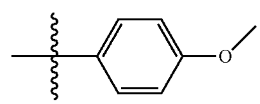 [SMILES: *c1ccc(OC)cc1] |
| 56-1 | 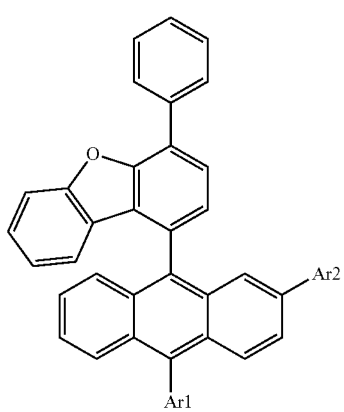 | 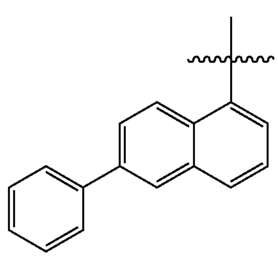 [SMILES: *c1cccc2cc(-c3ccccc3)ccc12] | 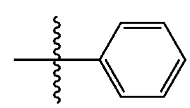 [SMILES: *c1ccccc1] |

-continued
| No. | | Ar1 | Ar2 |
|---|---|---|---|
| 56-2 | 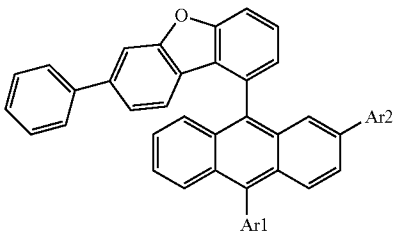 | 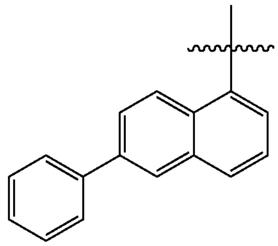 [SMILES: *c1cccc2cc(-c3ccccc3)ccc12] | 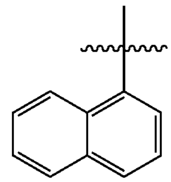 [SMILES: *c1cccc2ccccc12] |
| 56-3 | 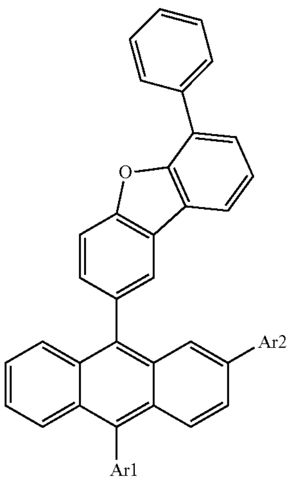 | 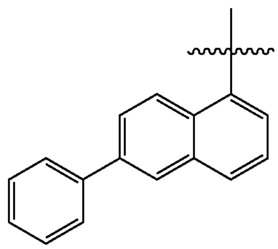 [SMILES: *c1cccc2cc(-c3ccccc3)ccc12] | 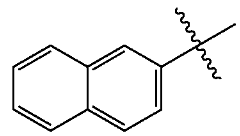 [SMILES: *c1ccc2ccccc2c1] |
| 56-4 | 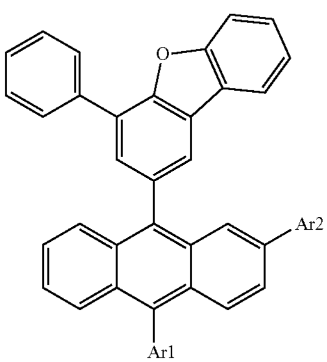 | 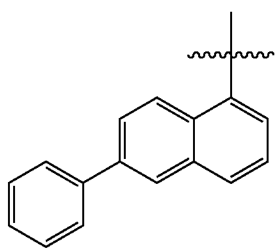 [SMILES: *c1cccc2cc(-c3ccccc3)ccc12] | 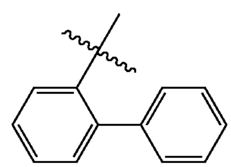 [SMILES: *c1ccccc1-c1ccccc1] |
| 56-5 | 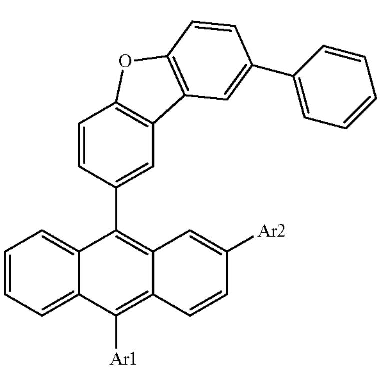 | 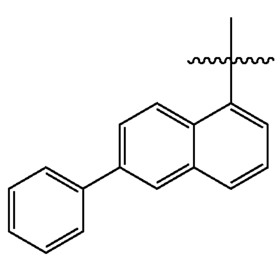 [SMILES: *c1cccc2cc(-c3ccccc3)ccc12] | 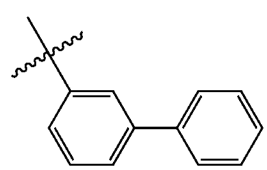 [SMILES: *c1cccc(-c2ccccc2)c1] |

-continued
| No. | | Ar1 | Ar2 |
|---|---|---|---|
| 56-6 | 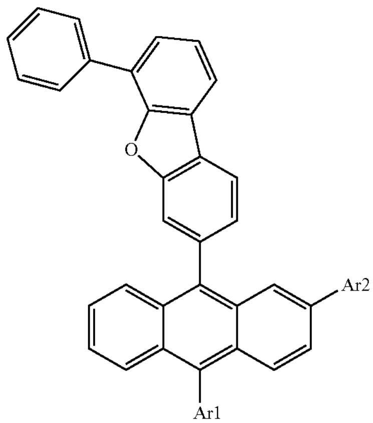 | 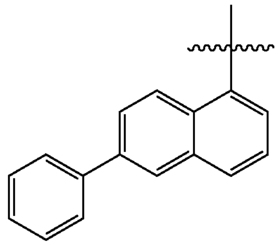 [SMILES: *c1cccc2cc(-c3ccccc3)ccc12] | 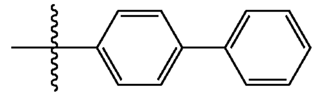 [SMILES: *c1ccc(-c2ccccc2)cc1] |
| 56-7 | 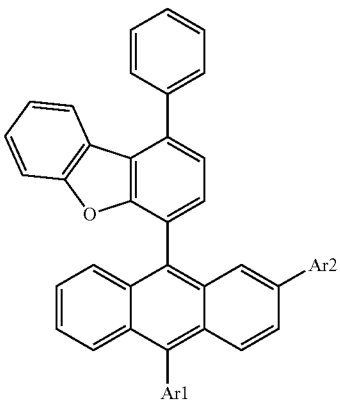 | 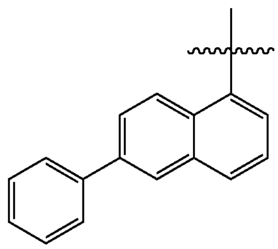 [SMILES: *c1cccc2cc(-c3ccccc3)ccc12] | 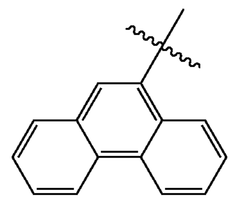 [SMILES: *c1cc2ccccc2c2ccccc12] |
| 56-9 | 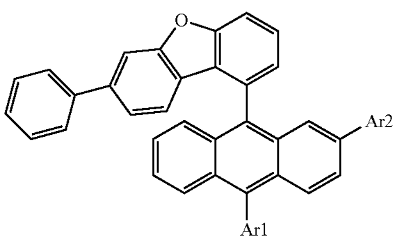 | 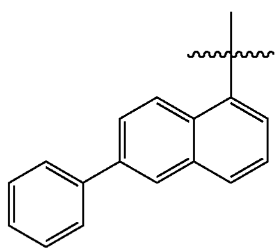 [SMILES: *c1cccc2cc(-c3ccccc3)ccc12] | 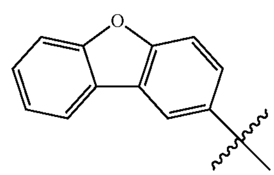 |
| 56-10 | 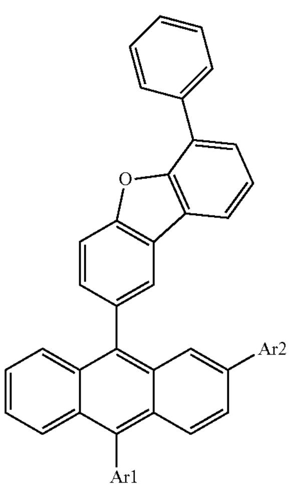 | 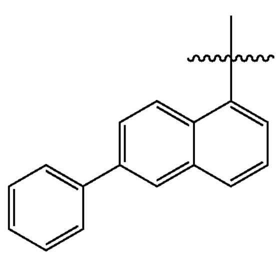 [SMILES: *c1cccc2cc(-c3ccccc3)ccc12] | 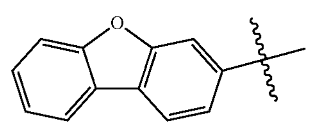 [SMILES: *c1ccc2c(c1)oc1ccccc12] |

-continued
| No. | | Ar1 | Ar2 |
|---|---|---|---|
| 56-11 | 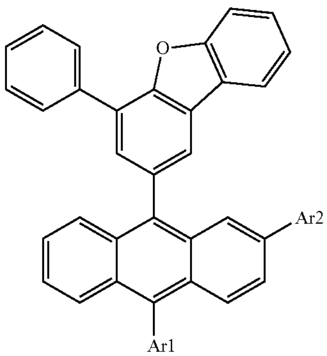 | 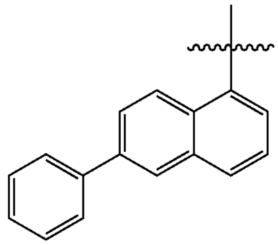 [SMILES: *c1cccc2cc(-c3ccccc3)ccc12] | 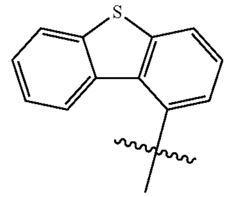 |
| 56-12 | 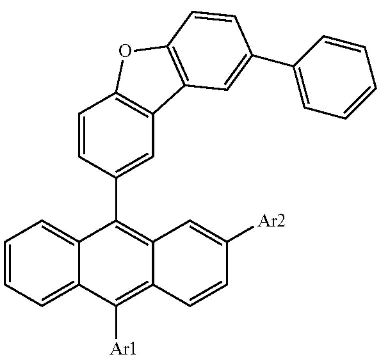 | 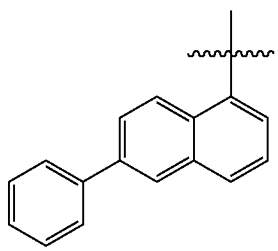 [SMILES: *c1cccc2cc(-c3ccccc3)ccc12] | 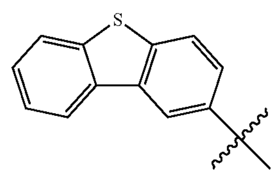 |
| 56-13 | 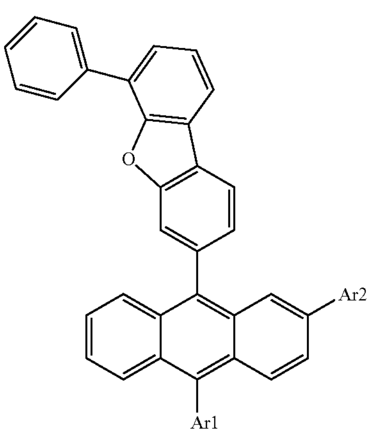 | 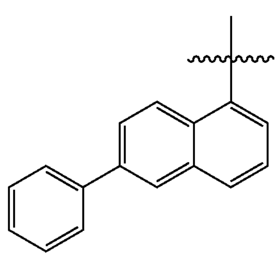 [SMILES: *c1cccc2cc(-c3ccccc3)ccc12] | 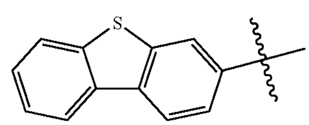 [SMILES: *c1ccc2c(c1)sc1ccccc12] |

-continued
| No. | | Ar1 | Ar2 |
|---|---|---|---|
| 56-17 | 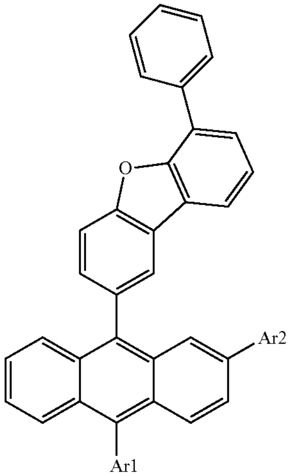 | 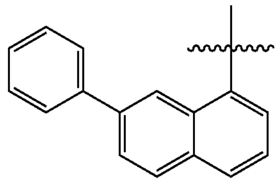 [SMILES: *c1cccc2ccc(-c3ccccc3)cc12] | 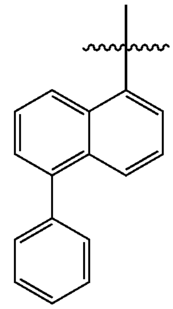 [SMILES: *c1cccc2c(-c3ccccc3)cccc12] |
| 56-18 | 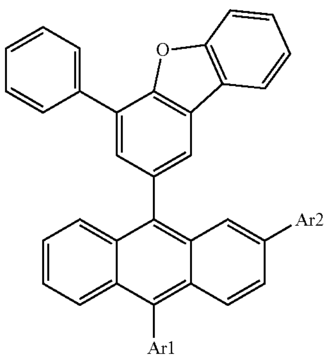 | 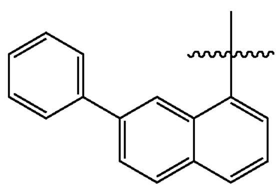 [SMILES: *c1cccc2ccc(-c3ccccc3)cc12] | 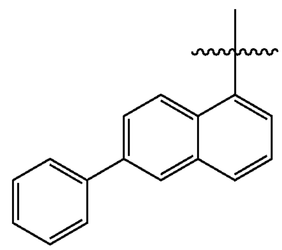 [SMILES: *c1cccc2cc(-c3ccccc3)ccc12] |
| 56-19 | 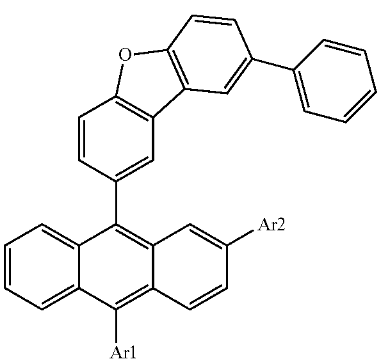 | 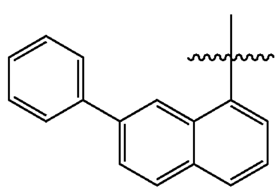 [SMILES: *c1cccc2ccc(-c3ccccc3)cc12] | 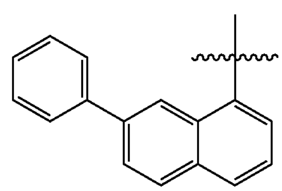 [SMILES: *c1cccc2ccc(-c3ccccc3)cc12] |
| 56-20 | 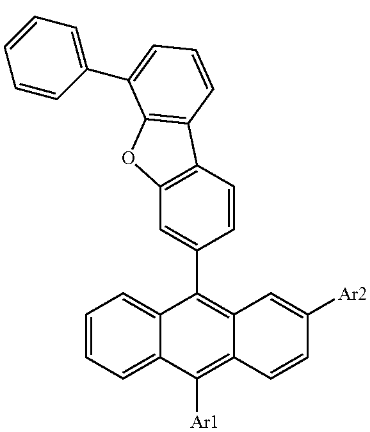 | 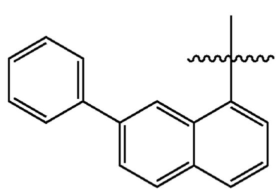 [SMILES: *c1cccc2ccc(-c3ccccc3)cc12] | 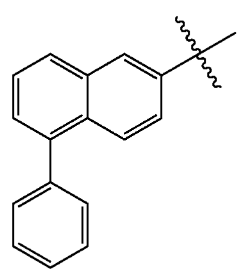 [SMILES: *c1ccc2c(-c3ccccc3)cccc2c1] |

-continued
| No. | | Ar1 | Ar2 |
|---|---|---|---|
| 56-21 | 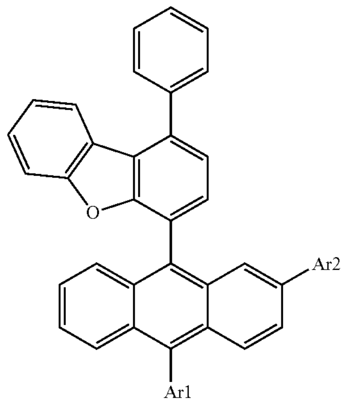 | 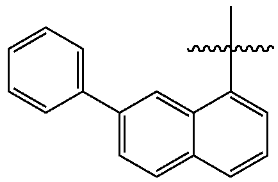 [SMILES: *c1cccc2ccc(-c3ccccc3)cc12] | 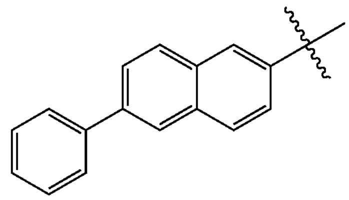 [SMILES: *c1ccc2cc(-c3ccccc3)ccc2c1] |
| 56-22 | 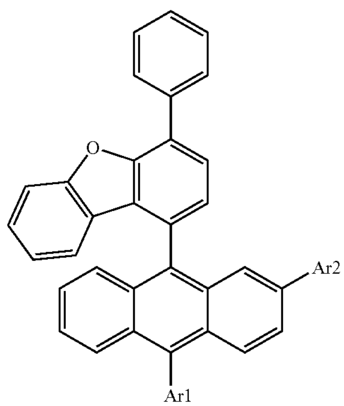 | 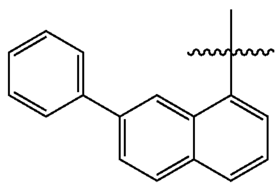 [SMILES: *c1cccc2ccc(-c3ccccc3)cc12] | 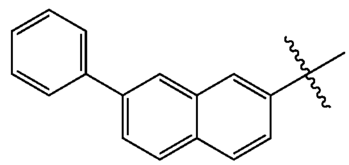 [SMILES: *c1ccc2ccc(-c3ccccc3)cc2c1] |
| 56-23 | 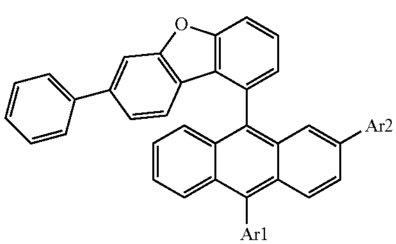 | 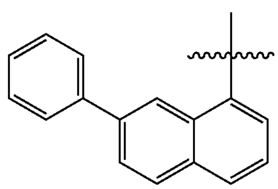 [SMILES: *c1cccc2ccc(-c3ccccc3)cc12] | 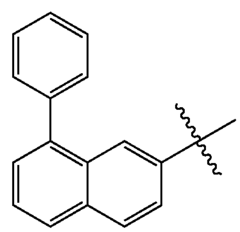 [SMILES: *c1ccc2cccc(-c3ccccc3)c2c1] |
| 56-24 | 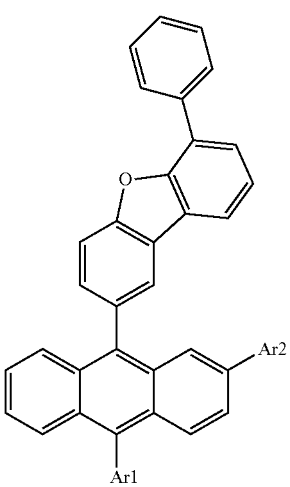 | 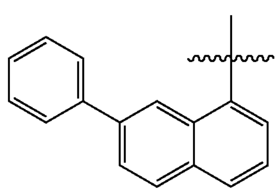 [SMILES: *c1cccc2ccc(-c3ccccc3)cc12] | 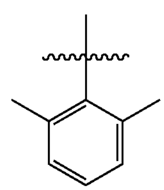 |

-continued
| No. | | Ar1 | Ar2 |
|---|---|---|---|
| 56-25 | 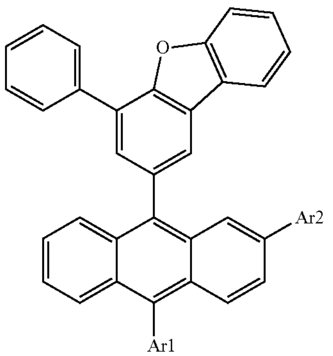 | 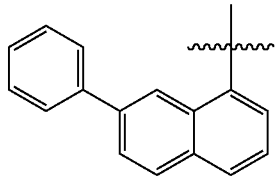 [SMILES: *c1cccc2ccc(-c3ccccc3)cc12] | 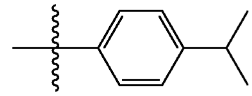 [SMILES: *c1ccc(C(C)C)cc1] |
| 56-26 | 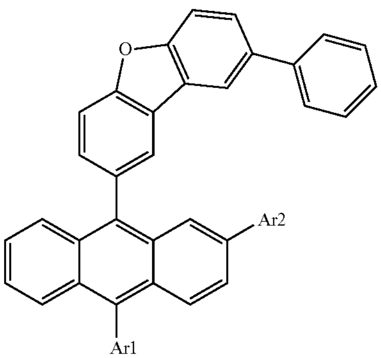 | 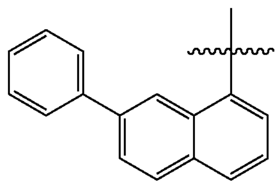 [SMILES: *c1cccc2ccc(-c3ccccc3)cc12] | 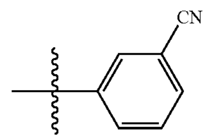 [SMILES: *c1cccc(C#N)c1] |
| 56-27 | 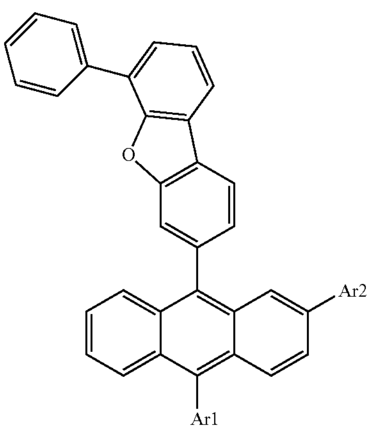 | 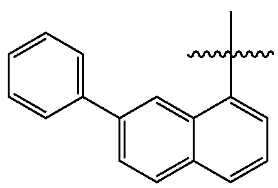 [SMILES: *c1cccc2ccc(-c3ccccc3)cc12] | 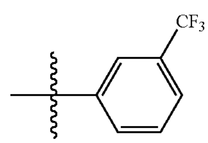 [SMILES: *c1cccc(C(F)(F)F)c1] |
| 56-28 | 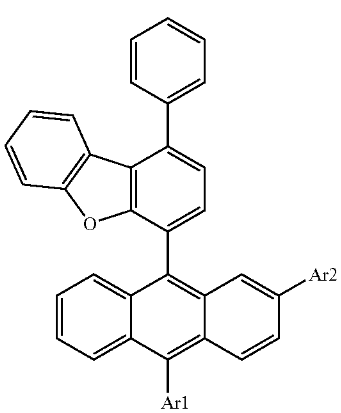 | 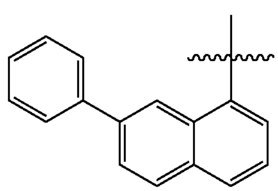 [SMILES: *c1cccc2ccc(-c3ccccc3)cc12] | 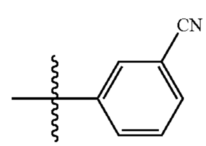 [SMILES: *c1cccc(C#N)c1] |

-continued
| No. | | Ar1 | Ar2 |
|---|---|---|---|
| 56-29 | 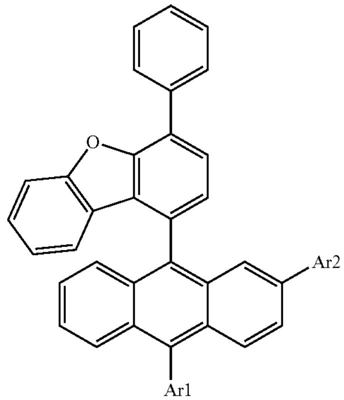 | 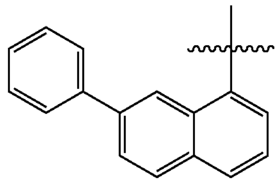 [SMILES: *c1cccc2ccc(-c3ccccc3)cc12] | 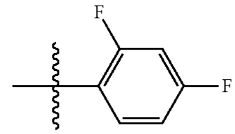 [SMILES: *c1ccc(F)cc1F] |
| 57-1 | 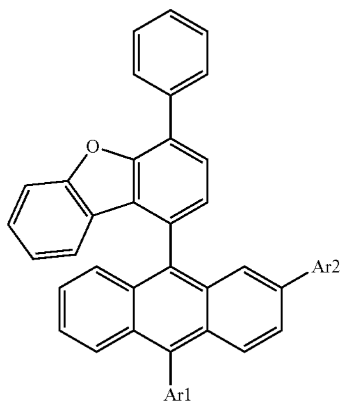 | 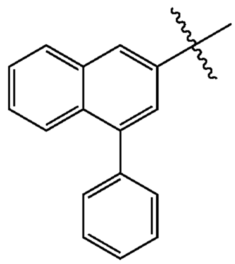 [SMILES: *c1cc(-c2ccccc2)c2ccccc2c1] | 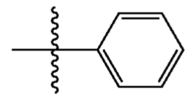 [SMILES: *c1ccccc1] |
| 57-2 | 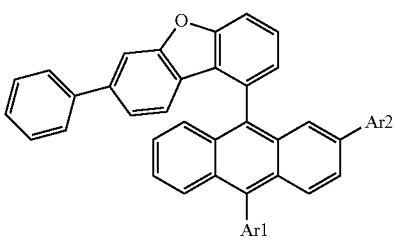 | 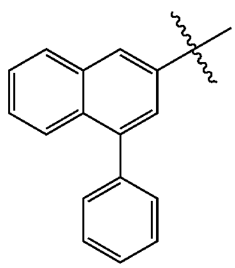 [SMILES: *c1cc(-c2ccccc2)c2ccccc2c1] | 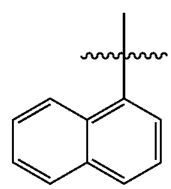 [SMILES: *c1cccc2ccccc12] |
| 57-3 | 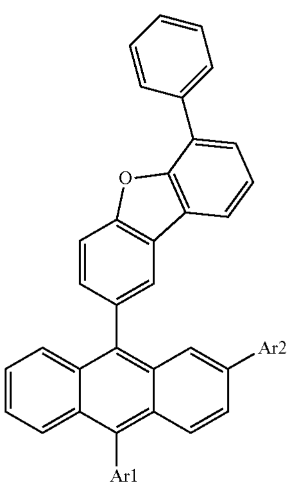 | 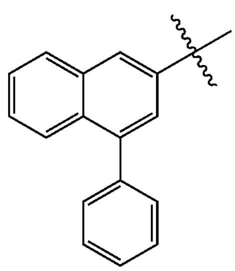 [SMILES: *c1cc(-c2ccccc2)c2ccccc2c1] | 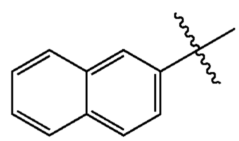 [SMILES: *c1ccc2ccccc2c1] |

-continued
| No. | | Ar1 | Ar2 |
|---|---|---|---|
| 57-4 | 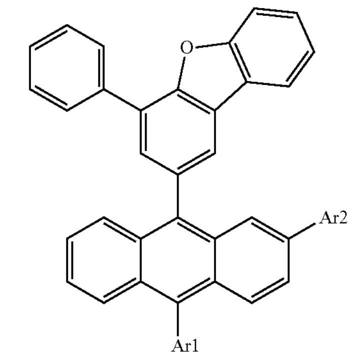 | 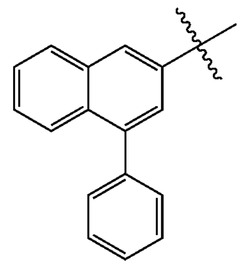 [SMILES: *c1cc(-c2ccccc2)c2ccccc2c1] | 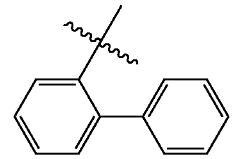 [SMILES: *c1ccccc1-c1ccccc1] |
| 57-5 | 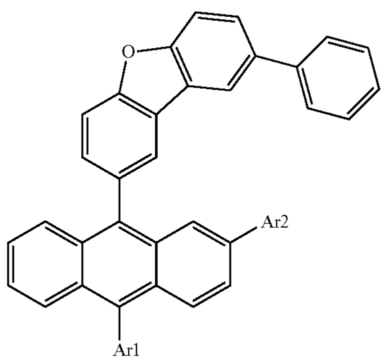 | 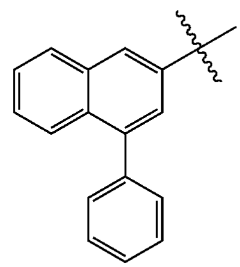 [SMILES: *c1cc(-c2ccccc2)c2ccccc2c1] | 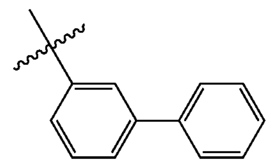 [SMILES: *c1cccc(-c2ccccc2)c1] |
| 57-6 | 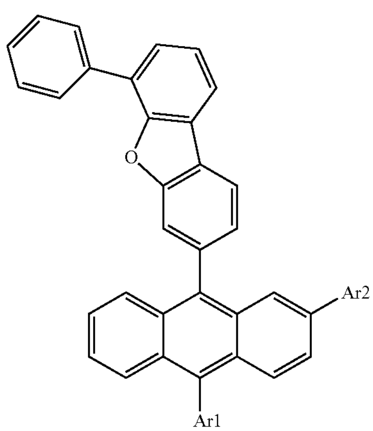 | 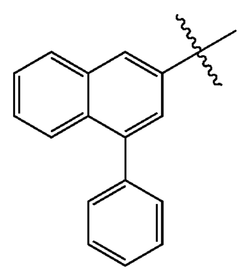 [SMILES: *c1cc(-c2ccccc2)c2ccccc2c1] | 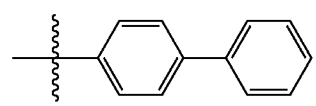 [SMILES: *c1ccc(-c2ccccc2)cc1] |
| 57-7 | 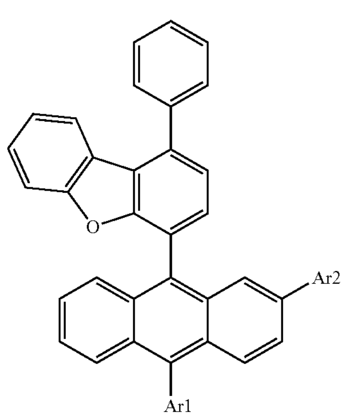 | 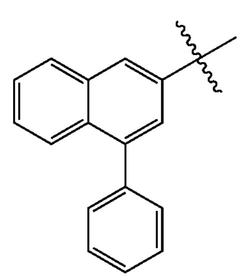 [SMILES: *c1cc(-c2ccccc2)c2ccccc2c1] | 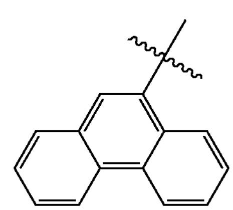 [SMILES: *c1cc2ccccc2c2ccccc12] |

-continued
| No. | | Ar1 | Ar2 |
|---|---|---|---|
| 57-9 | 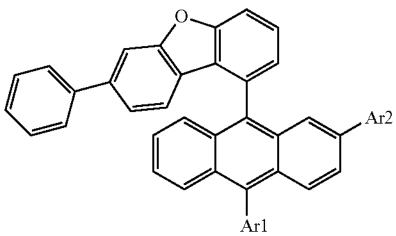 | 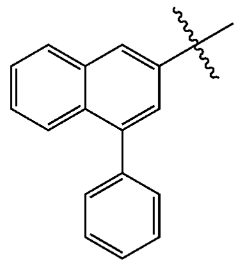 [SMILES: *c1cc(-c2ccccc2)c2ccccc2c1] | 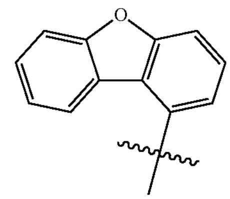 [SMILES: *c1cccc2oc3ccccc3c12] |
| 57-10 | 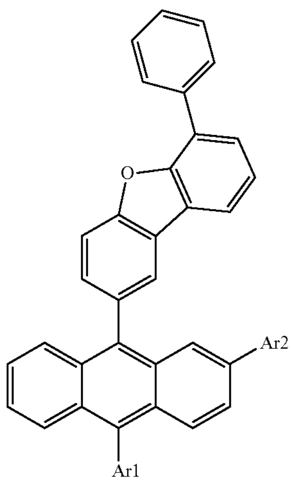 | 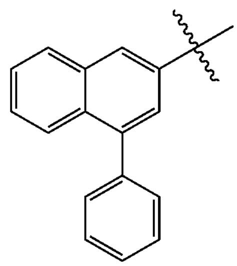 [SMILES: *c1cc(-c2ccccc2)c2ccccc2c1] | 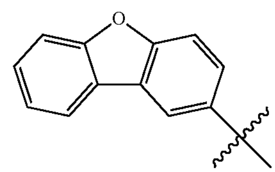 |
| 57-11 | 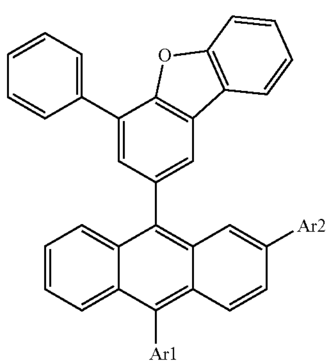 | 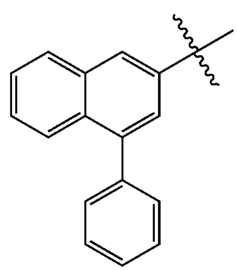 [SMILES: *c1cc(-c2ccccc2)c2ccccc2c1] | 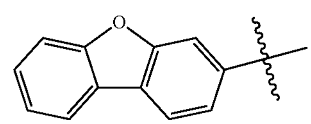 [SMILES: *c1ccc2c(c1)oc1ccccc12] |
| 57-12 | 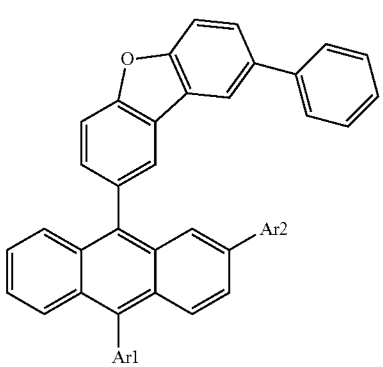 | 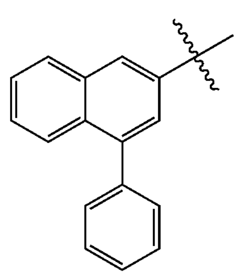 [SMILES: *c1cc(-c2ccccc2)c2ccccc2c1] | 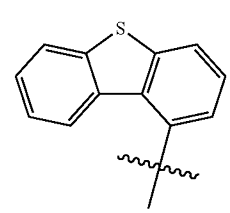 [SMILES: *c1cccc2sc3ccccc3c12] |

-continued
| No. | | Ar1 | Ar2 |
| --- | --- | --- | --- |
| 57-13 | 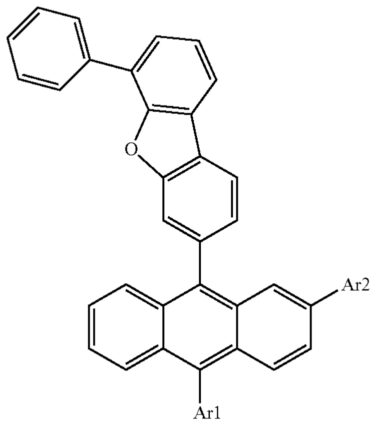 | 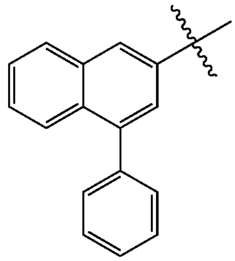 [SMILES: *c1cc(-c2ccccc2)c2ccccc2c1] | 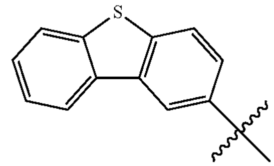 |
| 57-14 | 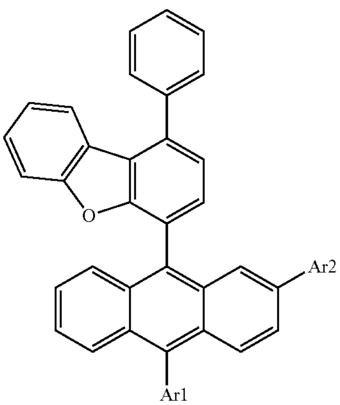 | 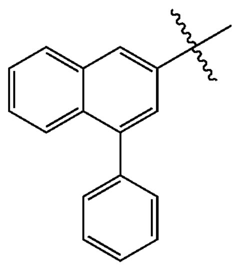 [SMILES: *c1cc(-c2ccccc2)c2ccccc2c1] | 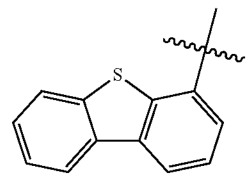 |
| 57-19 | 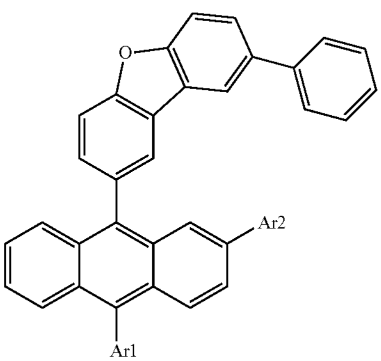 | 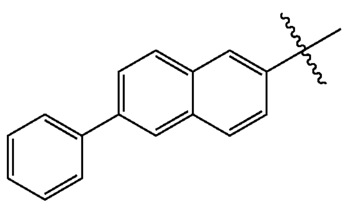 [SMILES: *c1ccc2cc(-c3ccccc3)ccc2c1] | 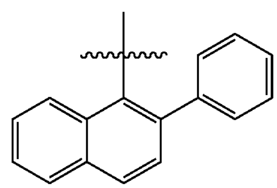 [SMILES: *c1c(-c2ccccc2)ccc2ccccc12] |
| 57-20 | 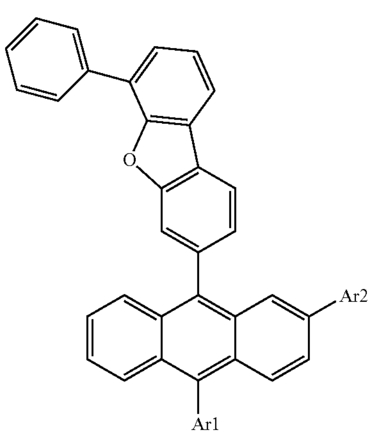 | 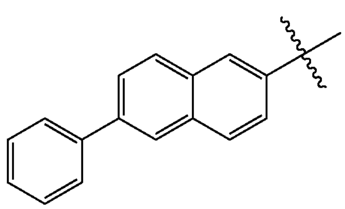 [SMILES: *c1ccc2cc(-c3ccccc3)ccc2c1] | 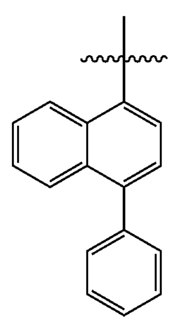 [SMILES: *c1ccc(-c2ccccc2)c2ccccc12] |

-continued
| No. | | Ar1 | Ar2 |
|---|---|---|---|
| 57-21 | 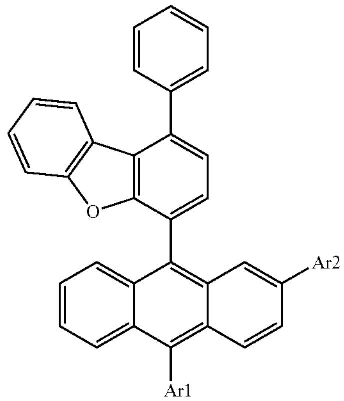 | 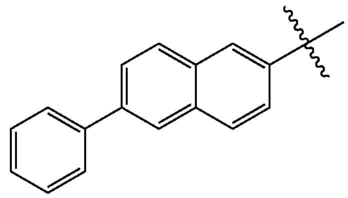 [SMILES: *c1ccc2cc(-c3ccccc3)ccc2c1] | 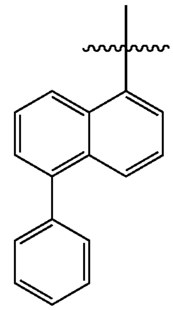 [SMILES: *c1cccc2c(-c3ccccc3)cccc12] |
| 57-22 | 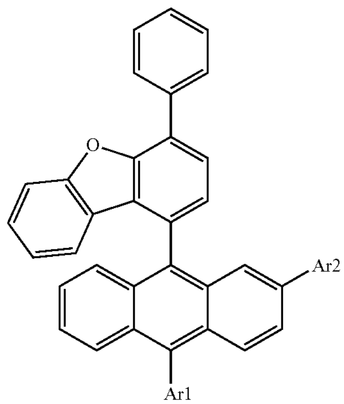 | 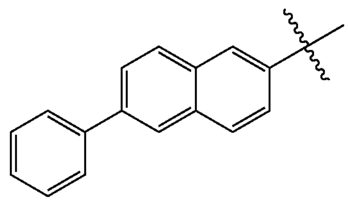 [SMILES: *c1ccc2cc(-c3ccccc3)ccc2c1] | 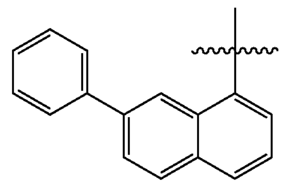 [SMILES: *c1cccc2ccc(-c3ccccc3)cc12] |
| 57-23 | 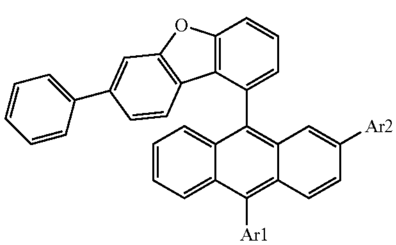 | 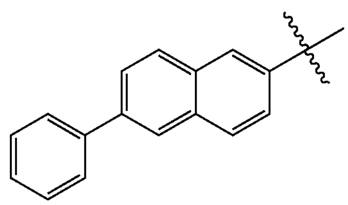 [SMILES: *c1ccc2cc(-c3ccccc3)ccc2c1] | 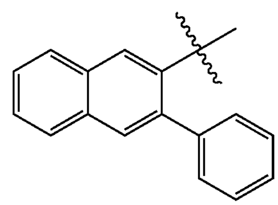 [SMILES: *c1cc2ccccc2cc1-c1ccccc1] |
| 57-24 | 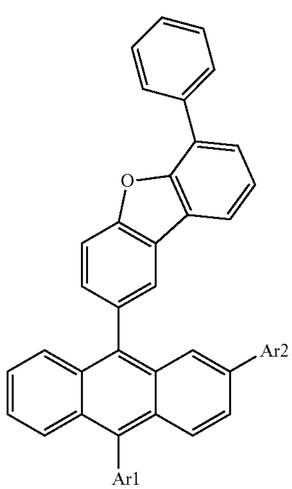 | 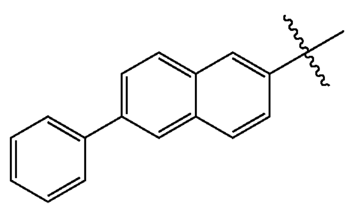 [SMILES: *c1ccc2cc(-c3ccccc3)ccc2c1] | 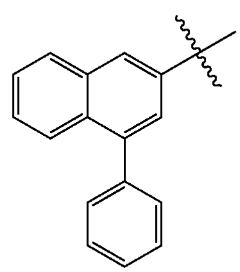 [SMILES: *c1cc(-c2ccccc2)c2ccccc2c1] |

-continued
| No. | | Ar1 | Ar2 |
|---|---|---|---|
| 57-25 | 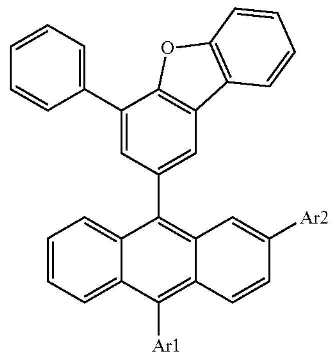 | 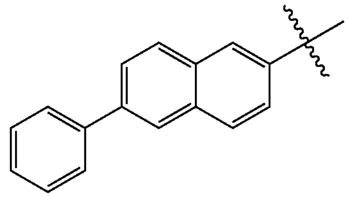 [SMILES: *c1ccc2cc(-c3ccccc3)ccc2c1] | 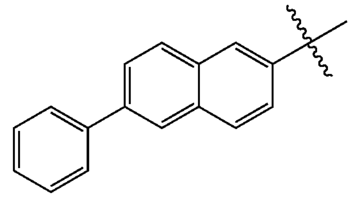 [SMILES: *c1ccc2cc(-c3ccccc3)ccc2c1] |
| 57-26 | 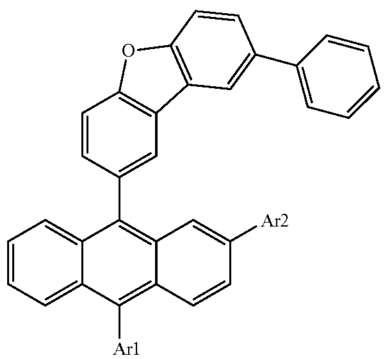 | 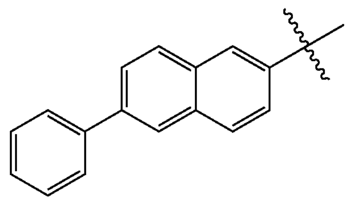 [SMILES: *c1ccc2cc(-c3ccccc3)ccc2c1] | 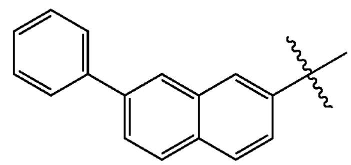 [SMILES: *c1ccc2ccc(-c3ccccc3)cc2c1] |
| 57-27 | 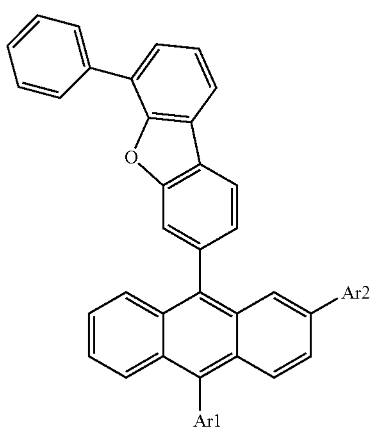 | 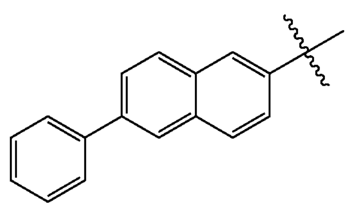 [SMILES: *c1ccc2cc(-c3ccccc3)ccc2c1] | 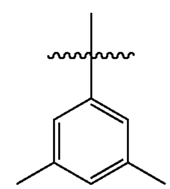 |
| 57-28 | 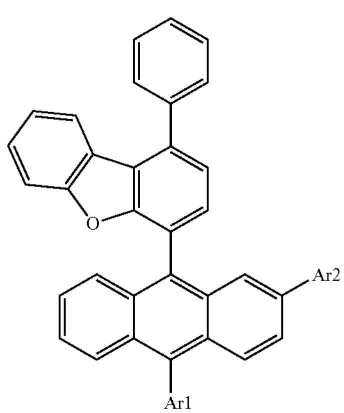 | 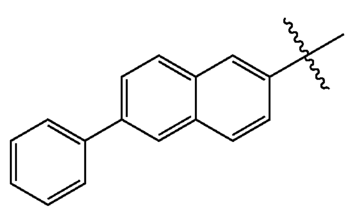 [SMILES: *c1ccc2cc(-c3ccccc3)ccc2c1] | 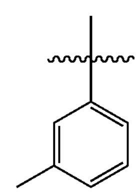 [SMILES: *c1cccc(C)c1] |

-continued
| No. | | Ar1 | Ar2 |
|---|---|---|---|
| 57-29 | 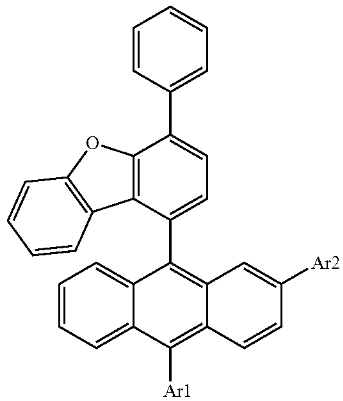 | 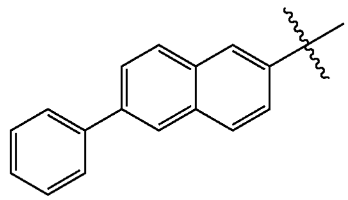 [SMILES: *c1ccc2cc(-c3ccccc3)ccc2c1] | 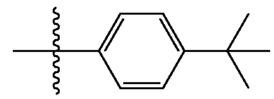 [SMILES: *c1ccc(C(C)(C)C)cc1] |
| 57-30 | 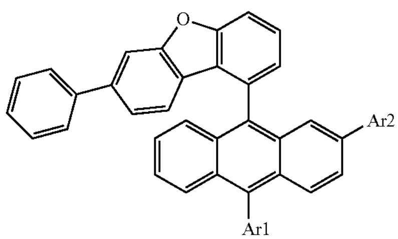 | 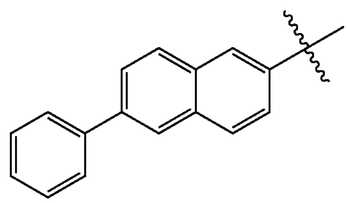 [SMILES: *c1ccc2cc(-c3ccccc3)ccc2c1] | 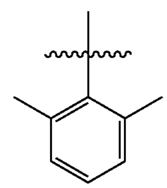 |
| 57-31 | 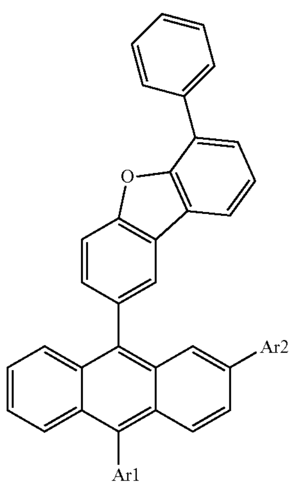 | 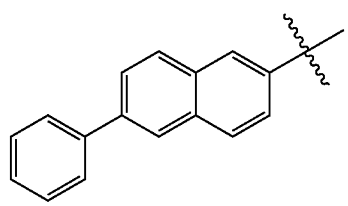 [SMILES: *c1ccc2cc(-c3ccccc3)ccc2c1] | 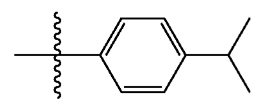 |
| 58-1 | 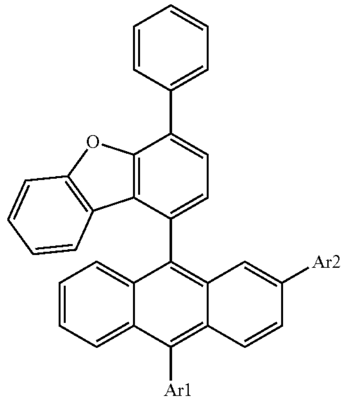 | 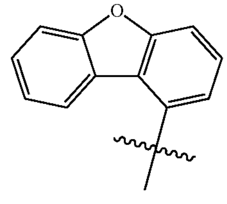 | 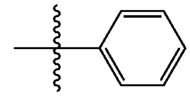 |

-continued
| No. | | Ar1 | Ar2 |
|---|---|---|---|
| 58-2 | 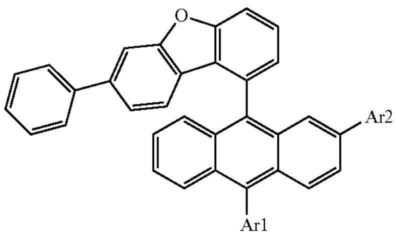 | 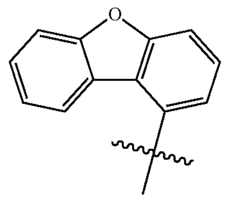 | 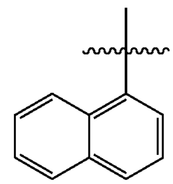 [SMILES: *c1cccc2ccccc12] |
| 58-3 | 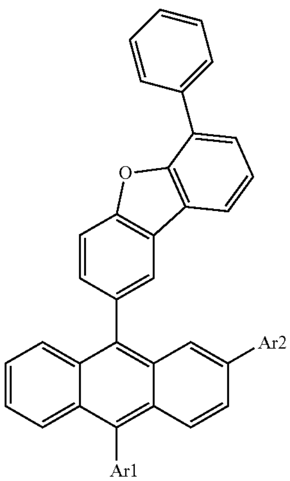 | 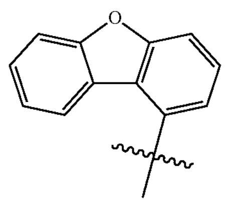 | 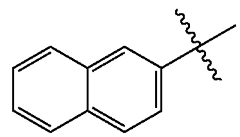 [SMILES: *c1ccc2ccccc2c1] |
| 58-4 | 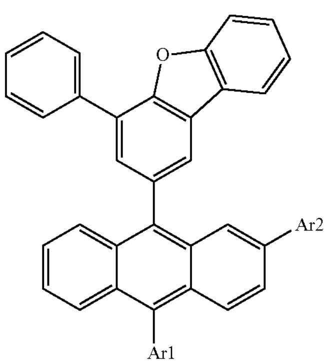 | 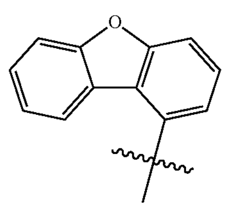 | 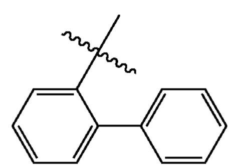 [SMILES: *c1ccccc1-c1ccccc1] |
| 58-5 | 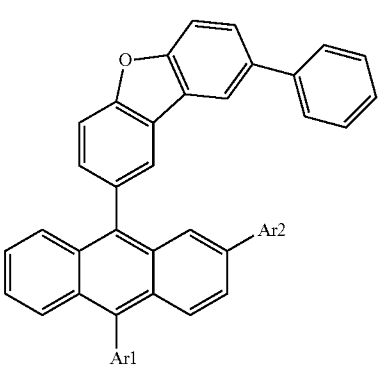 | 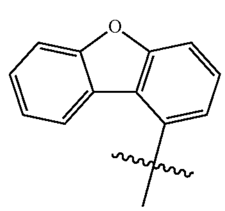 | 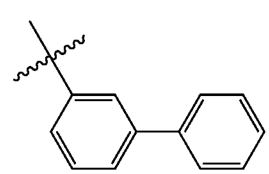 [SMILES: *c1cccc(-c2ccccc2)c1] |

-continued
| No. | | Ar1 | Ar2 |
|---|---|---|---|
| 58-6 | 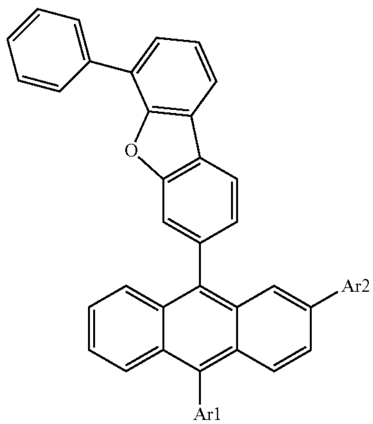 | 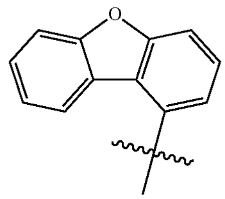 [SMILES: *c1cccc2oc3ccccc3c12] | 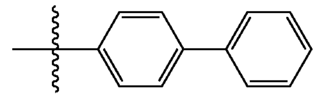 [SMILES: *c1ccc(-c2ccccc2)cc1] |
| 58-7 | 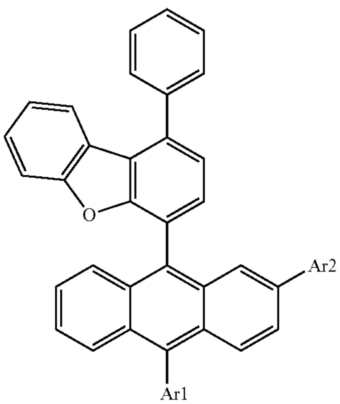 | 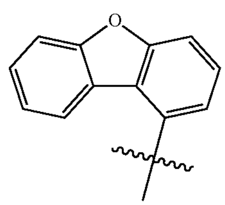 | 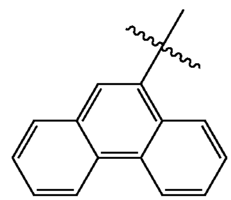 [SMILES: *c1cc2ccccc2c2ccccc12] |
| 58-9 | 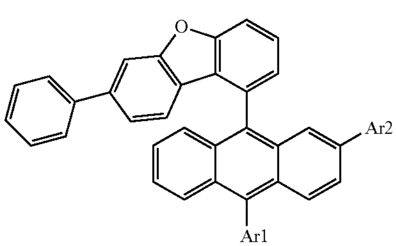 | 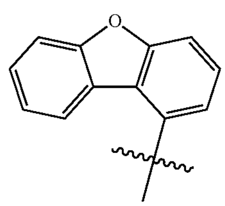 [SMILES: *c1cccc2oc3ccccc3c12] | 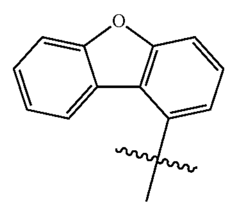 [SMILES: *c1cccc2oc3ccccc3c12] |
| 58-10 | 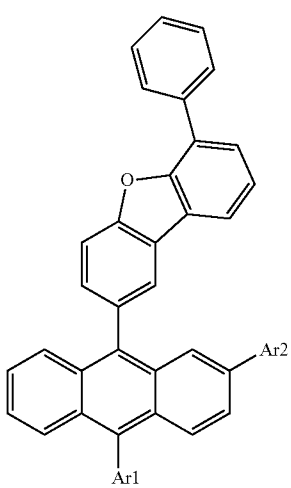 | 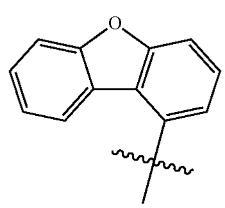 [SMILES: *c1cccc2oc3ccccc3c12] | 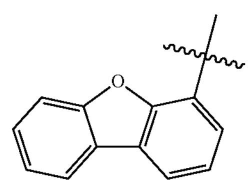 [SMILES: *c1cccc2c1oc1ccccc12] |

-continued
| No. | | Ar1 | Ar2 |
|---|---|---|---|
| 58-11 | 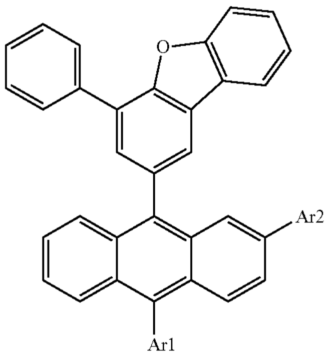 | 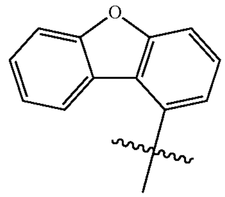 | 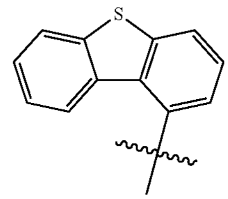 [SMILES: *c1cccc2sc3ccccc3c12] |
| 58-12 | 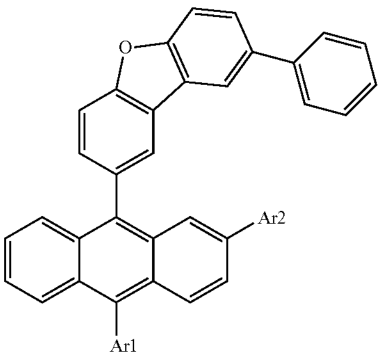 | 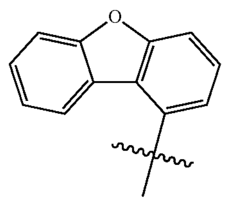 | 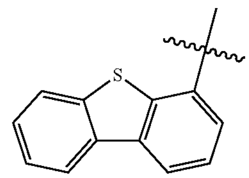 |
| 58-16 | 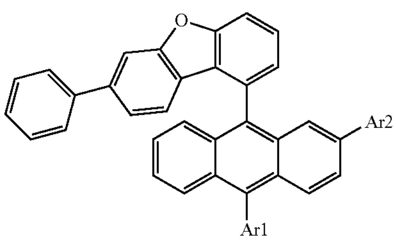 | 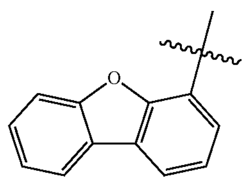 | 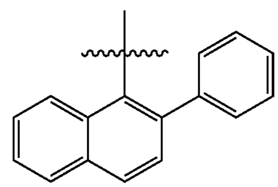 [SMILES: *c1c(-c2ccccc2)ccc2ccccc12] |
| 58-17 | 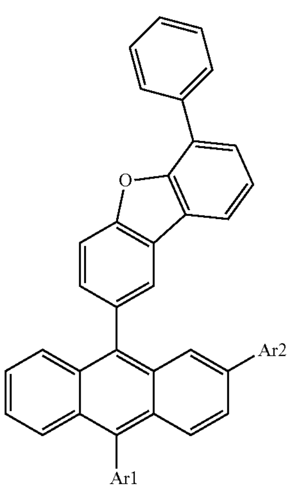 | 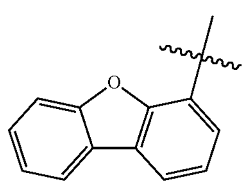 | 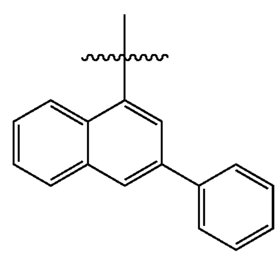 [SMILES: *c1cc(-c2ccccc2)cc2ccccc12] |

-continued
| No. | | Ar1 | Ar2 |
|---|---|---|---|
| 58-18 | 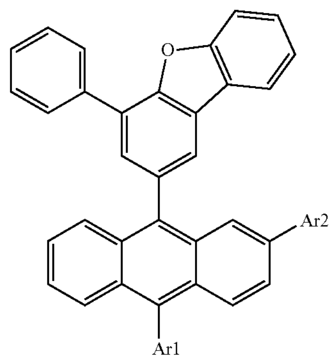 | 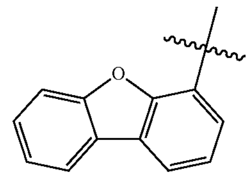 | 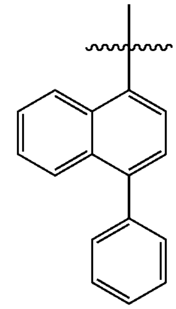 [SMILES: *c1ccc(-c2ccccc2)c2ccccc12] |
| 58-19 | 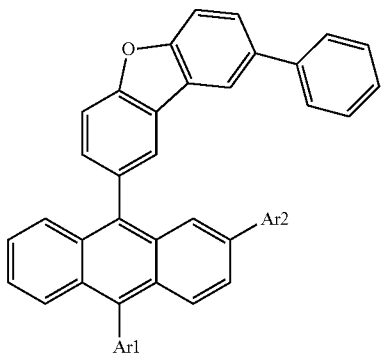 | 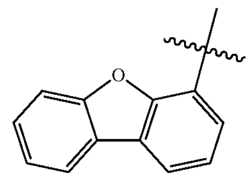 [SMILES: *c1cccc2c1oc1ccccc12] | 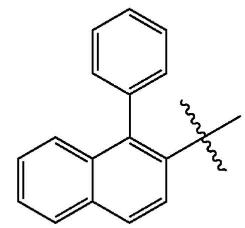 [SMILES: *c1ccc2ccccc2c1-c1ccccc1] |
| 58-20 | 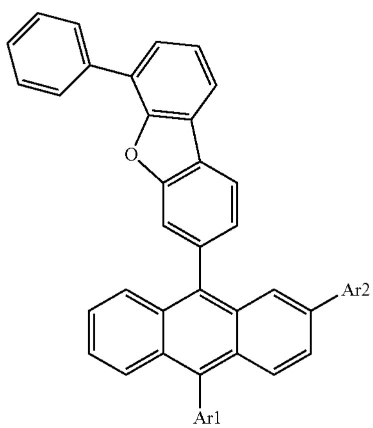 | 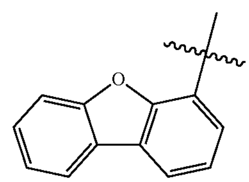 [SMILES: *c1cccc2c1oc1ccccc12] | 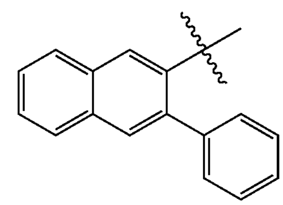 [SMILES: *c1cc2ccccc2cc1-c1ccccc1] |
| 58-21 | 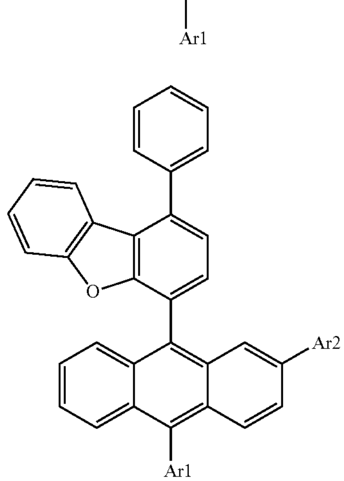 | 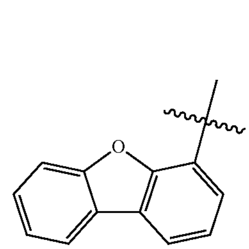 [SMILES: *c1cccc2c1oc1ccccc12] | 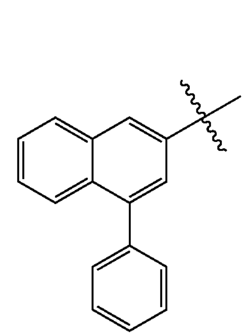 [SMILES: *c1cc(-c2ccccc2)c2ccccc2c1] |

-continued
| No. | | Ar1 | Ar2 |
|---|---|---|---|
| 58-22 | 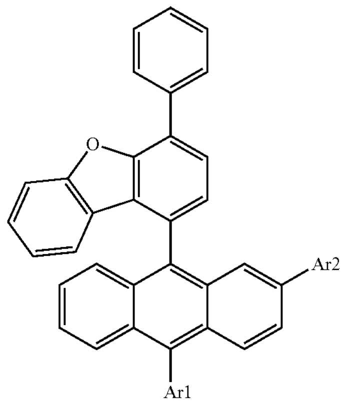 | 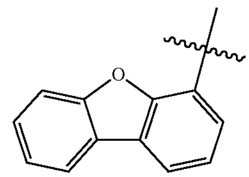 [SMILES: *c1cccc2c1oc1ccccc12] | 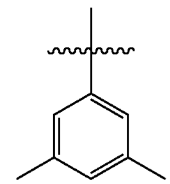 |
| 58-23 | 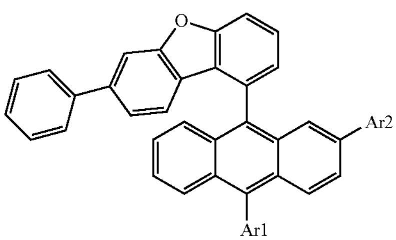 | 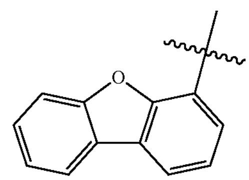 [SMILES: *c1cccc2c1oc1ccccc12] | 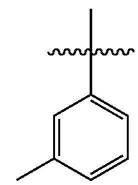 |
| 58-24 | 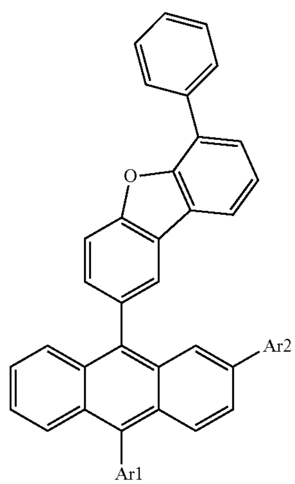 | 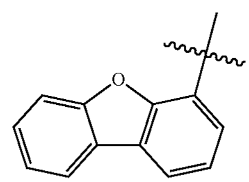 [SMILES: *c1cccc2c1oc1ccccc12] | 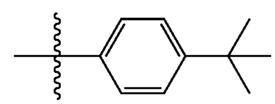 |
| 58-25 | 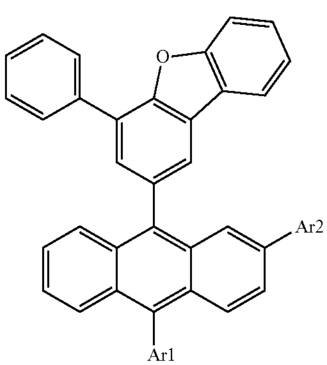 | 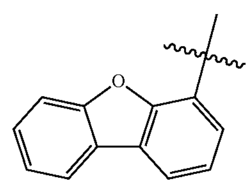 | 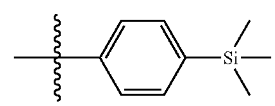 [SMILES: *c1ccc([Si](C)(C)C)cc1] |

-continued
| No. | | Ar1 | Ar2 |
|---|---|---|---|
| 58-26 | 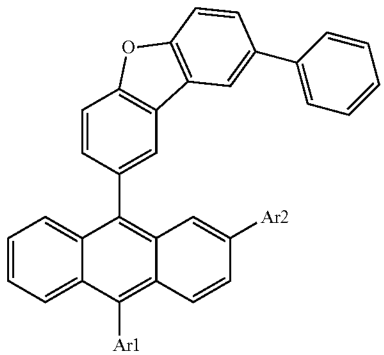 | 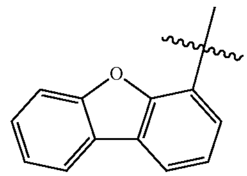 | 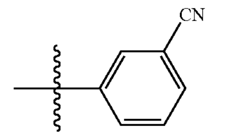 [SMILES: *c1cccc(C#N)c1] |
| 58-27 | 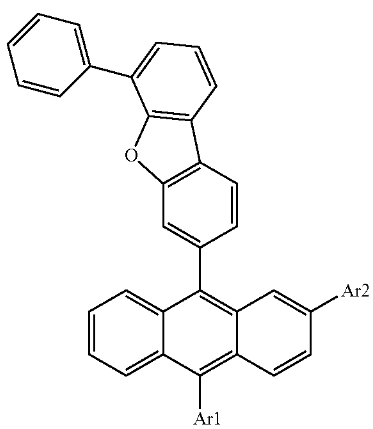 | 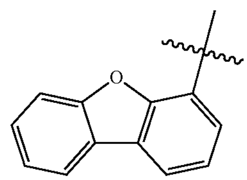 | 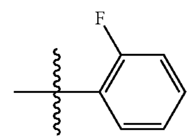 [SMILES: *c1ccccc1F] |
| 58-28 | 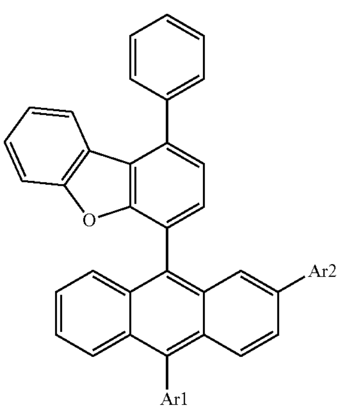 | 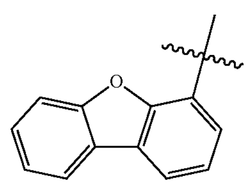 | 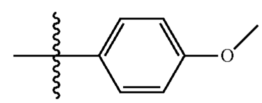 [SMILES: *c1ccc(OC)cc1] |
| 59-1 | 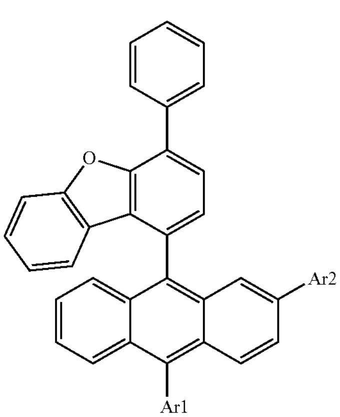 | 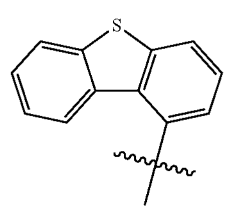 [SMILES: *c1cccc2sc3ccccc3c12] | 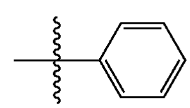 [SMILES: *c1ccccc1] |

-continued
| No. | | Ar1 | Ar2 |
|---|---|---|---|
| 59-2 | 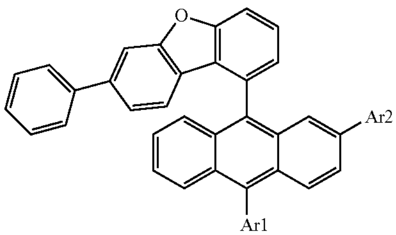 | 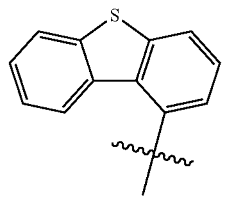 [SMILES: *c1cccc2sc3ccccc3c12] | 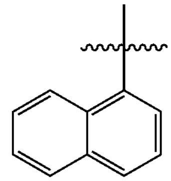 [SMILES: *c1cccc2ccccc12] |
| 59-3 | 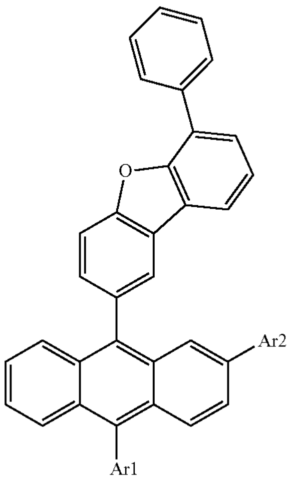 | 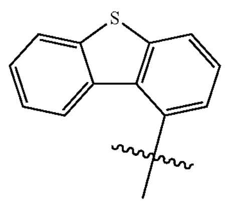 | 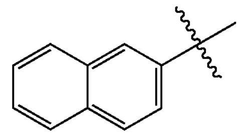 [SMILES: *c1ccc2ccccc2c1] |
| 59-4 | 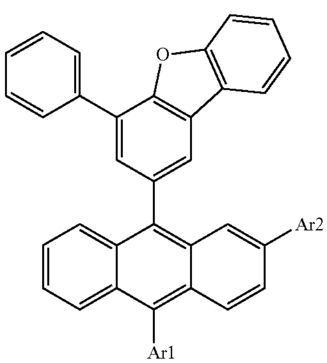 | 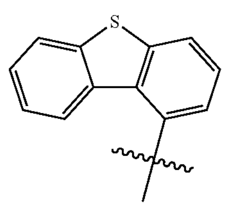 | 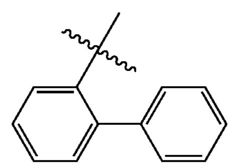 [SMILES: *c1ccccc1-c1ccccc1] |
| 59-5 | 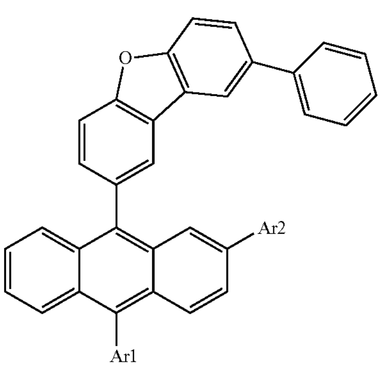 | 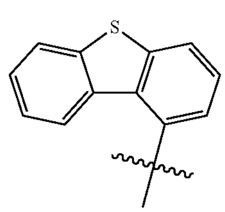 | 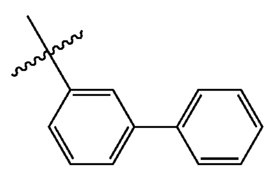 [SMILES: *c1cccc(-c2ccccc2)c1] |

-continued
| No. | | Ar1 | Ar2 |
|---|---|---|---|
| 59-6 | 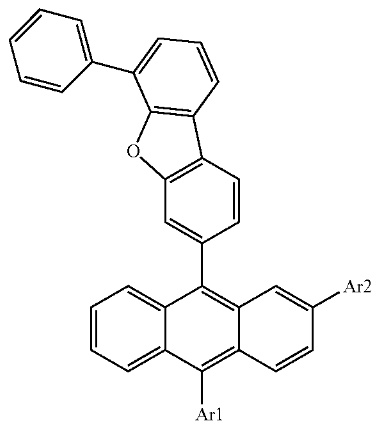 | 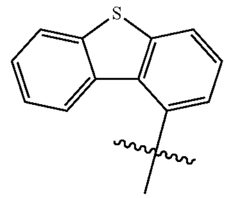 | 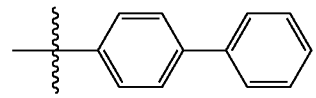 |
| 59-7 | 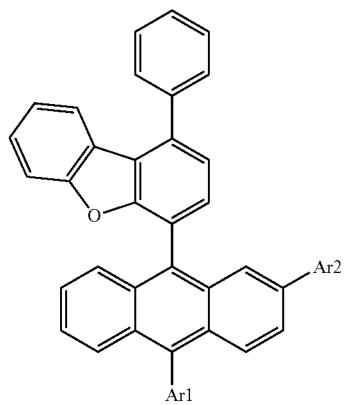 | 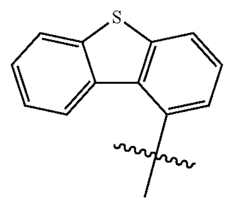 | 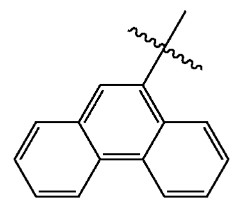 [SMILES: *c1cc2ccccc2c2ccccc12] |
| 59-9 | 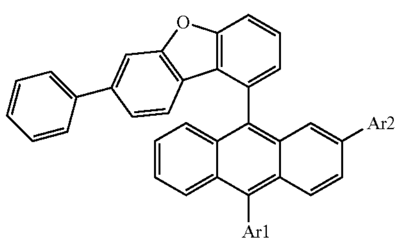 | 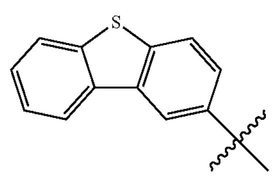 | 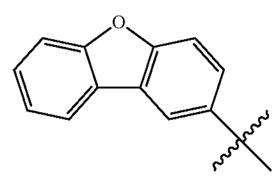 |
| 59-10 | 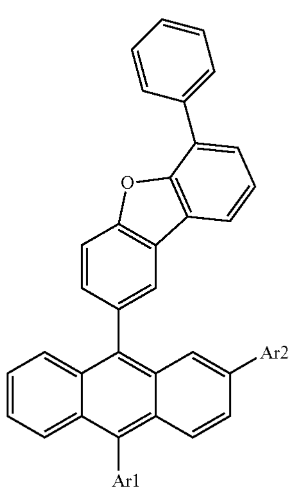 | 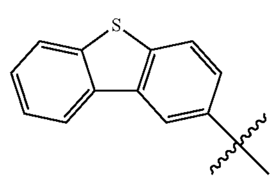 | 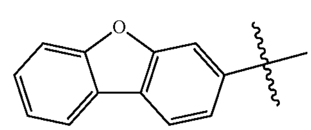 |

-continued
| No. | | Ar1 | Ar2 |
|---|---|---|---|
| 59-11 | 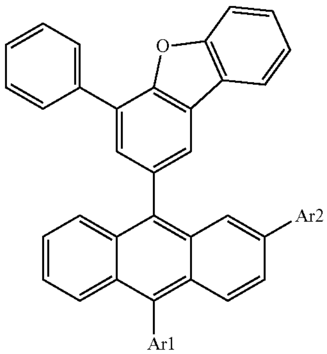 | 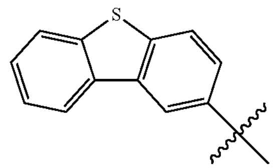 | 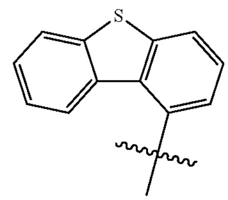 [SMILES: *c1cccc2sc3ccccc3c12] |
| 59-12 | 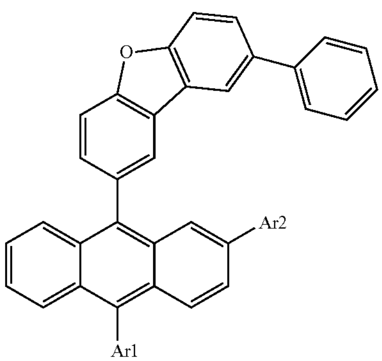 | 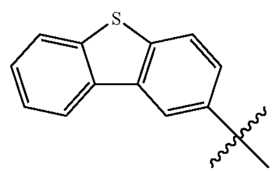 | 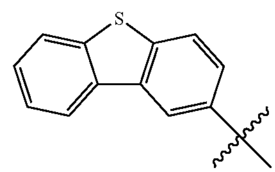 |
| 59-13 | 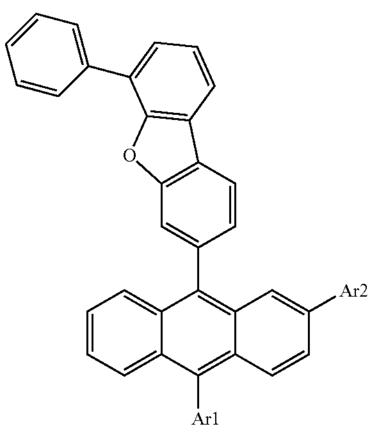 | 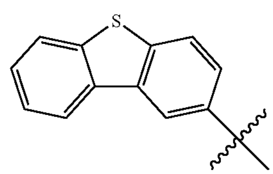 | 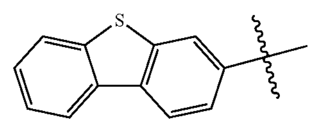 |
| 59-17 | 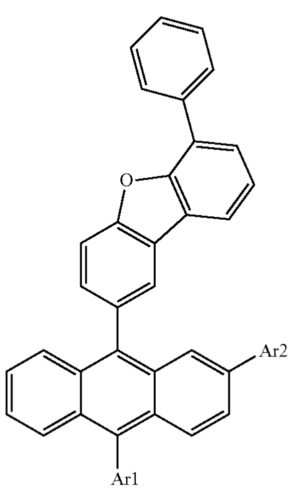 | 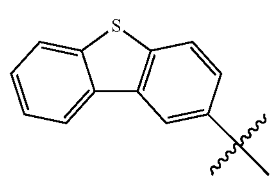 | 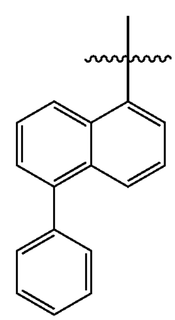 [SMILES: *c1cccc2c(-c3ccccc3)cccc12] |

-continued
| No. | | Ar1 | Ar2 |
|---|---|---|---|
| 59-18 | 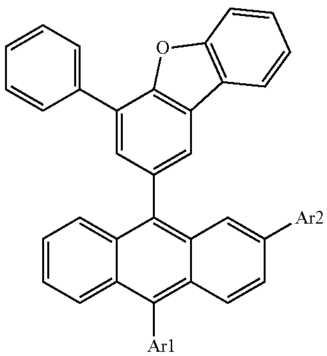 | 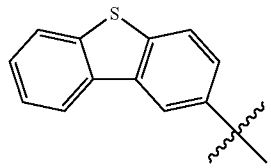 | 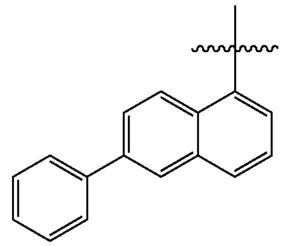 [SMILES: *c1cccc2cc(-c3ccccc3)ccc12] |
| 59-19 | 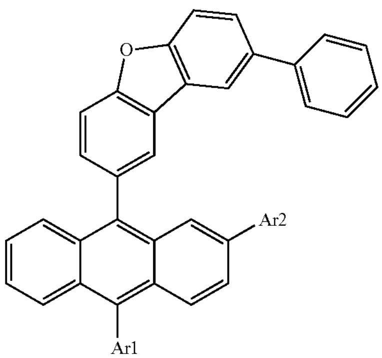 | 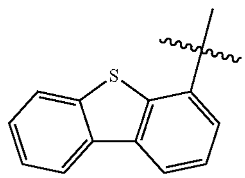 [SMILES: *c1cccc2c1sc1ccccc12] | 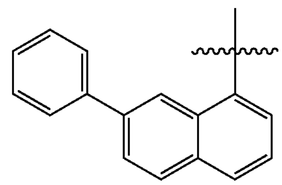 [SMILES: *c1cccc2ccc(-c3ccccc3)cc12] |
| 59-20 | 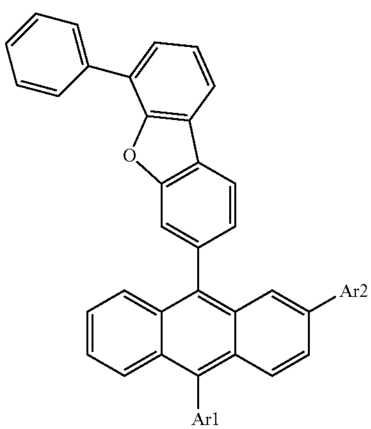 | 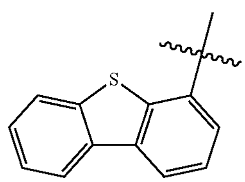 | 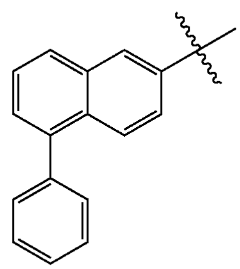 [SMILES: *c1ccc2c(-c3ccccc3)cccc2c1] |
| 59-21 | 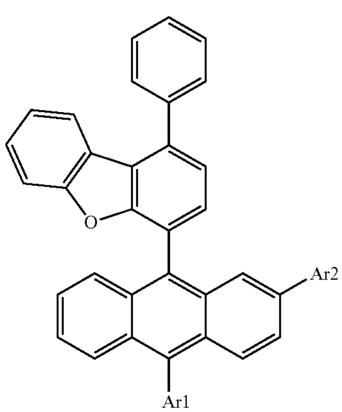 | 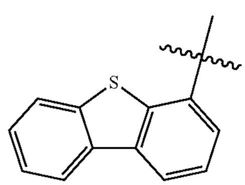 [SMILES: *c1cccc2c1sc1ccccc12] | 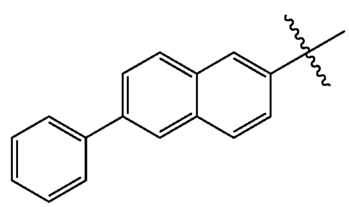 [SMILES: *c1ccc2cc(-c3ccccc3)ccc2c1] |

-continued
| No. | | Ar1 | Ar2 |
|---|---|---|---|
| 59-22 | 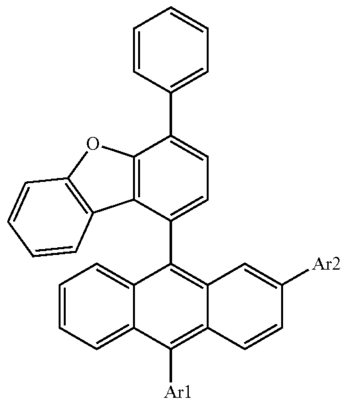 | 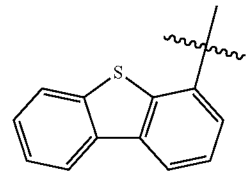 [SMILES: *c1cccc2c1sc1ccccc12] | 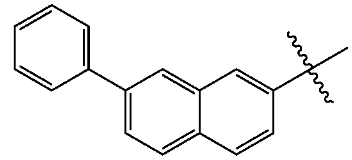 [SMILES: *c1ccc2ccc(-c3ccccc3)cc2c1] |
| 59-23 | 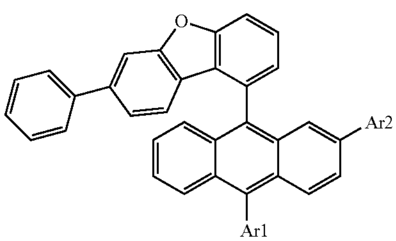 | 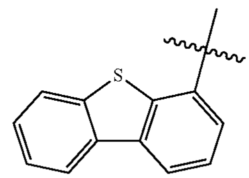 [SMILES: *c1cccc2c1sc1ccccc12] | 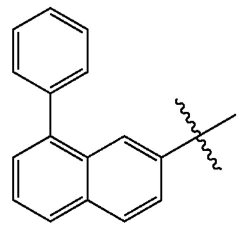 [SMILES: *c1ccc2cccc(-c3ccccc3)c2c1] |
| 59-24 | 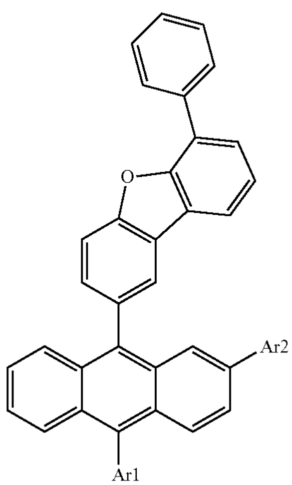 | 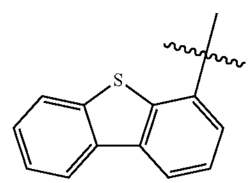 [SMILES: *c1cccc2c1sc1ccccc12] | 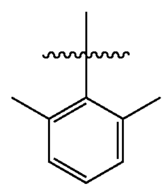 |
| 59-25 | 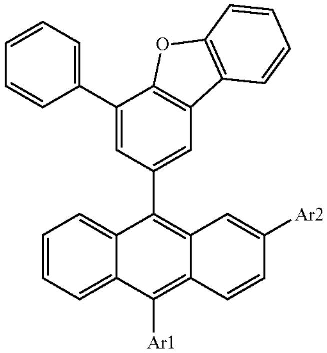 | 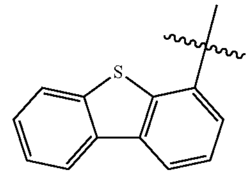 | 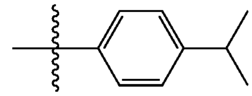 |

-continued
| No. | | Ar1 | Ar2 |
|---|---|---|---|
| 59-26 | 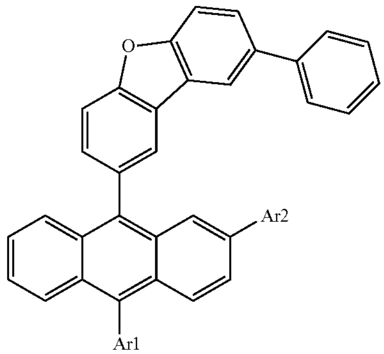 | 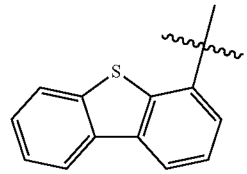 [SMILES: *c1cccc2c1sc1ccccc12] | 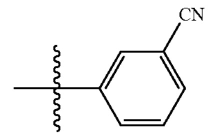 [SMILES: *c1cccc(C#N)c1] |
| 59-27 | 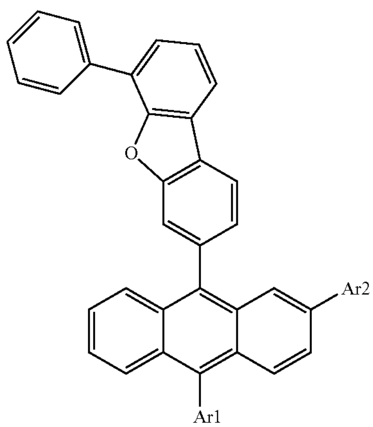 | 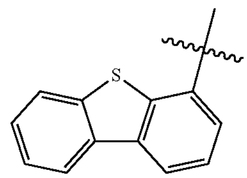 [SMILES: *c1cccc2c1sc1ccccc12] | 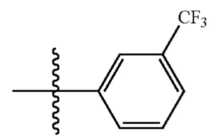 [SMILES: *c1cccc(C(F)(F)F)c1] |
| 59-28 | 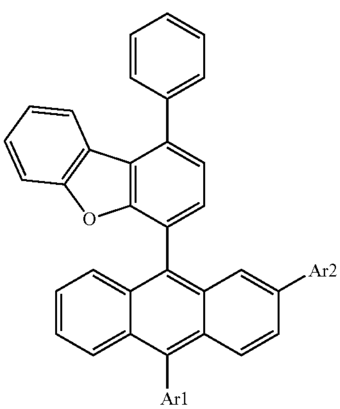 | 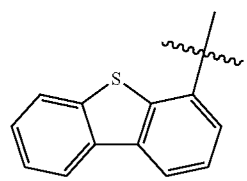 | 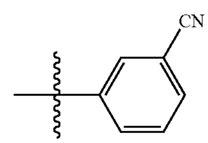 [SMILES: *c1cccc(C#N)c1] |
| 59-29 | 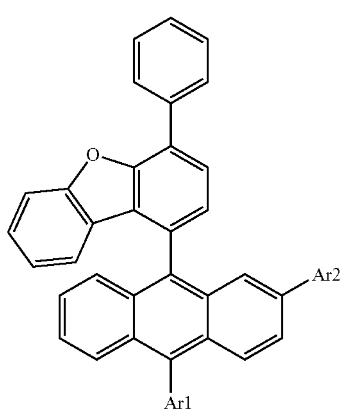 | 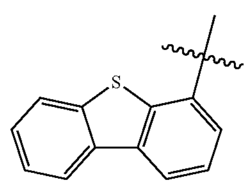 [SMILES: *c1cccc2c1sc1ccccc12] | 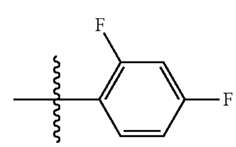 [SMILES: *c1ccc(F)cc1F] |

-continued
| No. | | Ar1 | Ar2 |
|---|---|---|---|
| 60-1 | 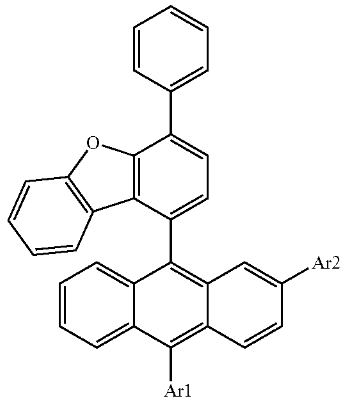 | 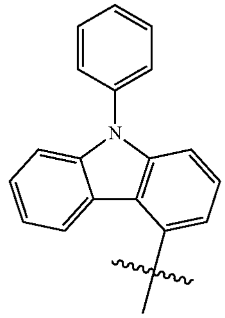 [SMILES: *c1cccc2c1c1ccccc1n2-c1ccccc1] | 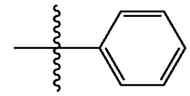 |
| 60-2 | 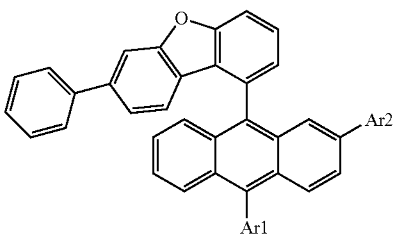 | 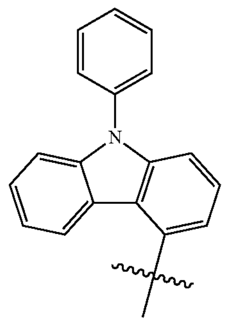 [SMILES: *c1cccc2c1c1ccccc1n2-c1ccccc1] | 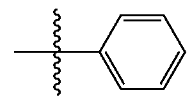 [SMILES: *c1ccccc1] |
| 60-3 | 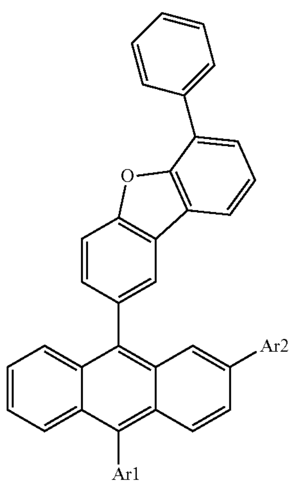 | 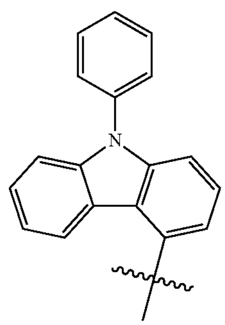 [SMILES: *c1cccc2c1c1ccccc1n2-c1ccccc1] | 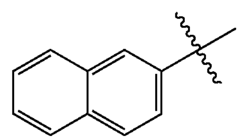 [SMILES: *c1ccc2ccccc2c1] |
| 60-4 | 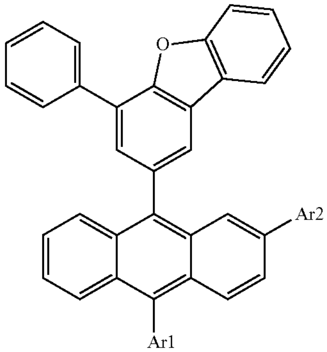 | 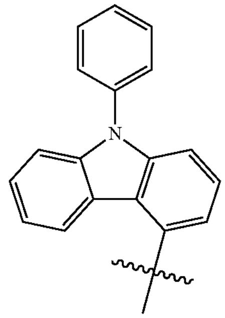 [SMILES: *c1cccc2c1c1ccccc1n2-c1ccccc1] | 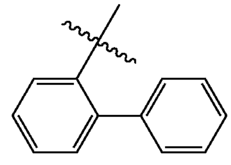 [SMILES: *c1ccccc1-c1ccccc1] |

-continued
| No. | | Ar1 | Ar2 |
|---|---|---|---|
| 60-5 | 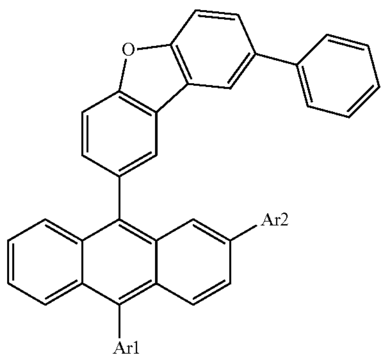 | 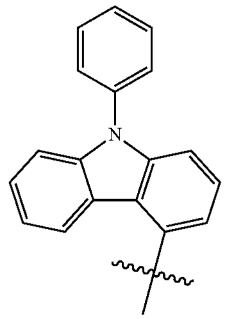 [SMILES: *c1cccc2c1c1ccccc1n2-c1ccccc1] | 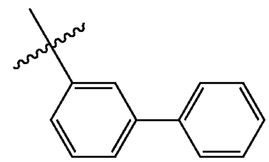 [SMILES: *c1cccc(-c2ccccc2)c1] |
| 60-6 | 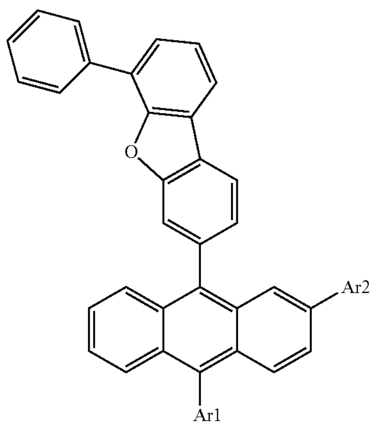 | 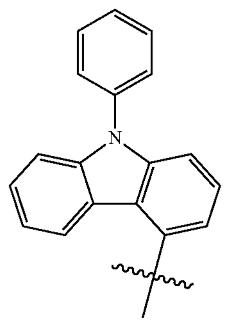 [SMILES: *c1cccc2c1c1ccccc1n2-c1ccccc1] | 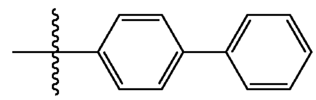 |
| 60-7 | 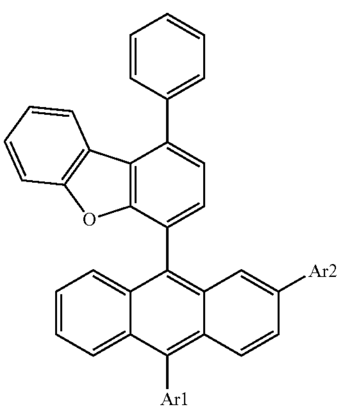 | 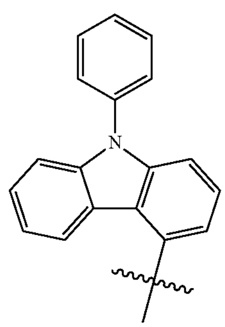 [SMILES: *c1cccc2c1c1ccccc1n2-c1ccccc1] | 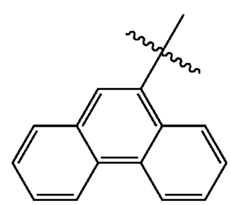 [SMILES: *c1cc2ccccc2c2ccccc12] |
| 60-9 | 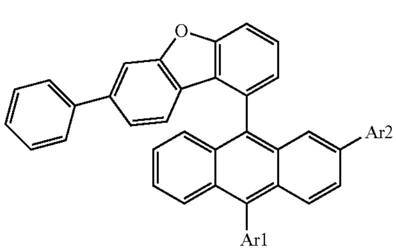 | 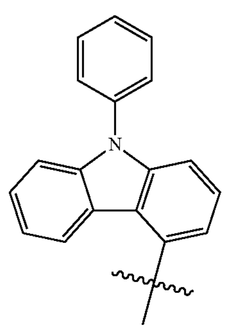 [SMILES: *c1cccc2c1c1ccccc1n2-c1ccccc1] | 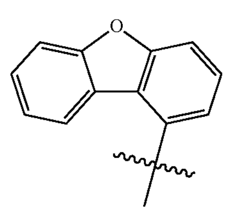 [SMILES: *c1cccc2oc3ccccc3c12] |

-continued
| No. | | Ar1 | Ar2 |
|---|---|---|---|
| 60-10 | 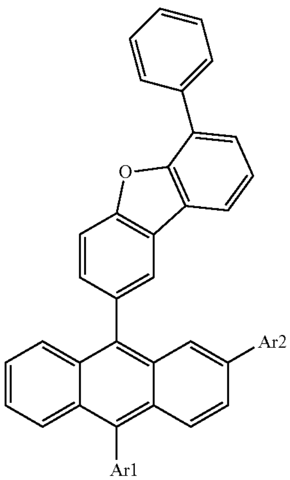 | 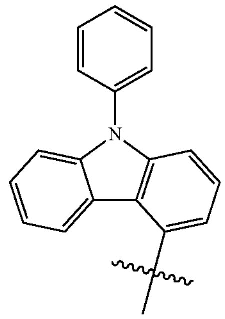 [SMILES: *c1cccc2c1c1ccccc1n2-c1ccccc1] | 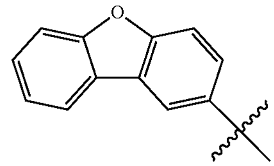 |
| 60-11 | 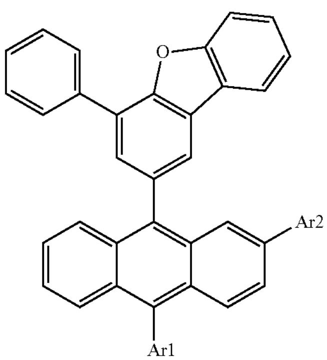 | 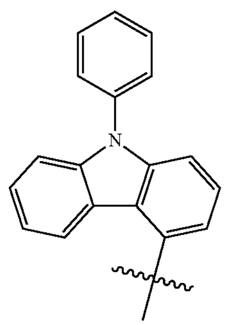 [SMILES: *c1cccc2c1c1ccccc1n2-c1ccccc1] | 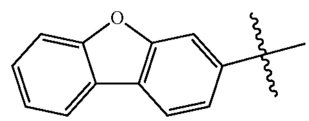 |
| 60-12 | 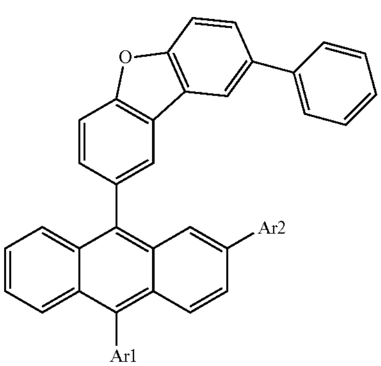 | 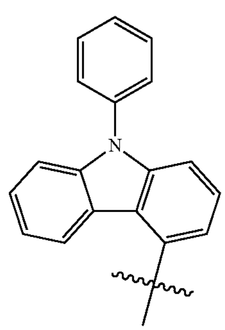 [SMILES: *c1cccc2c1c1ccccc1n2-c1ccccc1] | 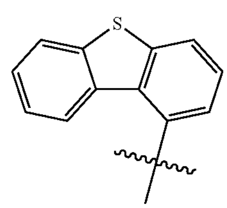 [SMILES: *c1cccc2sc3ccccc3c12] |

-continued
| No. | | Ar1 | Ar2 |
|---|---|---|---|
| 60-13 | 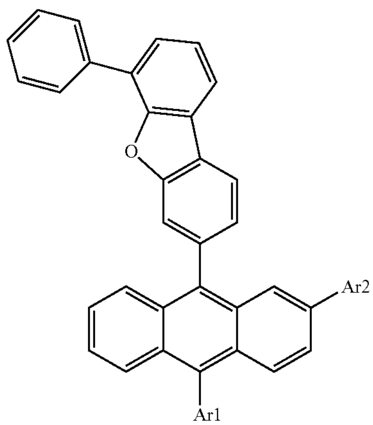 | 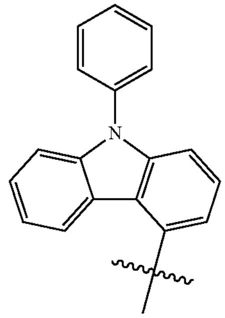 [SMILES: *c1cccc2c1c1ccccc1n2-c1ccccc1] | 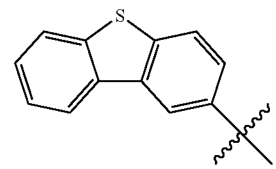 |
| 60-14 | 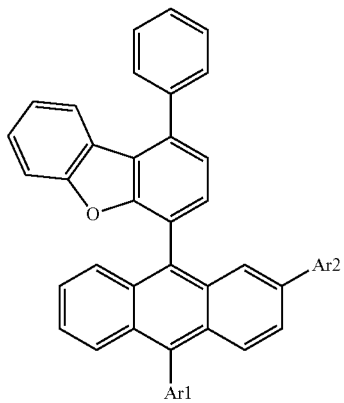 | 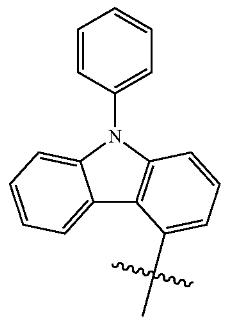 [SMILES: *c1cccc2c1c1ccccc1n2-c1ccccc1] | 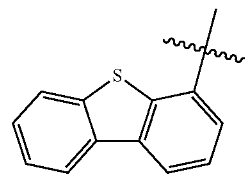 |
| 60-19 | 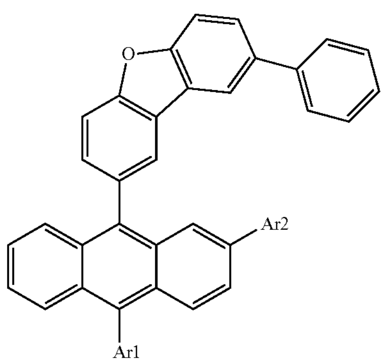 | 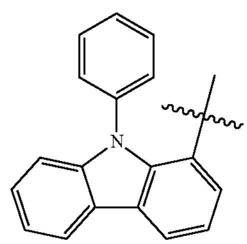 [SMILES: *c1cccc2c3ccccc3n(-c3ccccc3)c12] | 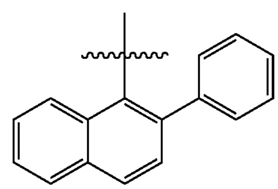 [SMILES: *c1c(-c2ccccc2)ccc2ccccc12] |
| 60-20 | 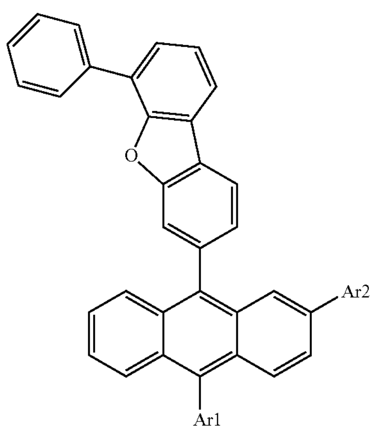 | 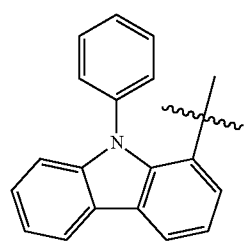 [SMILES: *c1cccc2c3ccccc3n(-c3ccccc3)c12] | 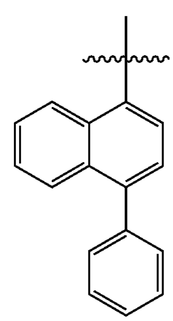 [SMILES: *c1ccc(-c2ccccc2)c2ccccc12] |

-continued
| No. | | Ar1 | Ar2 |
|---|---|---|---|
| 60-21 | 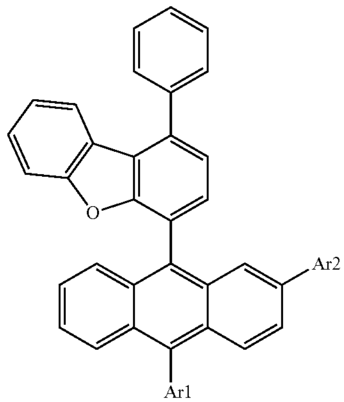 | 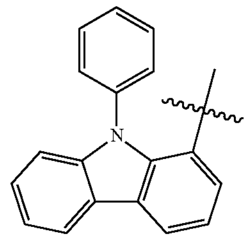 [SMILES: *c1cccc2c3ccccc3n(-c3ccccc3)c12] | 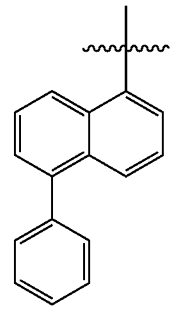 [SMILES: *c1cccc2c(-c3ccccc3)cccc12] |
| 60-22 | 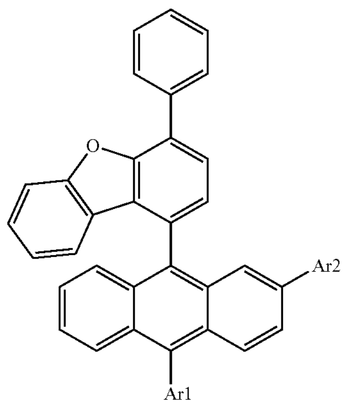 | 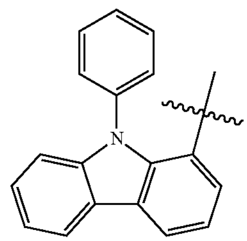 [SMILES: *c1cccc2c3ccccc3n(-c3ccccc3)c12] | 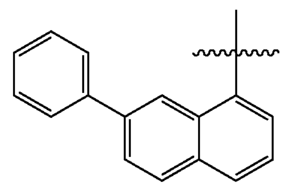 [SMILES: *c1cccc2ccc(-c3ccccc3)cc12] |
| 60-23 | 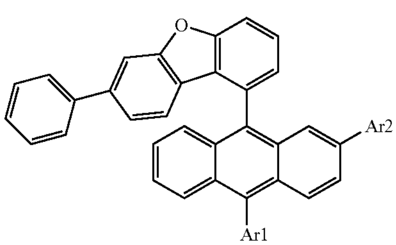 | 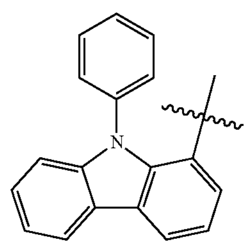 [SMILES: *c1cccc2c3ccccc3n(-c3ccccc3)c12] | 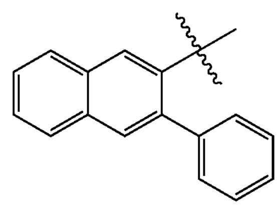 [SMILES: *c1cc2ccccc2cc1-c1ccccc1] |
| 60-24 | 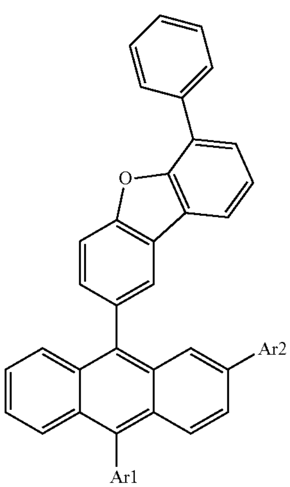 | 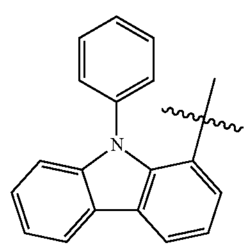 [SMILES: *c1cccc2c3ccccc3n(-c3ccccc3)c12] | 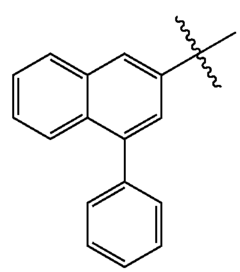 [SMILES: *c1cc(-c2ccccc2)c2ccccc2c1] |

-continued
| No. | | Ar1 | Ar2 |
|---|---|---|---|
| 60-25 | 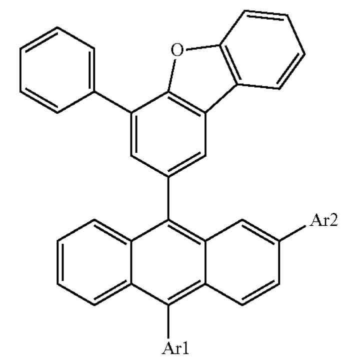 | 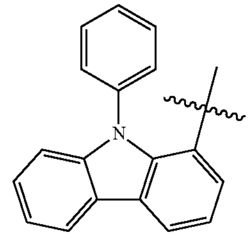 [SMILES: *c1cccc2c3ccccc3n(-c3ccccc3)c12] | 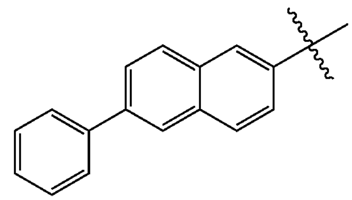 [SMILES: *c1ccc2cc(-c3ccccc3)ccc2c1] |
| 60-26 | 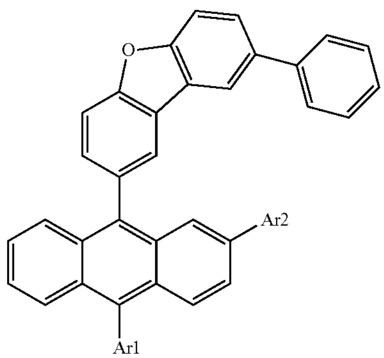 | 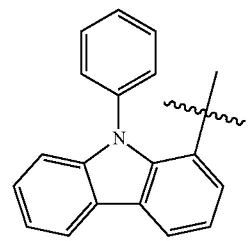 [SMILES: *c1cccc2c3ccccc3n(-c3ccccc3)c12] | 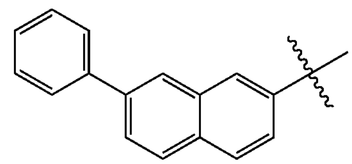 [SMILES: *c1ccc2ccc(-c3ccccc3)cc2c1] |
| 60-27 | 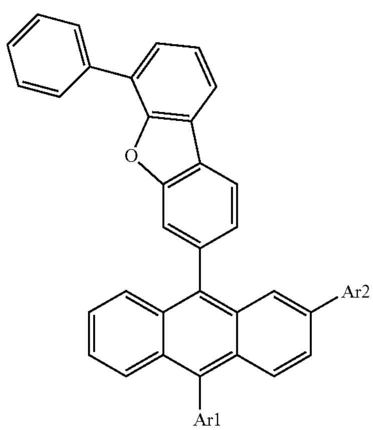 | 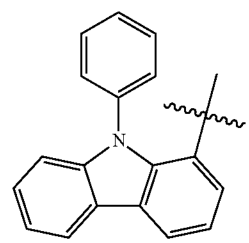 [SMILES: *c1cccc2c3ccccc3n(-c3ccccc3)c12] | 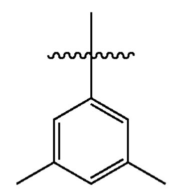 |
| 60-28 | 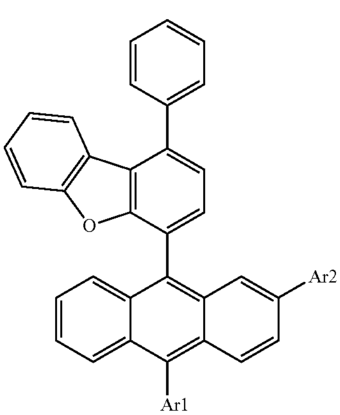 | 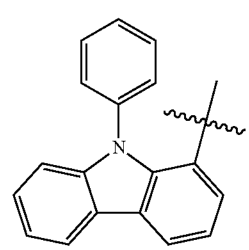 [SMILES: *c1cccc2c3ccccc3n(-c3ccccc3)c12] | 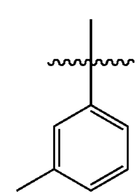 |

-continued

| No. | | Ar1 | Ar2 |
|---|---|---|---|
| 60-29 | 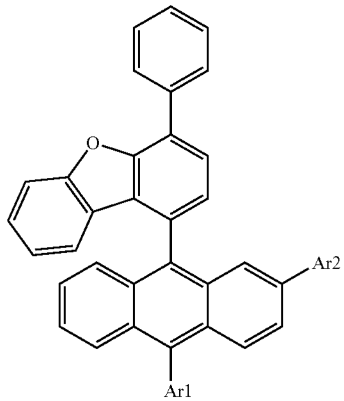 | 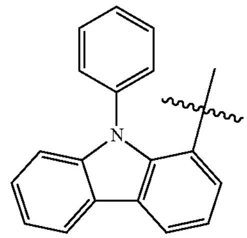 [SMILES: *c1cccc2c3ccccc3n(-c3ccccc3)c12] | 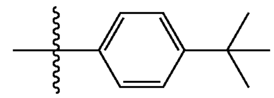 |
| 60-30 | 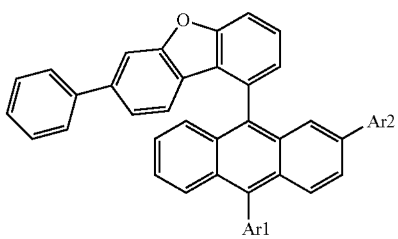 | 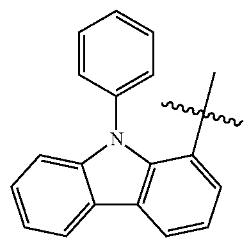 [SMILES: *c1cccc2c3ccccc3n(-c3ccccc3)c12] | 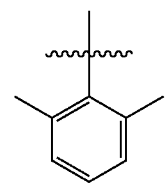 |
| 60-31 | 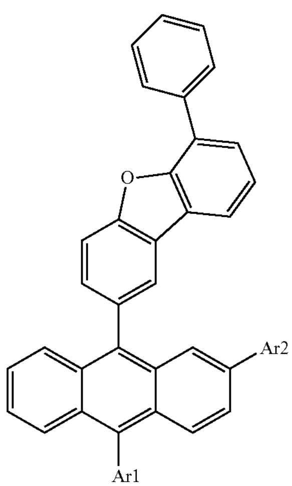 | 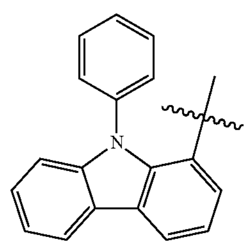 [SMILES: *c1cccc2c3ccccc3n(-c3ccccc3)c12] | 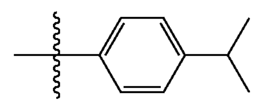 |

6. The organic light emitting device of claim 1, comprising the compound of Chemical Formula 2 in 1 parts by weight to 20 parts by weight with respect to 100 parts by weight of the compound of Chemical Formula 1.

7. The organic light emitting device of claim 1, wherein the organic material layer further includes one or more of a hole transfer layer, a hole injection layer, an electron blocking layer, an electron transfer and injection layer, an electron transfer layer, an electron injection layer, a hole blocking layer, and a hole transfer and injection layer.

* * * * *